US012563964B2

(12) United States Patent
Cho et al.

(10) Patent No.: US 12,563,964 B2
(45) Date of Patent: Feb. 24, 2026

(54) ORGANIC LIGHT-EMITTING DEVICE

(71) Applicant: LG CHEM, LTD., Seoul (KR)

(72) Inventors: Woo Jin Cho, Daejeon (KR); Moung Gon Kim, Daejeon (KR); Sung Kil Hong, Daejeon (KR); Dongheon Kim, Daejeon (KR); Sujeong Geum, Daejeon (KR)

(73) Assignee: LG CHEM, LTD., Seoul (KR)

( * ) Notice: Subject to any disclaimer, the term of this patent is extended or adjusted under 35 U.S.C. 154(b) by 882 days.

(21) Appl. No.: 17/762,458

(22) PCT Filed: Nov. 30, 2020

(86) PCT No.: PCT/KR2020/017275
§ 371 (c)(1),
(2) Date: Mar. 22, 2022

(87) PCT Pub. No.: WO2021/107728
PCT Pub. Date: Jun. 3, 2021

(65) Prior Publication Data

US 2022/0393111 A1 Dec. 8, 2022

(30) Foreign Application Priority Data

Nov. 29, 2019 (KR) ........................ 10-2019-0156695

(51) Int. Cl.
*H10K 85/60* (2023.01)
*H10K 50/12* (2023.01)
*H10K 50/18* (2023.01)

(52) U.S. Cl.
CPC ........... *H10K 85/626* (2023.02); *H10K 50/12* (2023.02); *H10K 85/615* (2023.02); *H10K 85/631* (2023.02); *H10K 85/6574* (2023.02); *H10K 85/6576* (2023.02); *H10K 85/658* (2023.02); *H10K 50/181* (2023.02)

(58) Field of Classification Search
None
See application file for complete search history.

(56) References Cited

U.S. PATENT DOCUMENTS

2004/0251816 A1 12/2004 Leo et al.
2006/0063027 A1 3/2006 Vestweber et al.
2013/0207046 A1* 8/2013 Pflumm ............... C07D 219/02 252/500
2018/0301629 A1 10/2018 Hatakeyama et al.
2020/0066997 A1 2/2020 Huang et al.
2020/0091431 A1 3/2020 Hatakeyama et al.
2020/0176679 A1 6/2020 Jeong et al.
(Continued)

FOREIGN PATENT DOCUMENTS

CN 107417715 12/2017
CN 109346614 A 2/2019
(Continued)

*Primary Examiner* — Robert S Loewe
(74) *Attorney, Agent, or Firm* — Bryan Cave Leighton Paisner LLP

(57) ABSTRACT

Provided is an organic light emitting device including: a cathode; an anode facing the cathode;
a light emitting layer between the cathode and the anode and comprising a host and a dopant;
a hole transport region between the anode and the light emitting layer; and
an electron transport region between the cathode and the light emitting layer,
wherein the hole transport region includes an organic material layer comprising a compound of Chemical Formula 1, and the dopant comprises a compound of Chemical Formula 2:

[Chemical Formula 1]

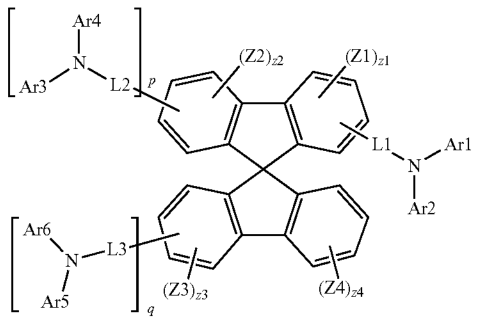

[Chemical Formula 2]

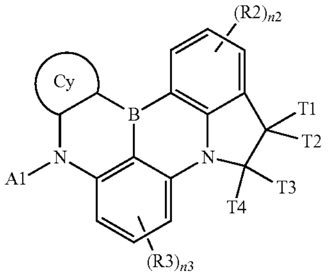

wherein:
Ar1 to Ar6 are each independently a substituted or unsubstituted: C6-60 aryl group or C2-60 heterocyclic group, or are bonded to an adjacent substituent to form a substituted or unsubstituted ring;
Cy is a substituted or unsubstituted: aliphatic hydrocarbon ring, aromatic ring, or hetero ring, or a substituted or unsubstituted ring in which these rings are fused.

19 Claims, 2 Drawing Sheets

(56) References Cited

U.S. PATENT DOCUMENTS

| | | | | |
|---|---|---|---|---|
| 2020/0203610 | A1 | 6/2020 | Duan et al. | |
| 2021/0005826 | A1 | 1/2021 | Tasaki et al. | |
| 2021/0036233 | A1 | 2/2021 | Joo et al. | |
| 2021/0367164 | A1 | 11/2021 | Song et al. | |
| 2021/0408390 | A1* | 12/2021 | Lee | H10K 85/615 |
| 2022/0173318 | A1 | 6/2022 | Kim et al. | |
| 2022/0352473 | A1 | 11/2022 | Kim et al. | |
| 2022/0399501 | A1 | 12/2022 | Lee et al. | |
| 2023/0140927 | A1* | 5/2023 | Shim | H10K 85/6572<br>257/40 |

FOREIGN PATENT DOCUMENTS

| | | | |
|---|---|---|---|
| CN | 110407859 | | 11/2019 |
| CN | 111933810 | | 11/2020 |
| CN | 113228335 | | 8/2021 |
| CN | 113875033 | | 12/2021 |
| JP | 2006-511939 | | 4/2006 |
| KR | 10-2014-0133572 | | 11/2014 |
| KR | 10-2017-0130434 | | 11/2017 |
| KR | 10-1876763 | | 7/2018 |
| KR | 10-2019-0051867 | | 5/2019 |
| KR | 10-2019-0132644 | | 11/2019 |
| KR | 10-2053569 | | 12/2019 |
| KR | 10-2020-0081985 | | 7/2020 |
| KR | 1020200132752 | A | 11/2020 |
| WO | 2013-120577 | | 8/2013 |
| WO | 2018-095397 | | 5/2018 |

* cited by examiner

[Figure 1]
[Figure 2]
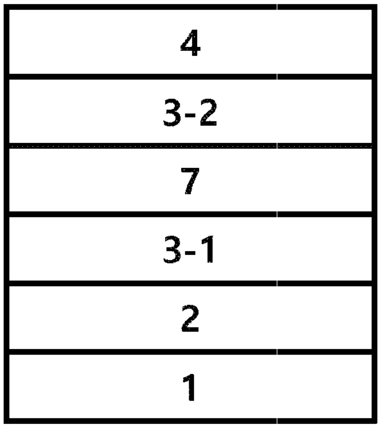
[Figure 3]
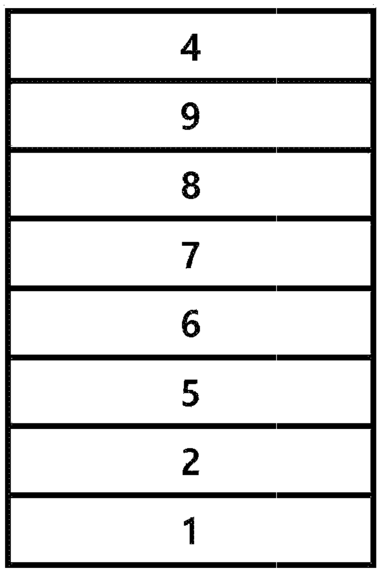

[Figure 4]
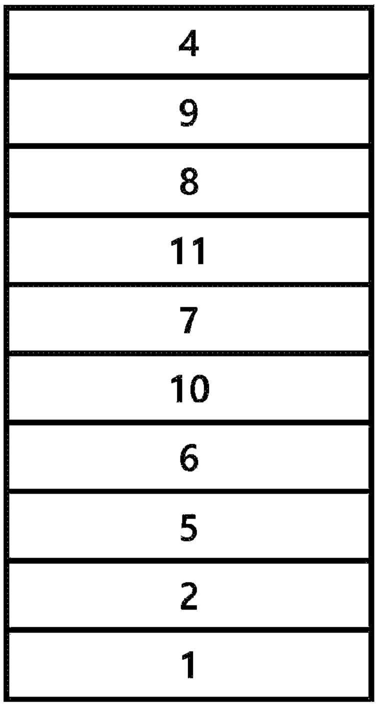

ORGANIC LIGHT-EMITTING DEVICE

CROSS-REFERENCE TO RELATED APPLICATIONS

This application is a National Stage Application of International Application No. PCT/KR2020/017275 filed on Nov. 30, 2020, which claims priority to and the benefit of Korean Patent Application No. 10-2019-0156695 filed in the Korean Intellectual Property Office on Nov. 29, 2019, the entire contents of which are incorporated herein by reference.

TECHNICAL FIELD

The present specification relates to an organic light emitting device including: an anode; a cathode provided to face the anode; and an organic material layer between the anode and the cathode.

BACKGROUND

In the present specification, an organic light emitting device is a light emitting device using an organic semiconductor material, and requires an exchange of holes and/or electrons between electrodes and organic semiconductor materials. The organic light emitting device can be roughly divided into the following two organic light emitting devices depending on the operation principle. The first organic light emitting device is a light emitting device in which an exciton is formed in an organic material layer by a photon that flows from an external light source to the device, the exciton is separated into electrons and holes, and the electrons and the holes are each transferred to different electrodes and used as a current source (voltage source). The second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon usually has a structure including an anode, a cathode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron blocking layer, an electron transport layer, an electron injection layer, and the like. In the structure of the organic light emitting device, if a voltage is applied between two electrodes, holes are injected from an anode into the organic material layer and electrons are injected from a cathode into the organic material layer, and when the injected holes and electrons meet each other, an exciton is formed, and light is emitted when the exciton falls down again to a ground state. Such an organic light emitting device has been known to have characteristics such as self-emission, high luminance, high efficiency, a low driving voltage, a wide viewing angle, and high contrast.

In an organic light emitting device, materials used as an organic material layer can be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system can be used as a light emitting material for the purpose of enhancing color purity and light emitting efficiency through energy transfer. The principle is that when a small amount of dopant which has a smaller energy band gap and better light emitting efficiency than those of a host mainly constituting a light emitting layer is mixed in the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, materials constituting an organic material layer in a device, for example, a hole injection material, a hole transport material, a light emitting material, an electron blocking material, an electron transport material, an electron injection material, and the like need to be supported by stable and efficient materials, so that there is a continuous need for developing a new material and an optimal combination.

BRIEF DESCRIPTION

Technical Problem

The present specification has been made in an effort to provide an organic light emitting device including: an anode; a cathode provided to face the anode; and an organic material layer between the anode and the cathode.

Technical Solution

The present specification provides an organic light emitting device including: a cathode; an anode provided to face the cathode; a light emitting layer provided between the cathode and the anode and including a host and a dopant; a hole transport region provided between the anode and the light emitting layer; and an electron transport region provided between the cathode and the light emitting layer, in which the hole transport region includes an organic material layer including a compound of the following Chemical Formula 1, and the dopant includes a compound of the following Chemical Formula 2:

[Chemical Formula 1]

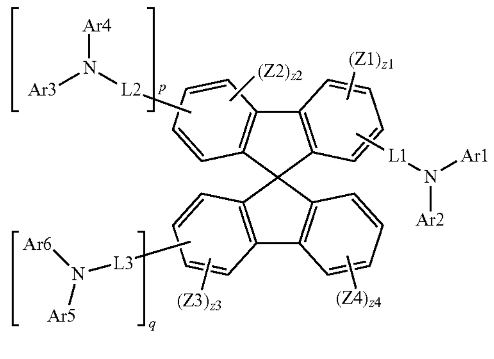

-continued

[Chemical Formula 2]

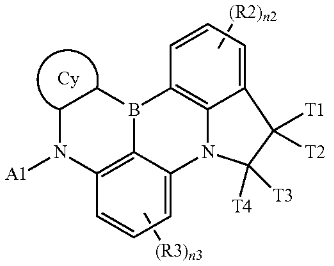

wherein in Chemical Formulae 1 and 2:

Ar1 to Ar6 are the same as or different from each other, and are each independently a substituted or unsubstituted aryl group having 6 to 60 carbon atoms, or a substituted or unsubstituted heterocyclic group having 2 to 60 carbon atoms; or are bonded to an adjacent substituent to form a substituted or unsubstituted ring;

L1 to L3 are the same as or different from each other, and are each independently a direct bond, a substituted or unsubstituted arylene group having 6 to 60 carbon atoms, or a substituted or unsubstituted divalent heterocyclic group having 2 to 60 carbon atoms, p and q are each 0 or 1;

Z1 to Z4 are the same as or different from each other, and are each independently hydrogen, deuterium, a halogen group, a nitrile group, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group;

z1 is an integer from 0 to 3;

z2 to z4 are each an integer from 0 to 4;

when z1 is 2 or higher, the Z1s are the same as or different from each other;

when z2 is 2 or higher, the Z2s are the same as or different from each other;

when z3 is 2 or higher, the Z3s are the same as or different from each other; and when z4 is 2 or higher, the Z4s are the same as or different from each other;

T1 to T4 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to an adjacent substituent to form an aliphatic hydrocarbon ring;

A1 is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group; or is bonded to an adjacent substituent to form a substituted or unsubstituted ring;

Cy is a substituted or unsubstituted aliphatic hydrocarbon ring, a substituted or unsubstituted aromatic ring, or a substituted or unsubstituted hetero ring, or a substituted or unsubstituted ring in which these rings are fused;

R2 and R3 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group, or are bonded to an adjacent substituent to form a substituted or unsubstituted ring, n2 and n3 are each an integer from 0 to 3;

when n2 is 2 or higher, the R2s are the same as or different from each other; and when n3 is 2 or higher, the R3s are the same as or different from each other.

Advantageous Effects

An organic light emitting device according to a first exemplary embodiment of the present specification has an advantage of a long service life.

An organic light emitting device according to a second exemplary embodiment of the present specification has an advantage of improved light emitting efficiency.

An organic light emitting device according to a third exemplary embodiment of the present specification has an advantage of a low driving voltage.

BRIEF DESCRIPTION OF THE DRAWINGS

FIG. 1 illustrates an example of an organic light emitting device in which a substrate 1, an anode 2, an organic material layer 3, and a cathode 4 are sequentially stacked.

FIG. 2 illustrates an example of an organic light emitting device in which a substrate 1, an anode 2, a hole transport region 3-1, a light emitting layer 7, an electron transport region 3-2, and a cathode 4 are sequentially stacked.

FIG. 3 illustrates an example of an organic light emitting device in which a substrate 1, an anode 2, a hole injection layer 5, a hole transport layer 6, a light emitting layer 7, an electron transport layer 8, an electron injection layer 9, and a cathode 4 are sequentially stacked.

FIG. 4 illustrates an example of an organic light emitting device in which a substrate 1, an anode 2, a hole injection layer 5, a hole transport layer 6, an electron blocking layer 10, a light emitting layer 7, a hole blocking layer 11, an electron transport layer 8, an electron injection layer 9, and a cathode 4 are sequentially stacked.

EXPLANATION OF REFERENCE NUMERALS AND SYMBOLS

1: Substrate
2: Anode
3: Organic material layer
3-1: Hole transport region

3-2: Electron transport region
4: Cathode
5: Hole injection layer
6: Hole transport layer
7: Light emitting layer
8: Electron injection layer
9: Electron injection layer
10: Electron blocking layer
11: Hole blocking layer

DETAILED DESCRIPTION

Hereinafter, the present specification will be described in detail.

The present specification provides an organic light emitting device including: a cathode; an anode provided to face the cathode; a light emitting layer provided between the cathode and the anode and including a host and a dopant; a hole transport region provided between the anode and the light emitting layer; and an electron transport region provided between the cathode and the light emitting layer, in which the hole transport region includes an organic material layer including the compound of Chemical Formula 1, and the dopant includes the compound of Chemical Formula 2.

Since Chemical Formula 1 of the present invention does not eliminate the light emitting characteristics from the light emitting layer, Chemical Formula 1 is easily used adjacent to the light emitting layer, and an organic light emitting device including the same has high efficiency. Further, Chemical Formula 1 has high thermal stability due to the structural characteristics thereof, and thus prevents the material from being changed by heat generated when a device is operated, thereby extending the service life.

Chemical Formula 2 of the present invention includes a non-aromatic pentagonal ring including N to affect the light emission characteristics due to the planarity, thereby increasing the efficiency. In addition, materials including aromatic hetero rings cause a lack of electrons in hydrocarbazole and amines, which have high electron densities to become stable with respect to radicals formed by decomposition of those compound by electric current, thereby extending the service life.

In this case, when the compound of Chemical Formula 1 is used in an electron blocking layer and the compound of Chemical Formula 2 is used in a light emitting layer, the stability of each material is excellent, so that the long service life characteristics of the device are enhanced, and the low voltage and high efficiency characteristics of the device are further enhanced by synergistic effects in the organic light emitting device.

Therefore, when the compound of Chemical Formula 1 and the compound of Chemical Formula 2 are applied to an organic light emitting device, it is possible to obtain an organic light emitting device having high efficiency, low voltage, and/or long service life characteristics.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element can be further included.

Throughout the specification of the present application, the term "combination thereof" included in the Markush type expression means a mixture or combination of one or more selected from the group consisting of constituent elements described in the Markush type expression, and means including one or more selected from the group consisting of the above-described constituent elements.

Hereinafter, substituents of the present specification will be described in detail, but are not limited thereto.

In the present specification, the term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being unsubstituted or substituted with one or more substituents selected from the group consisting of deuterium, a halogen, a cyano group, an alkyl group, a cycloalkyl group, an alkoxy group, an aryloxy group, a silyl group, a boron group, an amine group, a phosphine oxide group, an aryl group, and a heteroaryl group, or being unsubstituted or substituted with a substituent to which two or more substituents among the substituents exemplified above are linked.

In the present specification, the term "substituted or unsubstituted" means being unsubstituted or substituted with one or more substituents selected from the group consisting of deuterium, a halogen group, a cyano group, an alkyl group, a cycloalkyl group, an alkoxy group, a silyl group, an aryl group, and a heteroaryl group, or being unsubstituted or substituted with a substituent to which two or more substituents among the substituents exemplified above are linked.

In the present specification, the fact that two or more substituents are linked indicates that hydrogen of any one substituent is linked to another substituent. For example, for the linkage of two substituents, a phenyl group and a naphthyl group can be linked to become a substituent of

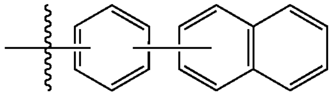
or
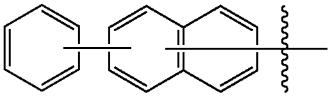
, and an isopropyl group and a phenyl group can be linked to become a substituent of

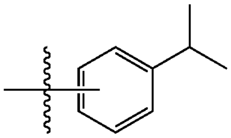
or
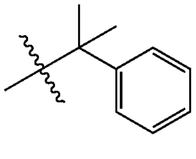
.

Further, the case where three substituents are linked to one another includes not only a case where (Substituent 1)-(Substituent 2)-(Substituent 3) are consecutively linked to one another, but also a case where (Substituent 2) and (Substituent 3) are linked to (Substituent 1). For example, a phenyl group, a naphthyl group, and an isopropyl group can be linked to become a substituent of

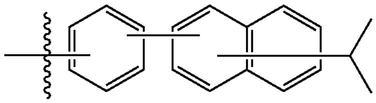
,

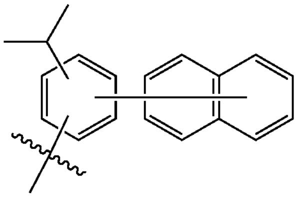
or

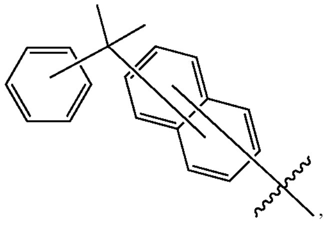
, and two phenyl groups and isopropyl groups can be linked to become a substituent of

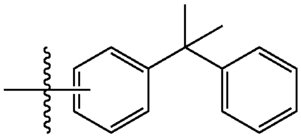
or

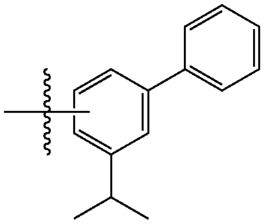
.

The above-described definition also applies equally to the case where four or more substituents are linked to one another.

In the present specification, "substituted with A or B" includes not only the case of being substituted with A alone or with B alone, but also the case of being substituted with A and B.

In the present specification, a halogen group can be fluorine, chlorine, bromine or iodine.

In the present specification, a silyl group can be —Si-$Y_aY_bY_c$, and the $Y_a$, $Y_b$, and $Y_c$ can be each hydrogen, a substituted or unsubstituted alkyl group, or a substituted or unsubstituted aryl group. Specific examples of the silyl group include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group can be —$BY_dY_e$, and the $Y_d$ and $Y_e$ can be each hydrogen, a substituted or unsubstituted alkyl group, or a substituted or unsubstituted aryl group. Specific examples of the boron group include a trimethylboron group, a triethylboron group, a tert-butyldimethylboron group, a triphenylboron group, a phenylboron group, and the like, but are not limited thereto.

In the present specification, the alkyl group can be straight-chained, branched or cyclic, and the number of carbon atoms thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkoxy group can be straight-chained, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

Substituents including an alkyl group, an alkoxy group, and other alkyl group moieties described in the present specification include both a straight-chained form and a branched form.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to yet another exemplary embodiment, the number of carbon atoms of the cycloalkyl group is 3 to 6. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an aryl group is not particularly limited, but has preferably 6 to 30 carbon atoms, and the aryl group can be monocyclic or polycyclic.

In the present specification, when the aryl group is a monocyclic aryl group, the number of carbon atoms thereof is not particularly limited, but is preferably 6 to 25. Specific examples of the monocyclic aryl group include a phenyl group, a biphenyl group, a terphenyl group, a quaterphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a triphenylenyl group, a pyrenyl group, a perylenyl group, a chrysenyl group, a fluorenyl group, and the like, but are not limited thereto.

In the present specification, the fluorenyl group can be substituted, and adjacent substituents can be bonded to each other to form a ring.

When the fluorenyl group is substituted, the substituent can be

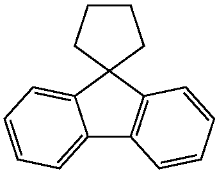,
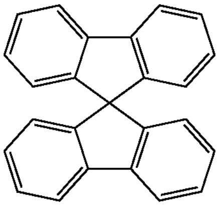,
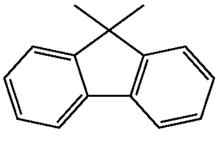,
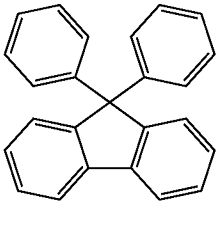, and the like. However, the substituent is not limited thereto.

In the present specification, an alkylaryl group means an aryl group which is substituted with an alkyl group, and among them, the above-described description on the alkyl group and the aryl group can be applied to the alkyl group and the aryl group.

In the present specification, an arylene group means a group having two bonding positions in an aryl group, that is, a divalent group. The above-described description on the aryl group can be applied to the arylene group, except that the arylene groups are each a divalent group.

In the present specification, a heterocyclic group includes one or more atoms other than carbon, that is, one or more heteroatoms, and specifically, the heteroatom can include one or more atoms selected from the group consisting of O, N, Se, S, and the like. The number of carbon atoms thereof is not particularly limited, but is preferably 2 to 30, and the heterocyclic group can be monocyclic or polycyclic. Examples of the heterocyclic group include a thiophene group, a furan group, a pyrrole group, an imidazole group, a triazole group, an oxazole group, an oxadiazole group, a pyridine group, a pyrimidine group, a triazine group, a triazole group, a quinoline group, a quinazoline group, a carbazole group, a benzoxazole group, a benzimidazole group, a benzothiazole group, a benzocarbazole group, a benzothiophene group, a dibenzothiophene group, a benzofuran group, a phenanthroline group, an isoxazole group, a thiadiazole group, a dibenzofuran group, and the like, but are not limited thereto.

In the present specification, the above-described description on the heterocyclic group can be applied to a heteroaryl group except for an aromatic heteroaryl group.

In the present specification, an amine group can be selected from the group consisting of $-NH_2$, an alkylamine group, an N-alkylarylamine group, an arylamine group, an N-arylheteroarylamine group, an N-alkylheteroarylamine group, and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group, an N-phenylfluorenylamine group, an N-phenyl terphenylamine group, an N-phenanthrenylfluorenylamine group, an N-biphenylfluorenylamine group, and the like, but are not limited thereto.

In the present specification, an N-alkylarylamine group means an amine group in which an alkyl group and an aryl group are substituted with N of the amine group.

In the present specification, an N-arylheteroarylamine group means an amine group in which an aryl group and a heteroaryl group are substituted with N of the amine group.

In the present specification, an N-alkylheteroarylamine group means an amine group in which an alkyl group and a heteroaryl group are substituted with N of the amine group.

In the present specification, an alkyl group, an aryl group, and a heteroaryl group in an alkylamine group, an N-alkylarylamine group, an arylamine group, an N-arylheteroarylamine group, an N-alkylheteroarylamine group, and a heteroarylamine group are each the same as the above-described examples of the alkyl group, the aryl group, and the heteroaryl group.

In the present specification, the "adjacent" group can mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

In the present specification, in a substituted or unsubstituted ring formed by being bonded to an adjacent group, the "ring" means a hydrocarbon ring or a hetero ring.

The hydrocarbon ring can be an aromatic ring, an aliphatic ring, or a fused ring of the aromatic ring and the aliphatic ring, and can be selected from the examples of the cycloalkyl group or the aryl group, except for the divalent hydrocarbon ring.

The description on the heterocyclic group can be applied to the hetero ring except for a divalent hetero ring.

In the present specification, the hole transport region includes an organic material layer including a compound of the following Chemical Formula 1:

[Chemical Formula 1]

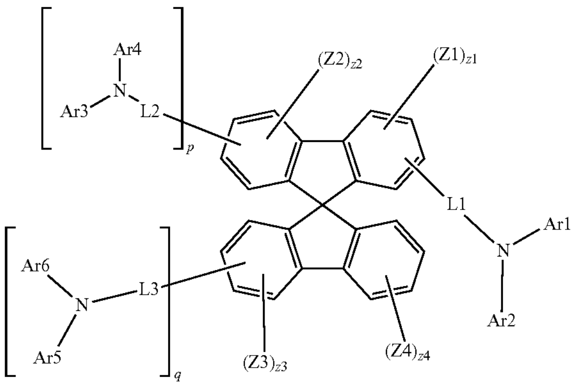

wherein in Chemical Formula 1:

Ar1 to Ar6 are the same as or different from each other, and are each independently a substituted or unsubstituted aryl group having 6 to 60 carbon atoms, or a substituted or unsubstituted heterocyclic group having 2 to 60 carbon atoms, or are bonded to an adjacent substituent to form a substituted or unsubstituted ring;

L1 to L3 are the same as or different from each other, and are each independently a direct bond, a substituted or unsubstituted arylene group having 6 to 60 carbon atoms, or a substituted or unsubstituted divalent heterocyclic group having 2 to 60 carbon atoms, p and q are each 0 or 1;

Z1 to Z4 are the same as or different from each other, and are each independently hydrogen, deuterium, a halogen group, a nitrile group, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group;

z1 is an integer from 0 to 3;

z2 to z4 are each an integer from 0 to 4;

when z1 is 2 or higher, the Z1s are the same as or different from each other;

when z2 is 2 or higher, the Z2s are the same as or different from each other;

when z3 is 2 or higher, the Z3s are the same as or different from each other; and when z4 is 2 or higher, the Z4s are the same as or different from each other.

In the present specification, the sum of p and q is 0 or 1.

In the present specification, the sum of p and q is 0.

In the present specification, the sum of p and q is 1.

In the present specification, Ar1 to Ar6 are the same as or different from each other, and are each independently a substituted or unsubstituted fluorenyl group, a substituted or unsubstituted spirobifluorenyl group, a substituted or unsubstituted phenyl group, a substituted or unsubstituted biphenyl group, a substituted or unsubstituted terphenyl group, a substituted or unsubstituted quaterphenyl group, a substituted or unsubstituted carbazolyl group, a substituted or unsubstituted dibenzofuranyl group, or a substituted or unsubstituted dibenzothiophenyl group.

In the present specification, Ar1 to Ar6 are each independently any one of the following structures:

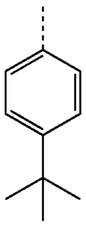
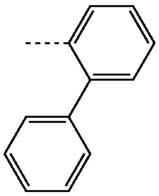
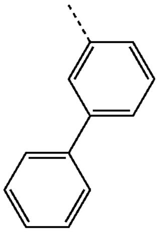
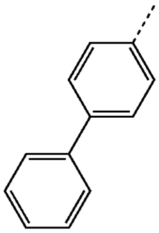
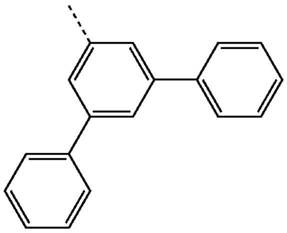

-continued

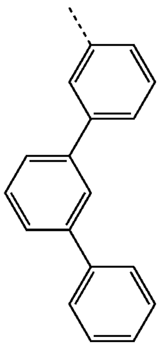
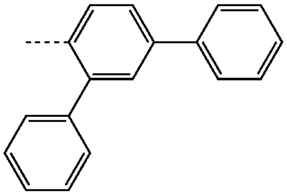
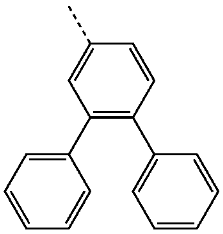
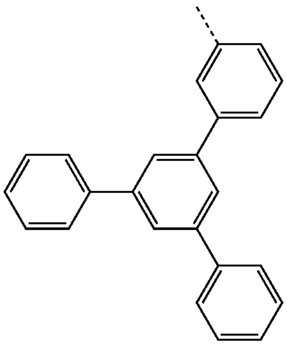
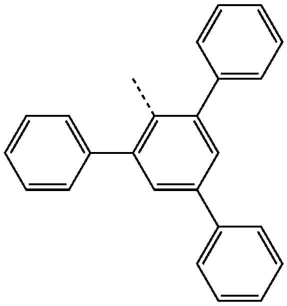
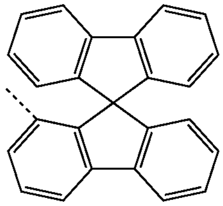
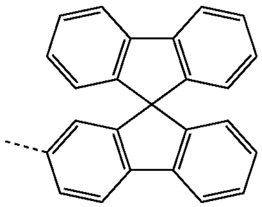
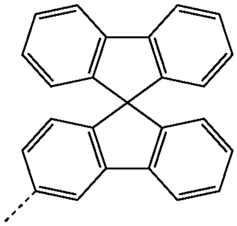
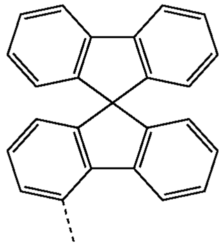
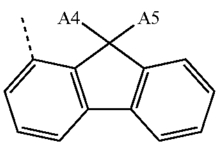
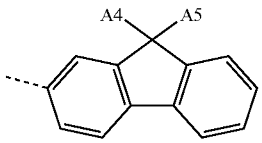
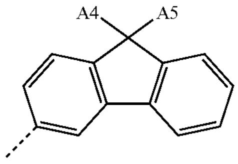

-continued
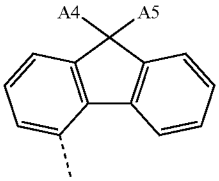
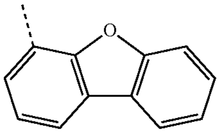
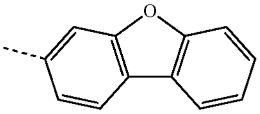
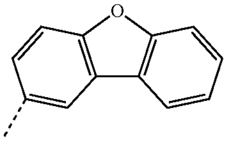
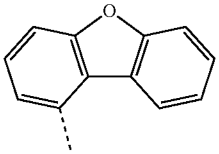
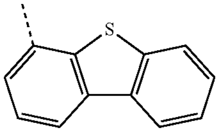
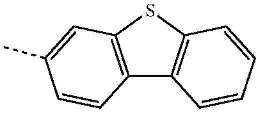
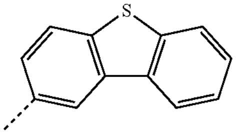
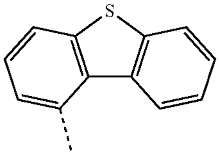
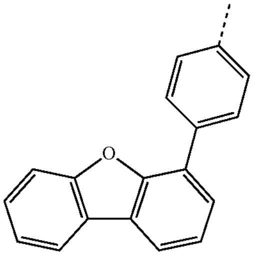
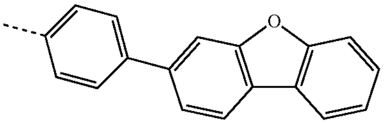
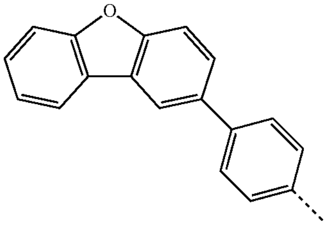
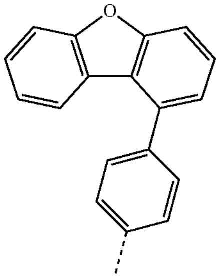
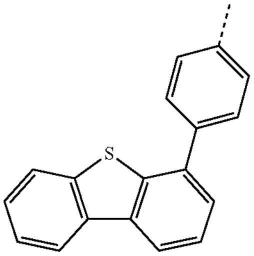
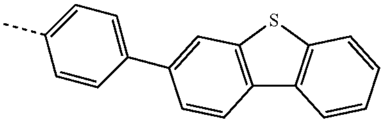
-continued
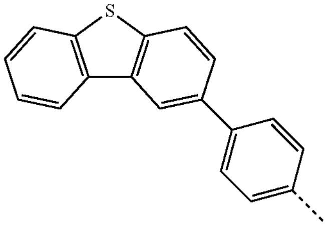
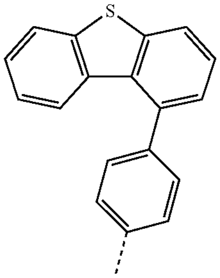
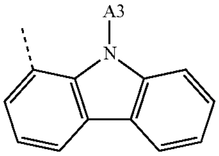
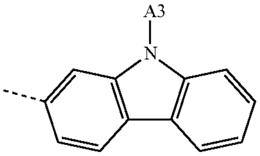
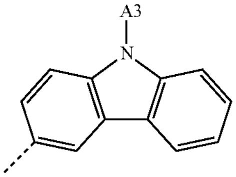
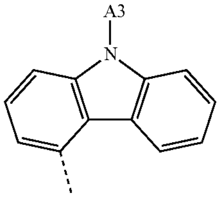
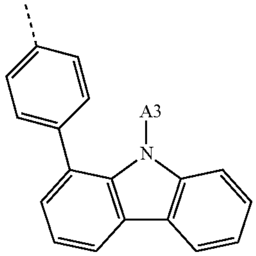
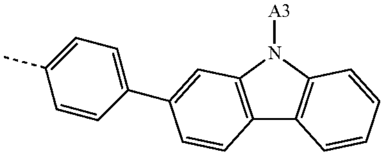
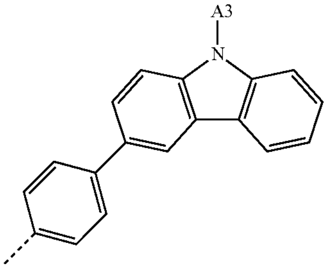
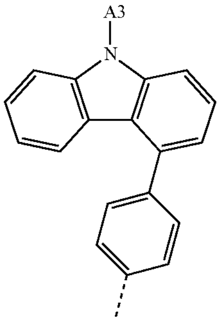

wherein in the structures:

a dotted line denotes a bonding position; and

A3 to A5 are the same as or different from each other, and are each independently hydrogen, a substituted or unsubstituted alkyl group, or a substituted or unsubstituted aryl group.

In the present specification, L1 to L3 are the same as or different from each other, and are each independently a direct bond, a substituted or unsubstituted phenylene group, a substituted or unsubstituted biphenylene group, a substituted or unsubstituted naphthylene group, a substituted or unsubstituted fluorene group, a substituted or unsubstituted spirofluorene group, a substituted or unsubstituted divalent carbazole group, a substituted or unsubstituted divalent dibenzofuran group, or a substituted or unsubstituted divalent dibenzothiophene group.

In the present specification, L1 to L3 are each independently any one of the following structures:

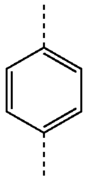
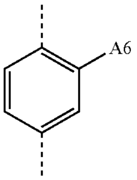
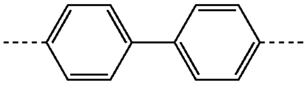
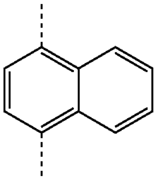
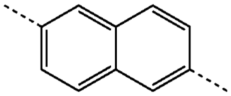
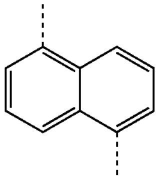
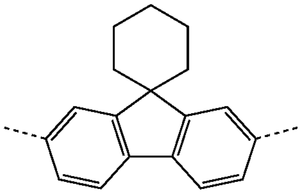
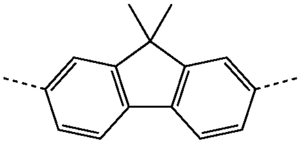
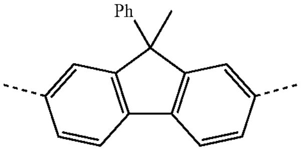
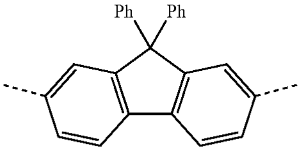
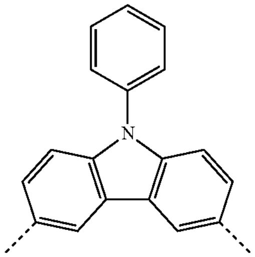
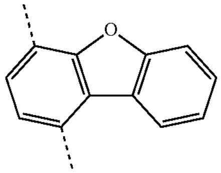

-continued

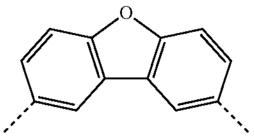
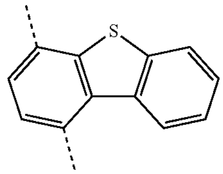
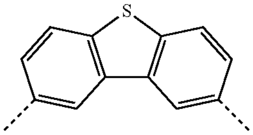

wherein in the structures, the dotted line denotes a bonding position, and A6 is a substituted or unsubstituted alkyl group, or a substituted or unsubstituted aryl group. Here, Ph is a phenyl group.

In the present specification, the compound of Chemical Formula 1 is any one of the following compounds:

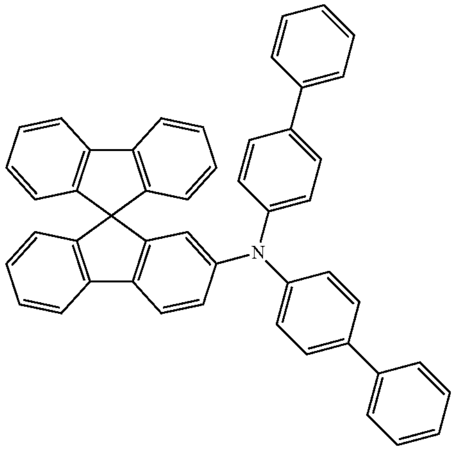

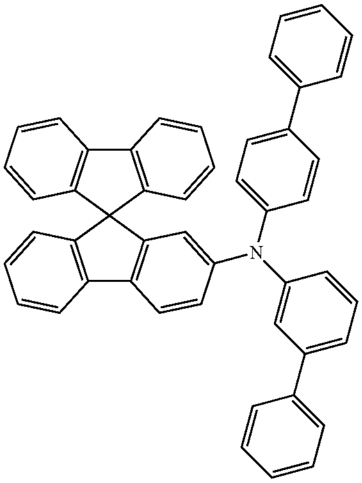

-continued
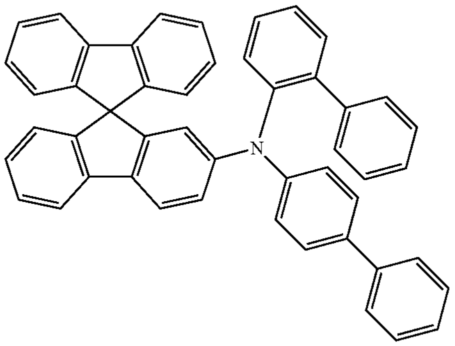
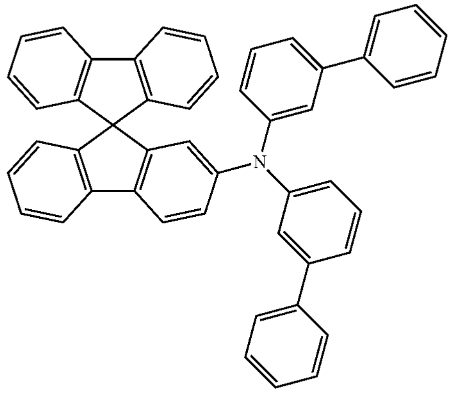
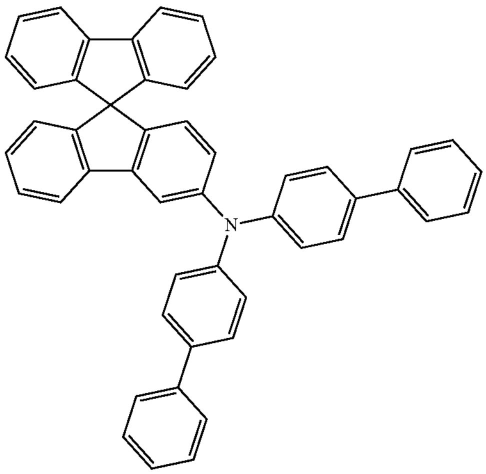
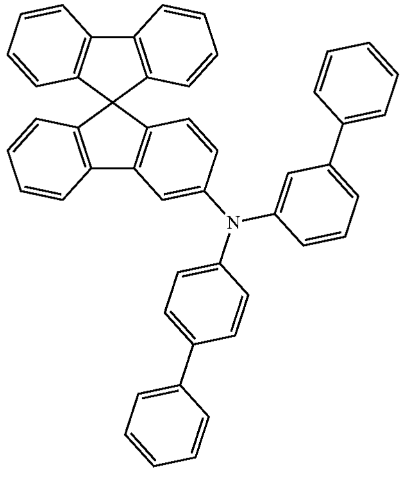
-continued
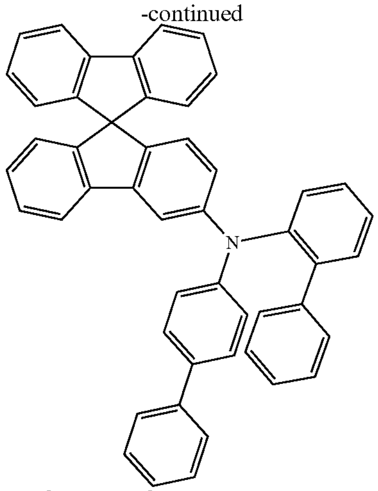
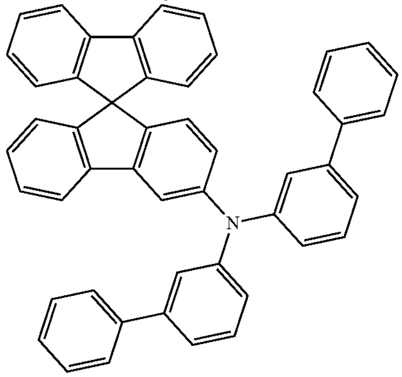
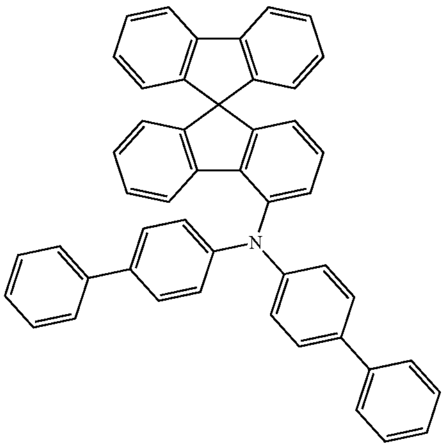
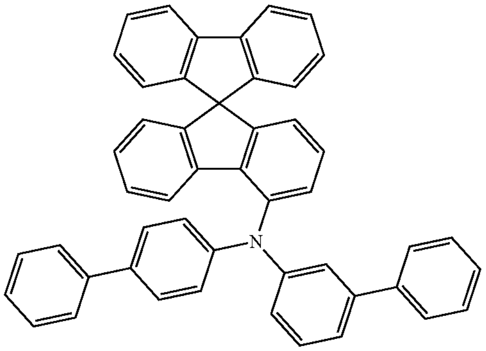

-continued
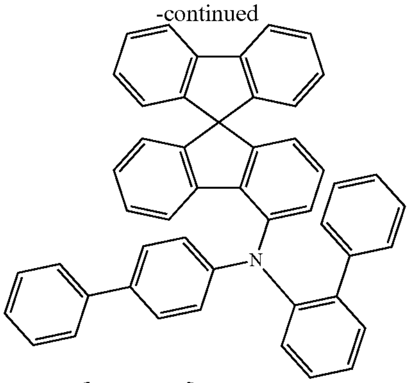
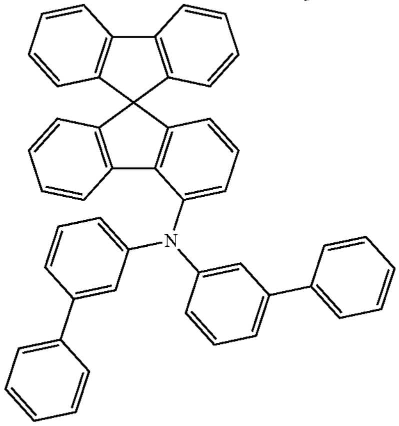
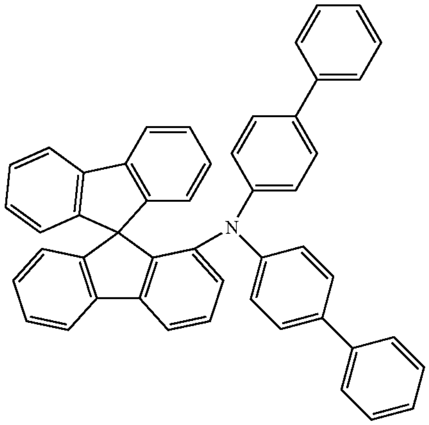
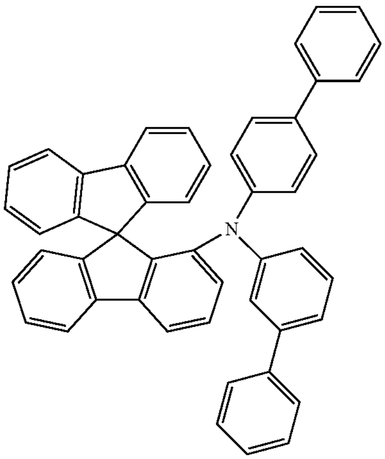
-continued
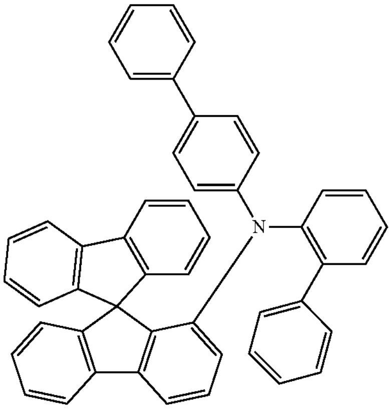
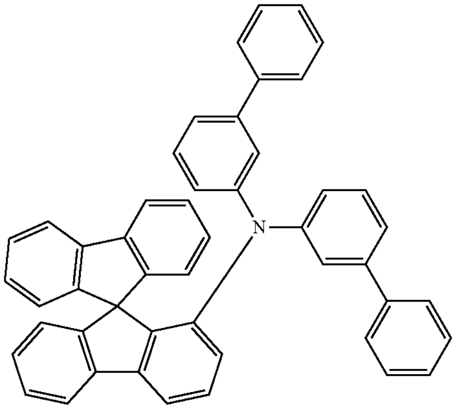
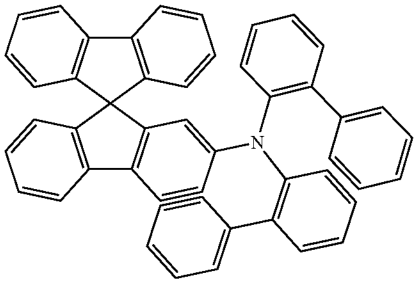
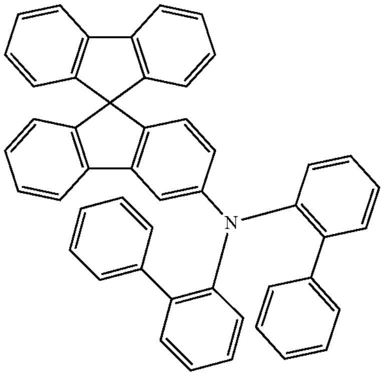

-continued
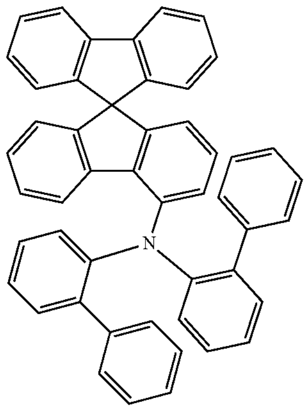
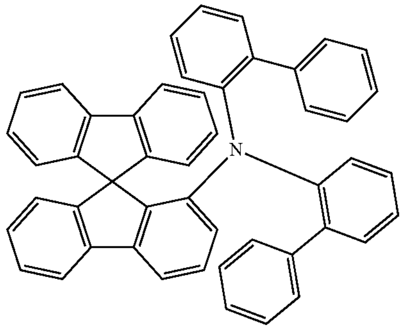
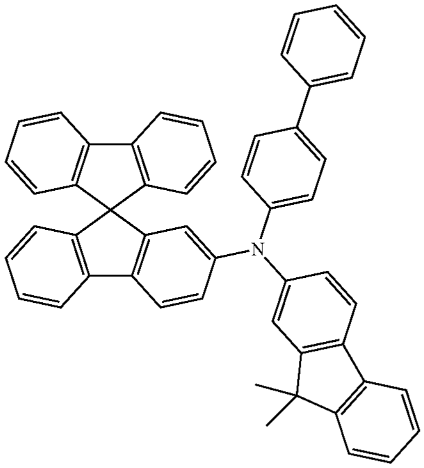
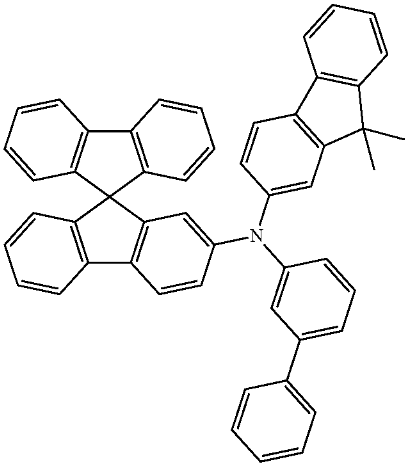
-continued
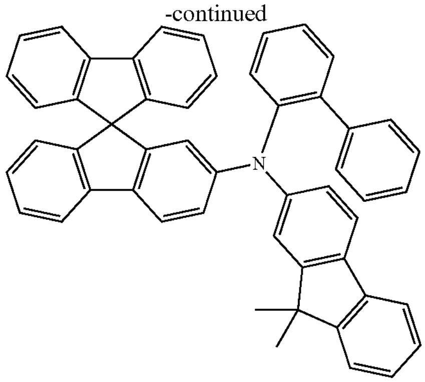
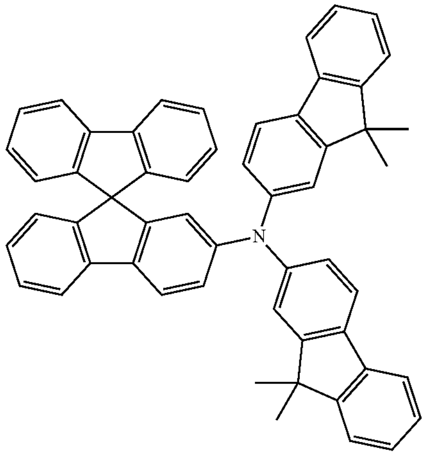
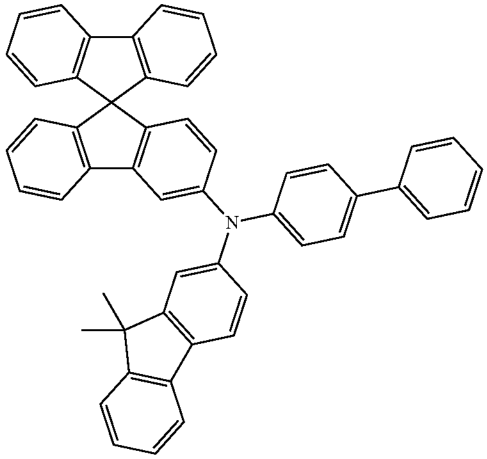
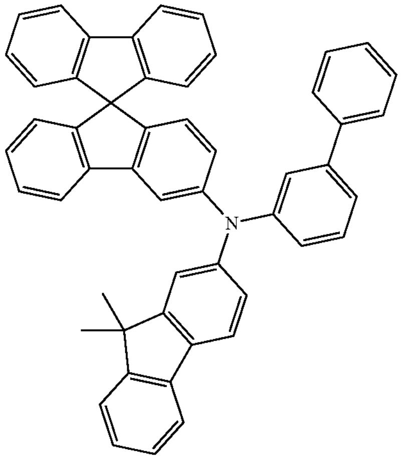

-continued
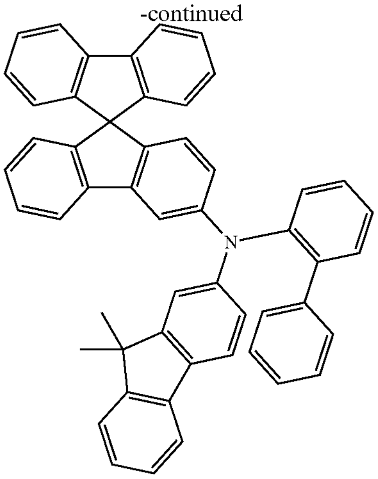
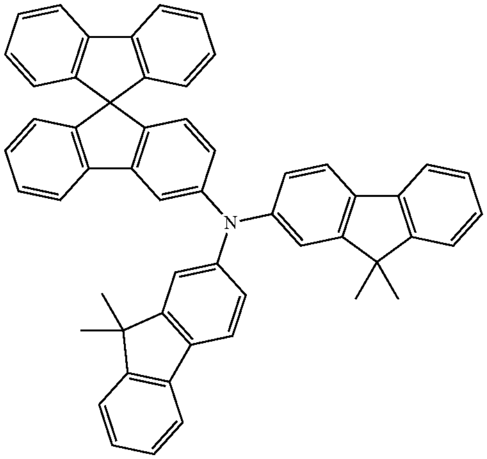
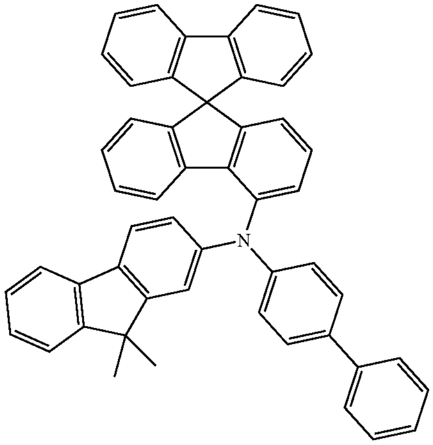
-continued
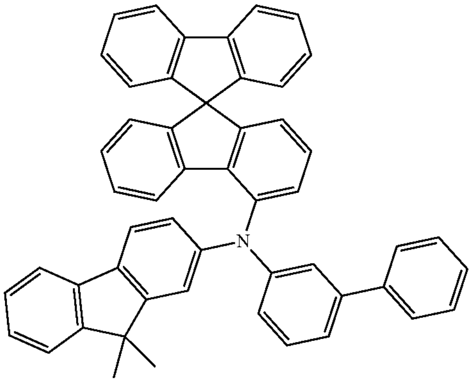
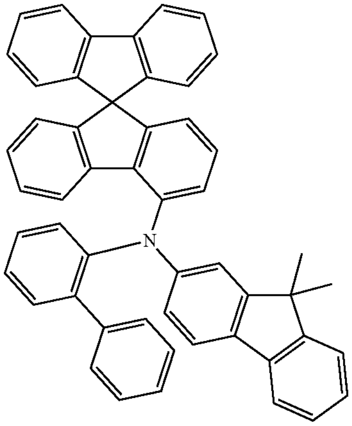
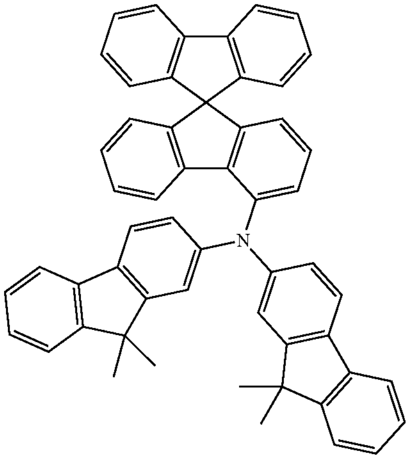
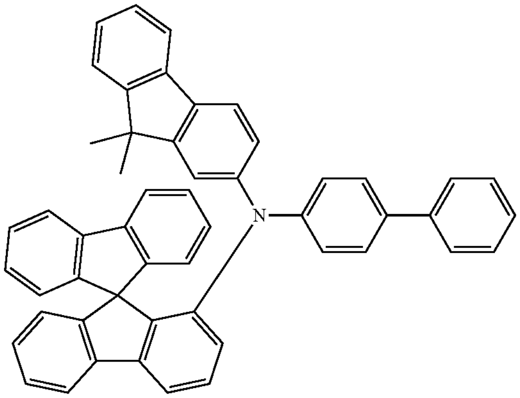

-continued
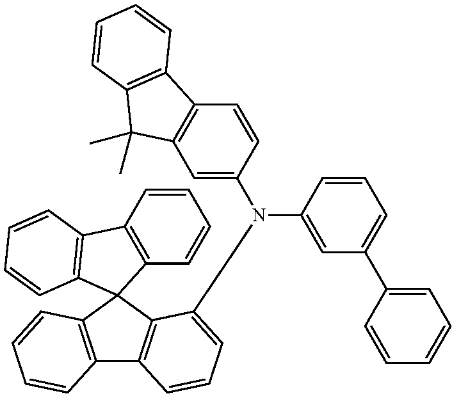
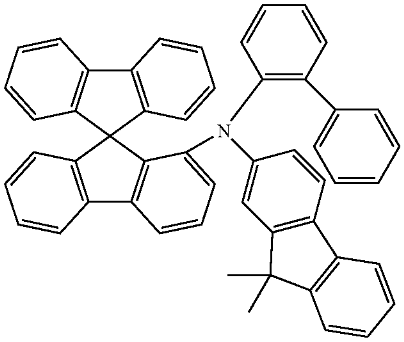
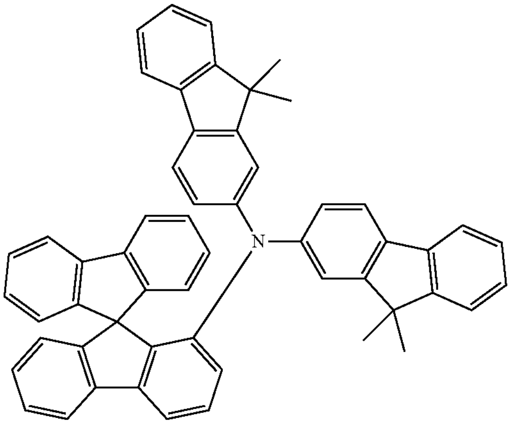
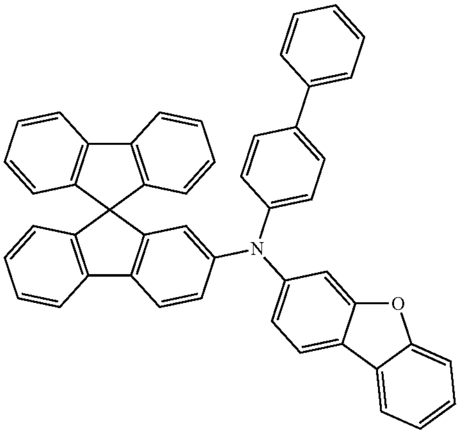
-continued
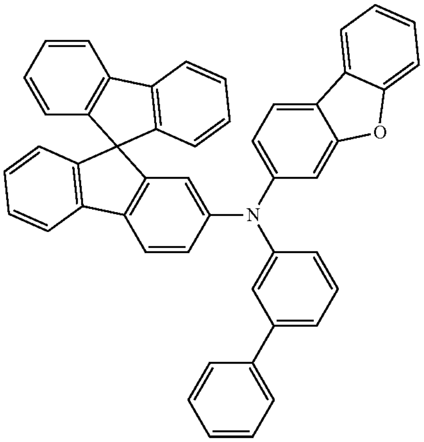
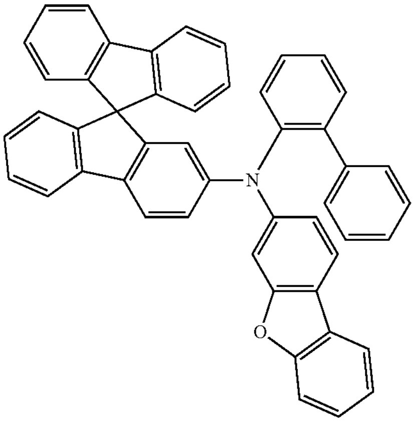
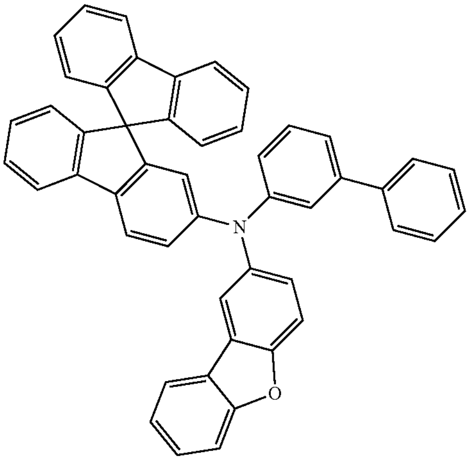
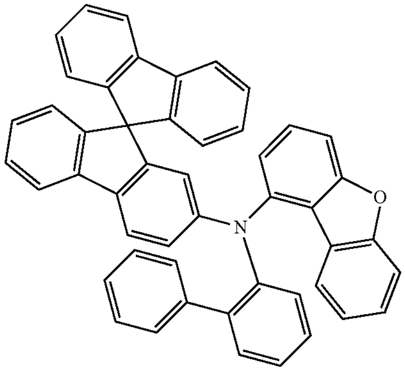

-continued
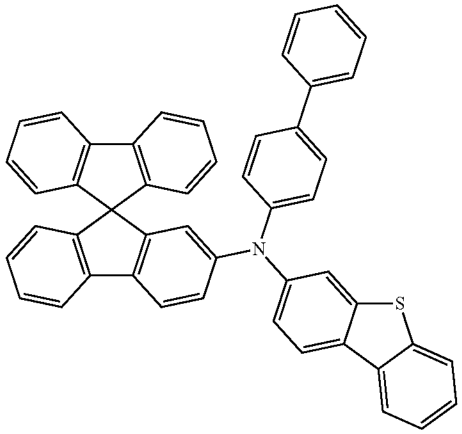
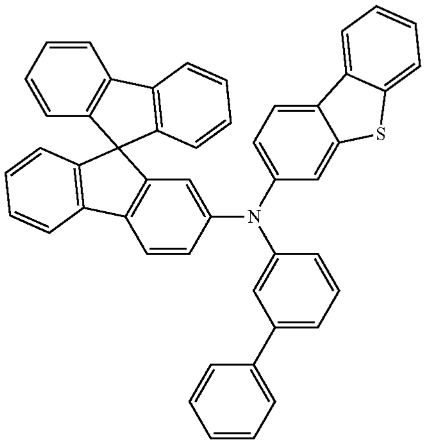
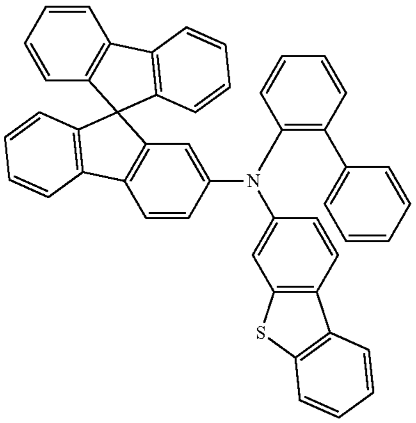
-continued
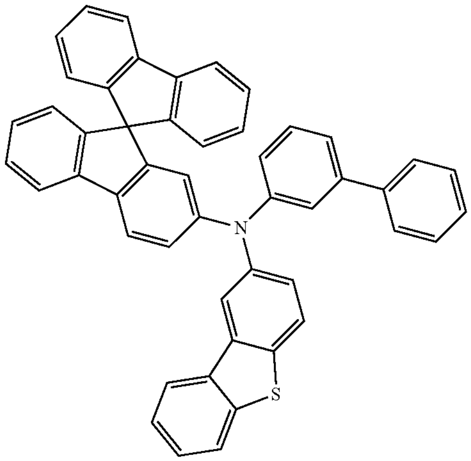
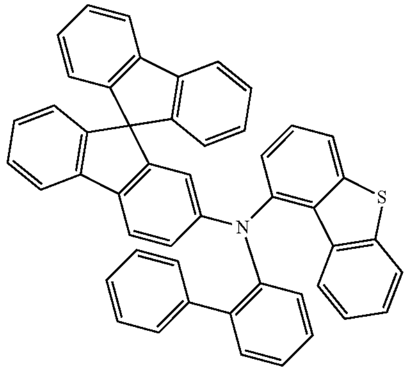
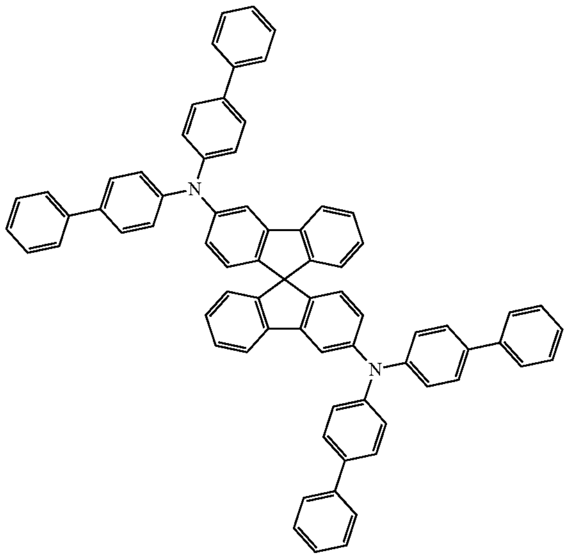

-continued
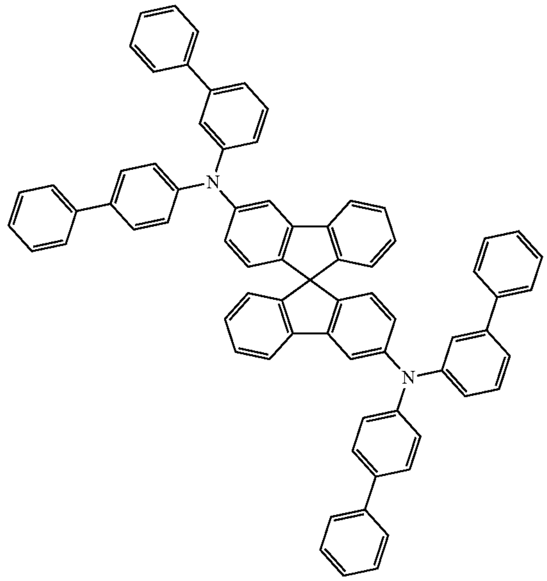
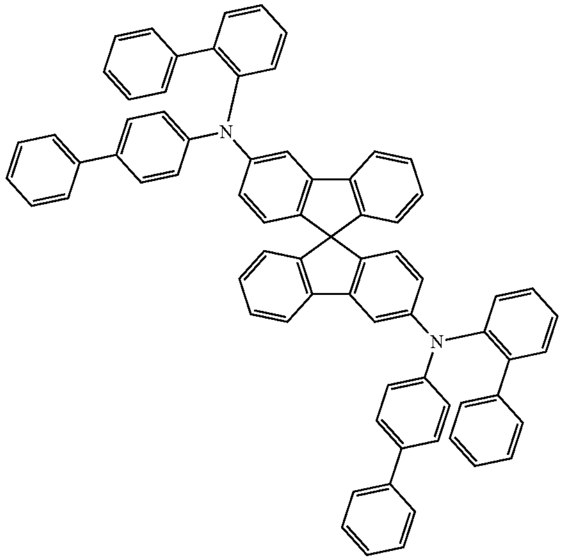
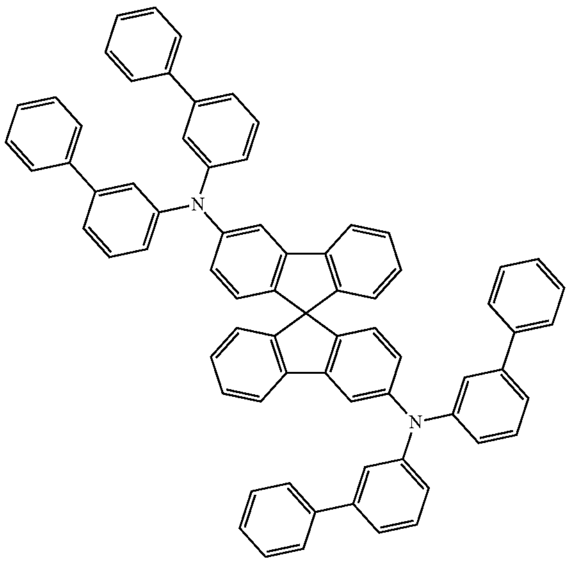
-continued
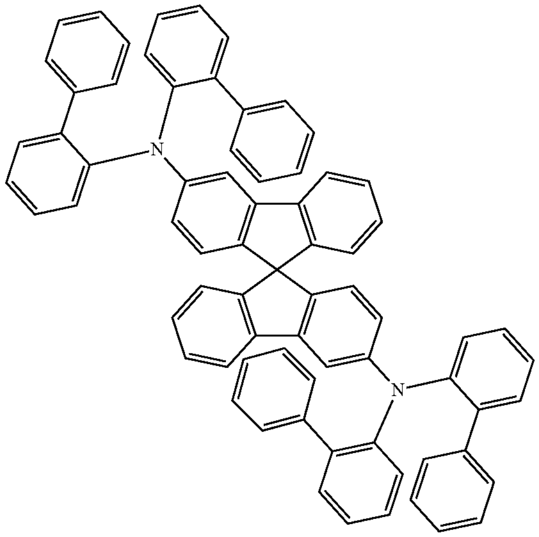
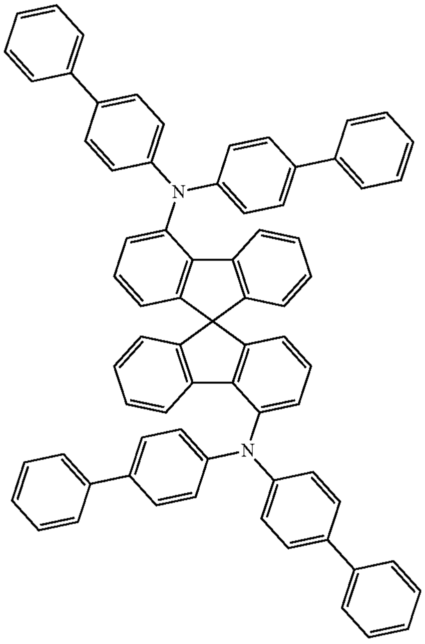

-continued
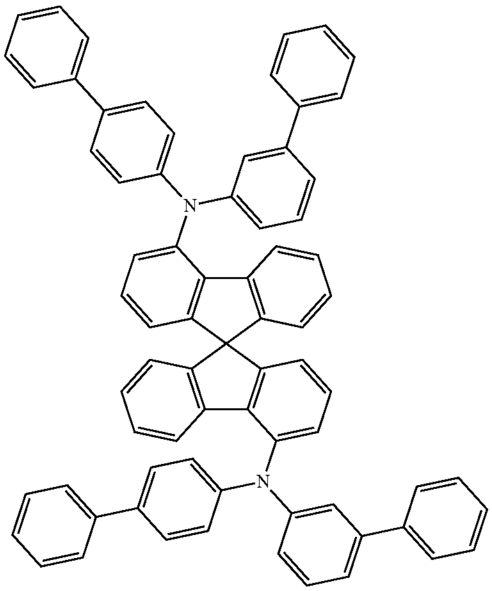
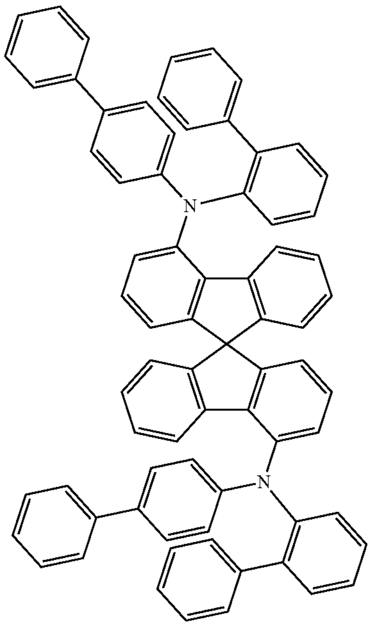
-continued
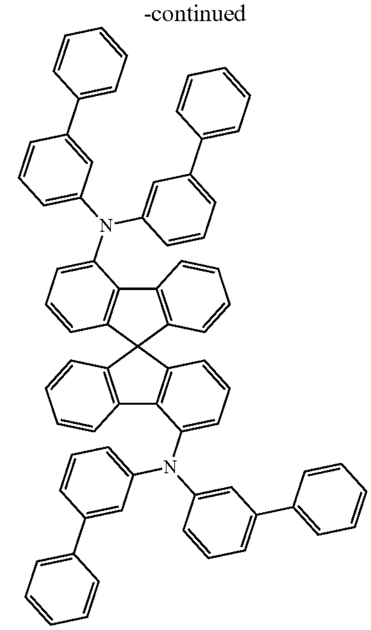
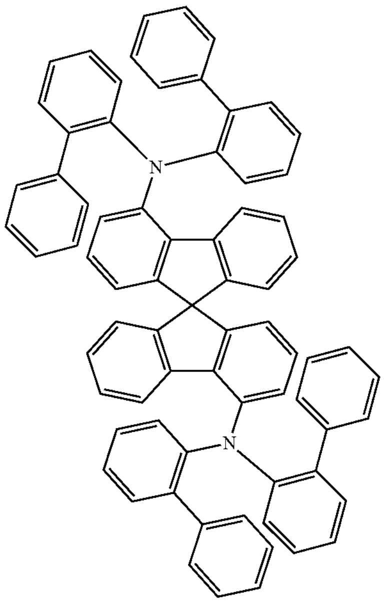
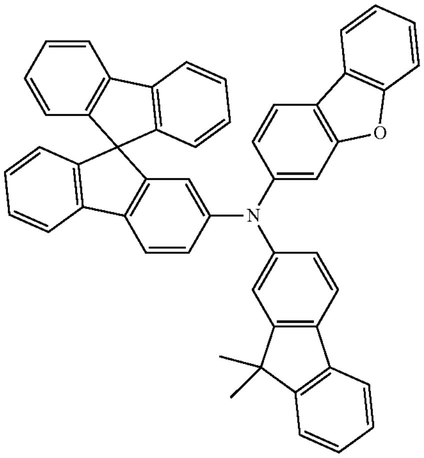

-continued
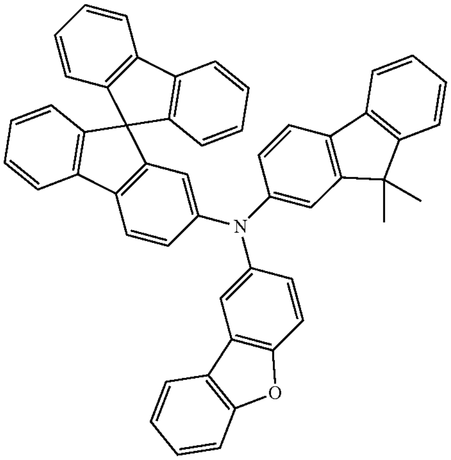
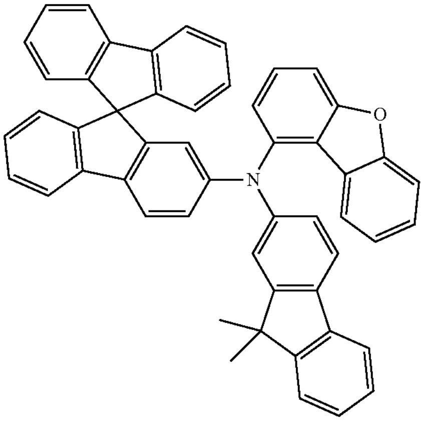
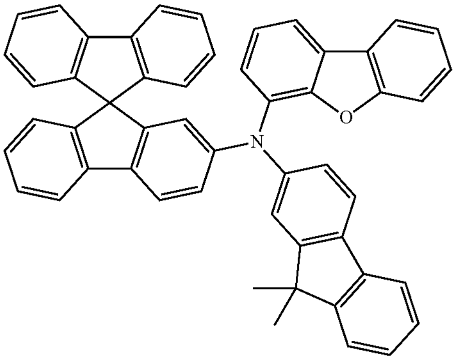
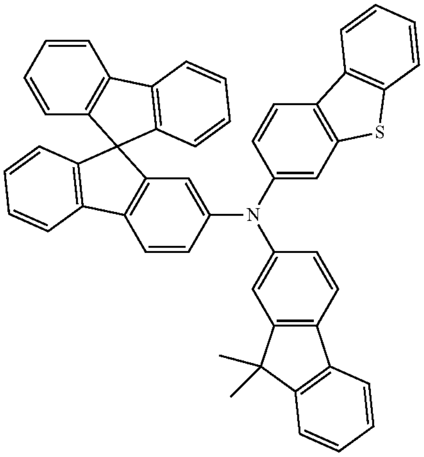
-continued
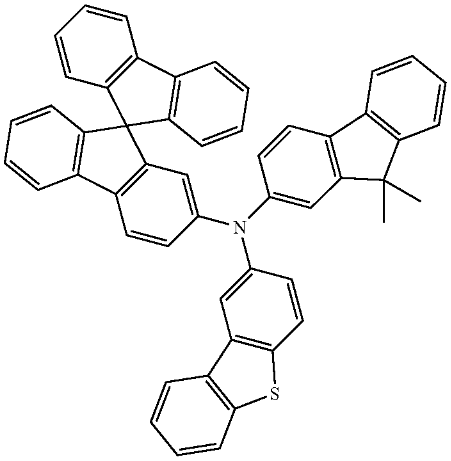
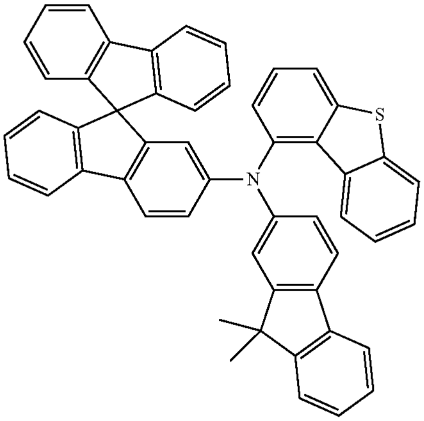
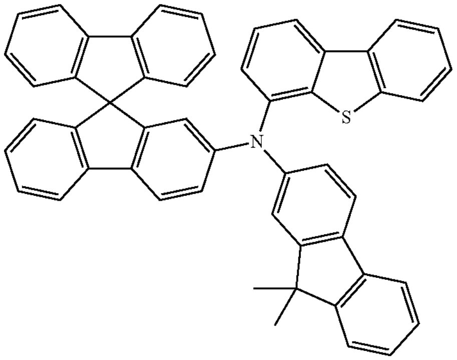

-continued
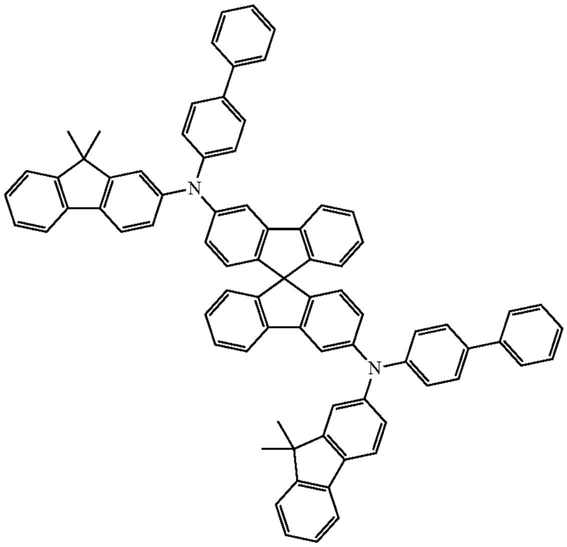
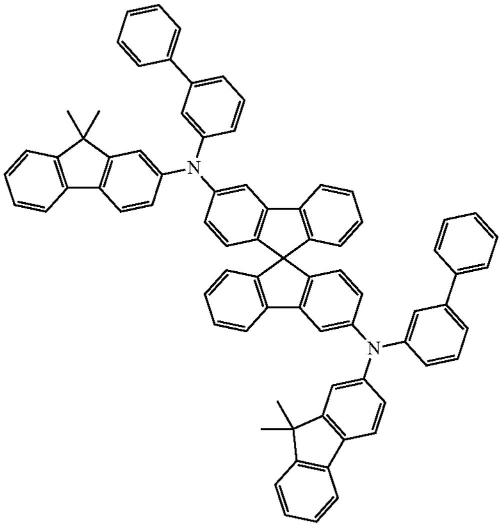
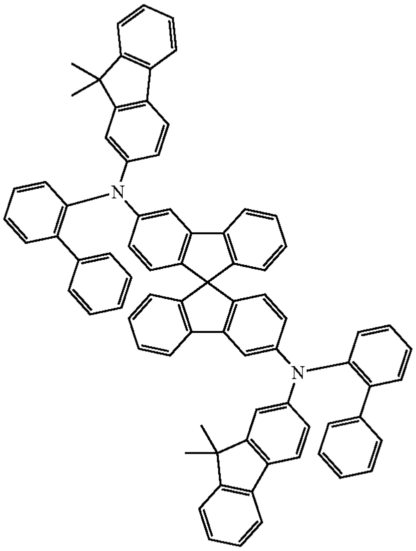
-continued
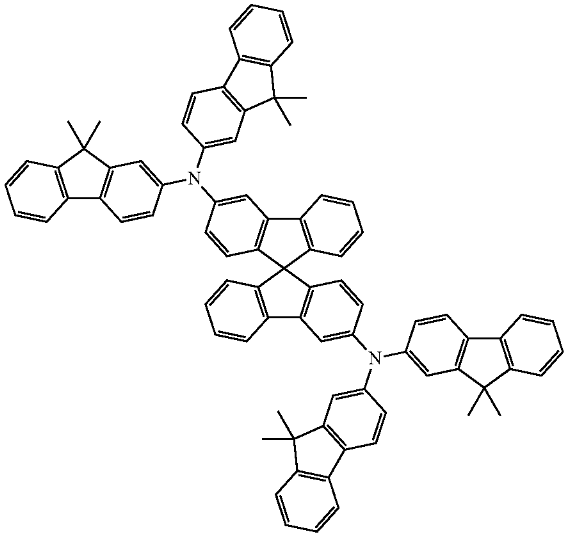
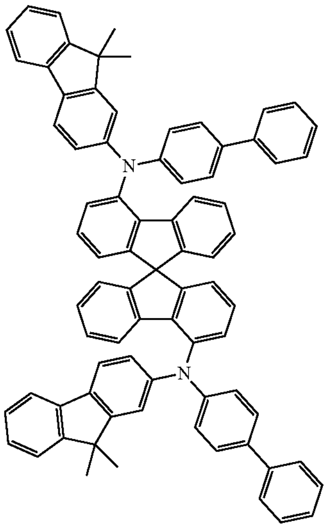
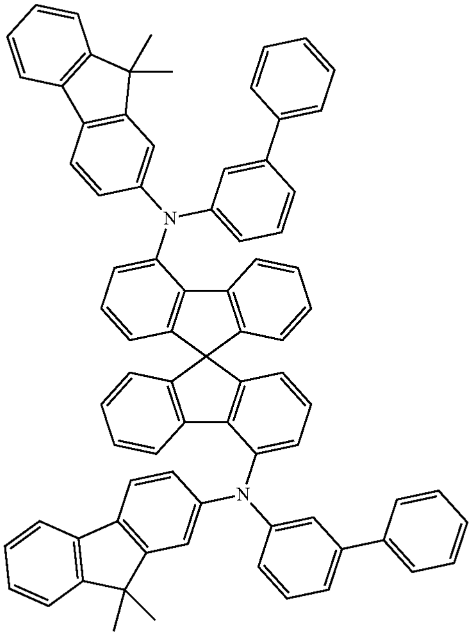

-continued
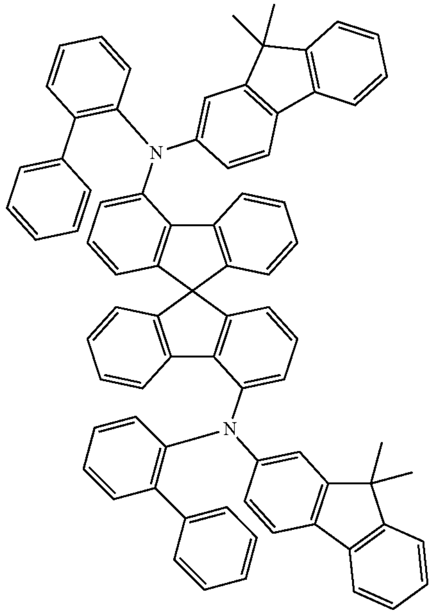
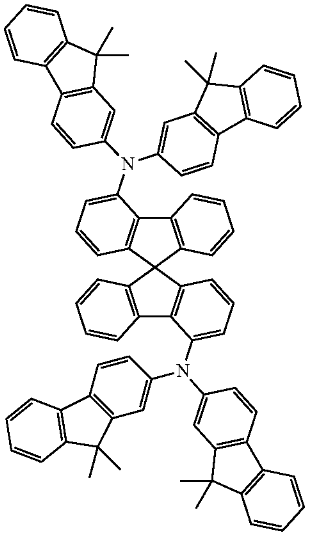
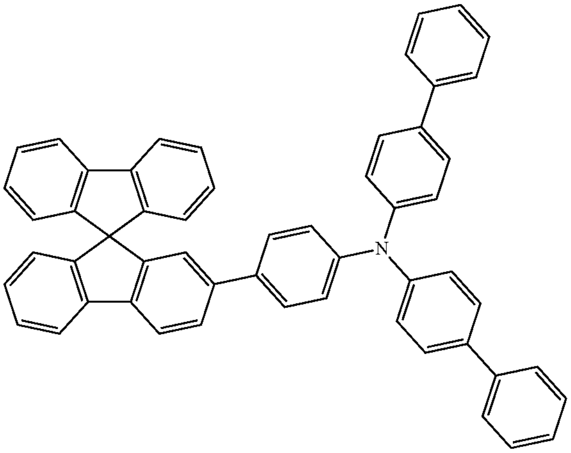
-continued
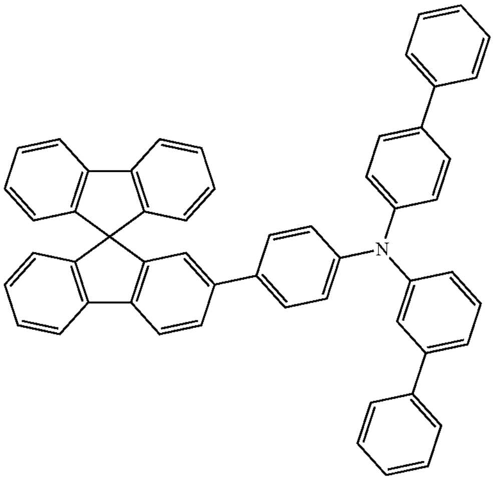
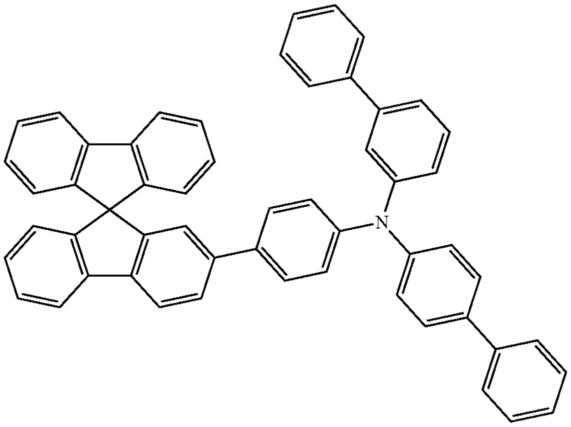
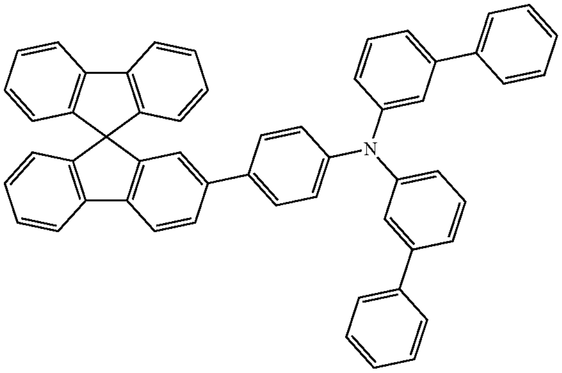

-continued
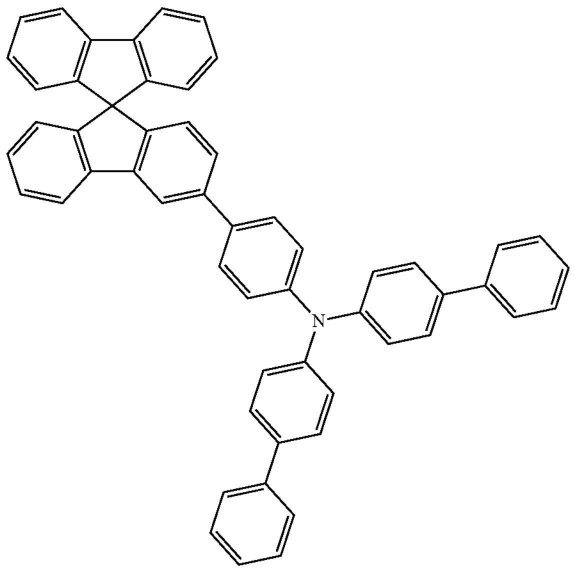
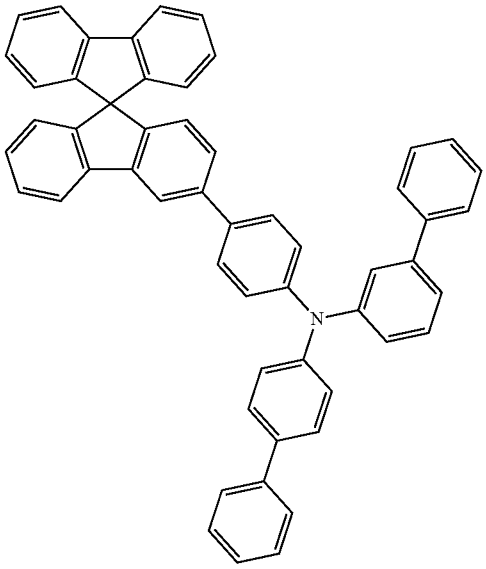
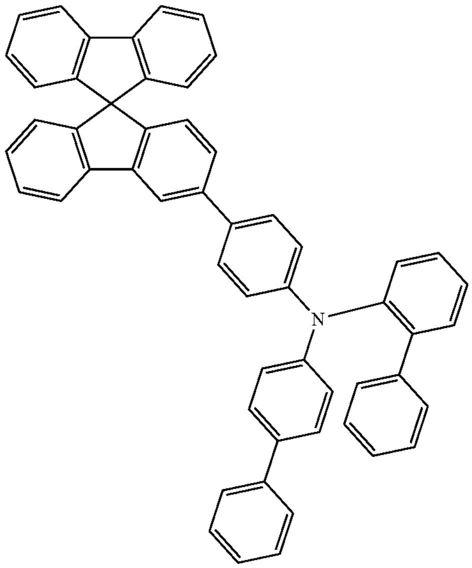
-continued
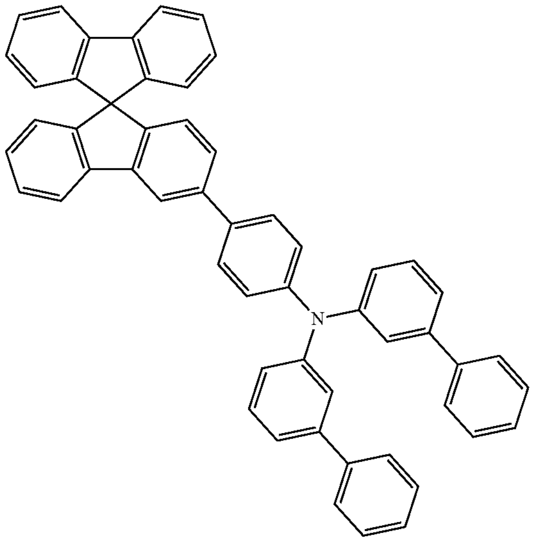
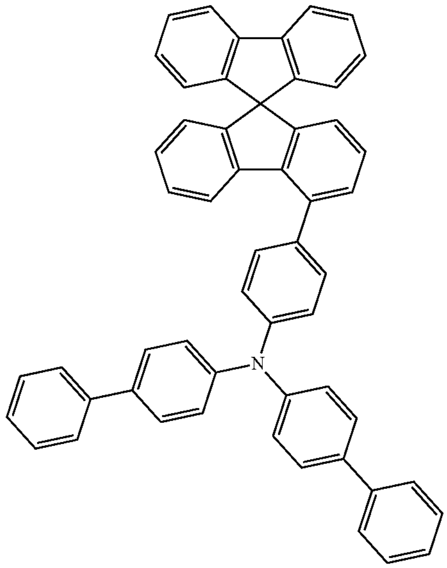
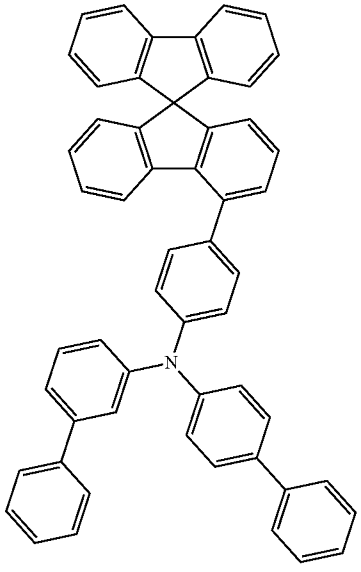

-continued
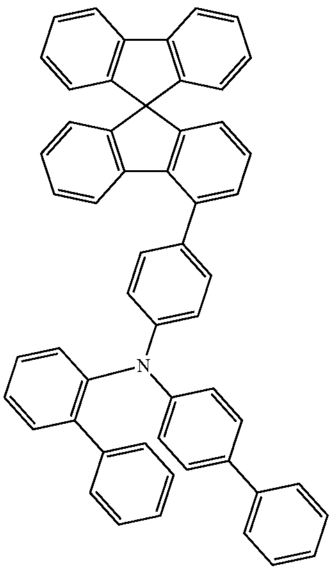
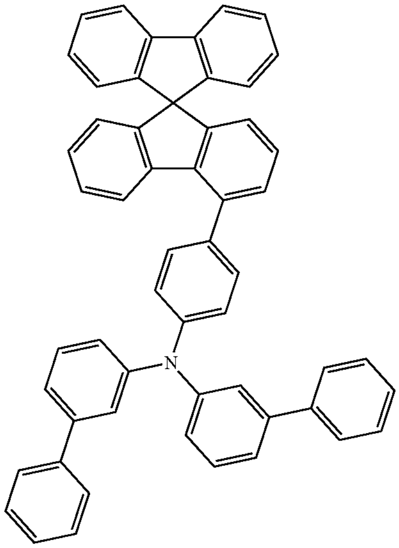
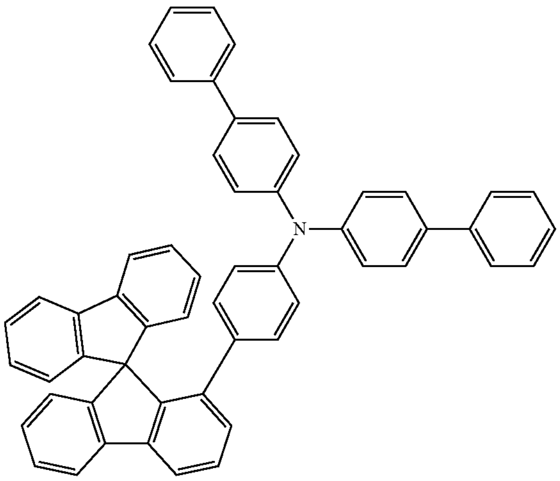
-continued
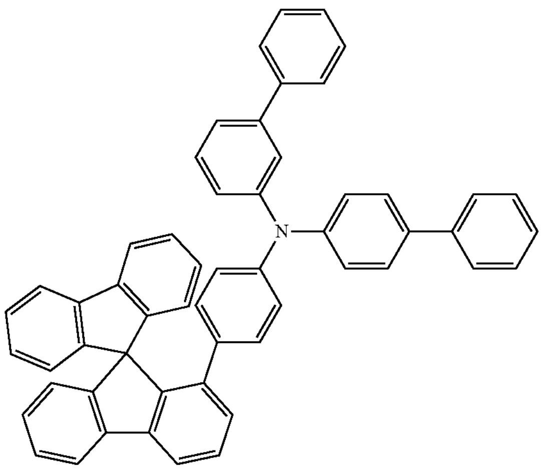
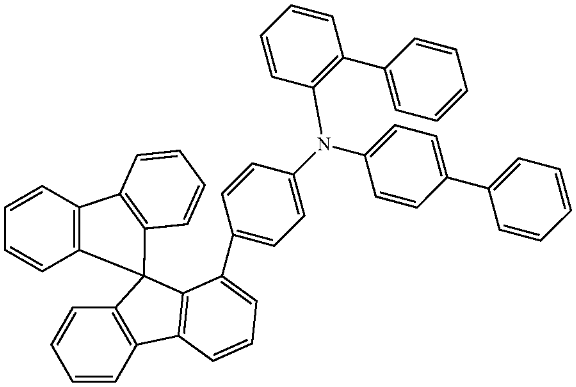
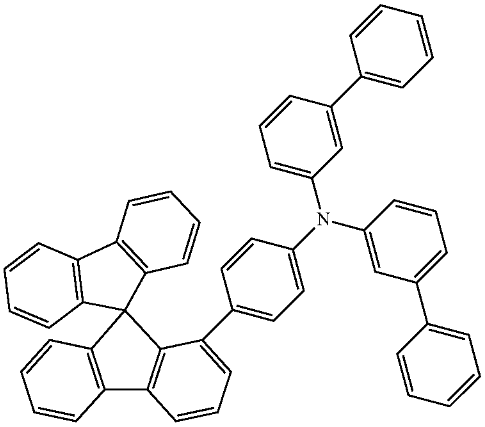
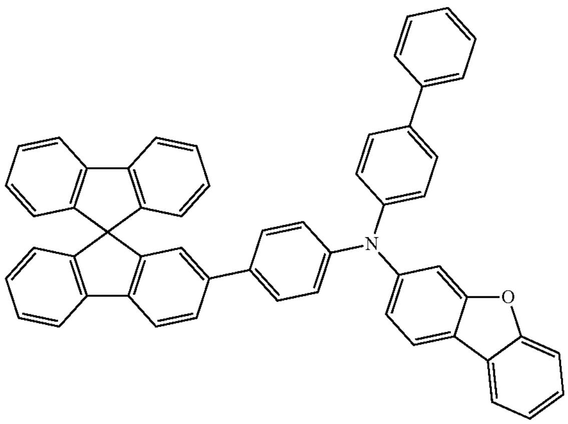

-continued
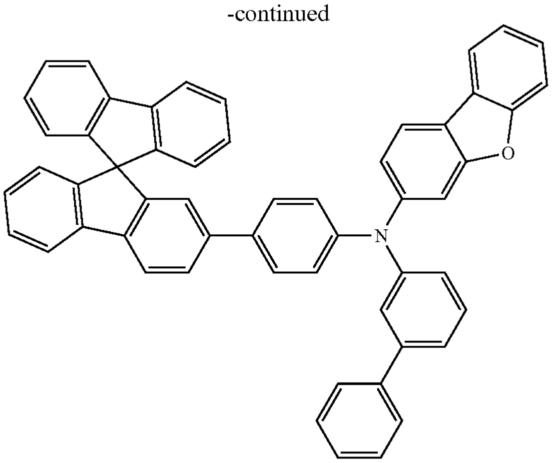
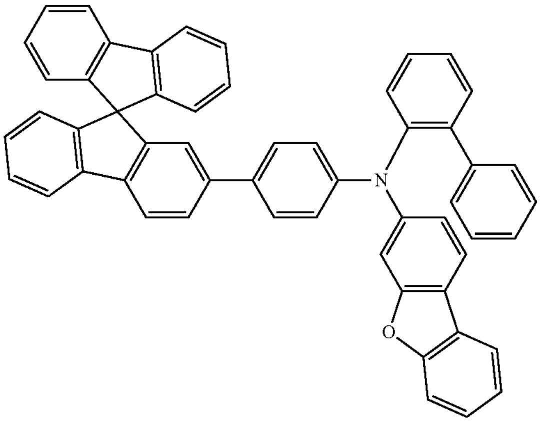
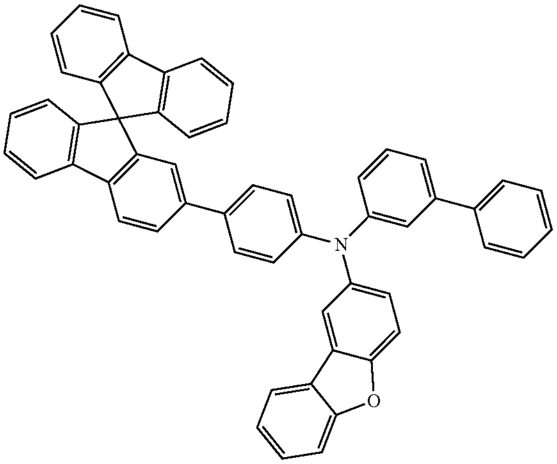
-continued
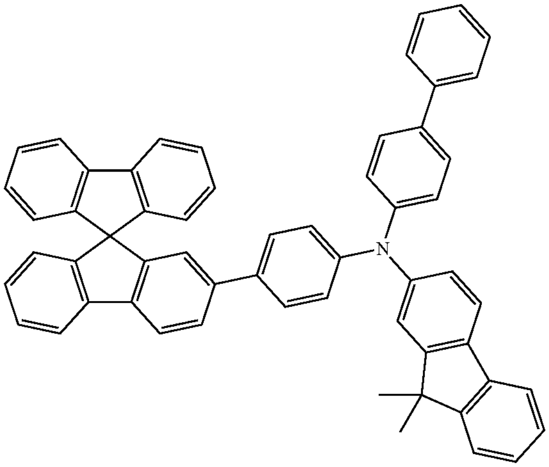
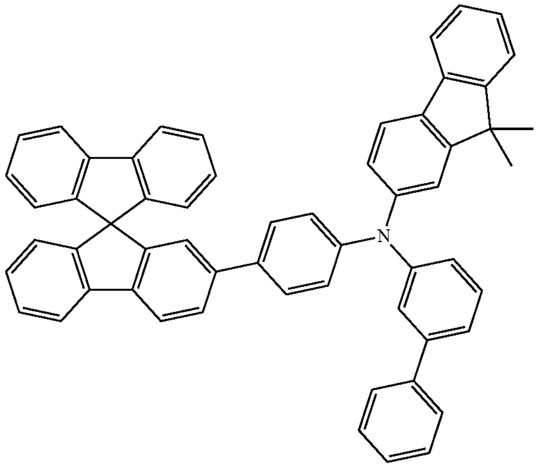
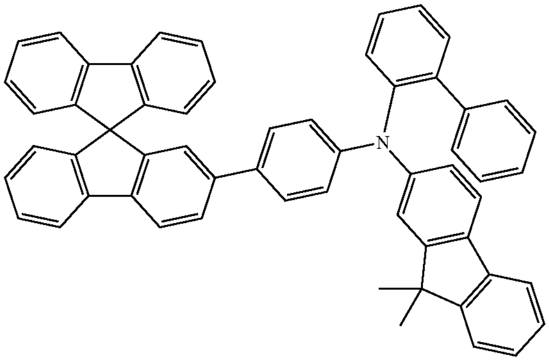

-continued
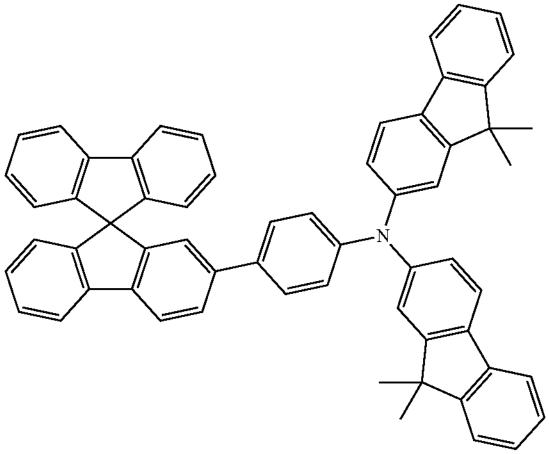
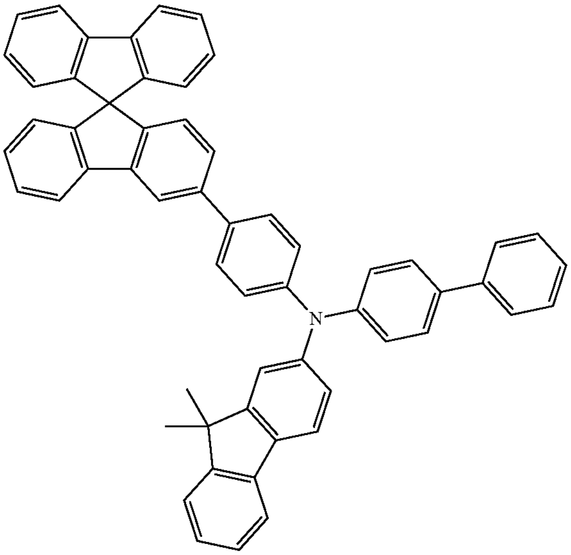
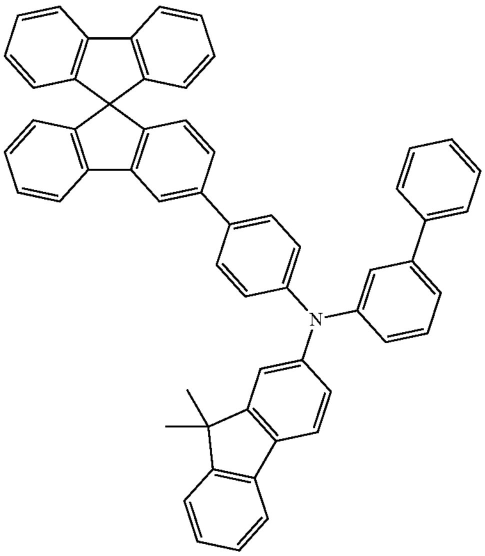
-continued
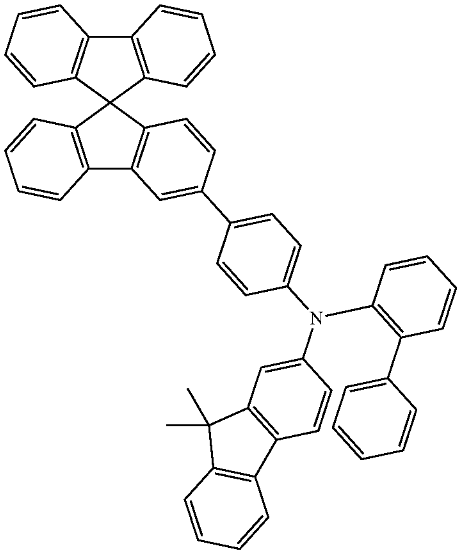
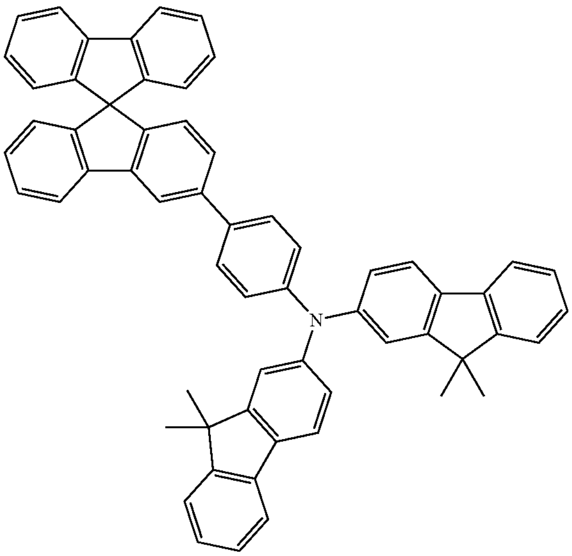
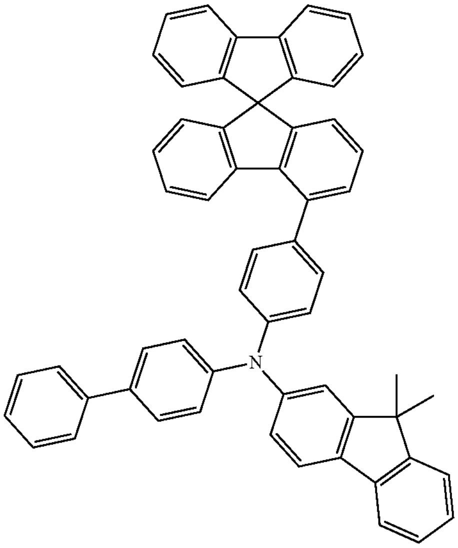

-continued
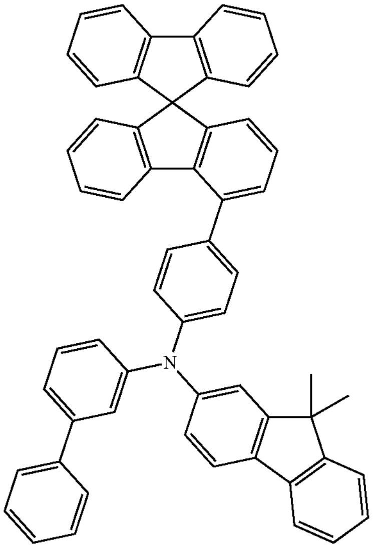
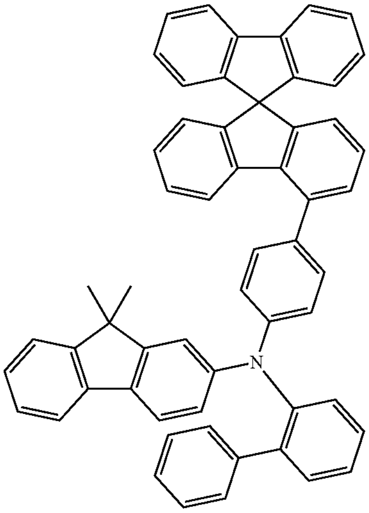
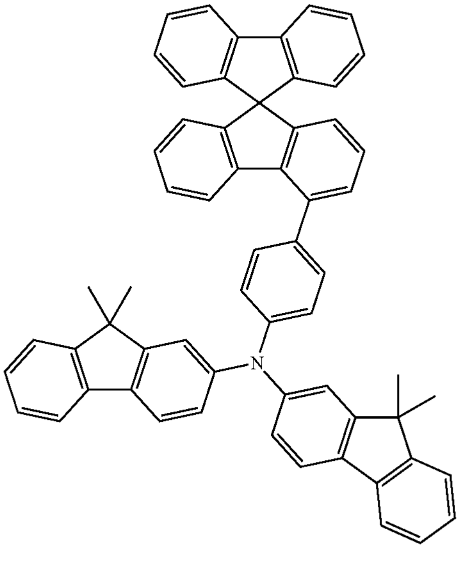
-continued
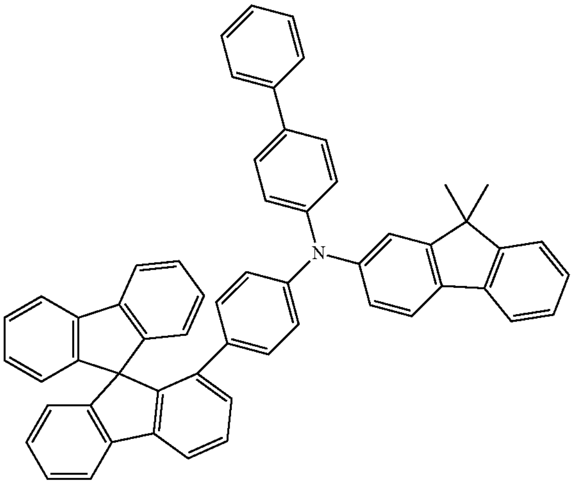
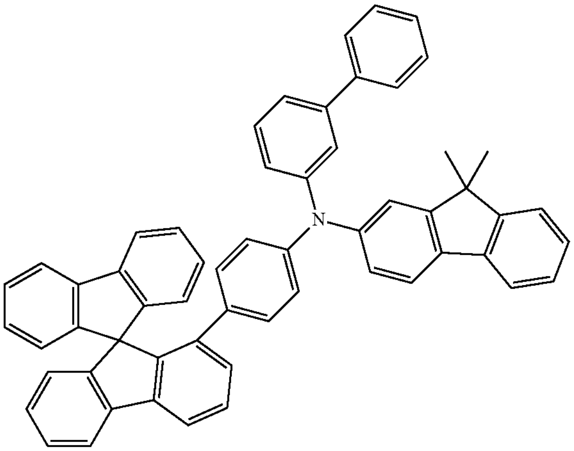
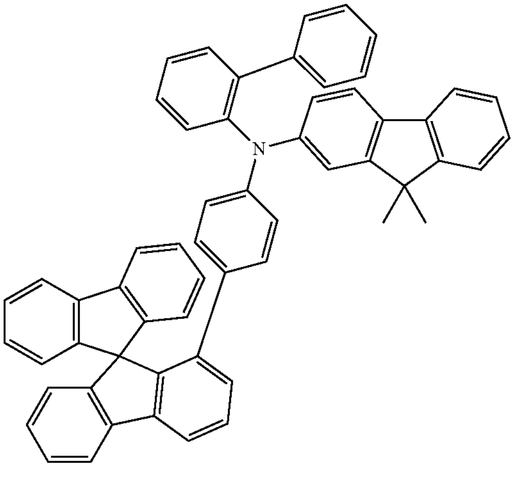

-continued
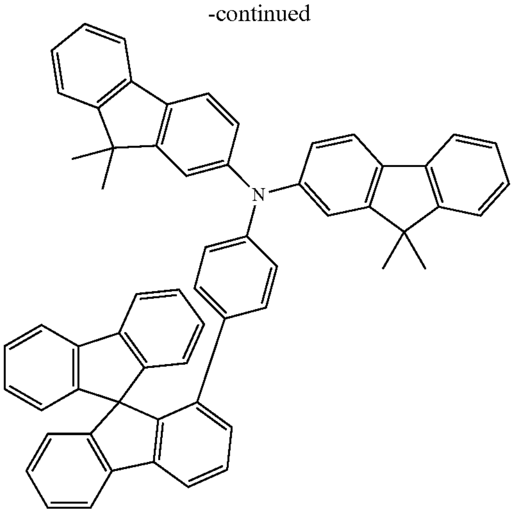
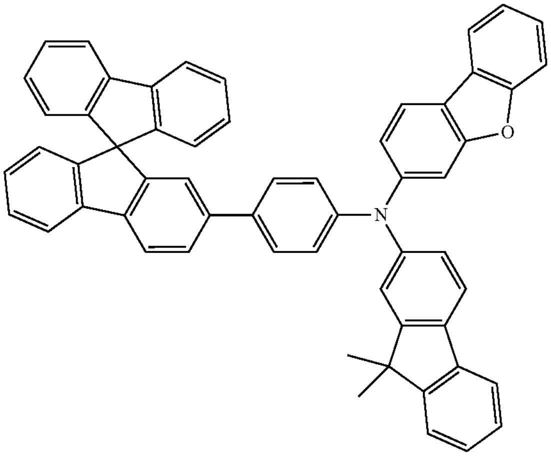
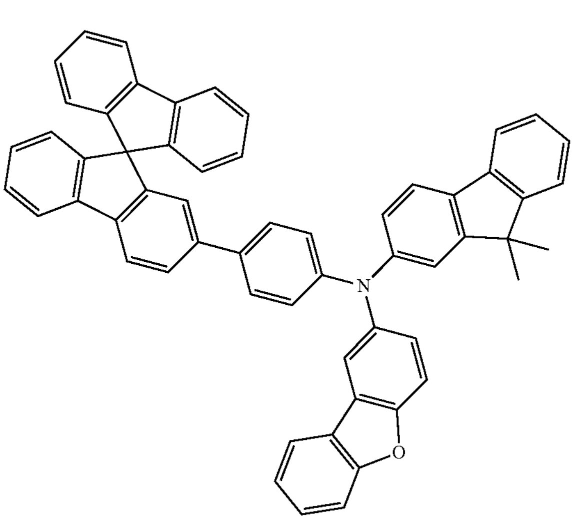
-continued
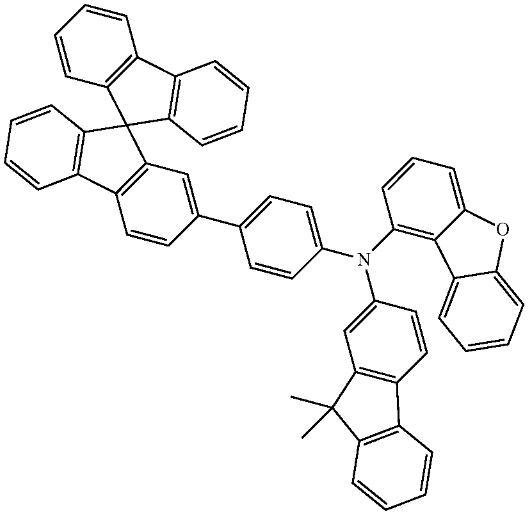
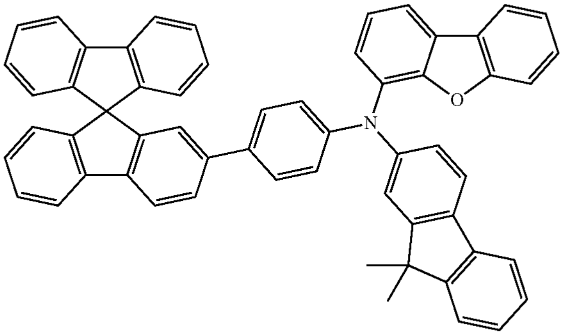
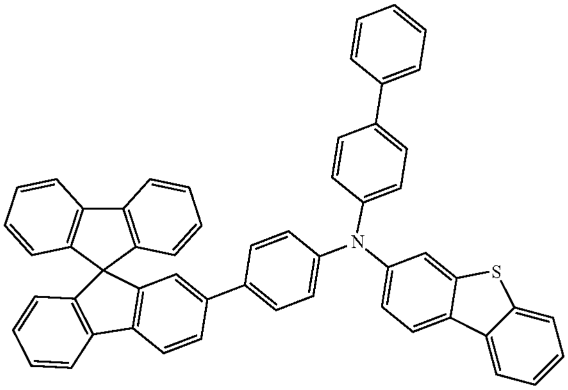

-continued
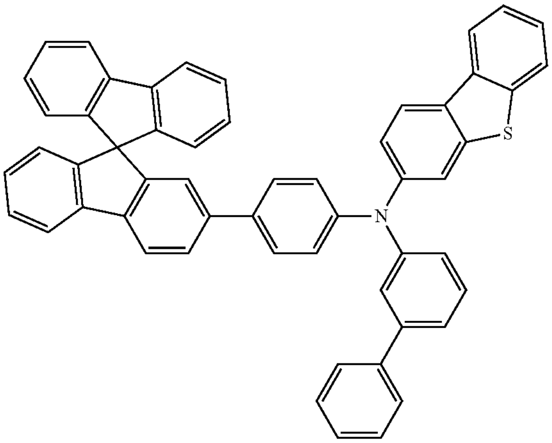
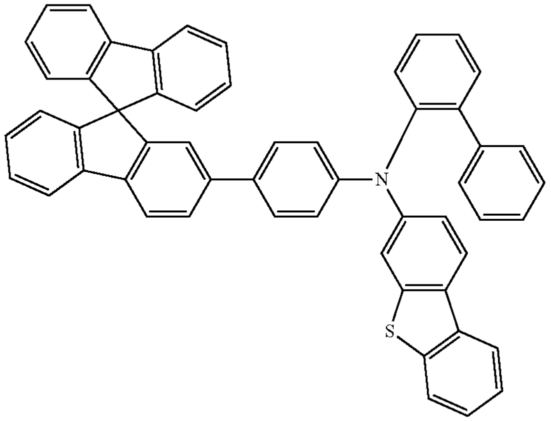
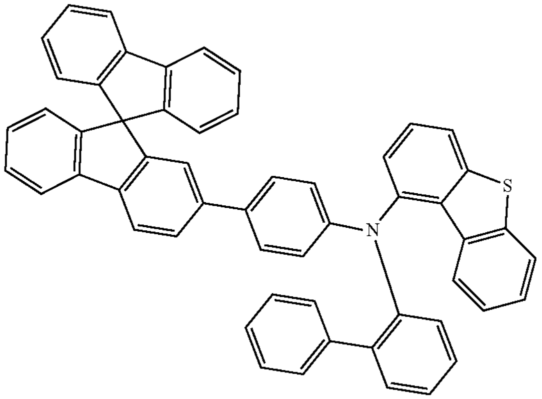
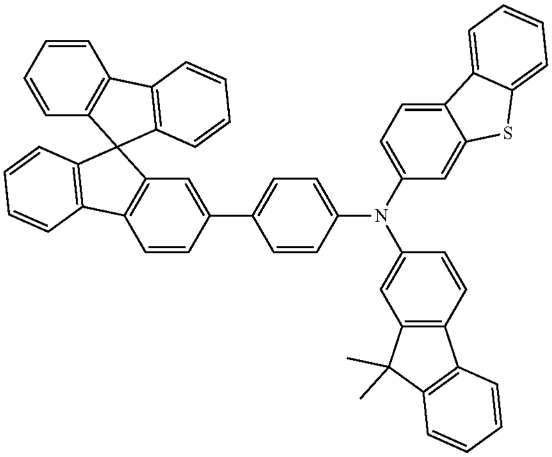
-continued
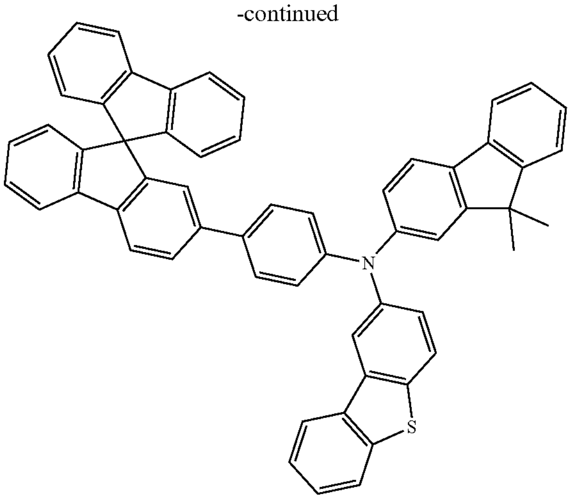
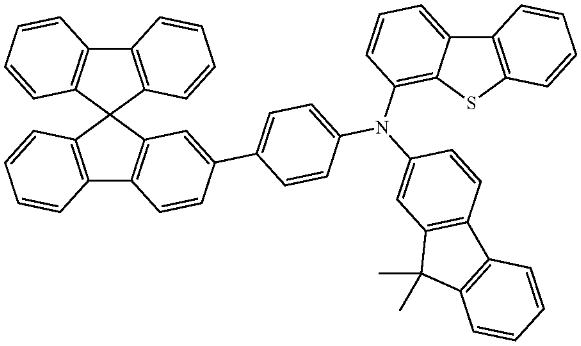
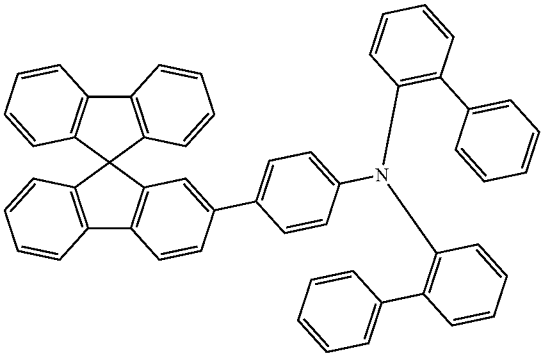
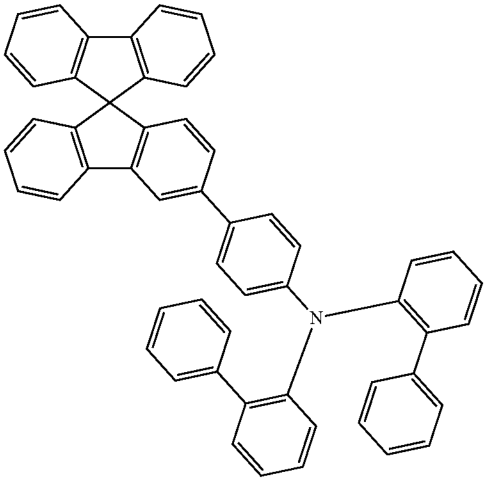

-continued
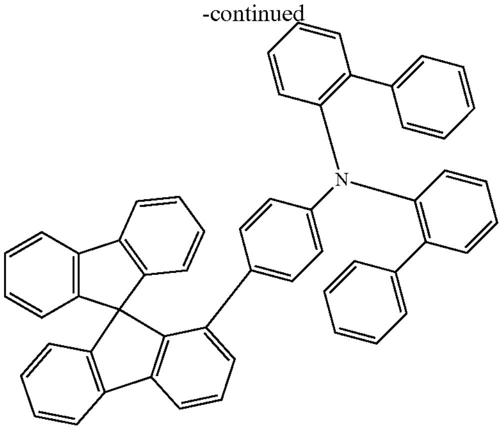
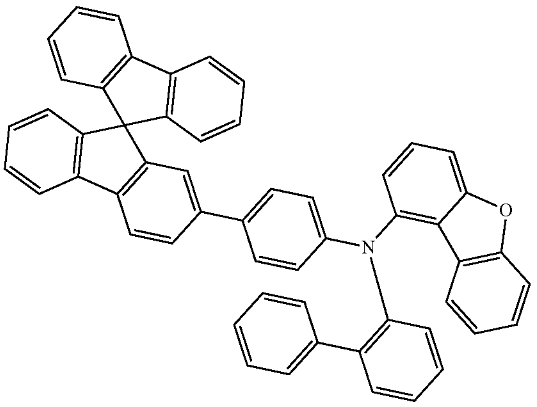
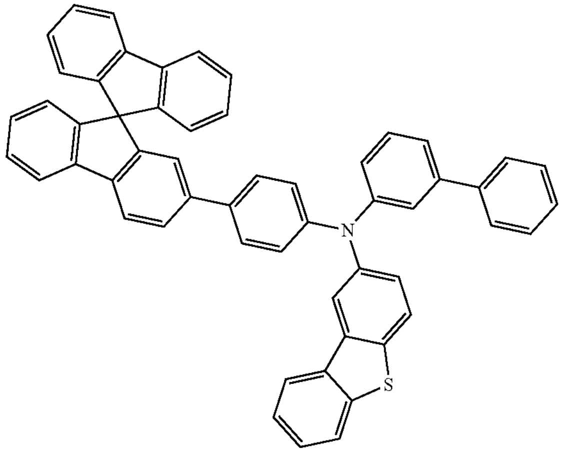
-continued
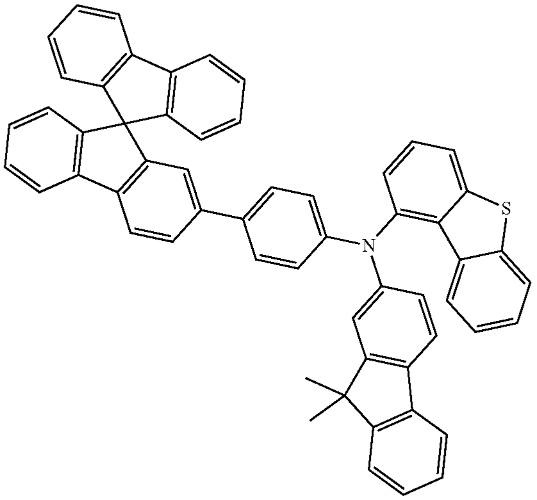
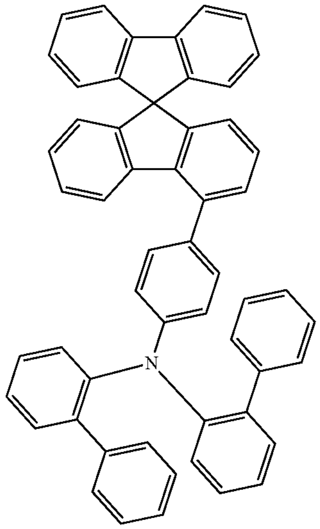
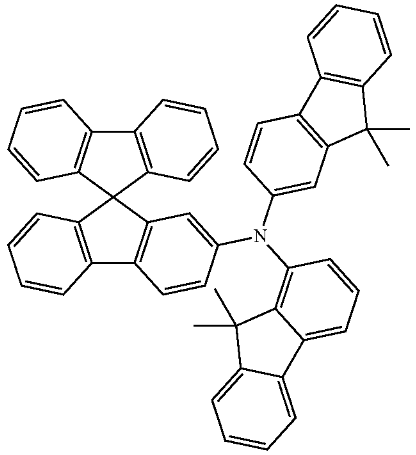

-continued
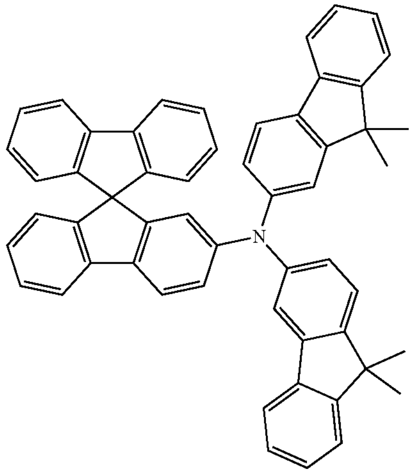
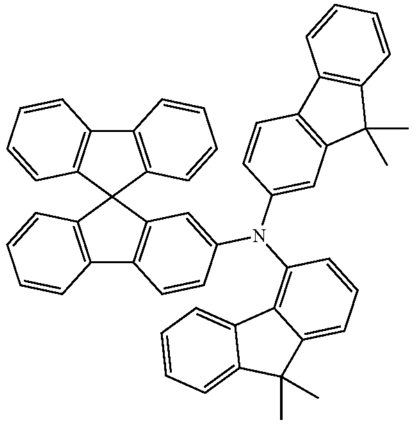
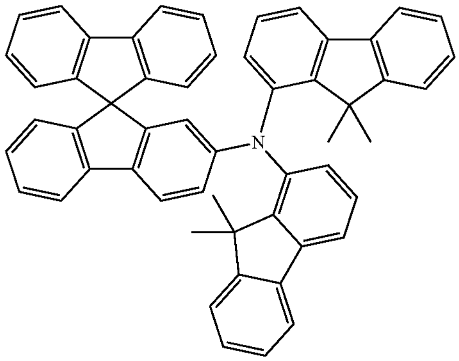
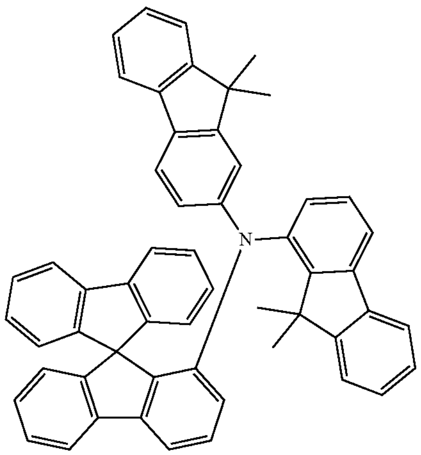
-continued
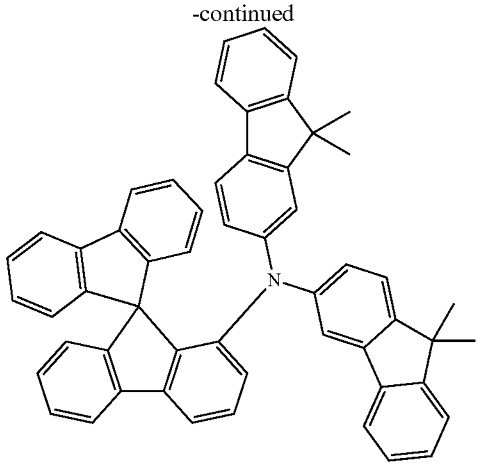
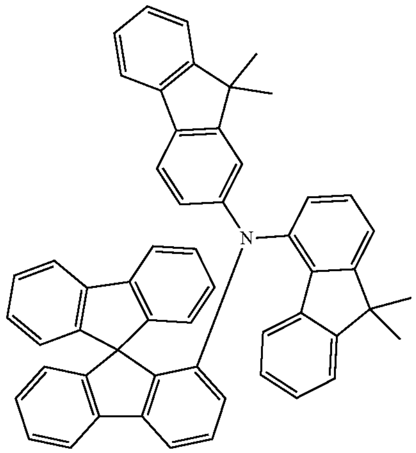
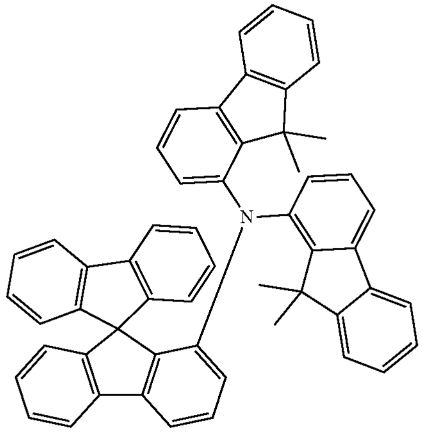

-continued
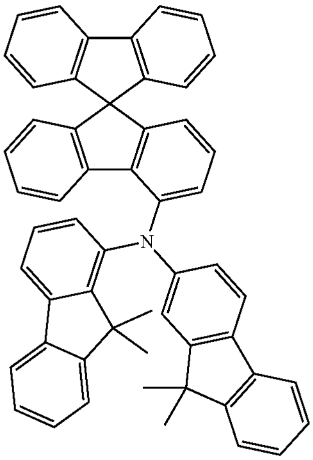
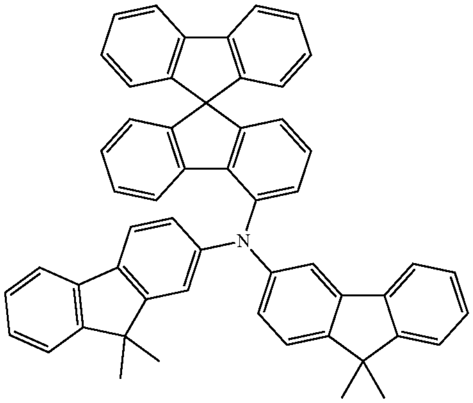
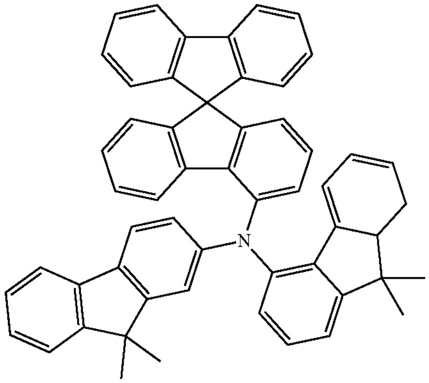
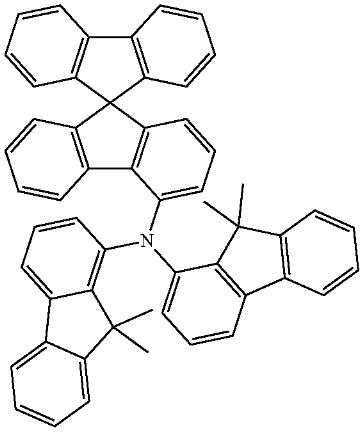
-continued
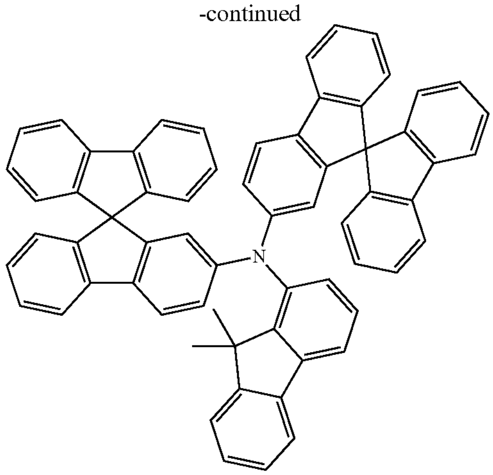
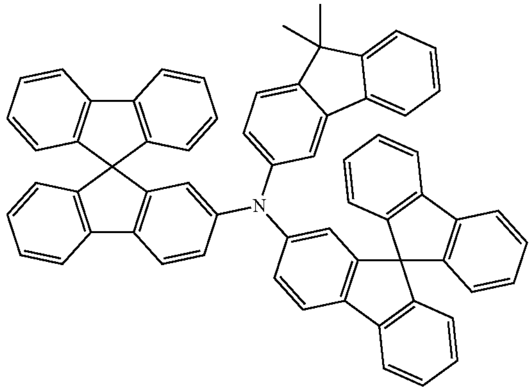
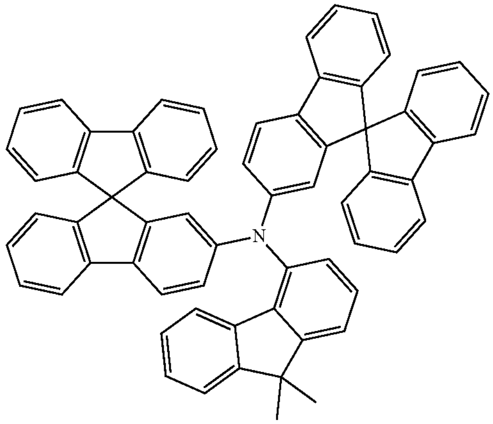
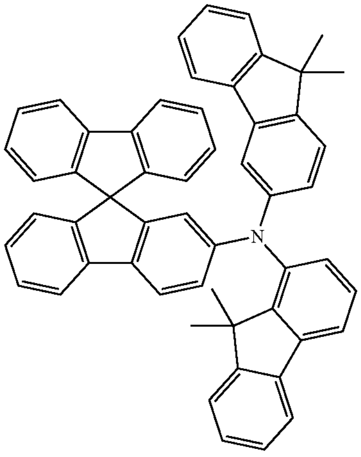

-continued
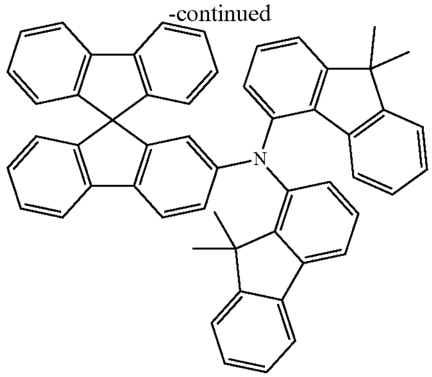
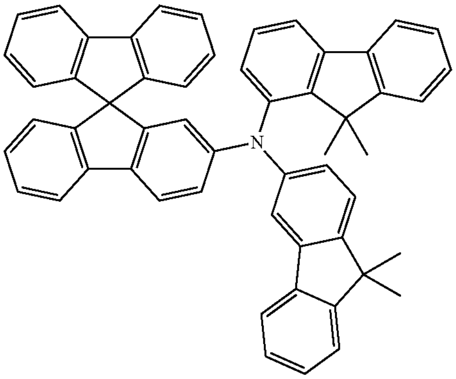
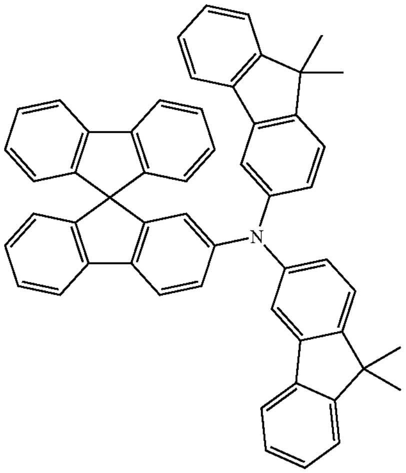
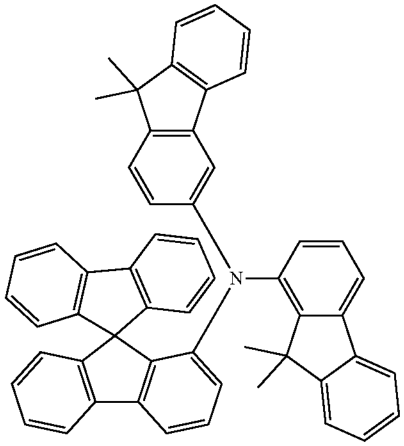
-continued
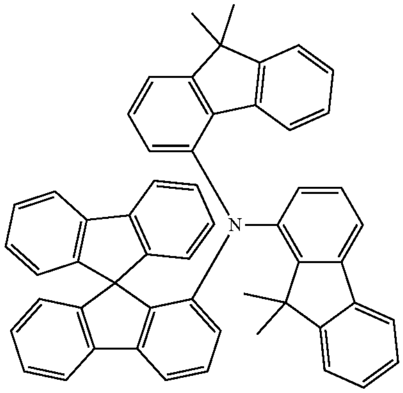
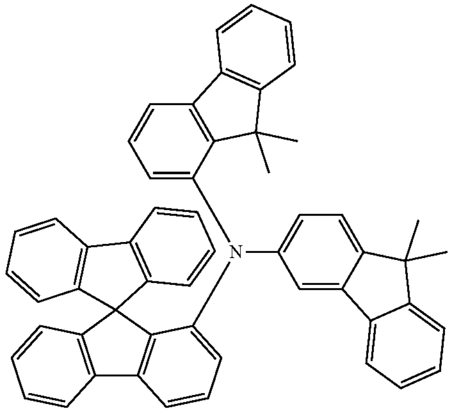
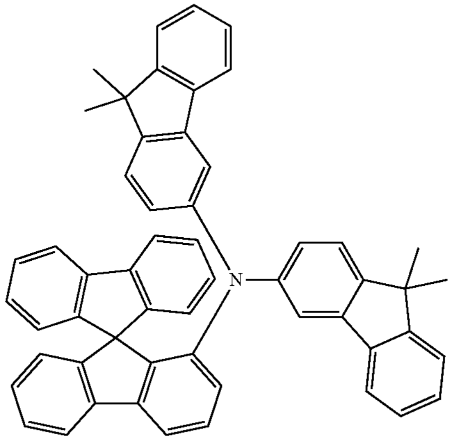
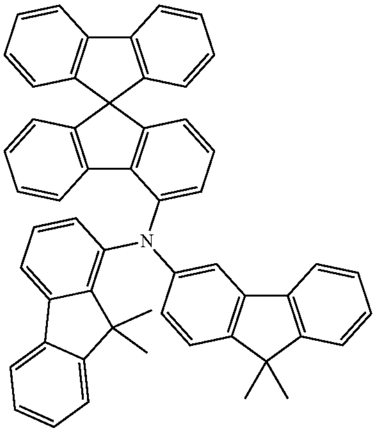

-continued
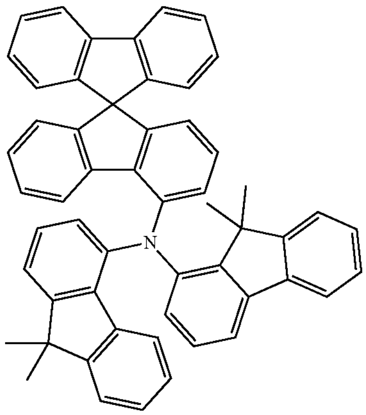
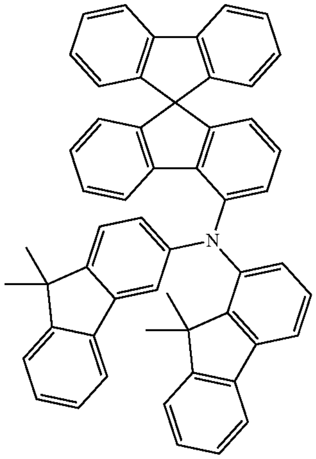
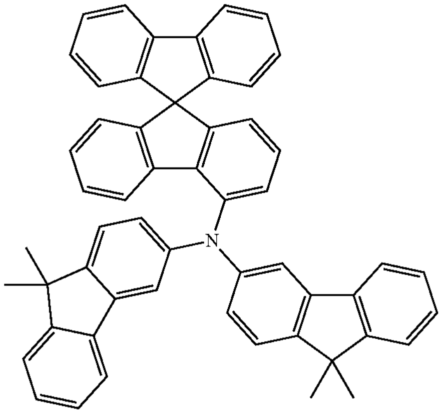
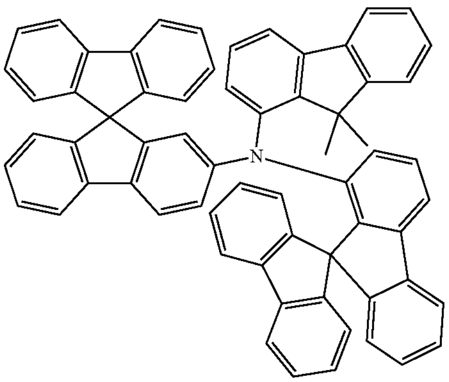
-continued
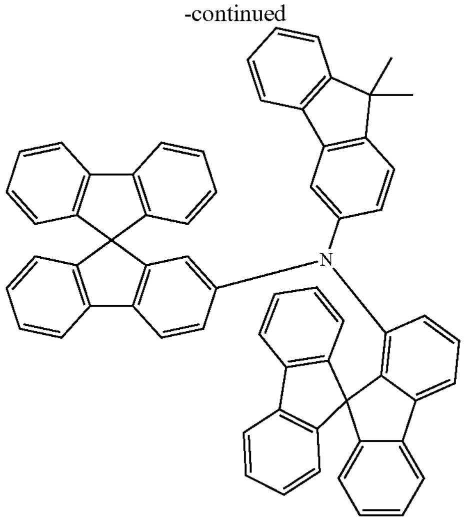
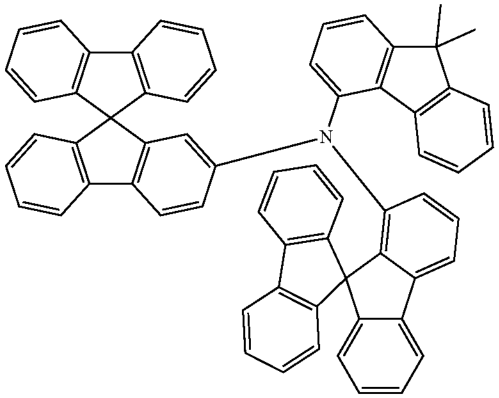
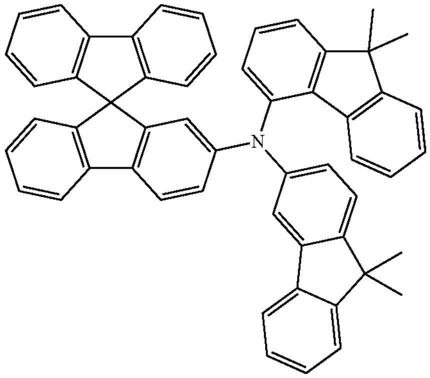
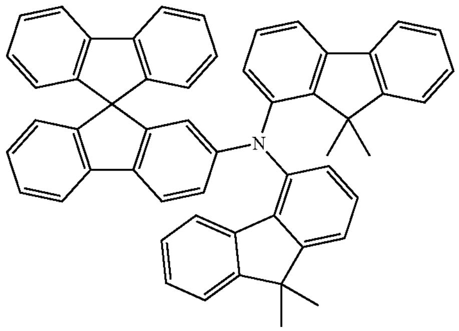

-continued
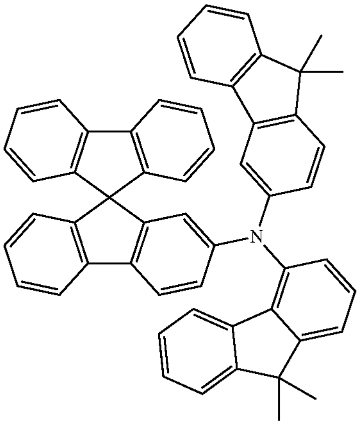
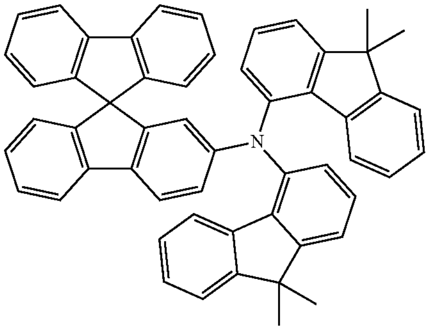
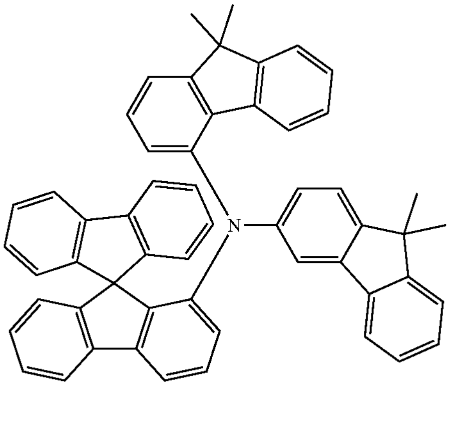
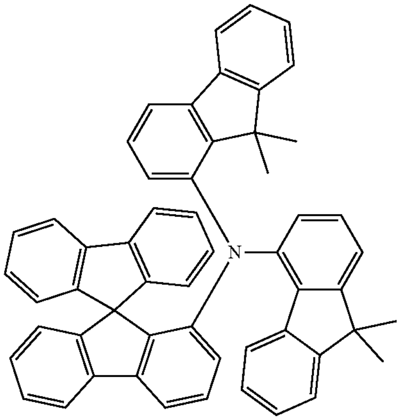
-continued
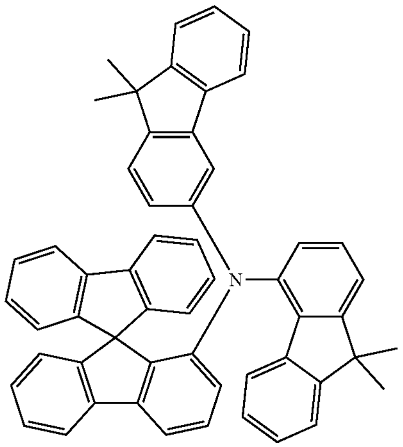
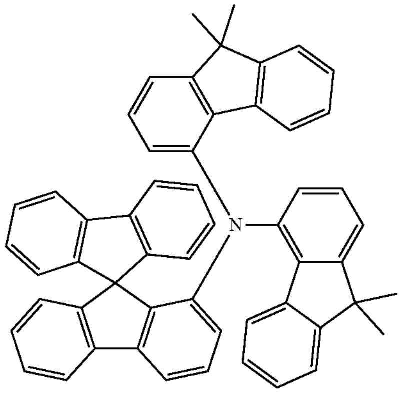
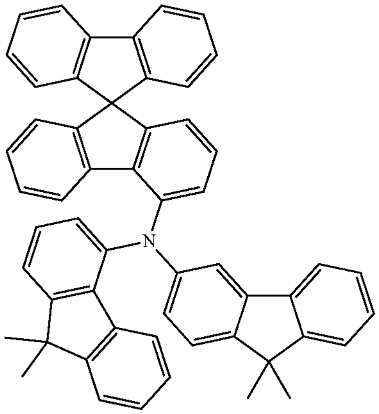
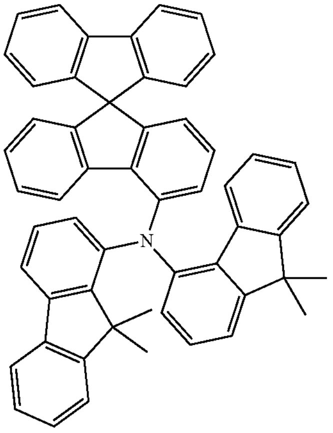

-continued
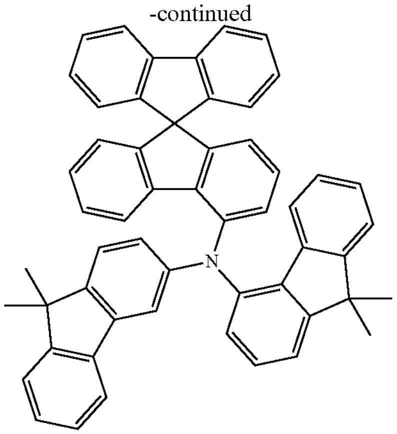
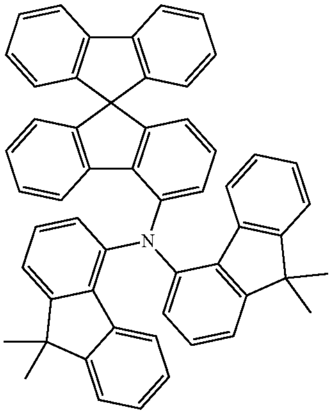
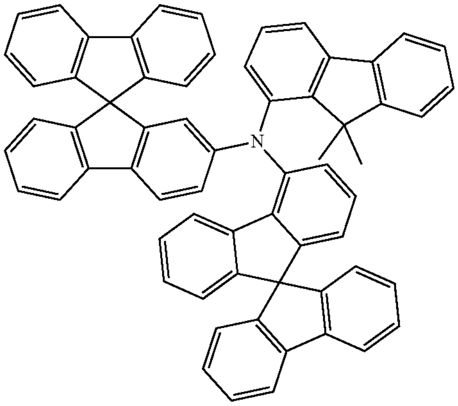
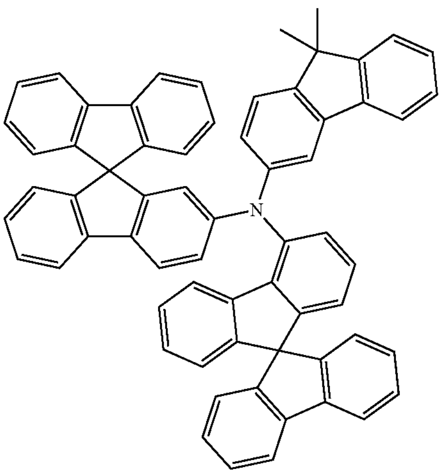
-continued
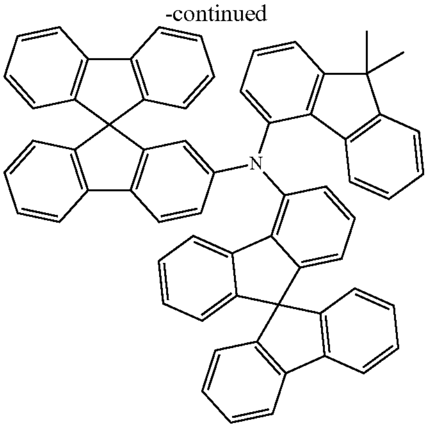
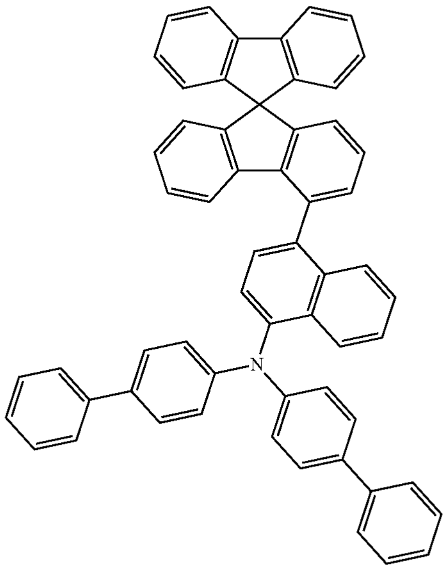
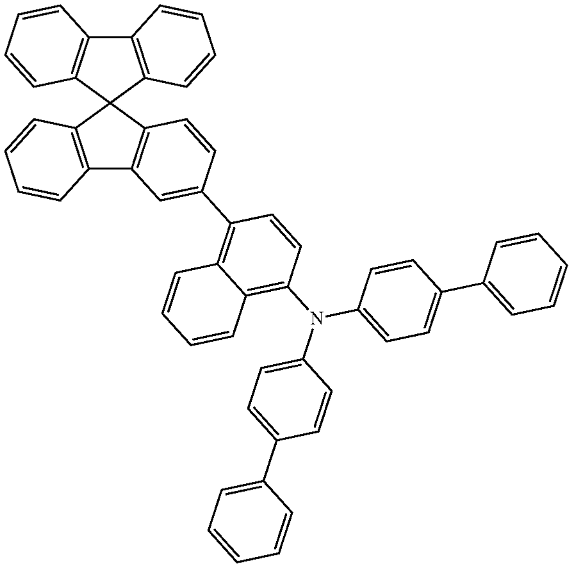

-continued
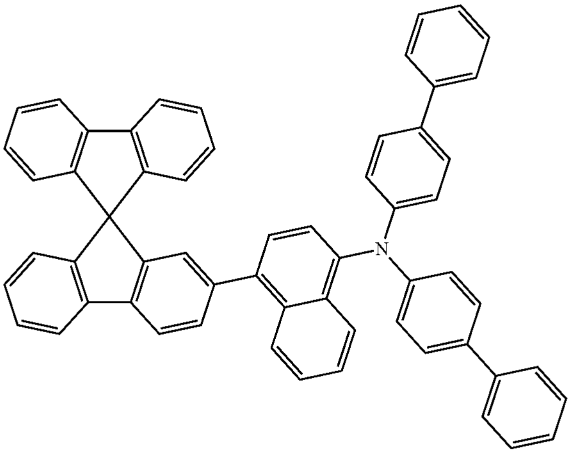
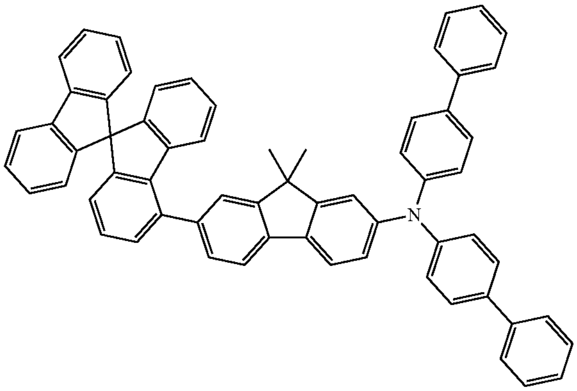
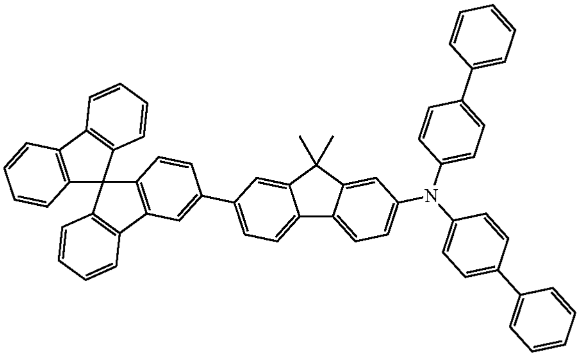
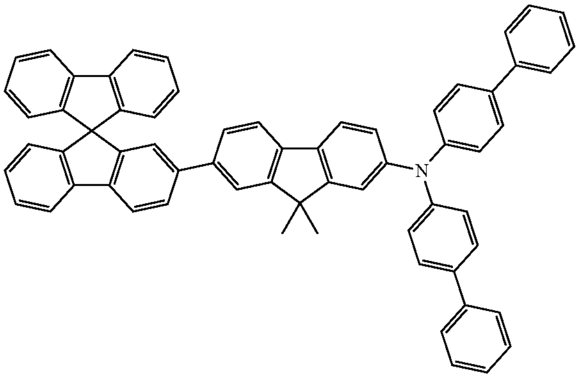
-continued
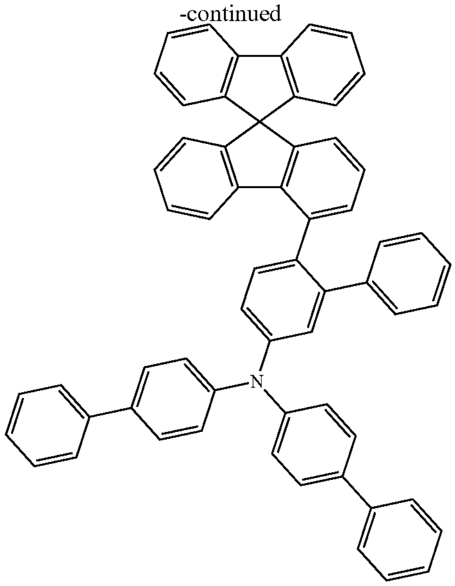
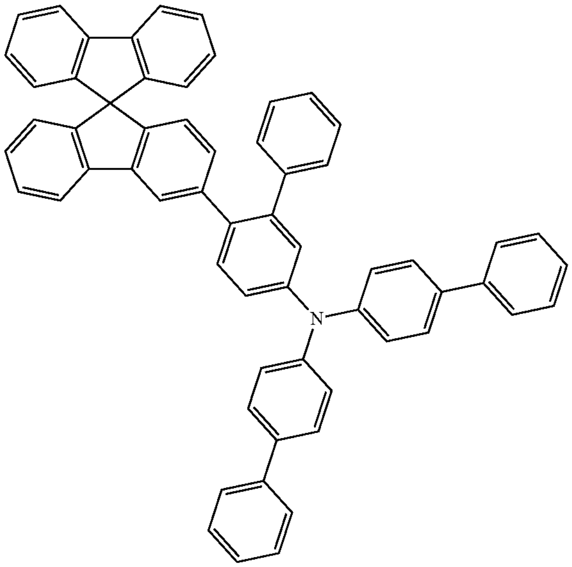
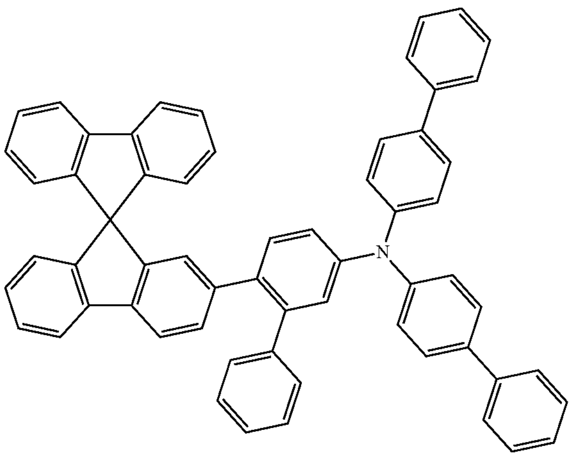

-continued
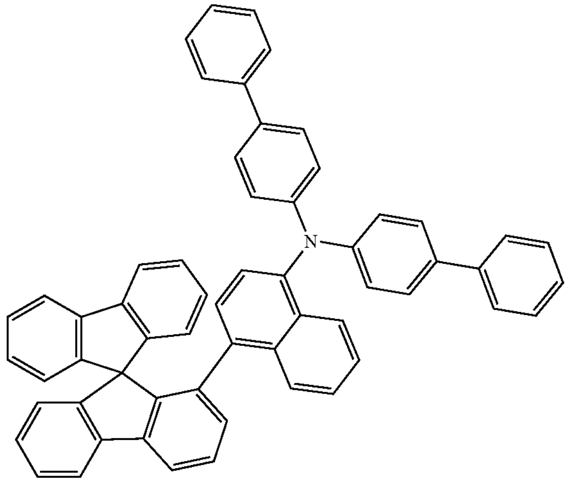
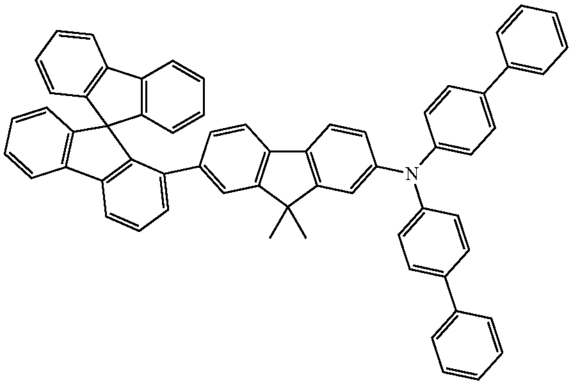
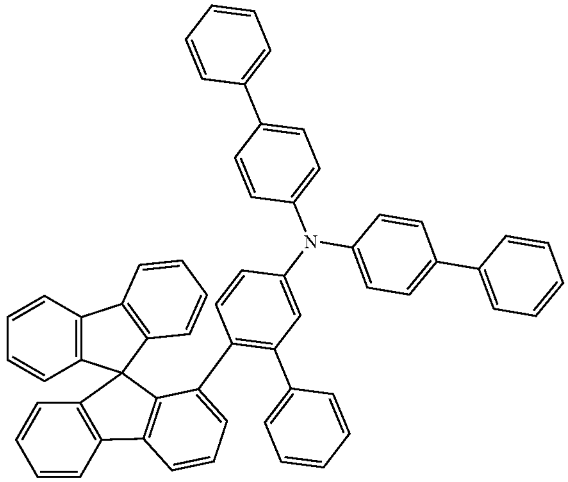
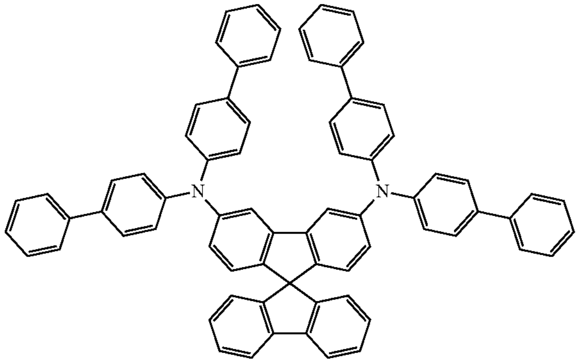
-continued
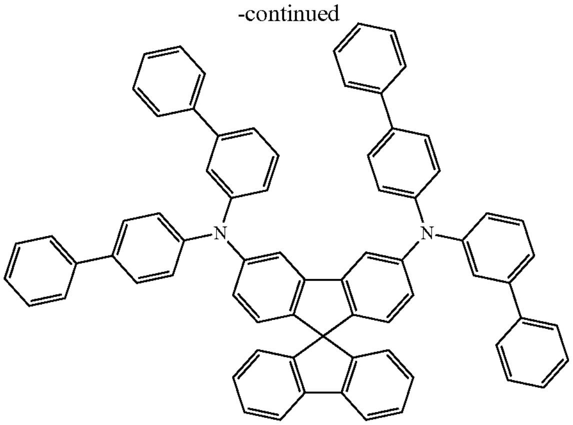
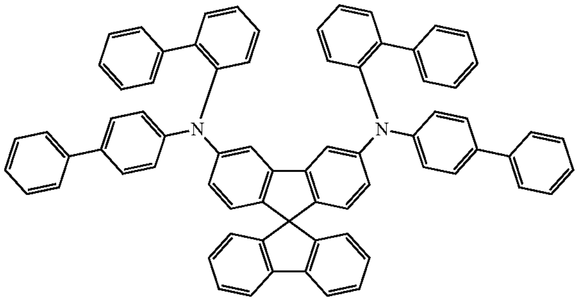
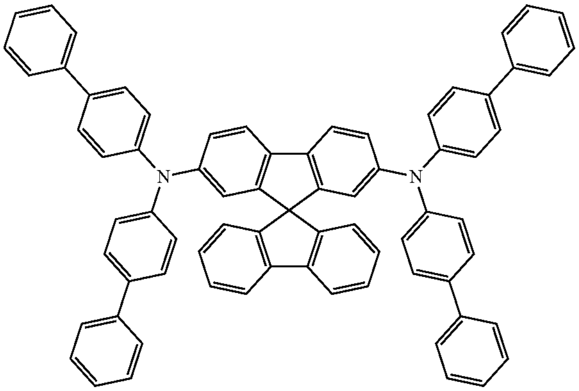
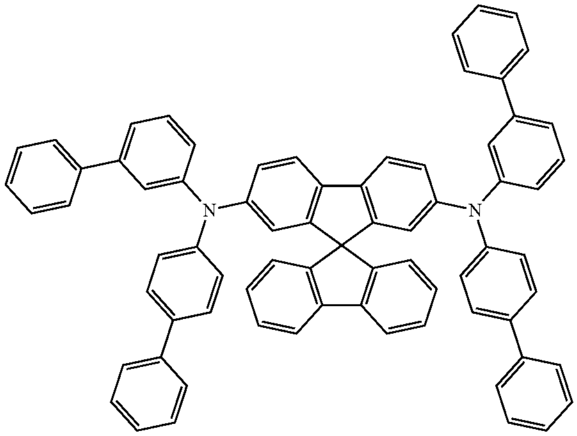

-continued
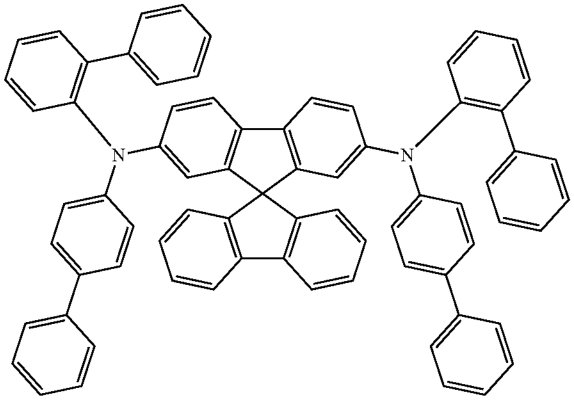
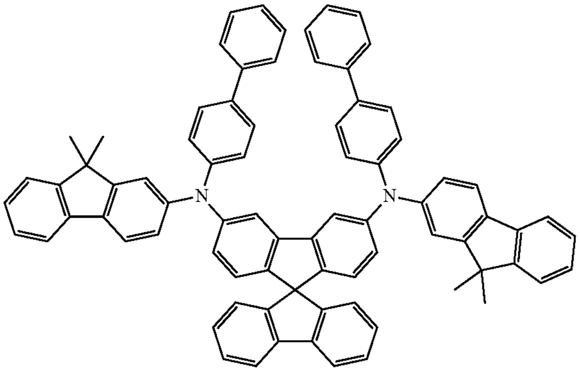
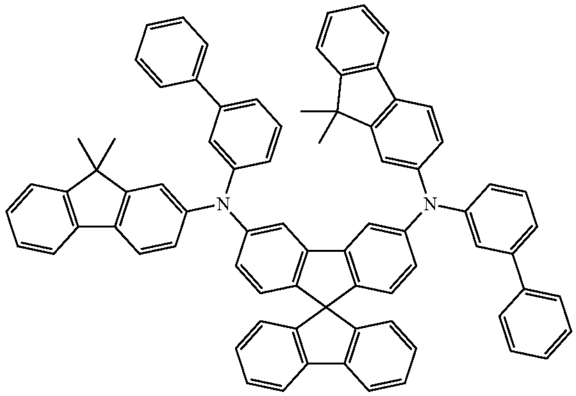
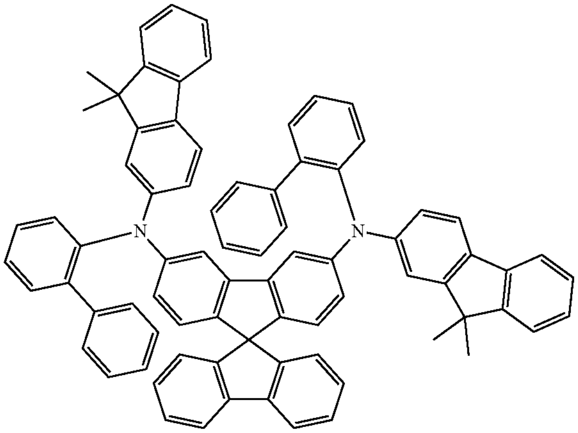
-continued
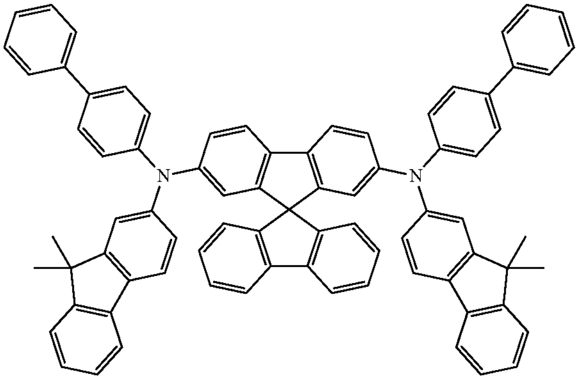
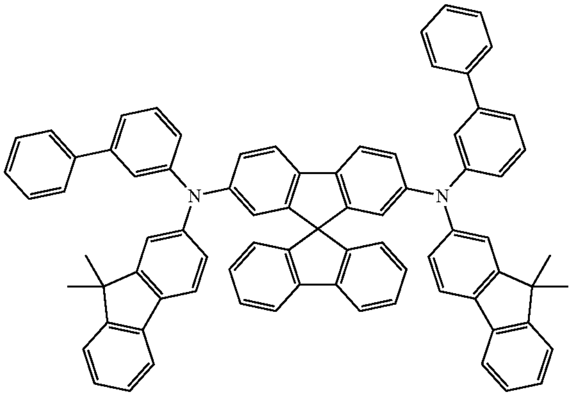
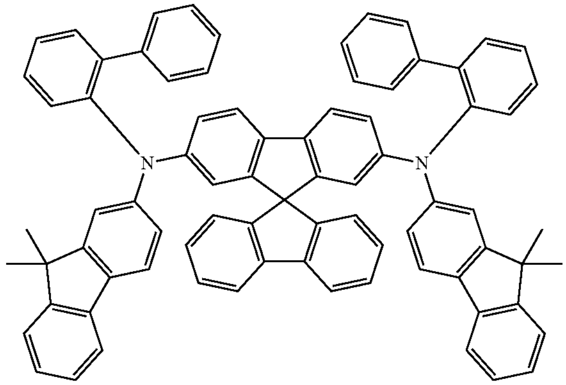
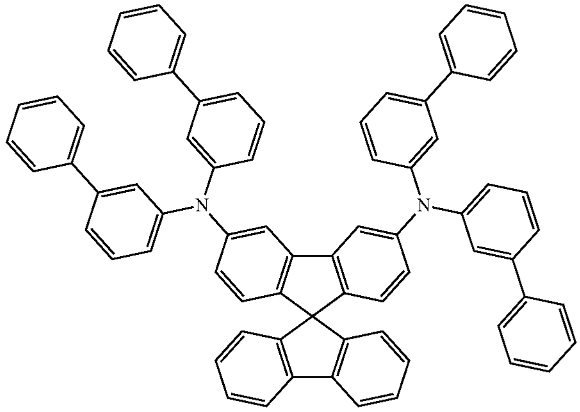

-continued
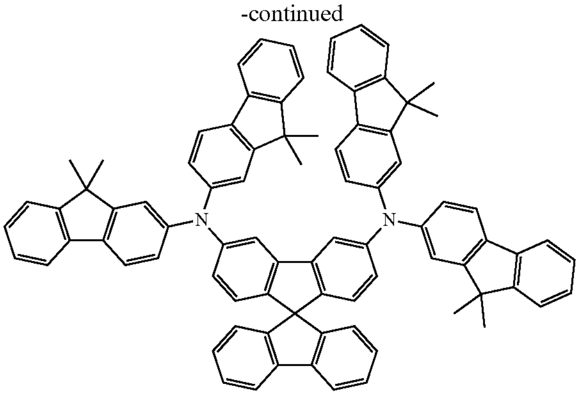
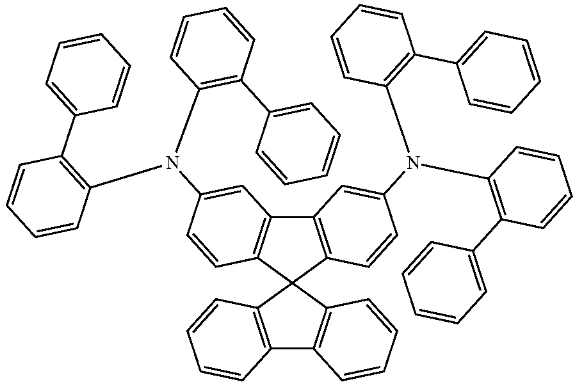
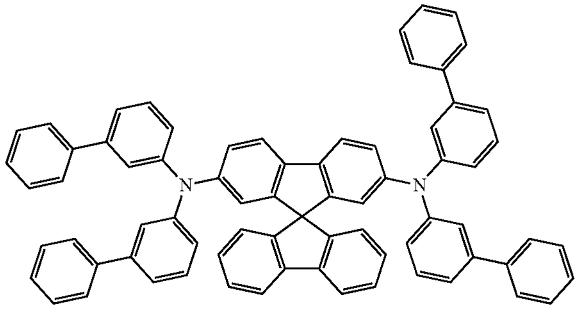
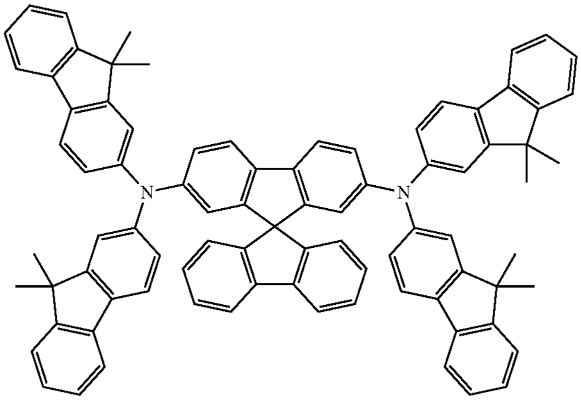
-continued
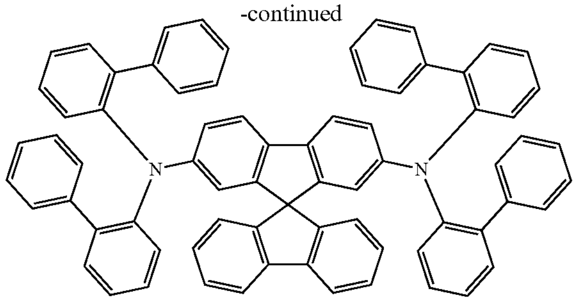
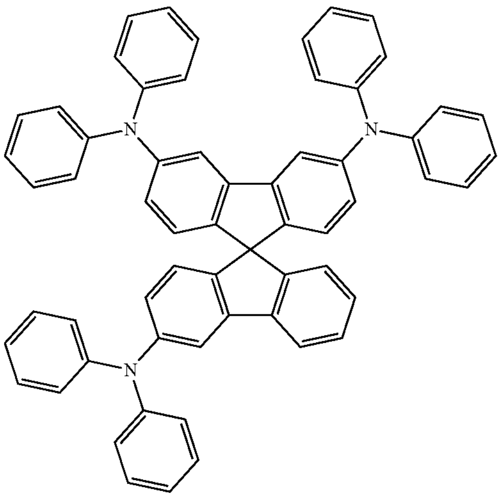
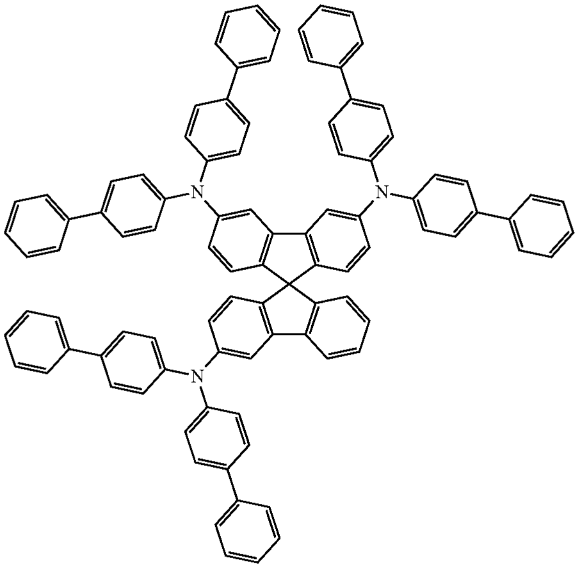

-continued
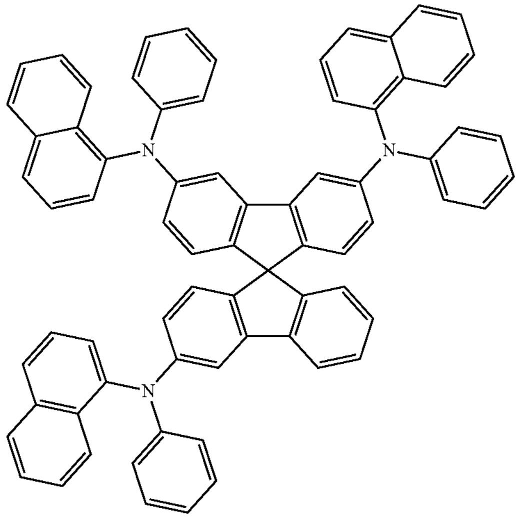
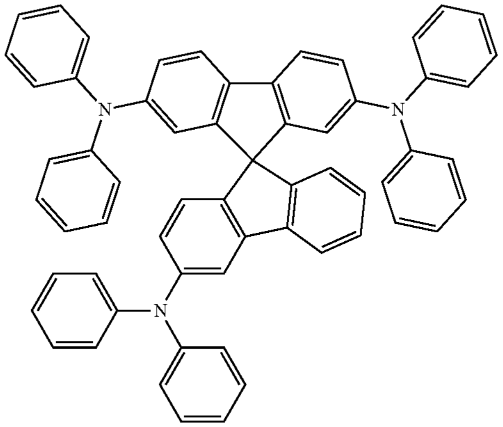
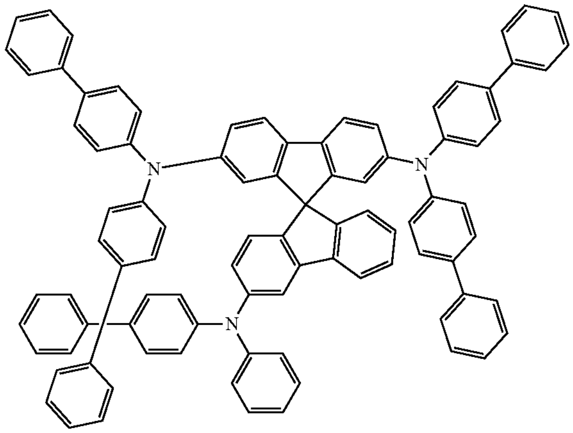
-continued
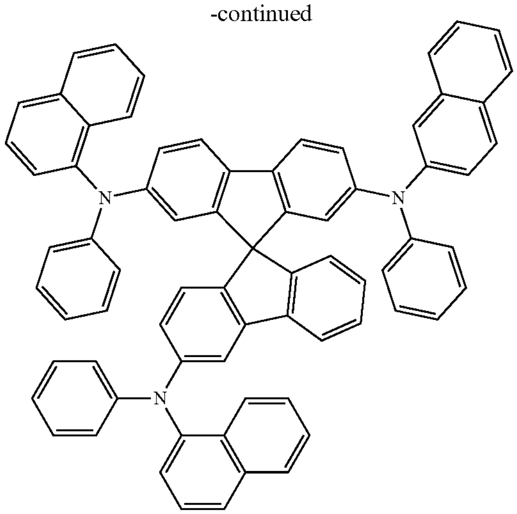
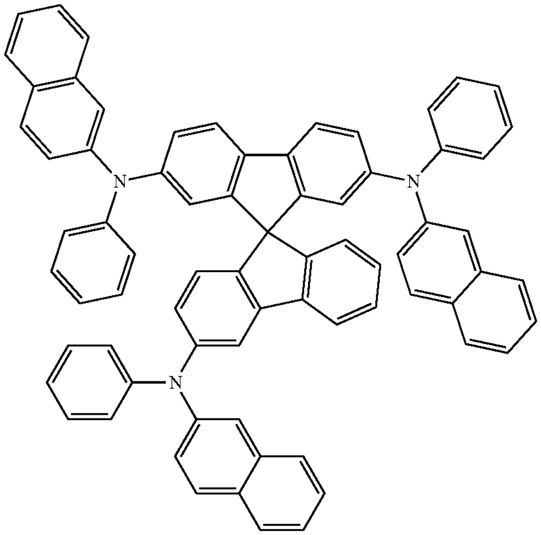
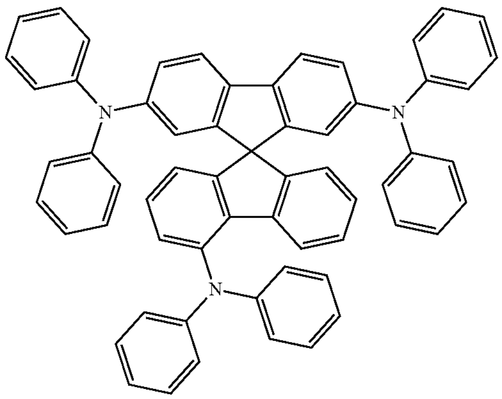

-continued
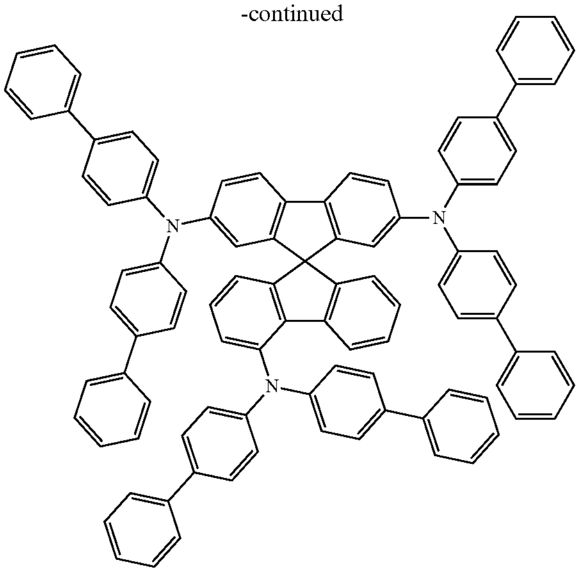
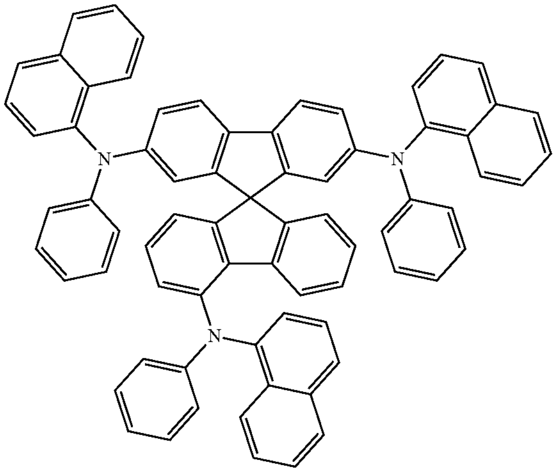
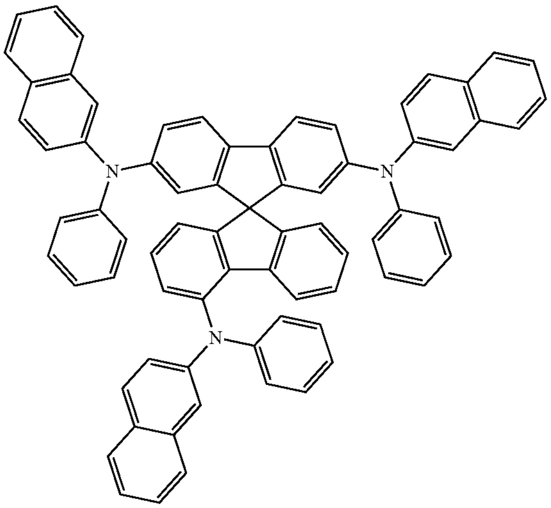
-continued
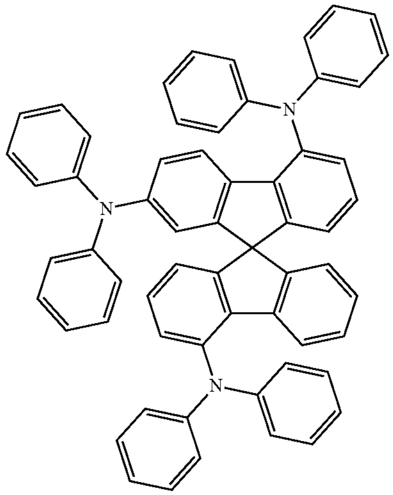
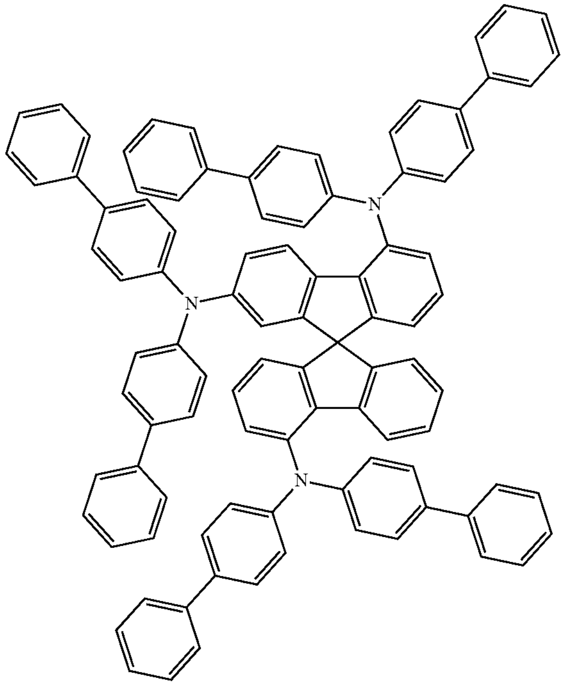
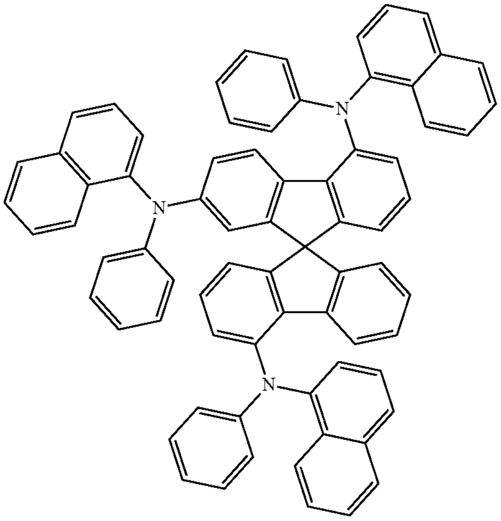

-continued

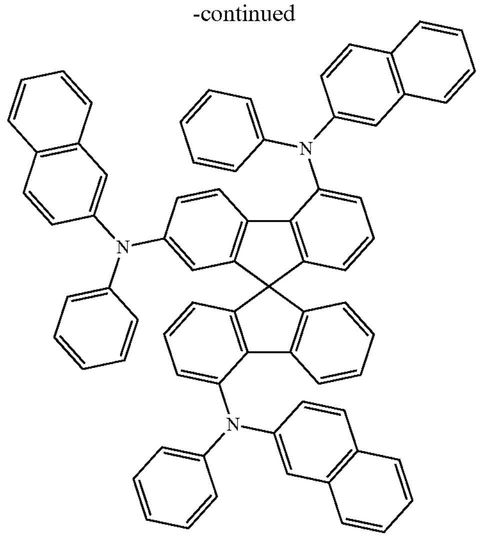

In the present specification, the dopant includes a compound of the following Chemical Formula 2:

[Chemical Formula 2]

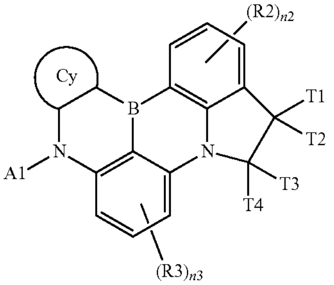

wherein in Chemical Formula 2:

T1 to T4 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to an adjacent substituent to form a substituted or unsubstituted aliphatic hydrocarbon ring;

A1 is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or is bonded to an adjacent substituent to form a substituted or unsubstituted ring;

Cy is a substituted or unsubstituted aliphatic hydrocarbon ring, a substituted or unsubstituted aromatic ring, or a substituted or unsubstituted hetero ring, or a substituted or unsubstituted ring in which these rings are fused;

R2 and R3 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group, or are bonded to an adjacent substituent to form a substituted or unsubstituted ring; and n2 and n3 are each an integer from 0 to 3, and when n2 is 2 or higher, the R2s are the same as or different from each other, and when n3 is 2 or higher, the R3s are the same as or different from each other.

In the present specification, Chemical Formula 2 is any one of the following Chemical Formulae 3 to 5:

[Chemical Formula 3]

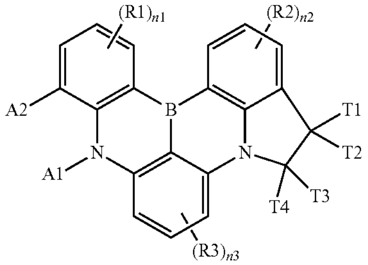

[Chemical Formula 4]

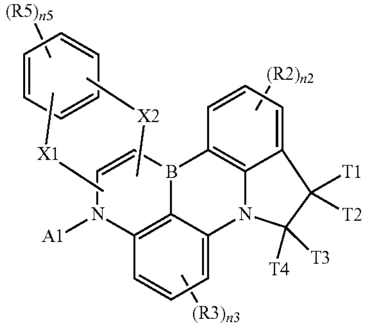

-continued

[Chemical Formula 5]

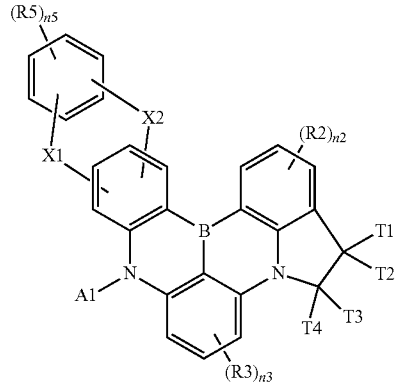

wherein in Chemical Formulae 3 to 5:

the definitions of R2 and R3, T1 to T4, A1, n2, and n3 are the same as those defined in Chemical Formula 2;

X1 and X2 are the same as or different from each other, and are each independently O, S, or CRR';

R, R', and R1 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

A2 and R5 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group, or are bonded to an adjacent substituent to form a substituted or unsubstituted ring; and n1 is an integer from 0 to 3, n5 is an integer from 0 to 4, and when n1 is 2 or higher, the R1s are the same as or different from each other, and when n5 is 2 or higher, the R5s are the same as or different from each other.

In the present specification, Chemical Formula 3 is the following Chemical Formula 3-1 or 3-2:

[Chemical Formula 3-1]

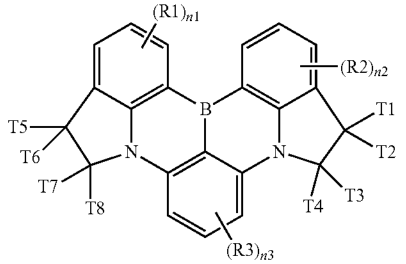

[Chemical Formula 3-2]

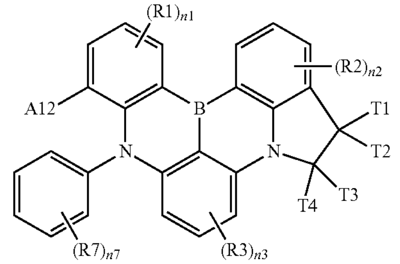

wherein in Chemical Formulae 3-1 and 3-2:

the definitions of R1 to R3, T1 to T4, and n1 to n3 are the same as those defined in Formulae 2 and 3;

A12 is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

R7 and T5 to T8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted ring; and n7 is an integer from 0 to 5, and when n7 is 2 or higher, the R7s are the same as or different from each other.

In the present specification, T1 and T4 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group.

In the present specification, T1 and T4 are the same as or different from each other, and are each independently hydrogen, deuterium, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group.

In the present specification, T1 and T4 are the same as or different from each other, and are each independently a substituted or unsubstituted alkyl group, a substituted or unsubstituted cycloalkyl group, a substituted or unsubstituted aryl group, or a substituted or unsubstituted heterocyclic group.

In the present specification, T1 and T4 are the same as or different from each other, and are each independently a substituted or unsubstituted alkyl group, or a substituted or unsubstituted aryl group.

In the present specification, T1 and T4 are the same as or different from each other, and are each independently a substituted or unsubstituted alkyl group having 1 to 10 carbon atoms, or a substituted or unsubstituted aryl group having 6 to 20 carbon atoms.

In the present specification, T1 and T4 are the same as or different from each other, and are each independently a substituted or unsubstituted alkyl group having 1 to 5 carbon atoms, or a substituted or unsubstituted aryl group having 6 to 10 carbon atoms.

In the present specification, T1 and T4 are the same as or different from each other, and are each independently a substituted or unsubstituted methyl group, a substituted or unsubstituted ethyl group, a substituted or unsubstituted propyl group, a substituted or unsubstituted butyl group, or a substituted or unsubstituted phenyl group.

In the present specification, T2 and T3 are bonded to each other to form a substituted or unsubstituted aliphatic hydrocarbon ring.

In the present specification, T2 and T3 are bonded to each other to form a substituted or unsubstituted cyclohexane ring, and among the substituents substituted in the cyclohexane ring, adjacent groups can be bonded to each other to form a substituted or unsubstituted ring.

In the present specification, T2 and T3 are bonded to each other to form a substituted or unsubstituted cyclohexane ring, and among the substituents substituted in the cyclohexane ring, adjacent groups can be bonded to each other to form a substituted or unsubstituted aromatic hydrocarbon ring.

In the present specification, T2 and T3 are bonded to each other to form a substituted or unsubstituted cyclohexane ring, and among the substituents substituted in the cyclohexane ring, adjacent groups can be bonded to each other to form a substituted or unsubstituted benzene ring.

In the present specification, T5 and T8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group.

In the present specification, T5 and T8 are the same as or different from each other, and are each independently hydrogen, deuterium, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group.

In the present specification, T5 and T8 are the same as or different from each other, and are each independently a substituted or unsubstituted alkyl group, a substituted or unsubstituted cycloalkyl group, a substituted or unsubstituted aryl group, or a substituted or unsubstituted heterocyclic group.

In the present specification, T5 and T8 are the same as or different from each other, and are each independently a substituted or unsubstituted alkyl group, or a substituted or unsubstituted aryl group.

In the present specification, T5 and T8 are the same as or different from each other, and are each independently a substituted or unsubstituted alkyl group having 1 to 10 carbon atoms, or a substituted or unsubstituted aryl group having 6 to 20 carbon atoms.

In the present specification, T5 and T8 are the same as or different from each other, and are each independently a substituted or unsubstituted alkyl group having 1 to 5 carbon atoms, or a substituted or unsubstituted aryl group having 6 to 10 carbon atoms.

In the present specification, T5 and T8 are the same as or different from each other, and are each independently a substituted or unsubstituted methyl group, a substituted or unsubstituted ethyl group, a substituted or unsubstituted propyl group, a substituted or unsubstituted butyl group, or a substituted or unsubstituted phenyl group.

In the present specification, T6 and T7 are bonded to each other to form a substituted or unsubstituted aliphatic hydrocarbon ring.

In the present specification, T6 and T7 are bonded to each other to form a substituted or unsubstituted cyclohexane ring, and among the substituents substituted in the cyclohexane ring, adjacent groups can be bonded to each other to form a substituted or unsubstituted ring.

In the present specification, T6 and T7 are bonded to each other to form a substituted or unsubstituted cyclohexane ring, and among the substituents substituted in the cyclohexane ring, adjacent groups can be bonded to each other to form a substituted or unsubstituted aromatic hydrocarbon ring.

In the present specification, T6 and T7 are bonded to each other to form a substituted or unsubstituted cyclohexane ring, and among the substituents substituted in the cyclohexane ring, adjacent groups can be bonded to each other to form a substituted or unsubstituted benzene ring.

In the present specification, Chemical Formula 2 is any one of the following Chemical Formulae 6 to 8:

[Chemical Formula 6]

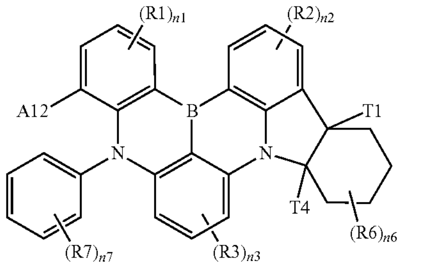

-continued

[Chemical Formula 7]

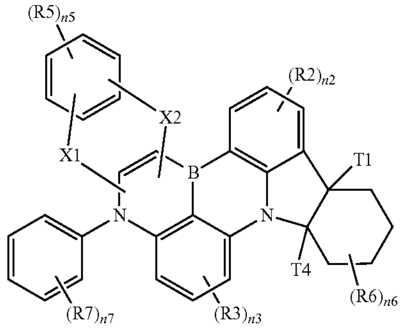

[Chemical Formula 8]

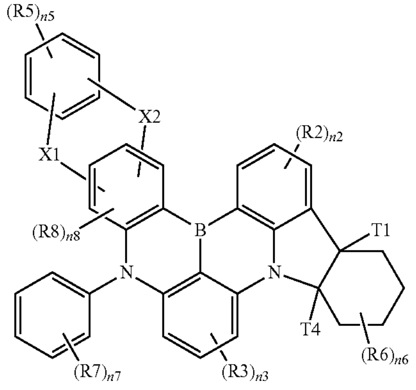

wherein in Chemical Formulae 6 to 8:

the definitions of R2 and R3, T1, T4, n2, and n3 are the same as those defined in Chemical Formula 2;

X1 and X2 are the same as or different from each other, and are each independently O, S, or CRR';

R, R', R1, and R8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

A12 and R5 to R7 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group, or are bonded to an adjacent substituent to form a substituted or unsubstituted ring; and n1 is an integer from 0 to 3, n5 is an integer from 0 to 4, n6 is an integer from 0 to 8, n7 is an integer from 0 to 5, n8 is an integer from 0 to 2, and when n1 is 2 or higher, the R1s are the same as or different from each other, and when n5 is 2 or higher, the R5s are the same as or different from each other, and when n6 is 2 or higher, the R6s are the same as or different from each other, and when n7 is 2 or higher, the R7s are the same as or different from each other, and when n8 is 2, the R8s are the same as or different from each other.

In the present specification, R6 is hydrogen, deuterium, a substituted or unsubstituted alkyl group, a substituted or unsubstituted alkenyl group, a substituted or unsubstituted alkynyl group, a substituted or unsubstituted cycloalkyl group, or a substituted or unsubstituted aryl group, or is bonded to an adjacent substituent to form a substituted or unsubstituted ring.

In the present specification, R6 is hydrogen, deuterium, a substituted or unsubstituted alkyl group, a substituted or unsubstituted alkenyl group, a substituted or unsubstituted alkynyl group, a substituted or unsubstituted cycloalkyl group, or a substituted or unsubstituted aryl group, or is bonded to an adjacent substituent to form a substituted or unsubstituted aromatic hydrocarbon ring.

In the present specification, R6 is hydrogen or deuterium, or is bonded to an adjacent substituent to form a substituted or unsubstituted aromatic hydrocarbon ring.

In the present specification, R6 is hydrogen or deuterium, or is bonded to an adjacent substituent to form a substituted or unsubstituted benzene ring.

In the present specification, Chemical Formula 2 is any one of the following Chemical Formulae A to H:

[Chemical Formula A]

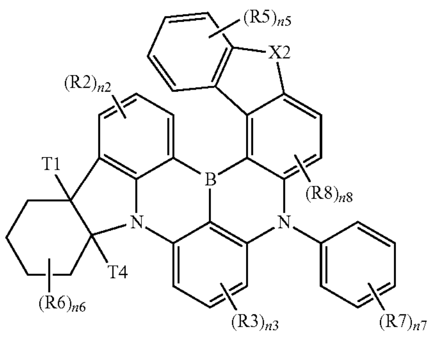

[Chemical Formula B]

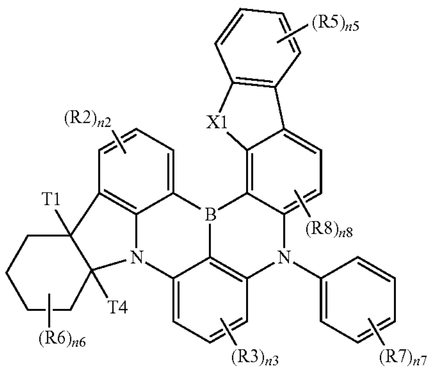

-continued

[Chemical Formula C]

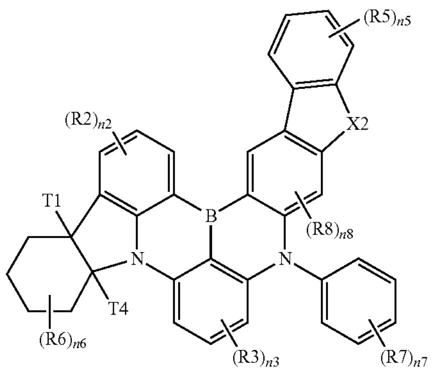

[Chemical Formula D]

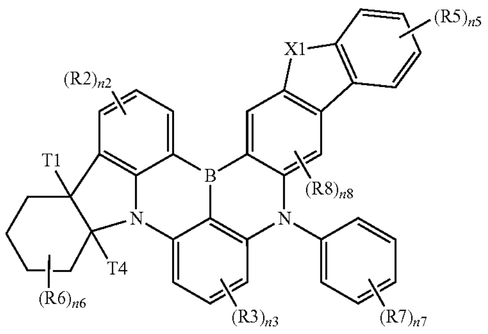

[Chemical Formula E]

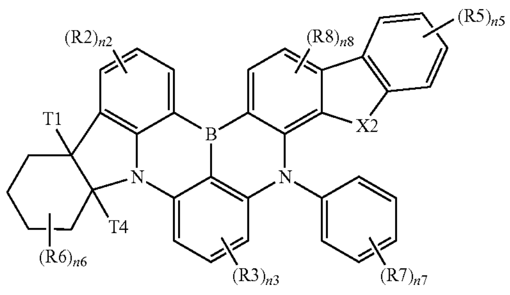

[Chemical Formula F]

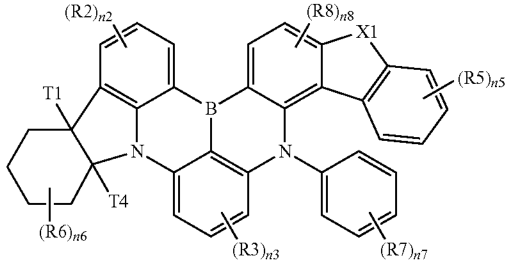

-continued

[Chemical Formula G]

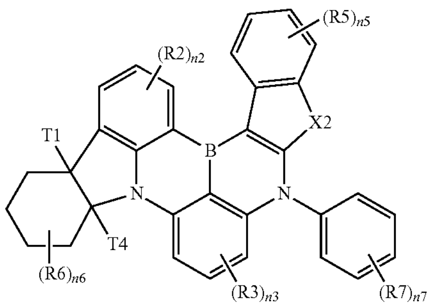

[Chemical Formula H]

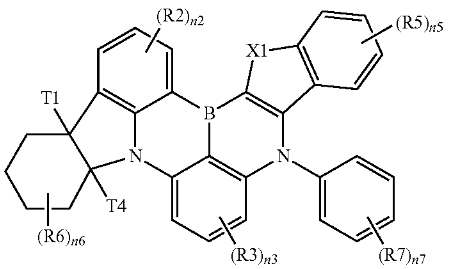

wherein in Chemical Formulae A to H: the definitions of R2 and R3, T1, T4, n2, and n3 are the same as those defined in Chemical Formula 2;

X1 and X2 are the same as or different from each other, and are each independently O, S, or CRR';

R, R', and R8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

R5 to R7 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group, or are bonded to an adjacent substituent to form a substituted or unsubstituted ring; and n5 is an integer from 0 to 4, n6 is an integer from 0 to 8, n7 is an integer from 0 to 5, n8 is an integer from 0 to 2, and when n5 is 2 or higher, the R5s are the same as or different from each other, and when n6 is 2 or higher, the R6s are the same as or different from each other, and when n7 is 2 or higher, the R7s are the same as or different from each other, and when n8 is 2, the R8s are the same as or different from each other.

In the present specification, R and R' are the same as or different from each other, and are each independently a substituted or unsubstituted alkyl group, a substituted or unsubstituted cycloalkyl group, or a substituted or unsubstituted aryl group.

In the present specification, R and R' are the same as or different from each other, and are each independently a substituted or unsubstituted alkyl group having 1 to 10 carbon atoms, a substituted or unsubstituted cycloalkyl group having 3 to 10 carbon atoms, or a substituted or unsubstituted aryl group having 6 to 20 carbon atoms.

In the present specification, R and R' are the same as or different from each other, and are each independently a substituted or unsubstituted methyl group, a substituted or unsubstituted cyclohexyl group, or a substituted or unsubstituted phenyl group.

In the present specification, R and R' are the same as or different from each other, and are each independently a methyl group which is unsubstituted or substituted with deuterium, a cyclohexyl group which is unsubstituted or substituted with deuterium, or a phenyl group which is unsubstituted or substituted with deuterium.

In the present specification, R1, R2, R3, R5, and R8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group.

In the present specification, R1, R2, R3, R5, and R8 are the same as or different from each other, and are each independently hydrogen, deuterium, a halogen group, a nitrile group, a substituted or unsubstituted silyl group, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, a substituted or unsubstituted amine group, or a substituted or unsubstituted heterocyclic group.

In the present specification, R1, R2, R3, R5, and R8 are the same as or different from each other, and are each independently hydrogen; deuterium; a halogen group; a nitrile group; a silyl group which is unsubstituted or substituted with a group selected from the group consisting of an alkyl group which is unsubstituted or substituted with deuterium and an aryl which is unsubstituted or substituted with deuterium; an alkyl group which is unsubstituted or substituted with a group selected from the group consisting of deuterium and an aryl group which is unsubstituted or substituted with deuterium; an alkenyl group which is unsubstituted or substituted with a group selected from the group consisting of deuterium and an aryl group which is unsubstituted or substituted with deuterium; an alkynyl group which is unsubstituted or substituted with a group selected from the group consisting of deuterium and an aryl group which is unsubstituted or substituted with deuterium; a cycloalkyl group which is unsubstituted or substituted with a group selected from the group consisting of deuterium, an alkyl group which is unsubstituted or substituted with deuterium, and an aryl group which is unsubstituted or substituted with deuterium; an aryl group which is unsubstituted or substituted with a group selected from the group consisting of deuterium, an alkyl group which is unsubstituted or substituted with deuterium, and a heterocyclic group which is unsubstituted or substituted with deuterium; an amine group which is unsubstituted or substituted with a group selected from the group consisting of an alkyl group which is unsubstituted or substituted with deuterium and an aryl group which is unsubstituted or substituted with deuterium; or a heterocyclic group which is unsubstituted or substituted with a group selected from the group consisting of an alkyl group which is unsubstituted or substituted with deuterium and an aryl group which is unsubstituted or substituted with deuterium.

In the present specification, R1, R2, R3, R5, and R8 are the same as or different from each other, and are each independently hydrogen; deuterium; a halogen group; a nitrile group; a silyl group which is unsubstituted or substituted with a group selected from the group consisting of an alkyl group which is unsubstituted or substituted with deuterium and an aryl which is unsubstituted or substituted with deuterium; an alkyl group which is unsubstituted or substituted with a group selected from the group consisting of deuterium and an aryl group which is unsubstituted or substituted with deuterium; an aryl group which is unsubstituted or substituted with a group selected from the group consisting of deuterium, an alkyl group which is unsubstituted or substituted with deuterium, and a heterocyclic group which is unsubstituted or substituted with deuterium; an amine group which is unsubstituted or substituted with a group selected from the group consisting of an alkyl group which is unsubstituted or substituted with deuterium and an aryl group which is unsubstituted or substituted with deuterium; or a heterocyclic group which is unsubstituted or substituted with a group selected from the group consisting of an alkyl group which is unsubstituted or substituted with deuterium and an aryl group which is unsubstituted or substituted with deuterium.

In the present specification, R1 and R3 are the same as or different from each other, and can be each independently any one of the following structures:

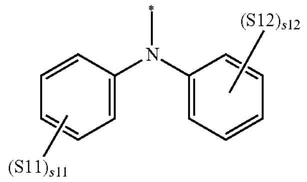

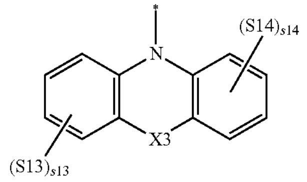

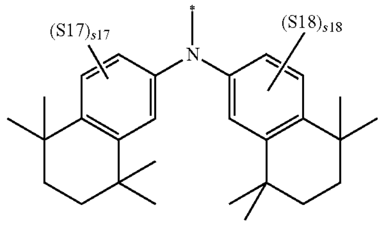

-continued

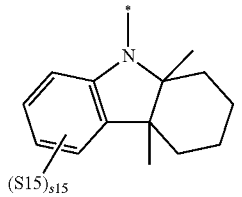

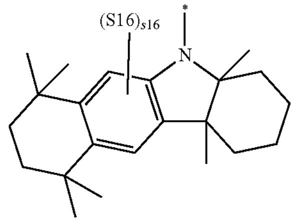

wherein in the structures: S11 to S18 are each independently hydrogen, deuterium, a halogen group, a cyano group, a substituted or unsubstituted alkyl group, a substituted or unsubstituted cycloalkyl group, a substituted or unsubstituted aryl group, or a substituted or unsubstituted heterocyclic group;

X3 is O, S, or CR"R'";

R" and R'" are the same as or different from each other, and are each independently a substituted or unsubstituted alkyl group, a substituted or unsubstituted cycloalkyl group, a substituted or unsubstituted aryl group, or a substituted or unsubstituted heterocyclic group;

s11 and s12 are each an integer from 0 to 5;

s13 to s15 are each an integer from 0 to 4;

s16 is an integer from 0 to 2;

s17 and s18 is an integer from 0 to 3;

when s11 is 2 or higher, the S11s are the same as or different from each other;

when s12 is 2 or higher, the S12s are the same as or different from each other;

when s13 is 2 or higher, the S13s are the same as or different from each other;

when s14 is 2 or higher, the S14s are the same as or different from each other;

when s15 is 2 or higher, the S15s are the same as or different from each other;

when s16 is 2 or higher, the S16s are the same as or different from each other;

when s17 is 2 or higher, the S17s are the same as or different from each other;

when s18 is 2 or higher, the S18s are the same as or different from each other; and

* denotes a position that is substituted.

In the present specification, the R7s are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted ring.

In the present specification, the R7s are the same as or different from each other, and are each independently hydrogen, deuterium, a halogen group, a nitrile group, a substituted or unsubstituted silyl group, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group.

In the present specification, the R7s are the same as or different from each other, and are each independently hydrogen; deuterium; a halogen group; a nitrile group; a silyl group which is unsubstituted or substituted with a group selected from the group consisting of an alkyl group and an aryl group; an alkyl group which is unsubstituted or substituted with a group selected from the group consisting of deuterium and an aryl group; an alkenyl group which is unsubstituted or substituted with a group selected from the group consisting of deuterium and an aryl group; an alkynyl group which is unsubstituted or substituted with a group selected from the group consisting of deuterium and an aryl group; a cycloalkyl group which is unsubstituted or substituted with a group selected from the group consisting of deuterium, an alkyl group, and an aryl group; an aryl group which is unsubstituted or substituted with a group selected from the group consisting of deuterium, an alkyl group, and an aryl group; or a heterocyclic group which is unsubstituted or substituted with a group selected from the group consisting of deuterium, an alkyl group, and an aryl group.

In the present specification, the R7s are the same as or different from each other, and are each independently hydrogen; deuterium; a silyl group which is unsubstituted or substituted with a group selected from the group consisting of an alkyl group and an aryl group; an alkyl group which is unsubstituted or substituted with a group selected from the group consisting of deuterium and an aryl group; a cycloalkyl group which is unsubstituted or substituted with a group selected from the group consisting of deuterium, an alkyl group, and an aryl group; an aryl group which is unsubstituted or substituted with a group selected from the group consisting of deuterium, an alkyl group, and an aryl group; or a heterocyclic group which is unsubstituted or substituted with a group selected from the group consisting of deuterium, an alkyl group, and an aryl group.

In the present specification, adjacent groups in R2, adjacent groups in R5, and adjacent groups in R7 are each independently bonded to each other to form a substituted or unsubstituted aliphatic hydrocarbon ring, a substituted or unsubstituted aromatic hydrocarbon ring, or a substituted or unsubstituted hetero ring.

In the present specification, adjacent groups of the R7s are each independently bonded to each other to form any one ring of the following structures:

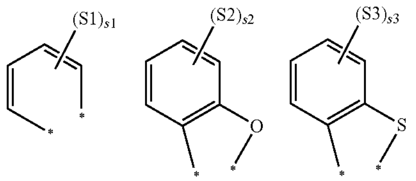

-continued

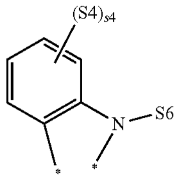

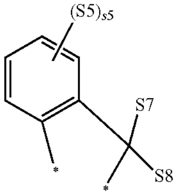

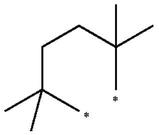

wherein in the structures: S1 to S8 are each independently hydrogen, deuterium, a halogen group, a cyano group, a substituted or unsubstituted alkyl group, a substituted or unsubstituted cycloalkyl group, a substituted or unsubstituted aryl group, or a substituted or unsubstituted heterocyclic group;

s1 to s5 are each an integer from 0 to 4;

when s1 is 2 or higher, the S1s are the same as or different from each other;

when s2 is 2 or higher, the S2s are the same as or different from each other;

when s3 is 2 or higher, the S3s are the same as or different from each other;

when s4 is 2 or higher, the S4s are the same as or different from each other;

when s5 is 2 or higher, the S5s are the same as or different from each other; and

* denotes a position that is substituted.

In the present specification, adjacent groups in R2 can be bonded to each other to form a substituted or unsubstituted aliphatic hydrocarbon ring.

In the present specification, adjacent groups in R2 can be bonded to each other to form

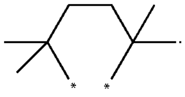

In the present specification, adjacent groups in R5 can be bonded to each other to form a substituted or unsubstituted aliphatic hydrocarbon ring.

In the present specification, adjacent groups in R5 can be bonded to each other to form

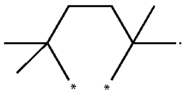

In the present specification, the compound of Chemical Formula 2 is any one of the following compounds:

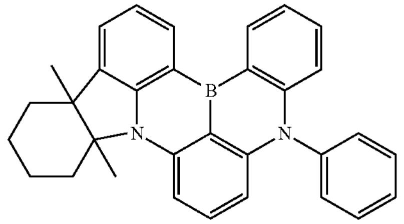

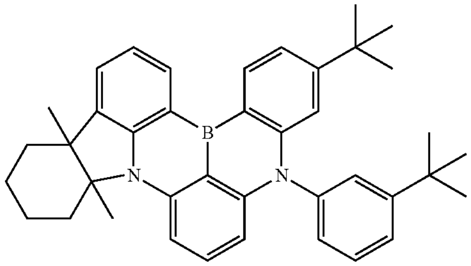

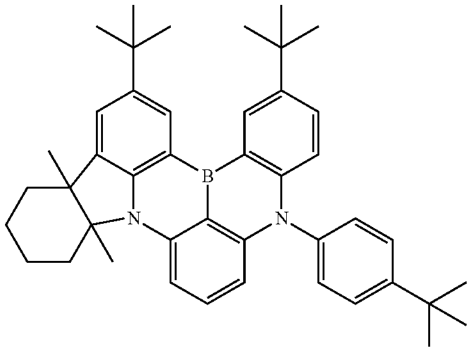

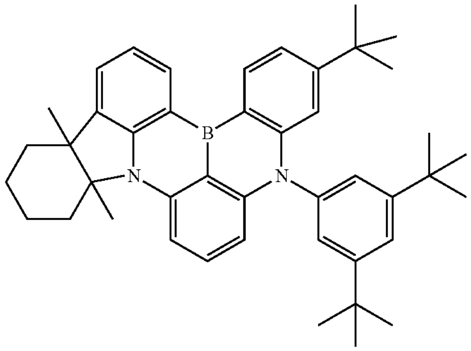

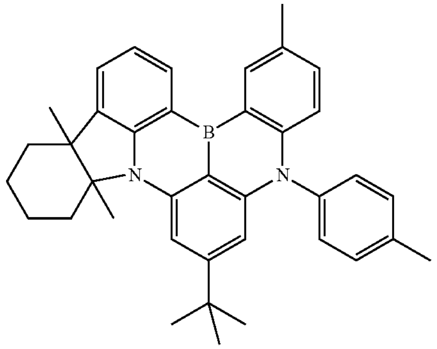

-continued
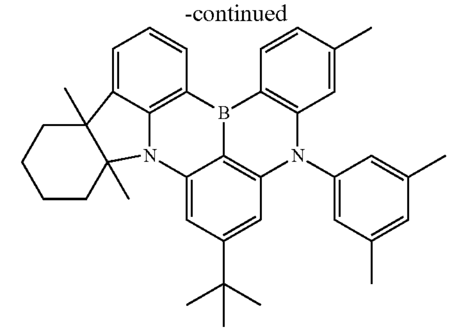
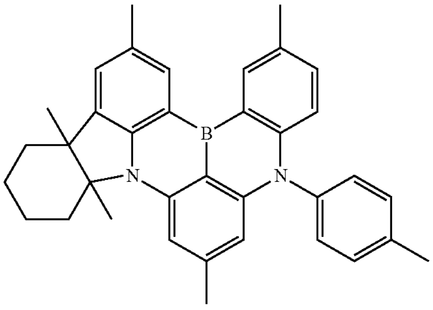
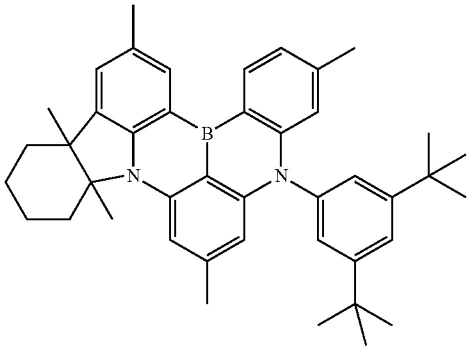
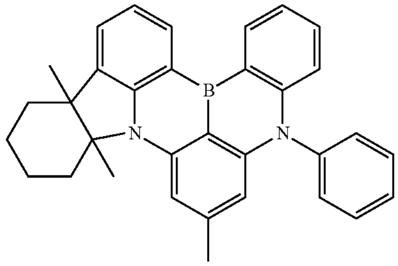
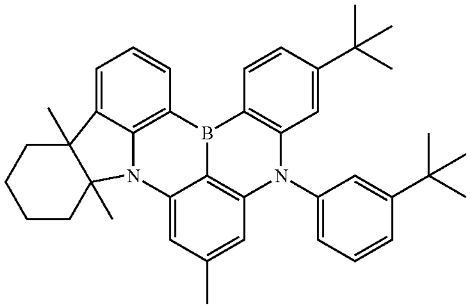
-continued
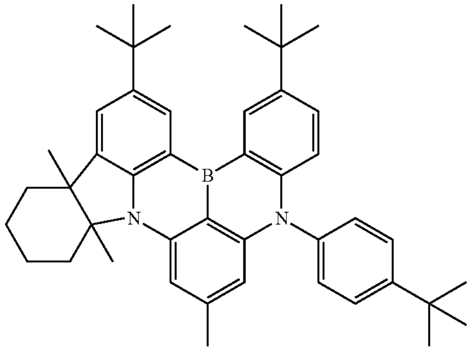
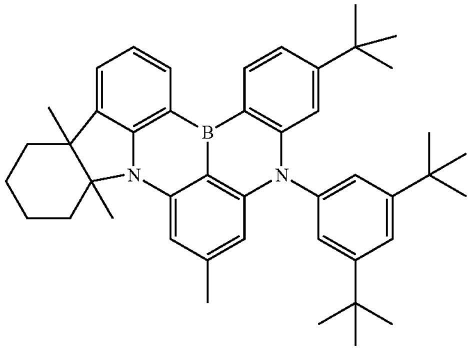
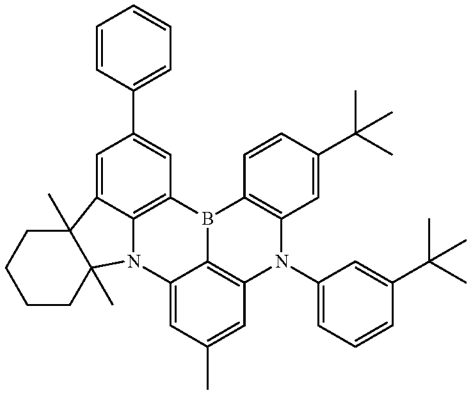
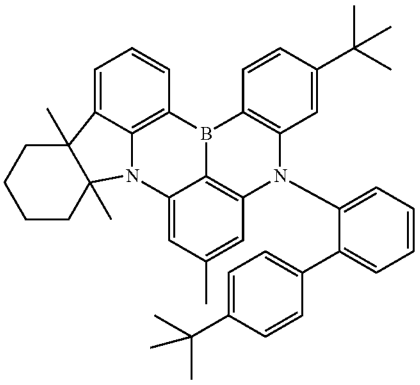

-continued
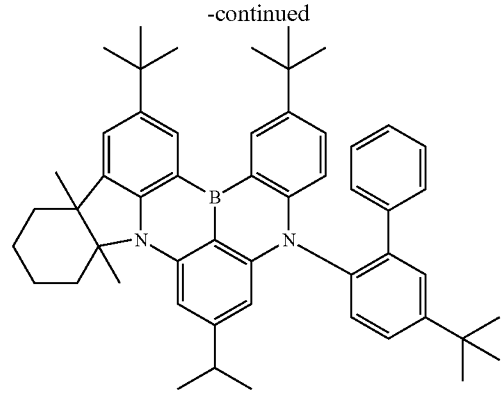
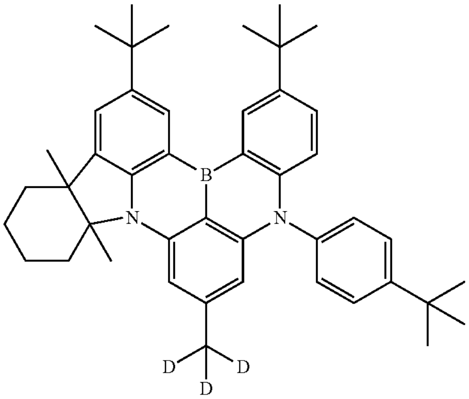
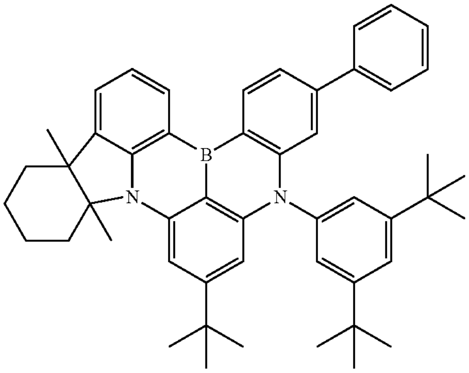
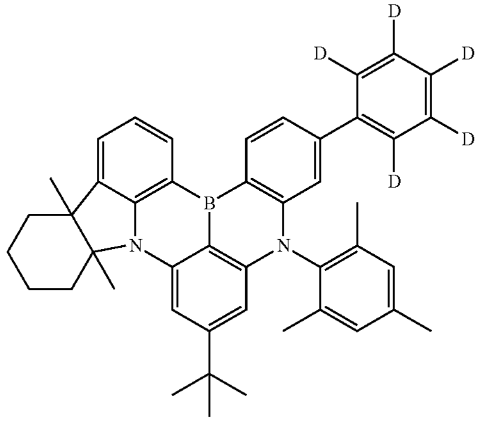
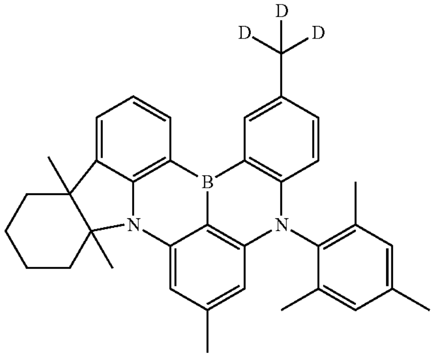
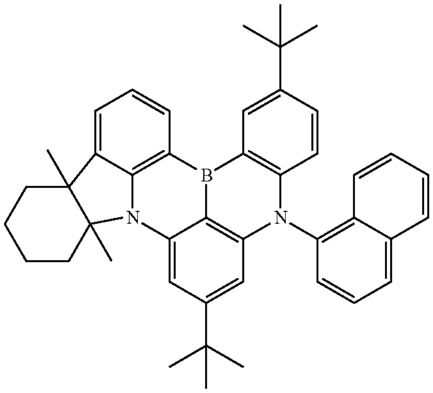
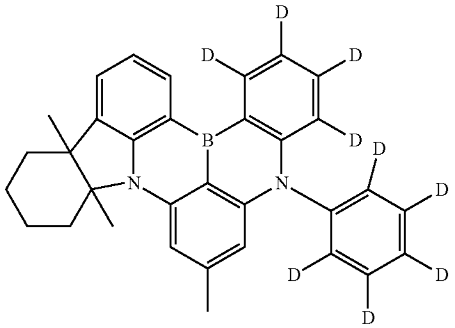
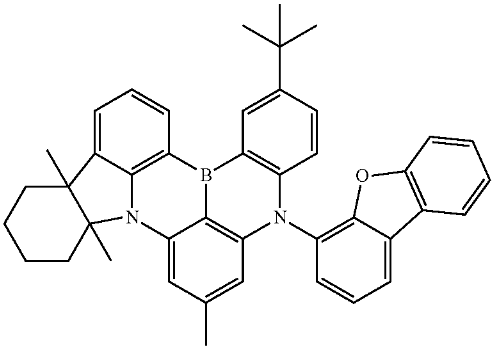

-continued
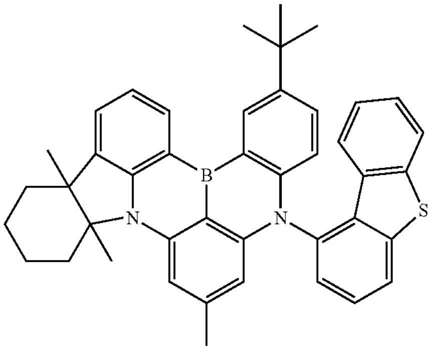
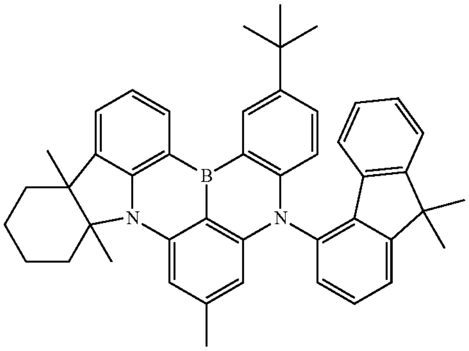
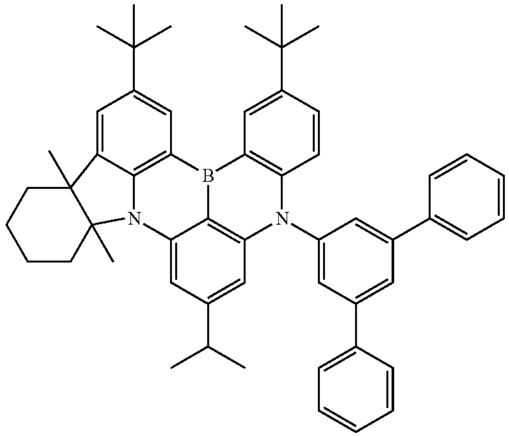
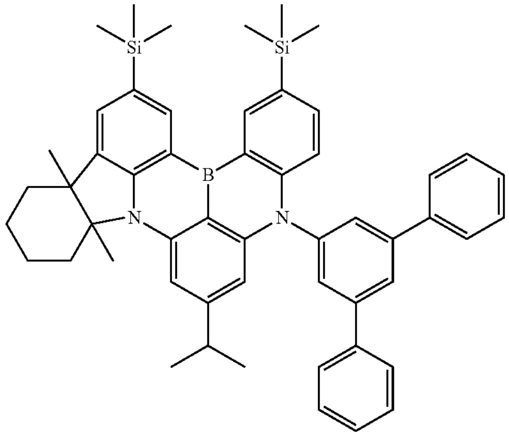
-continued
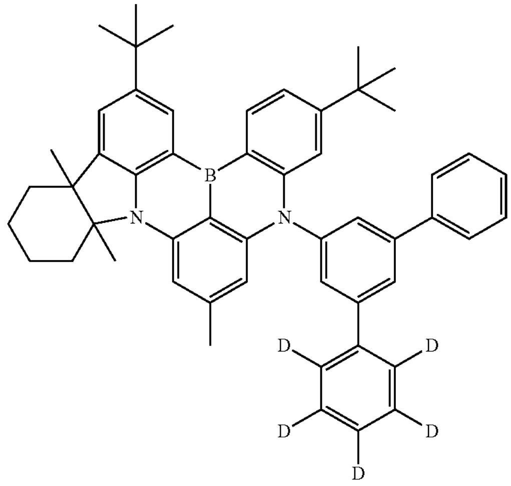
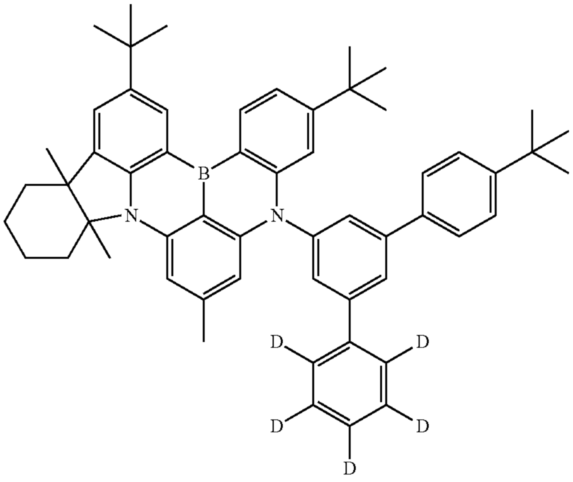
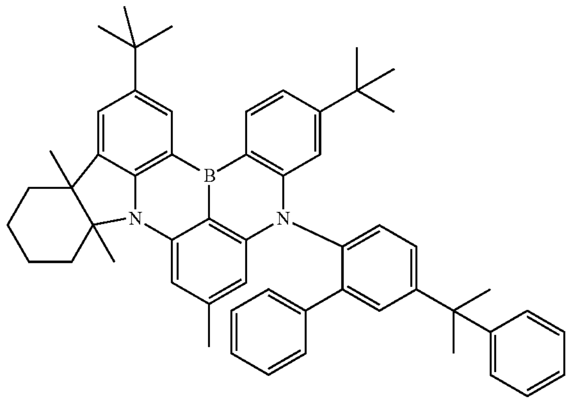

-continued
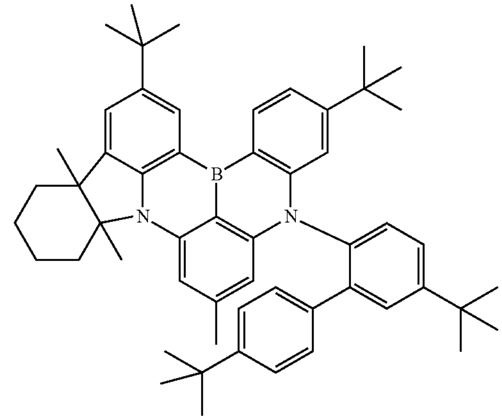
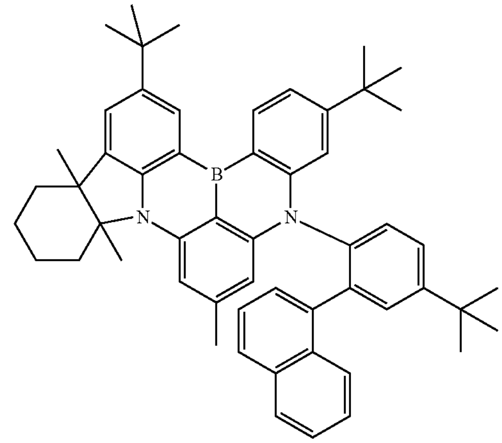
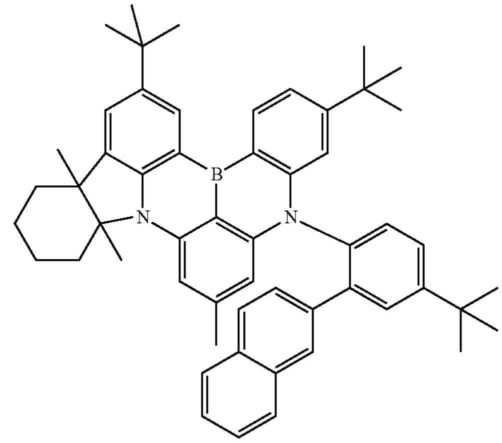
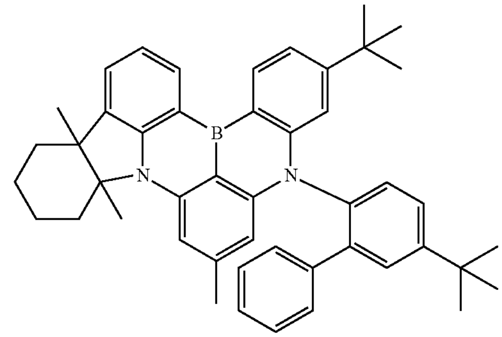
-continued
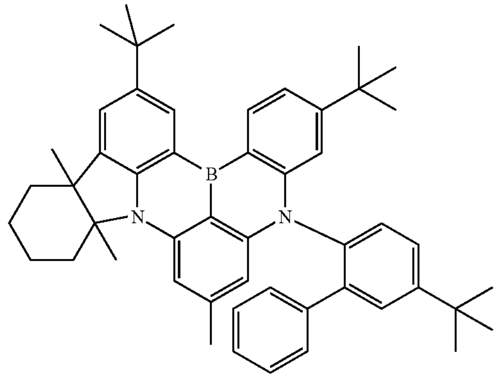
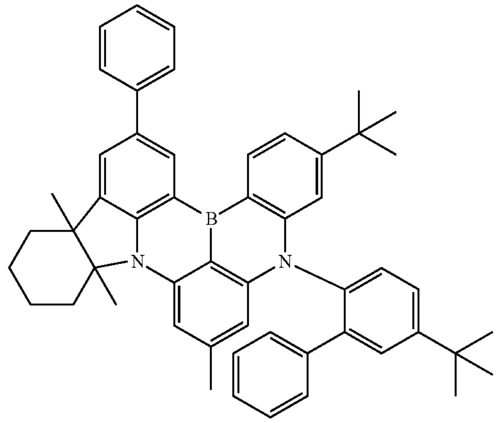
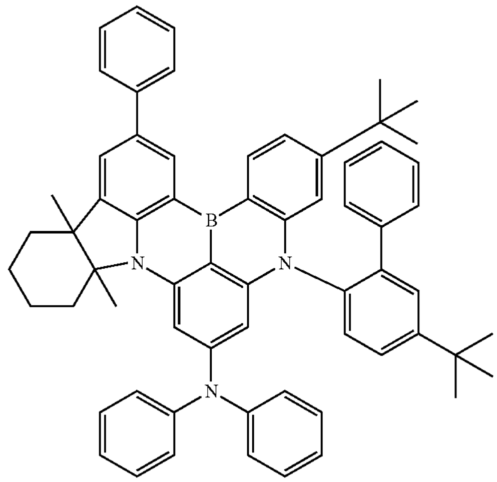

-continued
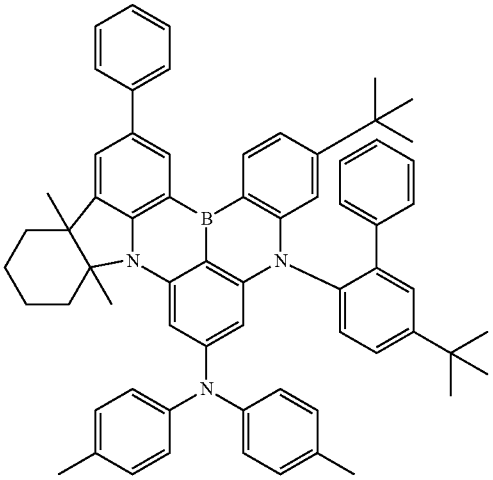
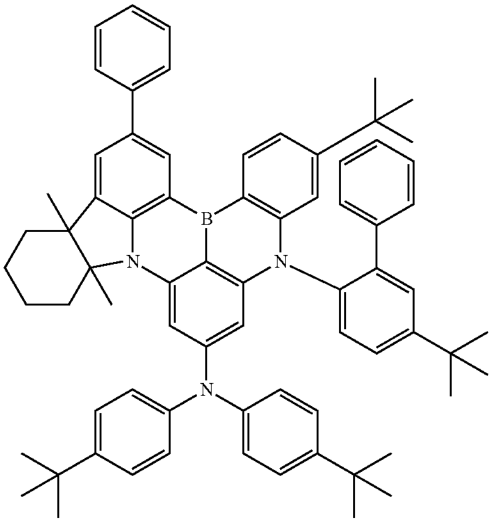
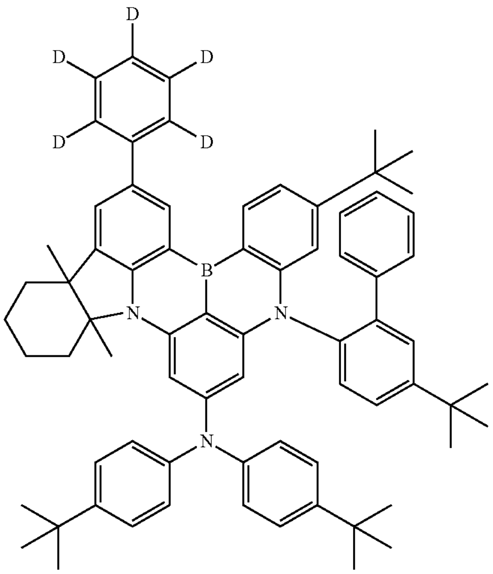
-continued
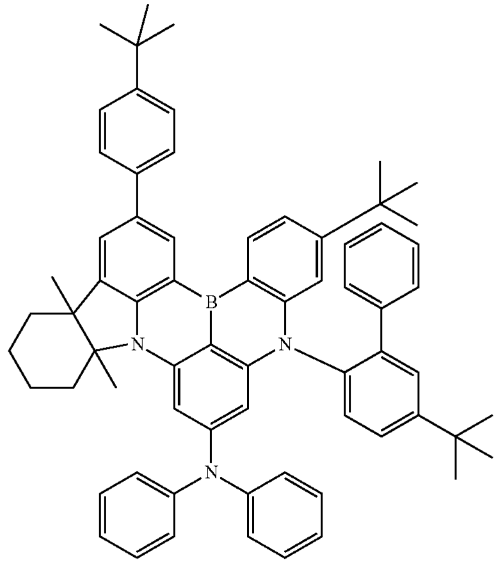
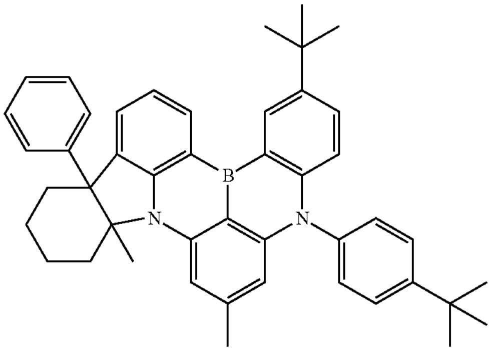
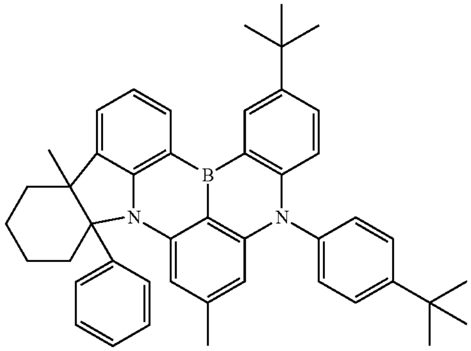
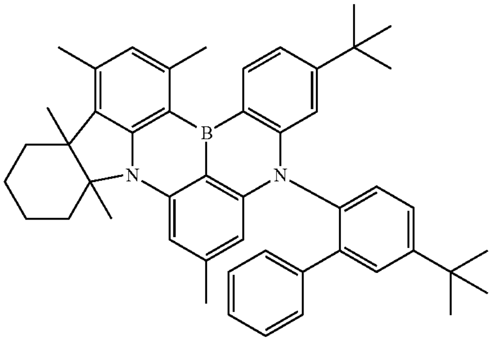

-continued
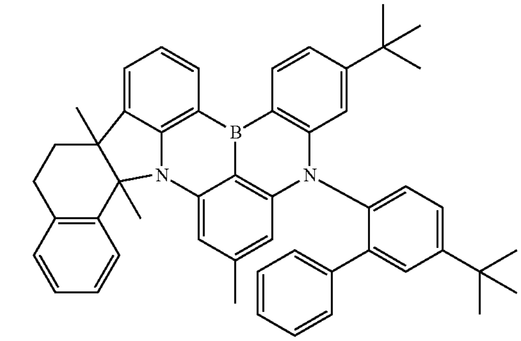
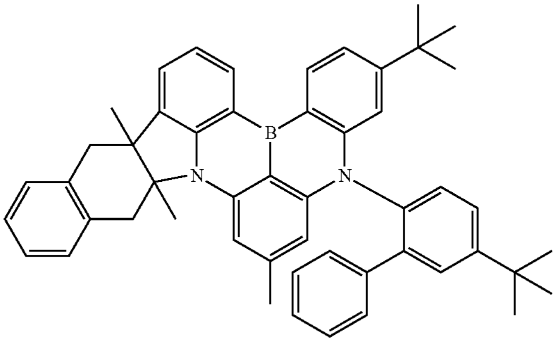
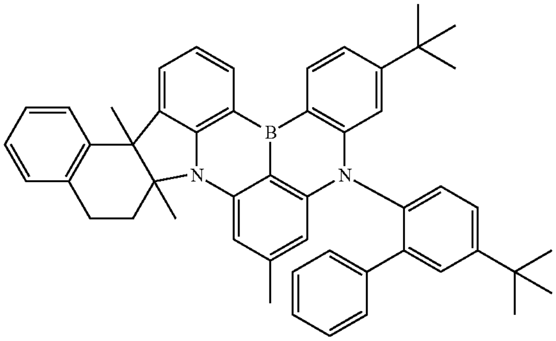
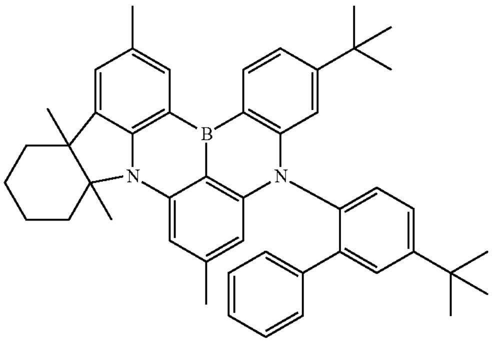
-continued
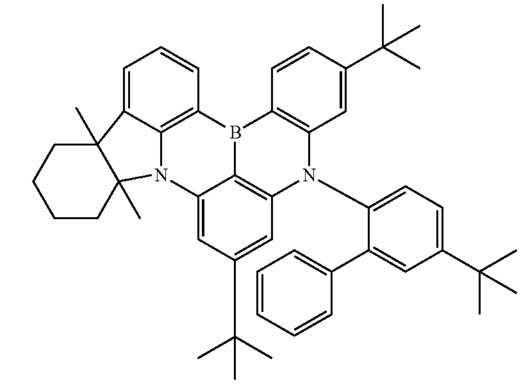
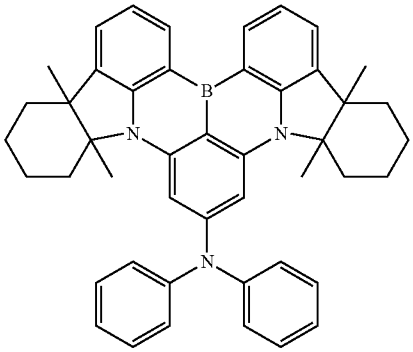
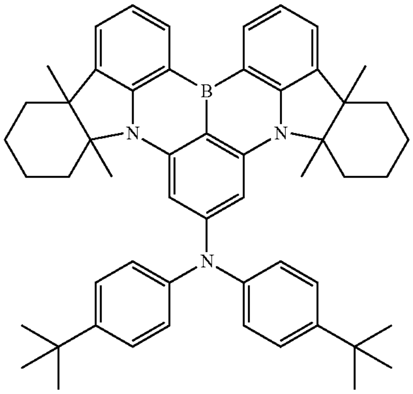
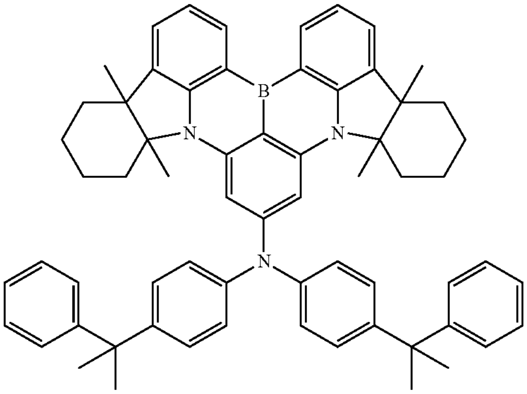

-continued
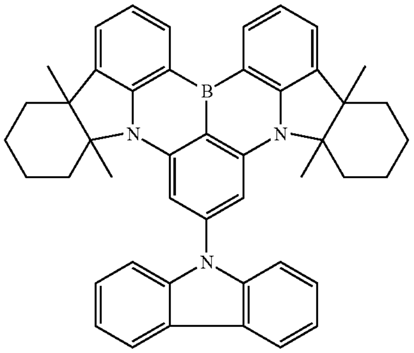
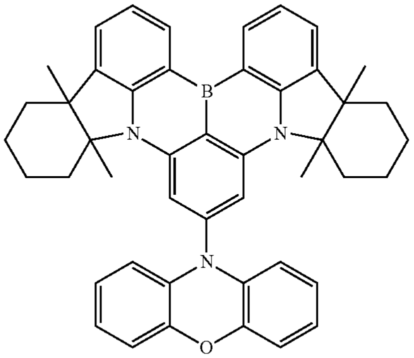
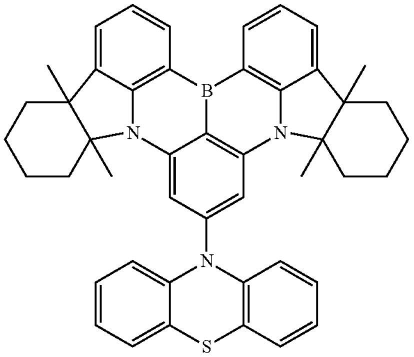
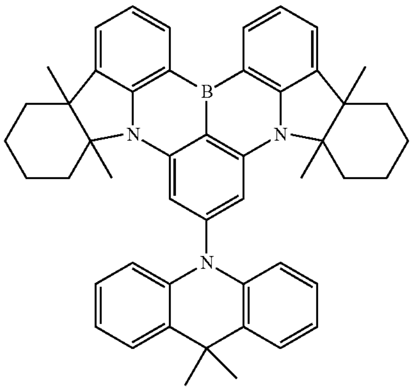
-continued
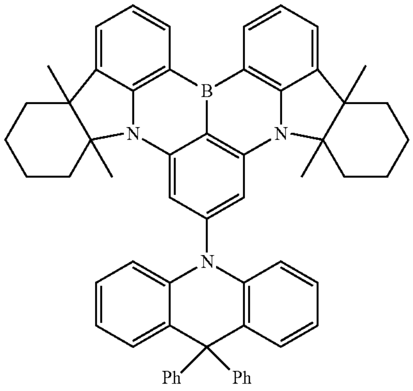
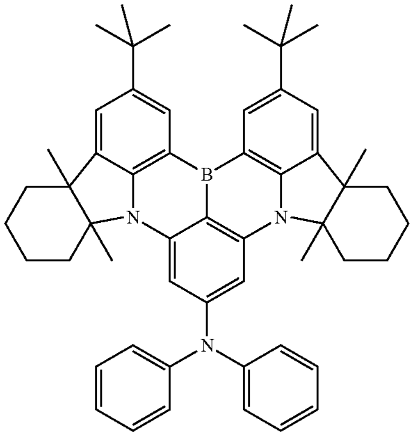
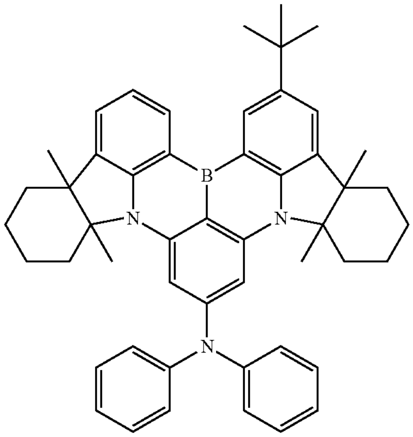
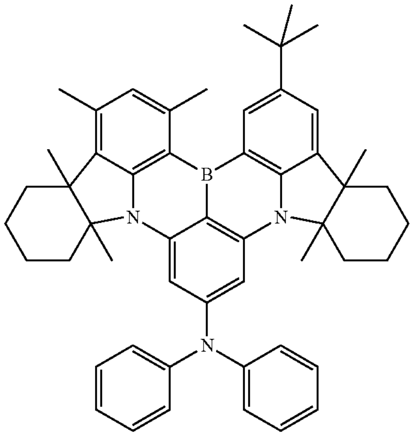

-continued
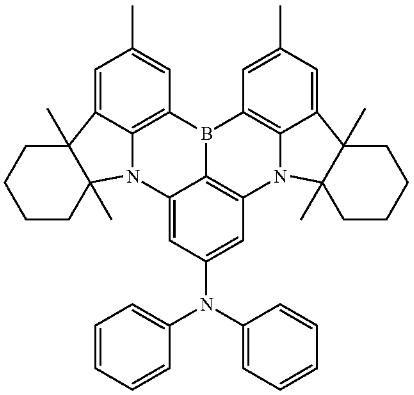
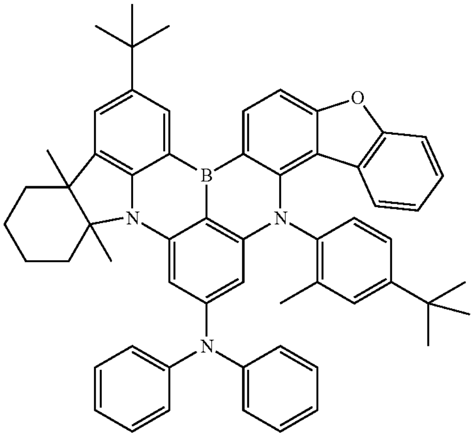
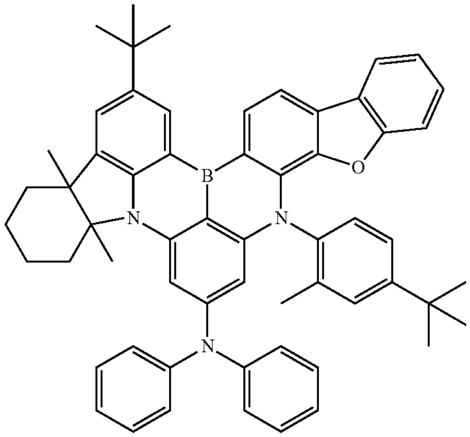
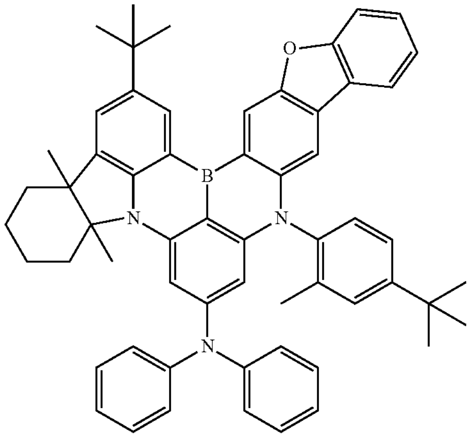
-continued
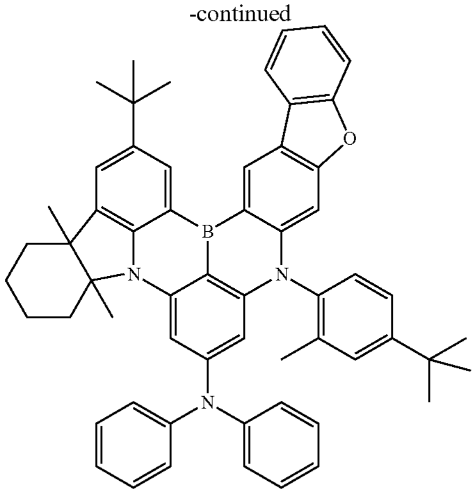
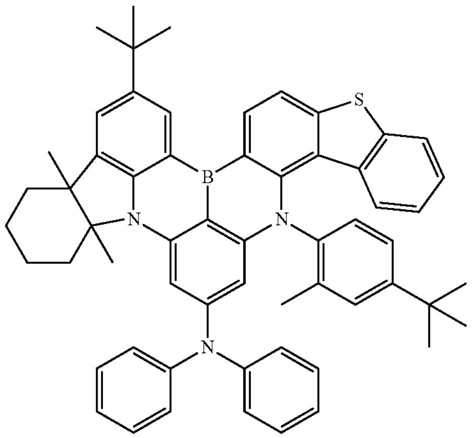
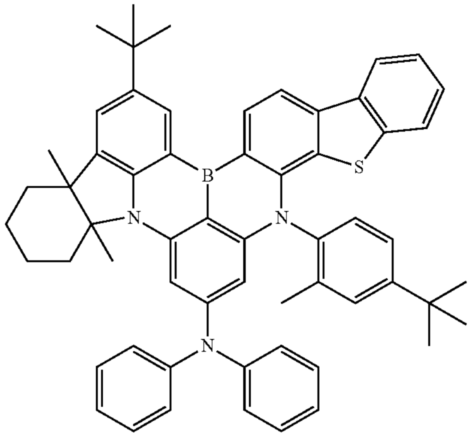

-continued
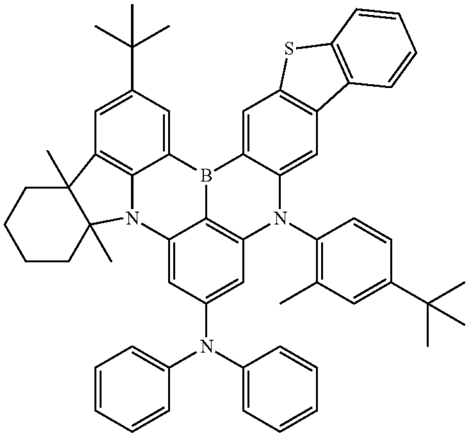
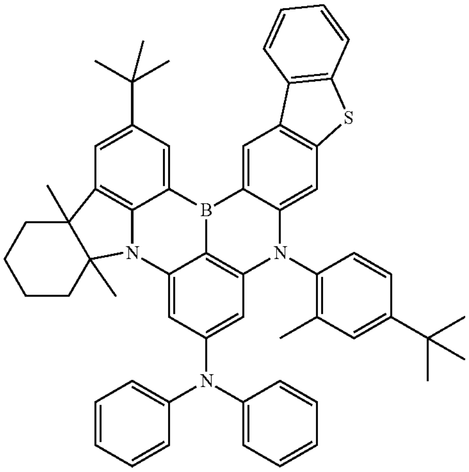
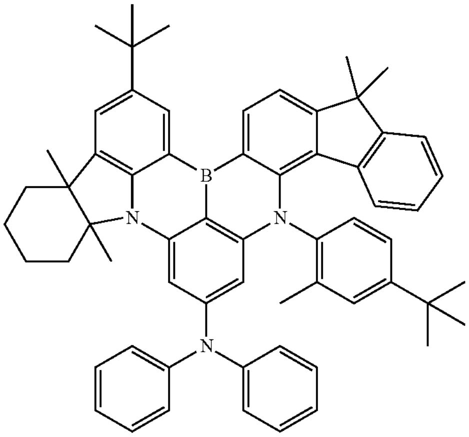
-continued
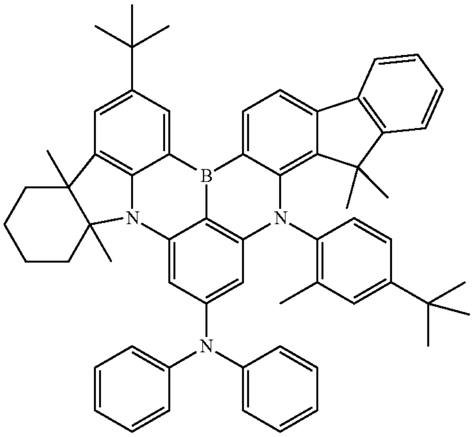
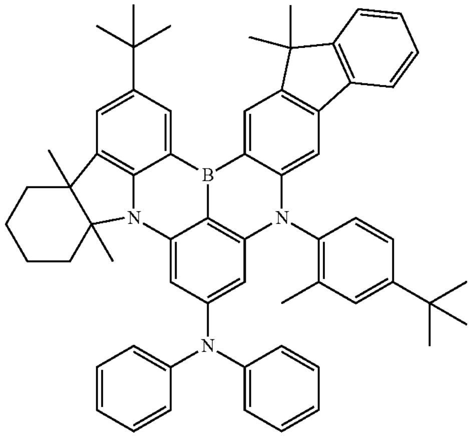
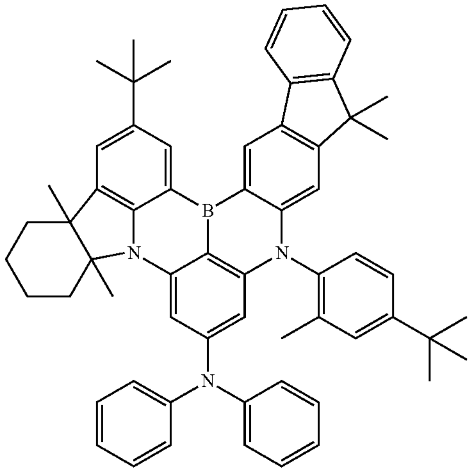

-continued
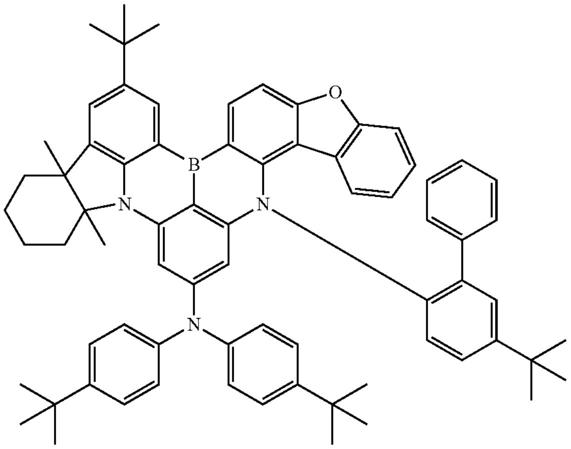
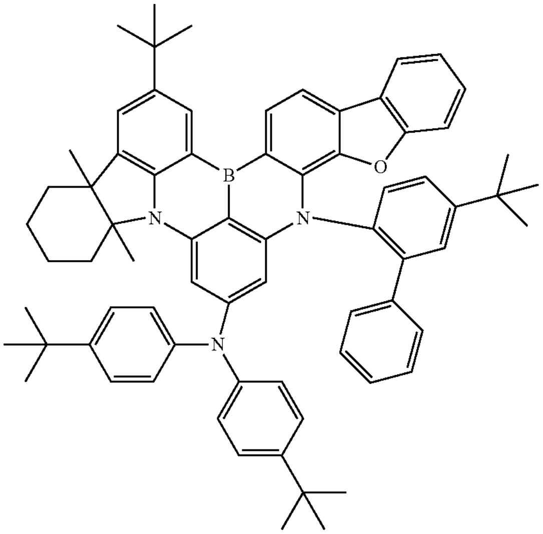
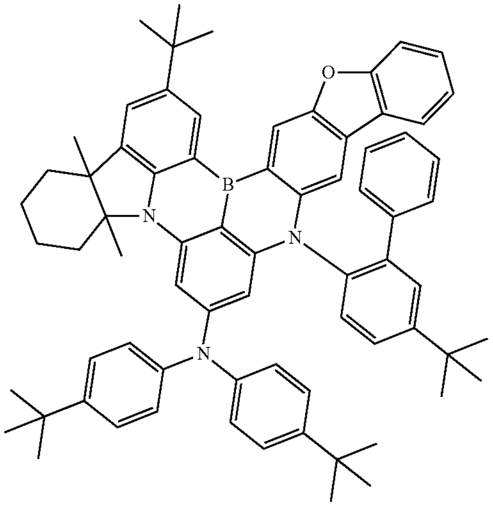
-continued
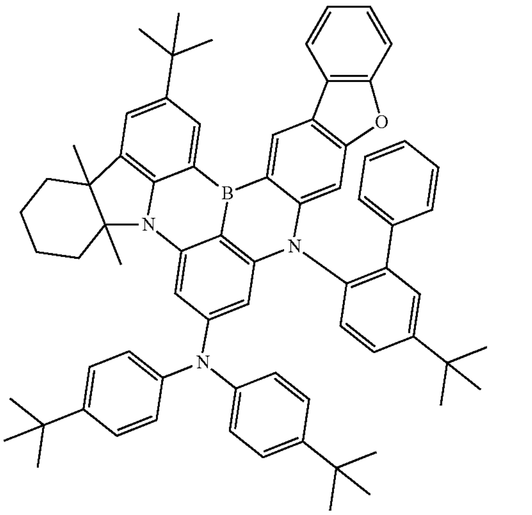
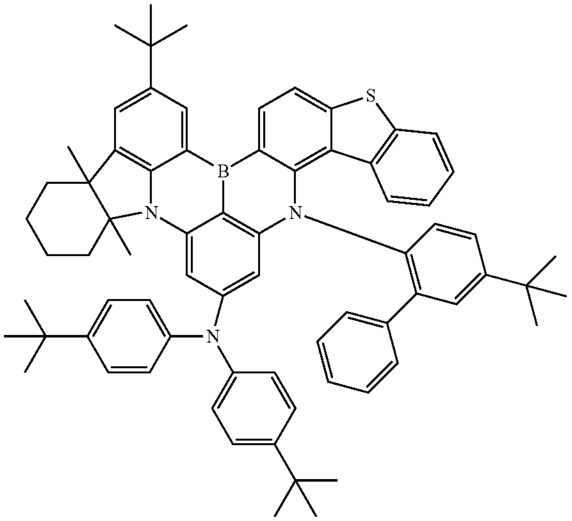
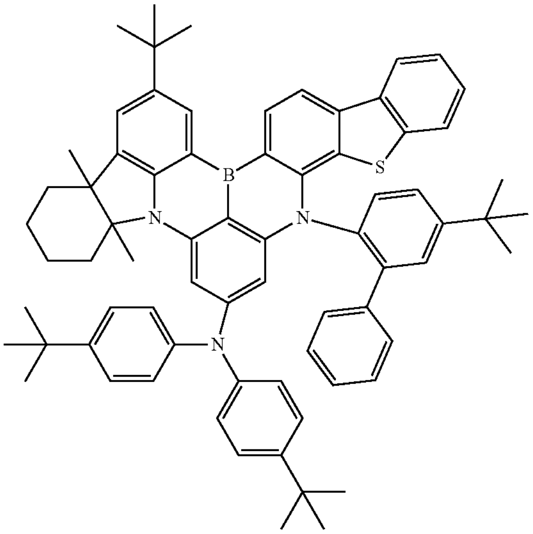

-continued
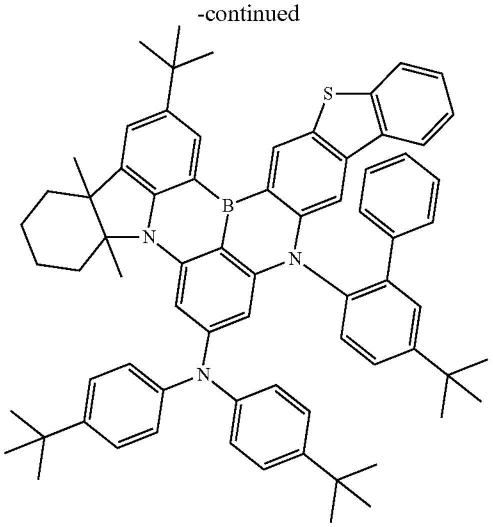
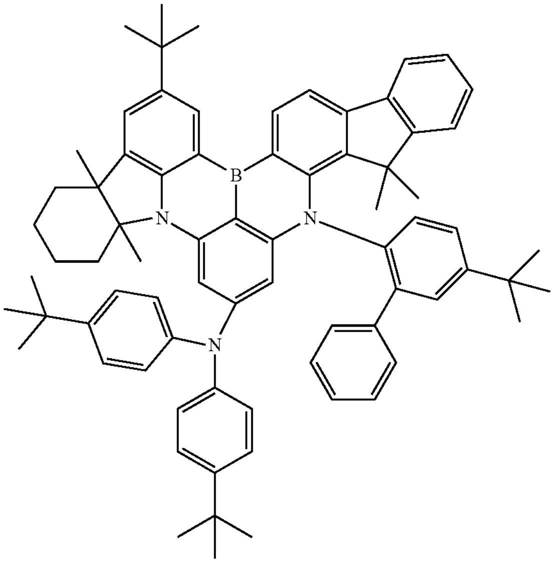
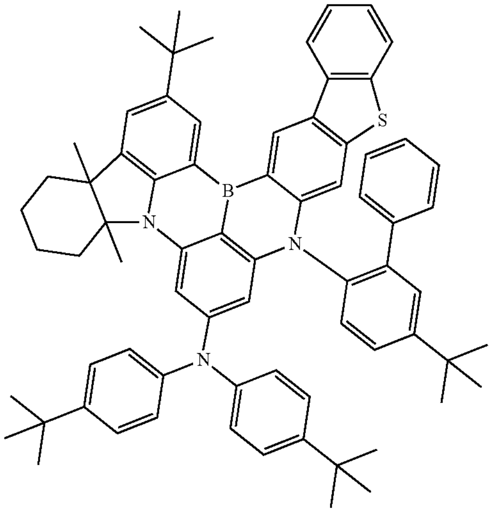
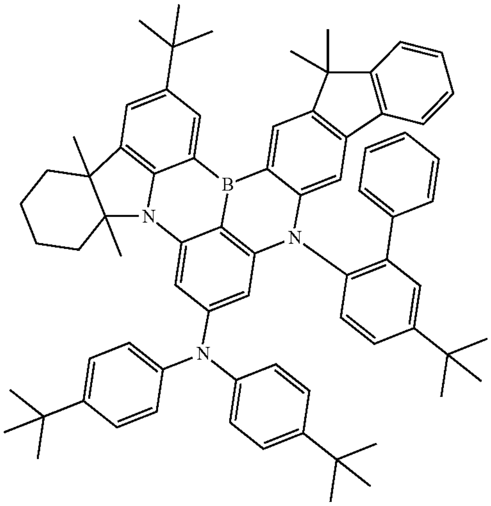
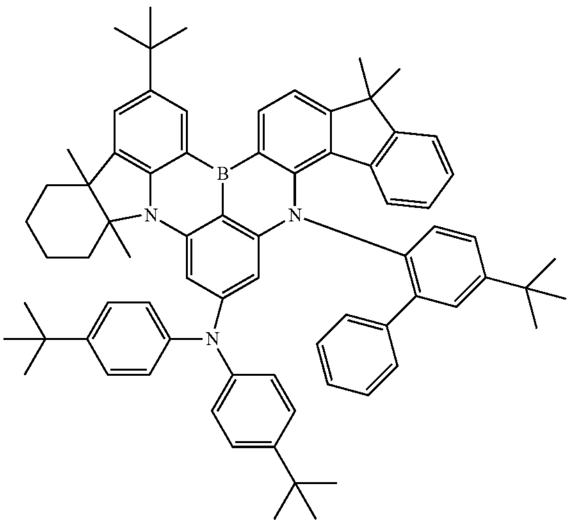
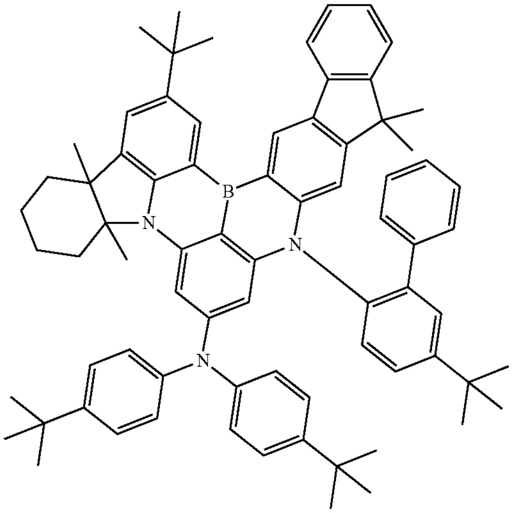
-continued -continued
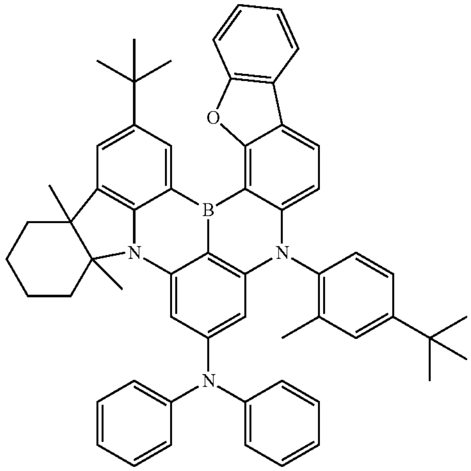
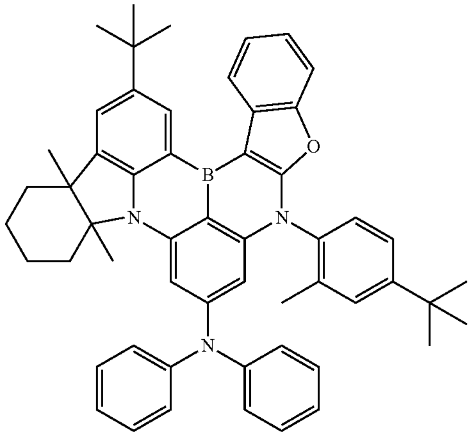
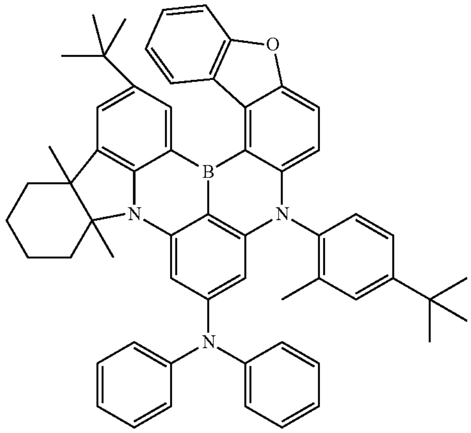
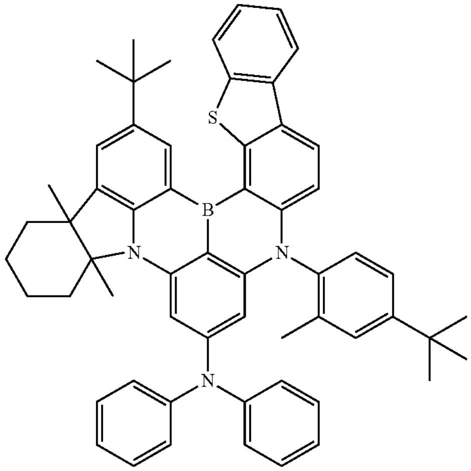
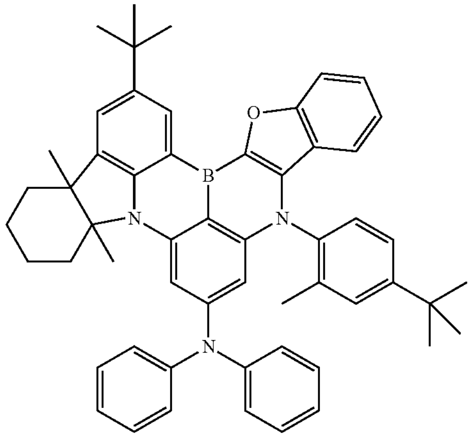
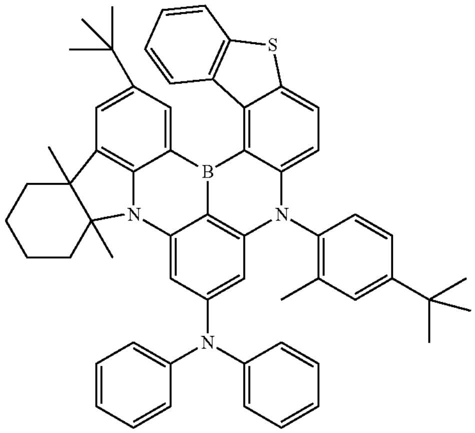
-continued -continued
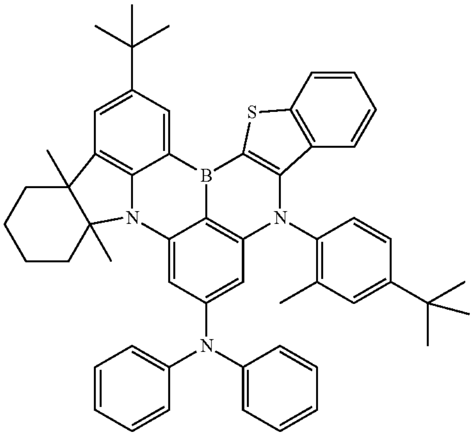
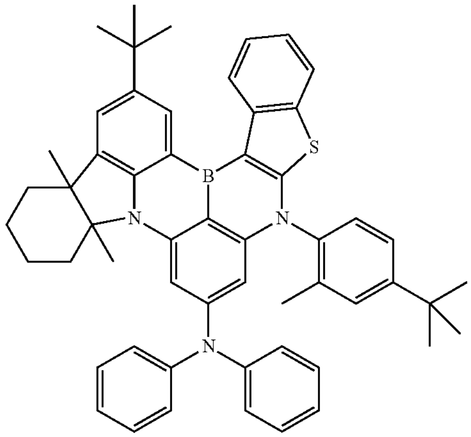
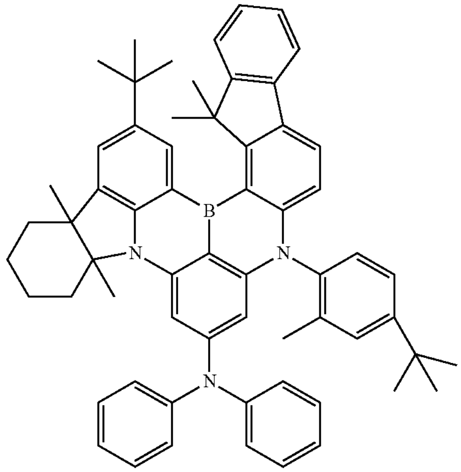
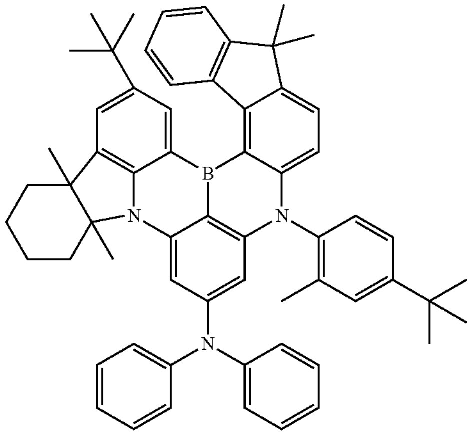
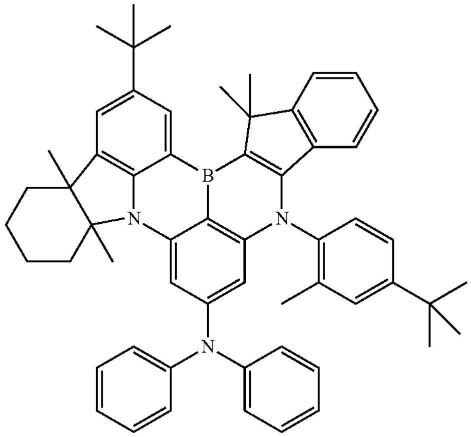
-continued
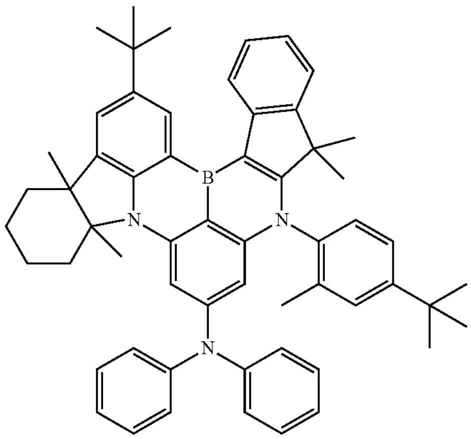

-continued
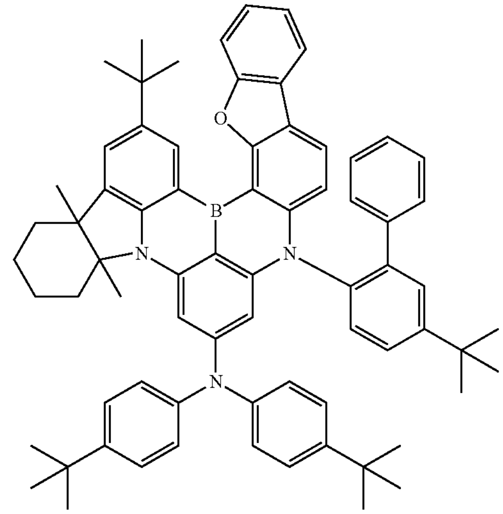
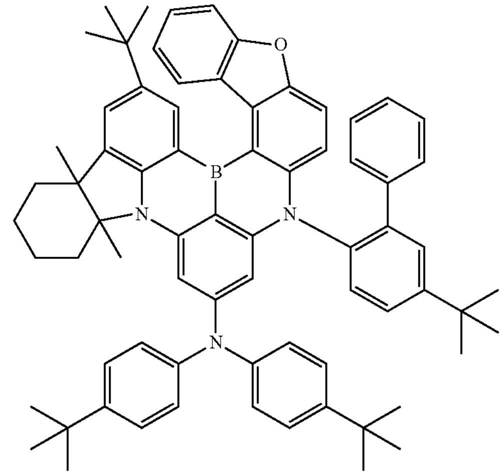
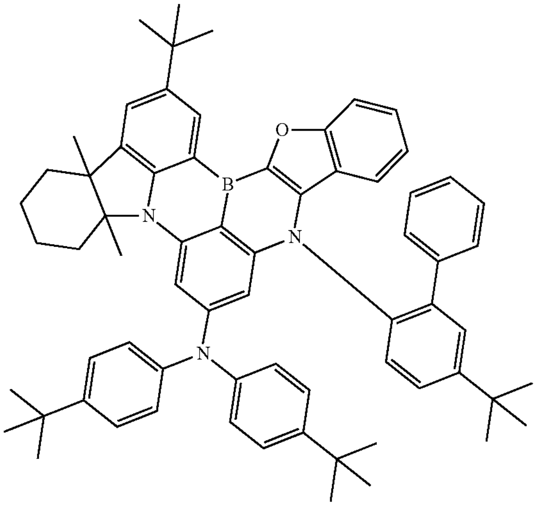
-continued
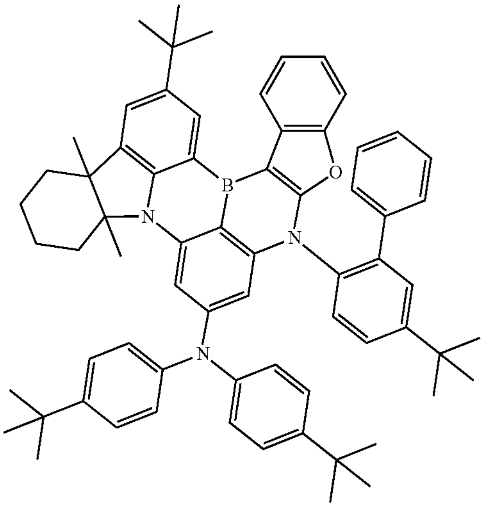
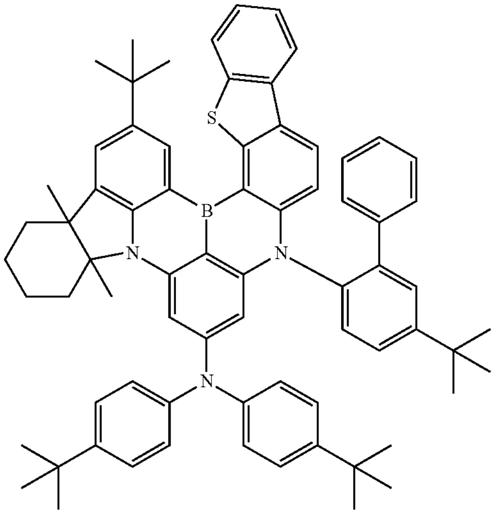
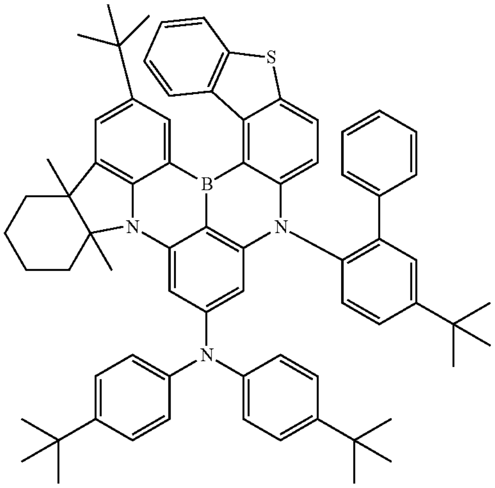

-continued
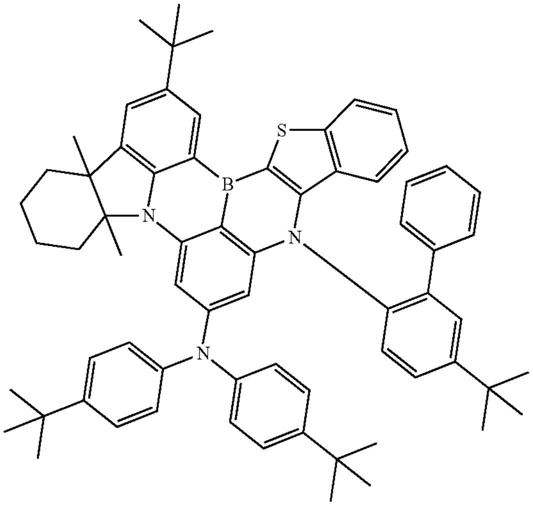
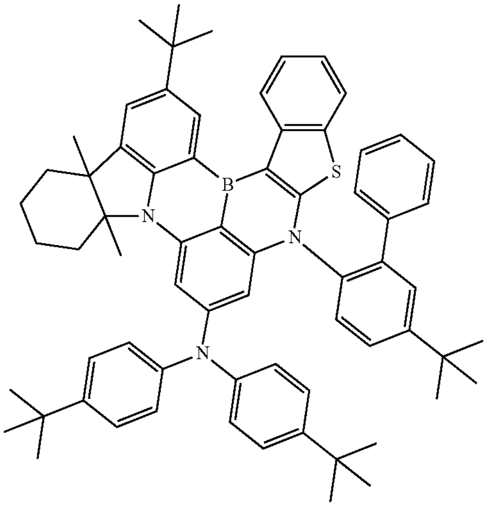
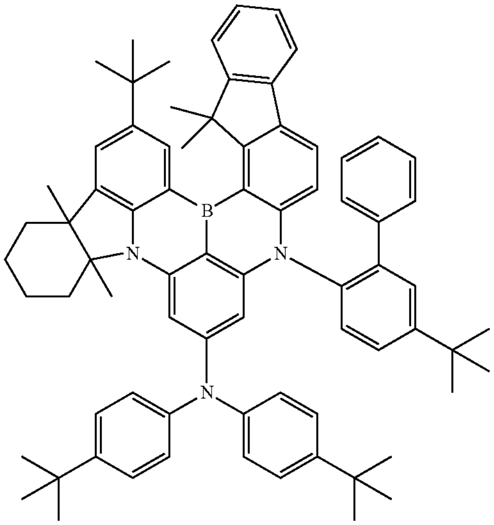
-continued
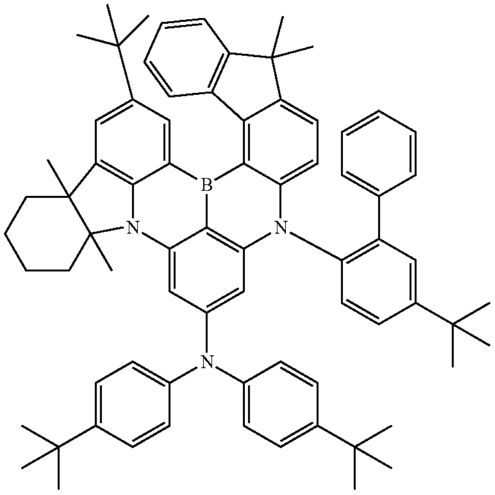
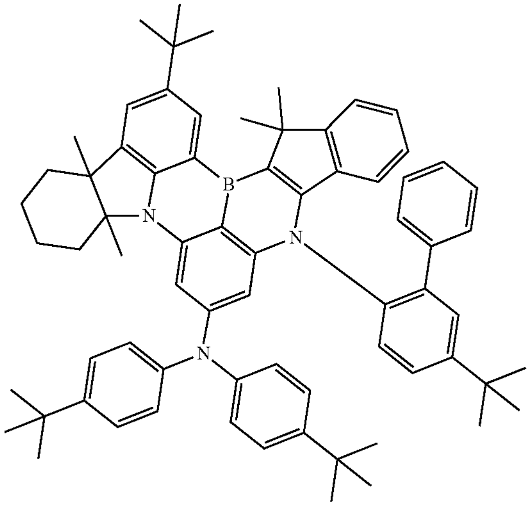
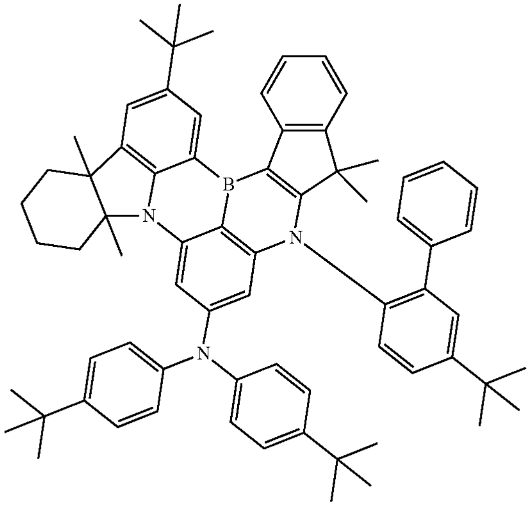

-continued
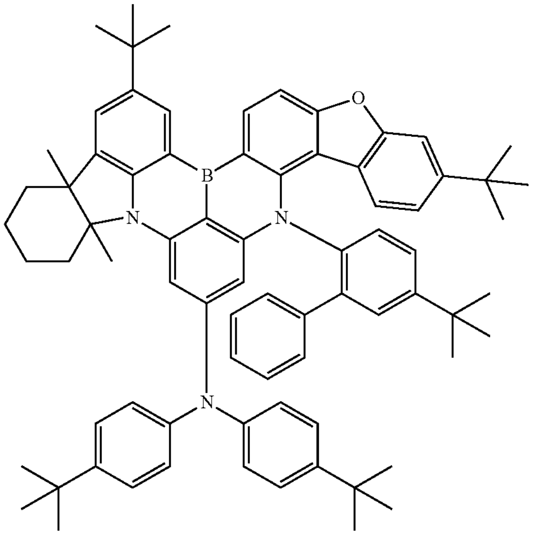
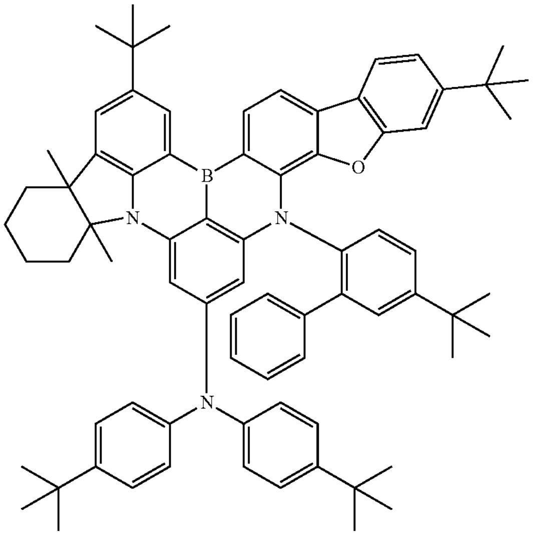
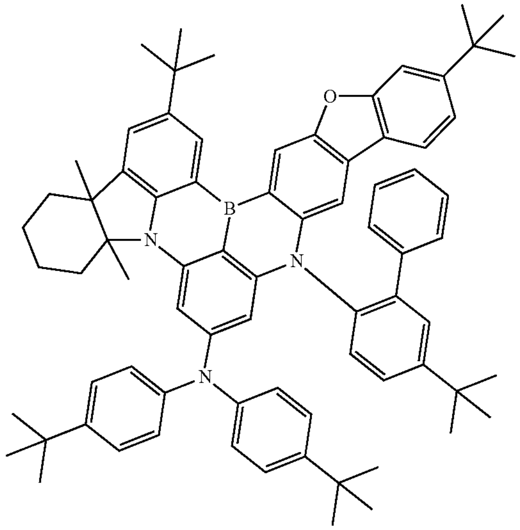
-continued
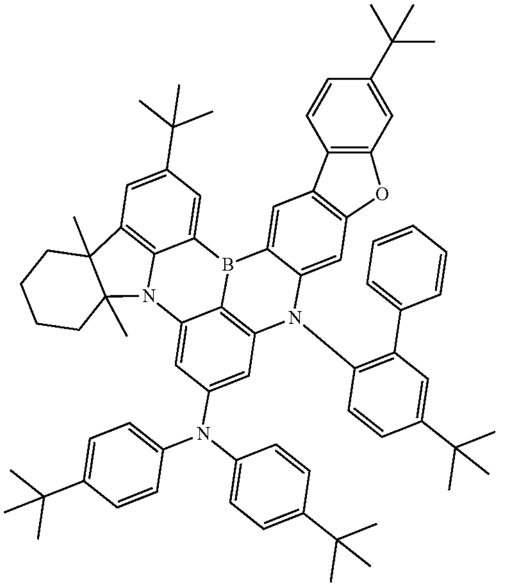
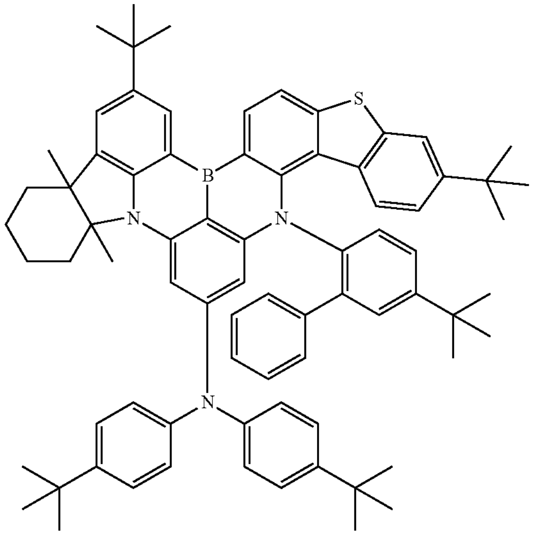
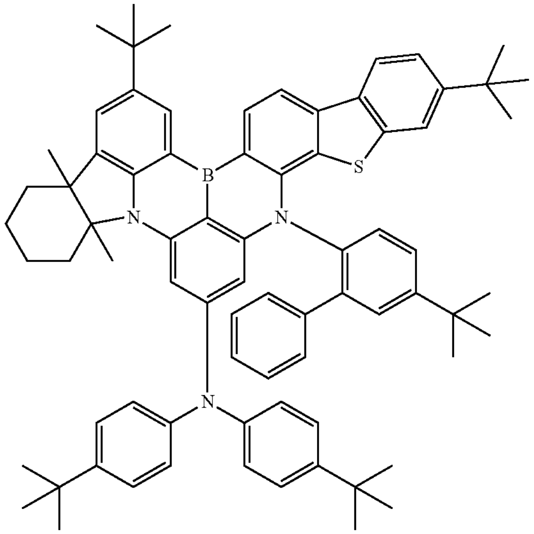

-continued
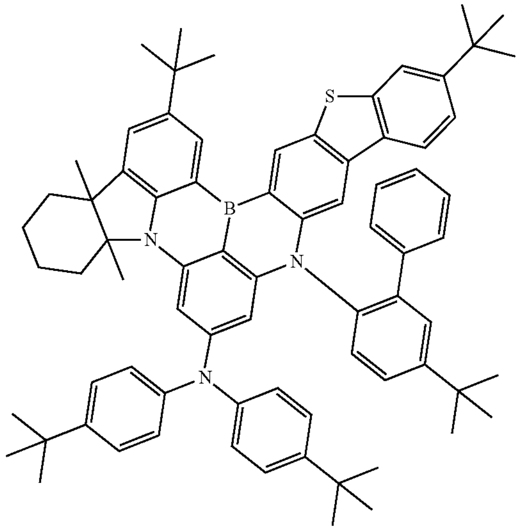
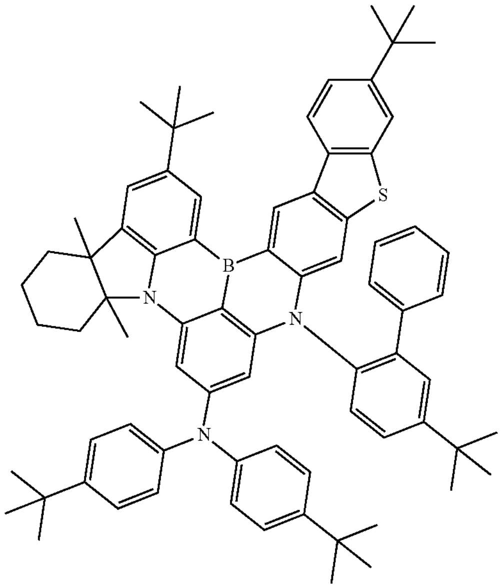
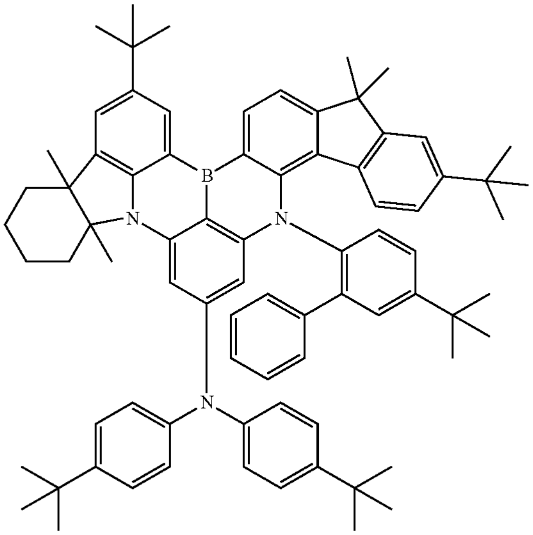
-continued
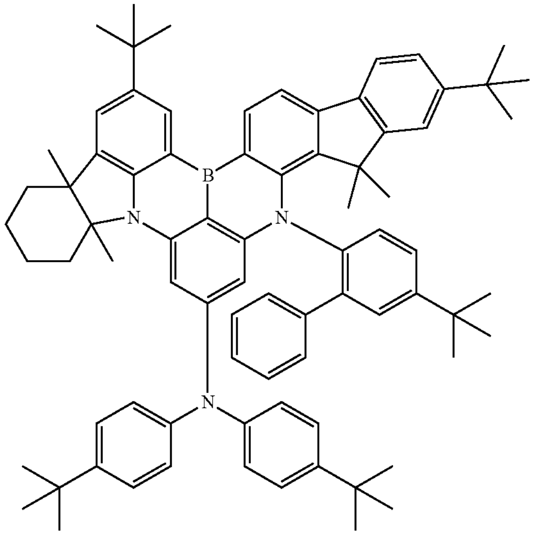
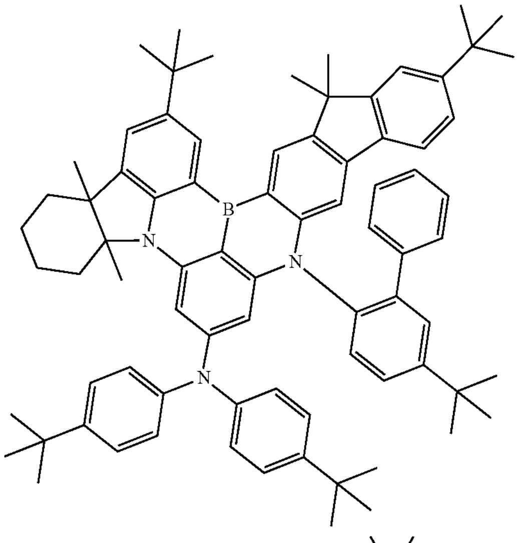
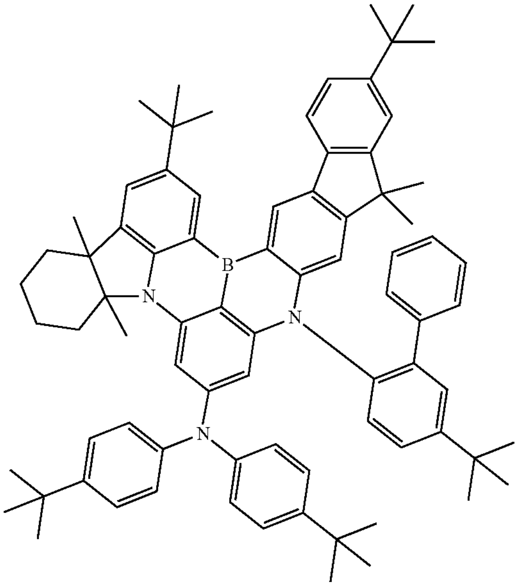

-continued
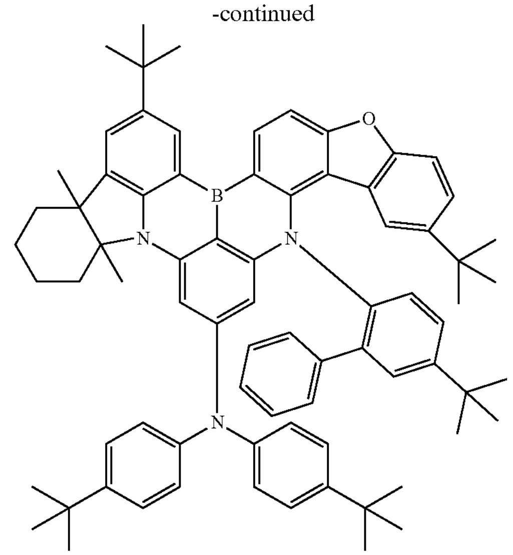
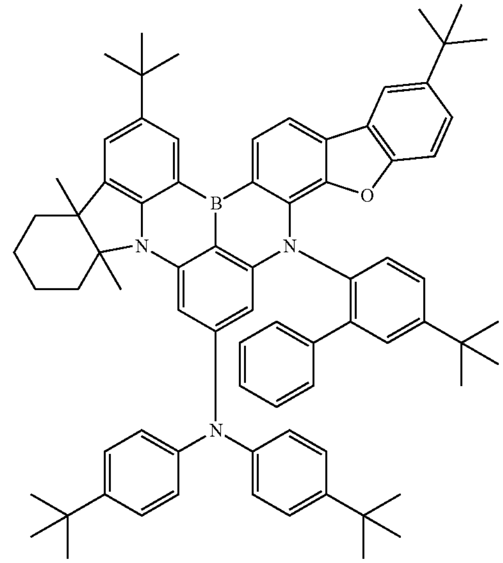
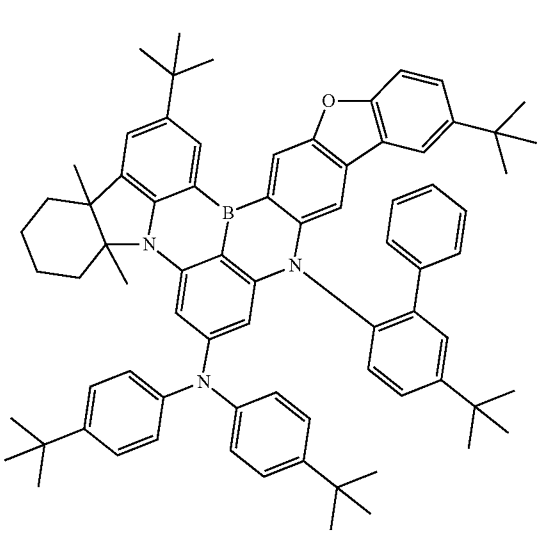
-continued
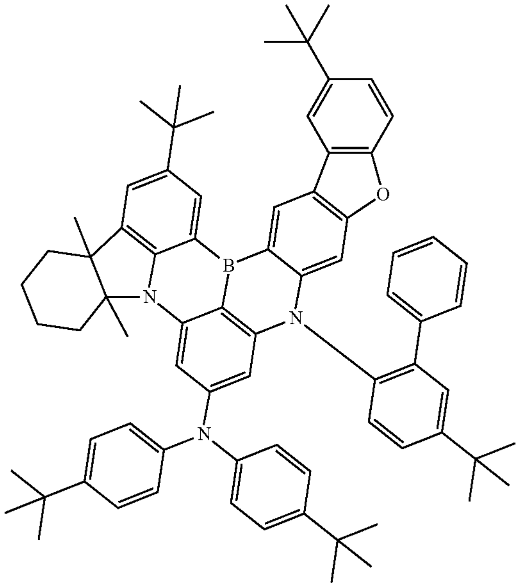
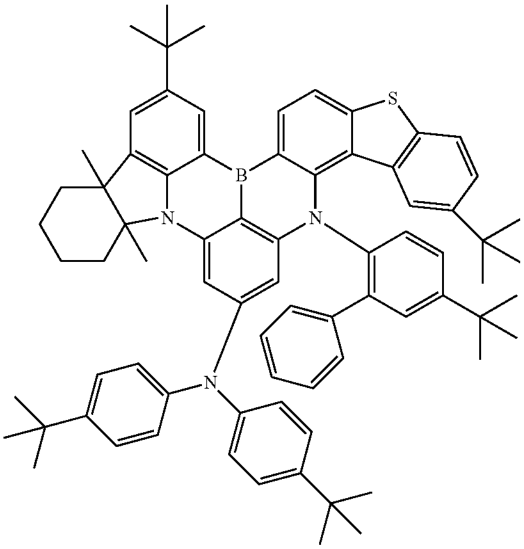
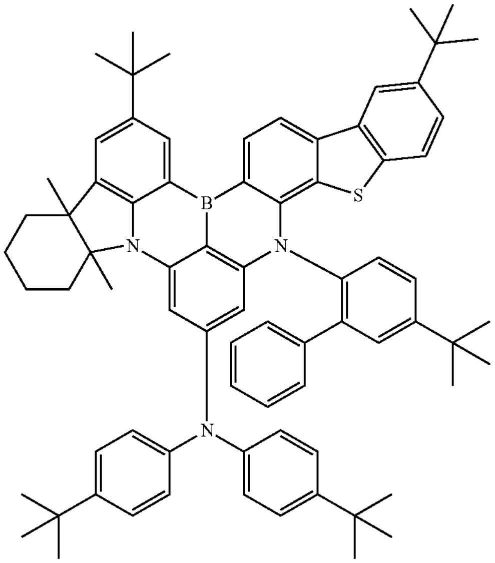

-continued
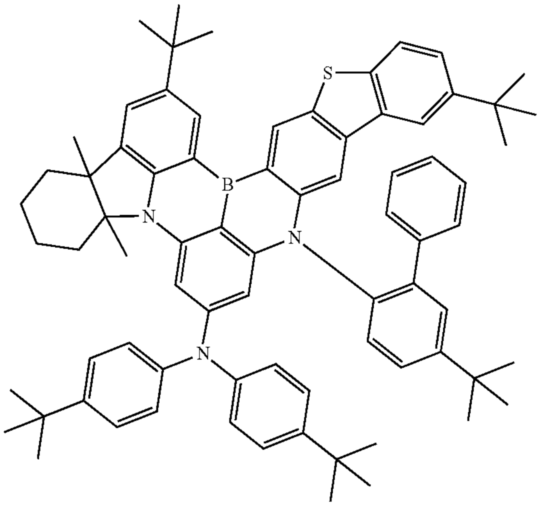
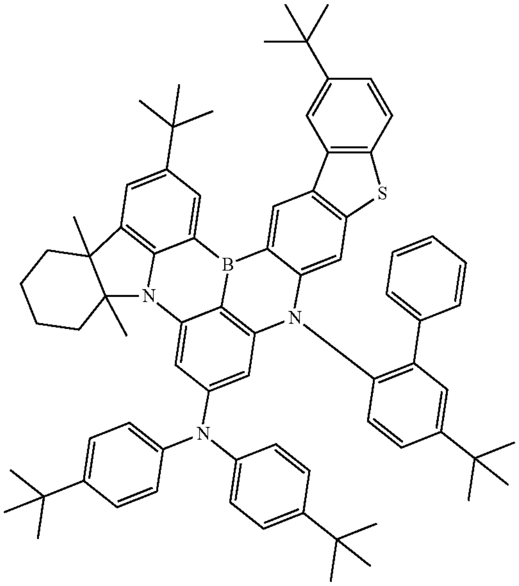
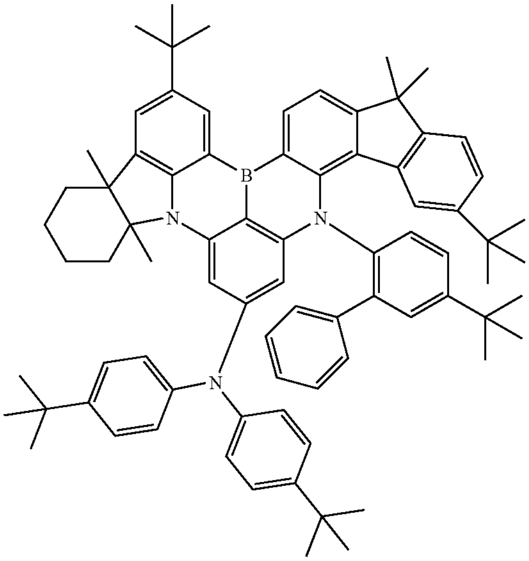
-continued
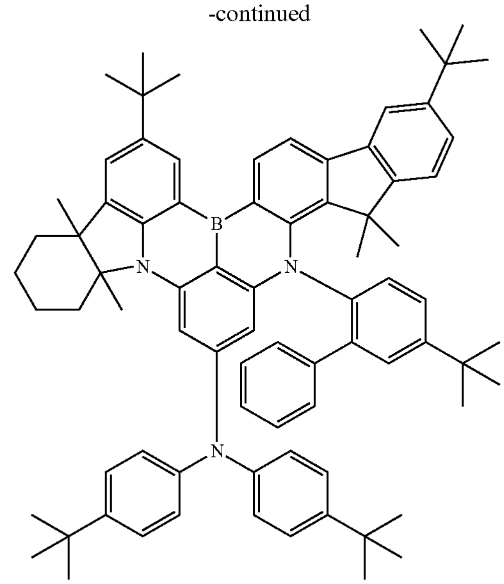
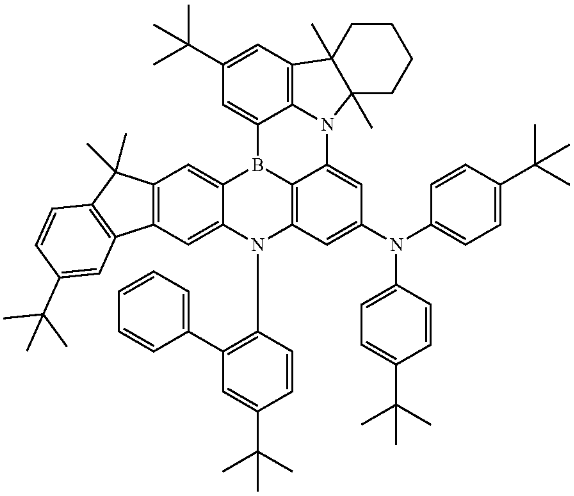
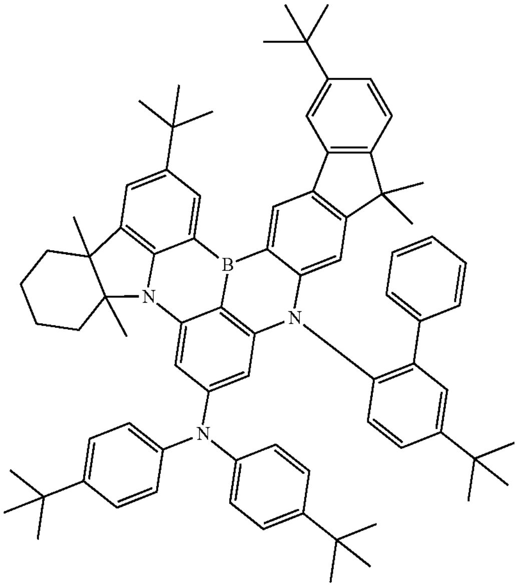

-continued
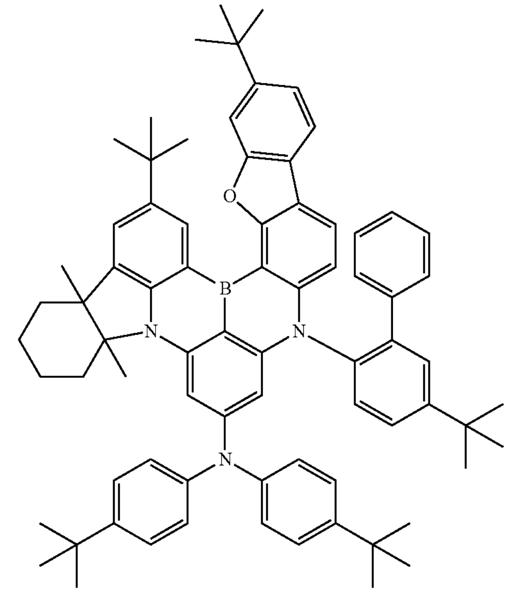
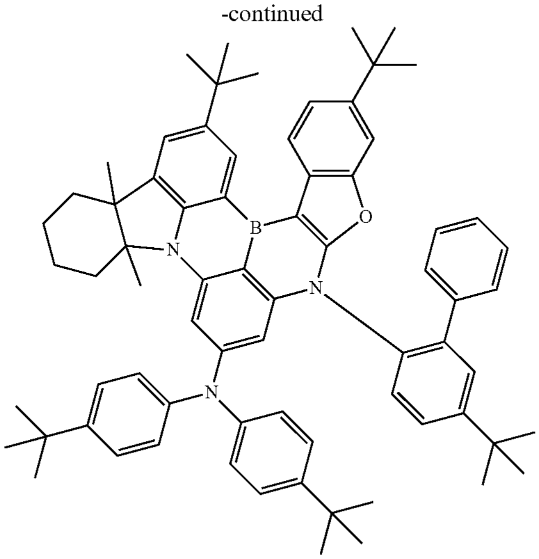
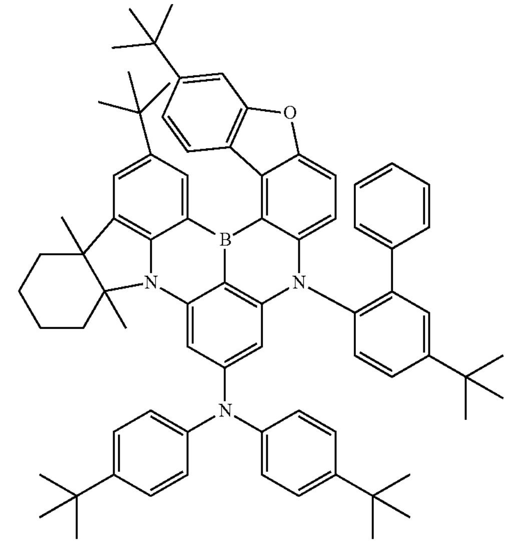
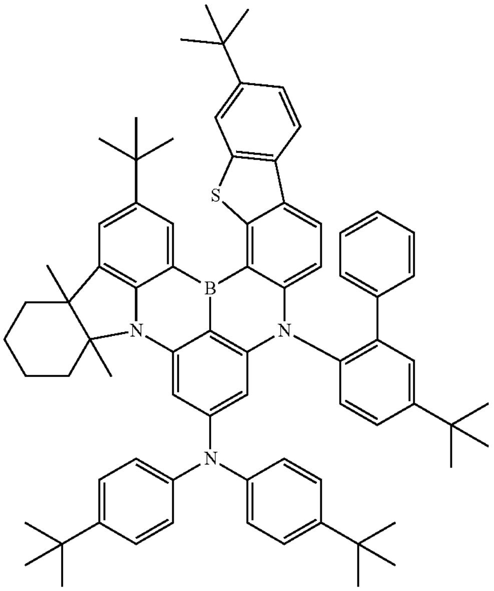
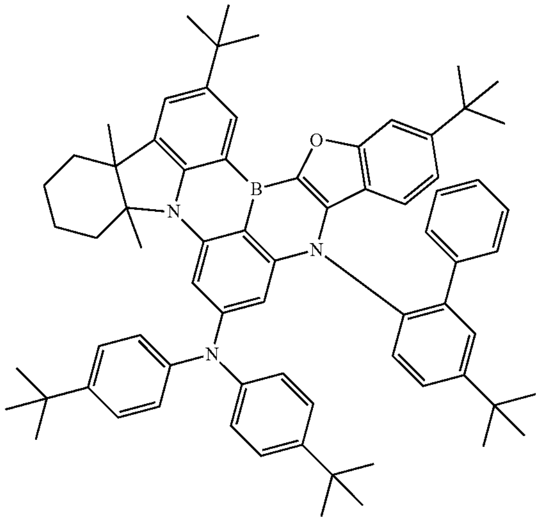
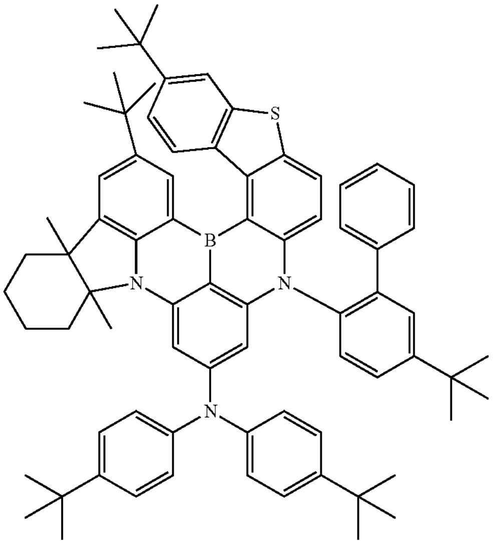

-continued
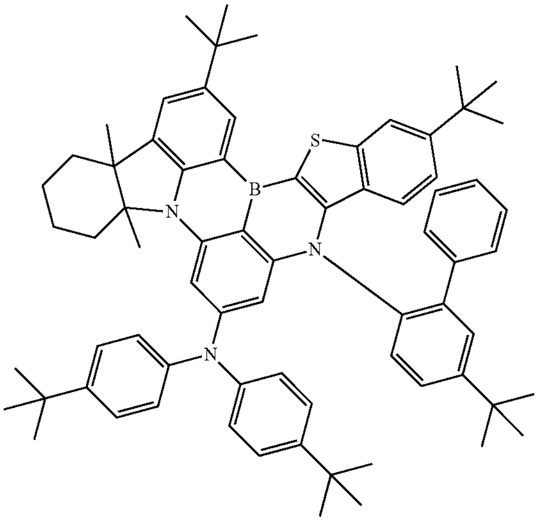
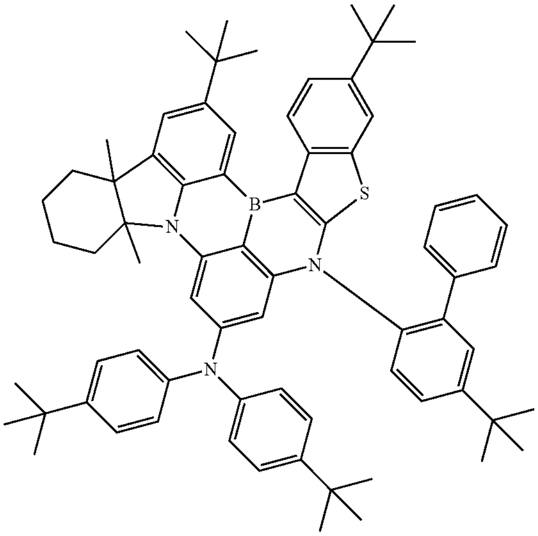
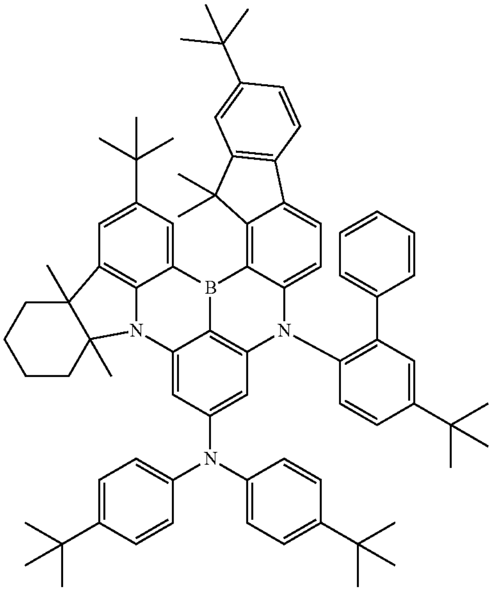
-continued
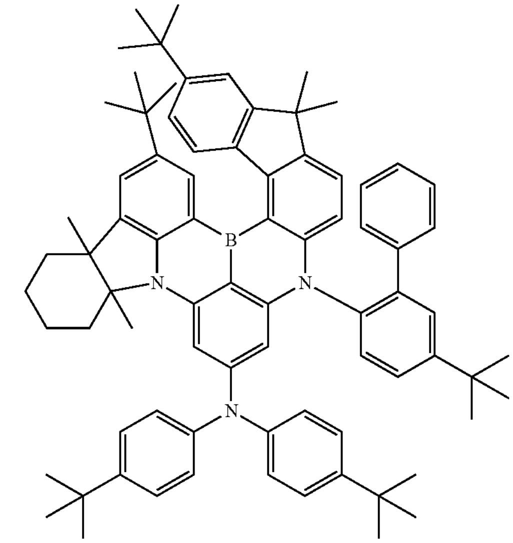
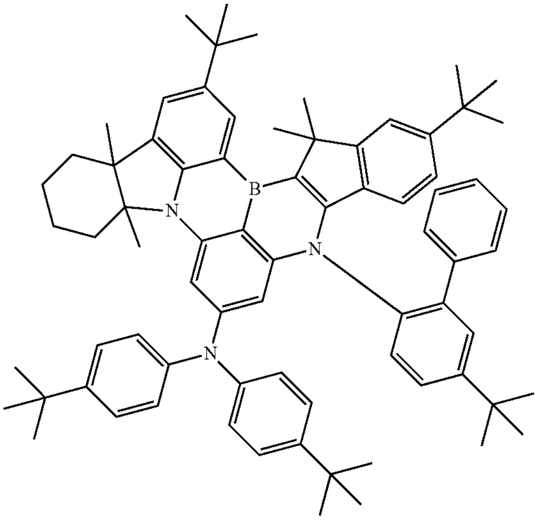
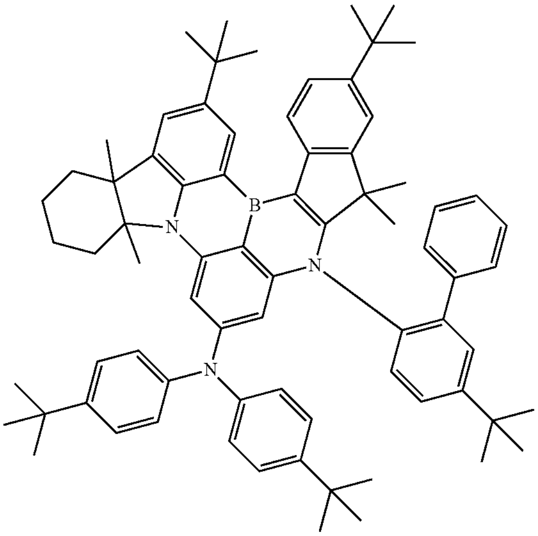

-continued
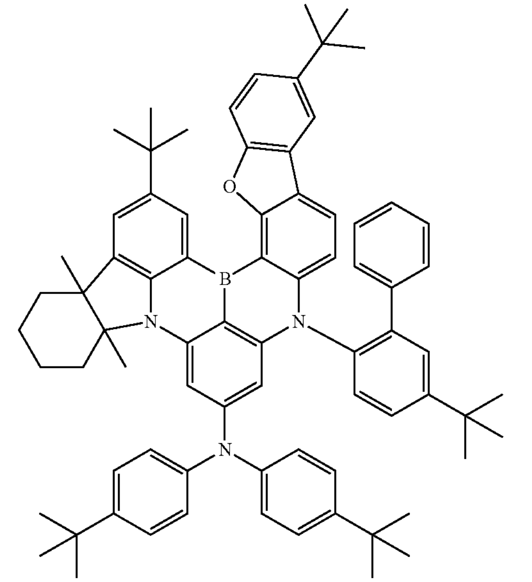
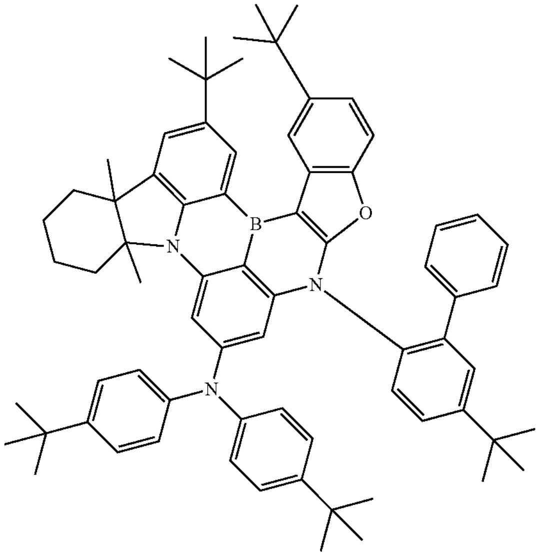
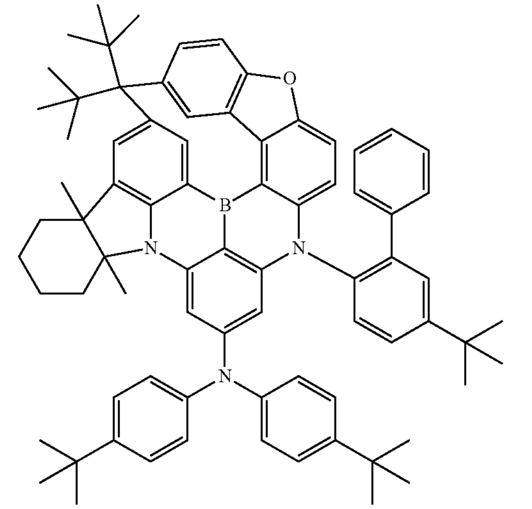
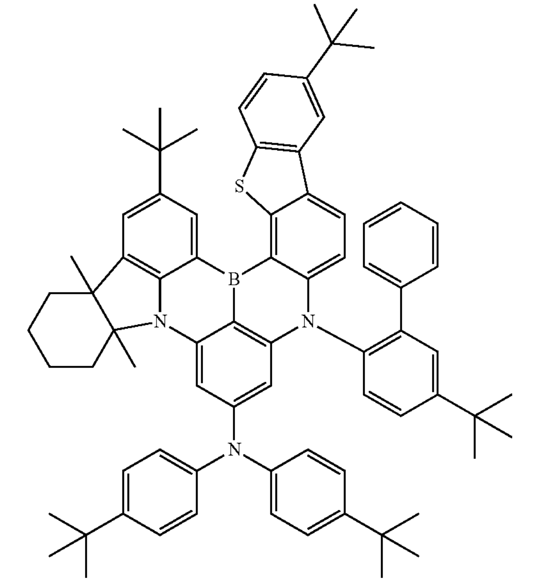
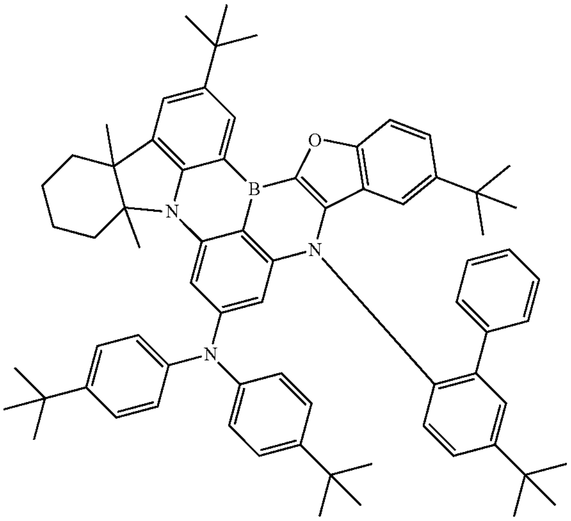
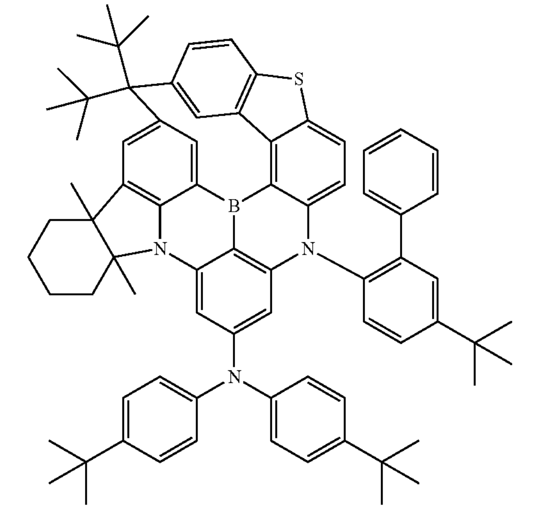
-continued -continued
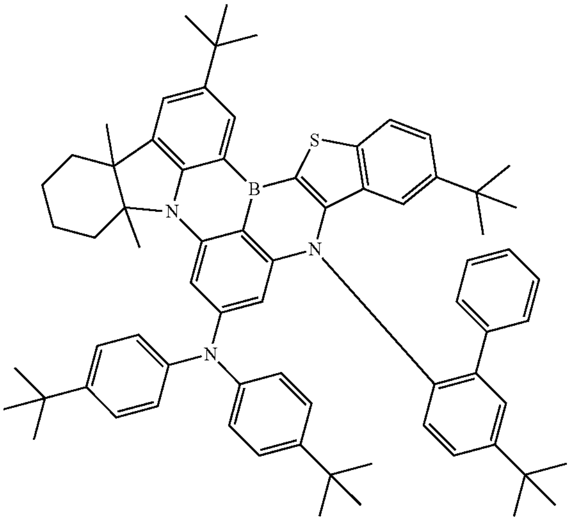
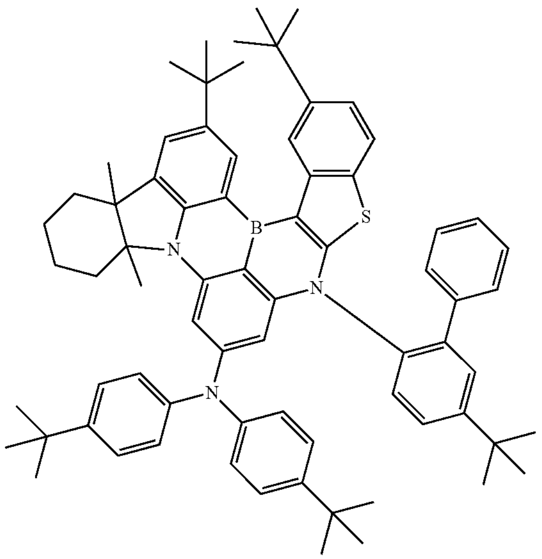
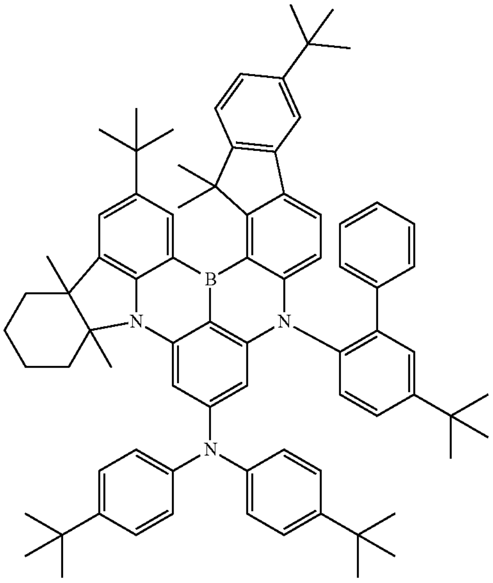
-continued
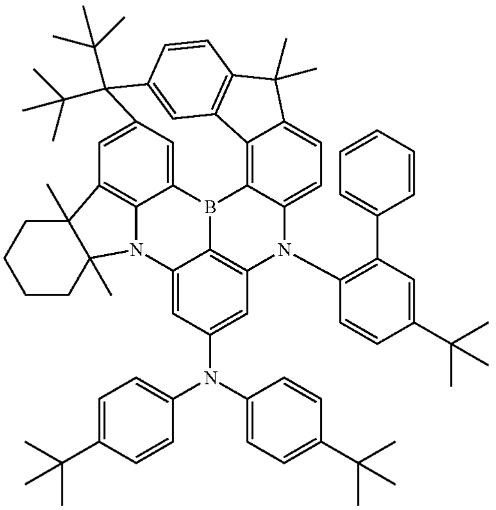
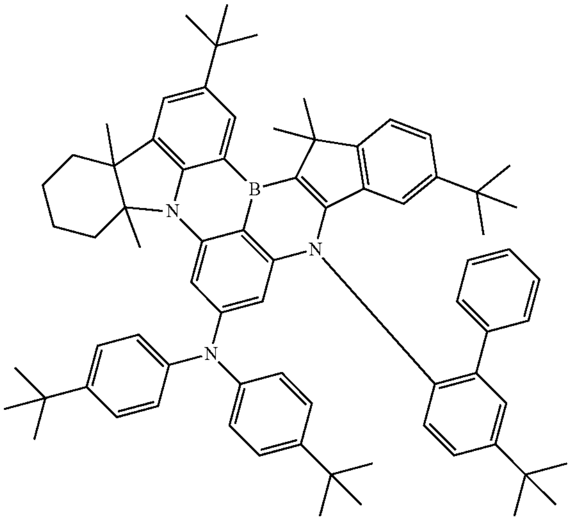
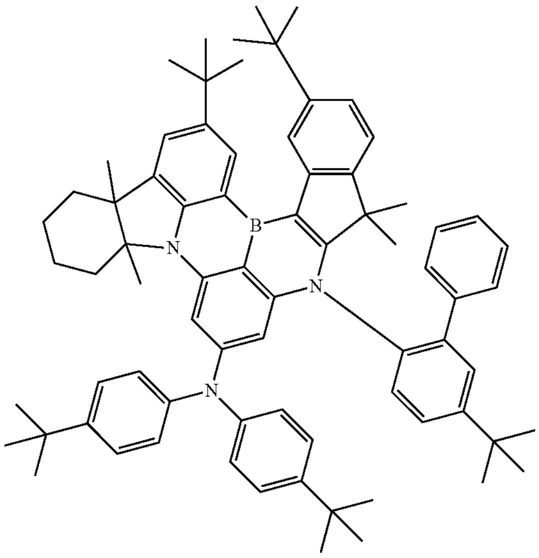

-continued
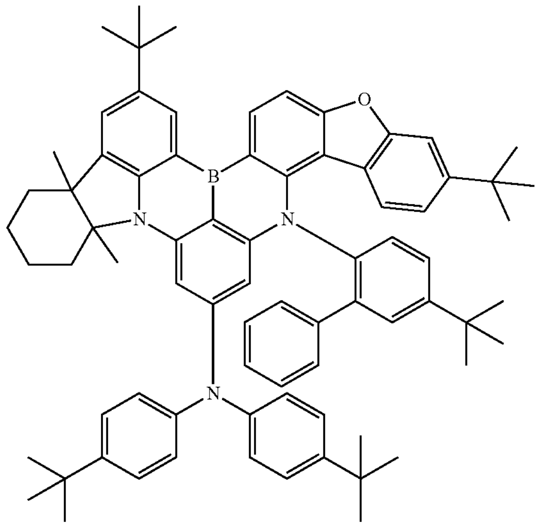
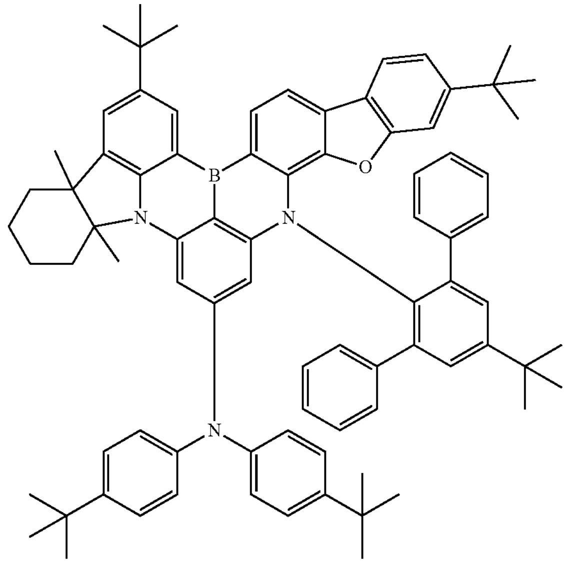
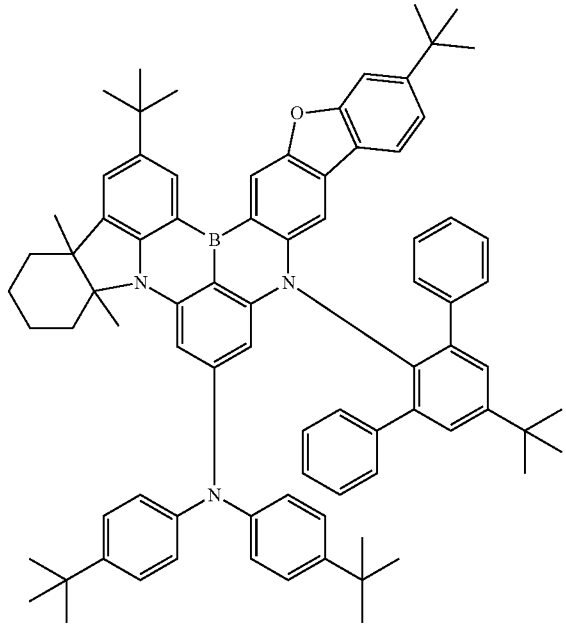
-continued
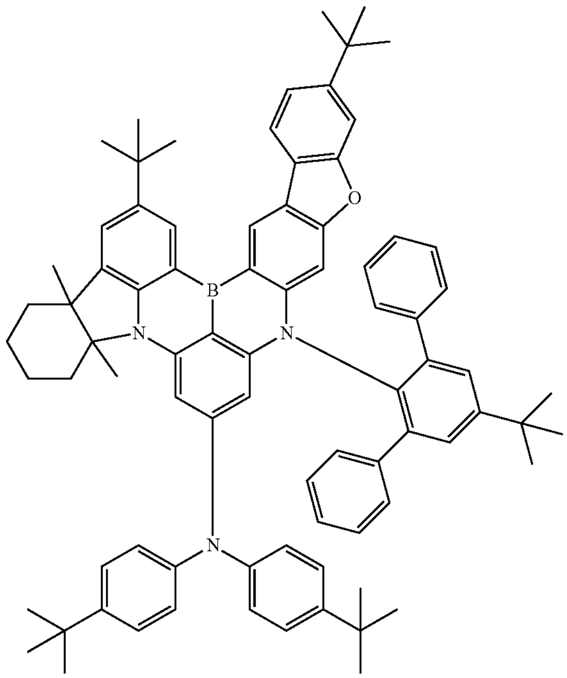
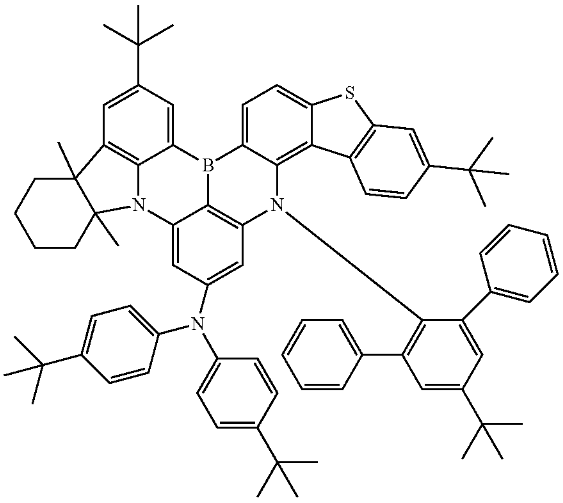

-continued
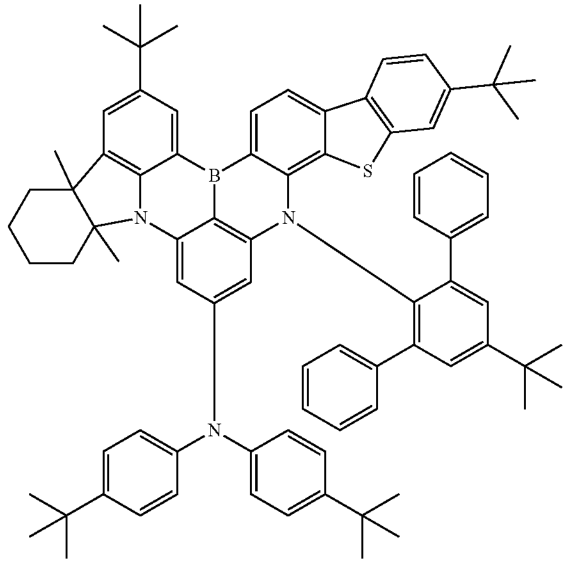
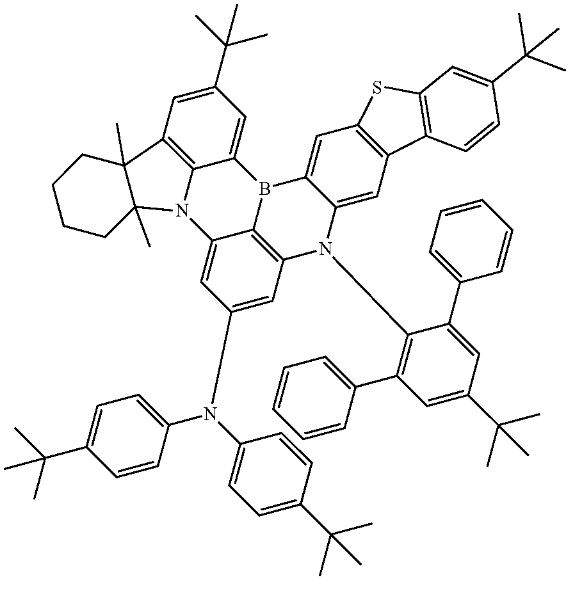
-continued
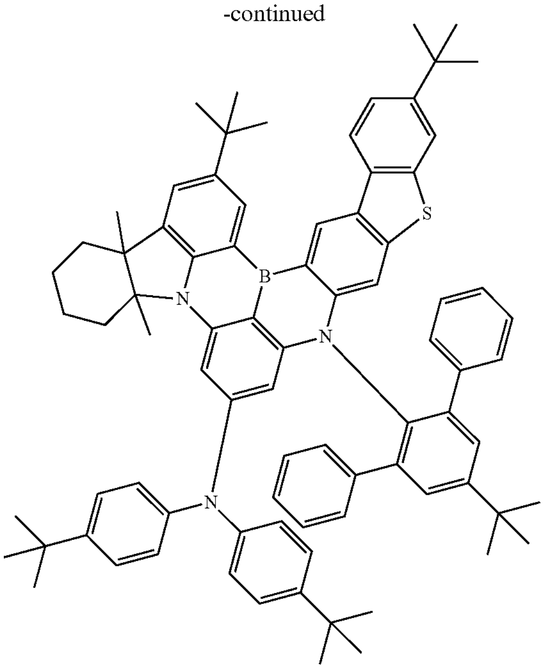
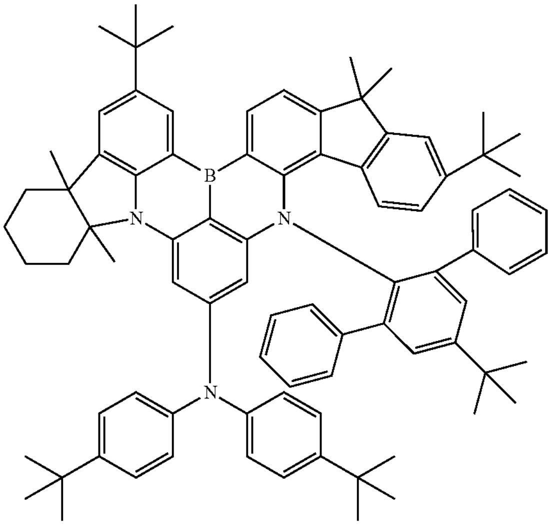
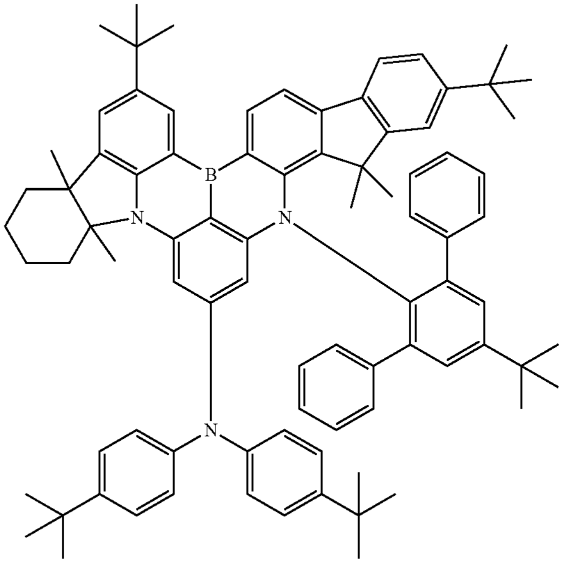

-continued
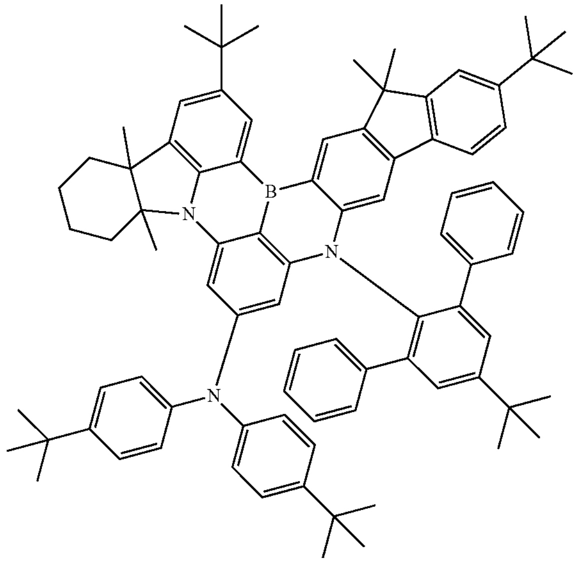
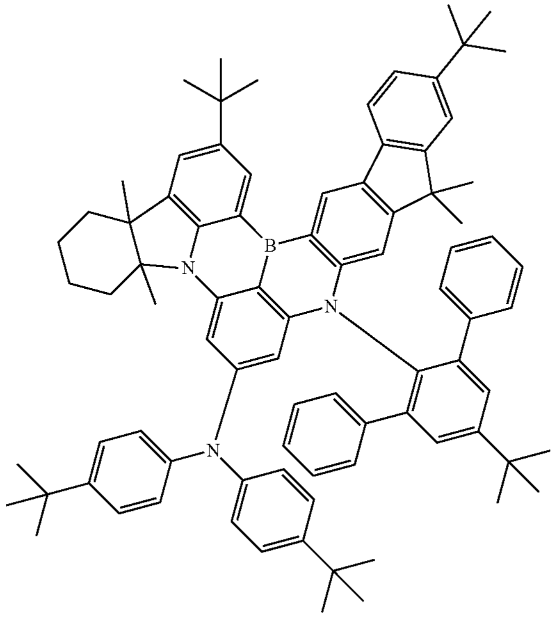
-continued
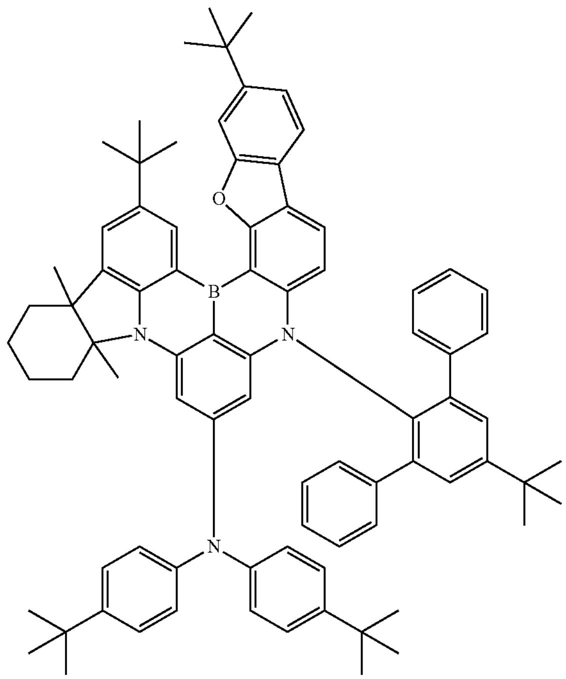
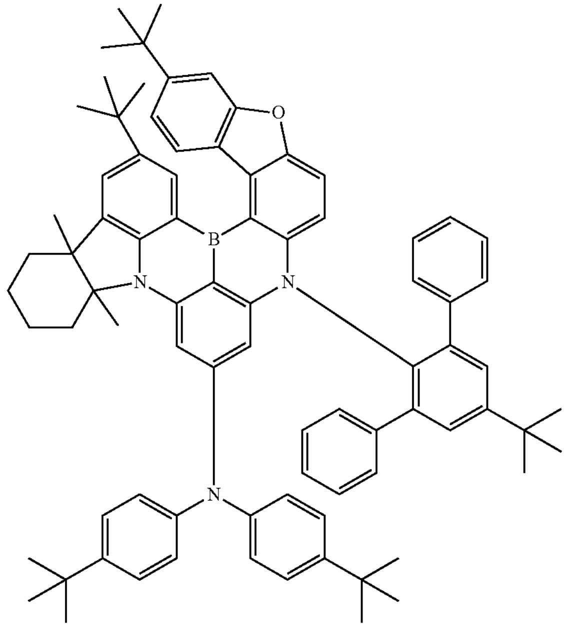

-continued
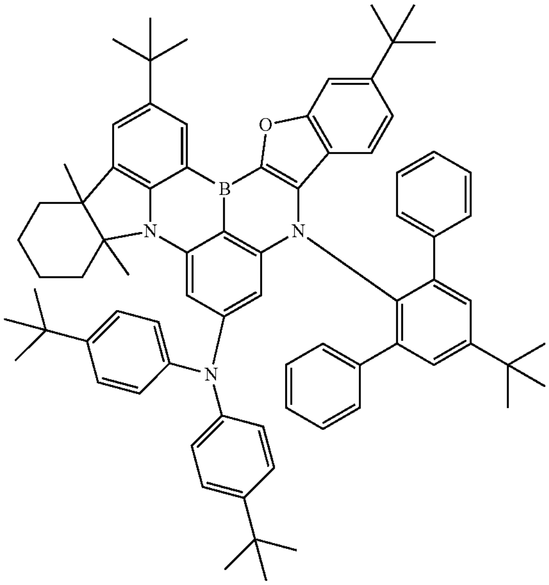
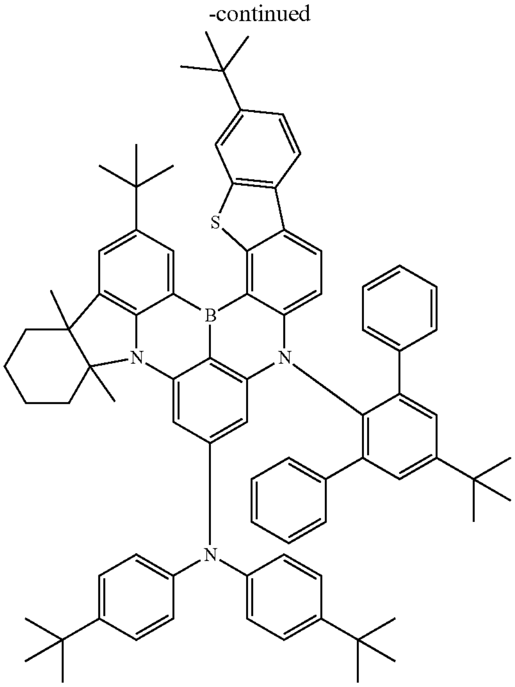
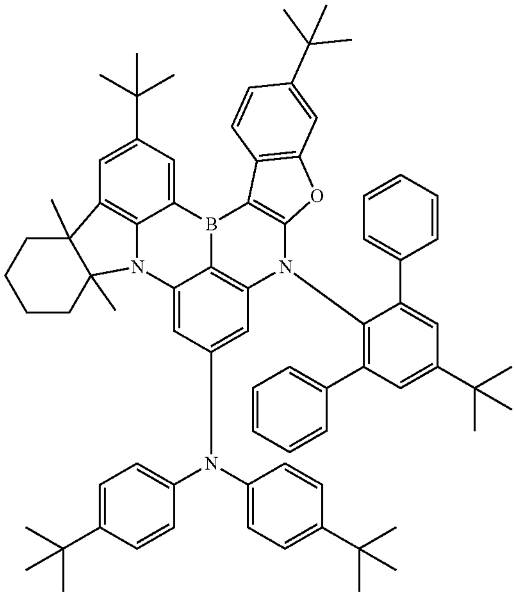
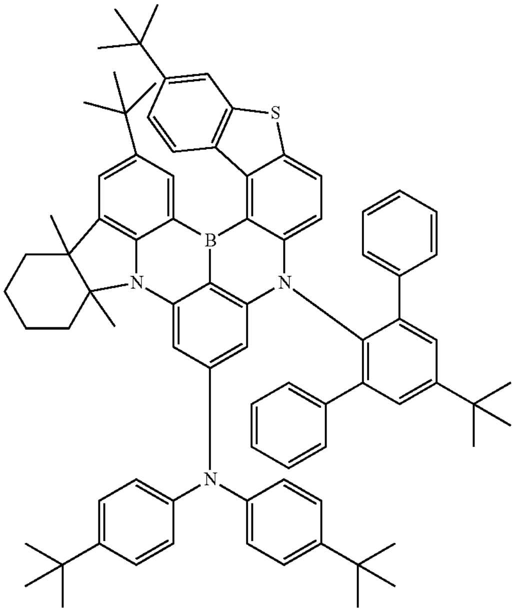

-continued
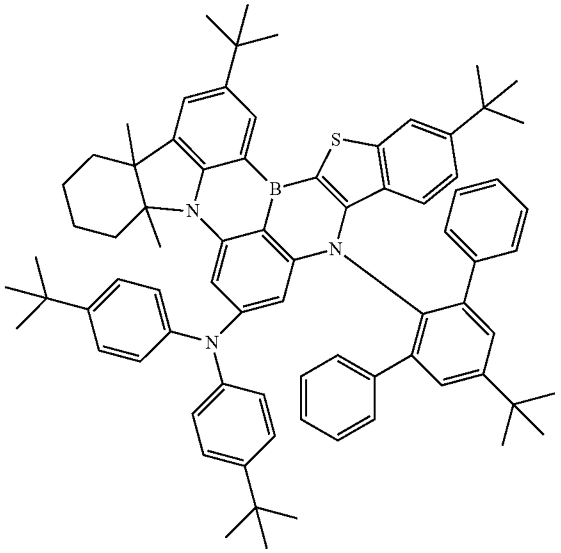
-continued
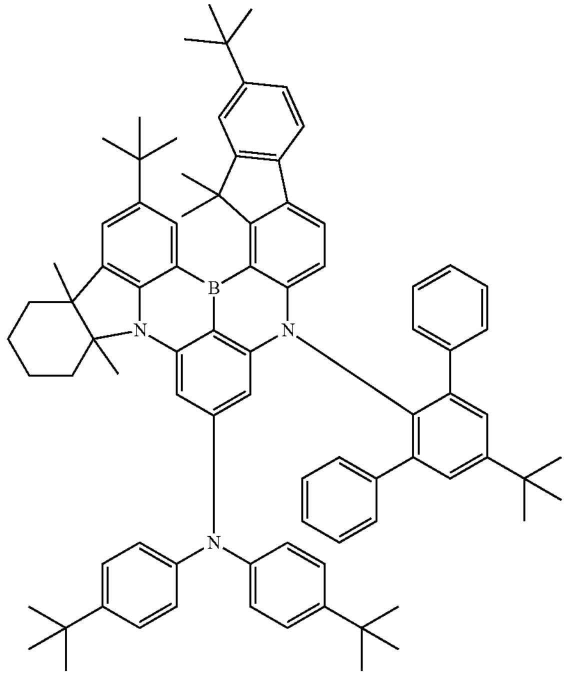
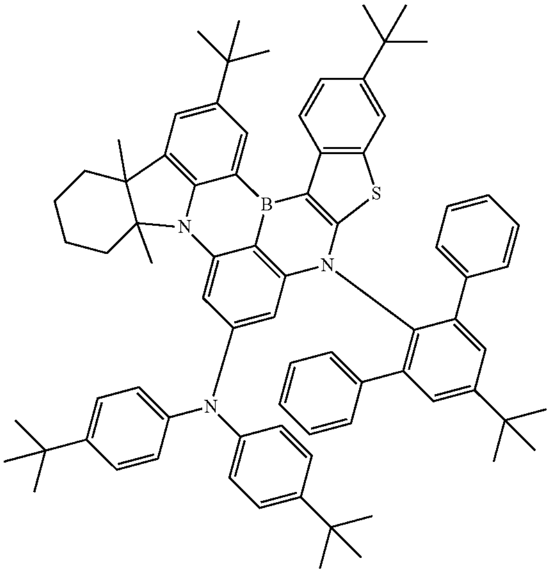
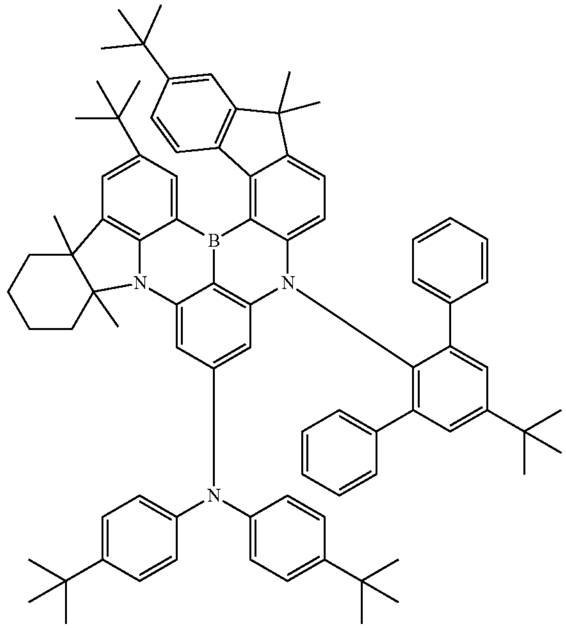

-continued
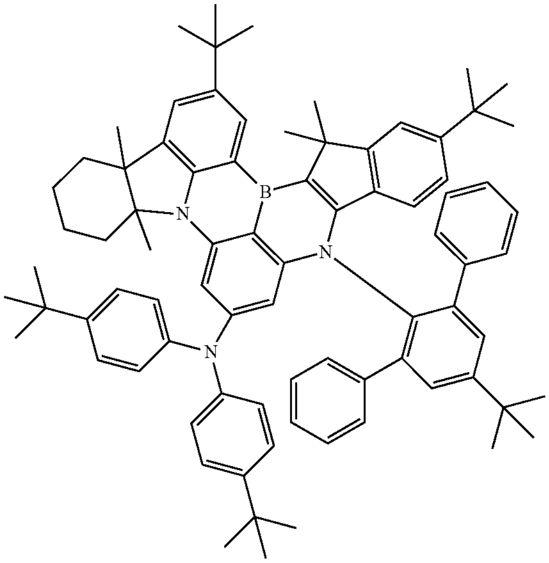
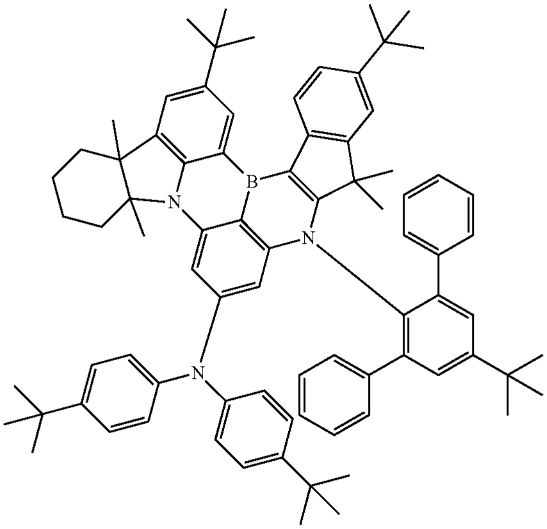
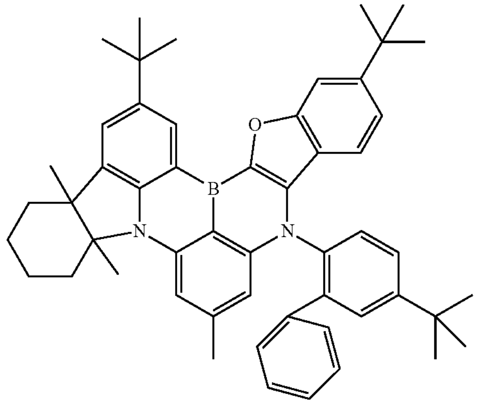
-continued
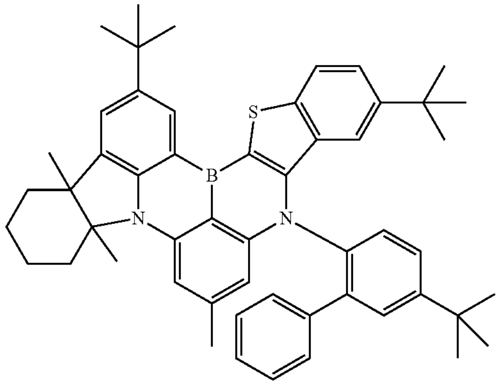
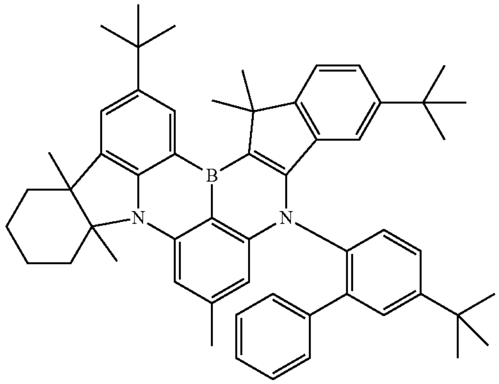
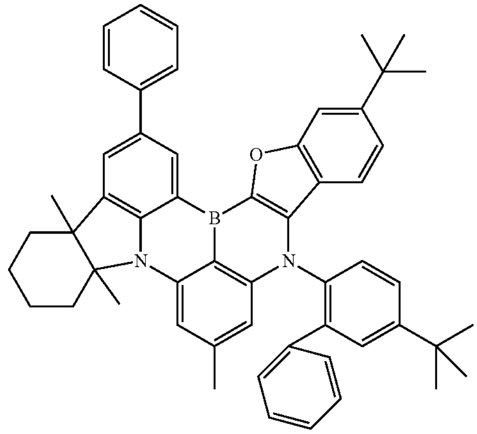
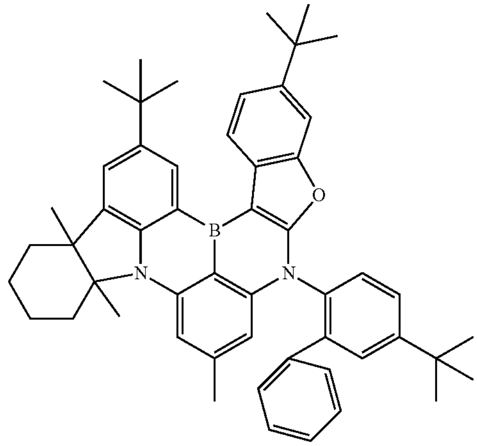

-continued
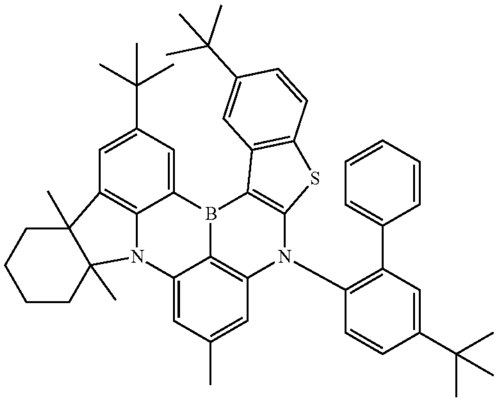
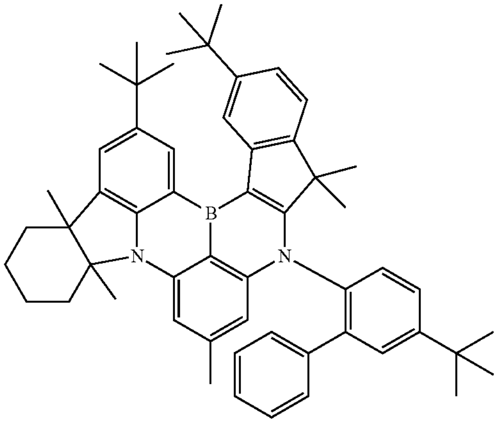
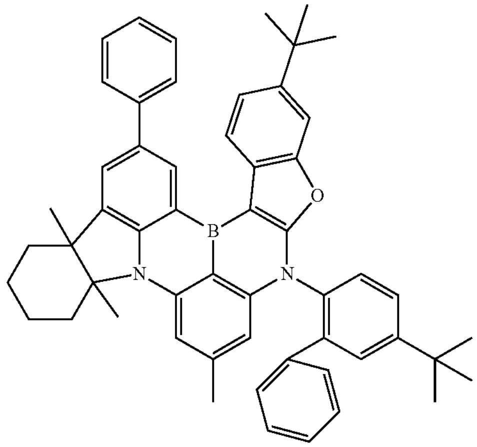
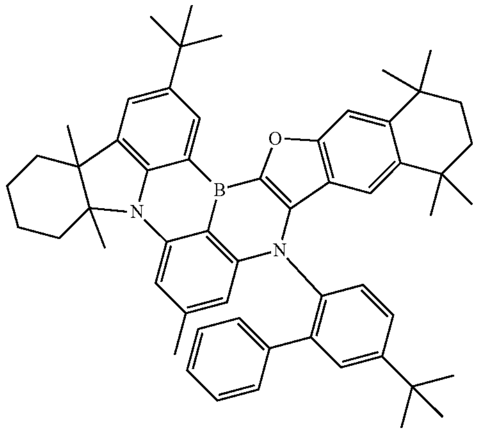
-continued
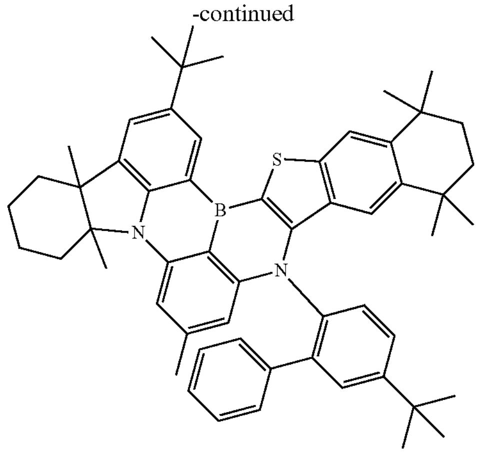
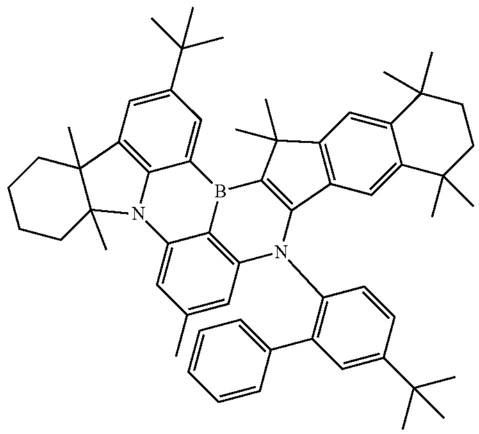
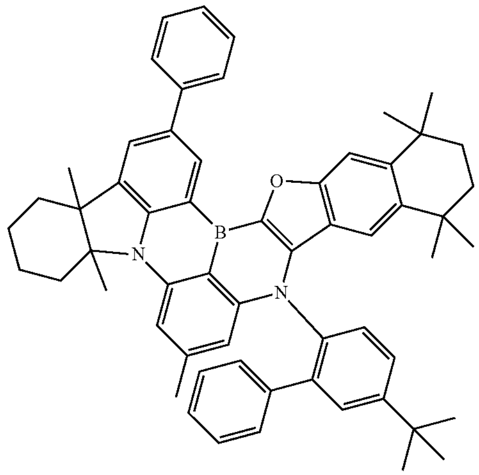

-continued
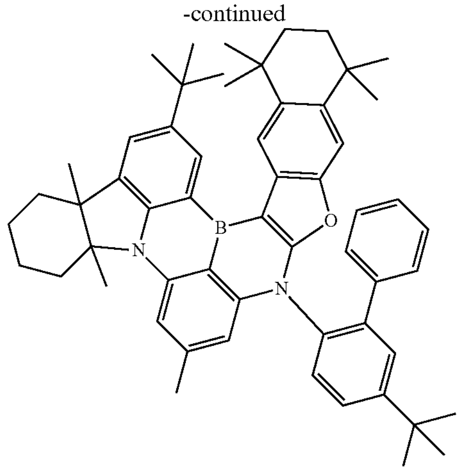
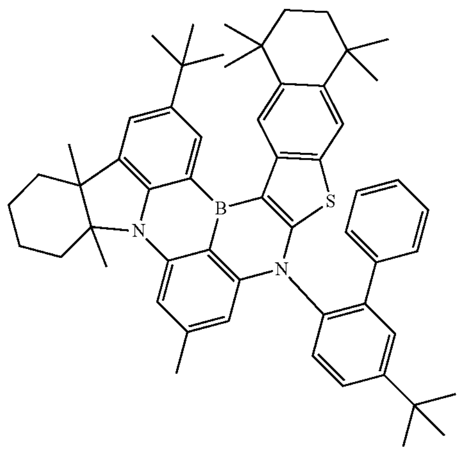
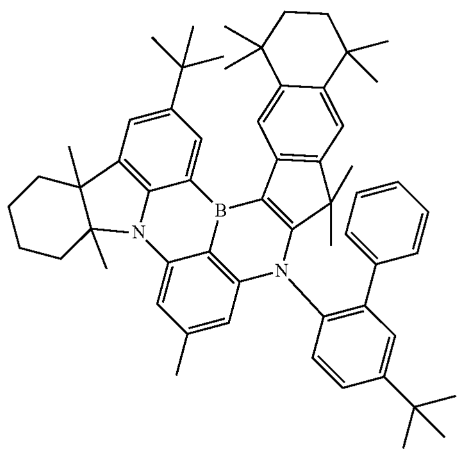
-continued
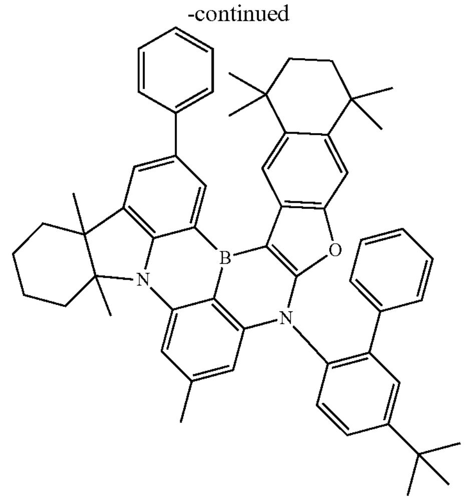
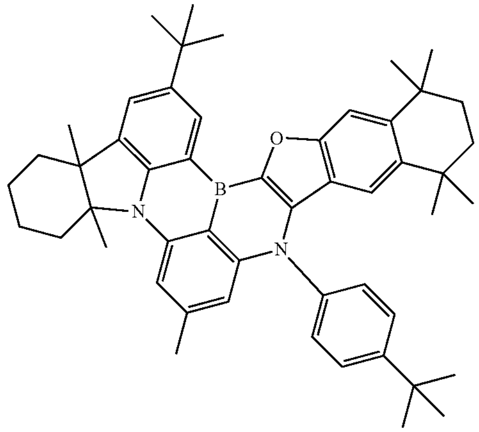
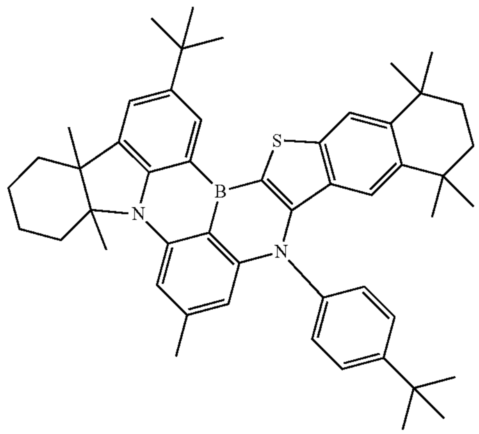

-continued
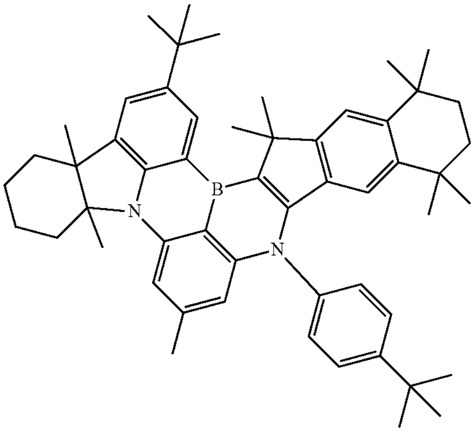
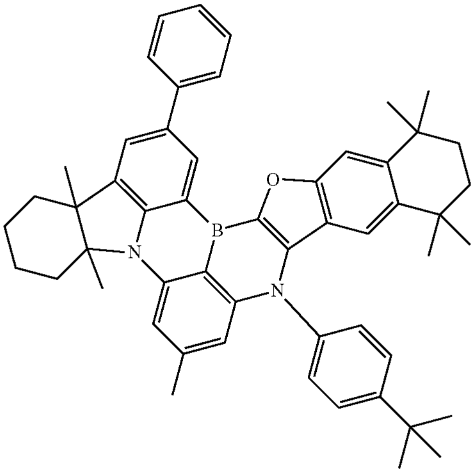
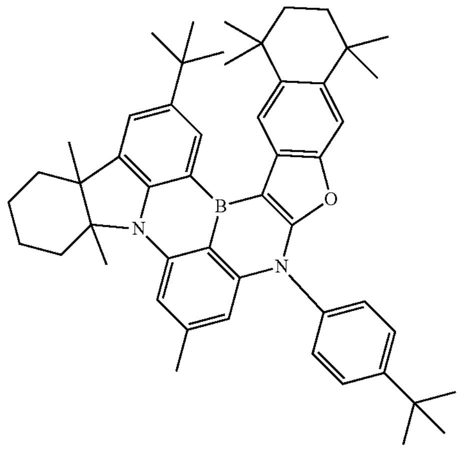
-continued
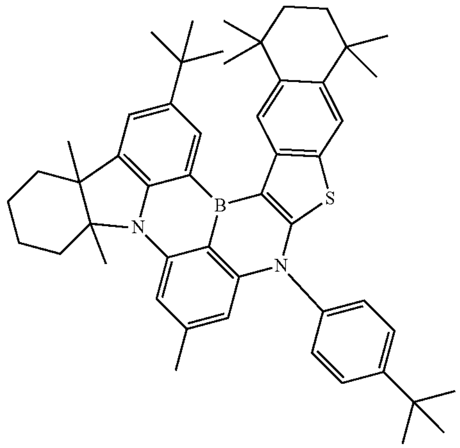
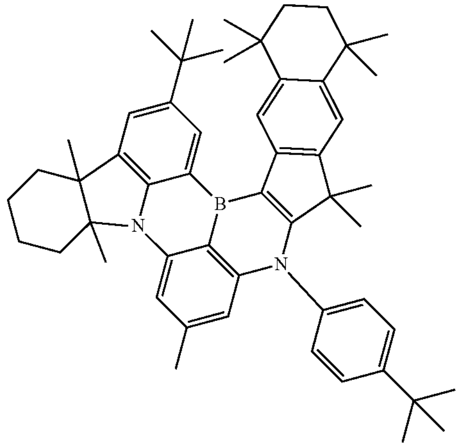
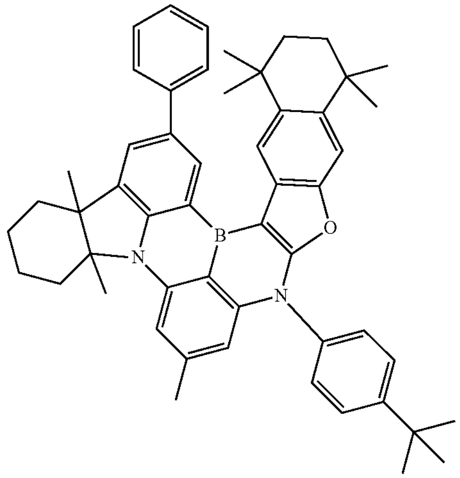

-continued
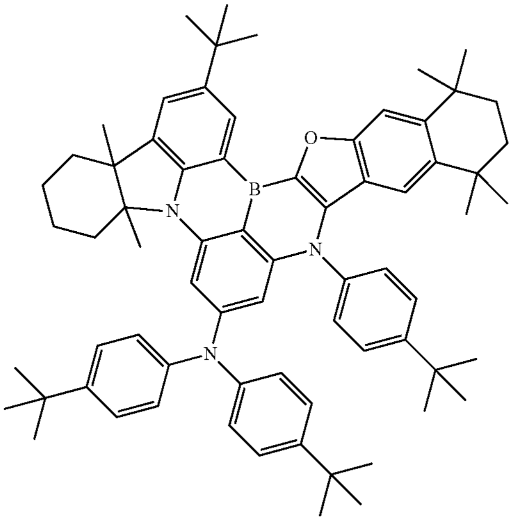
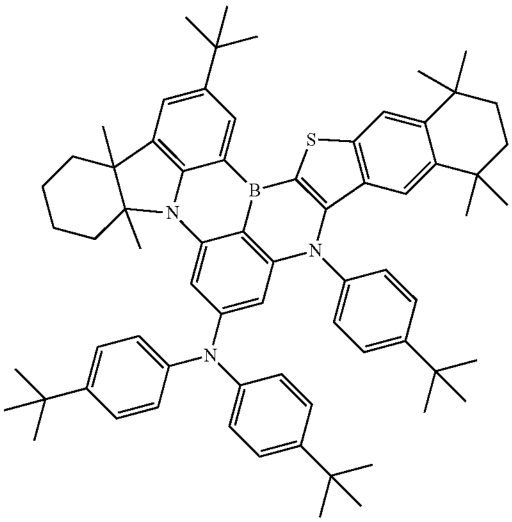
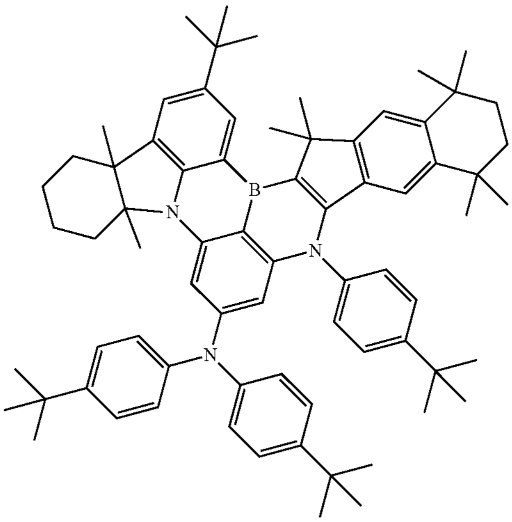
-continued
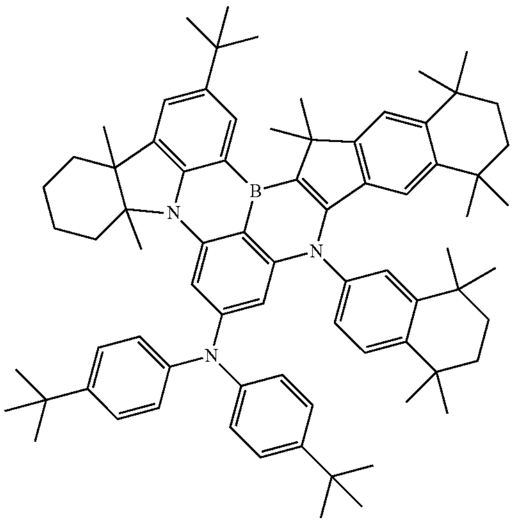
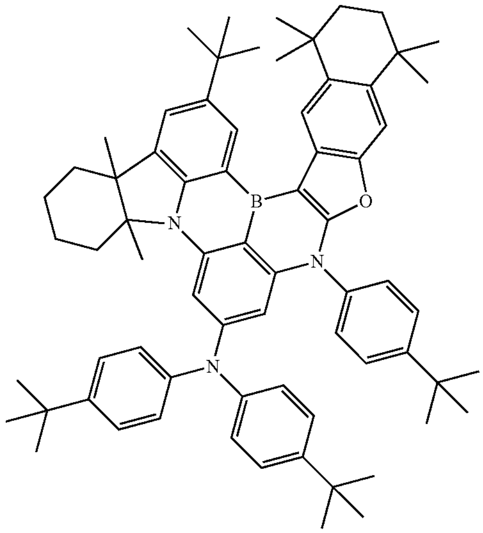
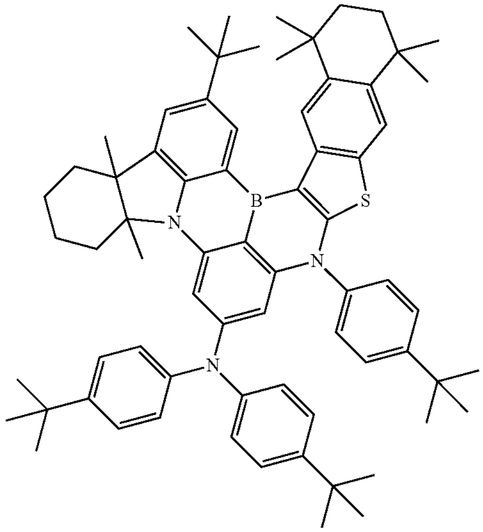

-continued
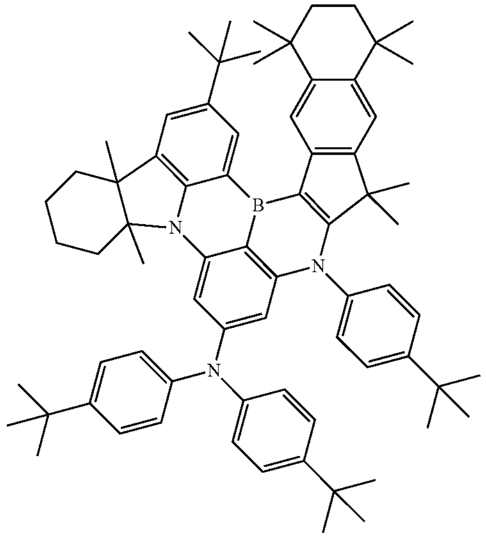
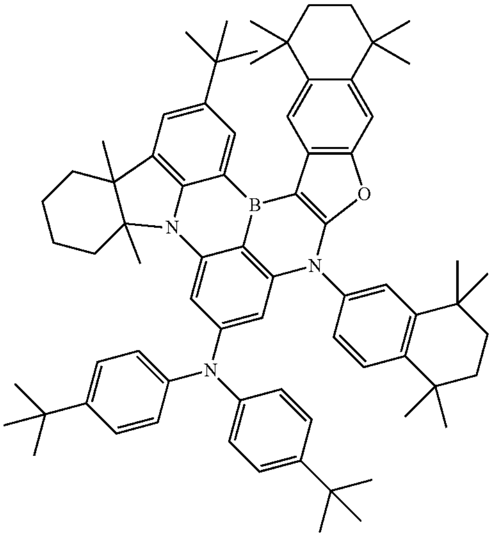
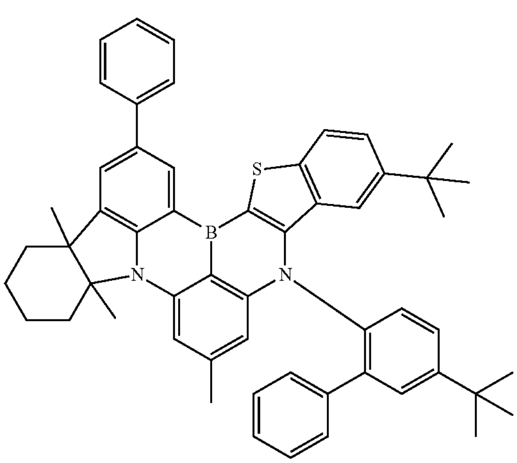
-continued
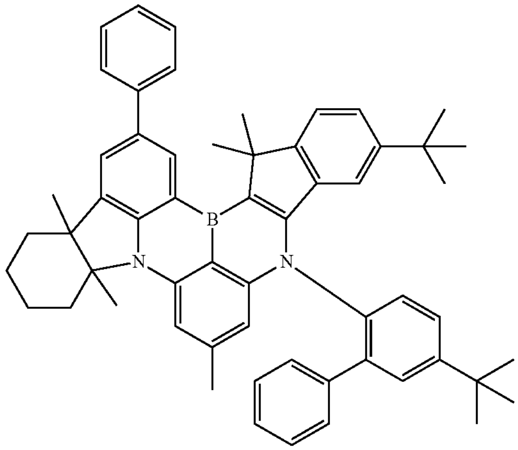
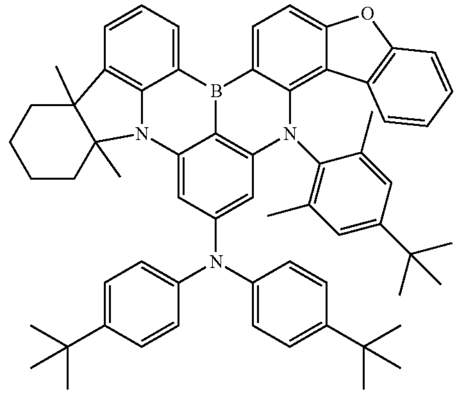
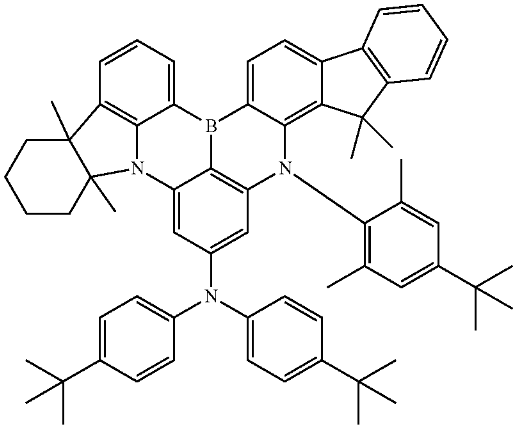
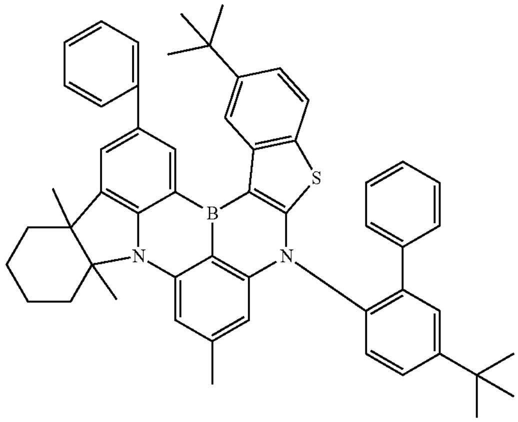

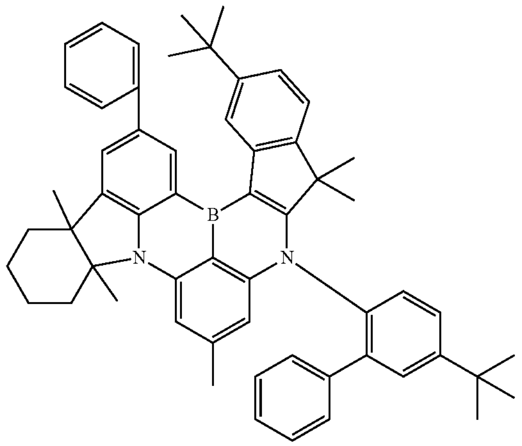
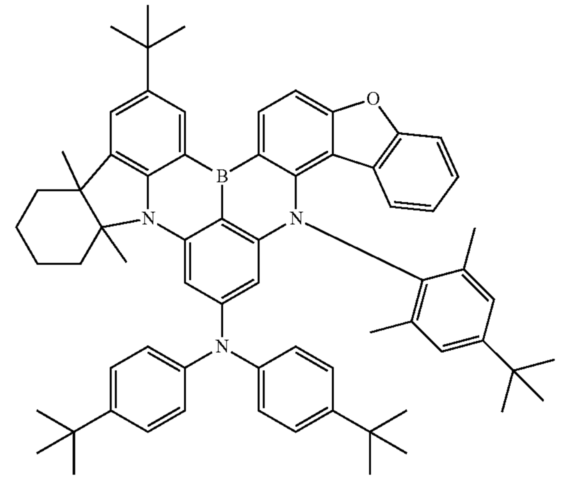
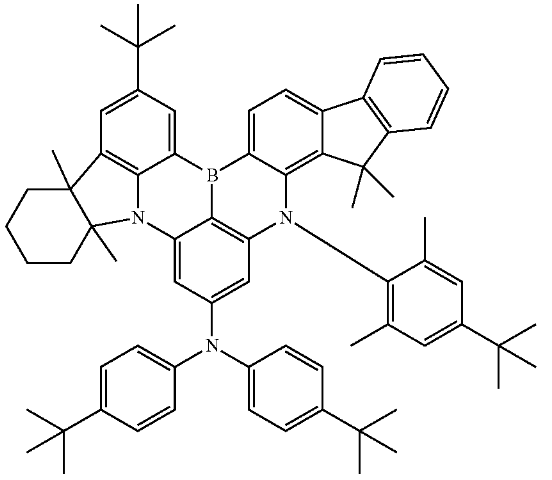
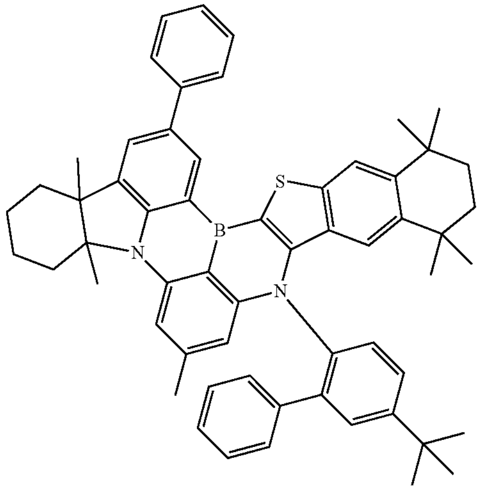
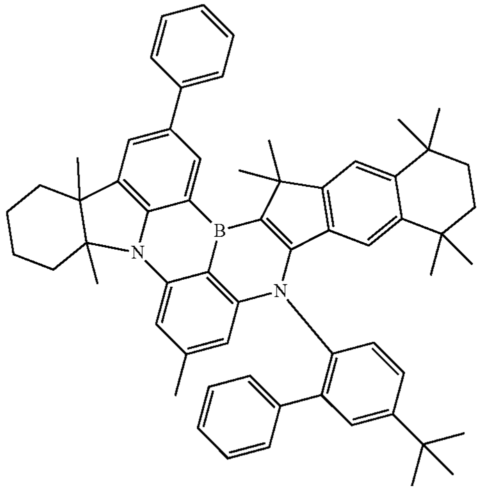
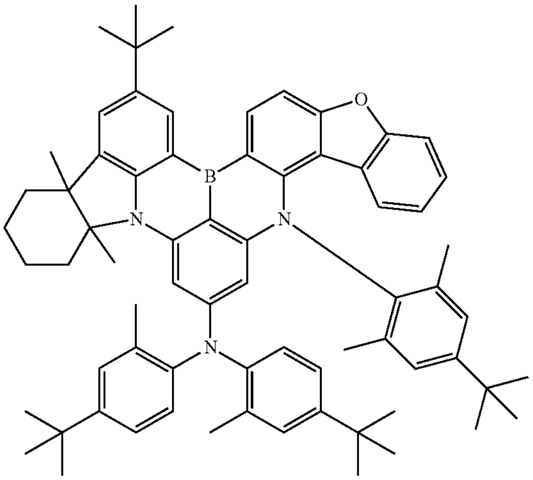

-continued
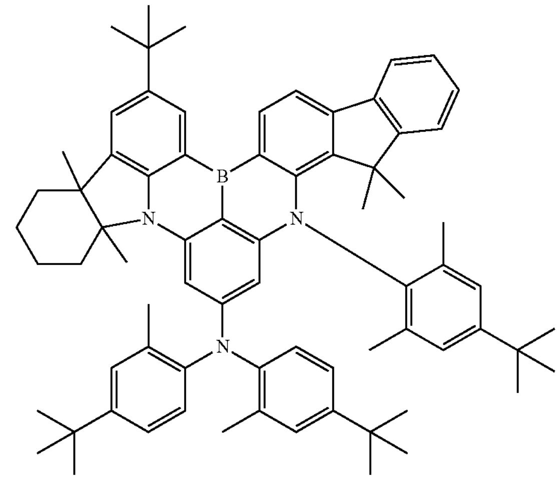
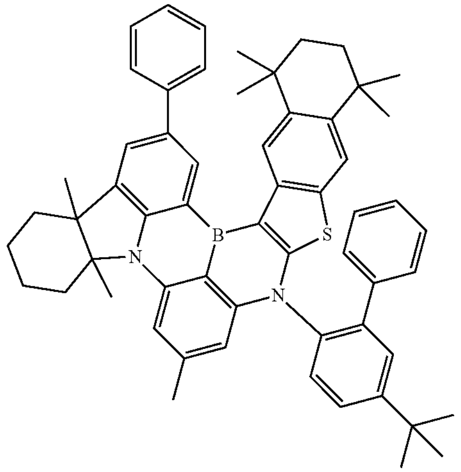
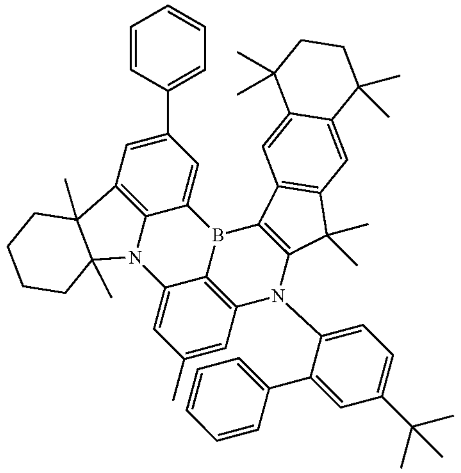
-continued
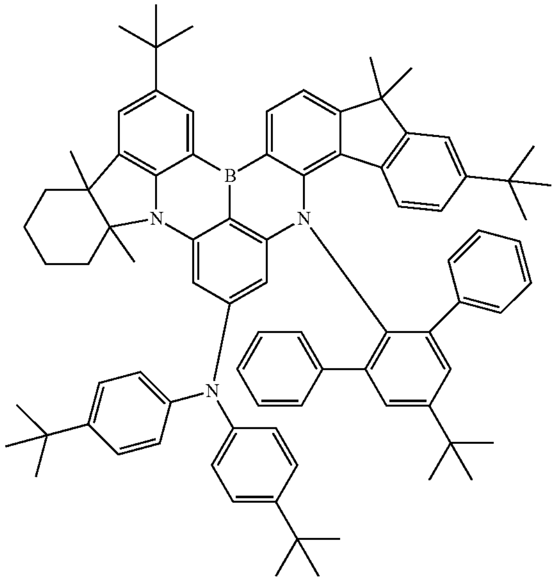
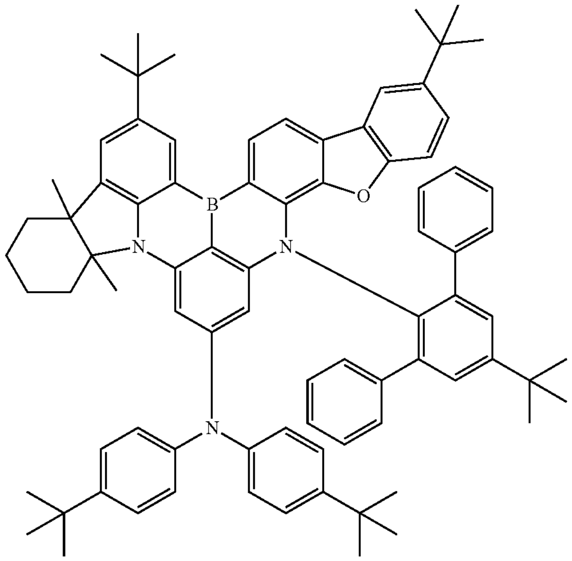
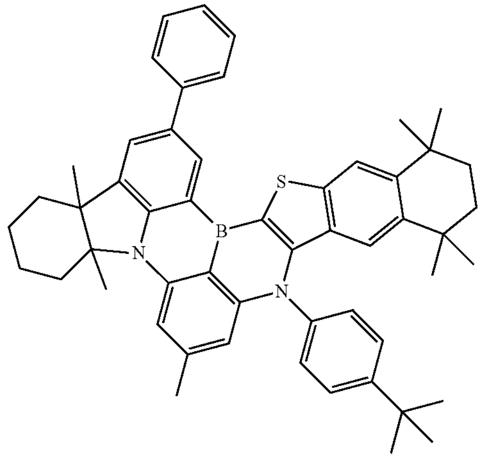

-continued
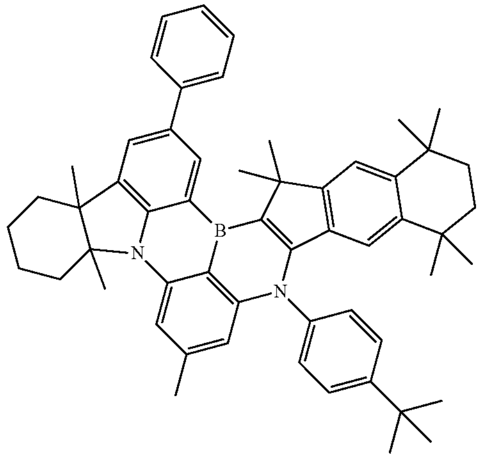
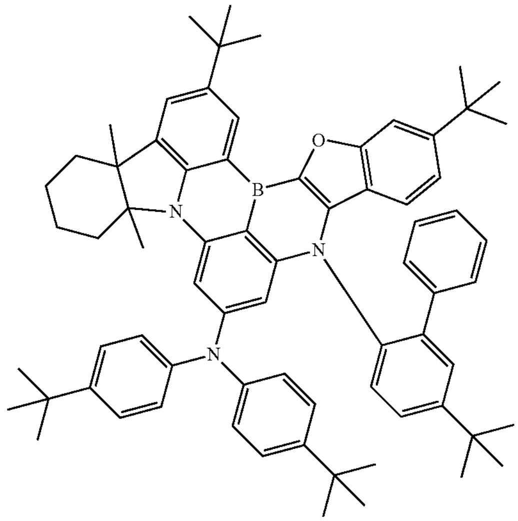
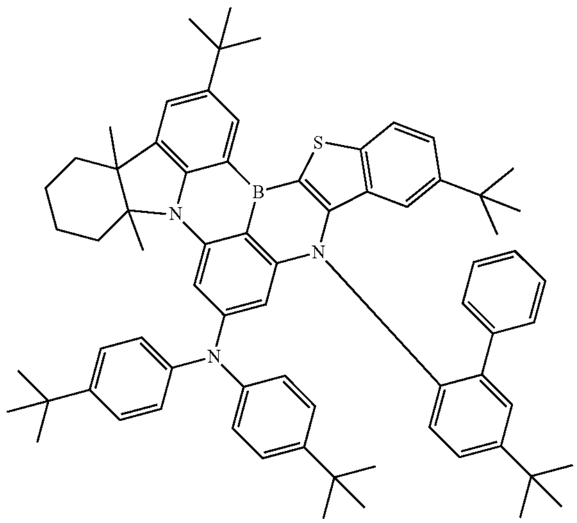
-continued
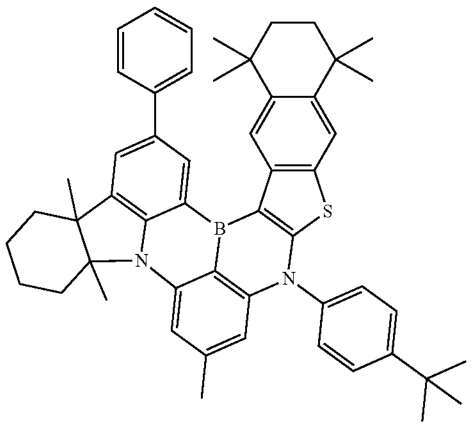
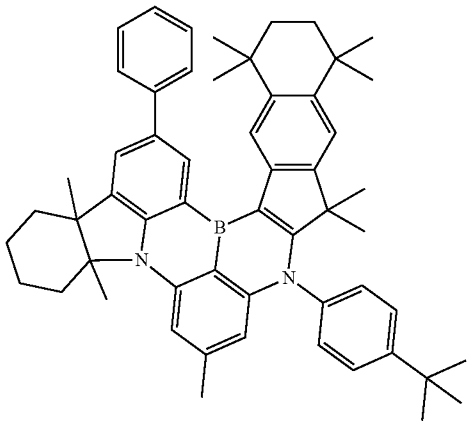
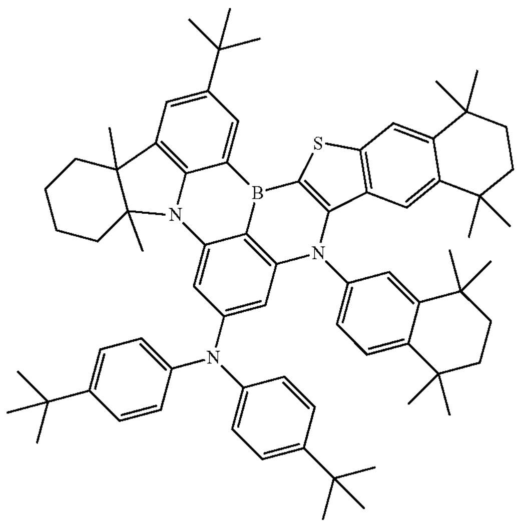

-continued
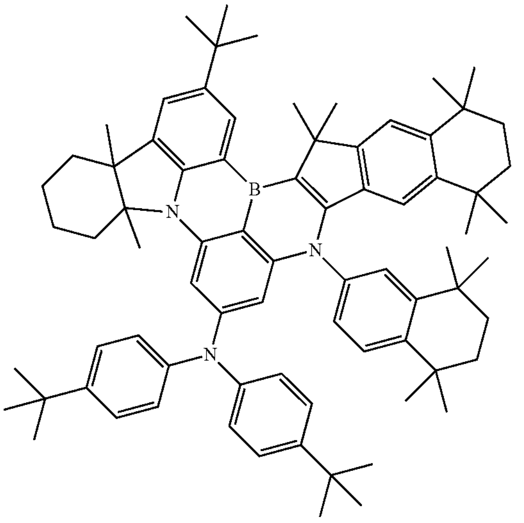
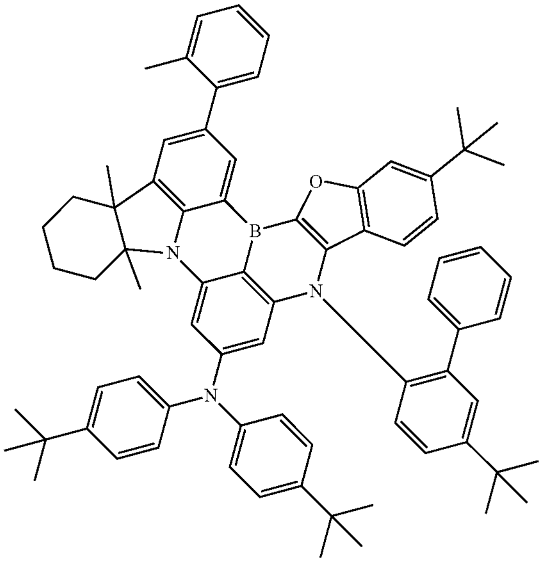
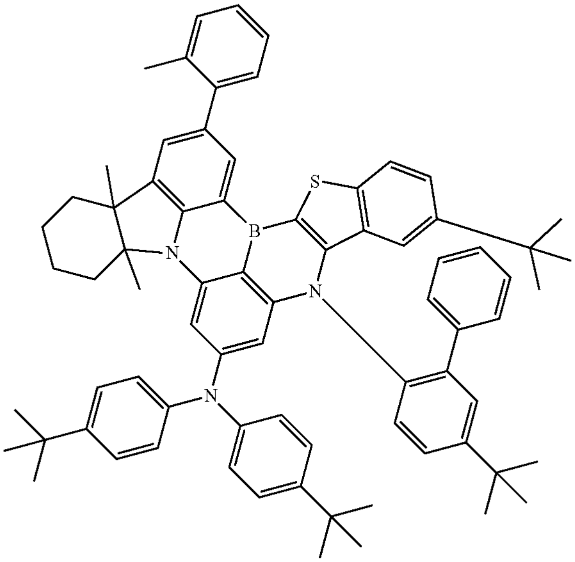
-continued
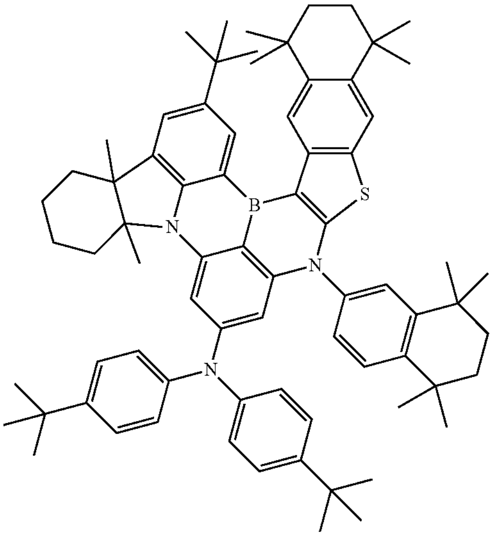
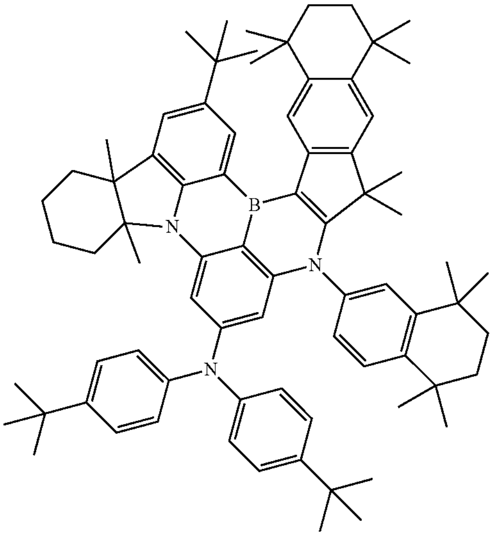
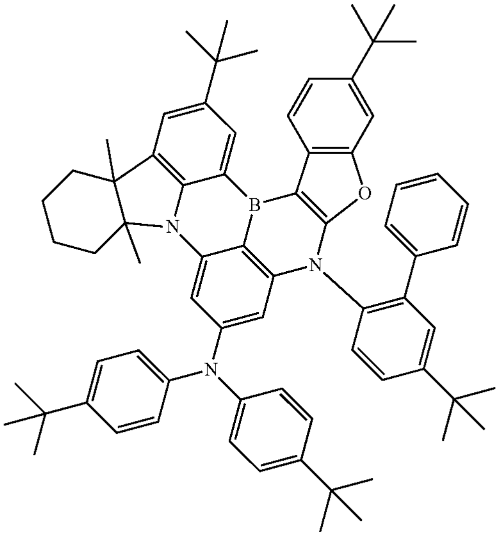

-continued
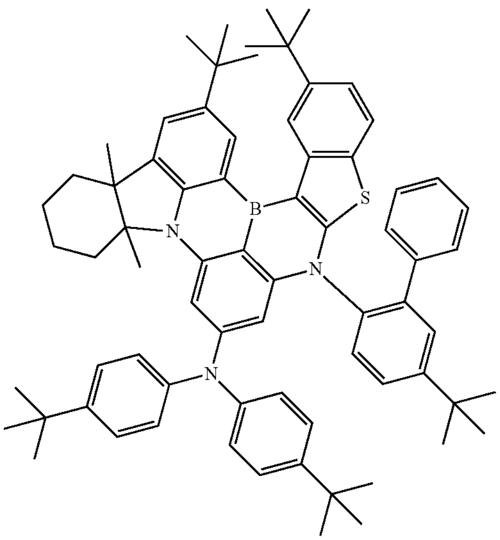
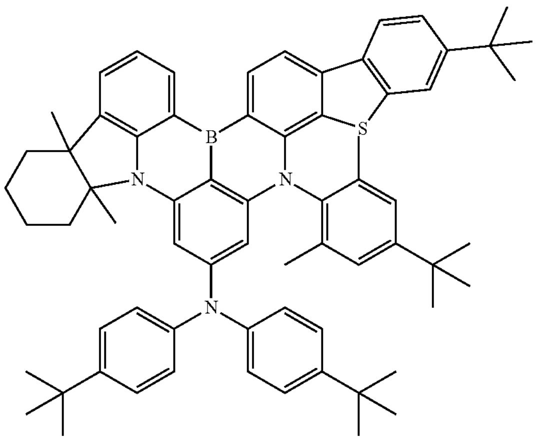
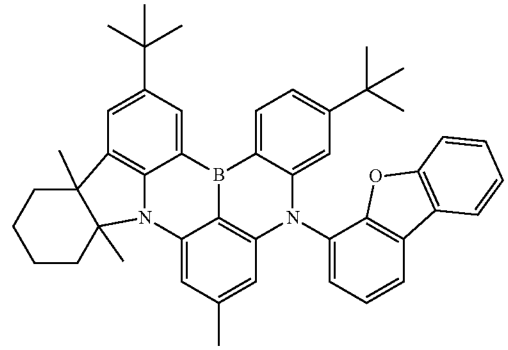
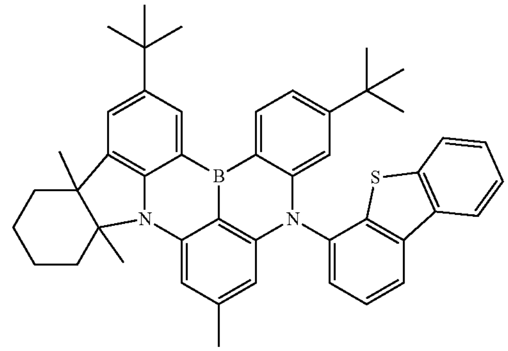
-continued
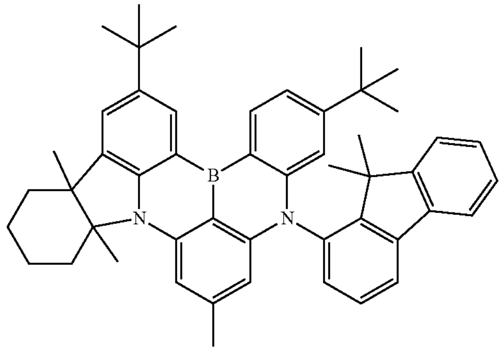
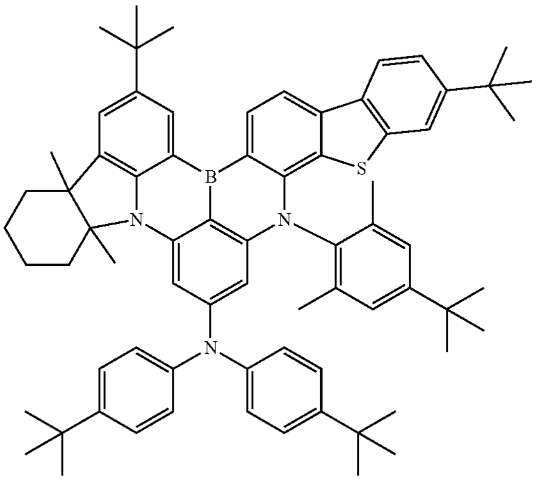
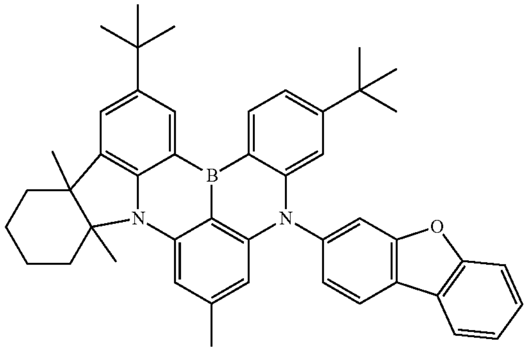
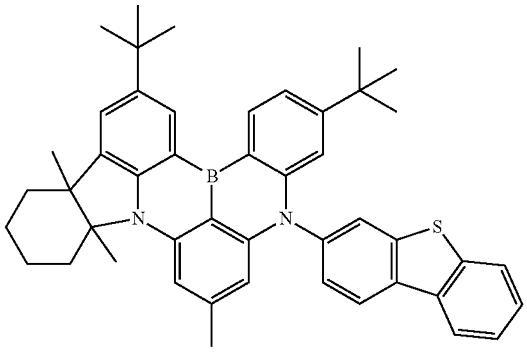

-continued
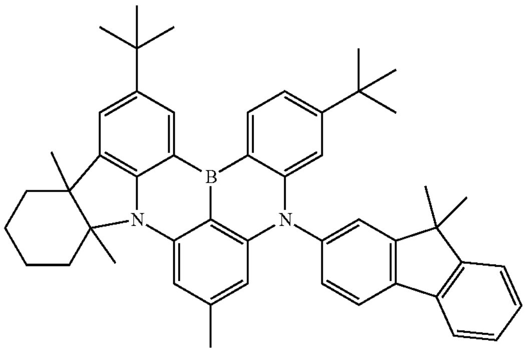
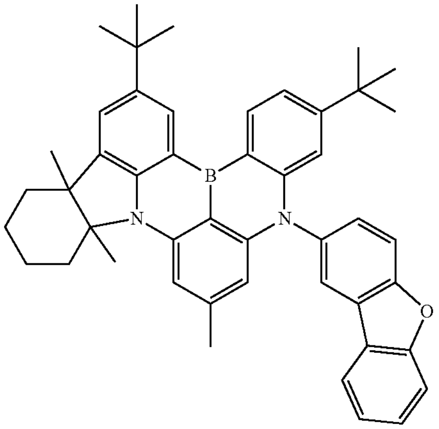
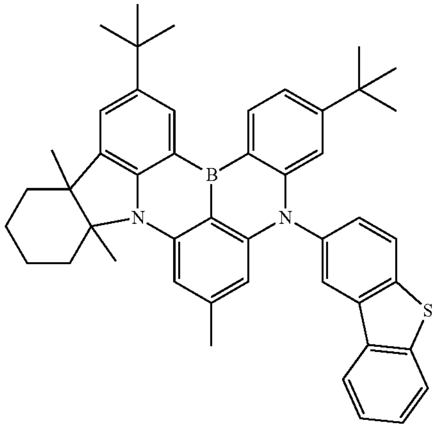
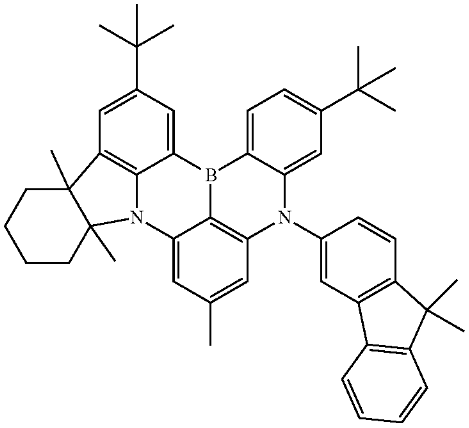
-continued
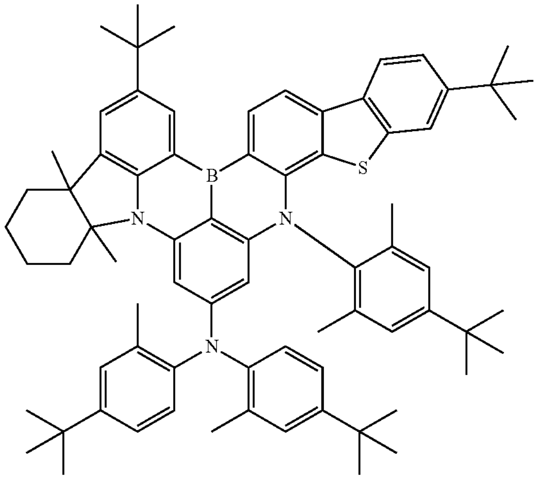
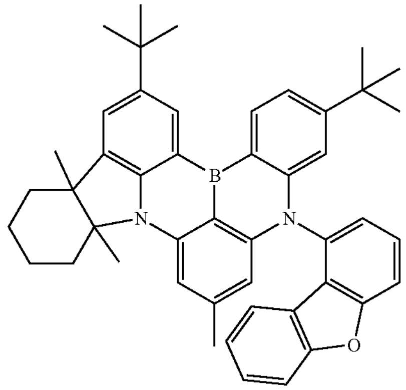
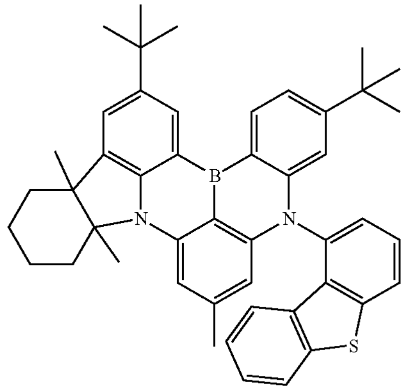
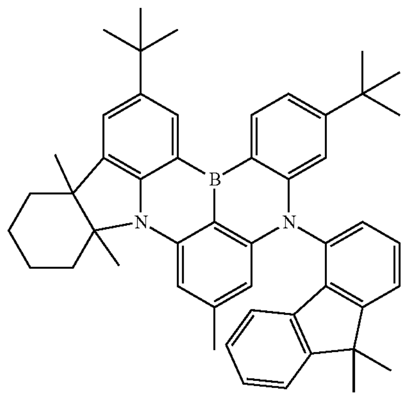

-continued
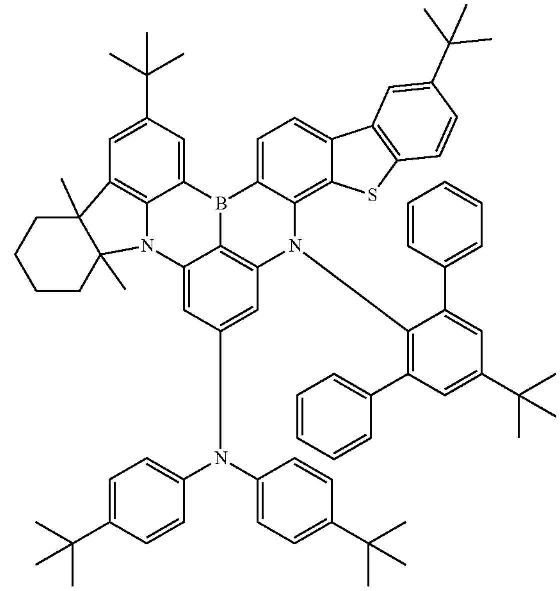
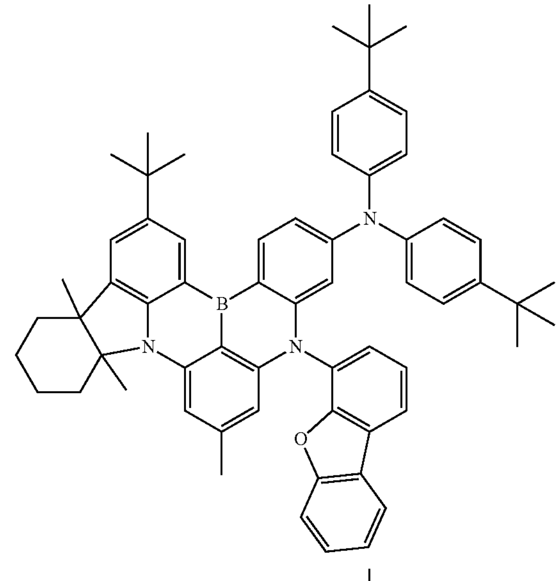
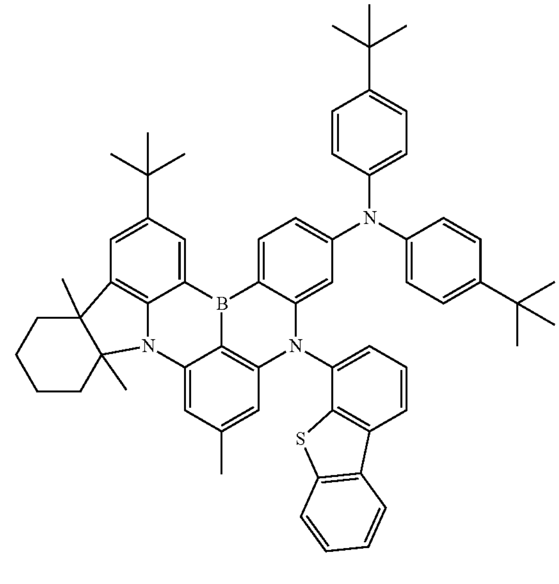
-continued
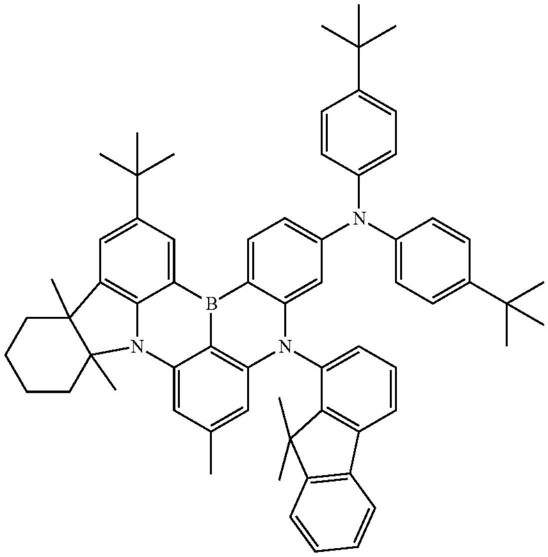
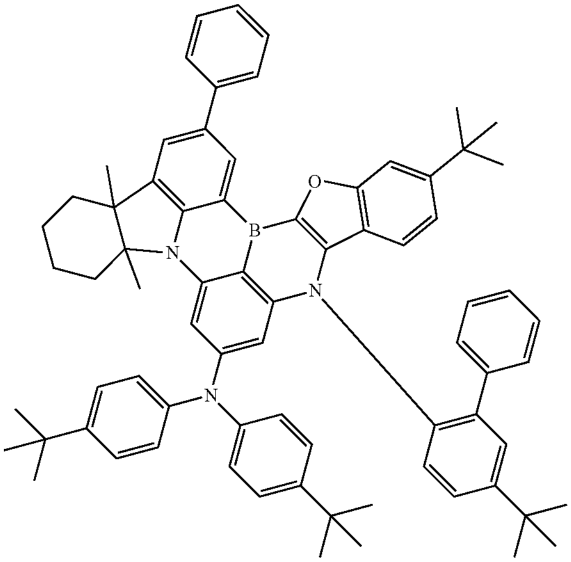
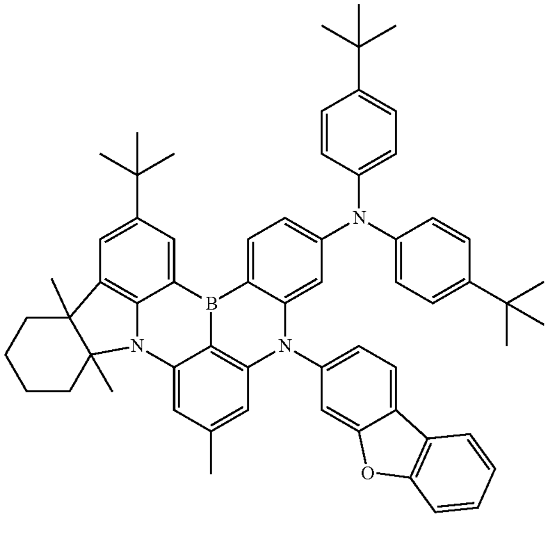

-continued
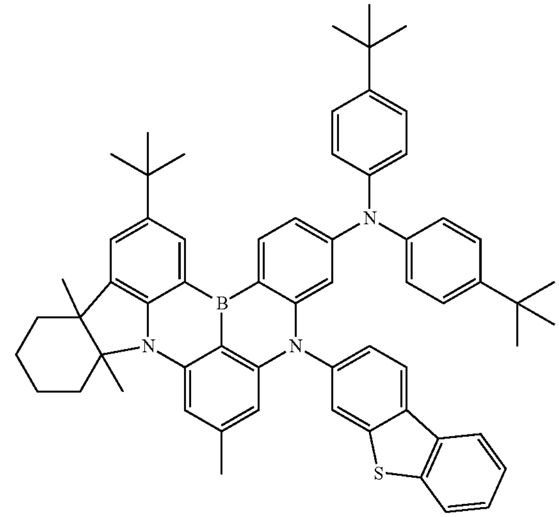
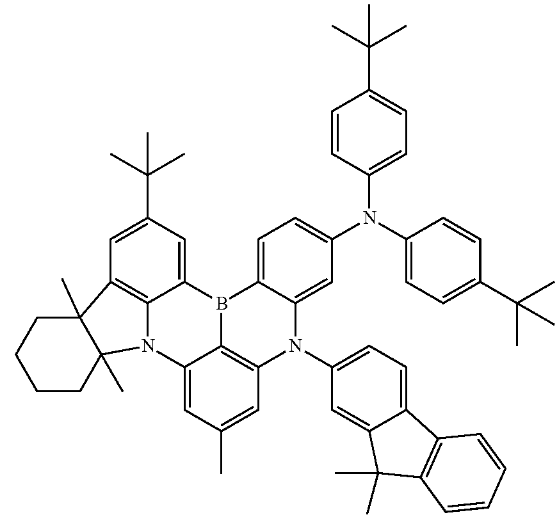
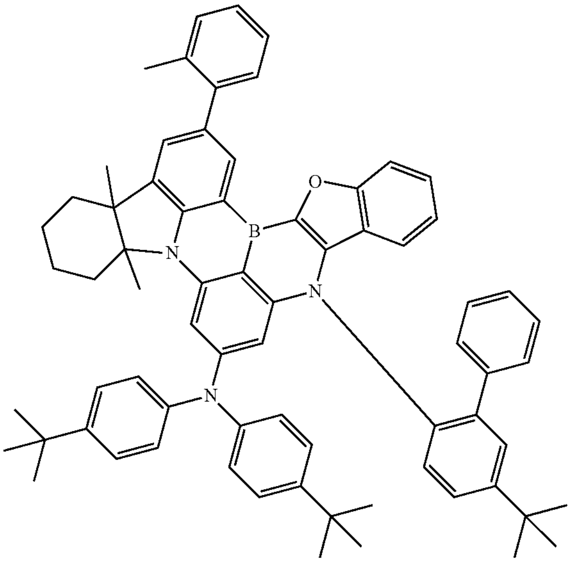
-continued
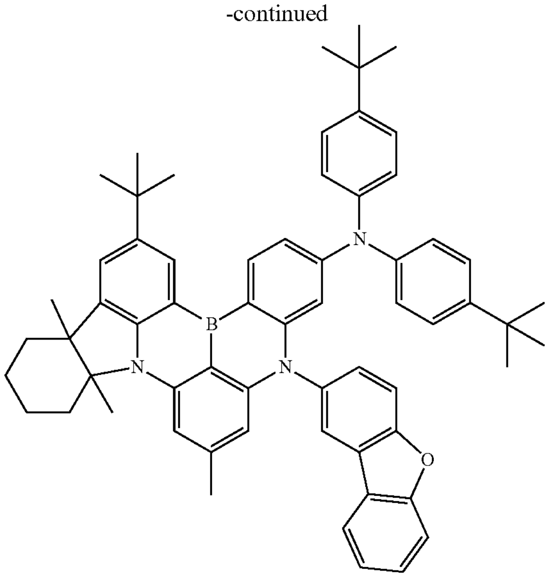
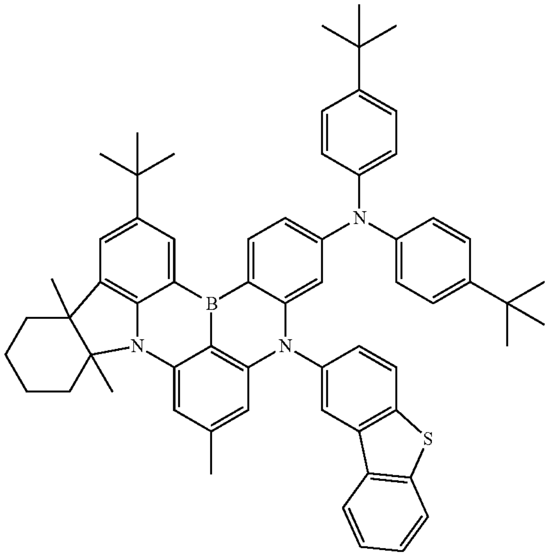
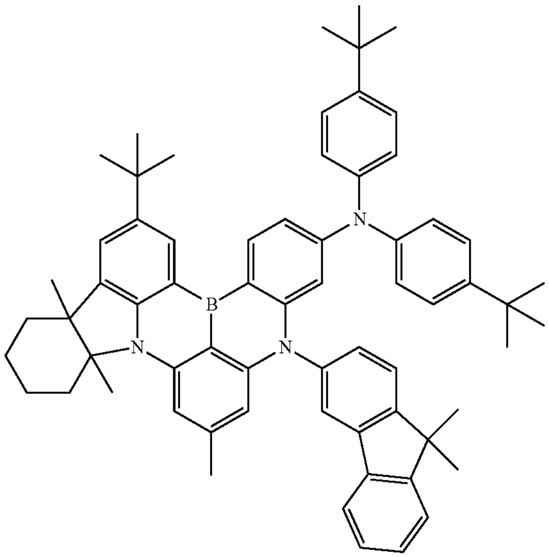

-continued
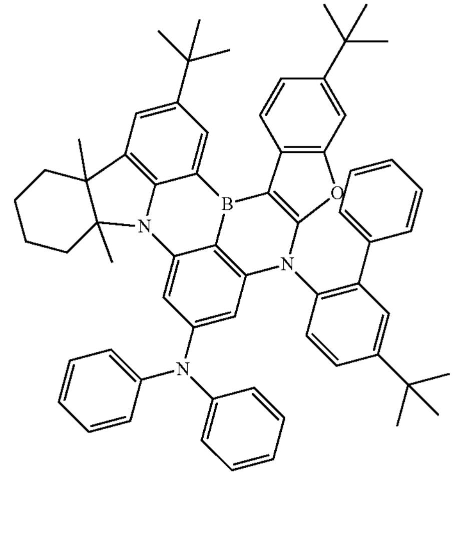
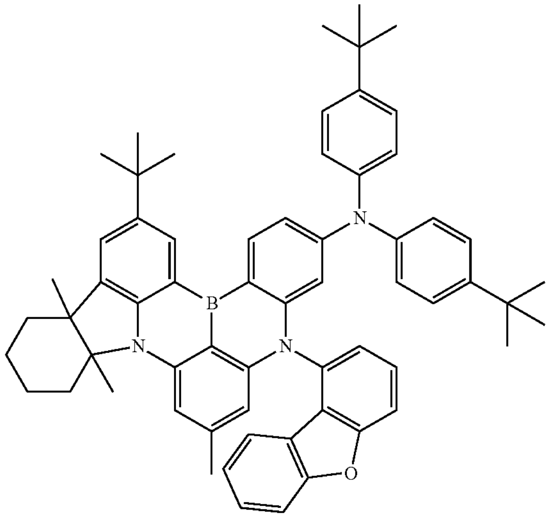
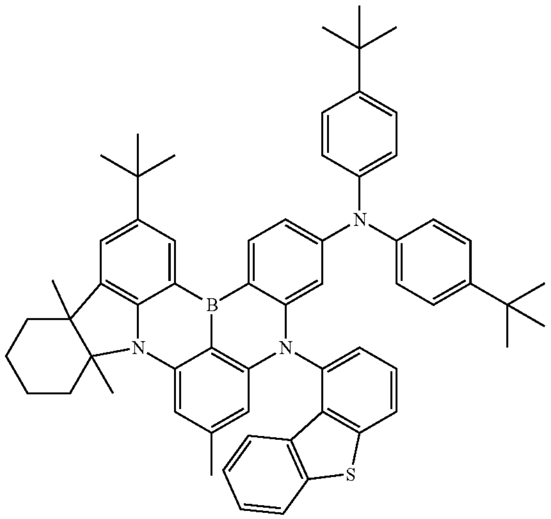
-continued
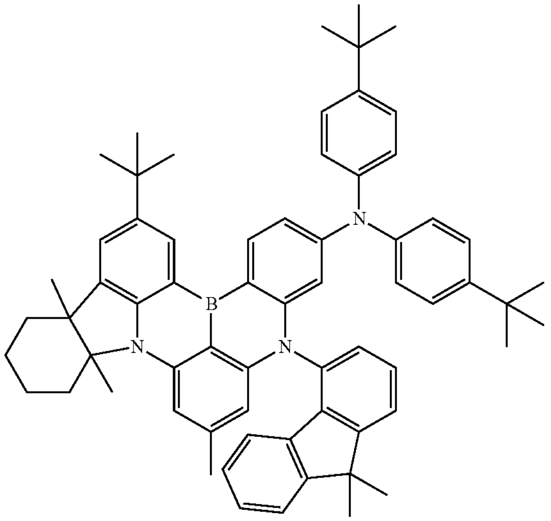 [SMILES: Cc1cc2c3c(c1)N1c4c(cc(C(C)(C)C)cc4C4(C)CCCCC14C)B3c1ccc(N(c3ccc(C(C)(C)C)cc3)c3ccc(C(C)(C)C)cc3)cc1N2c1cccc2c1-c1ccccc1C2(C)C]
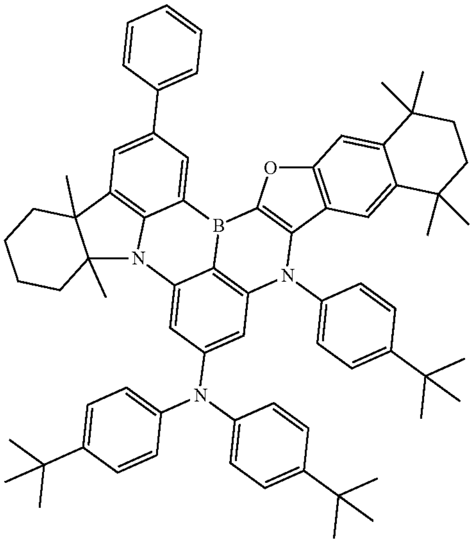
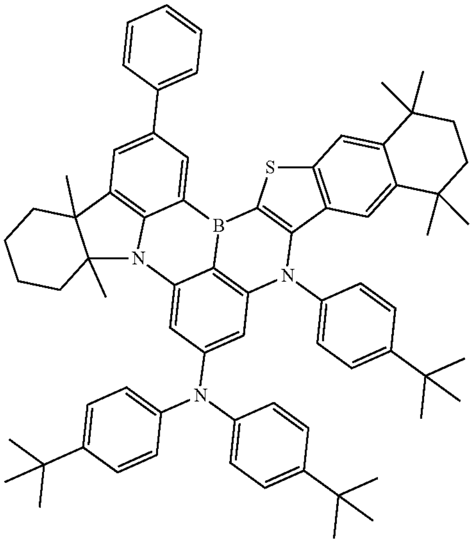

-continued
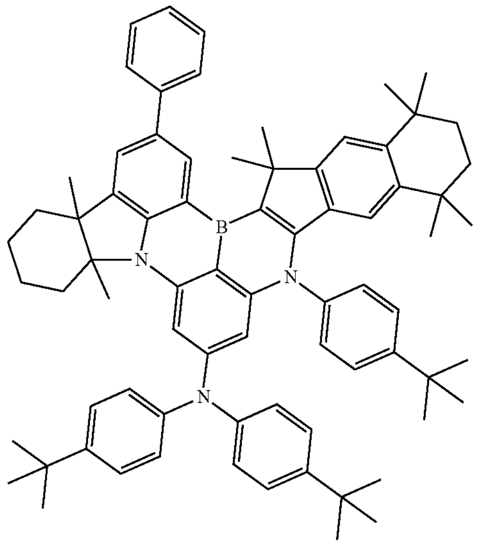
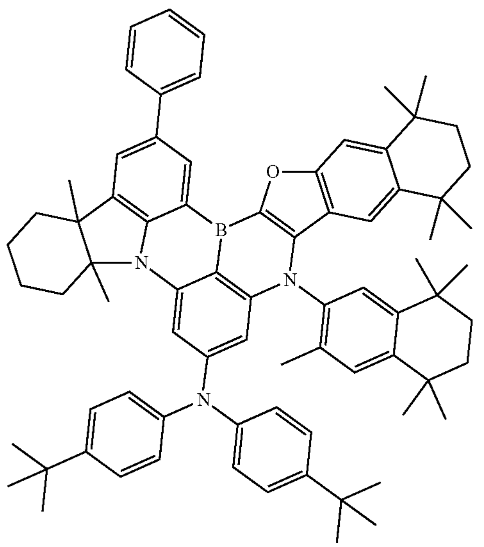
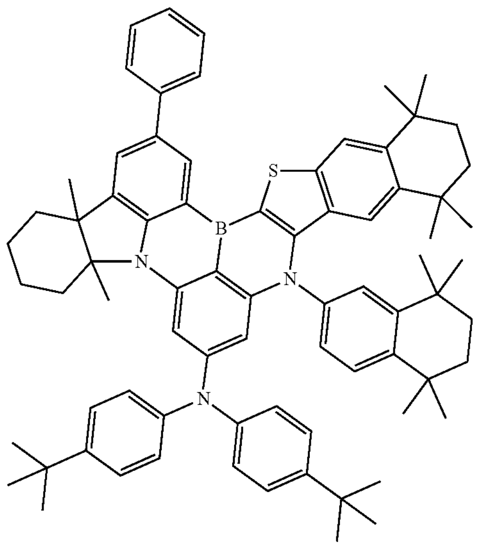
-continued
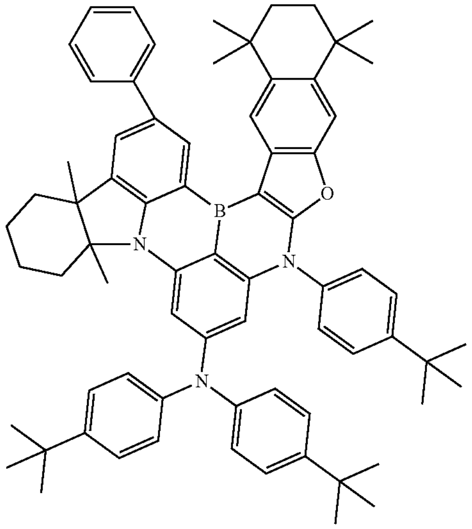
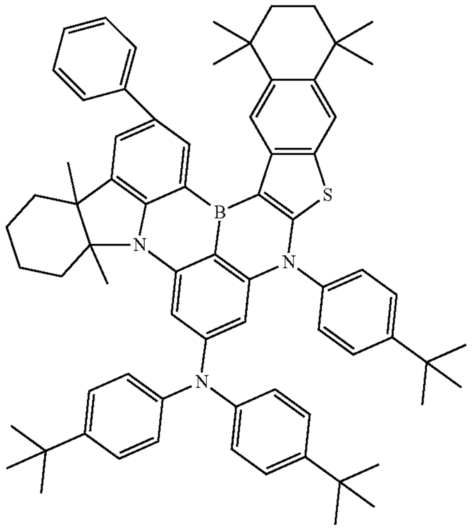
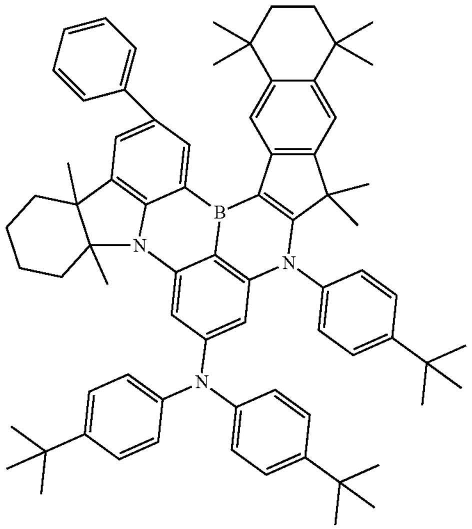

-continued
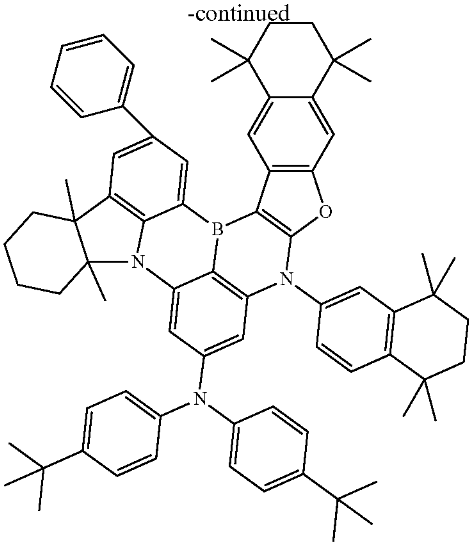
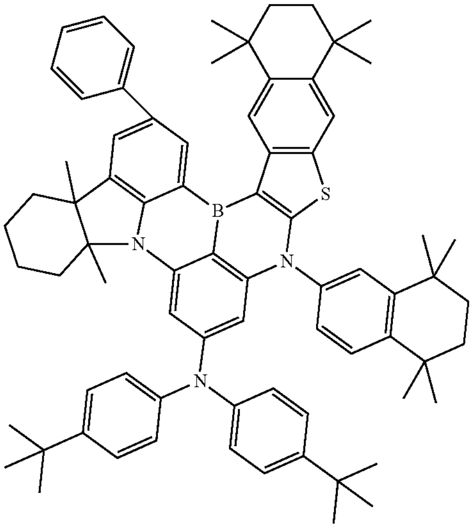
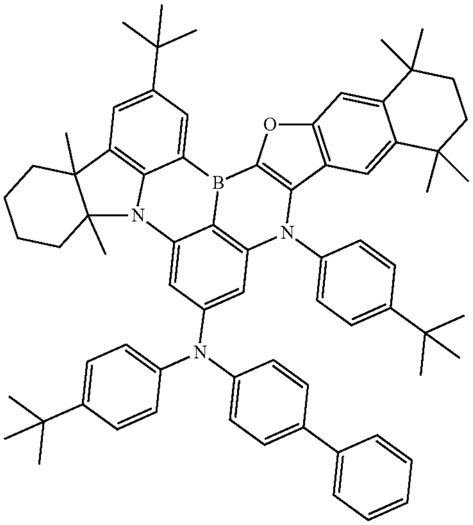
-continued
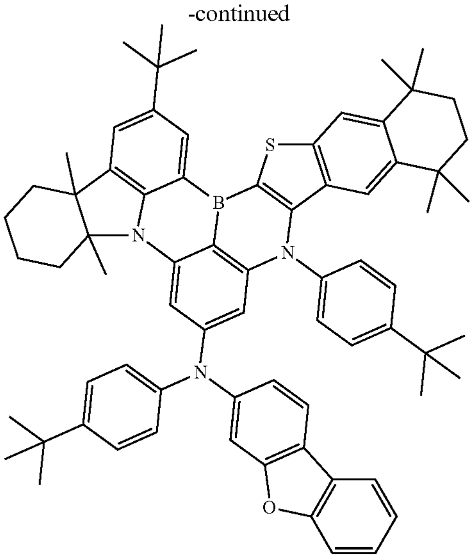
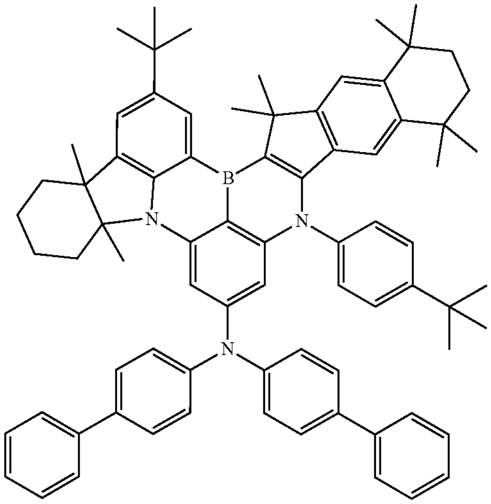
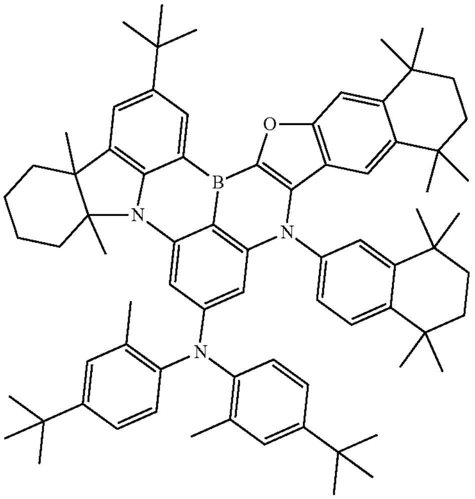

-continued
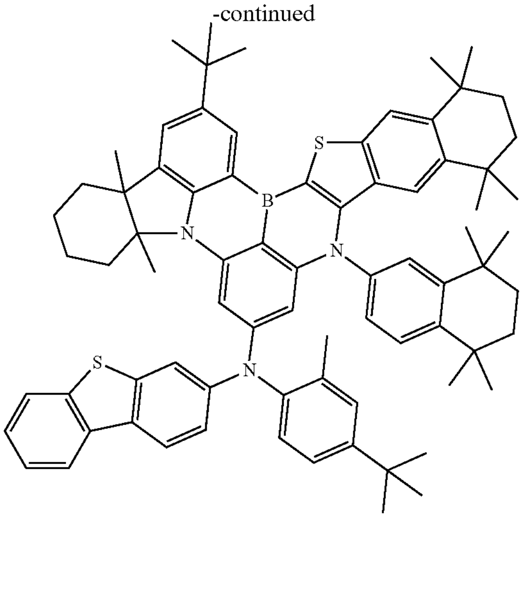
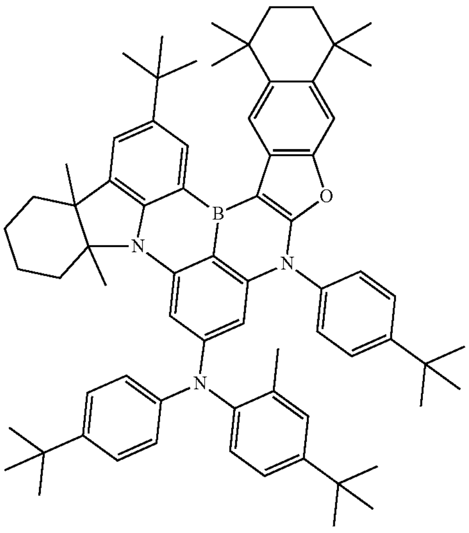
-continued
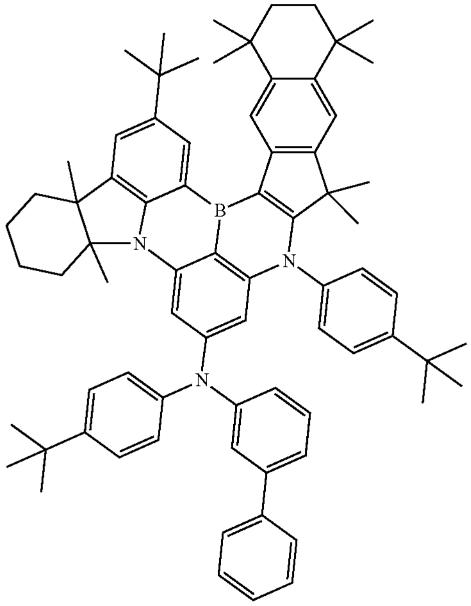
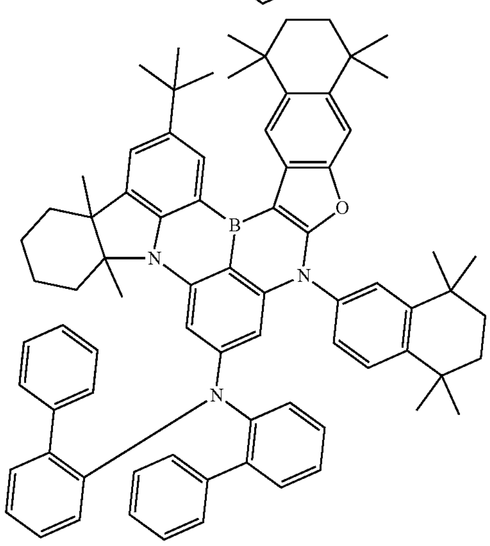
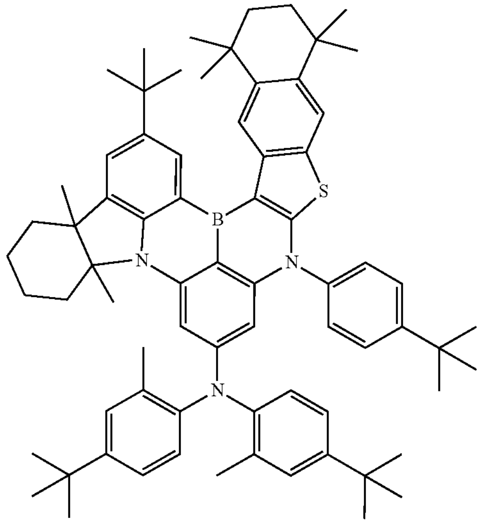
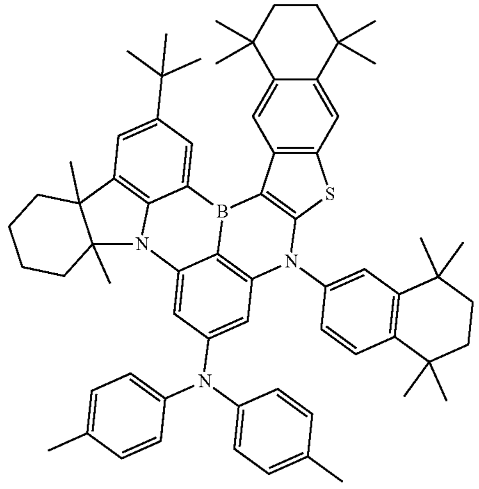

-continued
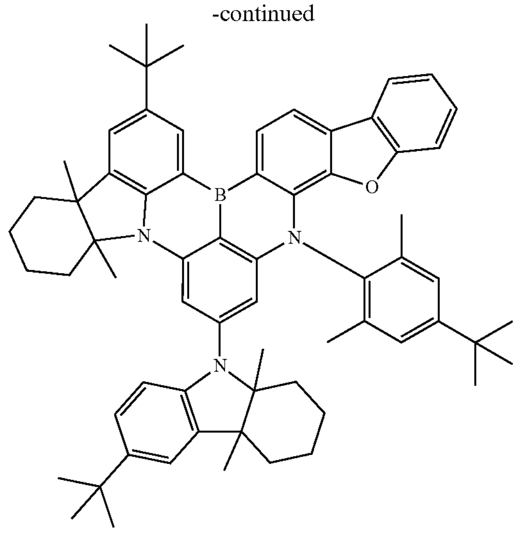
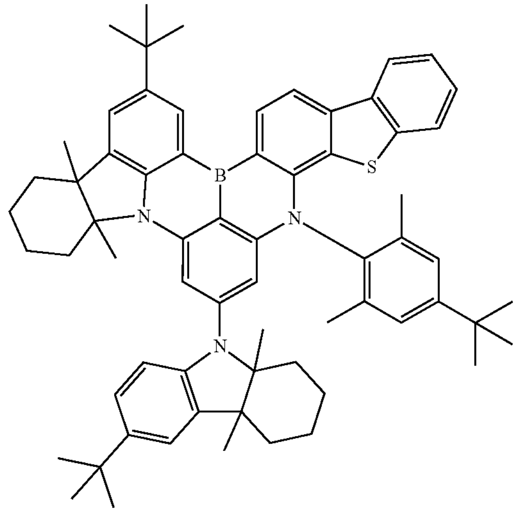
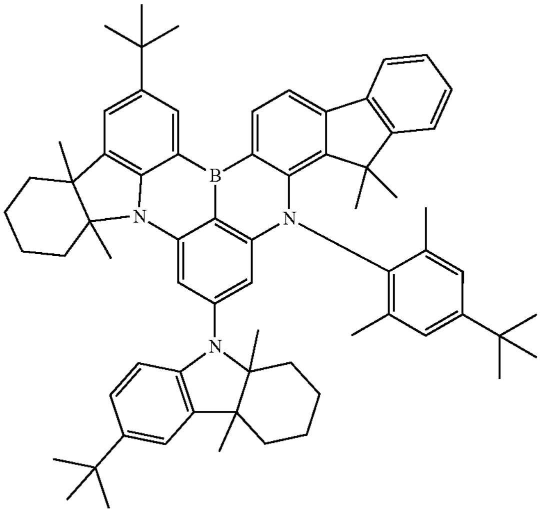
-continued
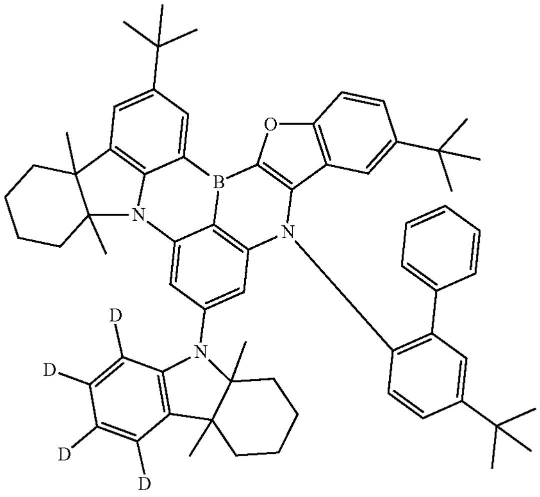
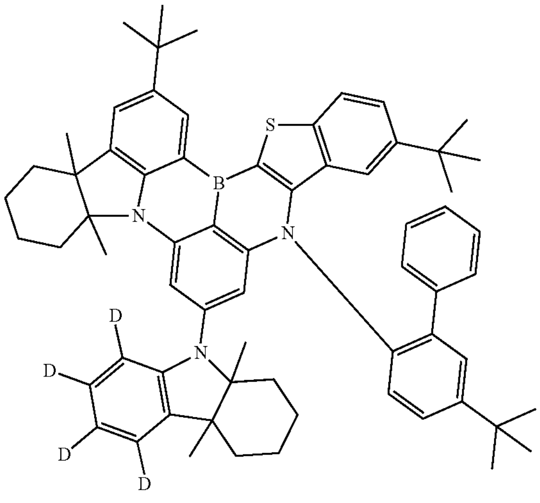
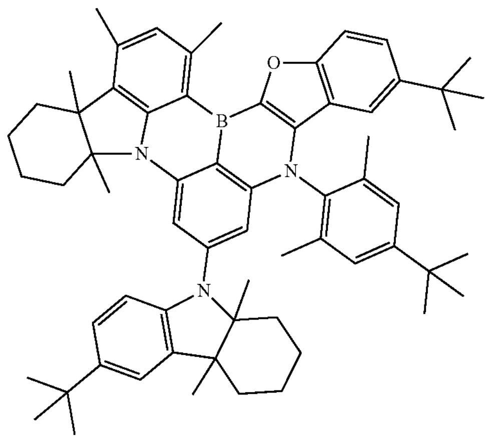

-continued
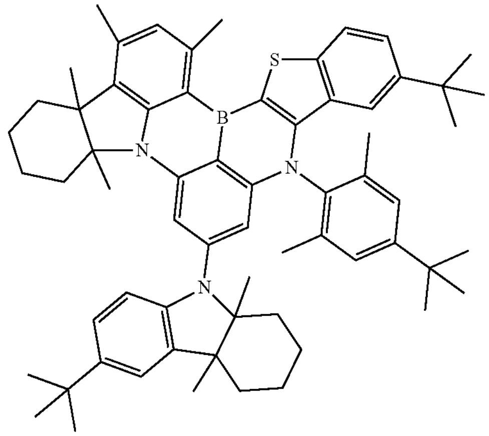
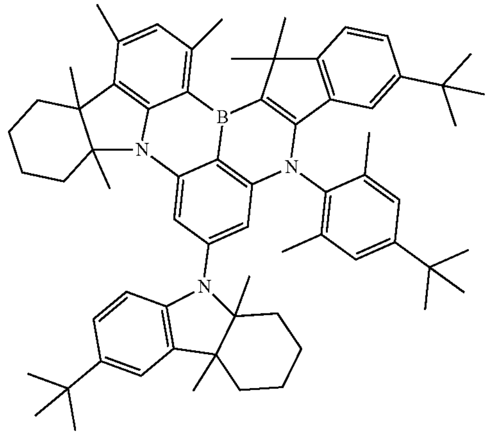
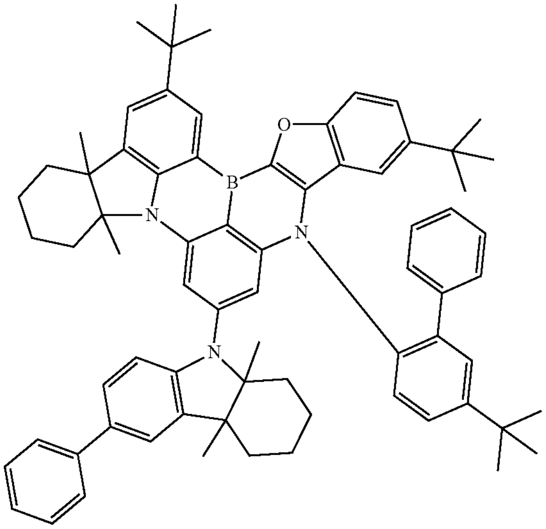
-continued
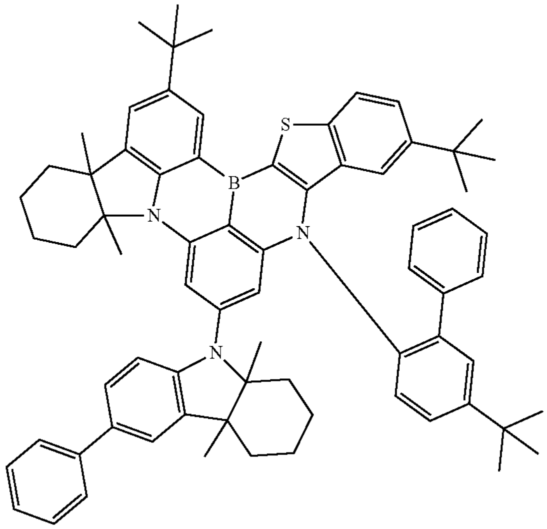
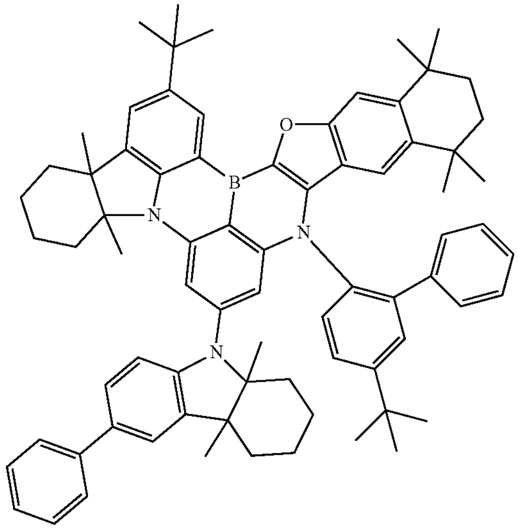
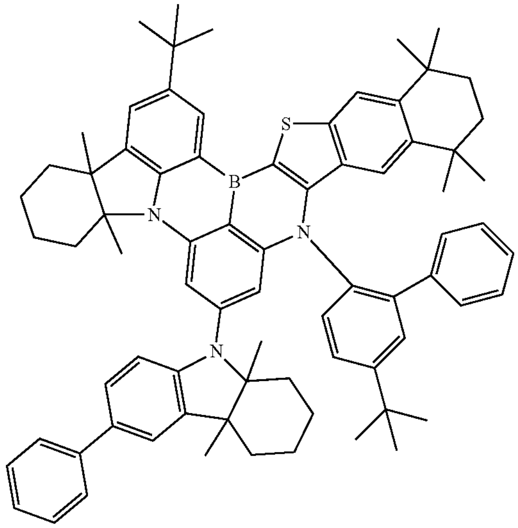

-continued
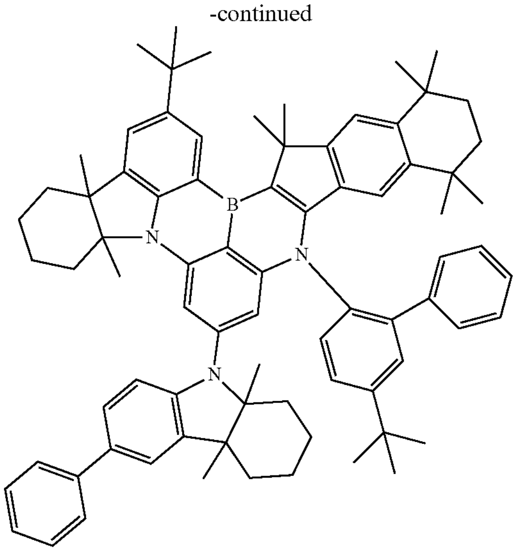
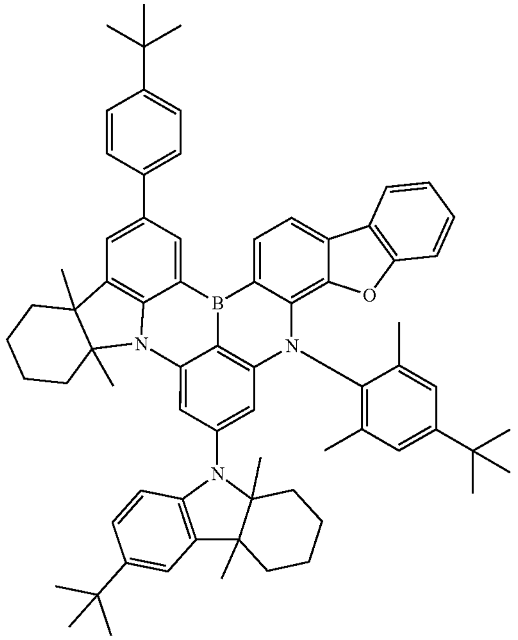
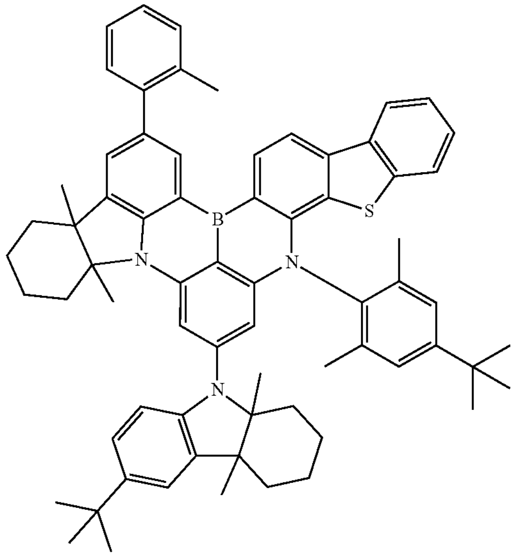
-continued
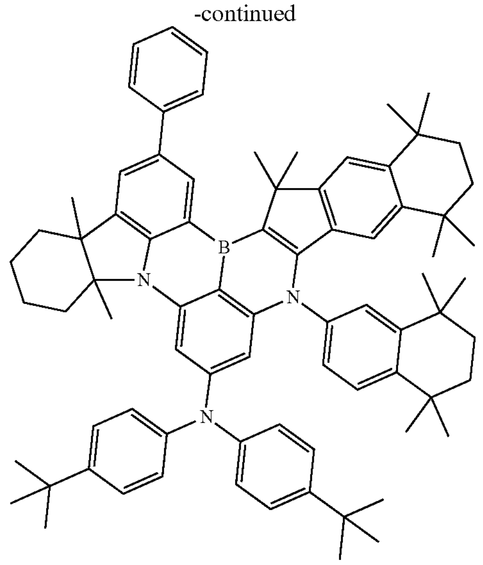
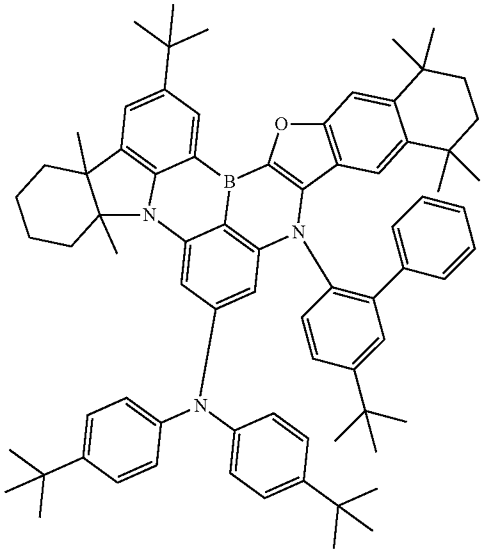
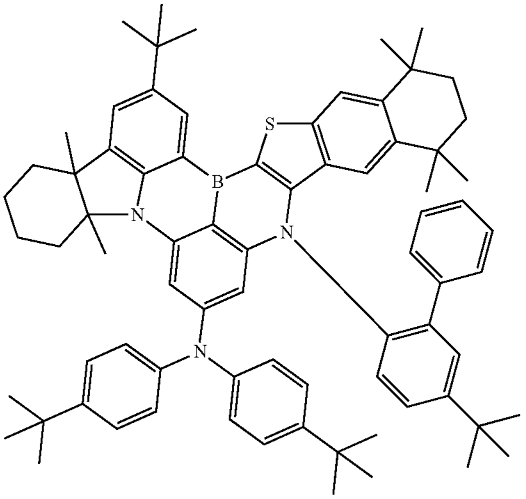

-continued
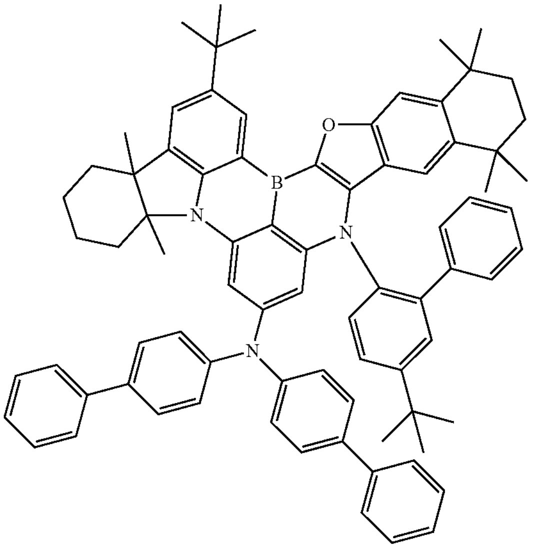
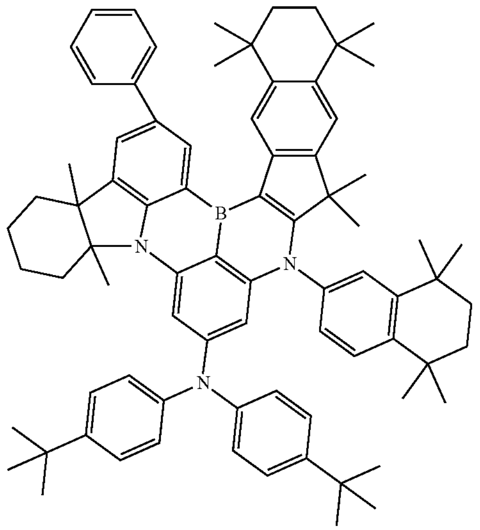
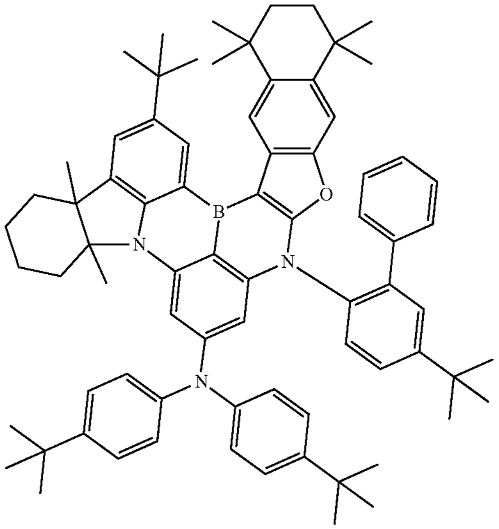
-continued
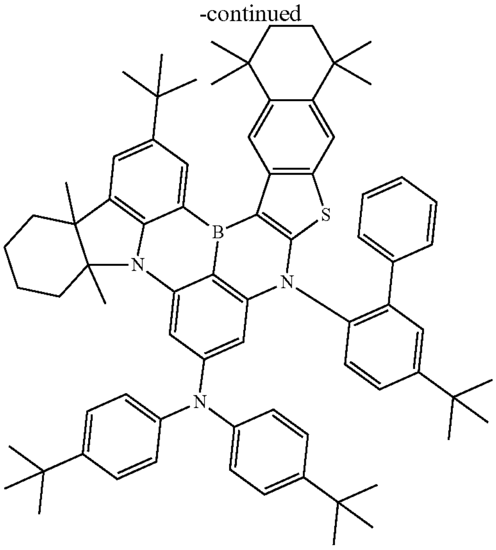
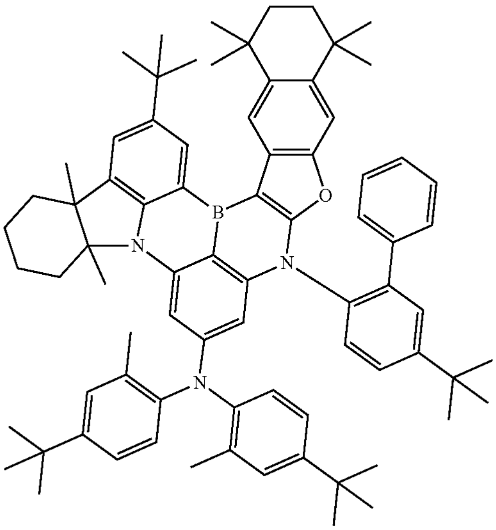
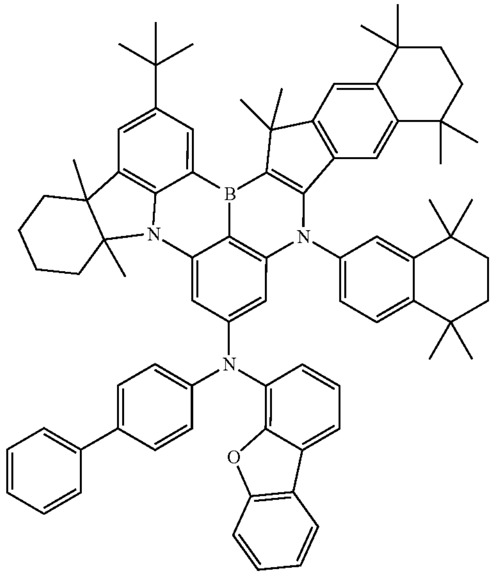

-continued
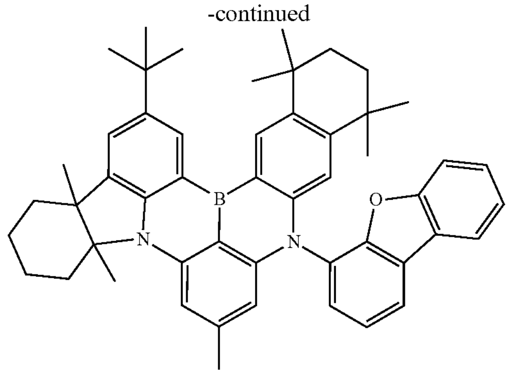
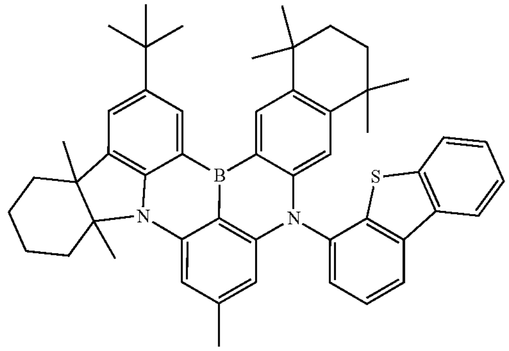
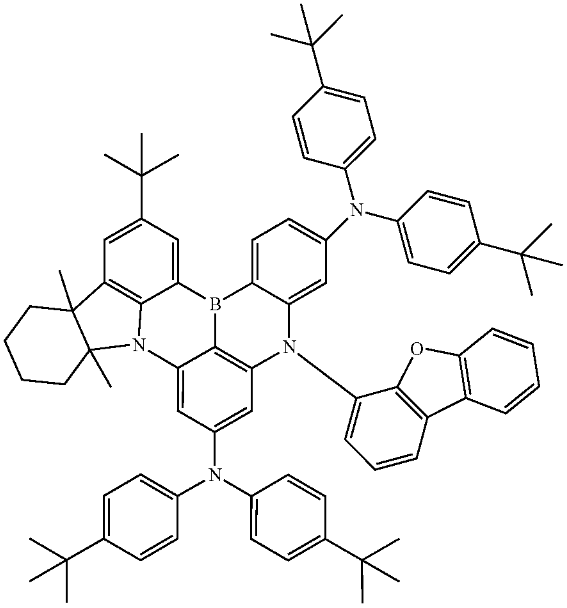
-continued
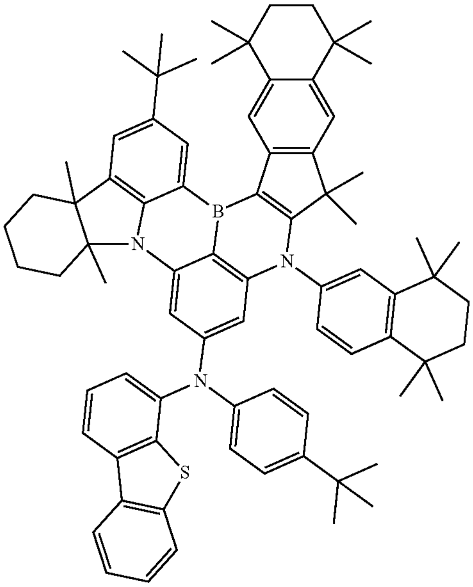
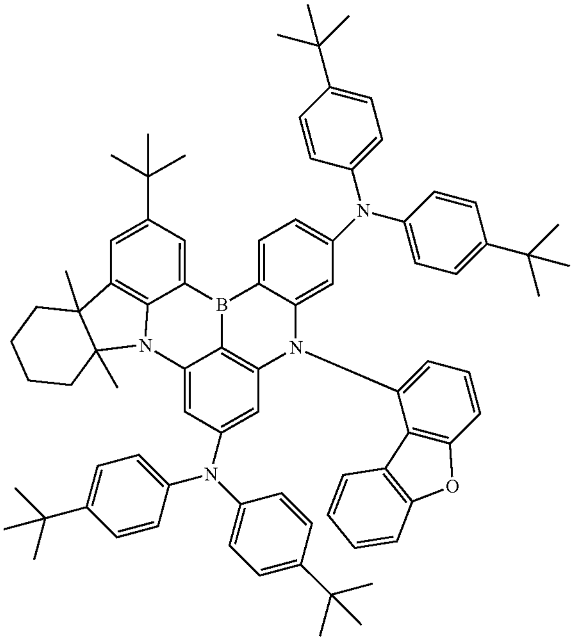
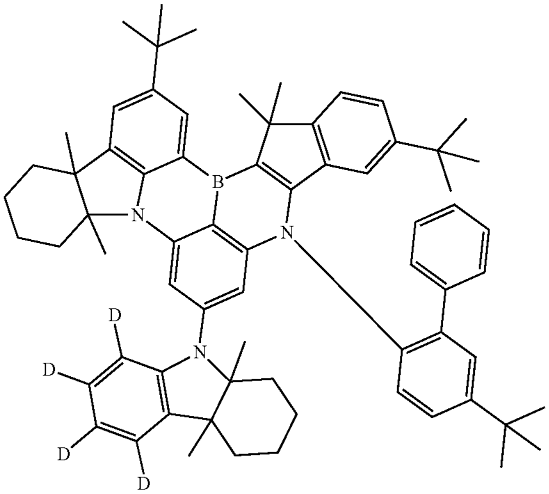

-continued
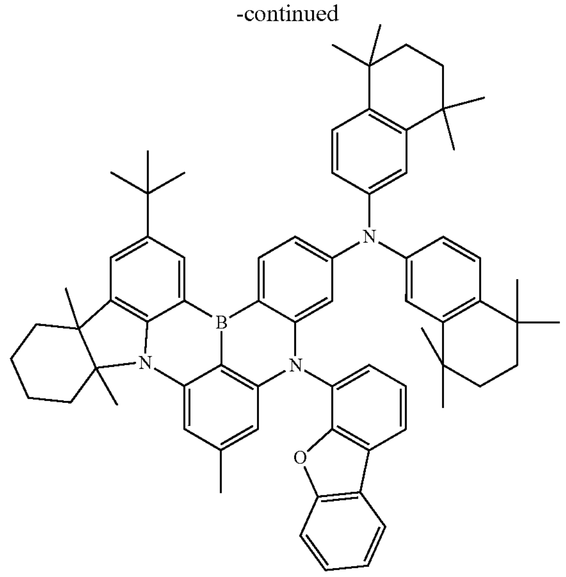
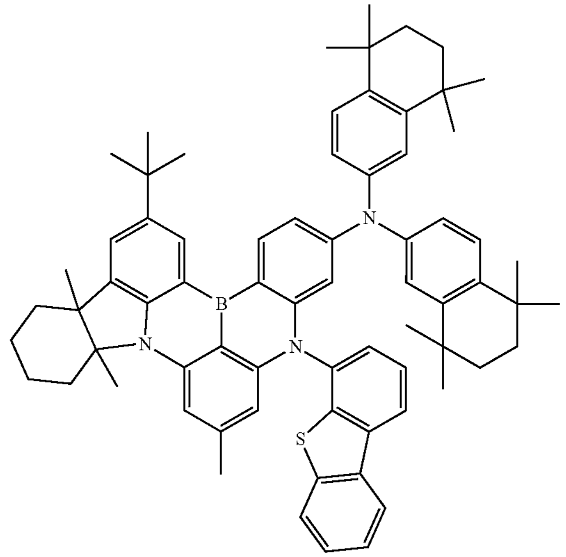
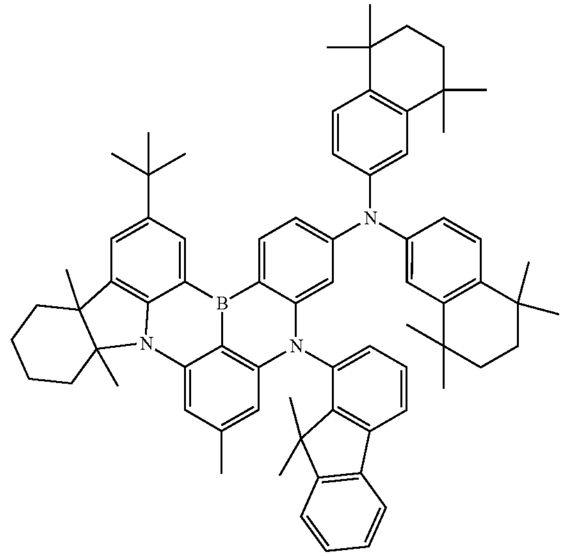
-continued
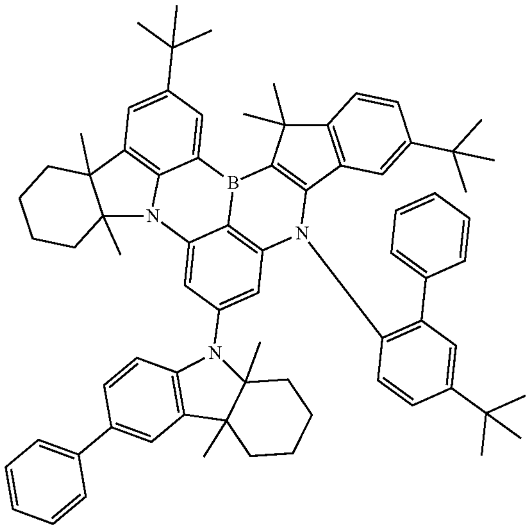
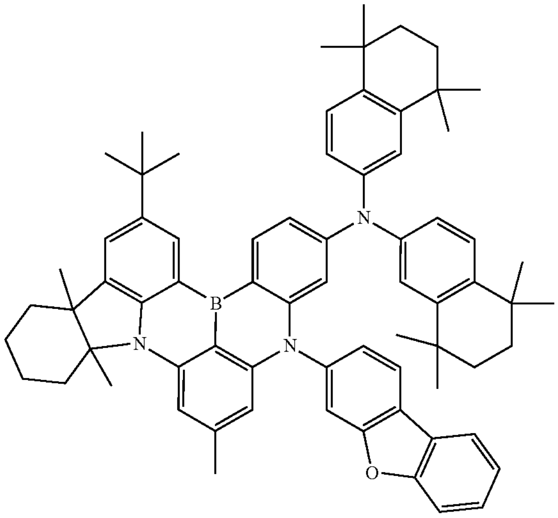
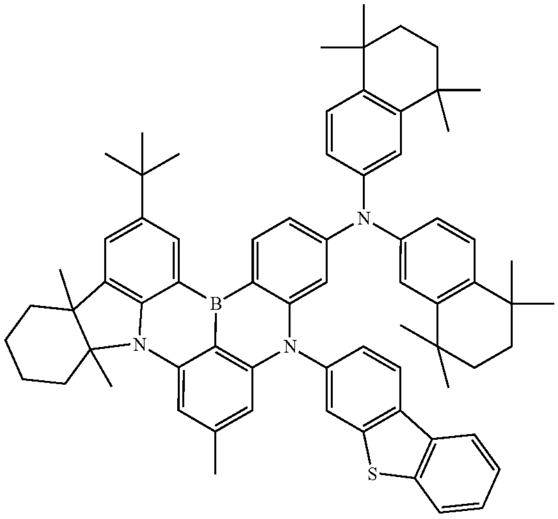

-continued
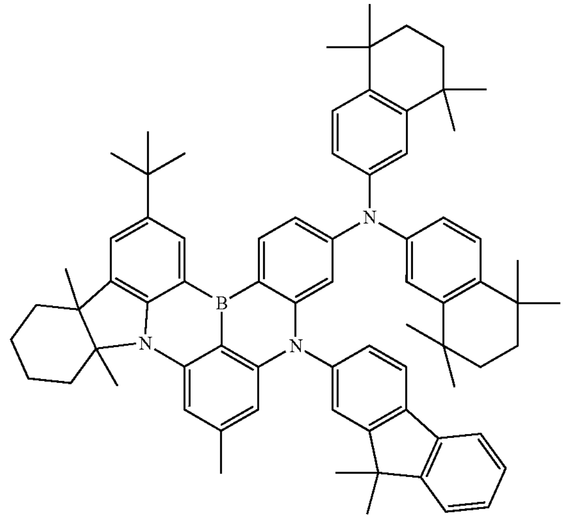
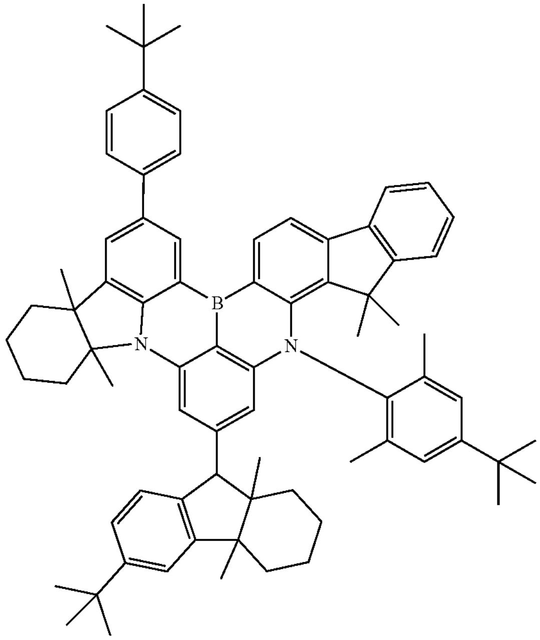
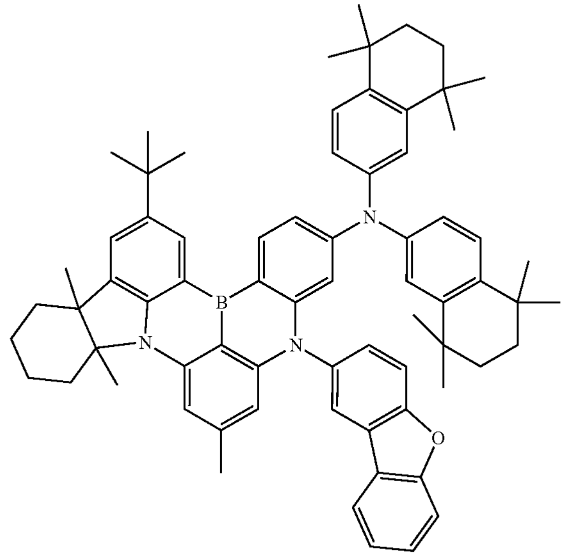
-continued
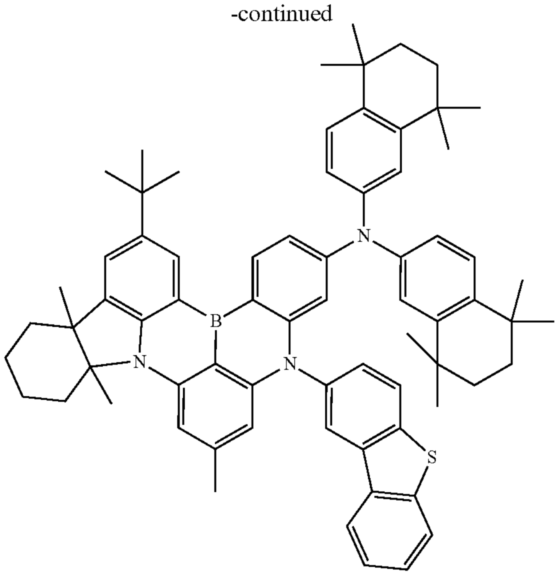
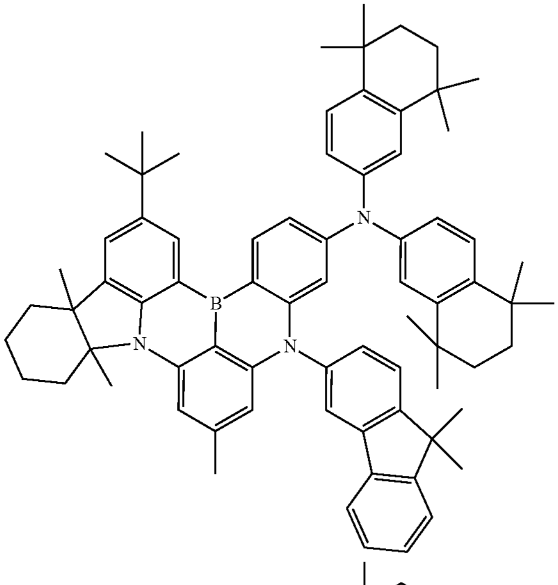
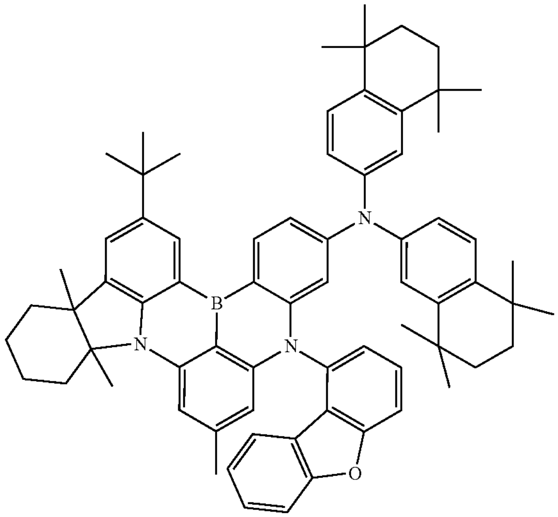

-continued
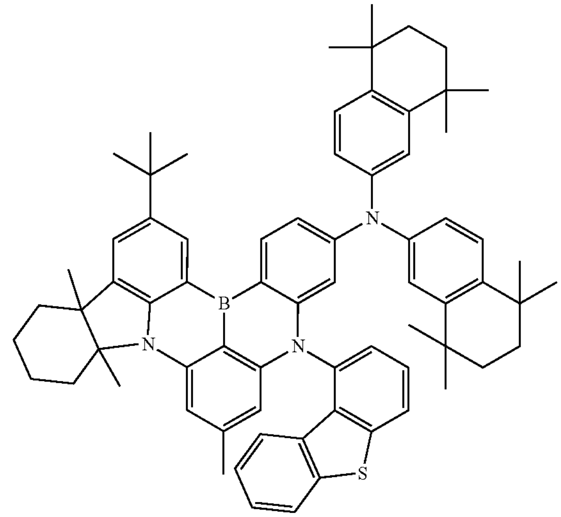
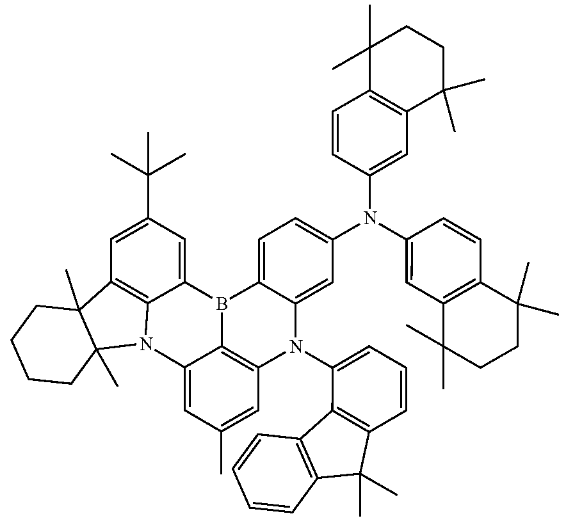
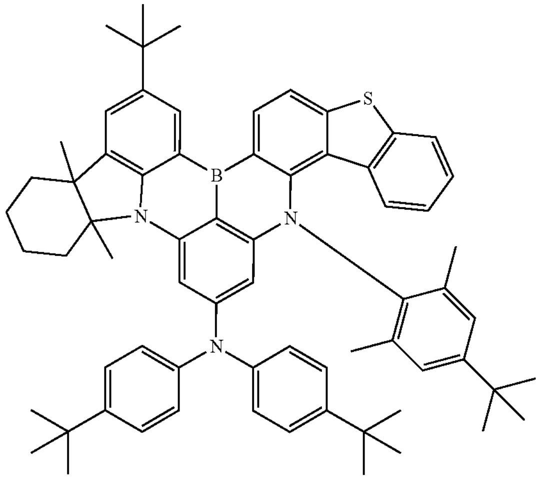
-continued
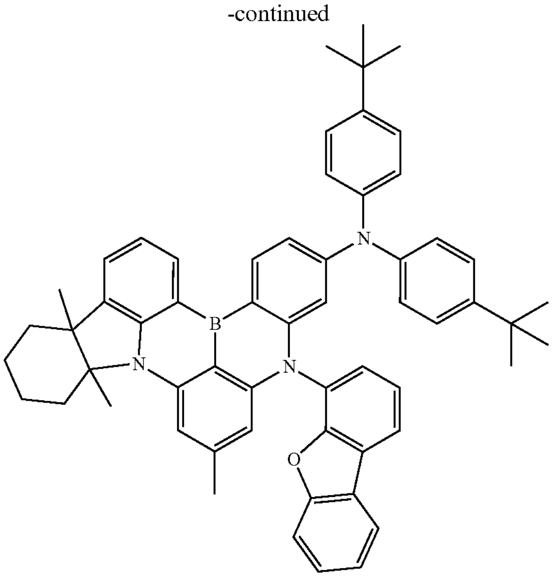
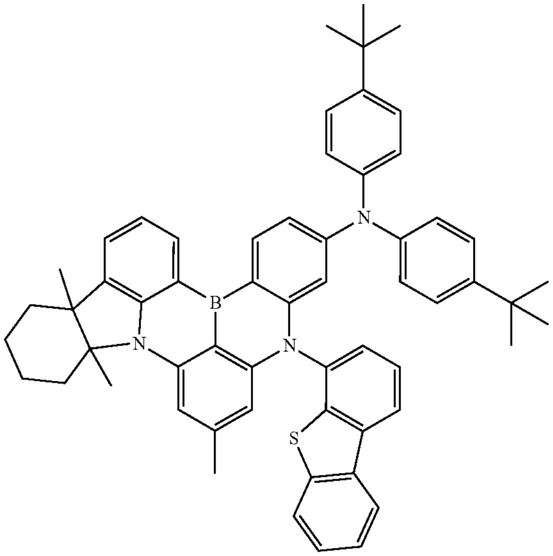
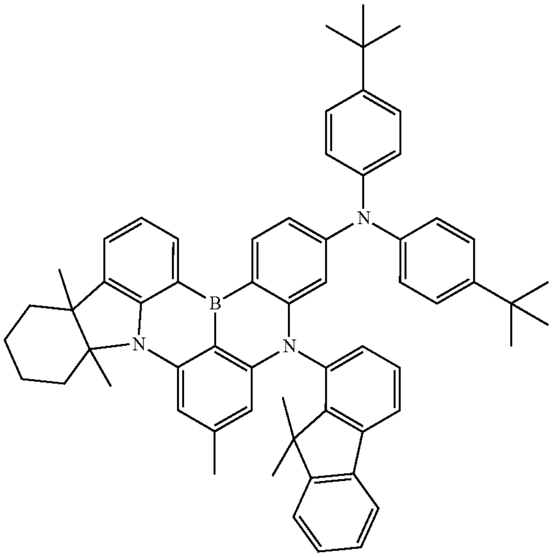

-continued
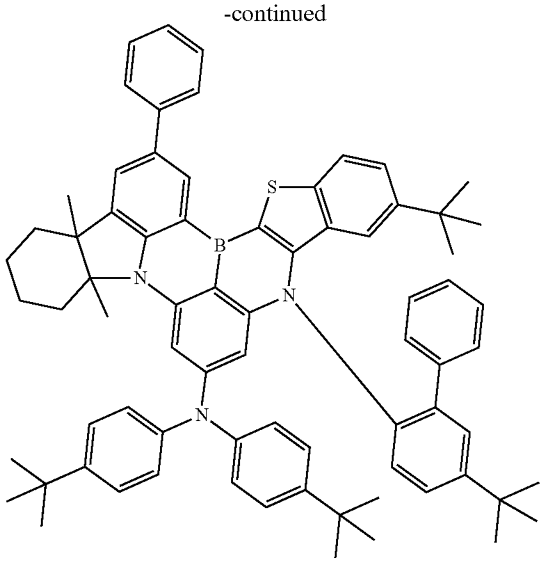
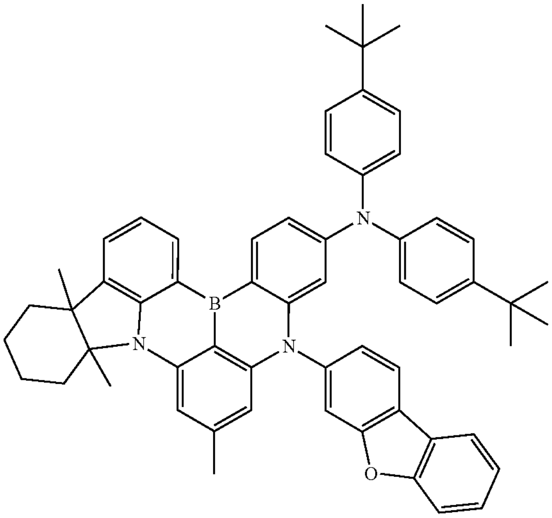
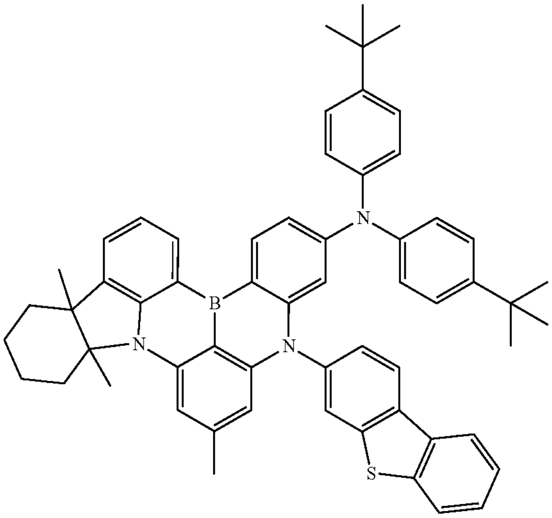
-continued
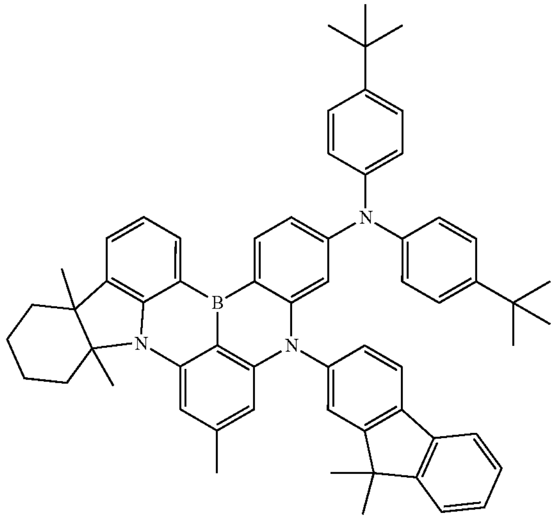
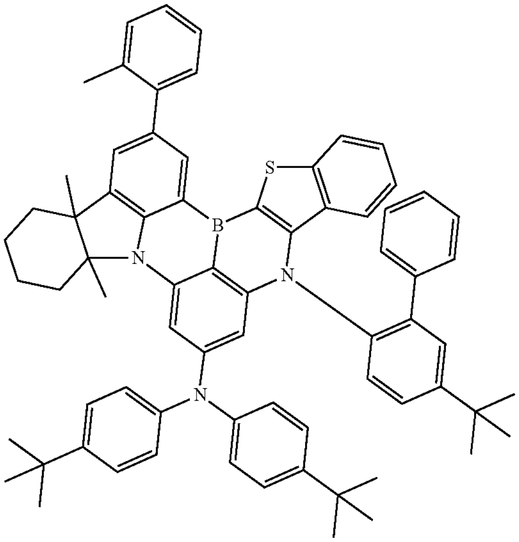
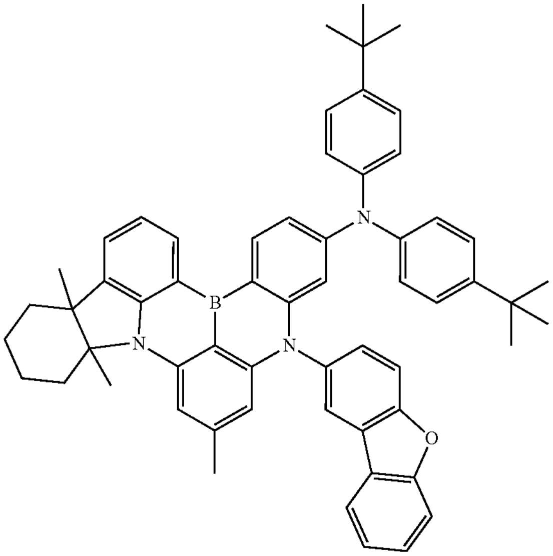

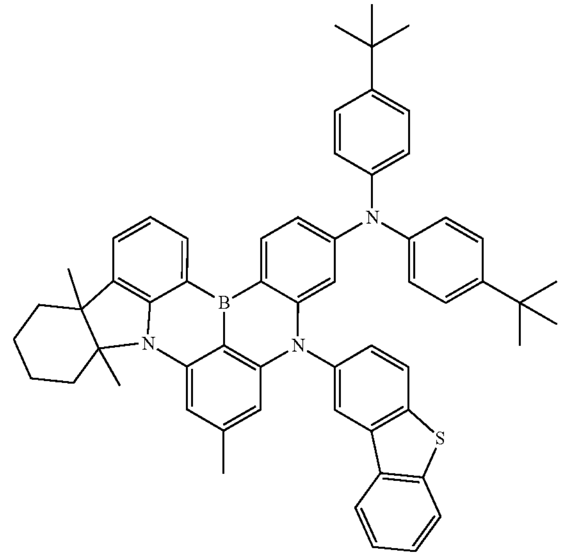
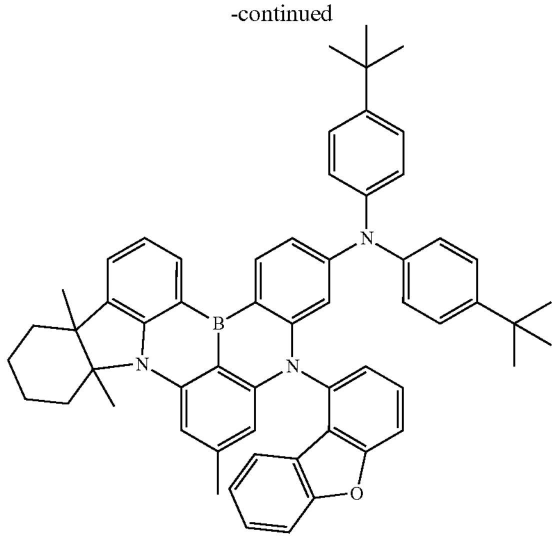
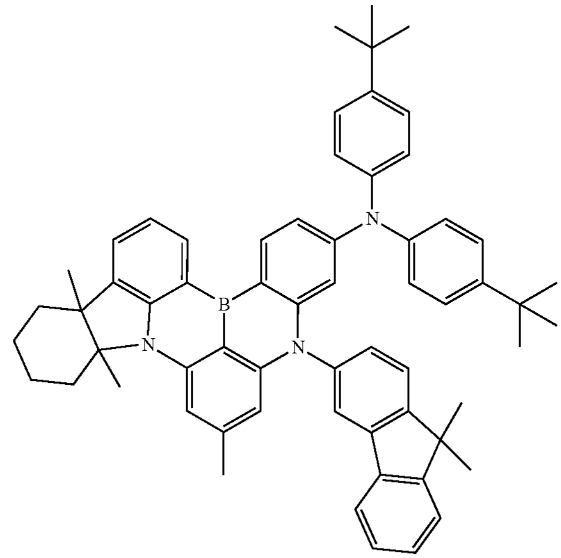
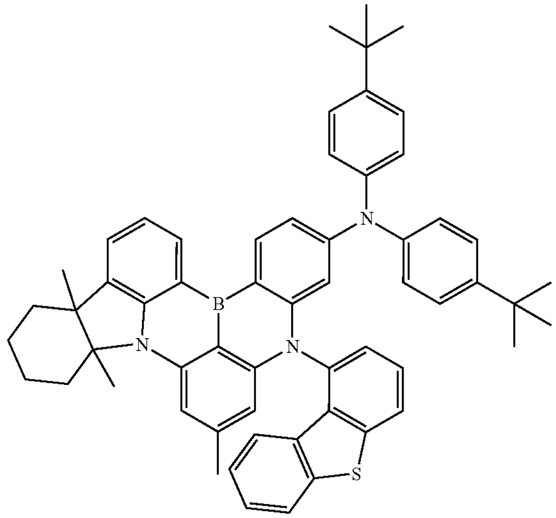
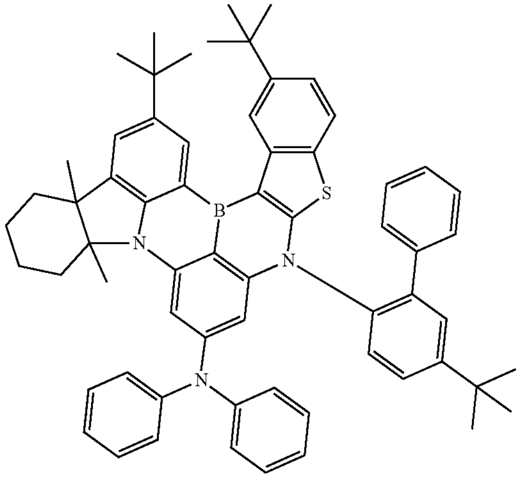
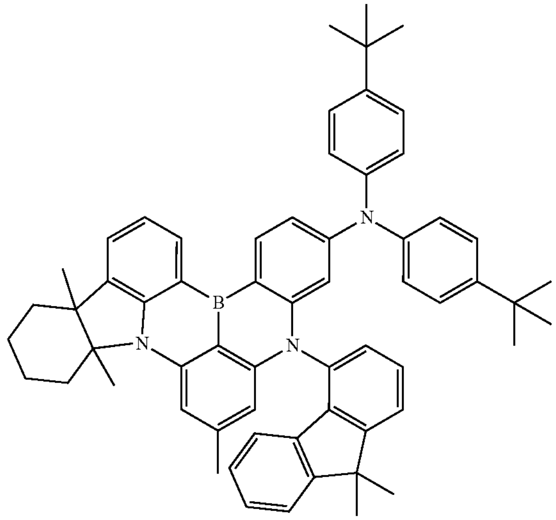

-continued
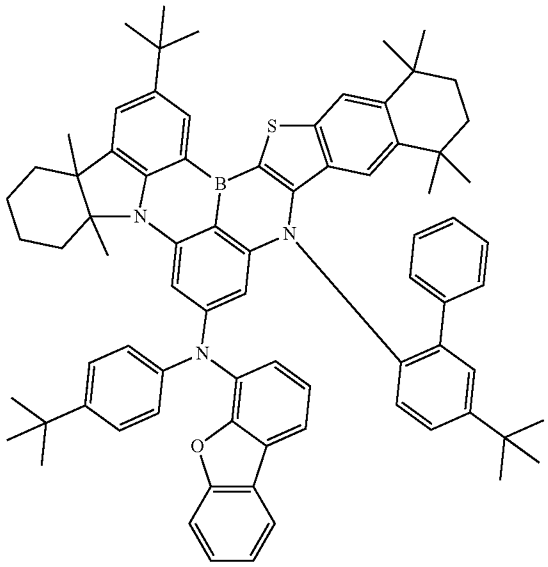
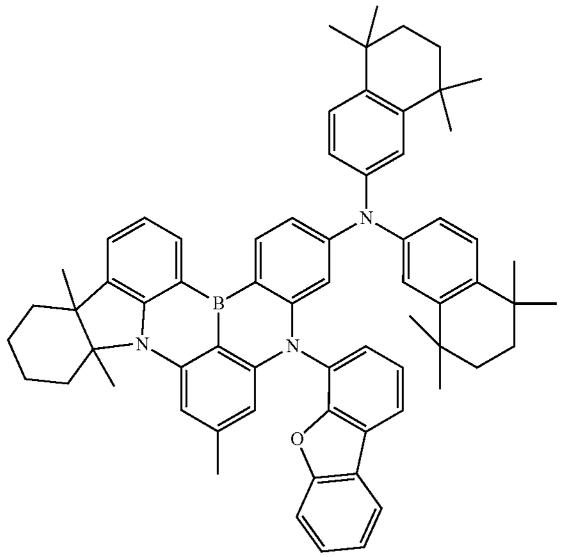
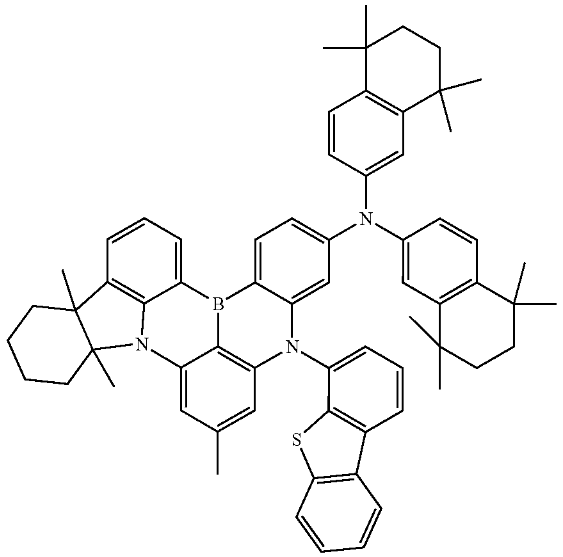
-continued
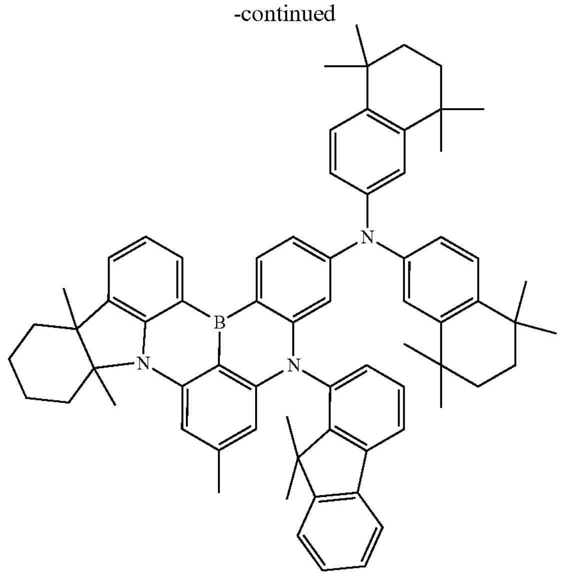
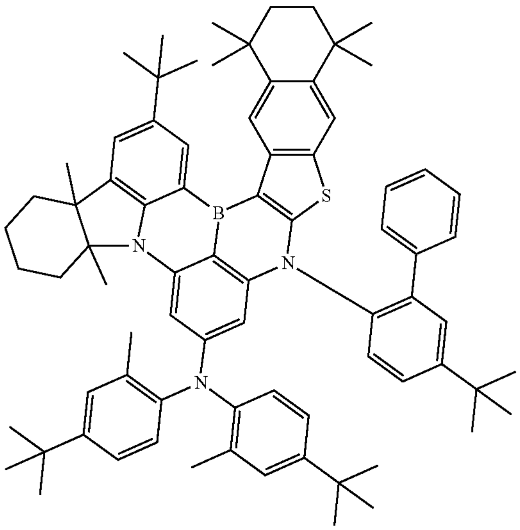
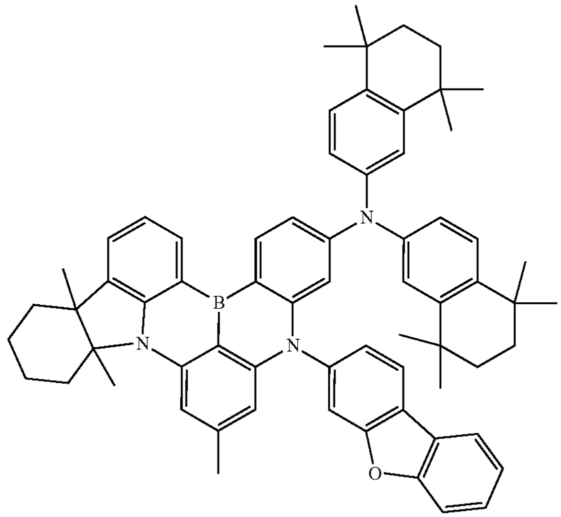

-continued
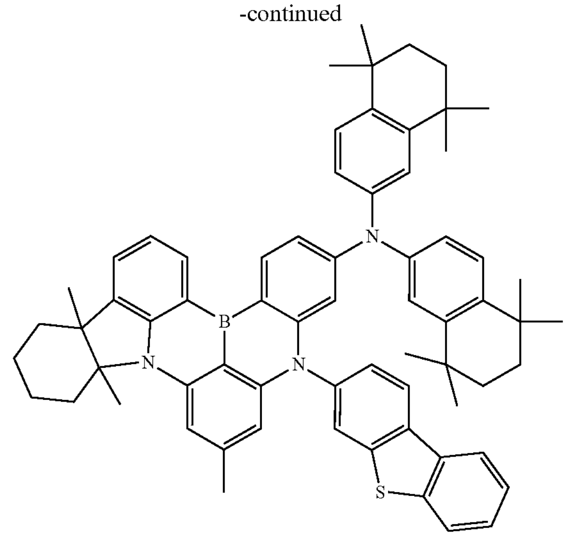
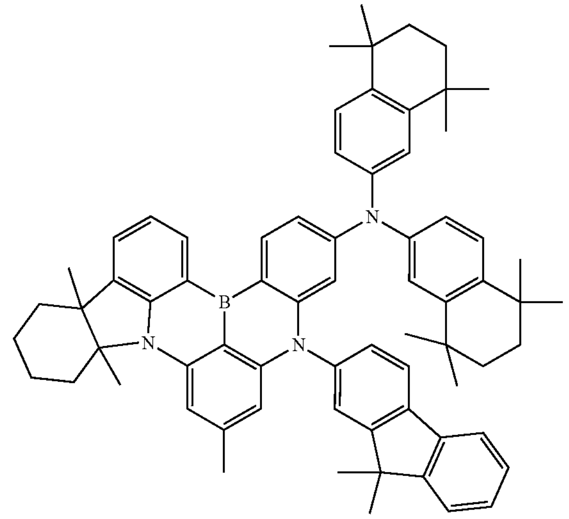
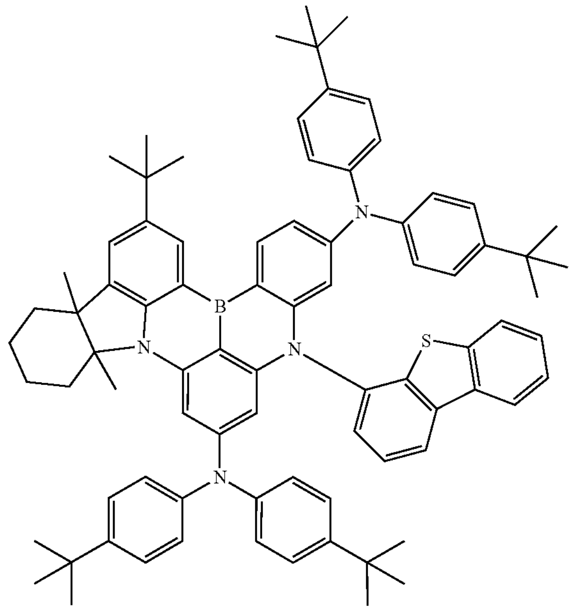
-continued
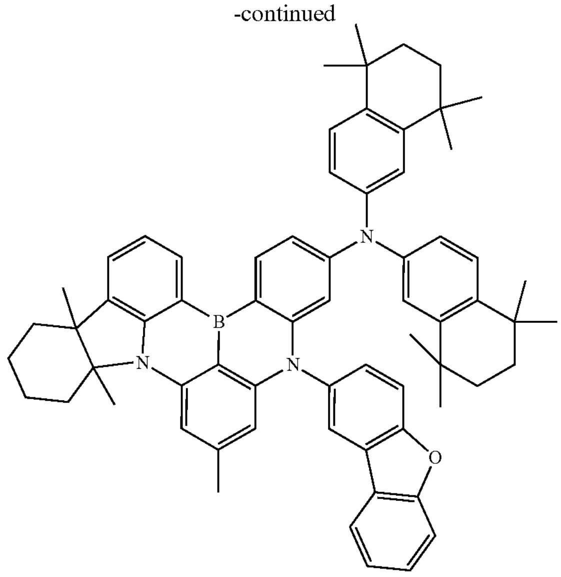
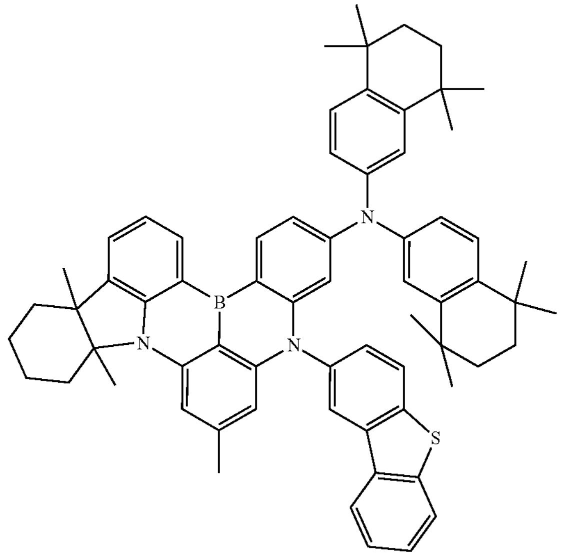
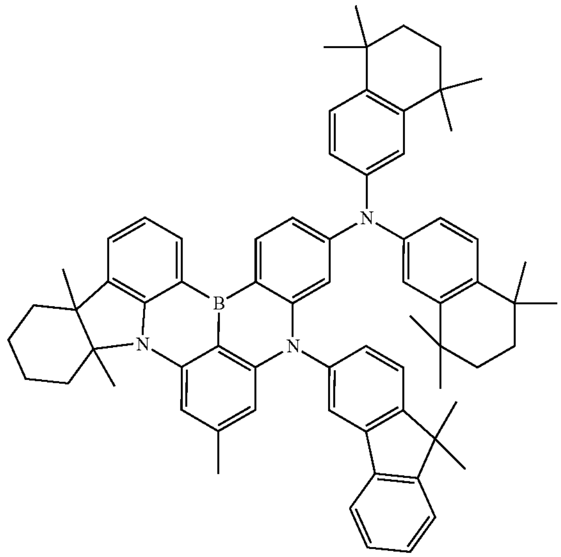

-continued
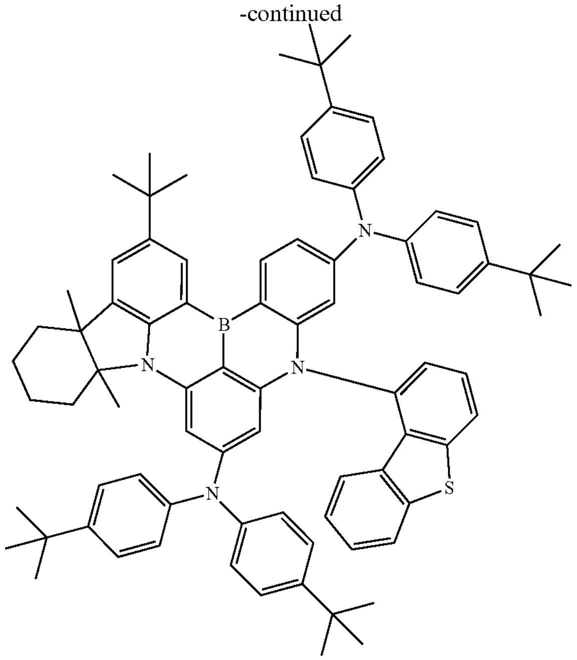
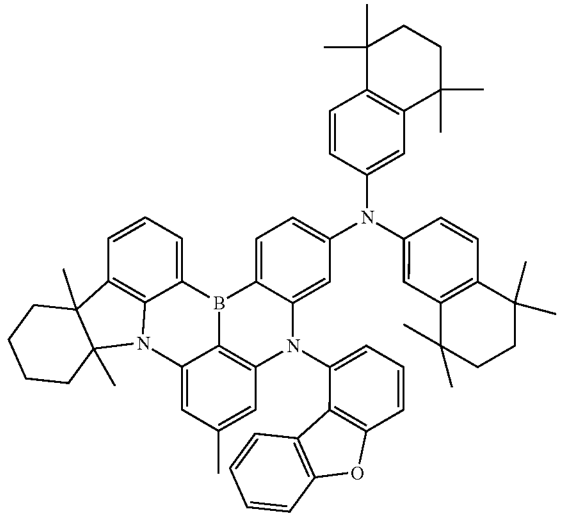
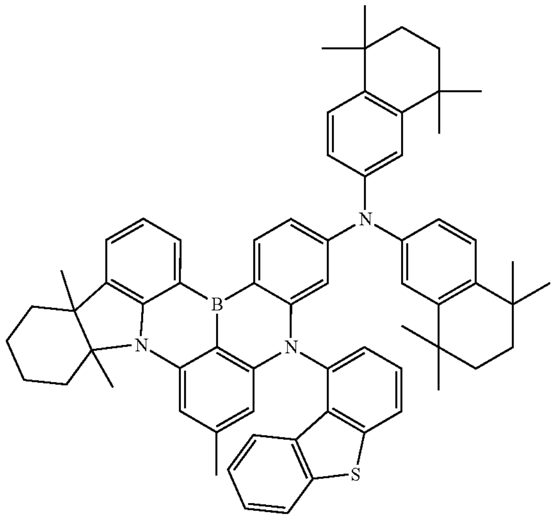
-continued
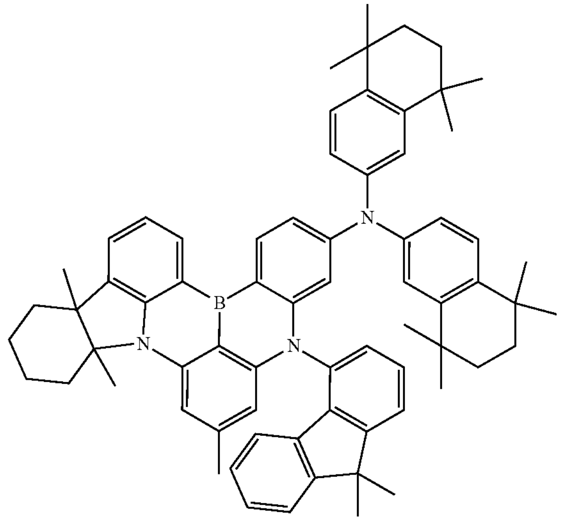
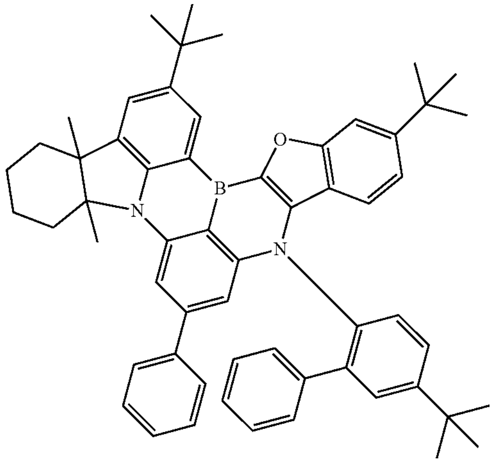
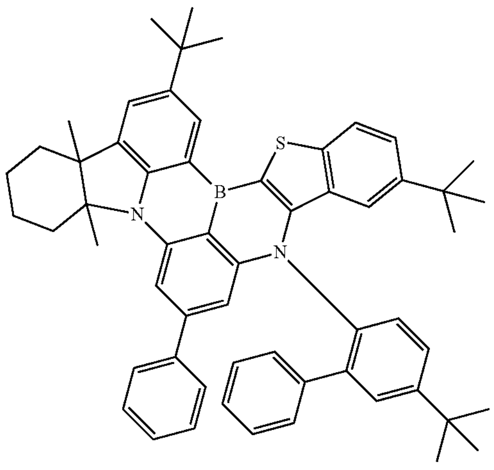

-continued
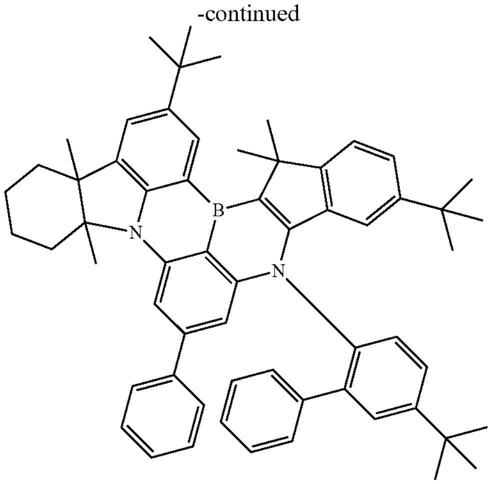
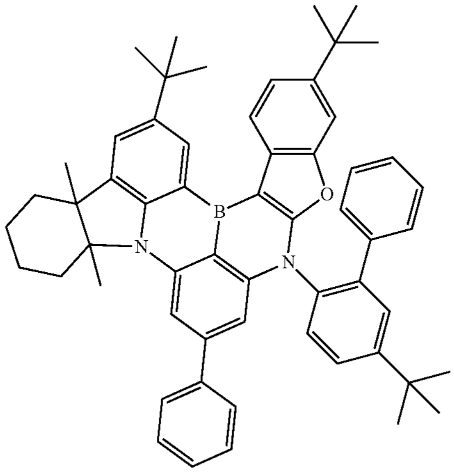
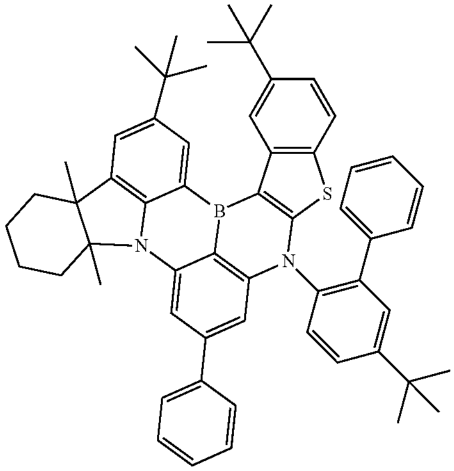
-continued
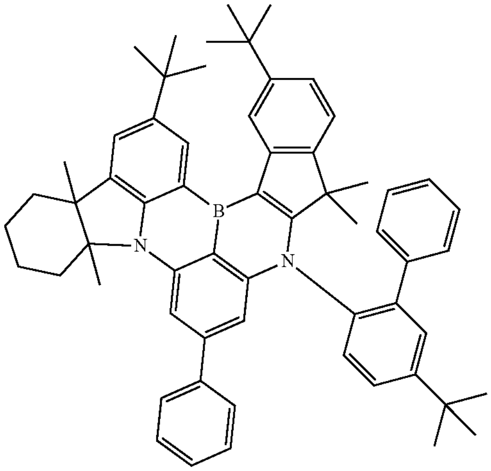
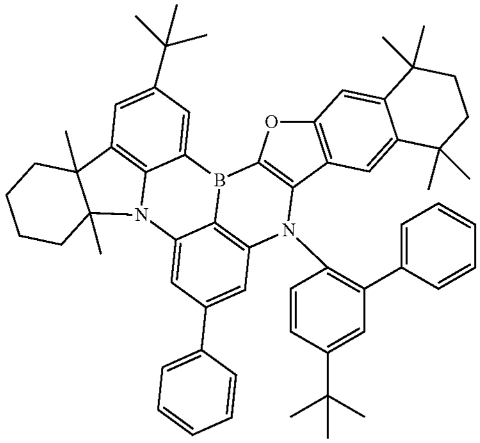
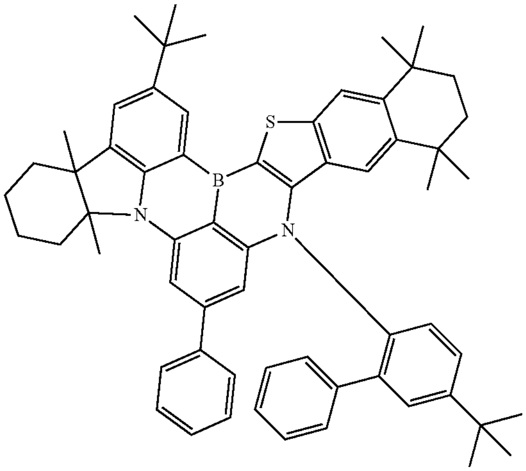

-continued
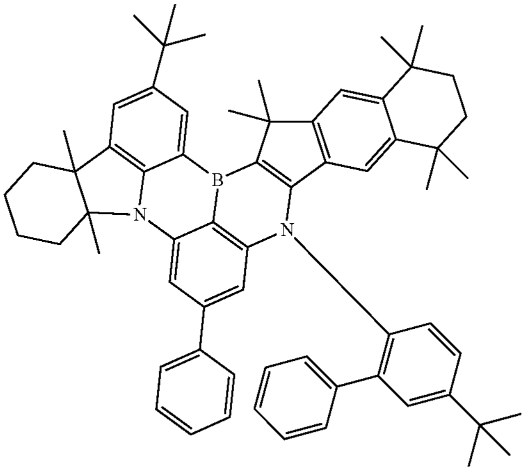
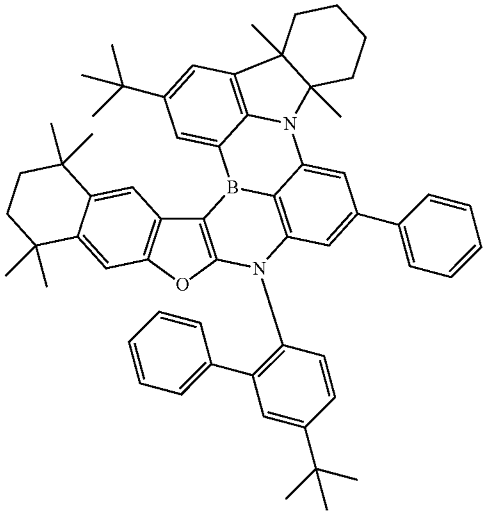
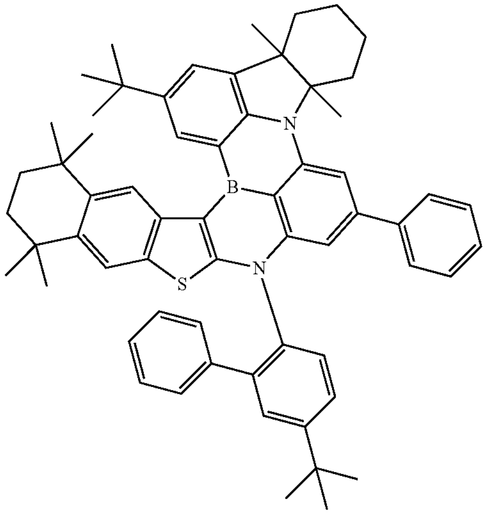
-continued
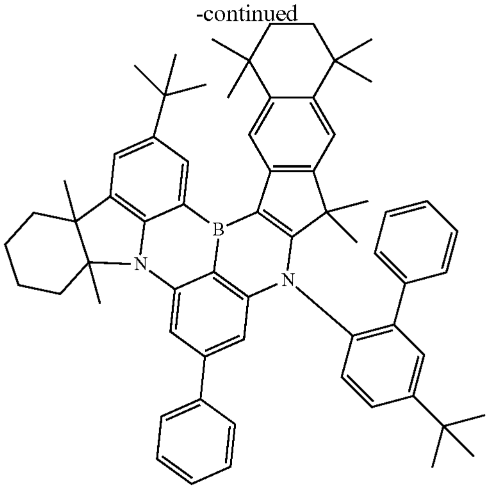
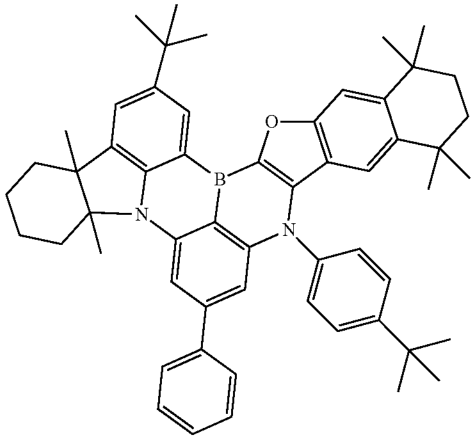
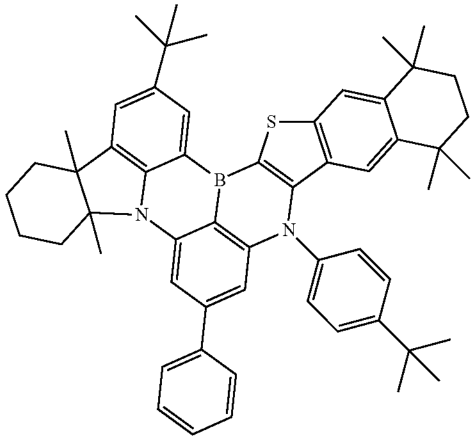

-continued
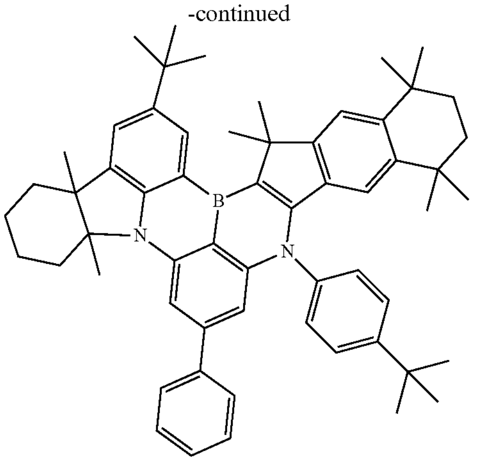
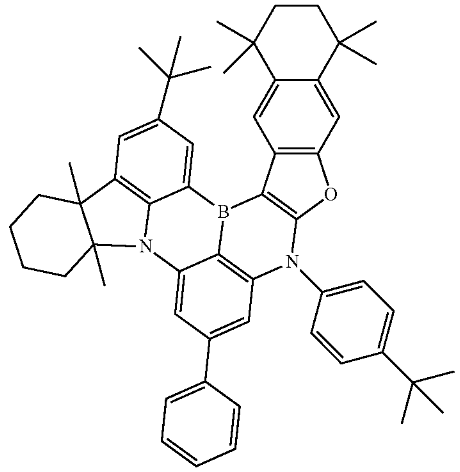
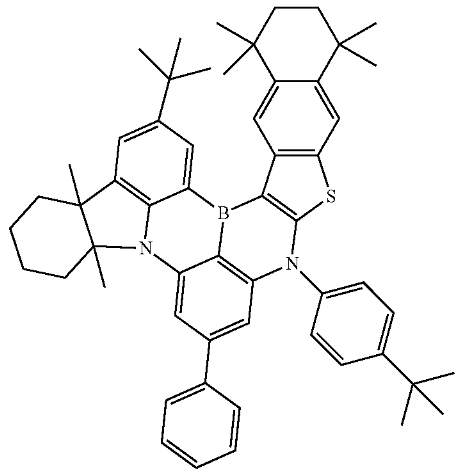
-continued
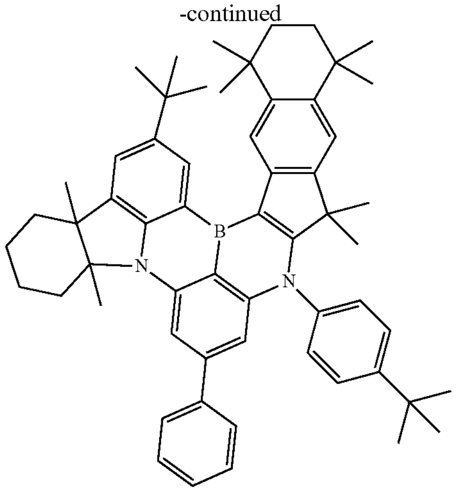
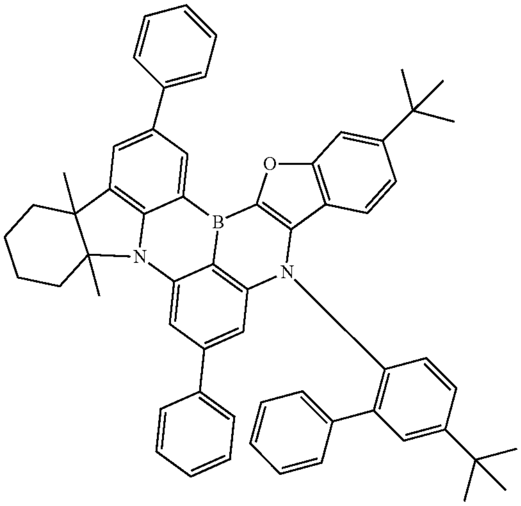
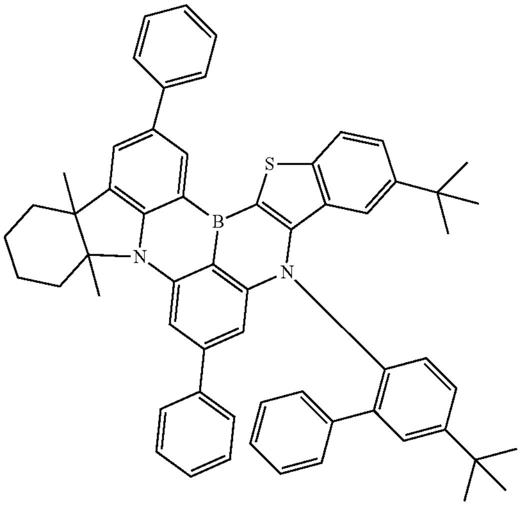

-continued
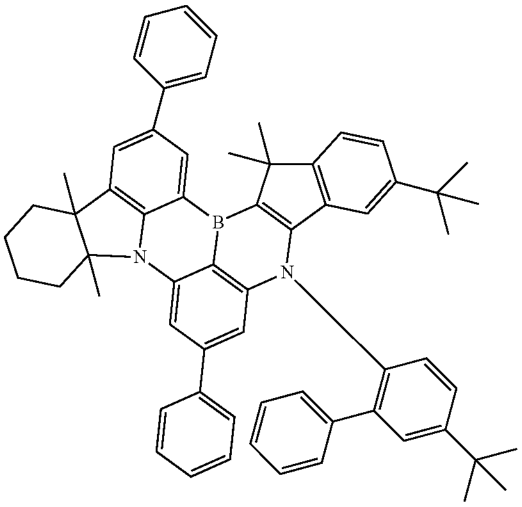
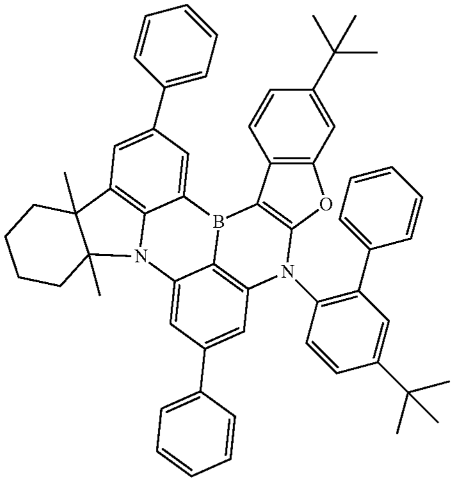
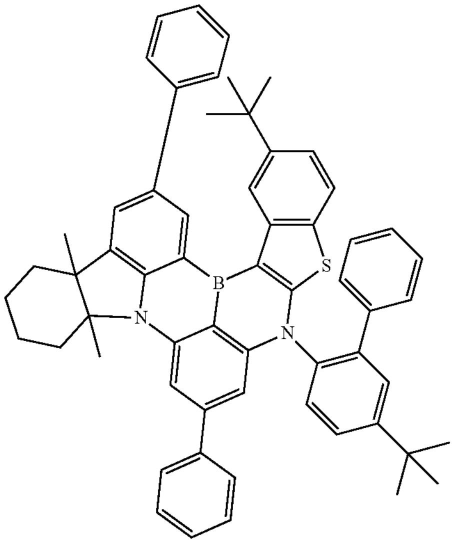
-continued
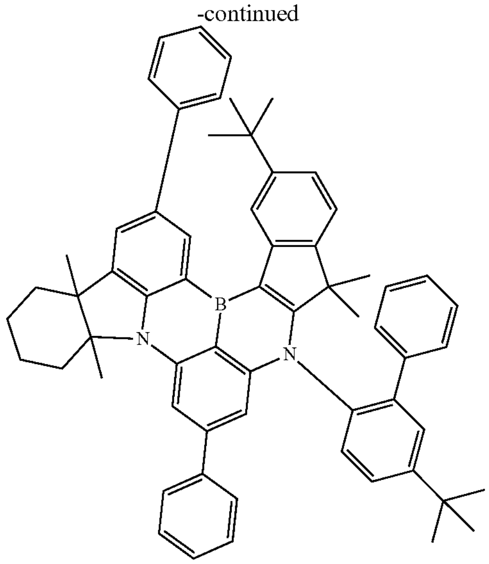
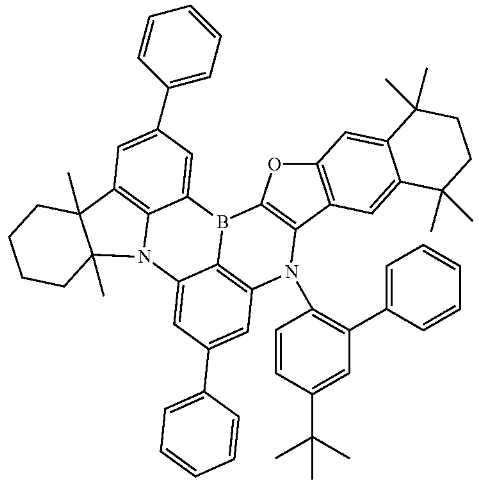
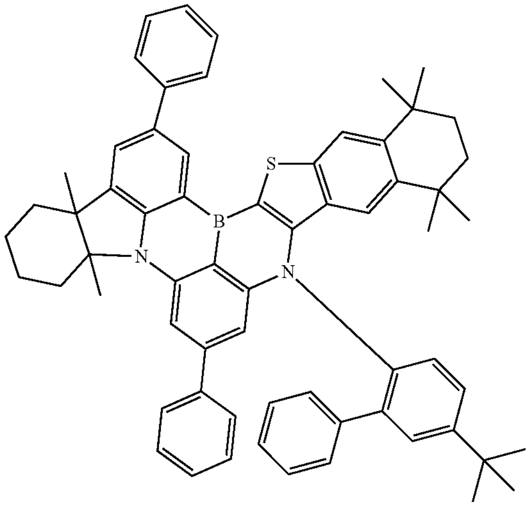

-continued
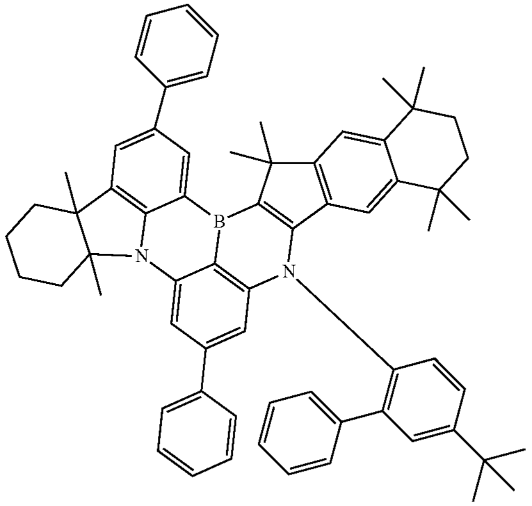
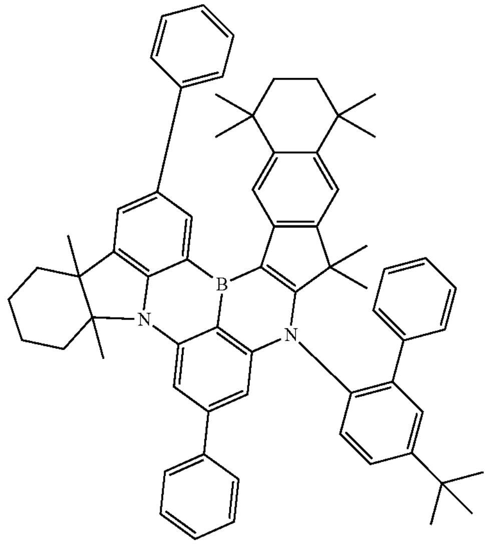
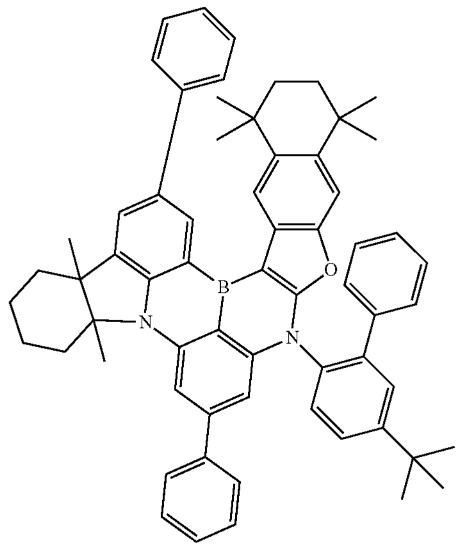
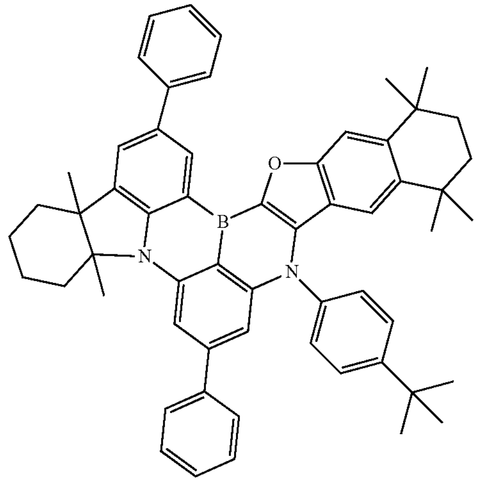
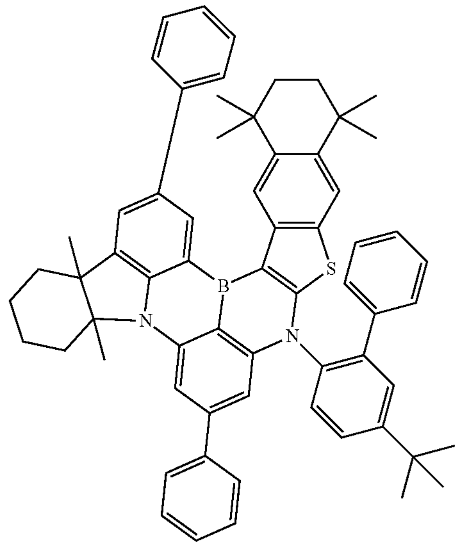
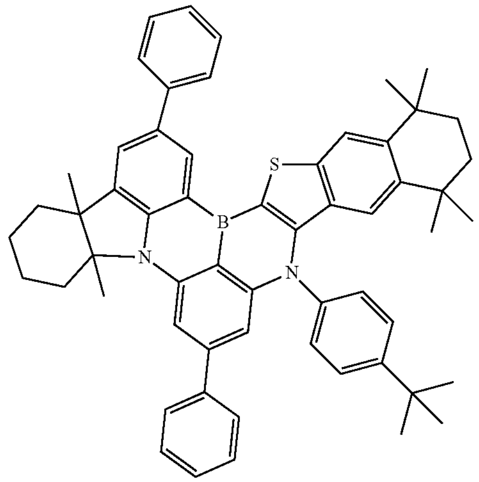

-continued
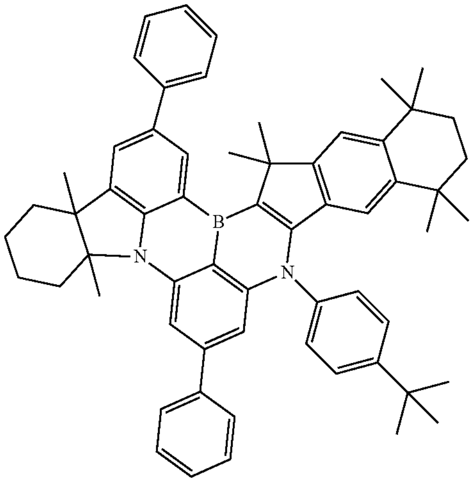
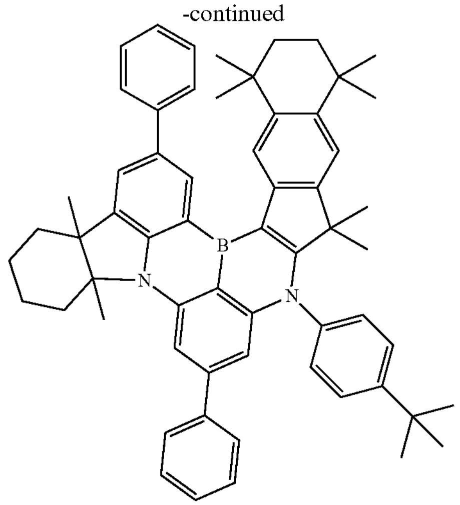
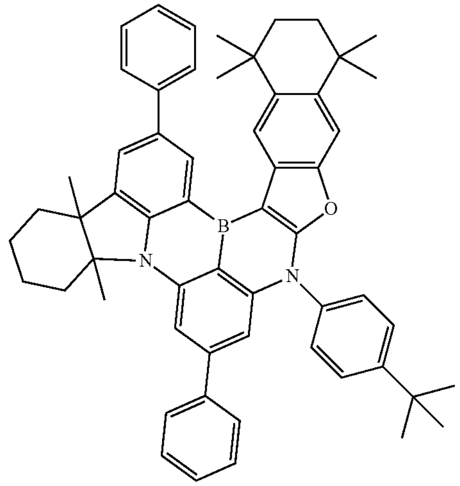
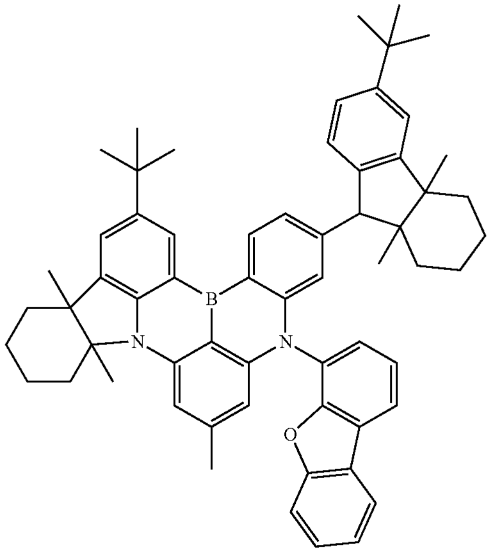
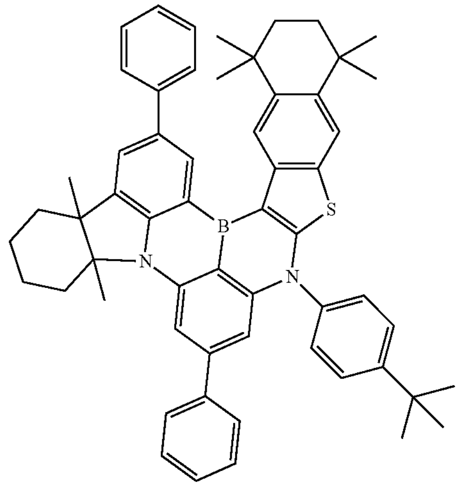
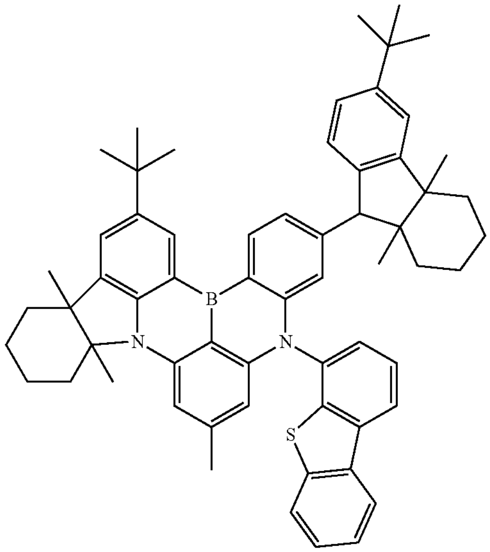
-continued -continued
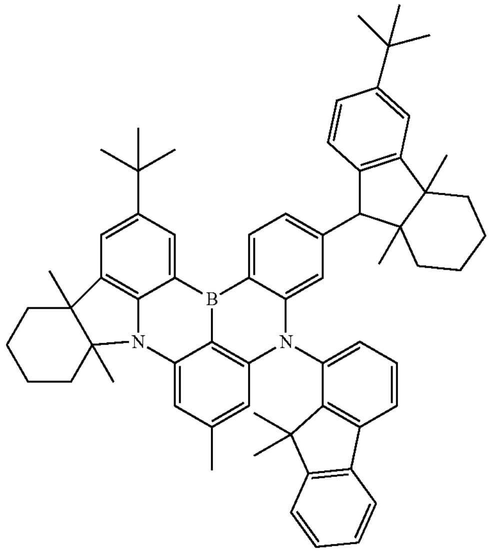
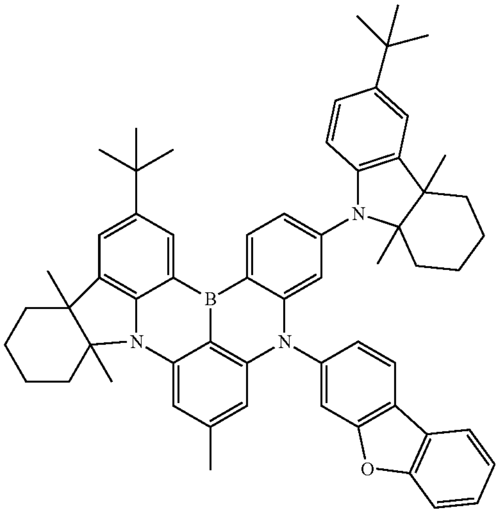
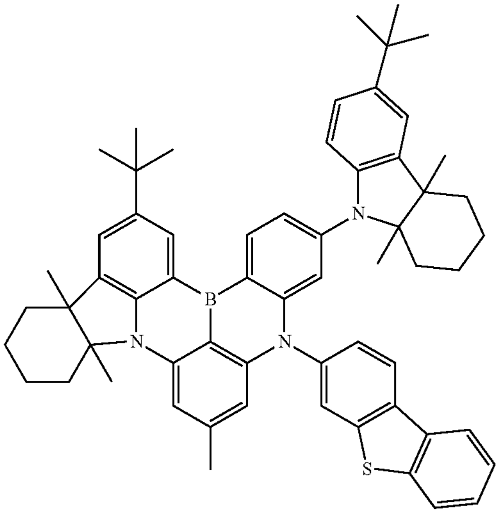
-continued
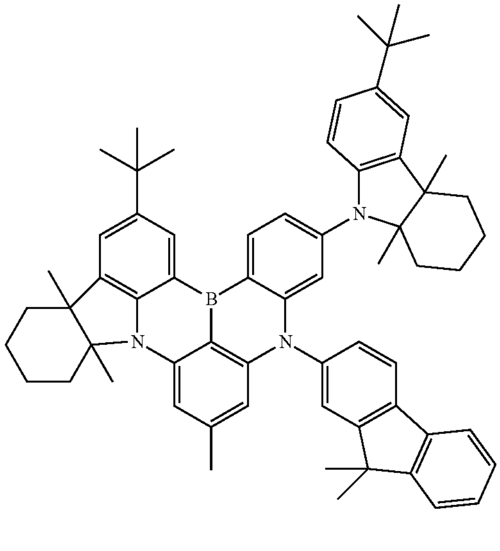
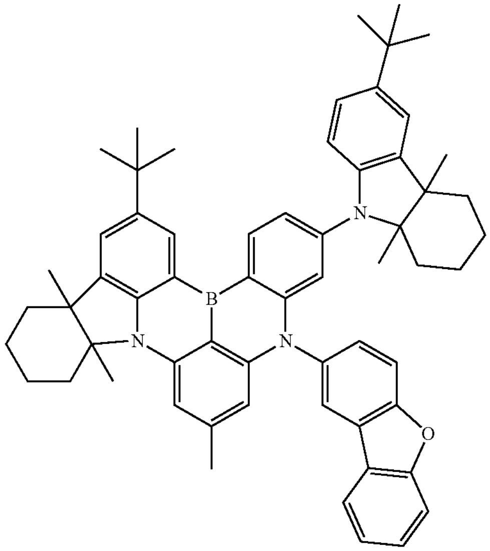
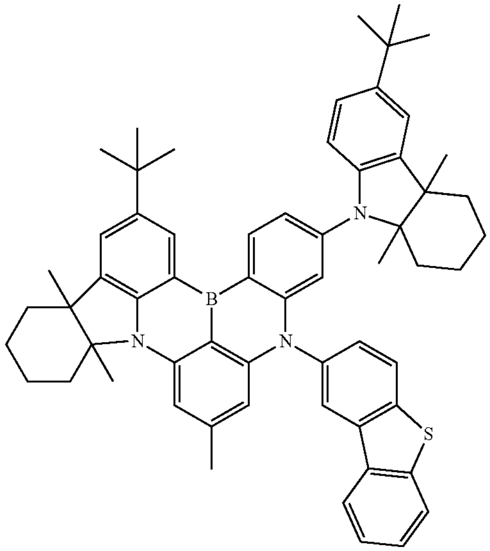

-continued
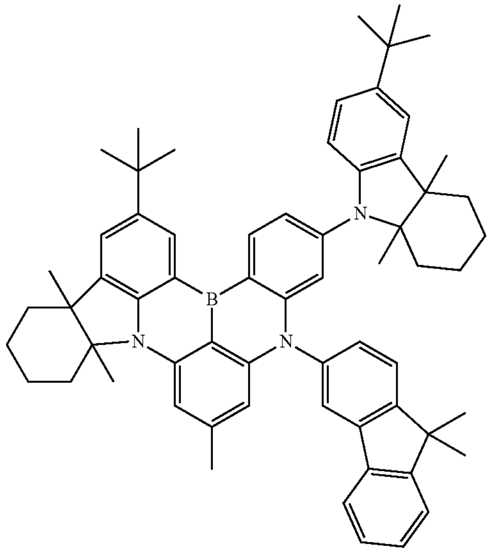
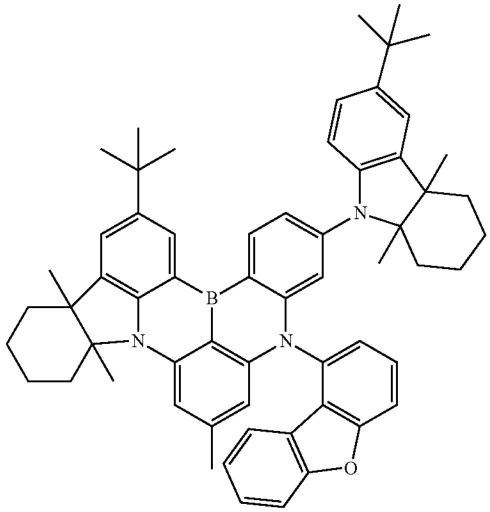
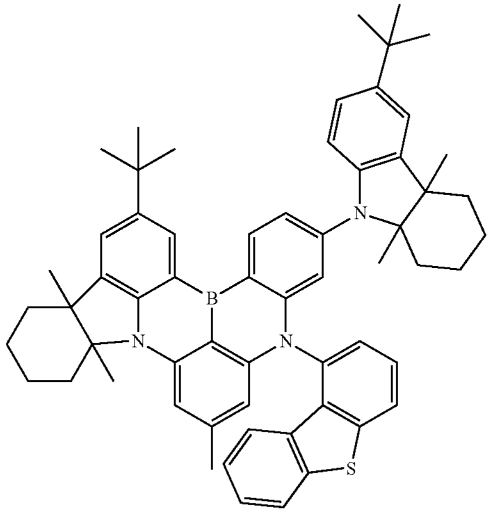
-continued
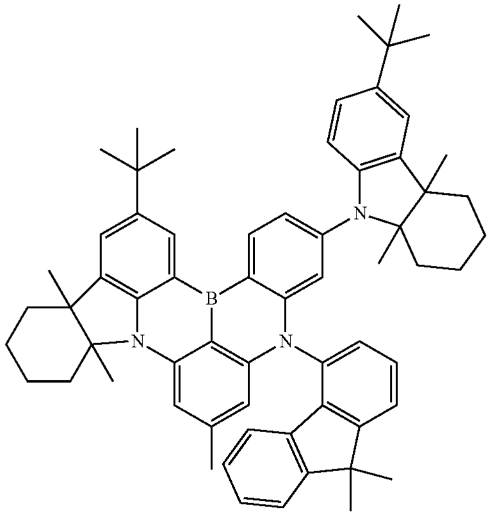
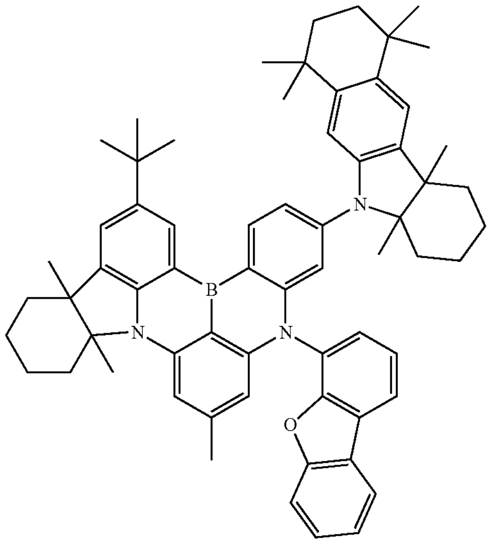
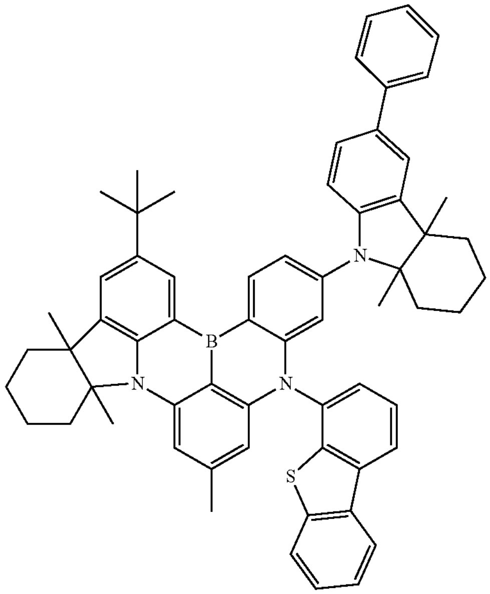

-continued
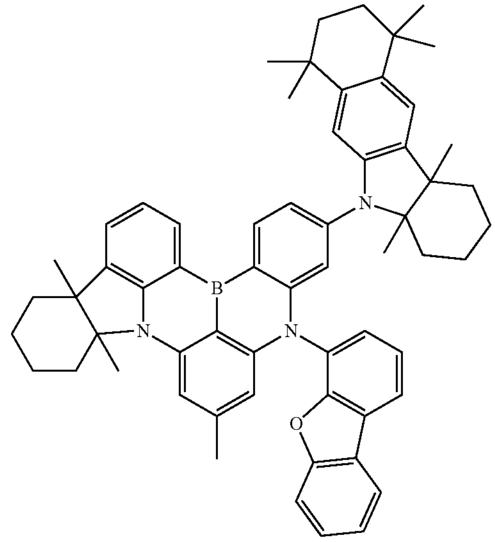
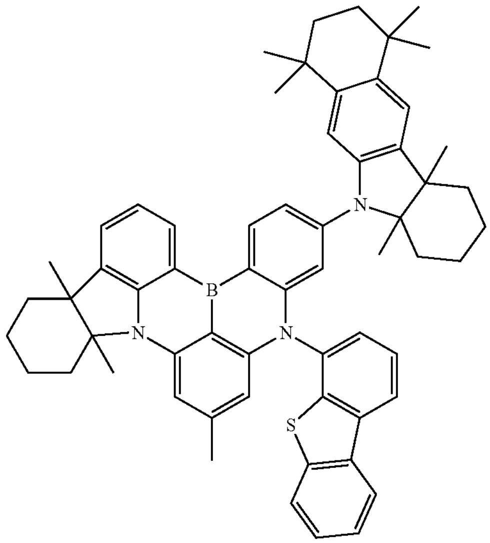 [SMILES: Cc1cc2c3c(c1)N1c4c(cccc4C4(C)CCCCC14C)B3c1ccc(N3c4cc5c(cc4C4(C)CCCCC34C)C(C)(C)CCC5(C)C)cc1N2c1cccc2c1sc1ccccc12]
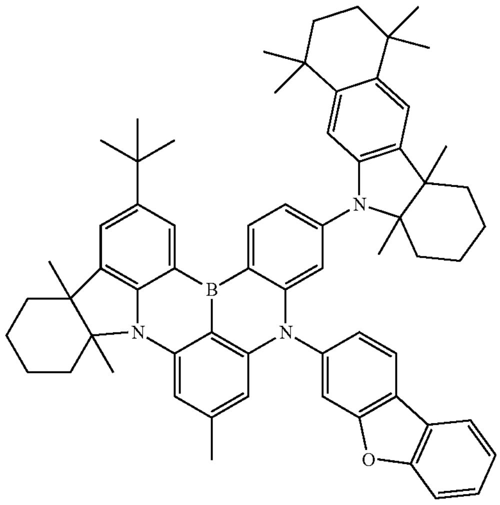
-continued
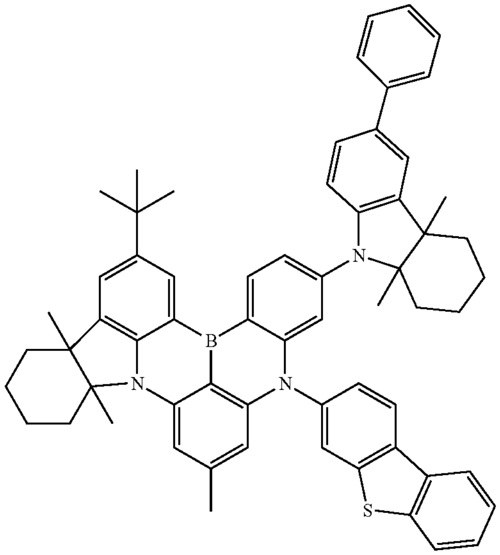
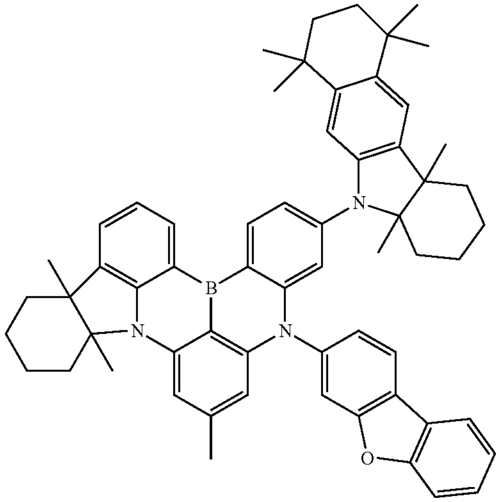
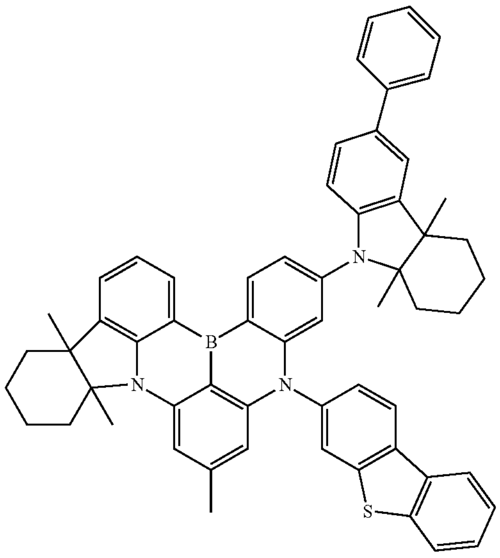

-continued
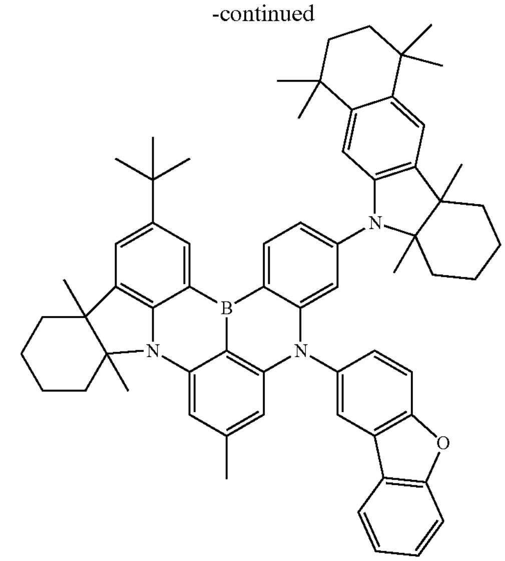
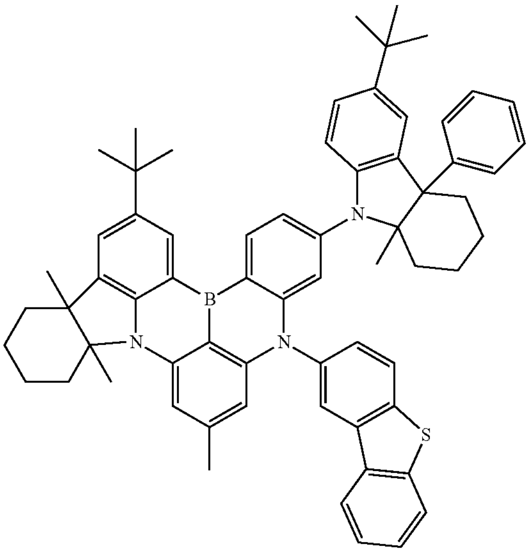
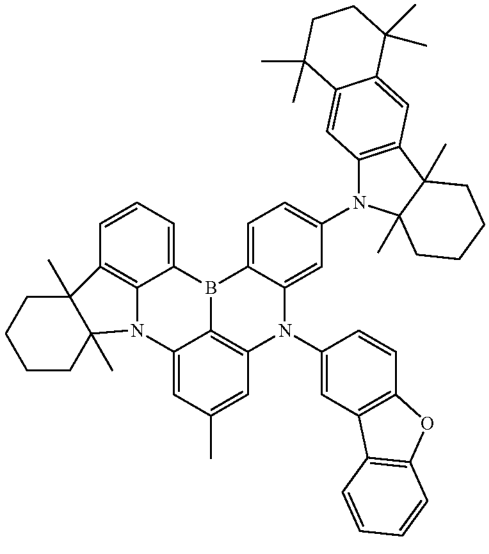
-continued
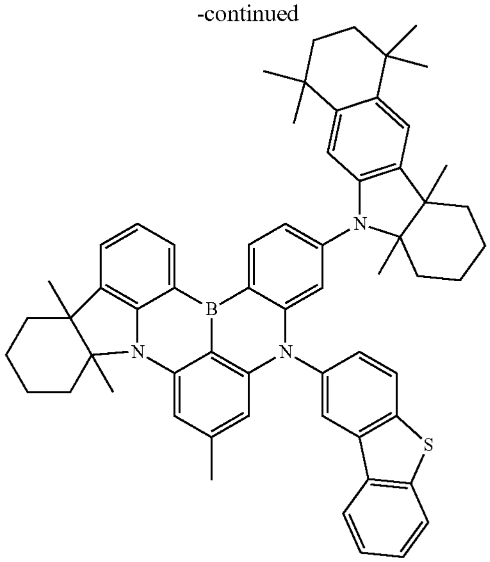
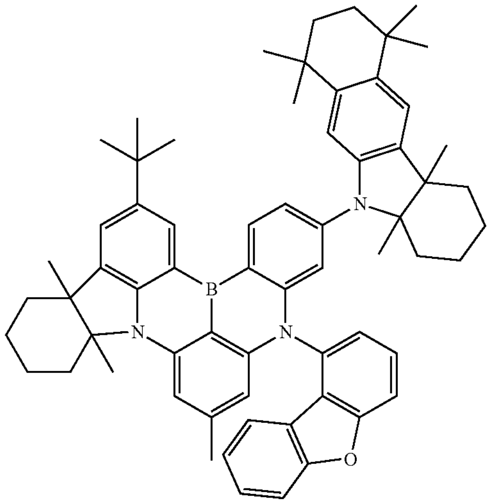
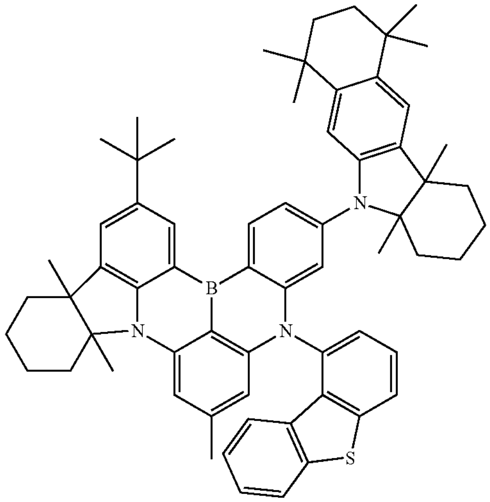

-continued
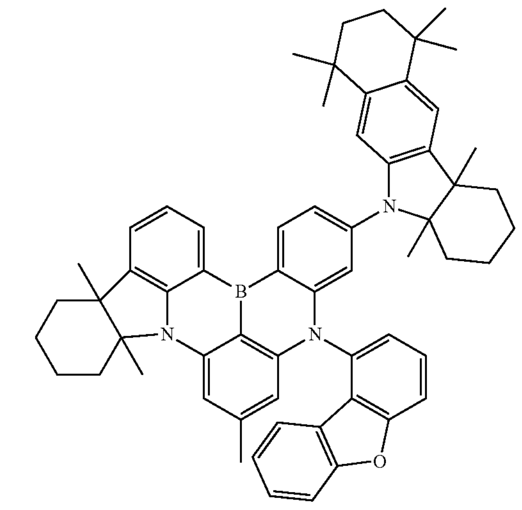
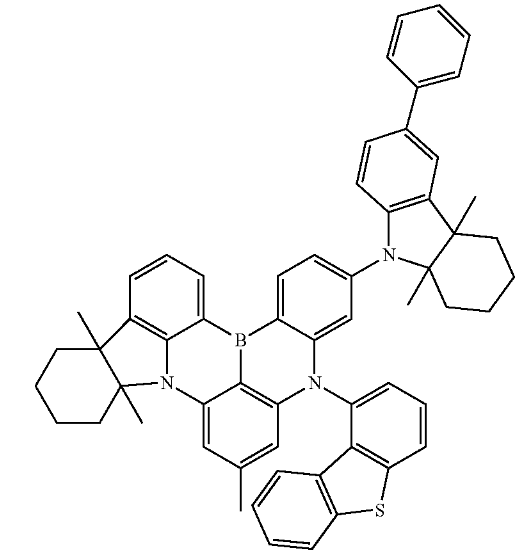
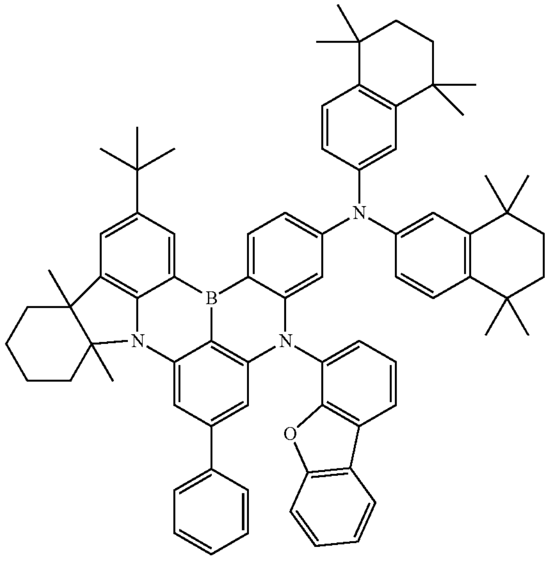
-continued
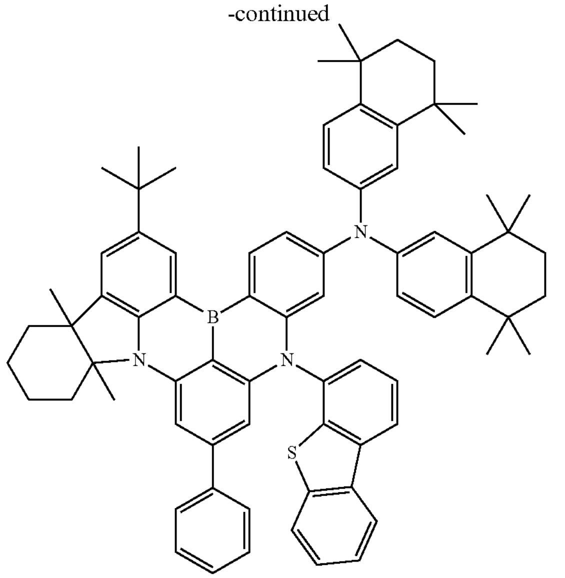
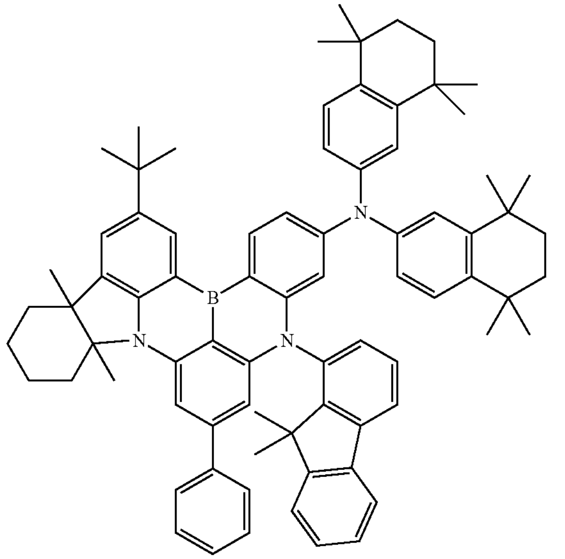
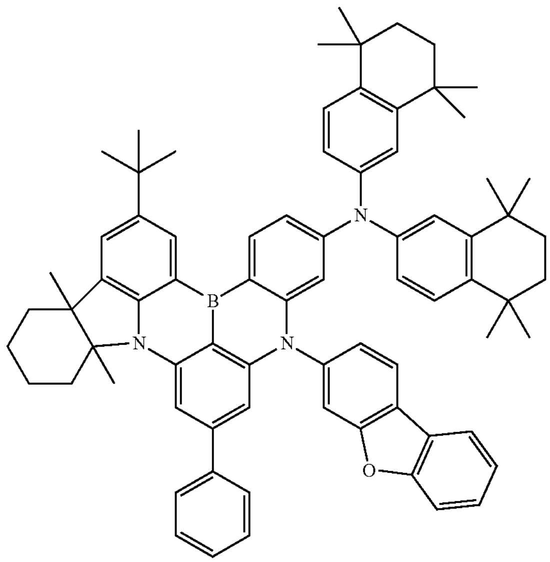

-continued
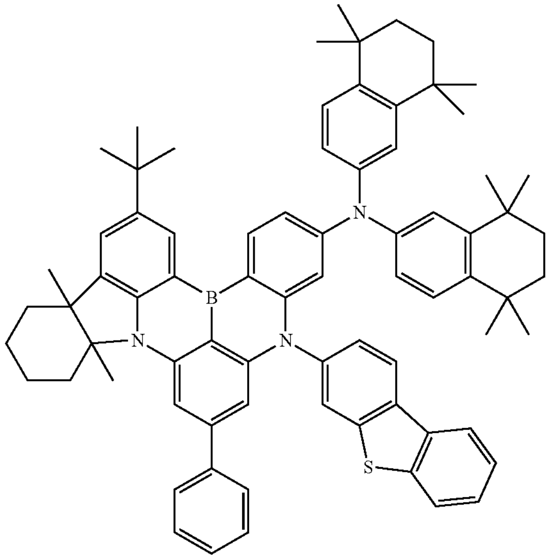
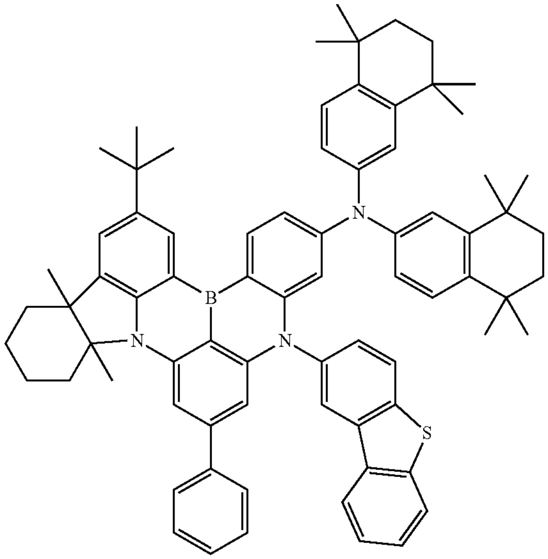
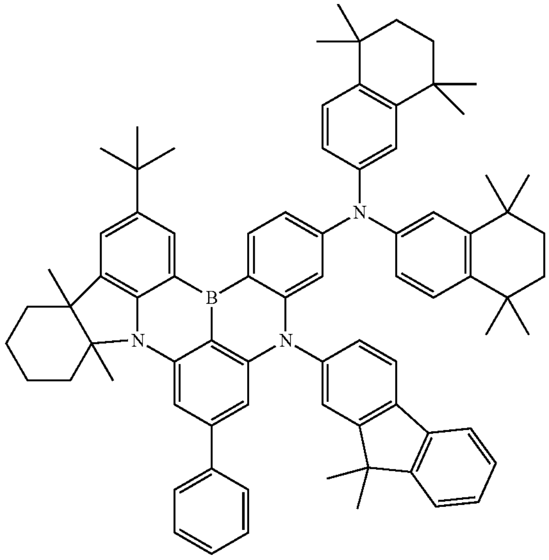
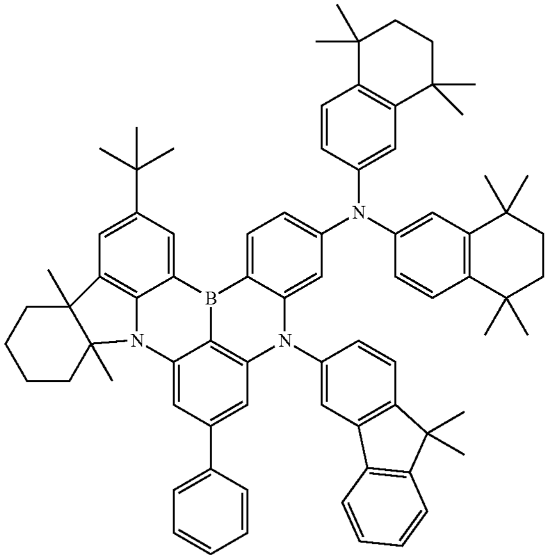
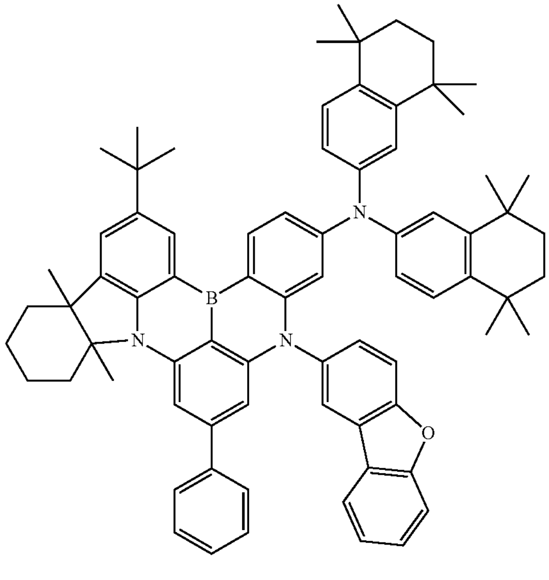
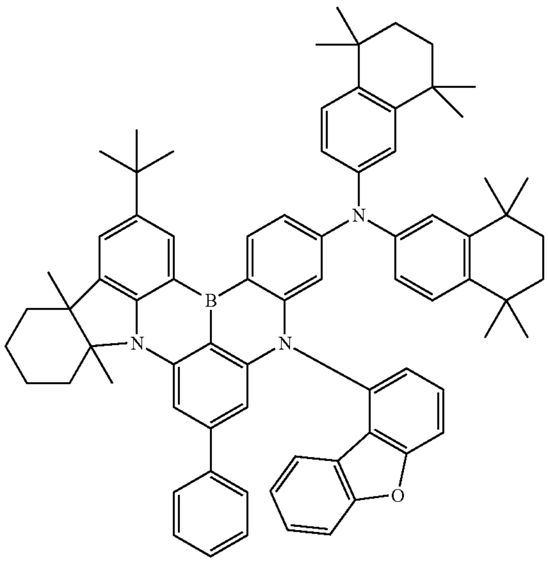
-continued -continued
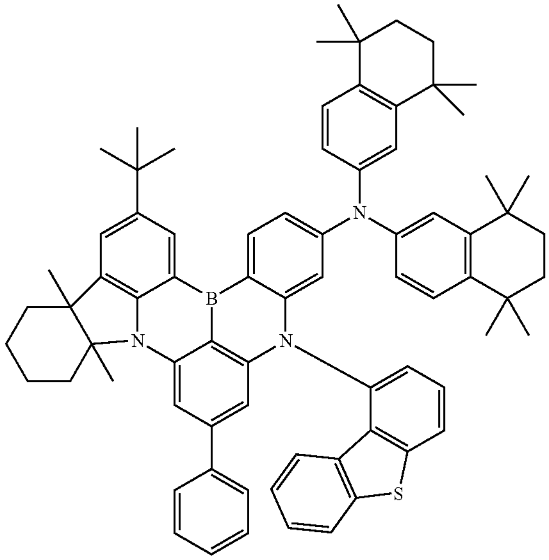
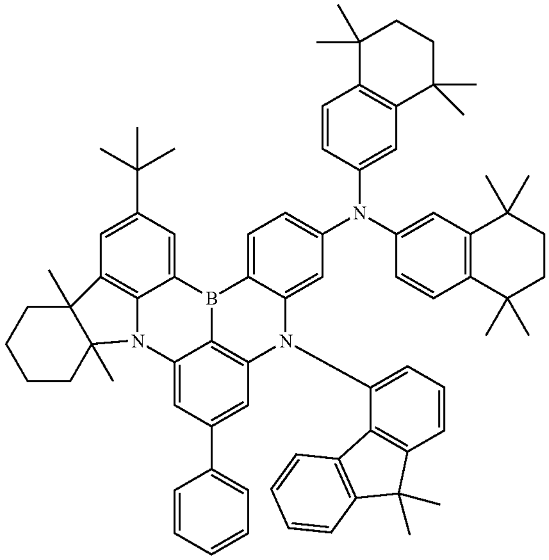
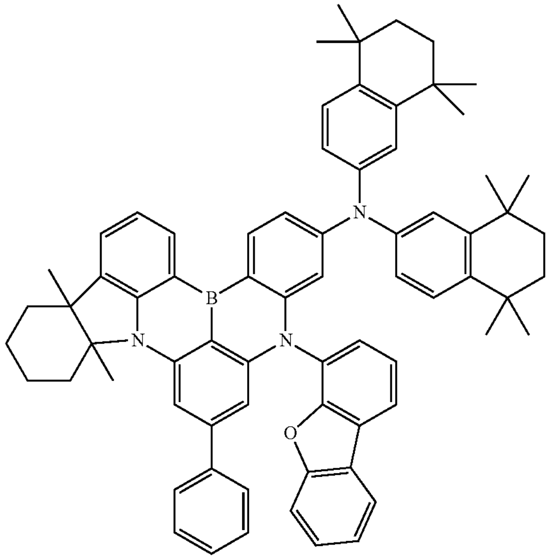
-continued
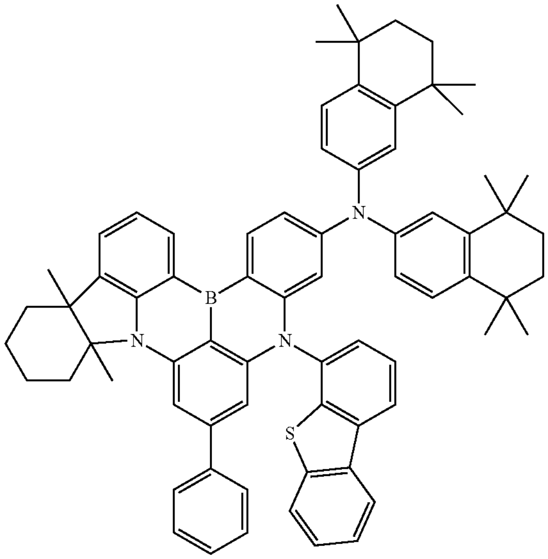
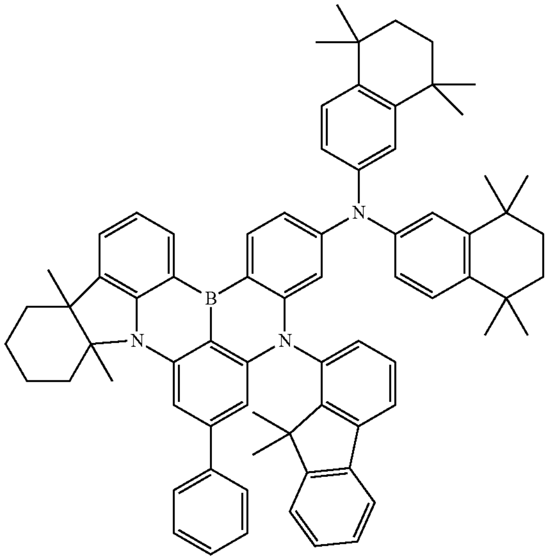
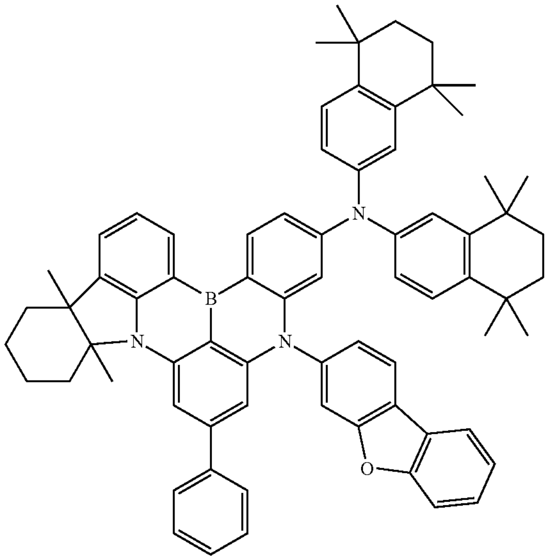

-continued
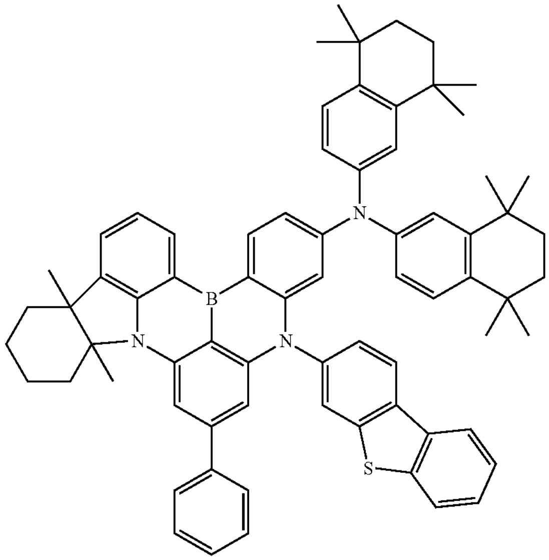
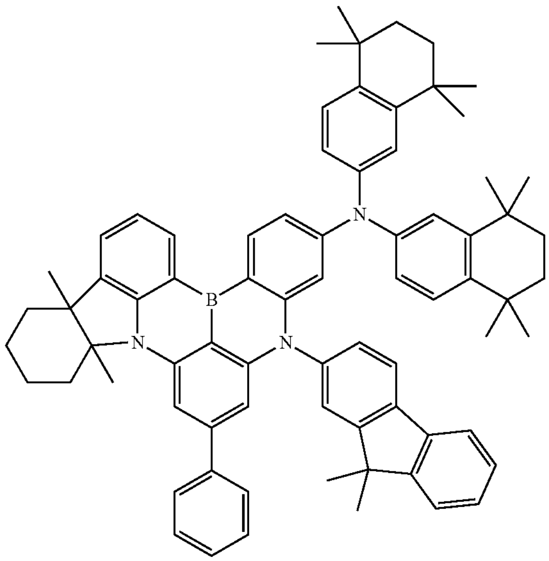
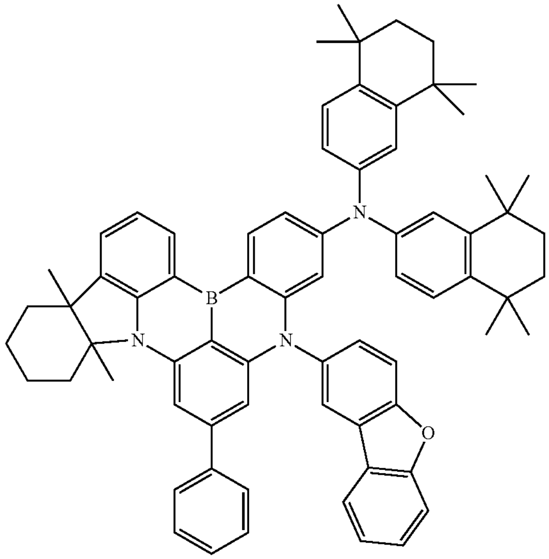
-continued
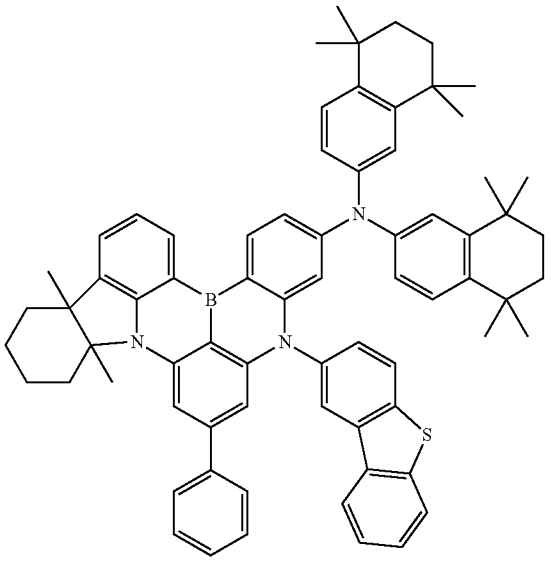
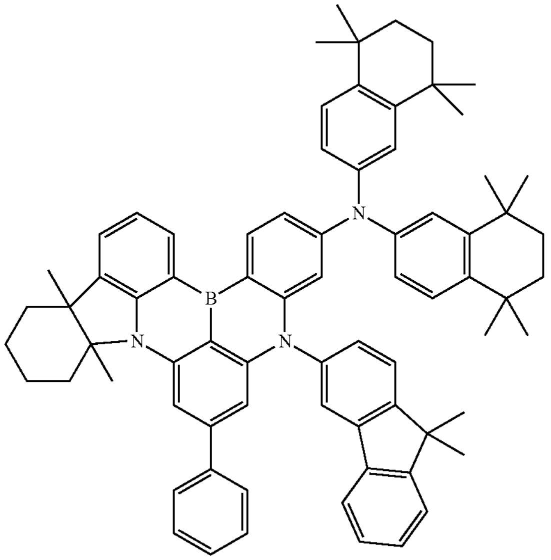
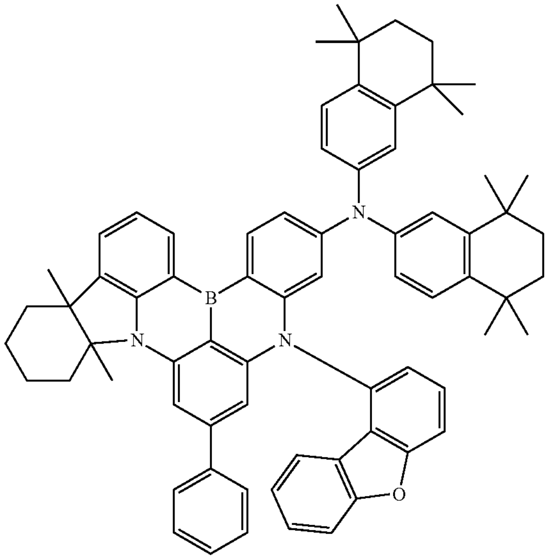

-continued
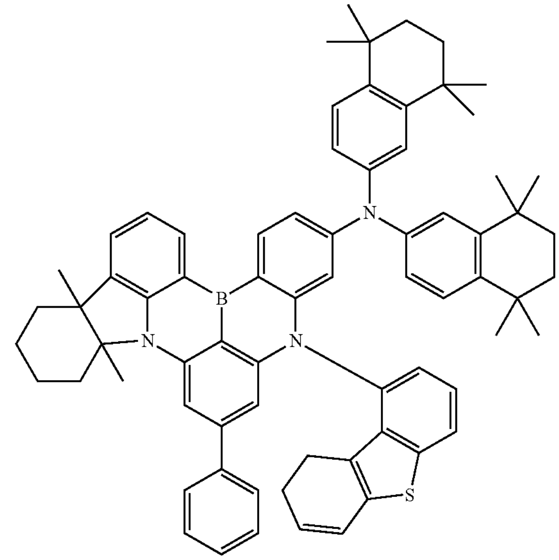
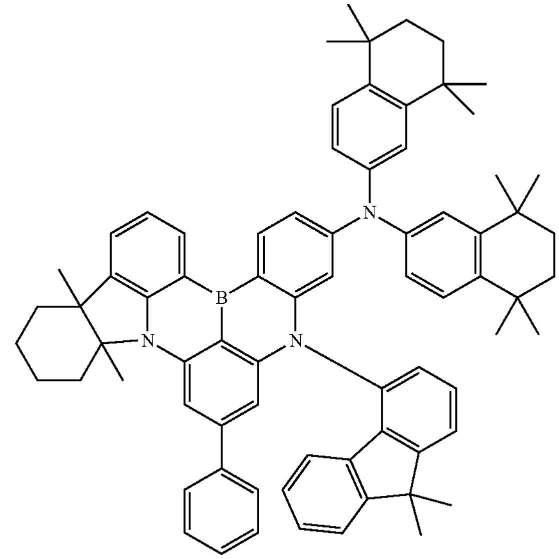
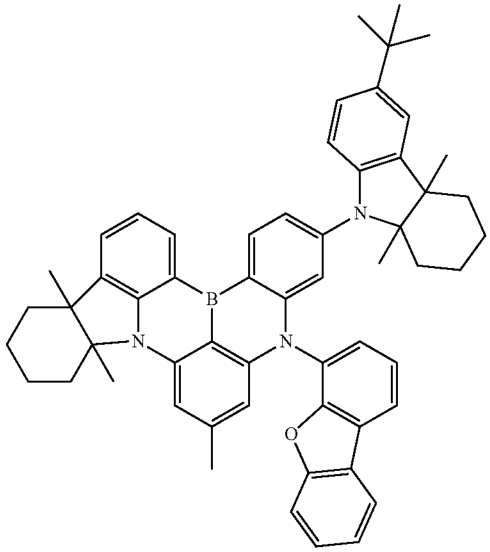
-continued
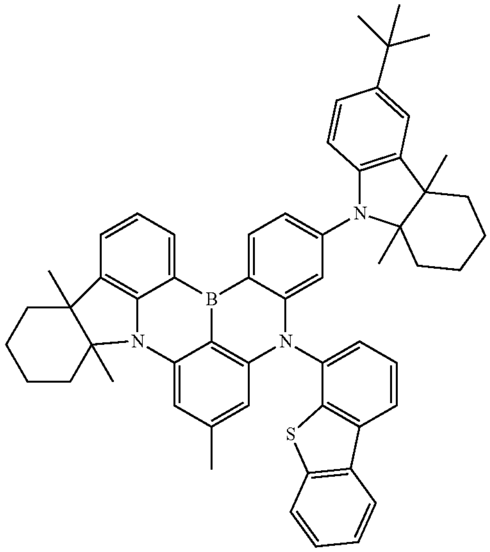
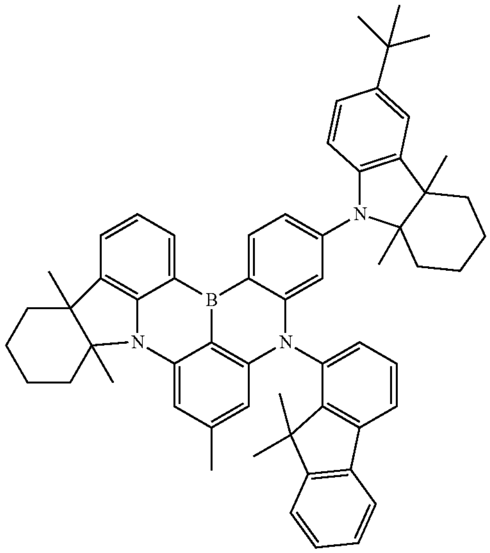
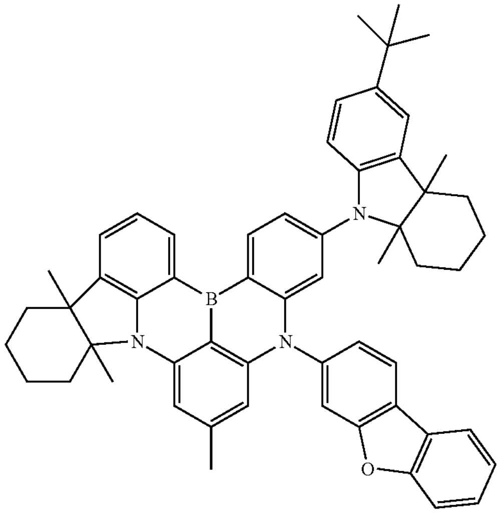

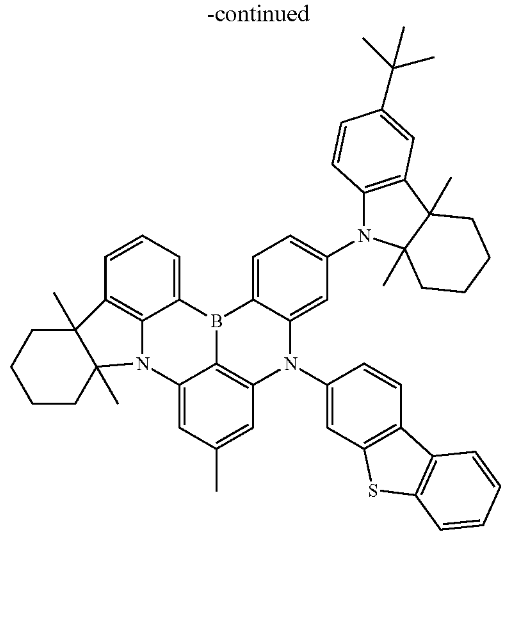
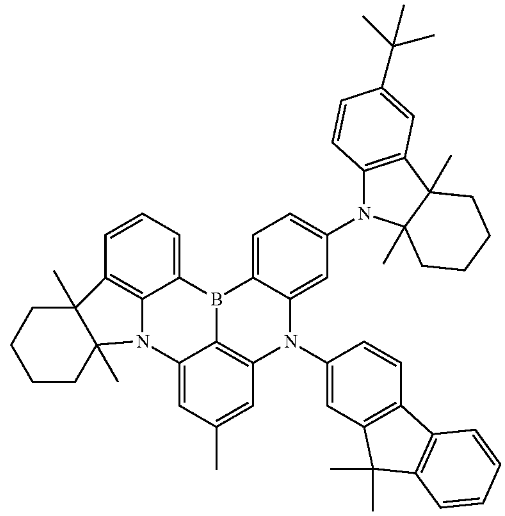
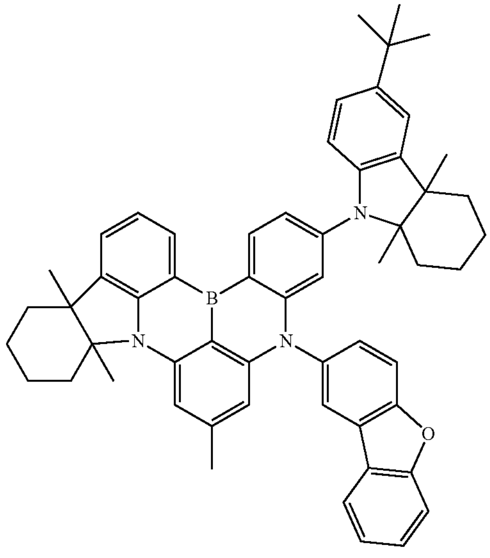
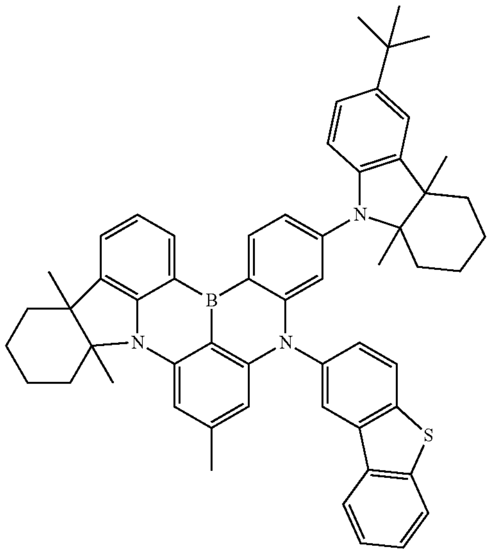
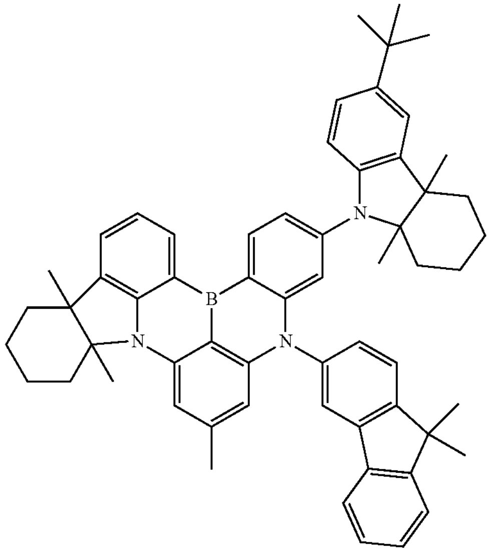
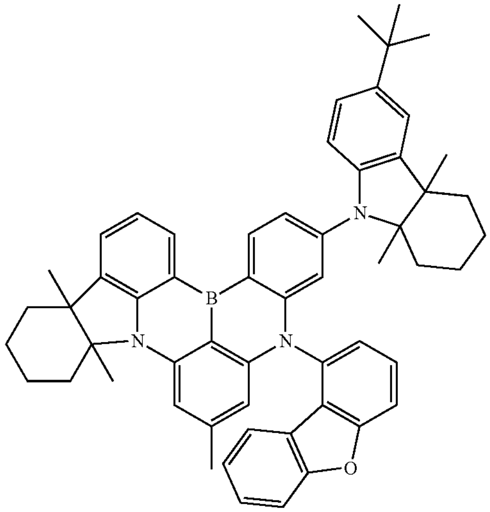

-continued
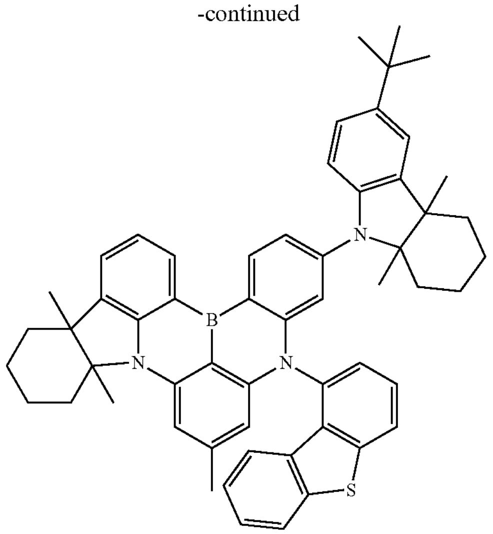
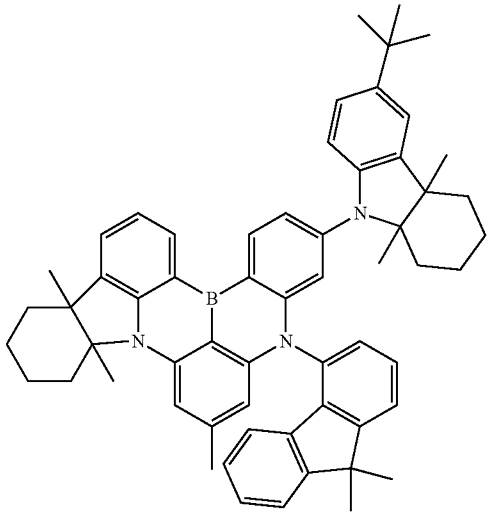
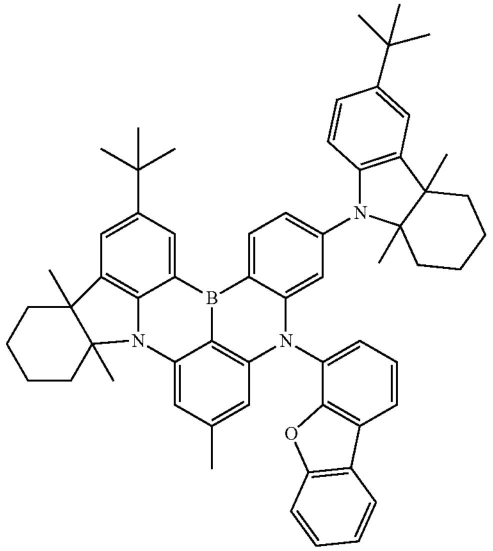
-continued
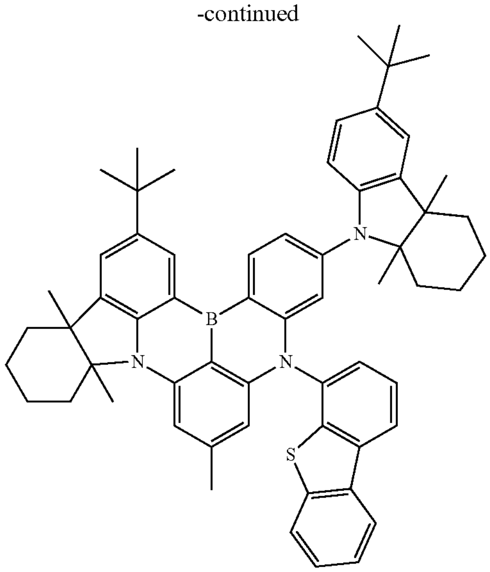
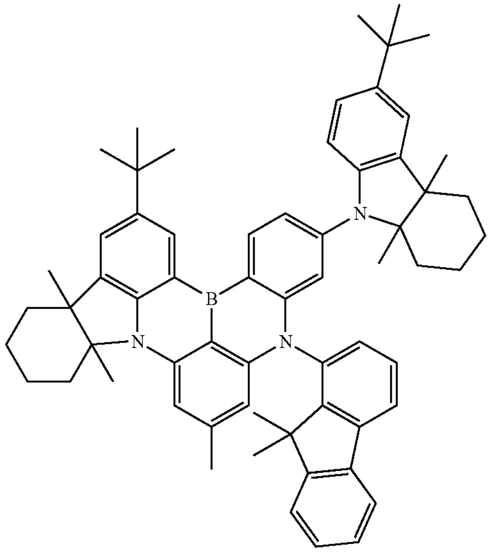
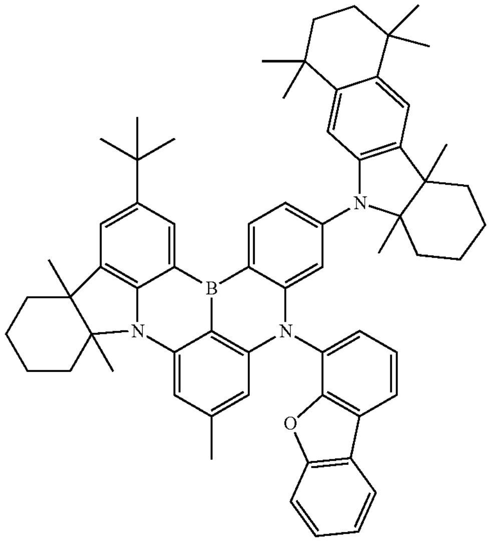

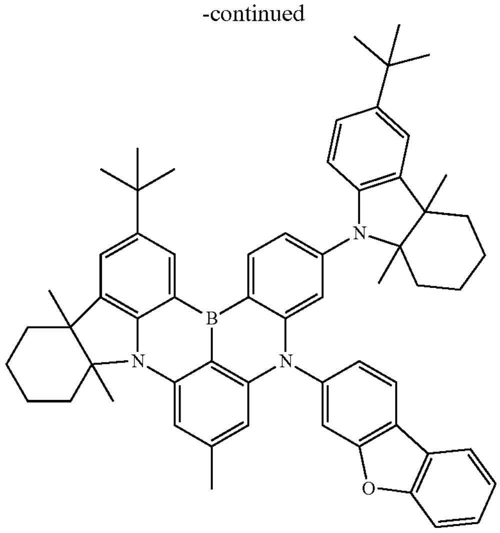
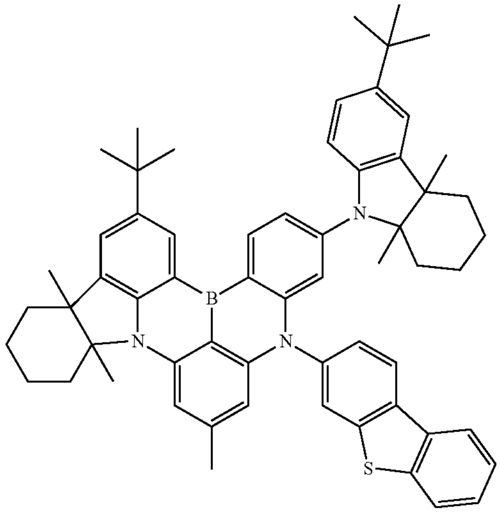
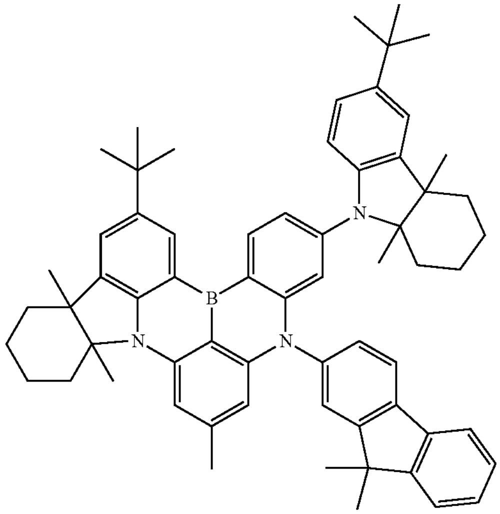 [SMILES: Cc1cc2c3c(c1)N1c4c(cc(C(C)(C)C)cc4C4(C)CCCCC14C)B3c1ccc(N3c4ccc(C(C)(C)C)cc4C4(C)CCCCC34C)cc1N2c1ccc2c(c1)C(C)(C)c1ccccc1-2]
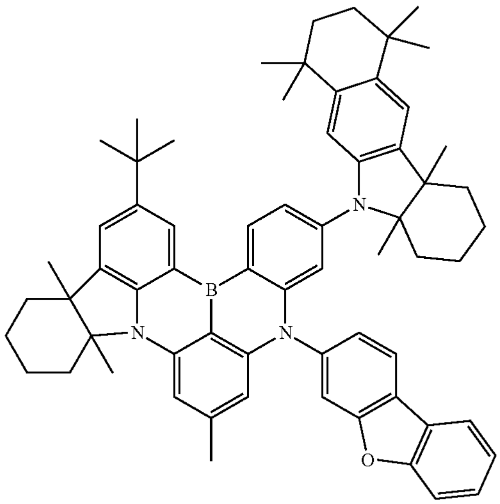
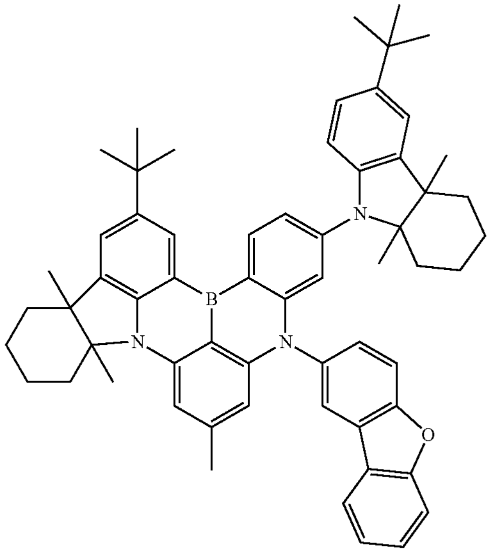
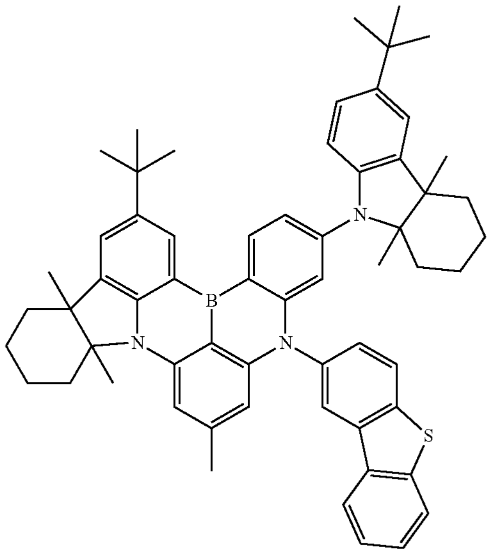

-continued
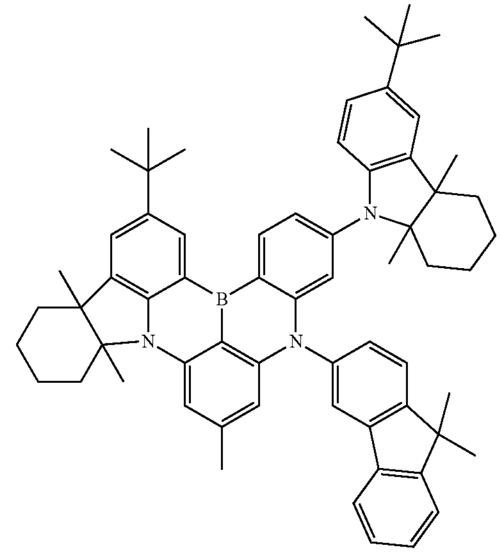 [SMILES: Cc1cc2c3c(c1)N1c4c(cc(C(C)(C)C)cc4C4(C)CCCCC14C)B3c1ccc(N3c4ccc(C(C)(C)C)cc4C4(C)CCCCC34C)cc1N2c1ccc2c(c1)-c1ccccc1C2(C)C]
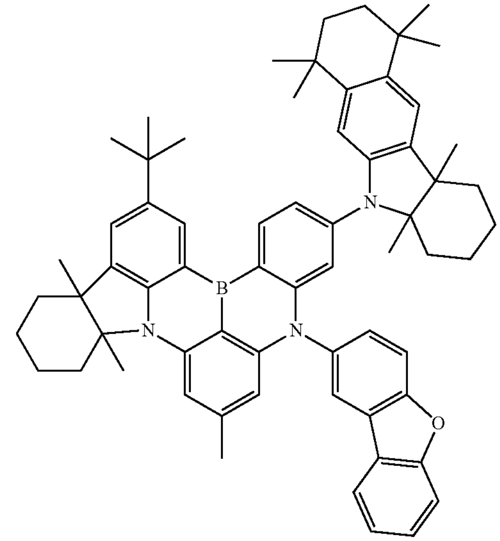
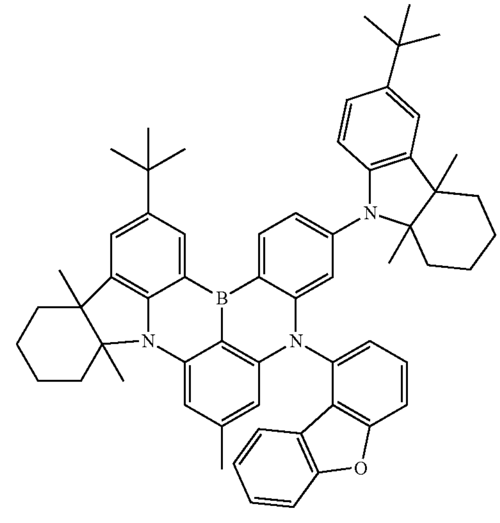
-continued
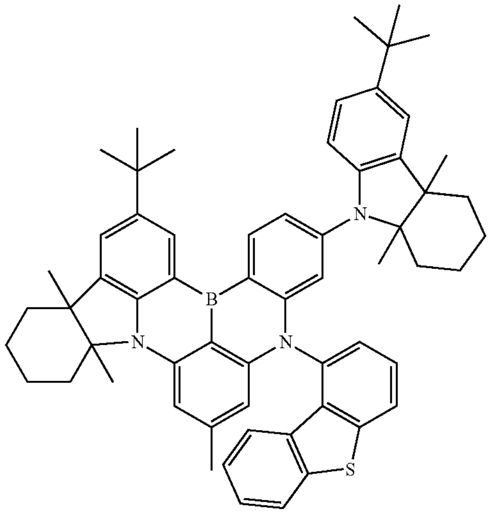
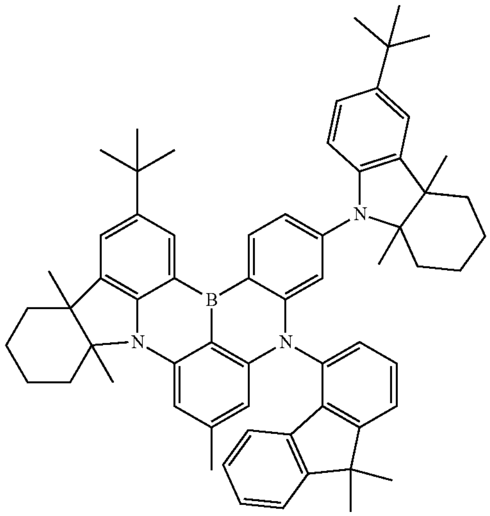
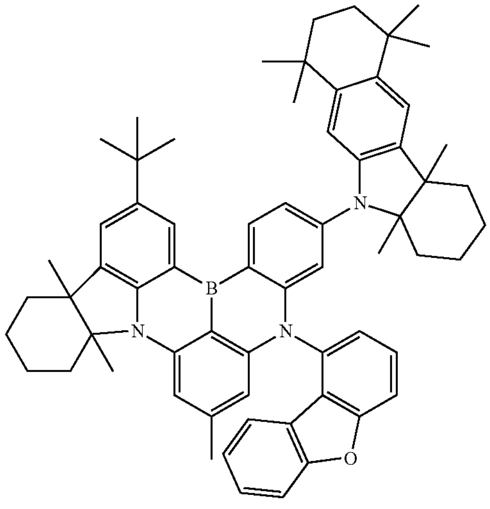

-continued
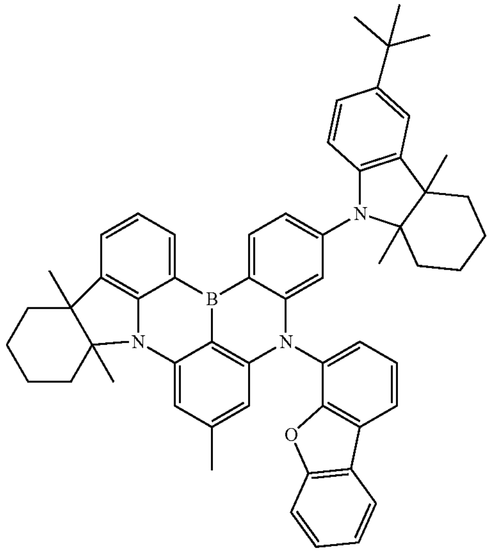
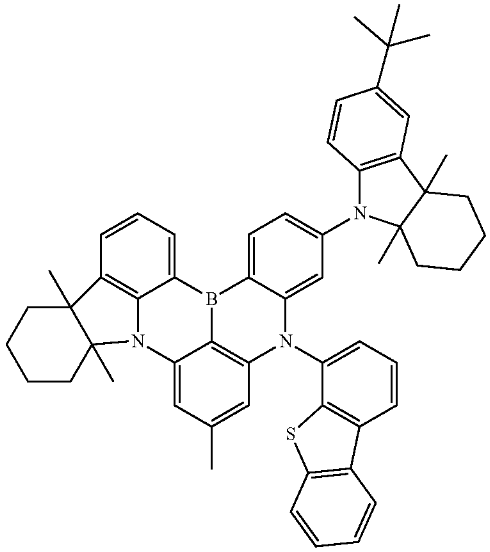
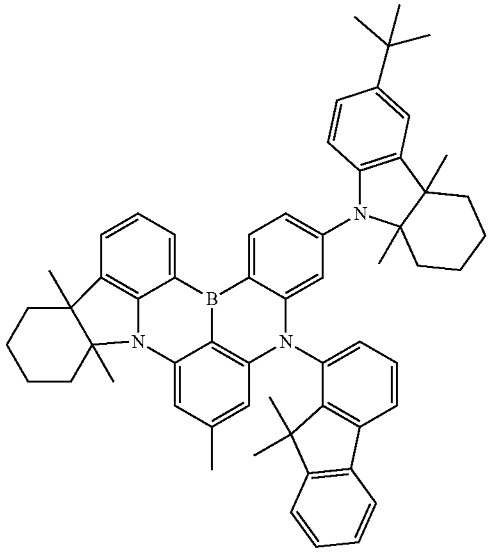
-continued
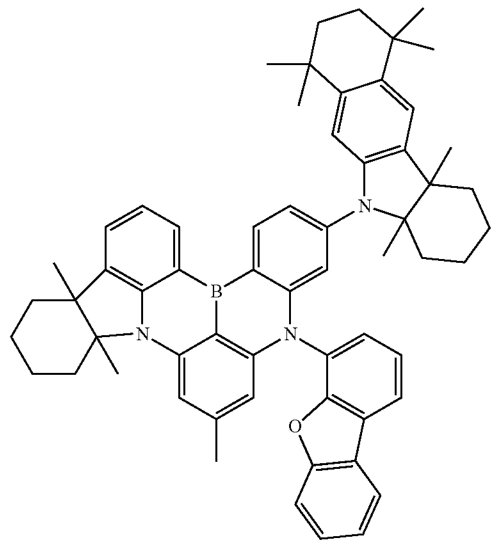
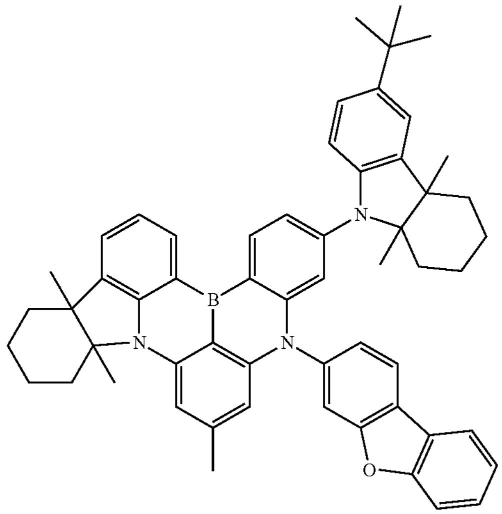
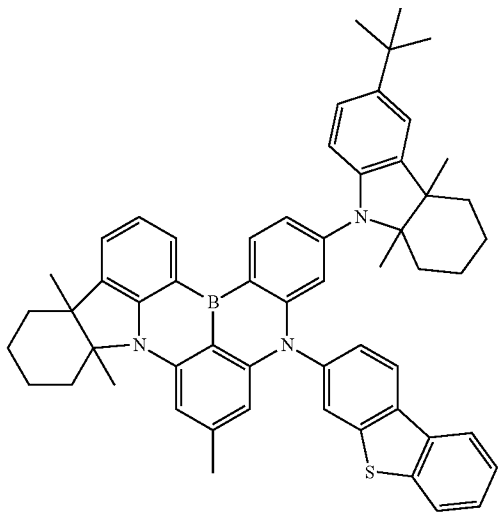

-continued
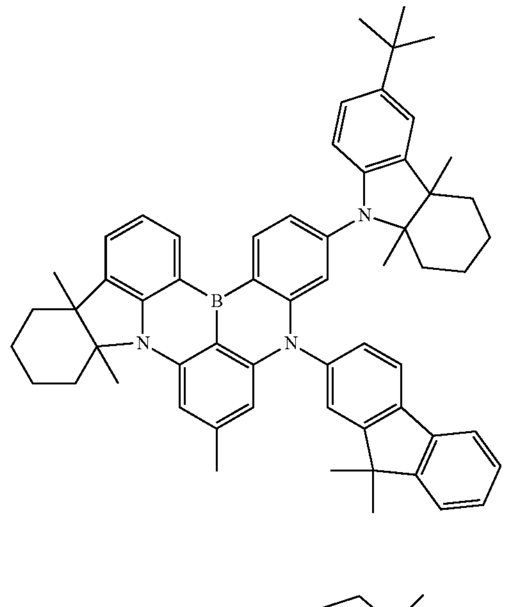
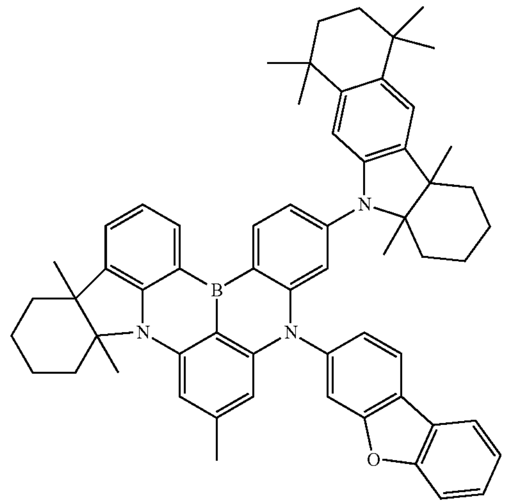
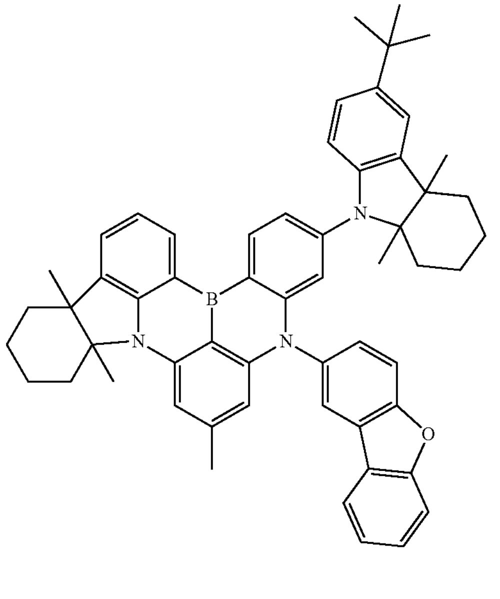
-continued
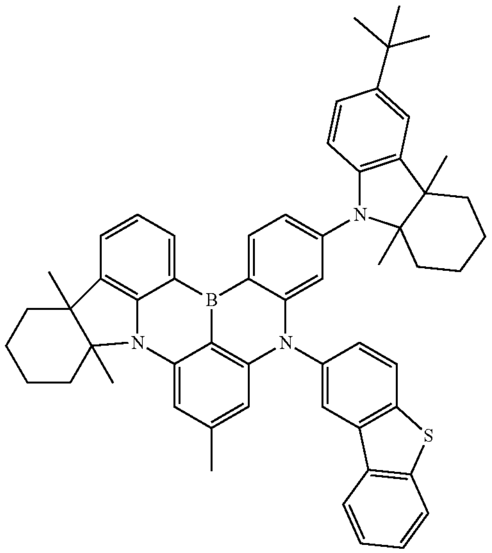
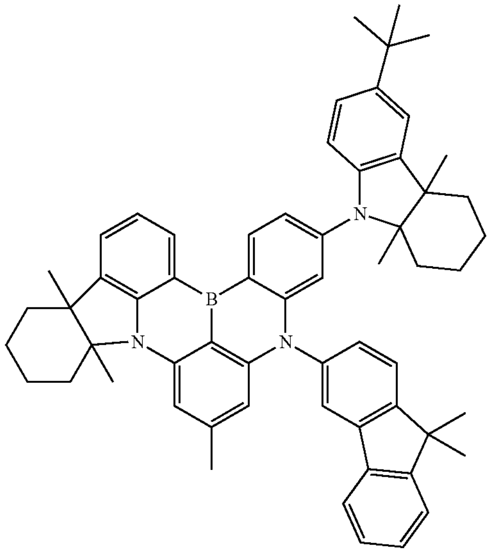
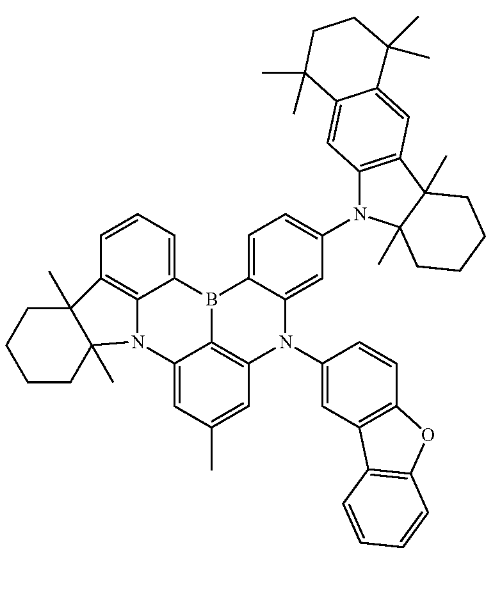

-continued
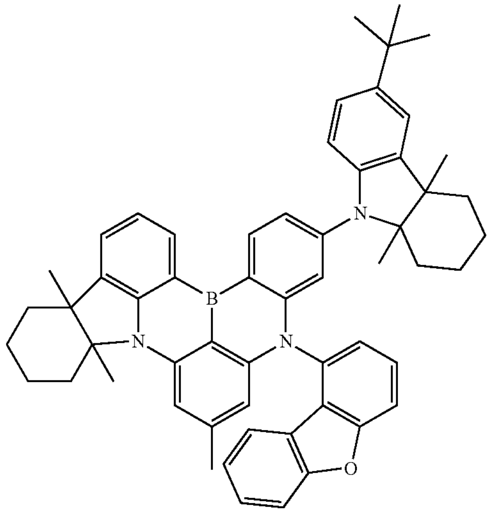
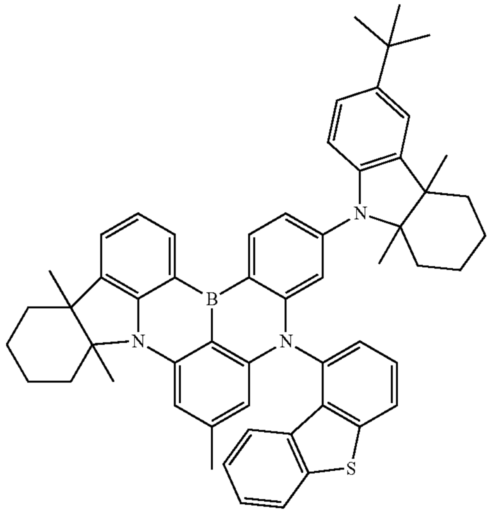
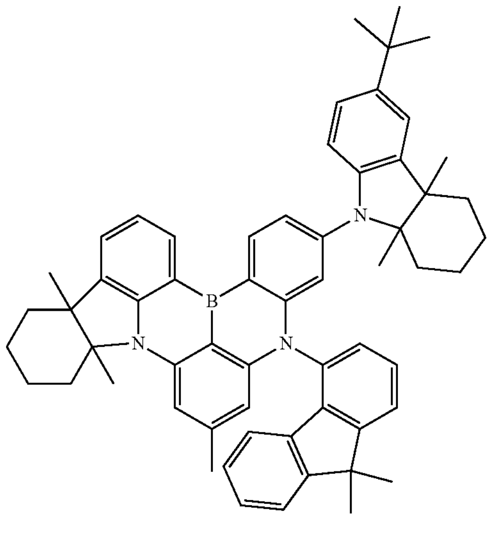
-continued
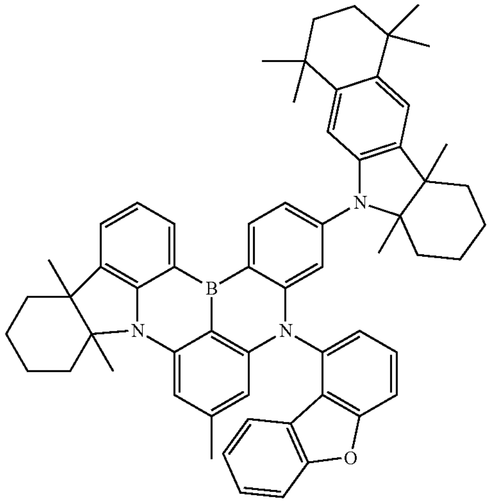
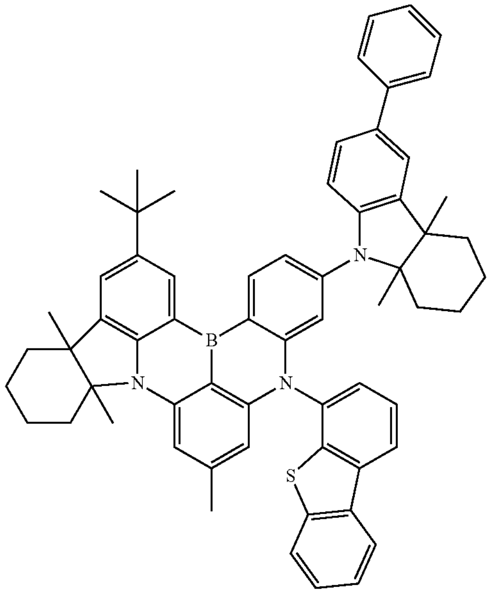
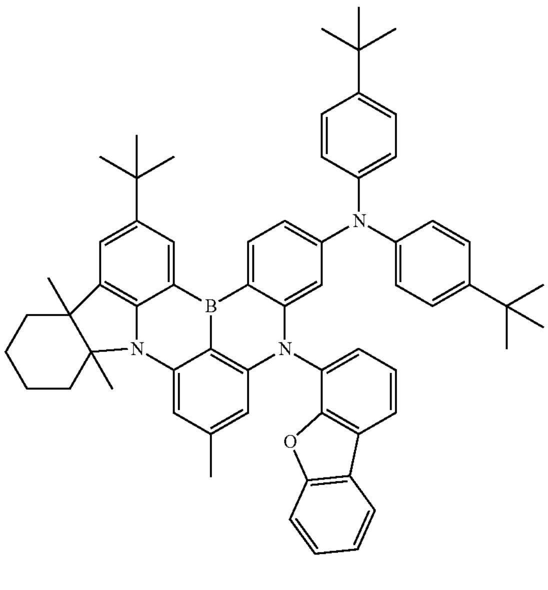

-continued
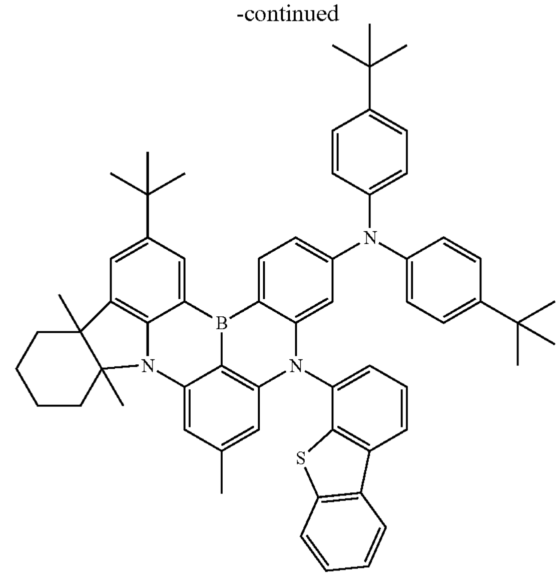
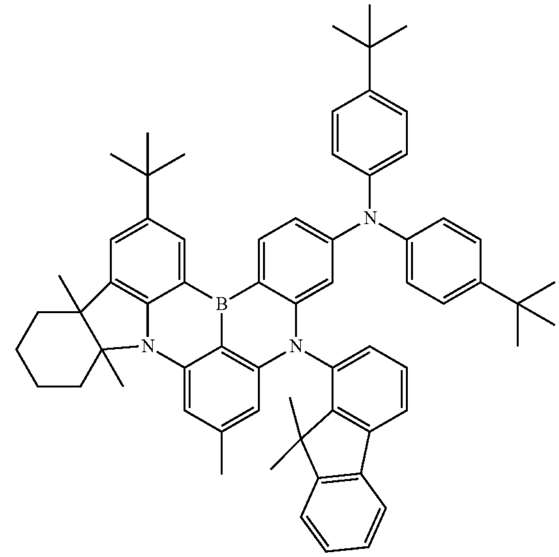
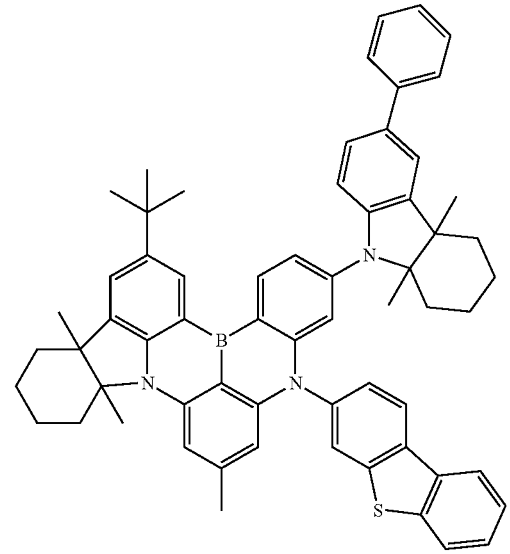
-continued
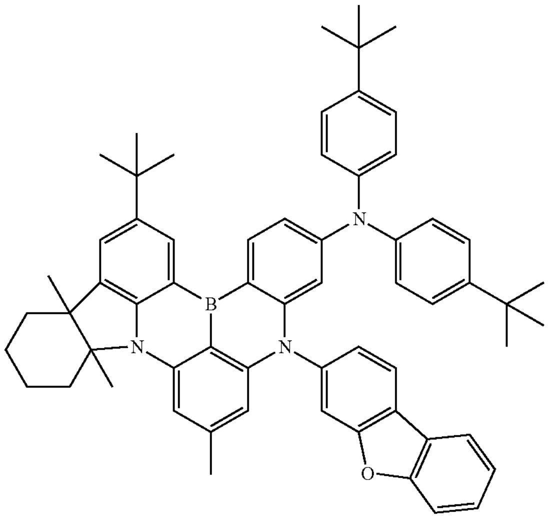
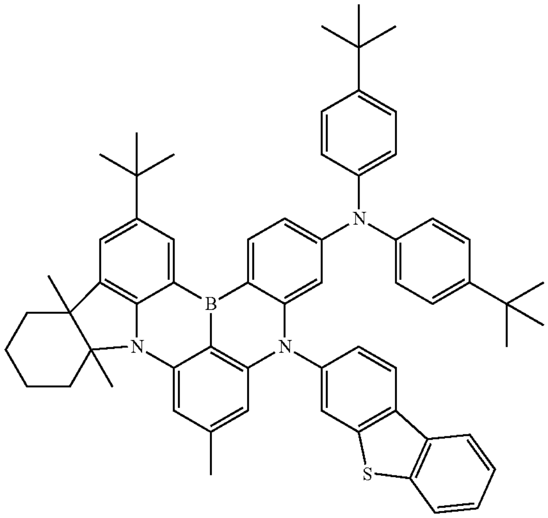
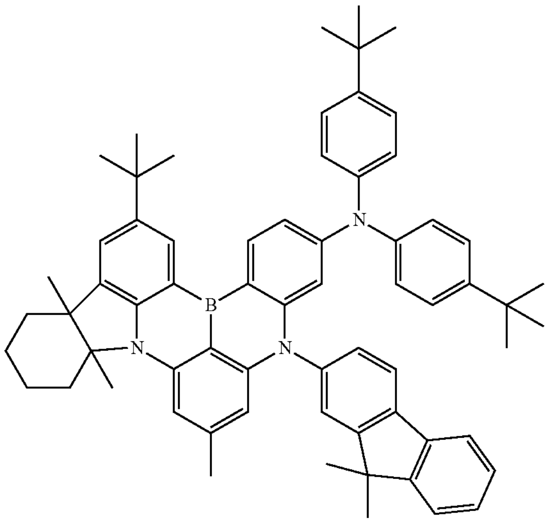

-continued
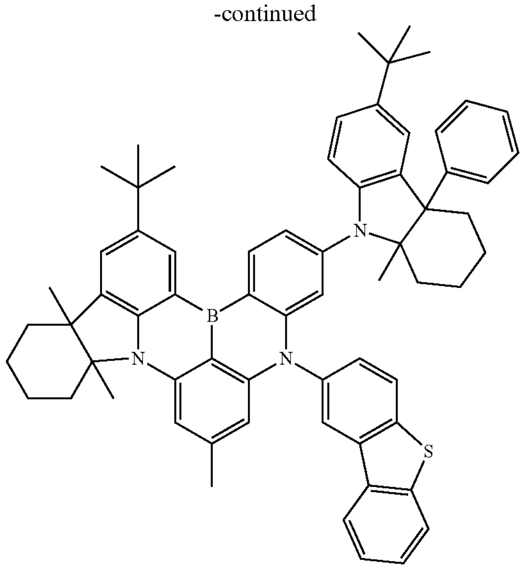
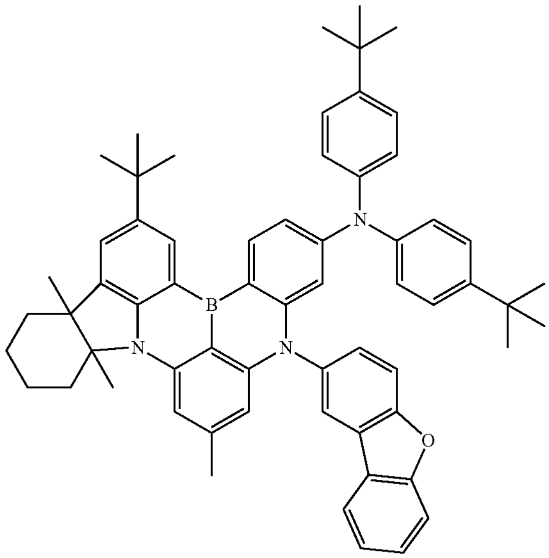
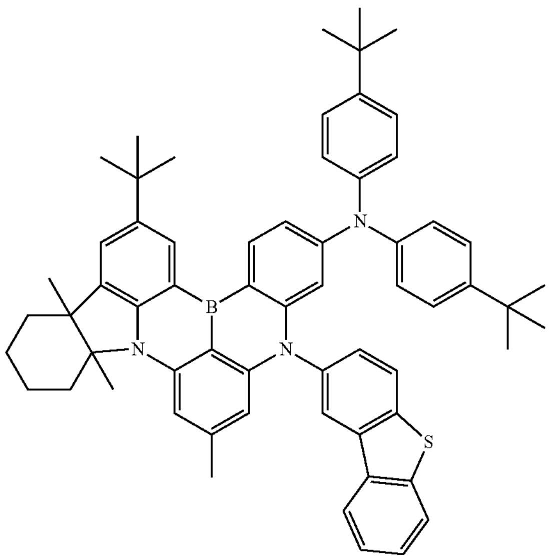
-continued
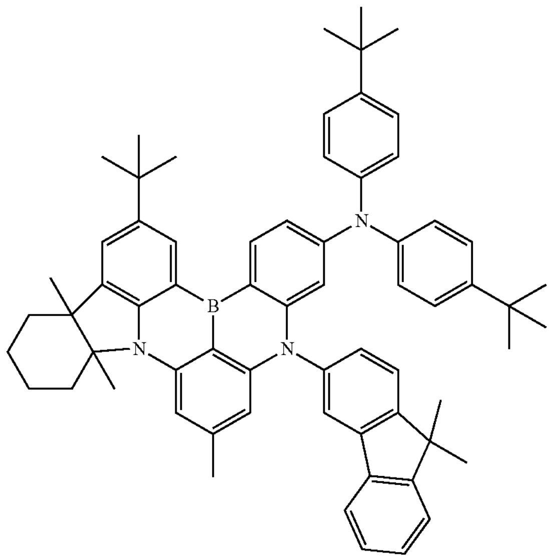
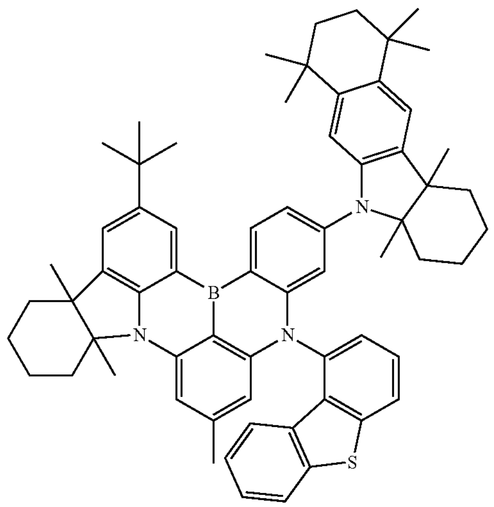
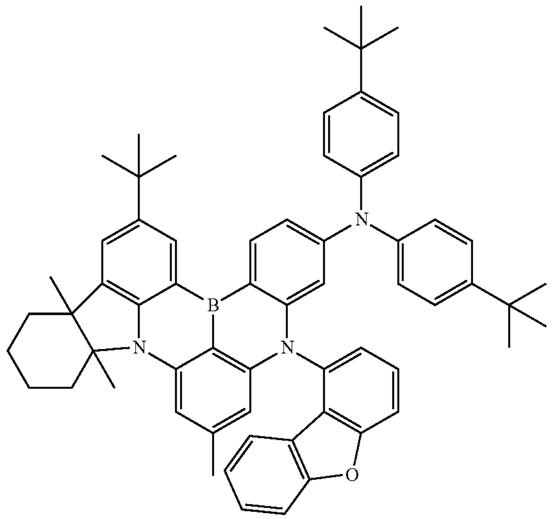

-continued
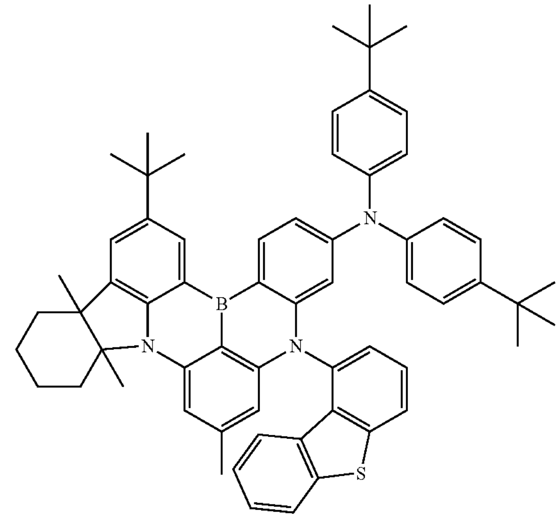
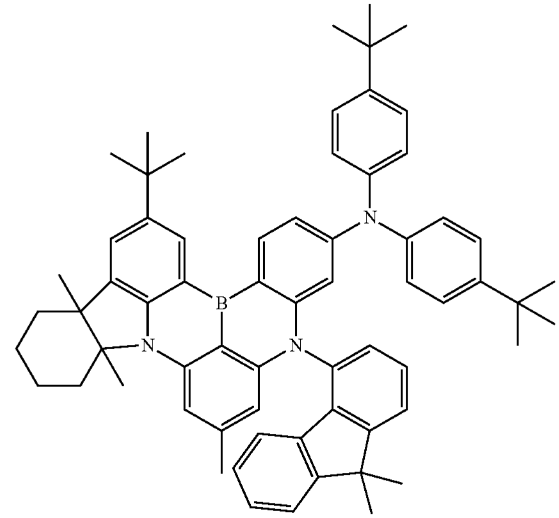 [SMILES: Cc1cc2c3c(c1)N1c4c(cc(C(C)(C)C)cc4C4(C)CCCCC14C)B3c1ccc(N(c3ccc(C(C)(C)C)cc3)c3ccc(C(C)(C)C)cc3)cc1N2c1cccc2c1-c1ccccc1C2(C)C]
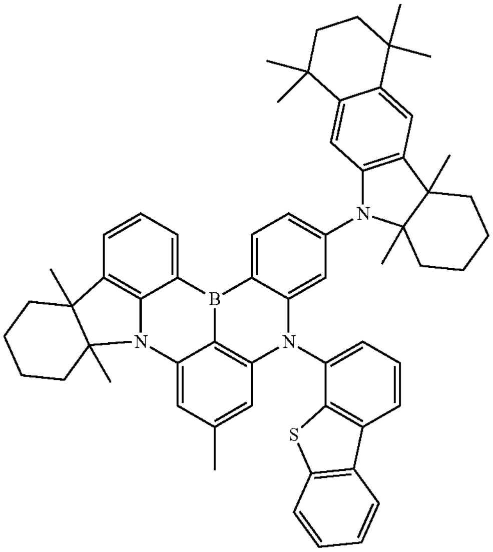
-continued
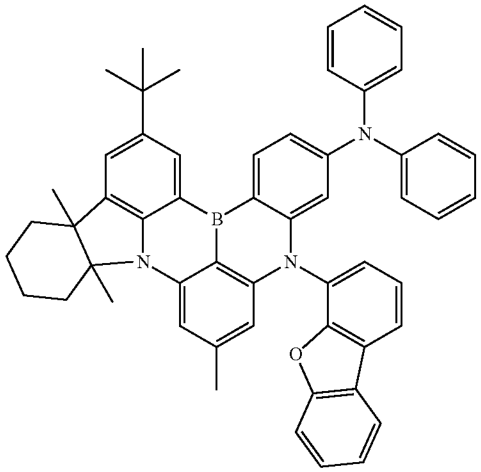
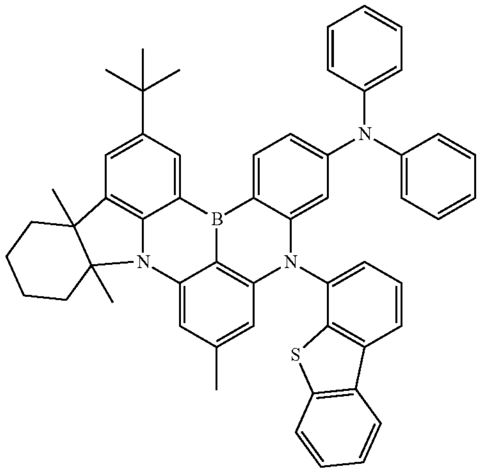
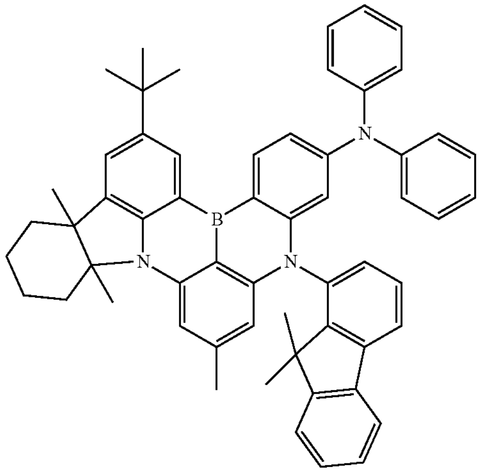

-continued
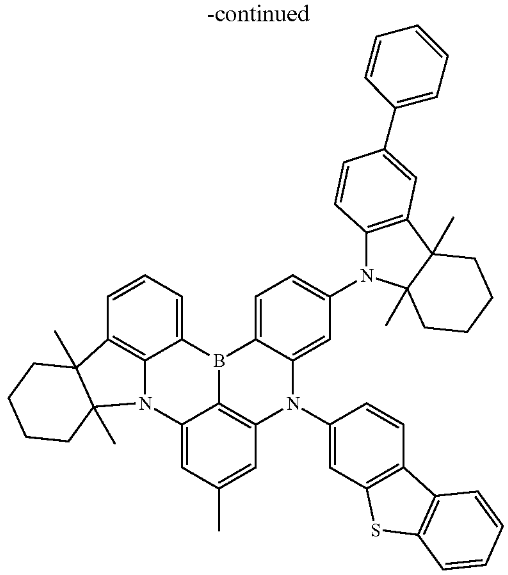
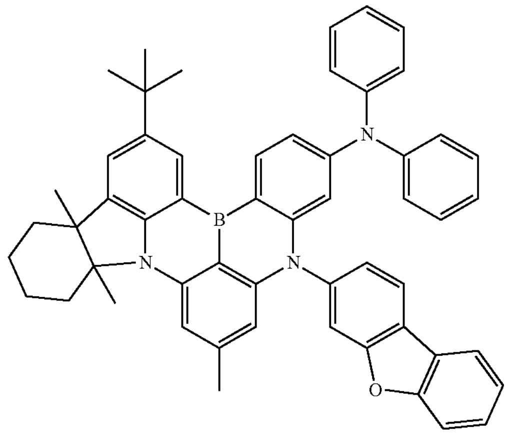
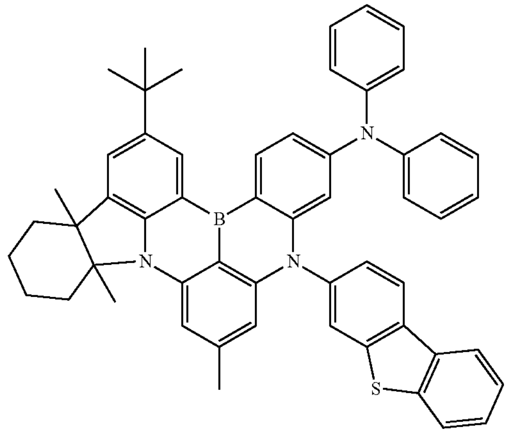
-continued
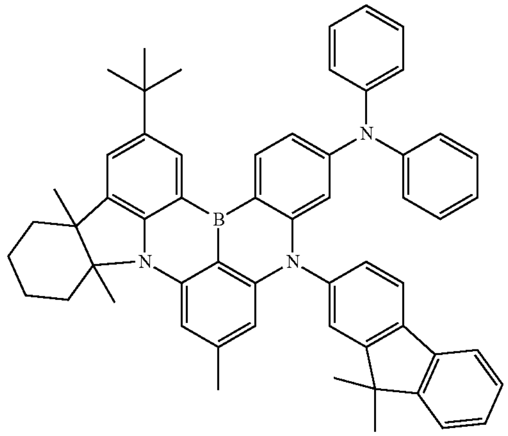
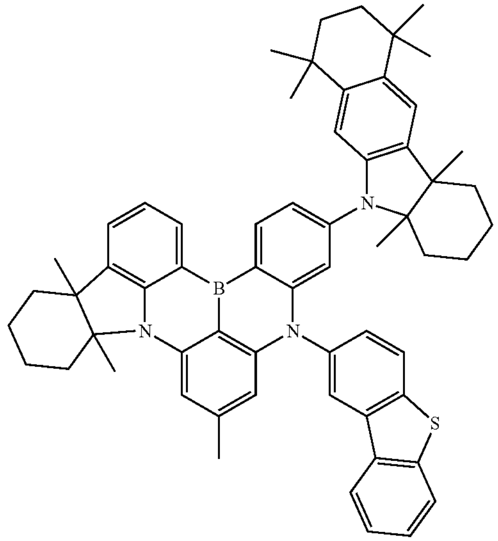
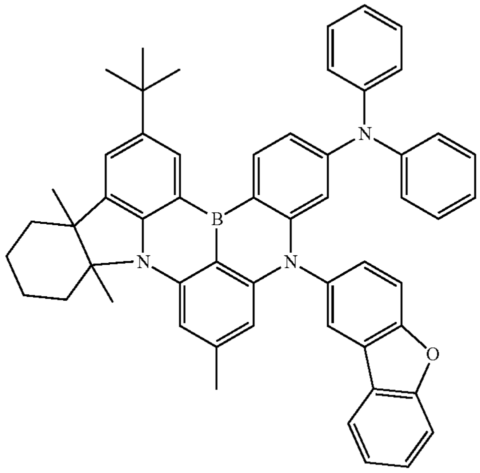

-continued
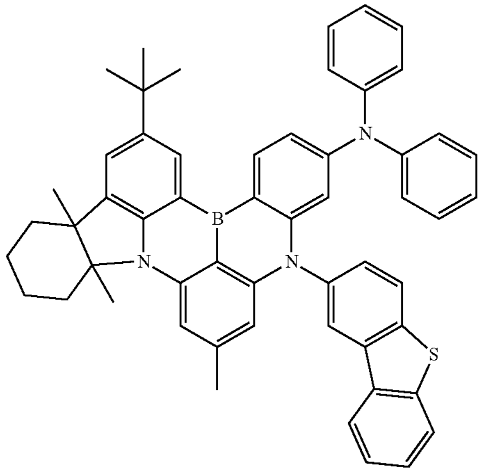
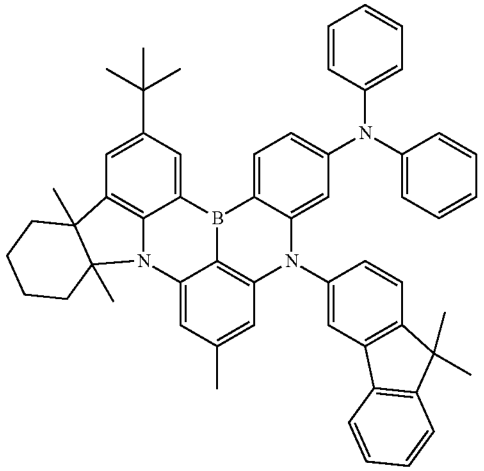
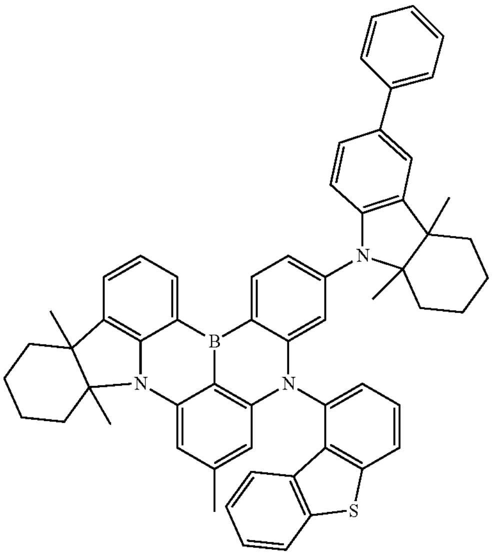
-continued
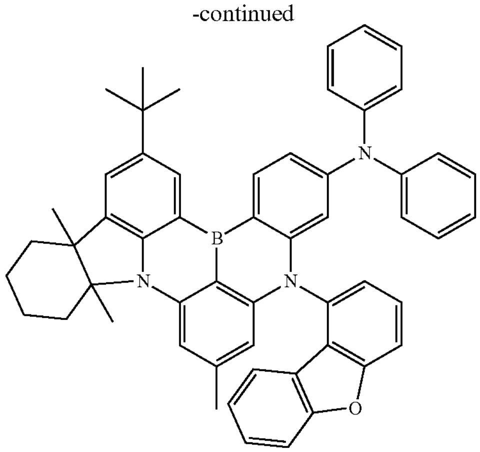
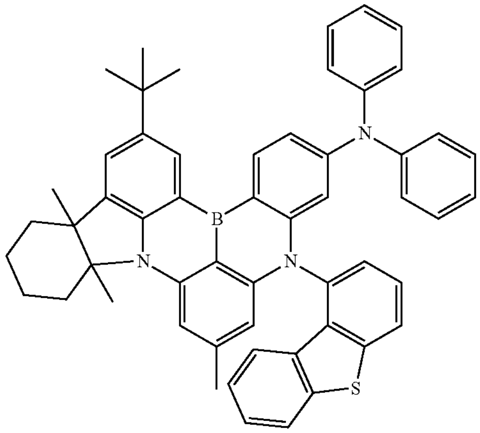
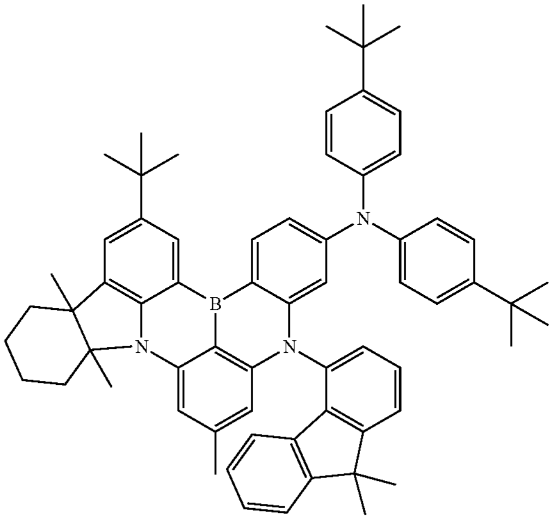

-continued
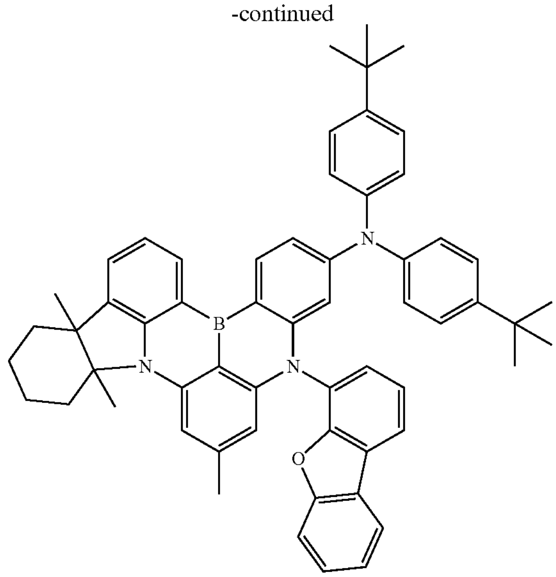
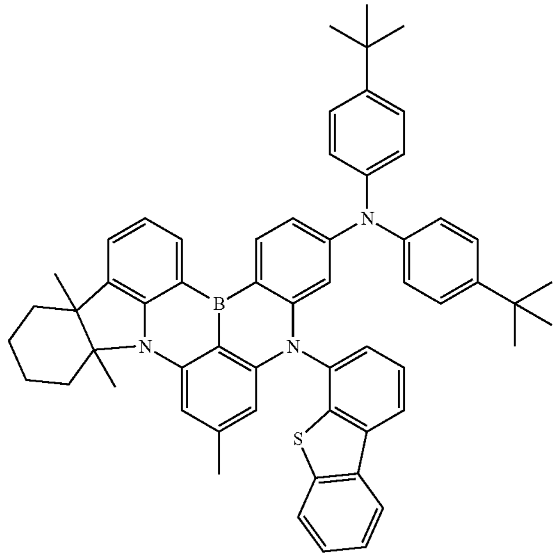
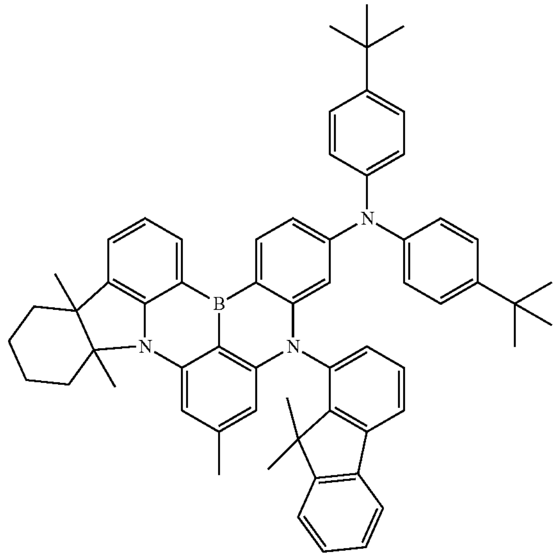
-continued
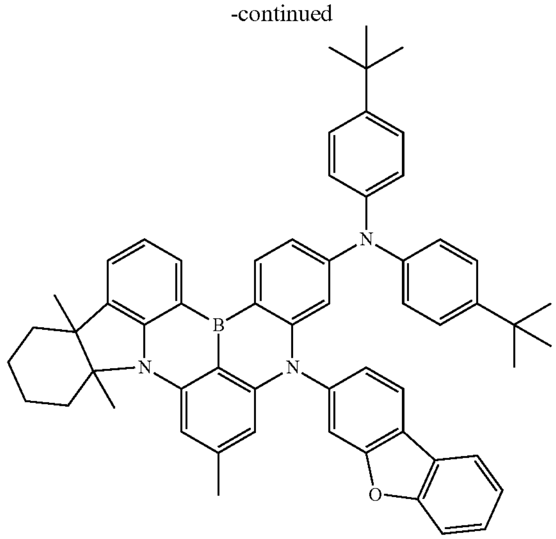
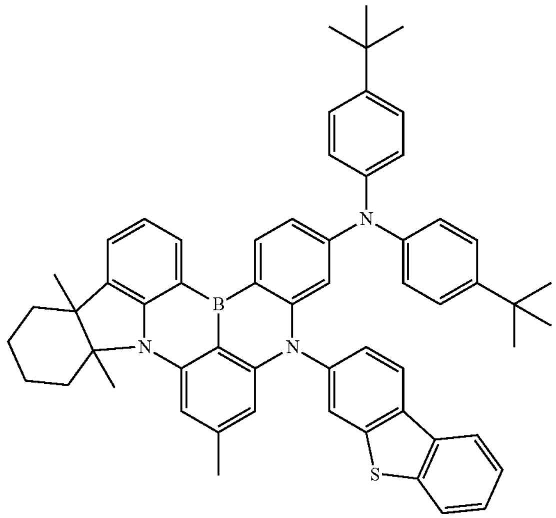
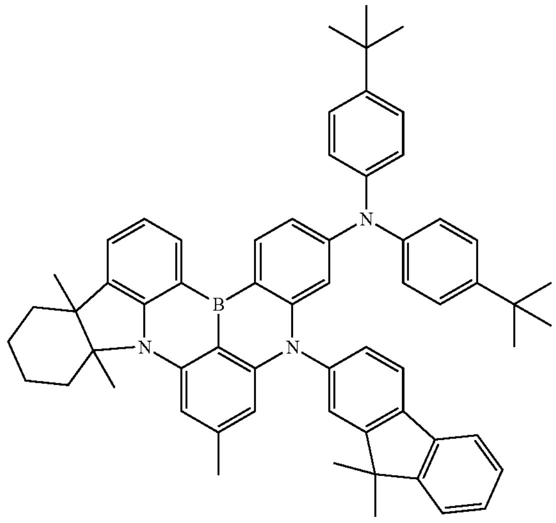

-continued
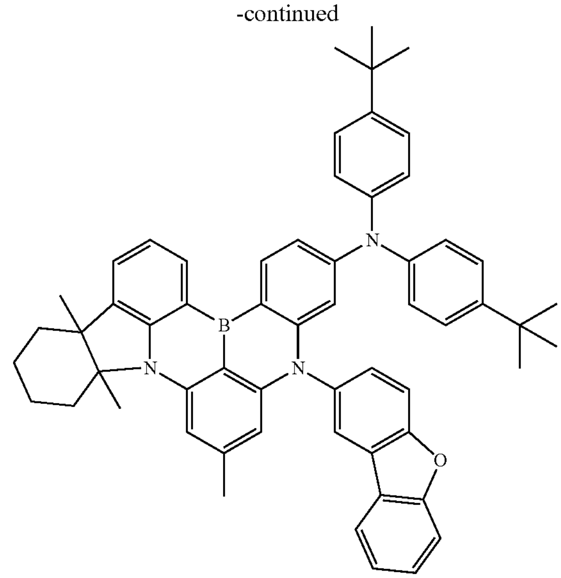
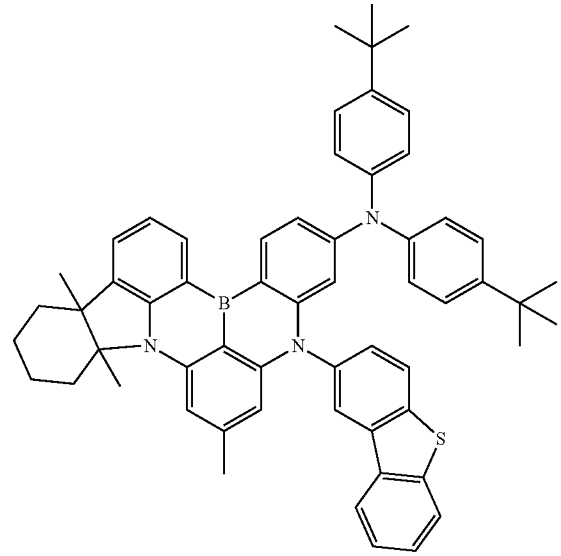
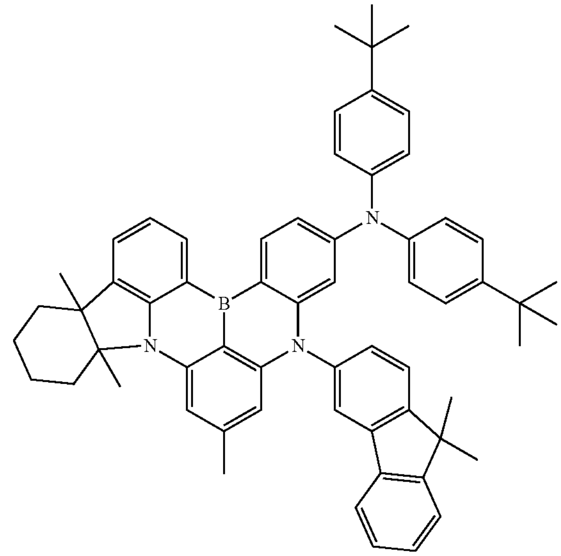
-continued
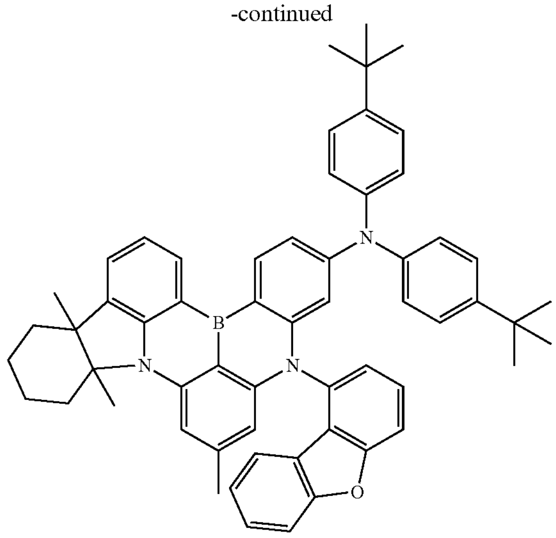
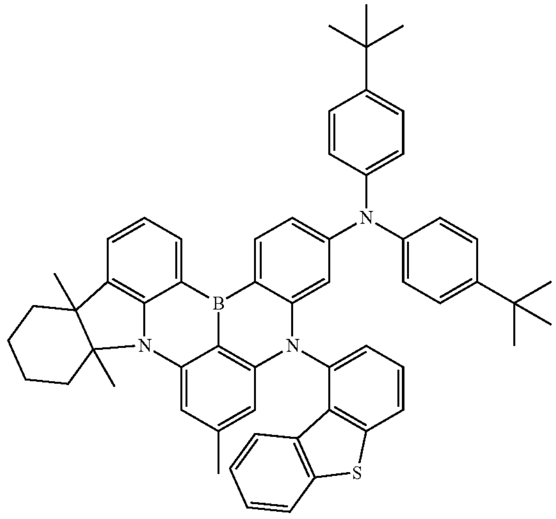
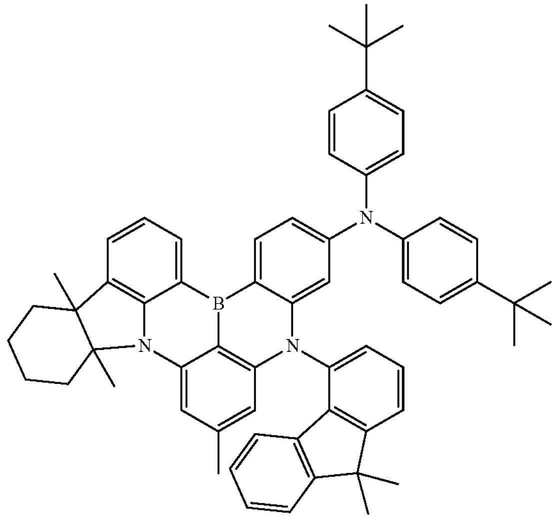

-continued
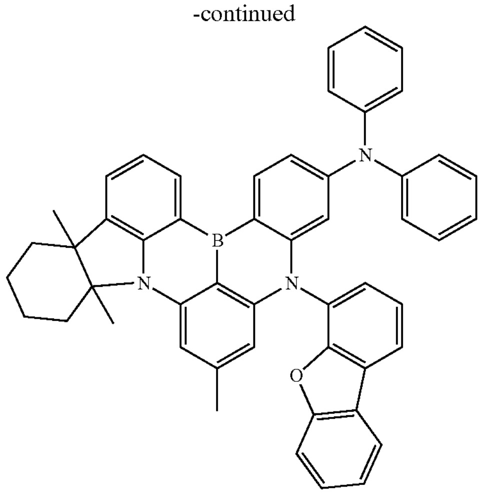
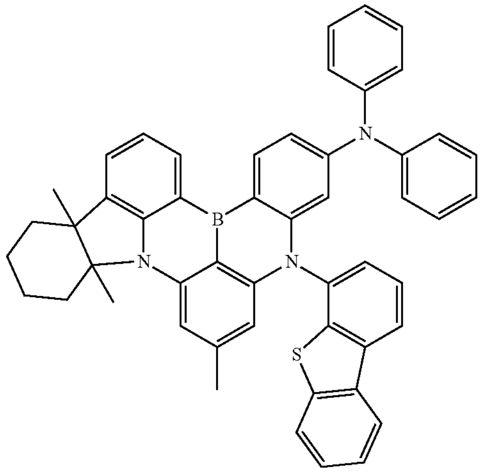
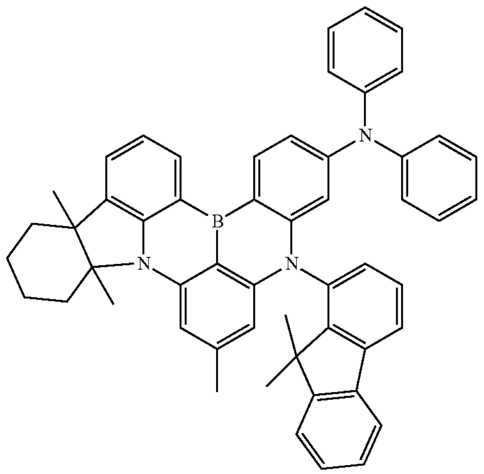
-continued
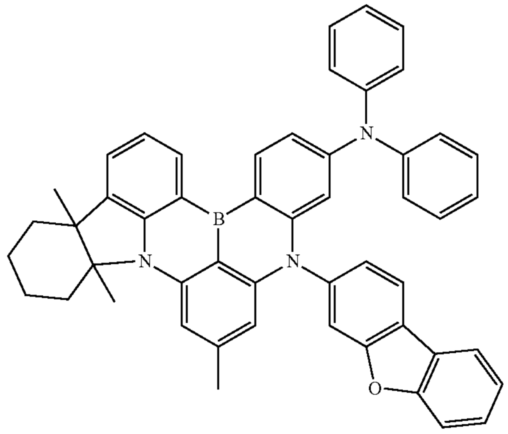
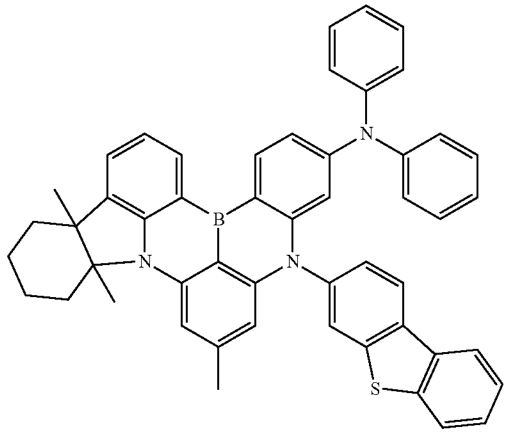
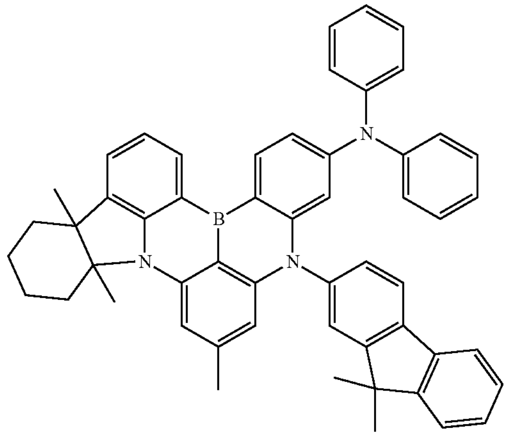

-continued
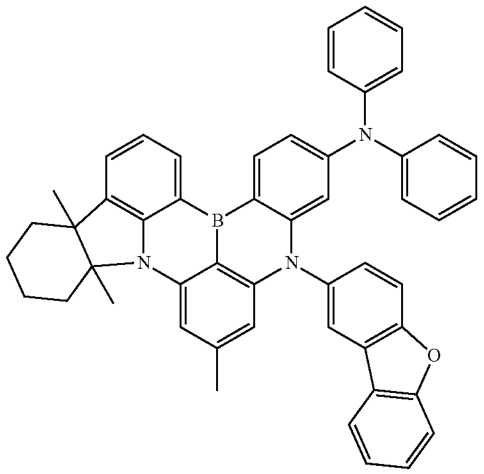
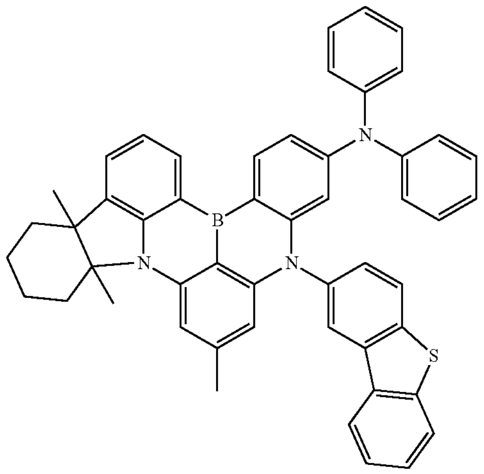
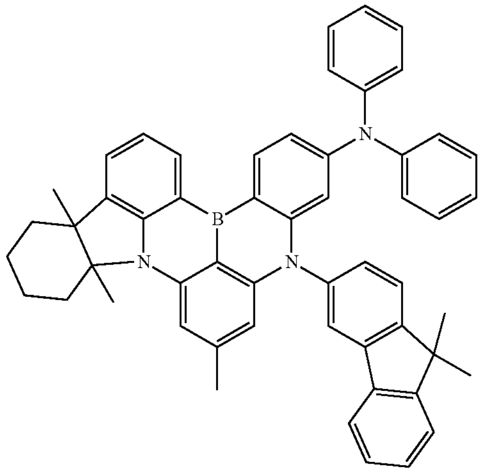
-continued
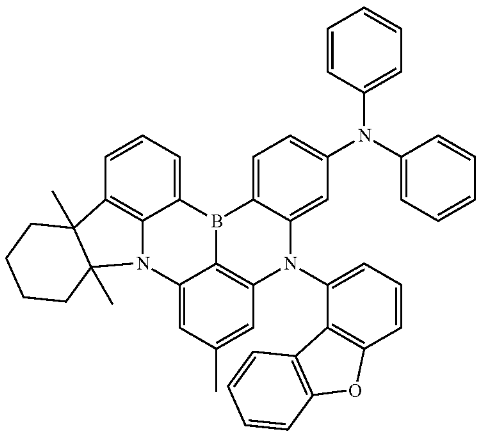
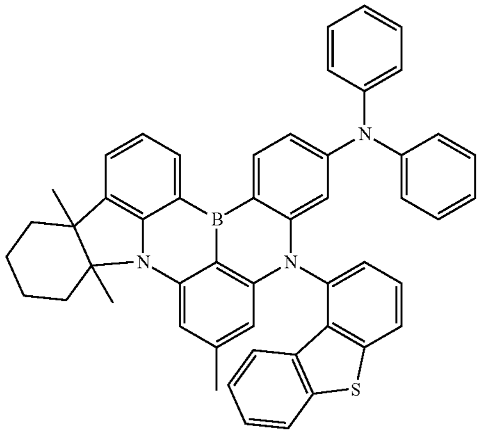
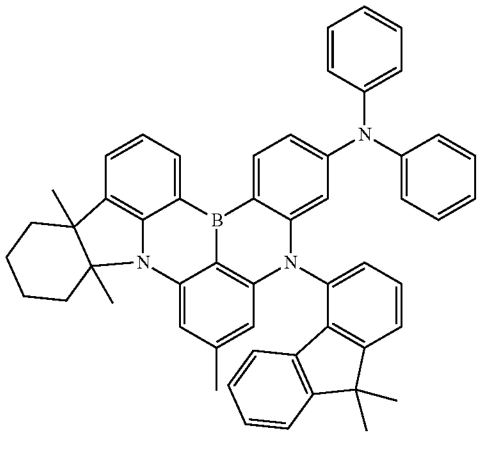

-continued
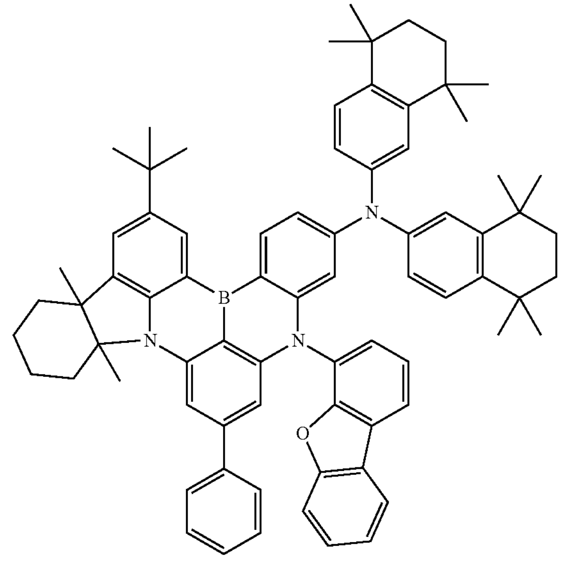
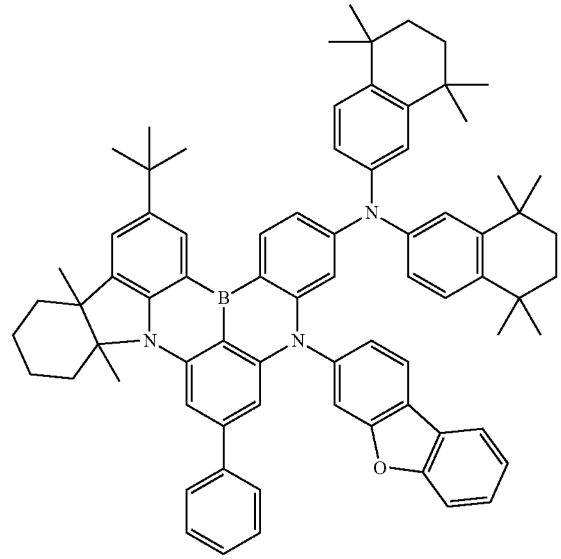
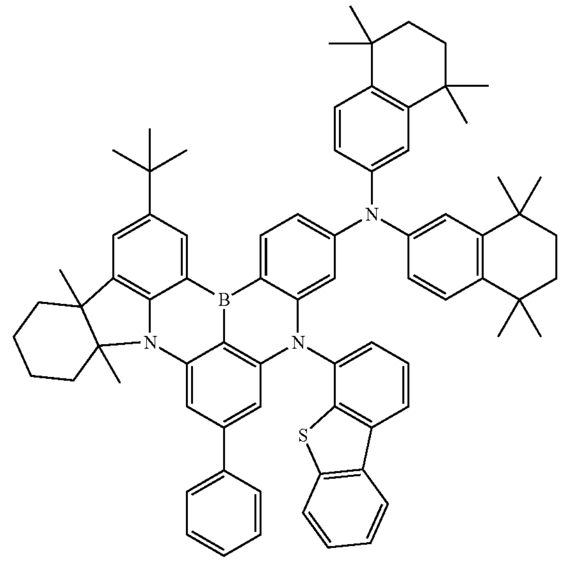
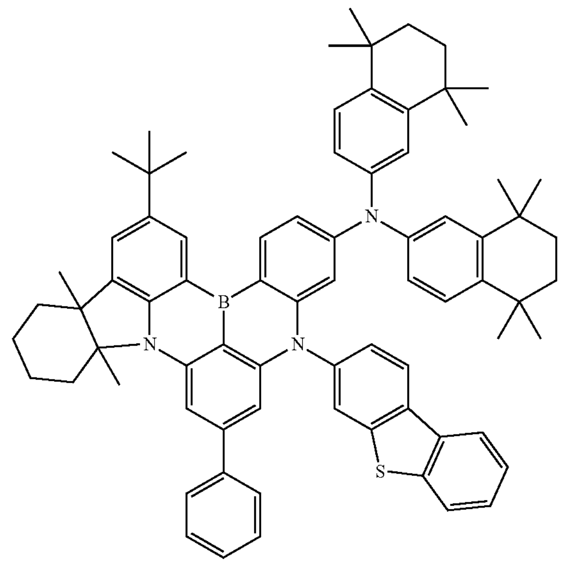
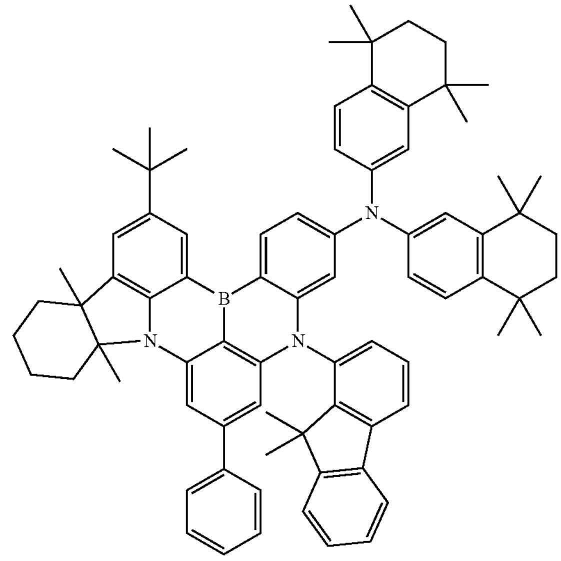
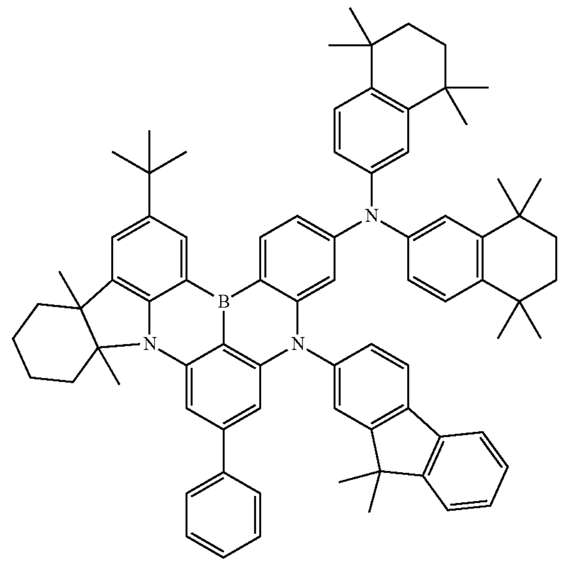
-continued -continued
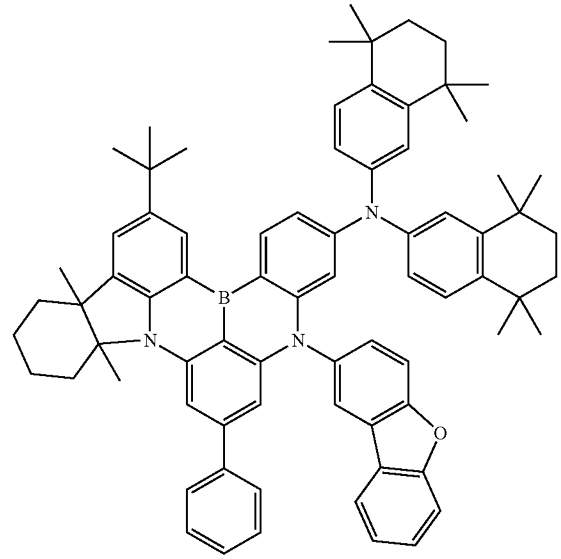
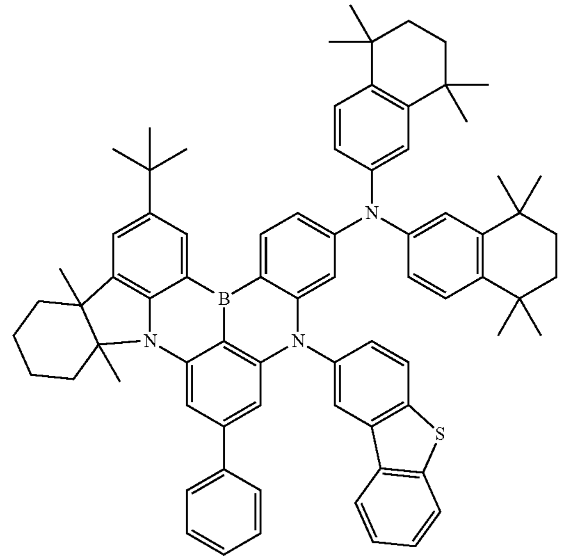
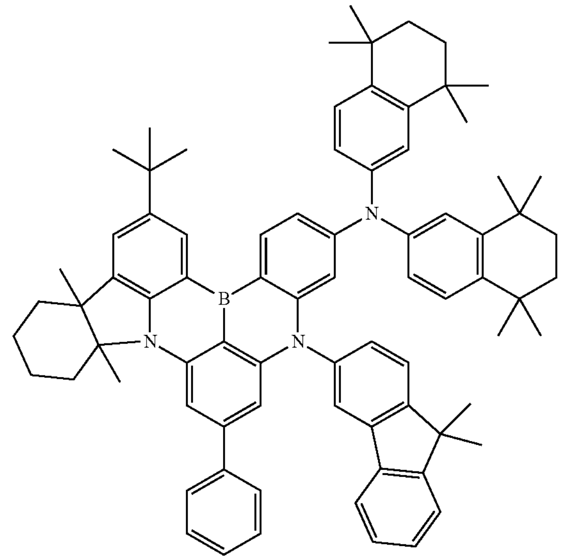
-continued
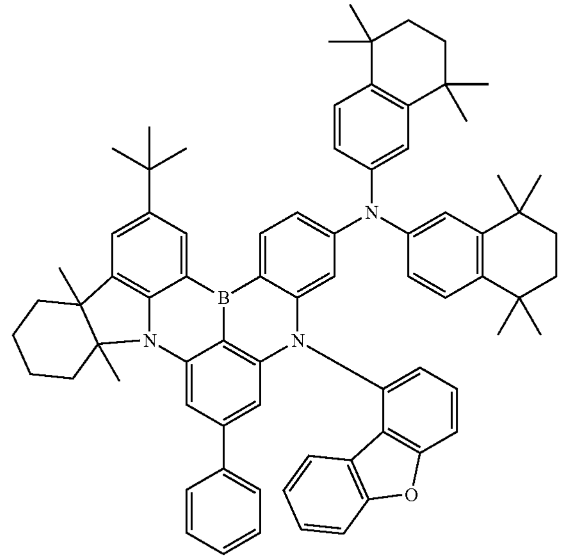
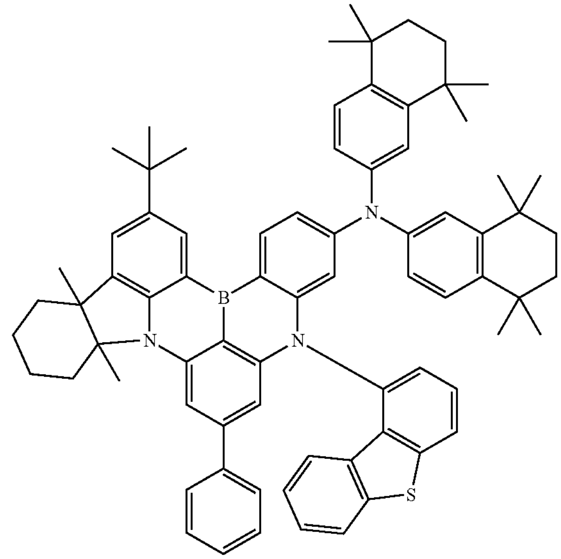
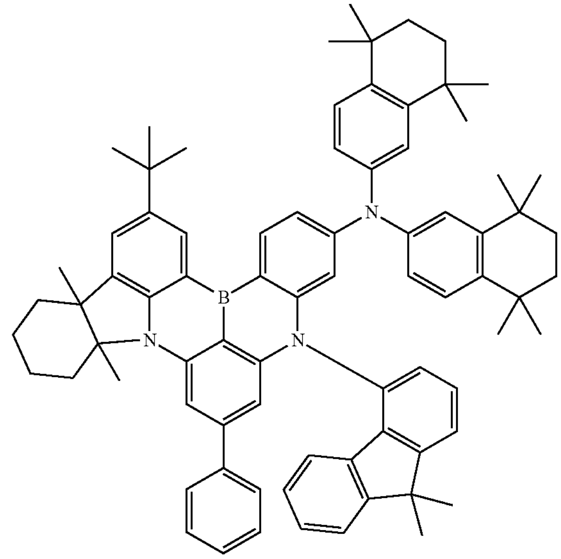

-continued
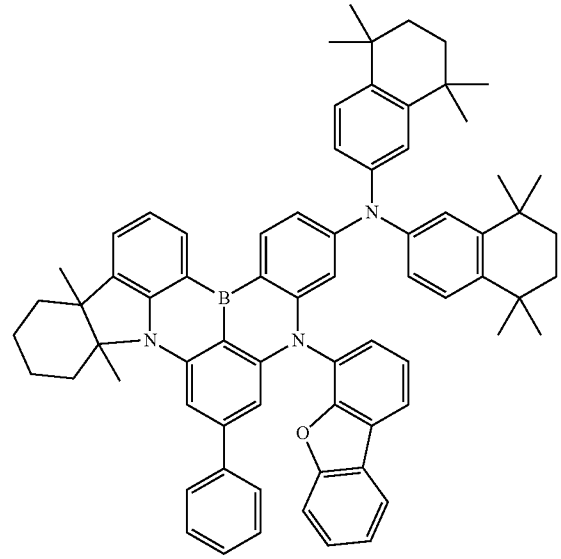
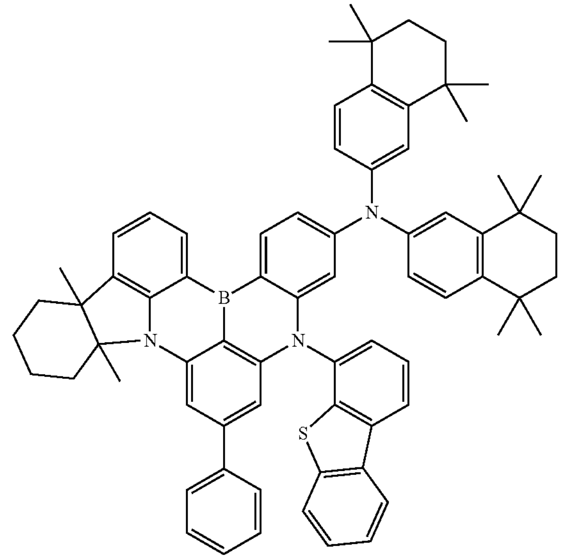
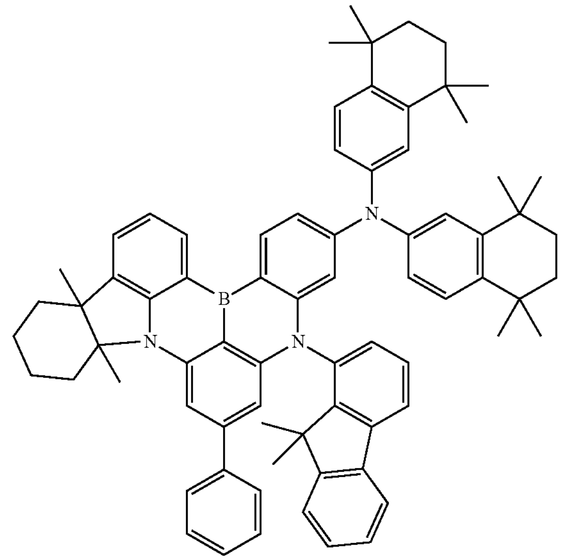
-continued
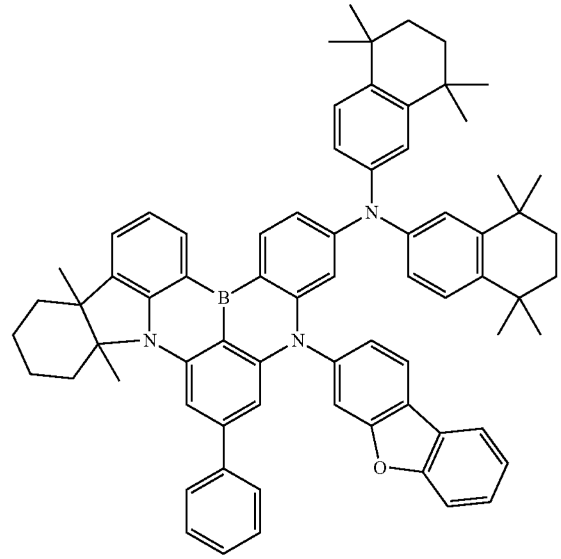
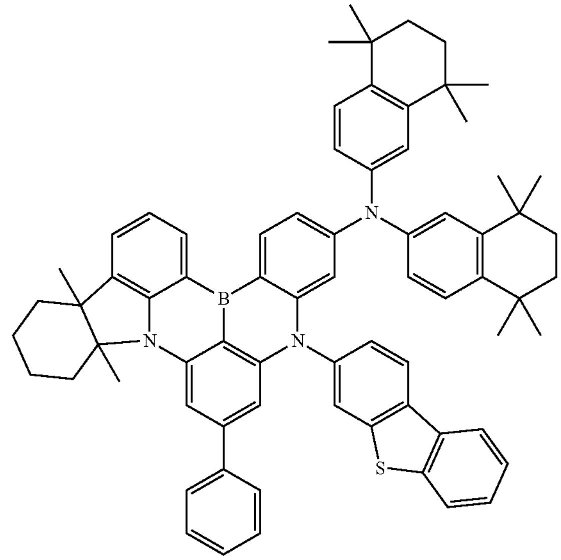
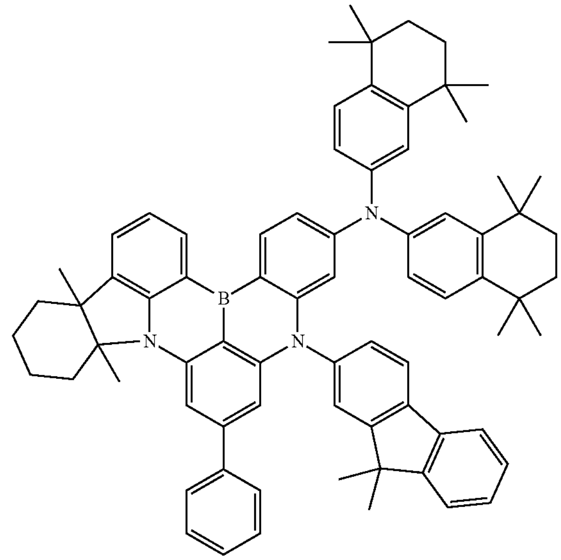

-continued
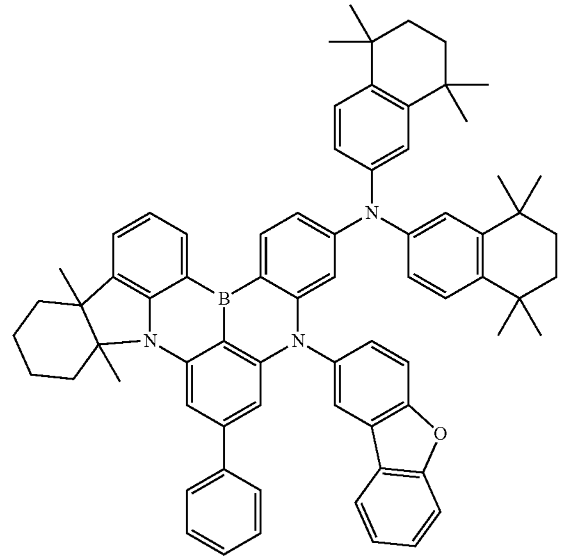
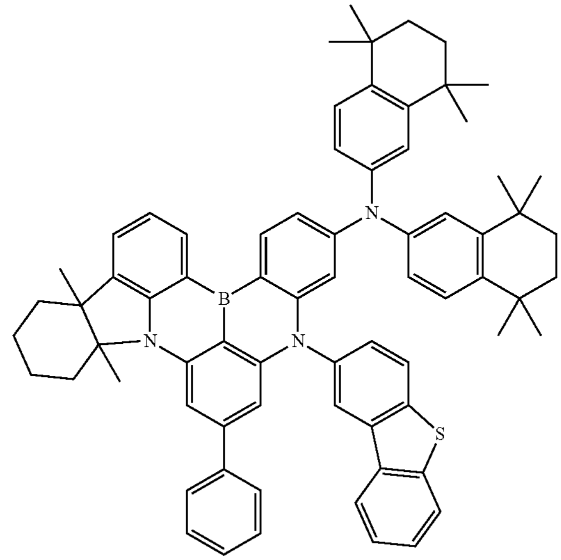
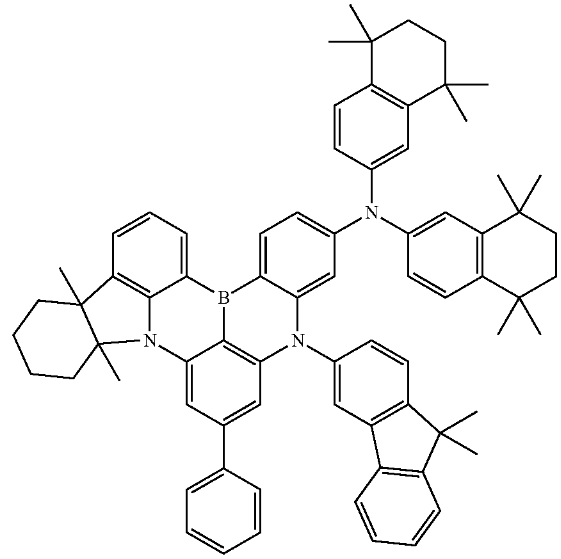
-continued
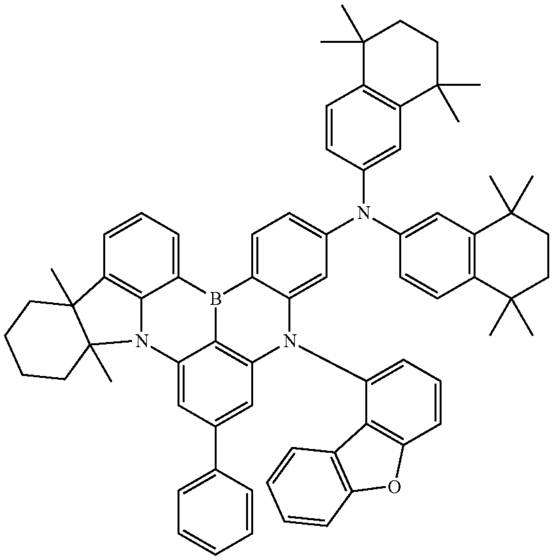
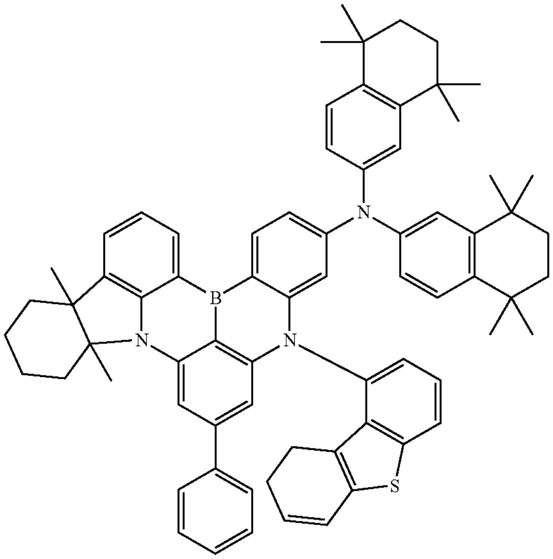
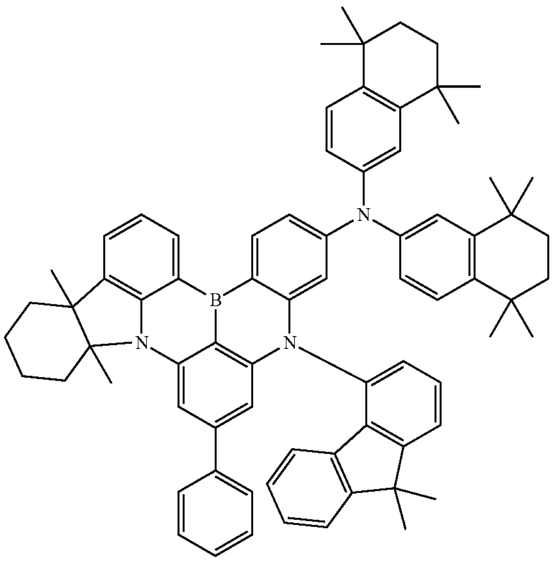

-continued
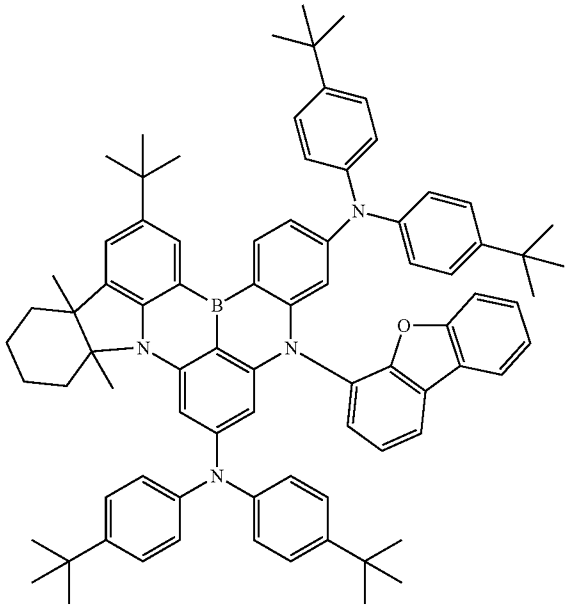
-continued
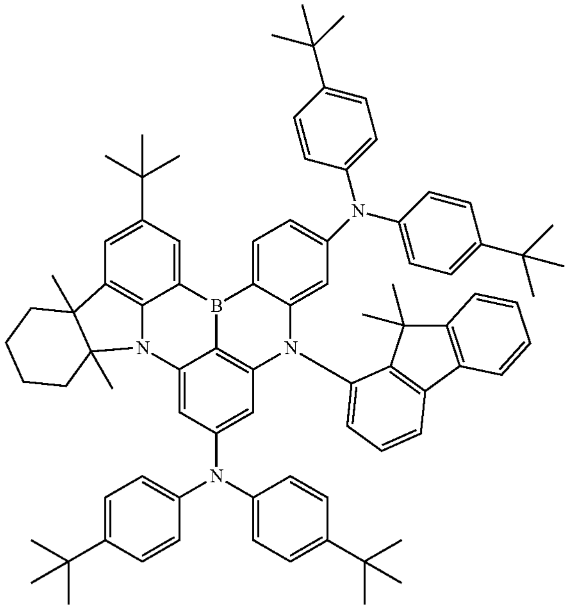
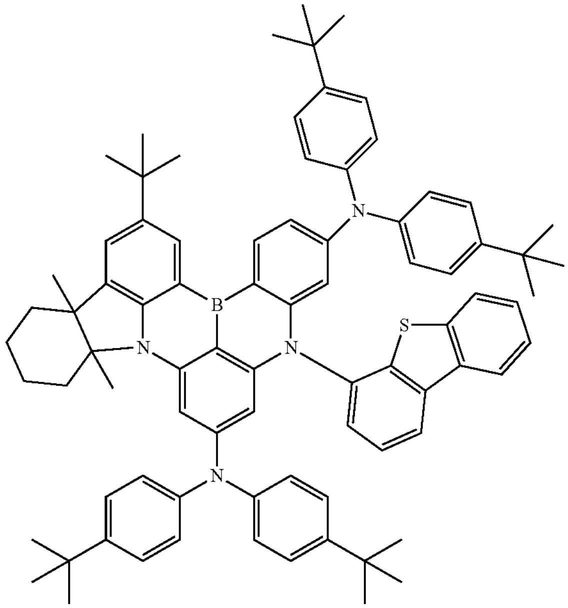
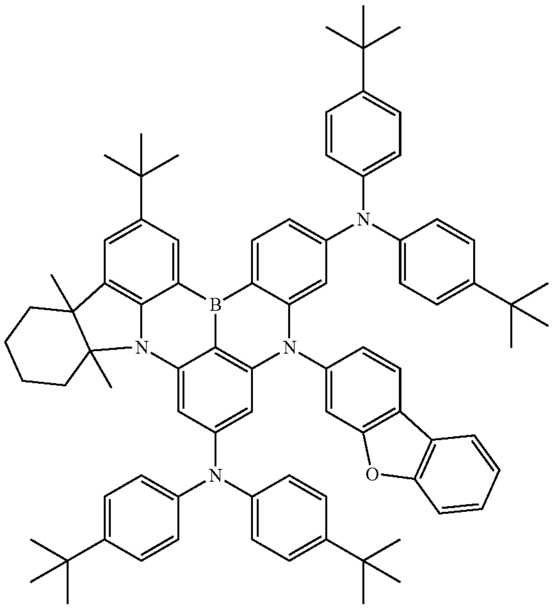

-continued
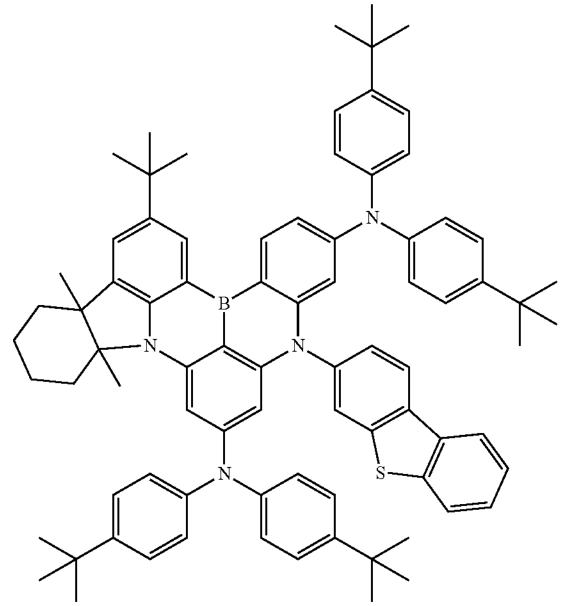
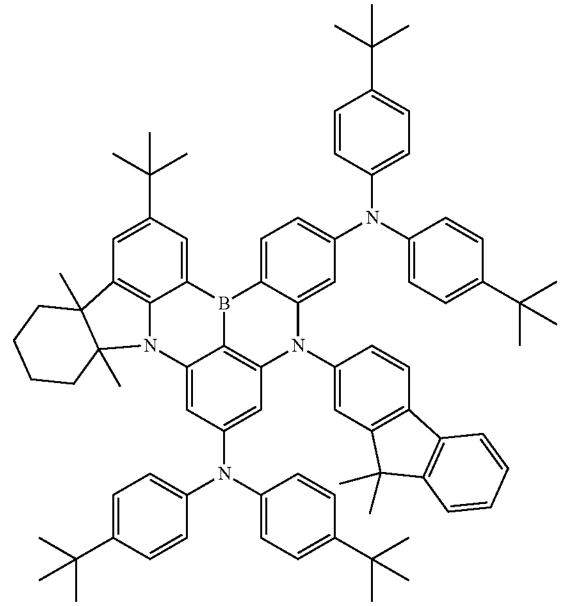 [SMILES: CC(C)(C)c1ccc(N(c2ccc(C(C)(C)C)cc2)c2ccc3c(c2)N(c2ccc4c(c2)C(C)(C)c2ccccc2-4)c2cc(N(c4ccc(C(C)(C)C)cc4)c4ccc(C(C)(C)C)cc4)cc4c2B3c2cc(C(C)(C)C)cc3c2N4C2(C)CCCCC32C)cc1]
-continued
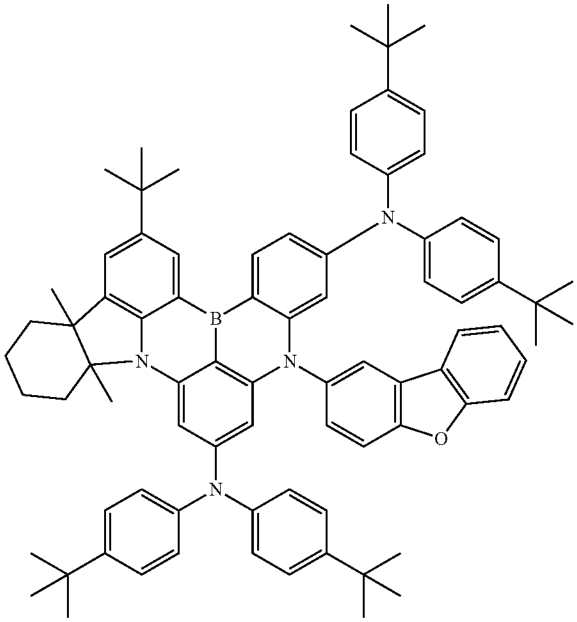
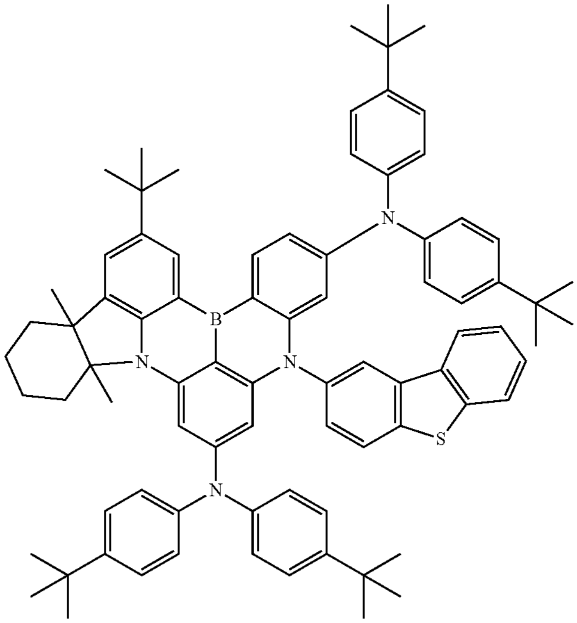

-continued
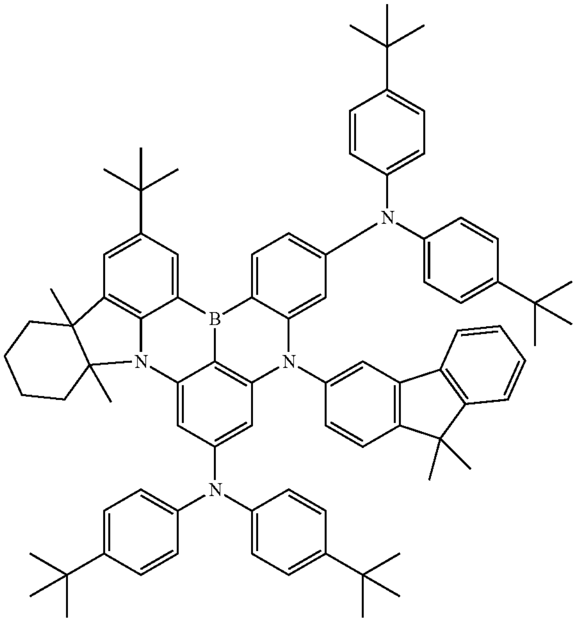
-continued
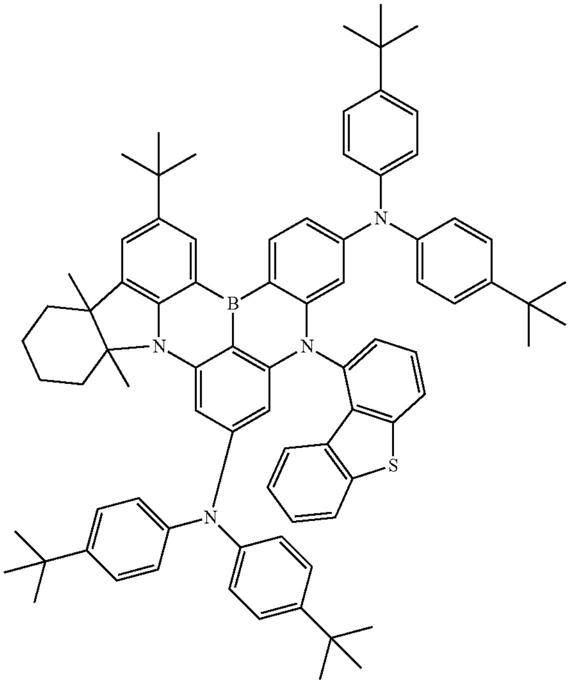
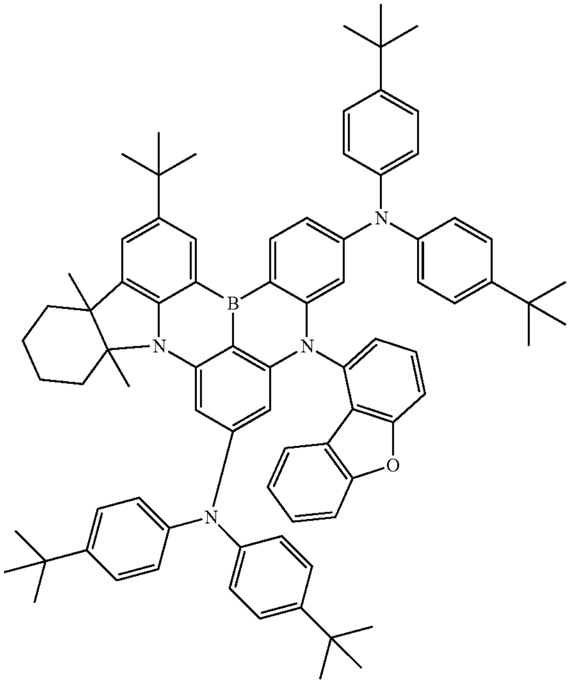
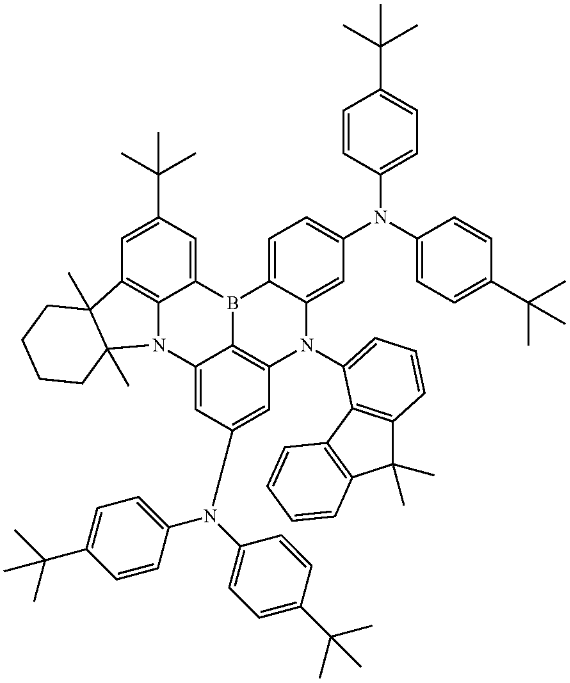

-continued
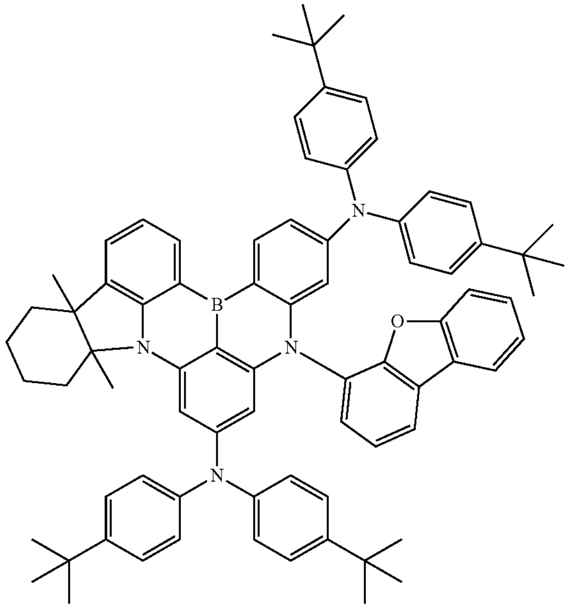
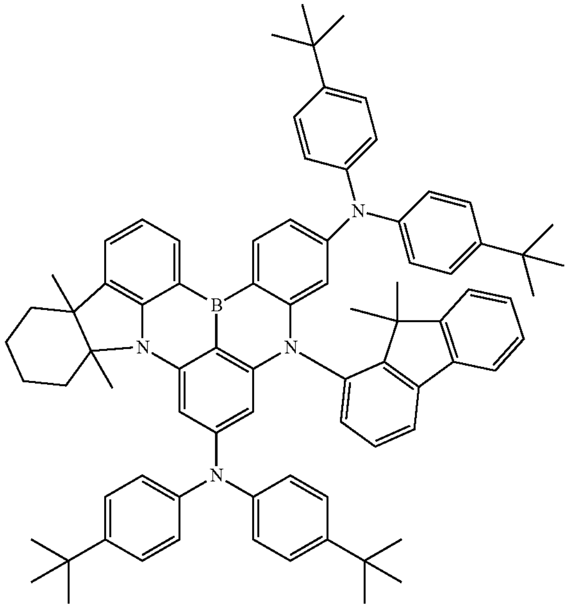
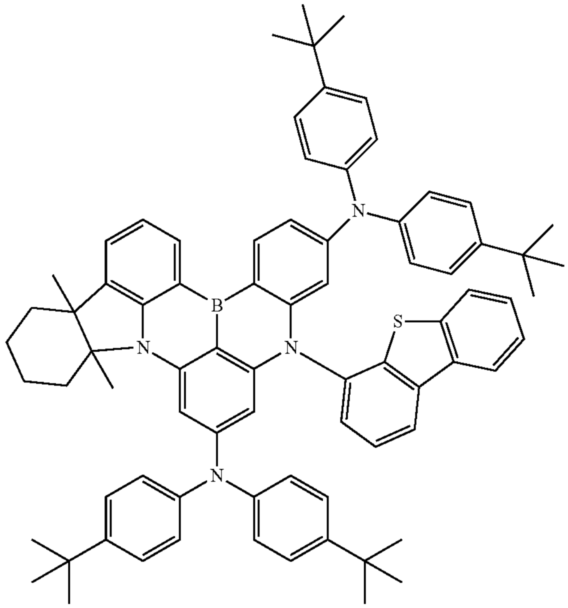
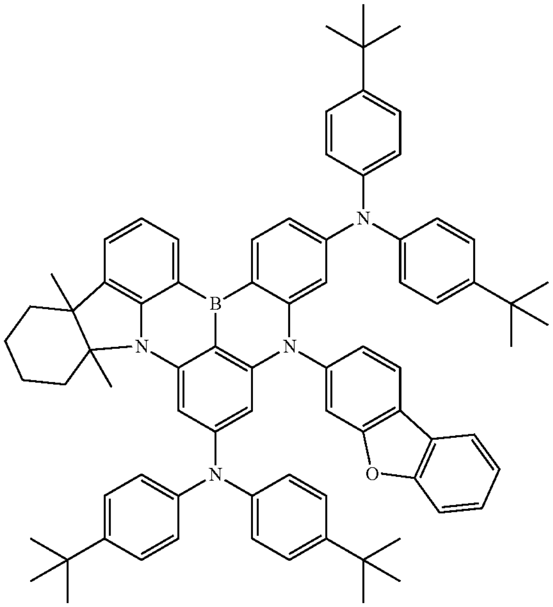

-continued
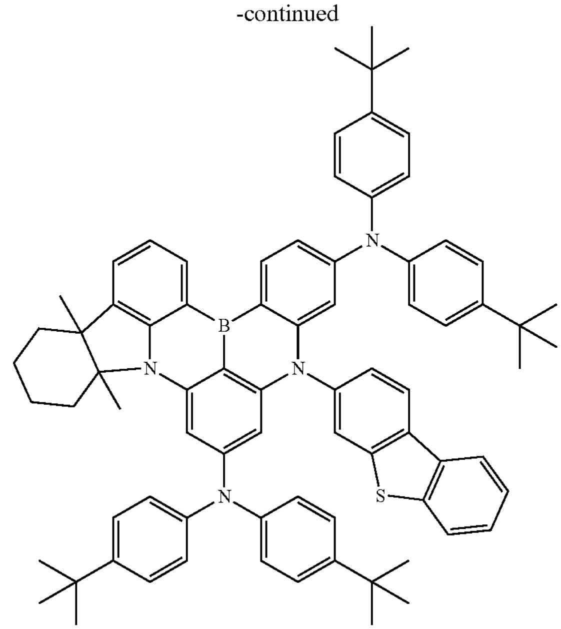
-continued
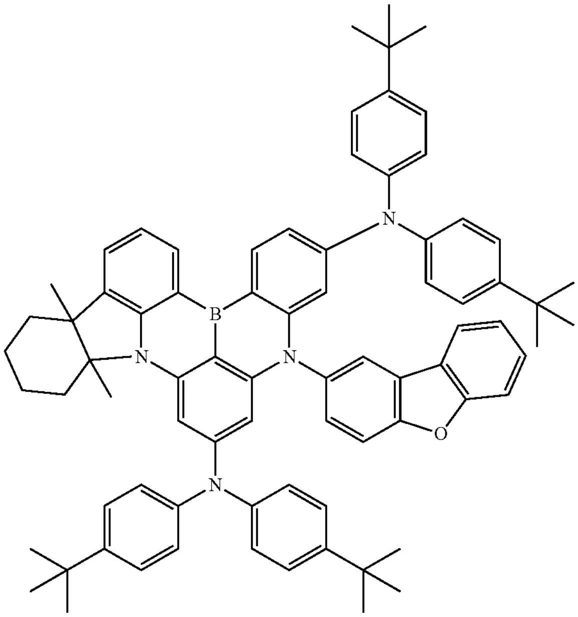
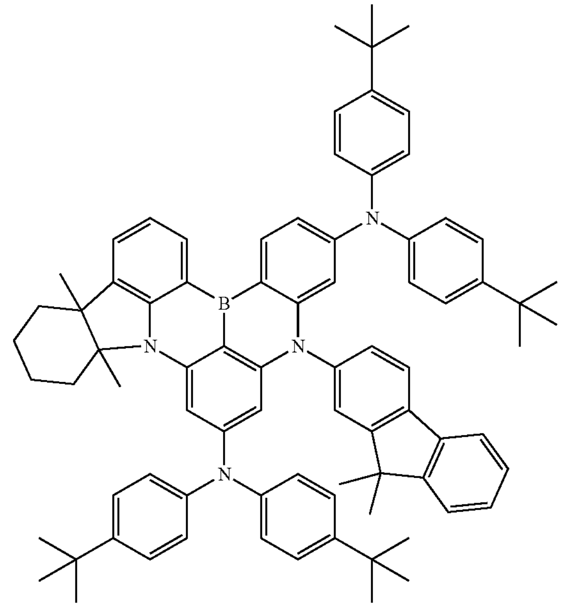
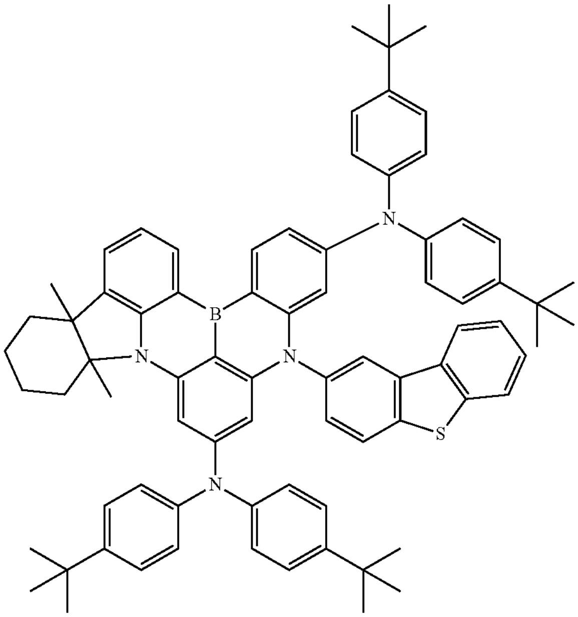

-continued
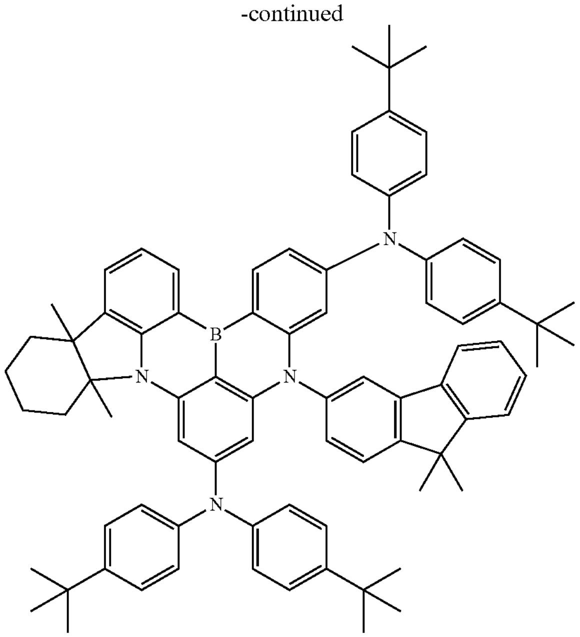
-continued
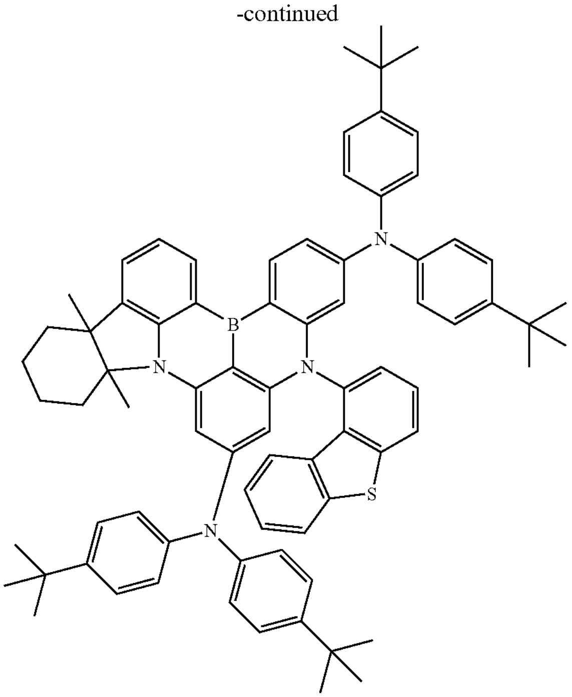
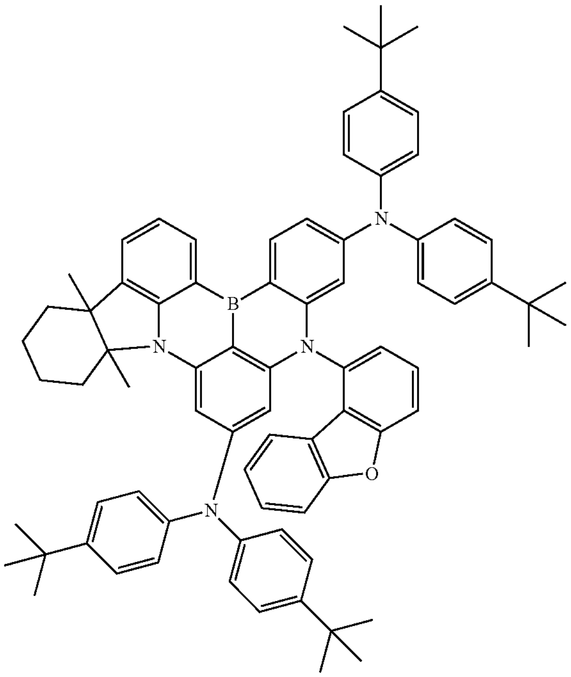
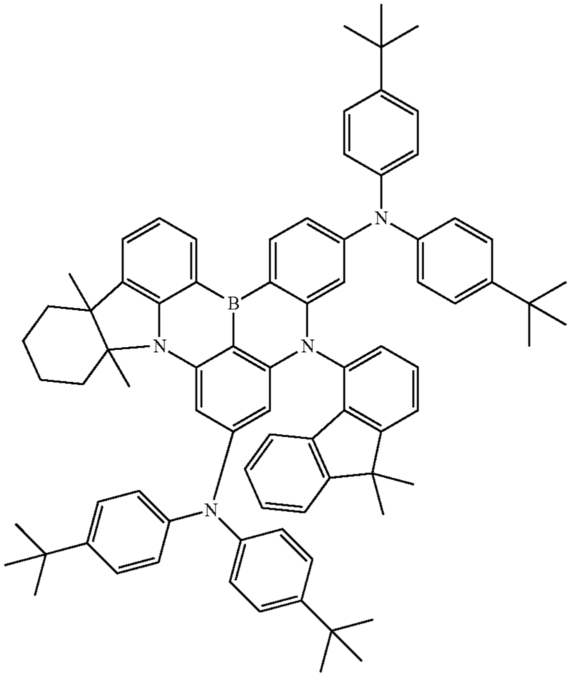

-continued
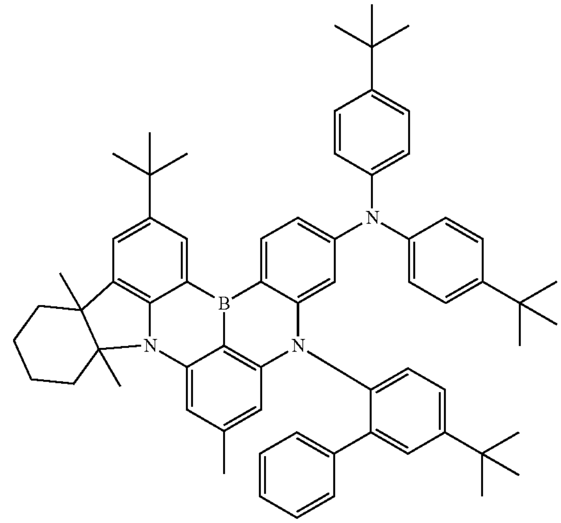
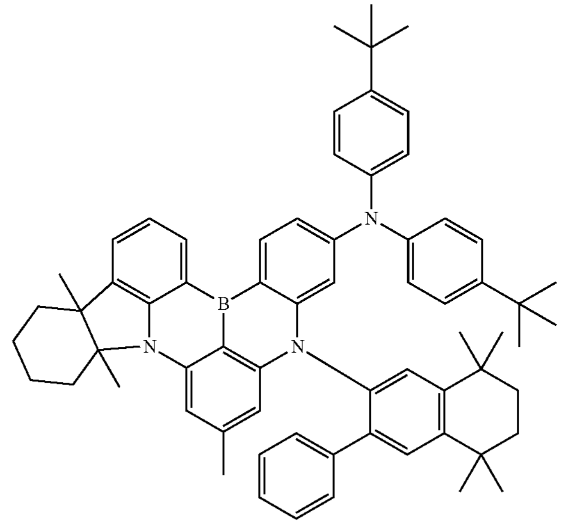
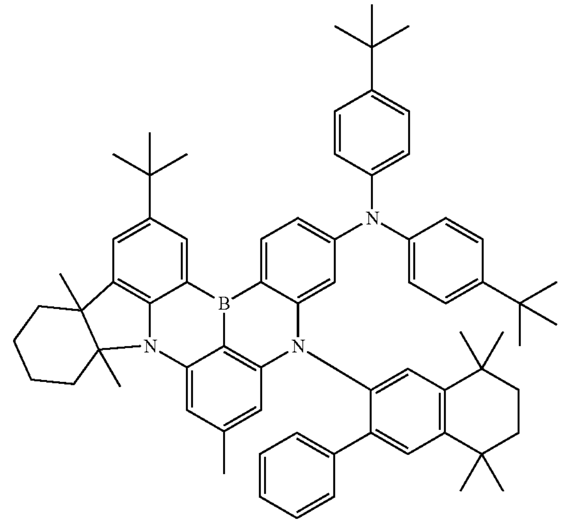
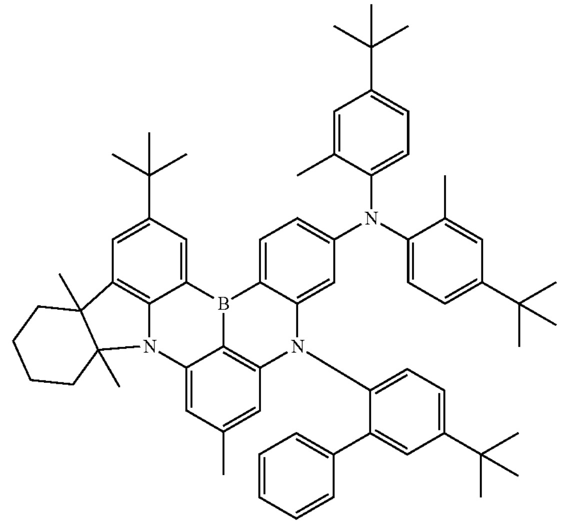
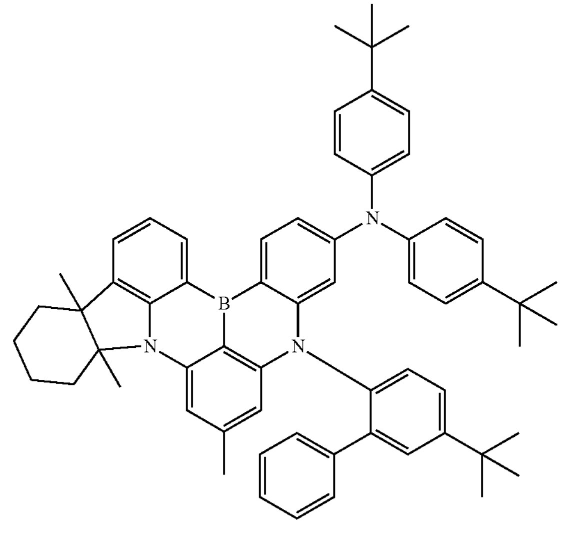
-continued
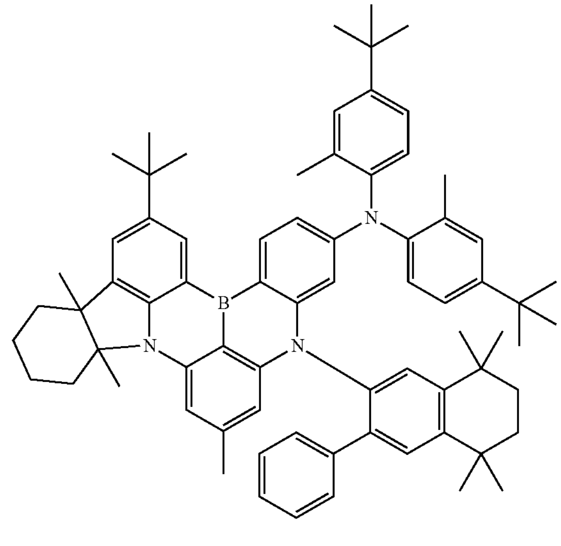

-continued
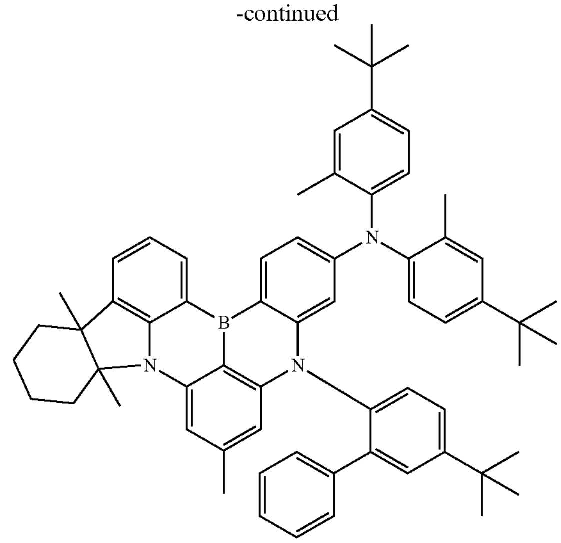
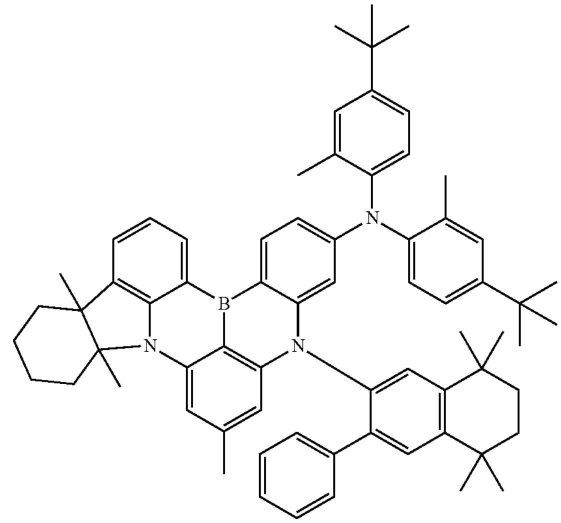
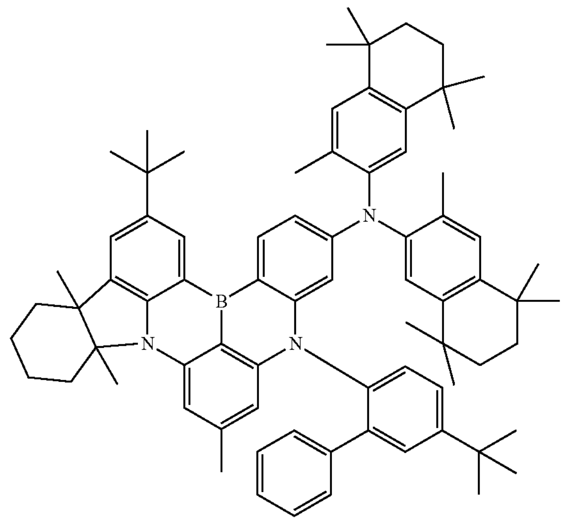
-continued
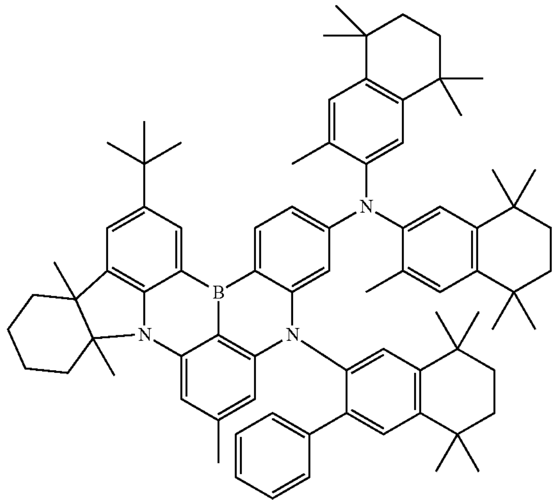
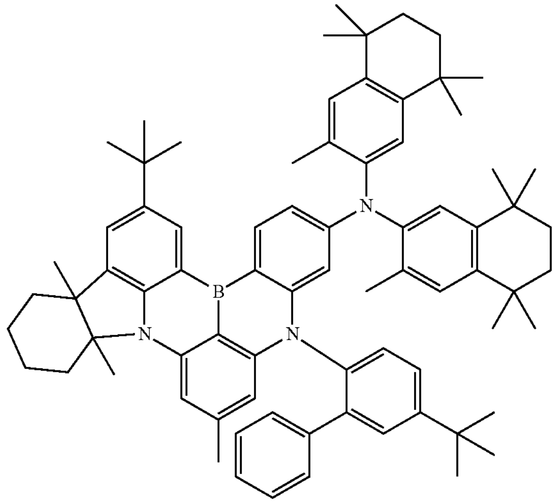 [SMILES: Cc1cc2c3c(c1)N1c4c(cc(C(C)(C)C)cc4C4(C)CCCCC14C)B3c1ccc(N(c3cc4c(cc3C)C(C)(C)CCC4(C)C)c3cc4c(cc3C)C(C)(C)CCC4(C)C)cc1N2c1ccc(C(C)(C)C)cc1-c1ccccc1]
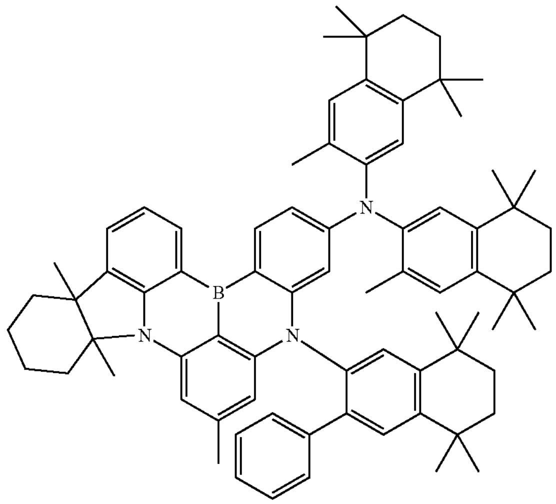

-continued
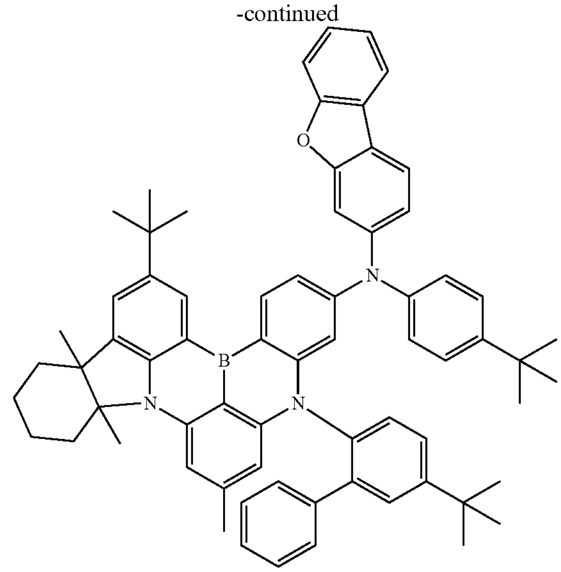
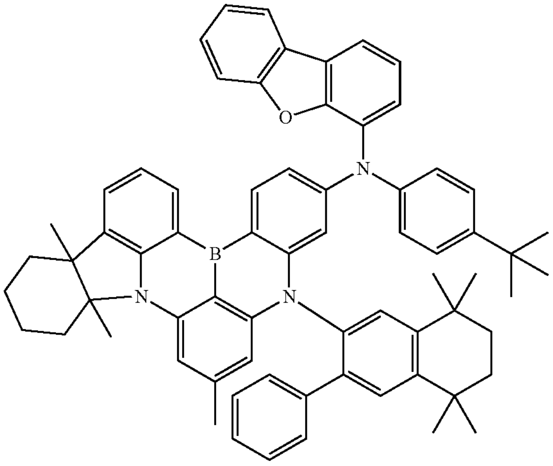
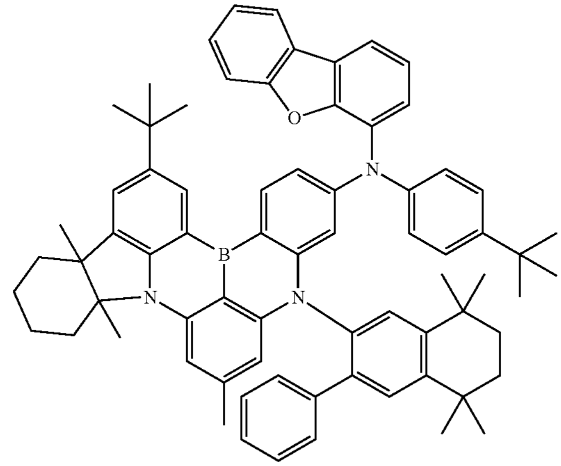
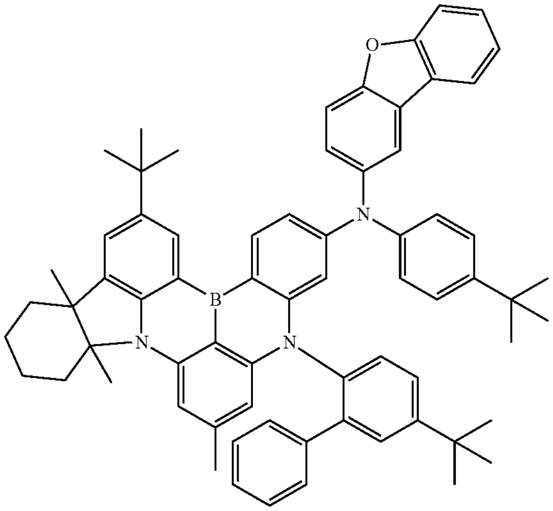
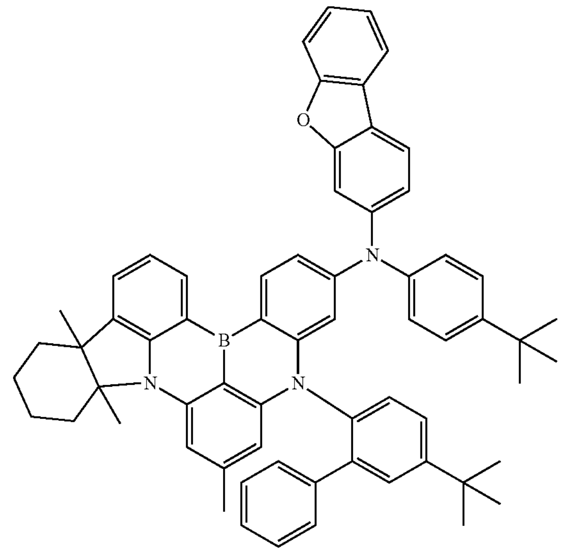
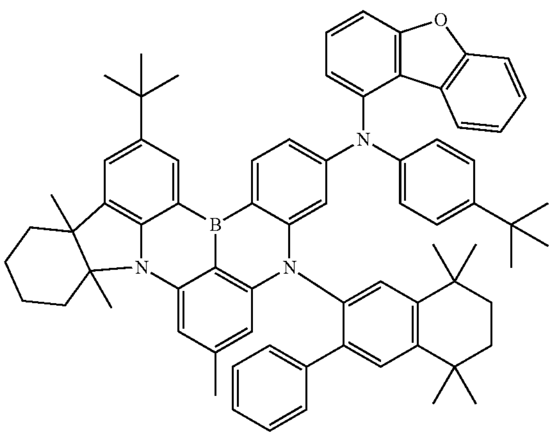
-continued -continued
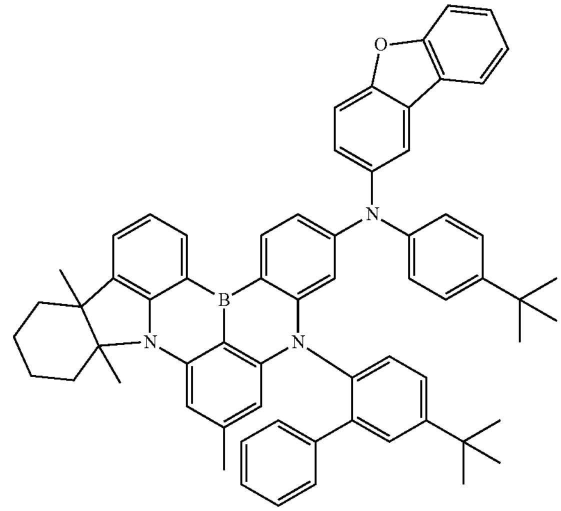
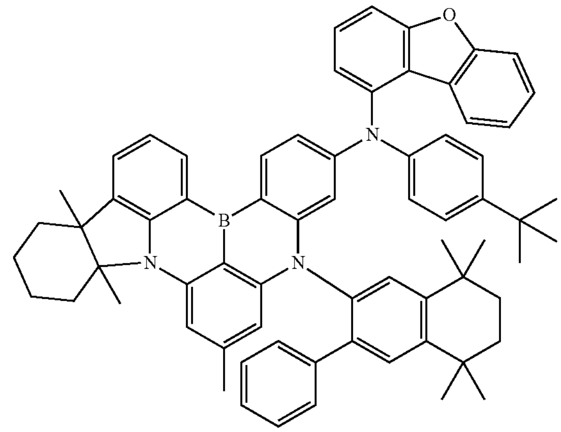
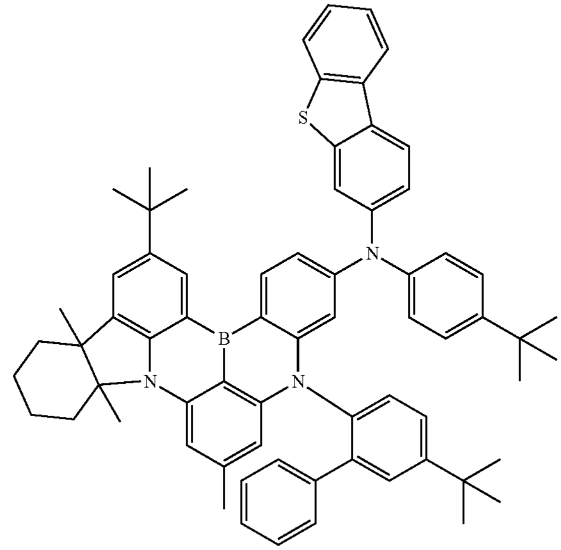
-continued
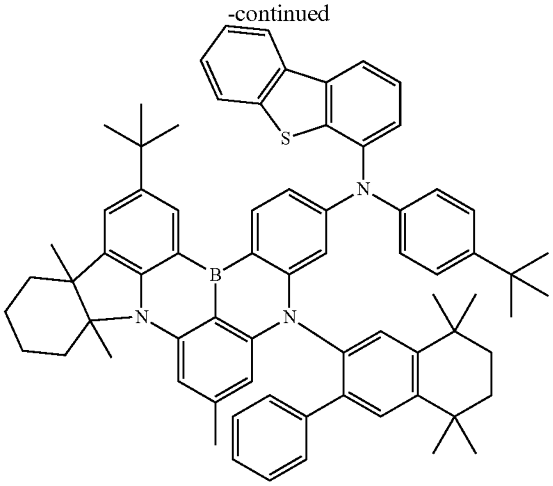
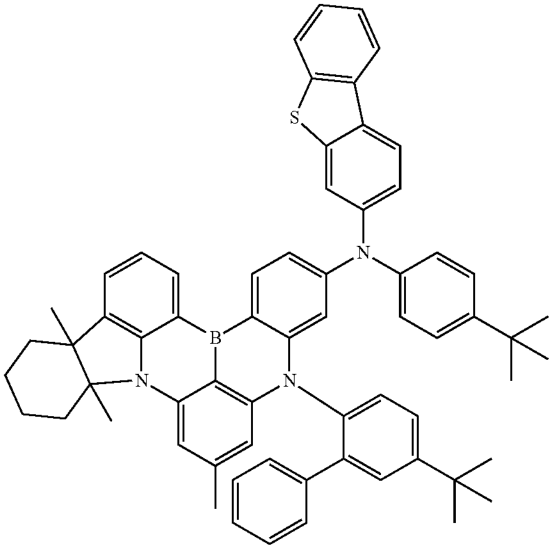
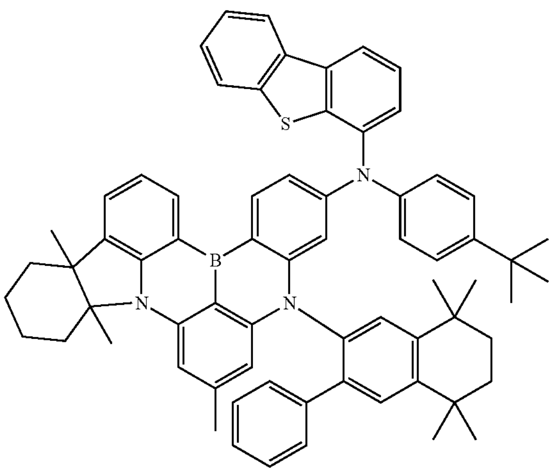

-continued
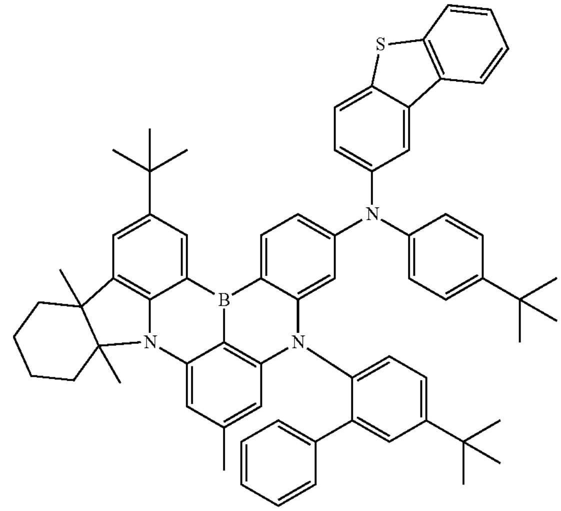
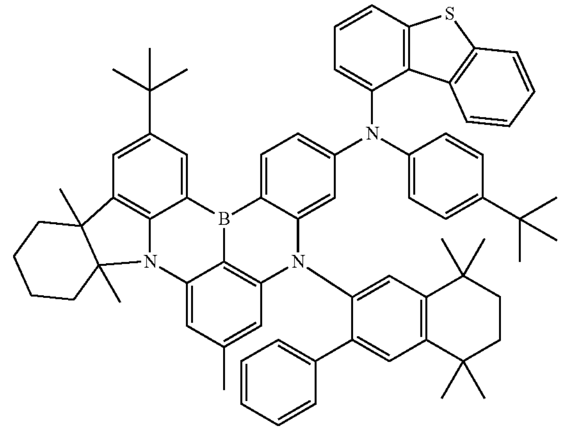
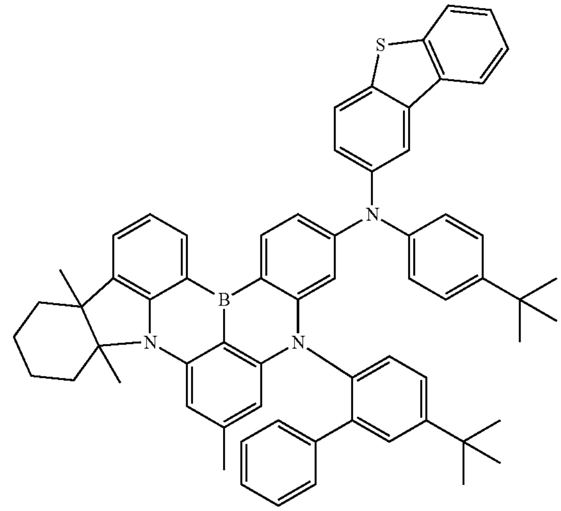
-continued
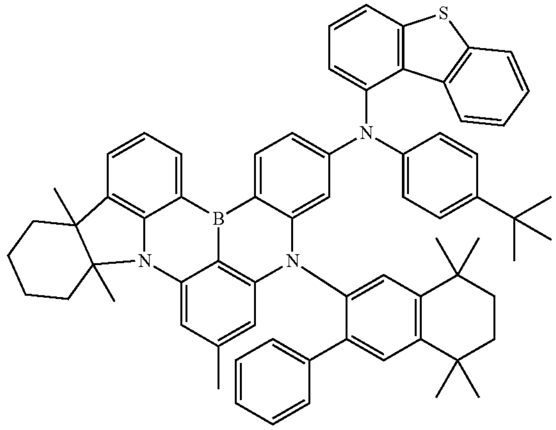
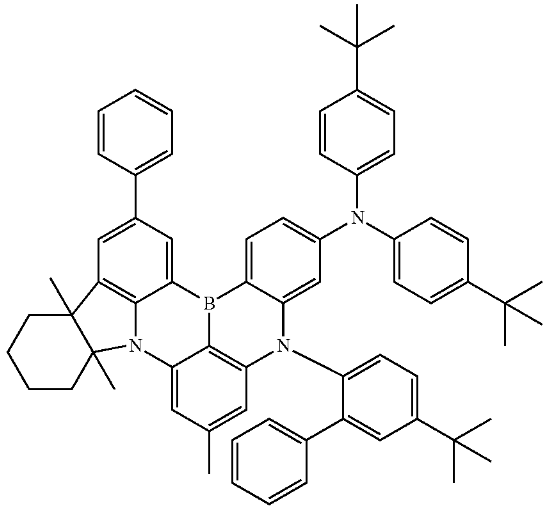
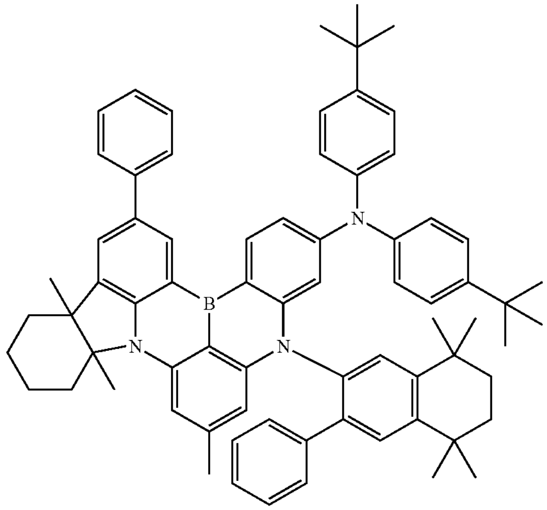

-continued
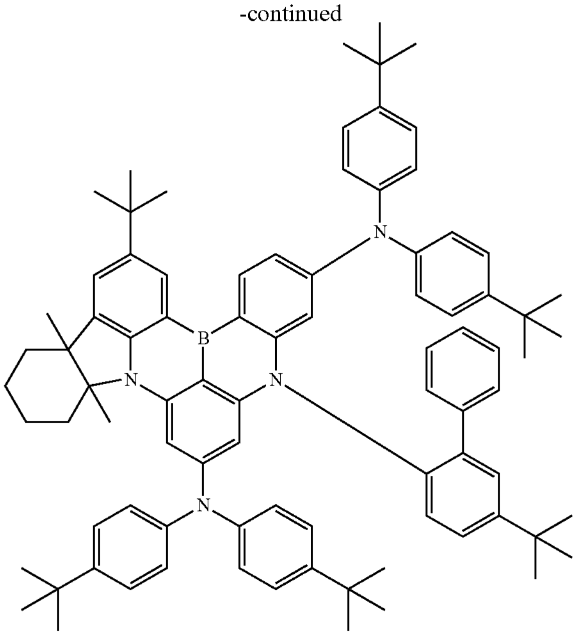
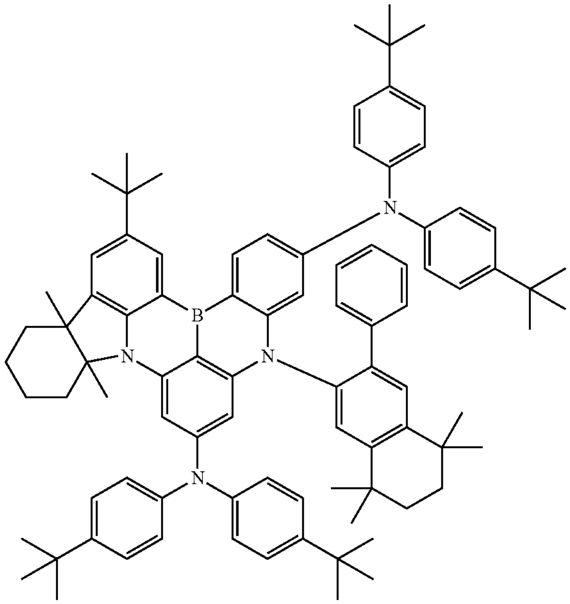
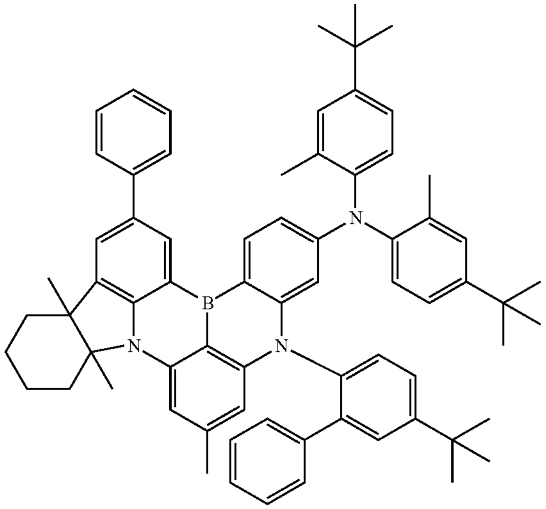
-continued
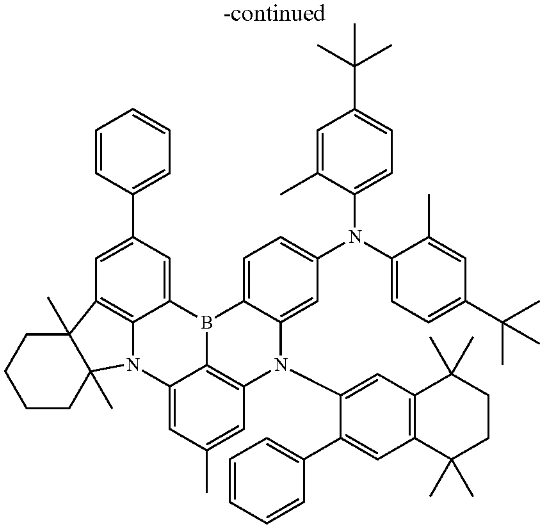
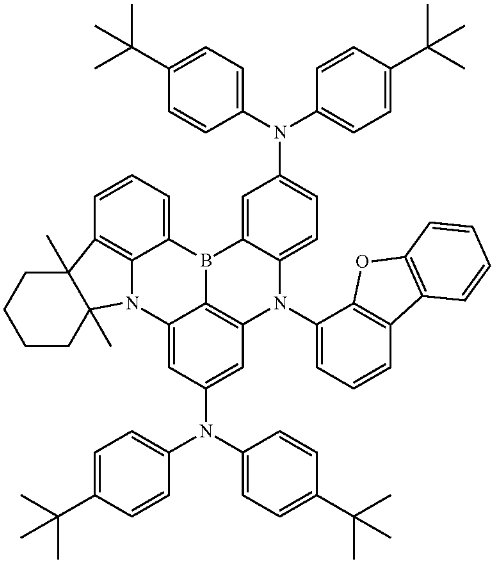
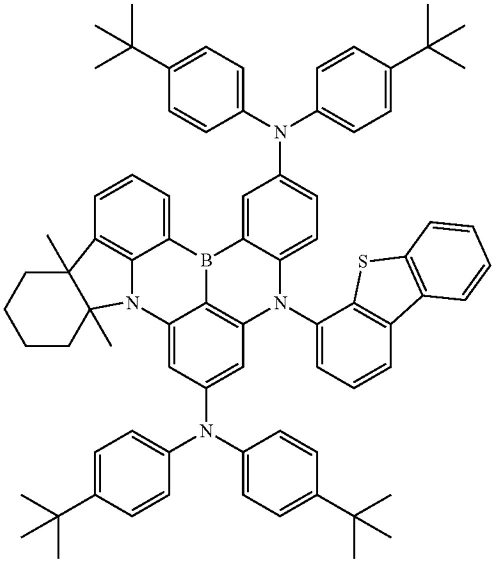

-continued
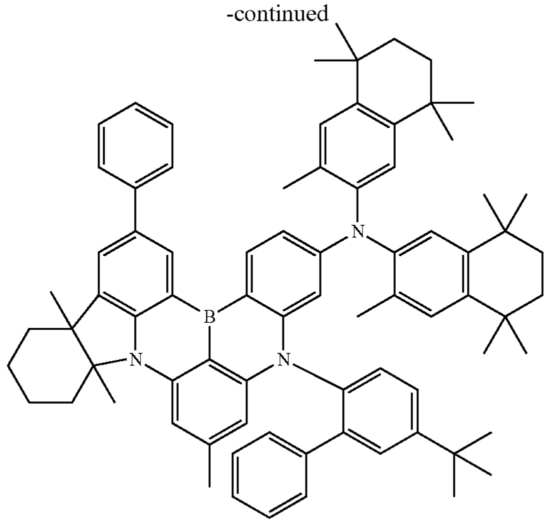
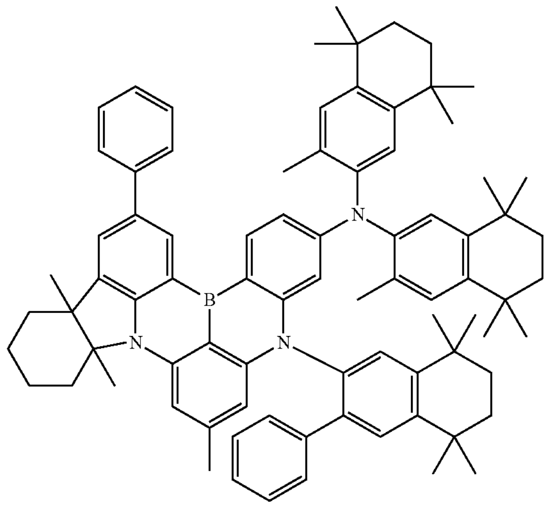
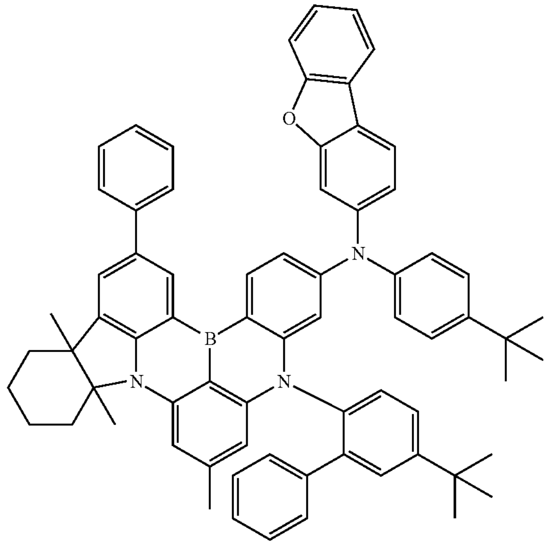
-continued
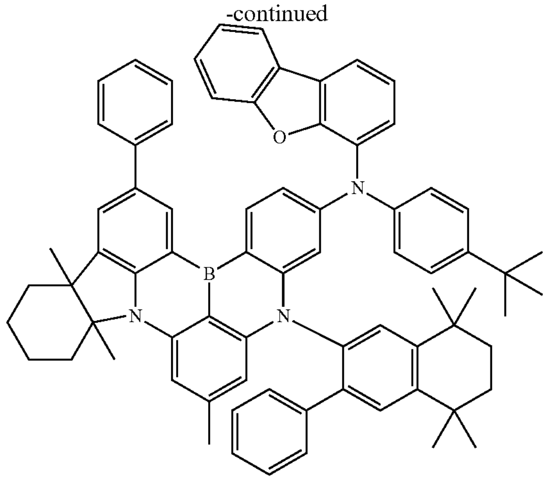
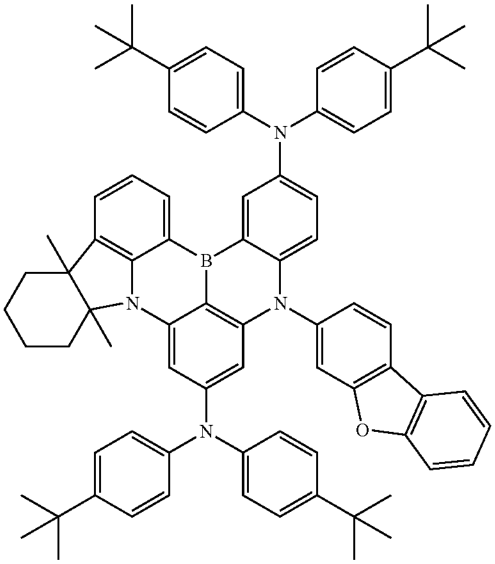
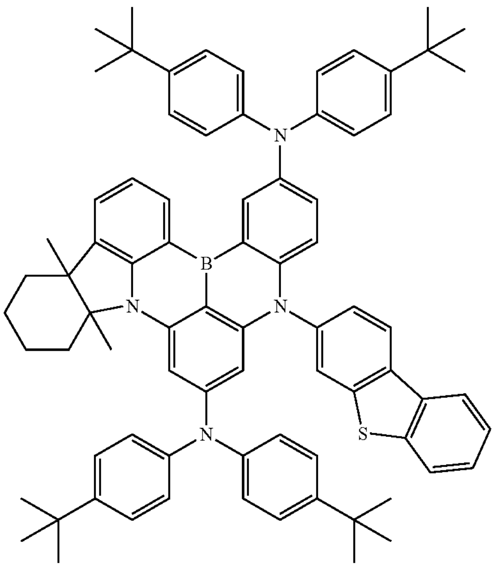

-continued
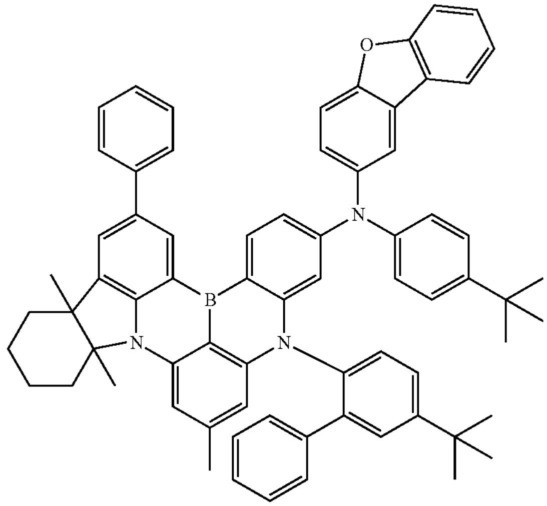
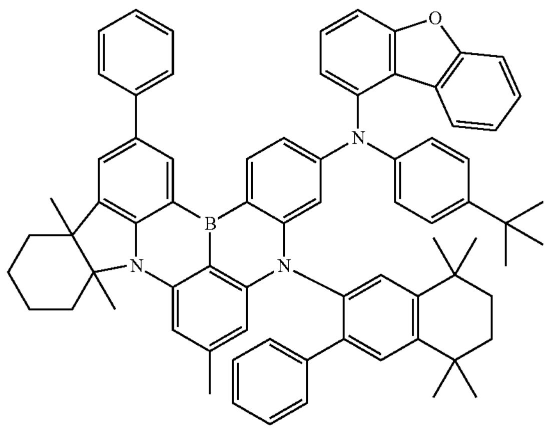
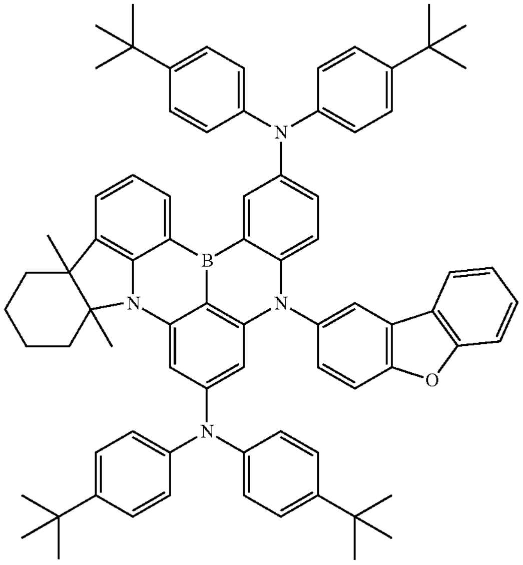
-continued
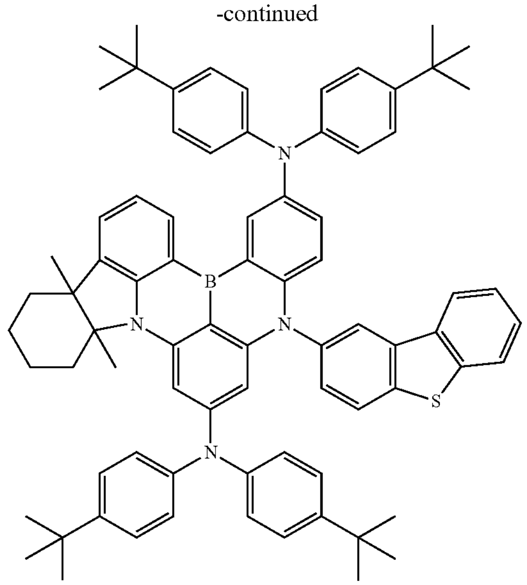
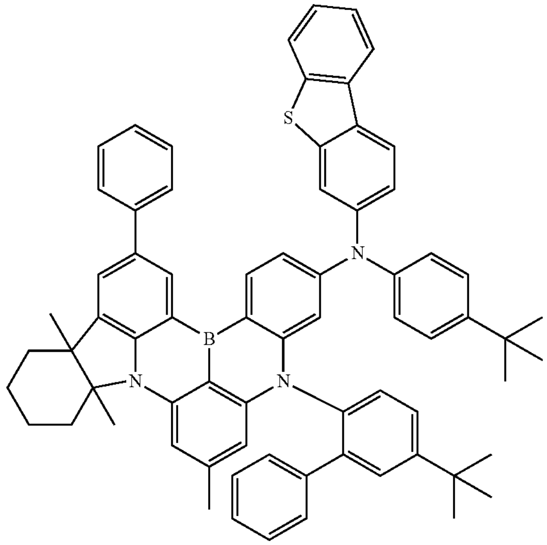
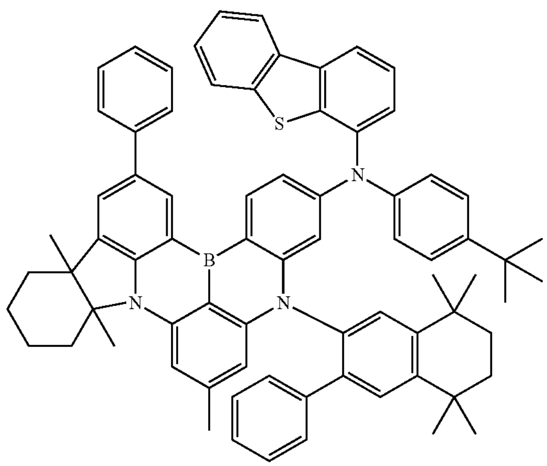

-continued
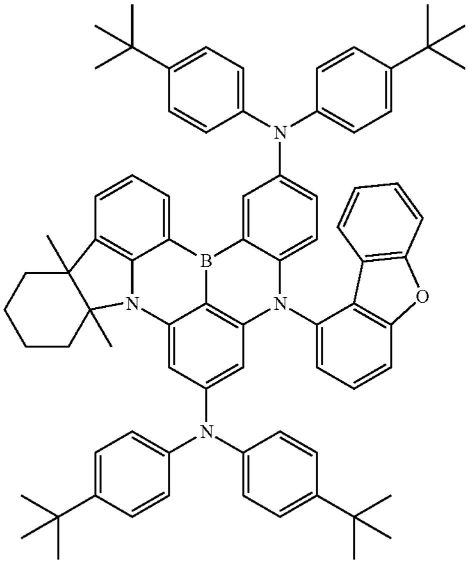
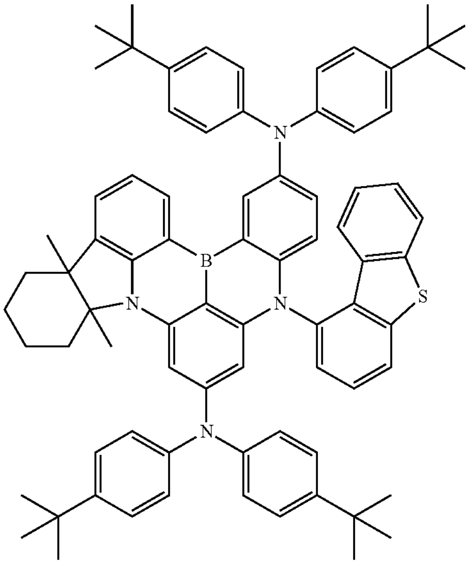
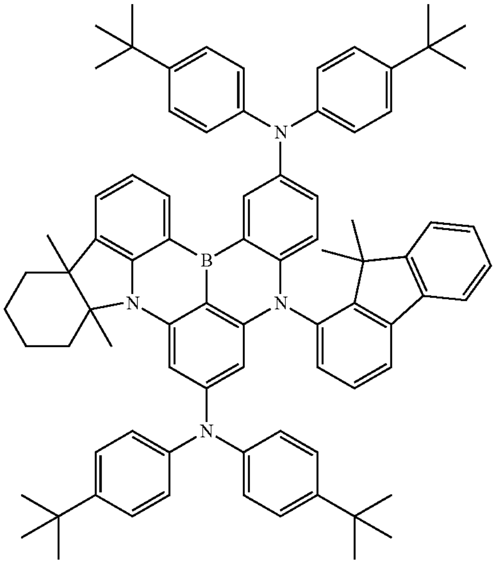
-continued
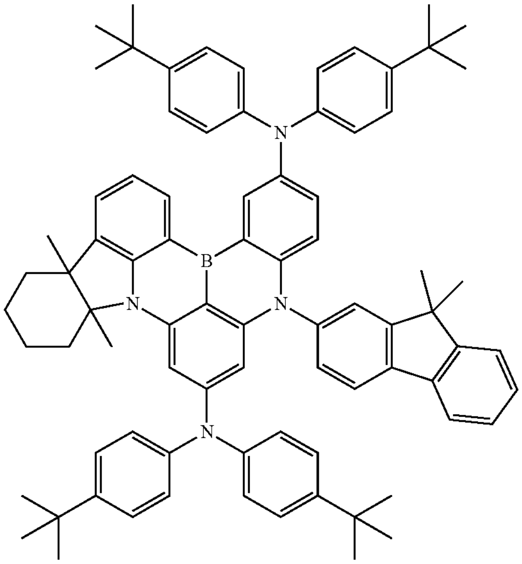
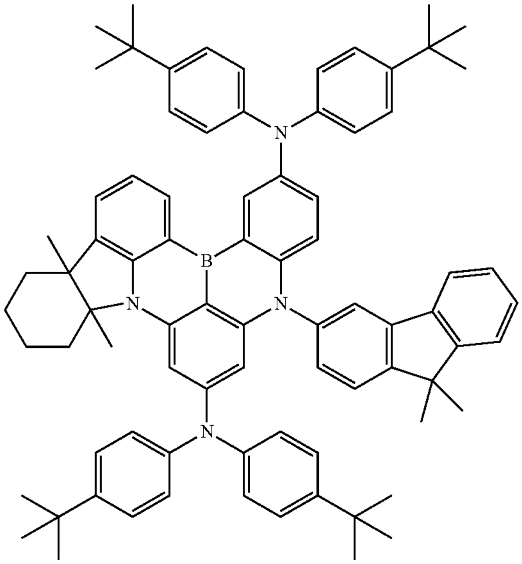
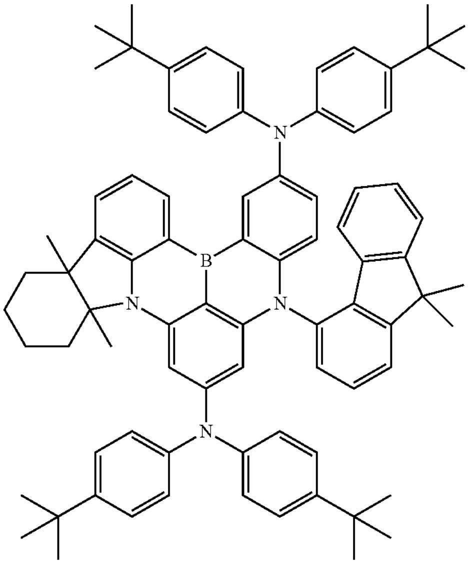

-continued
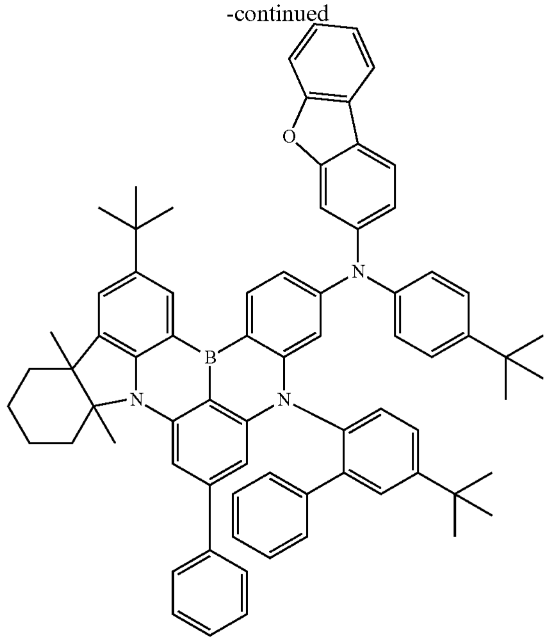
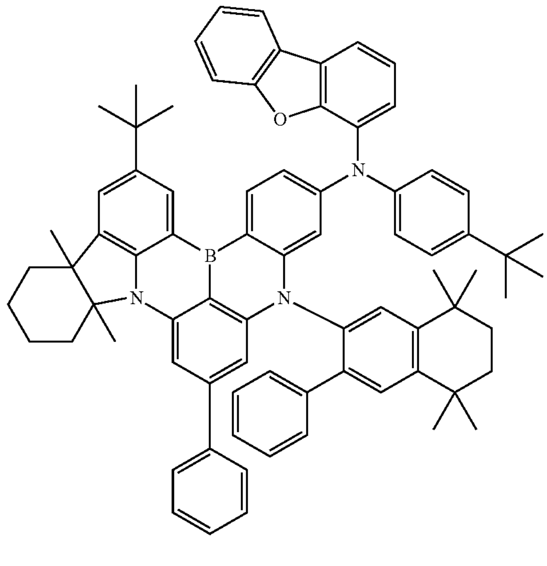
-continued
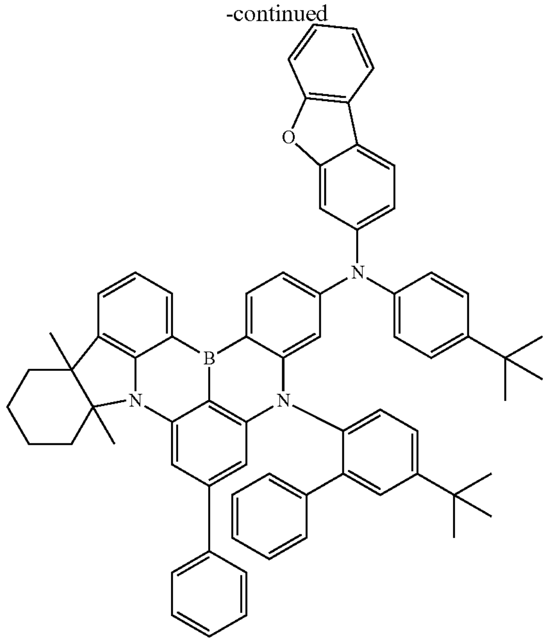
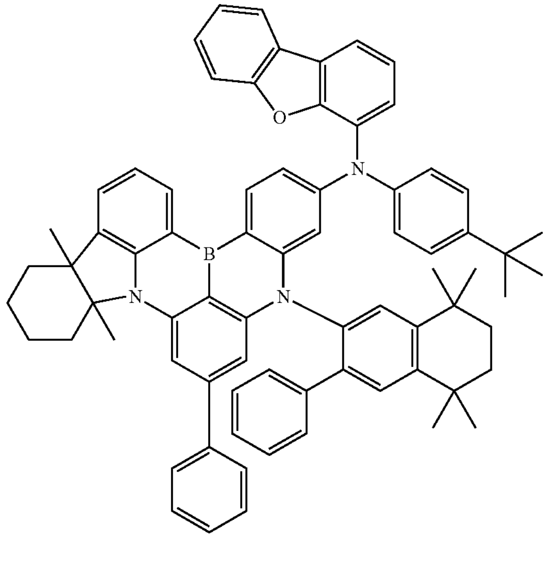

-continued
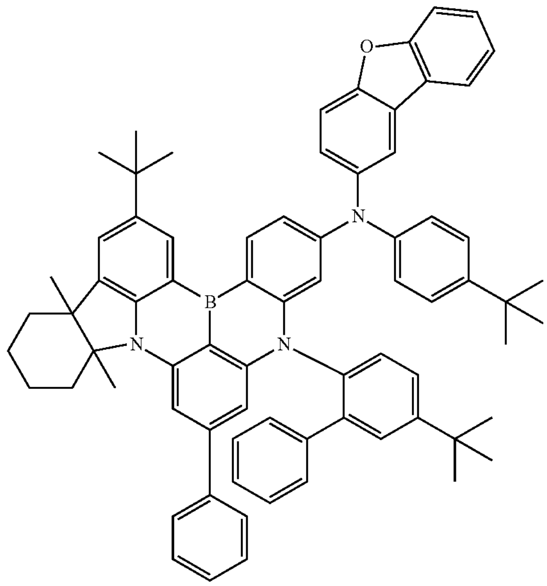
-continued
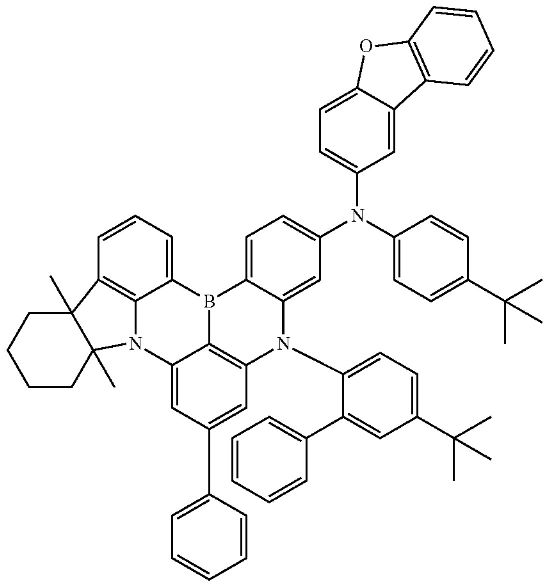
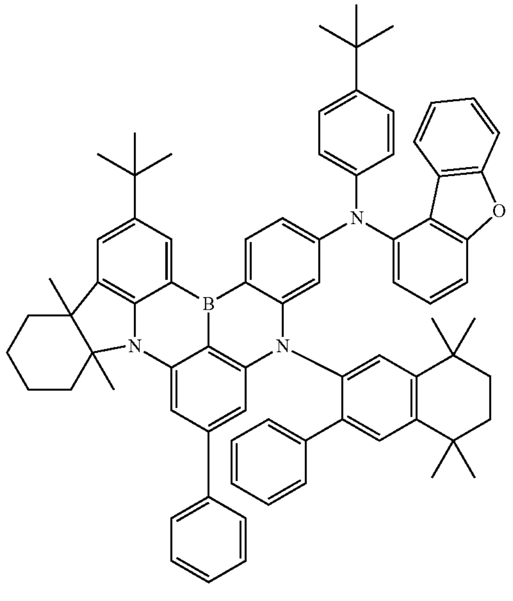
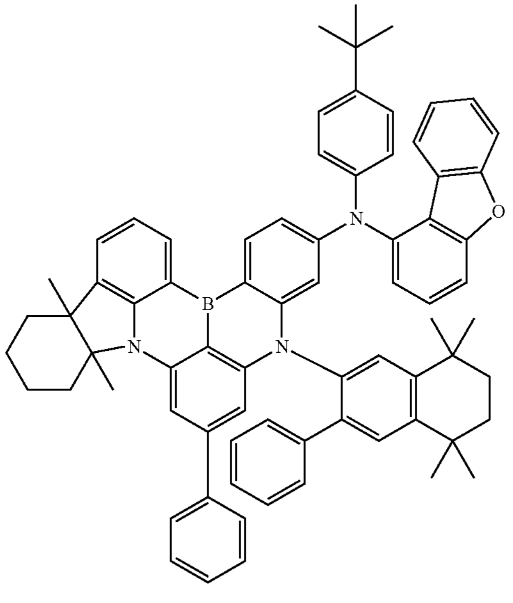

-continued
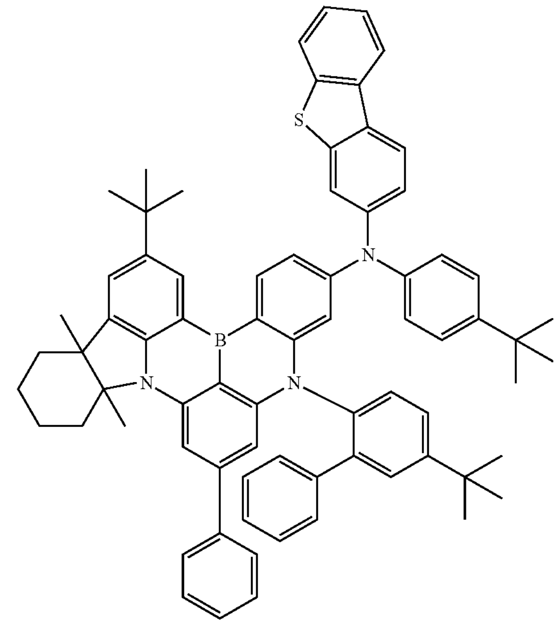
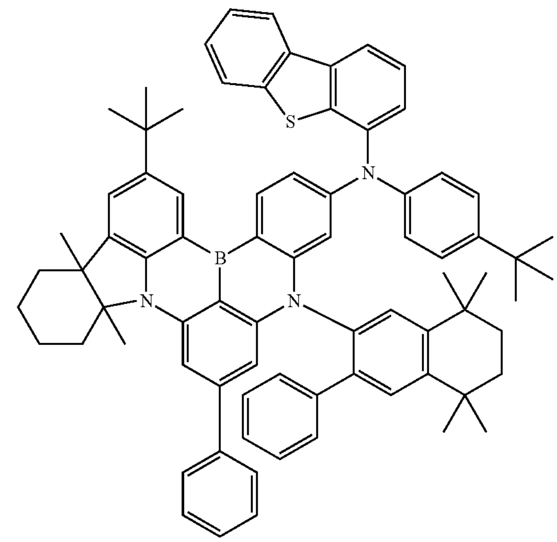
-continued
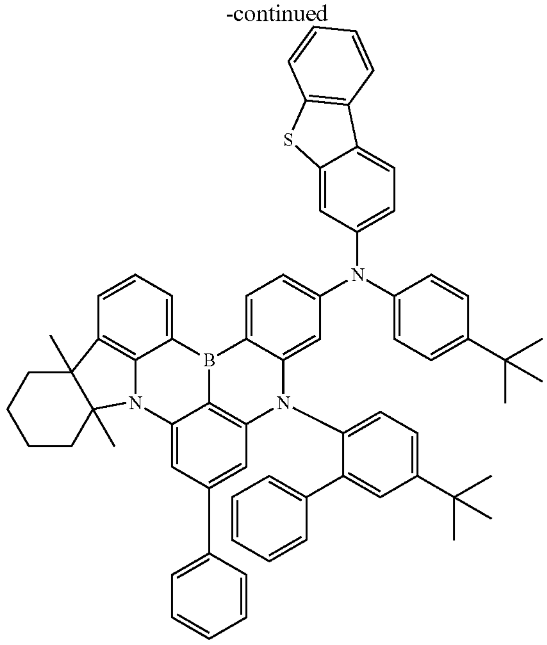
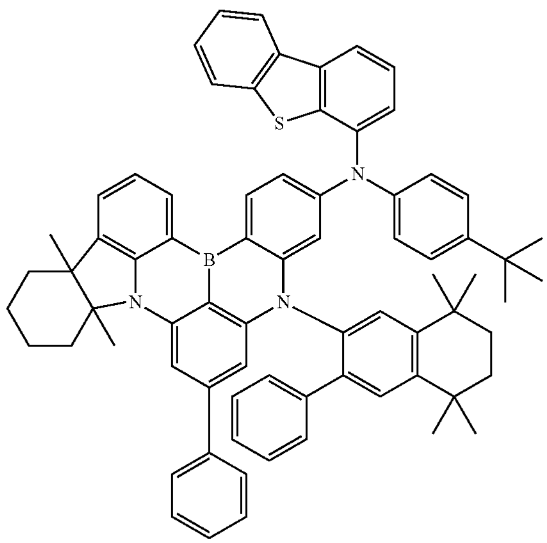

-continued
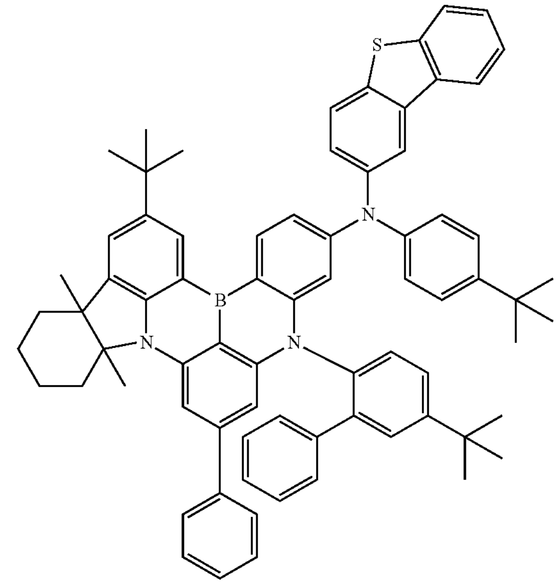
-continued
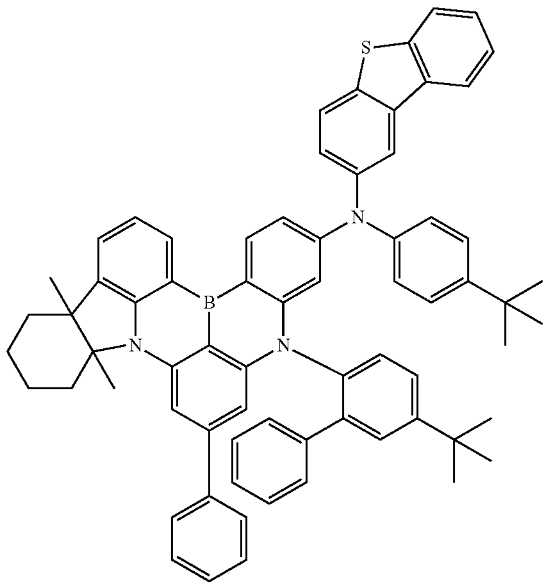
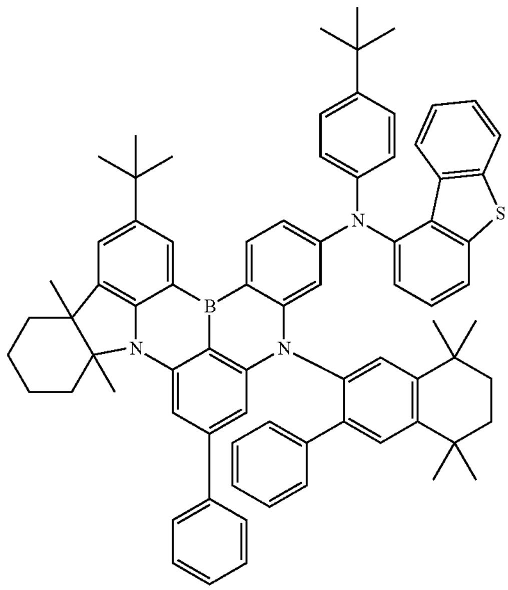
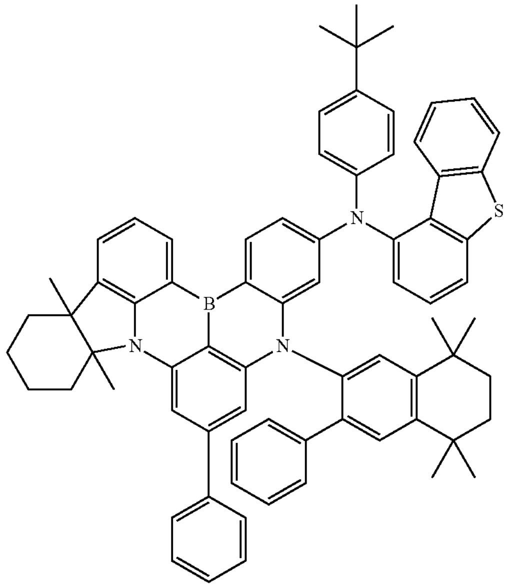

-continued
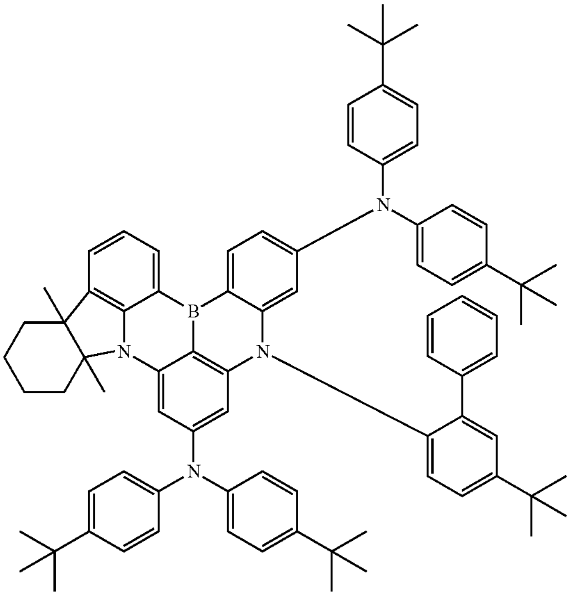
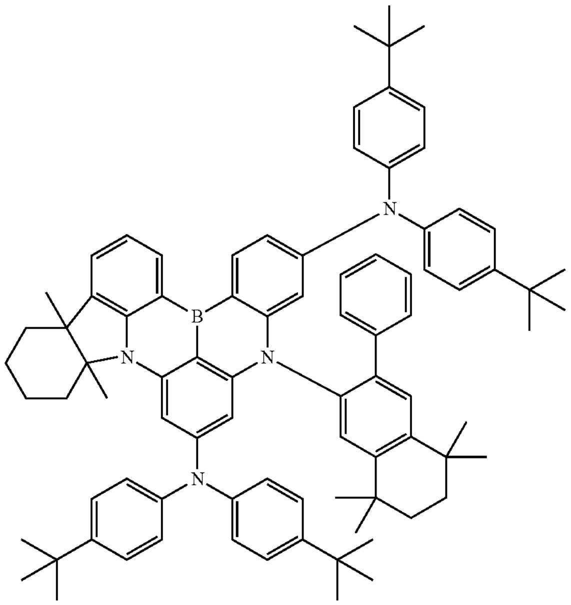
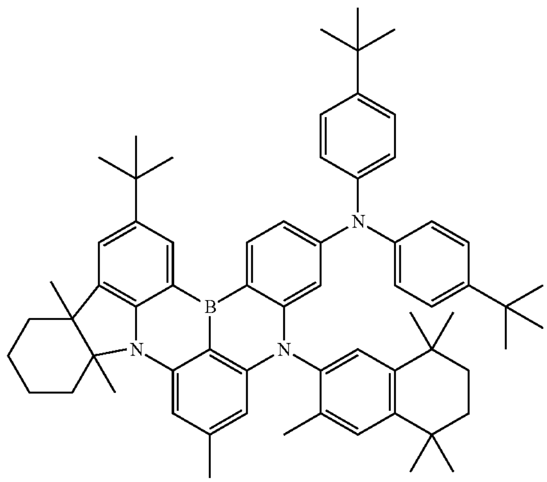
-continued
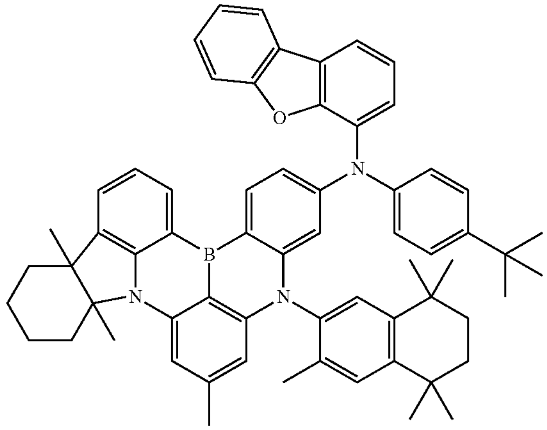
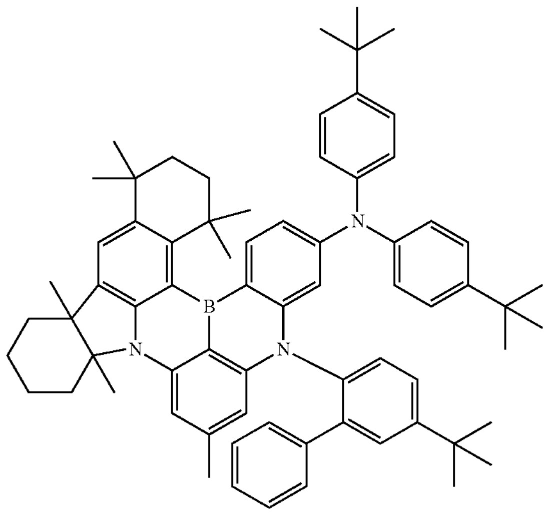
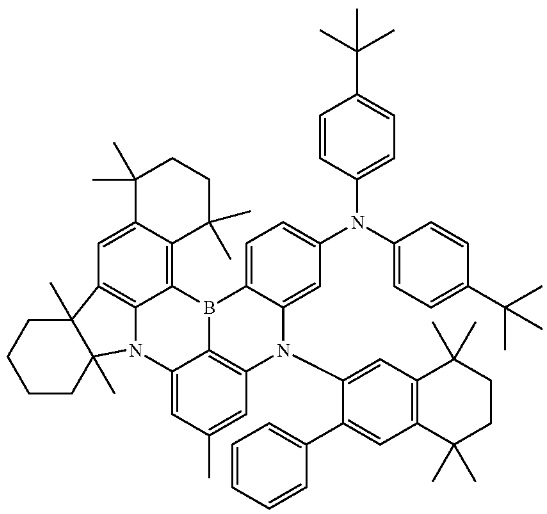

-continued
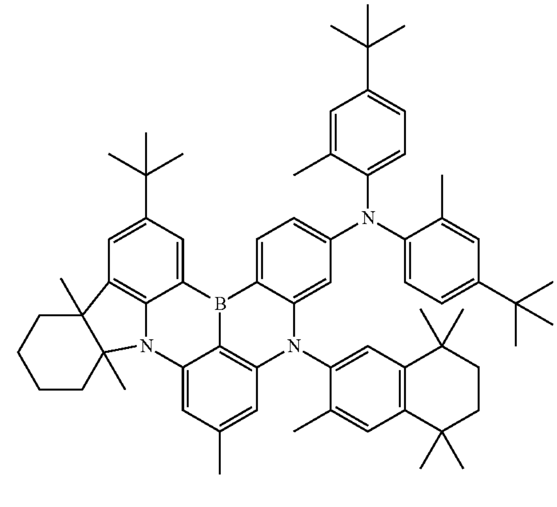
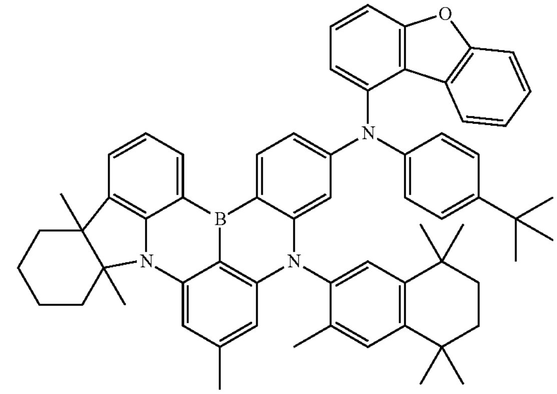
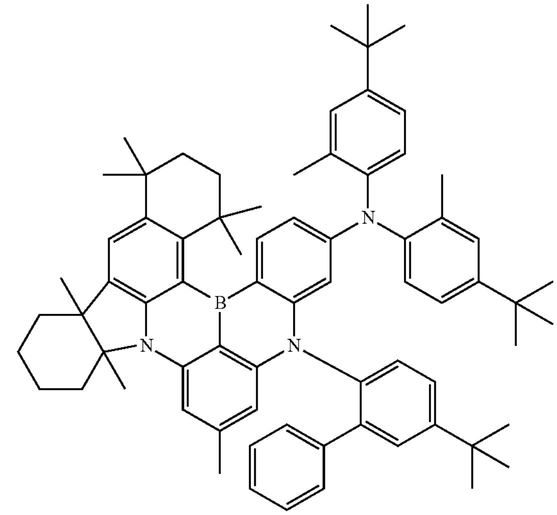
-continued
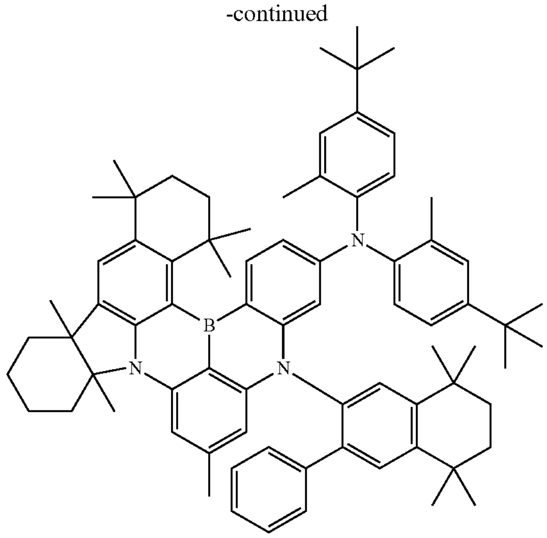
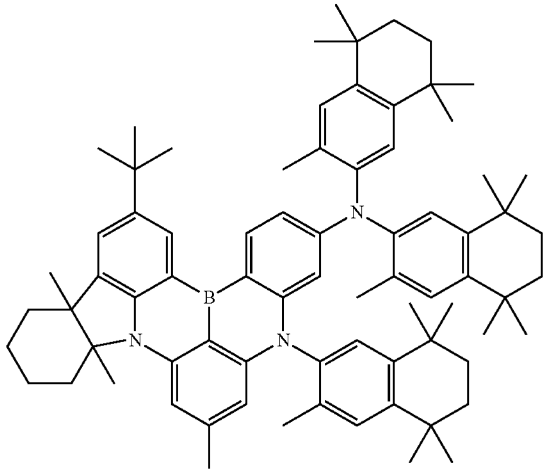
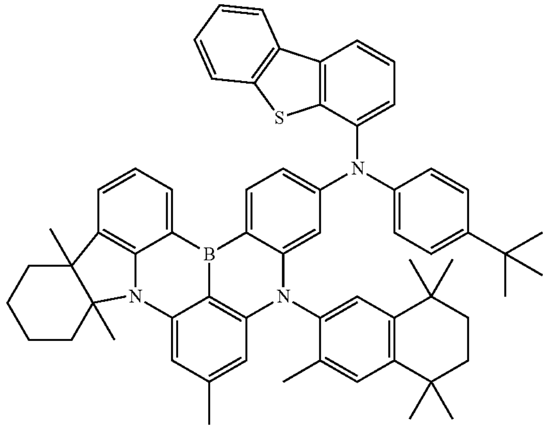

-continued
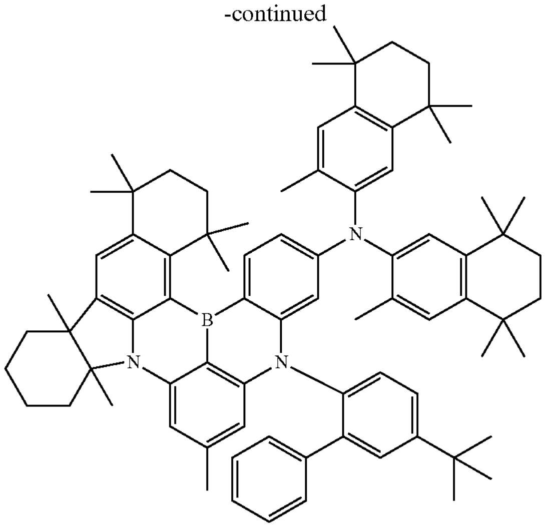
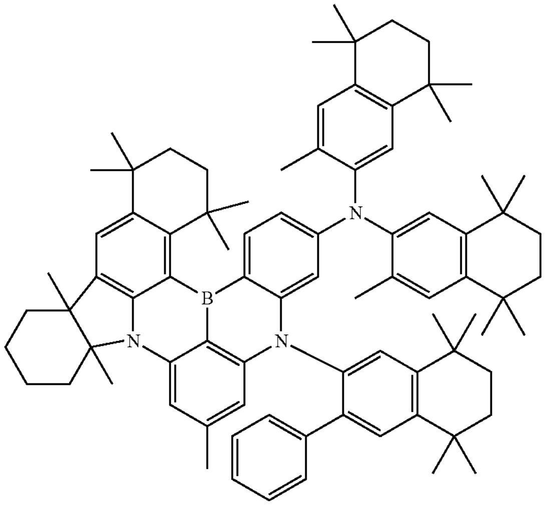
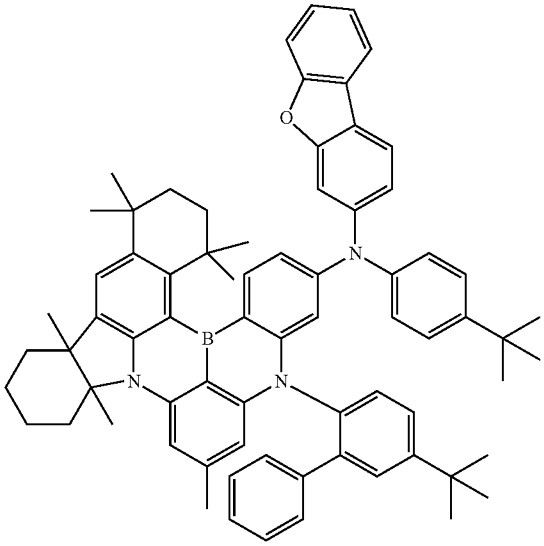
-continued
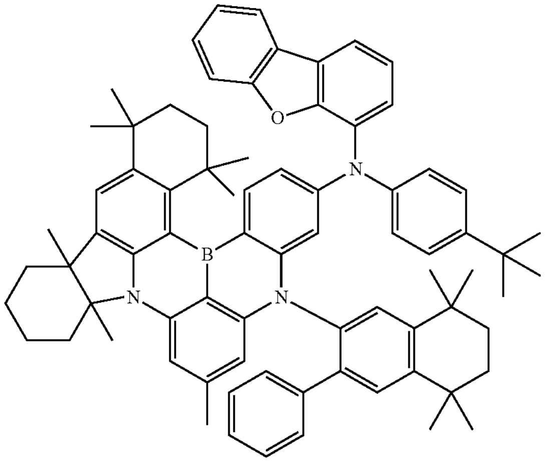
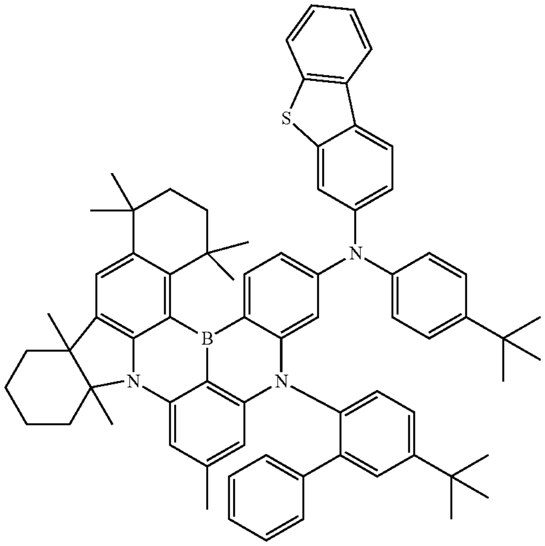
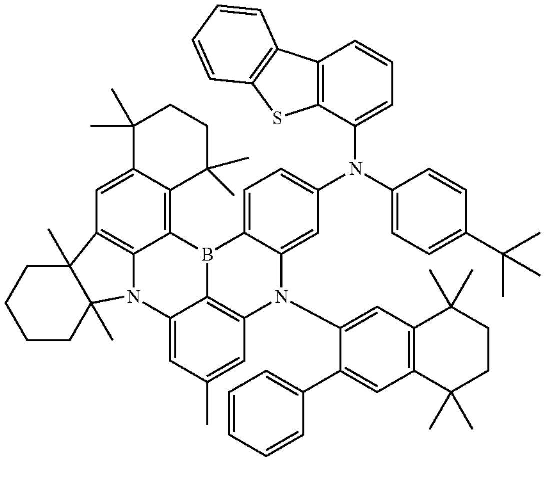

-continued
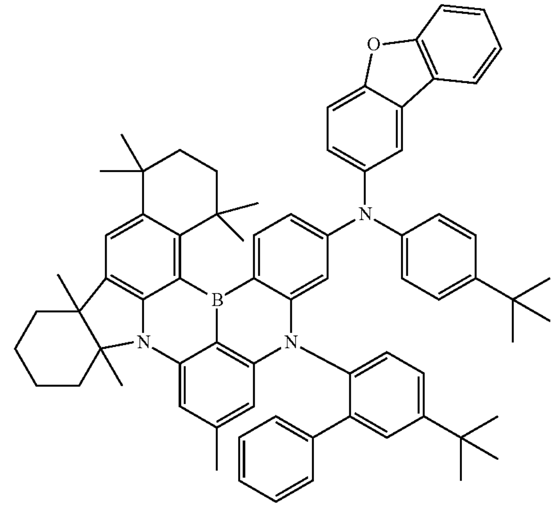
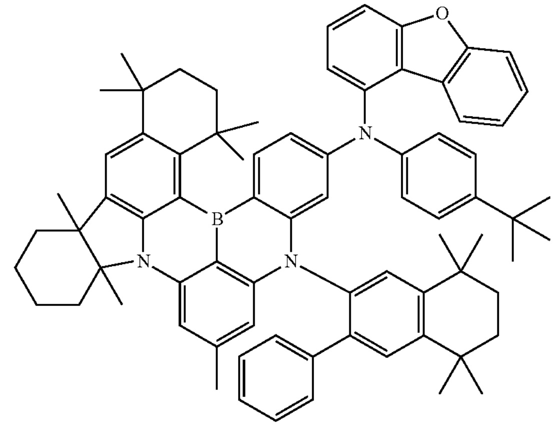
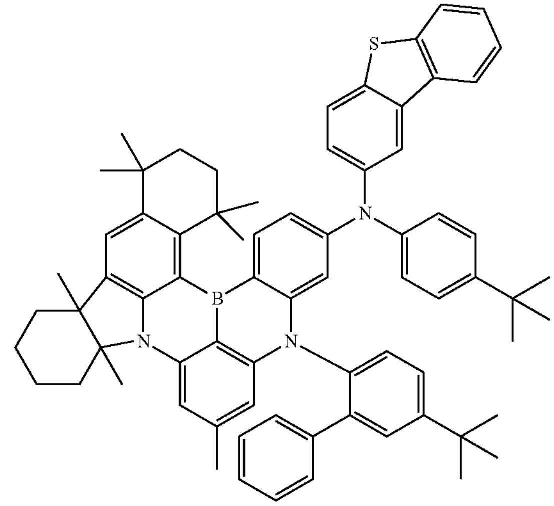
-continued
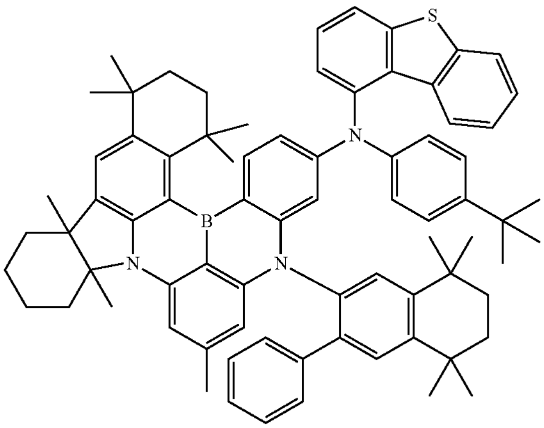
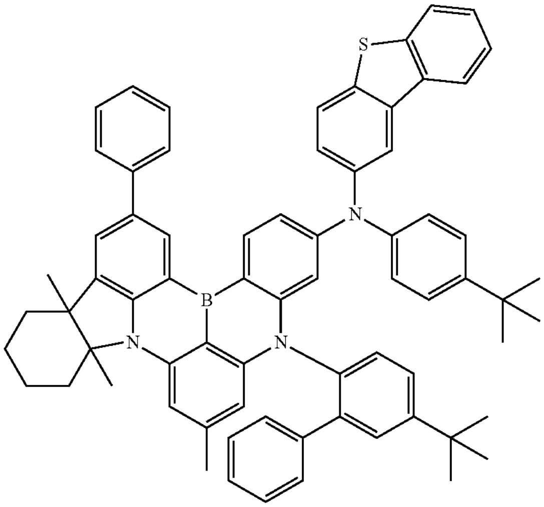
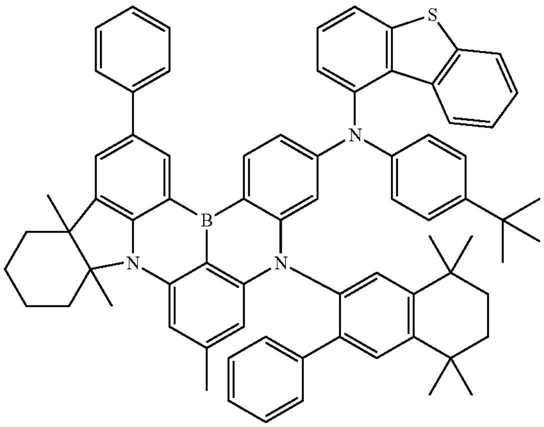

-continued
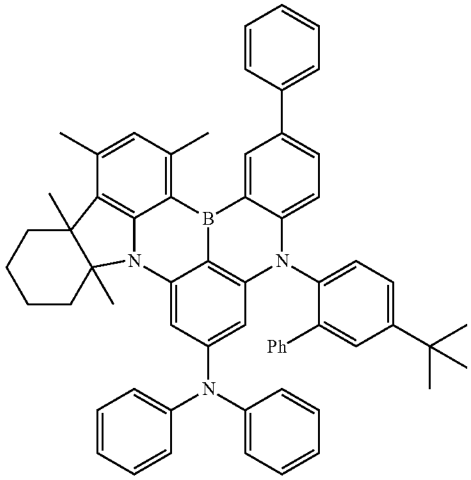
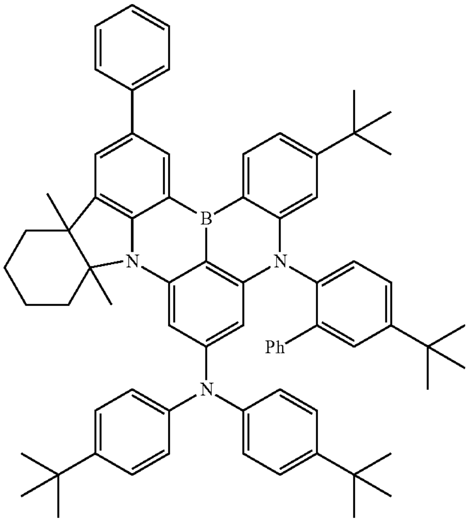
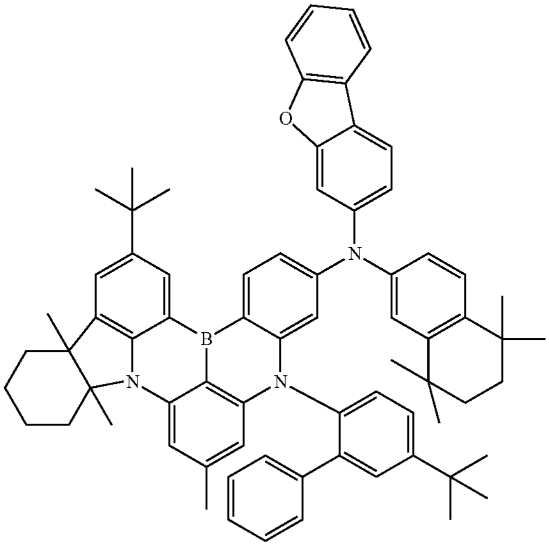
-continued
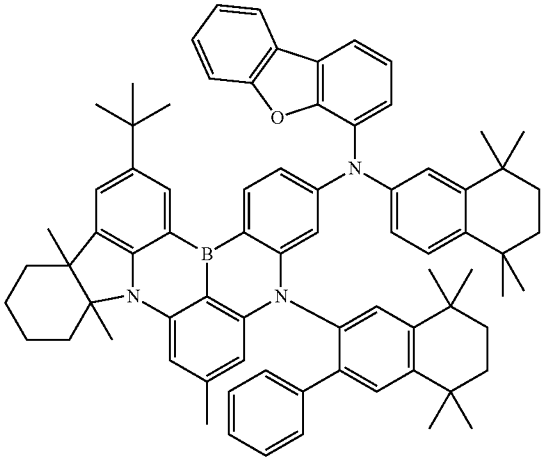
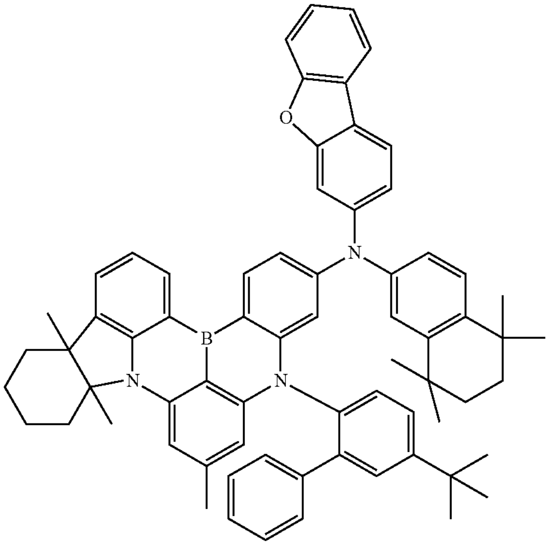
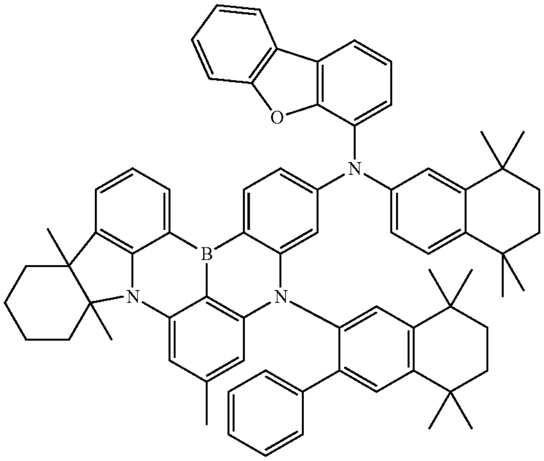

-continued
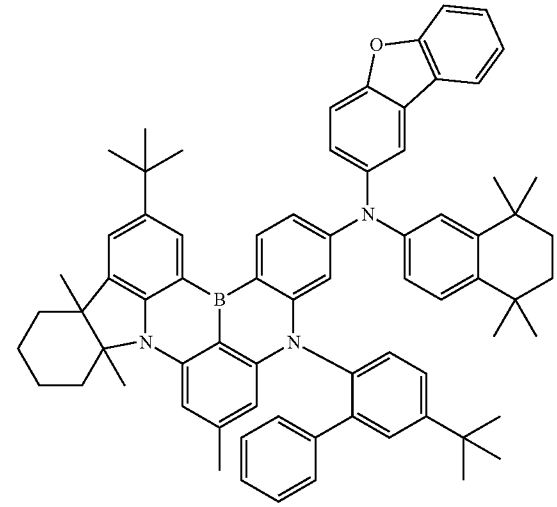
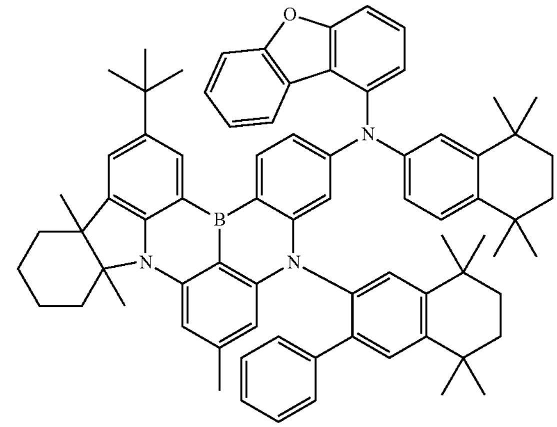
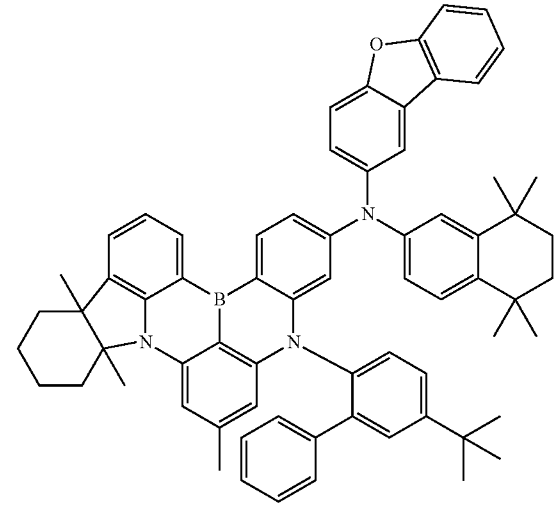
-continued
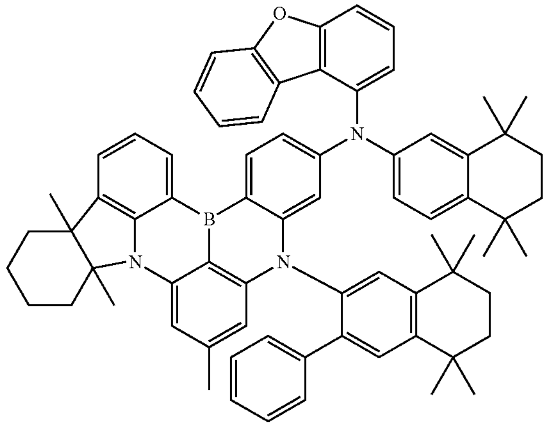
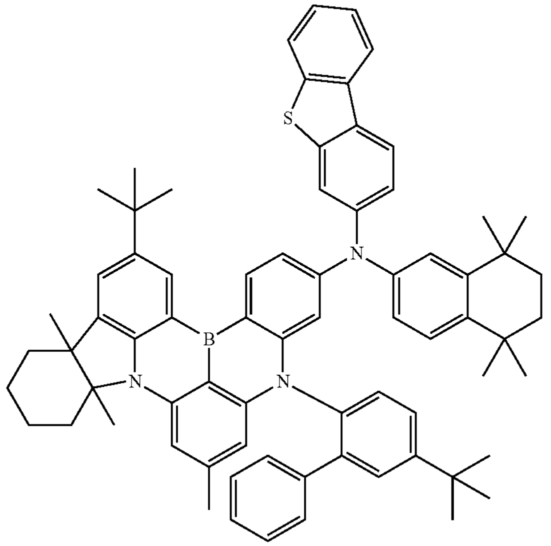
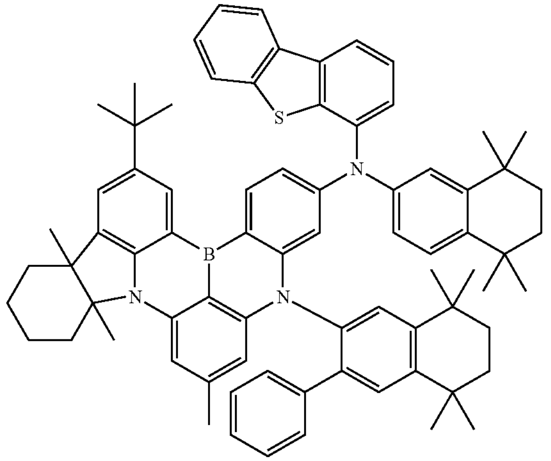

-continued
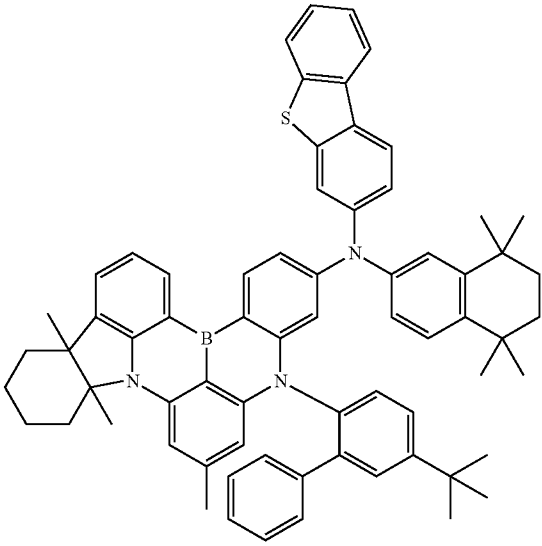
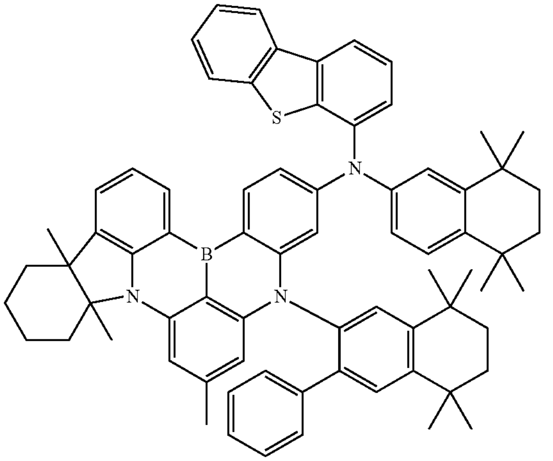
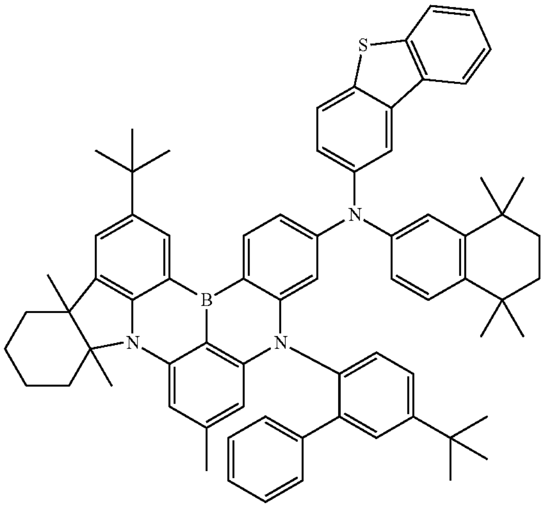
-continued
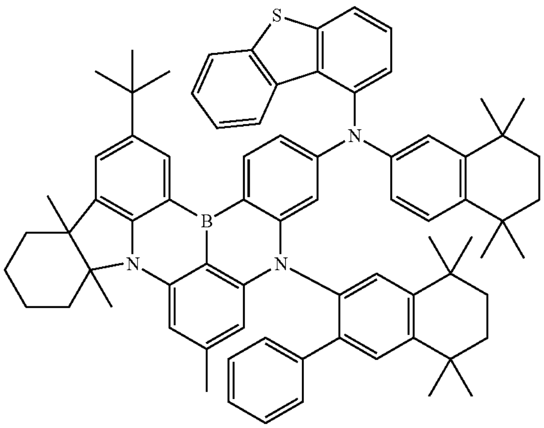
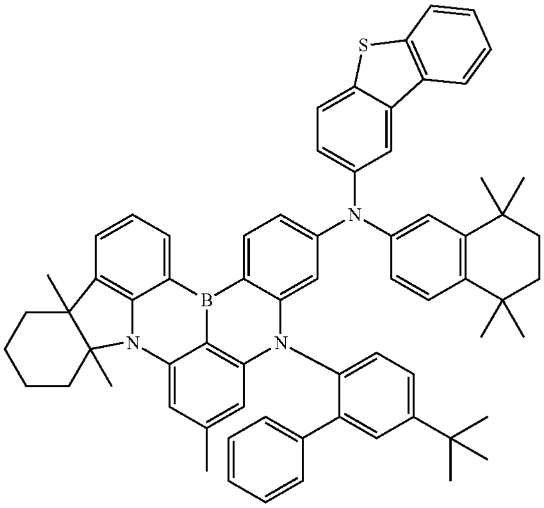
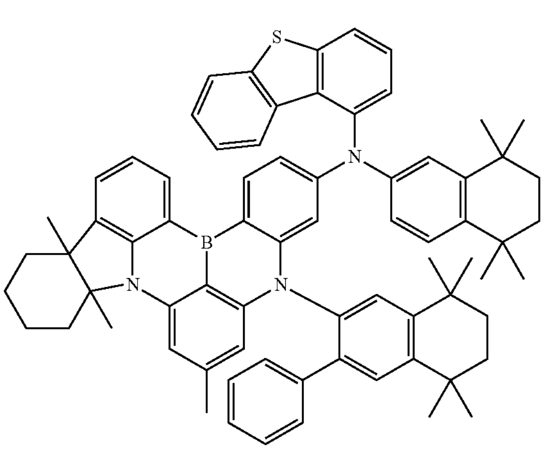

-continued
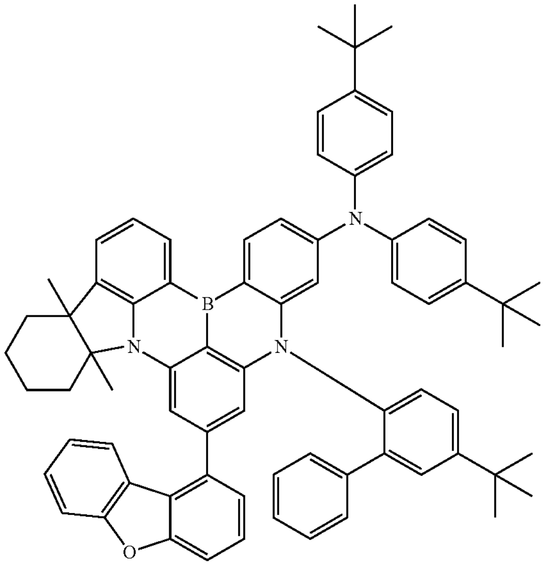
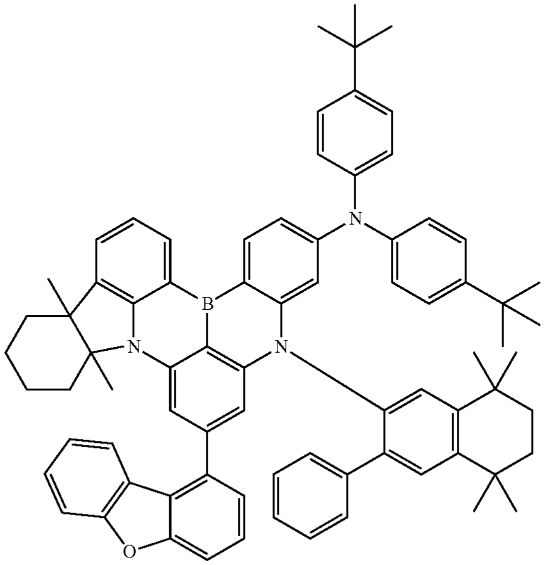
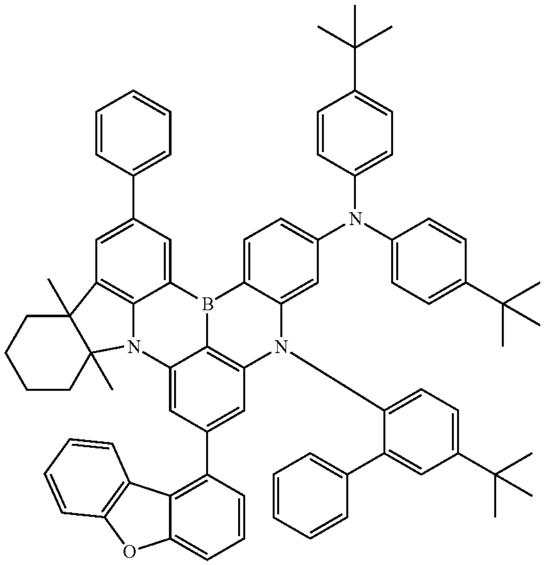
-continued
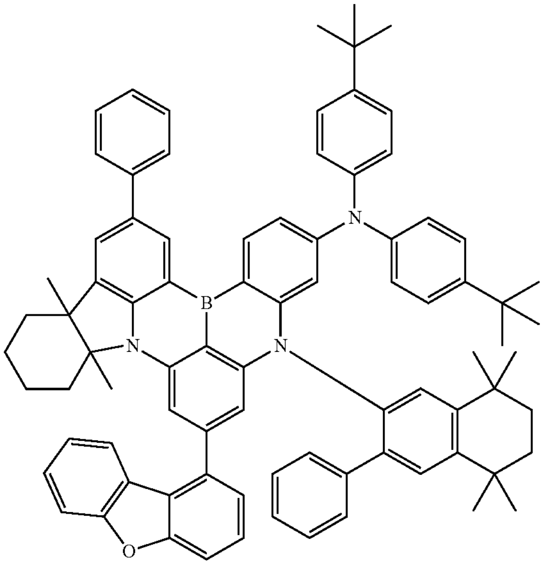
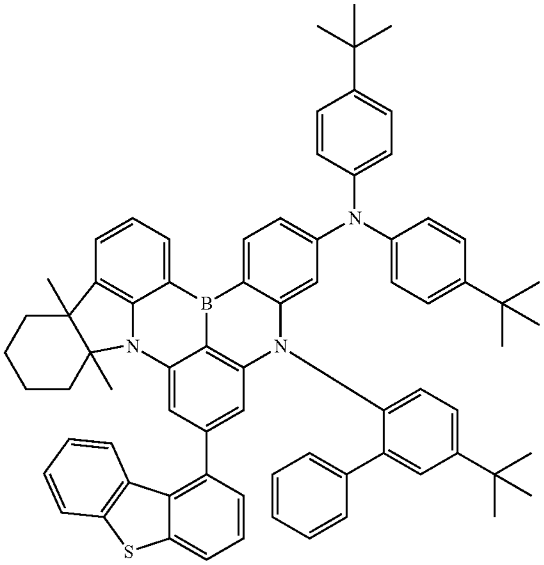
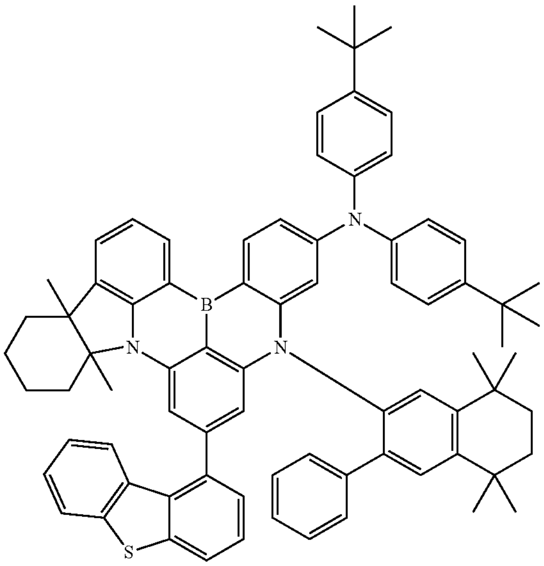

-continued
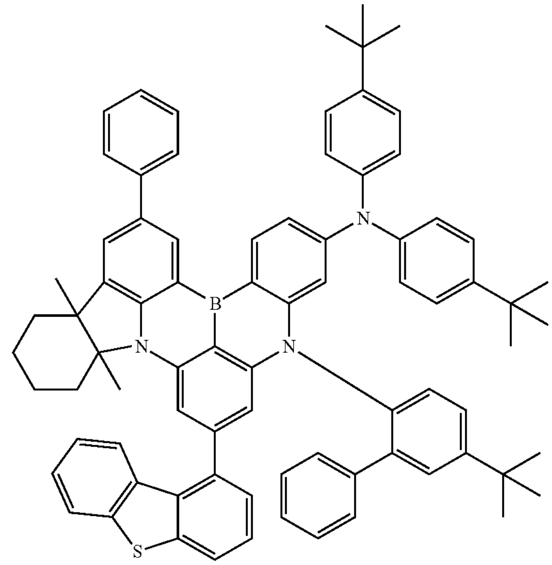
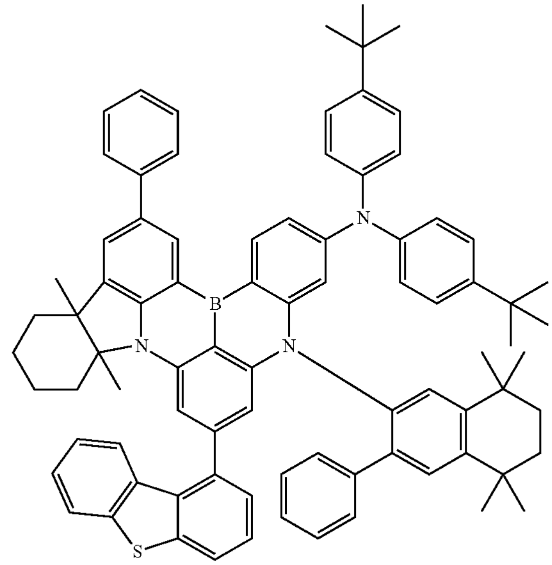
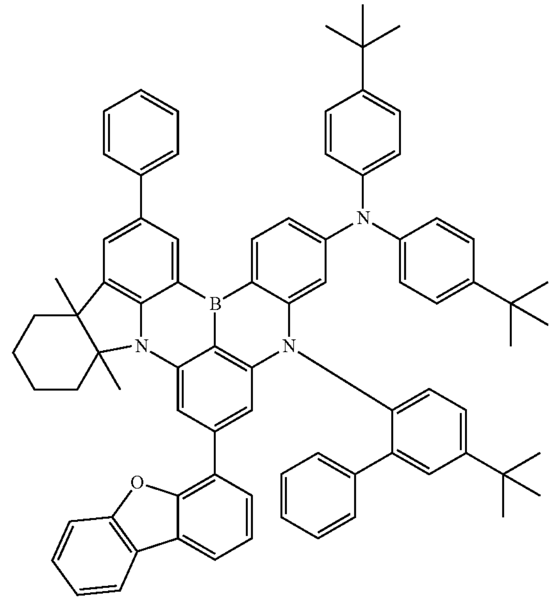
-continued
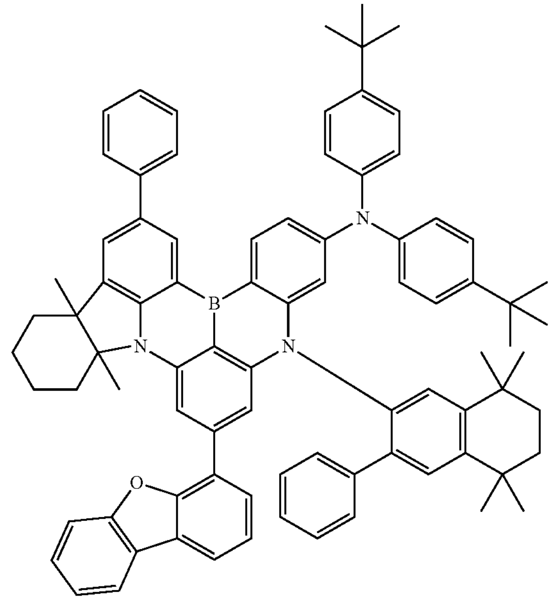
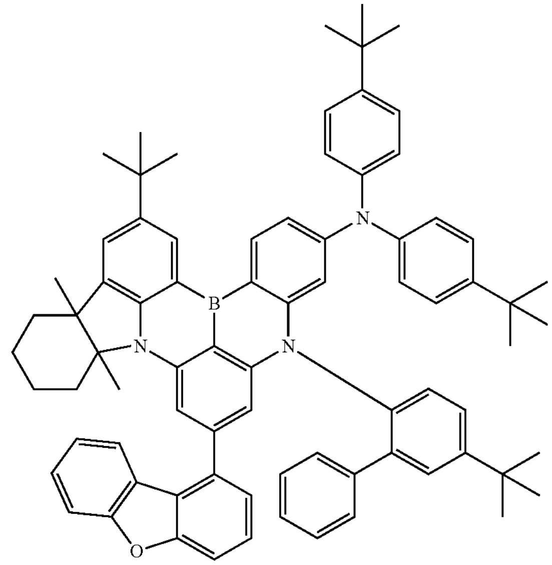
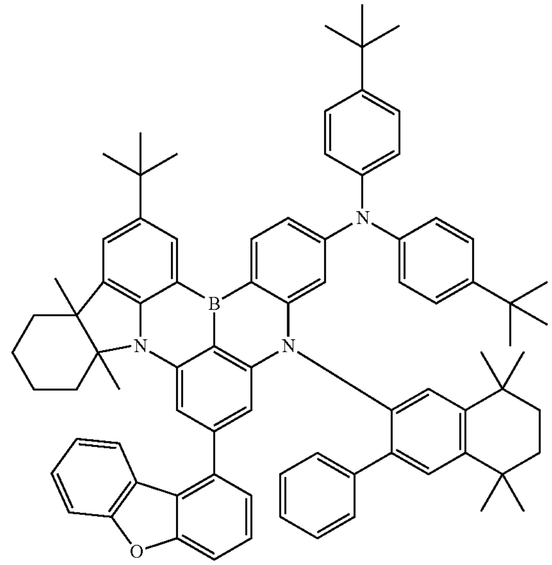

-continued
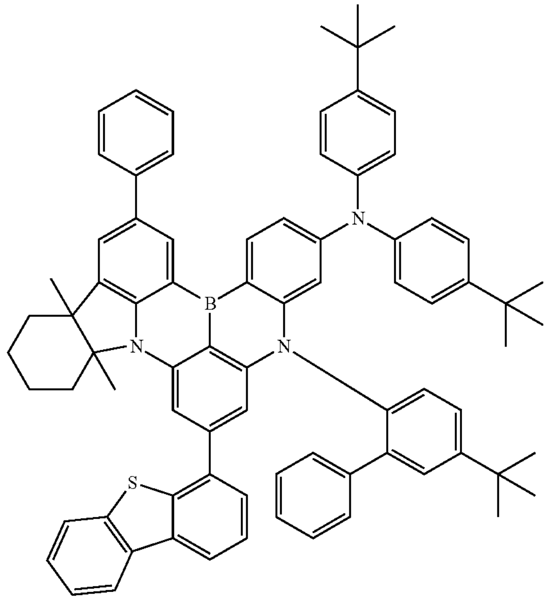
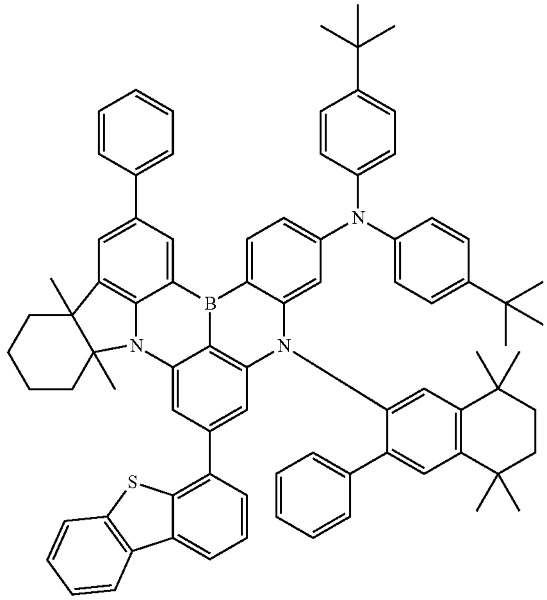
-continued
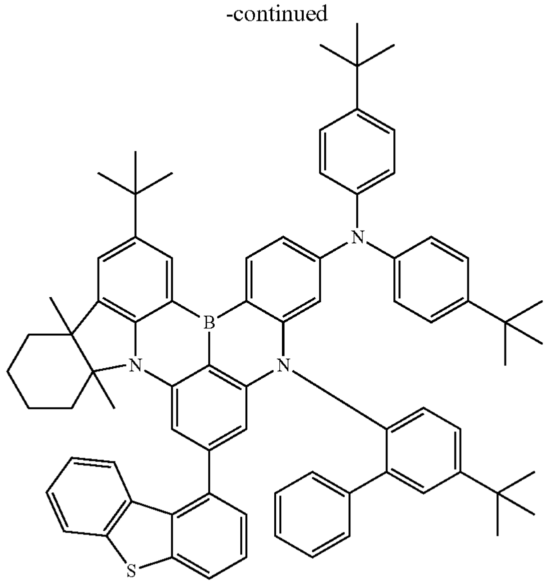
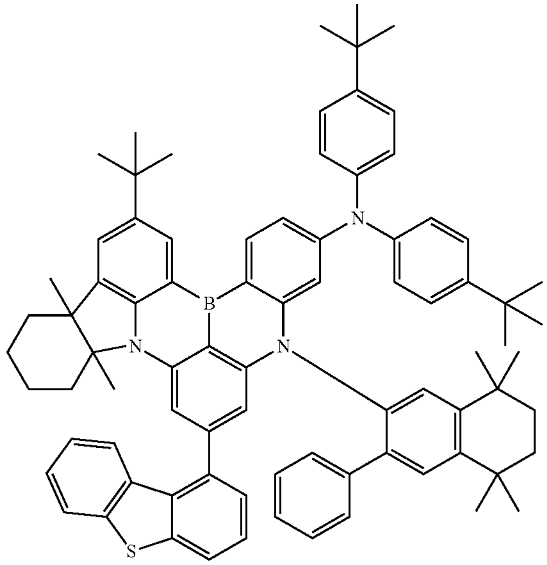
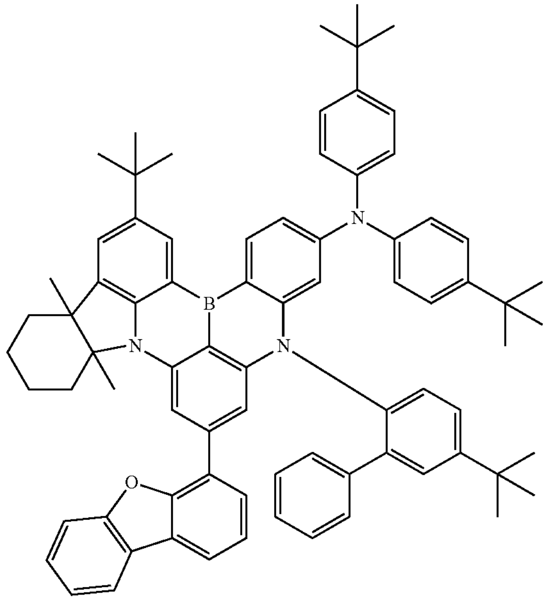

-continued
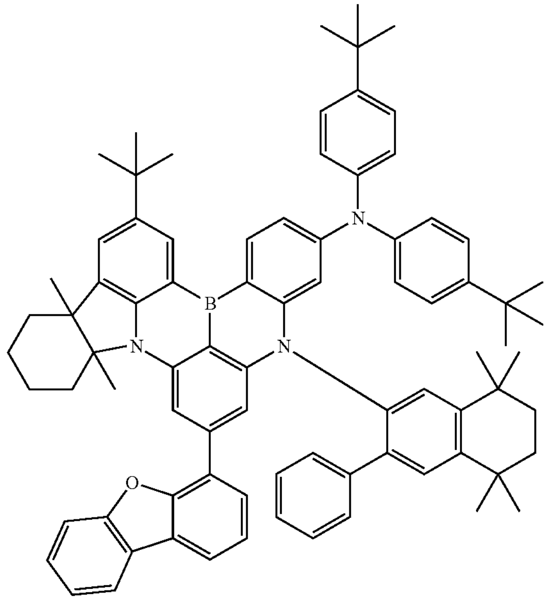
-continued
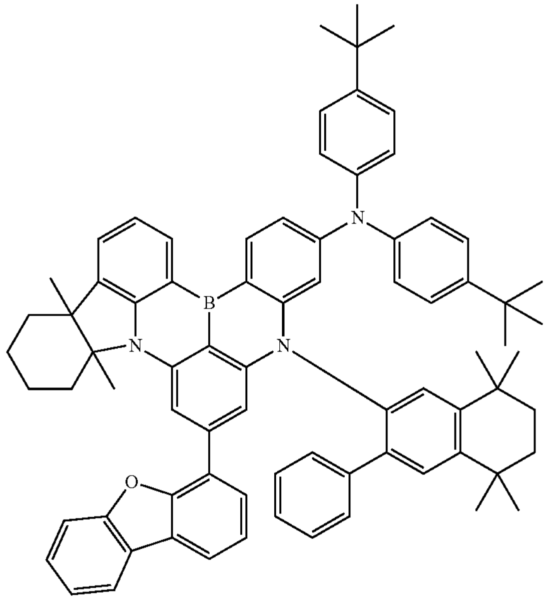
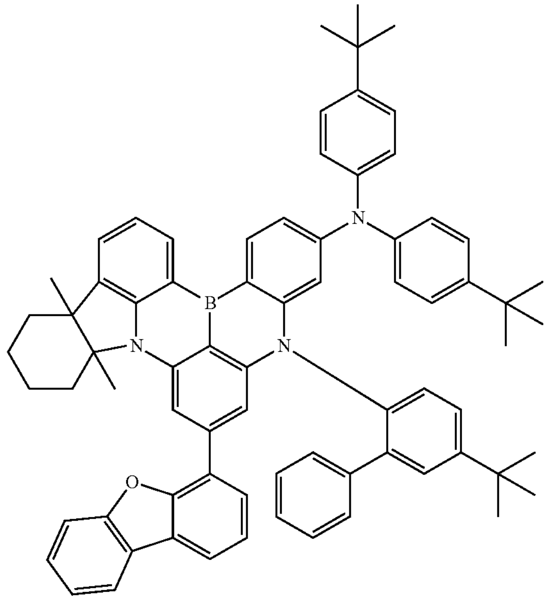
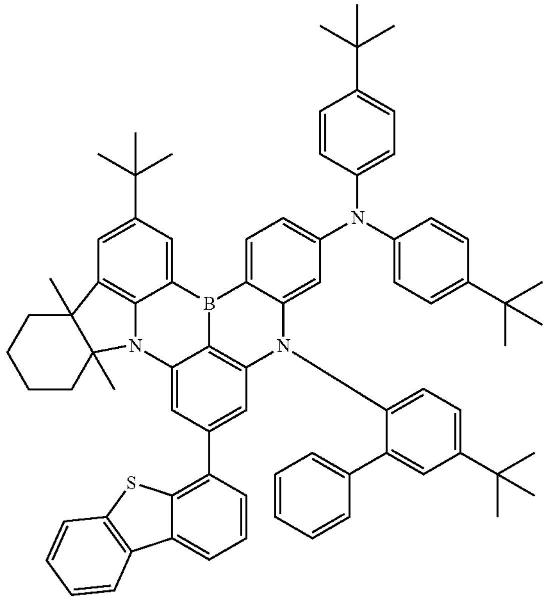

-continued
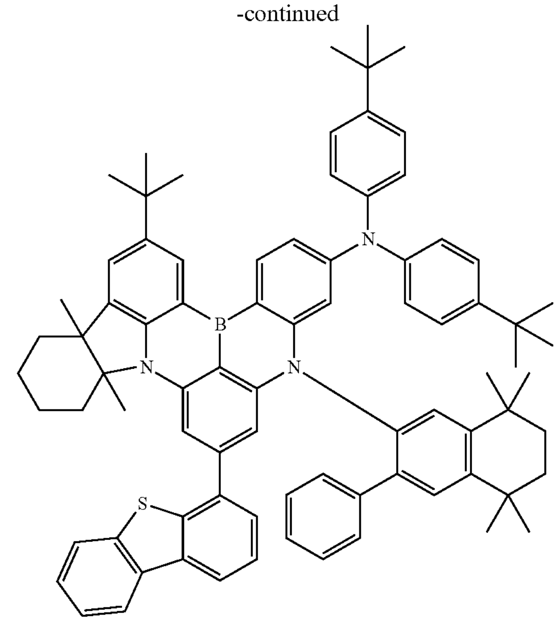
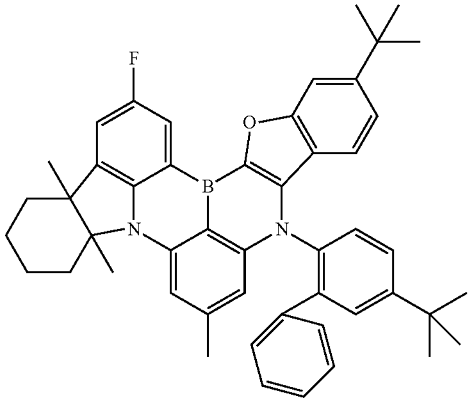
-continued
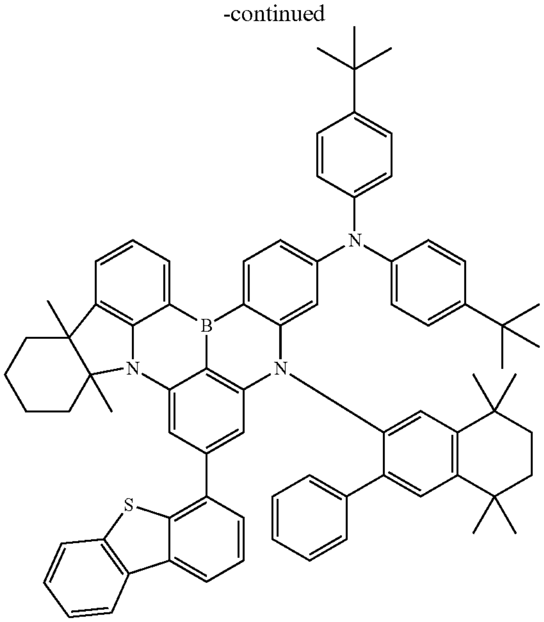
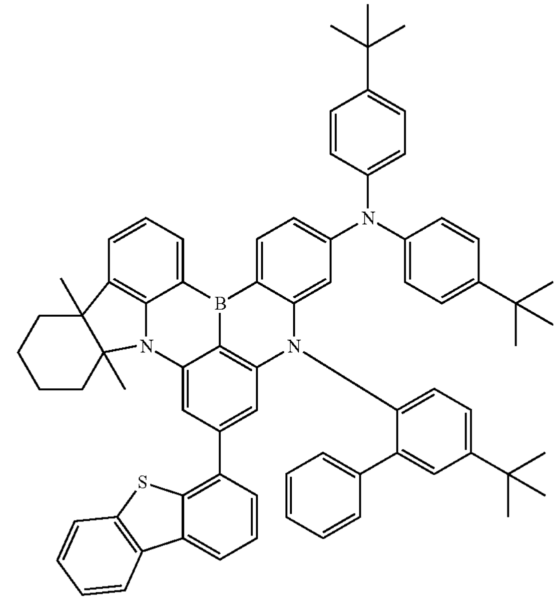
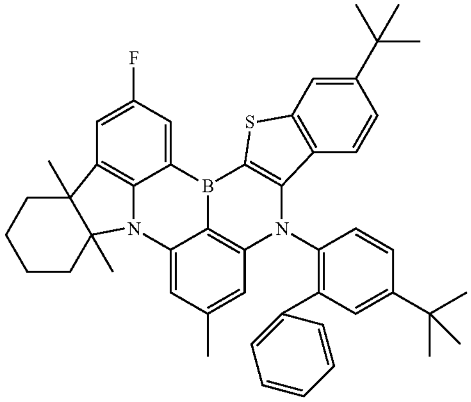

-continued
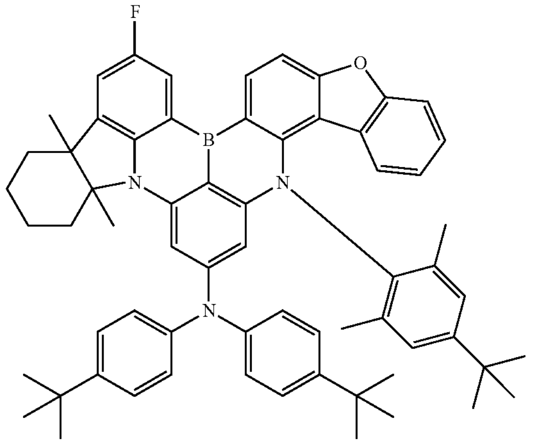
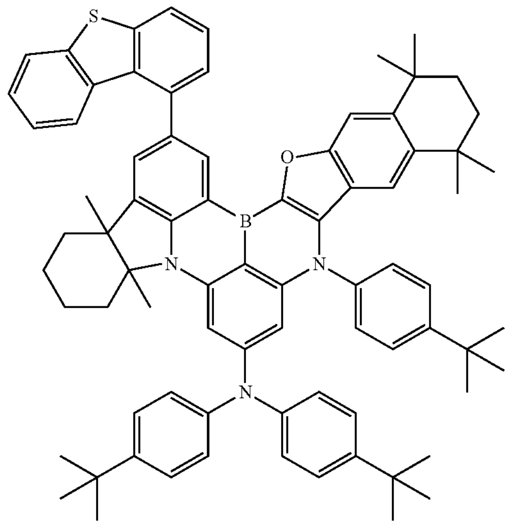
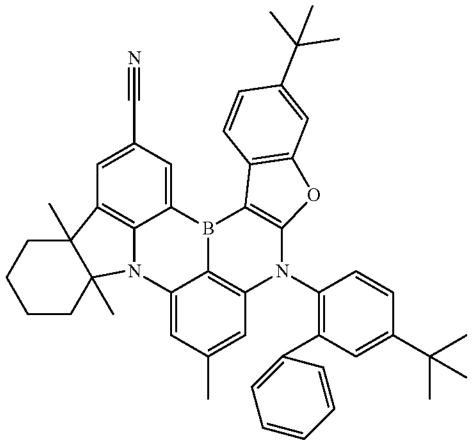
-continued
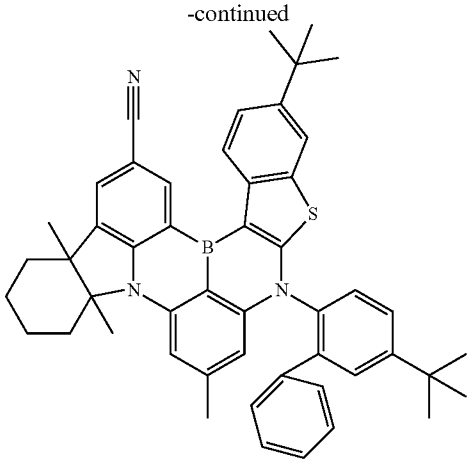
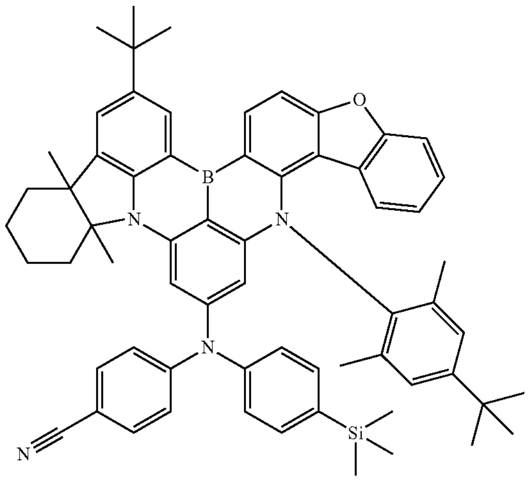
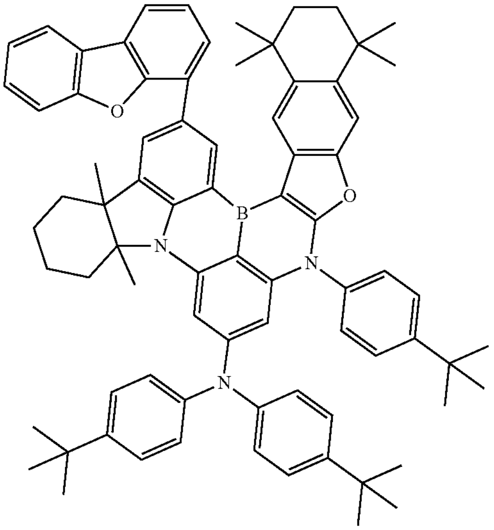

-continued
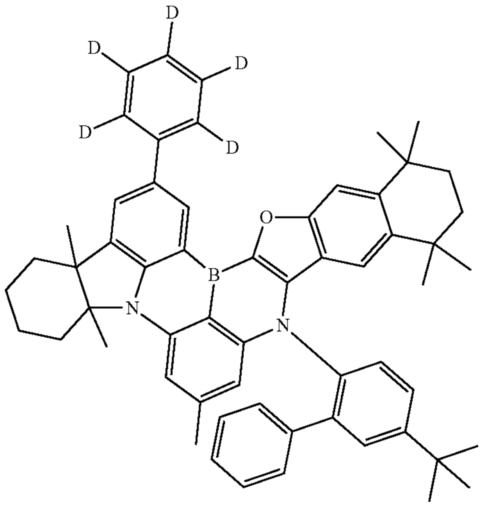
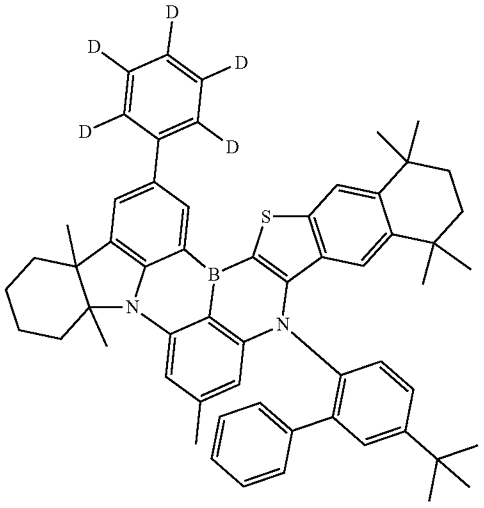
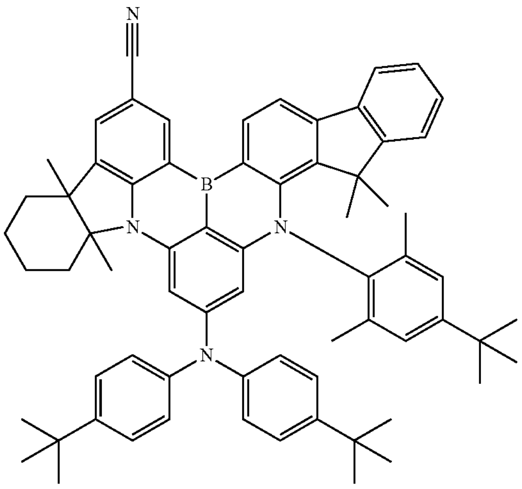
-continued
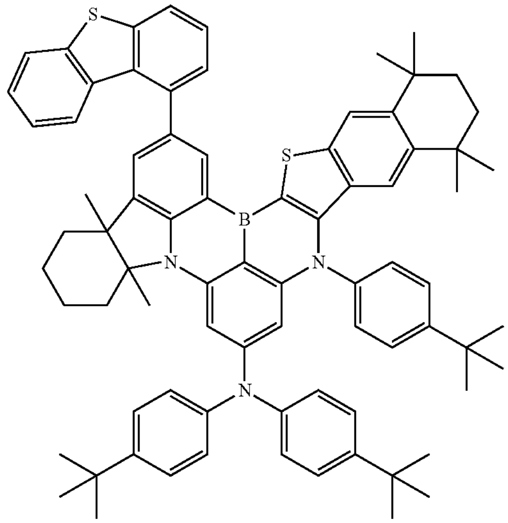
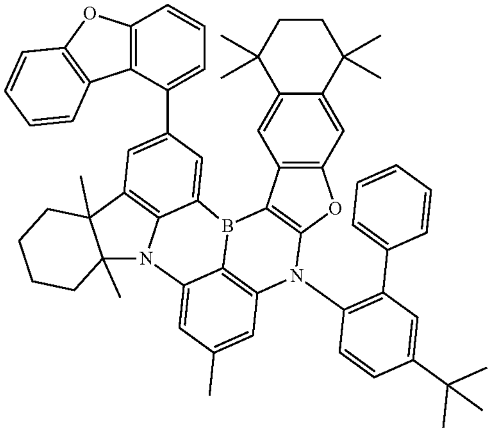
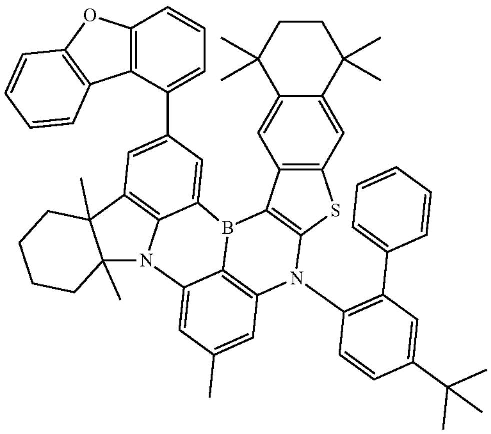

-continued
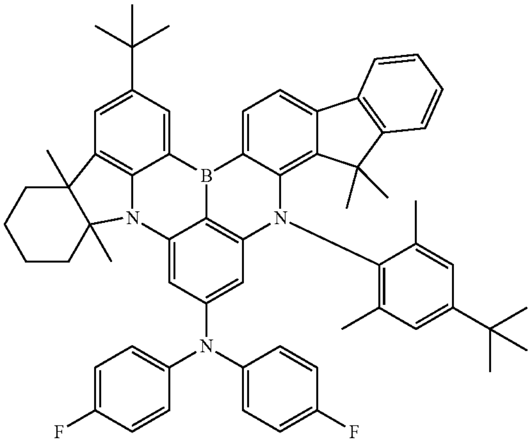
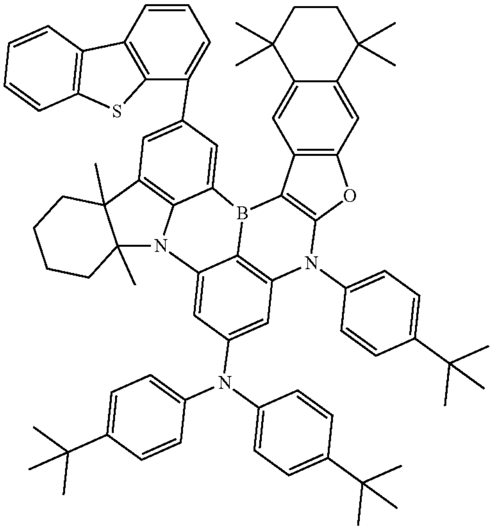
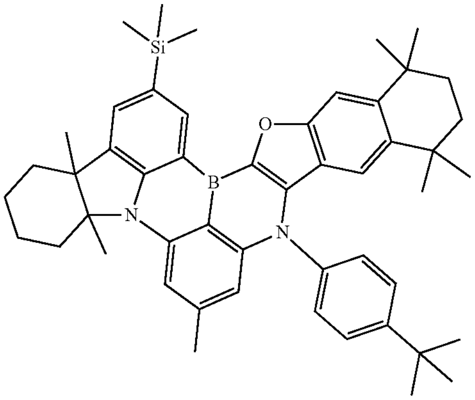
-continued
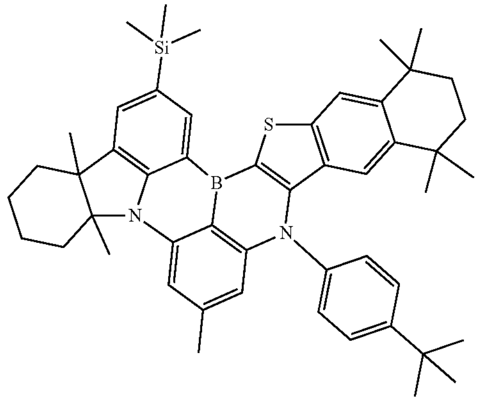
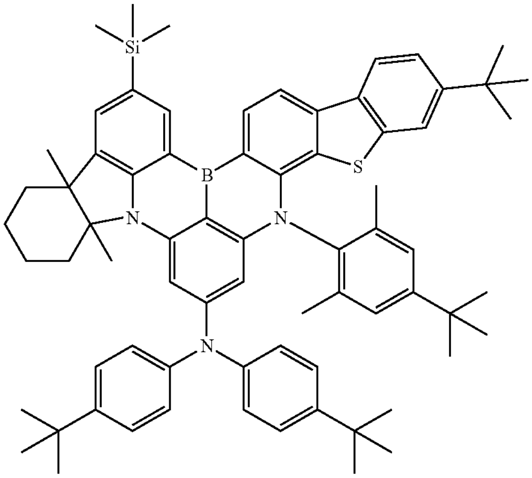
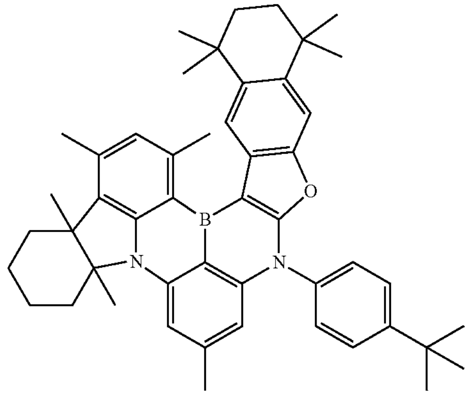
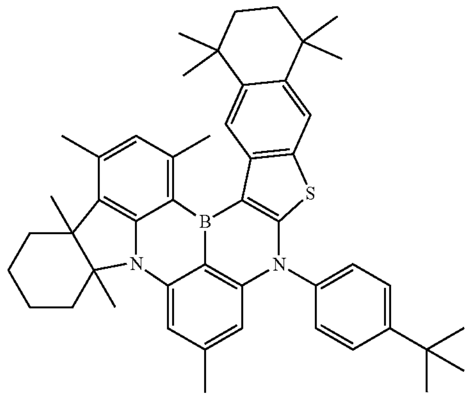

-continued
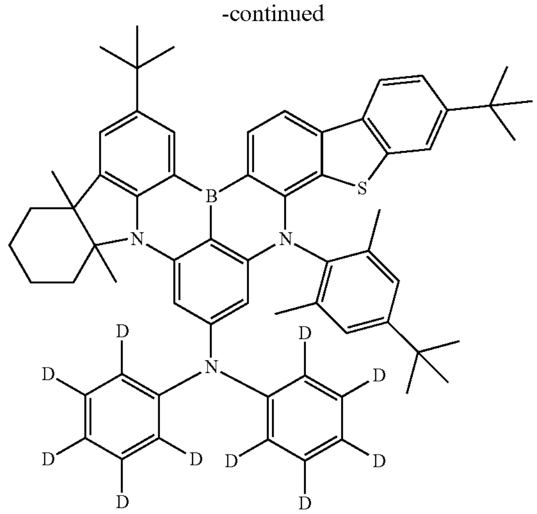
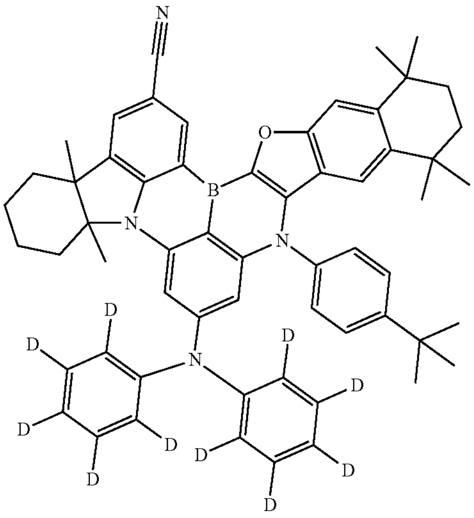
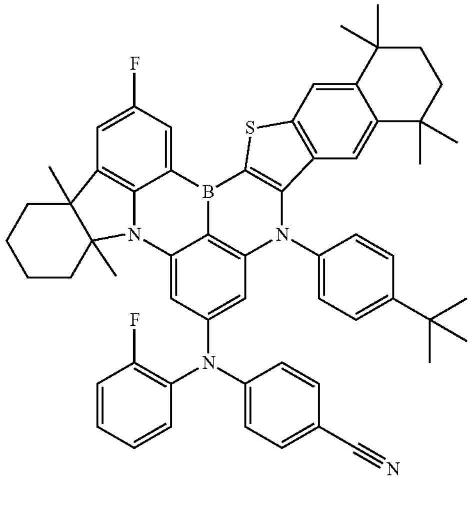
-continued
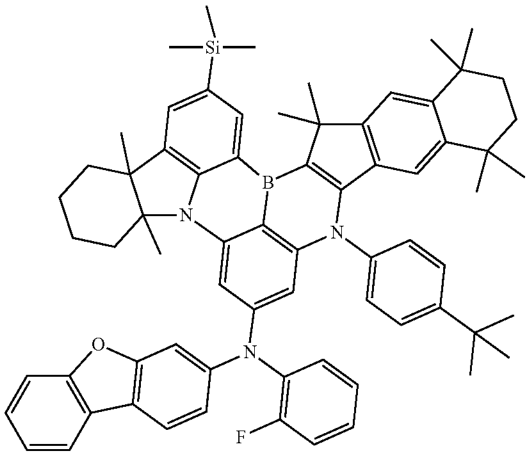
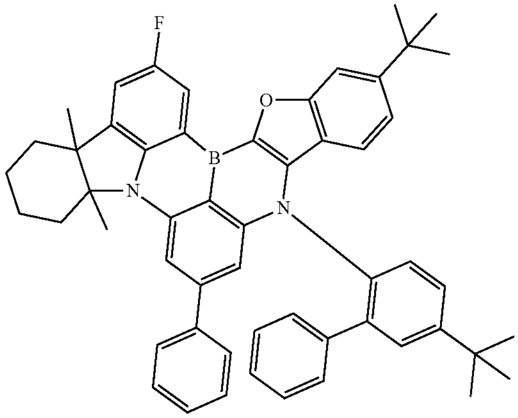
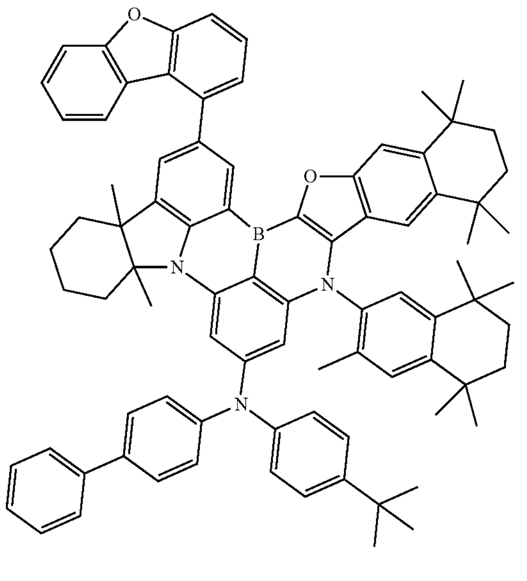

-continued
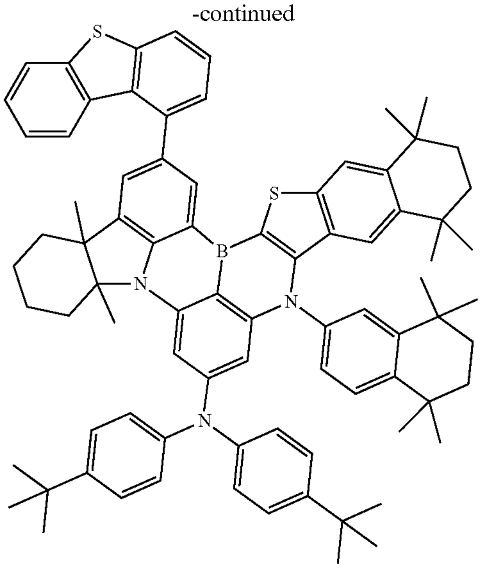
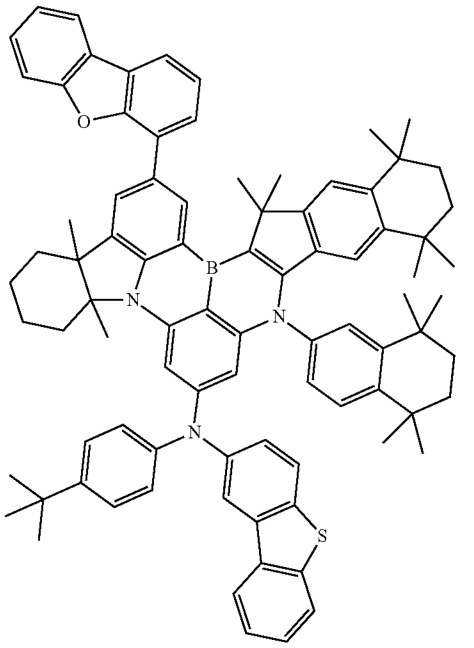
-continued
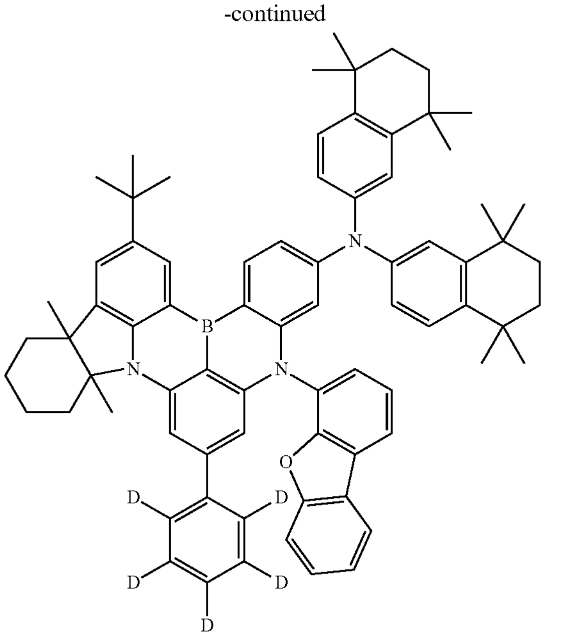
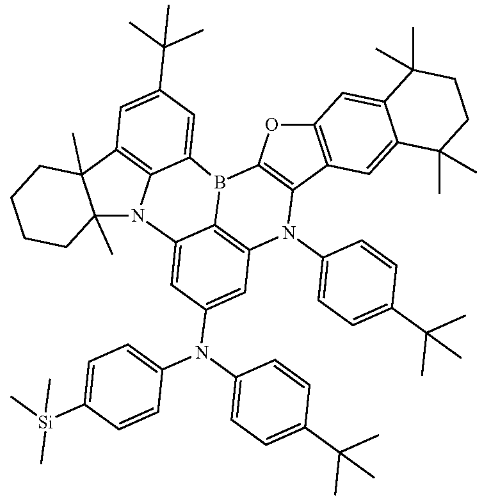
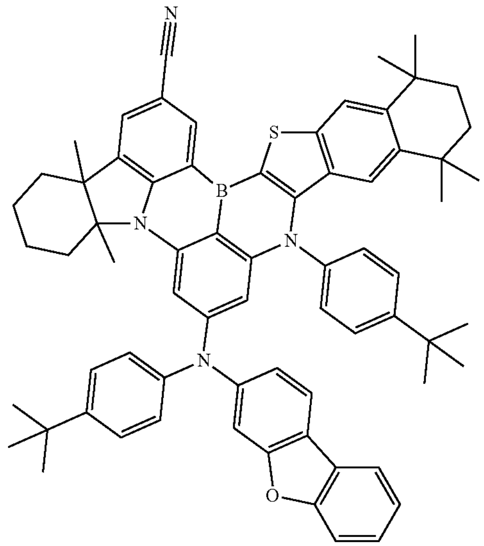

-continued
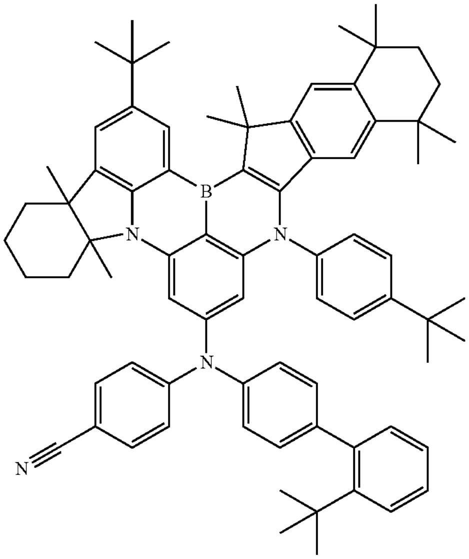
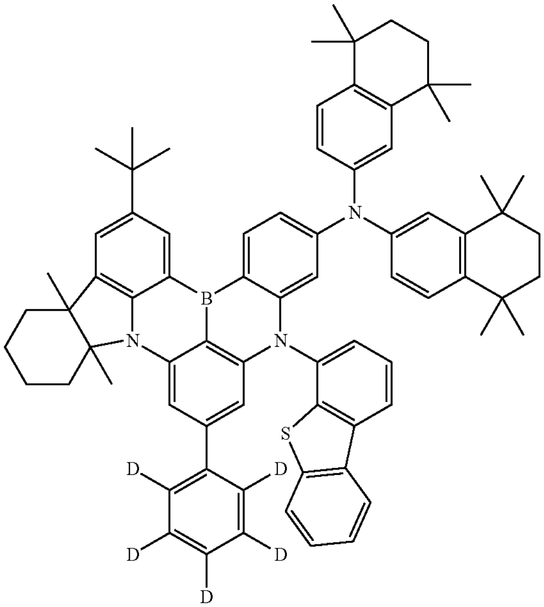
-continued
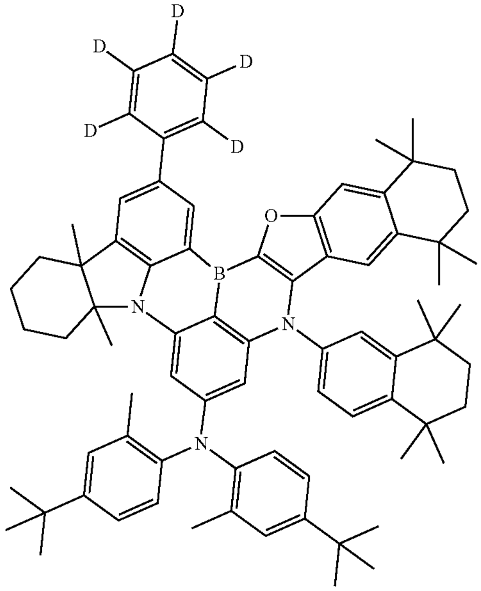
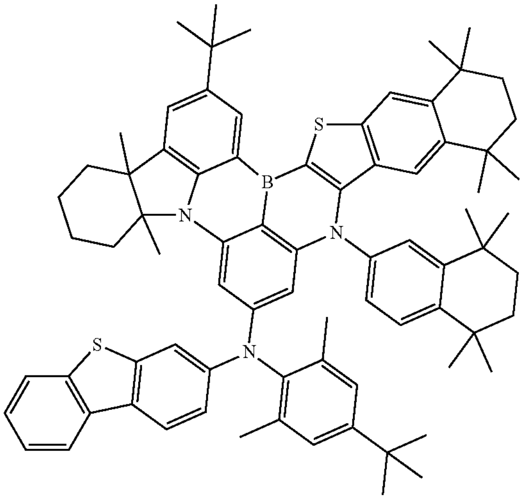
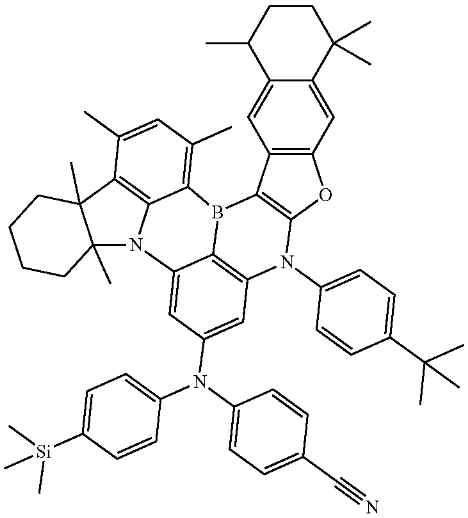

-continued
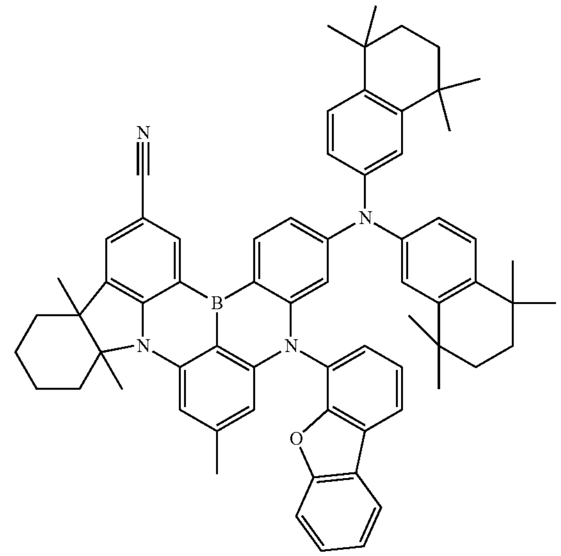
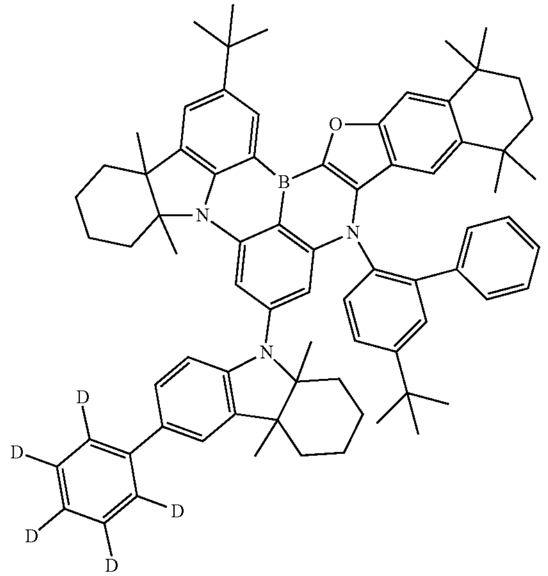
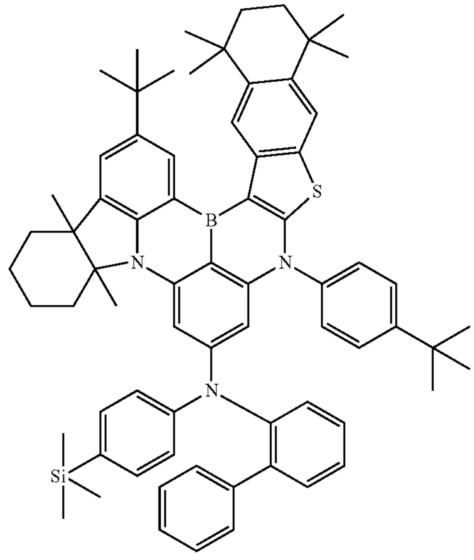
-continued
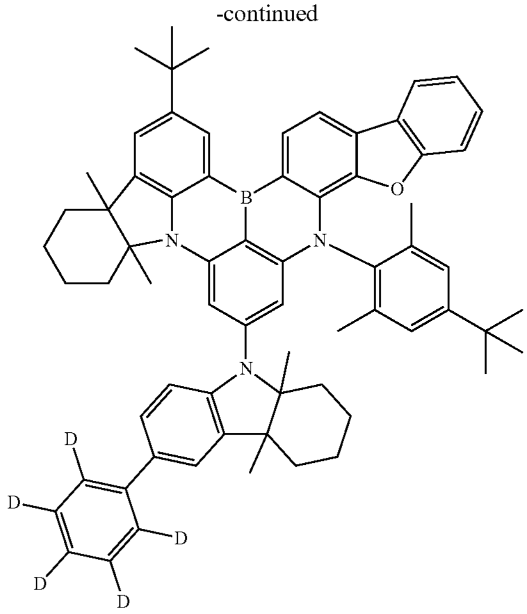
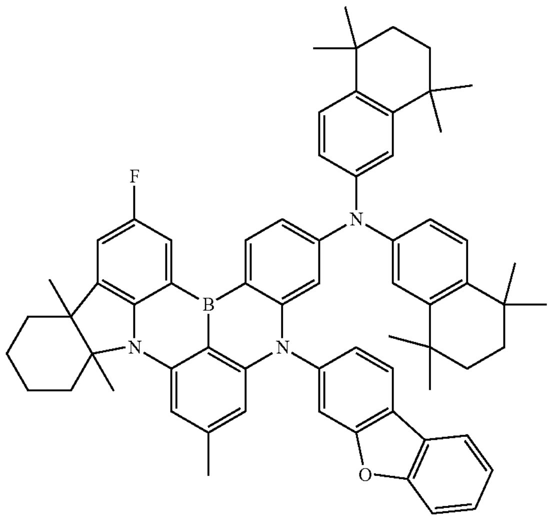
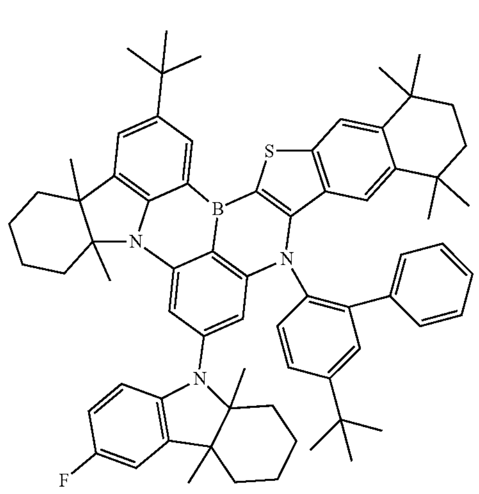

-continued
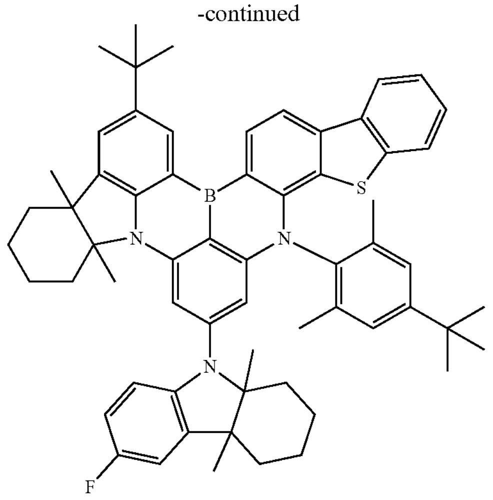
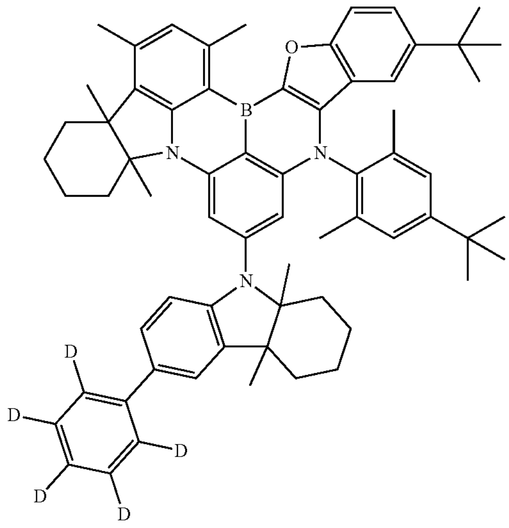
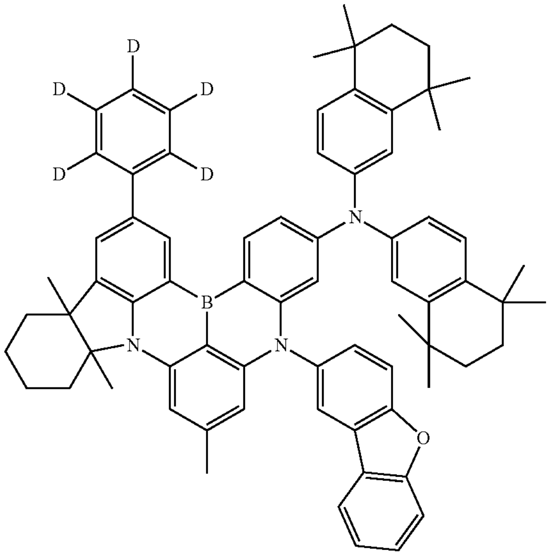
-continued
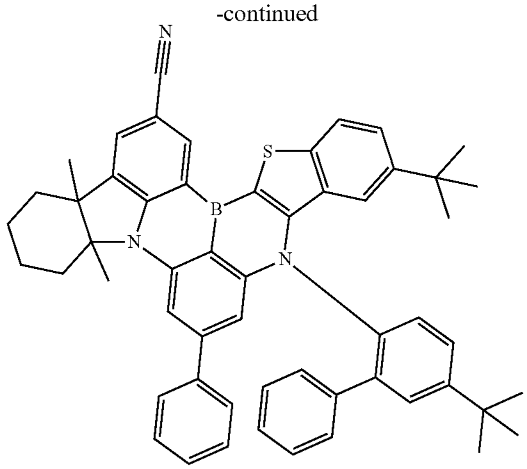
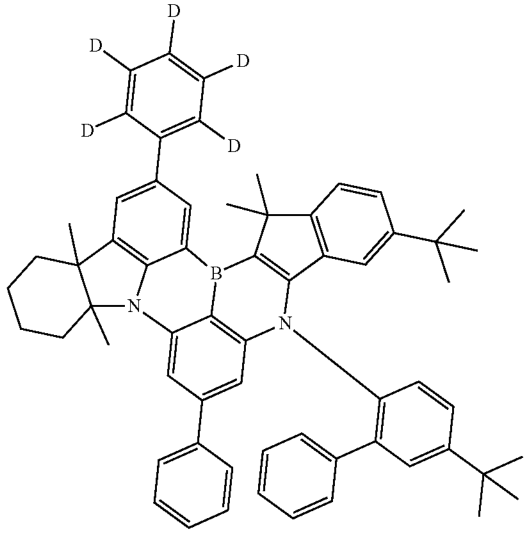
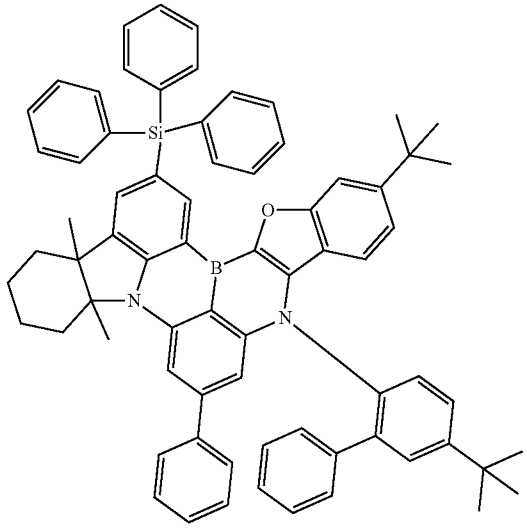

-continued
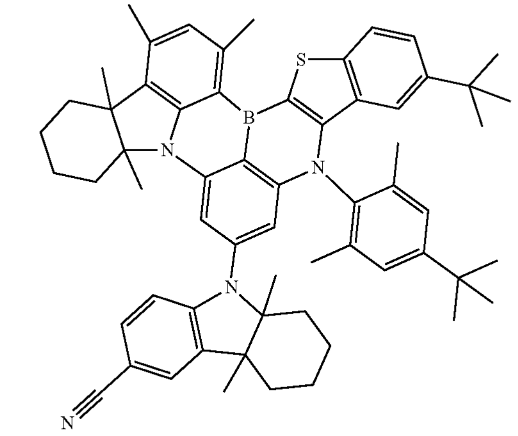
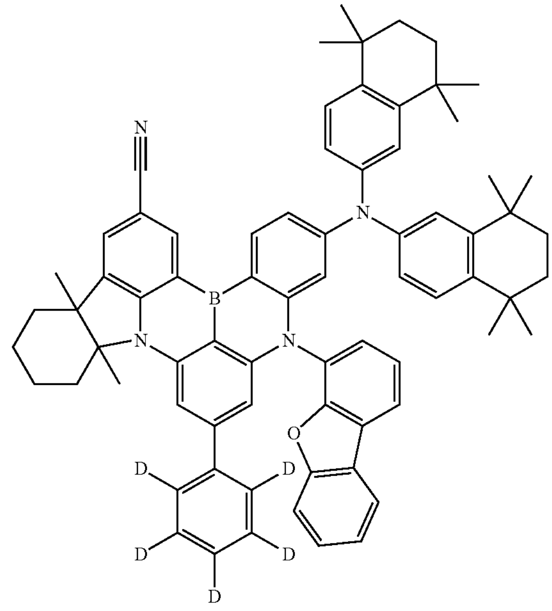
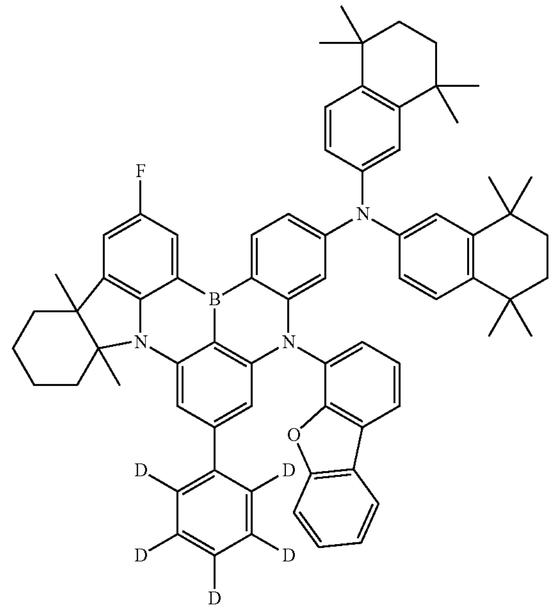
-continued
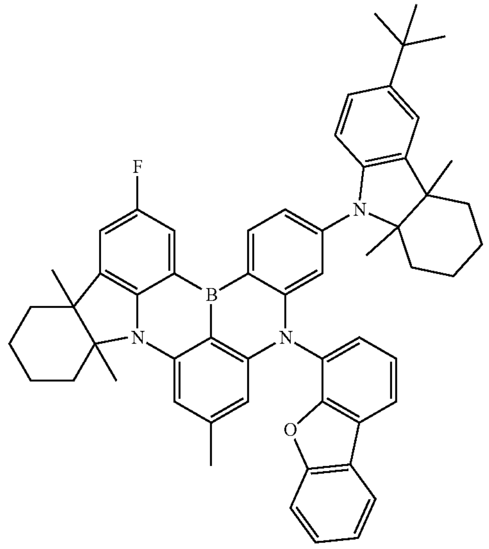
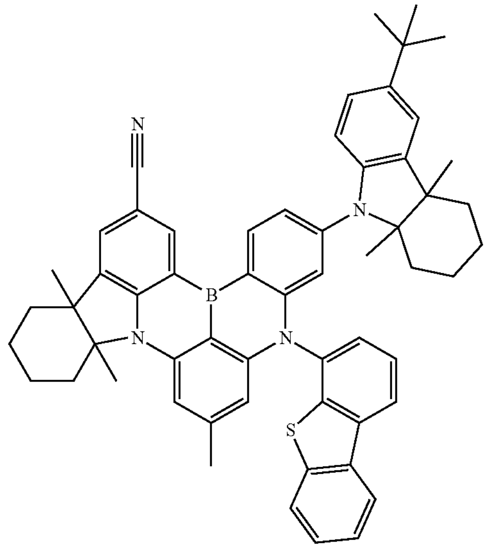
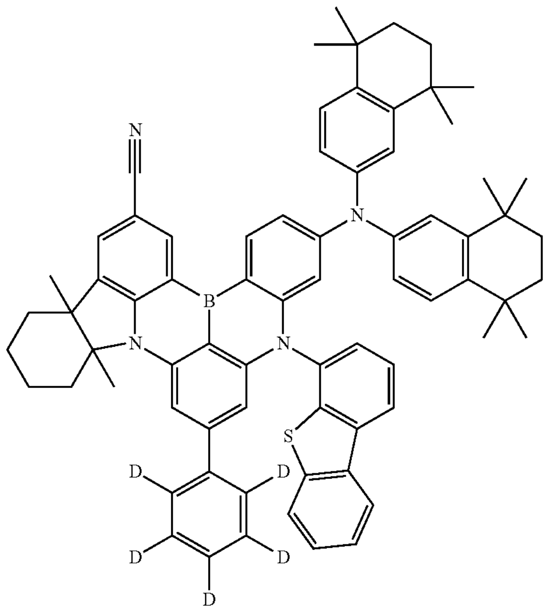

-continued
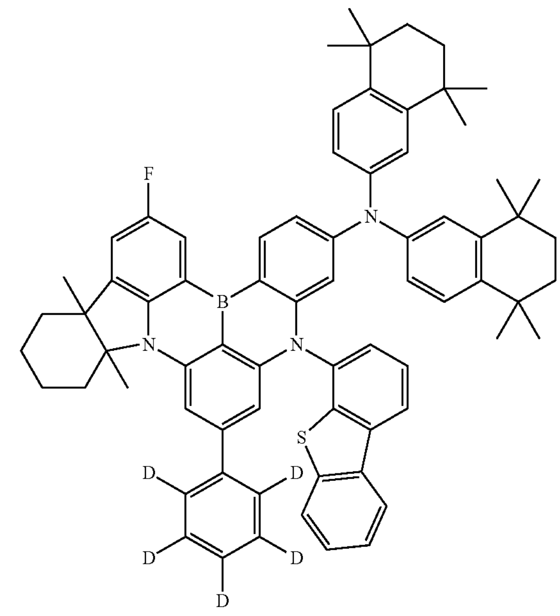
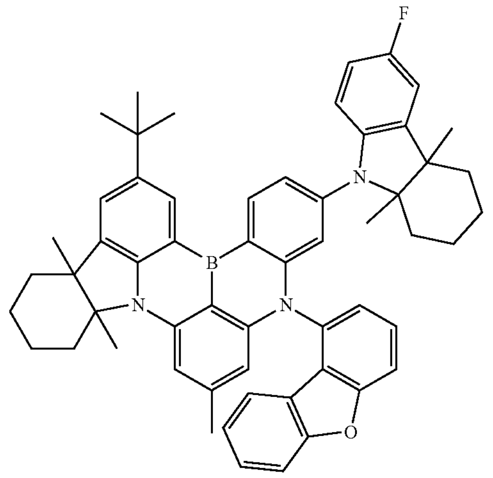
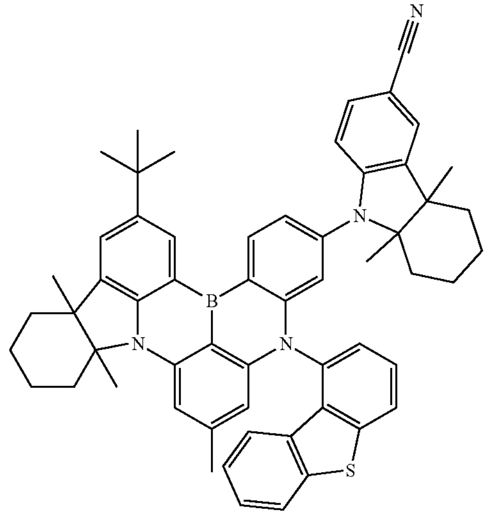
-continued
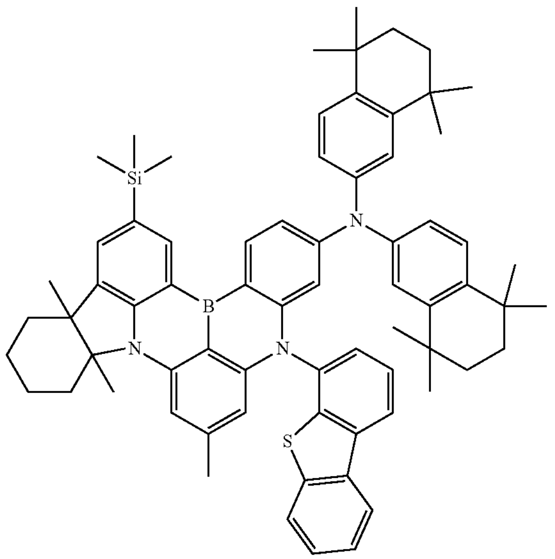
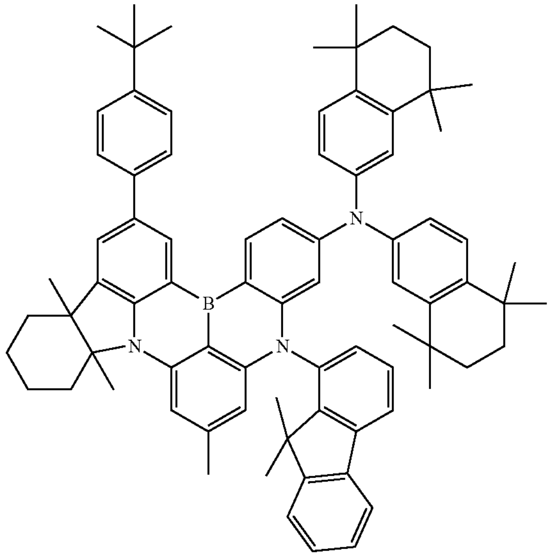
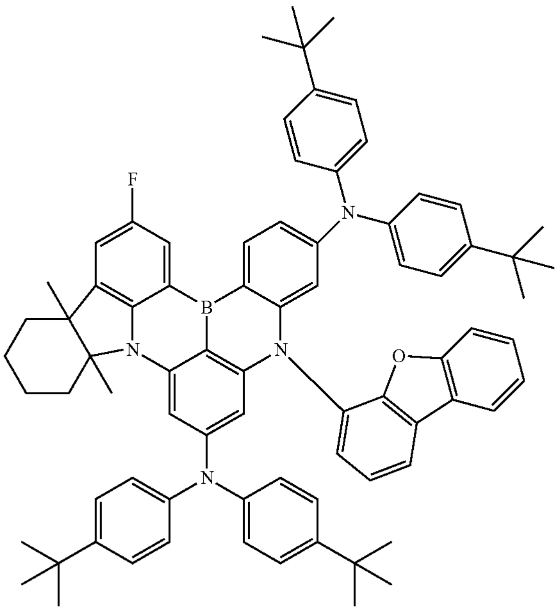

-continued

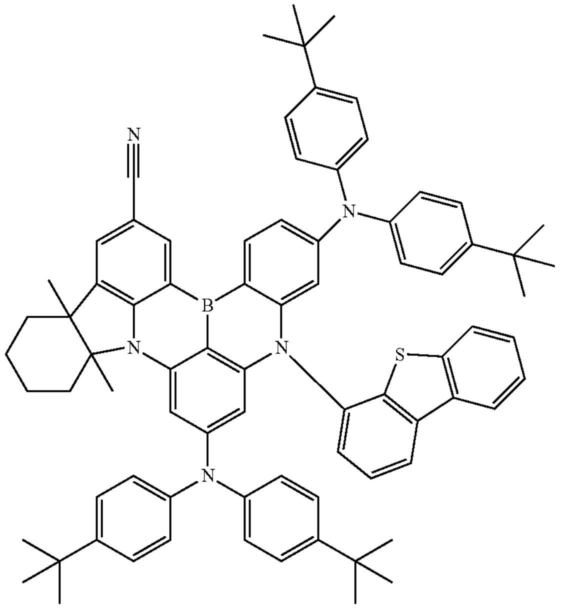

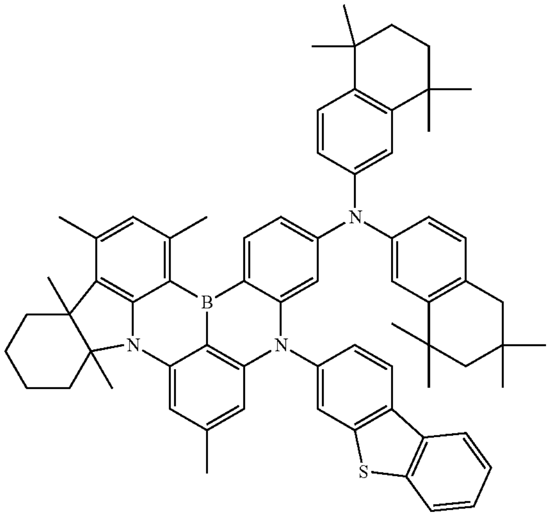

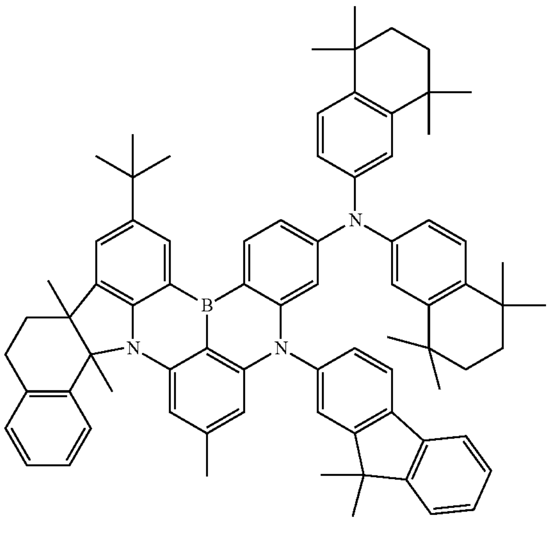

-continued

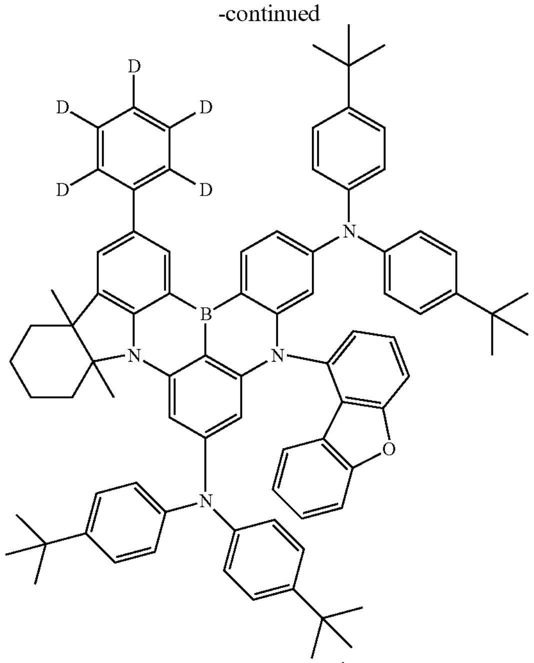

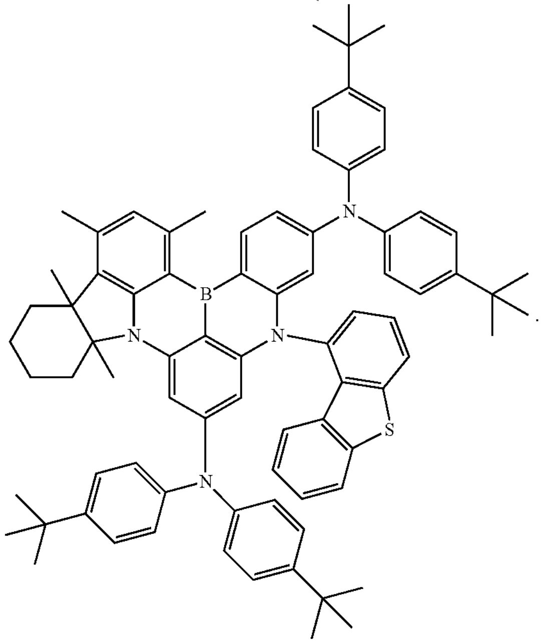

The compounds of Chemical Formulae 1 and 2 according to an exemplary embodiment of the present application can be prepared by the methods in the Synthesis Examples to be described below. The substituents can be bonded by a method known in the art, and the type or position of the substituent or the number of substituents can be changed according to the technology known in the art.

For example, the structure of the organic light emitting device of the present invention can have a structure illustrated in FIG. 1, but is not limited thereto.

FIG. 1 exemplifies a structure of an organic light emitting device in which a substrate 1, an anode 2, an organic material layer 3, and a cathode 4 are sequentially stacked.

FIG. 2 exemplifies a structure of an organic light emitting device in which a substrate 1, an anode 2, a hole transport region 3-1, a light emitting layer 7, an electron transport region 3-2, and a cathode 4 are sequentially stacked. In this case, the hole transport region 3-1 includes the compound of Chemical Formula 1, and the light emitting layer 7 includes the compound of Chemical Formula 2.

FIG. 3 exemplifies a structure of an organic light emitting device in which a substrate 1, an anode 2, a hole injection layer 5, a hole transport layer 6, a light emitting layer 7, an electron transport layer 8, an electron injection layer 9, and a cathode 4 are sequentially stacked. In this case, the hole transport region includes the hole injection layer 5 and the hole transport layer 6 which are disposed between the anode 2 and the light emitting layer 7, at least one of the hole injection layer 5 and the hole transport layer 6 which correspond to the hole transport region includes the compound of Chemical Formula 1, and the light emitting layer 7 includes the compound of Chemical Formula 2.

FIG. 4 exemplifies a structure of an organic light emitting device in which a substrate 1, an anode 2, a hole injection layer 5, a hole transport layer 6, an electron blocking layer 10, a light emitting layer 7, a hole blocking layer 11, an electron transport layer 8, an electron injection layer 9, and a cathode 4 are sequentially stacked. In this case, the hole transport region includes the hole injection layer 5 the hole transport layer 6, and the electron blocking layer 10 which are disposed between the anode 2 and the light emitting layer 7, at least one of the hole injection layer 5, the hole transport layer 6, and the electron blocking layer 10, which correspond to the hole transport region, includes the compound of Chemical Formula 1, and the light emitting layer 7 includes the compound of Chemical Formula 2.

FIGS. 1 and 4 exemplify an organic light emitting device, and the organic light emitting device is not limited thereto. The organic material layer of the organic light emitting device of the present application can also be composed of a single-layered structure, but can be composed of a multi-layered structure in which two or more organic material layers are stacked. For example, as a representative example of the organic light emitting device of the present invention, an organic light emitting device can have a structure including a hole injection layer, a hole transport layer, a light emitting layer, an electron transport layer, an electron injection layer, and the like as organic material layers. However, the structure of the organic light emitting device is not limited thereto, and can include a fewer number of organic layers.

In an exemplary embodiment of the present application, the organic material layer can include at least one of an electron transport layer, an electron injection layer, an electron transport and injection layer, an electron blocking layer, a hole blocking layer, a hole transport layer, a hole injection layer, and a hole transport and injection layer. Specifically, the hole transport region can include at least one of an electron blocking layer, a hole transport layer, a hole injection layer, and a hole transport and injection layer, and the electron transport region provided between the cathode and the light emitting layer can include at least one of an electron transport layer, an electron injection layer, an electron transport and injection layer, and a hole blocking layer.

In an exemplary embodiment of the present application, a hole transport region including the compound of Chemical Formula 1 is a layer which is brought into contact with the light emitting layer. Specifically, an organic material layer including the compound of Chemical Formula 1 is a layer which is brought into contact with the light emitting layer.

In an exemplary embodiment of the present application, the hole transport region includes a hole injection layer or a hole transport layer, and the hole injection layer or the hole transport layer includes the compound of Chemical Formula 1. The hole injection layer and the hole transport layer can be a single layer or multiple layers, and in the case of multiple layers, the hole injection layer or the hole transport layer, which is brought into contact with the light emitting layer among them, includes the compound of Chemical Formula 1.

In an exemplary embodiment of the present application, the hole transport region includes a hole injection layer and a hole transport layer, and the hole injection layer or the hole transport layer includes the compound of Chemical Formula 1. Preferably, the hole transport layer, which is brought into contact with the light emitting layer, includes the compound of Chemical Formula 1.

In an exemplary embodiment of the present application, the hole transport region includes a hole injection layer, a hole transport layer, or a hole injection and transport layer, and the hole injection layer, the hole transport layer, or the hole injection and transport layer includes the compound of Chemical Formula 1. The hole injection layer, the hole transport layer, or the hole injection and transport layer can be a single layer or multiple layers, and in the case of multiple layers, the hole injection layer, the hole transport layer, or the hole injection and transport layer, which is brought into contact with the light emitting layer among them, includes the compound of Chemical Formula 1.

In an exemplary embodiment of the present application, the hole transport region includes an electron blocking layer, and the electron blocking layer includes the compound of Chemical Formula 1. The electron blocking layer can be a single layer or multiple layers, and in the case of multiple layers, the electron blocking layer, which is brought into contact with the light emitting layer among them, includes the compound of Chemical Formula 1.

In an exemplary embodiment of the present application, an organic material layer including the compound of Chemical Formula 1 is an electron blocking layer or a hole transport layer.

In an exemplary embodiment of the present application, the organic material layer further includes an electron transport layer or an electron injection layer.

In an exemplary embodiment of the present application, the organic material layer further includes an electron injection layer, an electron transport layer, or an electron injection and transport layer.

For example, the organic light emitting device of the present application can be manufactured by sequentially stacking an anode, an organic material layer, and a cathode on a substrate. In this case, the organic light emitting device can be manufactured by depositing a metal or a metal oxide having conductivity, or an alloy thereof on a substrate to form an anode, forming an organic material layer including a hole injection layer, a hole transport layer, a light emitting layer, and an electron transport layer thereon, and then depositing a material, which can be used as a cathode, thereon, by using a physical vapor deposition (PVD) method such as sputtering or e-beam evaporation. In addition to the method described above, an organic light emitting device can be made by sequentially depositing a cathode material, an organic material layer, and an anode material on a substrate.

Further, the compounds of Chemical Formulae 1 and 2 can be formed as an organic material layer by not only a vacuum deposition method, but also a solution application method when an organic light emitting device is manufactured. Here, the solution application method means spin coating, dip coating, doctor blading, inkjet printing, screen printing, a spray method, roll coating, and the like, but is not limited thereto.

The anode is an electrode which injects holes, and as an anode material, materials having a high work function are usually preferred so as to facilitate the injection of holes into an organic material layer. Specific examples of the anode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The cathode is an electrode which injects electrons, and as a cathode material, materials having a low work function are usually preferred so as to facilitate the injection of electrons into an organic material layer. Specific examples of the cathode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from an anode to a light emitting layer, and a hole injection material is preferably a material which can proficiently accept holes from an anode at a low voltage, and the highest occupied molecular orbital (HOMO) of the hole injection material is preferably a value between the work function of the anode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer can have a thickness of 1 to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer.

The hole transport layer can serve to facilitate the transport of holes. A hole transport material is suitably a material having high hole mobility which can accept holes from an anode or a hole injection layer and transfer the holes to a light emitting layer. Specific examples thereof include arylamine-based organic materials, conductive polymers, block copolymers having both conjugated portions and non-conjugated portions, and the like, but are not limited thereto.

An electron blocking layer can be provided between the hole transport layer and the light emitting layer. For the electron blocking layer, materials known in the art can be used.

The light emitting layer can emit red, green, or blue light, and can be composed of a phosphorescent material or a fluorescent material. The light emitting material is a material which can receive holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

In an exemplary embodiment of the present application, the organic material layer includes a light emitting layer, and the light emitting layer includes the compound of Chemical Formula 2.

In an exemplary embodiment of the present application, the light emitting layer includes a host and a dopant, and the dopant can include the compound of Chemical Formula 2.

Examples of the host material for the light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

In an exemplary embodiment of the present application, the host can include a compound of the following Chemical Formula HO:

[Chemical Formula HO]

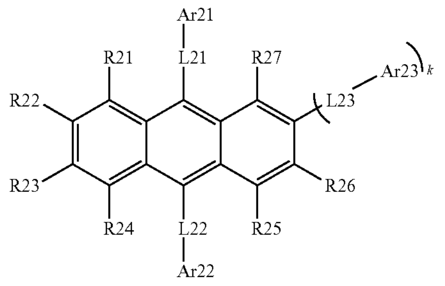

wherein in Chemical Formula HO:

L21 to L23 are the same as or different from each other, and are each independently a direct bond, a substituted or unsubstituted arylene group, or a substituted or unsubstituted heteroarylene group;

R21 to R27 are the same as or different from each other, and are each independently hydrogen, deuterium, a substituted or unsubstituted alkyl group, a substituted or unsubstituted cycloalkyl group, a substituted or unsubstituted silyl group, a substituted or unsubstituted aryl group, or a substituted or unsubstituted heteroaryl group;

Ar21 to Ar23 are the same as or different from each other, and are each independently a substituted or unsubstituted aryl group, or a substituted or unsubstituted heteroaryl group; and k is 0 or 1.

In an exemplary embodiment of the present specification, when k is 0, hydrogen or deuterium is linked to the position of -L23-Ar23.

In an exemplary embodiment of the present specification, L21 to L23 are the same as or different from each other, and are each independently a direct bond, a substituted or unsubstituted C6-C30 arylene group, or a C2-C30 heteroarylene group which is substituted or unsubstituted and includes N, O, or S.

In an exemplary embodiment of the present specification, L21 to L23 are the same as or different from each other, and are each independently a direct bond, a C6-C30 arylene group, or a C2-C30 heteroarylene group including N, O, or S, and the arylene group or heteroarylene group is unsubstituted or substituted with a C1-C10 alkyl group, a C6-C30 aryl group, or a C2-C30 heteroaryl group.

In an exemplary embodiment of the present specification, L21 to L23 are the same as or different from each other, and are each independently a direct bond, a substituted or unsubstituted phenylene group, a substituted or unsubstituted biphenylene group, a substituted or unsubstituted naphthylene group, a substituted or unsubstituted divalent dibenzofuran group, or a substituted or unsubstituted divalent dibenzothiophene group.

In an exemplary embodiment of the present specification, Ar21 to Ar23 are the same as or different from each other, and are each independently a substituted or unsubstituted C6-C30 aryl group, or a substituted or unsubstituted C2-C30 heteroaryl group.

In an exemplary embodiment of the present specification, Ar21 to Ar23 are the same as or different from each other, and are each independently a C6-C30 aryl group which is unsubstituted or substituted with deuterium, or a C2-C30 heteroaryl group which is unsubstituted or substituted with deuterium.

In an exemplary embodiment of the present specification, Ar21 to Ar23 are the same as or different from each other, and are each independently a substituted or unsubstituted monocyclic to tetracyclic aryl group, or a substituted or unsubstituted monocyclic to tetracyclic heteroaryl group.

In an exemplary embodiment of the present specification, Ar21 to Ar23 are the same as or different from each other, and are each independently a monocyclic to tetracyclic aryl group which is unsubstituted or substituted with deuterium, or a monocyclic to tetracyclic heteroaryl group which is unsubstituted or substituted with deuterium.

In an exemplary embodiment of the present specification, Ar21 to Ar23 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted anthracene group, a substituted or unsubstituted phenanthryl group, a substituted or unsubstituted phenalene group, a substituted or unsubstituted fluorenyl group, a substituted or unsubstituted benzofluorenyl group, a substituted or unsubstituted furan group, a substituted or unsubstituted thiophene group, a substituted or unsubstituted dibenzofuran group, a substituted or unsubstituted naphthobenzofuran group, a substituted or unsubstituted dibenzothiophene group, or a substituted or unsubstituted naphthobenzothiophene group.

In an exemplary embodiment of the present specification, Ar21 and Ar22 are different from each other.

In an exemplary embodiment of the present specification, Ar21 is a substituted or unsubstituted aryl group, and Ar22 is a substituted or unsubstituted aryl group.

In an exemplary embodiment of the present specification, Ar21 is a substituted or unsubstituted aryl group, and Ar22 is a substituted or unsubstituted heteroaryl group.

In an exemplary embodiment of the present specification, Ar21 is an aryl group which is unsubstituted or substituted with deuterium, and Ar22 is an aryl group which is unsubstituted or substituted with deuterium.

In an exemplary embodiment of the present specification, Ar21 is an aryl group which is unsubstituted or substituted with deuterium, and Ar22 is a heteroaryl group which is unsubstituted or substituted with deuterium.

In an exemplary embodiment of the present specification, R21 to R27 are the same as or different from each other, and are each independently hydrogen or deuterium.

In an exemplary embodiment of the present specification, R21 to R27 are hydrogen.

In an exemplary embodiment of the present specification, R21 to R27 are deuterium.

In an exemplary embodiment of the present specification, Chemical Formula HO is the following Chemical Formula HO1:

[Chemical Formula HO1]

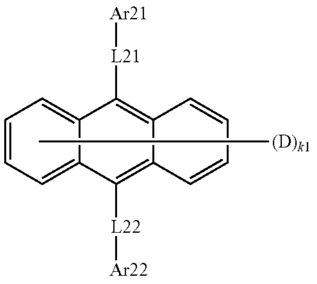

wherein in Chemical Formula HO1:

the definitions of L21 to L23 and Ar21 to Ar23 are the same as those defined in Chemical Formula HO, D means deuterium, k1 is an integer from 0 to 8, and k2 is an integer from 0 to 7.

In an exemplary embodiment of the present specification, the compound of Chemical Formula HO is any one selected from the following compounds:

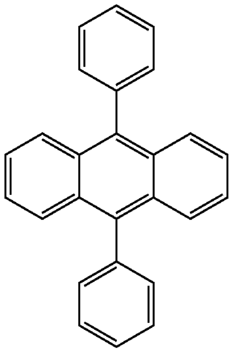

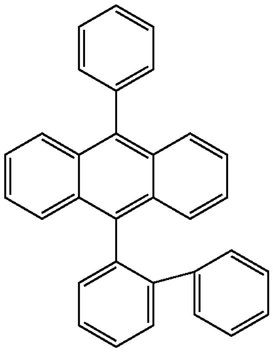

-continued
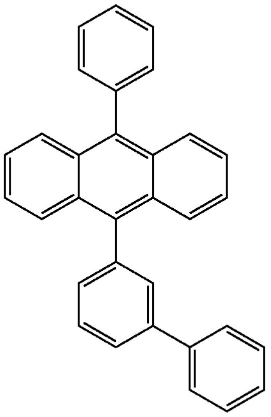
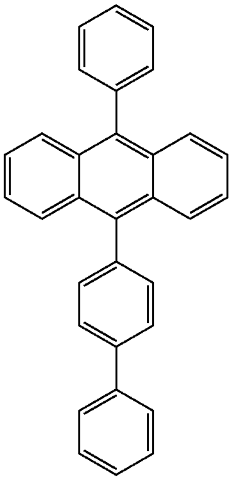
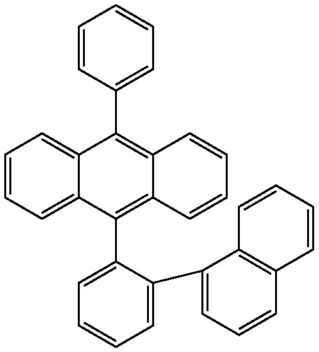
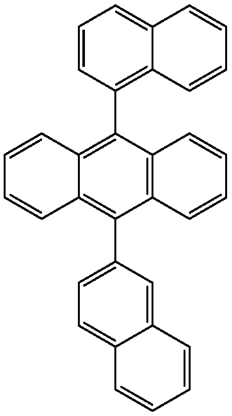
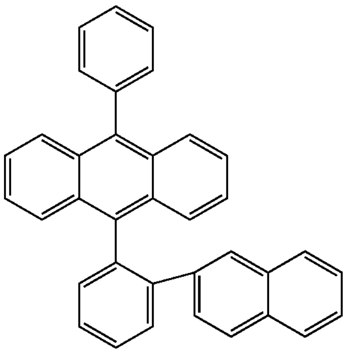
-continued
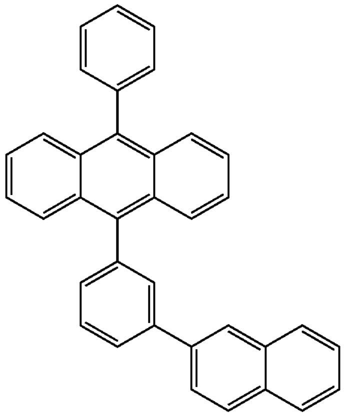
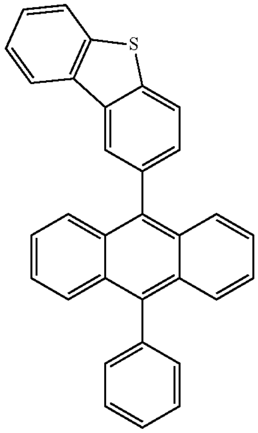
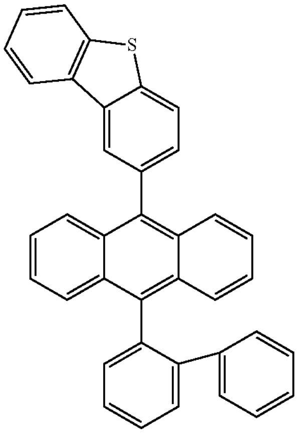
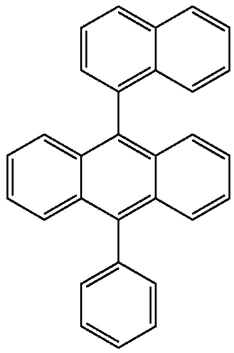
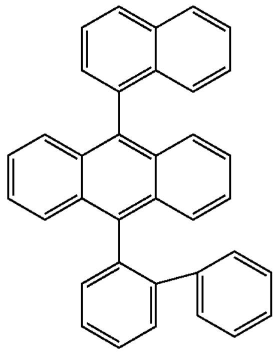

-continued
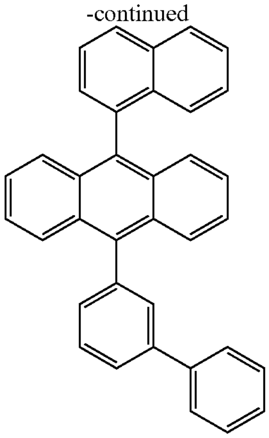
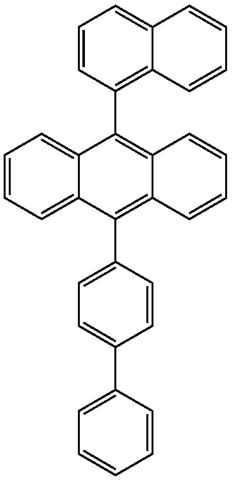
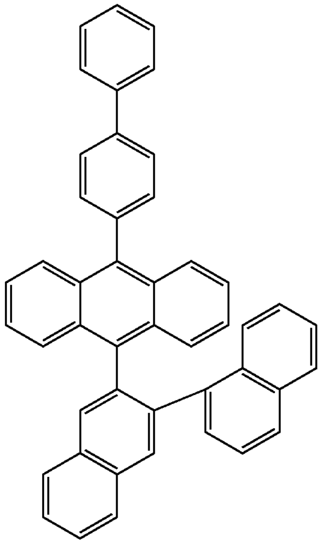
-continued
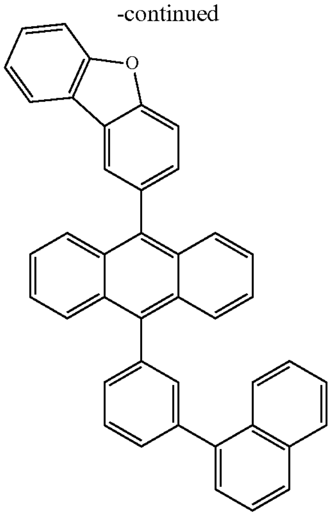
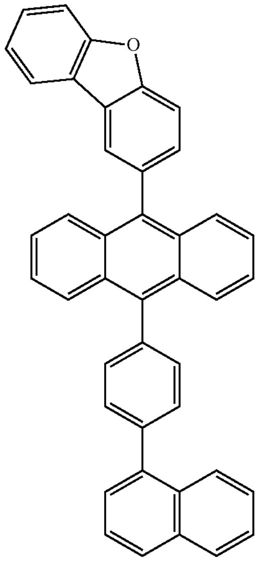
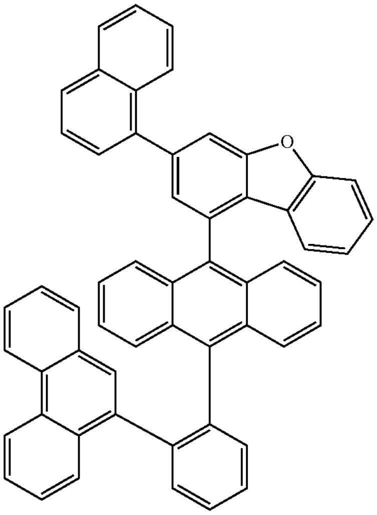

-continued
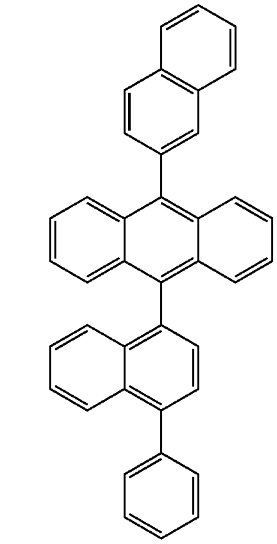
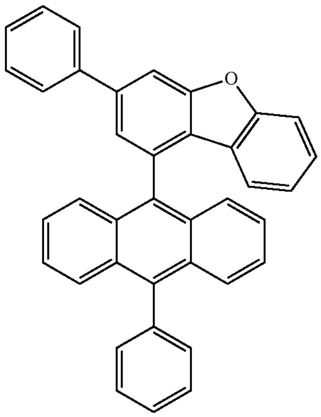
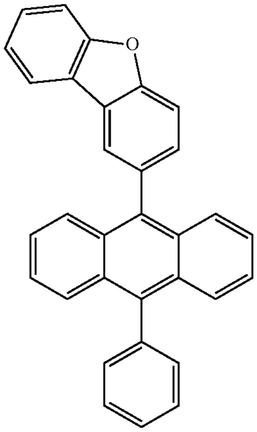
-continued
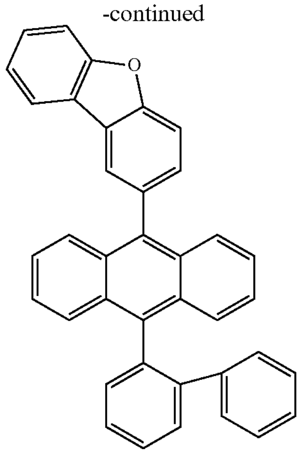
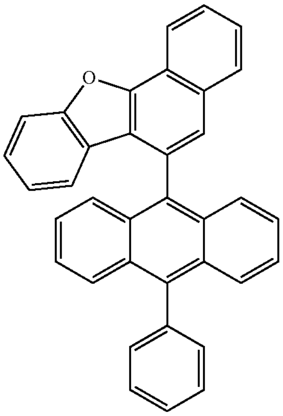
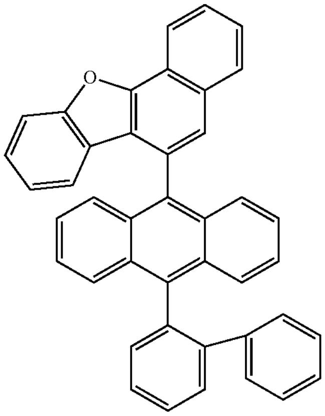
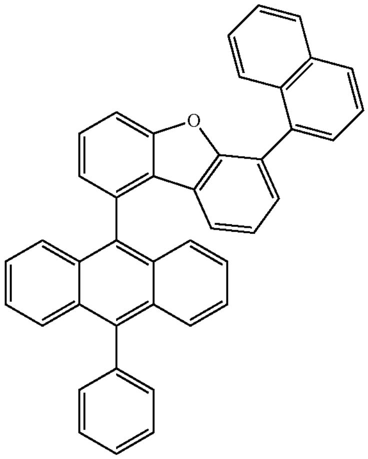

-continued
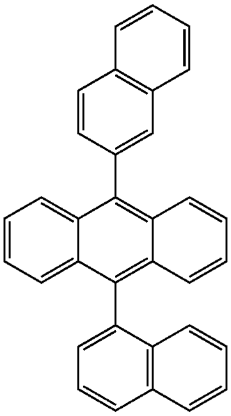
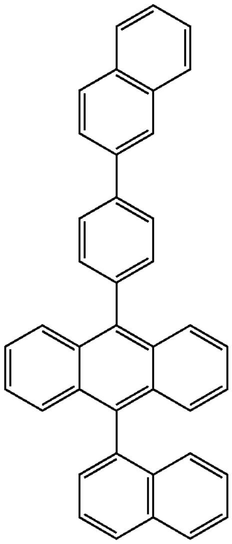
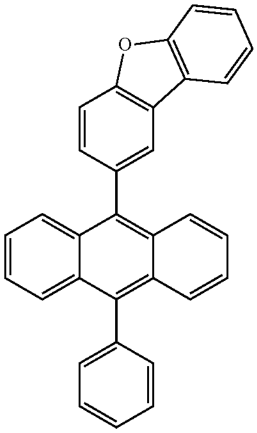
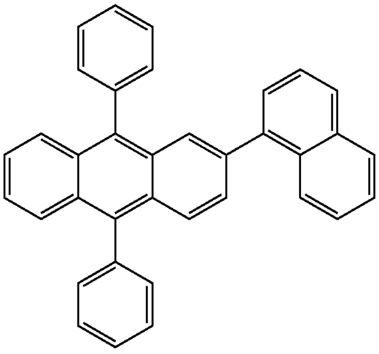
-continued
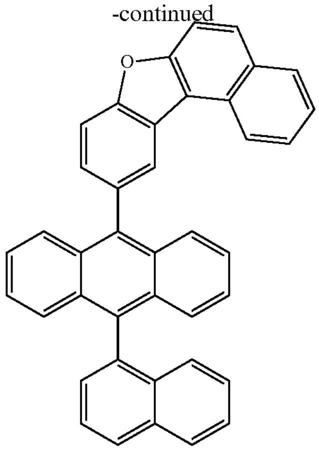
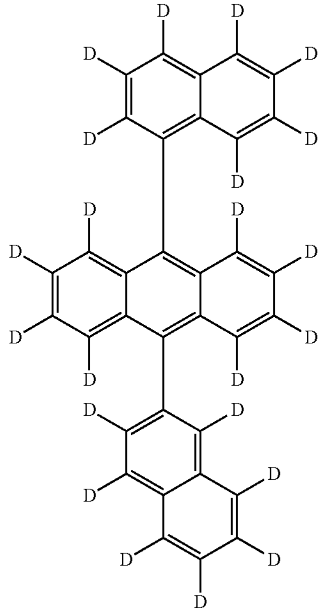
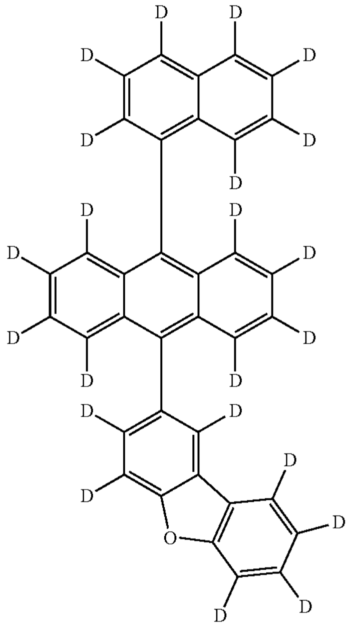

-continued
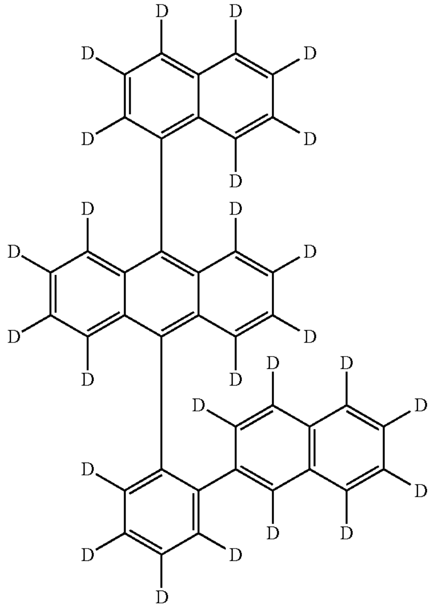
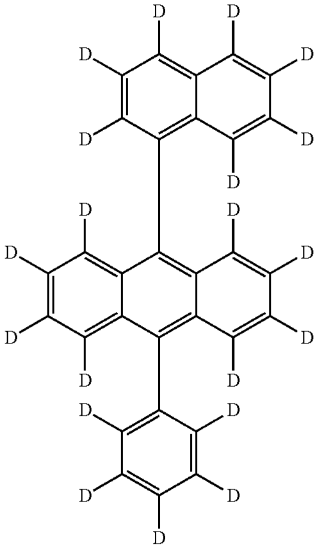
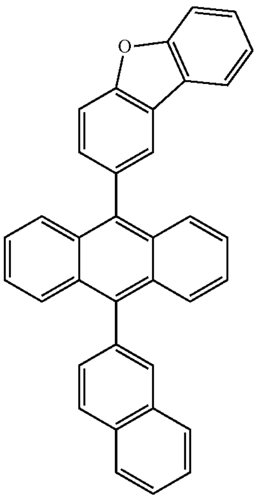
-continued
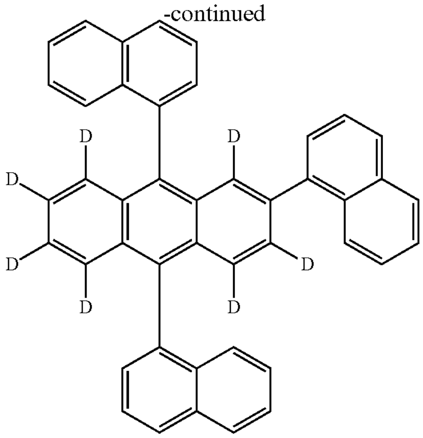
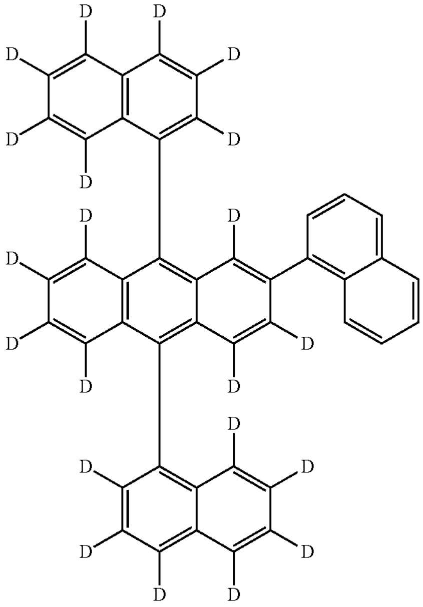
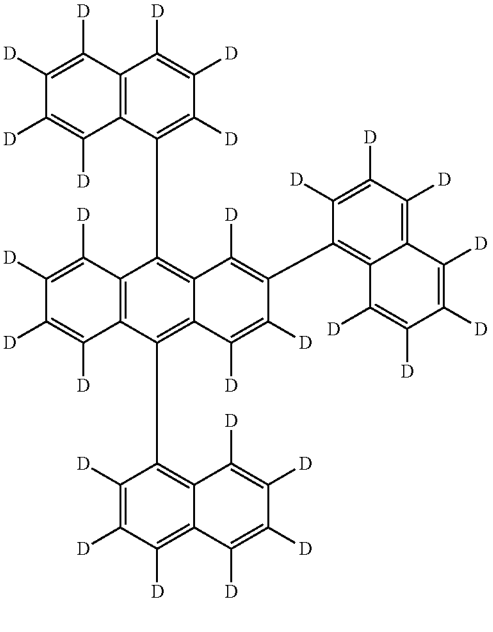

-continued
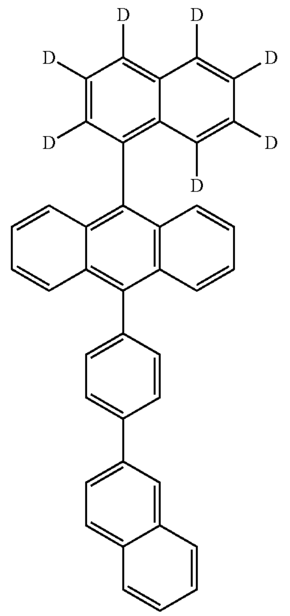
-continued
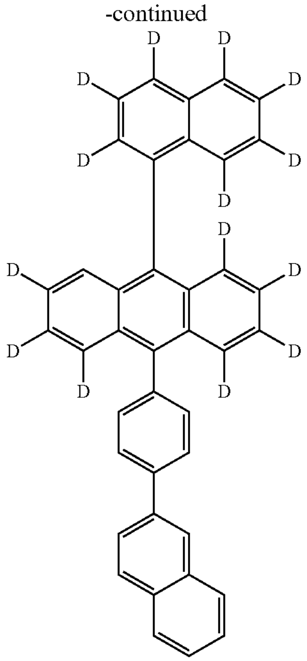
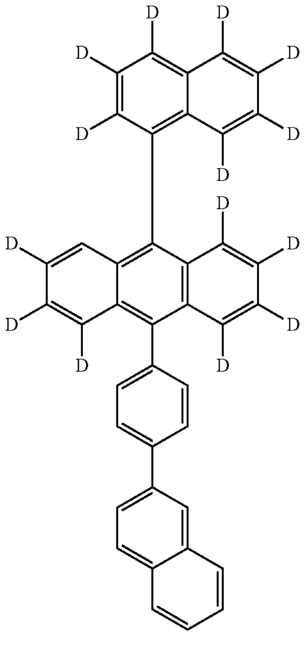
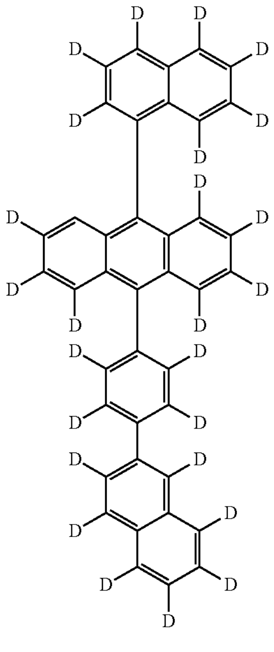

-continued
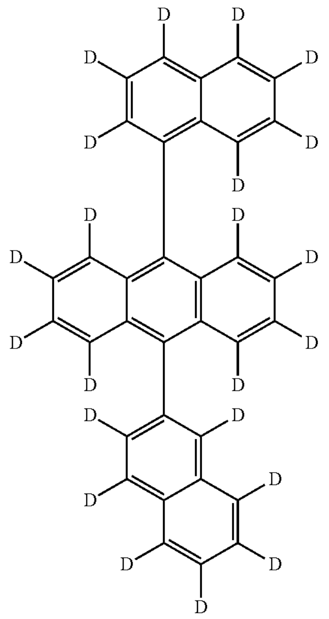
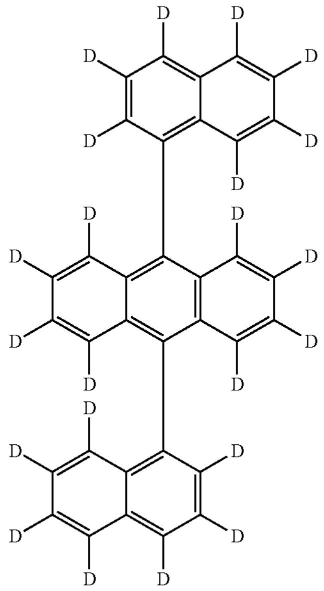
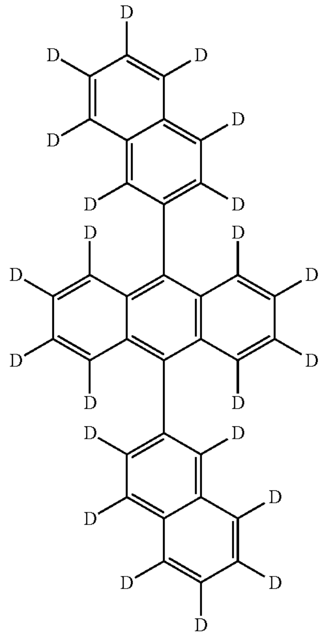
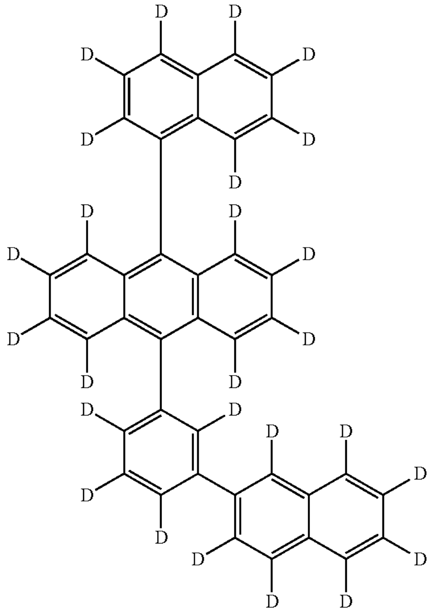

-continued
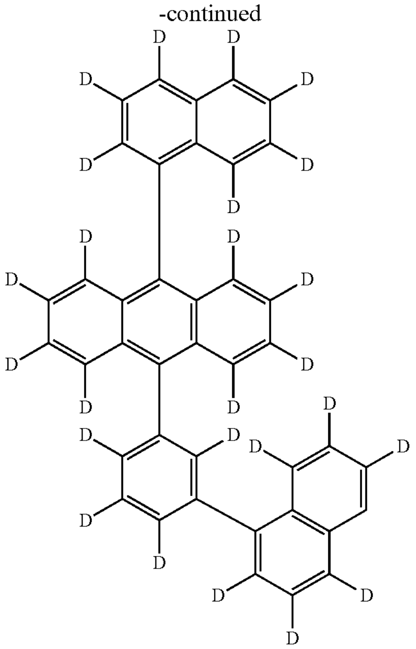
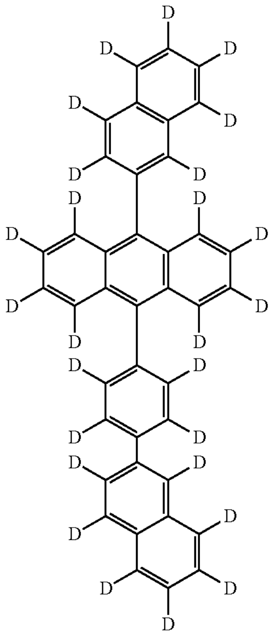
-continued
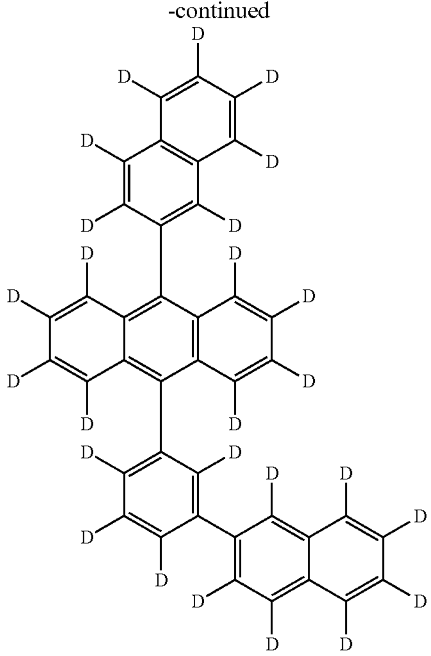
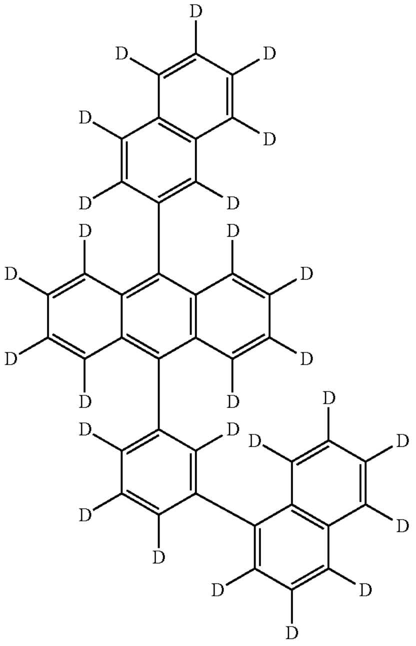

-continued
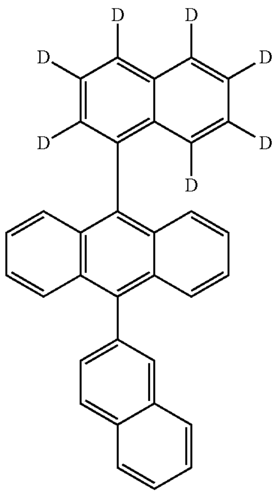
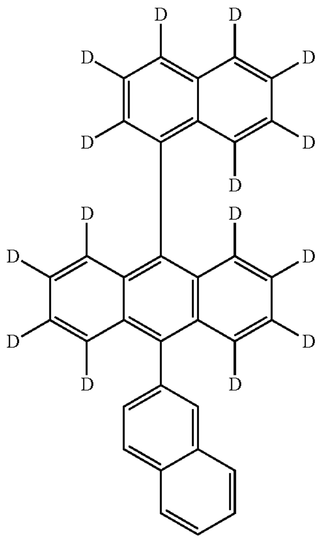
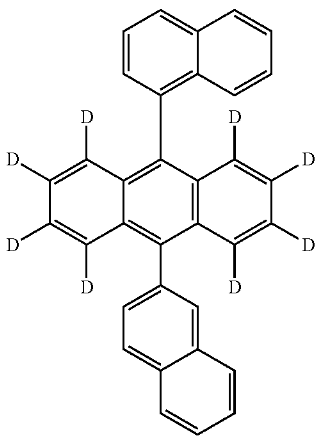
-continued
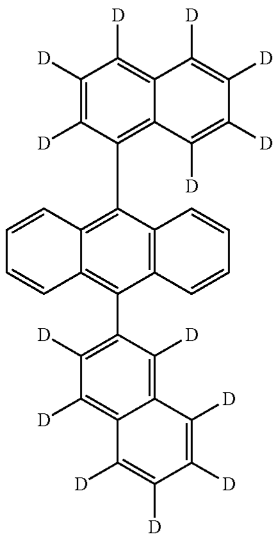
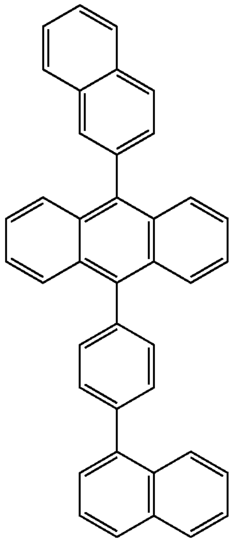
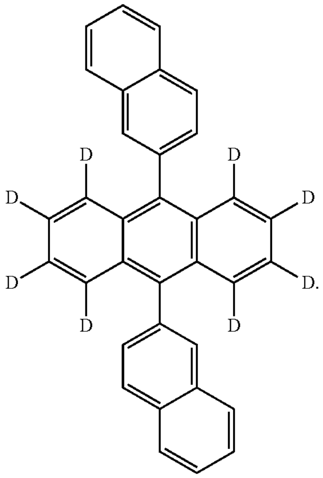
In an exemplary embodiment of the present specification, a weight ratio of the host and the dopant can be 95:5 to 5:95.
In an exemplary embodiment of the present specification, a weight ratio of the host and the dopant can be 1:9 to 9:1, 2:8 to 8:2, 3:7 to 7:3, or 4:6 to 6:4, preferably 5:5 (1:1).

In an exemplary embodiment of the present specification, the light emitting layer includes one or two or more of the compounds of Chemical Formula HO.

When the light emitting layer emits red light, it is possible to use a phosphorescent material such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxyquinolino)-aluminum ($Alq_3$) as a light emitting dopant, but the light emitting dopant is not limited thereto. When the light emitting layer emits green light, it is possible to use a phosphorescent material such as fac tris(2-phenylpyridine)iridium ($Ir(ppy)_3$), or a fluorescent material such as tris(8-hydroxyquinolino)aluminum ($Alq_3$), an anthracene-based compound, a pyrene-based compound, and a boron-based compound as a light emitting dopant, but the light emitting dopant is not limited thereto. When the light emitting layer emits blue light, it is possible to use a phosphorescent material such as $(4,6\text{-F2ppy})_2\text{Irpic}$, or a fluorescent material such as spiro-DPVBi, spiro-6P, distyryl benzene (DSB), distyryl arylene (DSA), a PFO-based polymer, a PPV-based polymer, an anthracene-based compound, a pyrene-based compound, and a boron-based compound as a light emitting dopant, but the light emitting dopant is not limited thereto.

The electron transport layer can serve to facilitate the transport of electrons. An electron transport material is suitably a material having high electron mobility which can proficiently accept electrons from a cathode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer can have a thickness of 1 to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer.

The electron injection layer can serve to facilitate the injection of electrons. An electron injection material is preferably a compound which has a capability of transporting electrons, an effect of injecting electrons from a cathode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo-[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a cathode, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

EXAMPLES

Hereinafter, the present specification will be described in more detail through Examples. However, the following Examples are provided only for exemplifying the present specification, but are not intended to limit the present specification.

SYNTHESIS EXAMPLES

Synthesis Example 1-1

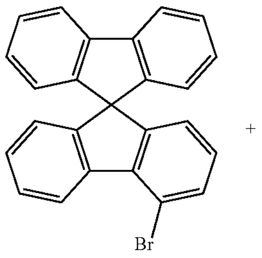

A

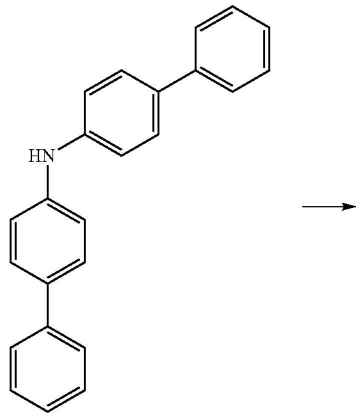

a1

-continued

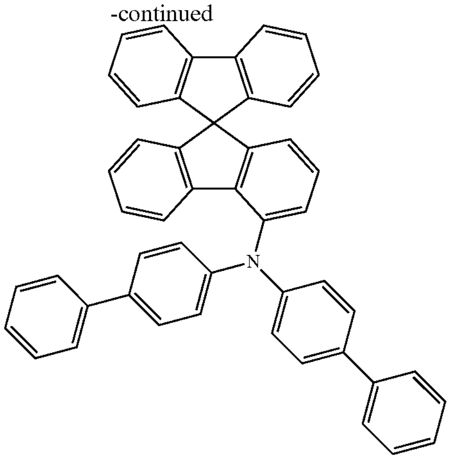

1-1

After Compound A (40.0 g, 101.51 mmol) and Compound a1 (32.95 g, 102.53 mmol) were completely dissolved in 1,000 ml of toluene in a 2-L round bottom flask under a nitrogen atmosphere, sodium t-butoxide (NaOtBu) (14.63 g, 152.27 mmol) was added thereto, bis(tri-tert-butyl-phosphine) palladium(0) (0.52 g, 1.02 mmol) was put thereinto, and then the resulting mixture was heated and stirred for 3 hours. The temperature was lowered to normal temperature, the mixture was filtered to remove the base, and then toluene was concentrated under reduced pressure, and the residue was recrystallized with 500 ml of ethyl acetate to prepare Synthesis Example 1-1 (49.5 g, yield: 77%). MS$[M+H]^+$=636

Synthesis Example 1-2

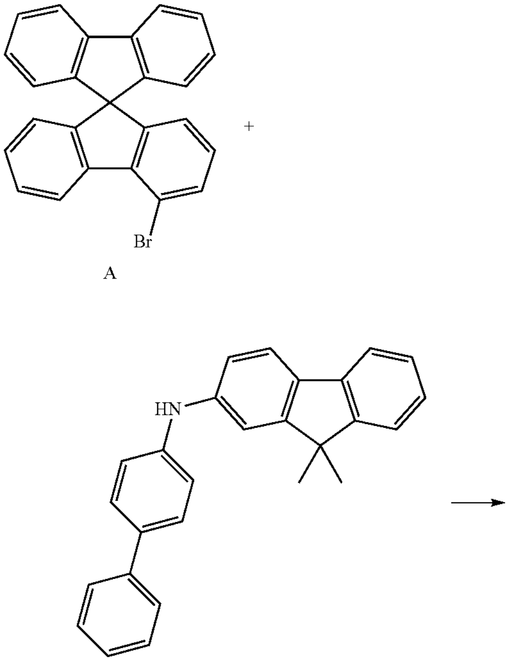

A a2

-continued

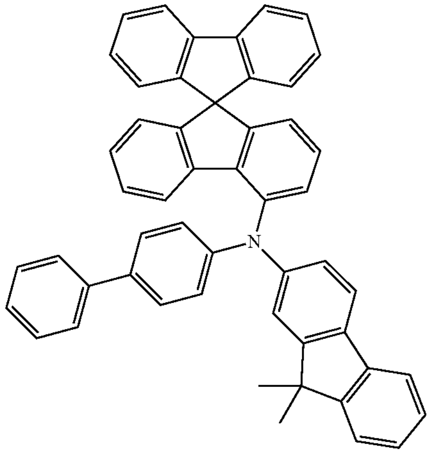

1-2

After Compound A (42.0 g, 106.59 mmol) and Compound a2 (38.92 g, 107.65 mmol) were completely dissolved in 1,000 ml of toluene in a 2-L round bottom flask under a nitrogen atmosphere, NaOtBu (15.36 g, 159.88 mmol) was added thereto, bis(tri-tert-butylphosphine) palladium(0) (0.54 g, 1.07 mmol) was put thereinto, and then the resulting mixture was heated and stirred for 3 hours. The temperature was lowered to normal temperature, the mixture was filtered to remove the base, and then toluene was concentrated under reduced pressure, and the residue was recrystallized with 500 ml of ethyl acetate to prepare Synthesis Example 1-2 (50.2 g, yield: 70%). MS$[M+H]^+$=676

Synthesis Example 1-3

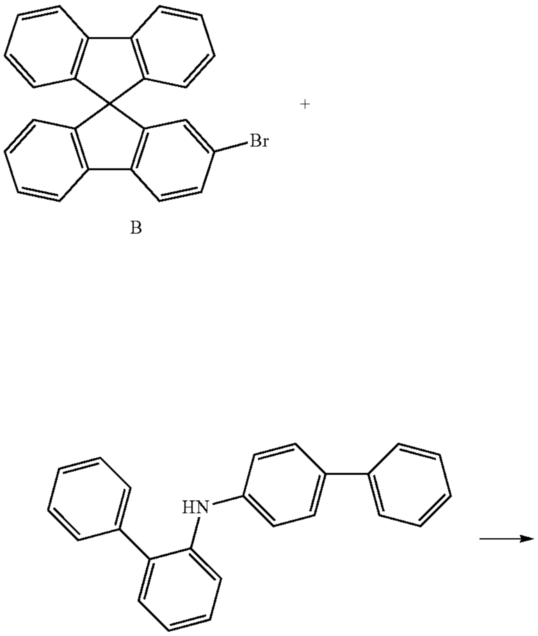

B a3

-continued

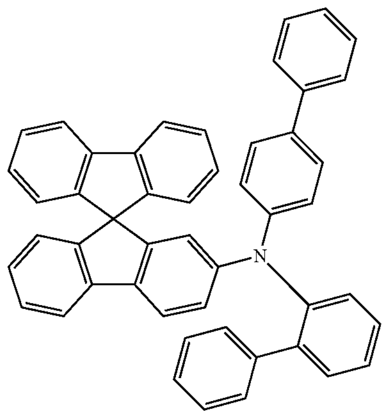

1-3

After Compound B (28.0 g, 71.06 mmol) and Compound a3 (23.07 g, 71.77 mmol) were completely dissolved in 700 ml of toluene in a 2-L round bottom flask under a nitrogen atmosphere, NaOtBu (10.24 g, 106.59 mmol) was added thereto, bis(tri-tert-butylphosphine) palladium(0) (0.36 g, 0.71 mmol) was put thereinto, and then the resulting mixture was heated and stirred for 3 hours. The temperature was lowered to normal temperature, the mixture was filtered to remove the base, and then toluene was concentrated under reduced pressure, and the residue was recrystallized with 500 ml of ethyl acetate to prepare Synthesis Example 1-3 (29.0 g, yield: 64%). MS[M+H]$^+$=636

Synthesis Example 2-1. Synthesis of Compound 19

1) Synthesis of Intermediate 45

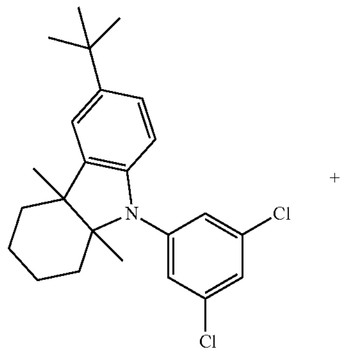

[Intermediate 33]

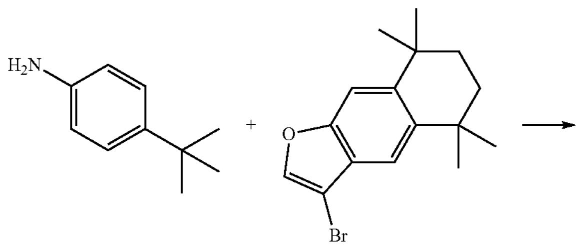

-continued

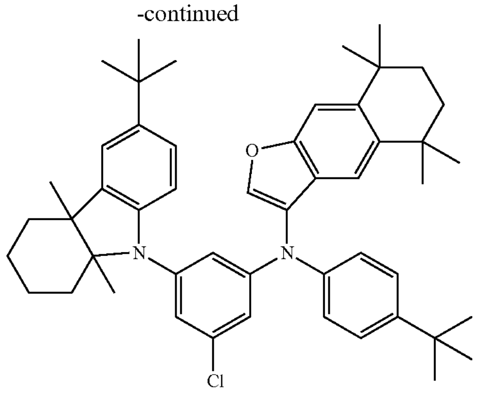

[Intermediate 45]

After Intermediate 33 (40 g), 14.8 g of 4-(tert-butyl) aniline, 0.5 g of bis(tri-tert-butylphosphine)-palladium(0), and 24 g of sodium-tert-butoxide were put into 600 ml of toluene under a nitrogen atmosphere, the resulting mixture was stirred under reflux for 1 hour. After it was confirmed whether the reaction proceeded, 30.6 g of 3-bromo-5,5,8,8-tetramethyl-5,6,7,8-tetrahydronaphtho[2,3-b]furan was introduced thereinto during the stirring, and then the resulting mixture was stirred under reflux for 4 hours. After the completion of the reaction, the resulting product was extracted, and then recrystallized to obtain Intermediate 45 (57 g). (Yield 77%). MS[M+H]$^+$=742

2) Synthesis of Intermediate 46

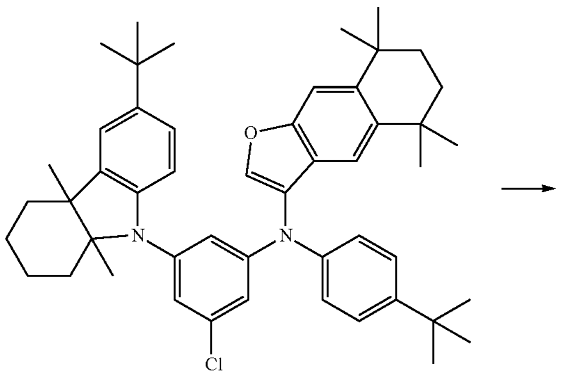

[Intermediate 45]

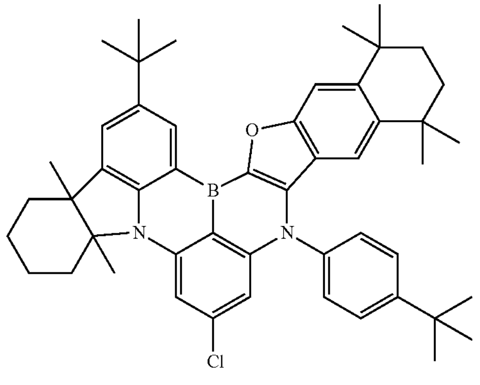

[Intermediate 46]

After Intermediate 45 (25 g) and 22.5 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain Intermediate 46 (7.5 g) (yield 30%). MS[M+H]$^+$=750

3) Synthesis of Compound 19

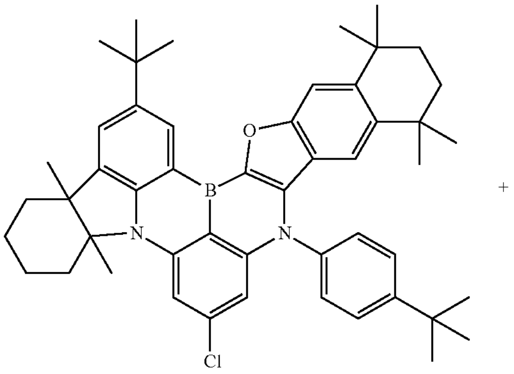

[Intermediate 46]

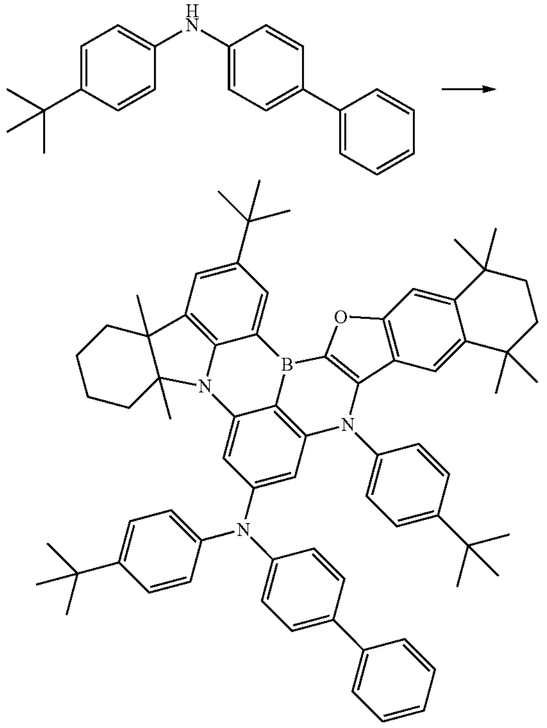

[Compound 19]

After Intermediate 46 (7 g), 2.9 g of N-(4-(tert-butyl)phenyl)-[1,1'-biphenyl]-4-amine, 1.8 g of sodium-tert-butoxide, and 0.05 g of bis(tri-tert-butyl-phosphine)palladium (0) were put into 100 ml of toluene under a nitrogen atmosphere, the resulting mixture was stirred under reflux for 6 hours. After the completion of the reaction, the resulting product was extracted, and then recrystallized to obtain Compound 19 (7.2 g). (Yield 76%). MS[M+H]$^+$=1015

Synthesis Example 2-2. Synthesis of Compound 20

1) Synthesis of Intermediate 47

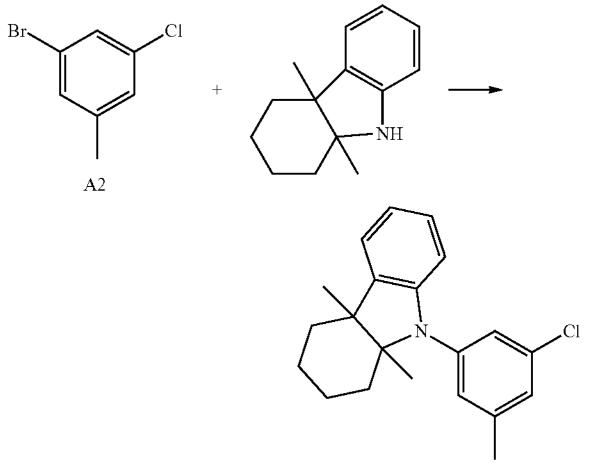

A2

[Intermediate 47]

After Compound A2 (40 g), 39.2 g of 4a,9a-dimethyl-2,3,4,4a,9,9a-hexahydro-1H-carbazole, 1.0 g of bis(tri-tert-butylphosphine)palladium(0), and 38 g of sodium-tert-butoxide were put into 600 ml of toluene under a nitrogen atmosphere, the resulting mixture was stirred under reflux for 4 hours. After the completion of the reaction, the resulting product was extracted, and then column purified to obtain Intermediate 47 (49 g). (Yield 77%). MS[M+H]$^+$=326

2) Synthesis of Intermediate 48

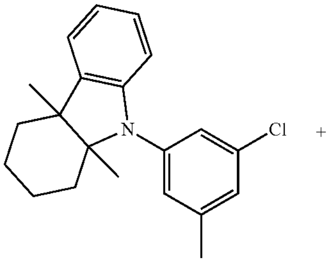

[Intermediate 47]

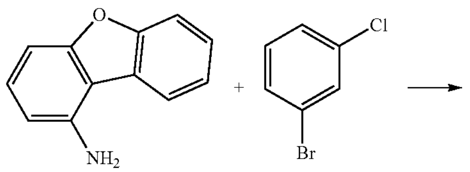

-continued

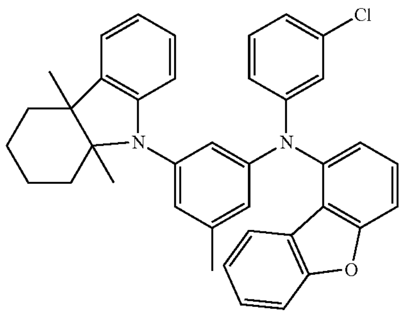

[Intermediate 48]

After Intermediate 47 (40 g), 22.5 g of dibenzo[b,d]furan-1-amine, 0.6 g of bis(tri-tert-butyl-phosphine)palladium(0), and 29.5 g of sodium-tert-butoxide were put into 600 ml of toluene under a nitrogen atmosphere, the resulting mixture was stirred under reflux for 1 hour. Thereafter, it was confirmed whether the reaction proceeded, and then 23.5 g of 1-bromo-3-chlorobenzene was introduced thereinto during the stirring, and then the resulting mixture was stirred under reflux for 4 hours. After the completion of the reaction, the resulting product was extracted, and then recrystallized to obtain Intermediate 48 (55 g). (Yield 77%). MS[M+H]$^+$=584

3) Synthesis of Intermediate 49

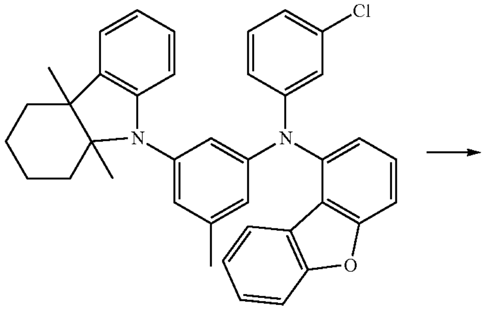

[Intermediate 48]

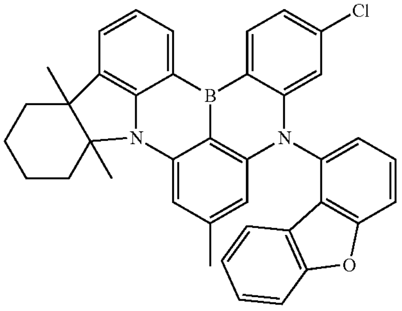

[Intermediate 49]

After Intermediate 48 (25 g) and 28.5 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain Intermediate 44 (7.8 g) (yield 31%). MS[M+H]$^+$=592

4) Synthesis of Compound 20

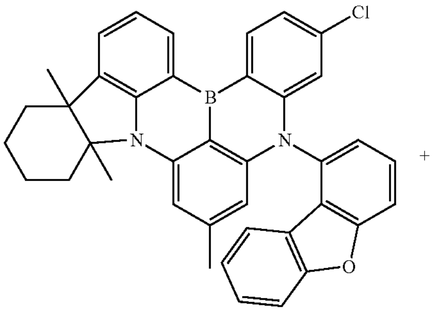

[Intermediate 49]

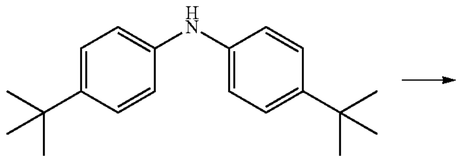

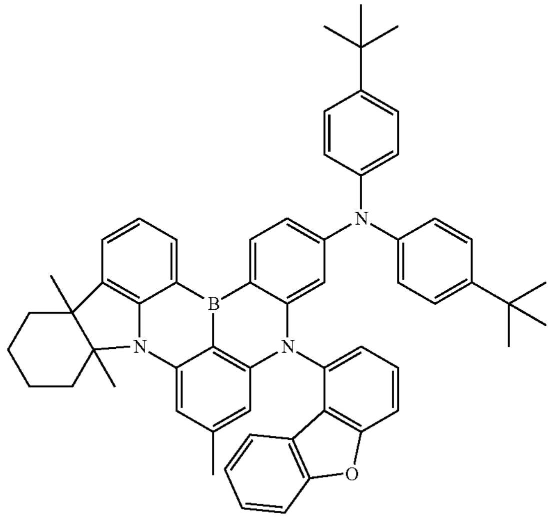

[Compound 20]

After Intermediate 49 (7 g), 3.4 g of bis(4-(tert-butyl)phenyl)amine, 2.3 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain Compound 20 (7.4 g). (Yield 75%). MS[M+H]$^+$=836

Synthesis Example 2-3. Synthesis of Compound 25

1) Synthesis of Intermediate 58

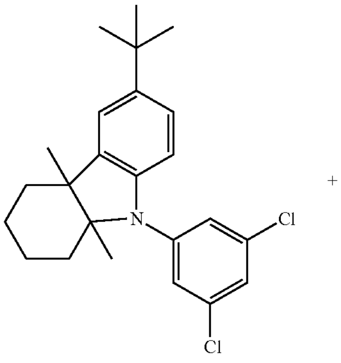

[Intermediate 33]

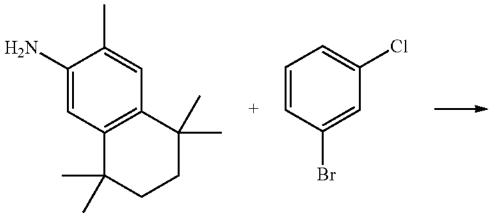

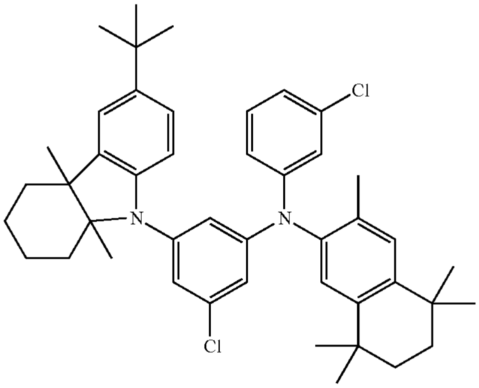

[Intermediate 58]

After Intermediate 33 (40 g), 21.6 g of 3,5,5,8,8-pentamethyl-5,6,7,8-tetrahydronaphthalen-2-amine, 0.5 g of bis(tri-tert-butylphosphine)palladium(0), and 23.9 g of sodium-tert-butoxide were put into 600 ml of toluene under a nitrogen atmosphere, the resulting mixture was stirred under reflux for 1 hour. Thereafter, it was confirmed whether the reaction proceeded, and then 19.1 g of 1-bromo-3-chlorobenzene was introduced thereinto during the stirring, and then the resulting mixture was stirred under reflux for 4 hours. After the completion of the reaction, the resulting product was extracted, and then recrystallized to obtain Intermediate 58 (53 g). (Yield 77%). MS[M+H]$^+$=694

2) Synthesis of Intermediate 59

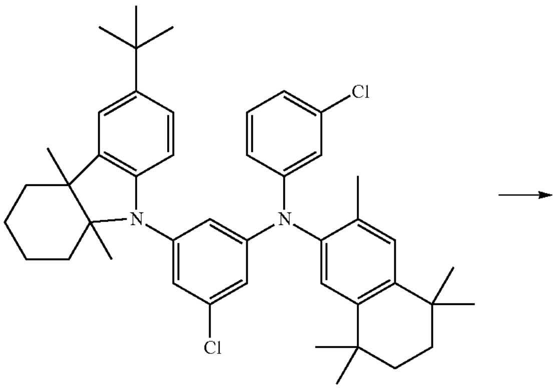

[Intermediate 58]

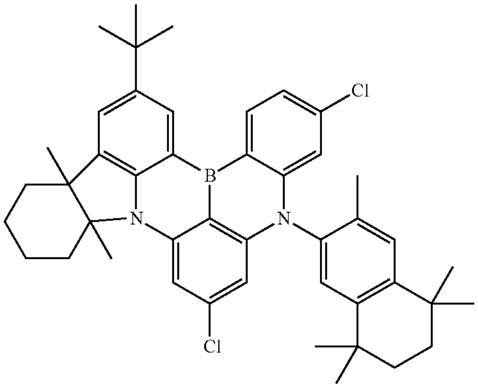

[Intermediate 59]

After Intermediate 58 (25 g) and 24.0 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain Intermediate 59 (7.4 g) (yield 29%). MS[M+H]$^+$=702

4) Synthesis of Compound 25

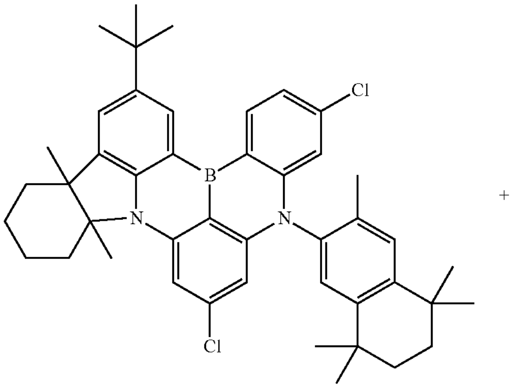

[Intermediate 59]

-continued

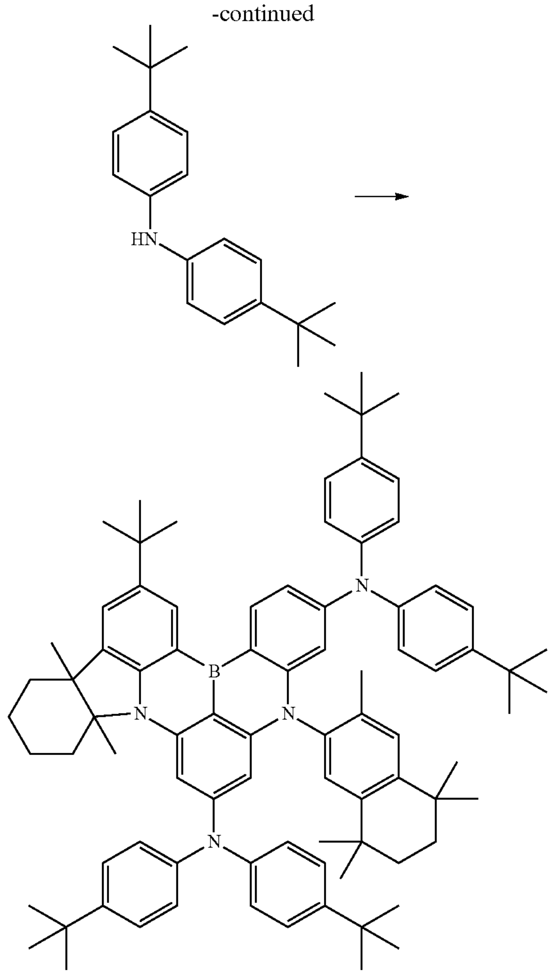

[Compound 25]

After Intermediate 59 (7 g), 5.6 g of bis(4-(tert-butyl) phenyl)amine, 2.0 g of sodium-tert-butoxide, and 0.05 g of bis(tri-tert-butylphosphine)palladium(0) were put into 100 ml of toluene under a nitrogen atmosphere, the resulting mixture was stirred under reflux for 6 hours. After the completion of the reaction, the resulting product was extracted, and then recrystallized to obtain Compound 25 (8.3 g). (Yield 70%). $MS[M+H]^+=1192$

Comparative Example 1

A glass substrate thinly coated with indium tin oxide (ITO) to have a thickness of 1,000 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was repeated twice by using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using oxygen plasma for 5 minutes, and then was transported to a vacuum deposition machine.

Compounds of the following Compound HI-1 and the following Compound HI-2 were thermally vacuum deposited to have a thickness of 100 Å at a ratio of 98:2 (molar ratio) on the transparent ITO electrode thus prepared, thereby forming a hole injection layer.

A compound of the following Chemical Formula HT-1 (1,150 Å) was vacuum deposited on the hole injection layer, thereby forming a hole transport layer.

Subsequently, the following Compound EB-1 was vacuum deposited to have a film thickness of 50 Å on the hole transport layer, thereby forming an electron blocking layer.

Subsequently, a compound of the following Chemical Formula BH-1 and a compound of the following Chemical Formula BD-1 were vacuum deposited at a weight ratio of 25:1 to have a film thickness of 200 Å on the electron blocking layer, thereby forming a light emitting layer. The following compound HB-1 was vacuum deposited to have a film thickness of 50 Å on the light emitting layer, thereby forming a hole blocking layer.

Subsequently, the following Compound ET-1 and the following compound lithium quinolate (LiQ) were vacuum deposited at a weight ratio of 1:1 on the hole blocking layer, thereby forming an electron transport layer having a thickness of 300 Å. Lithium fluoride (LiF) and aluminum were subsequently deposited to have a thickness of 12 Å and 2,000 Å, respectively, on the electron transport layer, thereby forming an electron injection layer and a negative electrode, respectively.

In the aforementioned procedure, the deposition rate of the organic material was maintained at 0.4 Å/sec to 0.7 Å/sec, the deposition rates of lithium fluoride and aluminum of the negative electrode were maintained at 0.3 Å/sec and at 2 Å/sec, respectively, and the degree of vacuum during the deposition was maintained at $2\times10^{-7}$ to $5\times10^{-6}$ torr, thereby manufacturing an organic light emitting device.

The compounds used in Comparative Example 1 are as follows:

HI-1

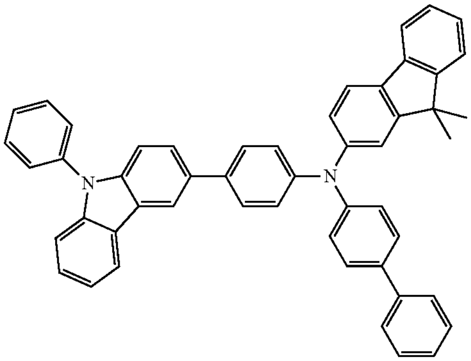

HI-2

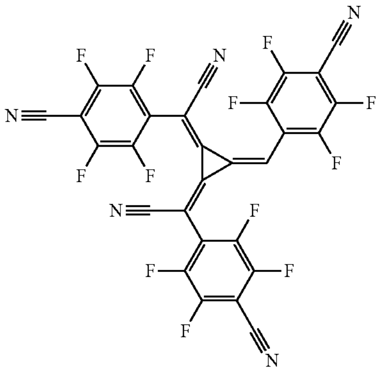

-continued

HT-1

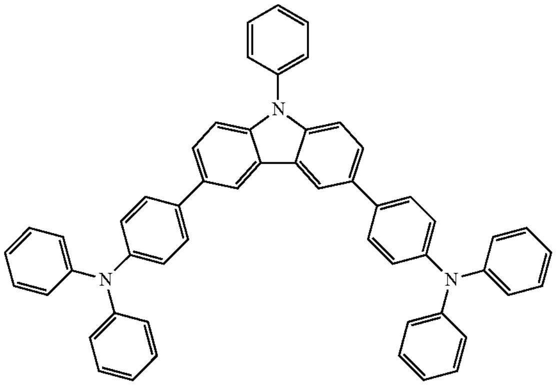

EB-1

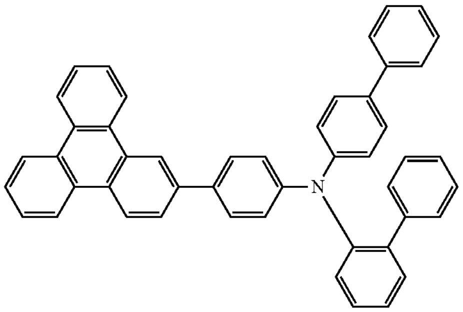

BH-1

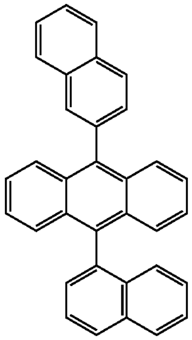

BD-1

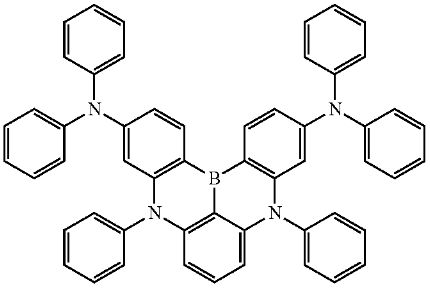

-continued

HB-1

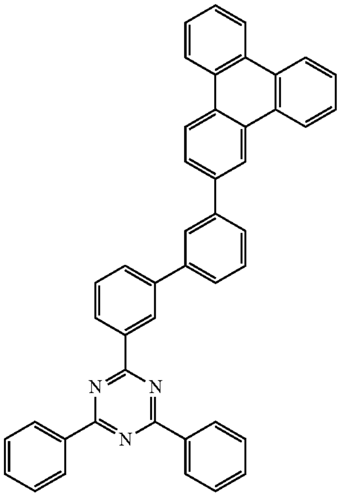

ET-1

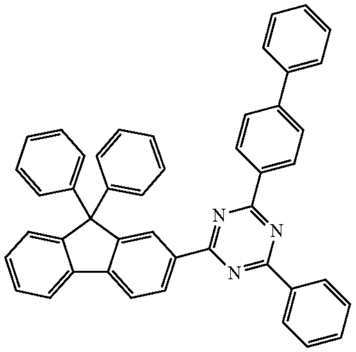

LiQ

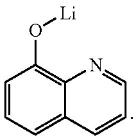

Examples 1 to 9 and Comparative Examples 2 to 11

Organic light emitting devices were manufactured in the same manner as in Comparative Example 1, except that in Comparative Example 1, the compounds described in the following Table 1 were used instead of the electron blocking layer compound EB-1 and the dopant compound BD-1, respectively. The compounds used in the Examples and the Comparative Examples are as follows:

-continued
1-1
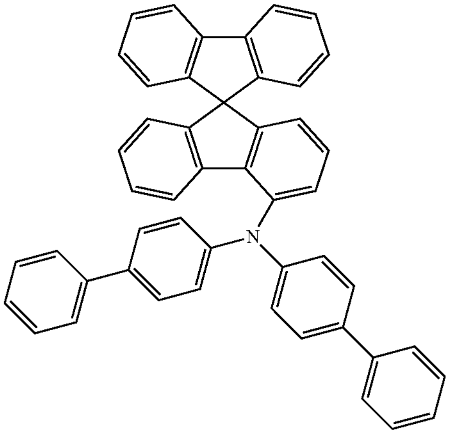
1-2
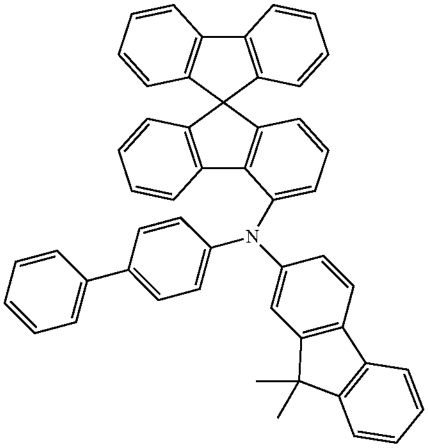
1-3
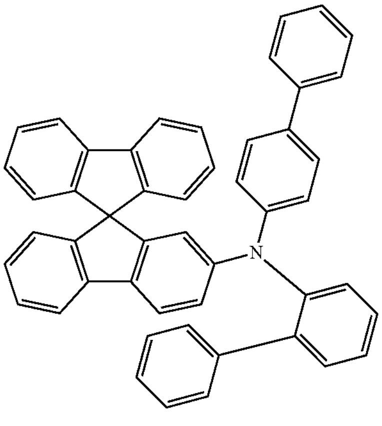
19
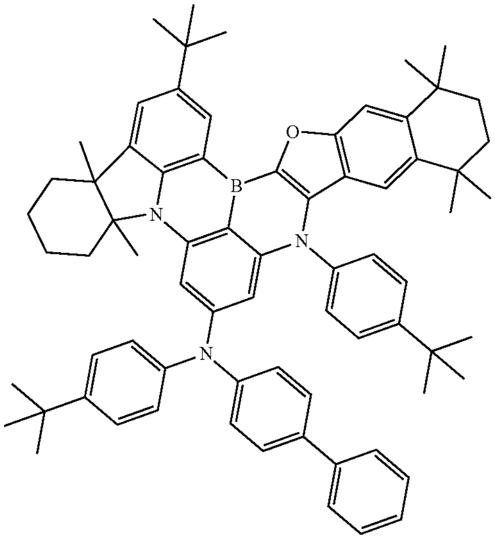
20
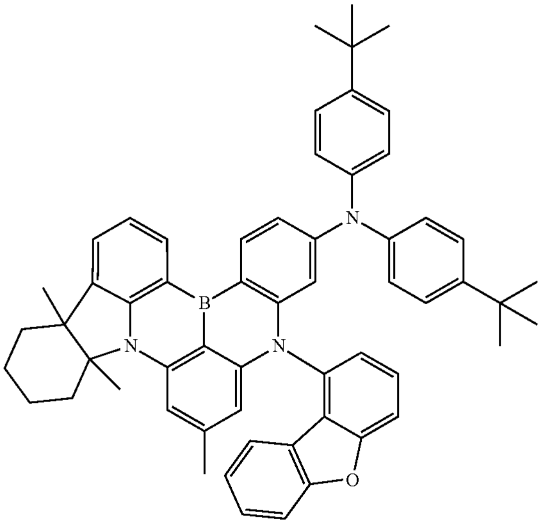

-continued

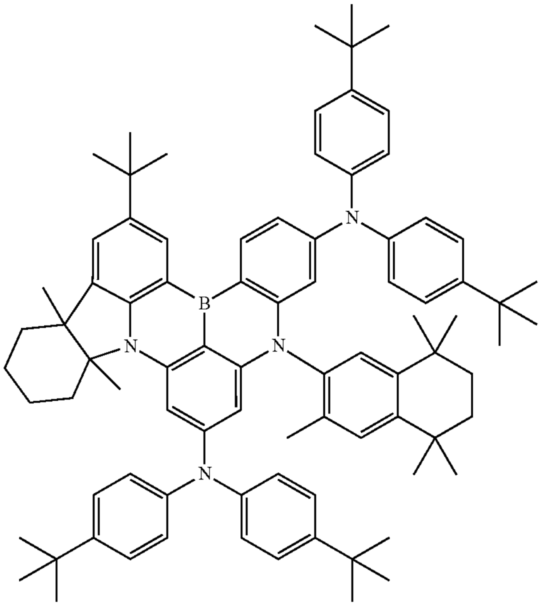

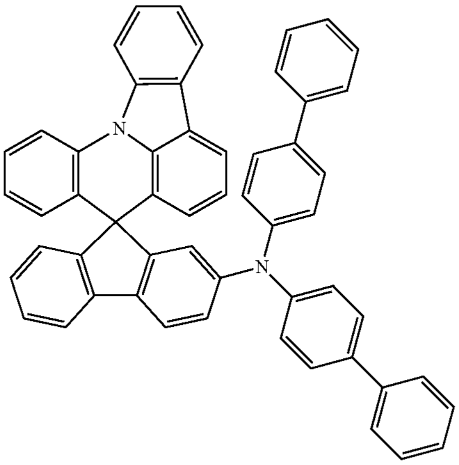

EB-2

Experimental Example 1

When an electric current of 20 $mA/cm^2$ was applied to the organic light emitting devices manufactured in the Examples and the Comparative Examples, the driving voltage, the light emitting efficiency, and the color coordinate were measured from the manufactured organic light emitting devices at a current density of 20 $mA/cm^2$, and time (T95) taken for the luminance to become 98% of the initial luminance at a current density of 20 $mA/cm^2$ was measured. The results are shown in the following Table 1. T95 means the time taken for the luminance to be reduced to 95% of the initial luminance (1600 nit).

TABLE 1

| | Electron blocking layer | Dopant | Voltage (V) | Efficiency (cd/A) | Color coordinate (x, y) | T95 (hr) |
|---|---|---|---|---|---|---|
| Example 1 | 1-1 | 19 | 3.76 | 5.13 | (0.146, 0.047) | 254 |
| Example 2 | 1-2 | 19 | 3.49 | 4.95 | (0.147, 0.046) | 268 |
| Example 3 | 1-3 | 19 | 3.53 | 5.23 | (0.146, 0.043) | 244 |
| Example 4 | 1-1 | 20 | 3.54 | 5.05 | (0.144, 0.047) | 275 |
| Example 5 | 1-2 | 20 | 3.55 | 5.06 | (0.146, 0.046) | 280 |
| Example 6 | 1-3 | 20 | 3.78 | 5.18 | (0.147, 0.044) | 262 |
| Example 7 | 1-1 | 25 | 3.68 | 5.54 | (0.144, 0.048) | 258 |
| Example 8 | 1-2 | 25 | 3.96 | 5.71 | (0.146, 0.045) | 249 |
| Example 9 | 1-3 | 25 | 3.86 | 5.84 | (0.147, 0.047) | 276 |
| Comparative Example 1 | EB-1 | BD-1 | 4.18 | 3.83 | (0.144, 0.048) | 195 |
| Comparative Example 2 | EB-2 | BD-1 | 4.16 | 3.45 | (0.144, 0.046) | 204 |
| Comparative Example 3 | 1-1 | BD-1 | 4.14 | 3.27 | (0.147, 0.045) | 188 |
| Comparative Example 4 | 1-2 | BD-1 | 4.08 | 3.76 | (0.144, 0.047) | 210 |
| Comparative Example 5 | 1-3 | BD-1 | 4.02 | 3.95 | (0.146, 0.045) | 225 |
| Comparative Example 6 | EB-1 | 19 | 4.05 | 3.28 | (0.147, 0.045) | 194 |
| Comparative Example 7 | EB-1 | 20 | 4.03 | 3.74 | (0.147, 0.046) | 190 |
| Comparative Example 8 | EB-1 | 25 | 4.26 | 4.04 | (0.147, 0.044) | 175 |
| Comparative Example 9 | EB-2 | 19 | 4.12 | 3.98 | (0.144, 0.048) | 194 |
| Comparative Example 10 | EB-2 | 20 | 4.18 | 4.12 | (0.146, 0.047) | 205 |
| Comparative Example 11 | EB-2 | 25 | 4.08 | 4.07 | (0.147, 0.048) | 198 |

As shown in Table 1, the organic light emitting devices of the Examples in which Compounds 1-1 to 1-3 were used as the electron blocking layer material and Compounds 19, 20, and 25 were simultaneously used as the dopant material of the light emitting layer exhibited better characteristics in terms of driving voltage, light emitting efficiency, or service life than the organic light emitting devices in Comparative Examples 3 to 11 which employed one of the compounds of Chemical Formulae 1 and 2. It is confirmed that the efficiency and service life characteristics of the organic light emitting devices of the Examples according to the present invention, which employ all of the compounds of Compounds 1-1 to 1-3, and Compounds 19, 20, and 25 are simultaneously improved. Generally, considering that the light emitting efficiency and service life characteristics of the organic light emitting device have a trade-off relationship with each other, it can be seen that the organic light emitting devices employing a combination of the compounds of the present invention exhibit remarkably improved device characteristics compared to the devices in the Comparative Examples.

The invention claimed is:

1. An organic light emitting device comprising:

a cathode;

an anode provided to face the cathode;

a light emitting layer provided between the cathode and the anode and comprising a host and a dopant;

a hole transport region provided between the anode and the light emitting layer; and an electron transport region provided between the cathode and the light emitting layer, wherein the hole transport region includes an organic material layer comprising a compound of any one of the following Chemical Formula 1-A to 1-C, and the dopant comprises a compound of the following Chemical Formula 2:

[Chemical Formula 1-A]

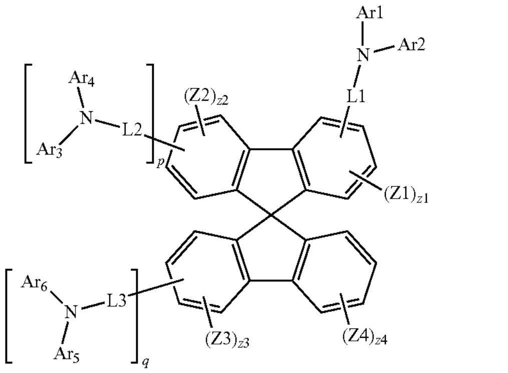

[Chemical Formula 1-B]

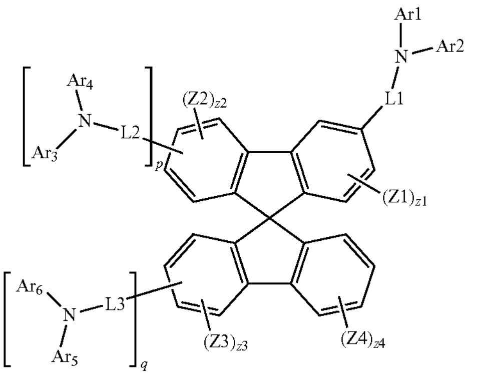

[Chemical Formula 1-C]

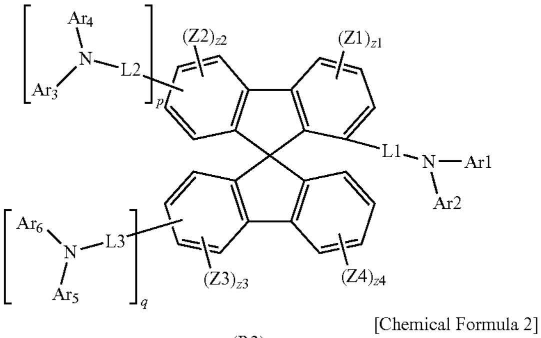

[Chemical Formula 2]

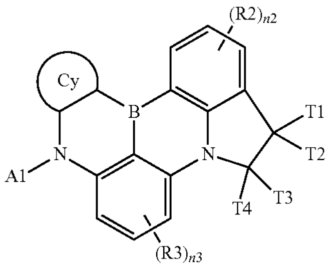

wherein in Chemical Formulae 1-A to 1-C and Chemical Formula 2:

Ar1 and Ar2 are the same as or different from each other, and are each independently a substituted or unsubstituted aryl group having 6 to 60 carbon atoms, or a substituted or unsubstituted heterocyclic group having 2 to 60 carbon atoms and containing S or O, or are bonded to an adjacent substituent to form a substituted or unsubstituted ring;

Ar3 to Ar6 are the same as or different from each other, and are each independently a substituted or unsubstituted aryl group having 6 to 60 carbon atoms, or a substituted or unsubstituted heterocyclic group having 2 to 60 carbon atoms, or are bonded to an adjacent substituent to form a substituted or unsubstituted ring;

L1 to L3 are the same as or different from each other, and are each independently a direct bond, a substituted or unsubstituted arylene group having 6 to 60 carbon atoms, or a substituted or unsubstituted divalent heterocyclic group having 2 to 60 carbon atoms;

p and q are each 0;

Z1 to Z4 are the same as or different from each other, and are each independently hydrogen, deuterium, a halogen group, a nitrile group, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group;

z1 is an integer from 0 to 3;

z2 to z4 are each an integer from 0 to 4;

when z1 is 2 or higher, the Z1s are the same as or different from each other;

when z2 is 2 or higher, the Z2s are the same as or different from each other;

when z3 is 2 or higher, the Z3s are the same as or different from each other;

when z4 is 2 or higher, the Z4s are the same as or different from each other;

T1 to T4 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to an adjacent substituent to form an aliphatic hydrocarbon ring;

A1 is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group; or is bonded to an adjacent substituent to form a substituted or unsubstituted ring;

Cy is a substituted or unsubstituted aliphatic hydrocarbon ring, a substituted or unsubstituted aromatic ring, or a substituted or unsubstituted hetero ring, or a substituted or unsubstituted ring in which these rings are fused;

R2 and R3 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; or are bonded to an adjacent substituent to form a substituted or unsubstituted ring;

n2 and n3 are each an integer from 0 to 3;

when n2 is 2 or higher, the R2s are the same as or different from each other; and when n3 is 2 or higher, the R3s are the same as or different from each other.

2. The organic light emitting device of claim 1, wherein:

Ar1 and Ar2 are the same as or different from each other, and are each independently a substituted or unsubstituted fluorenyl group, a substituted or unsubstituted spirobifluorenyl group, a substituted or unsubstituted phenyl group, a substituted or unsubstituted biphenyl group, a substituted or unsubstituted terphenyl group, a substituted or unsubstituted quaterphenyl group, a substituted or unsubstituted dibenzofuranyl group, or a substituted or unsubstituted dibenzothiophenyl group; and Ar3 to Ar6 are the same as or different from each other, and are each independently a substituted or unsubstituted fluorenyl group, a substituted or unsubstituted spirobifluorenyl group, a substituted or unsubstituted phenyl group, a substituted or unsubstituted biphenyl group, a substituted or unsubstituted terphenyl group, a substituted or unsubstituted quaterphenyl group, a substituted or unsubstituted carbazolyl group, a substituted or unsubstituted dibenzofuranyl group, or a substituted or unsubstituted dibenzothiophenyl group.

3. The organic light emitting device of claim 1, wherein:

Ar1 and Ar2 are each independently any one of the following structures:

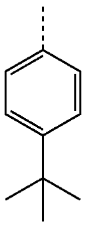
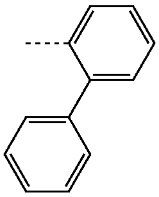
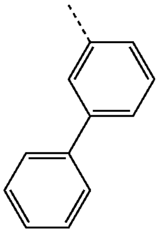
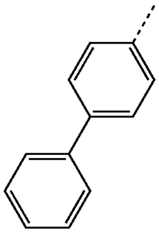
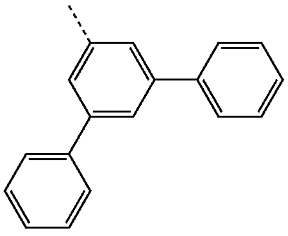

-continued

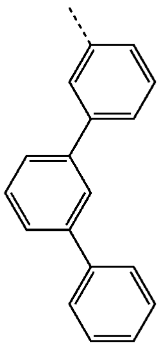
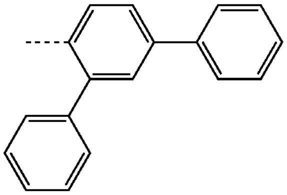
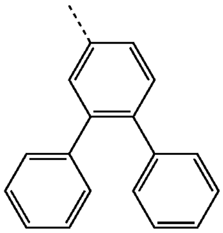
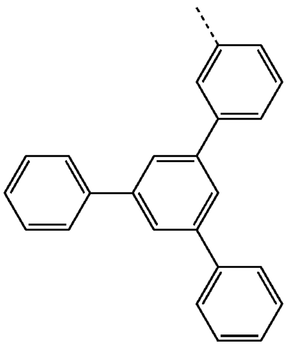
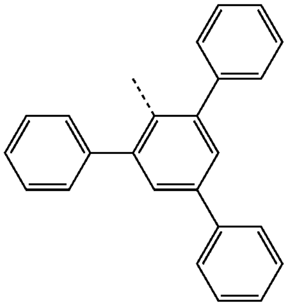
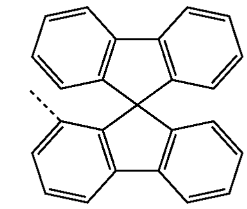
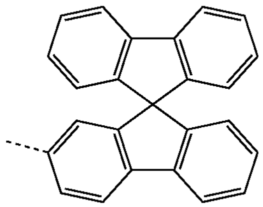
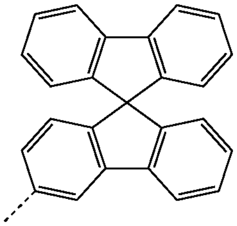
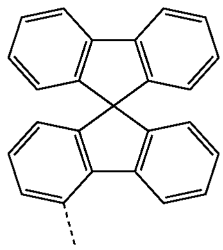
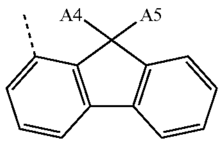
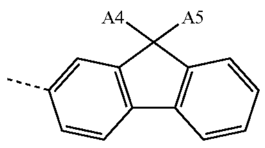
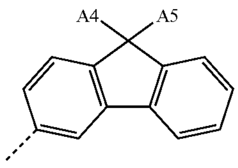

-continued
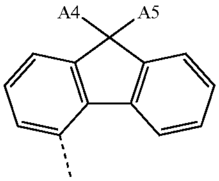
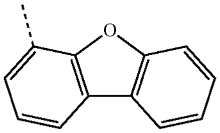
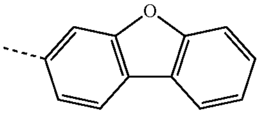
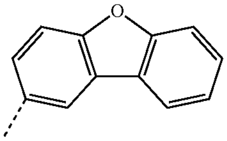
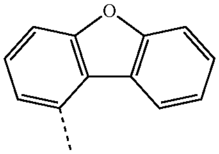
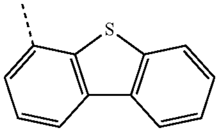
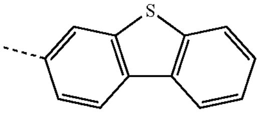
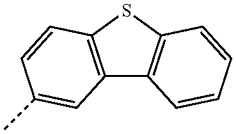
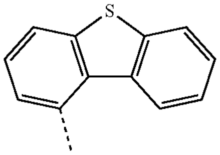
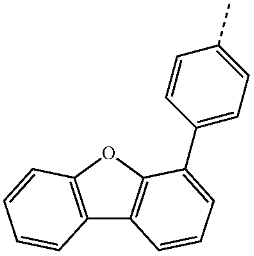
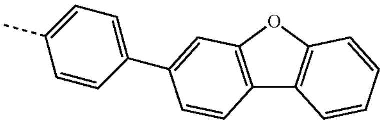
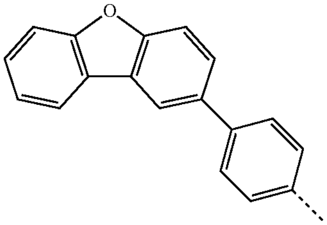
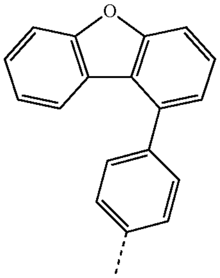
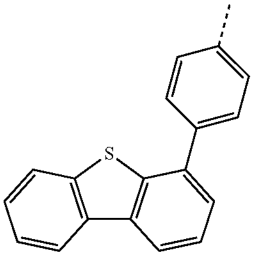
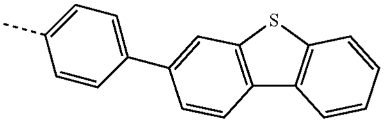
-continued
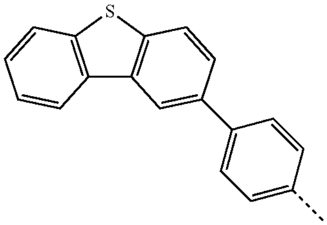
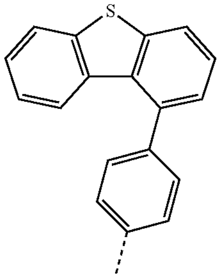
and Ar3 to Ar6 are each independently any one of the following structures:
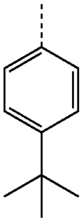
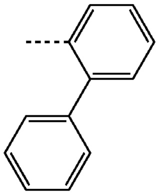
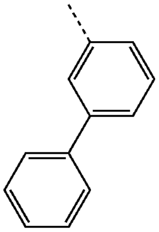
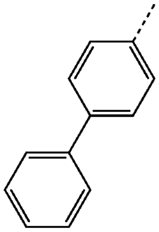
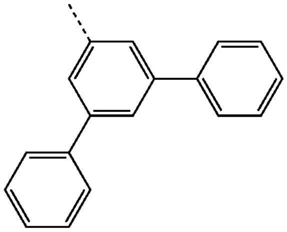
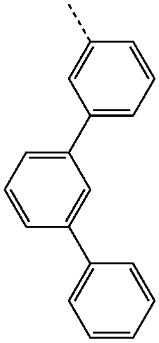
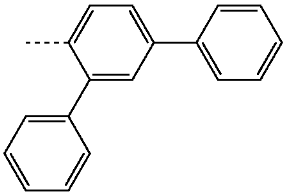

-continued
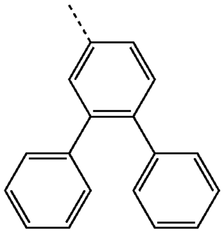
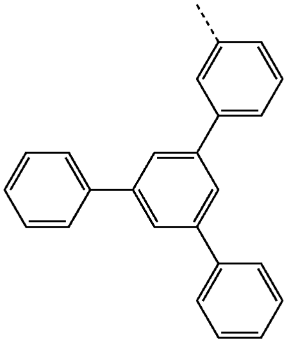
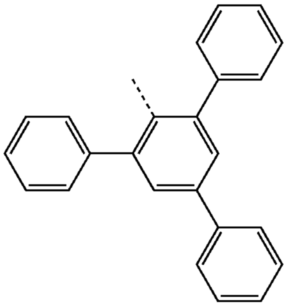
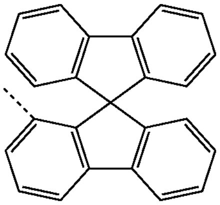
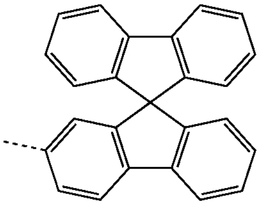
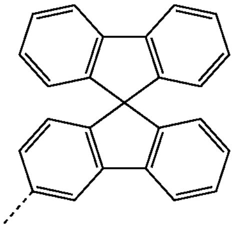
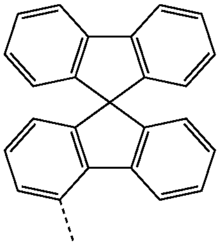
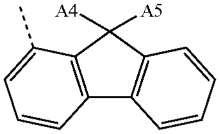
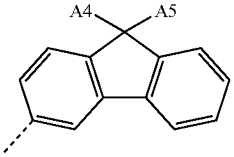
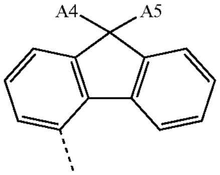
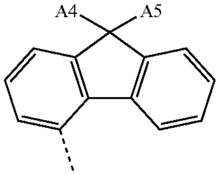
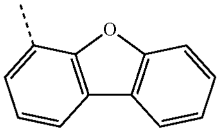
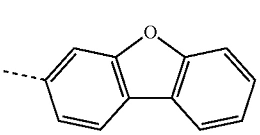
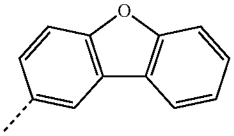
-continued
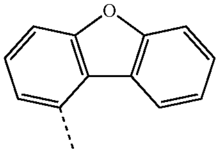
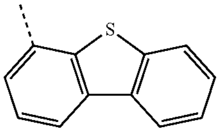
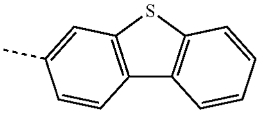
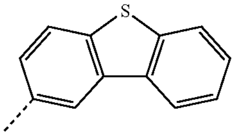
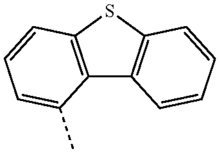
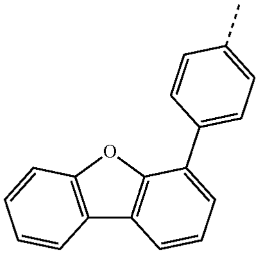
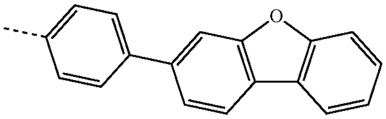
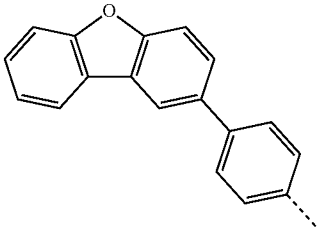
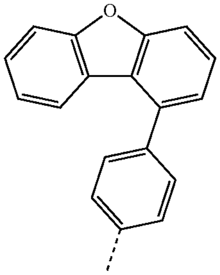
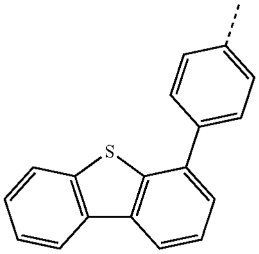
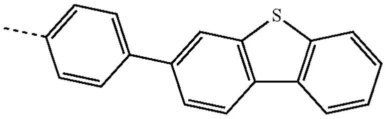
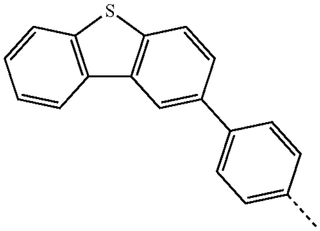
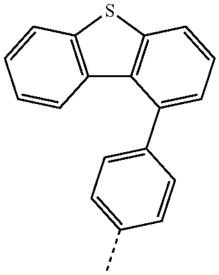
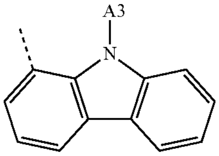
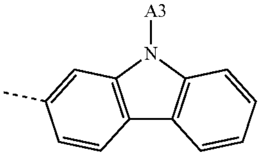

-continued

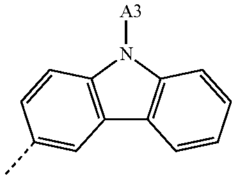

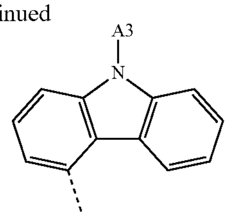

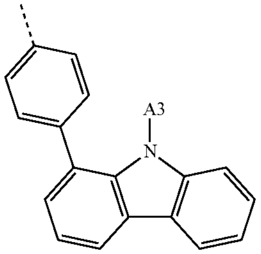

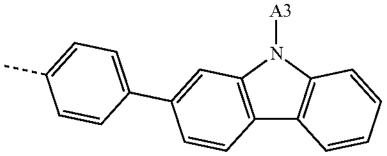

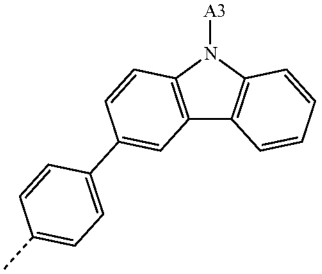

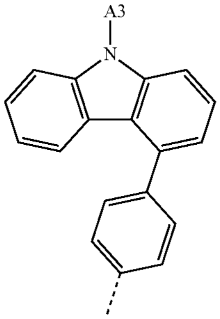

wherein in the structures:

a dotted line denotes a bonding position; and

A3 to A5 are the same as or different from each other, and are each independently hydrogen, a substituted or unsubstituted alkyl group, or a substituted or unsubstituted aryl group.

4. The organic light emitting device of claim 1, wherein L1 to L3 are the same as or different from each other, and are each independently a direct bond, a substituted or unsubstituted phenylene group, a substituted or unsubstituted biphenylene group, a substituted or unsubstituted naphthylene group, a substituted or unsubstituted fluorene group, a substituted or unsubstituted spirofluorene group, a substituted or unsubstituted divalent carbazole group, a substituted or unsubstituted divalent dibenzofuran group, or a substituted or unsubstituted divalent dibenzothiophene group.

5. The organic light emitting device of claim 1, wherein L1 to L3 are each independently any one of the following structures:

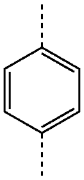

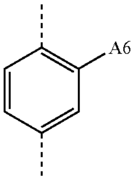

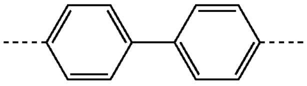

-continued

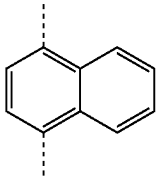

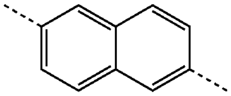

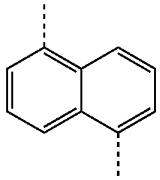

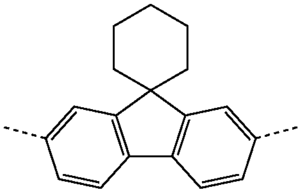

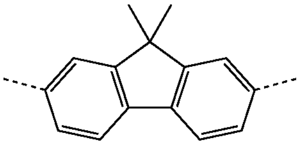

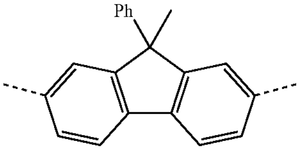

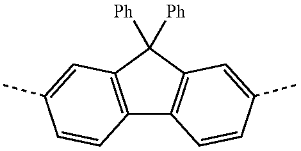

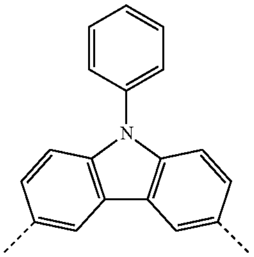

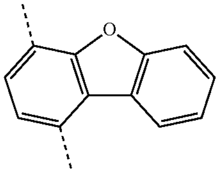

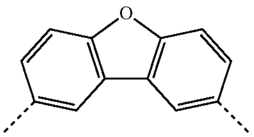

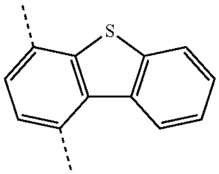

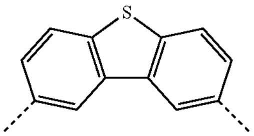

wherein in the structures:

a dotted line denotes a bonding position; and

A6 is a substituted or unsubstituted alkyl group, or a substituted or unsubstituted aryl group.

6. The organic light emitting device of claim 1, wherein Chemical Formula 2 is any one of the following Chemical Formulae 3 to 5:

[Chemical Formula 3]

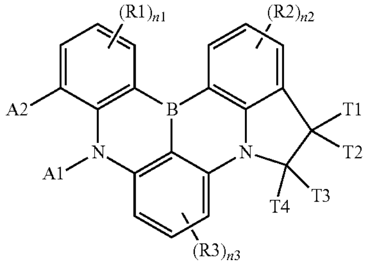

[Chemical Formula 4]

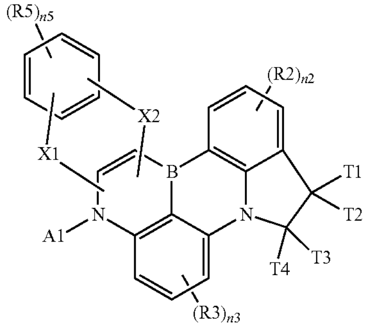

[Chemical Formula 5]

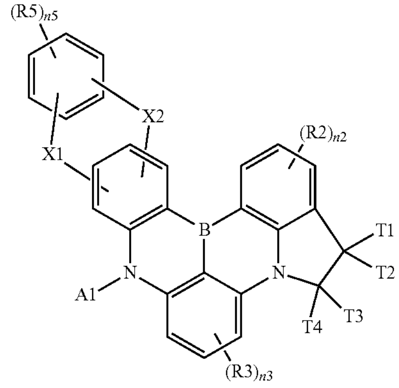

wherein in Chemical Formulae 3 to 5:

the definitions of R2 and R3, T1 to T4, A1, n2, and n3 are the same as those defined in Chemical Formula 2;

X1 and X2 are the same as or different from each other, and are each independently O, S, or CRR';

R, R', and R1 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

A2 and R5 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; or are bonded to an adjacent substituent to form a substituted or unsubstituted ring;

n1 is an integer from 0 to 3;

n5 is an integer from 0 to 4;

when n1 is 2 or higher, the R1s are the same as or different from each other, and when n5 is 2 or higher, the R5s are the same as or different from each other.

7. The organic light emitting device of claim 6, wherein Chemical Formula 3 is the following Chemical Formula 3-1 or 3-2:

[Chemical Formula 3-1]

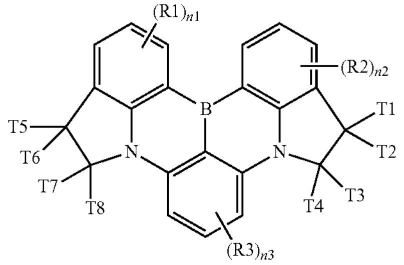

[Chemical Formula 3-2]

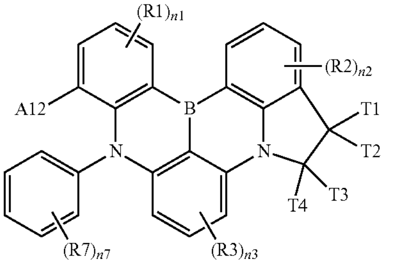

wherein in Chemical Formulae 3-1 and 3-2:

the definitions of RI to R3, T1 to T4, and n1 to n3 are the same as those defined in Chemical Formulae 2 and 3;

A12 is hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group;

R7 and T5 to T8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or adjacent groups are bonded to each other to form a substituted or unsubstituted ring;

n7 is an integer from 0 to 5; and when n7 is 2 or higher, the R7s are the same as or different from each other.

8. The organic light emitting device of claim 1, wherein Chemical Formula 2 is any one of the following Chemical Formulae 6 to 8:

[Chemical Formula 6]

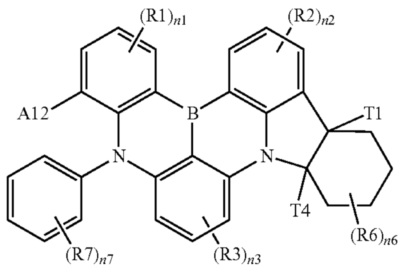

[Chemical Formula 7]

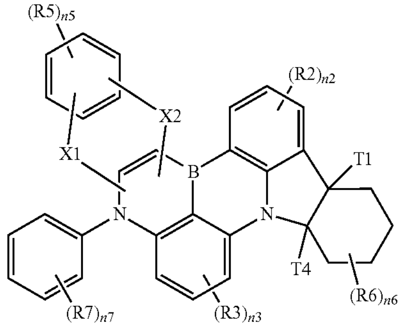

[Chemical Formula 8]

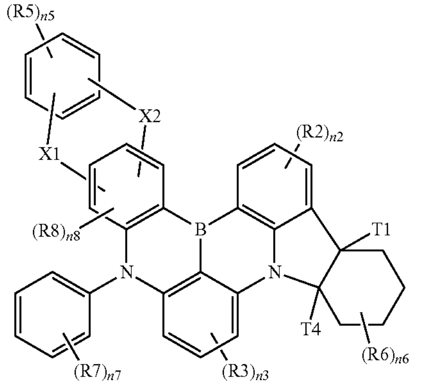

wherein in Chemical Formulae 6 to 8:

the definitions of R2 and R3, T1, T4, n2, and n3 are the same as those defined in Chemical Formula 2;

X1 and X2 are the same as or different from each other, and are each independently O, S, or CRR';

R, R', R1, and R8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

A12 and R5 to R7 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; or are bonded to an adjacent substituent to form a substituted or unsubstituted ring;

n1 is an integer from 0 to 3;

n5 is an integer from 0 to 4;

n6 is an integer from 0 to 8;

n7 is an integer from 0 to 5;

n8 is an integer from 0 to 2;

when n1 is 2 or higher, the R1s are the same as or different from each other;

when n5 is 2 or higher, the R5s are the same as or different from each other;

when n6 is 2 or higher, the R6s are the same as or different from each other;

when n7 is 2 or higher, the R7s are the same as or different from each other; and when n8 is 2, the R8s are the same as or different from each other.

9. An organic light emitting device comprising:

a cathode;

an anode provided to face the cathode;

a light emitting layer provided between the cathode and the anode and comprising a host and a dopant;

a hole transport region provided between the anode and the light emitting layer; and an electron transport region provided between the cathode and the light emitting layer, wherein the hole transport region includes an organic material layer comprising a compound of the following Chemical Formula 1, and the dopant comprises a compound of any one of the following Chemical Formulae A to H:

[Chemical Formula 1]

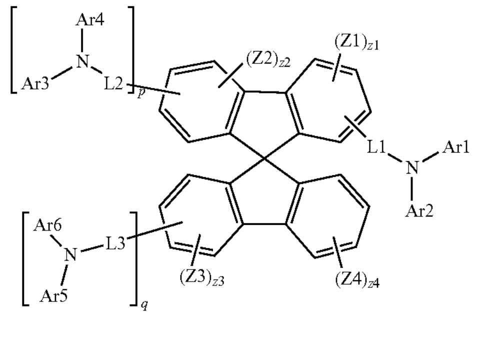

-continued

[Chemical Formula A]

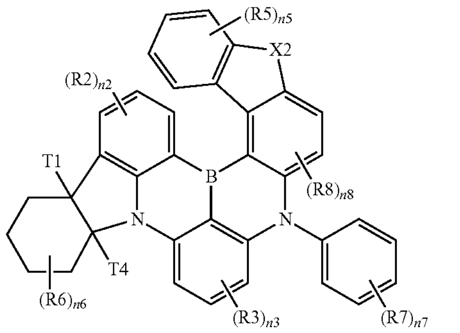

[Chemical Formula B]

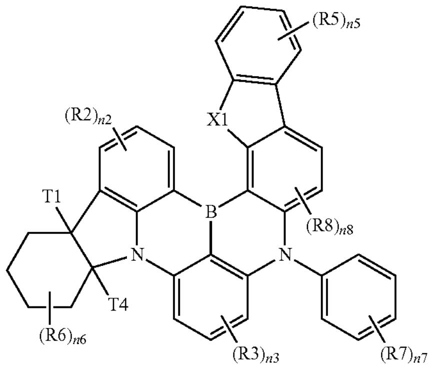

[Chemical Formula C]

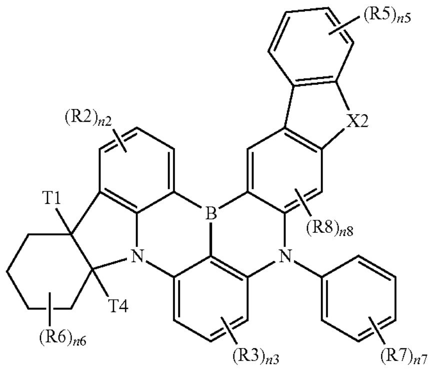

[Chemical Formula D]

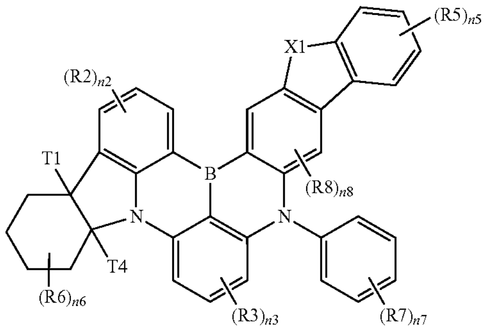

-continued

[Chemical Formula E]

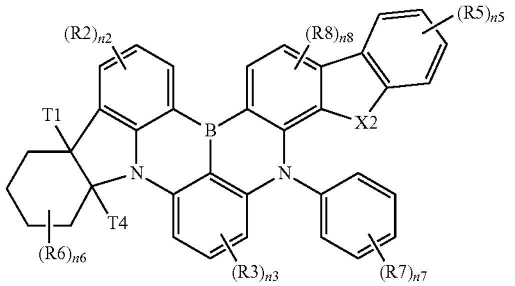

[Chemical Formula F]

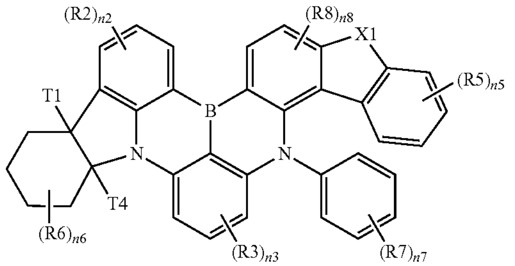

[Chemical Formula G]

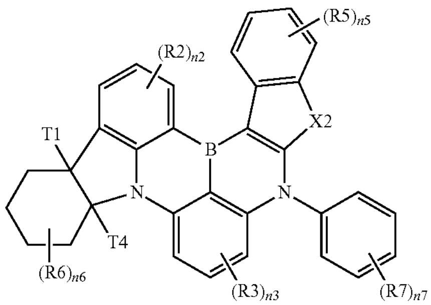

[Chemical Formula H]

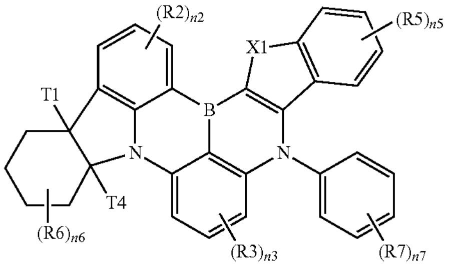

wherein in Chemical Formula 1 and Chemical Formulae A to H:

Ar1 and Ar2 are the same as or different from each other, and are each independently a substituted or unsubstituted aryl group having 6 to 60 carbon atoms, or a substituted or unsubstituted heterocyclic group having 2 to 60 carbon atoms and containing S or O, or are bonded to an adjacent substituent to form a substituted or unsubstituted ring;

Ar3 to Ar6 are the same as or different from each other, and are each independently a substituted or unsubstituted aryl group having 6 to 60 carbon atoms, or a substituted or unsubstituted heterocyclic group having 2 to 60 carbon atoms, or are bonded to an adjacent substituent to form a substituted or unsubstituted ring;

L1 to L3 are the same as or different from each other, and are each independently a direct bond, a substituted or unsubstituted arylene group having 6 to 60 carbon atoms, or a substituted or unsubstituted divalent heterocyclic group having 2 to 60 carbon atoms;

p and q are each 0 or 1;

Z1 to Z4 are the same as or different from each other, and are each independently hydrogen, deuterium, a halogen group, a nitrile group, a substituted or unsubstituted alkyl group, a substituted or unsubstituted alkenyl group, a substituted or unsubstituted alkynyl group, a substituted or unsubstituted cycloalkyl group, a substituted or unsubstituted aryl group, or a substituted or unsubstituted heterocyclic group;

z1 is an integer from 0 to 3;

z2 to z4 are each an integer from 0 to 4;

when z1 is 2 or higher, the Z1s are the same as or different from each other;

when z2 is 2 or higher, the Z2s are the same as or different from each other;

when z3 is 2 or higher, the Z3s are the same as or different from each other;

when z4 is 2 or higher, the Z4s are the same as or different from each other;

T1 and T4 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, or a substituted or unsubstituted heterocyclic group, or are bonded to an adjacent substituent to form an aliphatic hydrocarbon ring;

R2 and R3 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; or are bonded to an adjacent substituent to form a substituted or unsubstituted ring;

n2 and n3 are each an integer from 0 to 3;

when n2 is 2 or higher, the R2s are the same as or different from each other; and when n3 is 2 or higher, the R3s are the same as or different from each other;

X1 and X2 are the same as or different from each other, and are each independently O, S, or CRR';

R, R', and R8 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group;

R5 to R7 are the same as or different from each other, and are each independently hydrogen, deuterium, a halogen group, a nitrile group, a substituted or unsubstituted silyl group, a substituted or unsubstituted boron group, a substituted or unsubstituted alkyl group, a substituted or unsubstituted alkenyl group, a substituted or unsubstituted alkynyl group, a substituted or unsubstituted alkoxy group, a substituted or unsubstituted aryloxy group, a substituted or unsubstituted cycloalkyl group, a substituted or unsubstituted aryl group, a substituted or unsubstituted amine group, or a substituted or unsubstituted heterocyclic group; or are bonded to an adjacent substituent to form a substituted or unsubstituted ring;

n5 is an integer from 0 to 4;

n6 is an integer from 0 to 8;

n7 is an integer from 0 to 5;

n8 is an integer from 0 to 2;

when n5 is 2 or higher, the R5s are the same as or different from each other, when n6 is 2 or higher, the R6s are the same as or different from each other, when n7 is 2 or higher, the R7s are the same as or different from each other, and when n8 is 2, the R8s are the same as or different from each other.

10. The organic light emitting device of claim 9, wherein the compound of Chemical Formula 1 is any one of the following compounds:

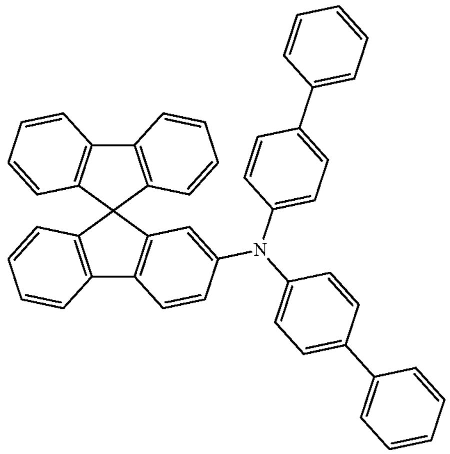

-continued
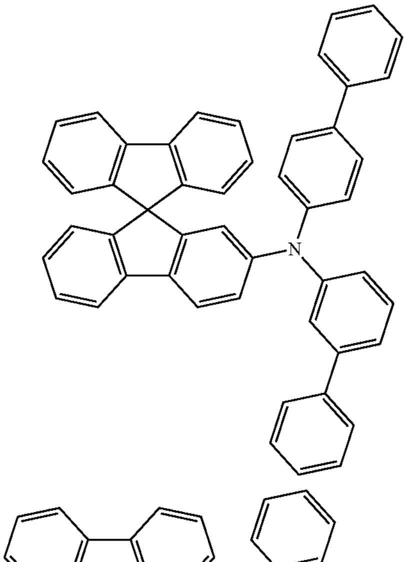
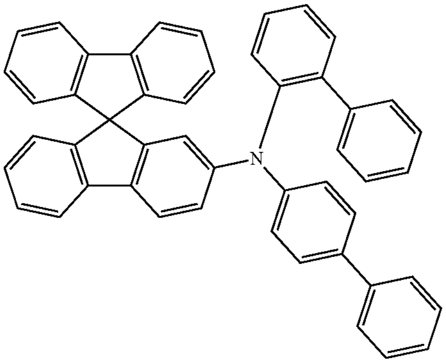
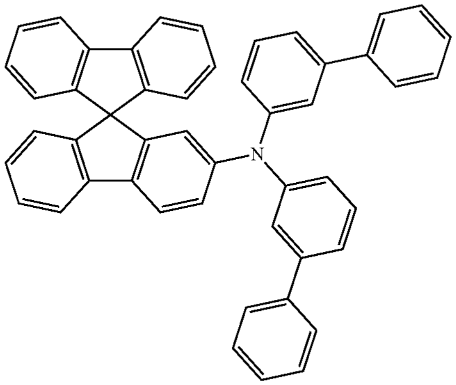
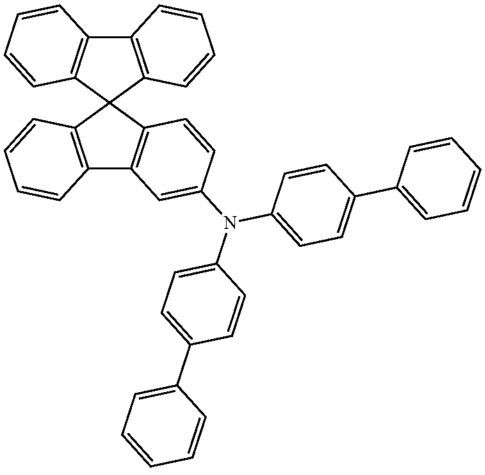
-continued
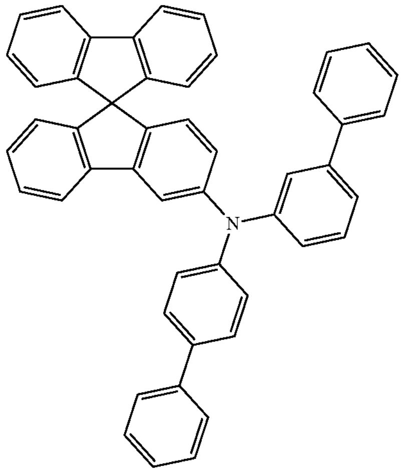
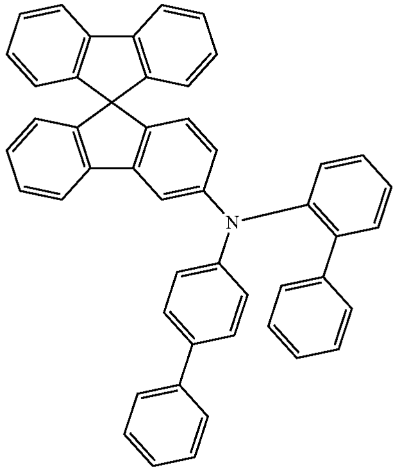
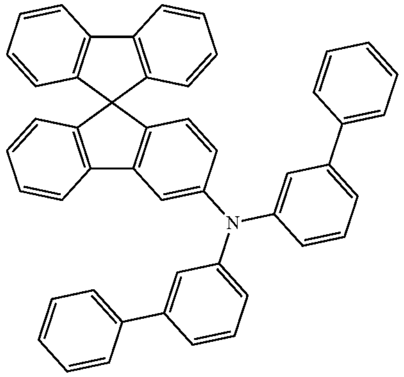

-continued
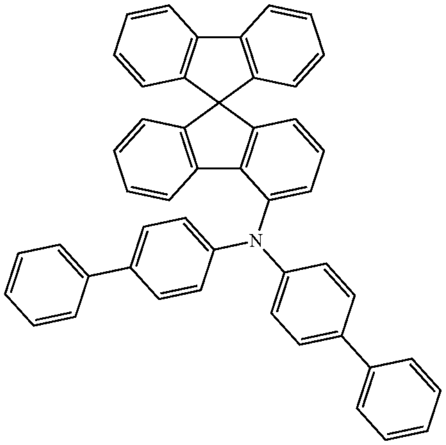
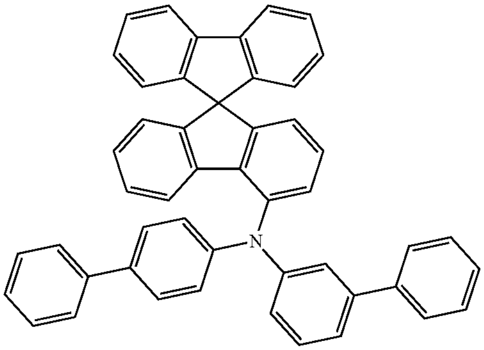
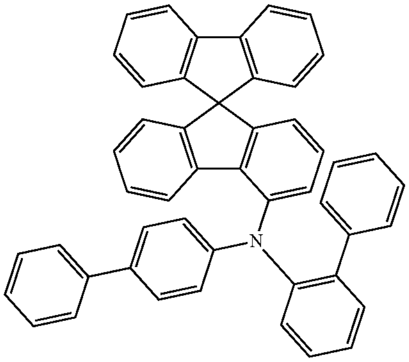
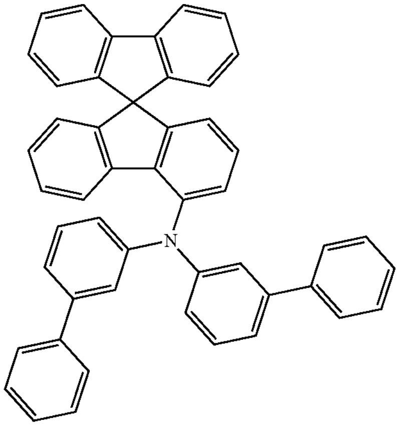
-continued
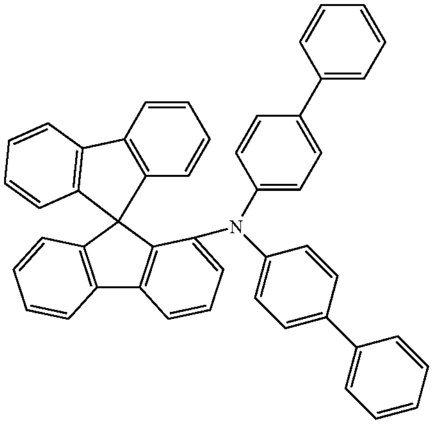
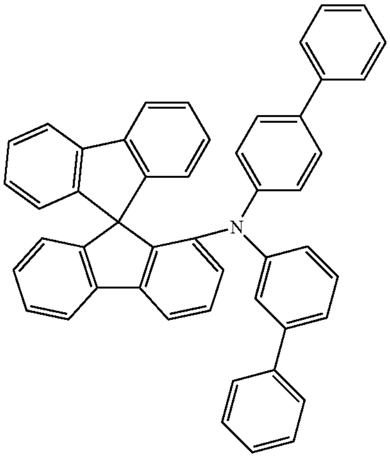
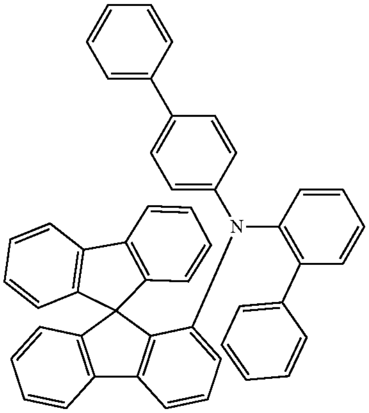
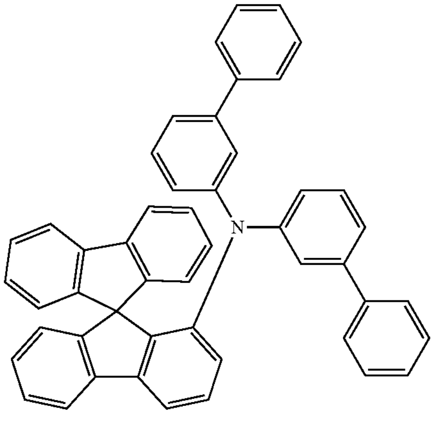

-continued
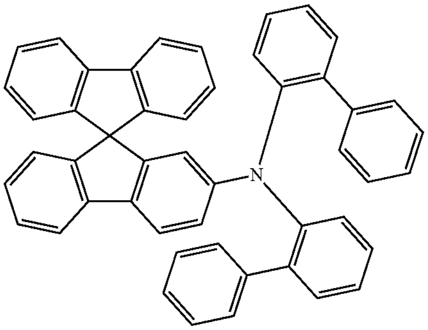
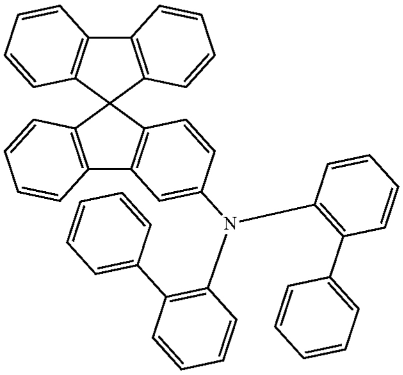
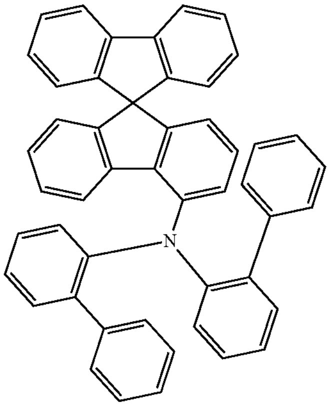
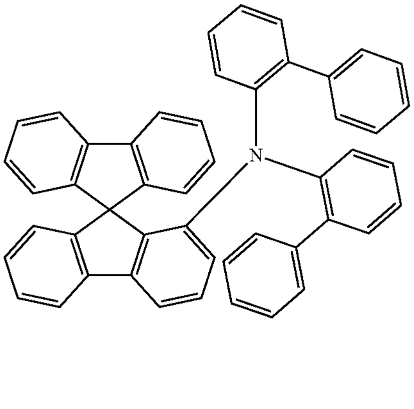
-continued
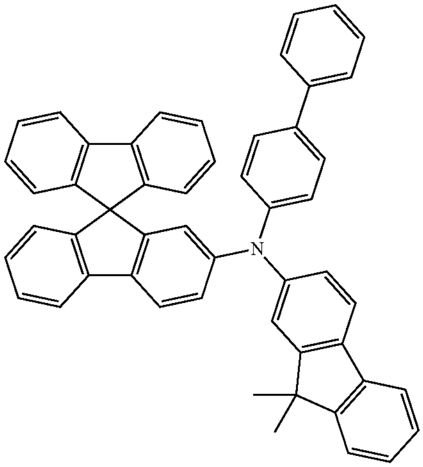
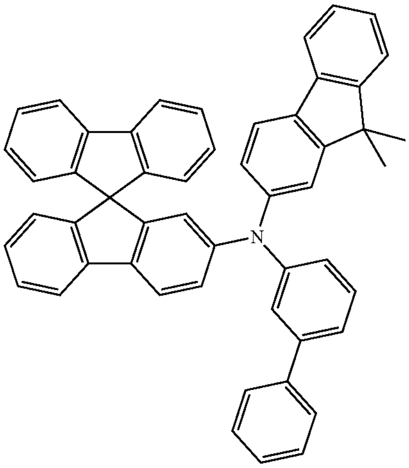
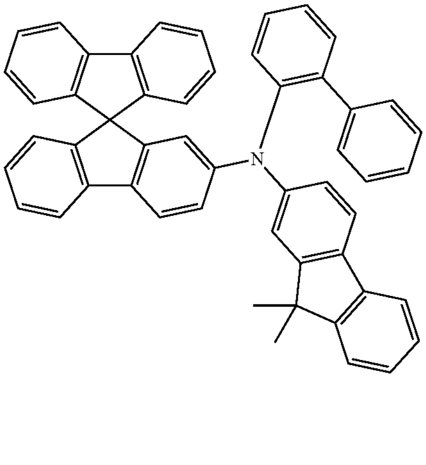

-continued
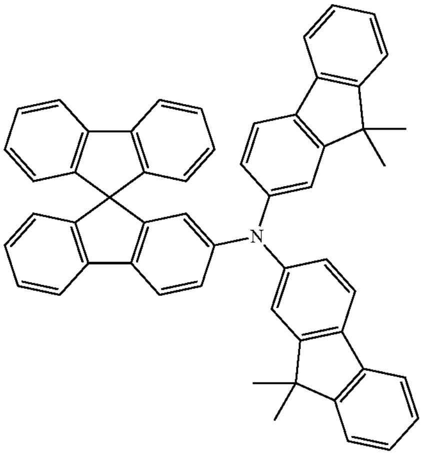
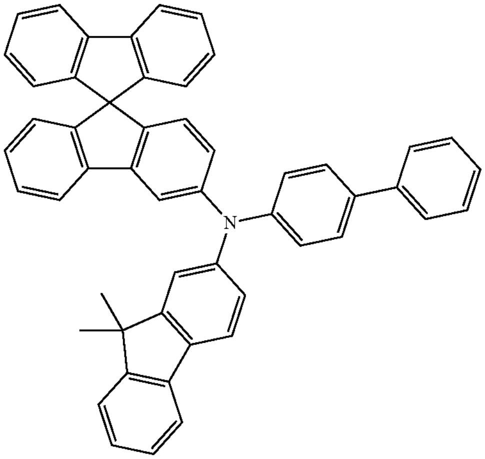
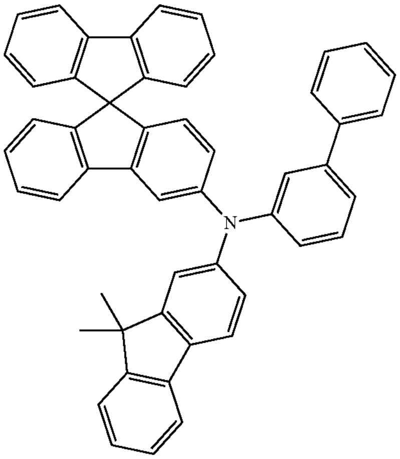
-continued
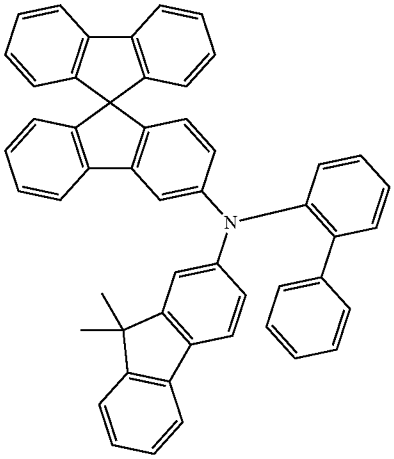
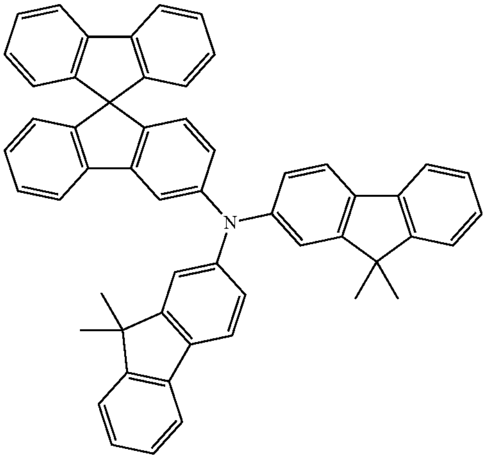
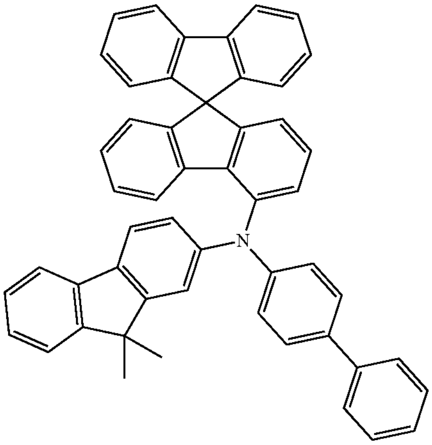

-continued
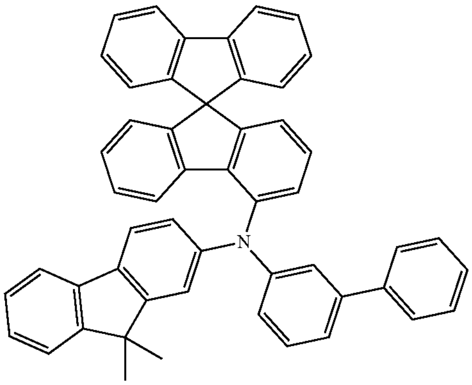
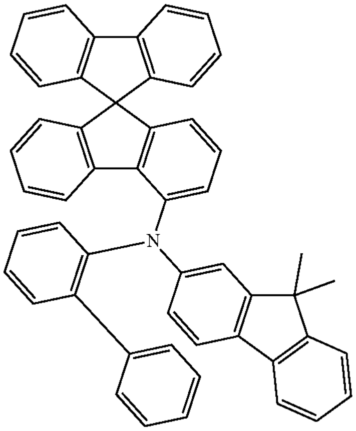
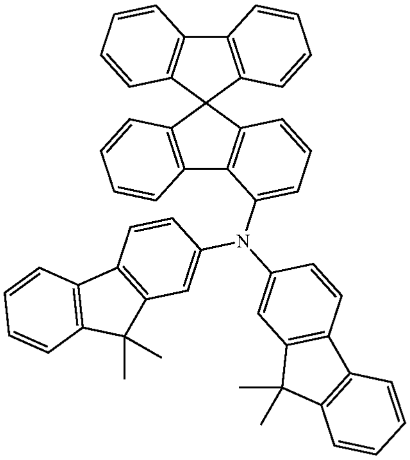
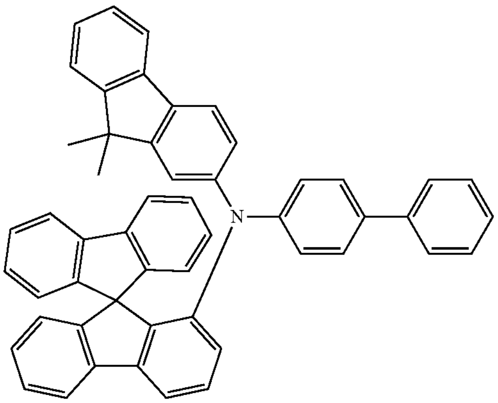
-continued
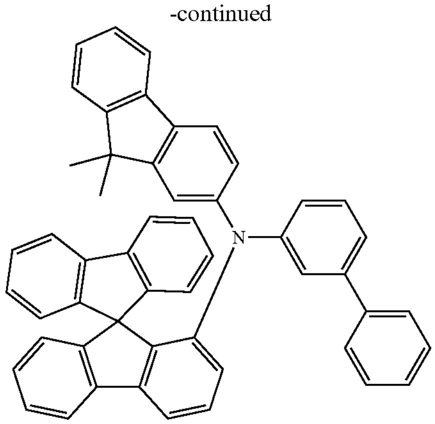
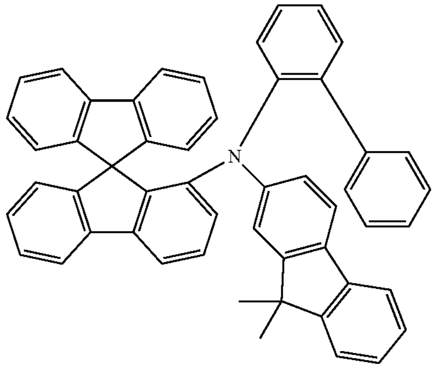
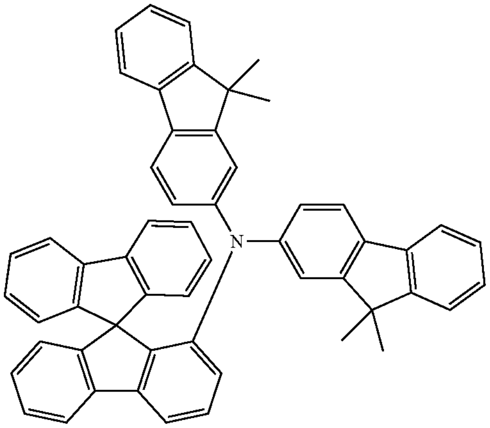
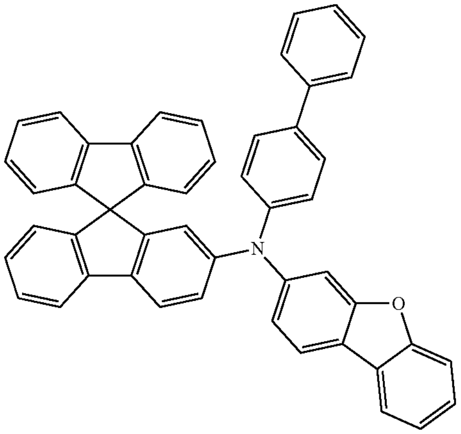

-continued
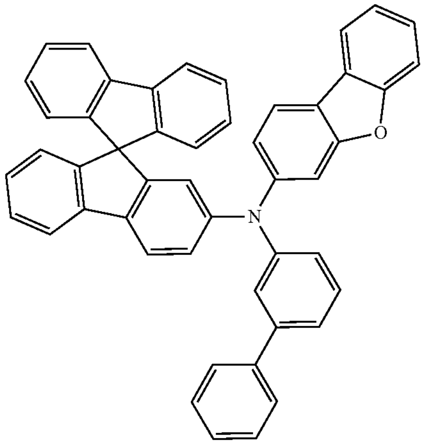
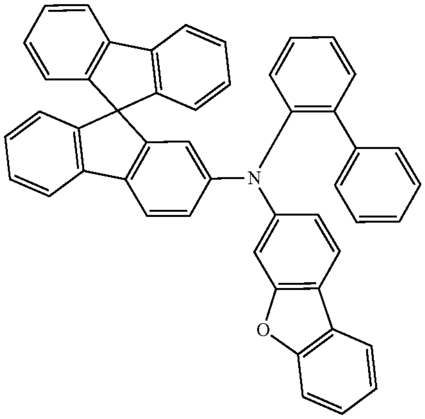
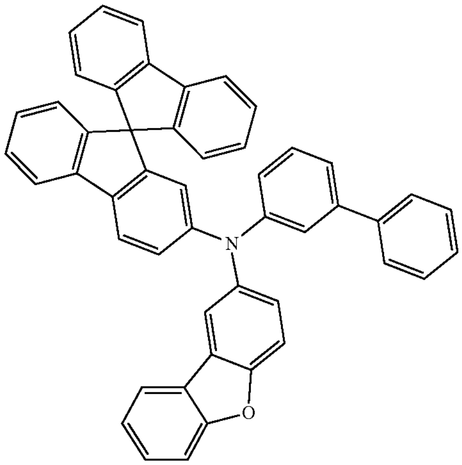
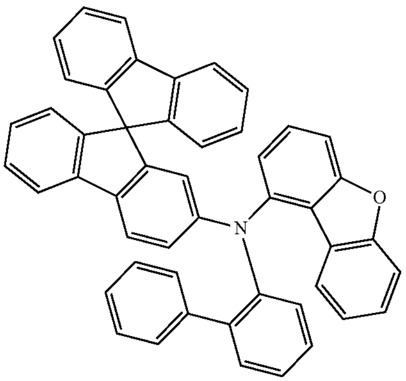
-continued
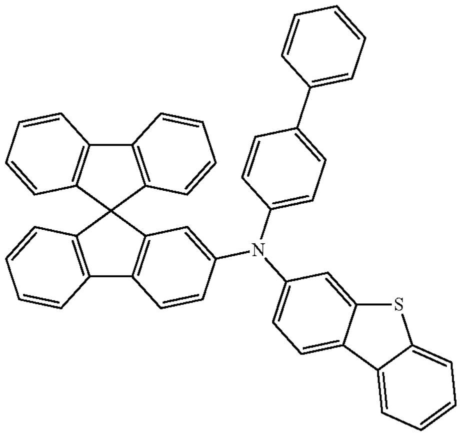
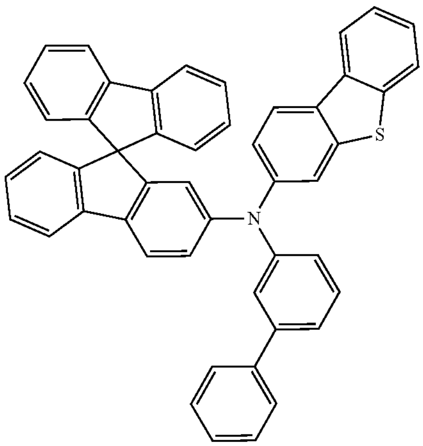
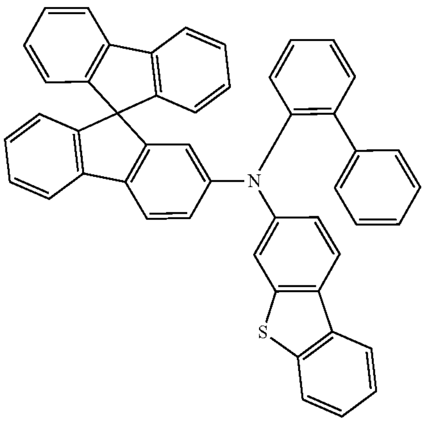

-continued
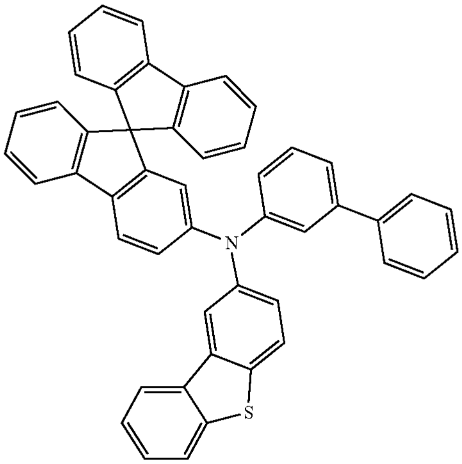
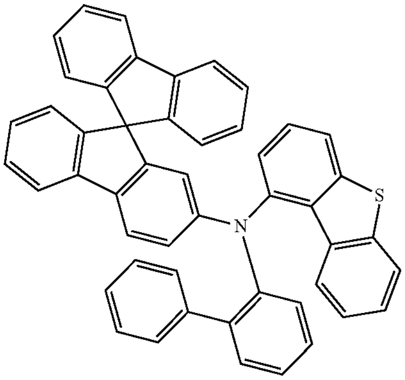
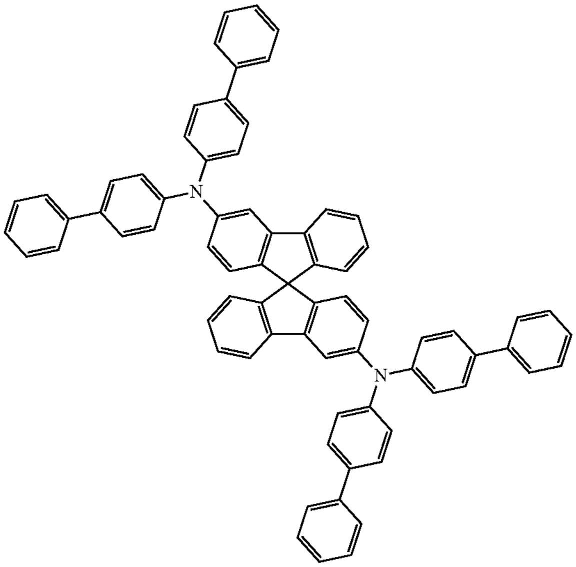
-continued
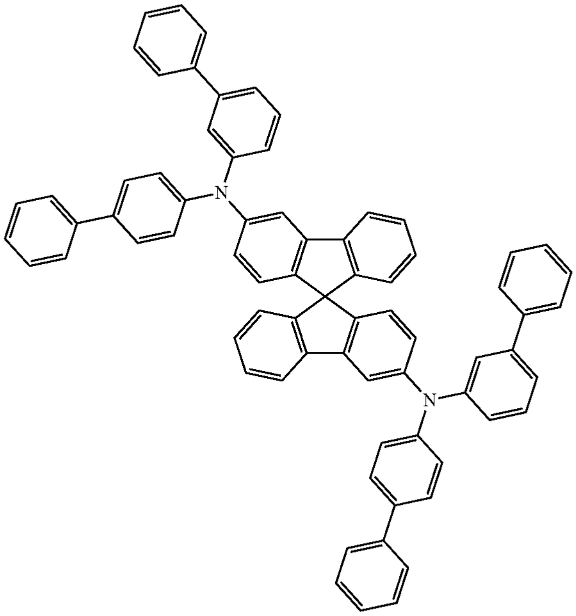
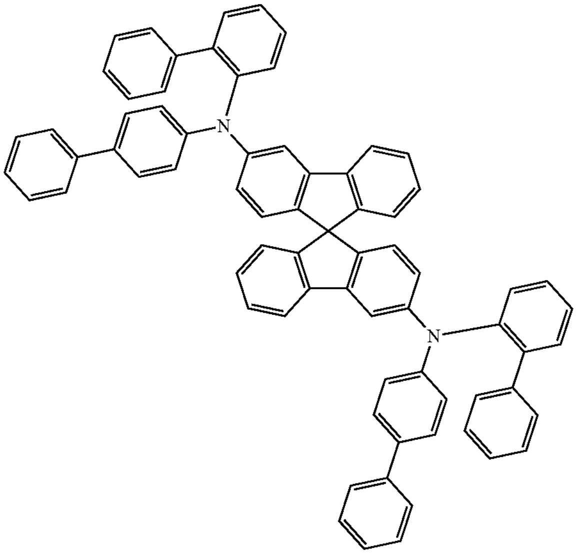
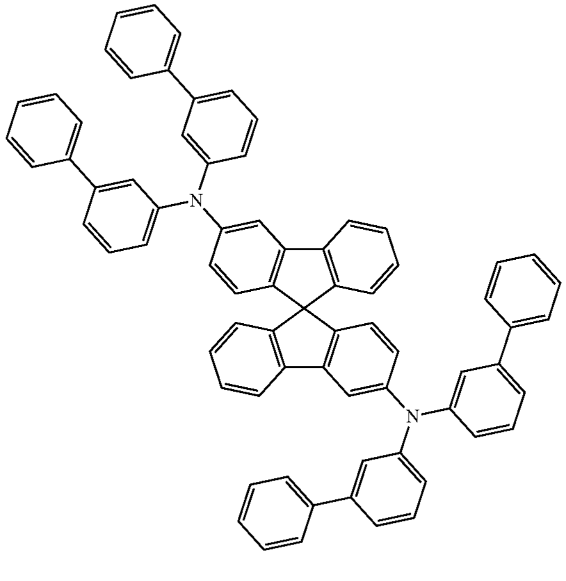

-continued
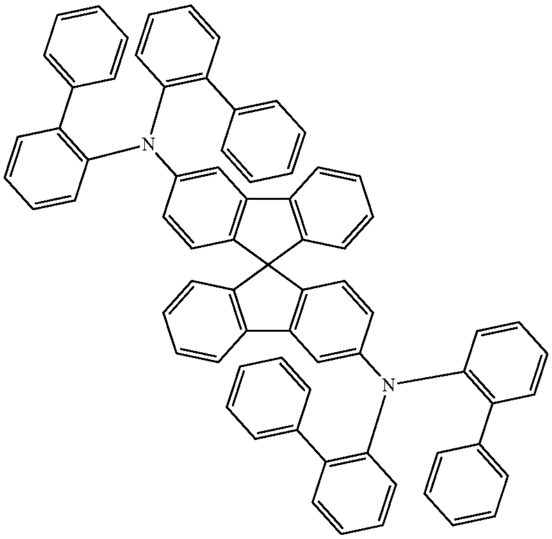
-continued
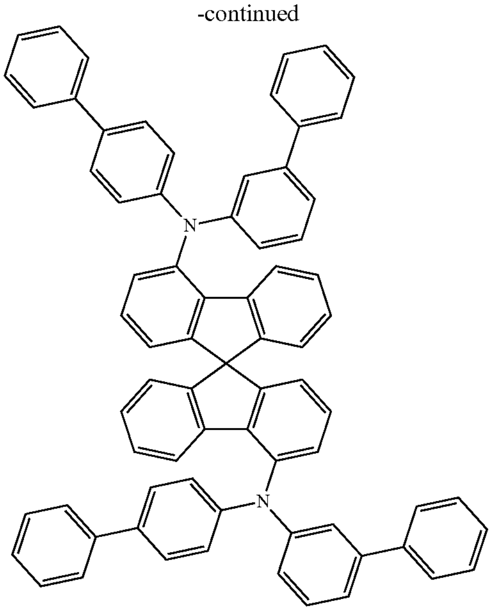
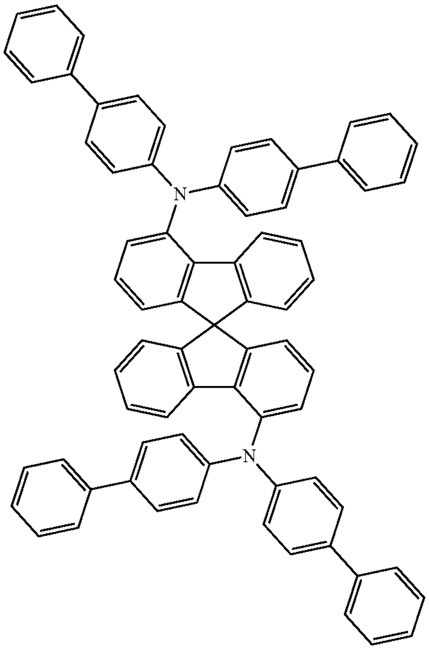
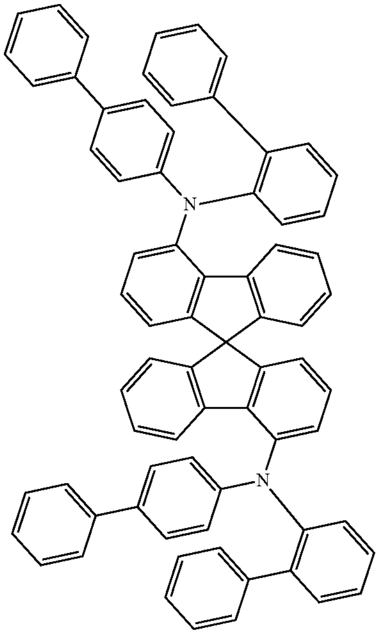

-continued
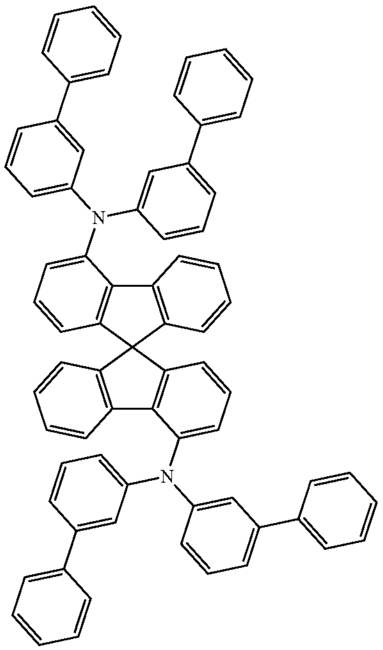
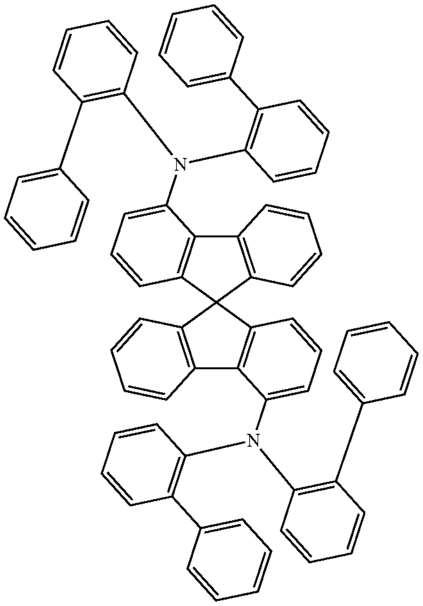
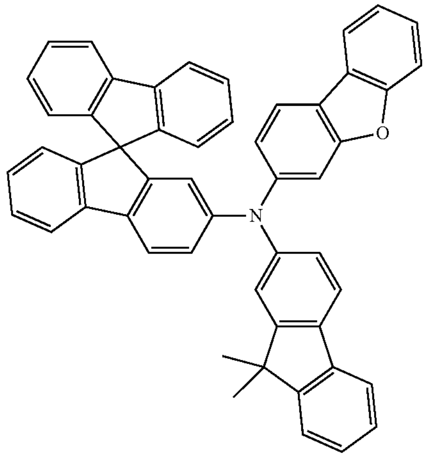
-continued
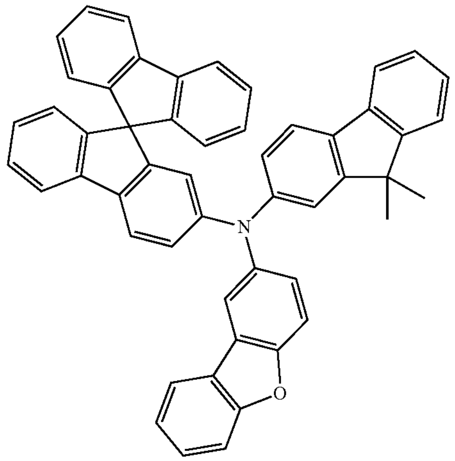
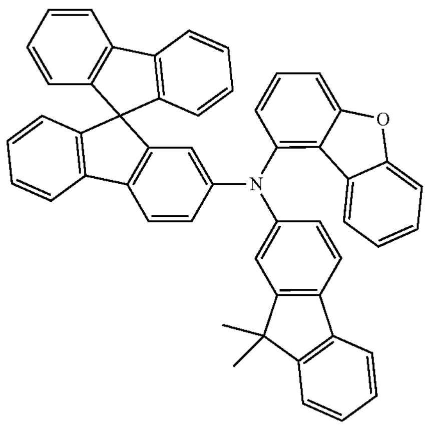
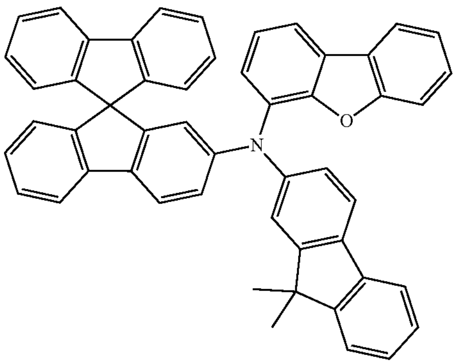
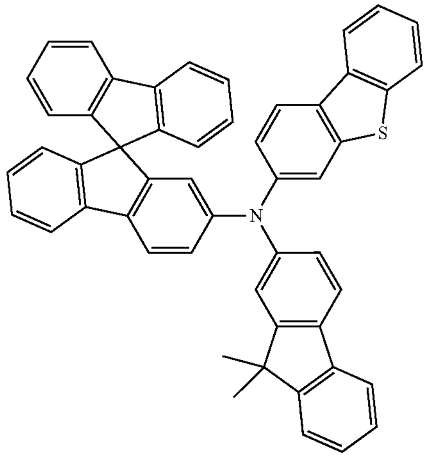

-continued
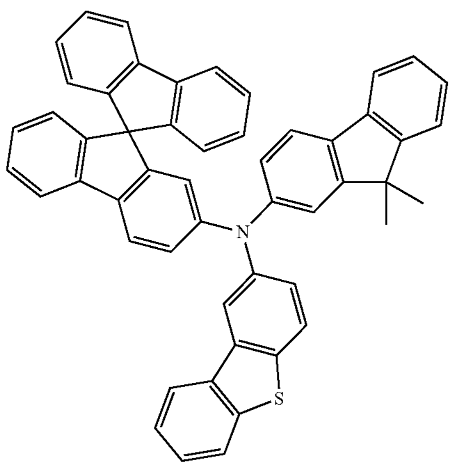
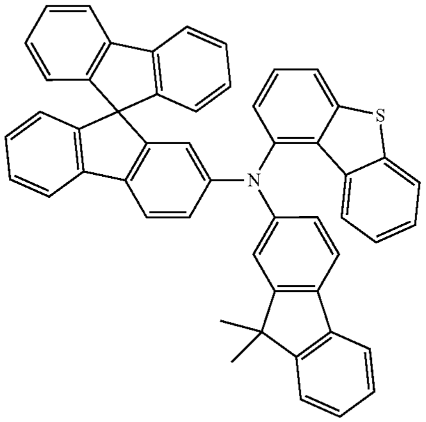
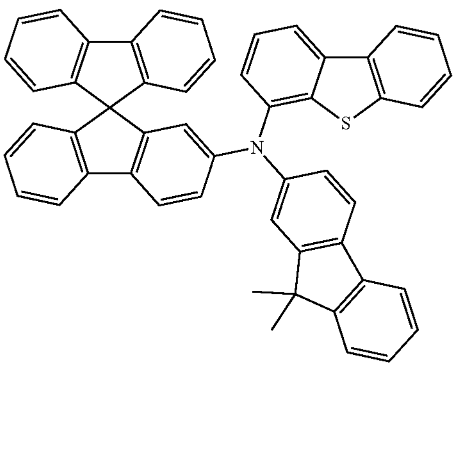
-continued
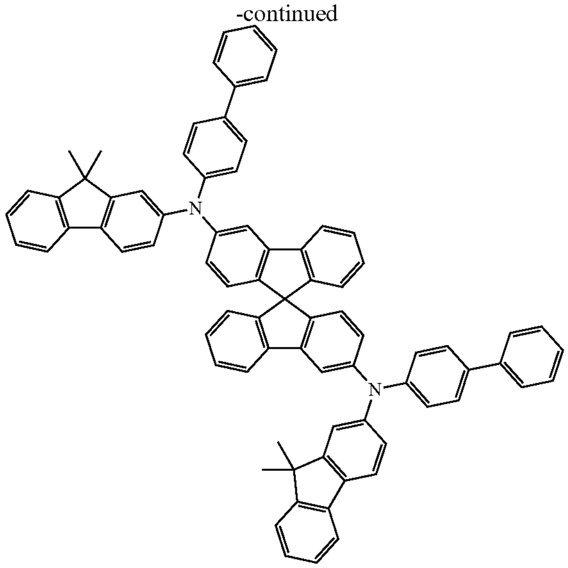
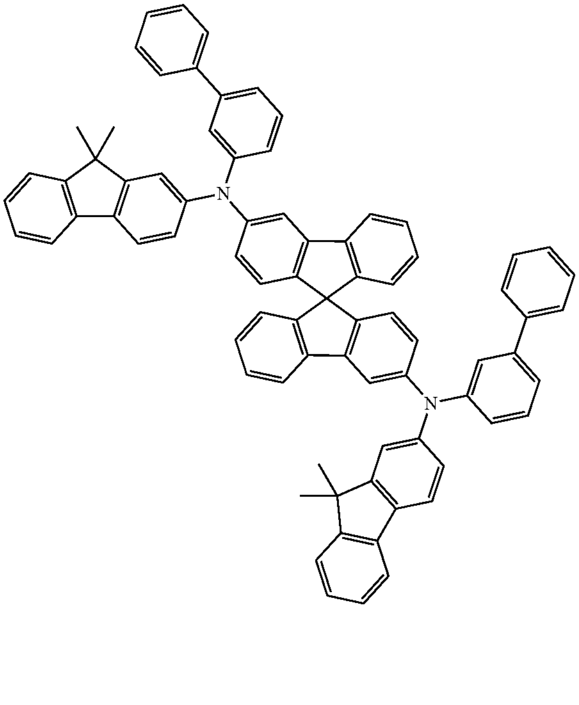

-continued
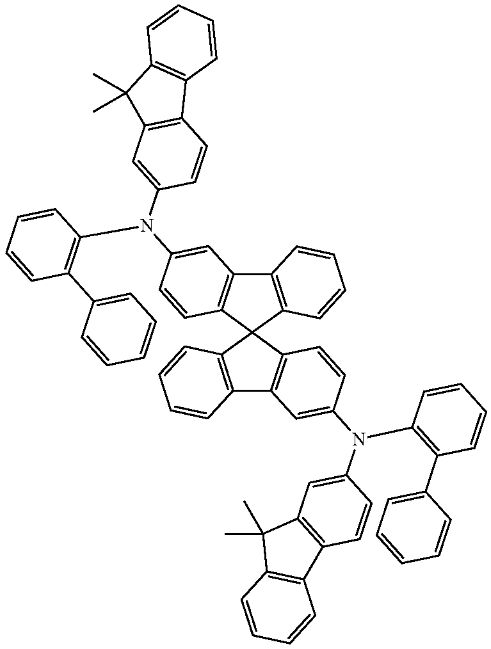
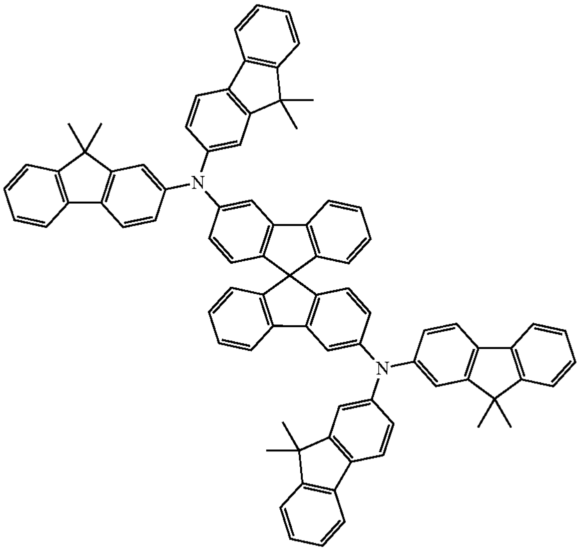
-continued
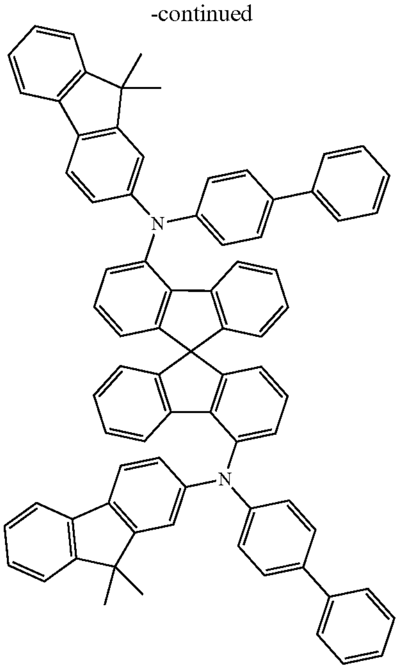
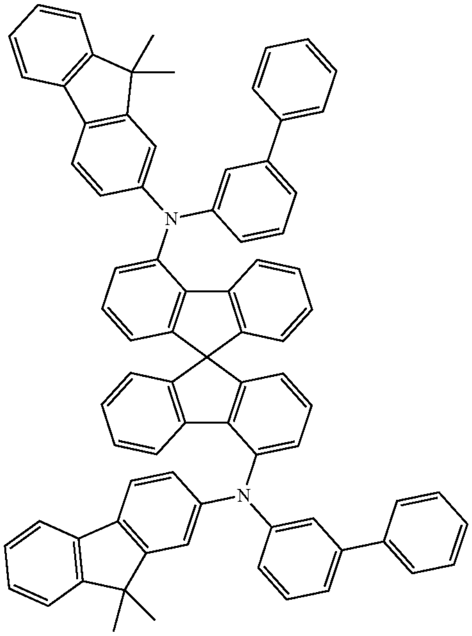

-continued
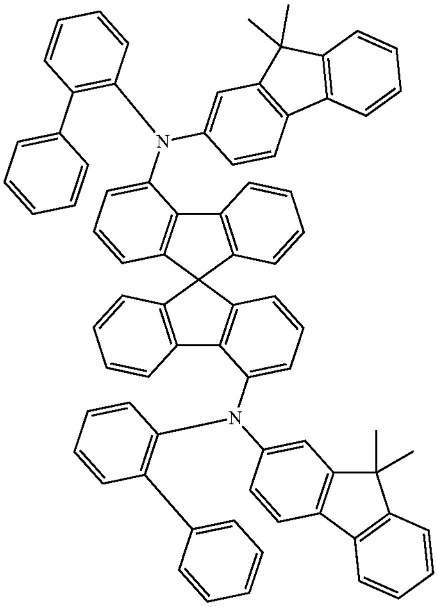
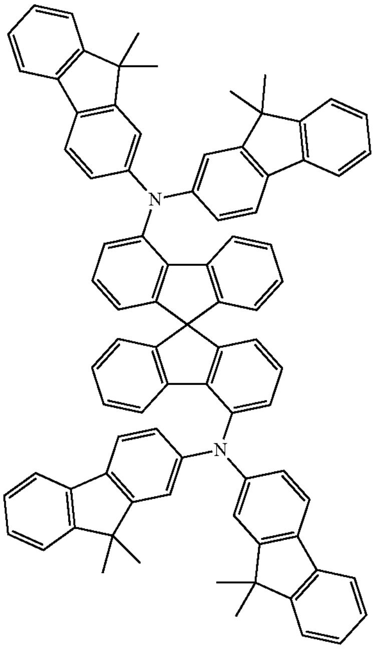
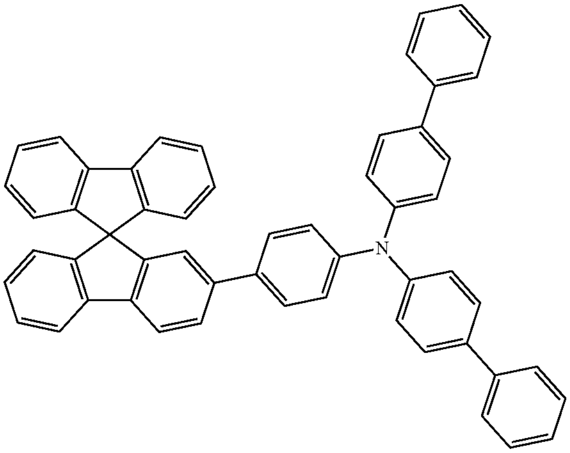
-continued
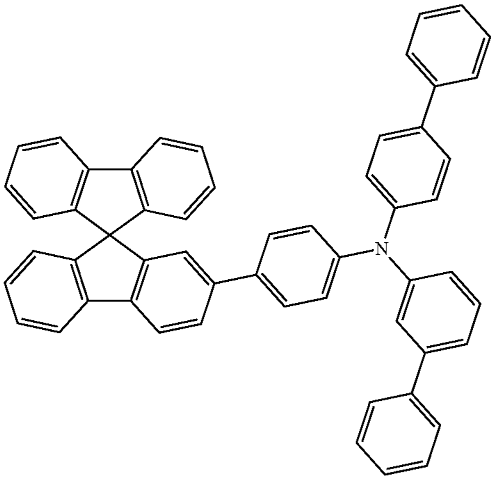
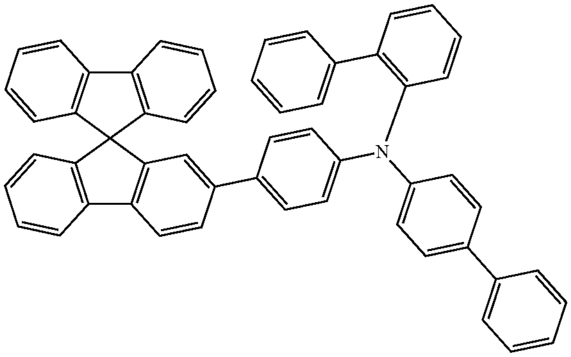
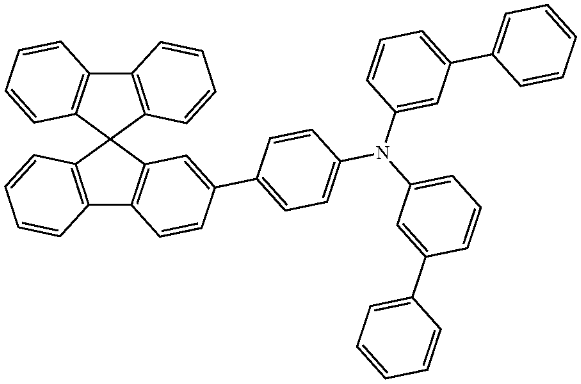

-continued
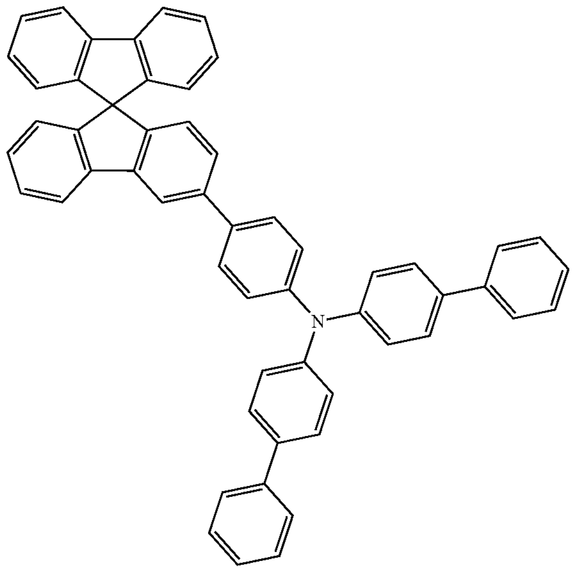
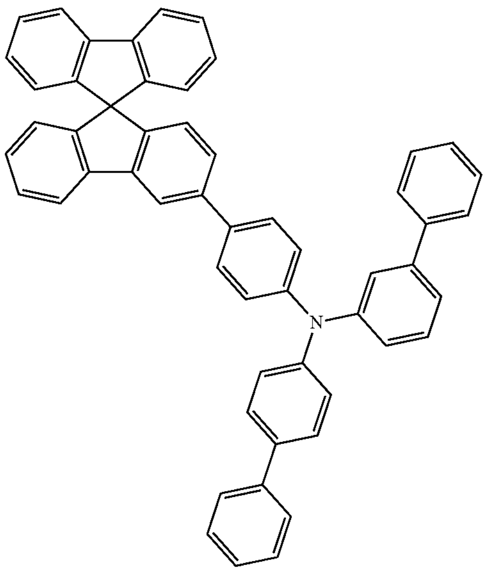
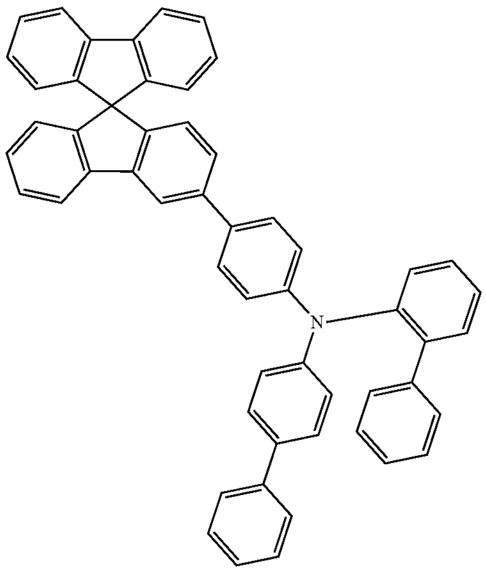
-continued
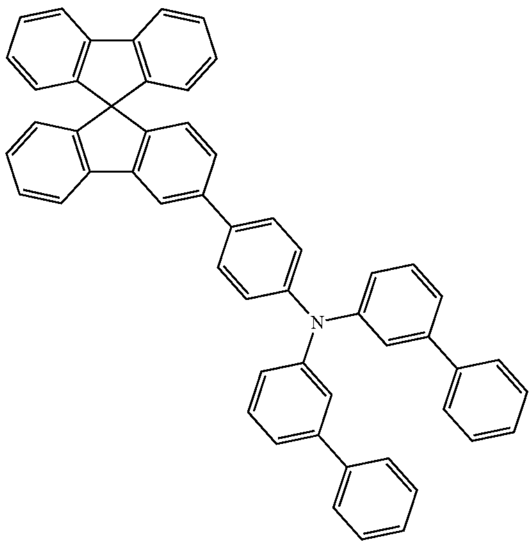
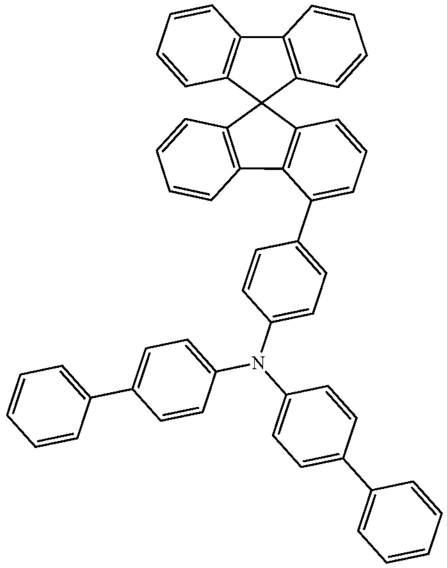
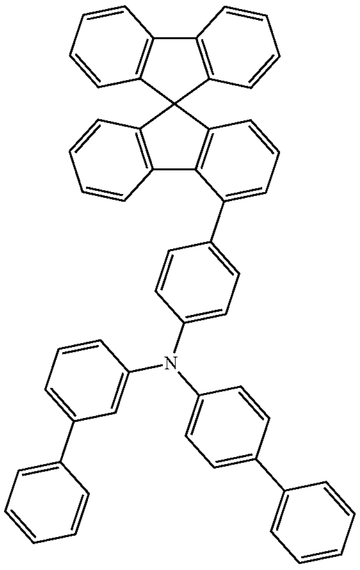

-continued
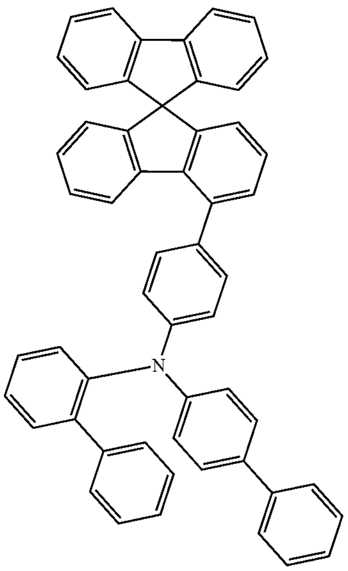
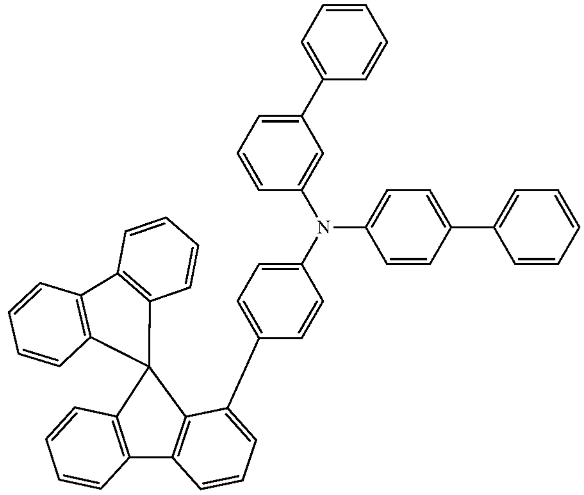
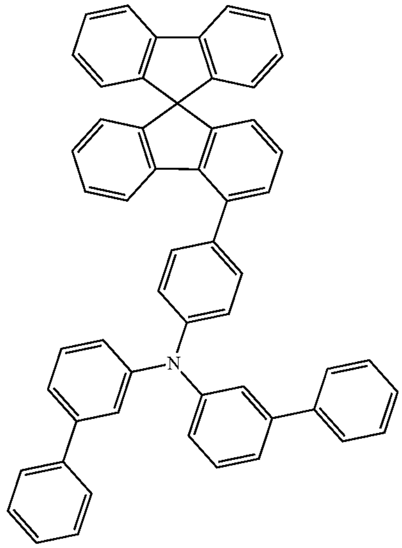
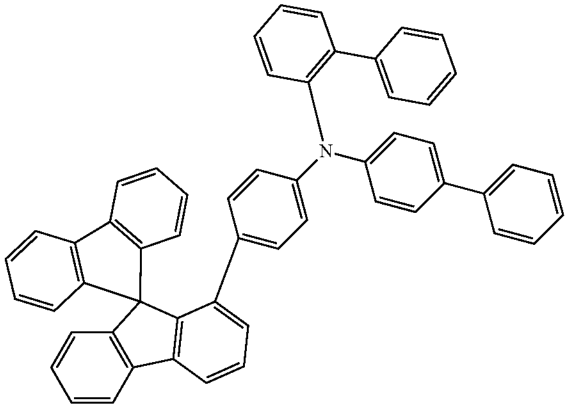
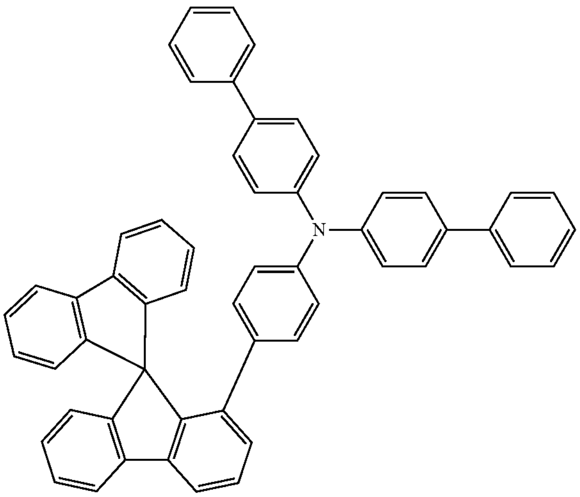
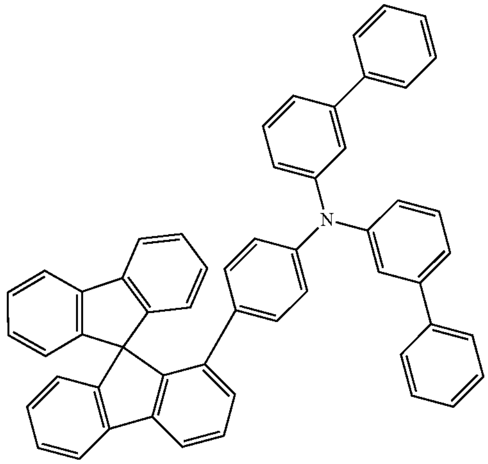

-continued
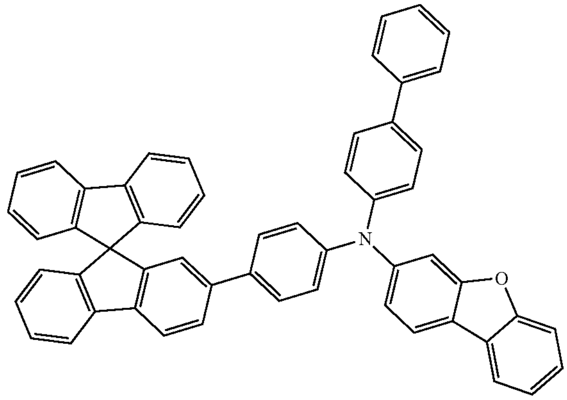
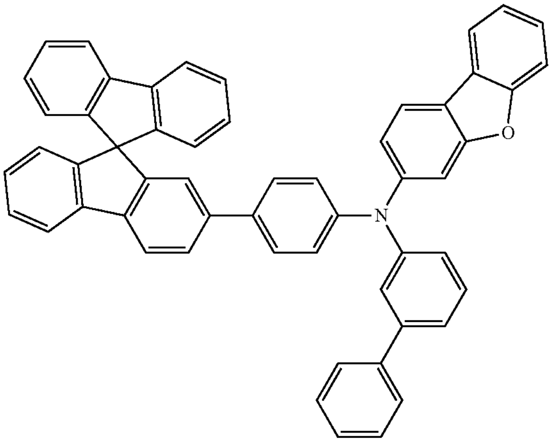
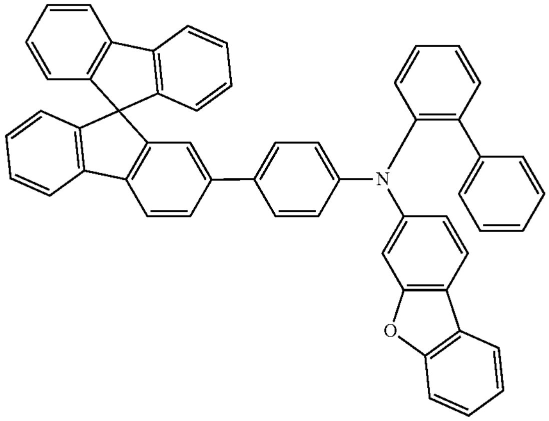
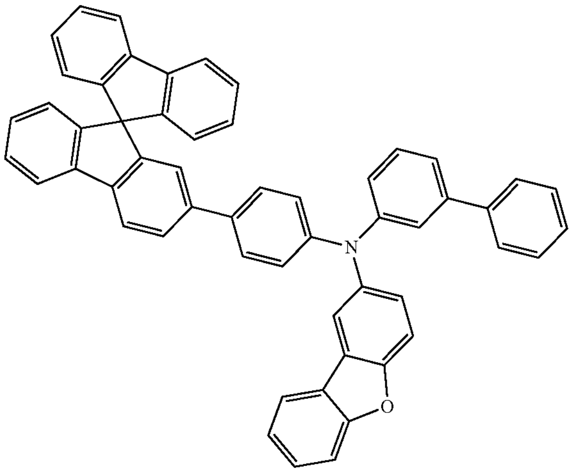
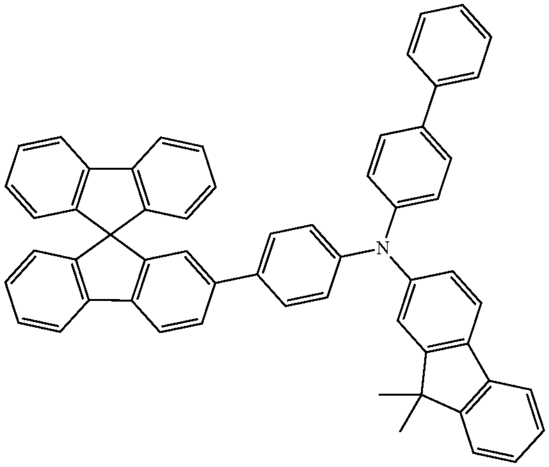
-continued
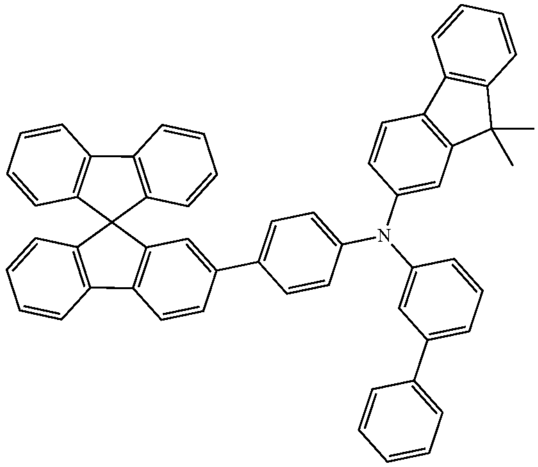

-continued
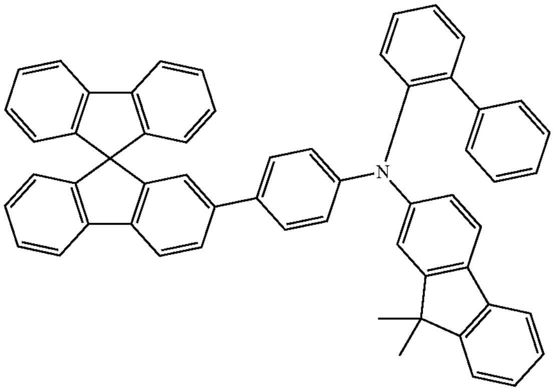
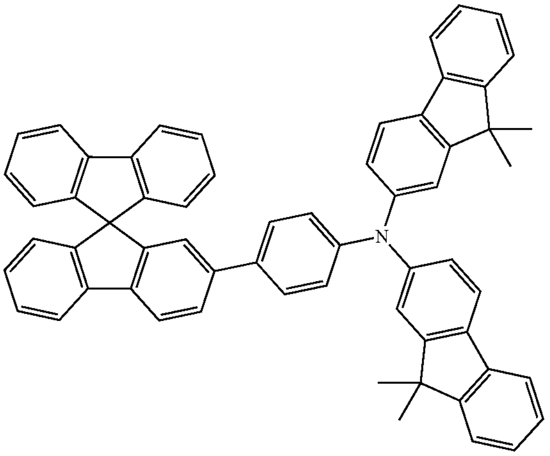
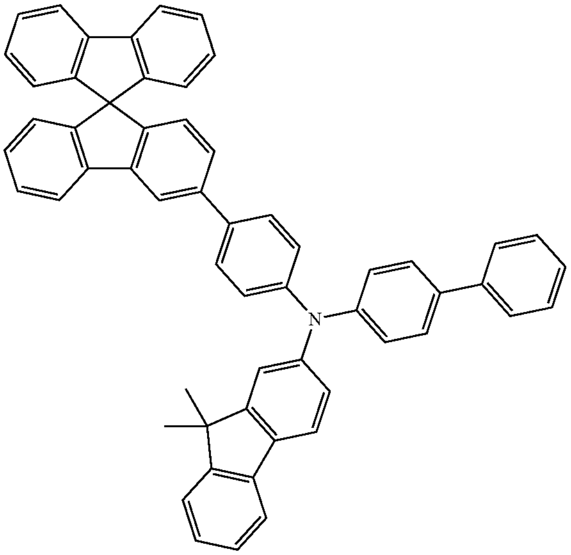
-continued
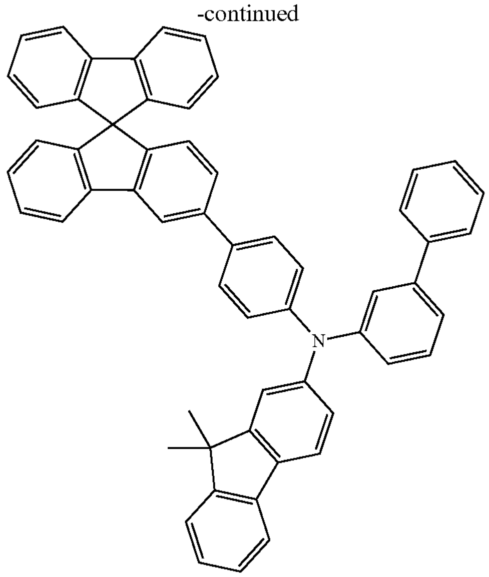
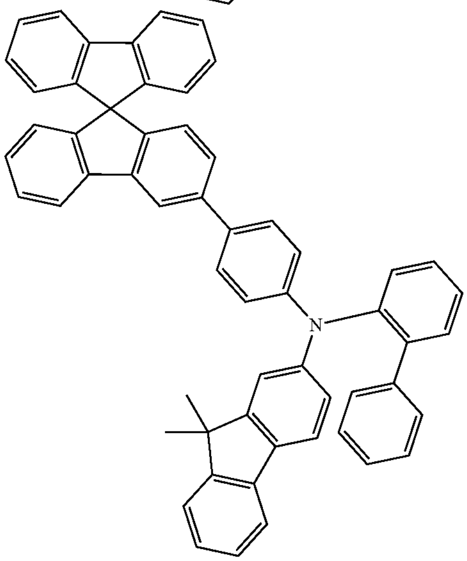
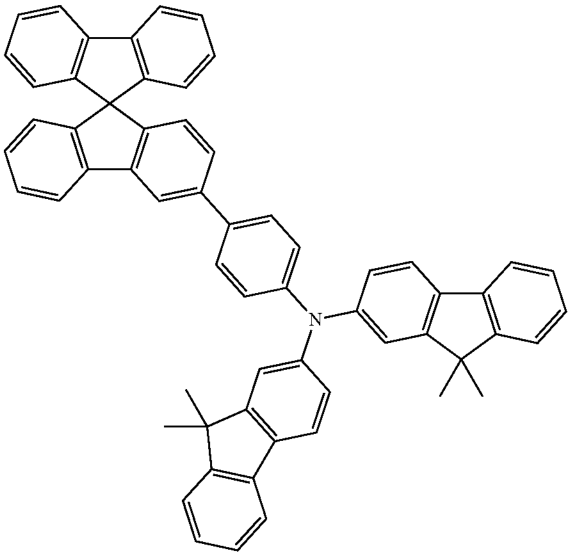

-continued
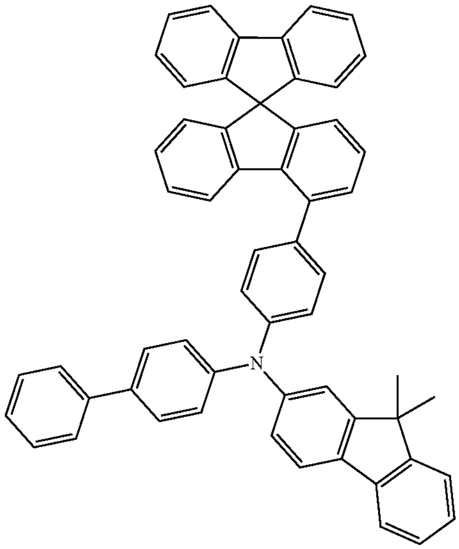
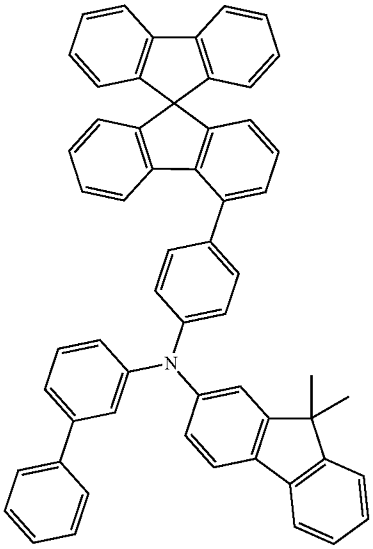
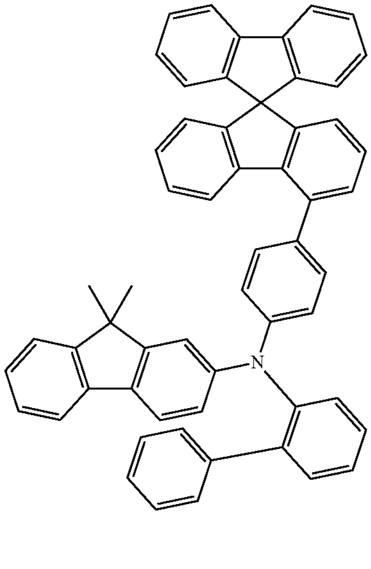
-continued
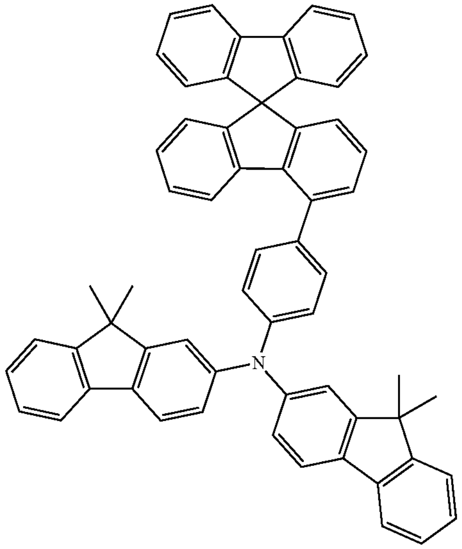
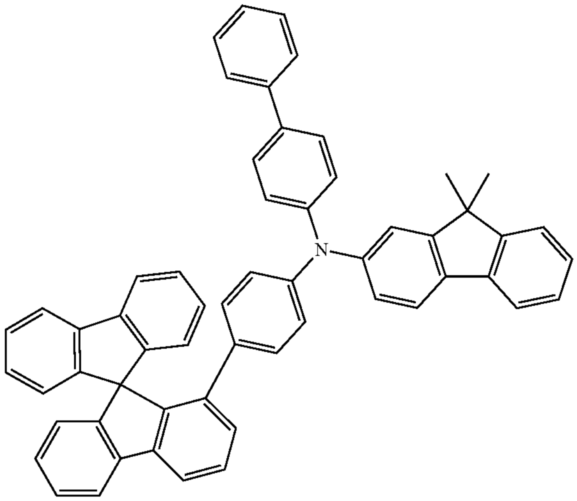
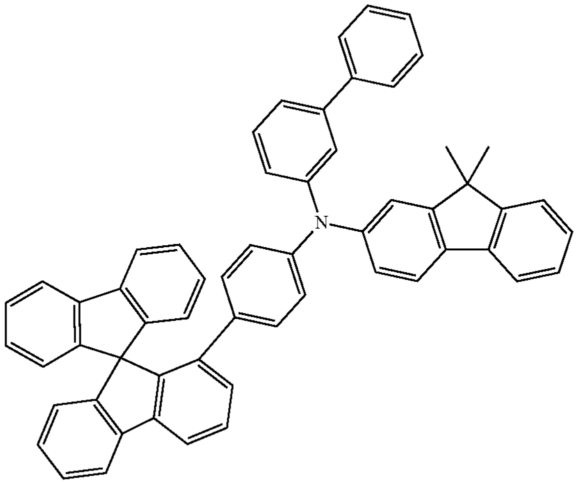

-continued
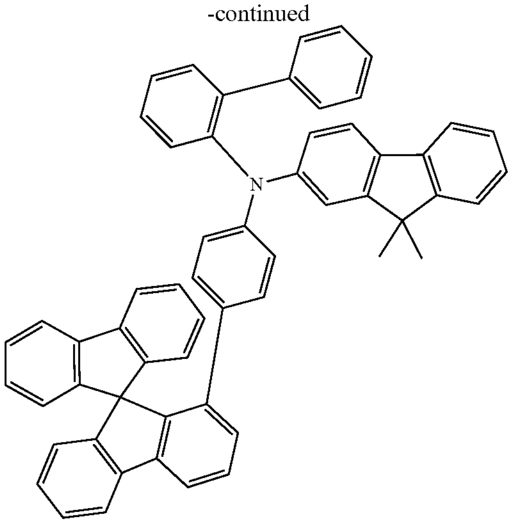
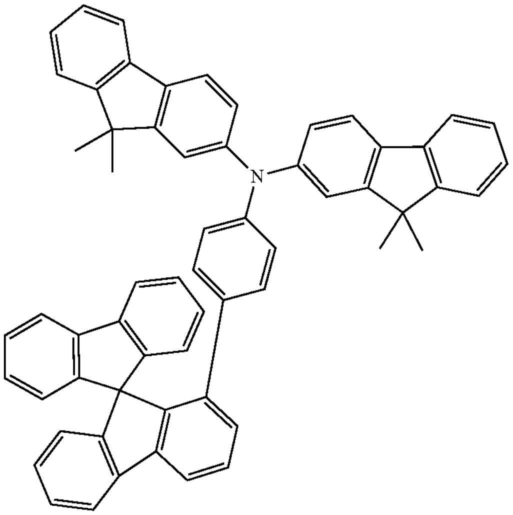
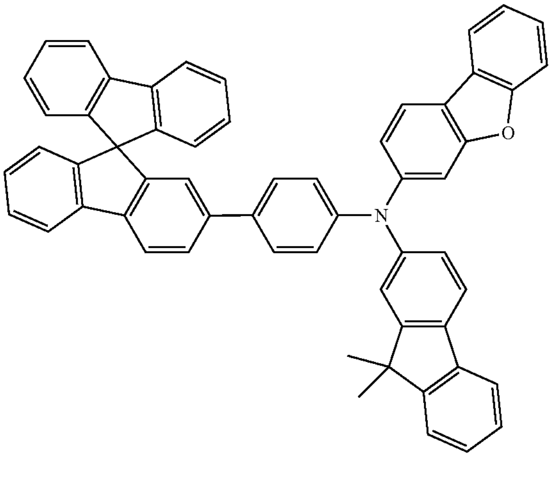
-continued
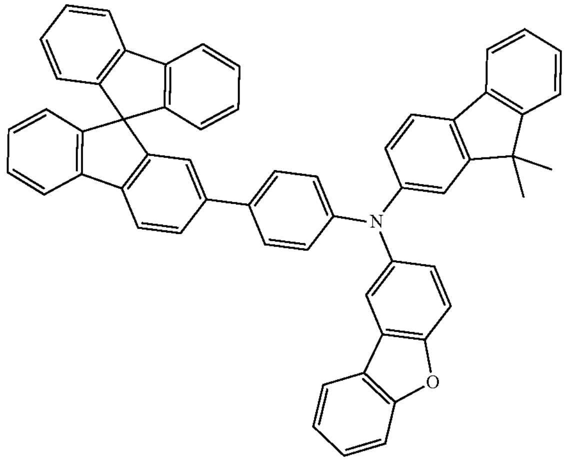
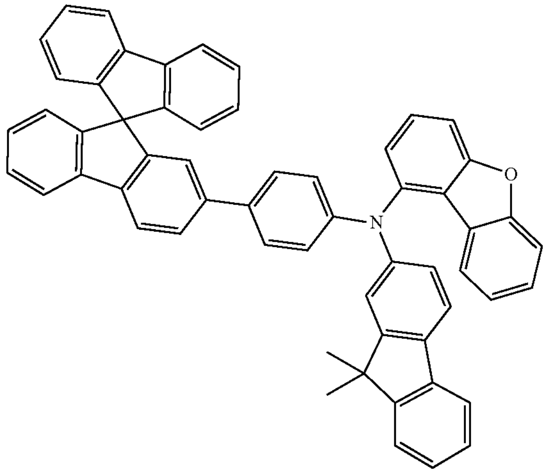
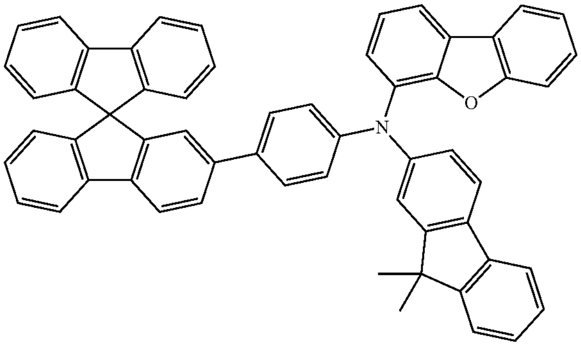

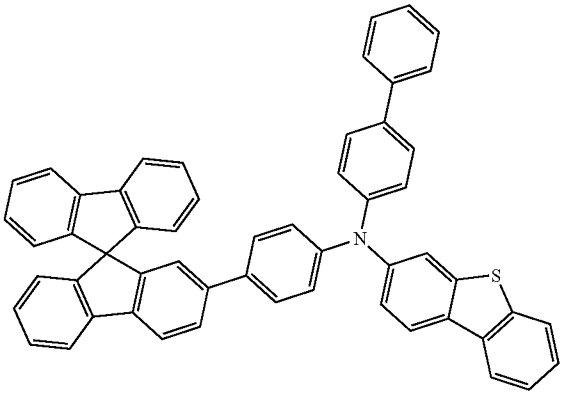
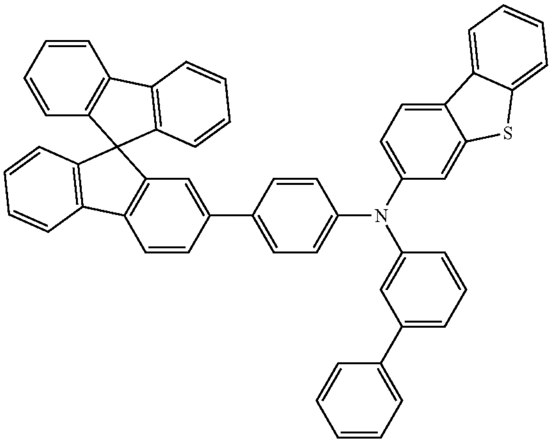
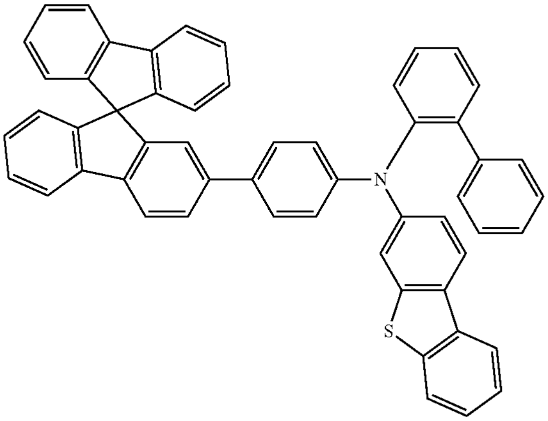
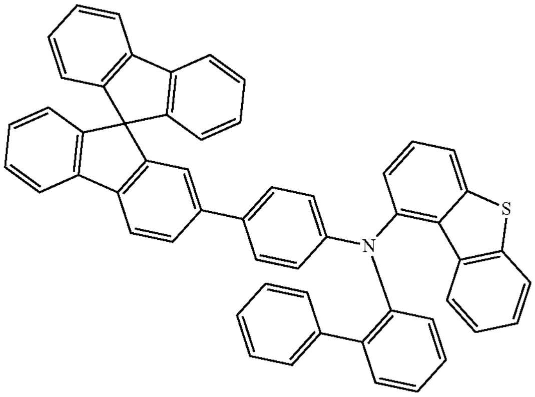
-continued
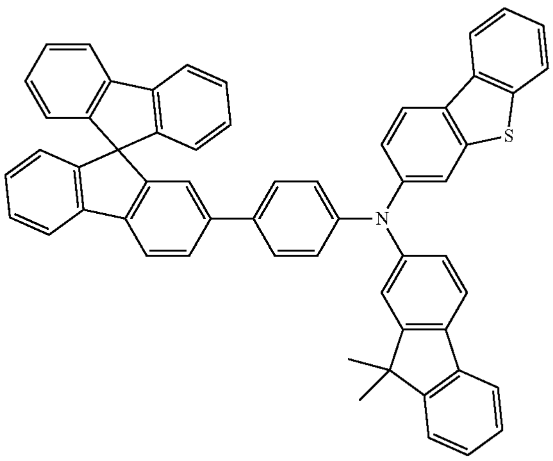
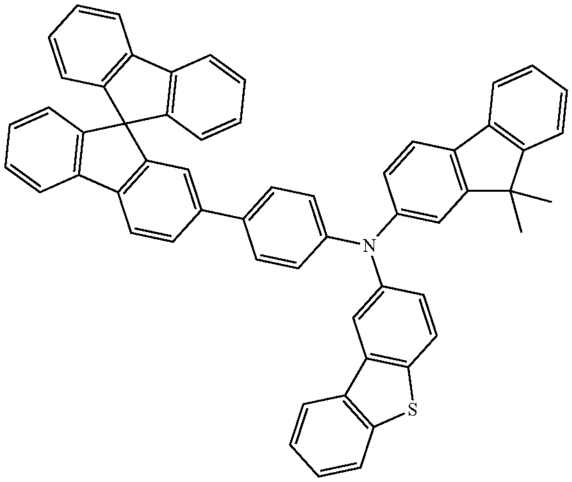
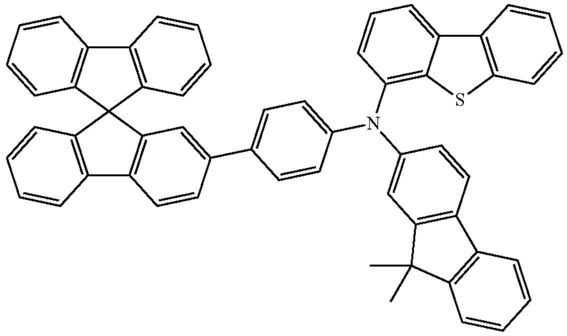
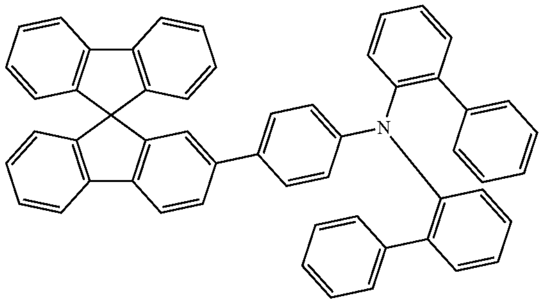

-continued
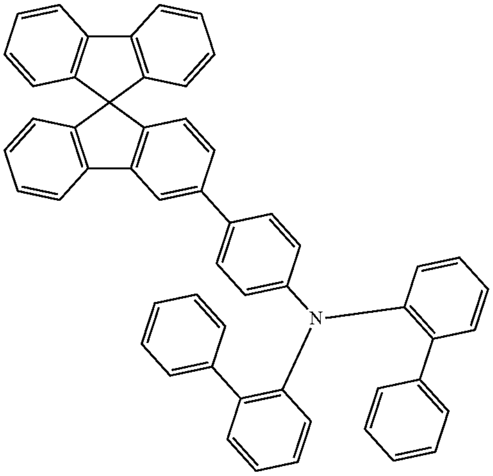
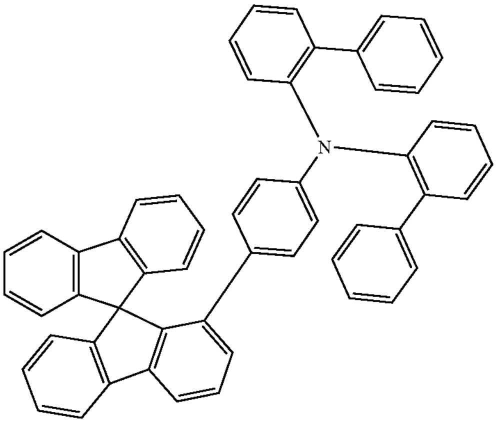
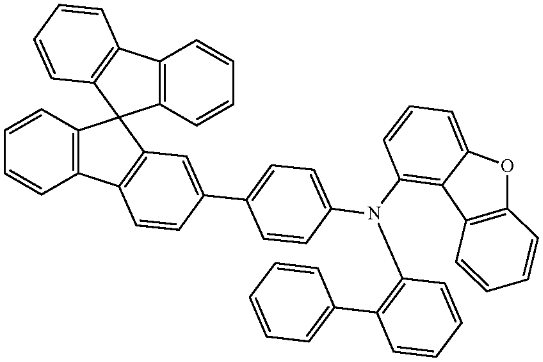
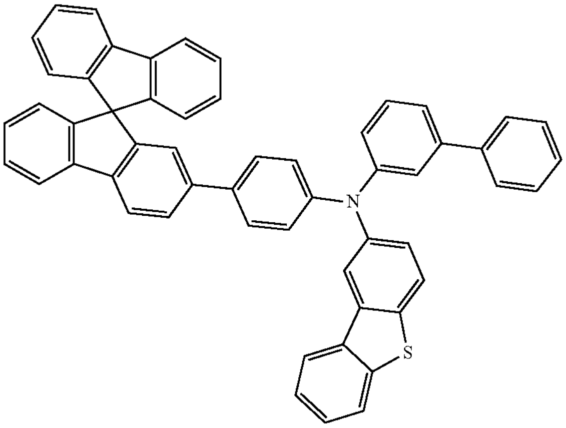
-continued
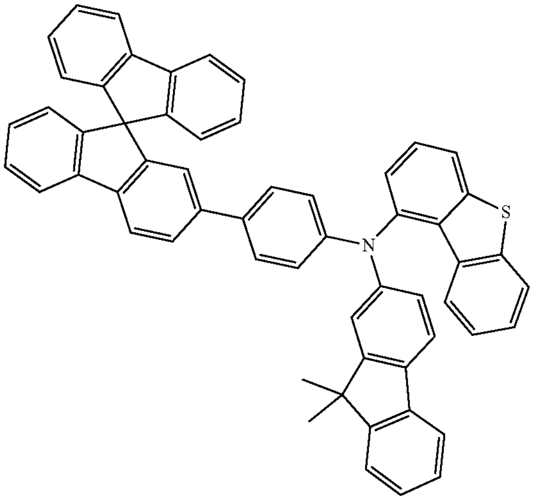
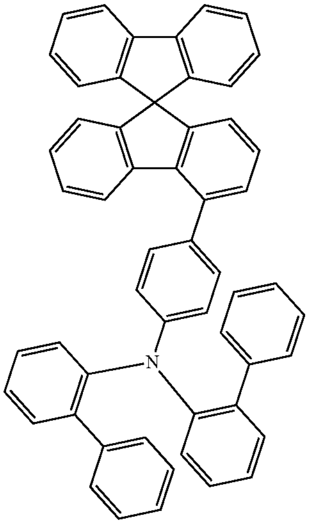
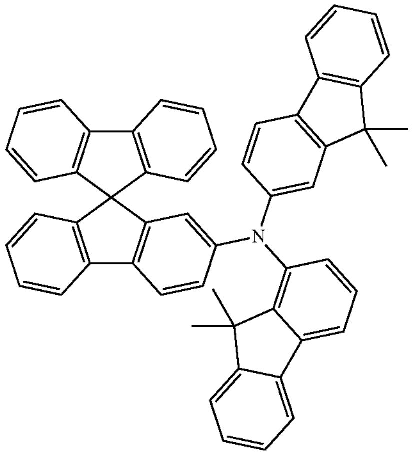

-continued
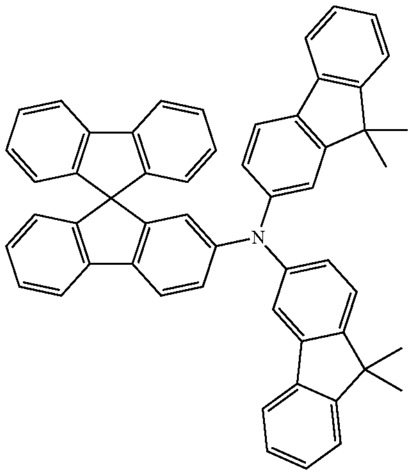
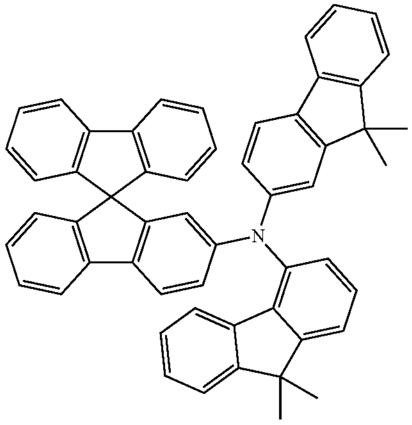
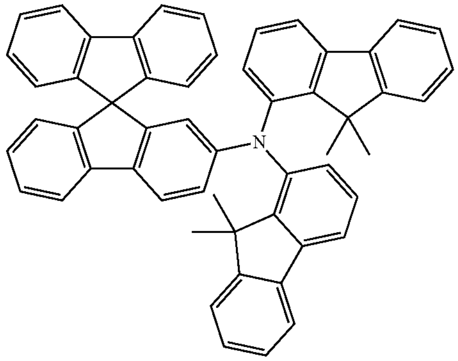
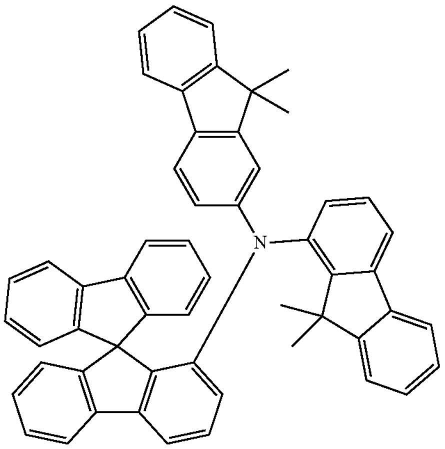
-continued
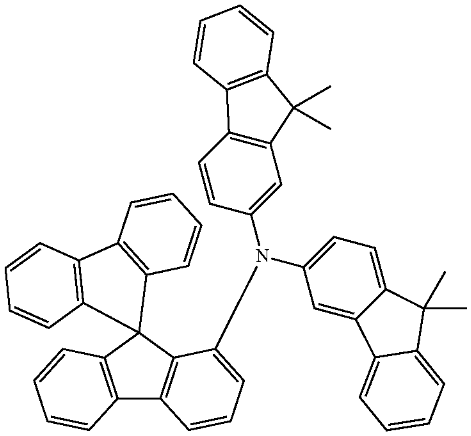
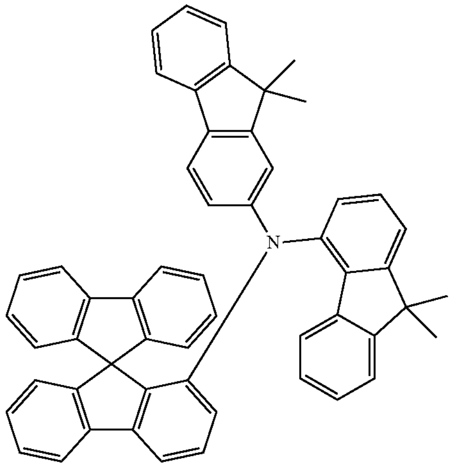
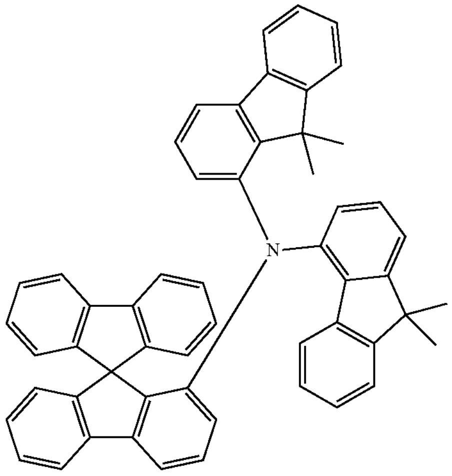

-continued
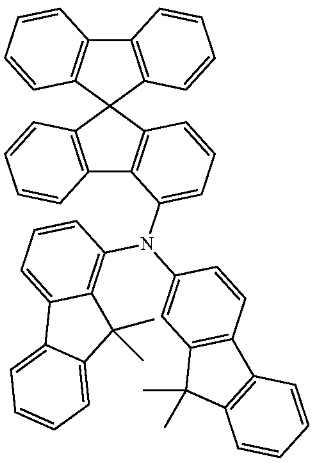
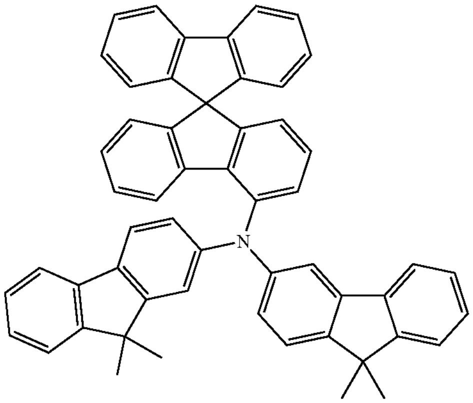
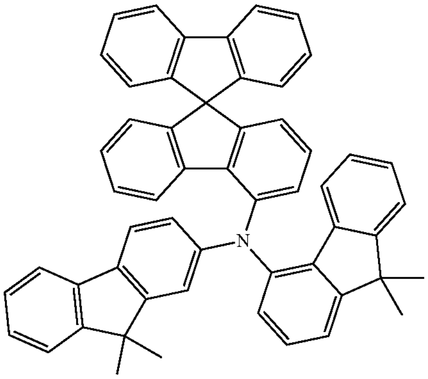
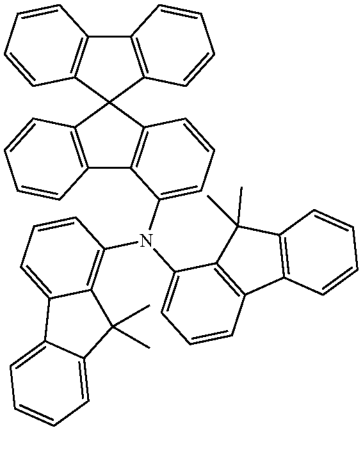
-continued
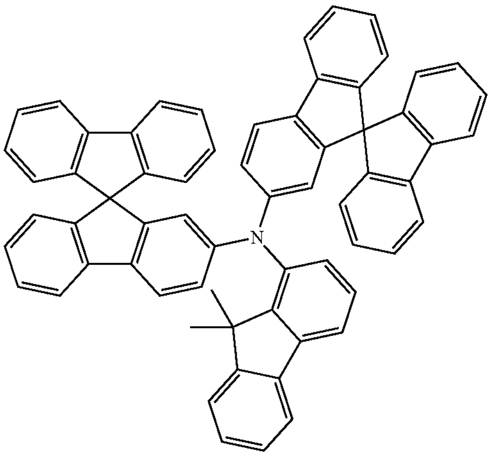
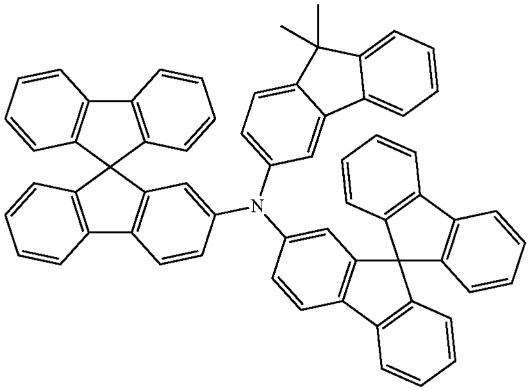
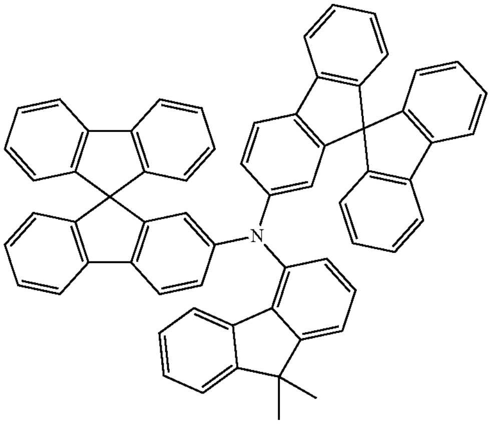
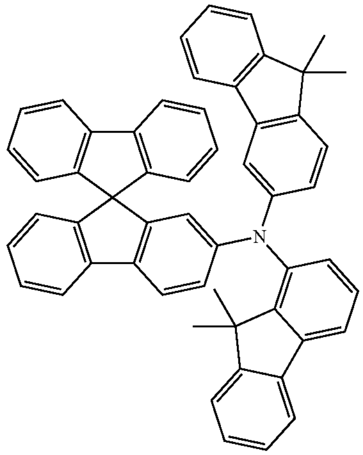

-continued
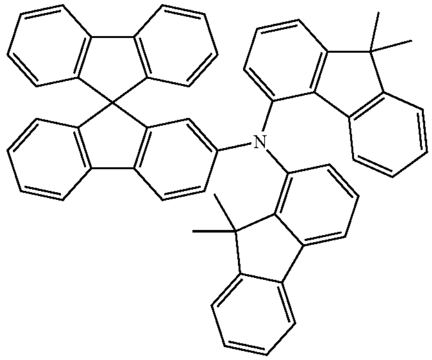
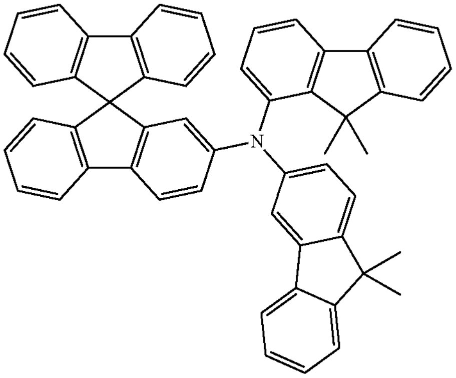
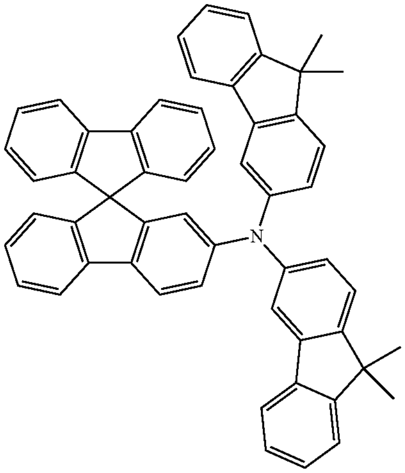
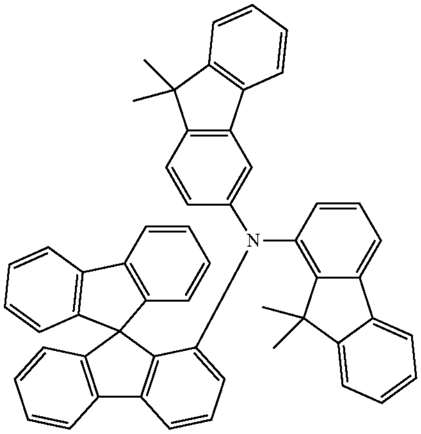
-continued
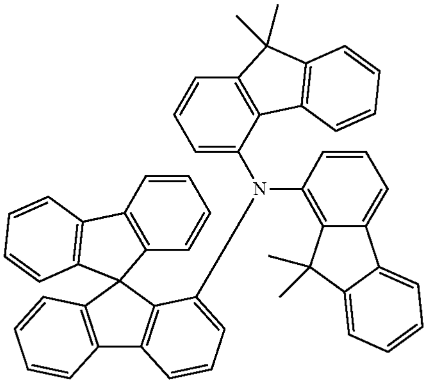
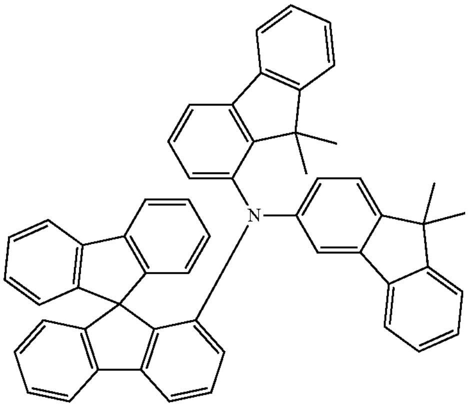
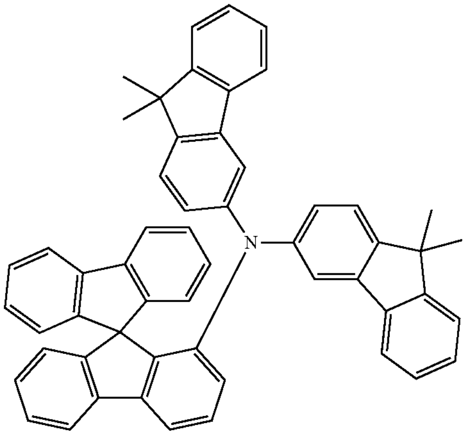
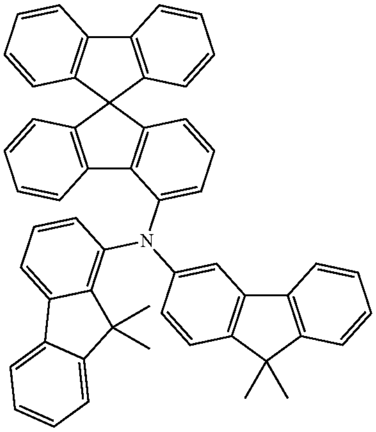

-continued
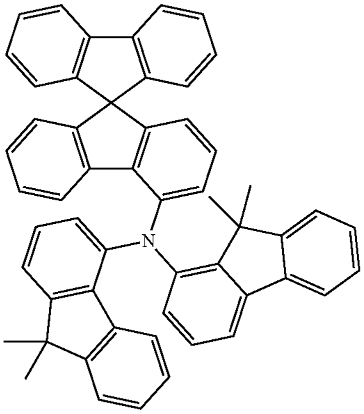
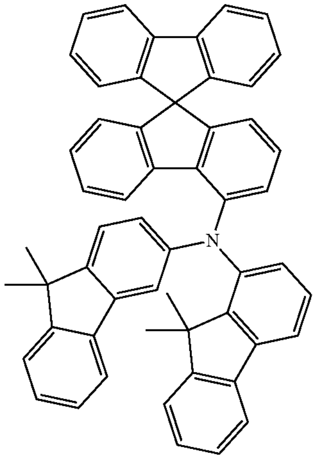
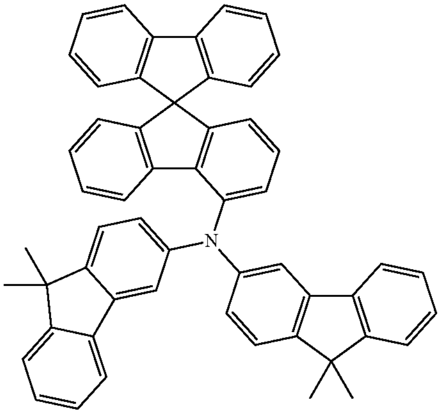
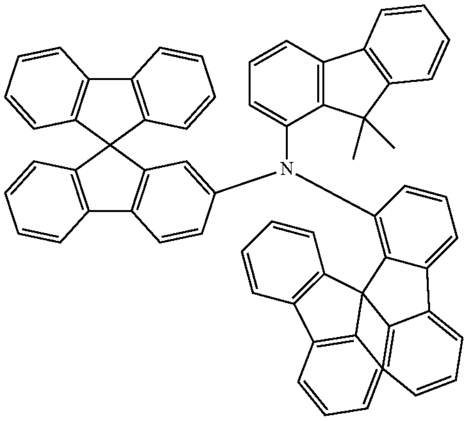
-continued
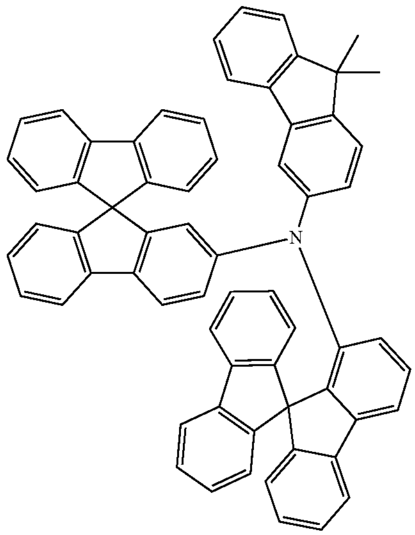
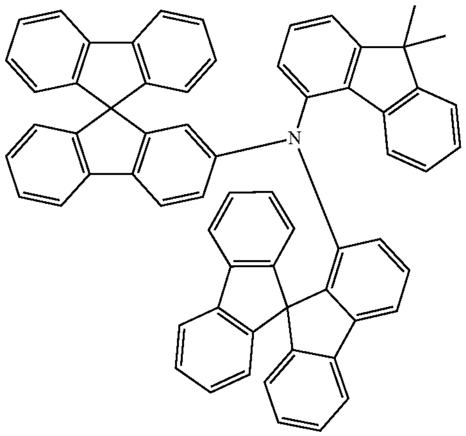
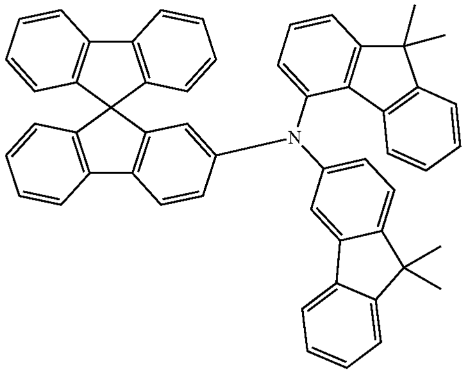
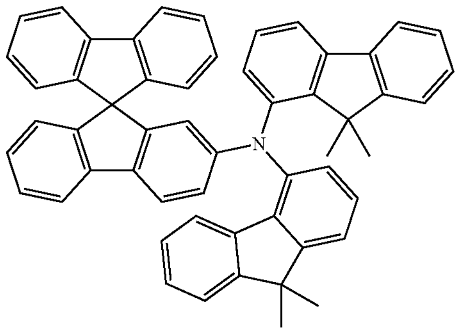

-continued
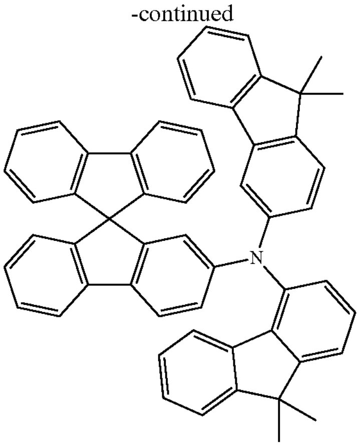
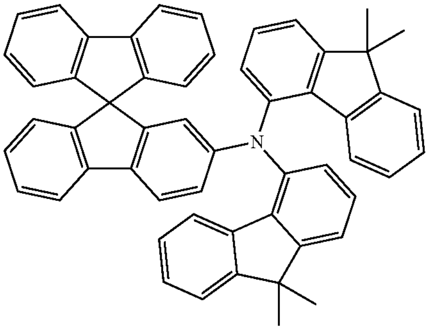
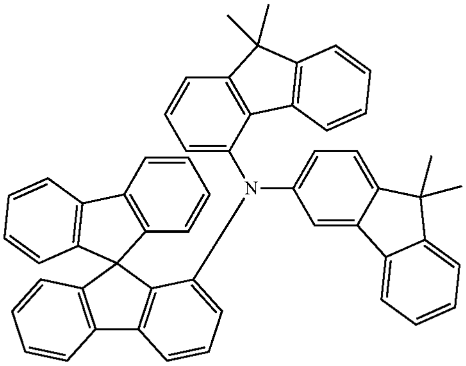
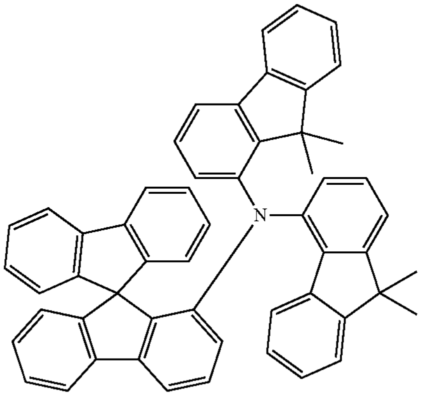
-continued
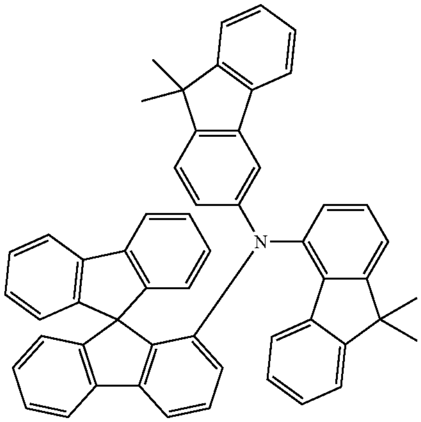
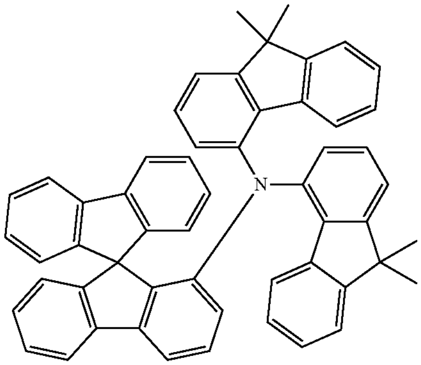
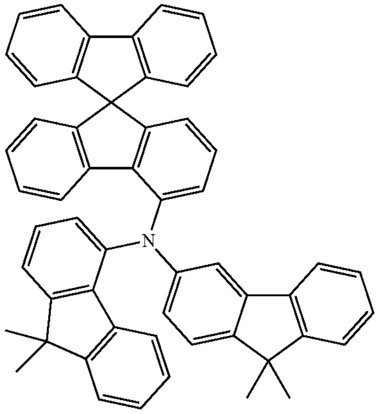
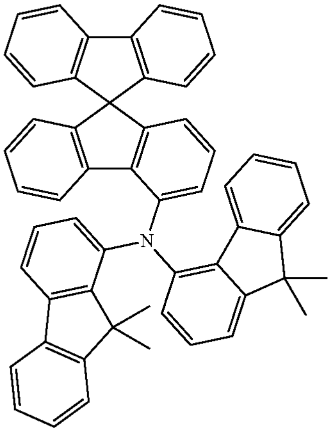

-continued
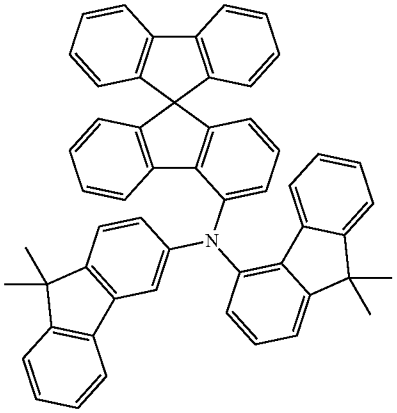
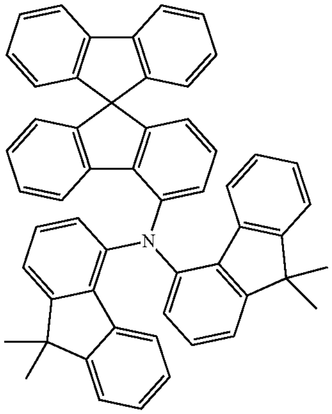
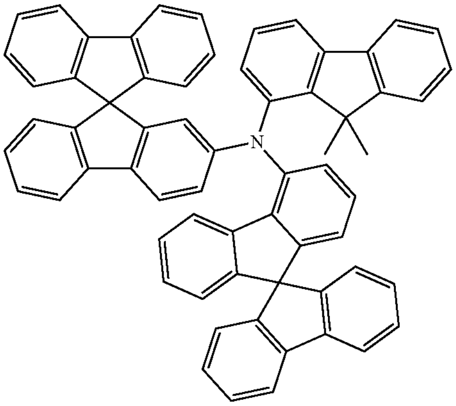
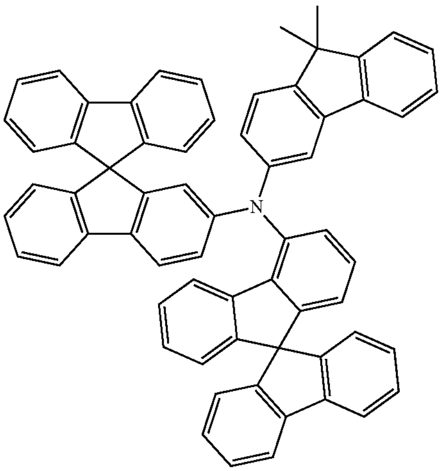
-continued
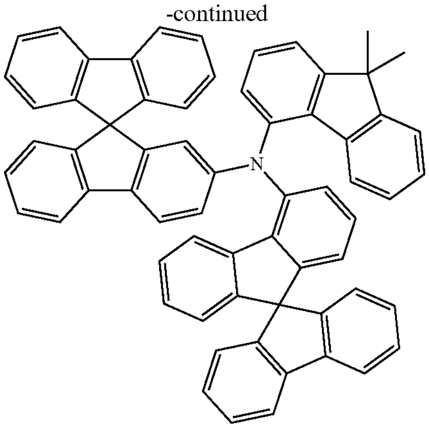
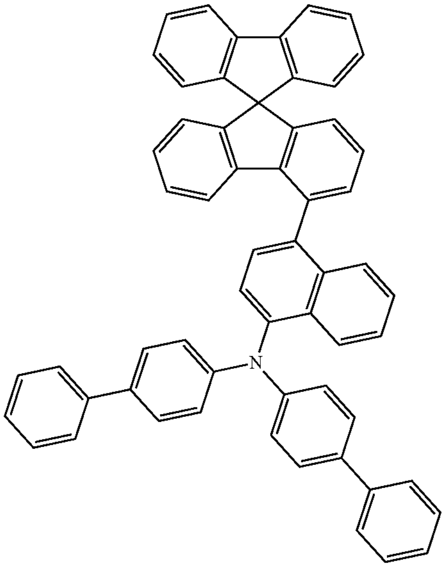
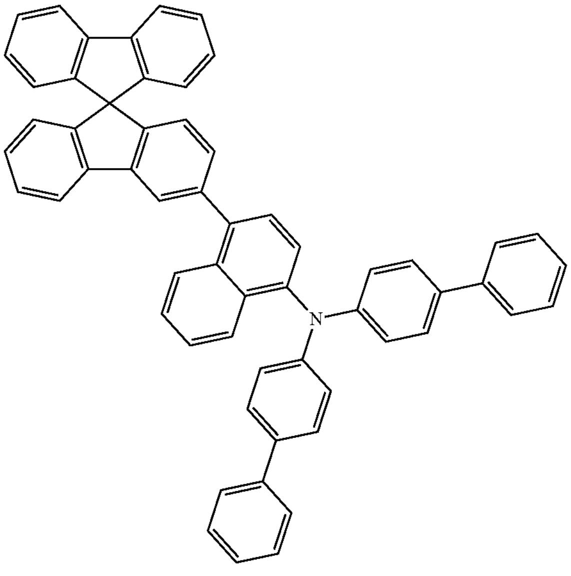

-continued
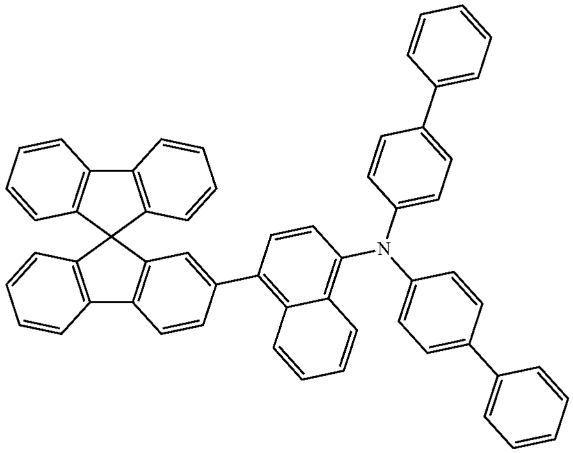
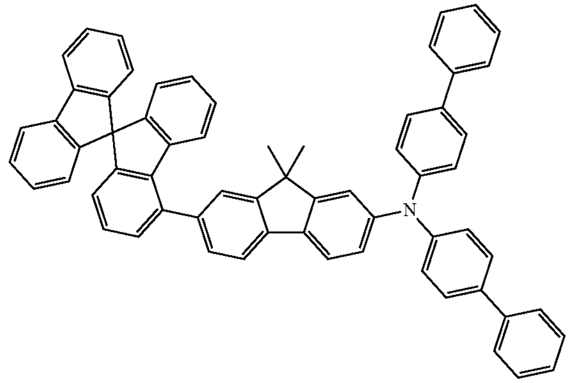
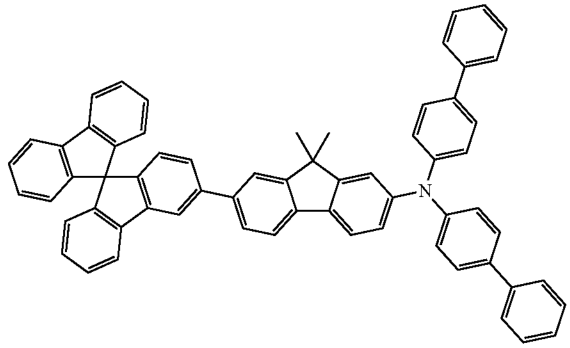
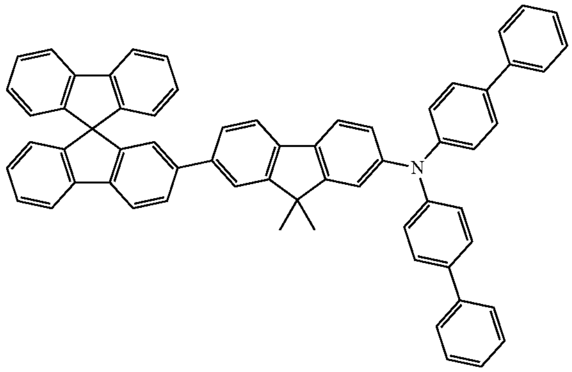
-continued
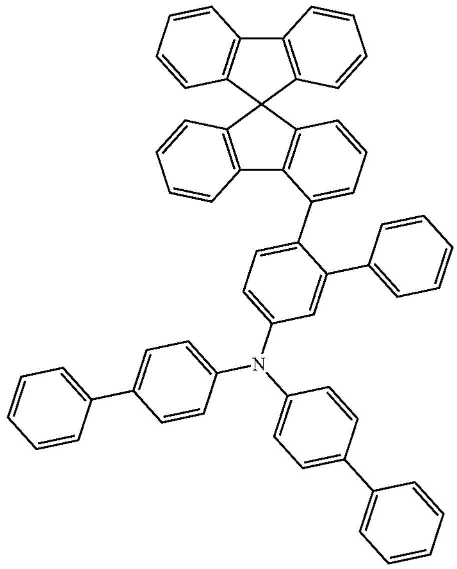
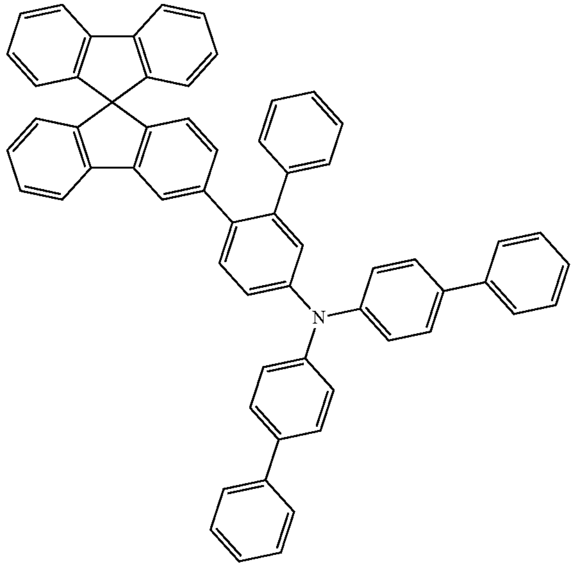
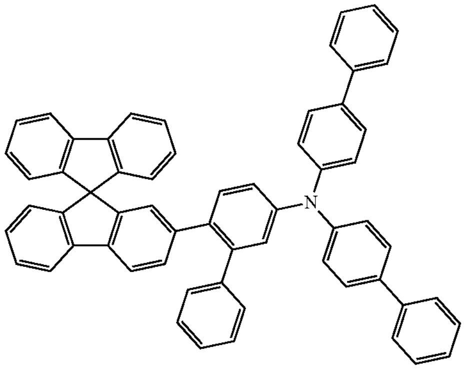

-continued
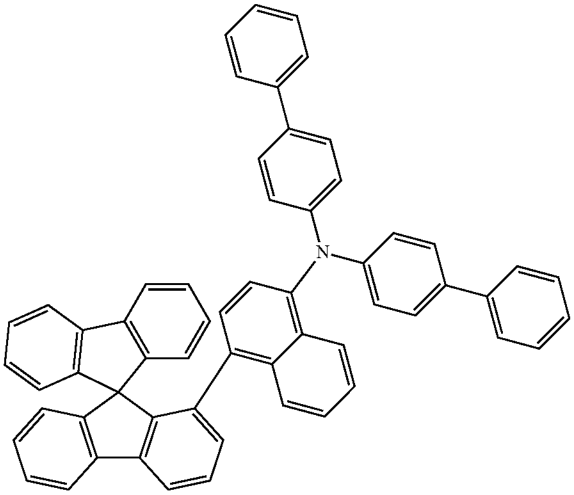
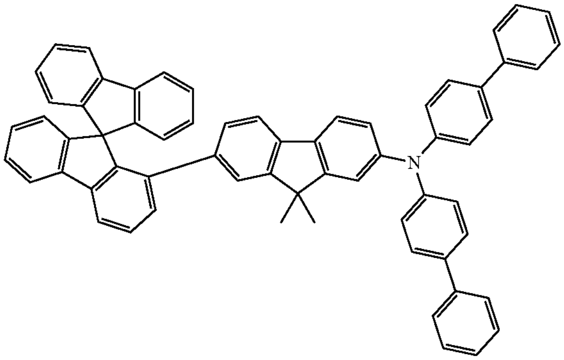
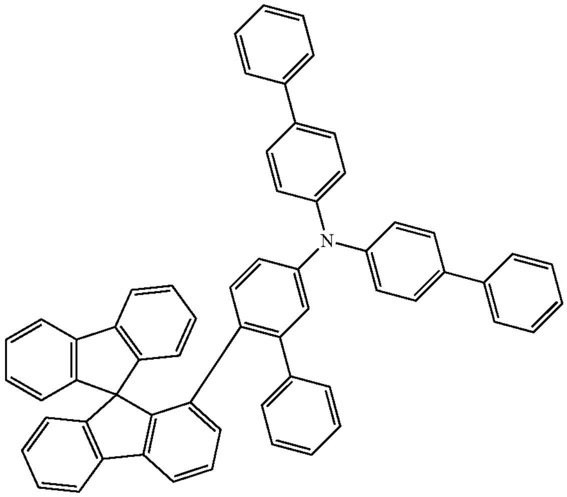
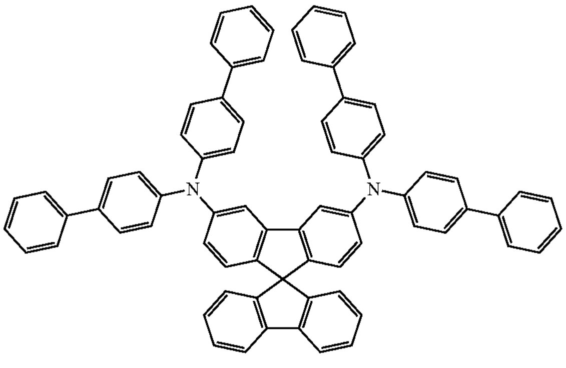
-continued
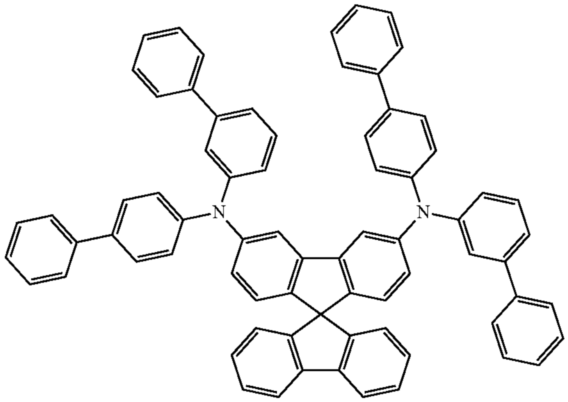
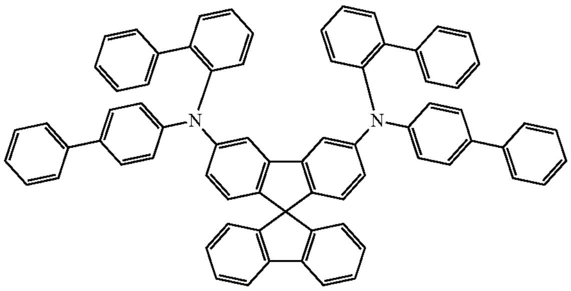
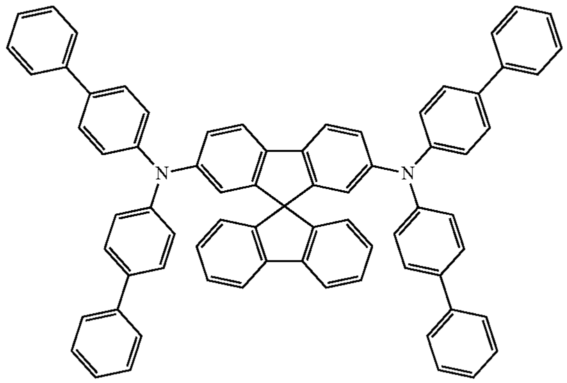
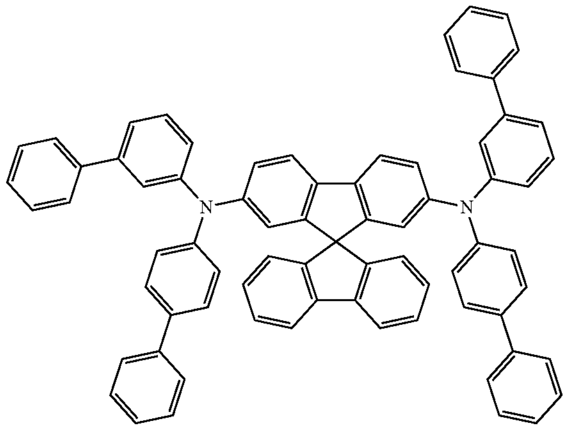

-continued
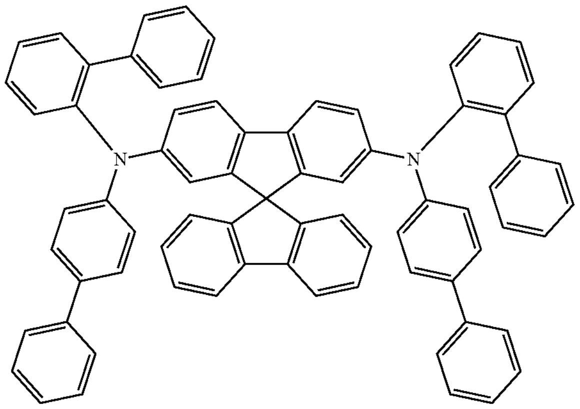
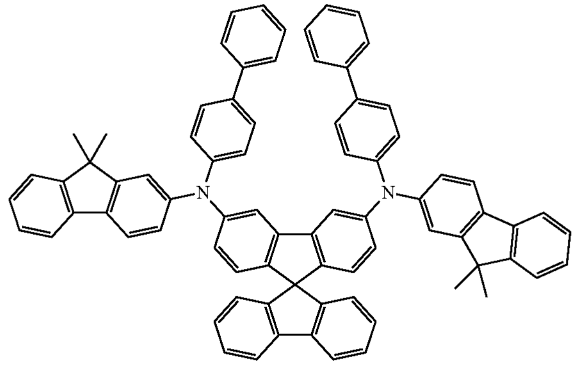
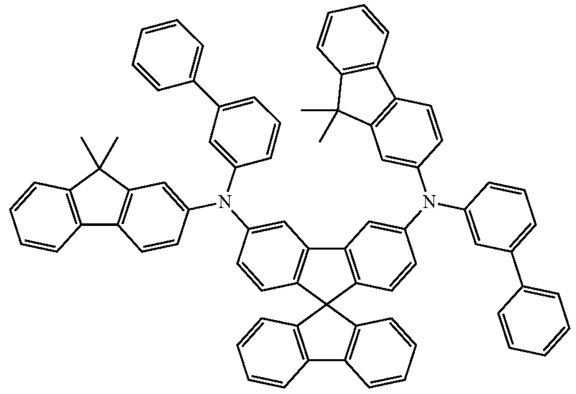
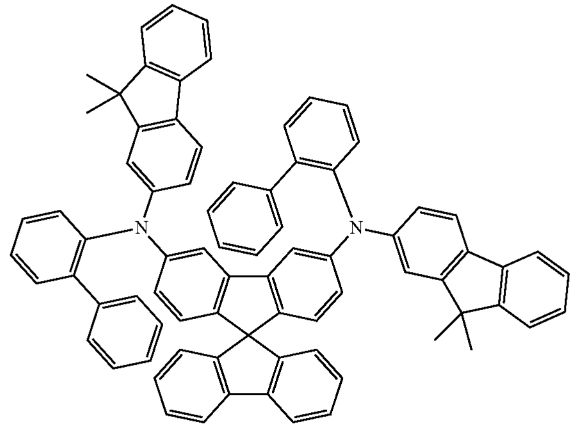
-continued
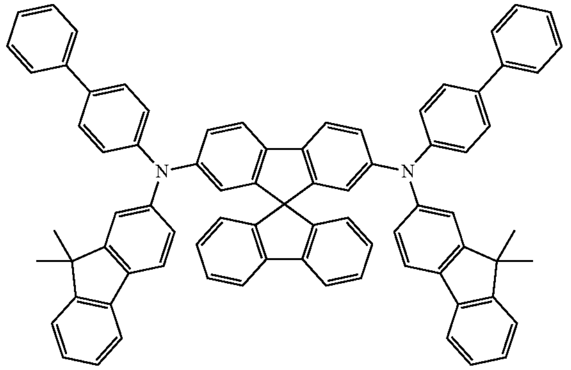
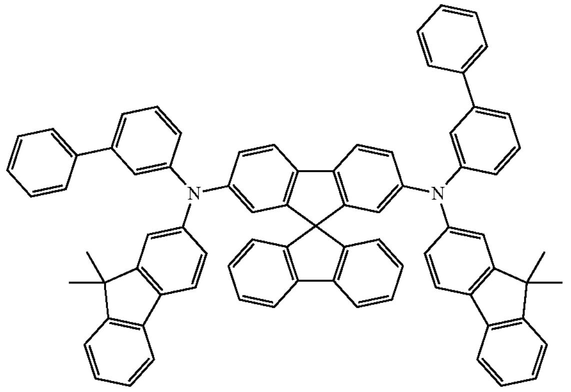
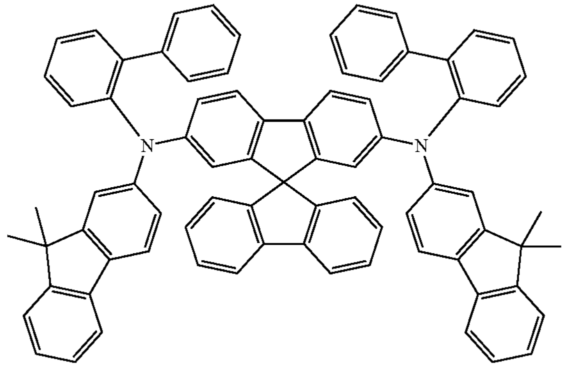
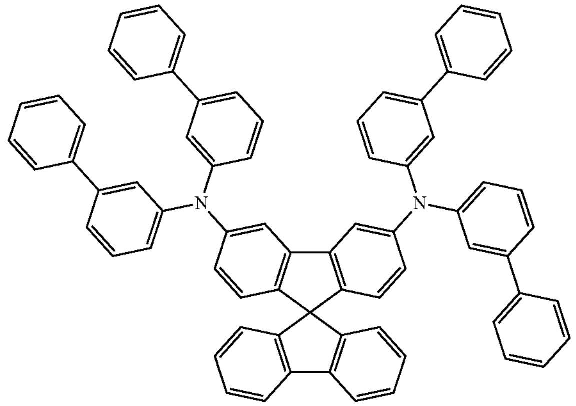

-continued
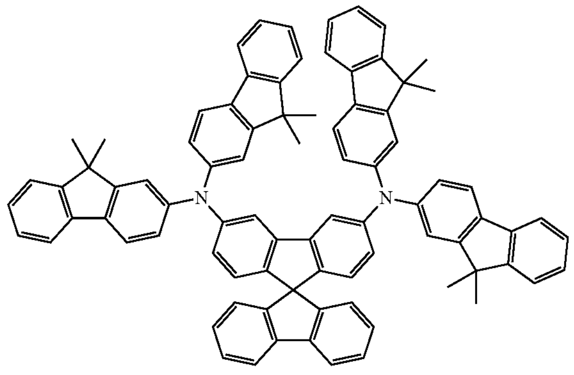
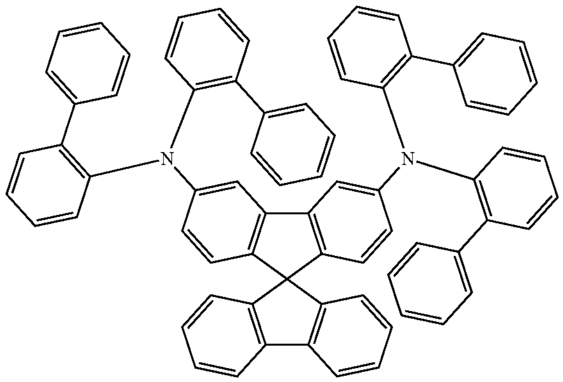
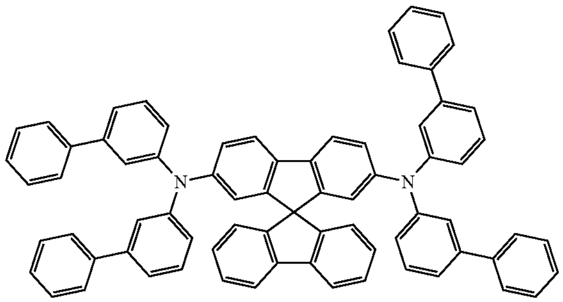
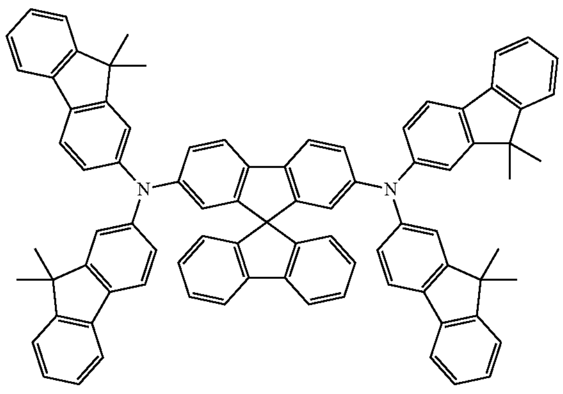
-continued
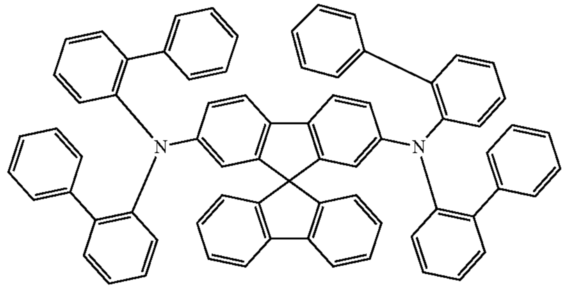 [SMILES: c1ccc(-c2ccccc2N(c2ccc3c(c2)C2(c4ccccc4-c4ccccc42)c2cc(N(c4ccccc4-c4ccccc4)c4ccccc4-c4ccccc4)ccc2-3)c2ccccc2-c2ccccc2)cc1]
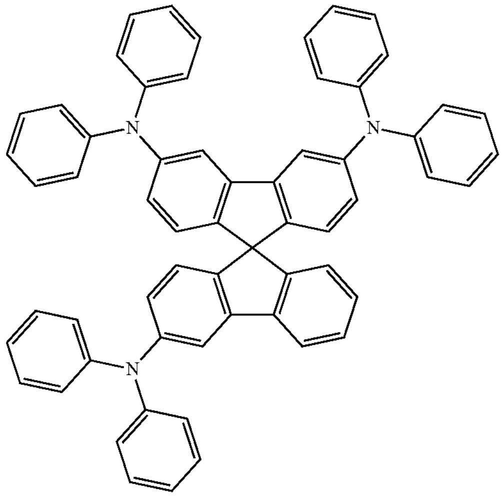
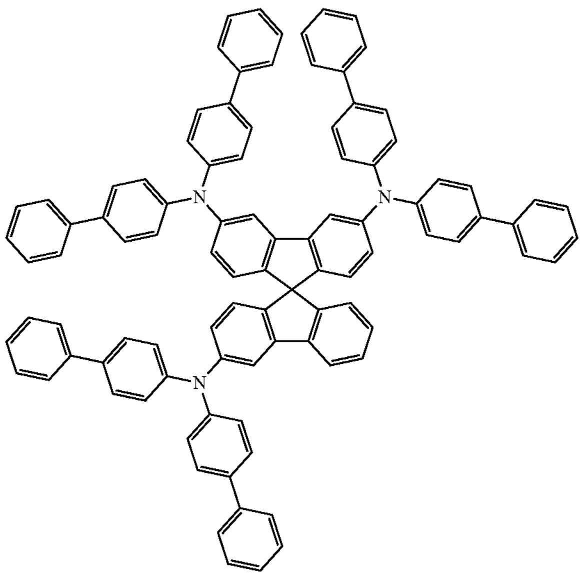

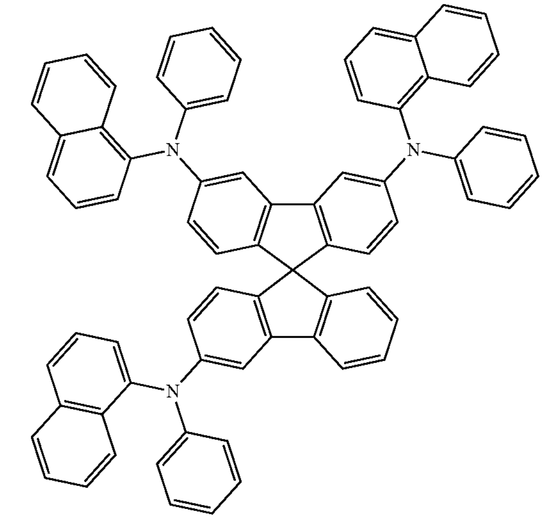
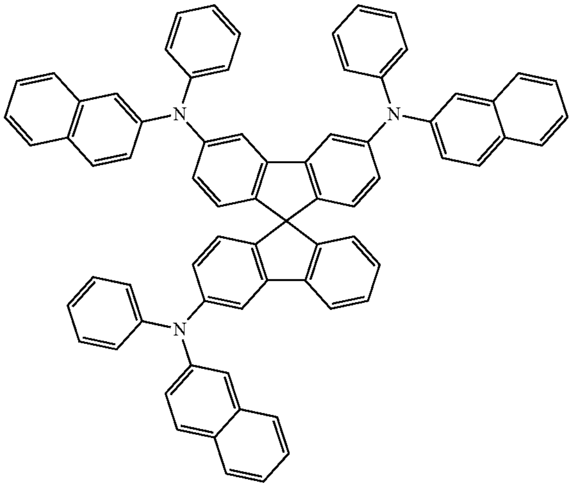
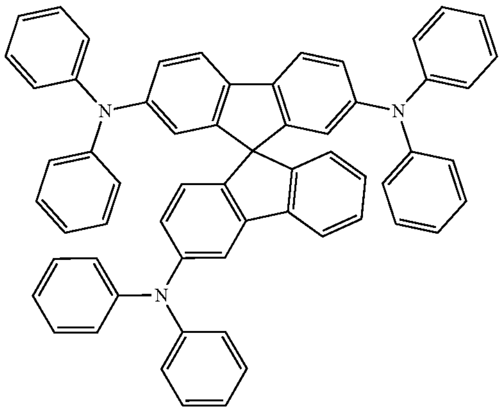
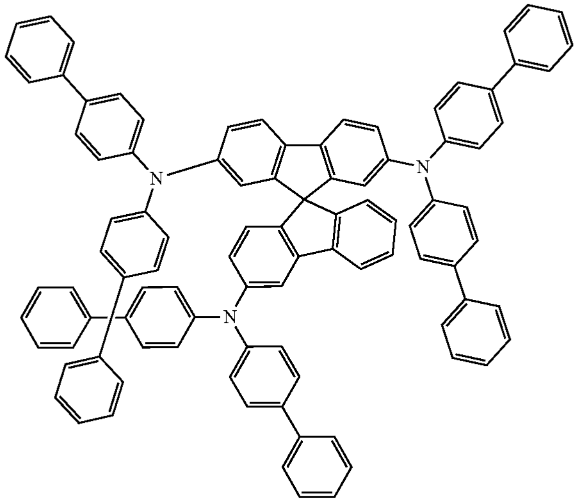
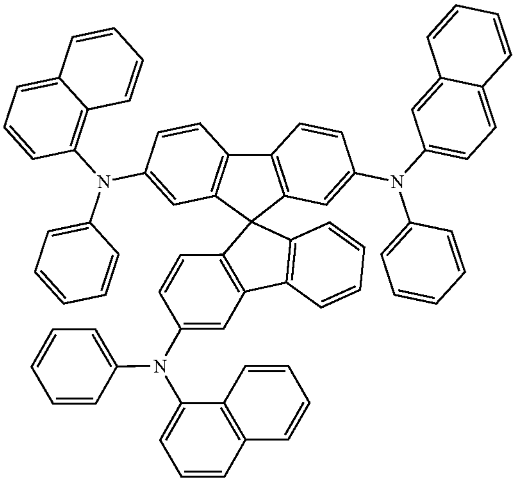
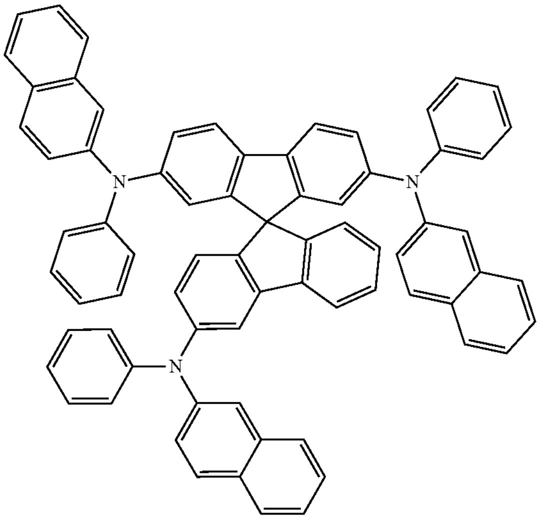

-continued
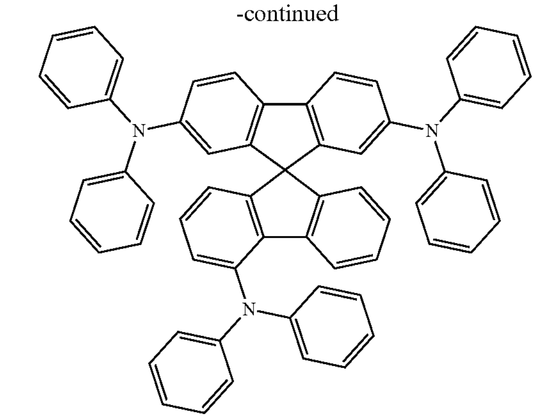
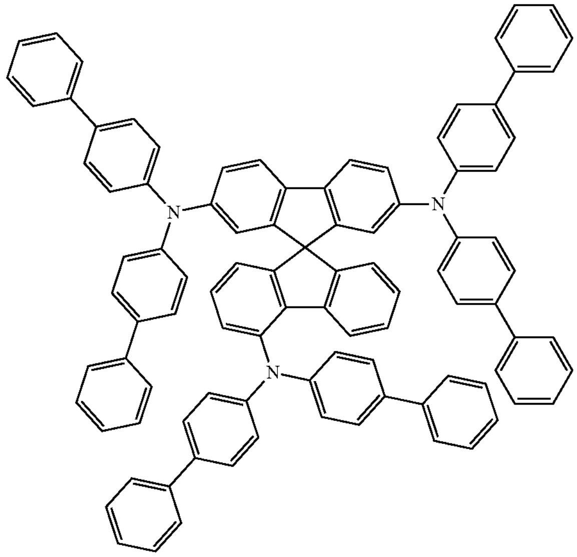
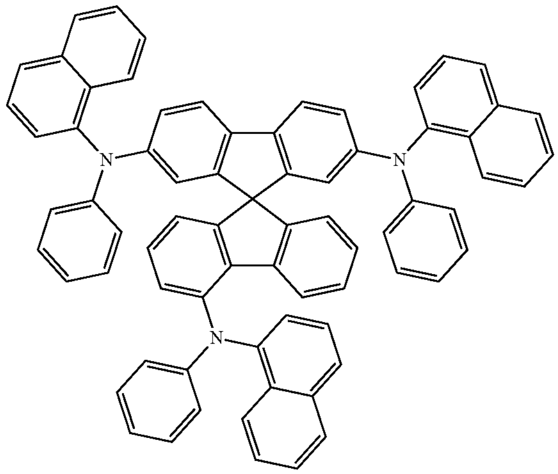
-continued
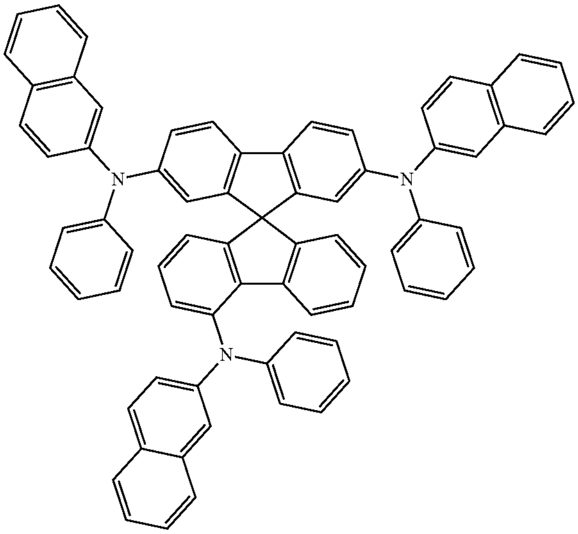
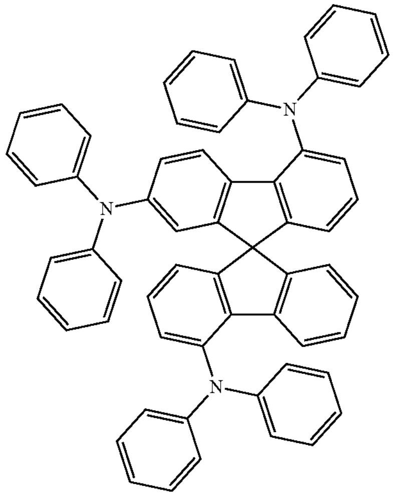
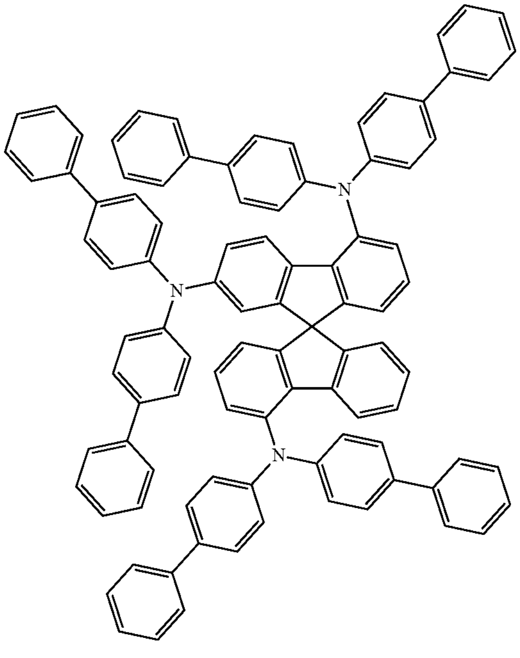

-continued
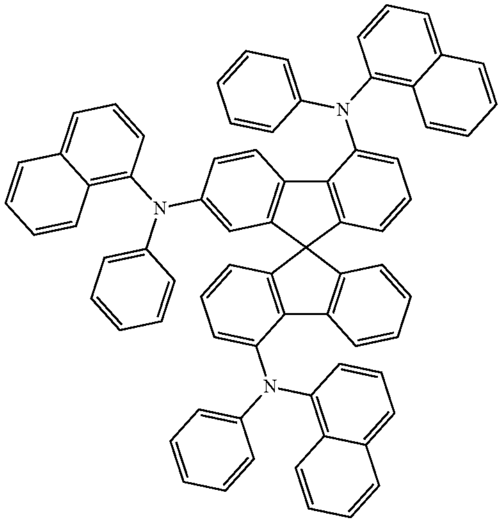
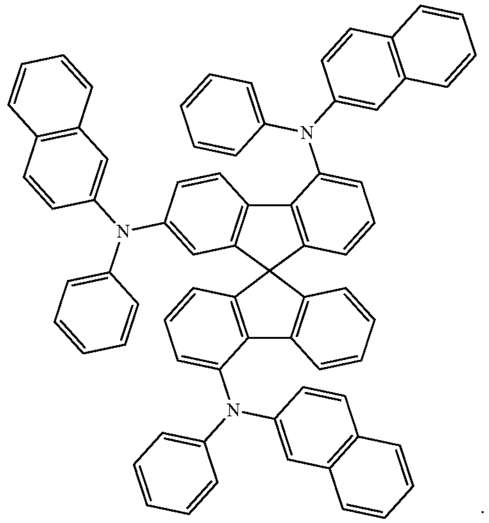
.
11. The organic light emitting device of claim 1, wherein the compound of Chemical Formula 1-A to 1-C is any one of the following compounds:
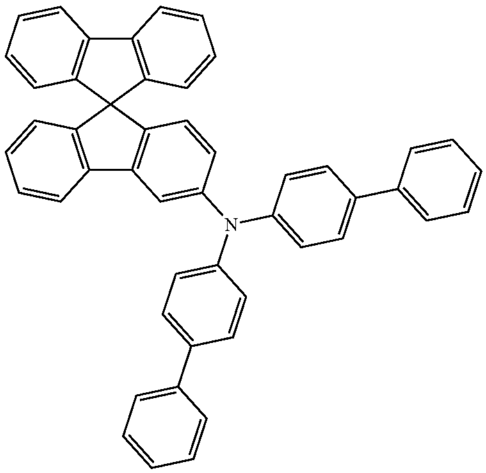
-continued
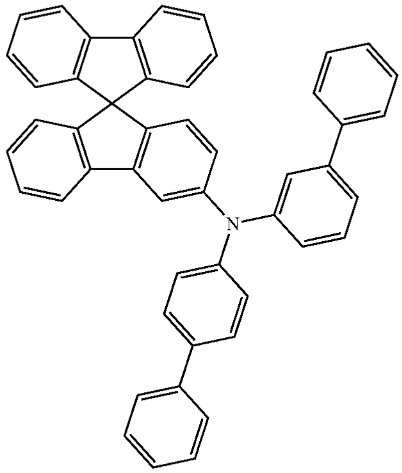
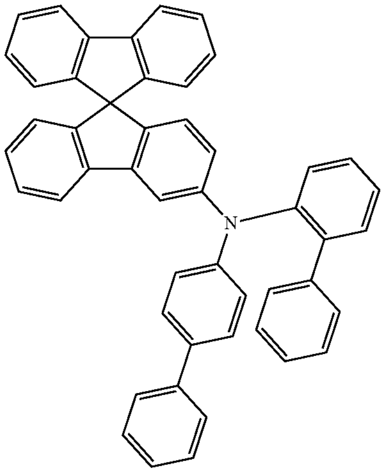
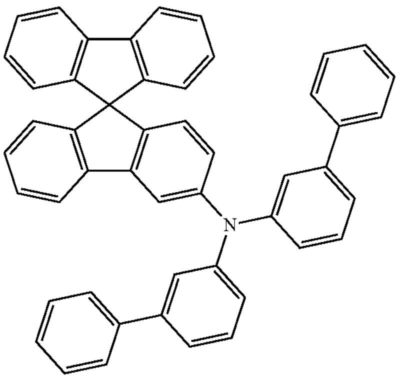

-continued
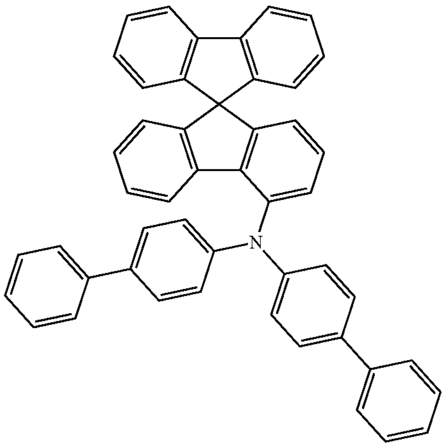
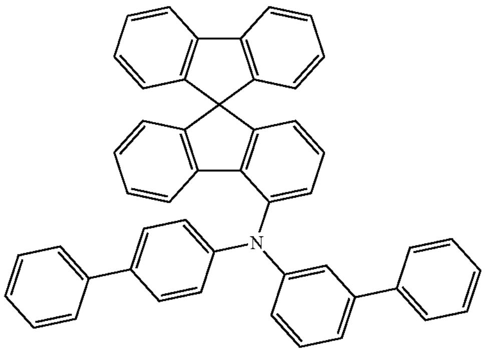
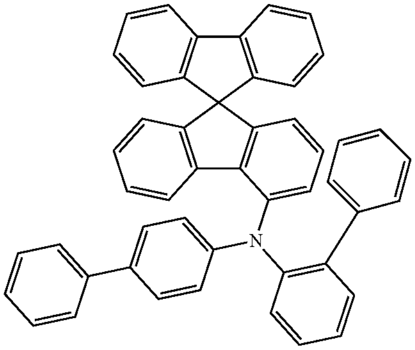
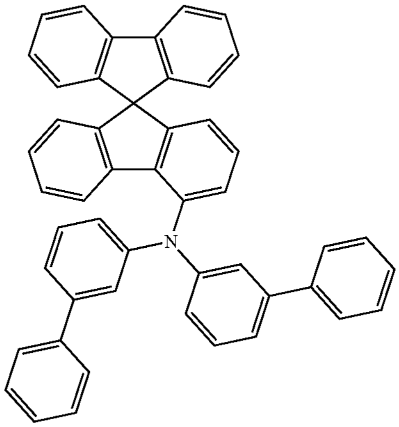
-continued
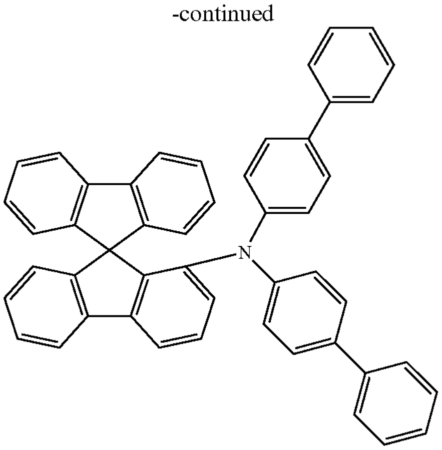
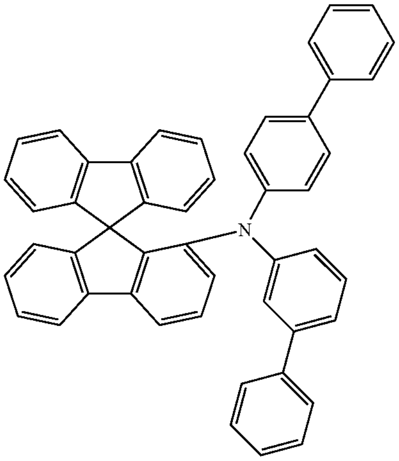
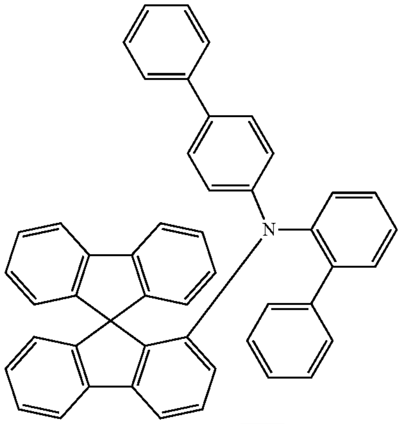
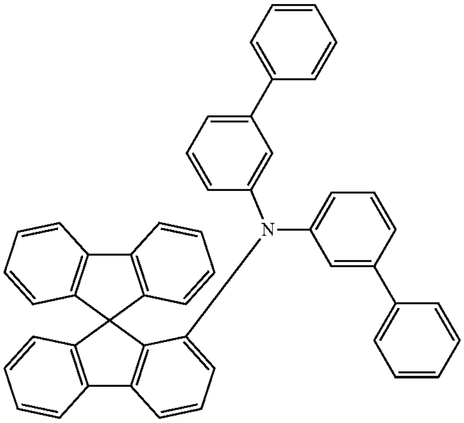

-continued
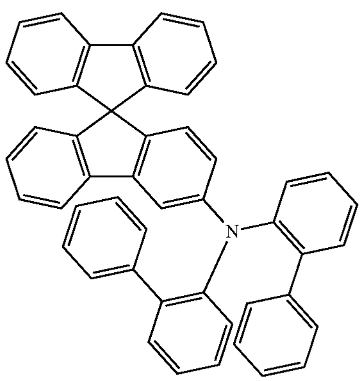
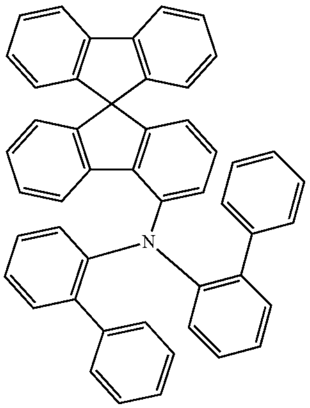
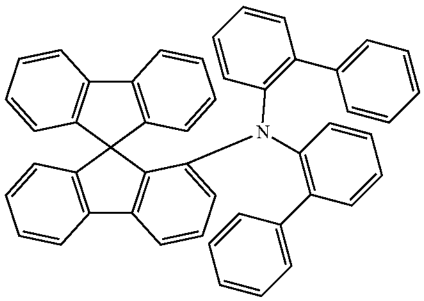
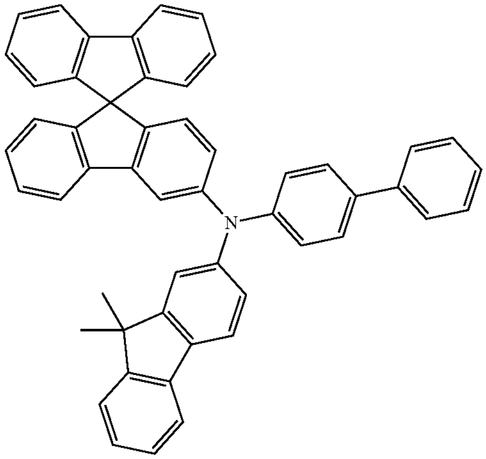
-continued
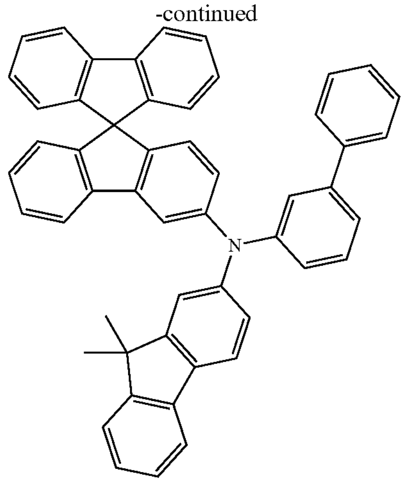
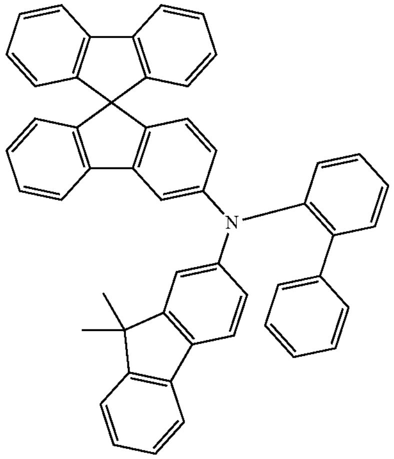
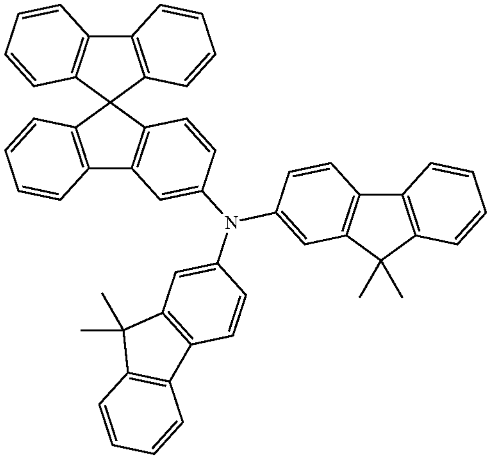

-continued
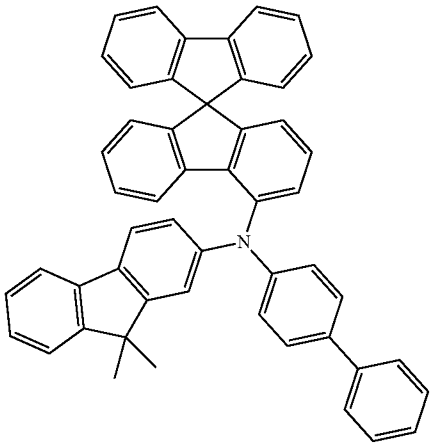
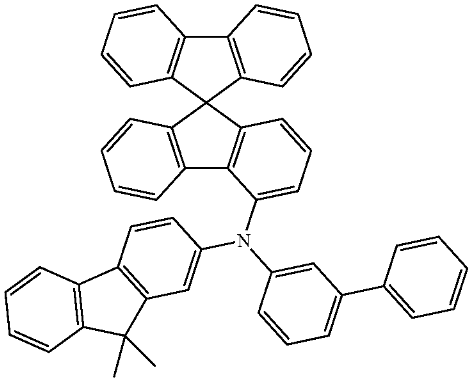
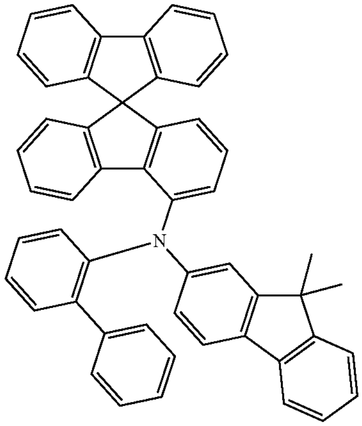
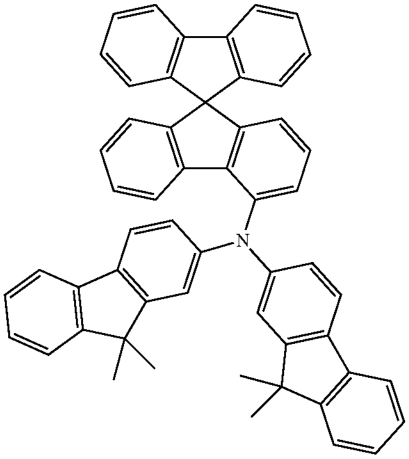
-continued
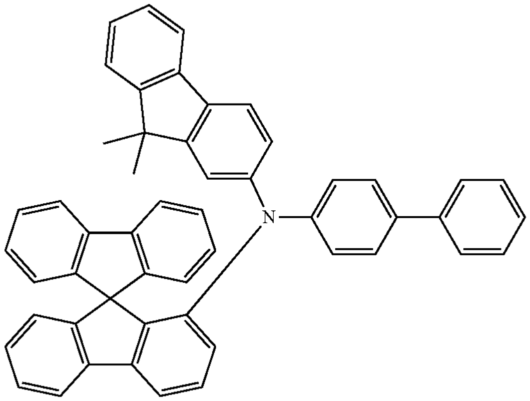
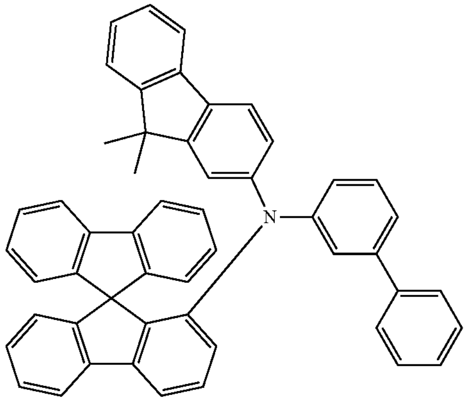
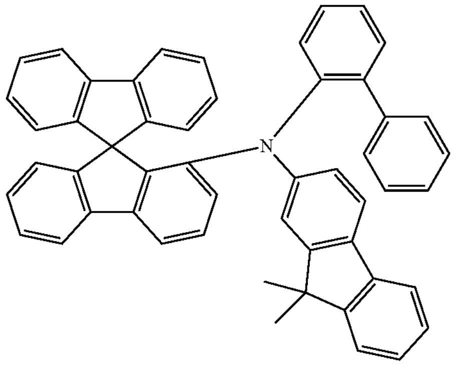
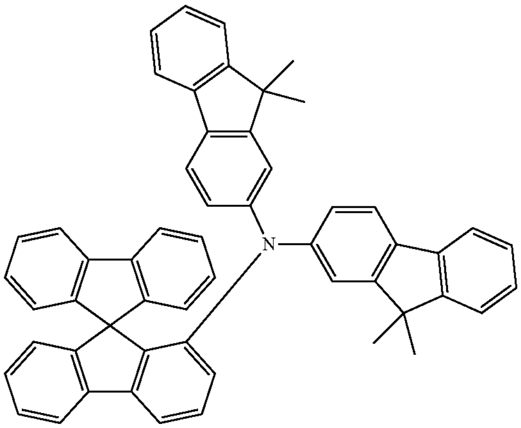

-continued
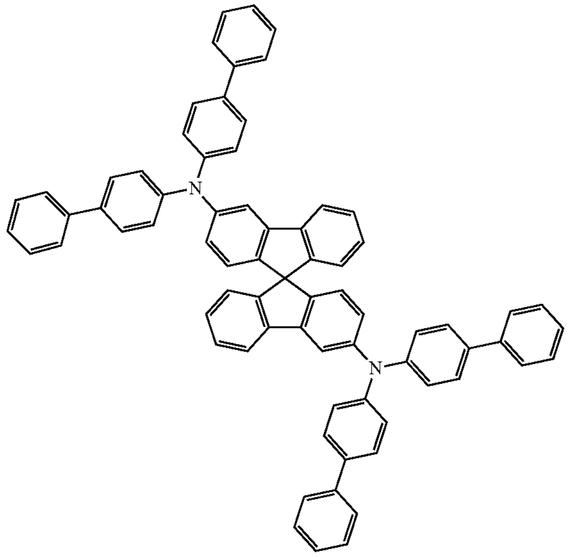
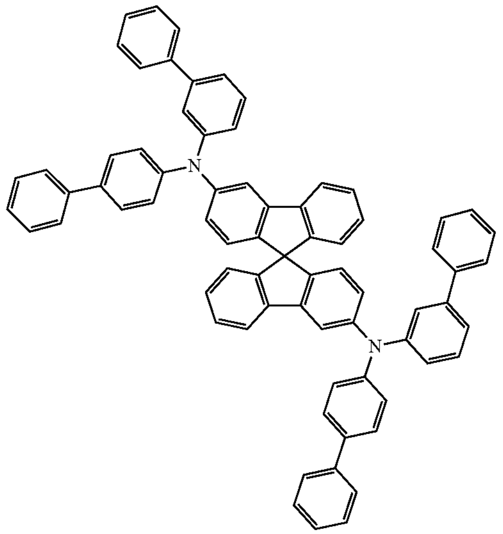
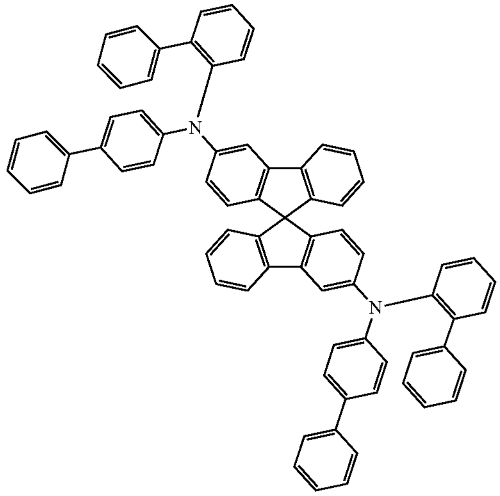
-continued
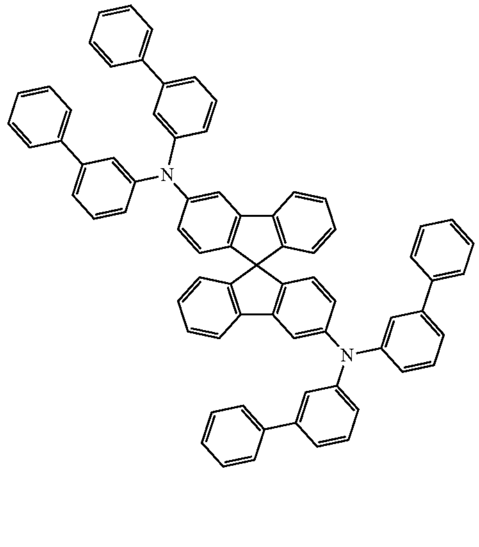
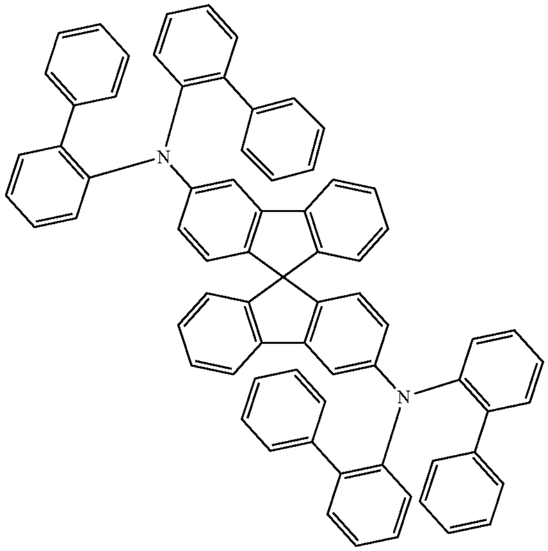
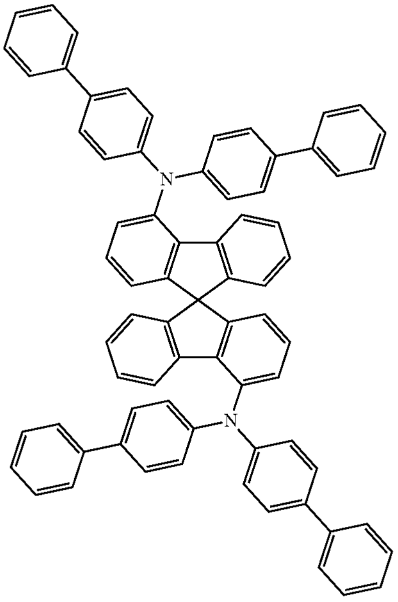

-continued
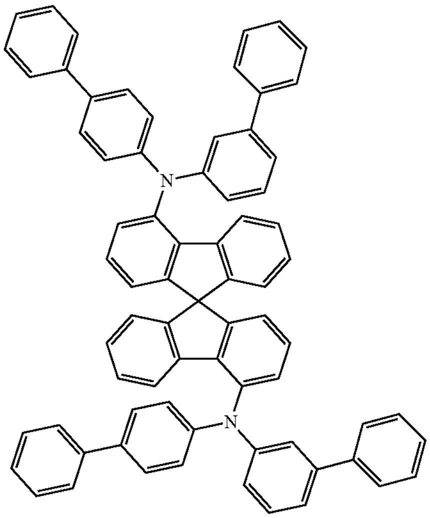
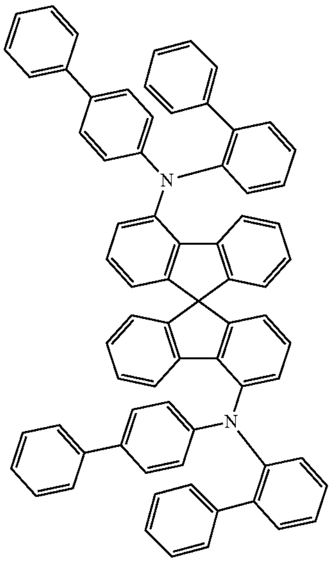
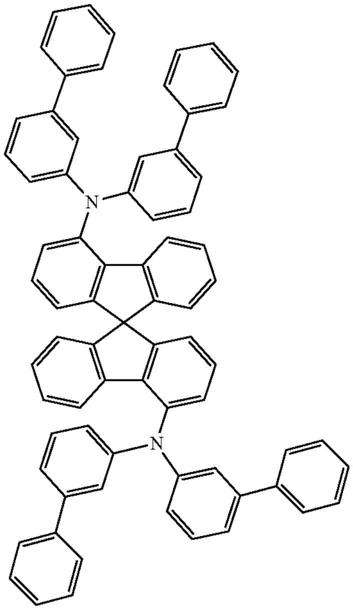
-continued
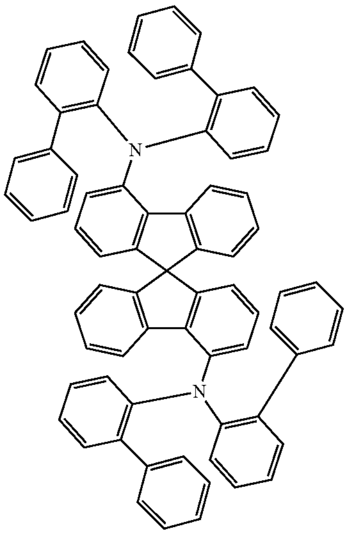
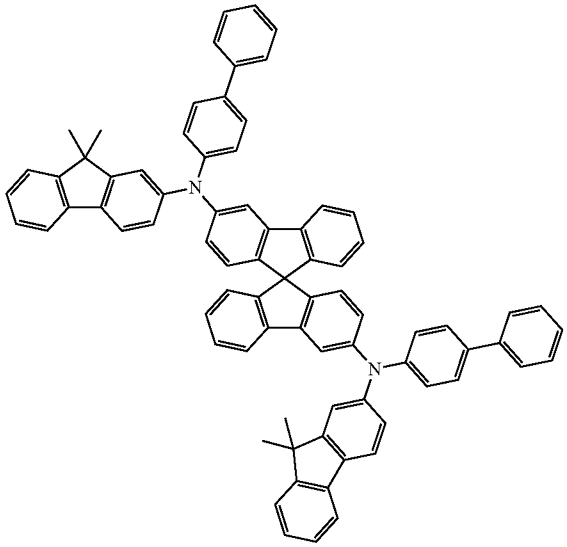
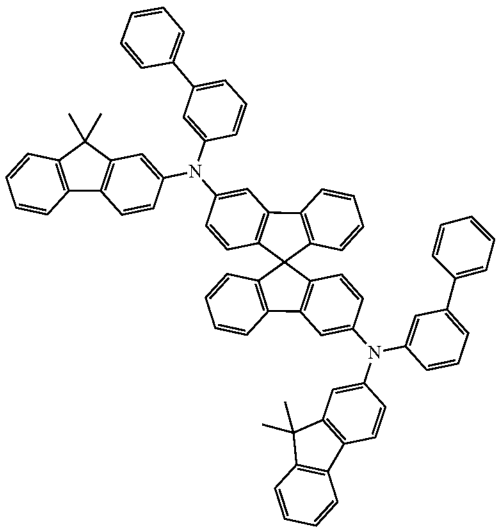

-continued
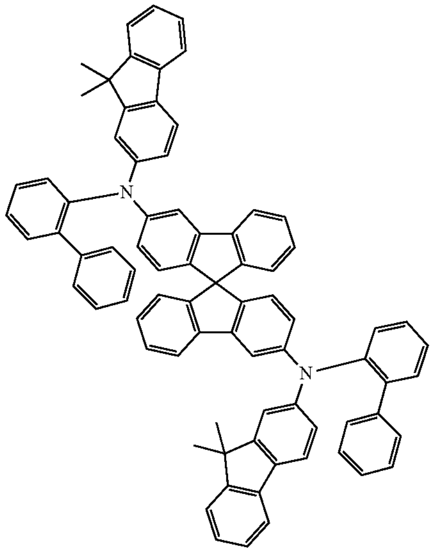
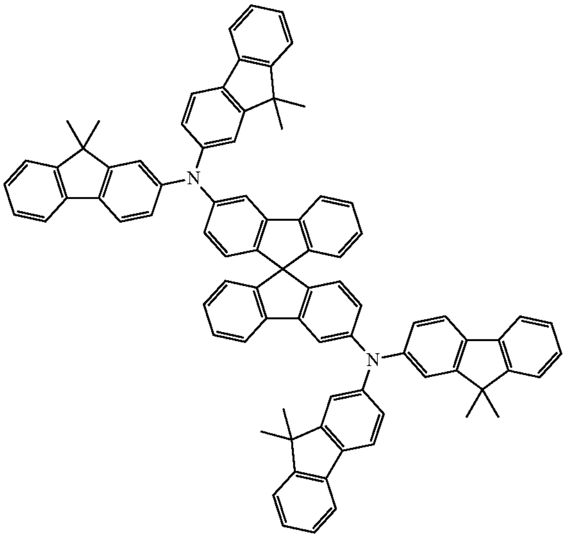
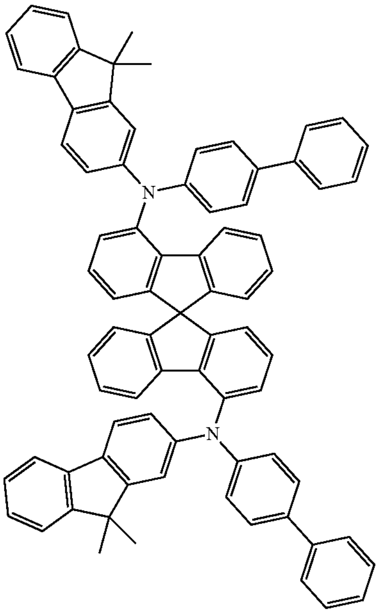
-continued
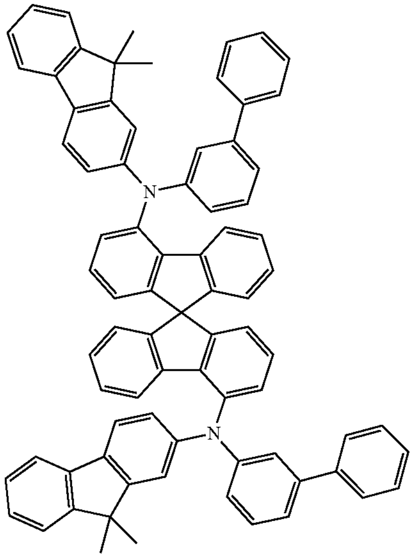
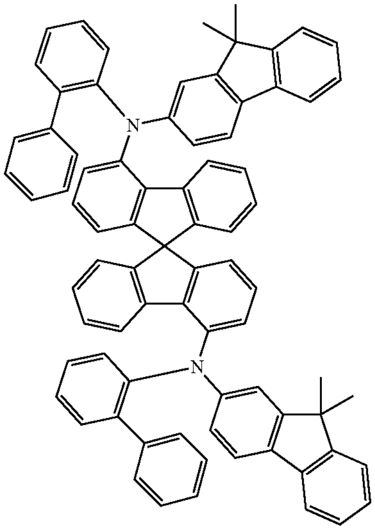
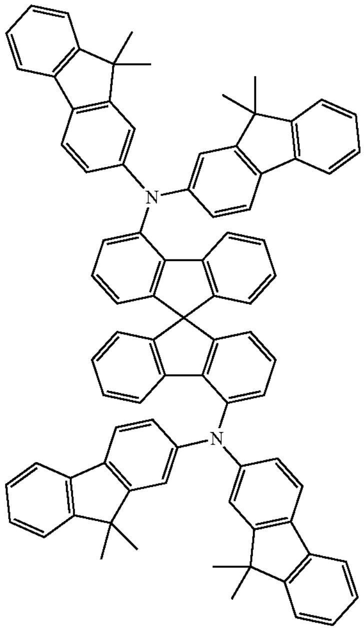

-continued
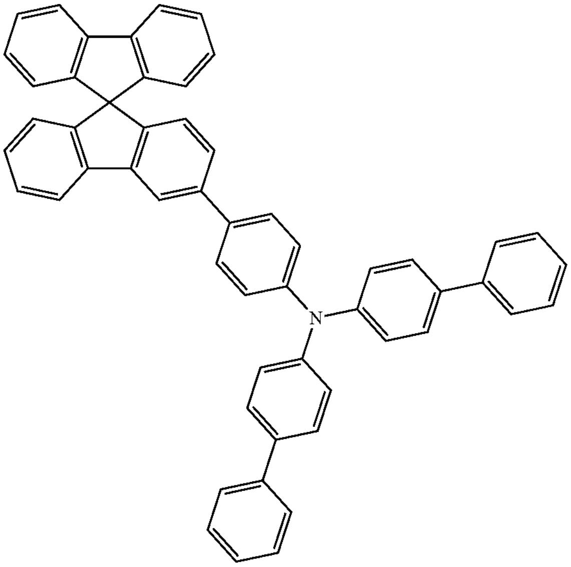
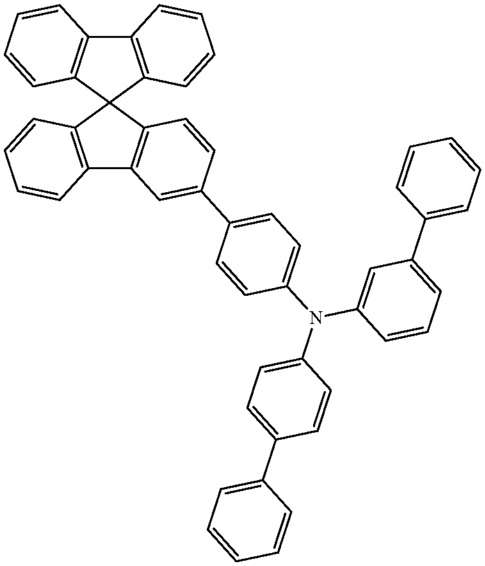
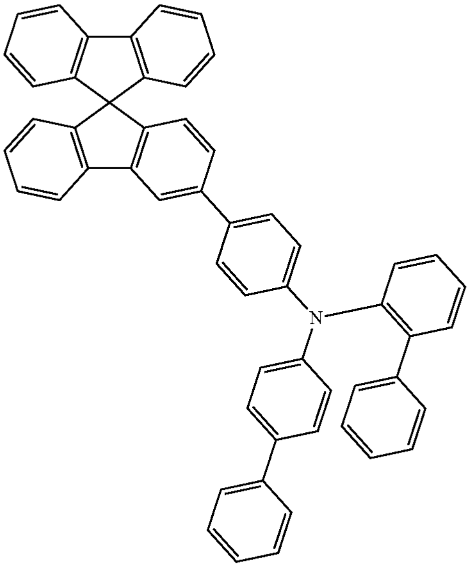
-continued
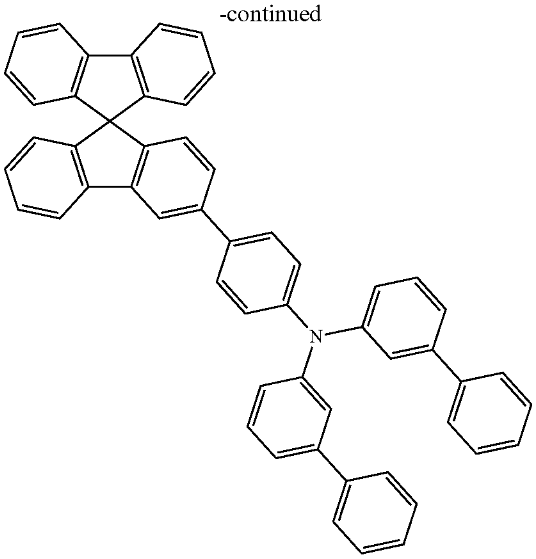
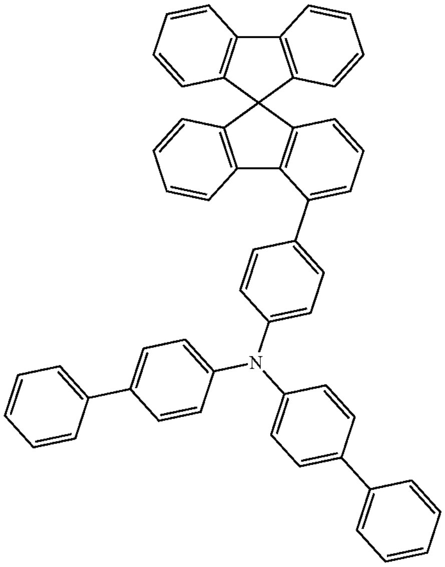
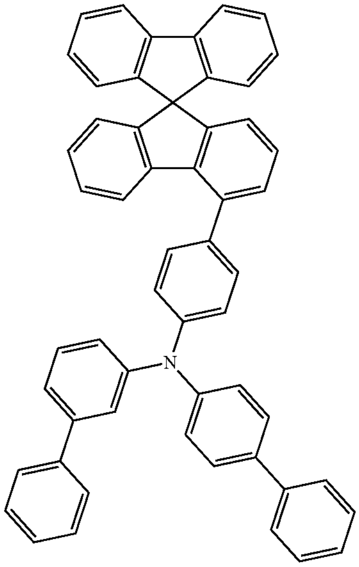

-continued
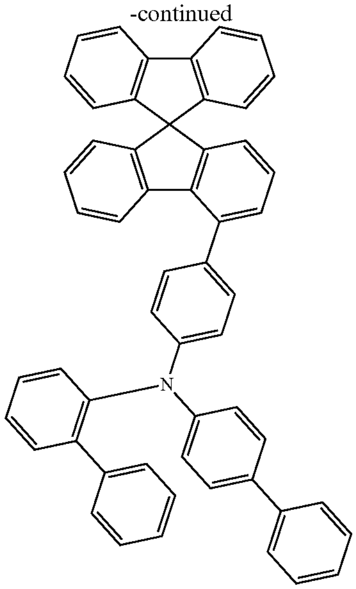
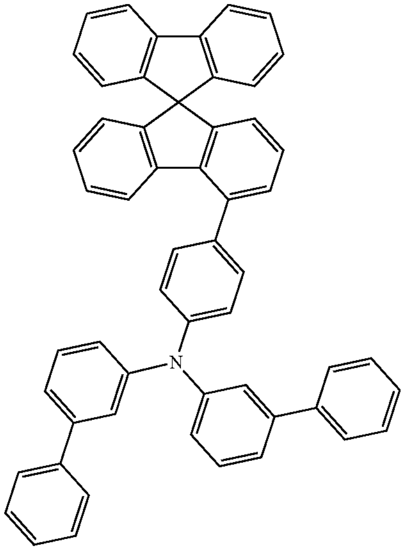
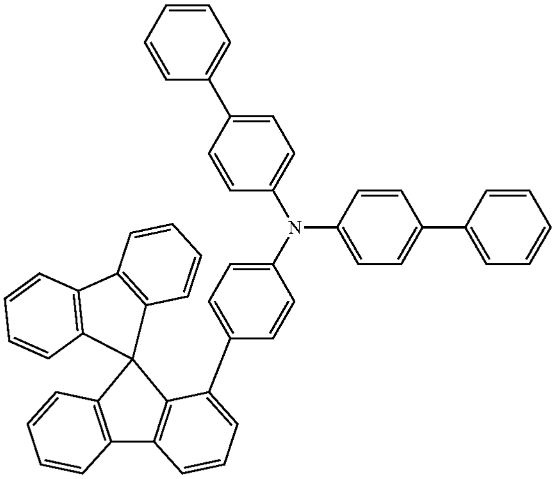
-continued
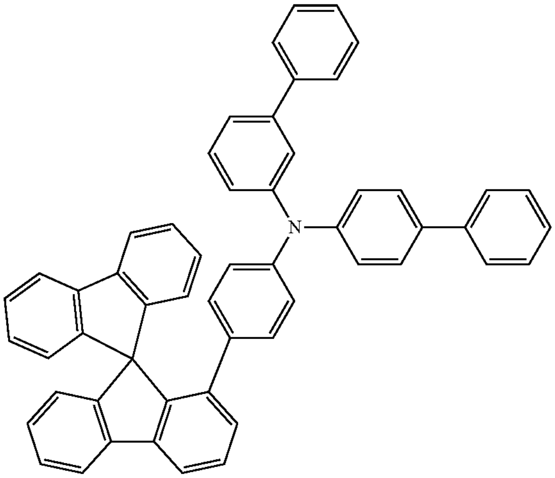
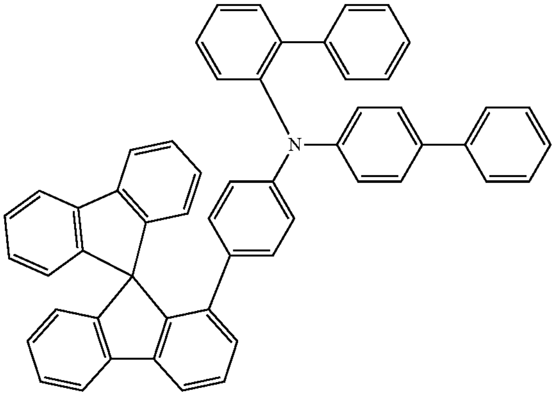
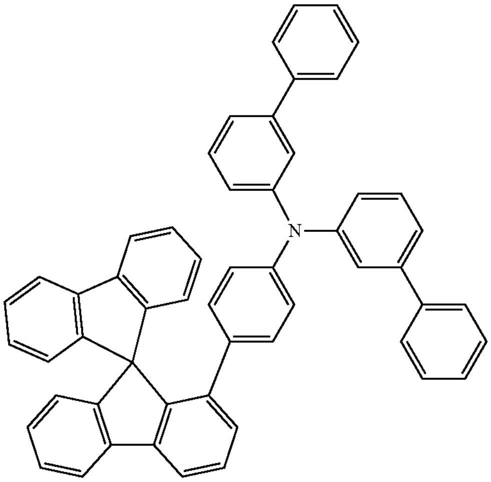

-continued
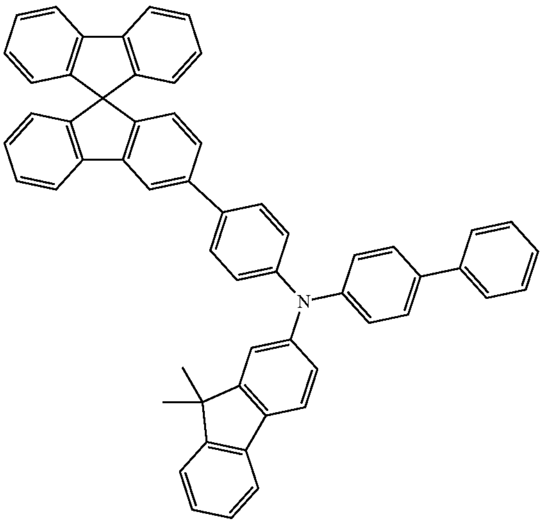
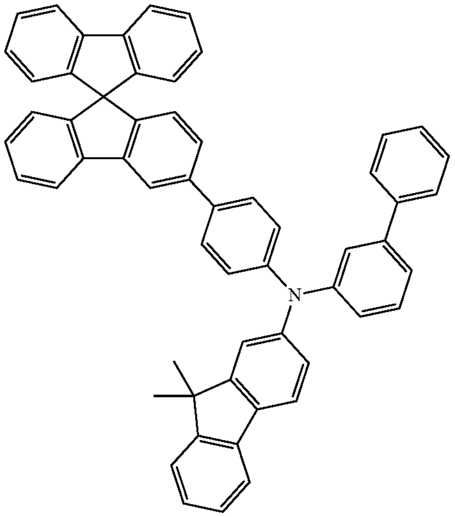
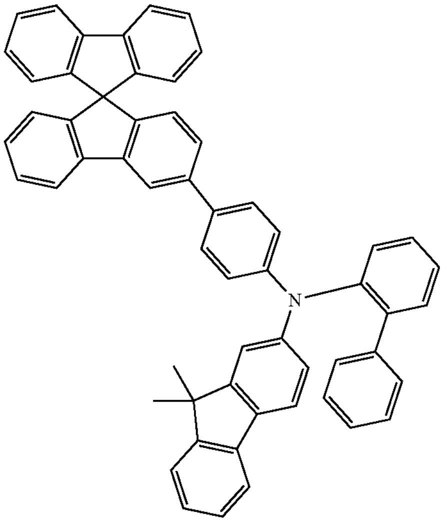
-continued
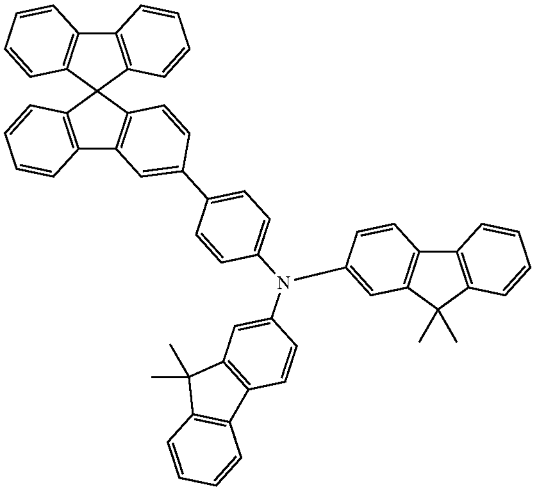
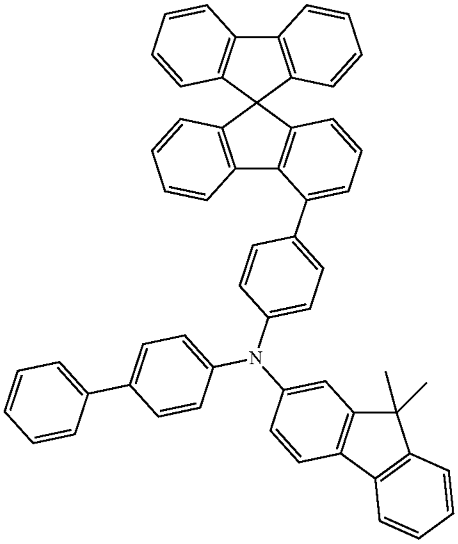
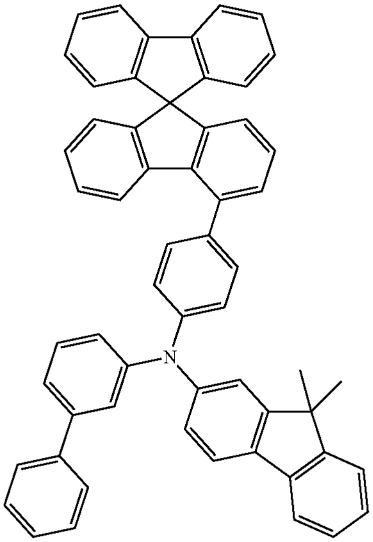

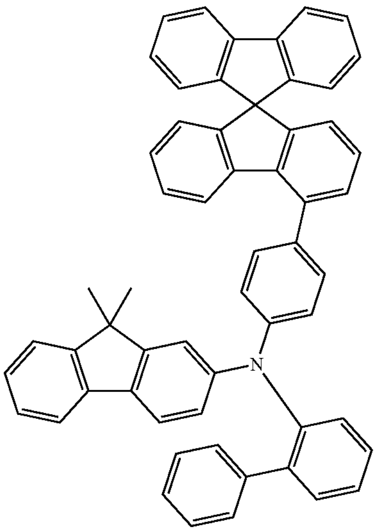
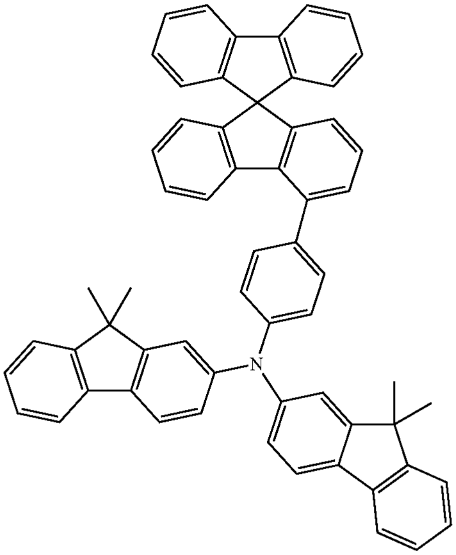
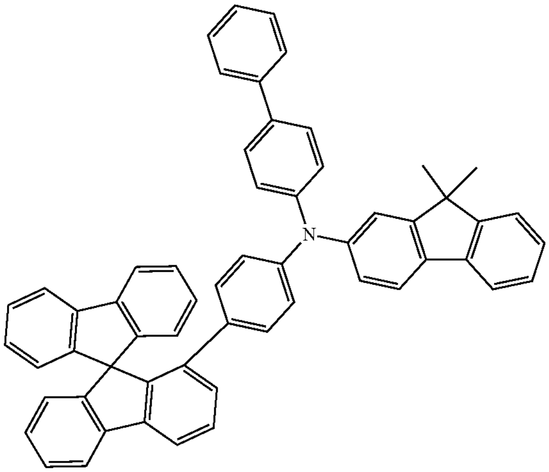
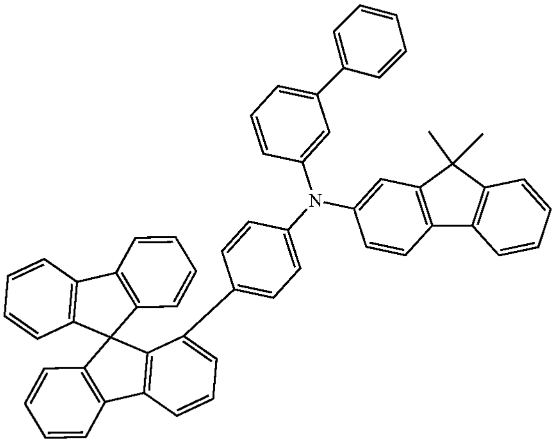
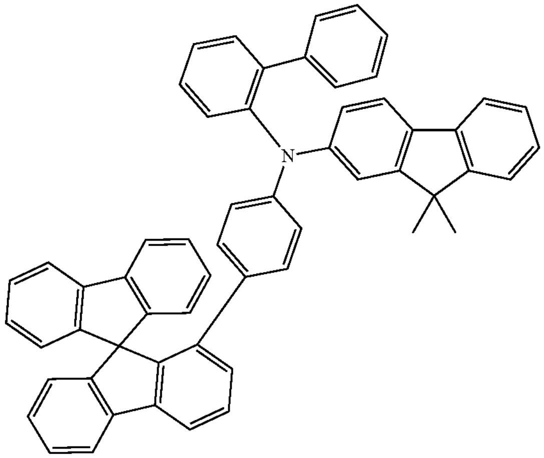
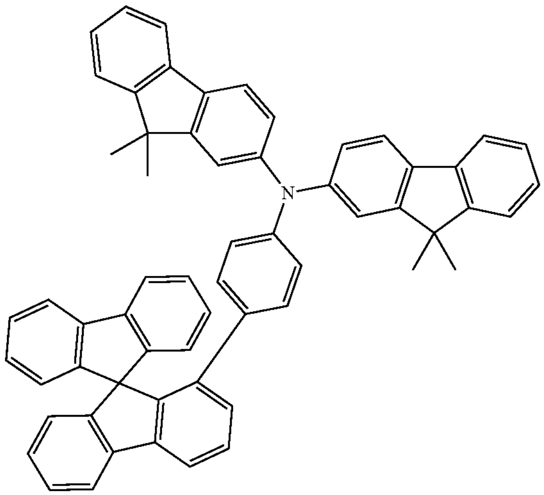

-continued
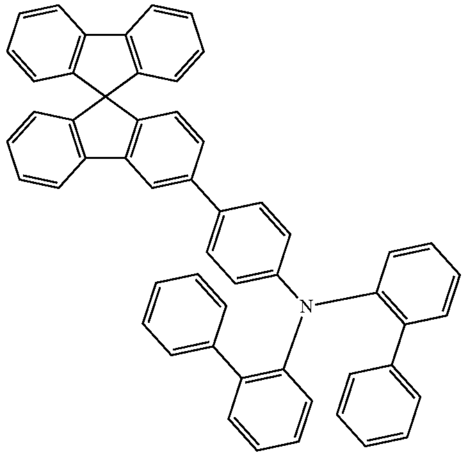
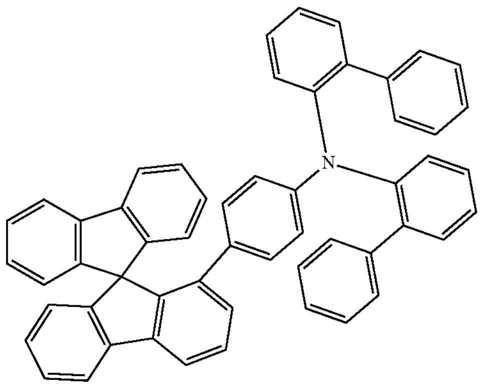
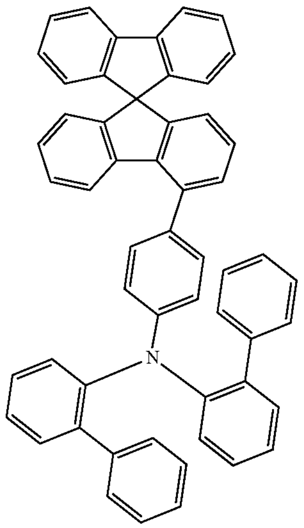
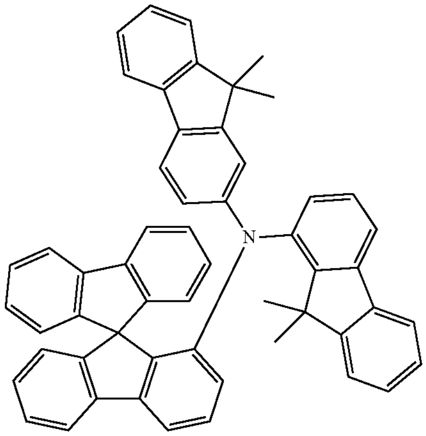
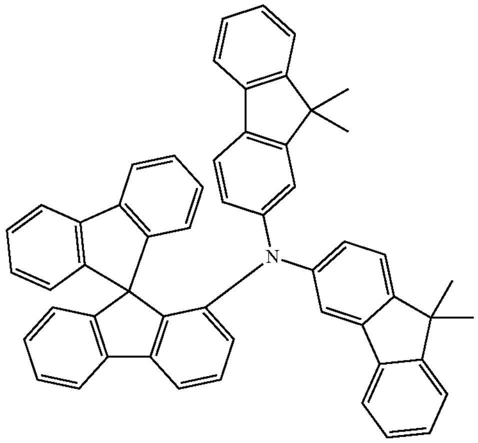
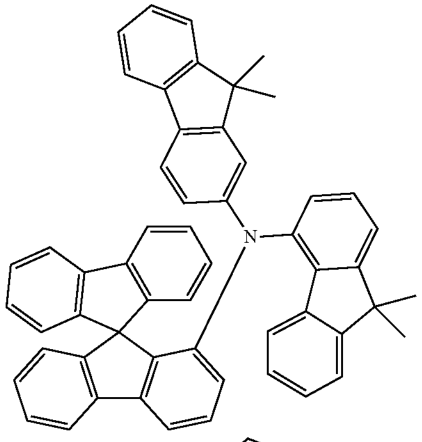
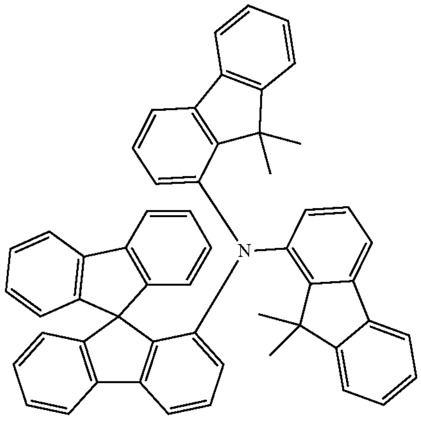

-continued
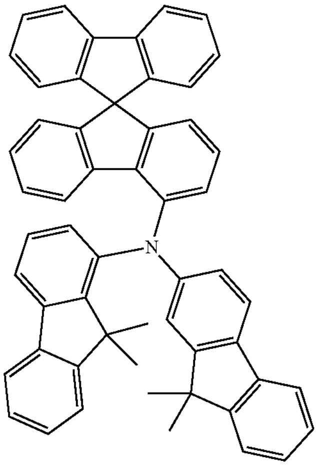
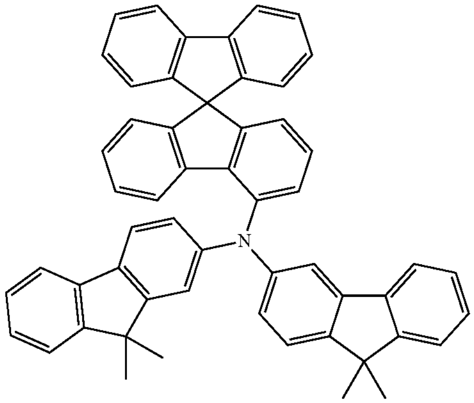
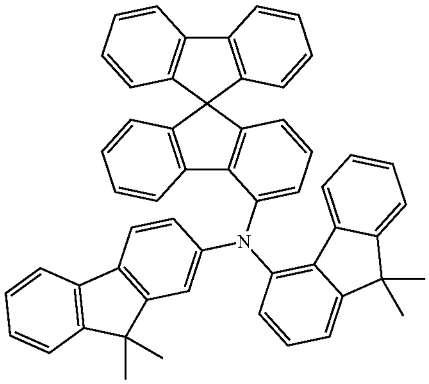
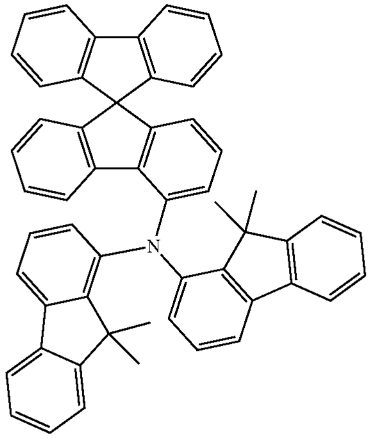
-continued
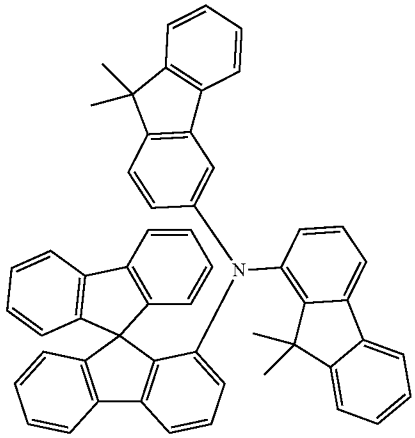
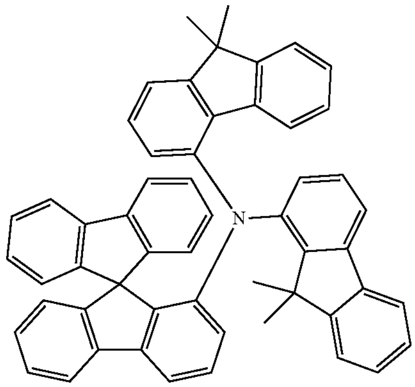
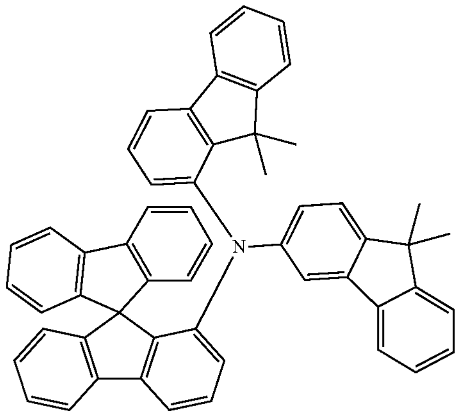
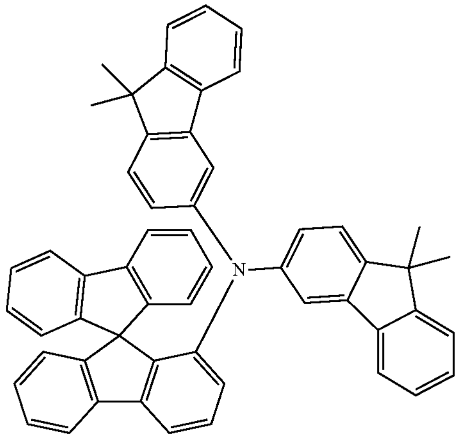

-continued
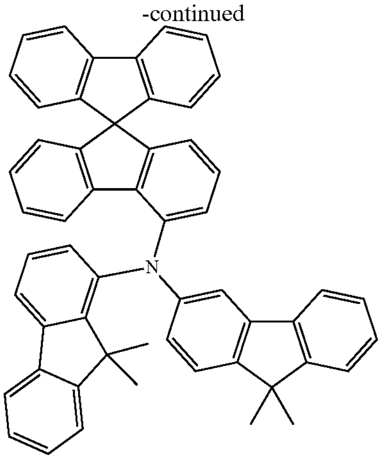
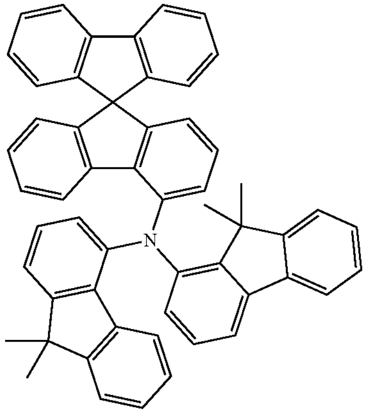
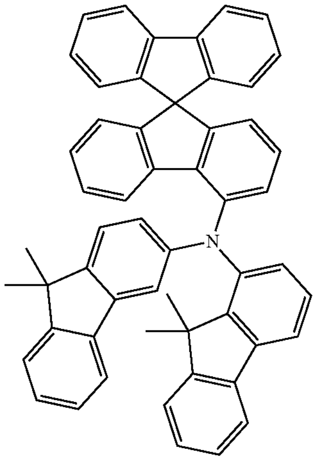
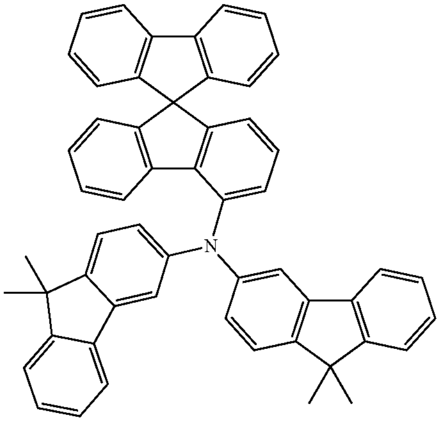
-continued
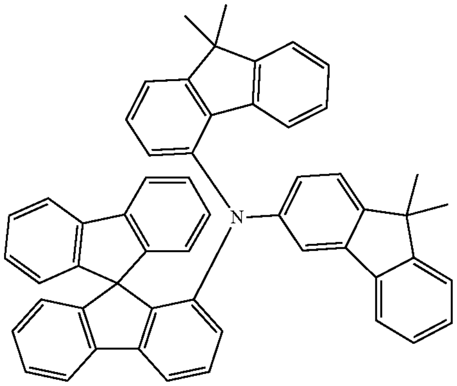
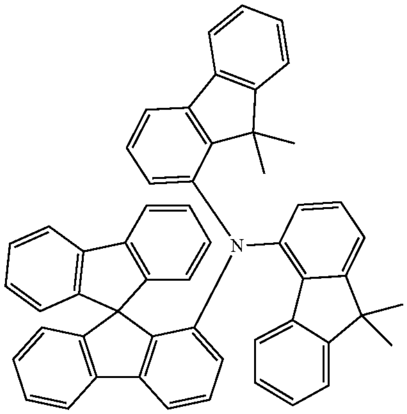
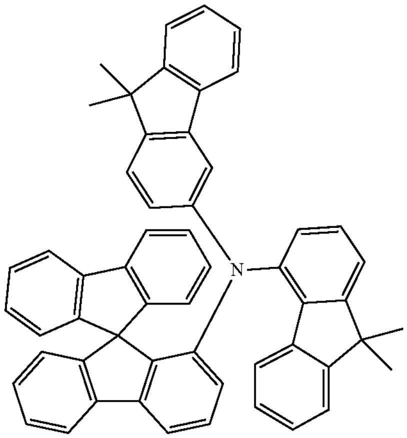
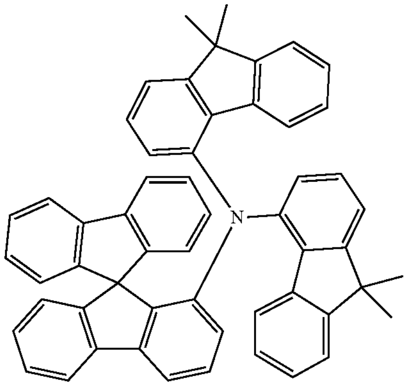

-continued
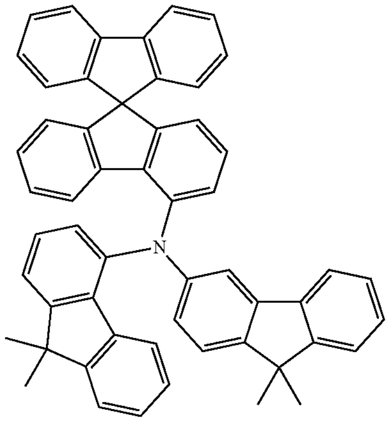
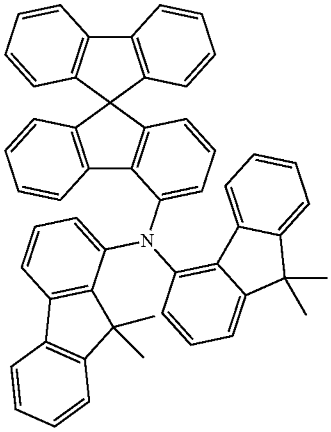
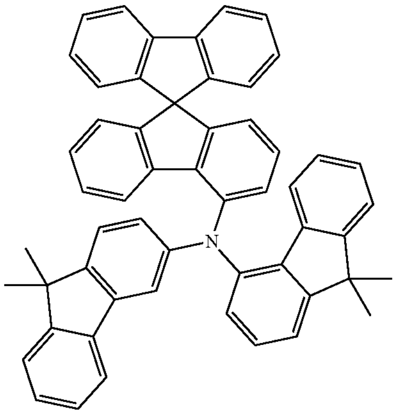
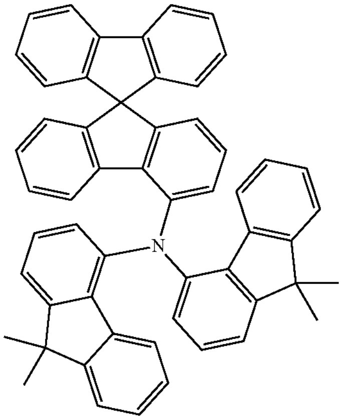
-continued
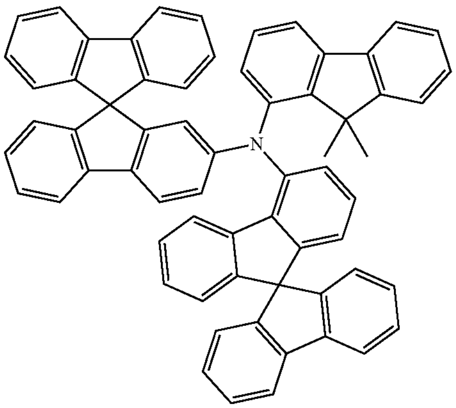
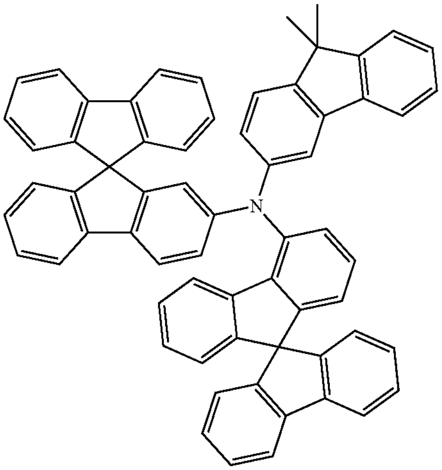
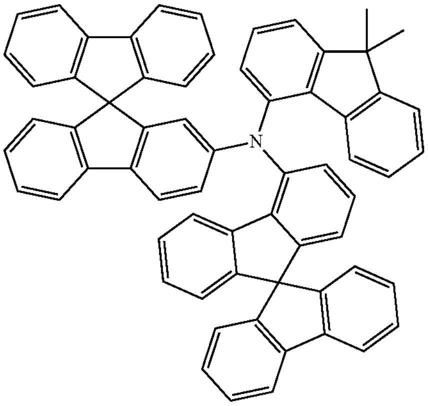

-continued
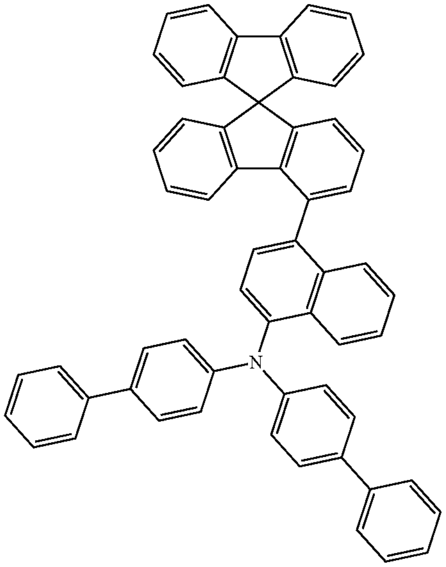
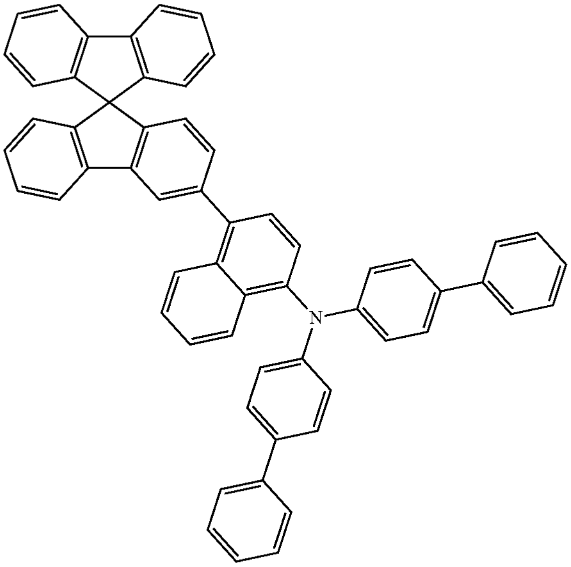
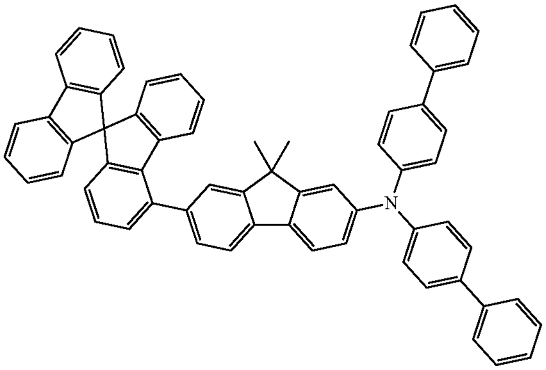
-continued
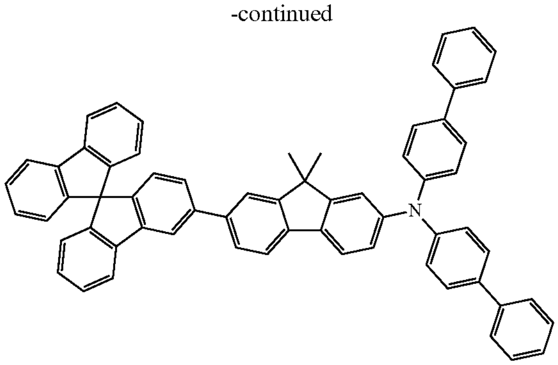
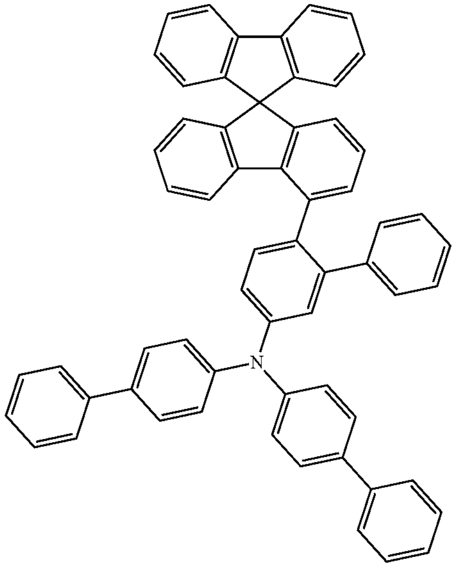
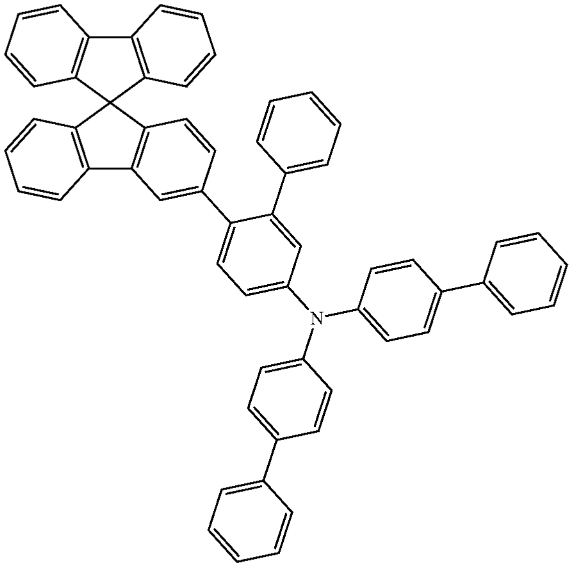

-continued
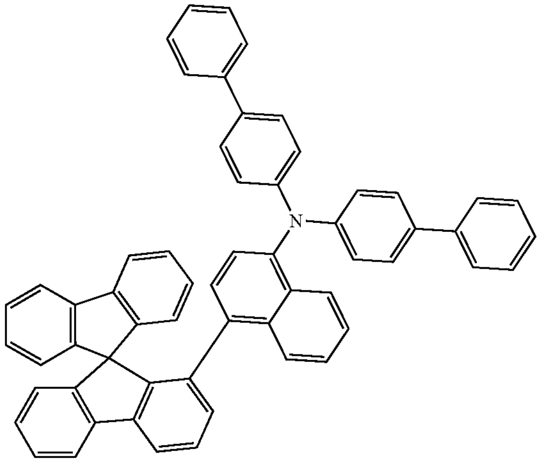
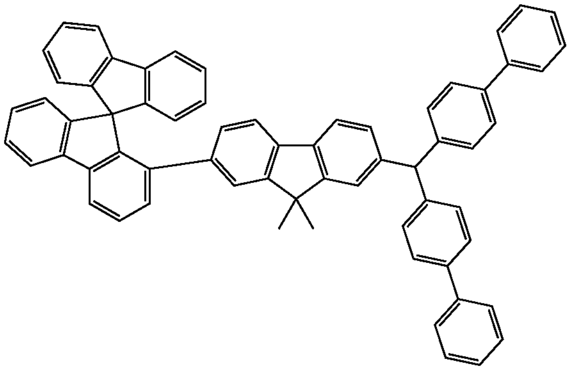
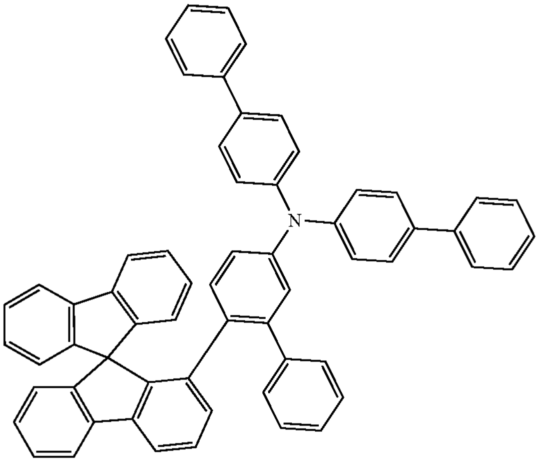
12. The organic light emitting device of claim 1, wherein the compound of Chemical Formula 2 is any one of the following compounds:
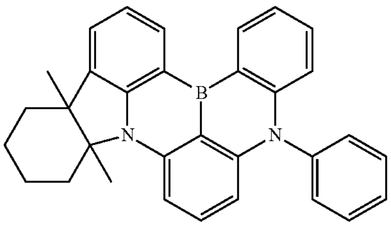
-continued
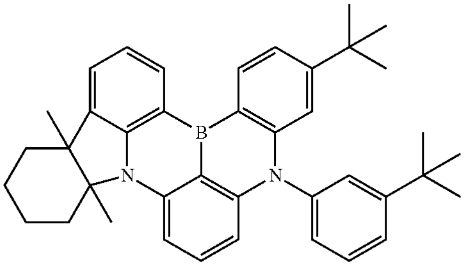
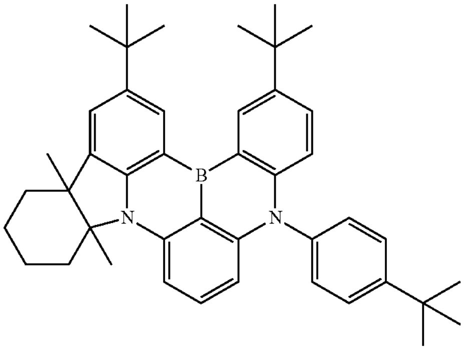
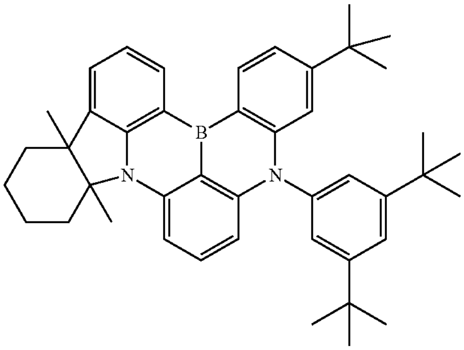
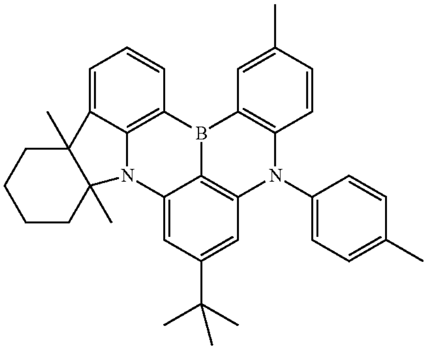
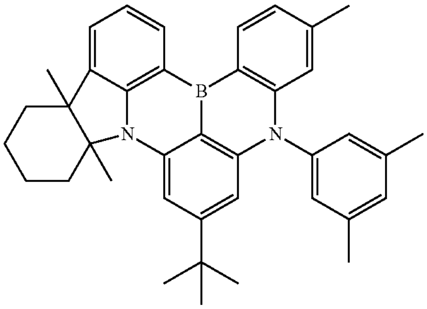

-continued
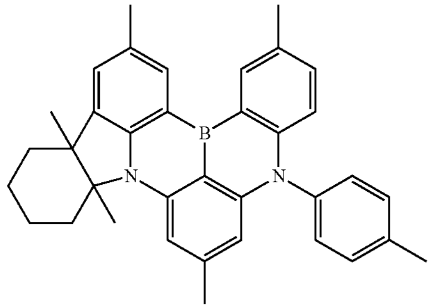
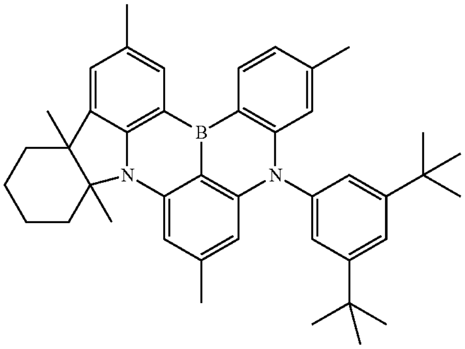
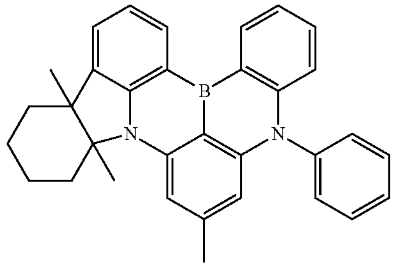
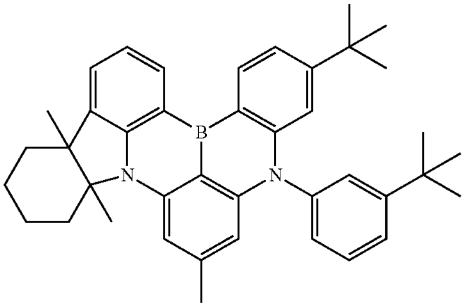
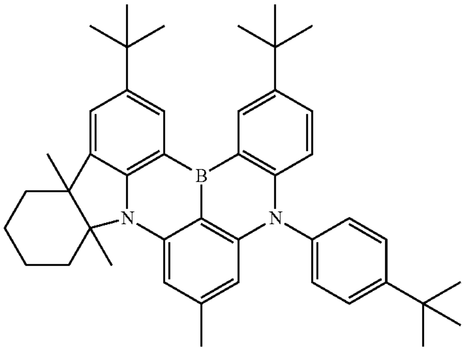
-continued
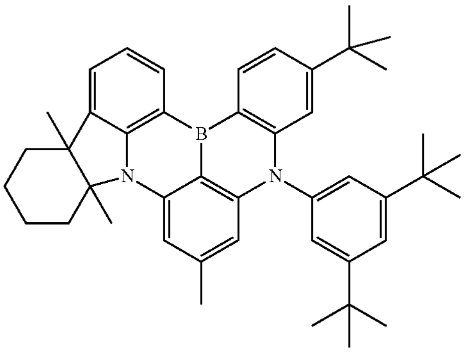
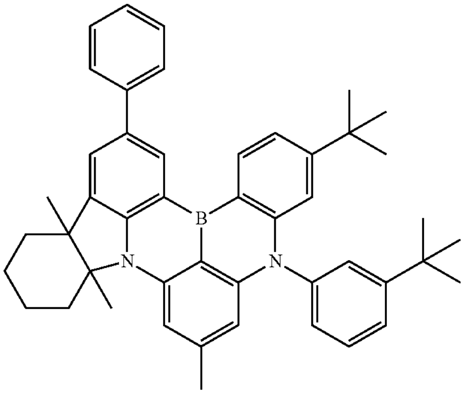
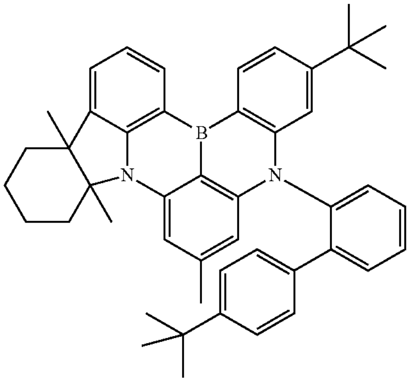
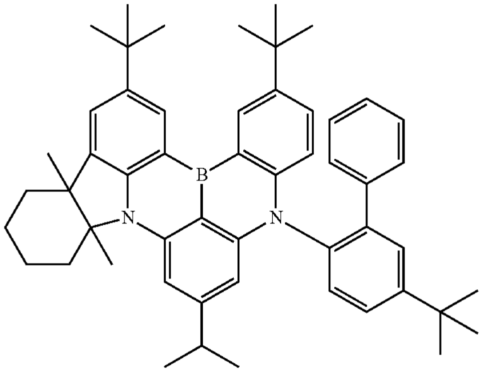

-continued
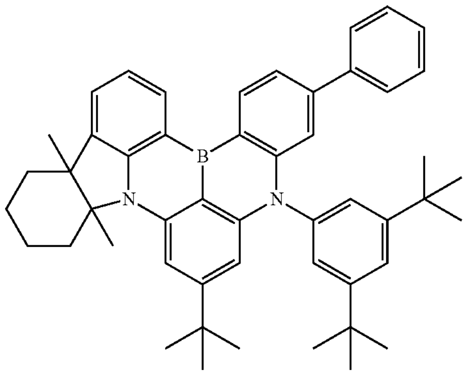
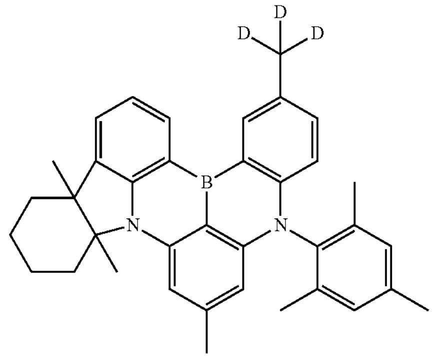
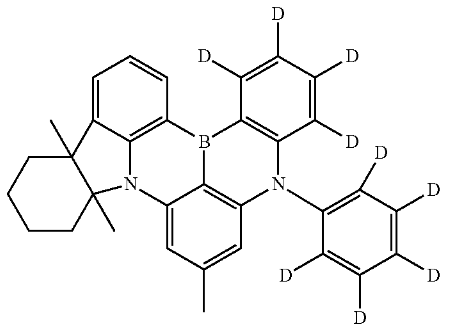
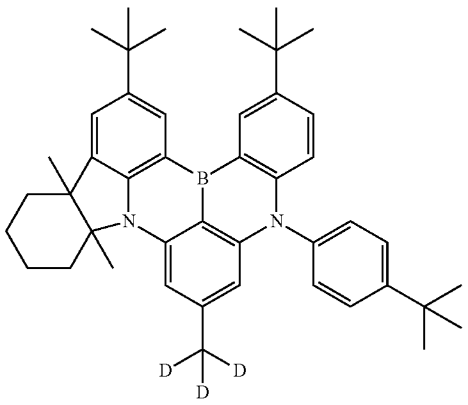
-continued
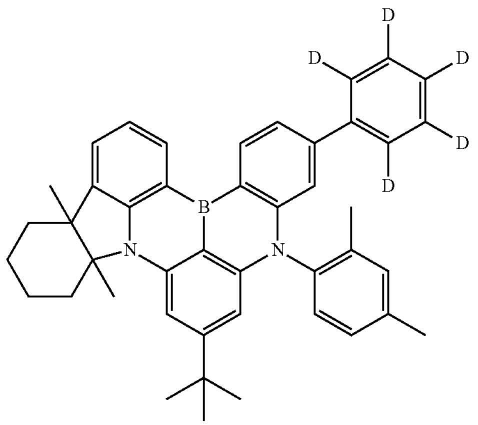
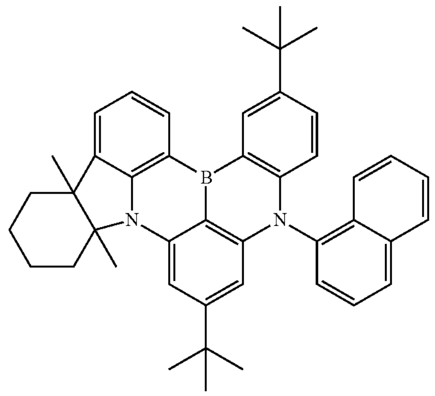
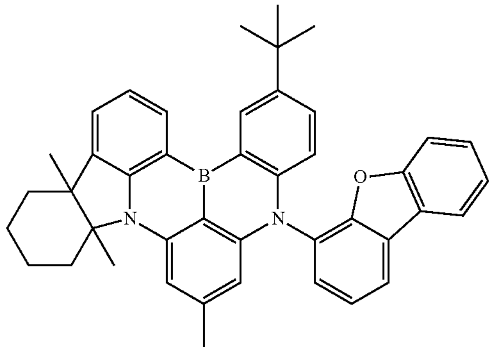
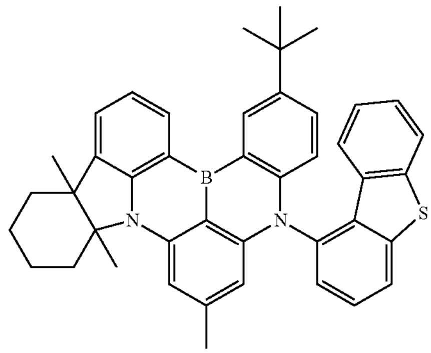

-continued
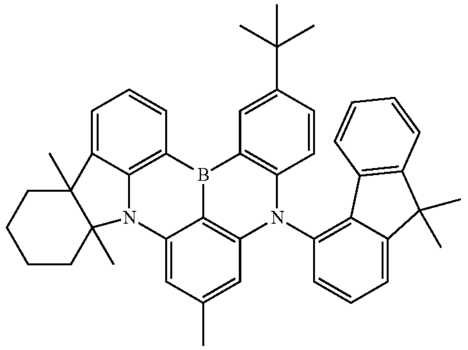
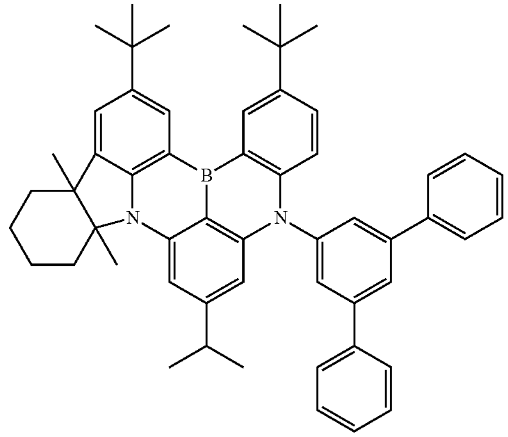
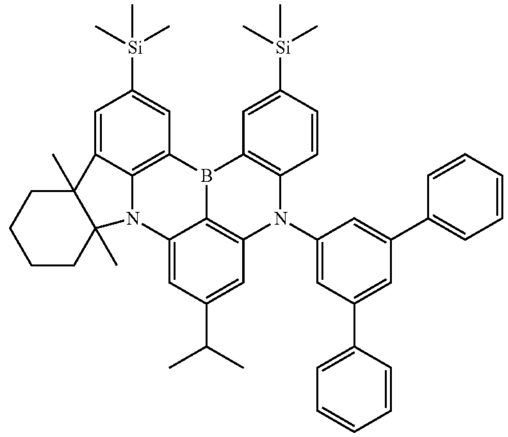
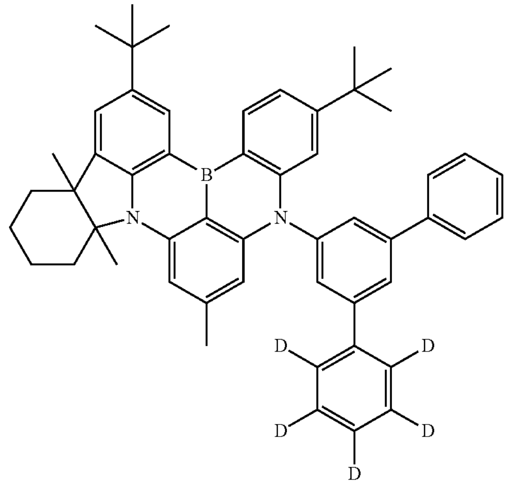
-continued
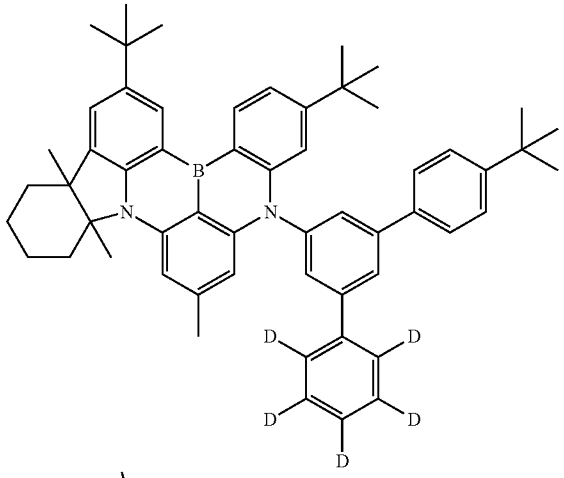
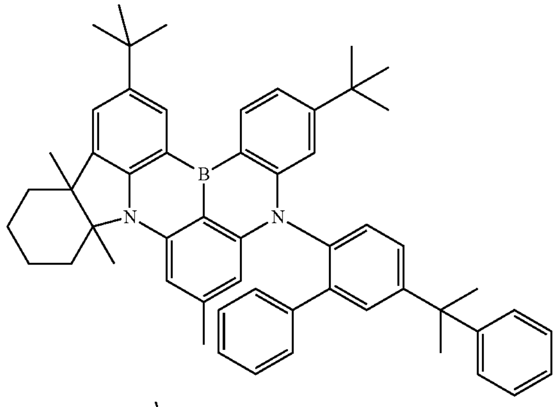
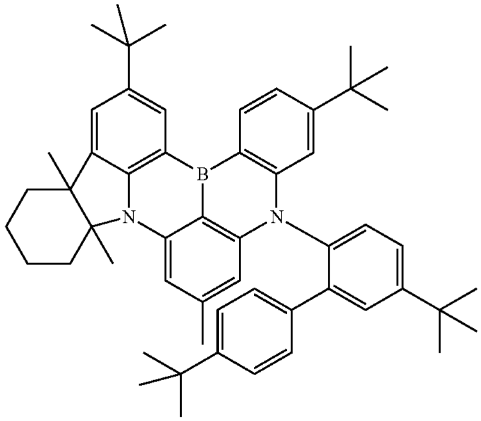
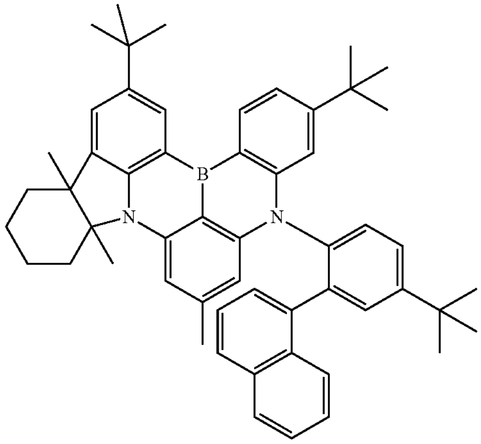

-continued
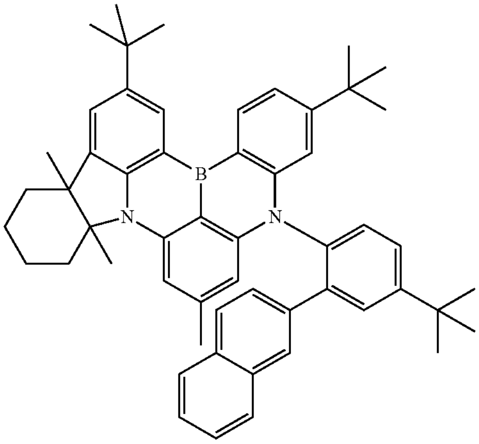
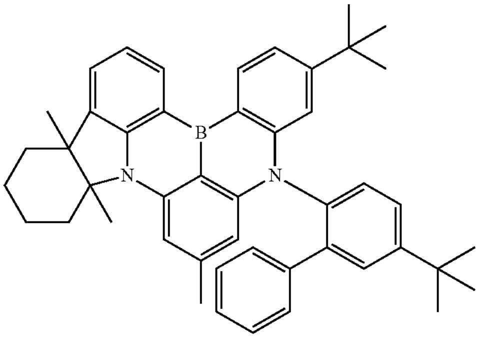
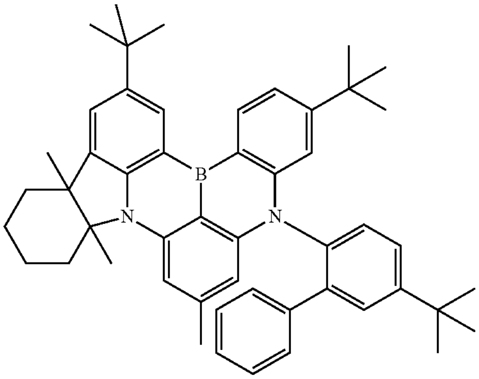
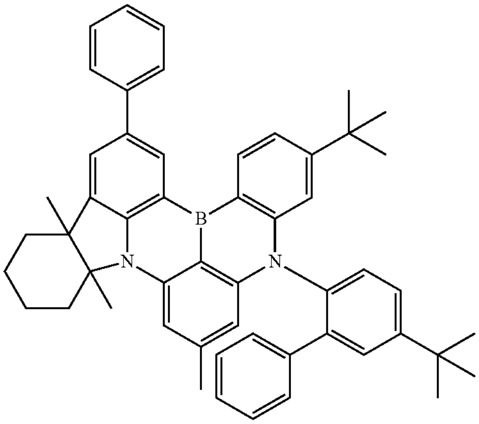
-continued
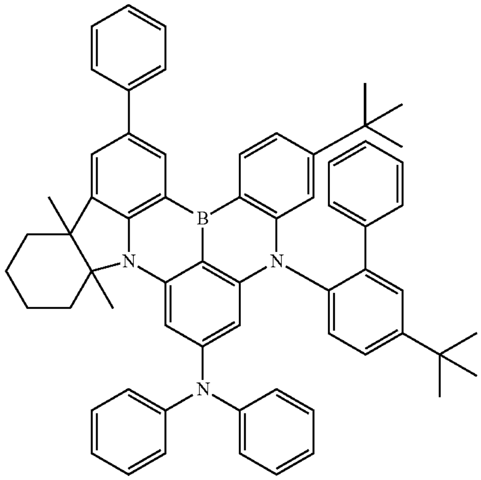
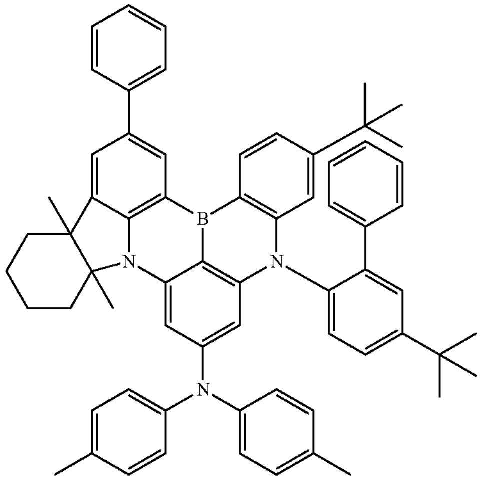
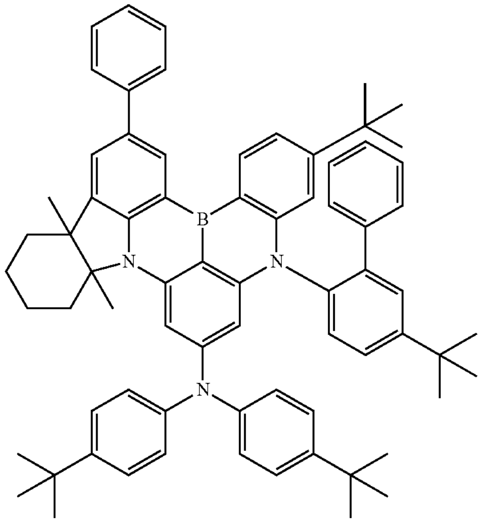

-continued
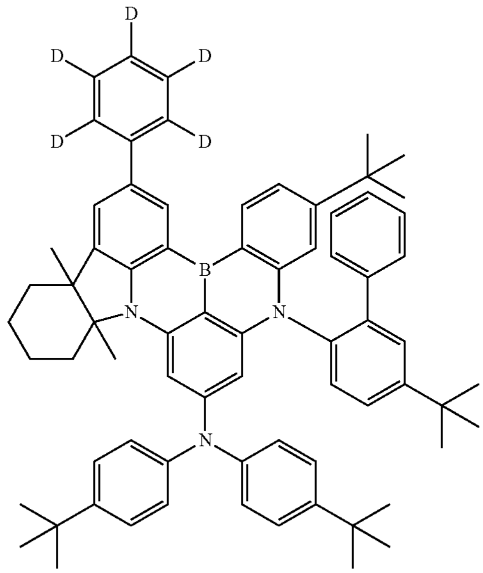
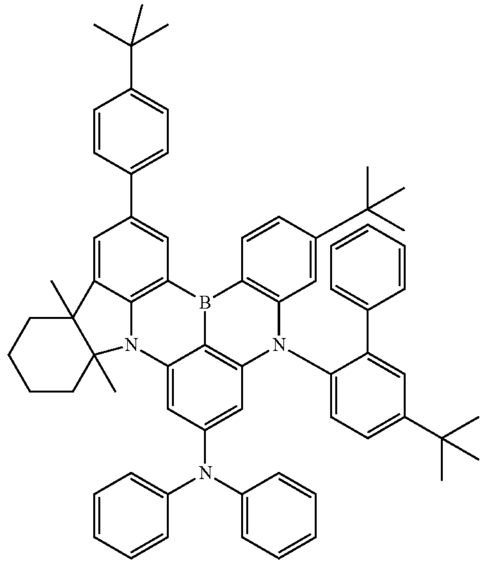
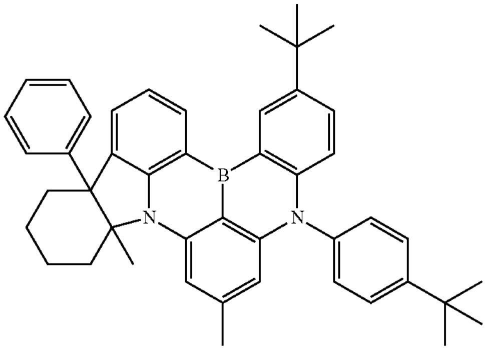
-continued
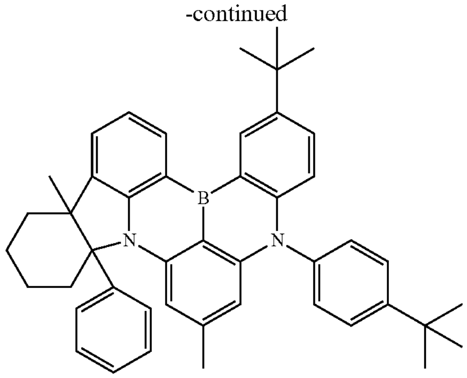
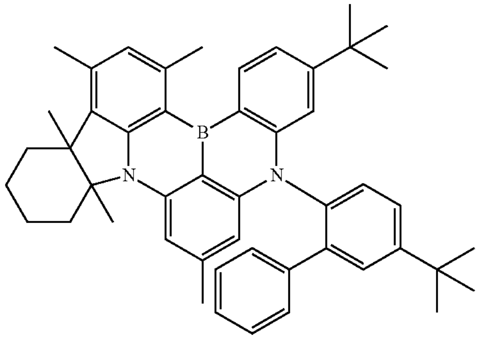
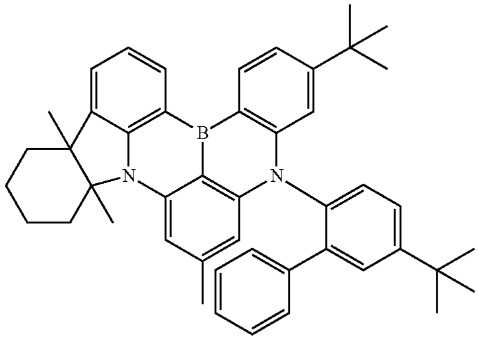
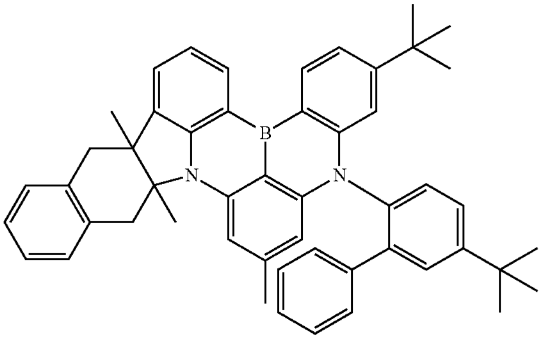
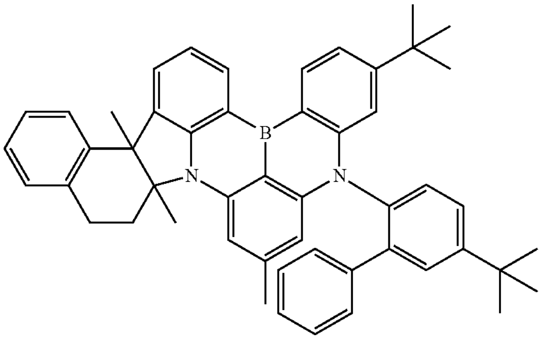

-continued
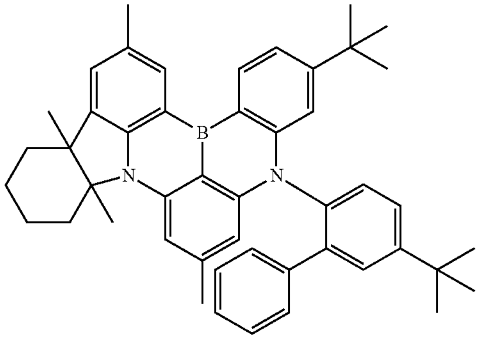
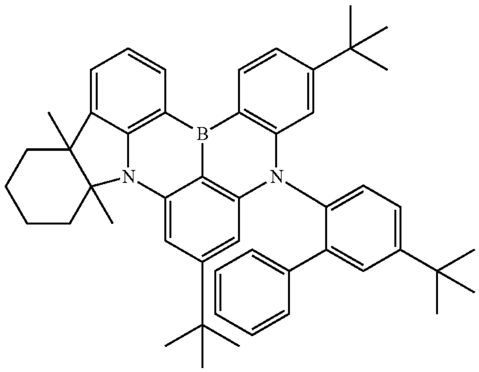
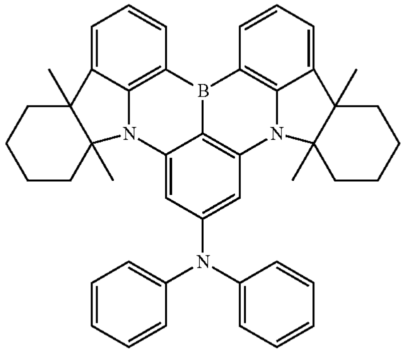
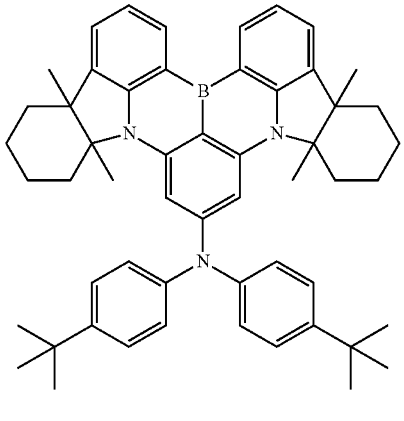
-continued
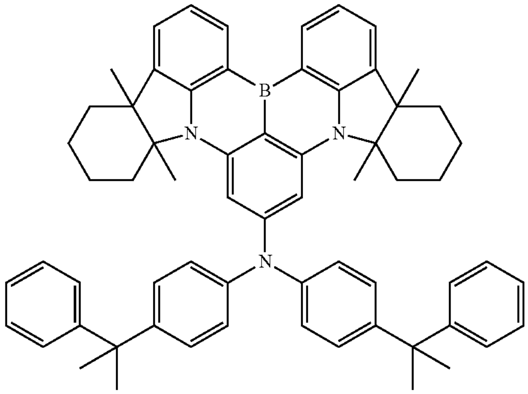
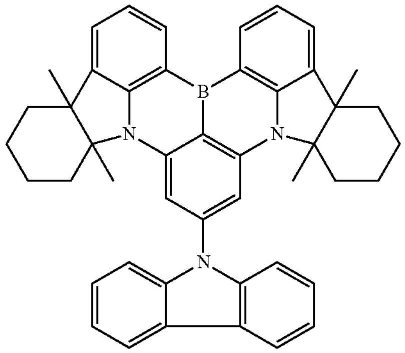
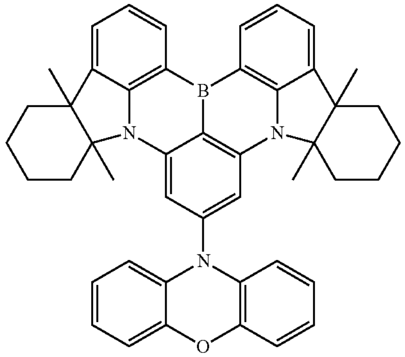
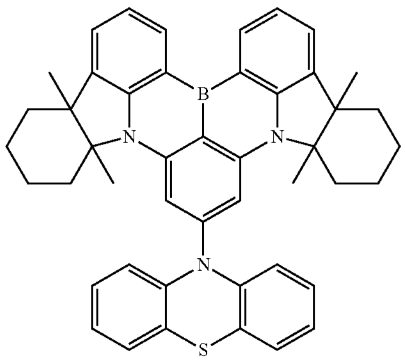

-continued
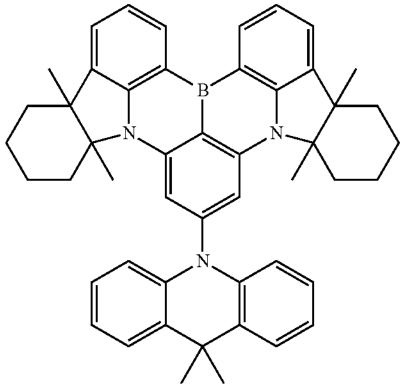
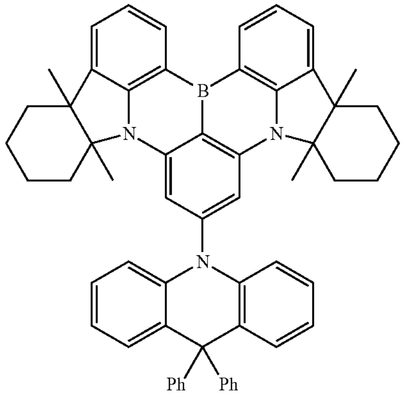
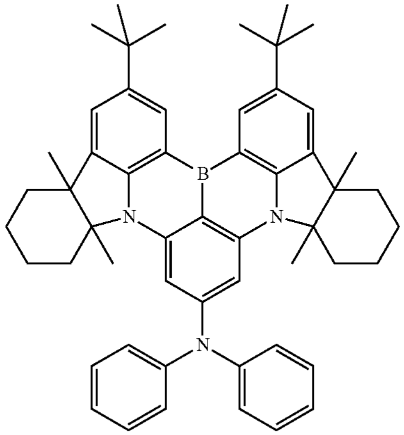
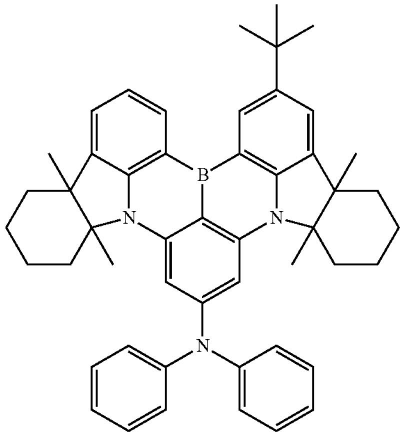
-continued
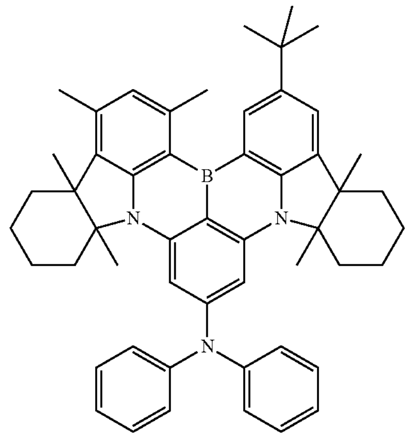
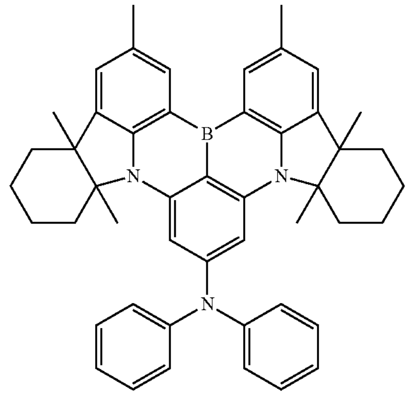
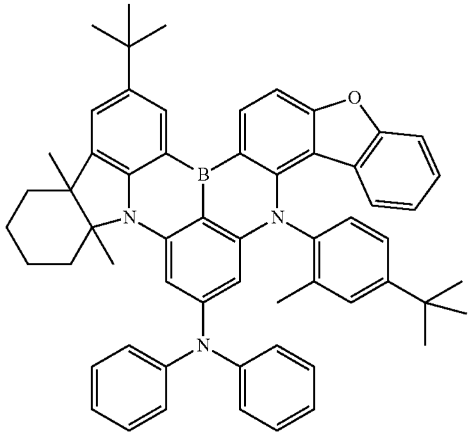
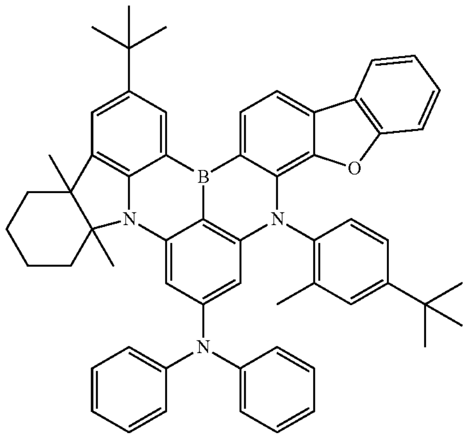

-continued
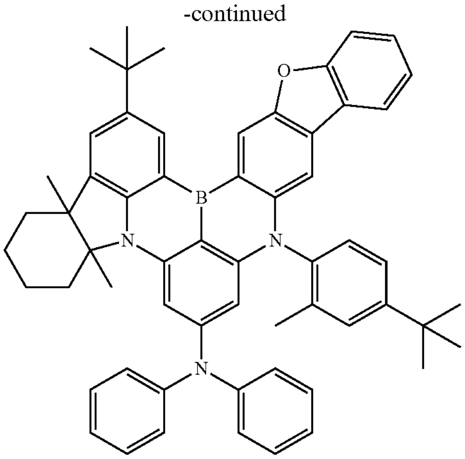
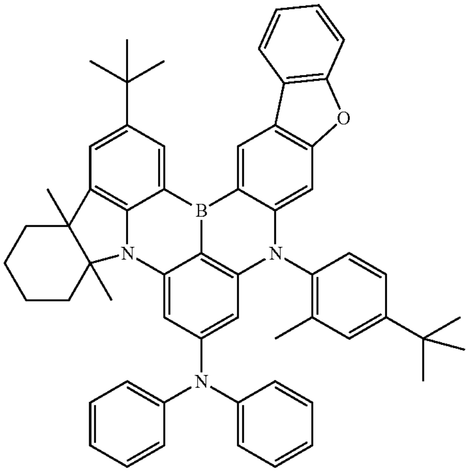
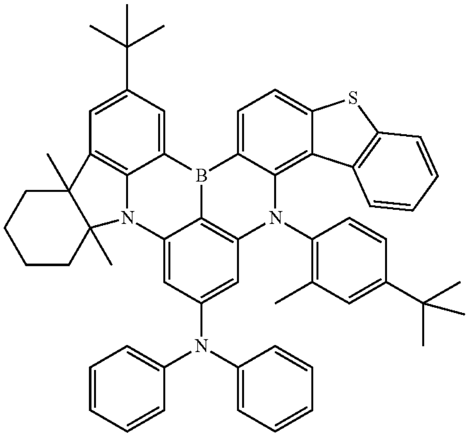
-continued
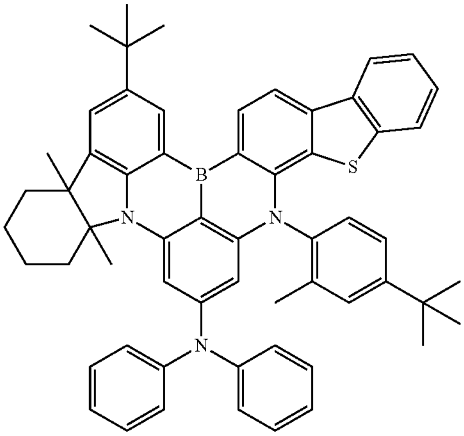
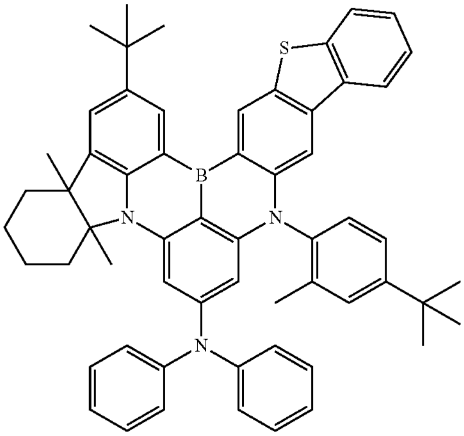
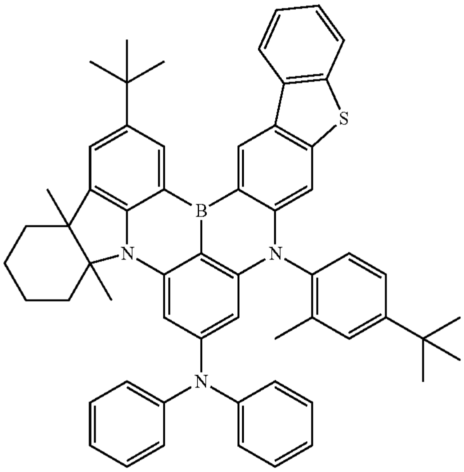

-continued
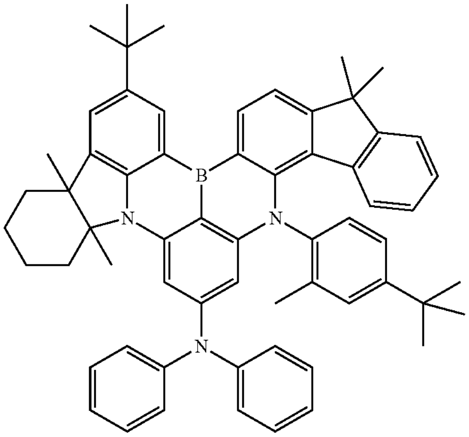
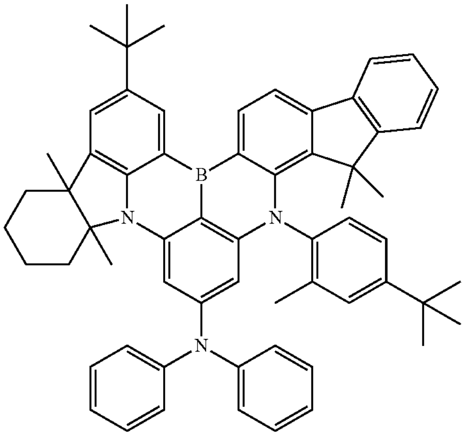
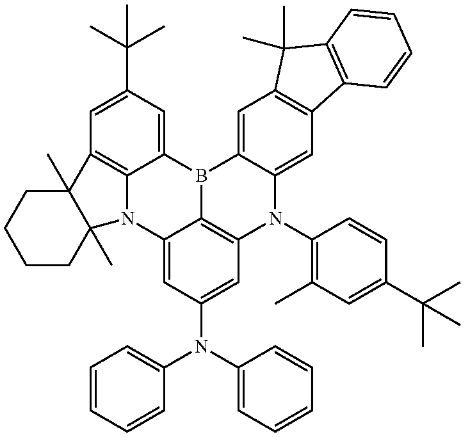
-continued
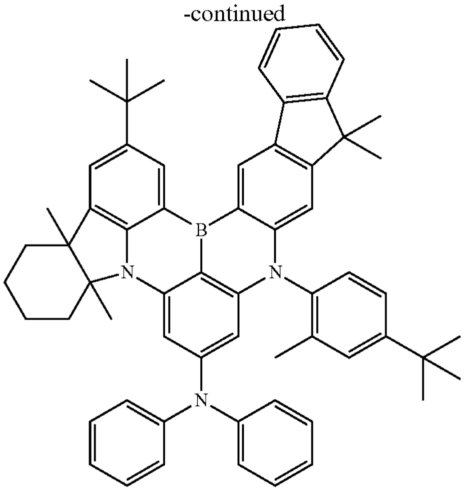
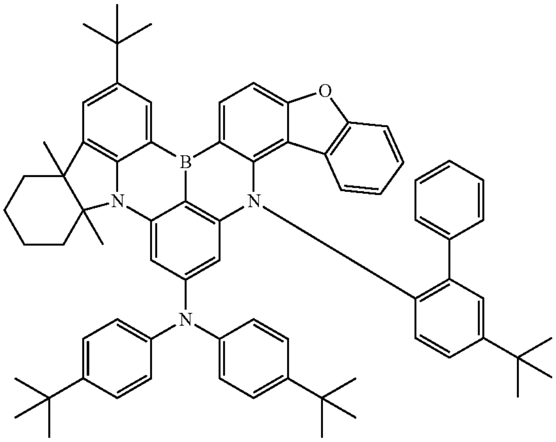
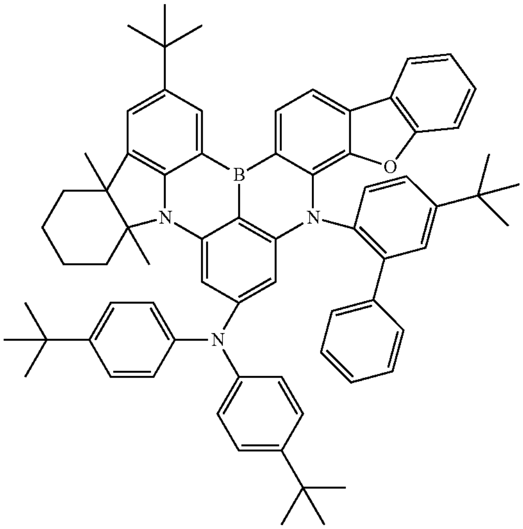

-continued
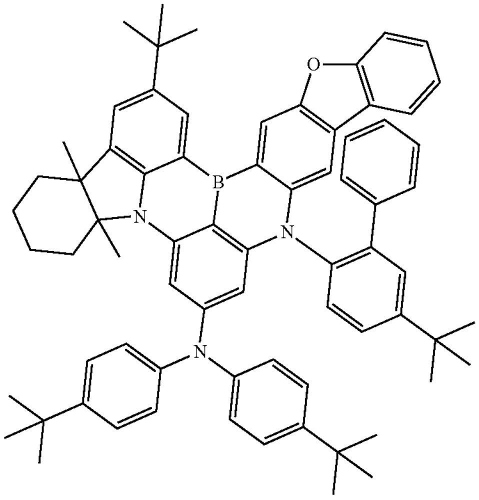
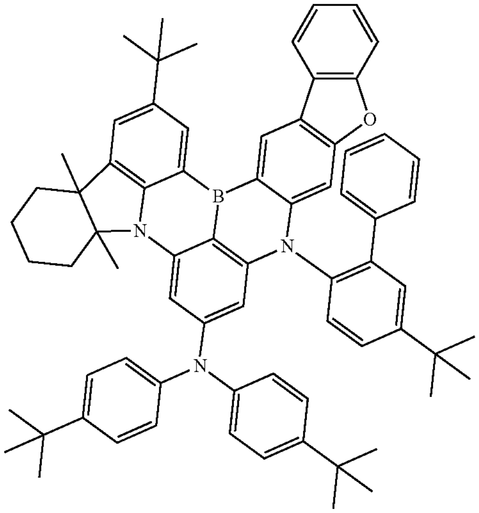
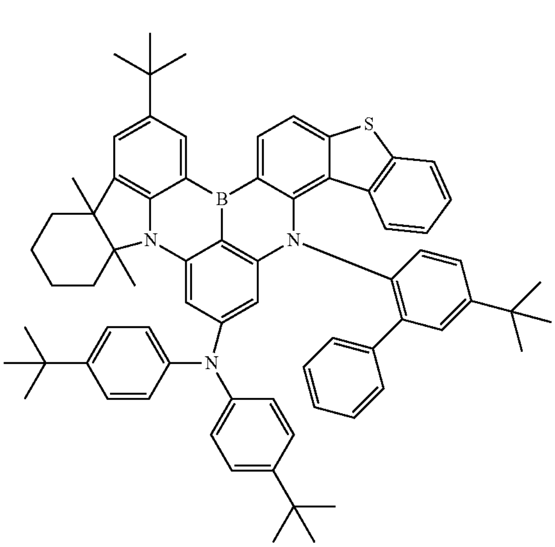
-continued
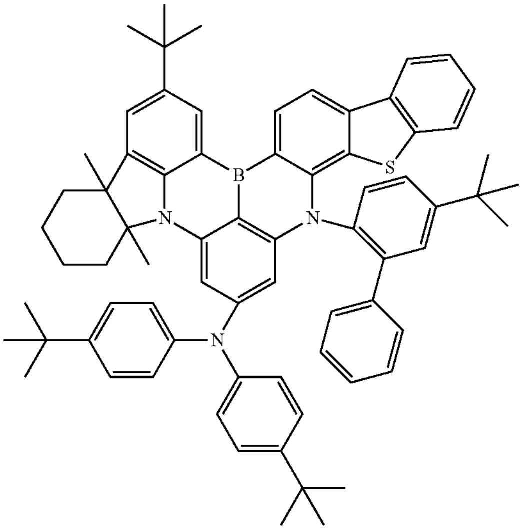
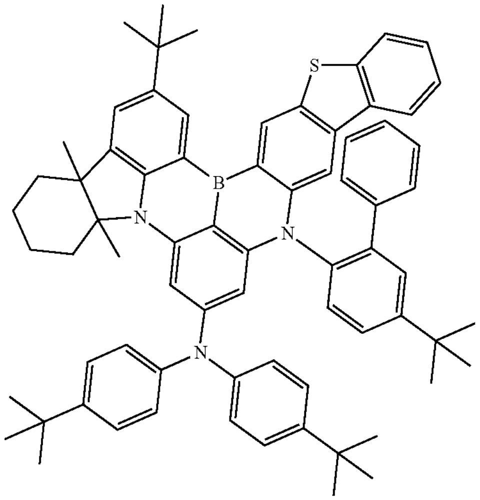
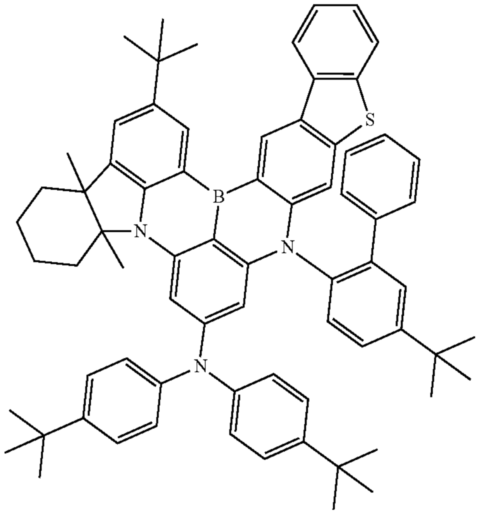

-continued
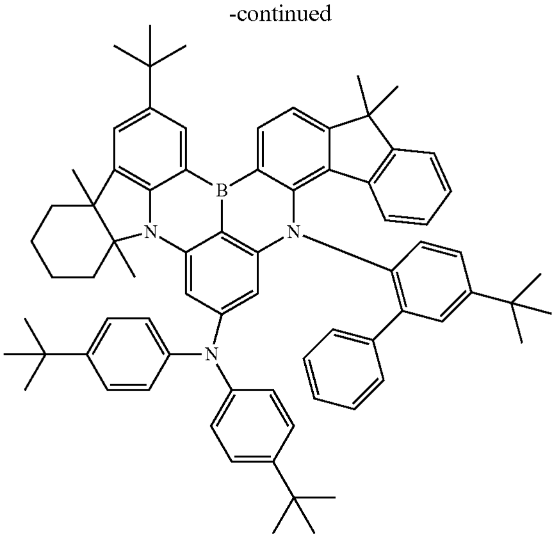
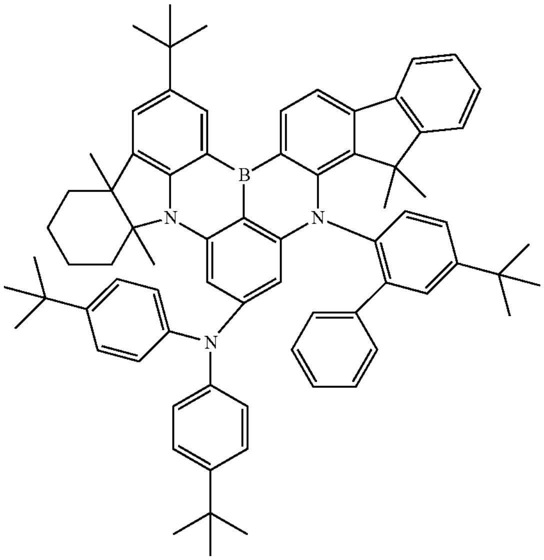
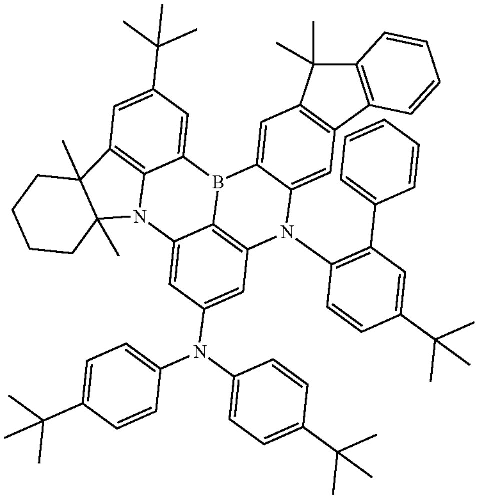
-continued
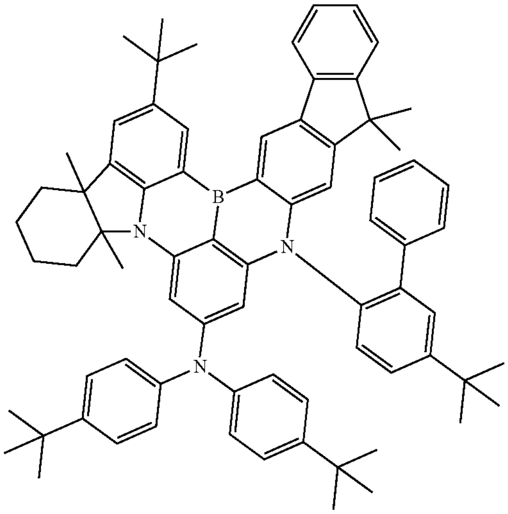
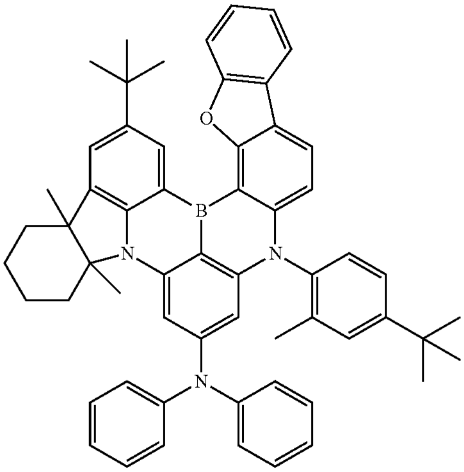
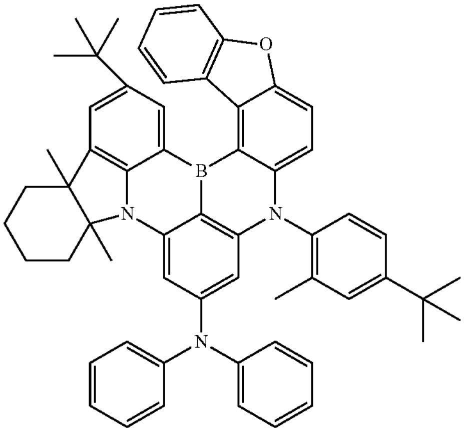

-continued
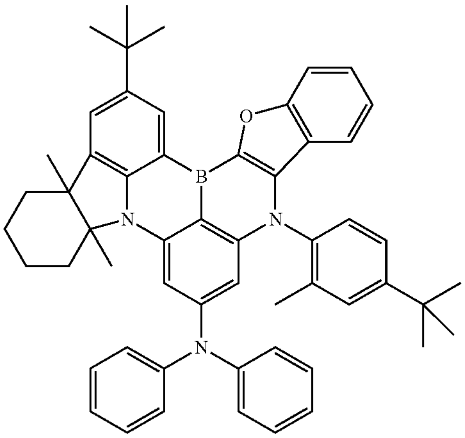
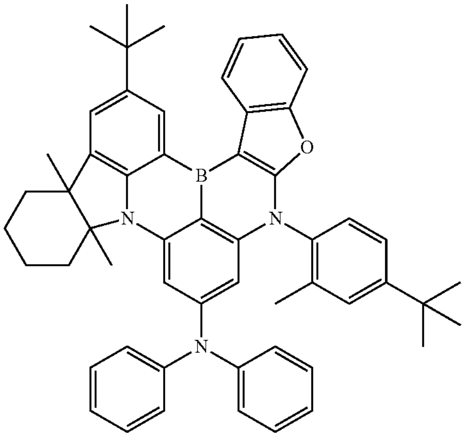
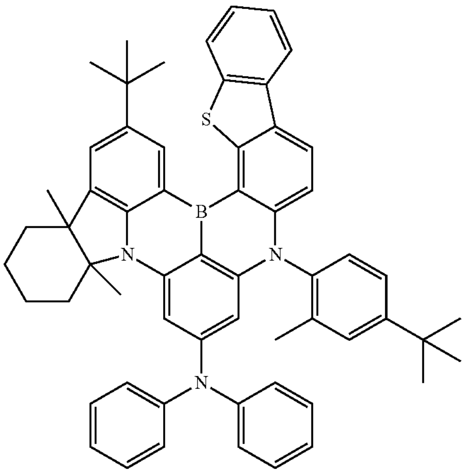
-continued
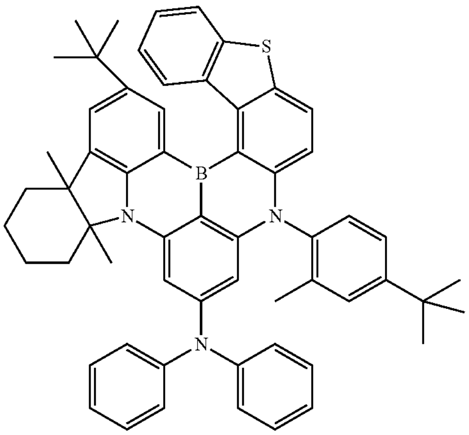
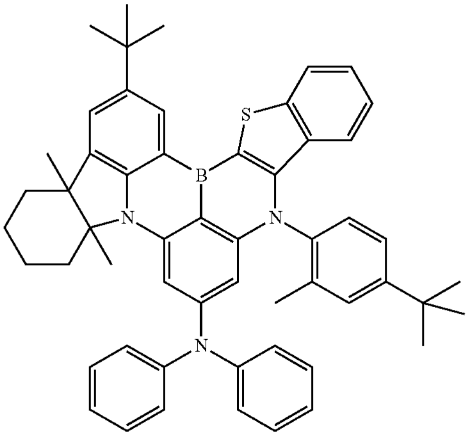
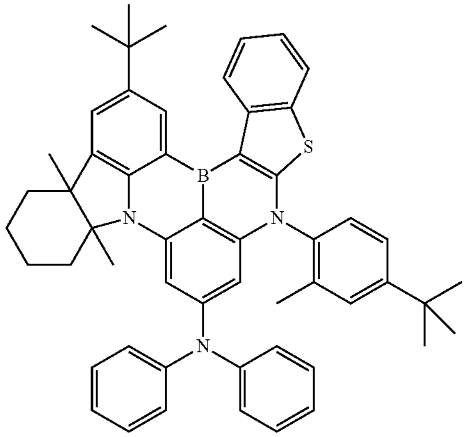

-continued
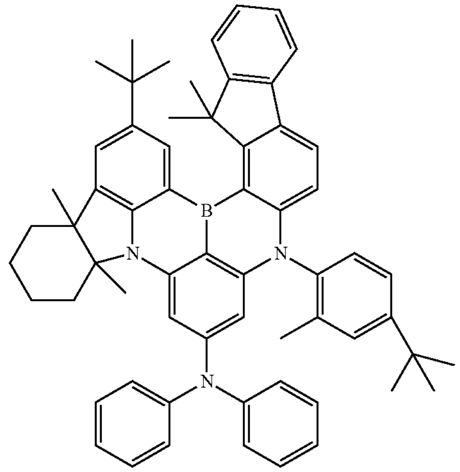
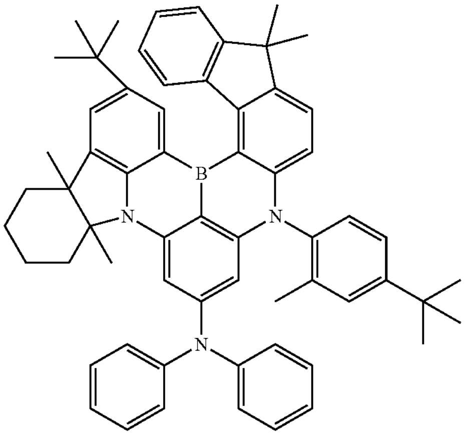
-continued
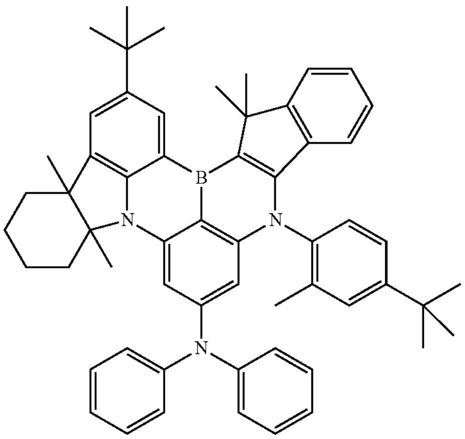
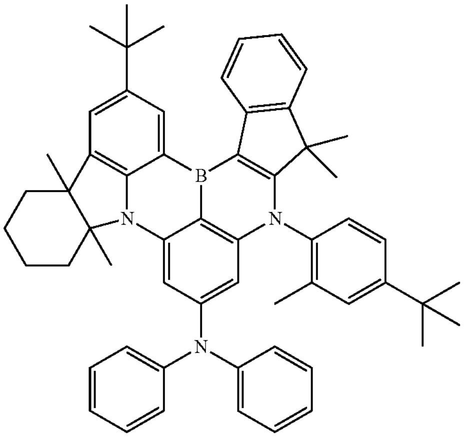
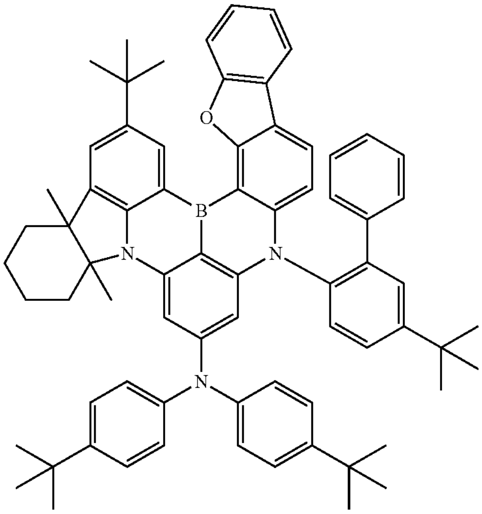
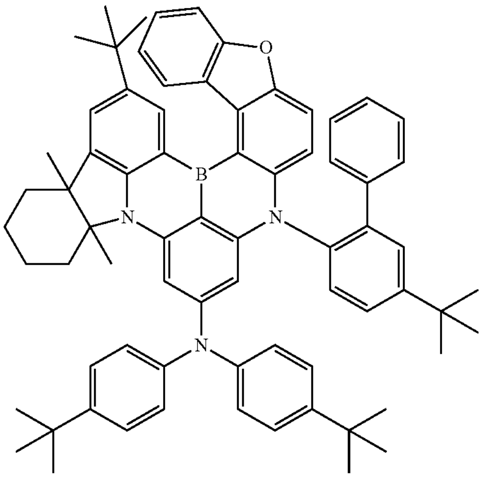

-continued
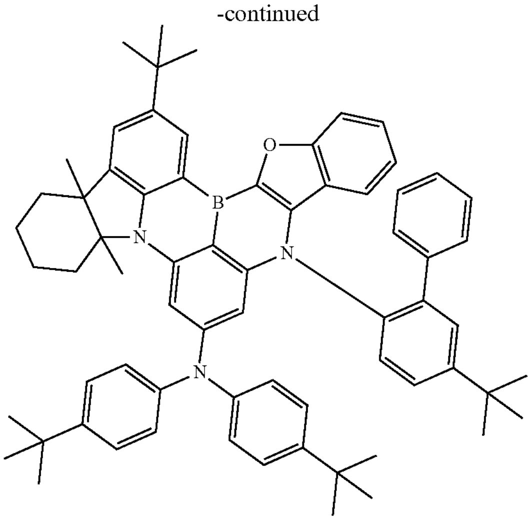
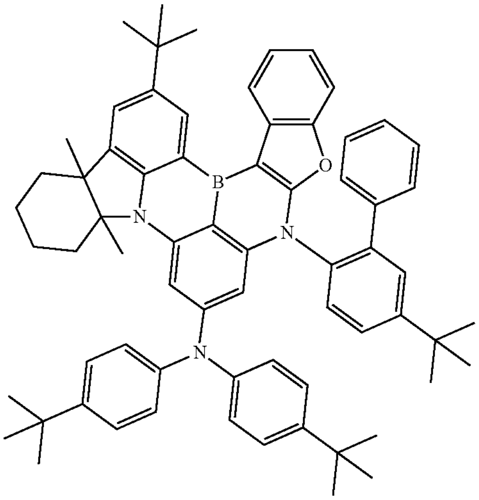
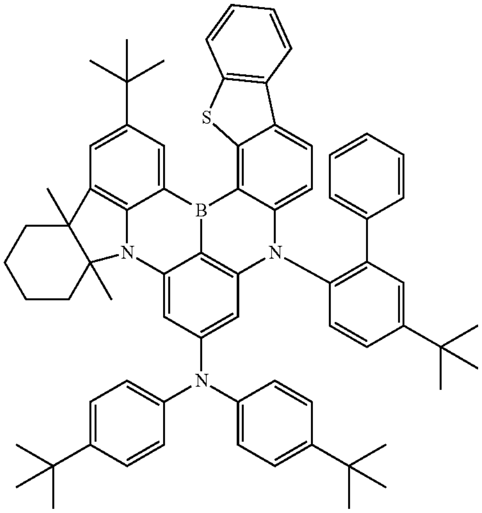
-continued
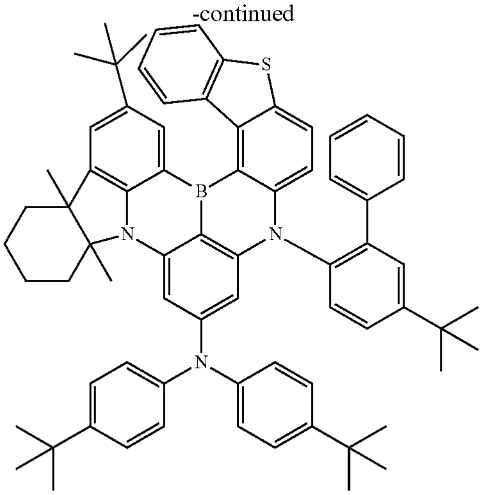
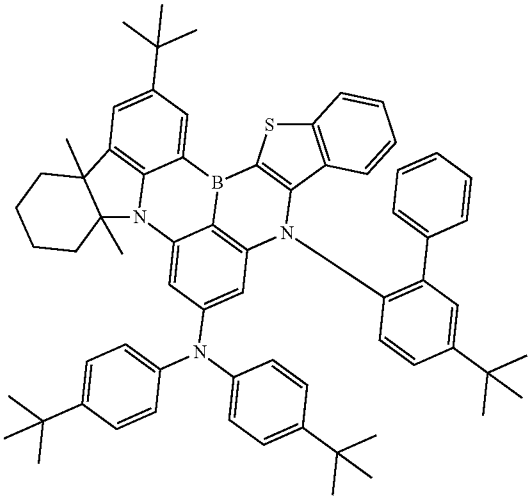
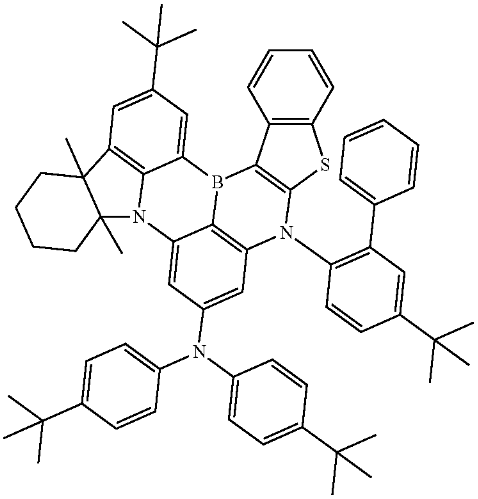

-continued
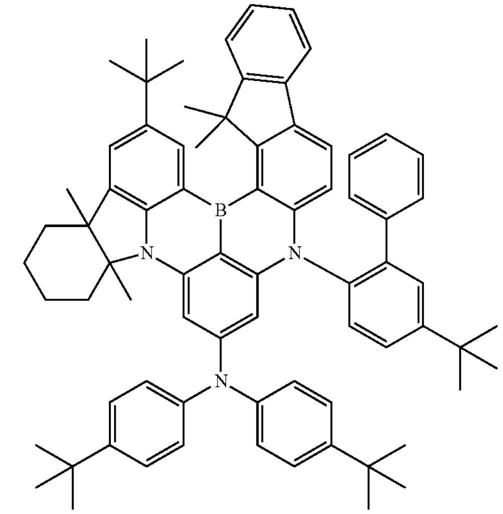
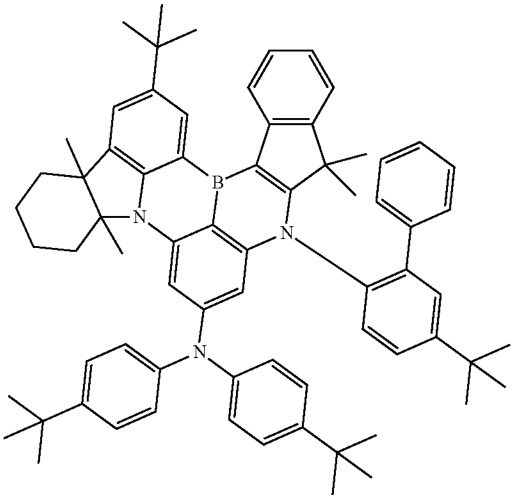
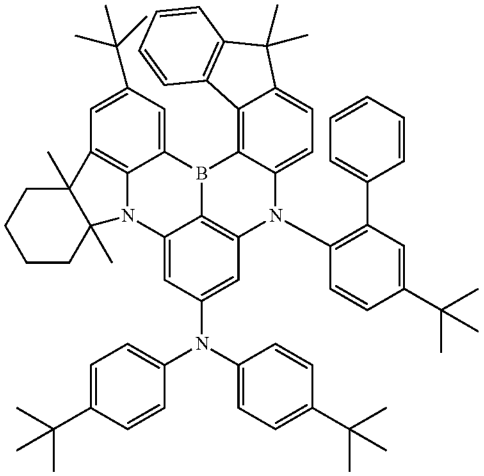
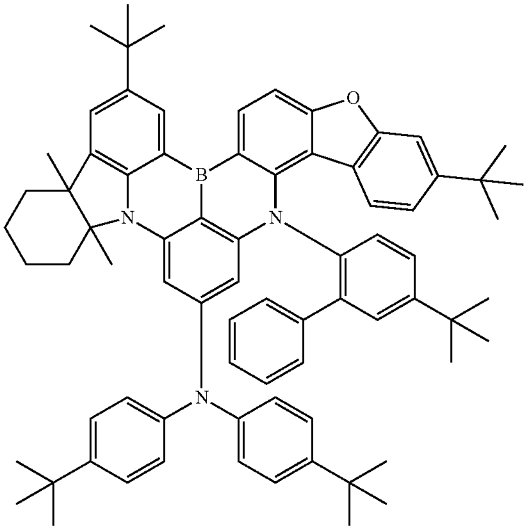
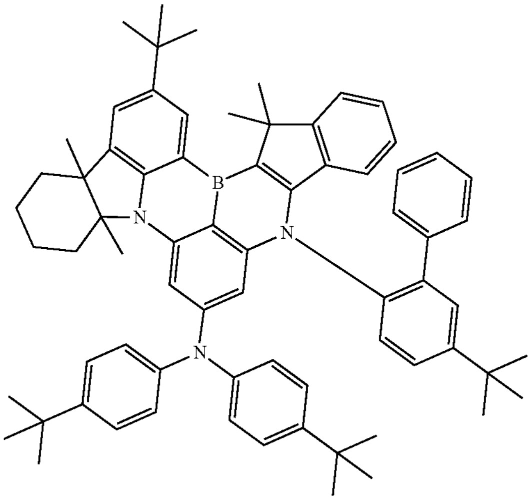
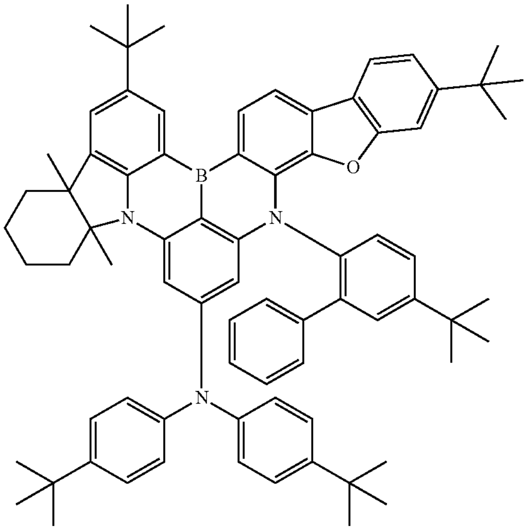

-continued
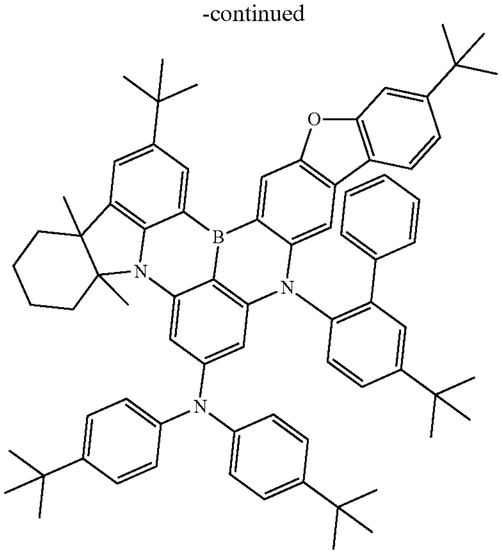
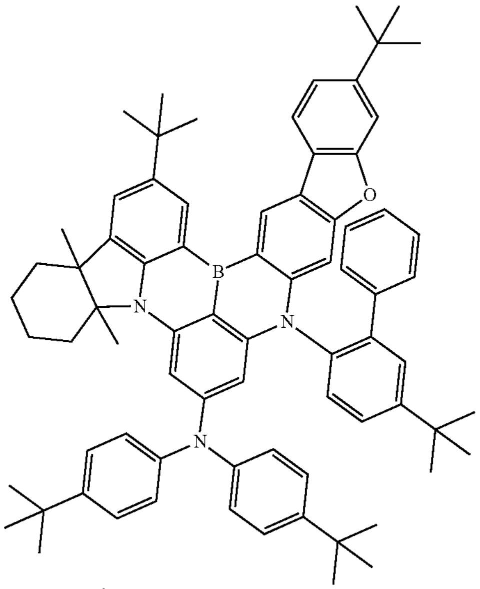
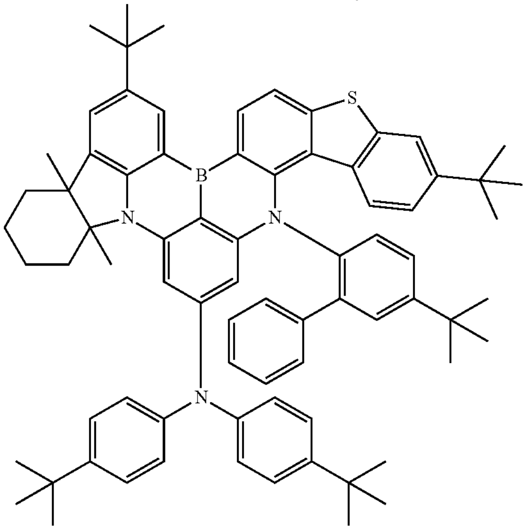
-continued
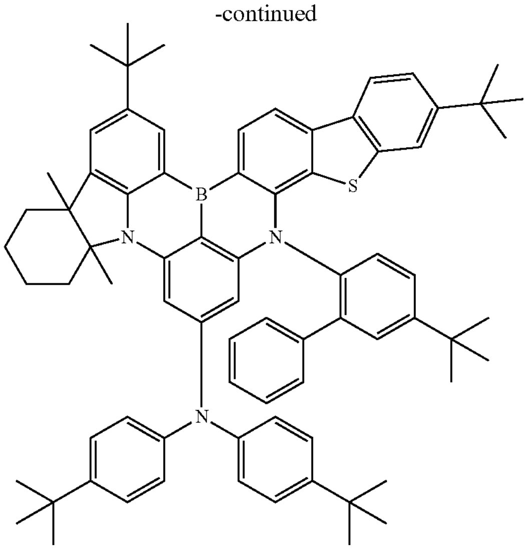
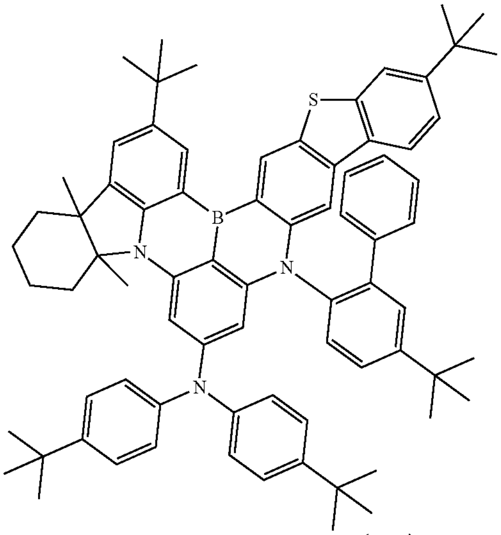
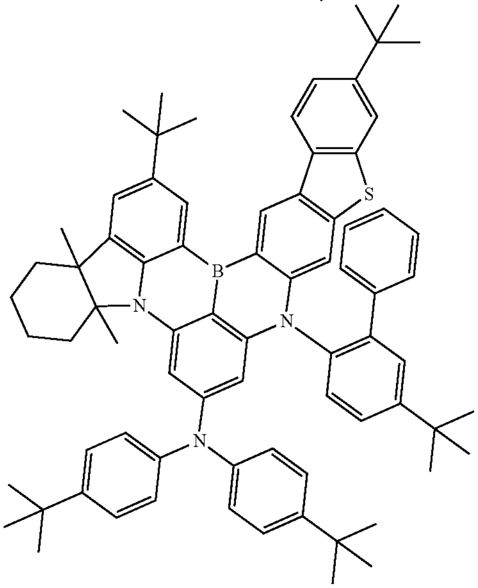

-continued
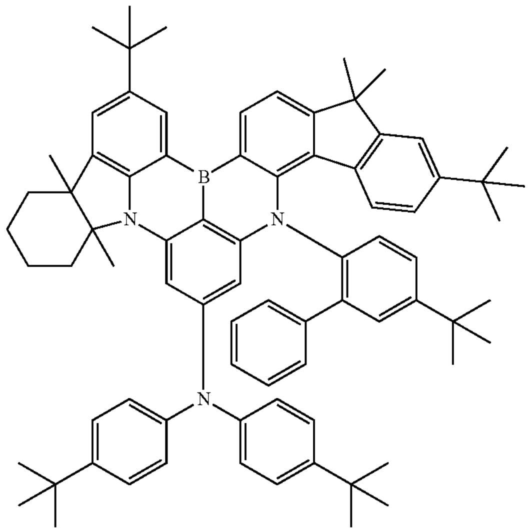
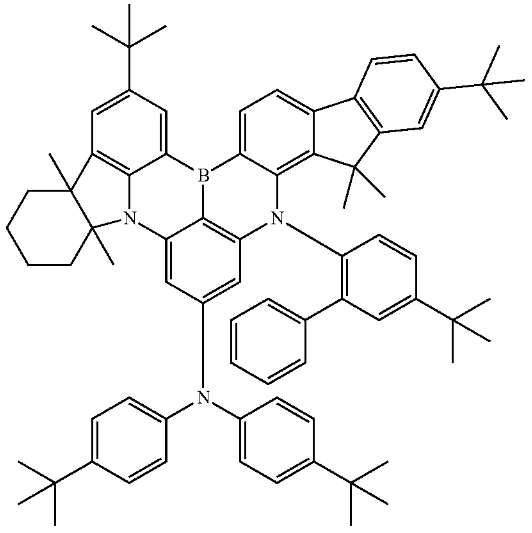
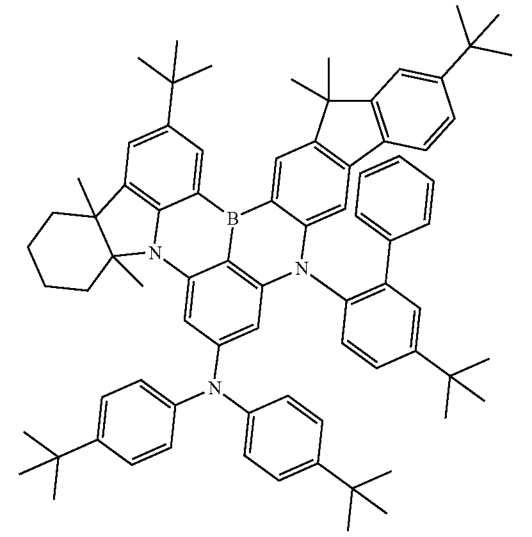
-continued
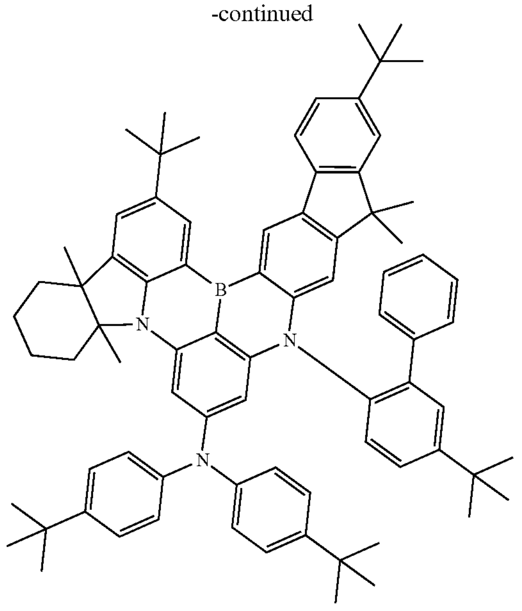
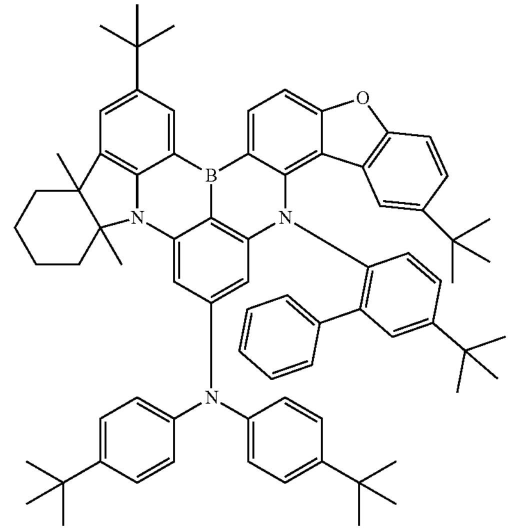
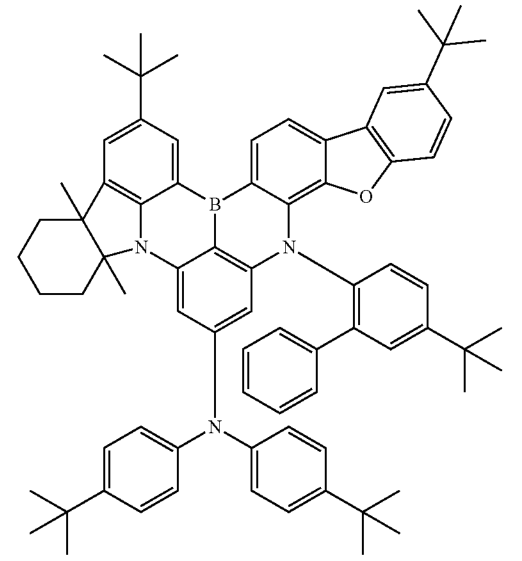

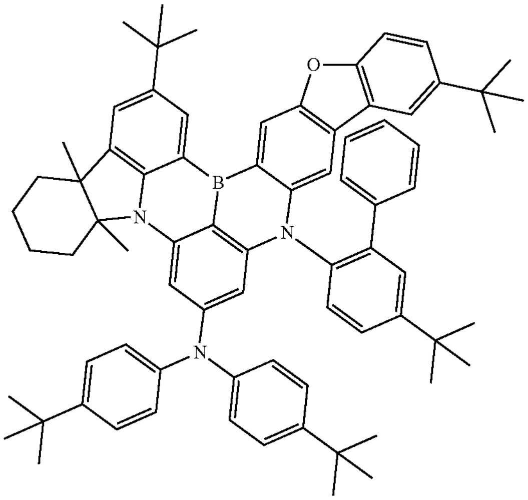
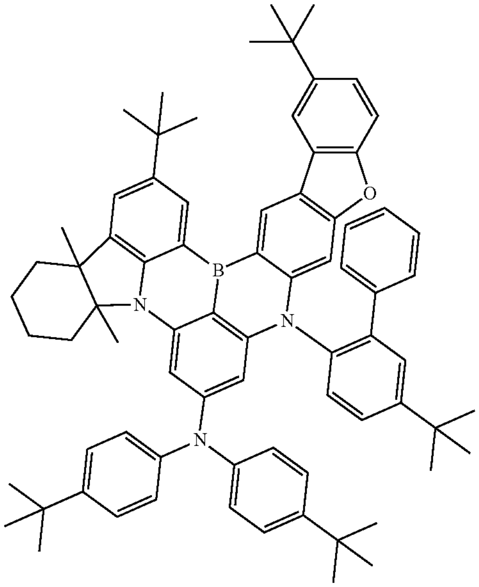
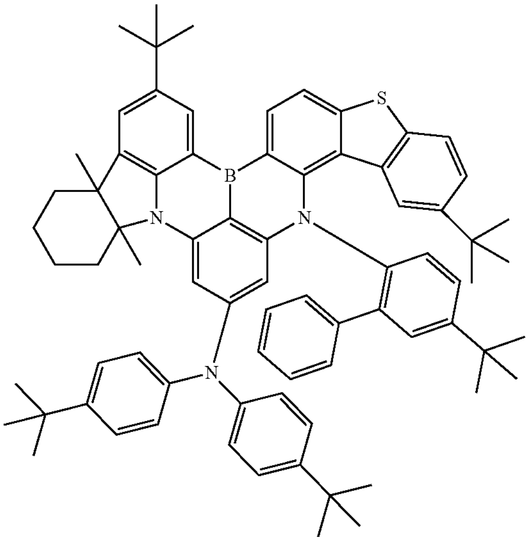
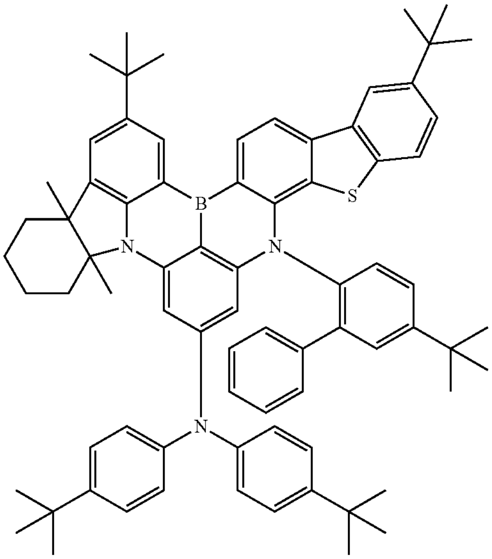
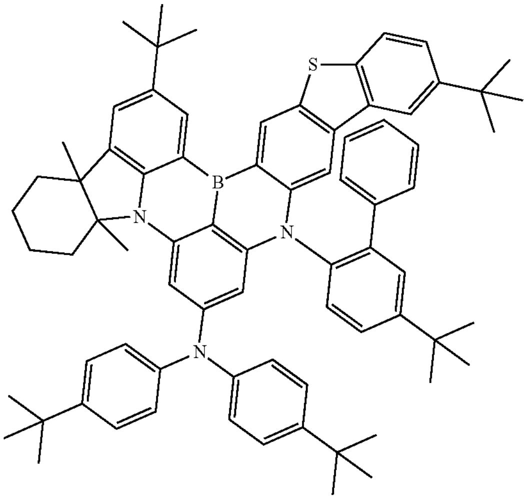
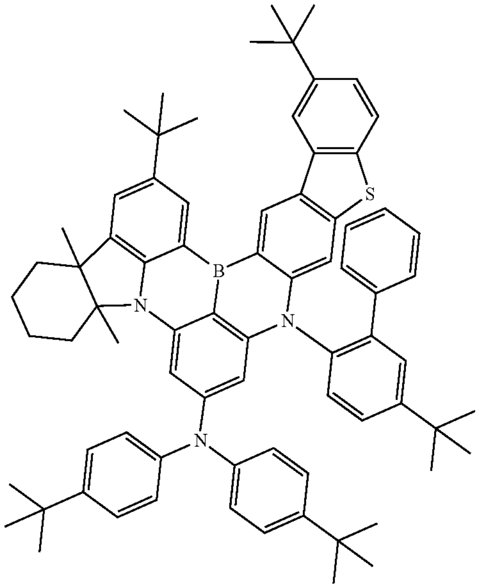

-continued
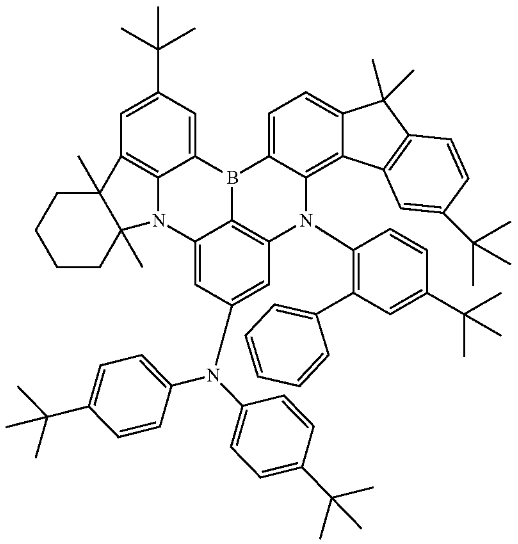
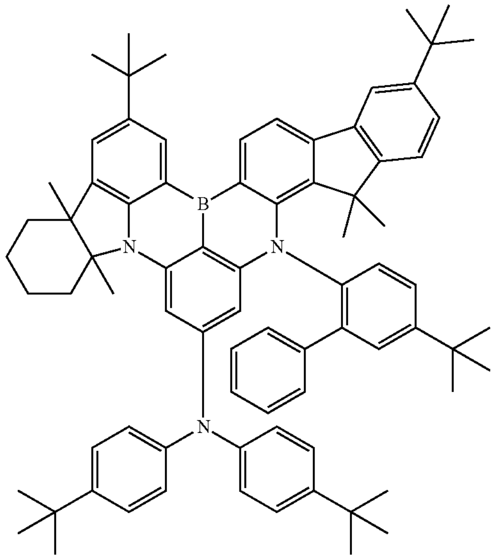
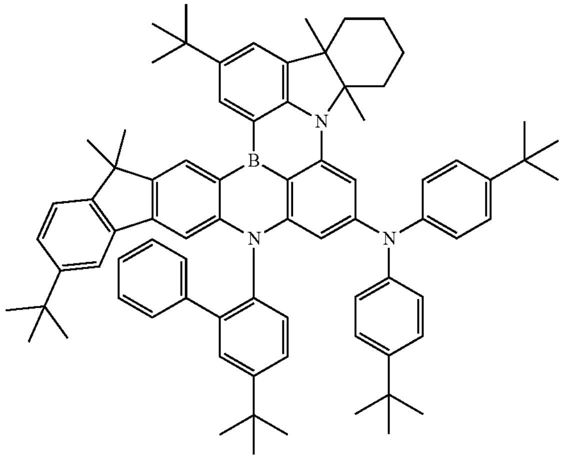
-continued
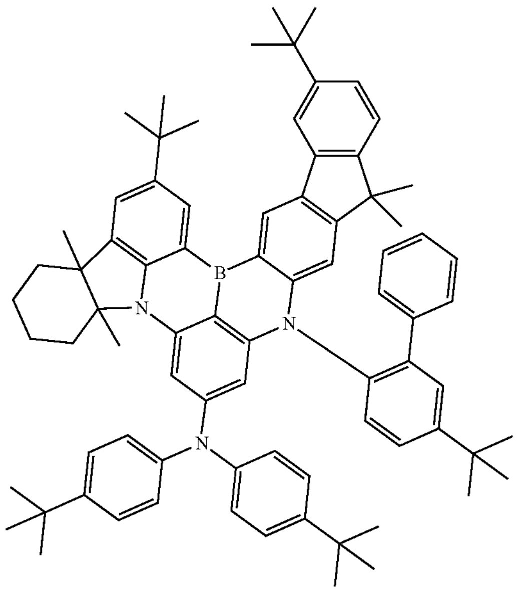
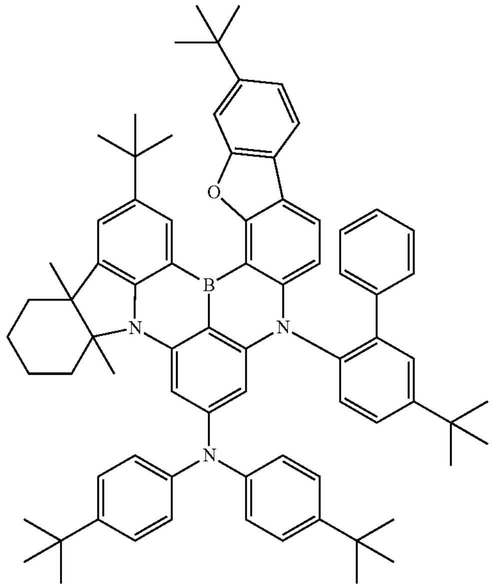

-continued
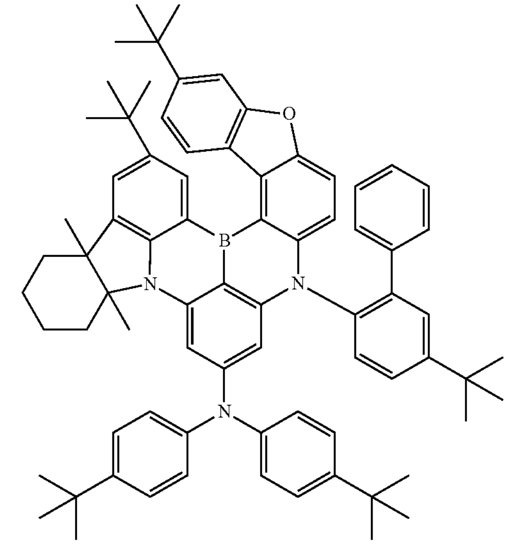
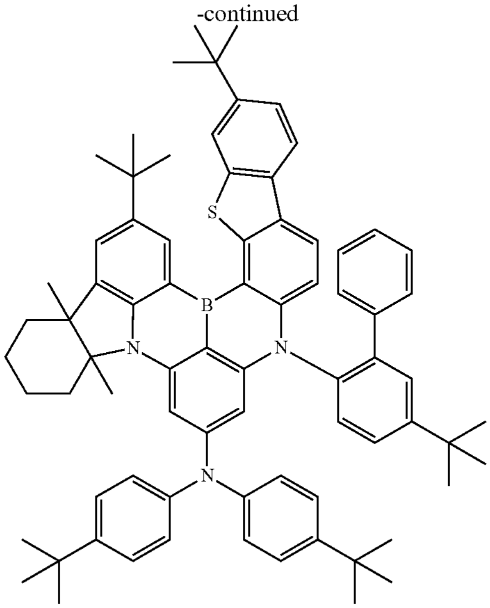
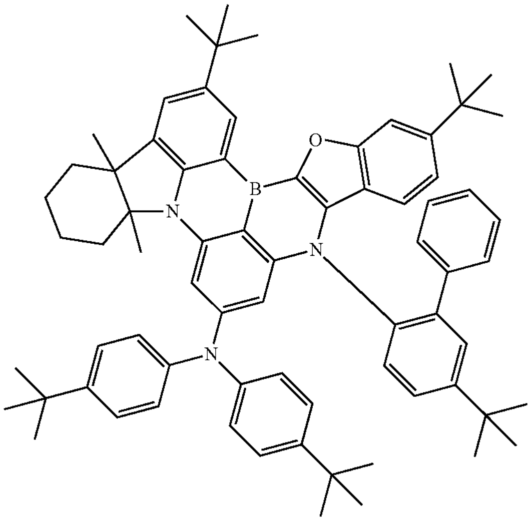
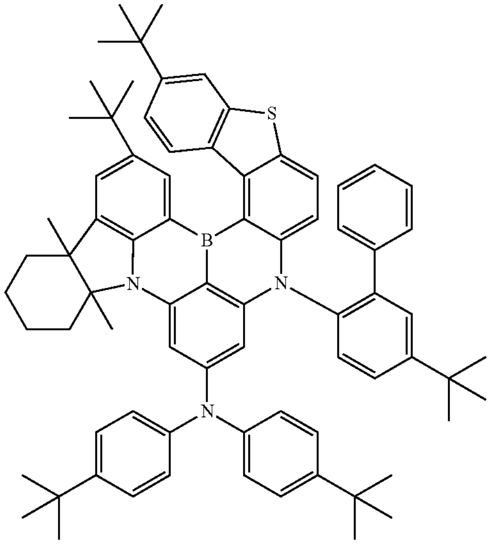
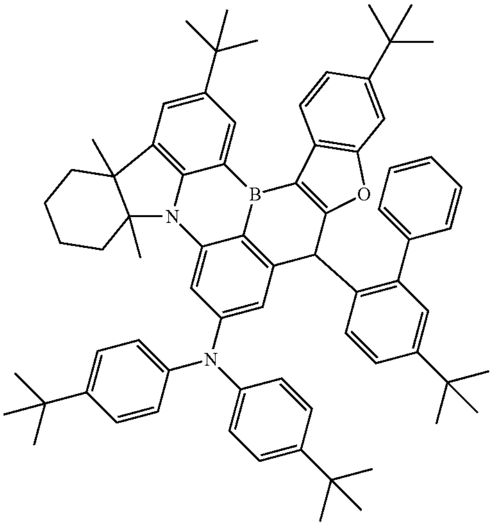
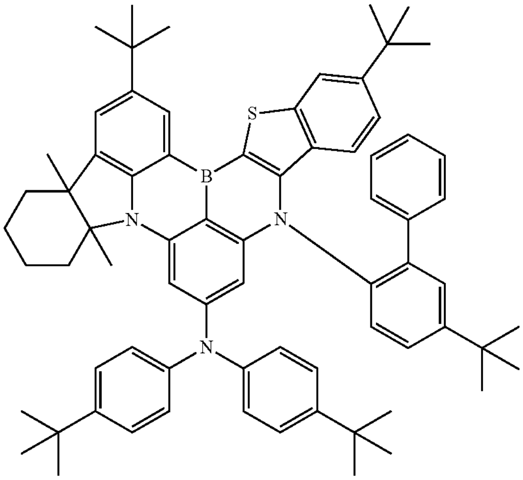

-continued
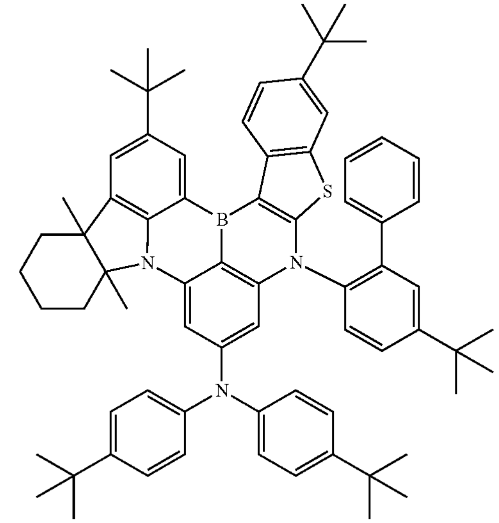
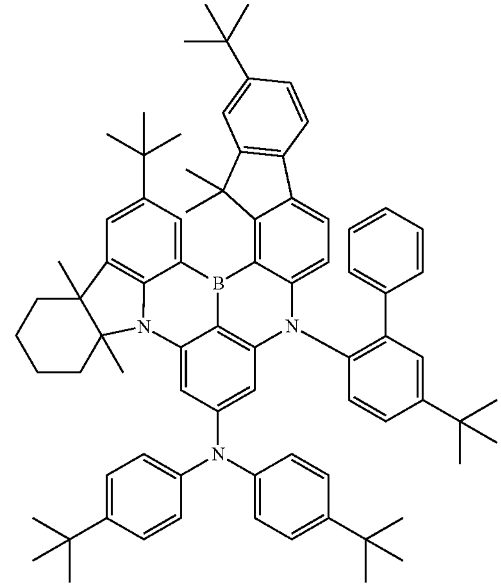
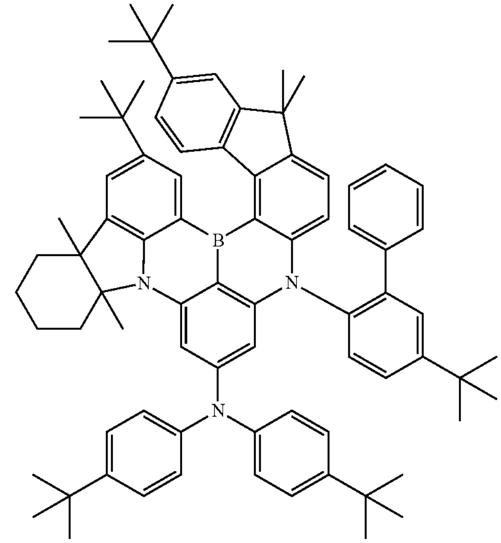
-continued
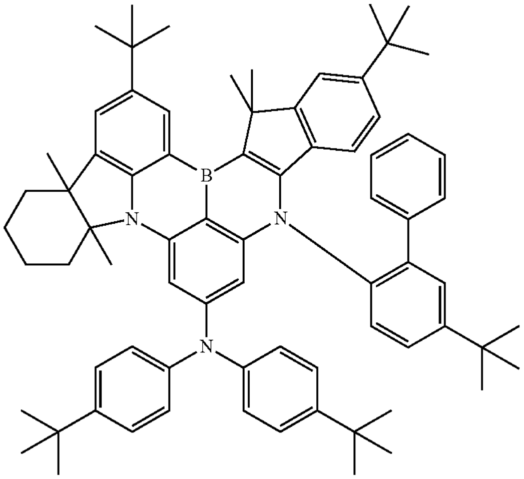
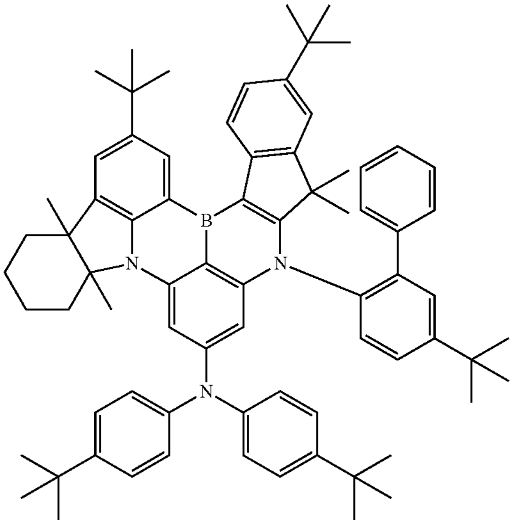
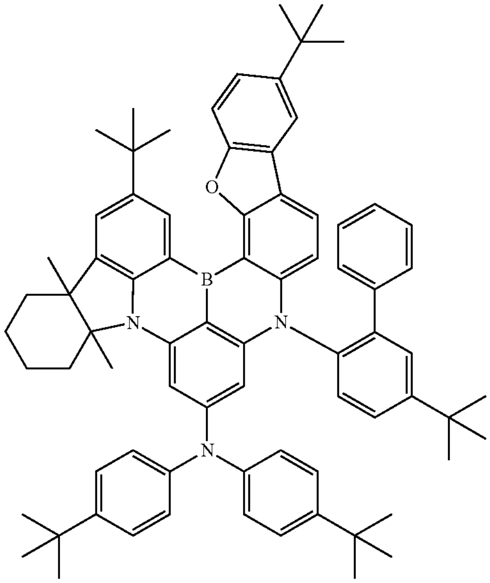

-continued
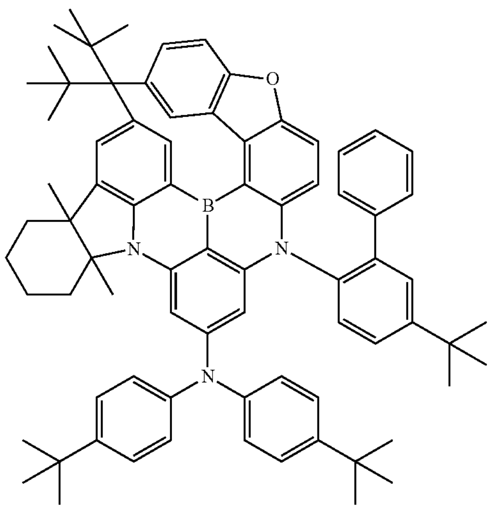
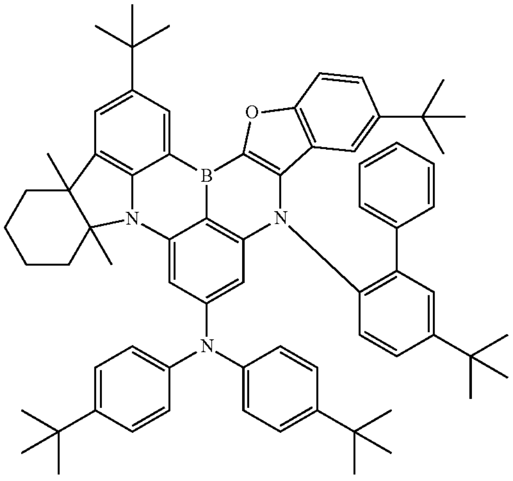
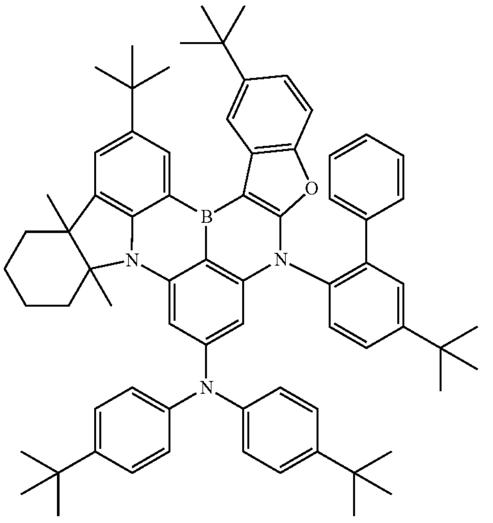
-continued
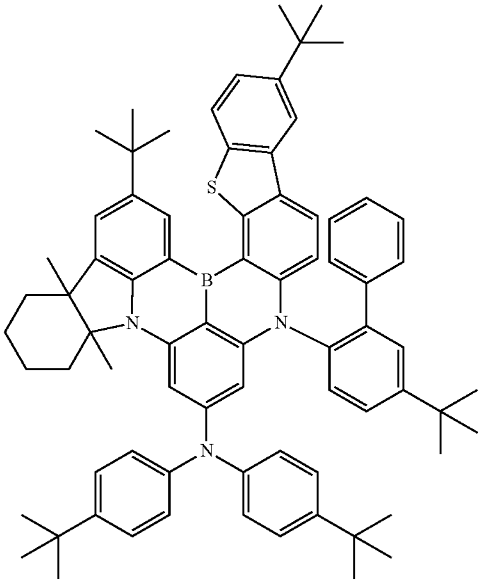
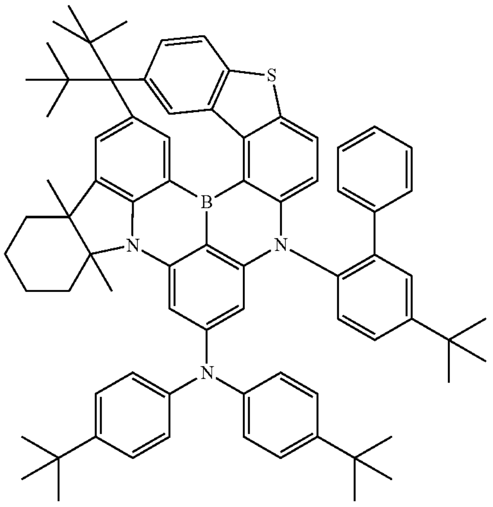
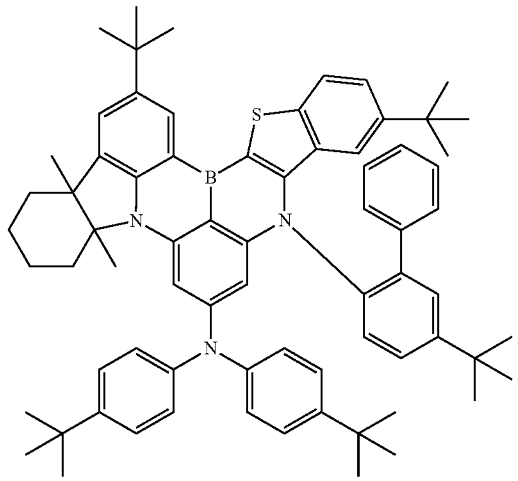

-continued
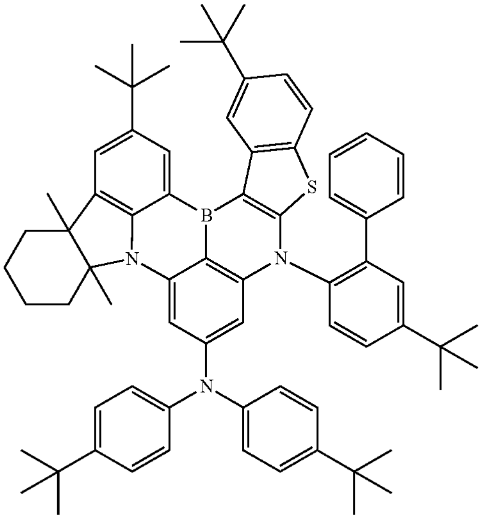
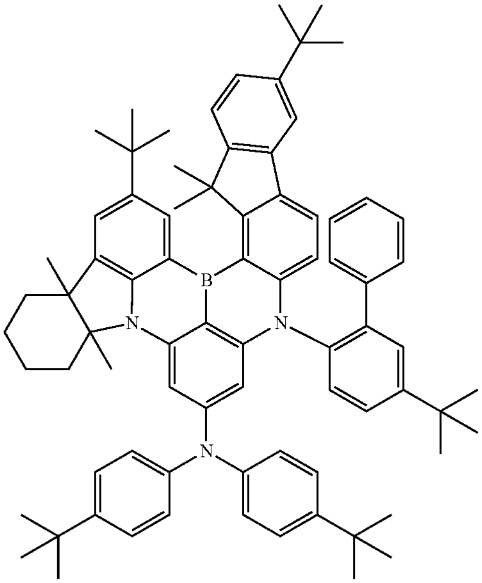
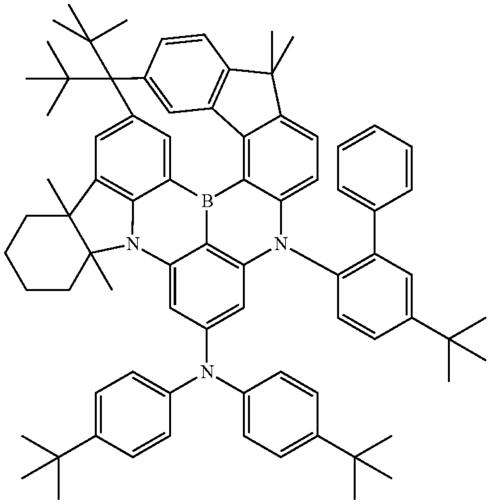
-continued
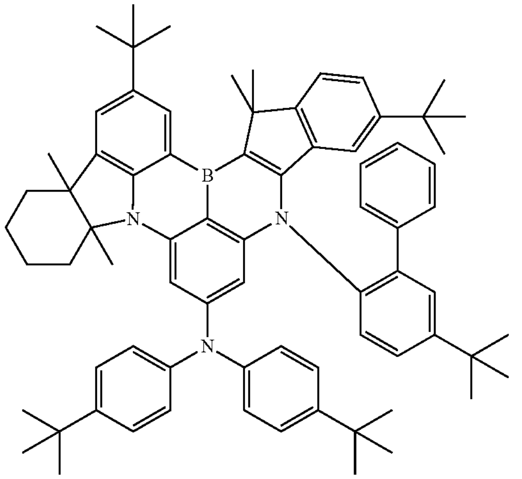
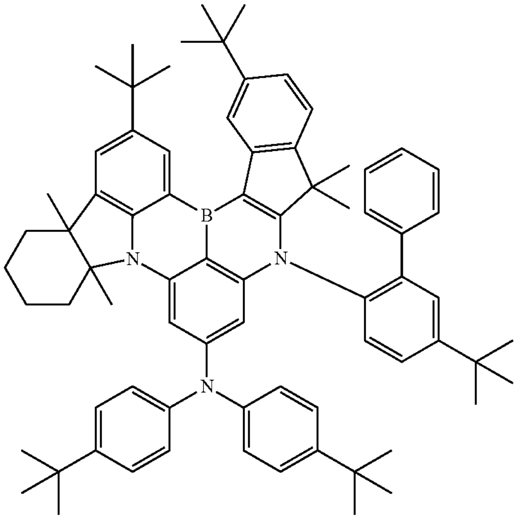
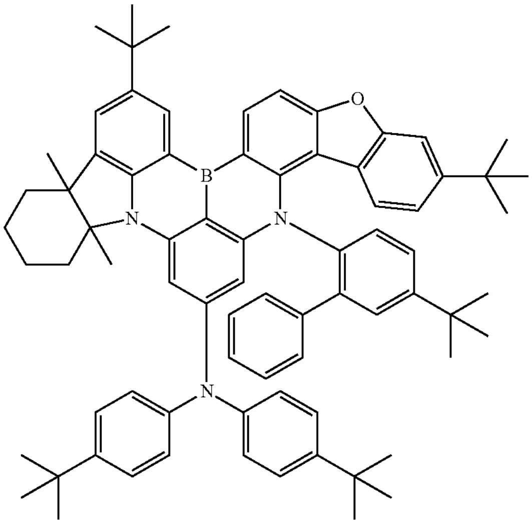

-continued
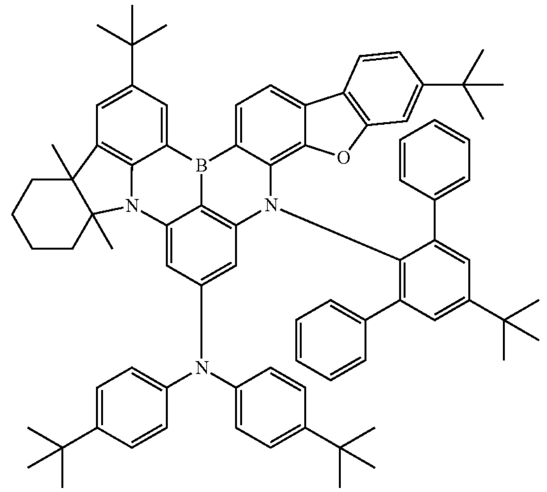
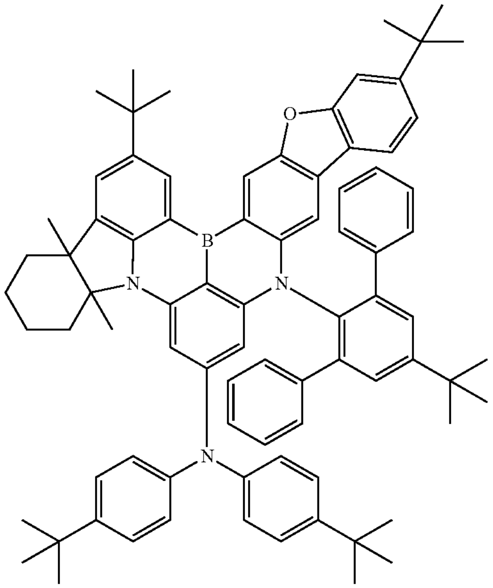
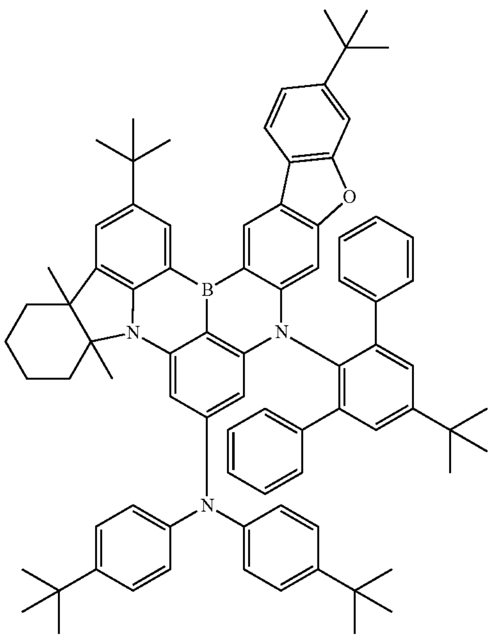
-continued
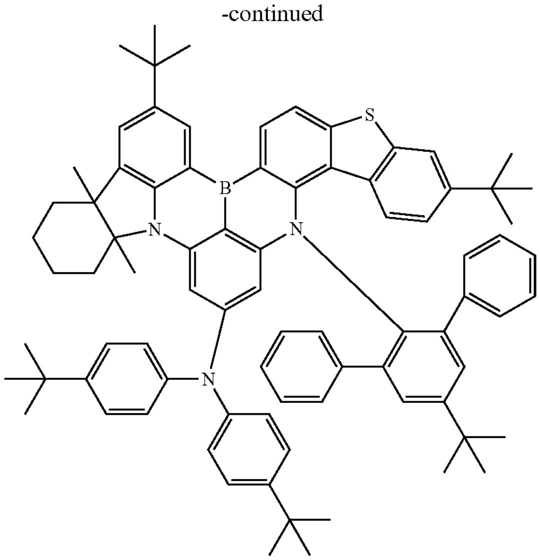
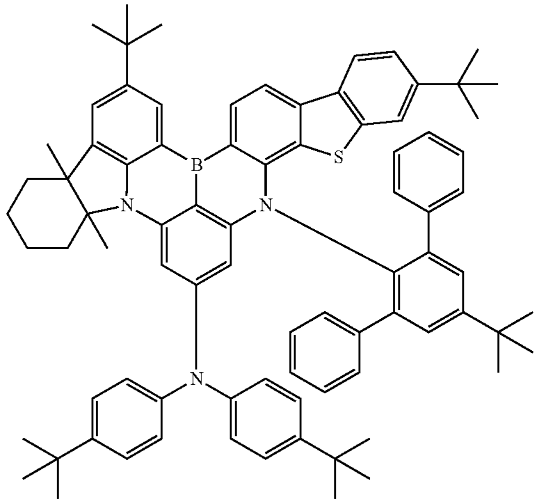
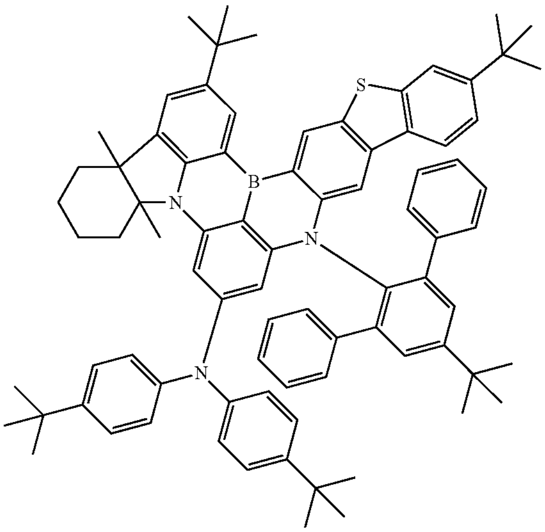

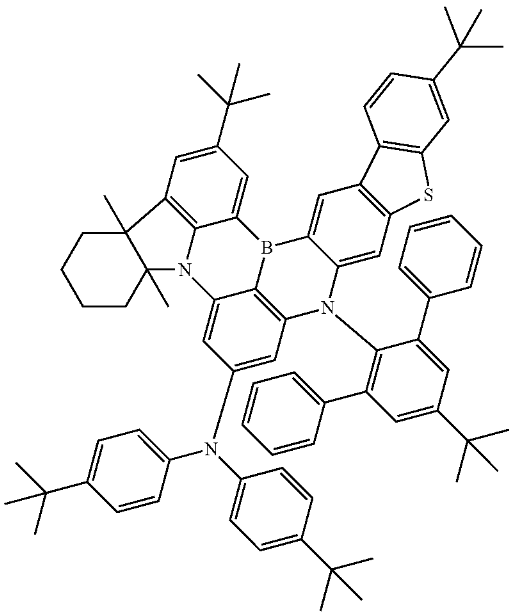
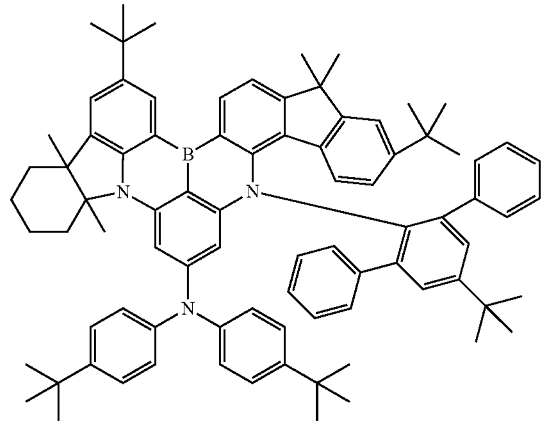
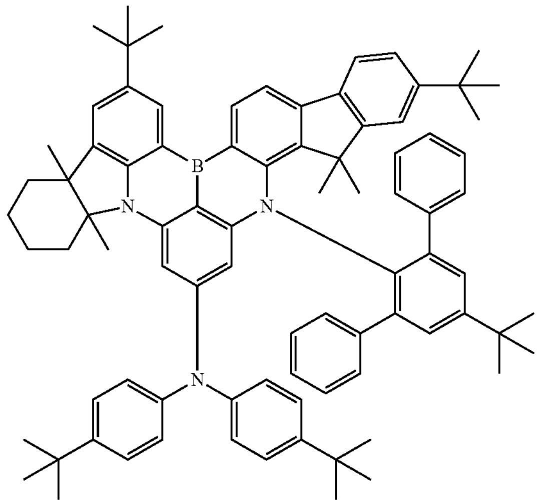
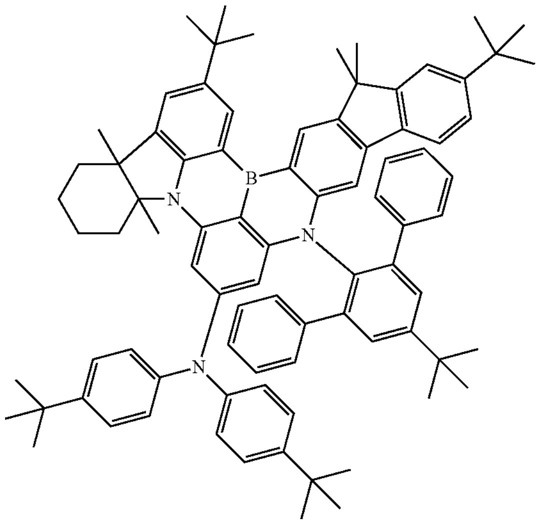
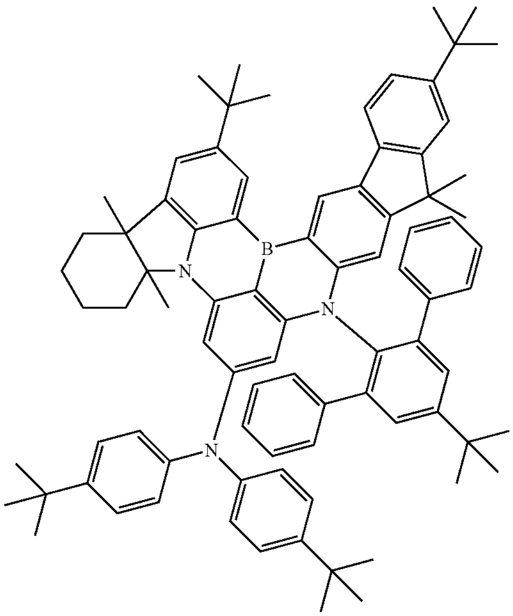

-continued
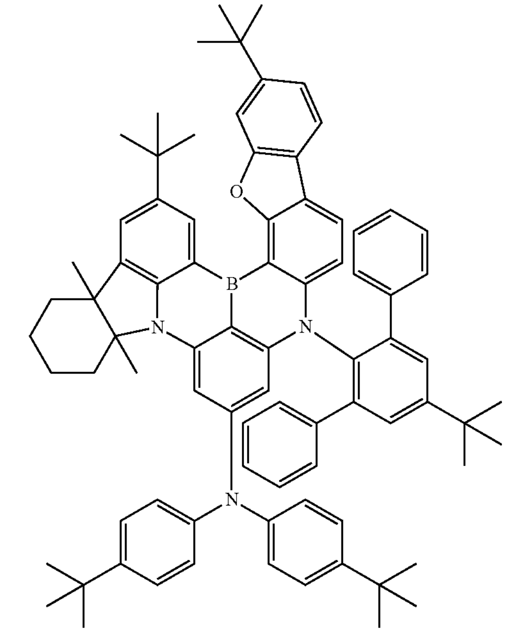
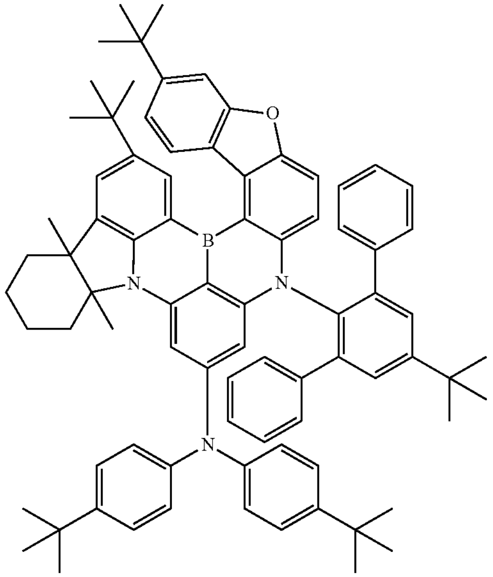
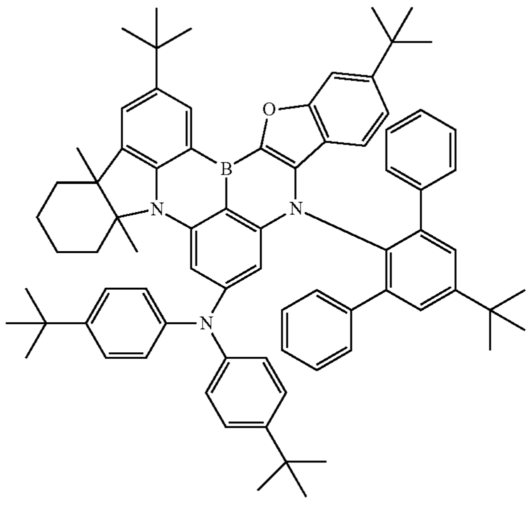
-continued
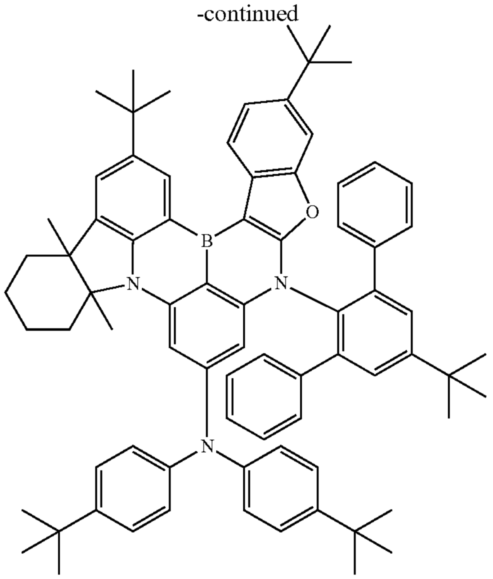
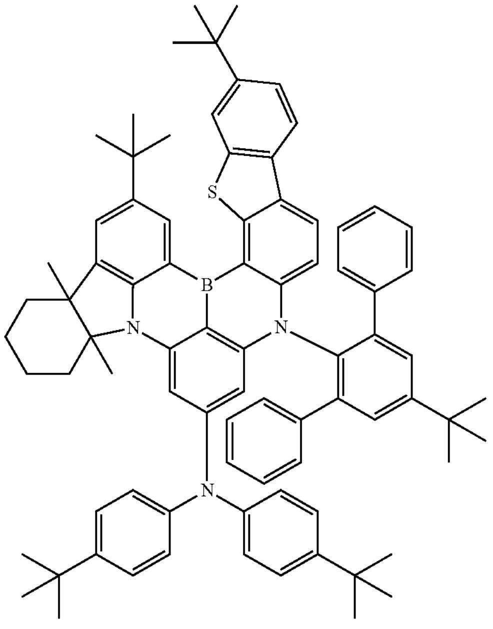

-continued
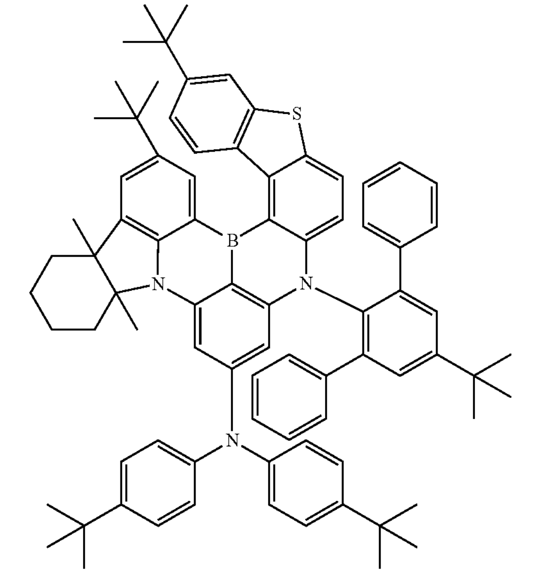
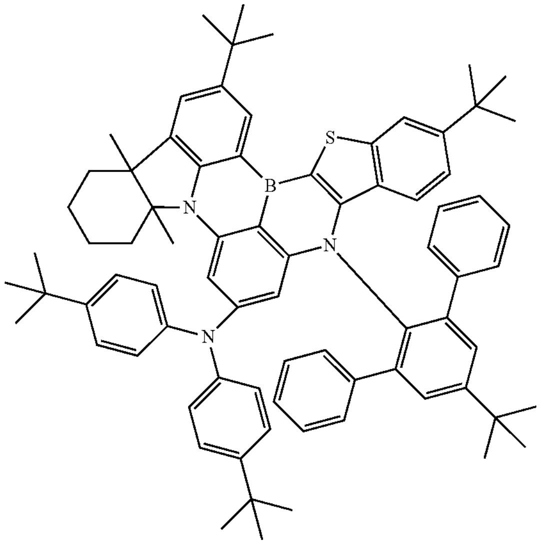
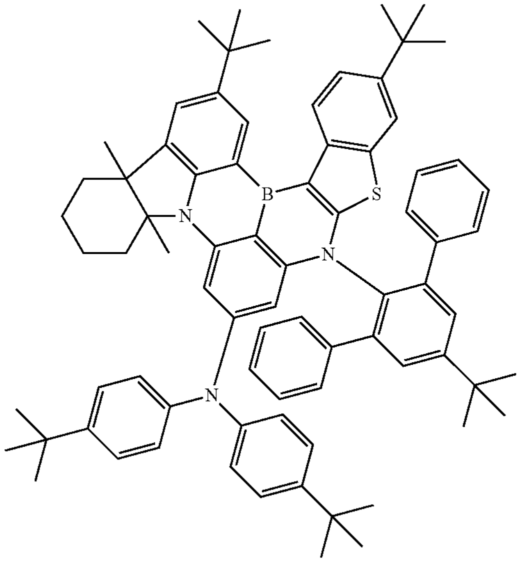
-continued
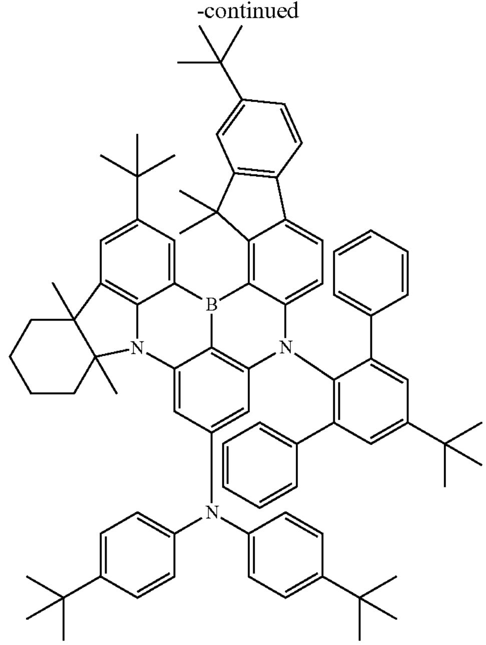
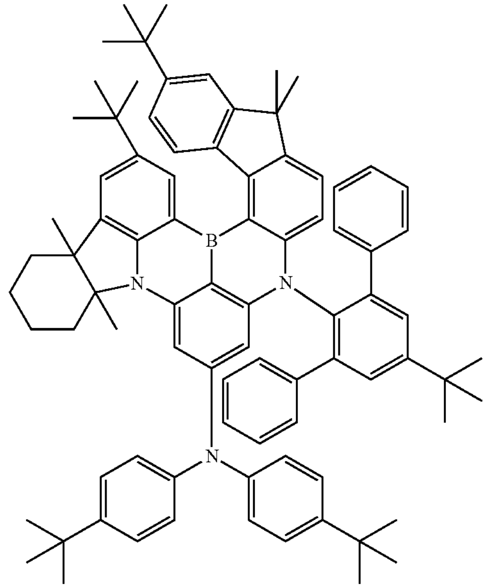

-continued
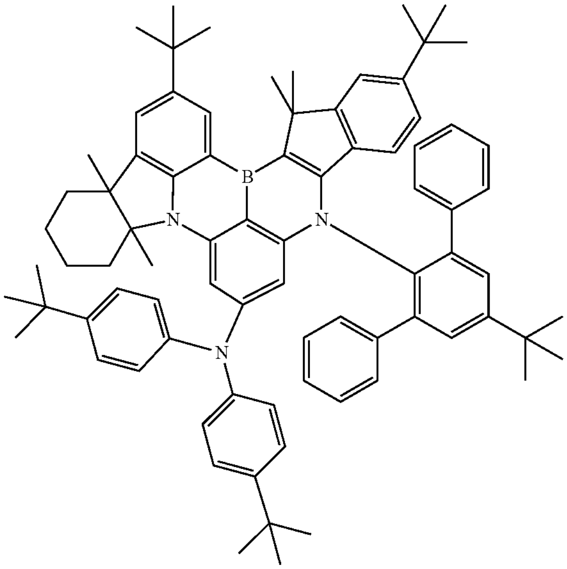
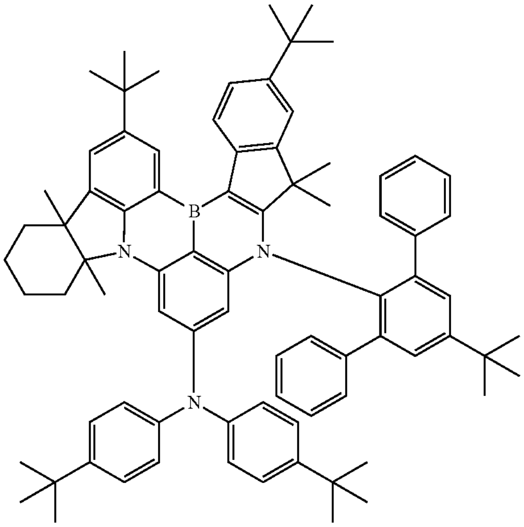
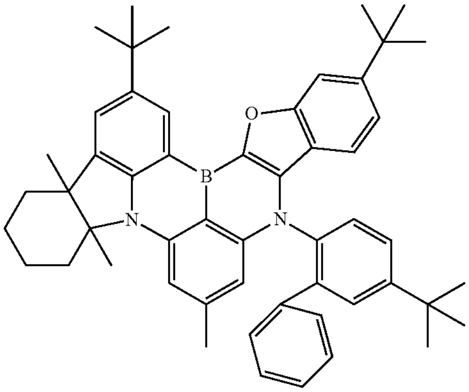
-continued
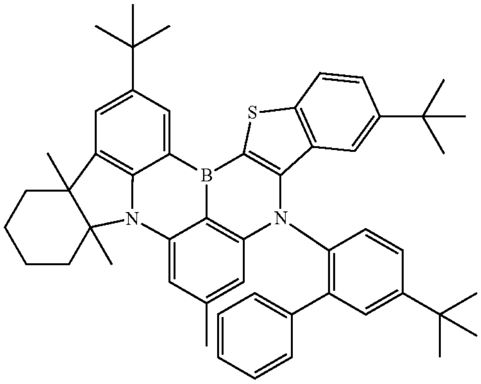
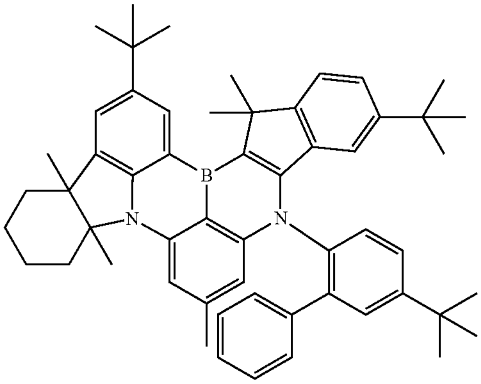
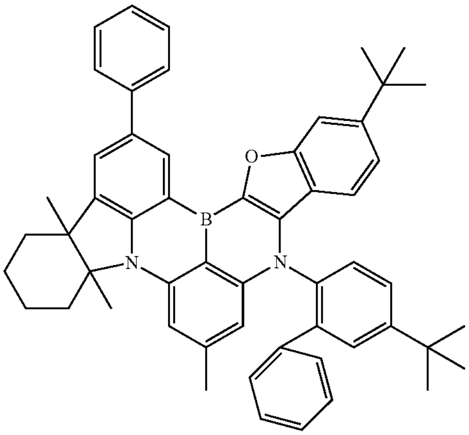
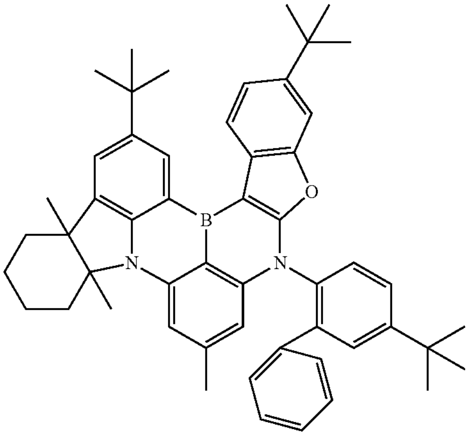

-continued
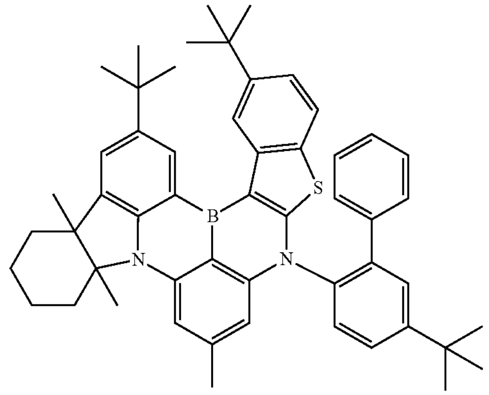
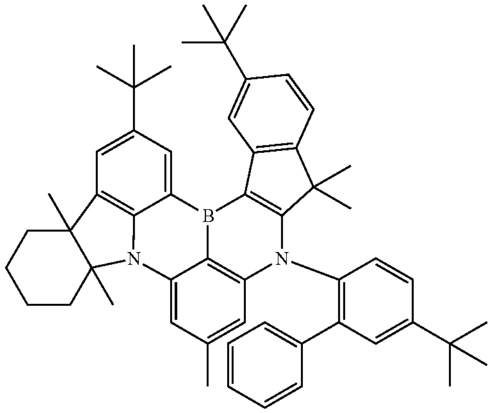
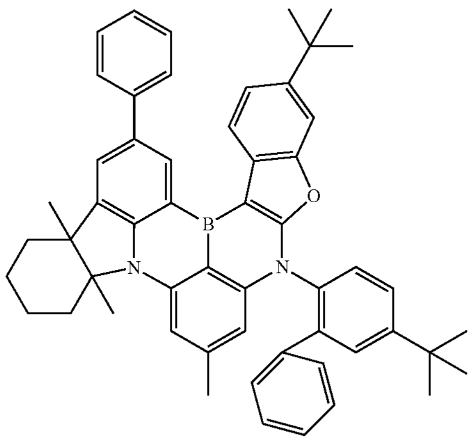
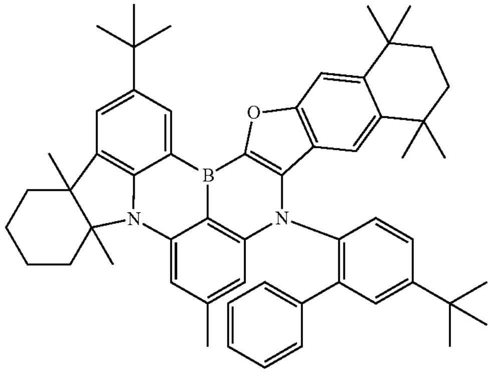
-continued
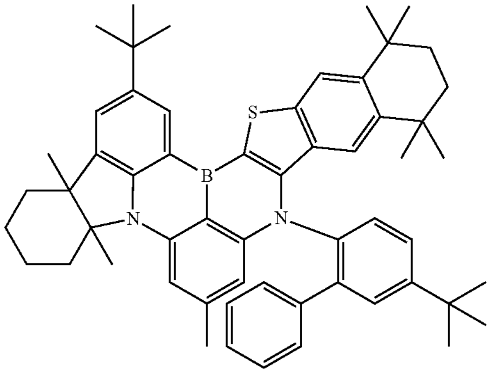
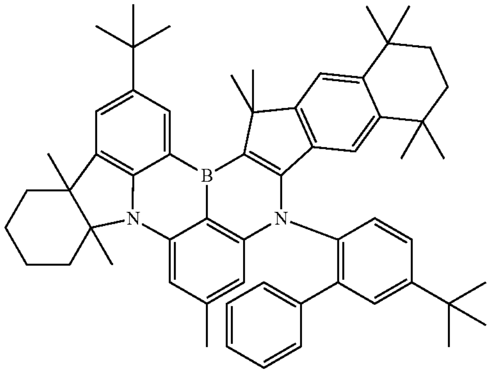
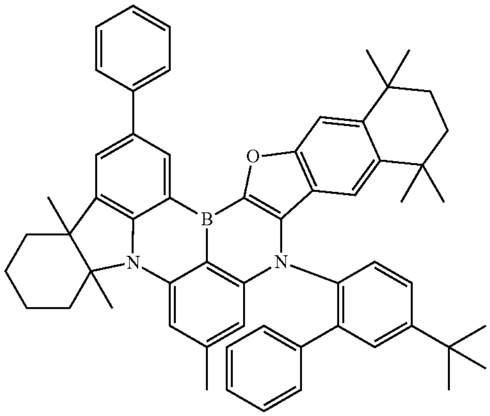
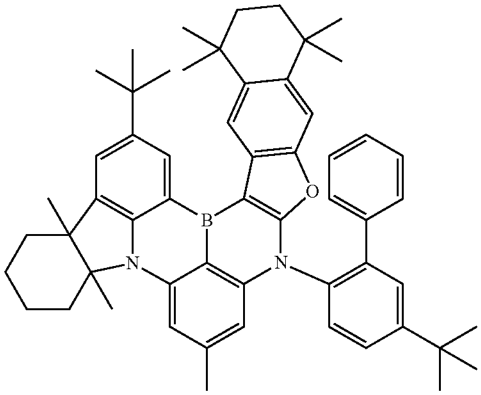

-continued
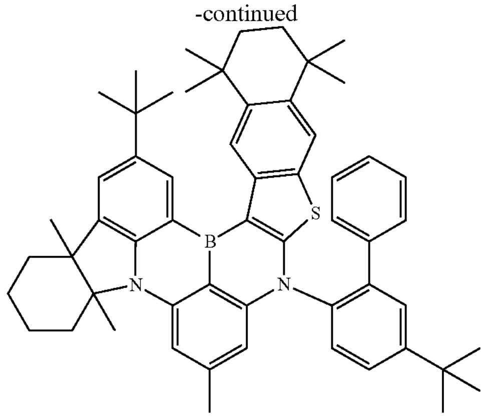
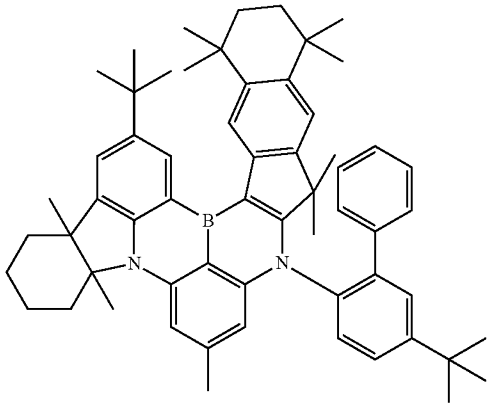
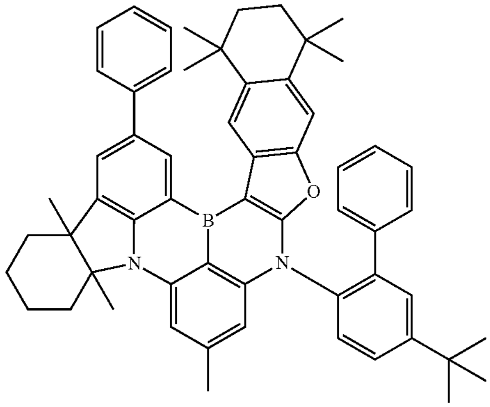
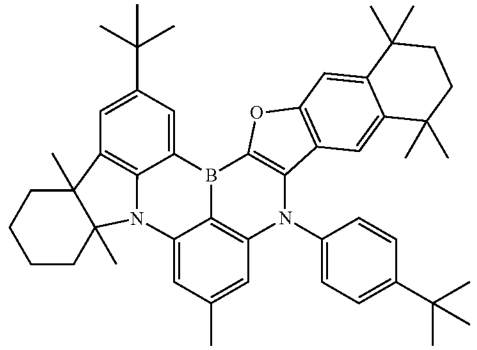
-continued
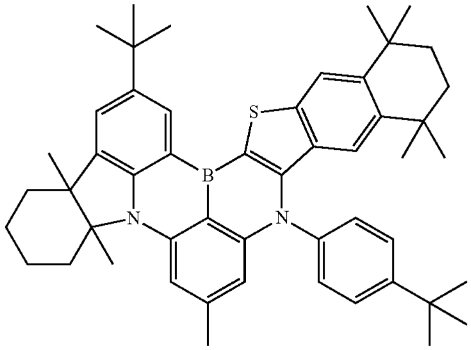
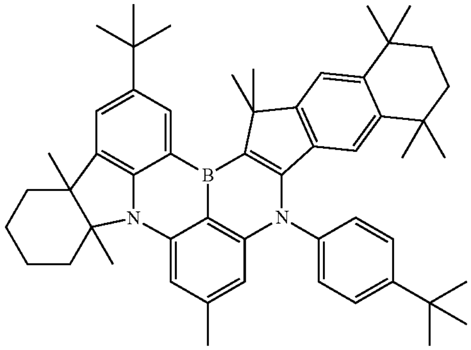
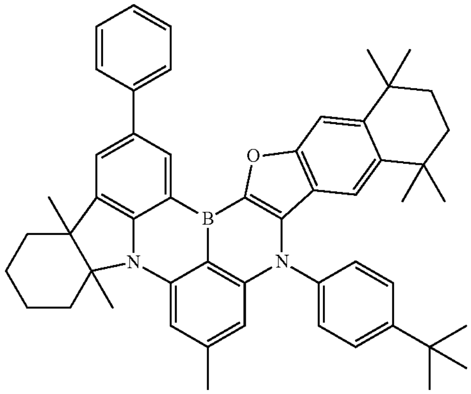
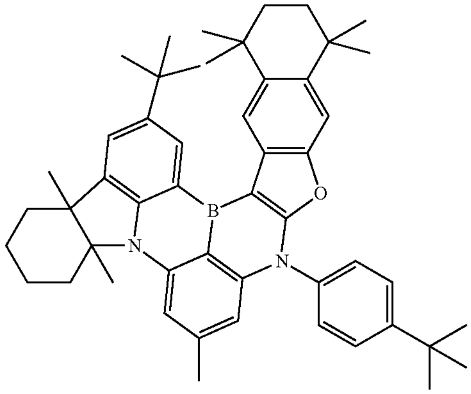

-continued
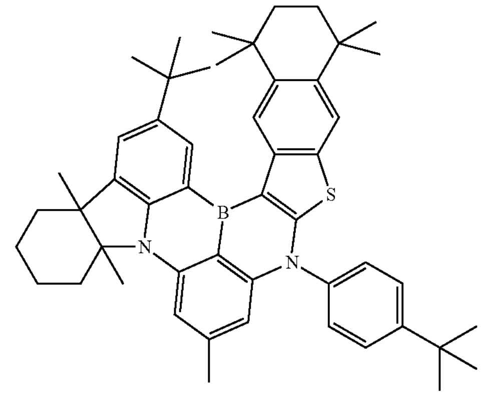
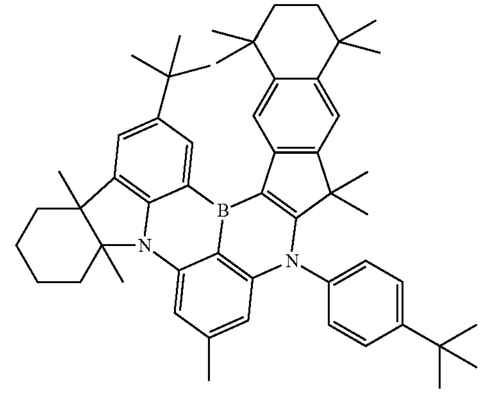
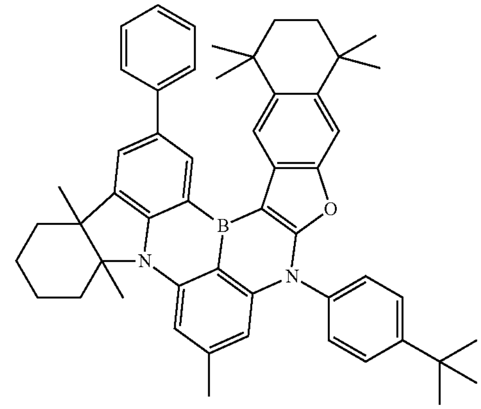
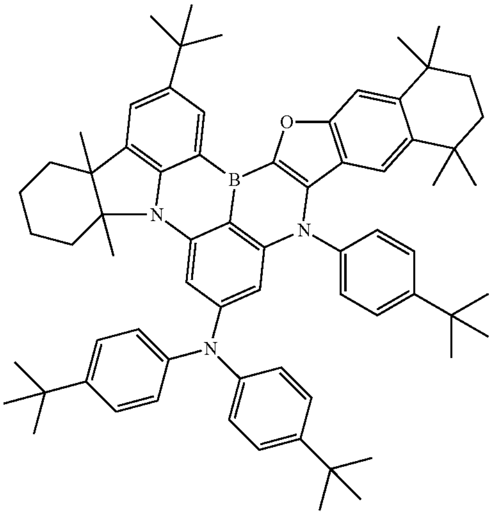
-continued
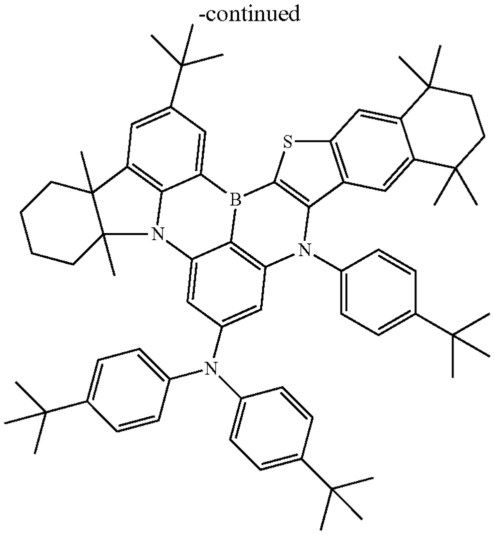
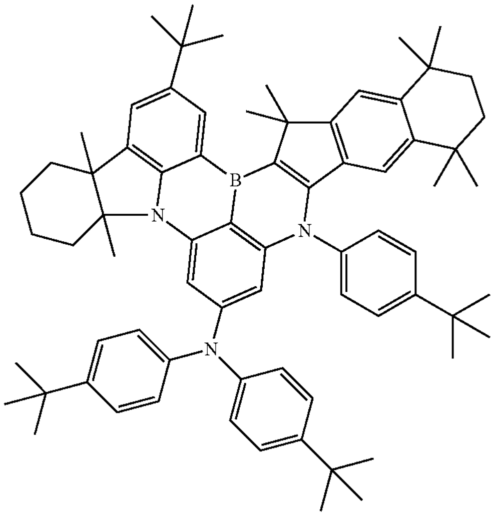
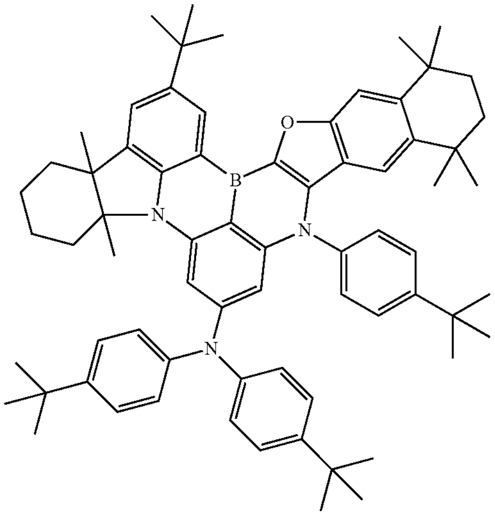

-continued
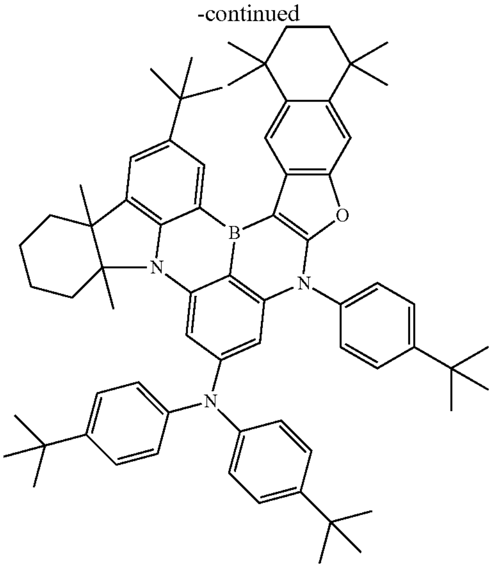
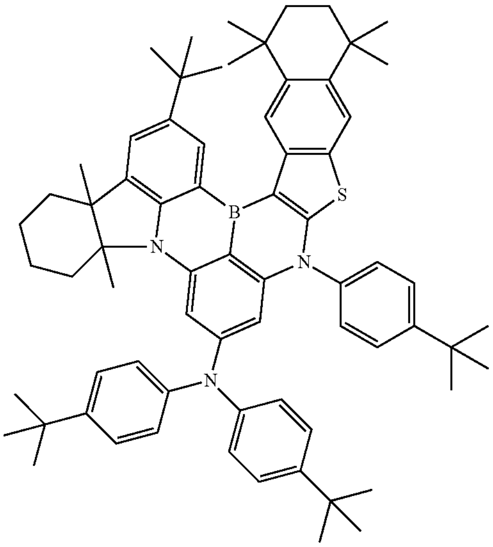
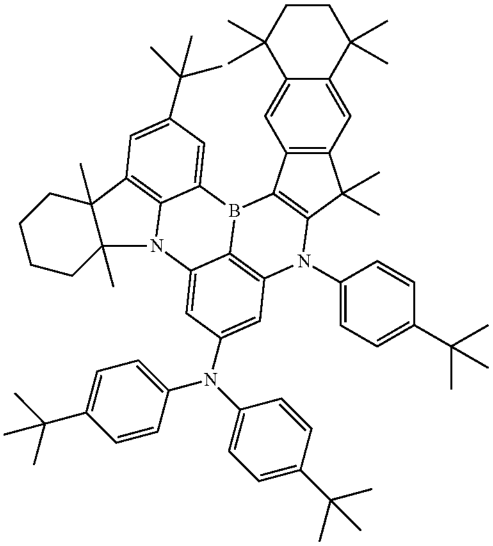
-continued
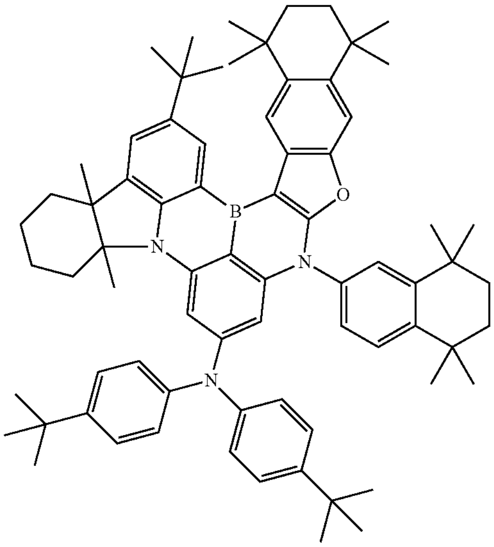
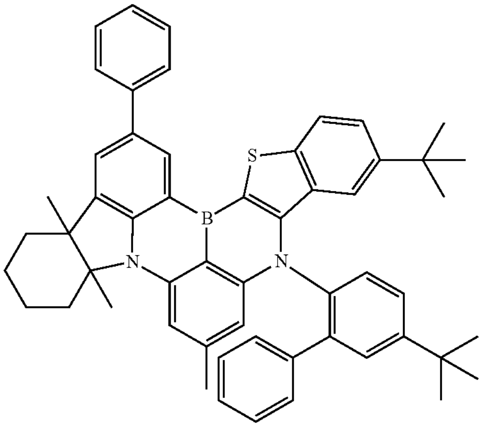
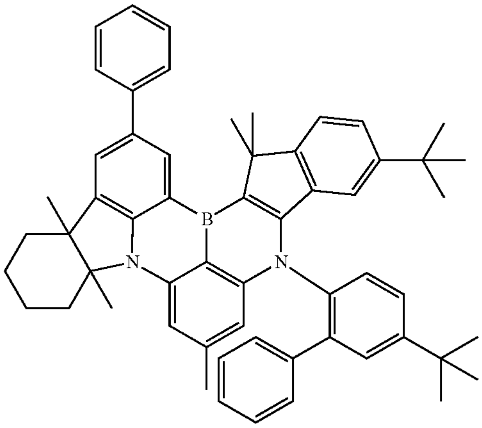

-continued
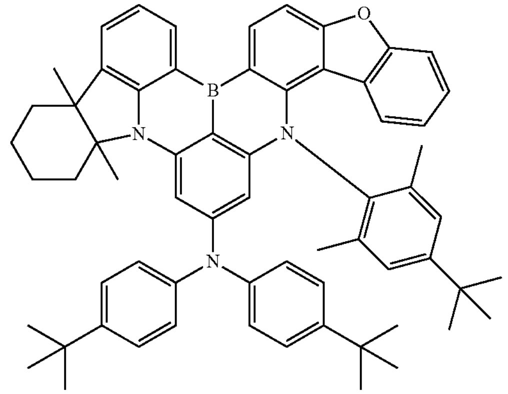
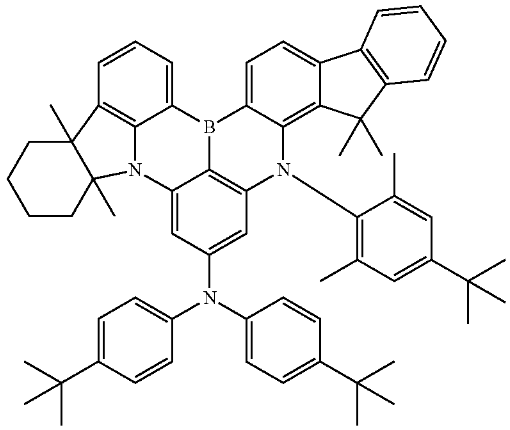
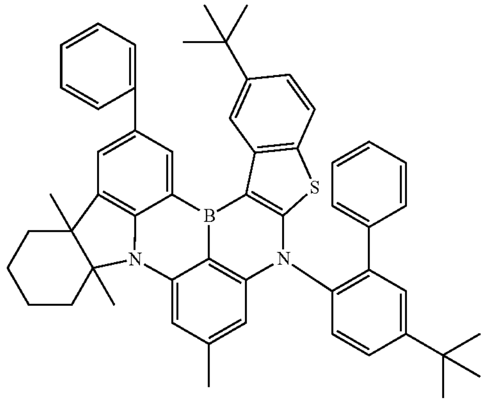
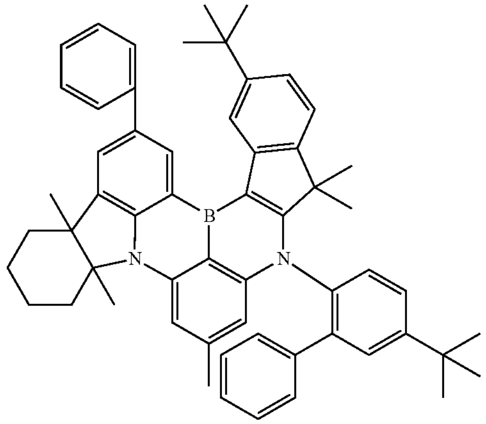
-continued
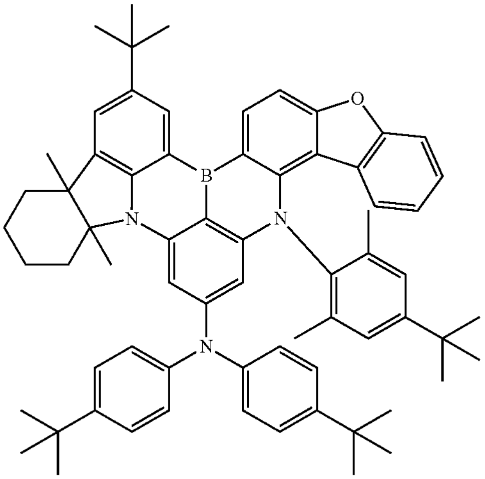
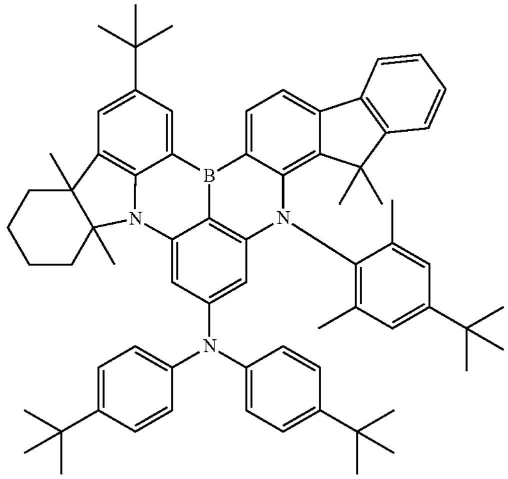
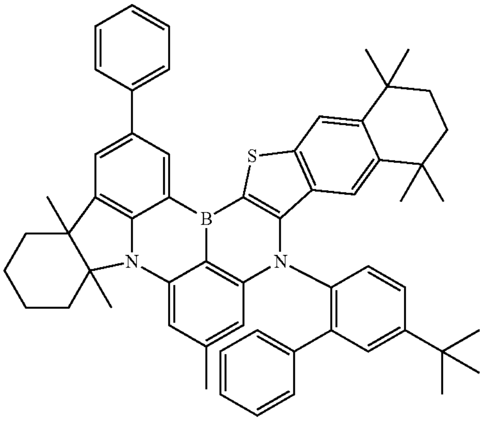

-continued
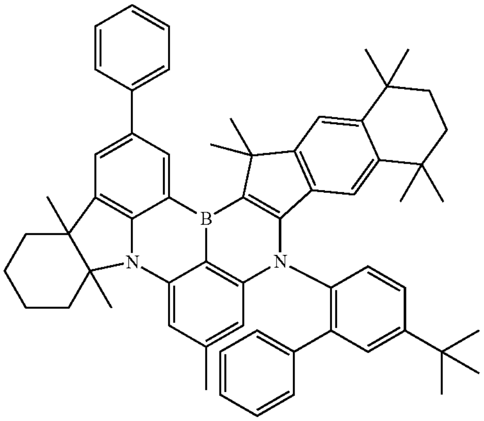
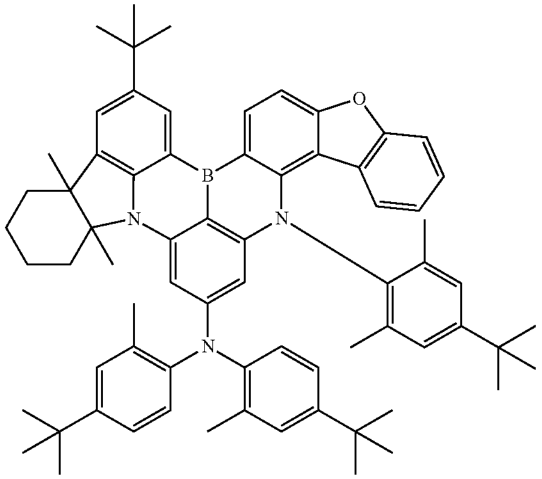
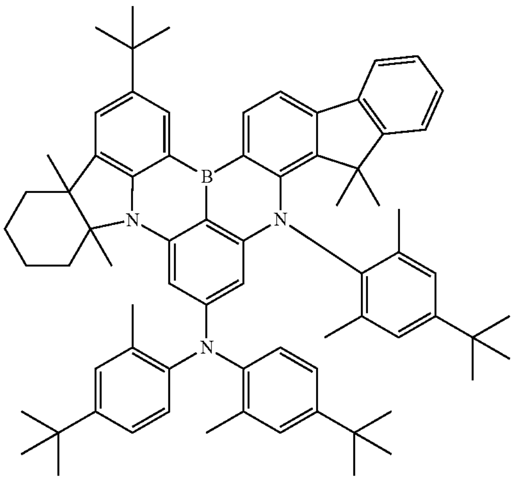
-continued
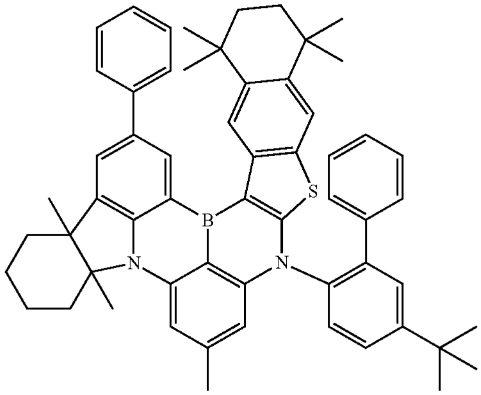
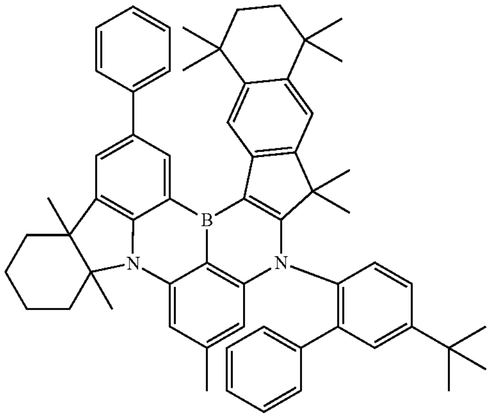
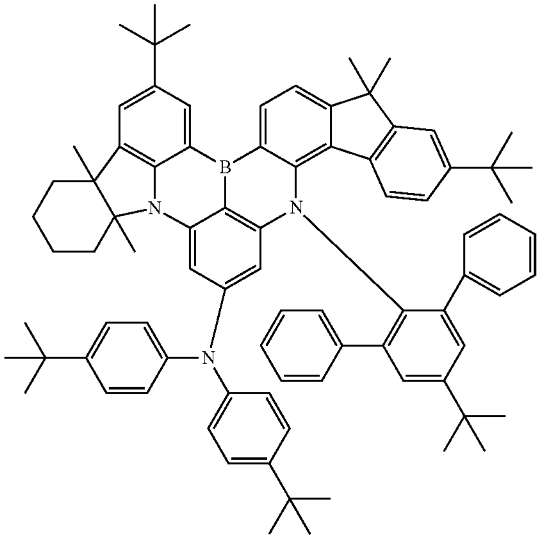

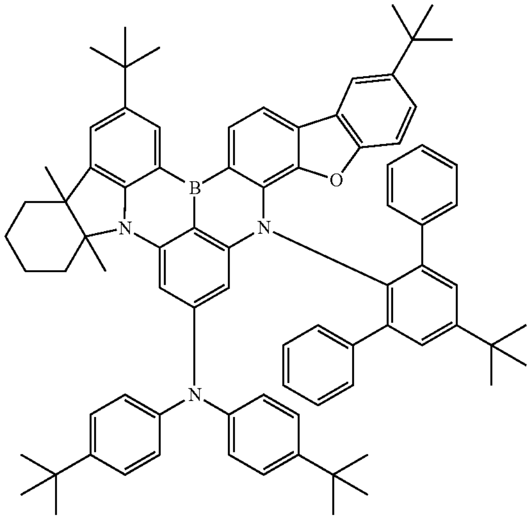
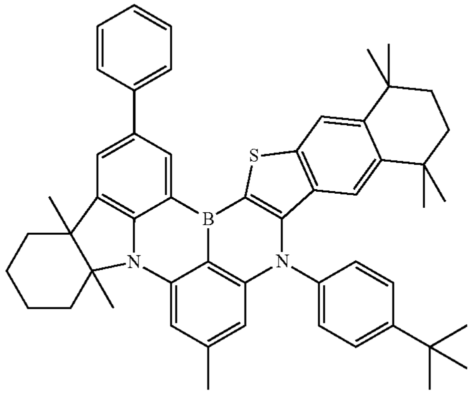
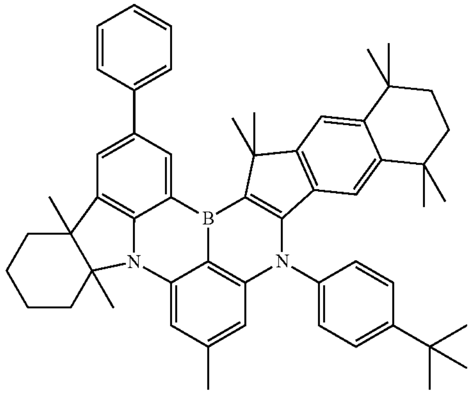
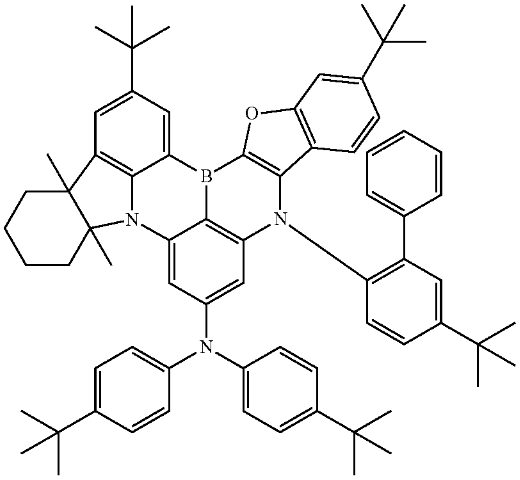
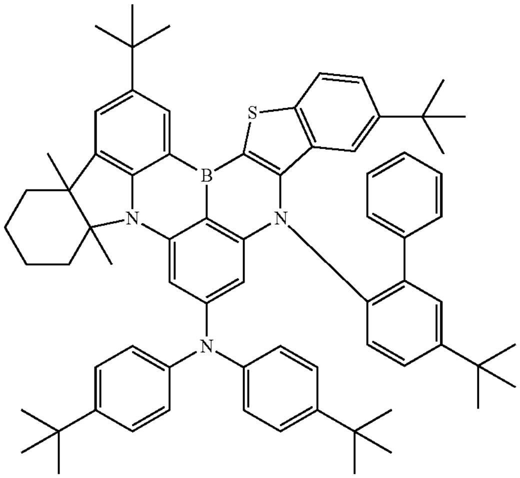
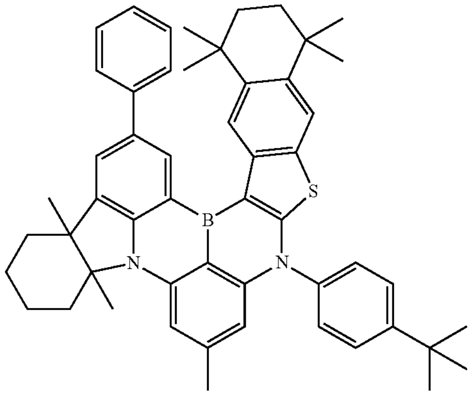

-continued
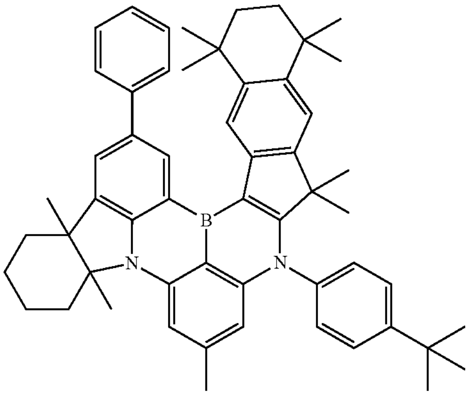
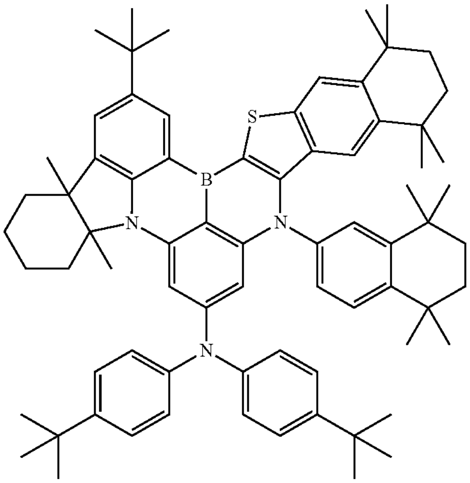
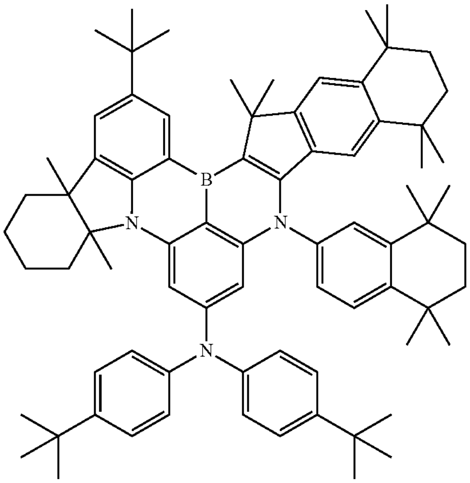
-continued
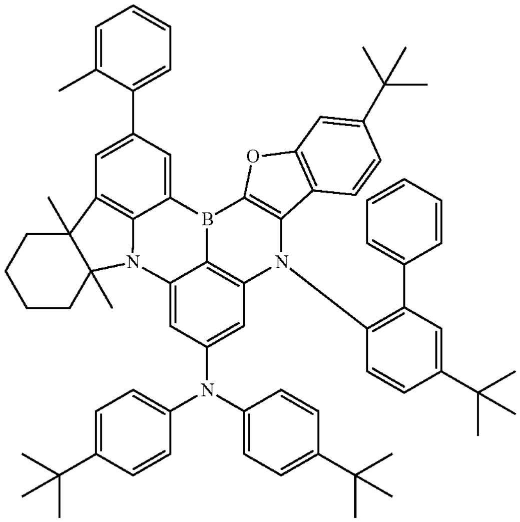
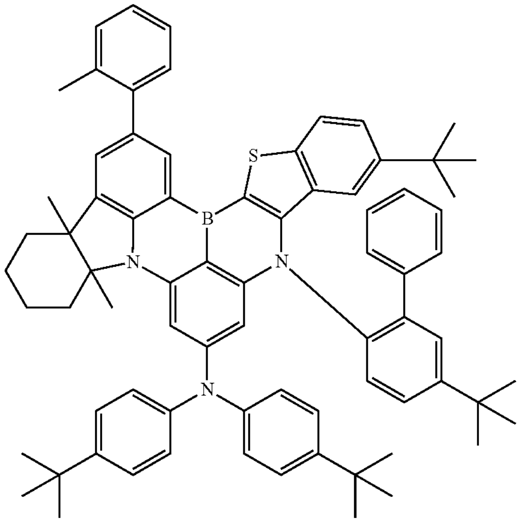
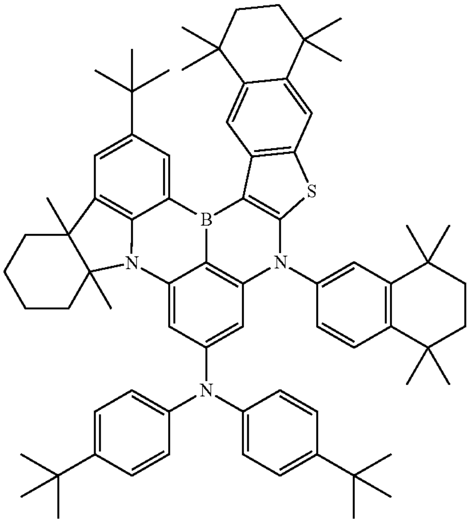

-continued
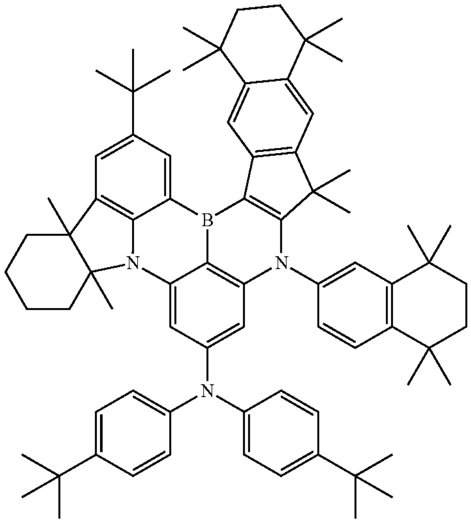
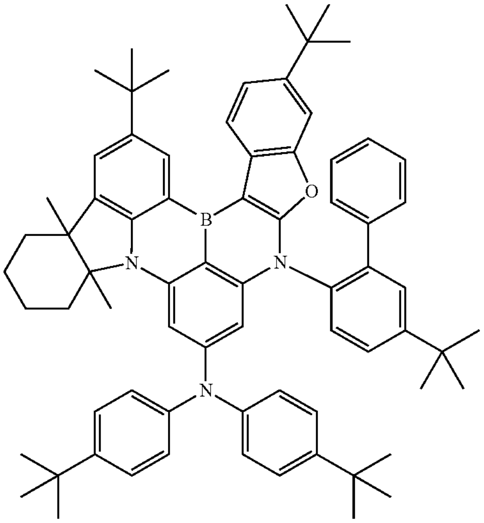
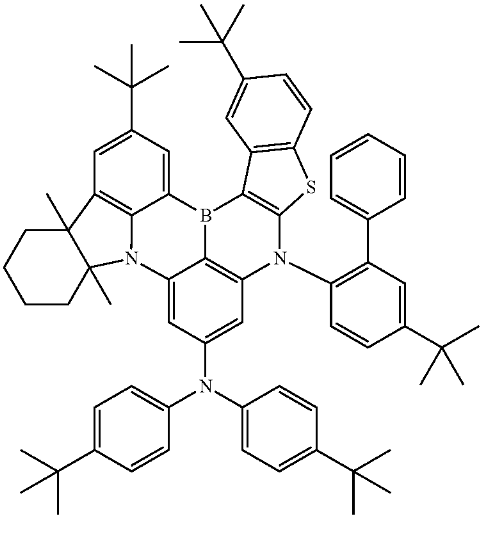
-continued
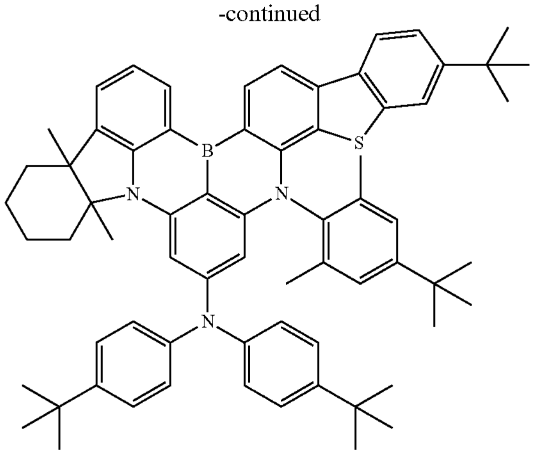
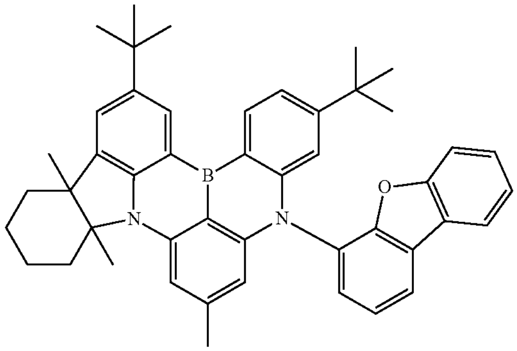
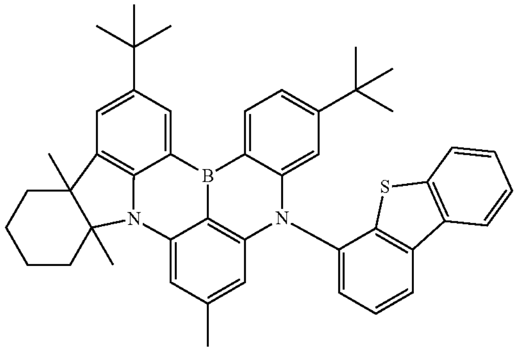
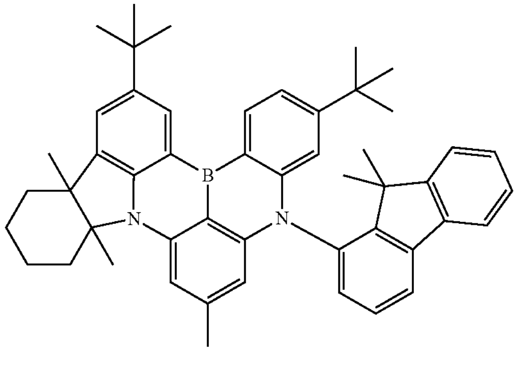

-continued
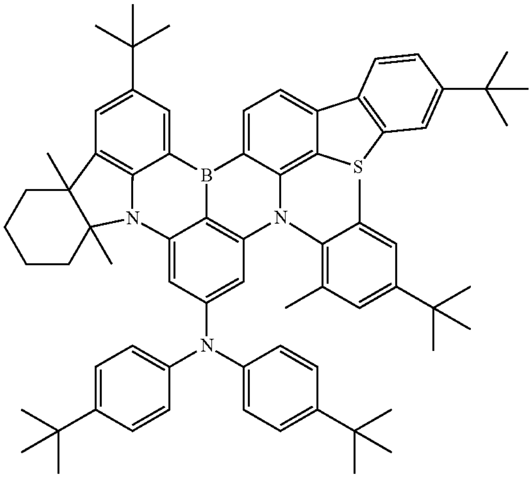
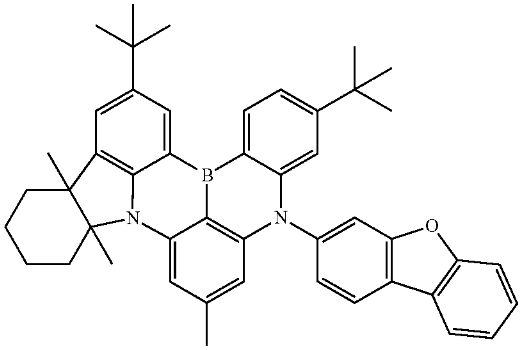
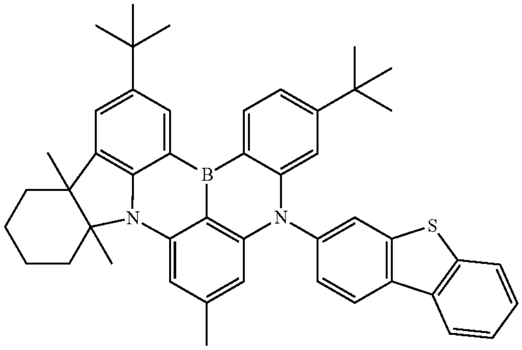
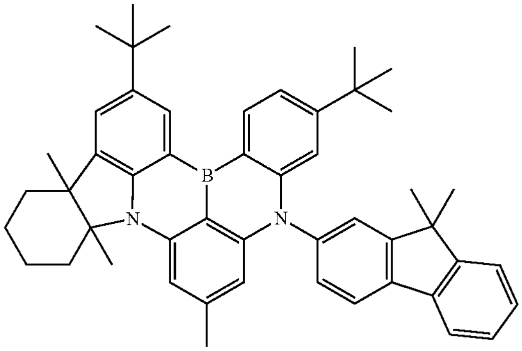
-continued
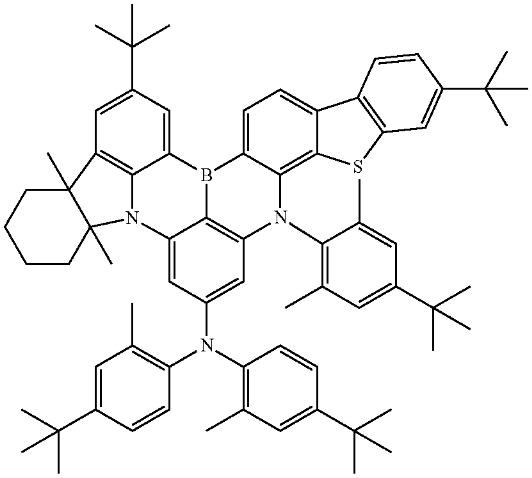
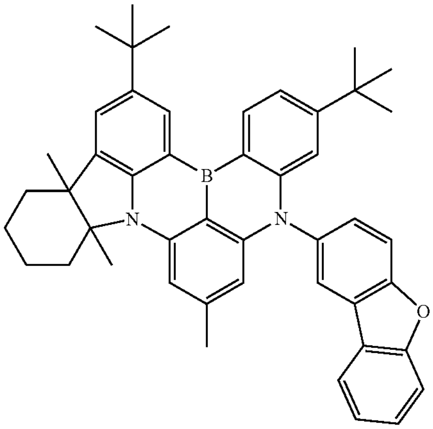
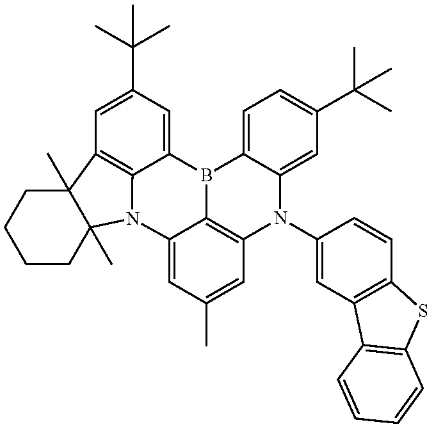

-continued
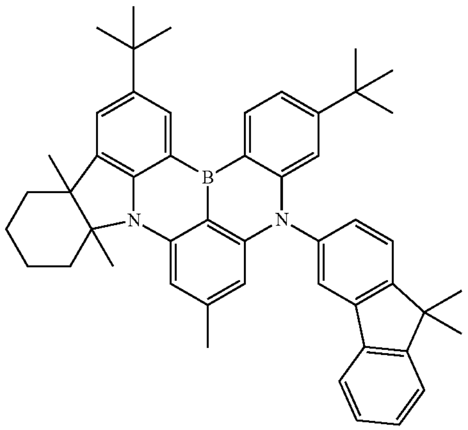
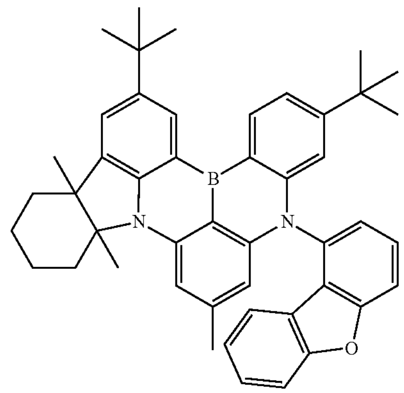
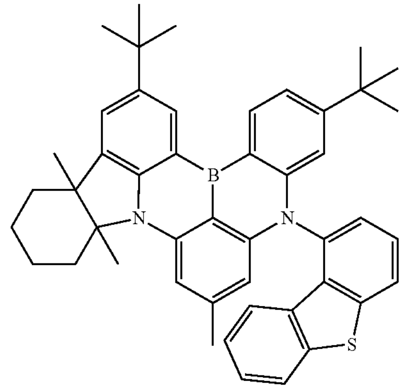
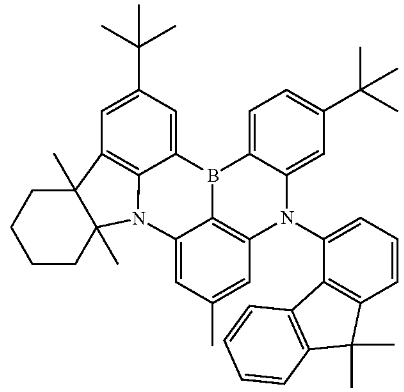
-continued
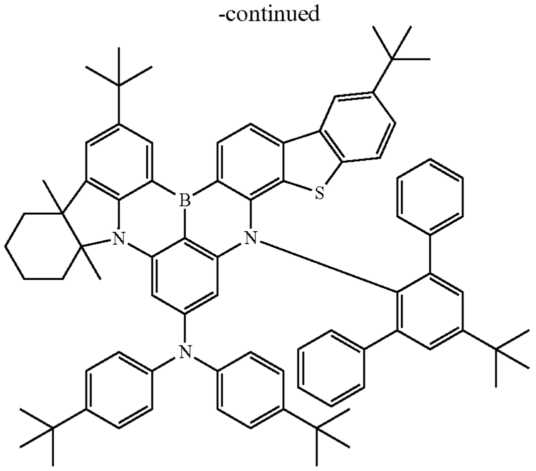
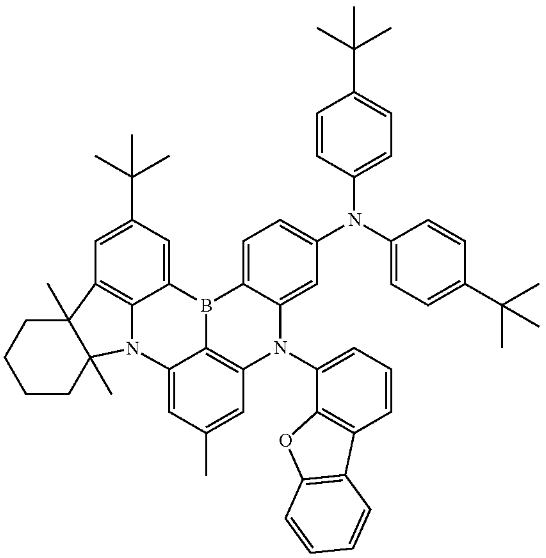
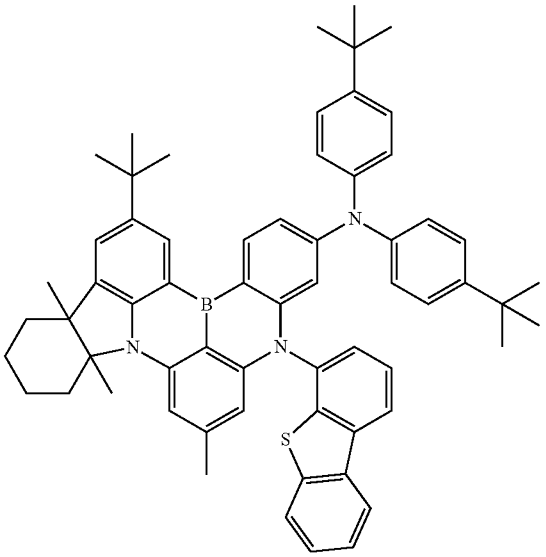

-continued
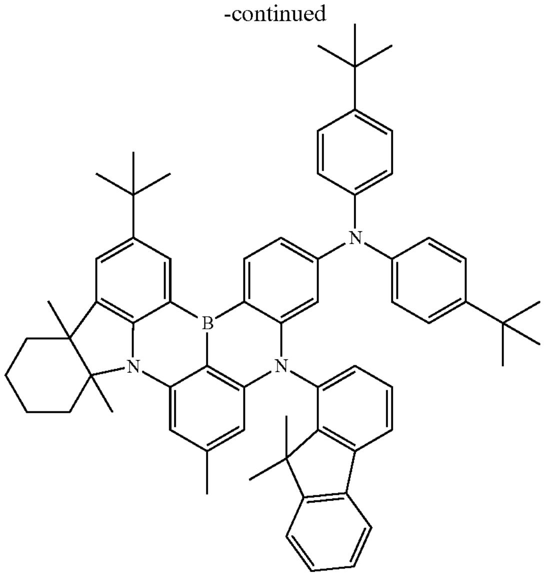
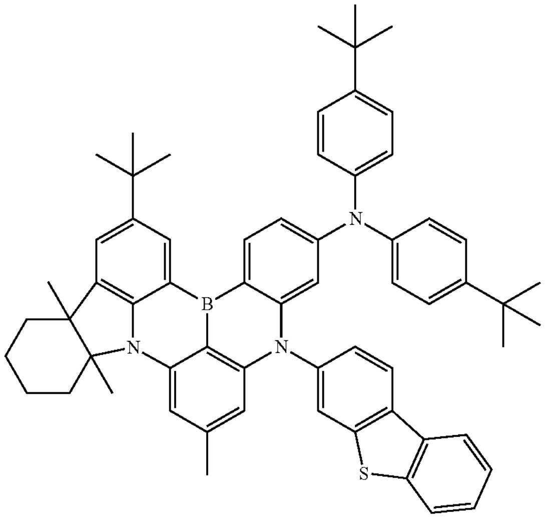
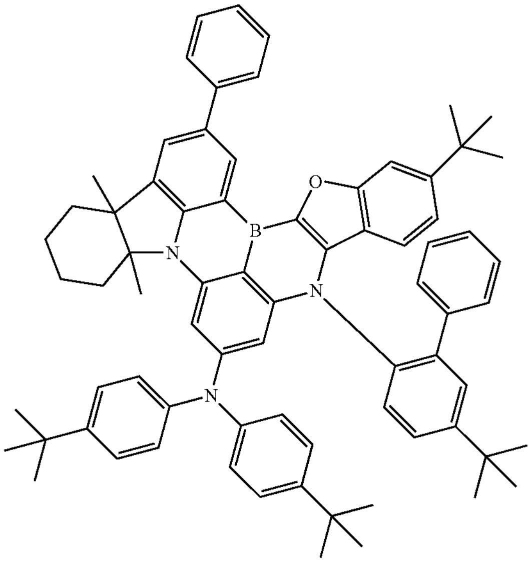
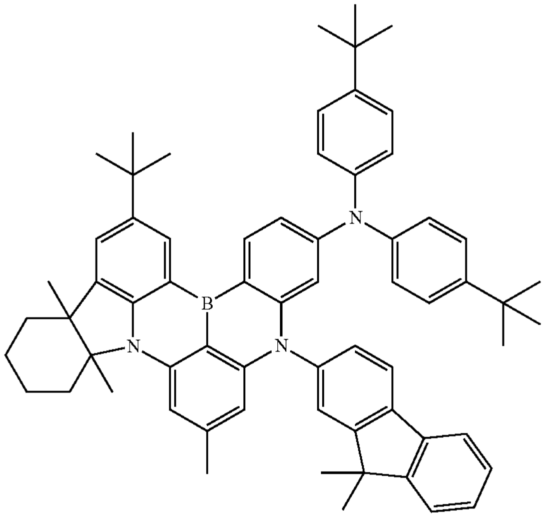
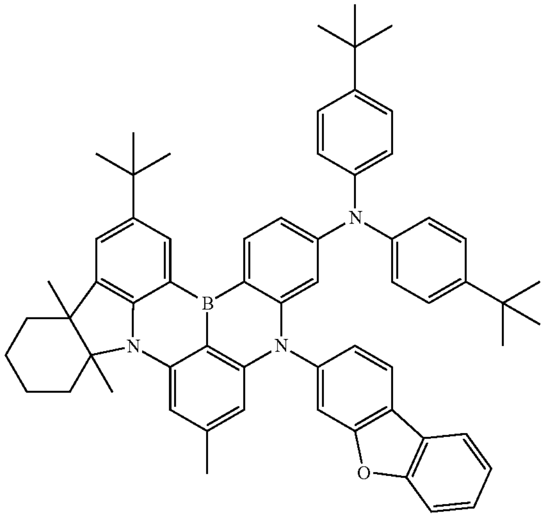
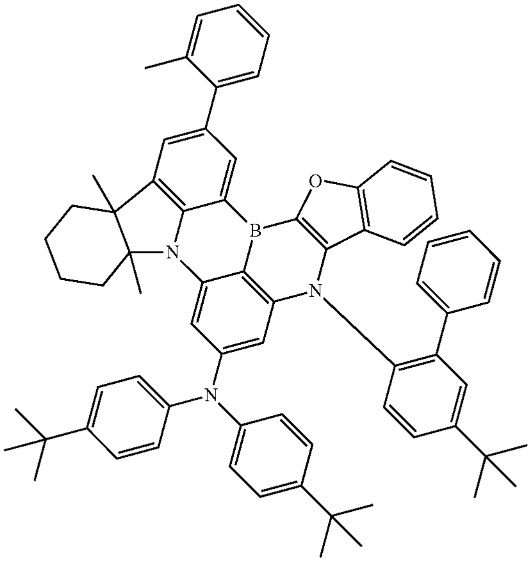
-continued -continued
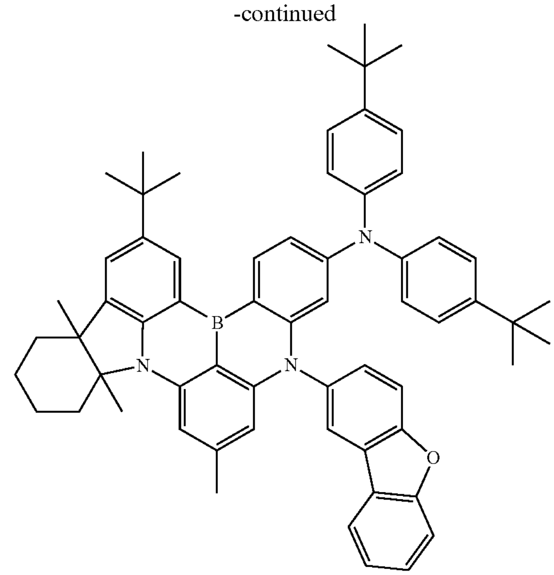
-continued
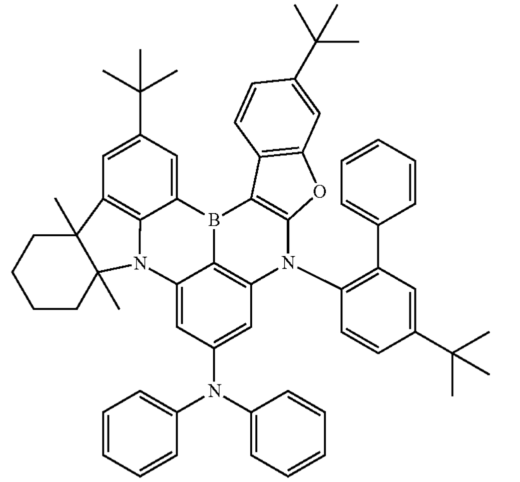
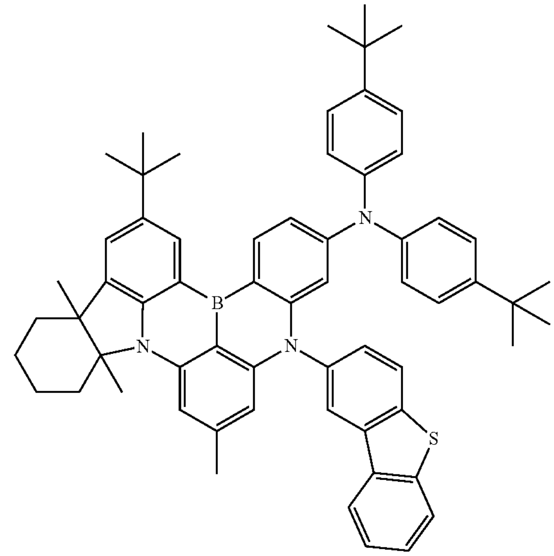
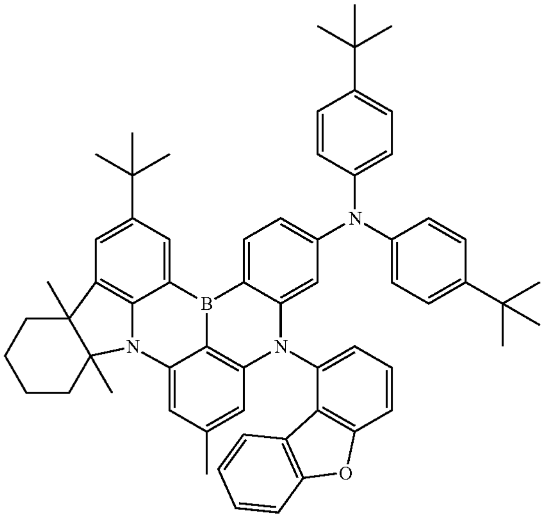
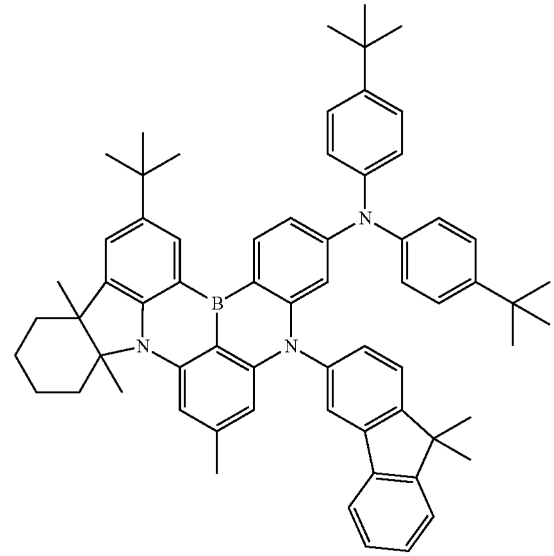
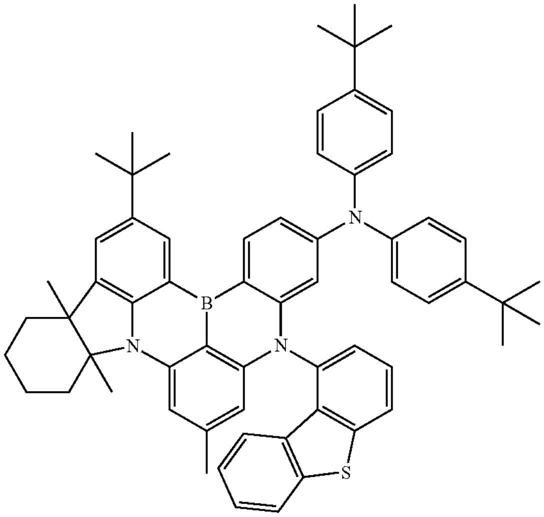

-continued
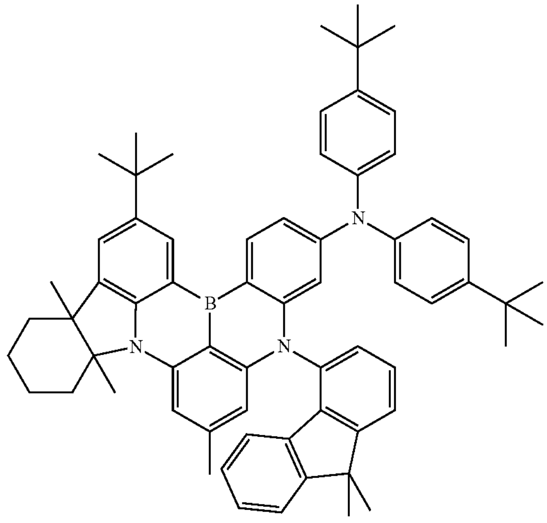
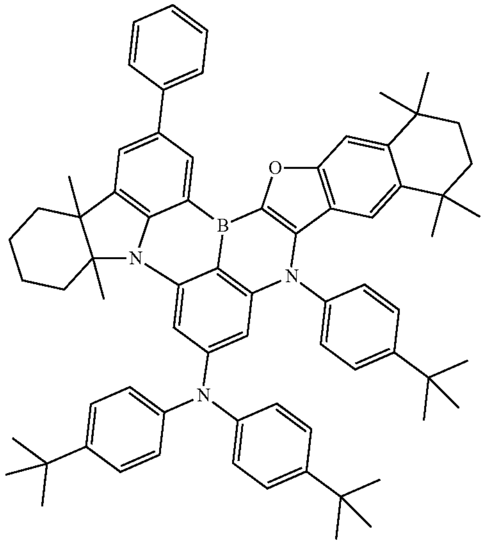
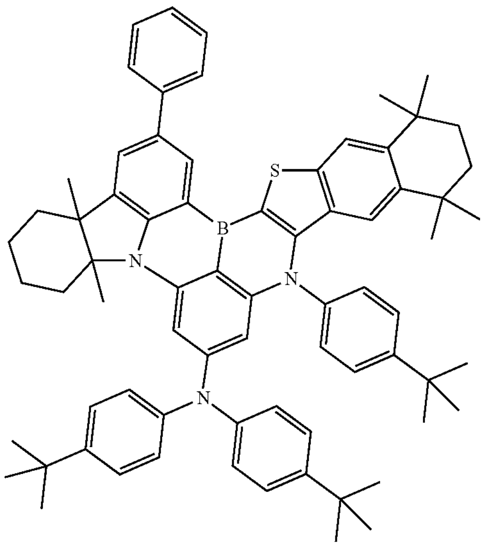
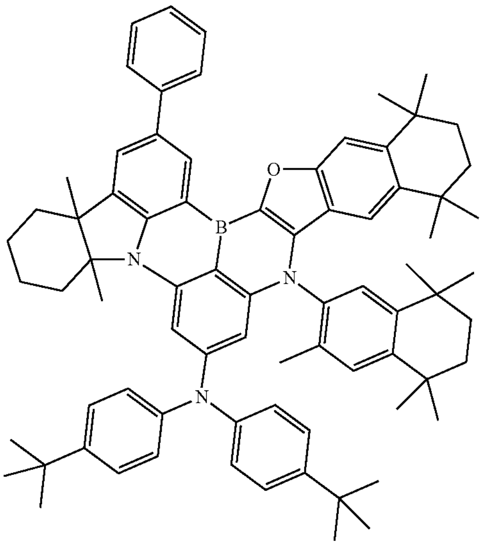
-continued
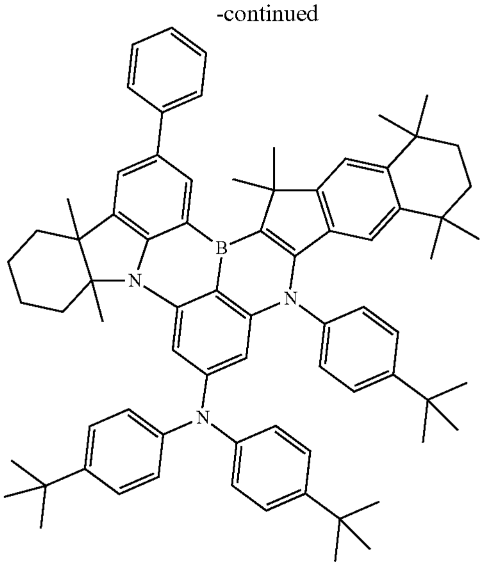
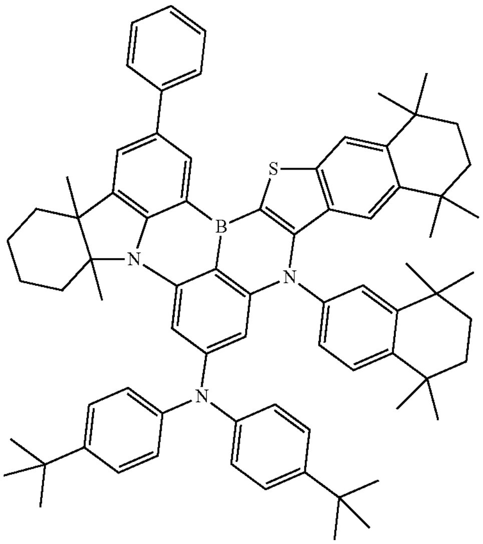

-continued
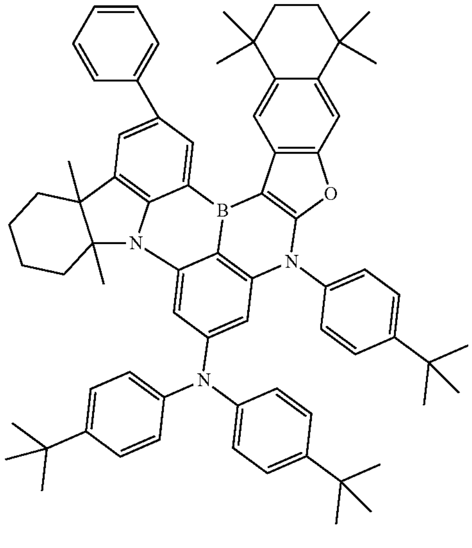
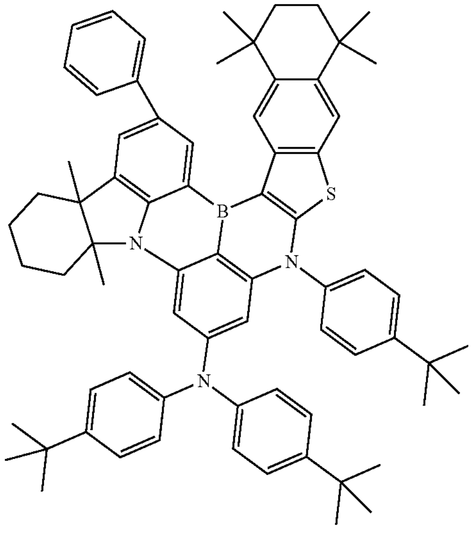
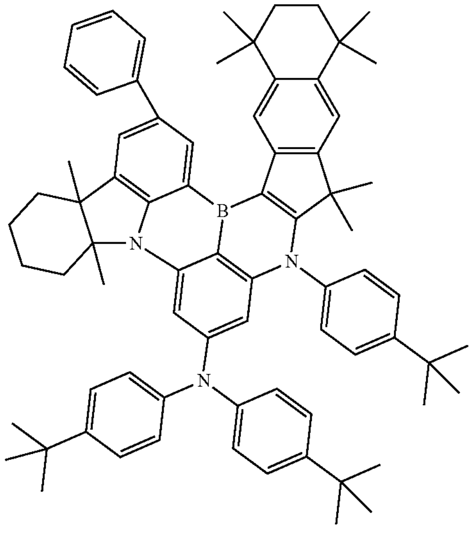
-continued
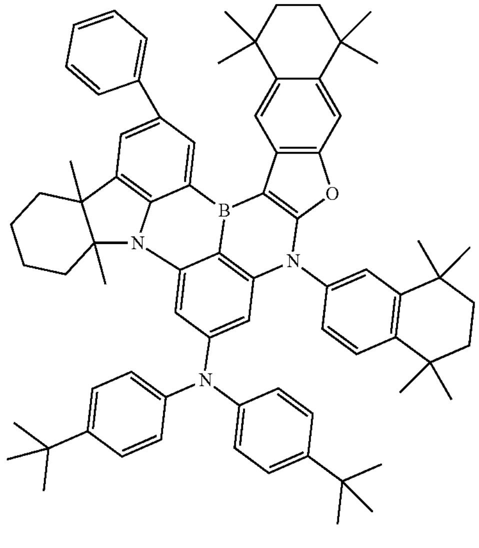
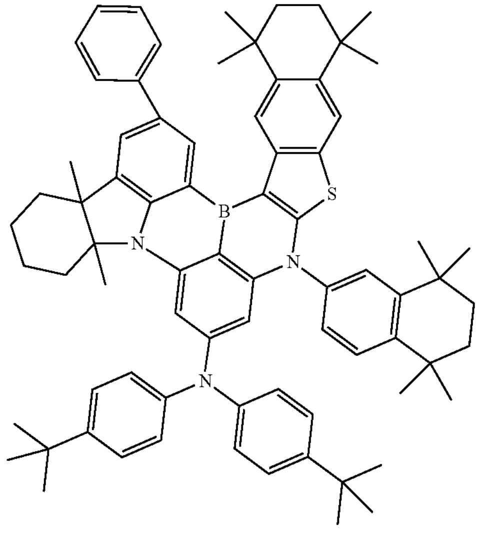
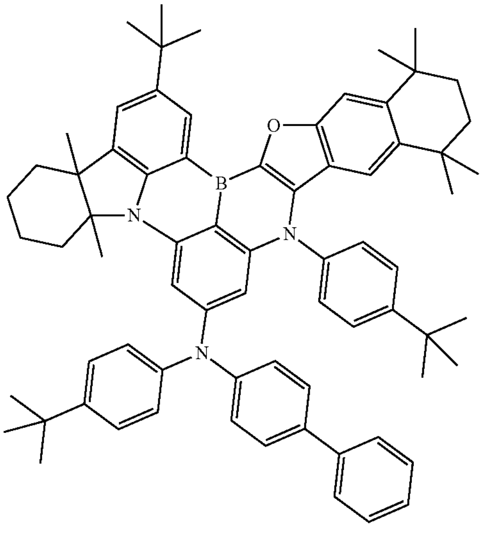

-continued
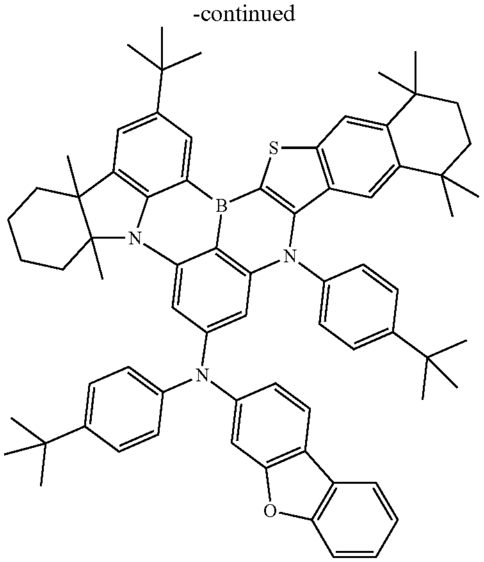
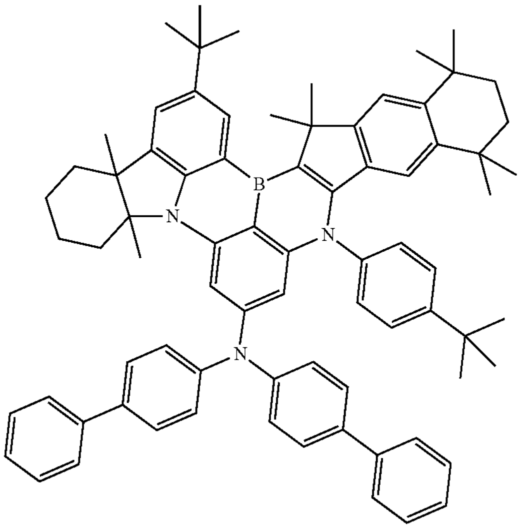
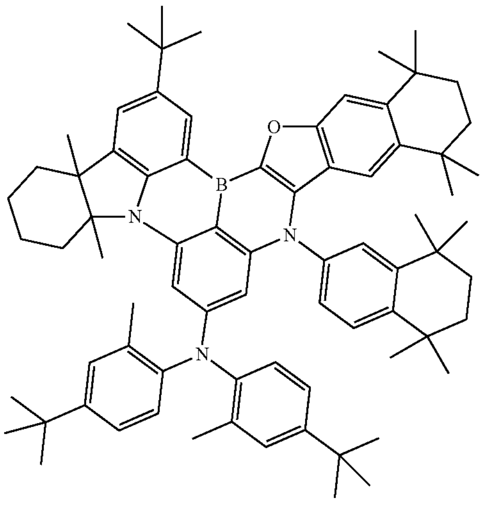
-continued
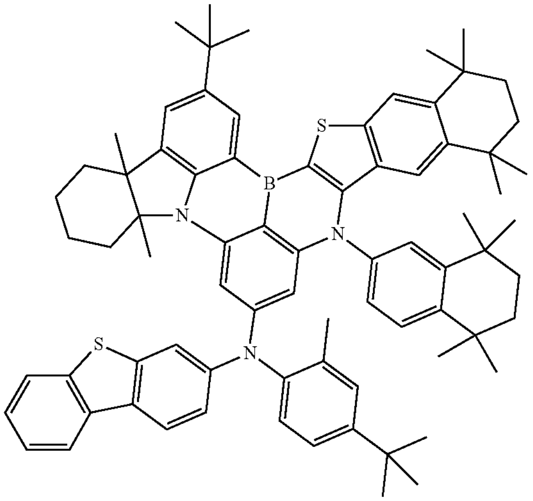
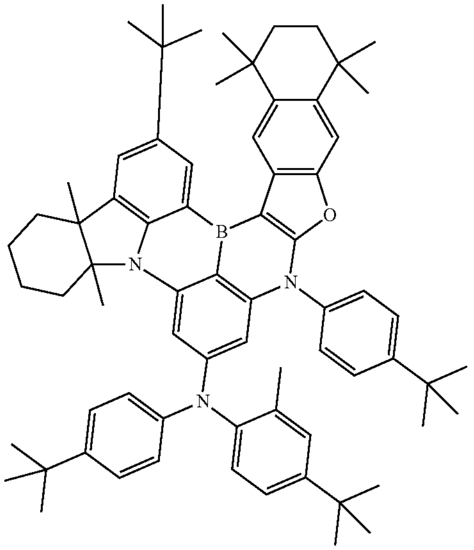
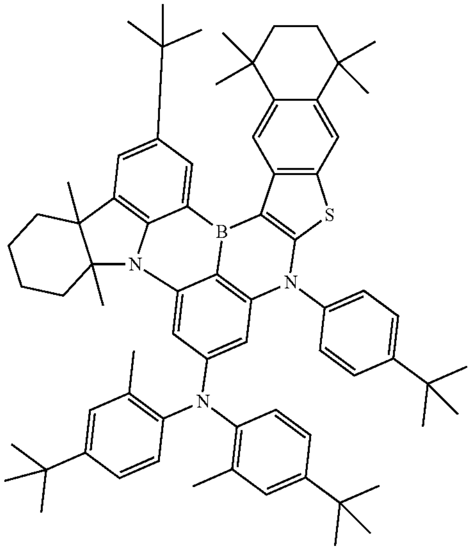

-continued
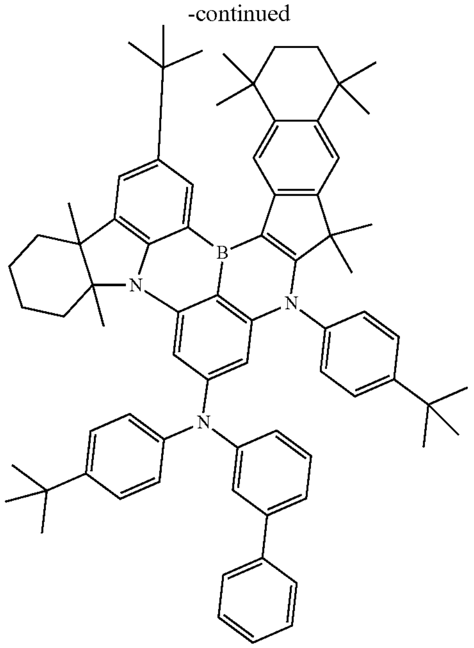
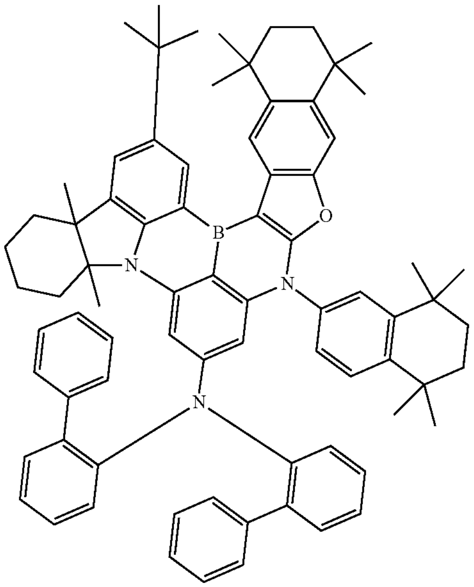
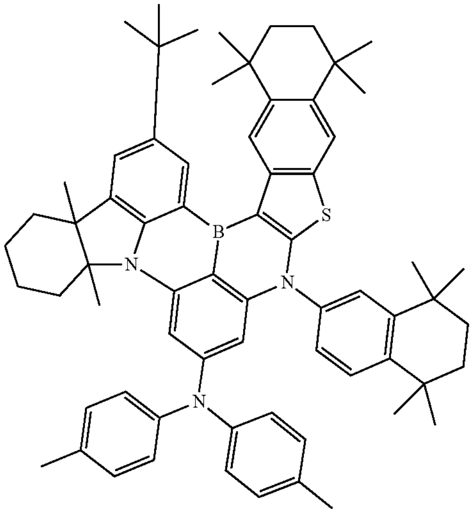
-continued
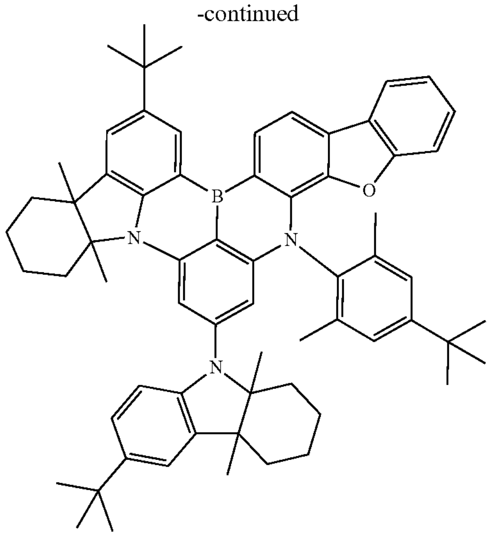
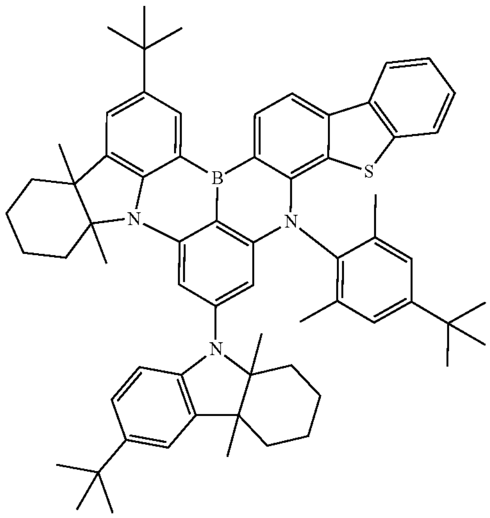
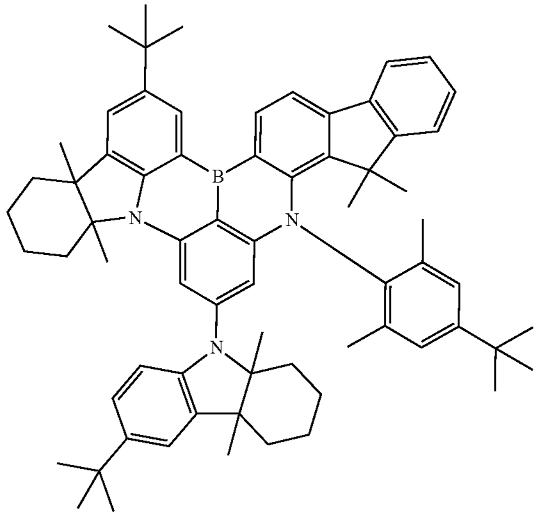

-continued
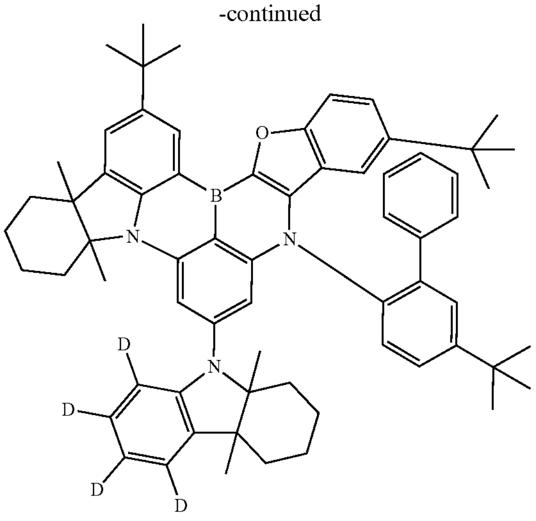
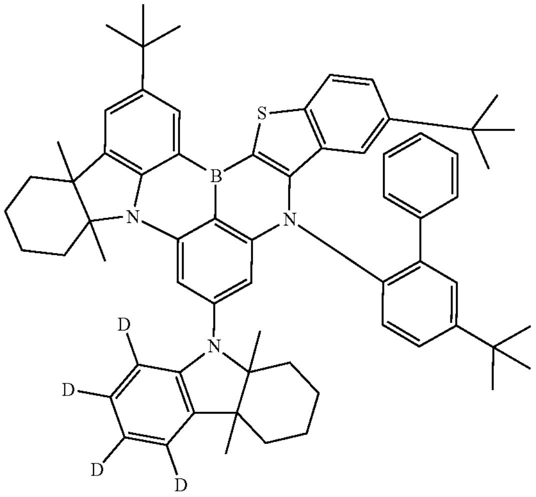
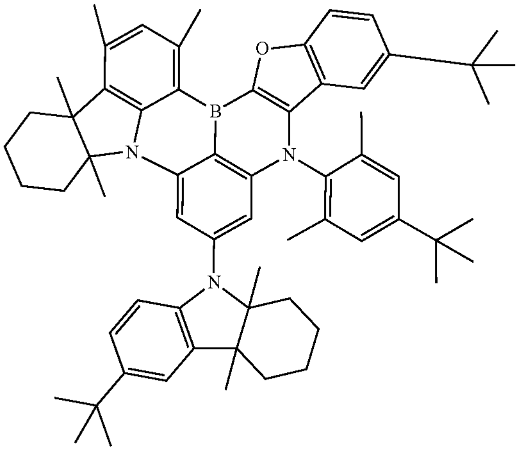
-continued
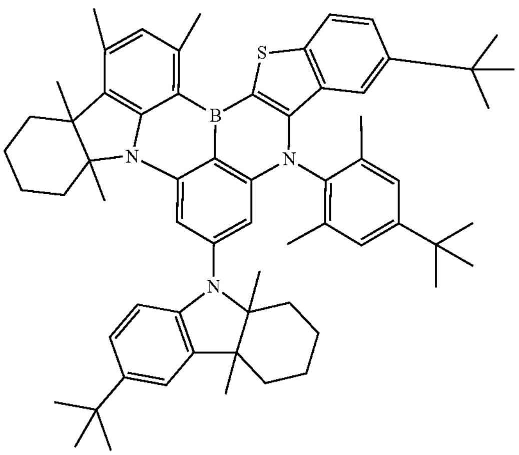
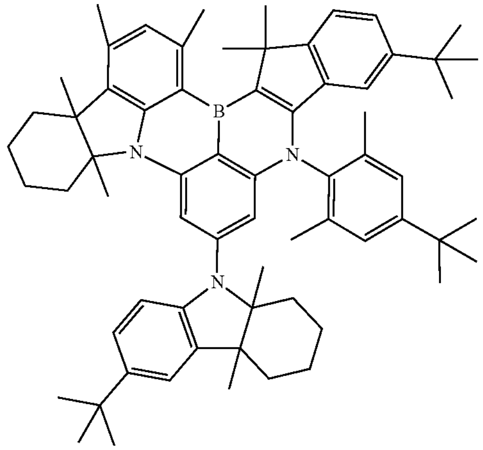
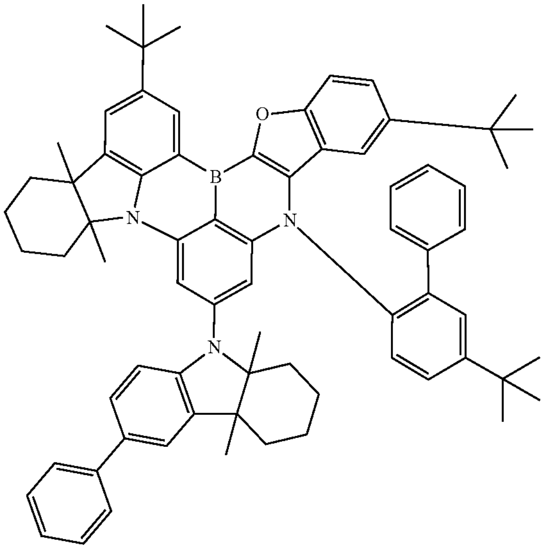

-continued
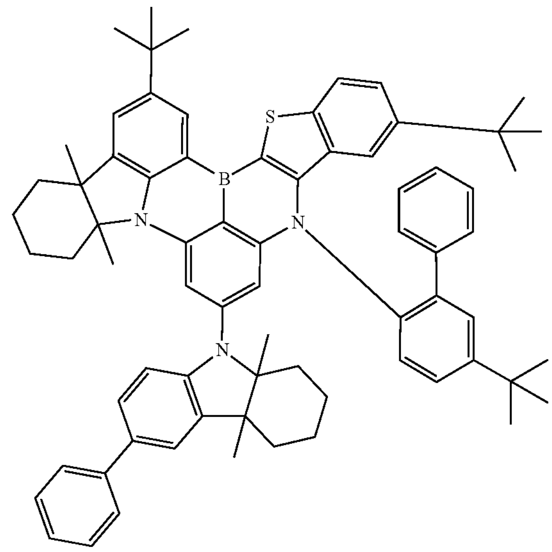
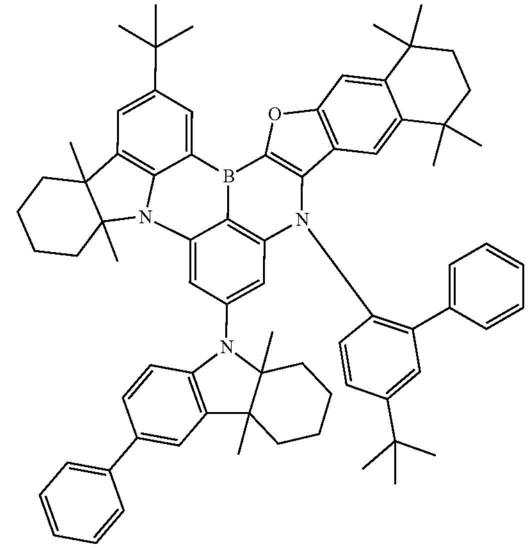
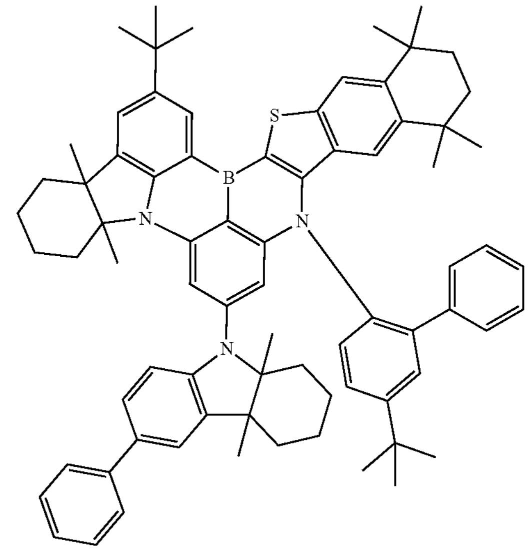
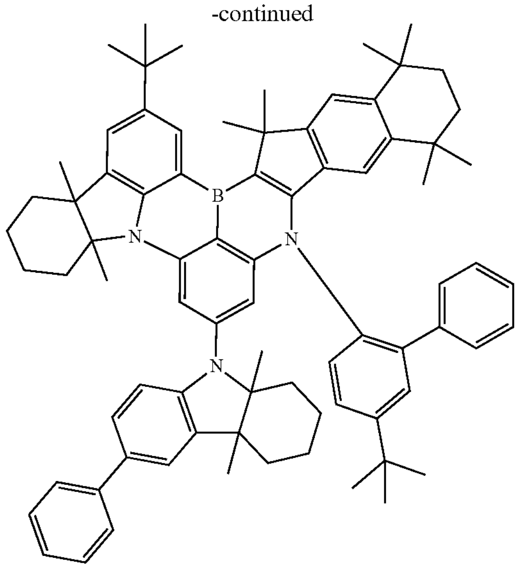
-continued
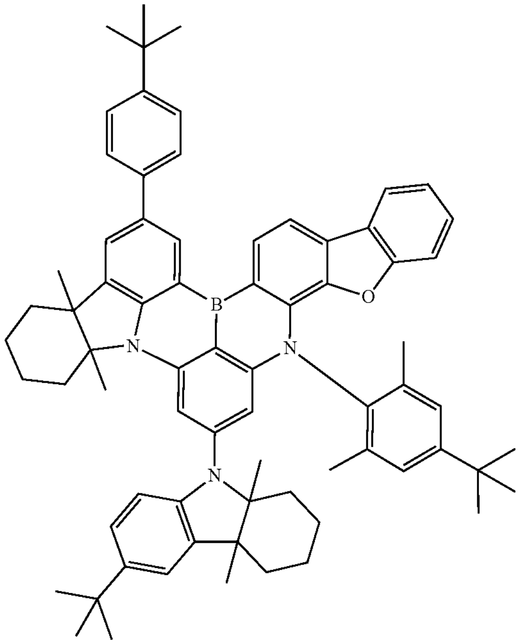

-continued
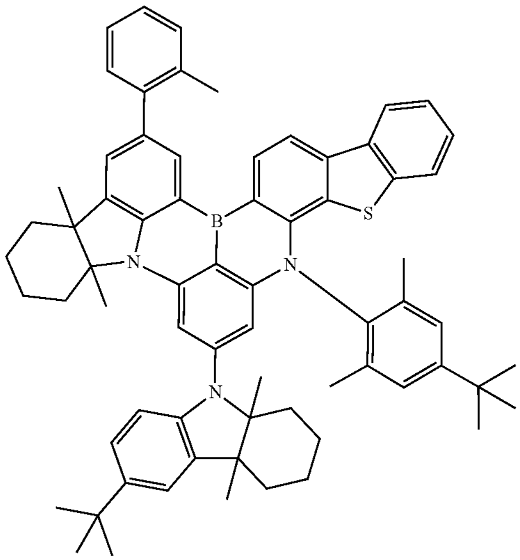
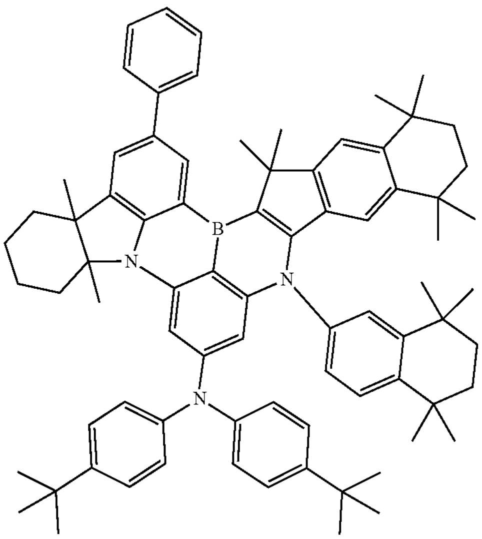
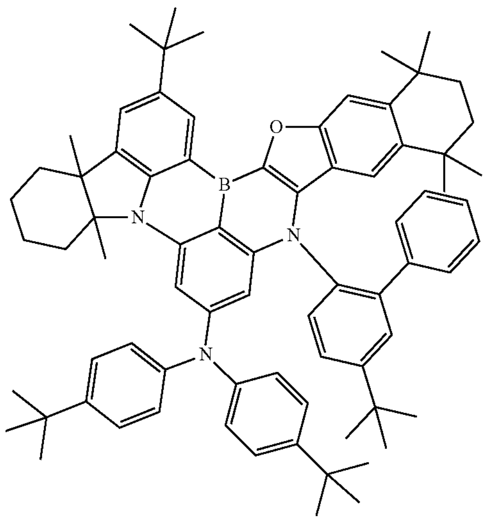
-continued
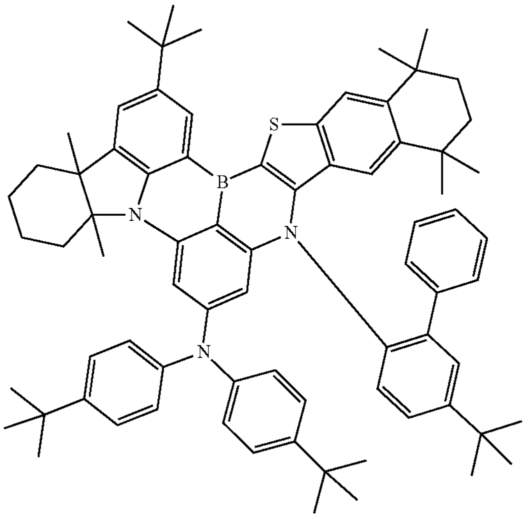
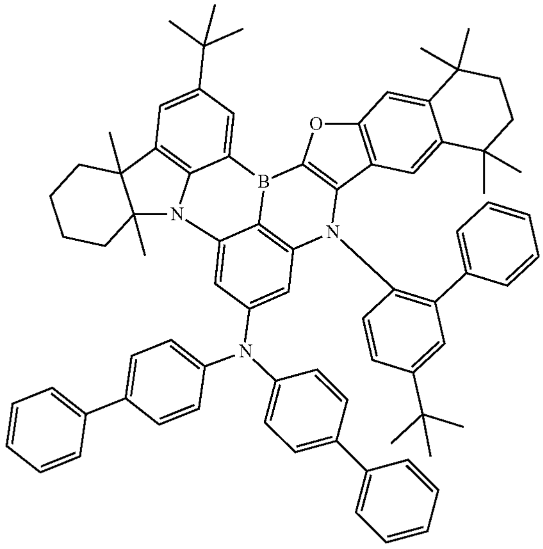
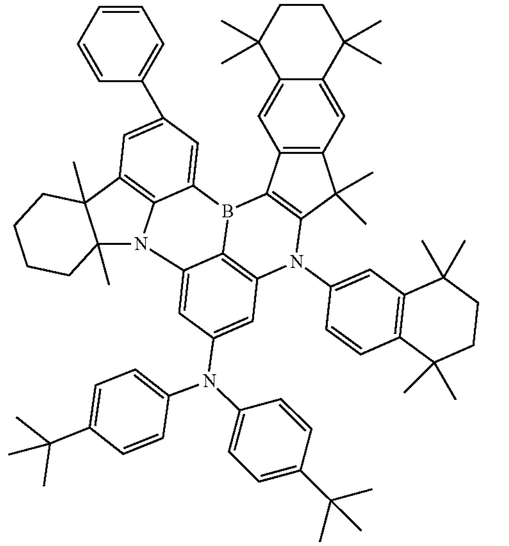

-continued
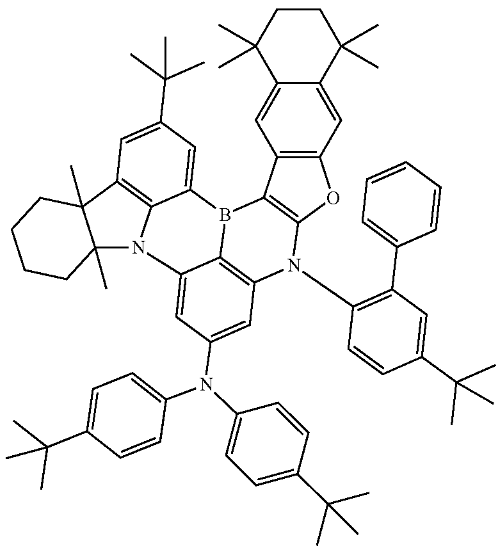
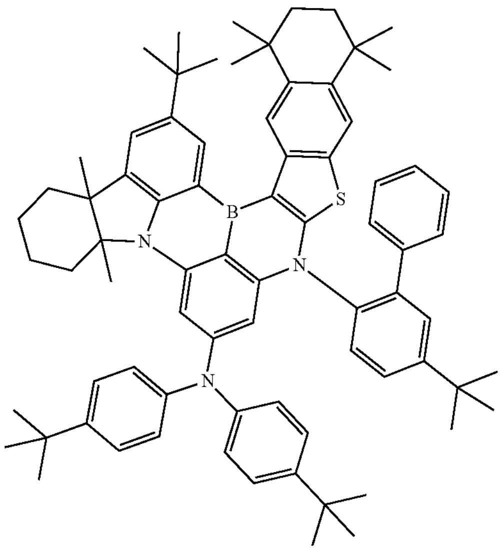
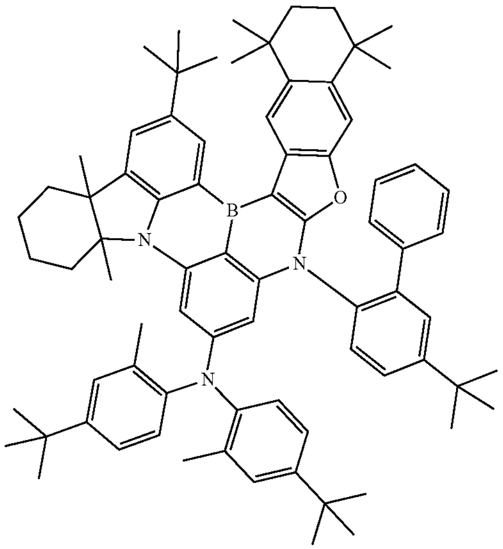
-continued
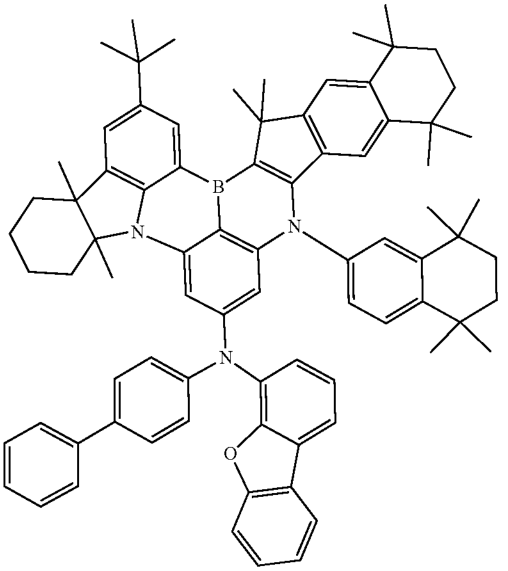
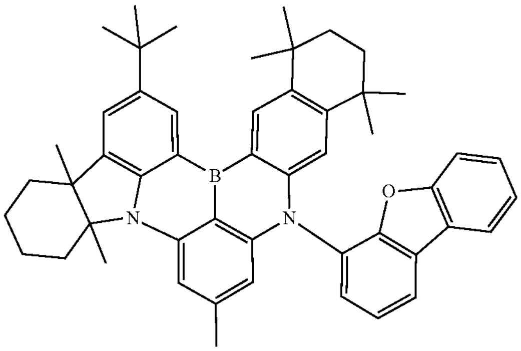
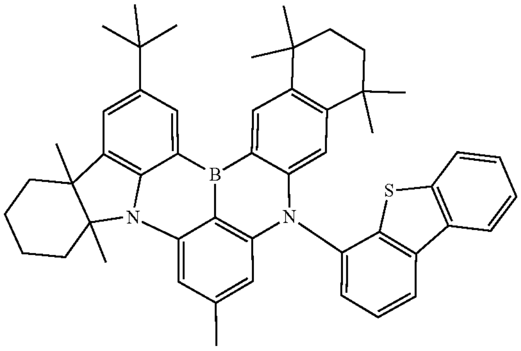

-continued
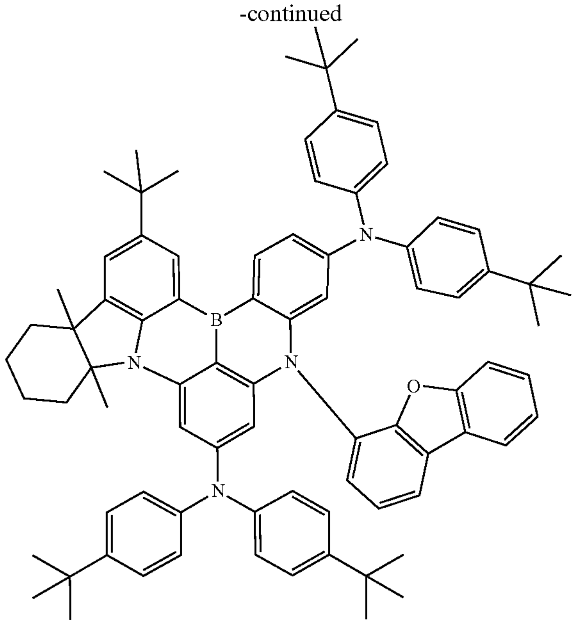
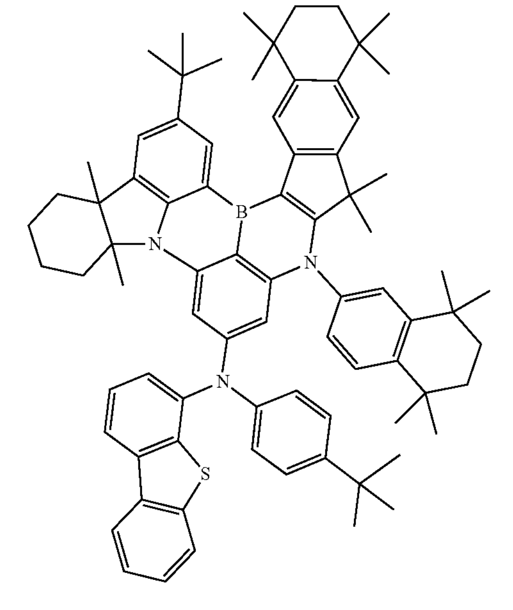
-continued
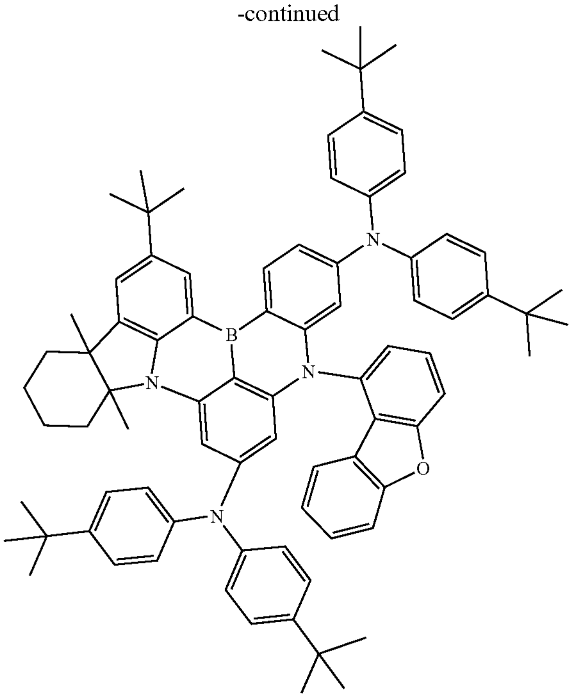
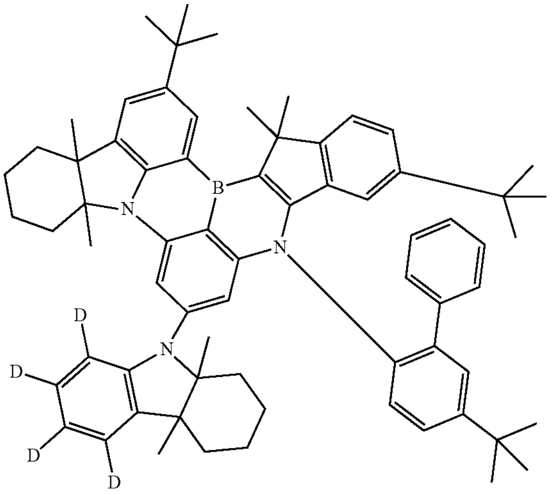
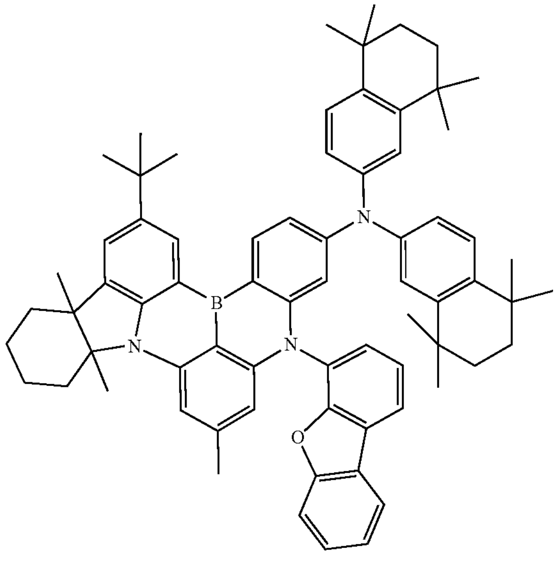

-continued
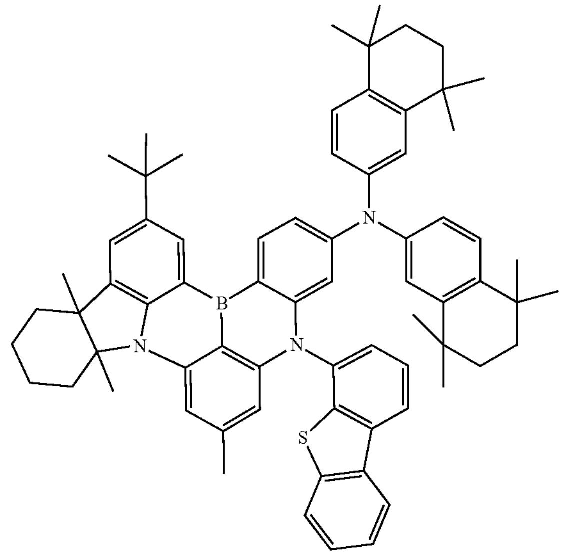
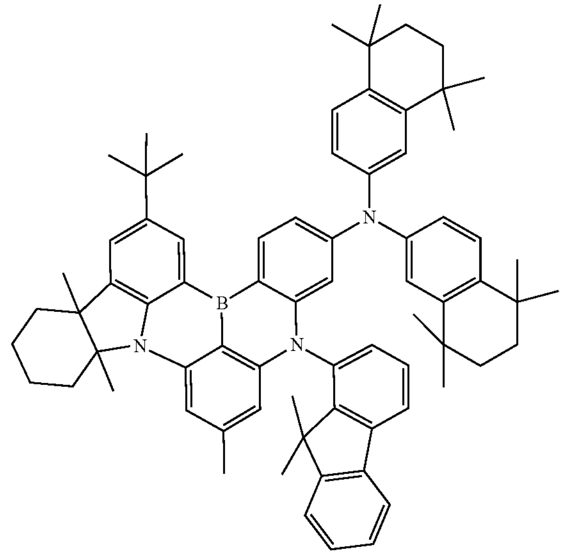
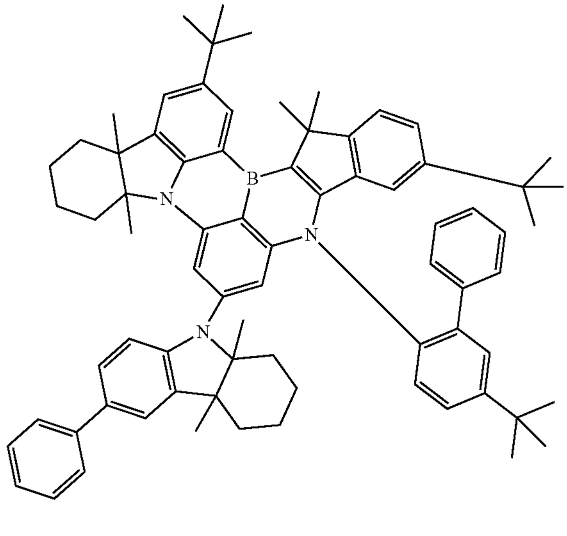
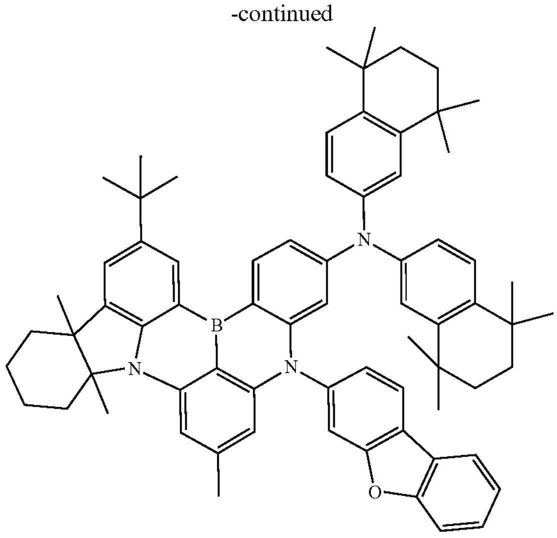
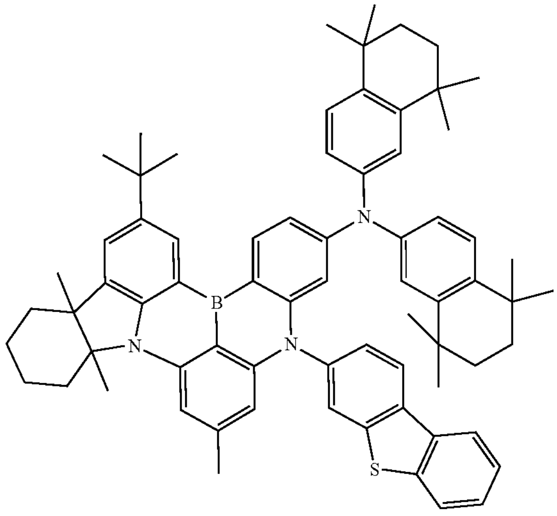
-continued
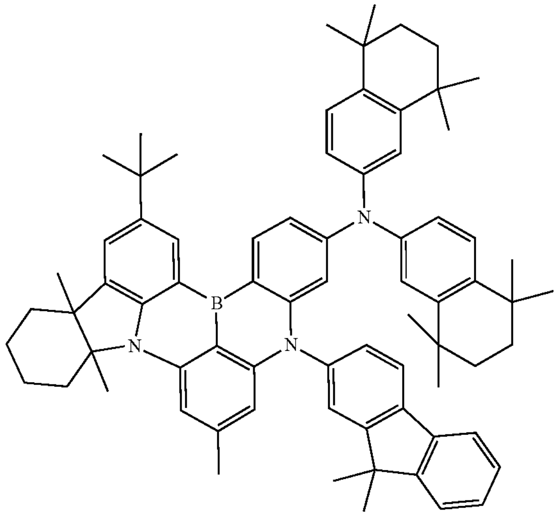

-continued
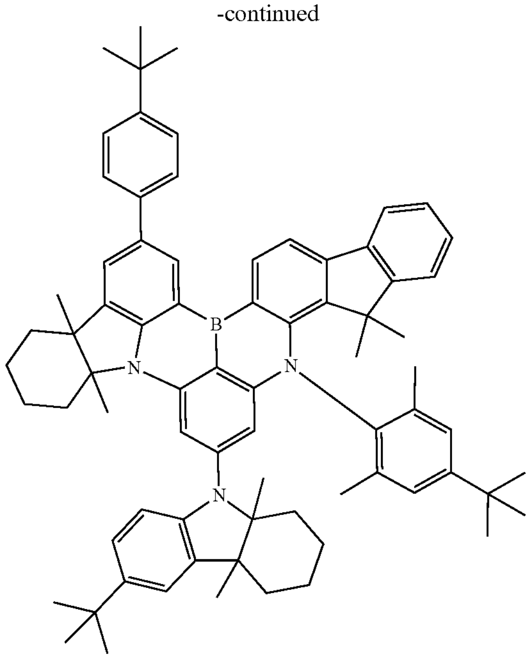
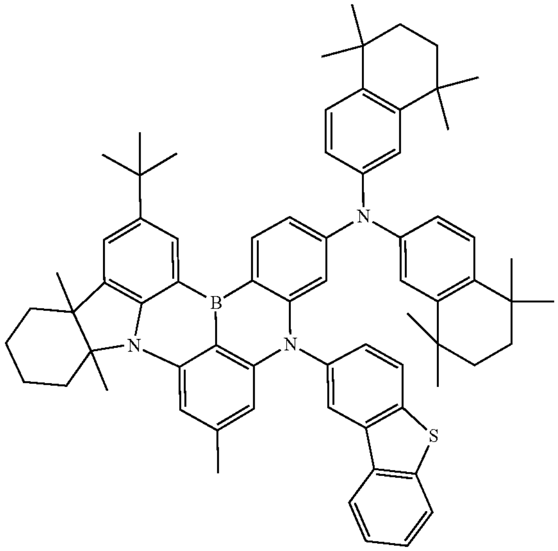
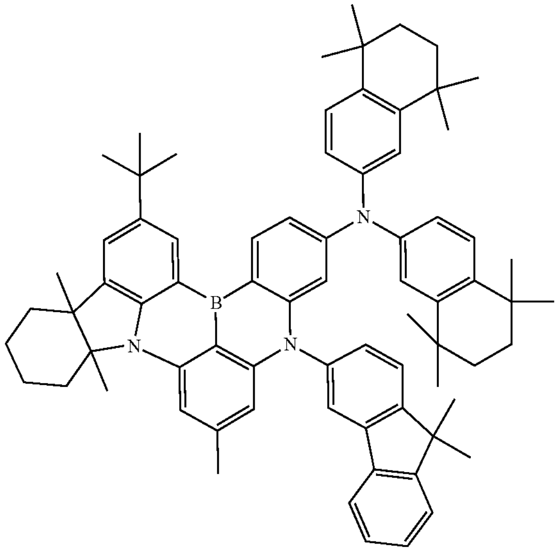
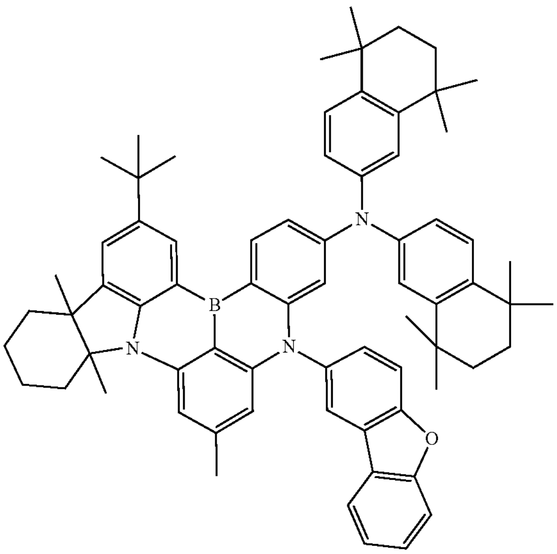
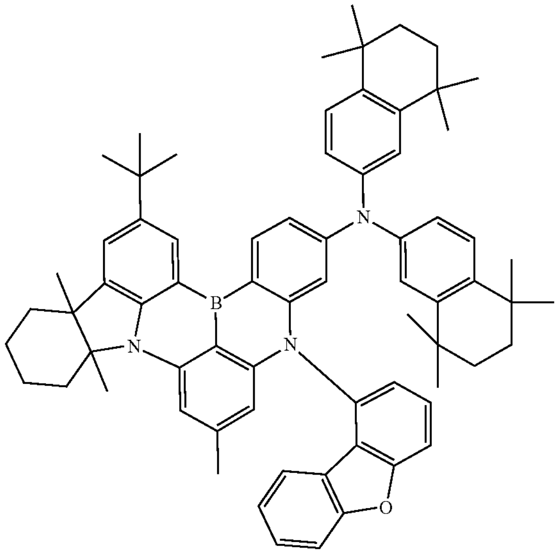

-continued
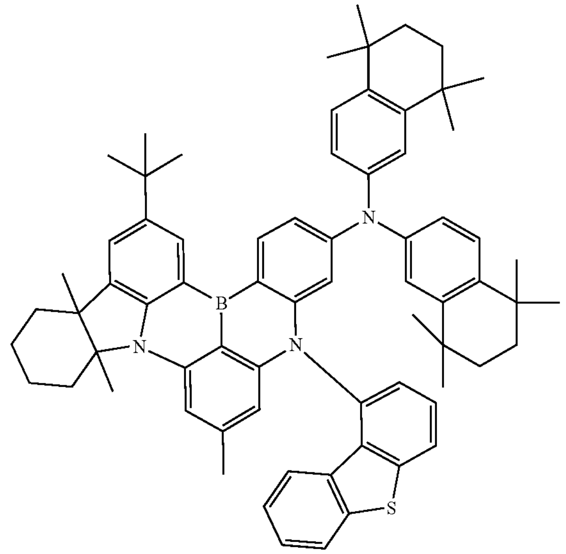
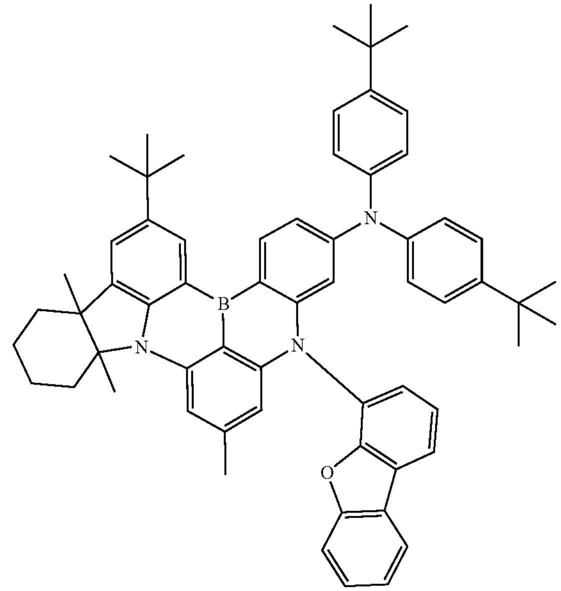
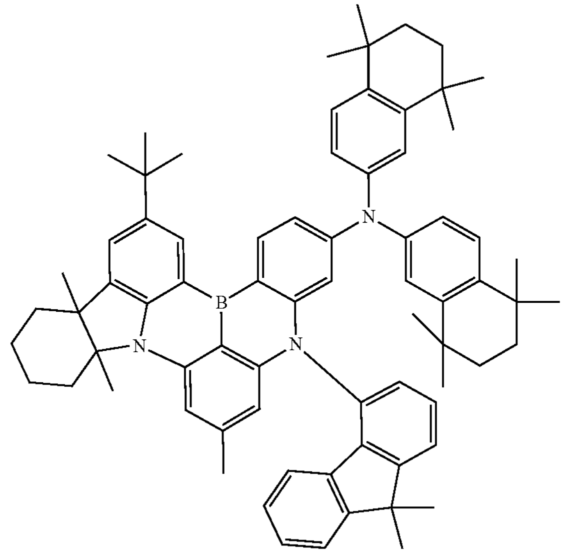
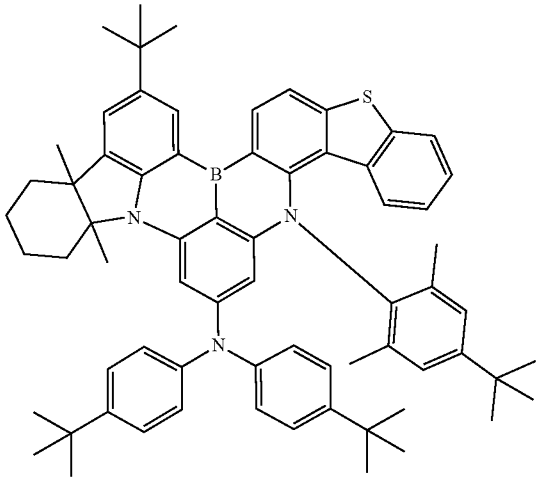
-continued
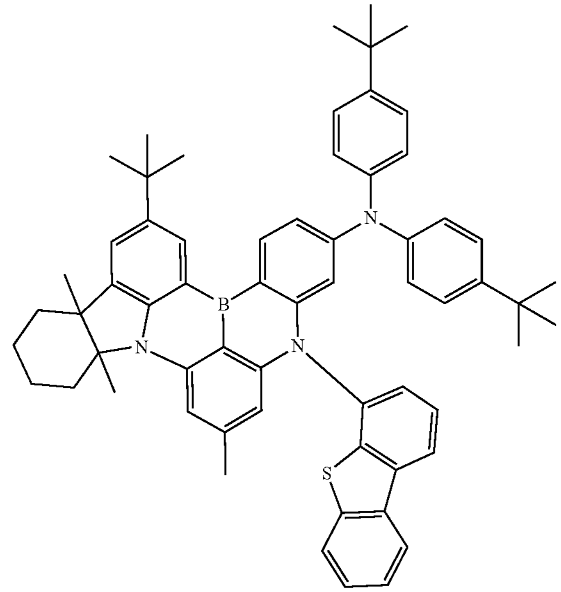

-continued
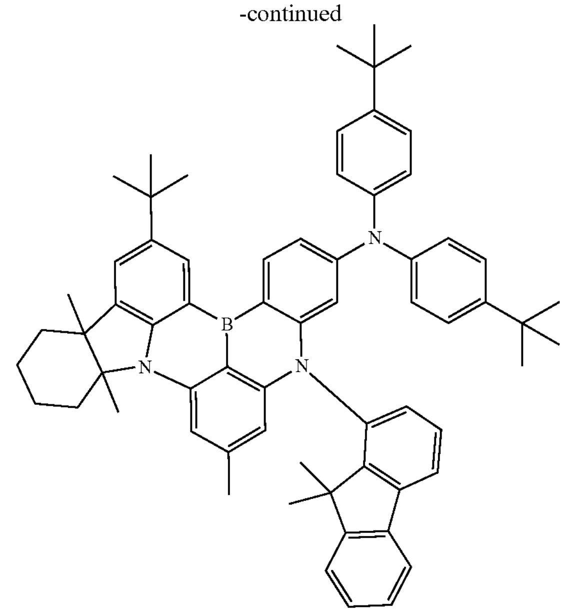
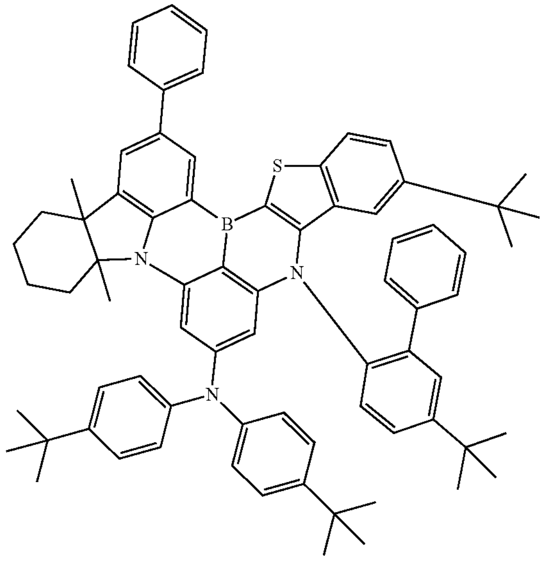
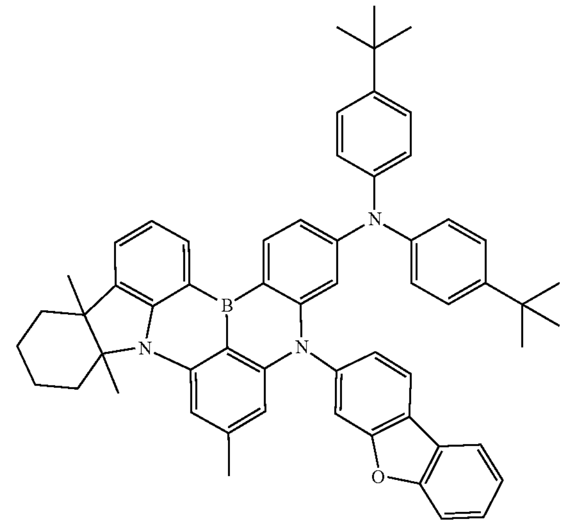
-continued
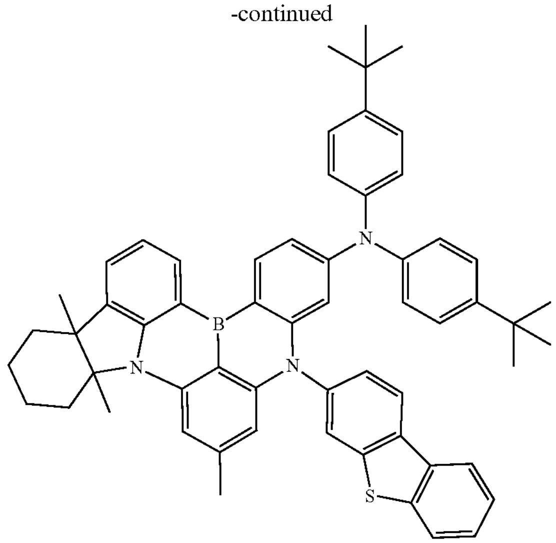
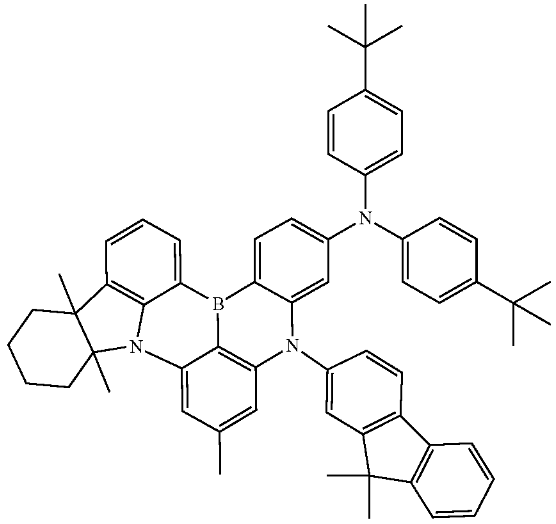
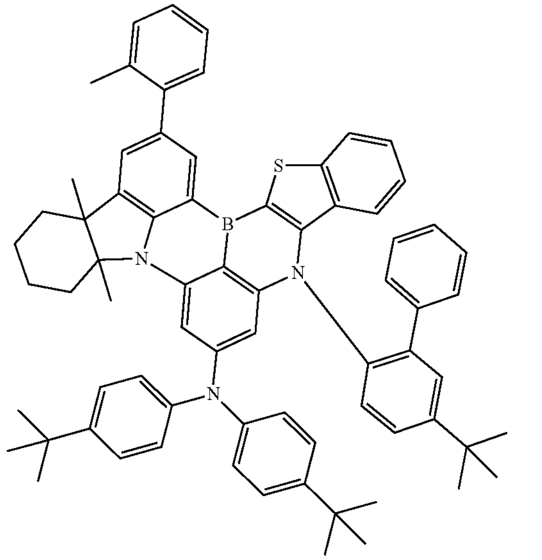

-continued
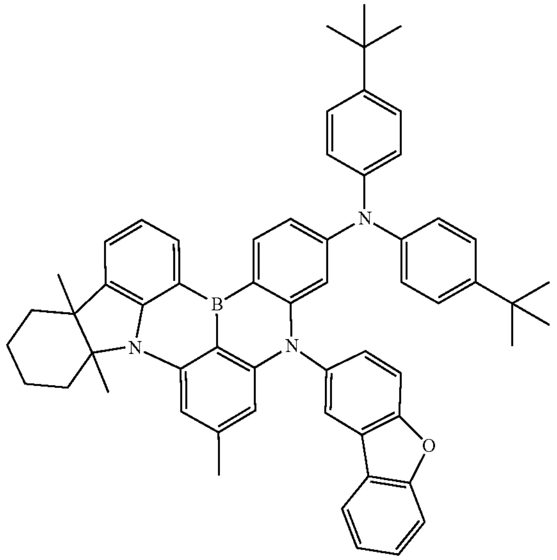
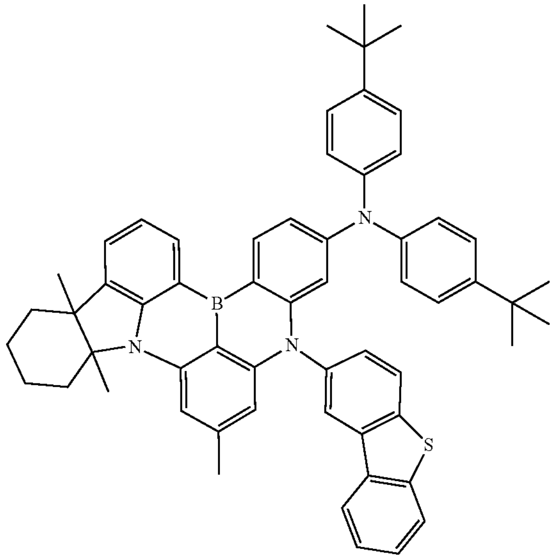
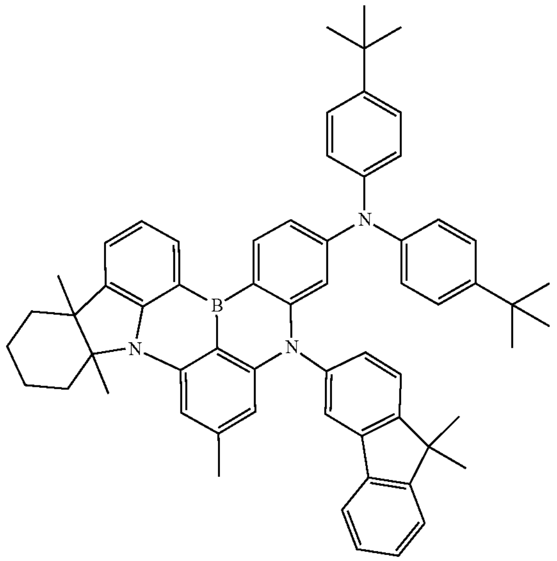
-continued
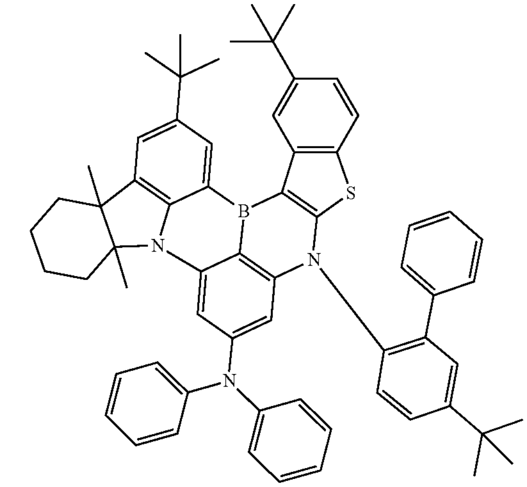
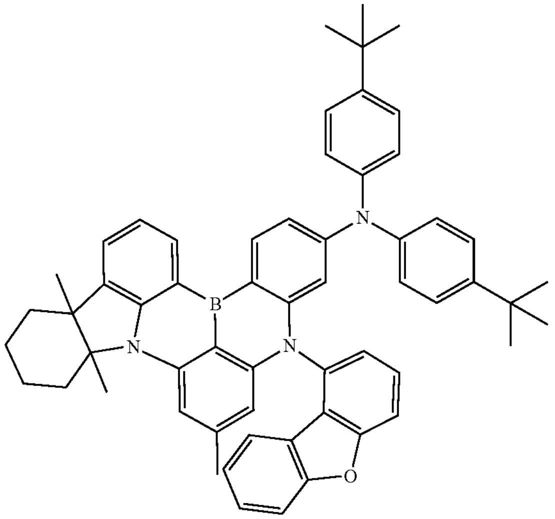
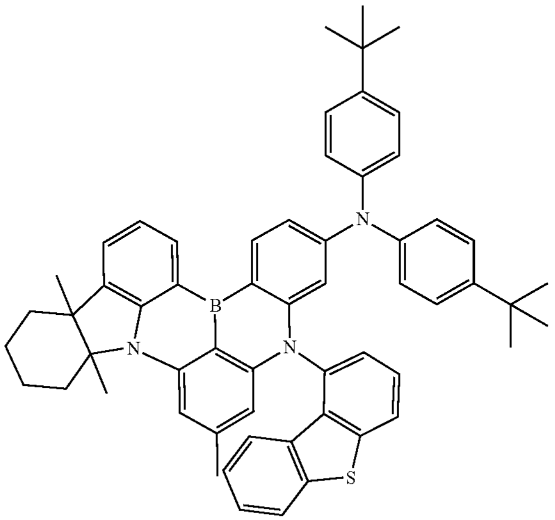

-continued
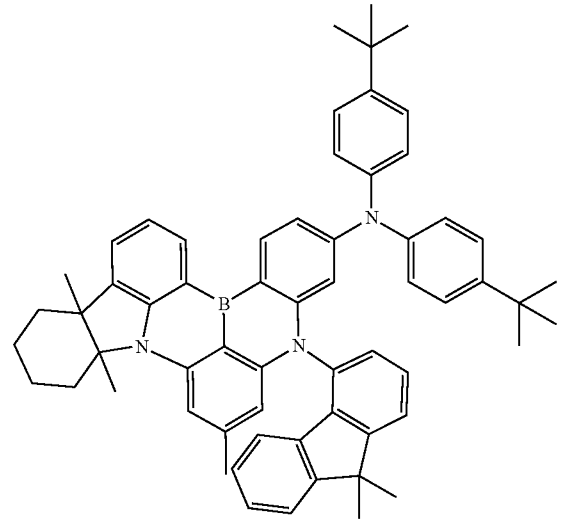
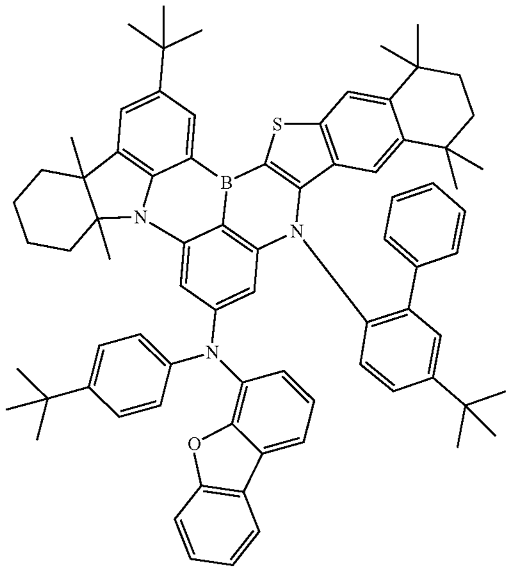
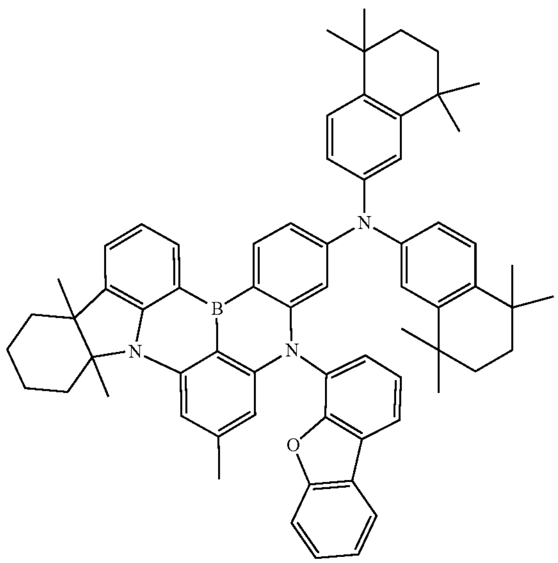
-continued
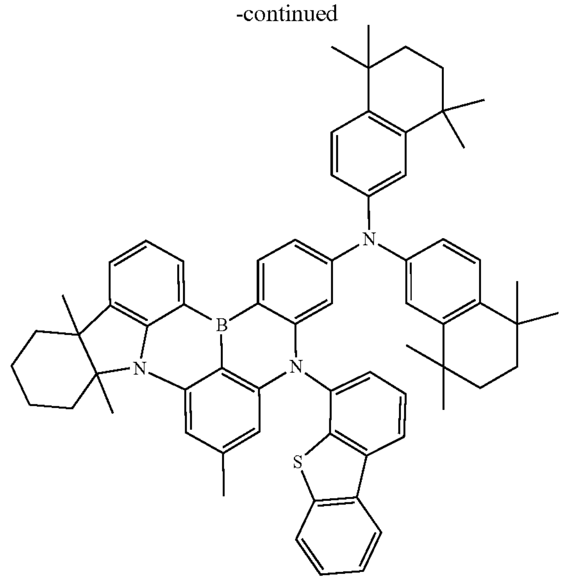
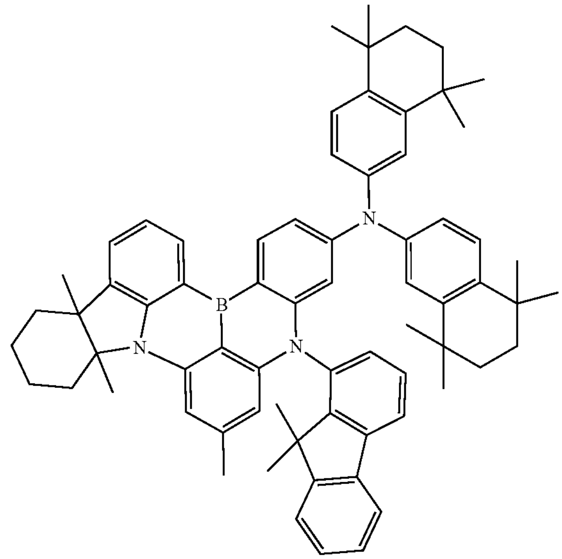
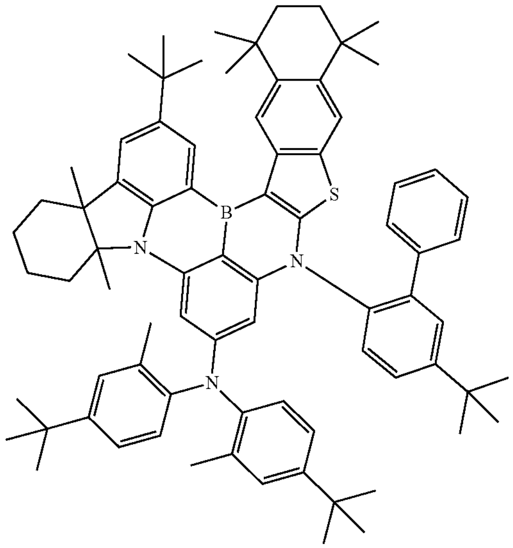

-continued
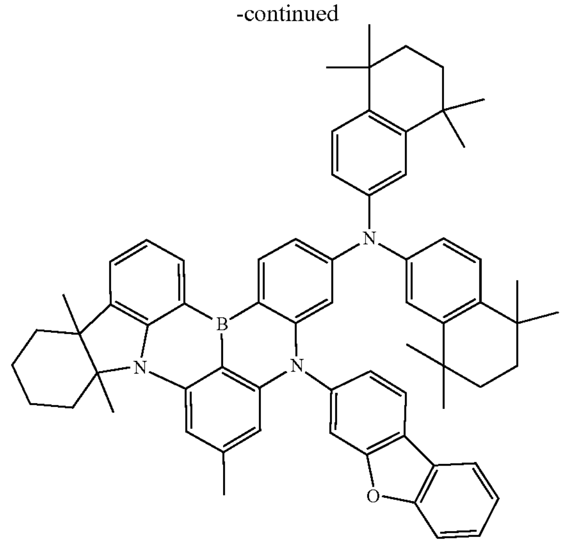
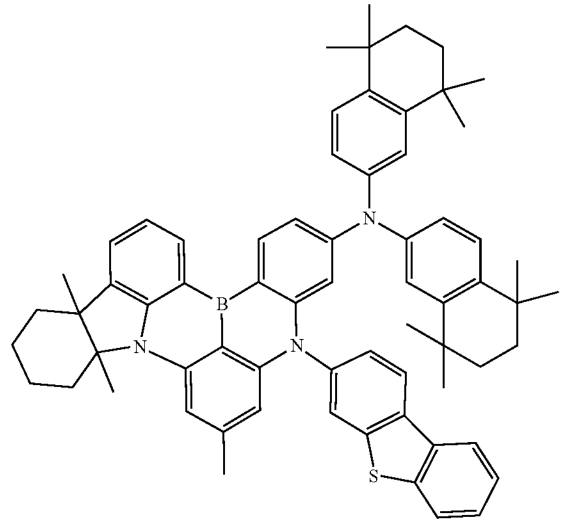
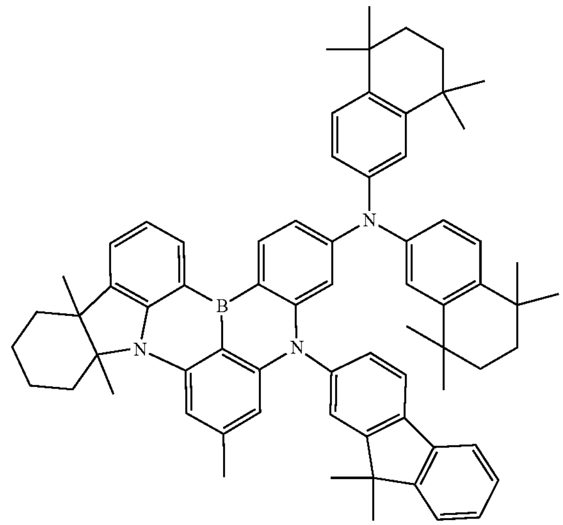
-continued
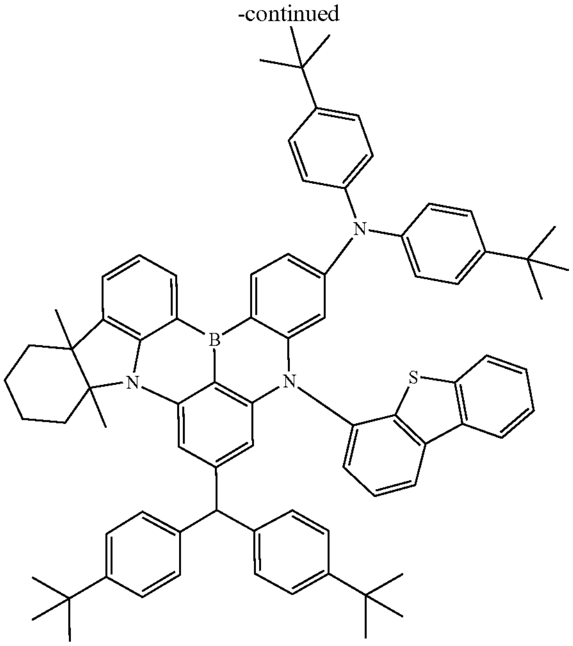
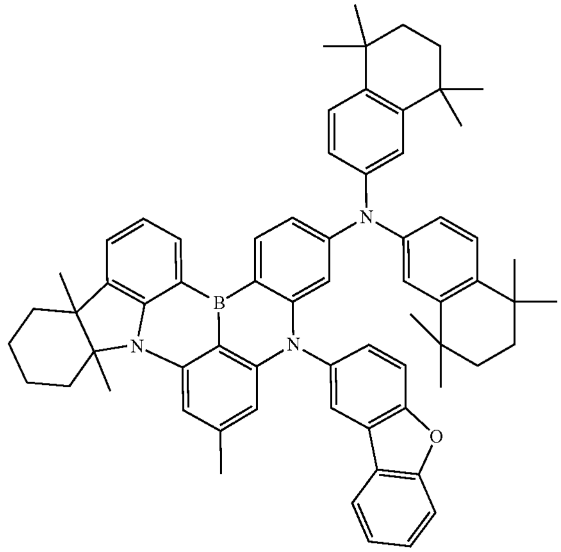
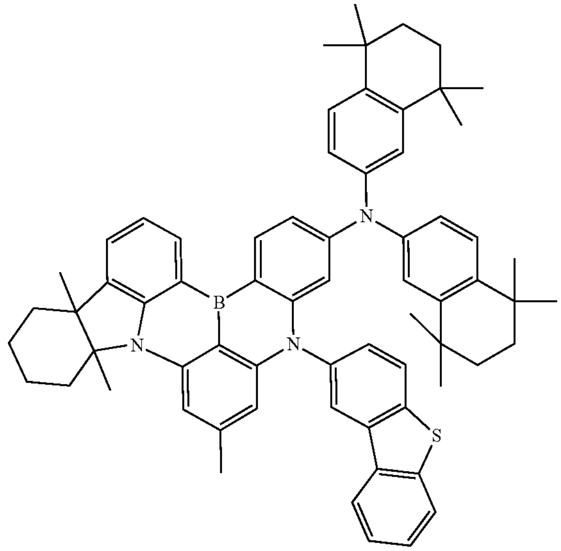

-continued
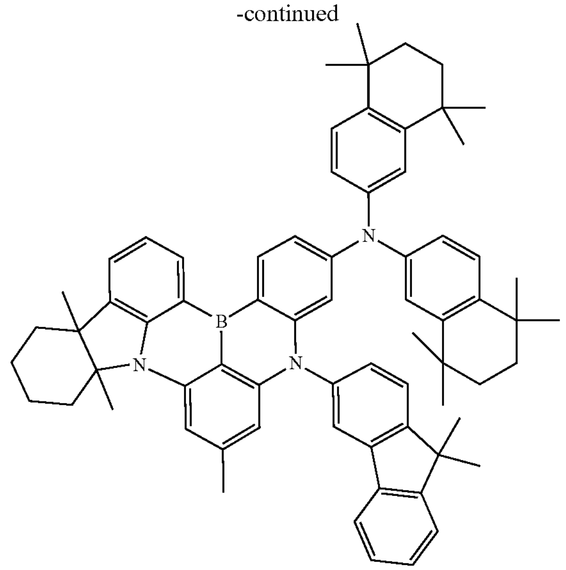
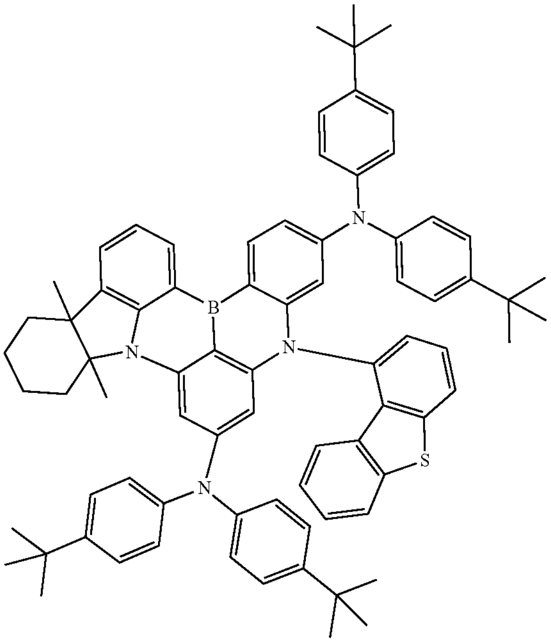
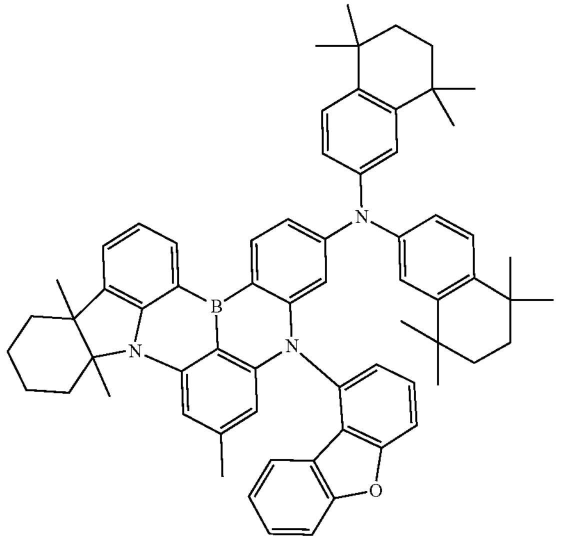
-continued
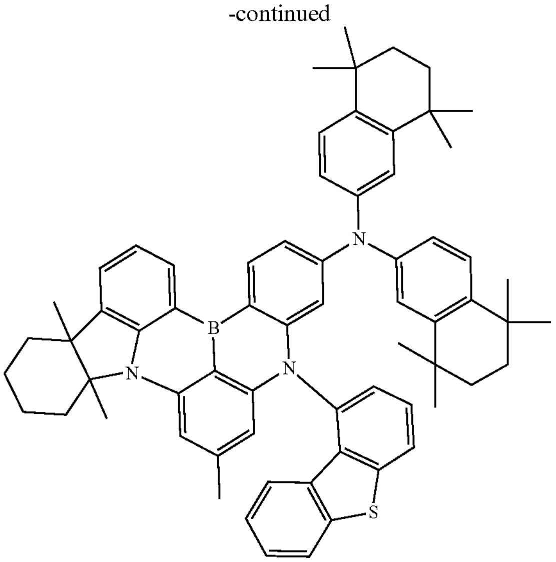
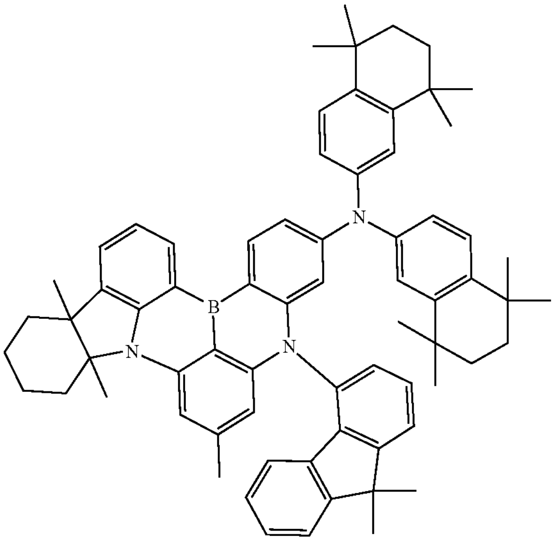
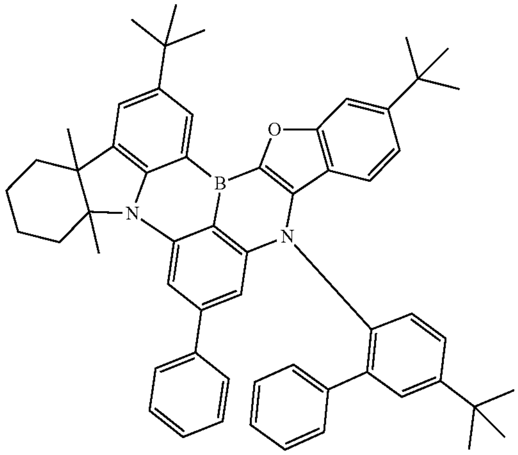

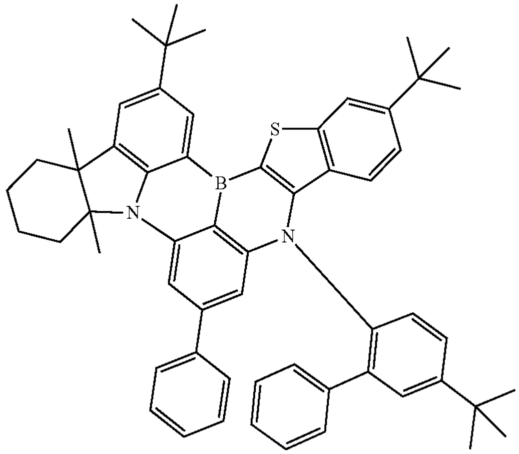
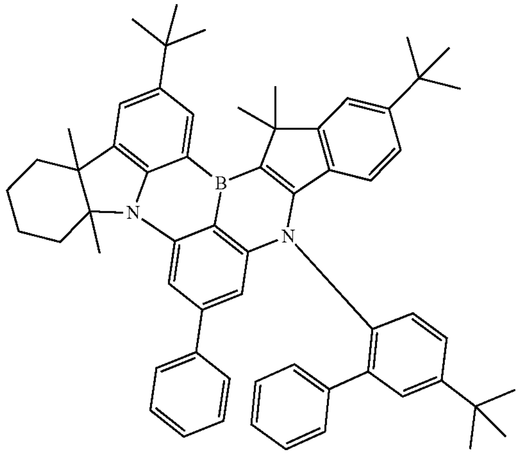
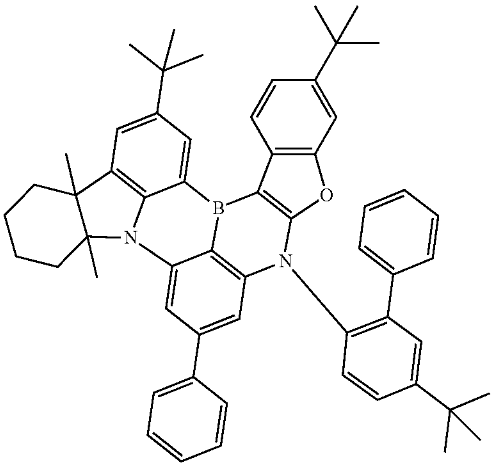
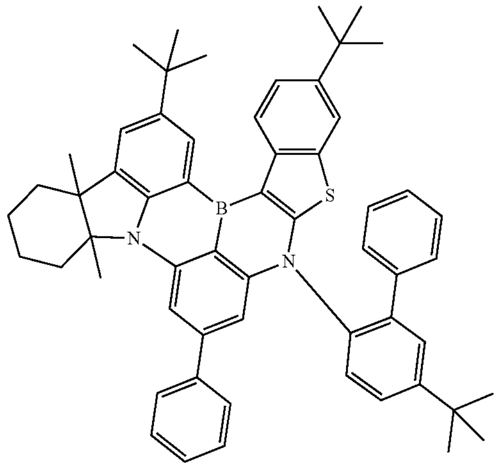
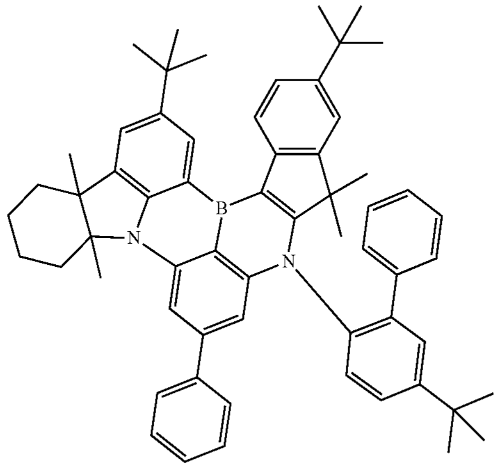
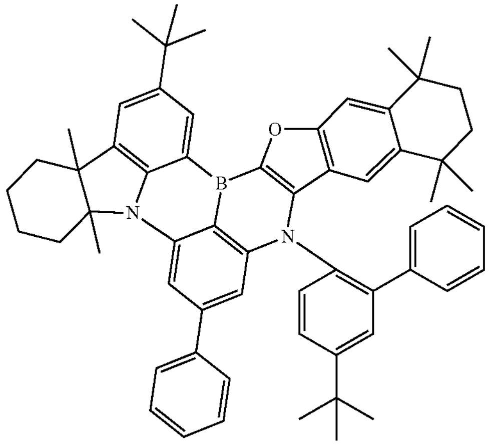

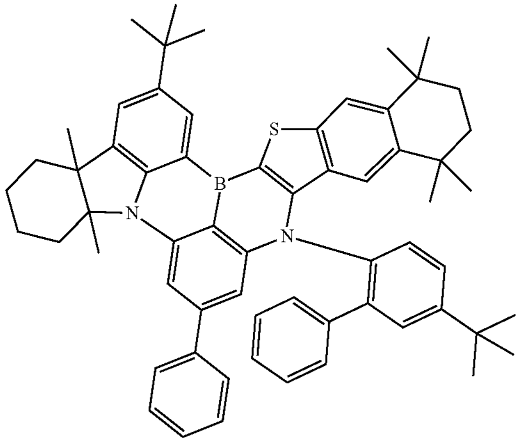
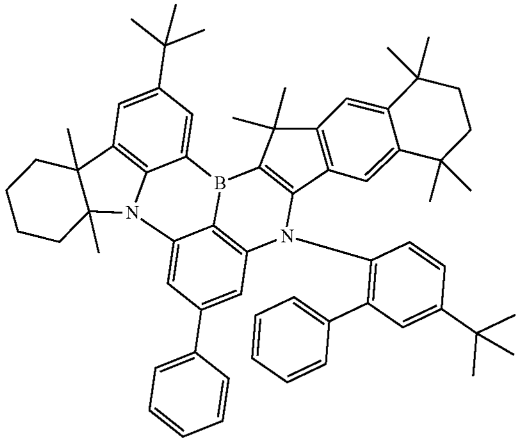
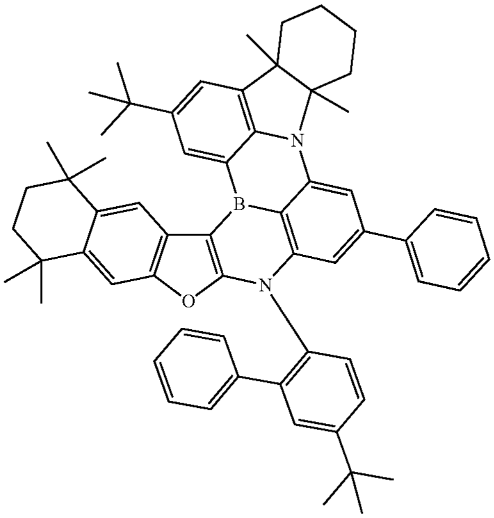
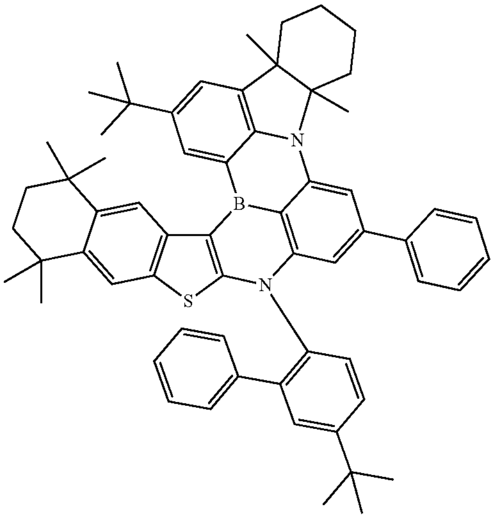
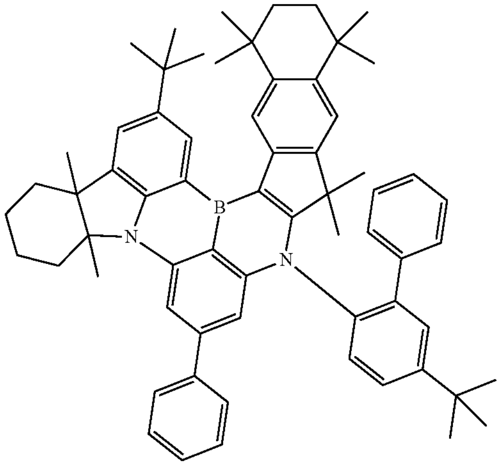
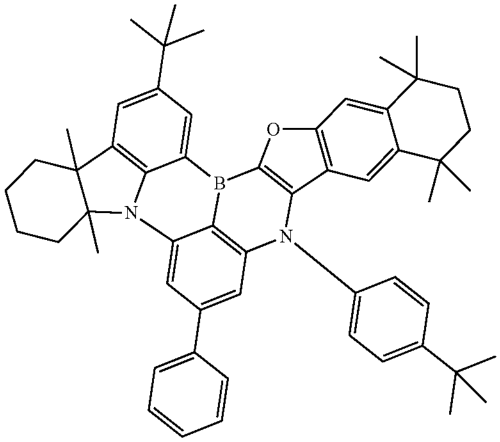

-continued
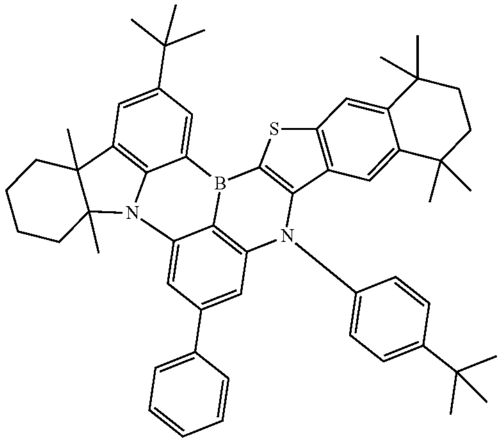
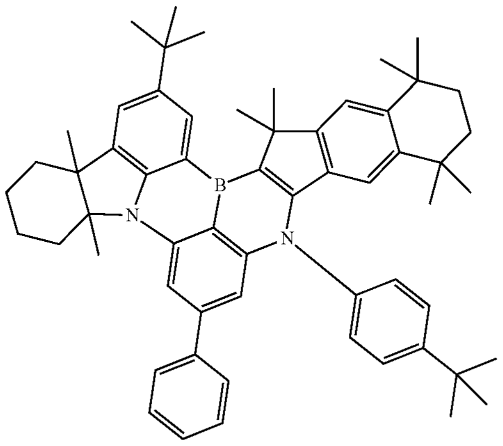
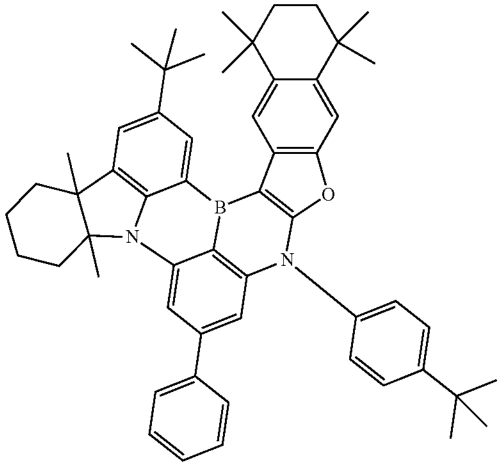
-continued
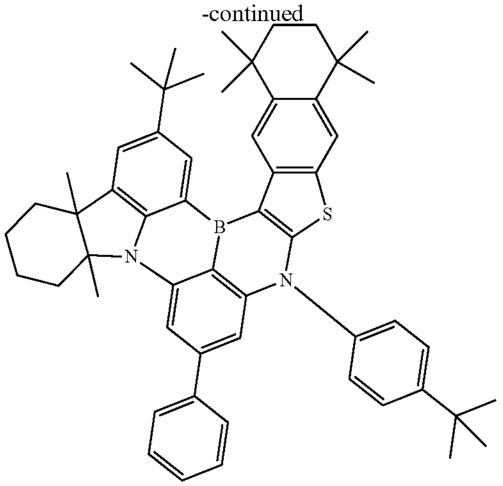
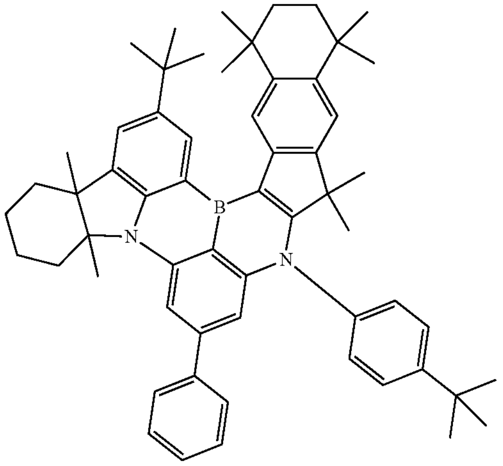
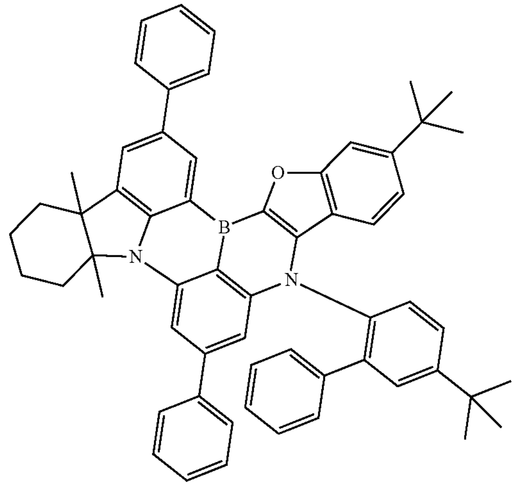

-continued
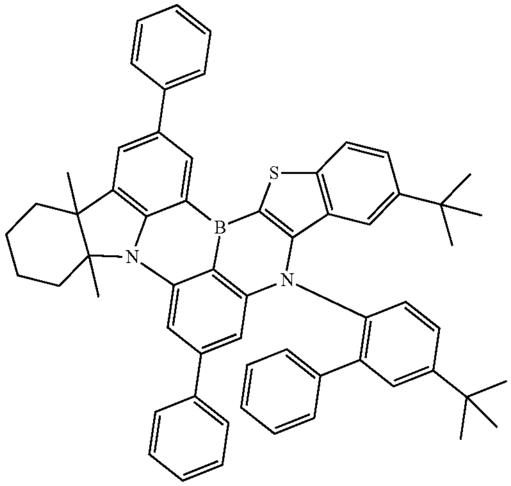
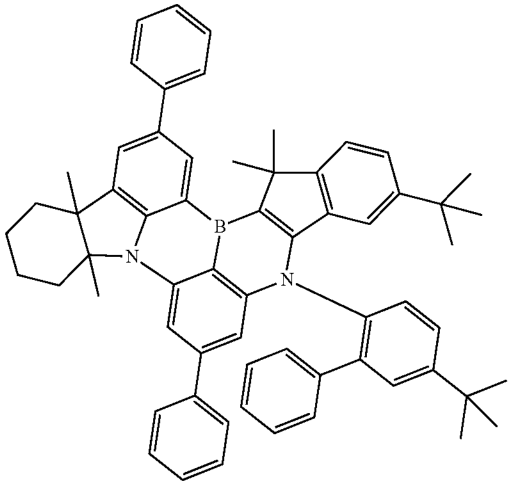
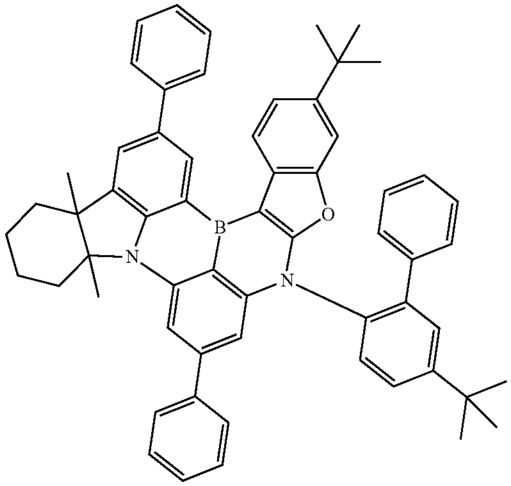
-continued
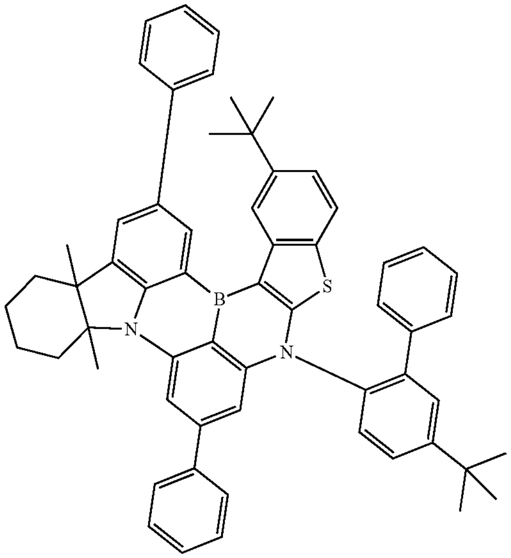
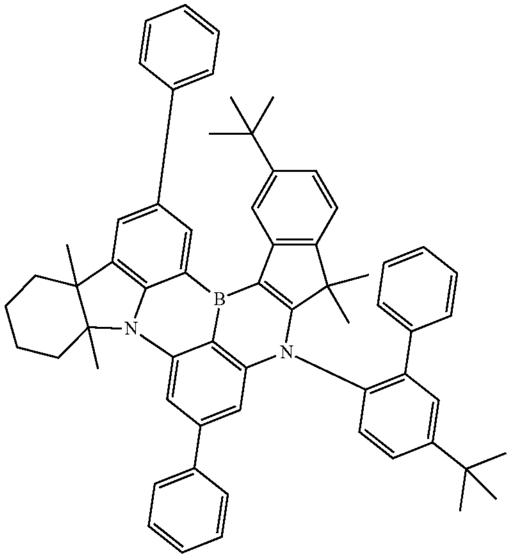
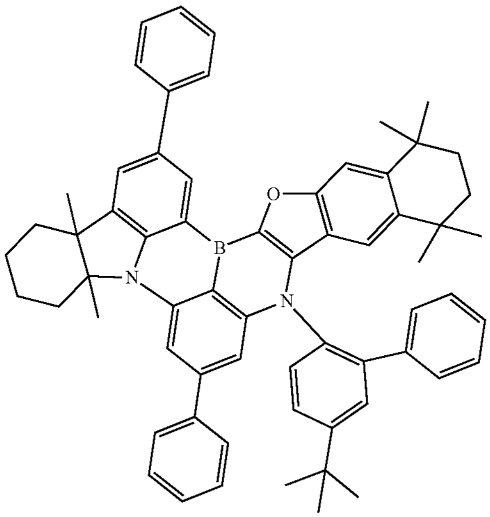

-continued
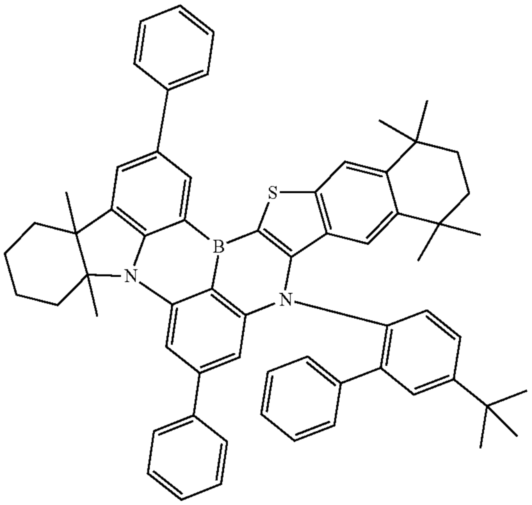
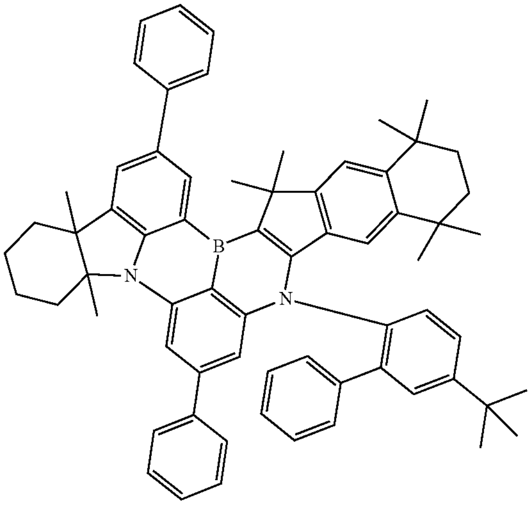
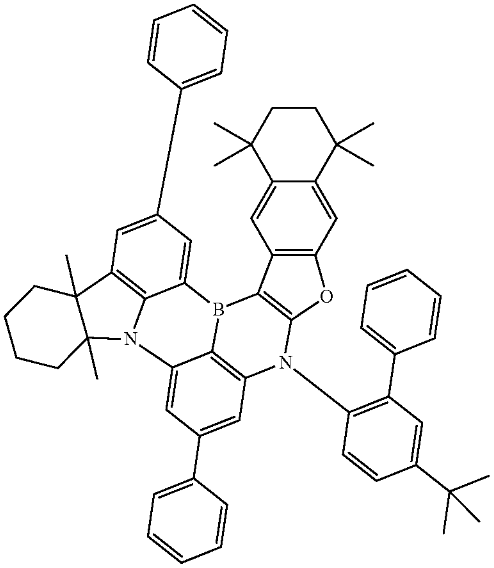
-continued
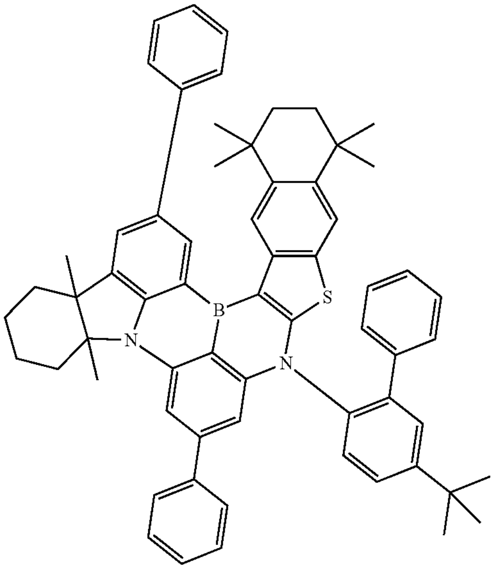
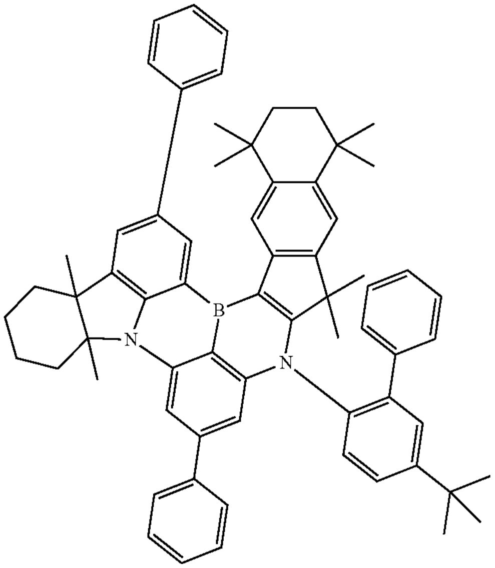
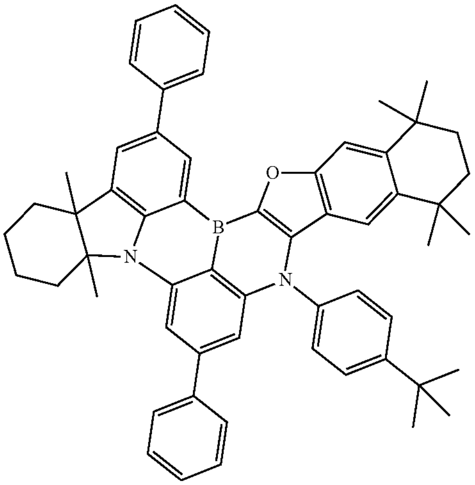

-continued
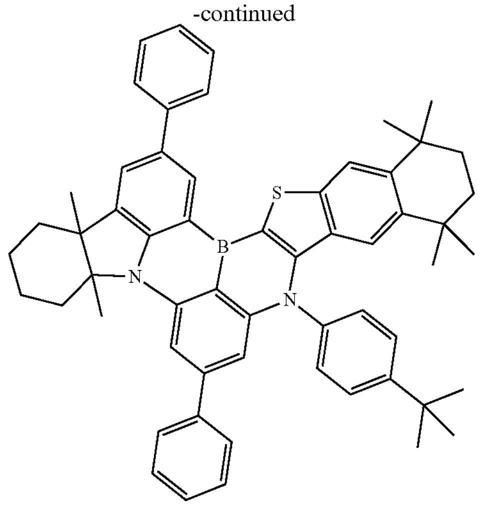
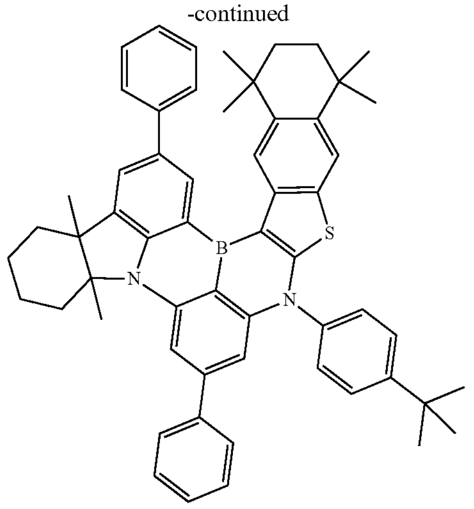
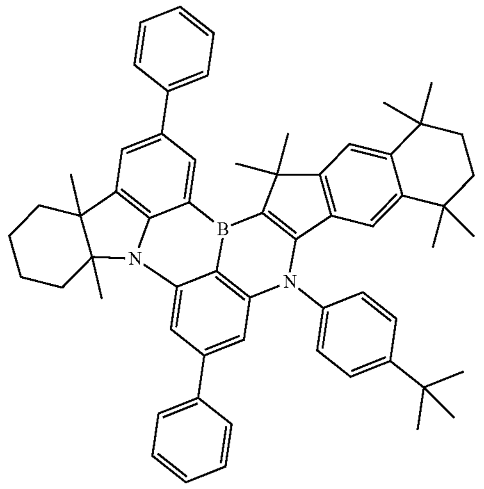
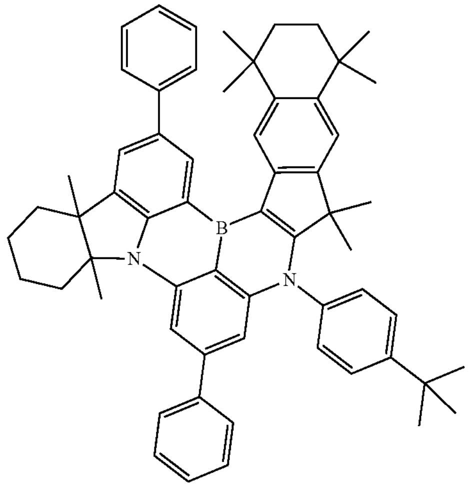
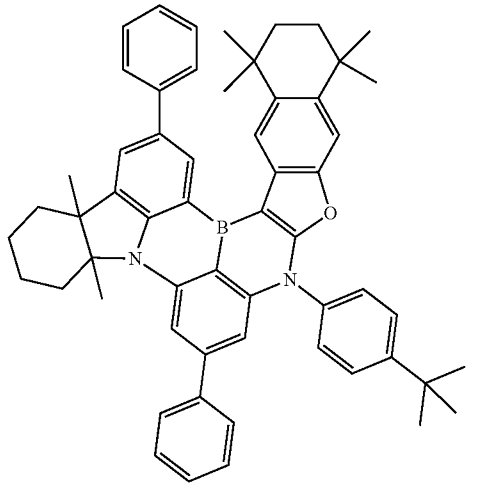
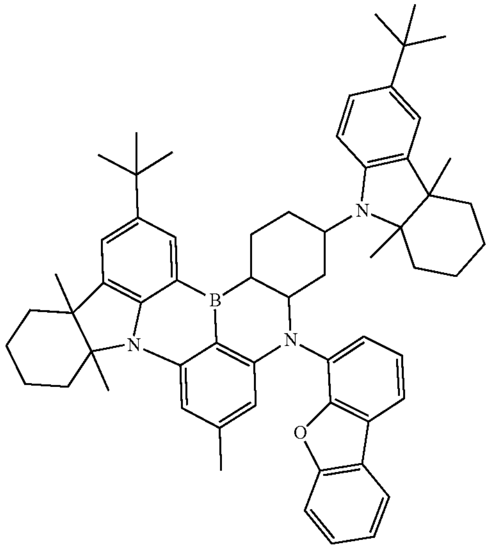
-continued -continued
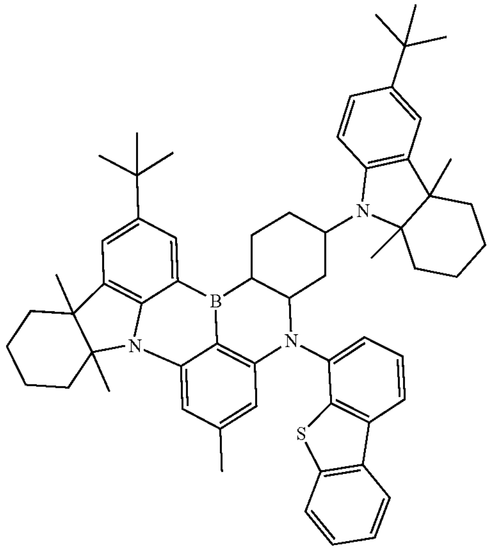
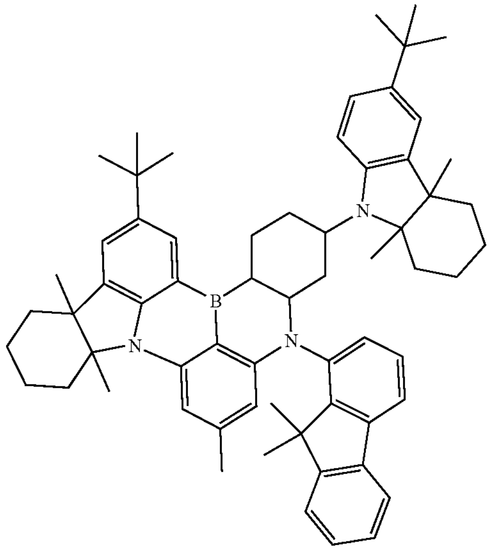
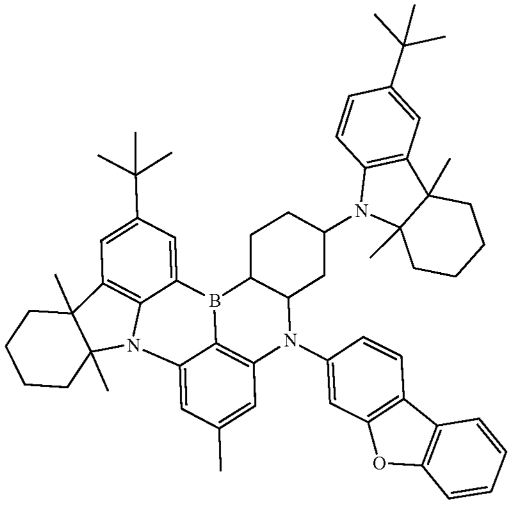
-continued
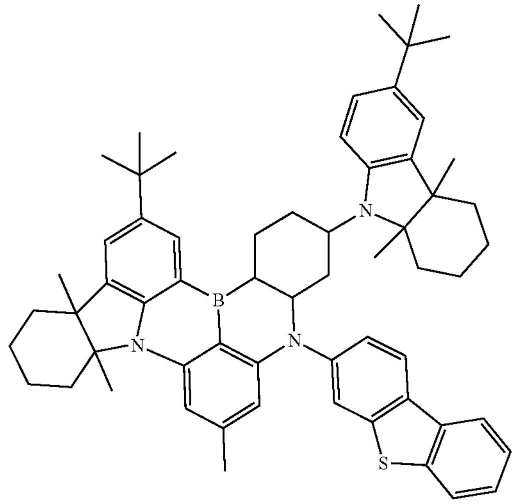
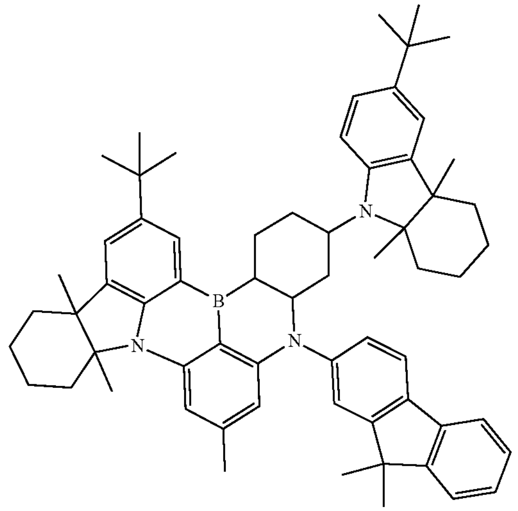
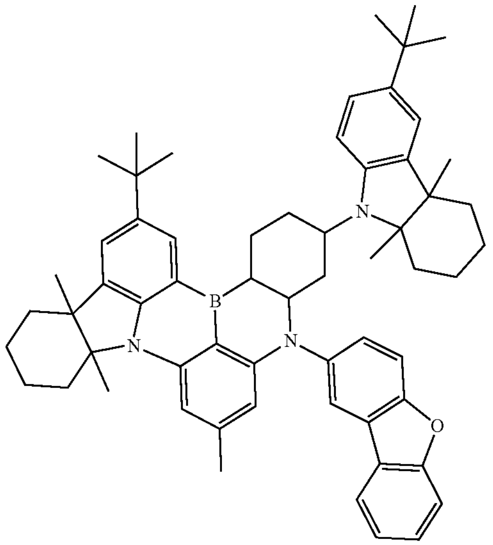

-continued
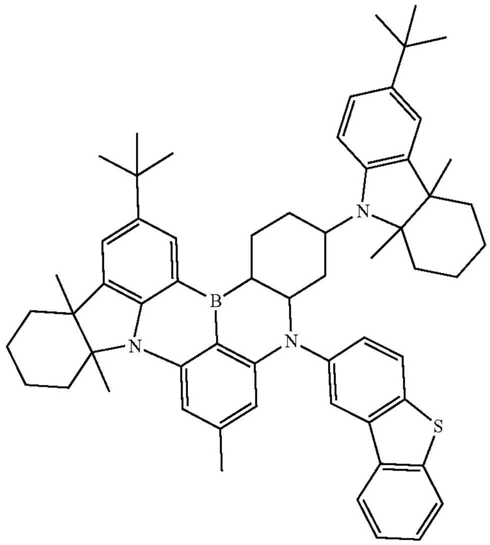
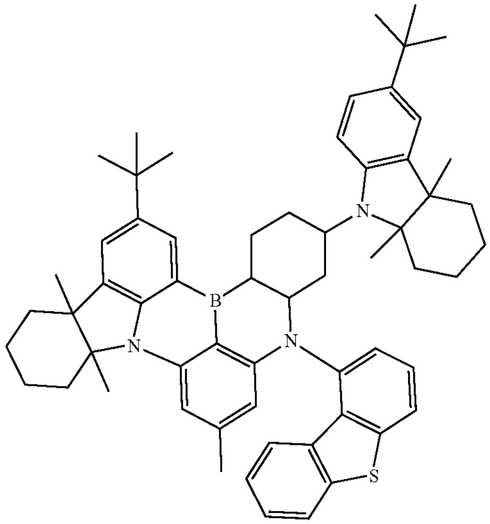
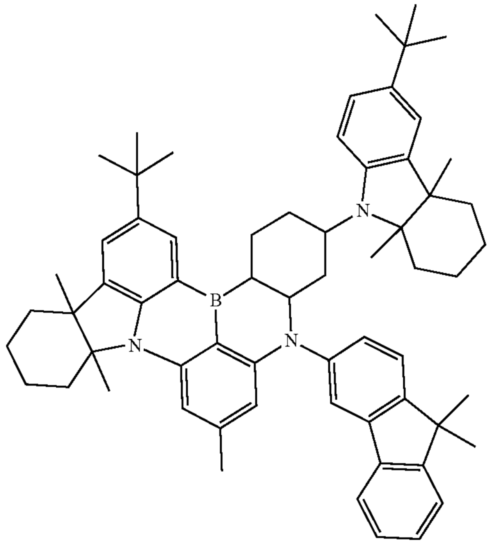
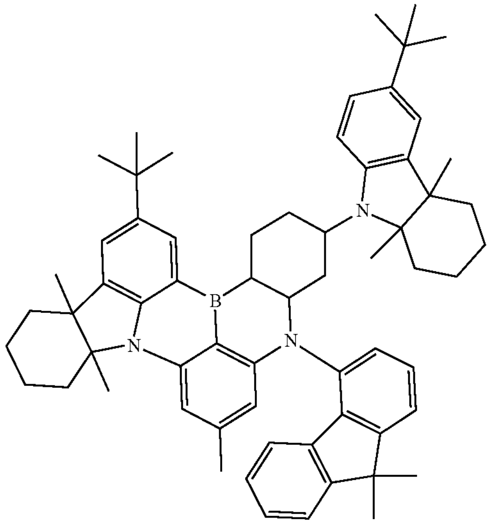 [SMILES: Cc1cc2c3c(c1)N1c4c(cc(C(C)(C)C)cc4C4(C)CCCCC14C)B3C1CCC(N3c4ccc(C(C)(C)C)cc4C4(C)CCCCC34C)CC1N2c1cccc2c1-c1ccccc1C2(C)C]
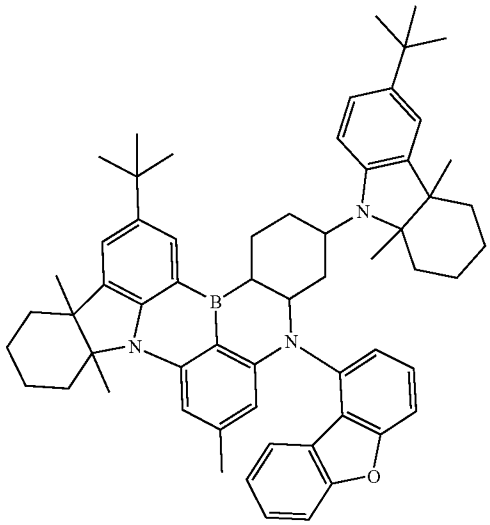
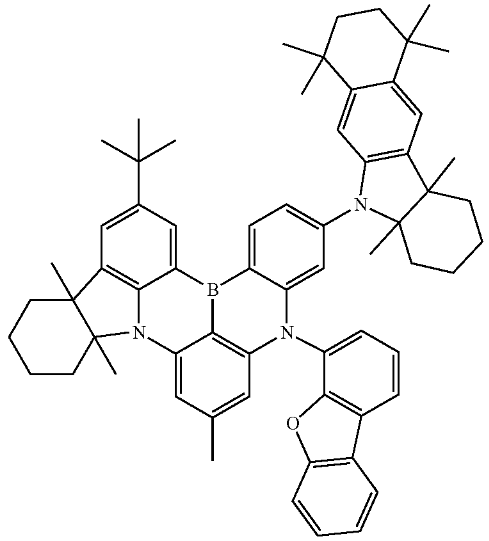

-continued
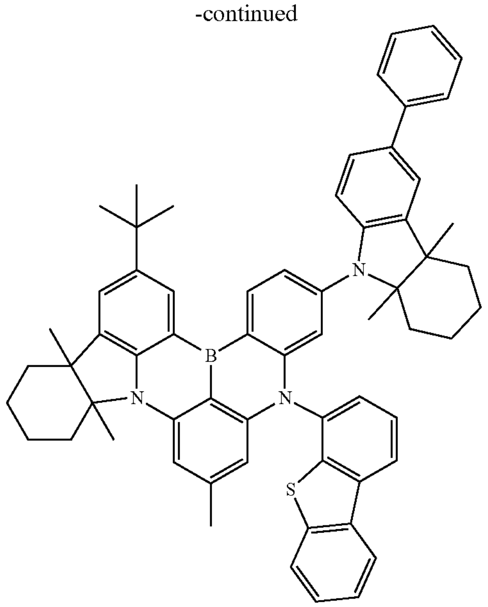
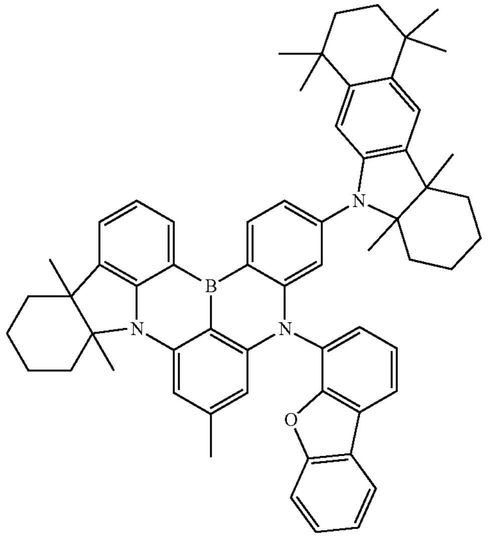
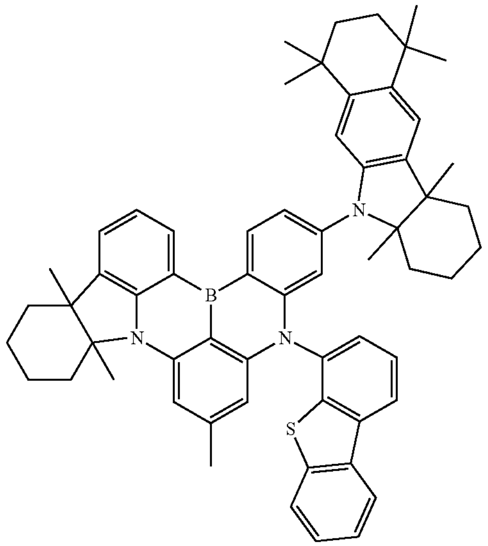
-continued
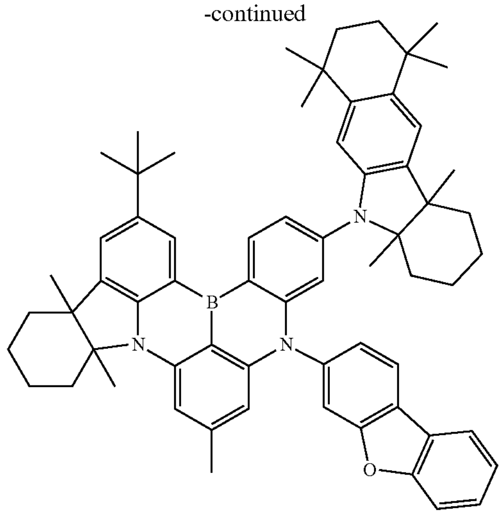
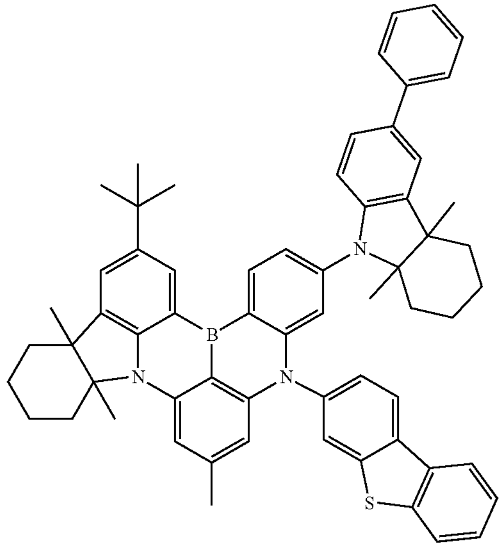
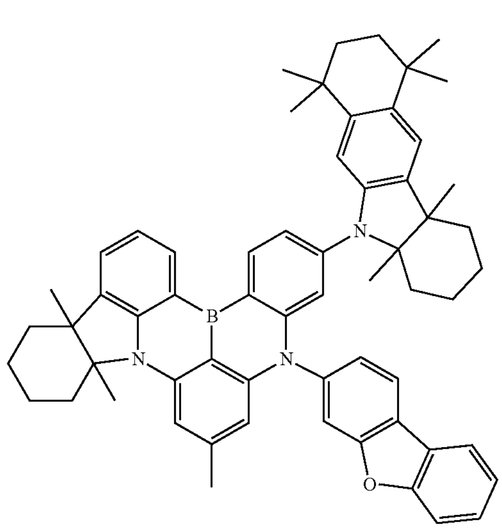

-continued
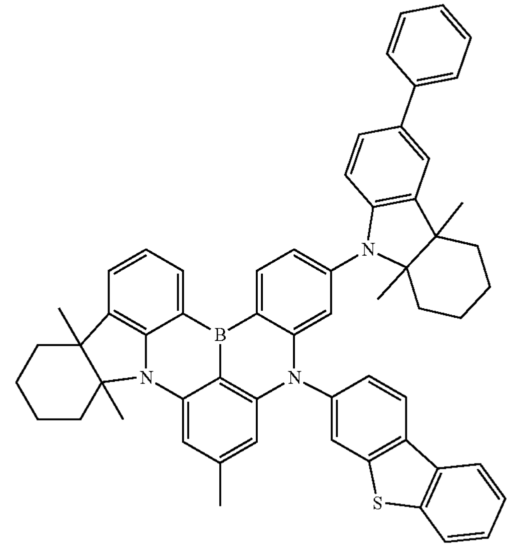
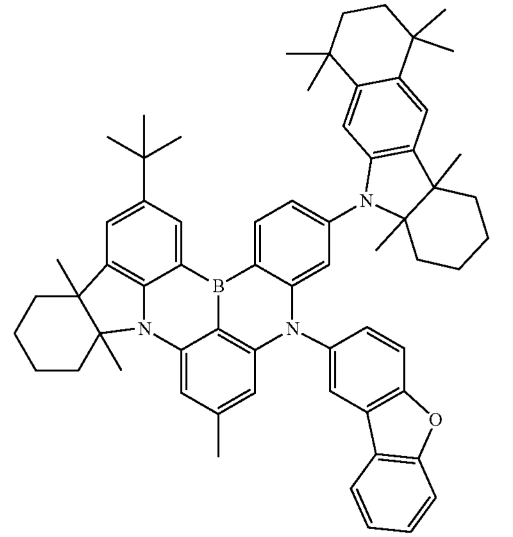
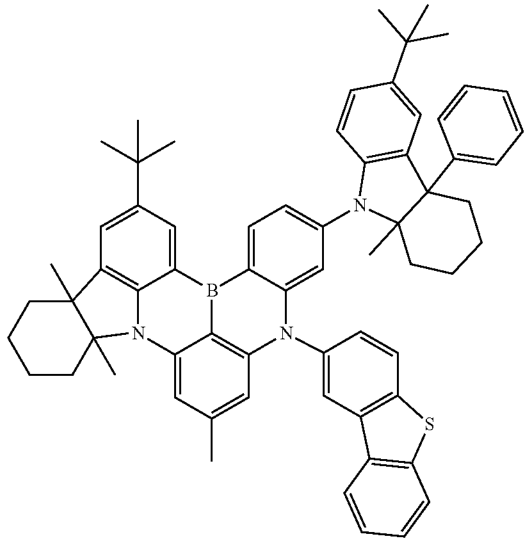
-continued
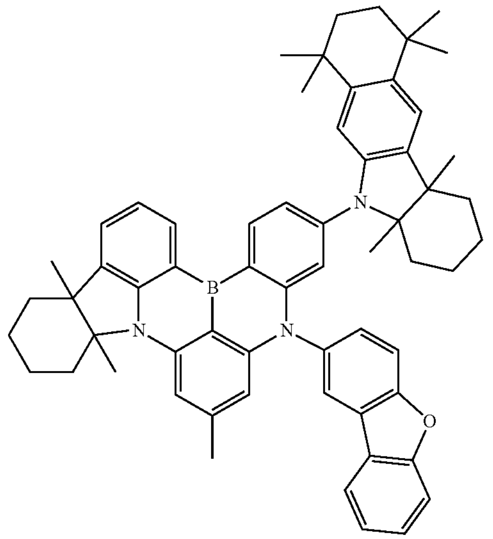
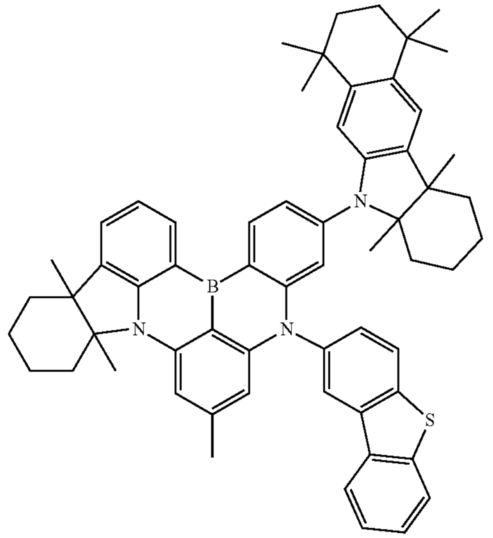
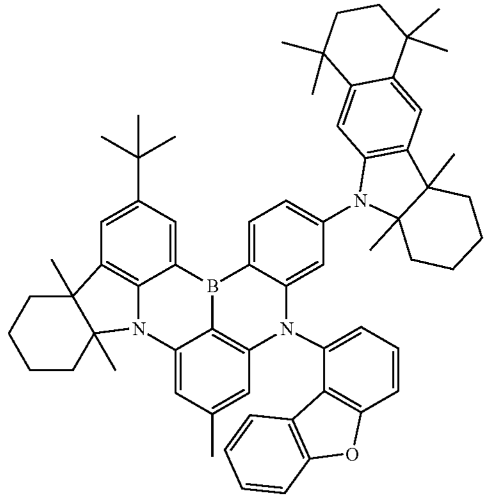

-continued
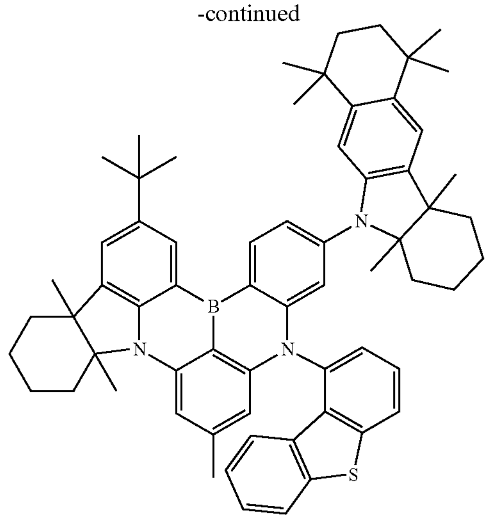
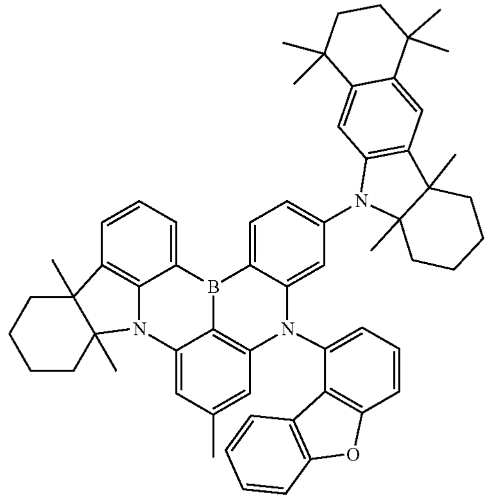
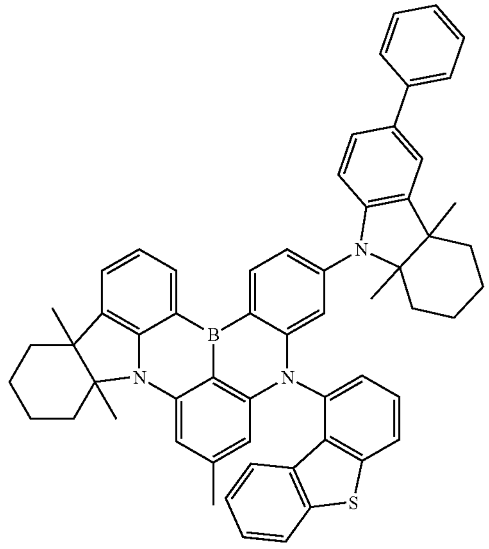
-continued
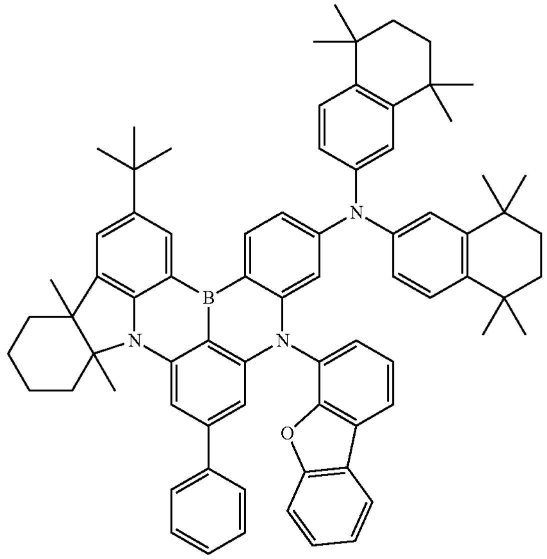
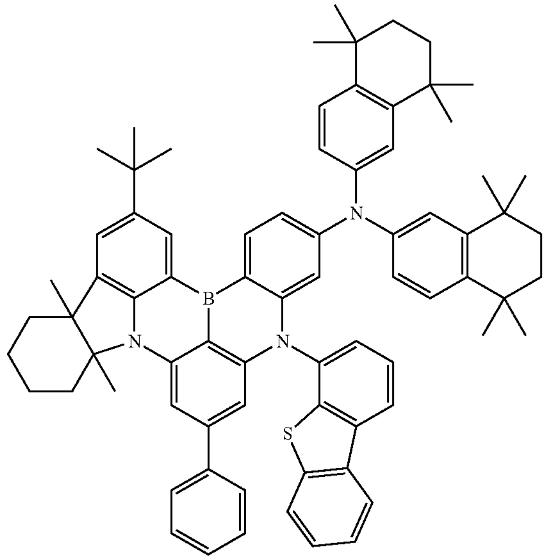
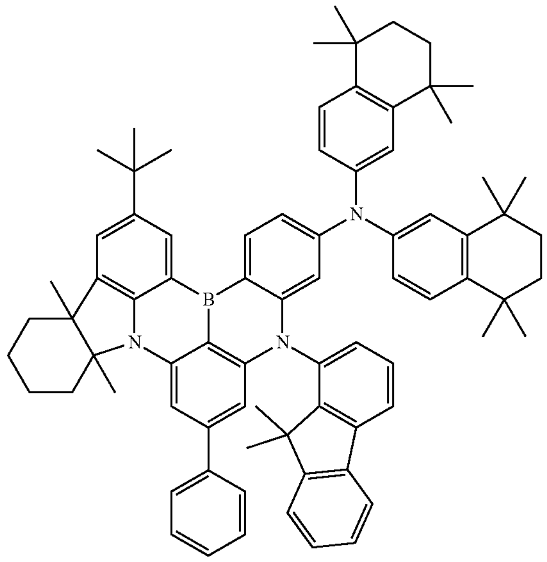

-continued
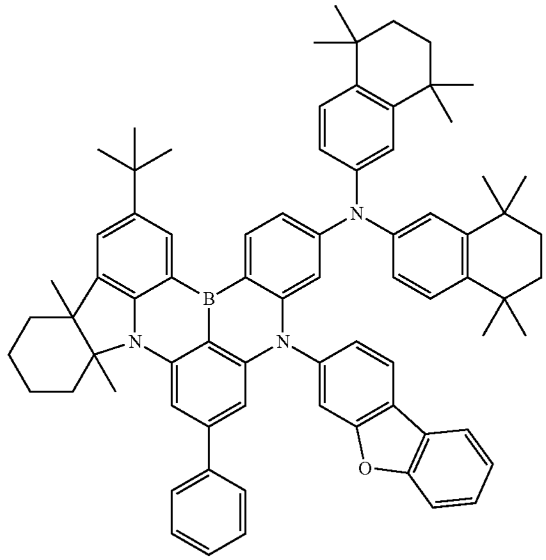
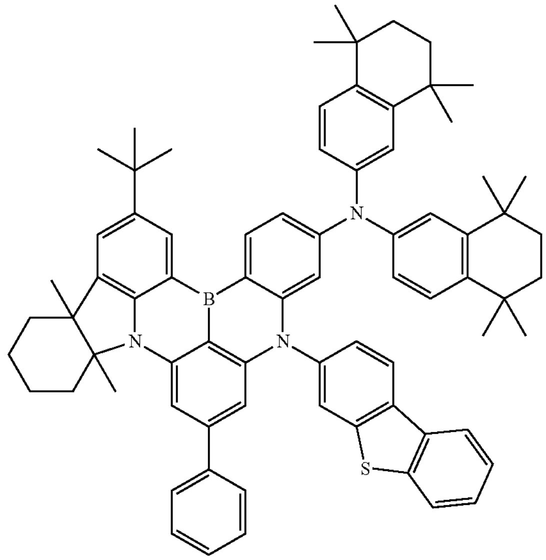
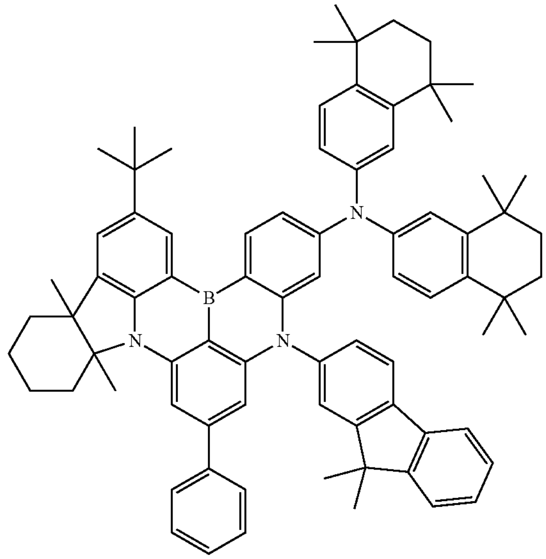
-continued
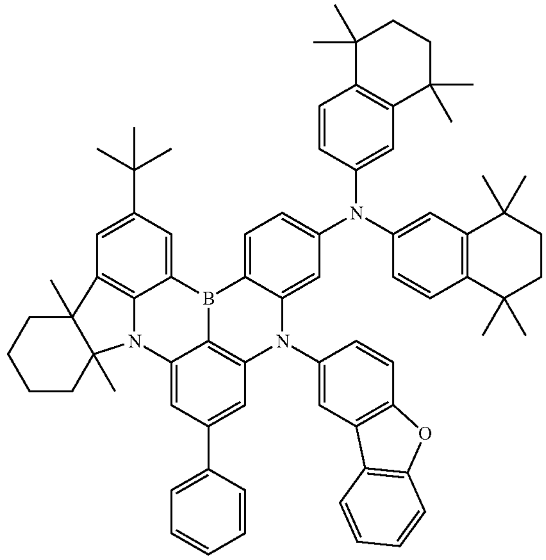
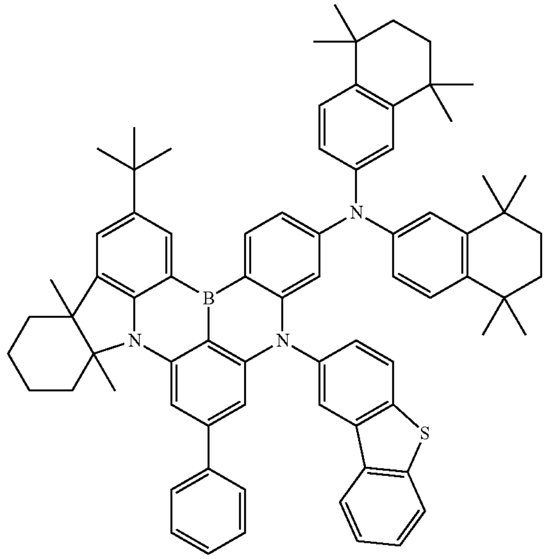
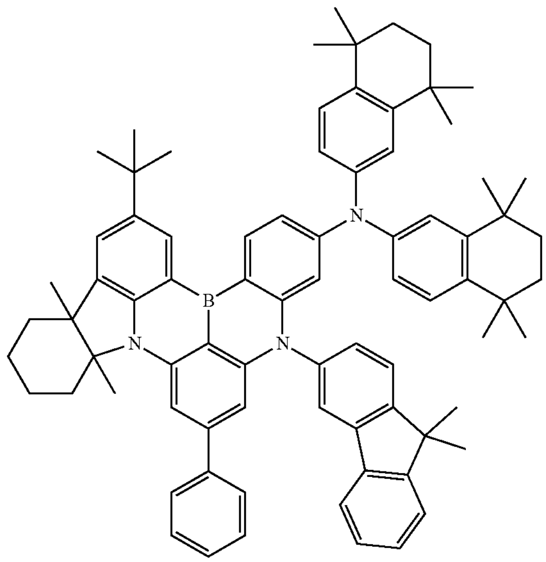

-continued
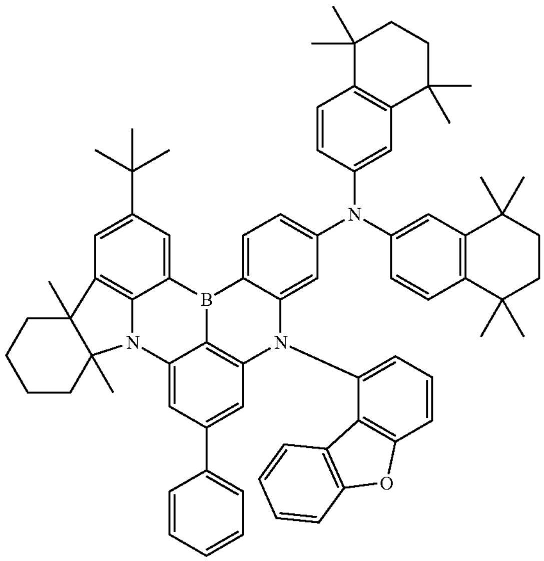
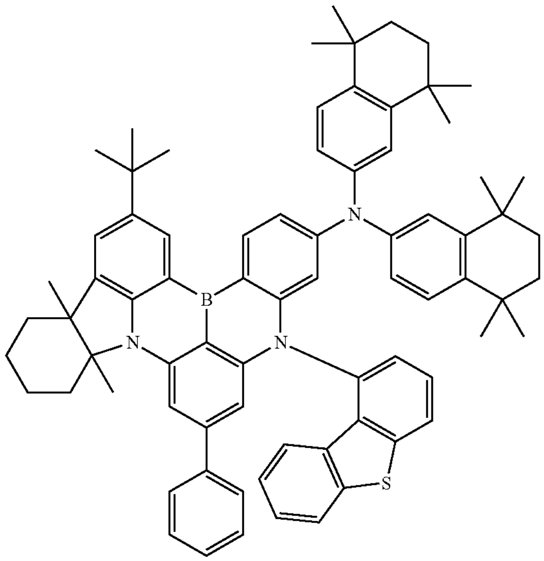
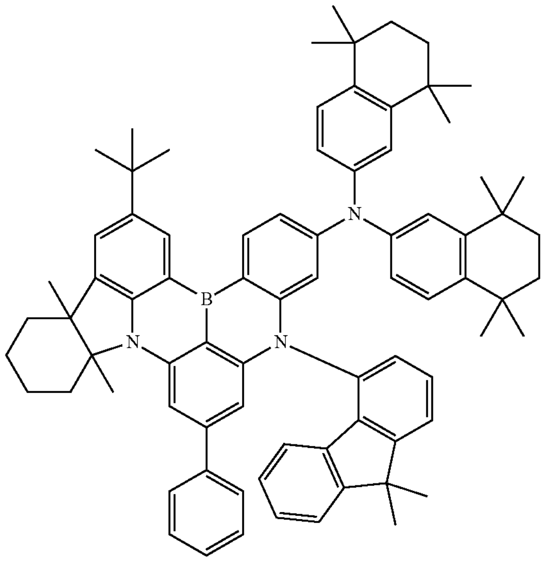
-continued
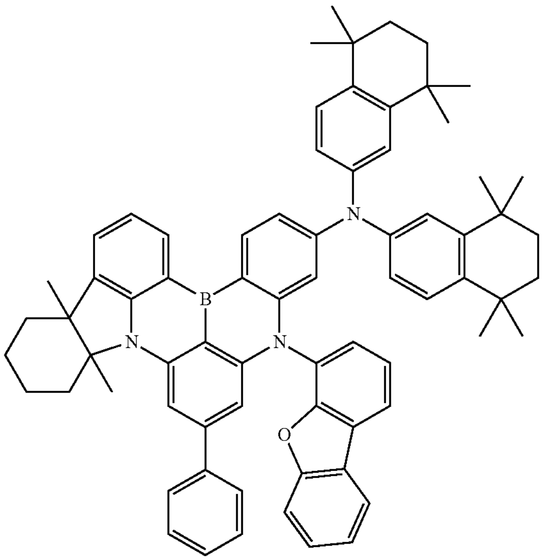
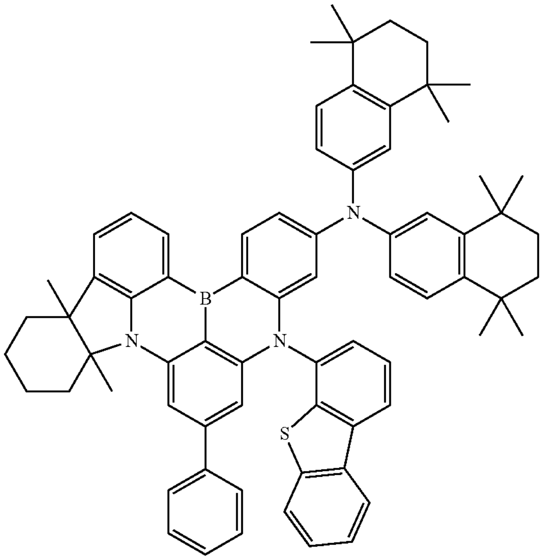
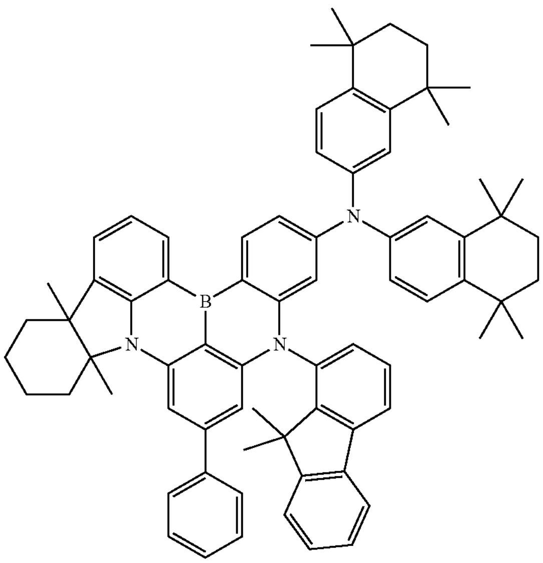

-continued
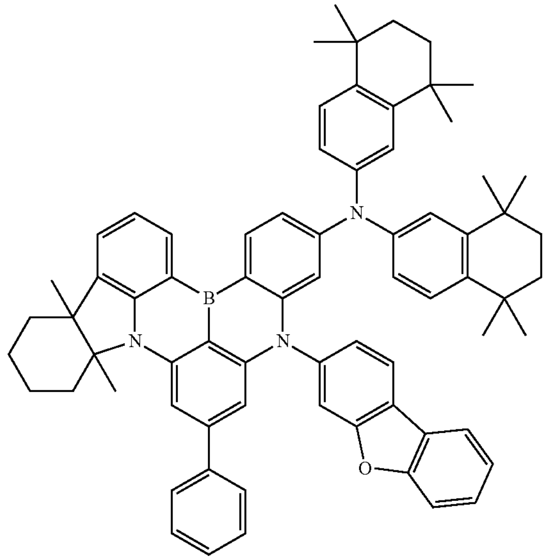
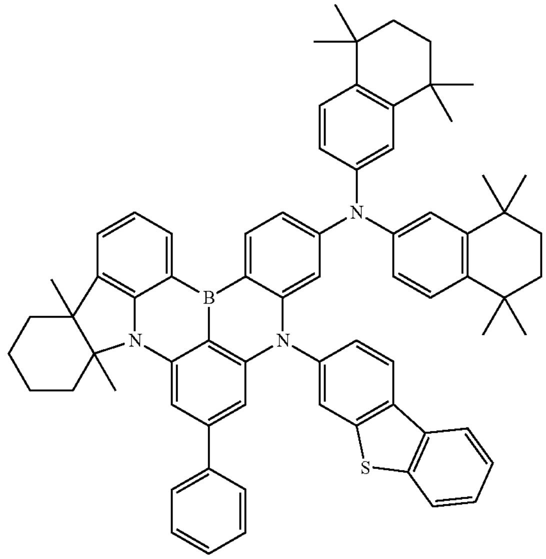
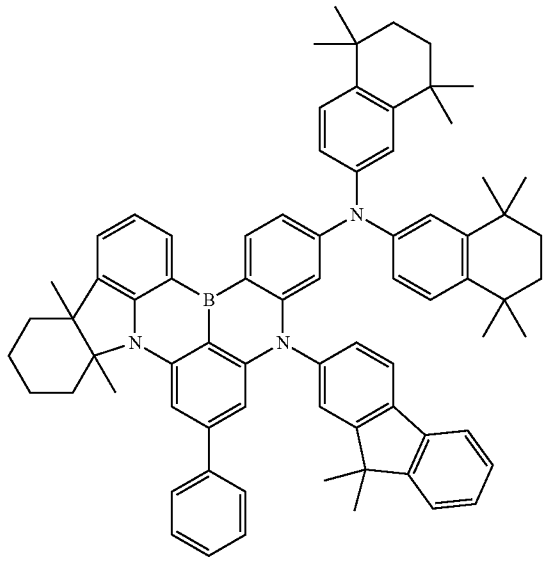
-continued
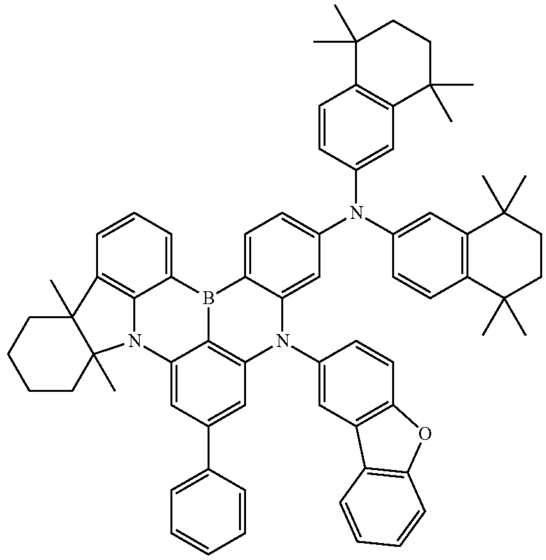
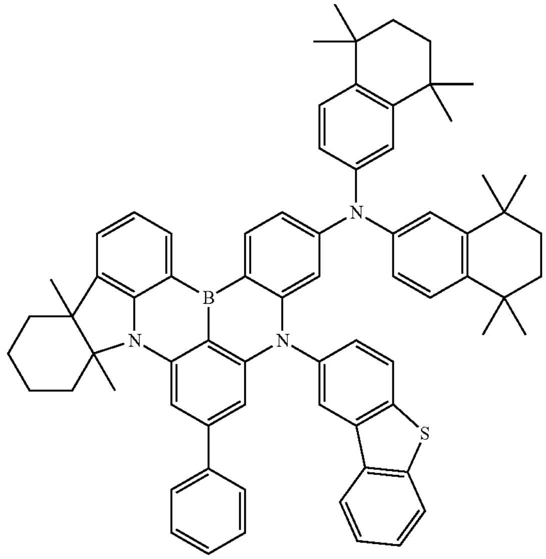
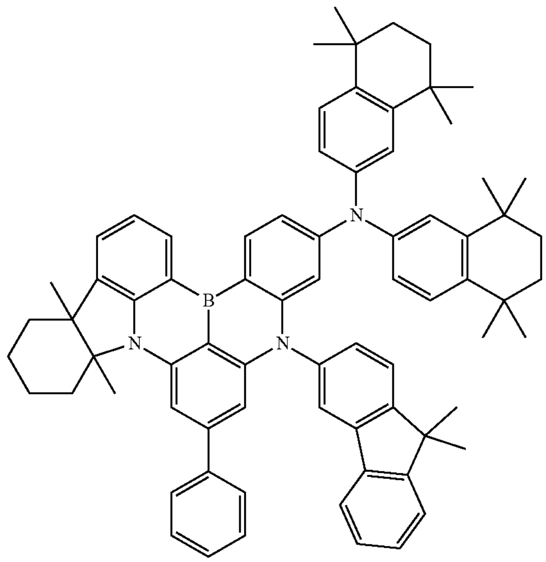

-continued
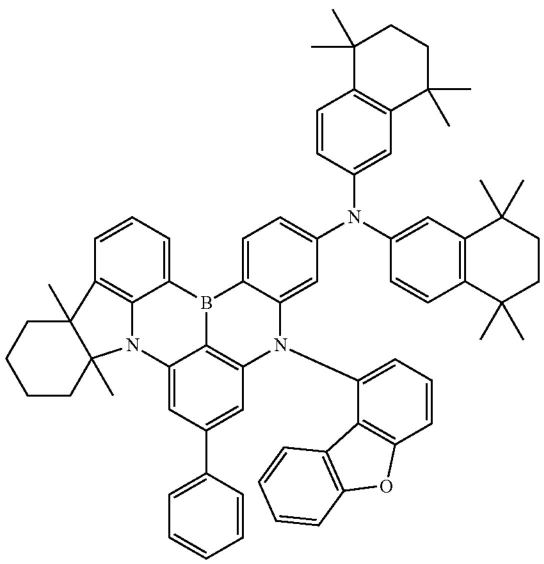
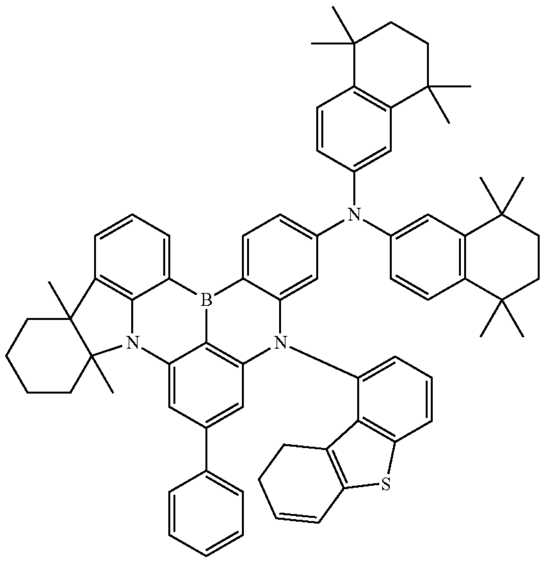
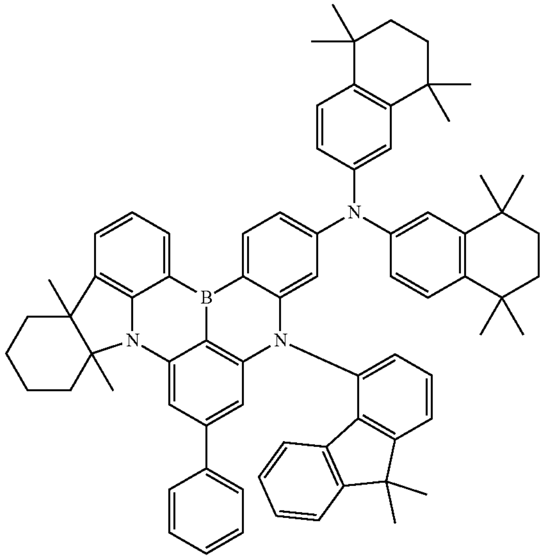
-continued
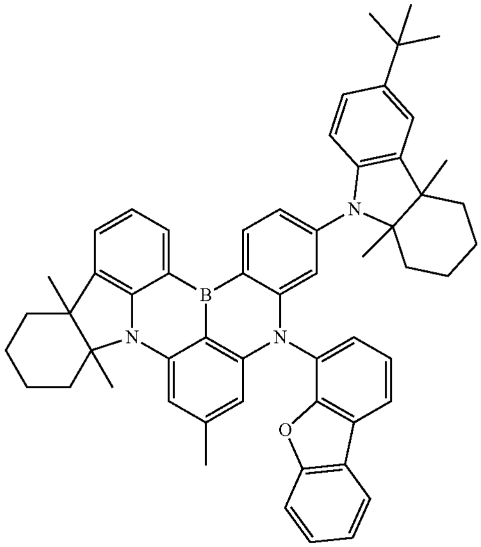
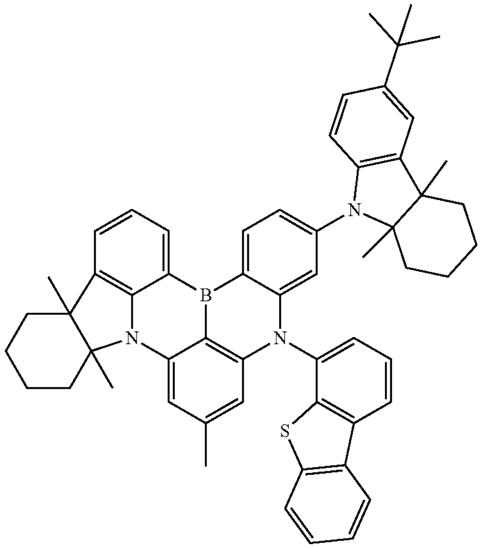
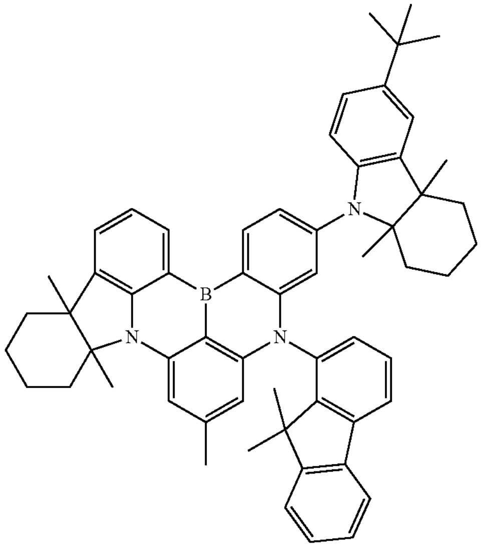

-continued
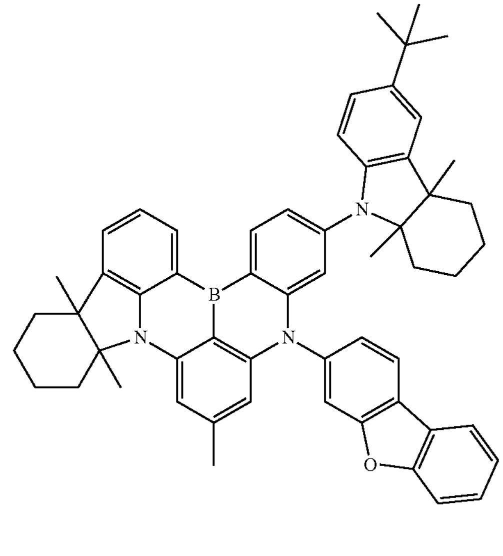
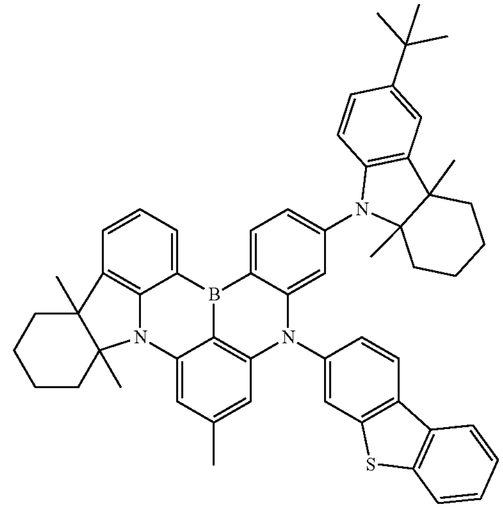
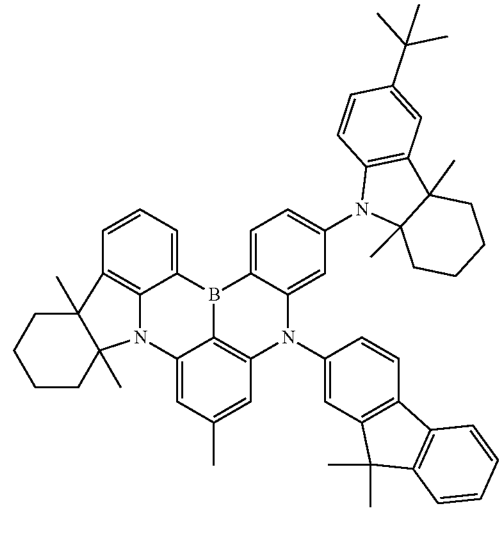
-continued
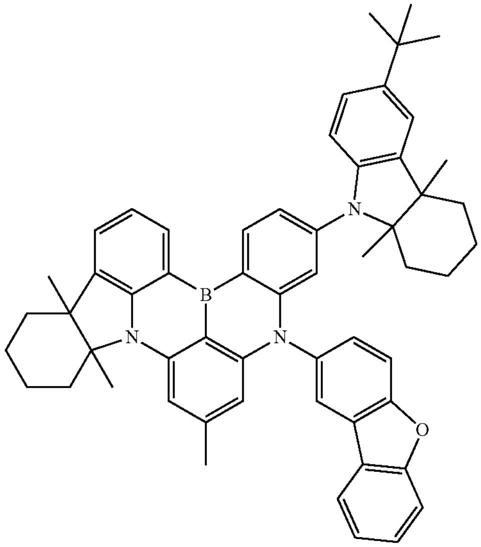
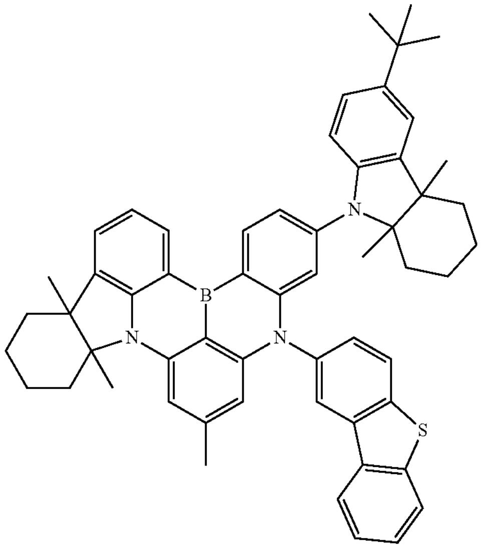
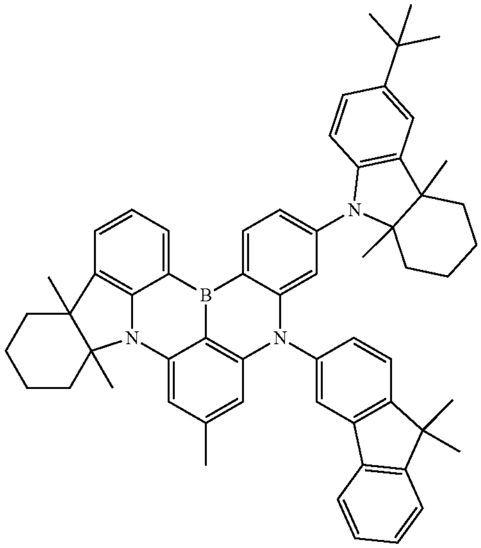

-continued
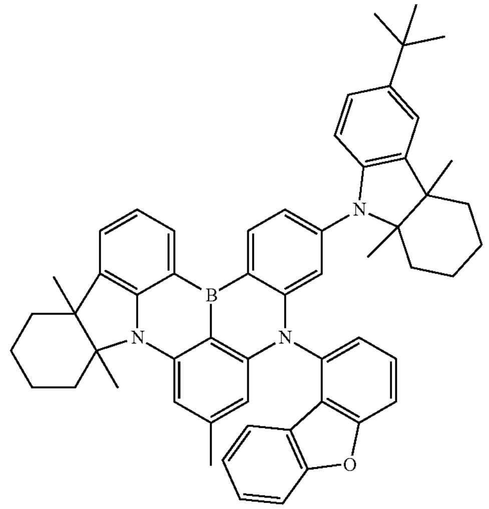
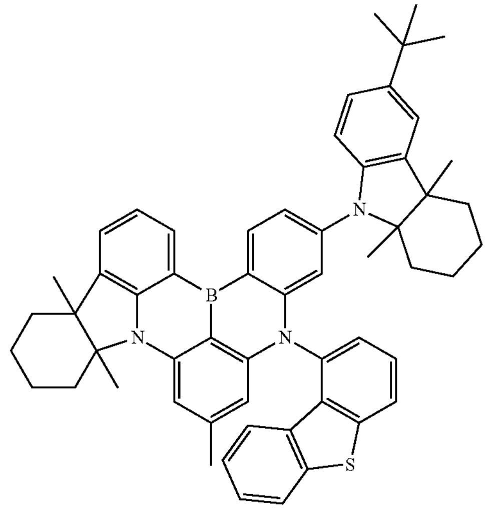
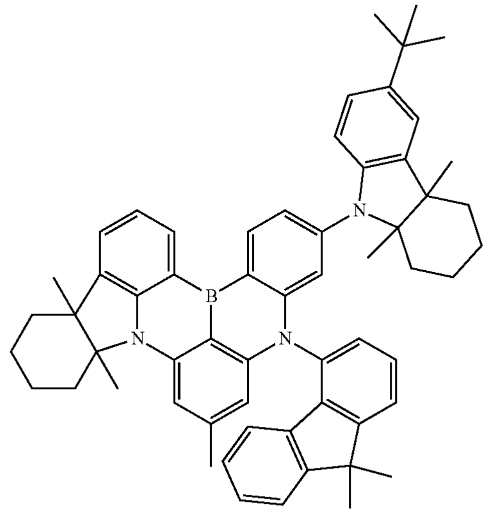
-continued
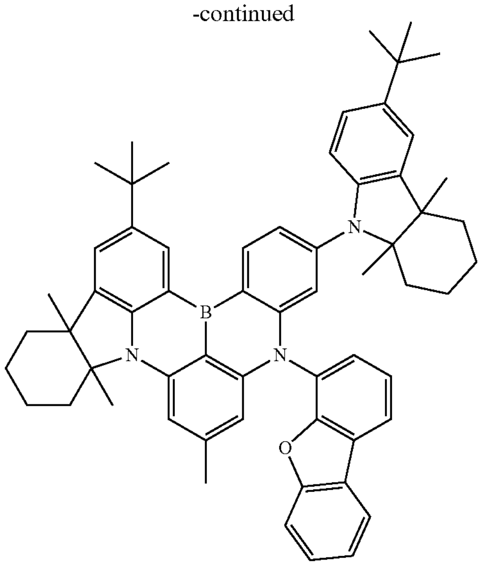
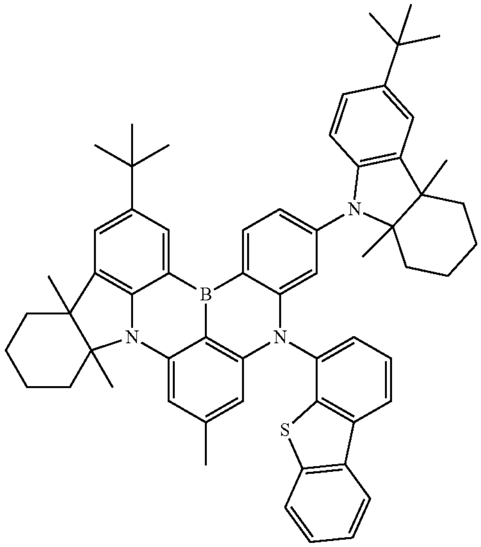
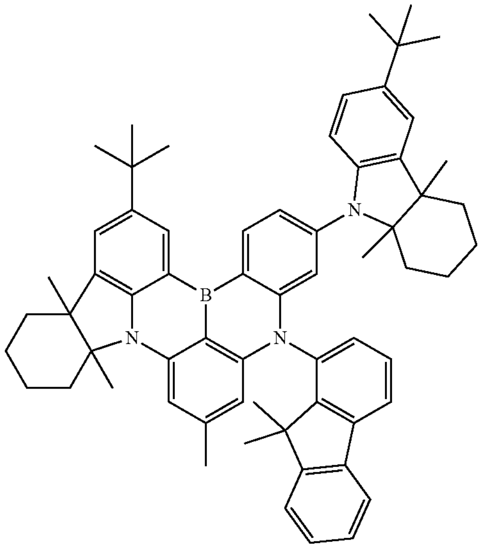

-continued
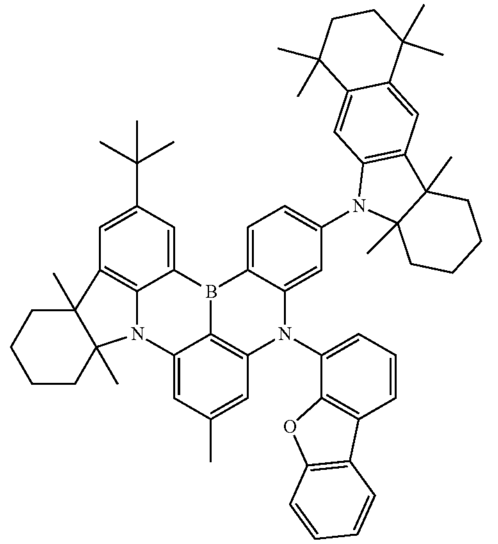
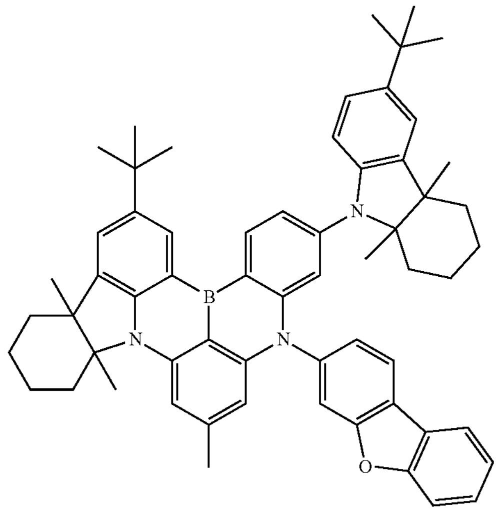
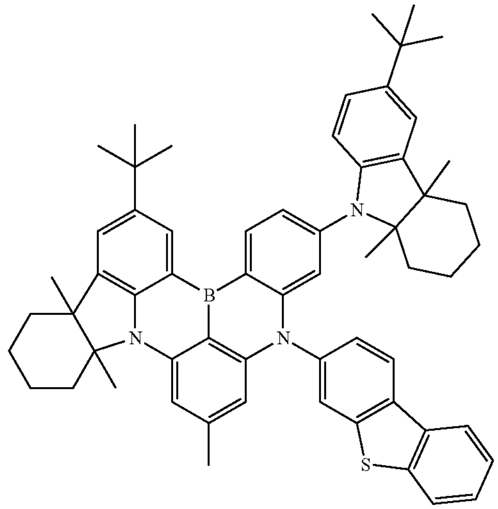
-continued
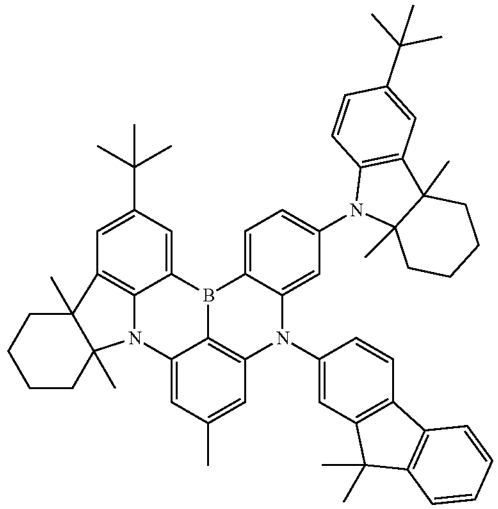
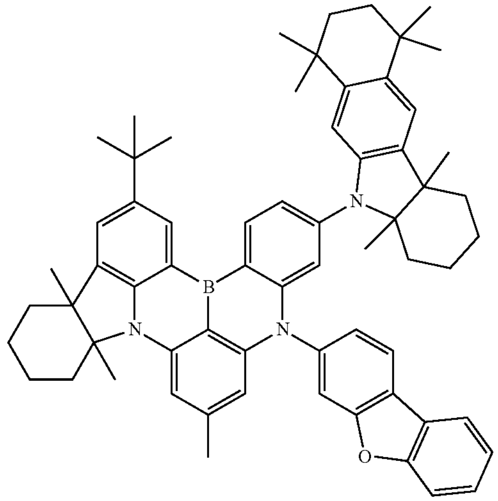
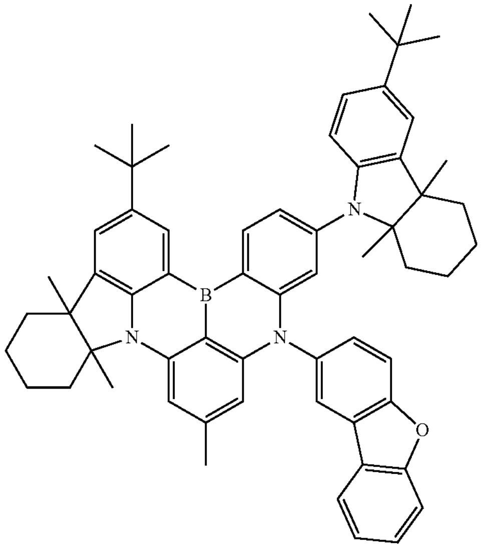

-continued
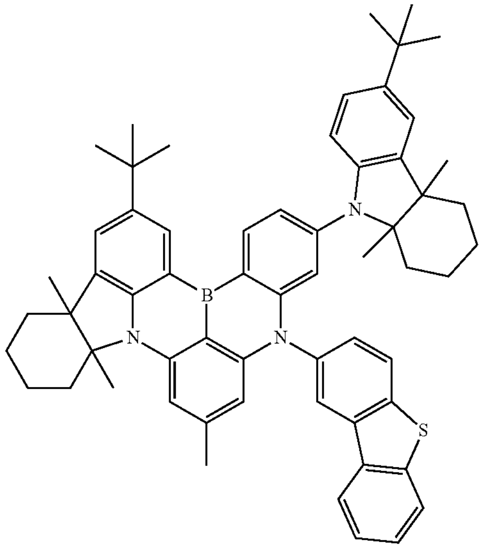
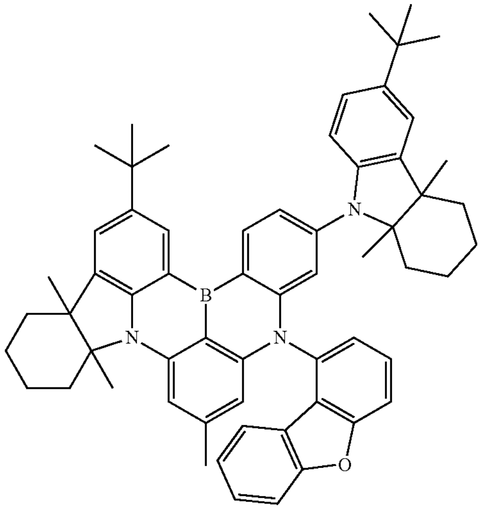
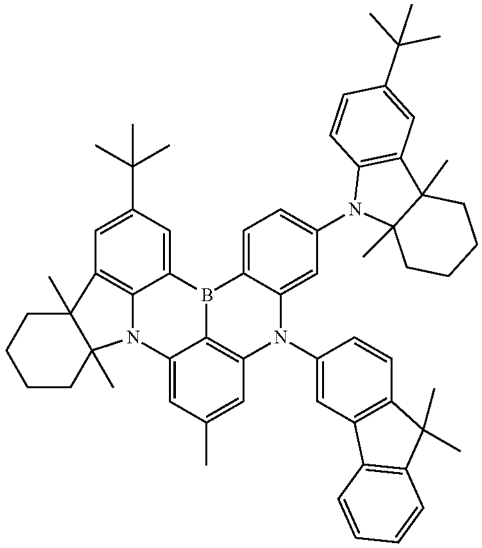
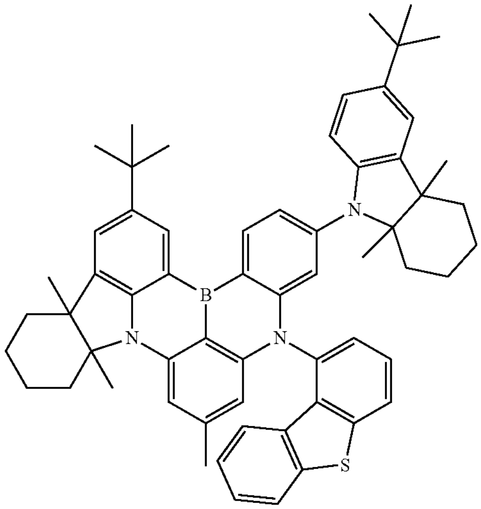
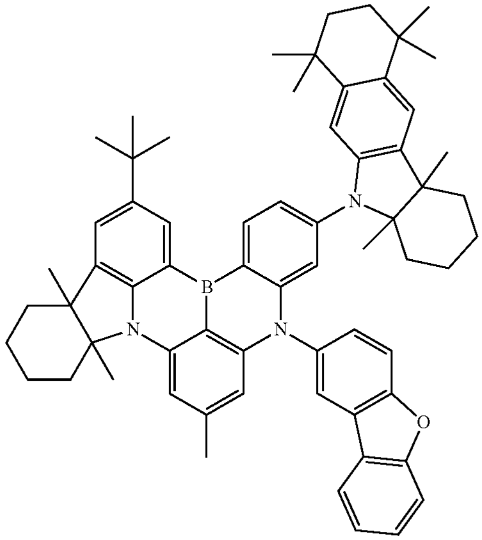
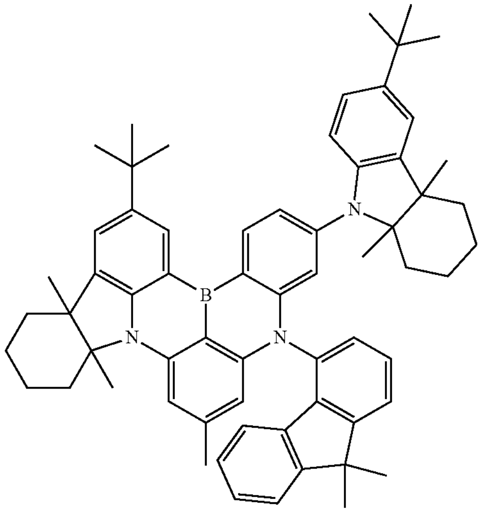
-continued -continued
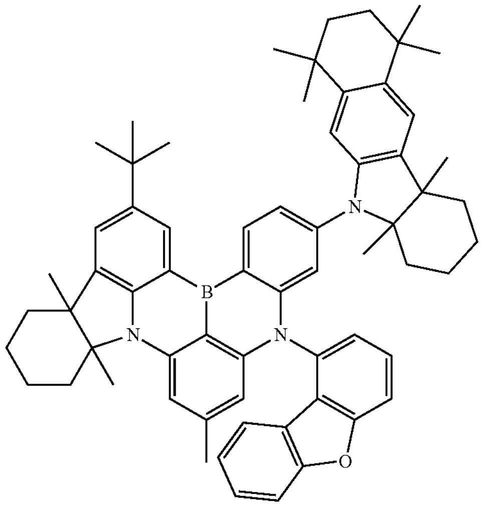
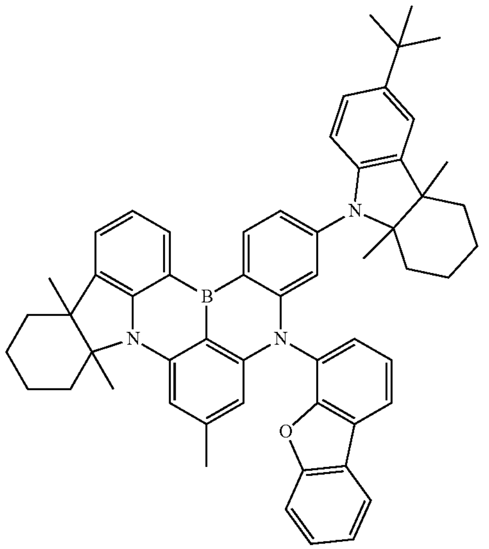
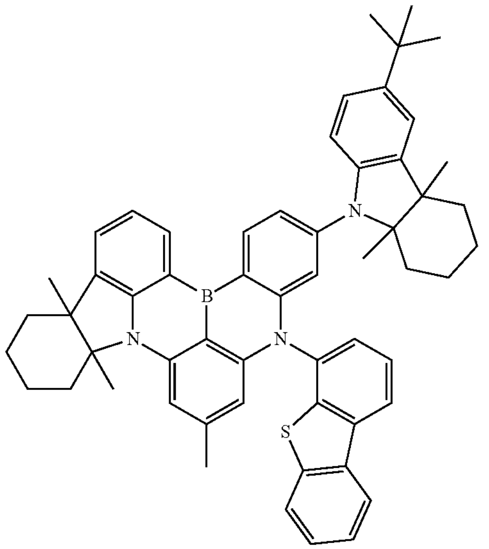
-continued
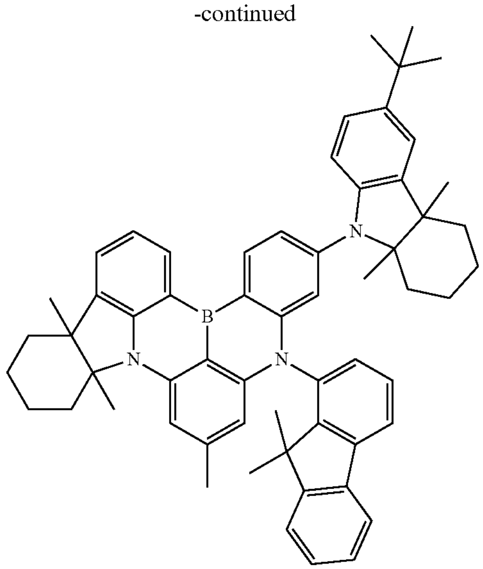
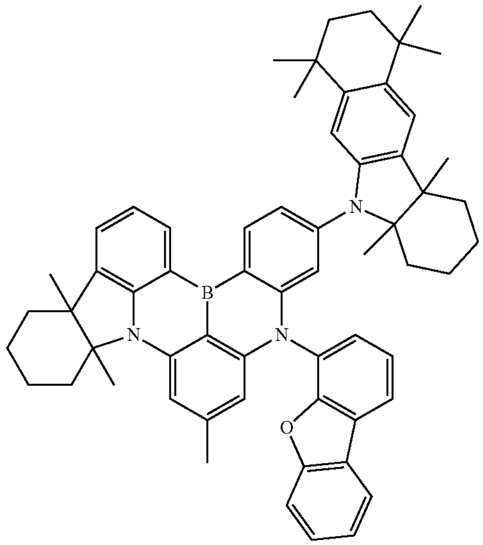
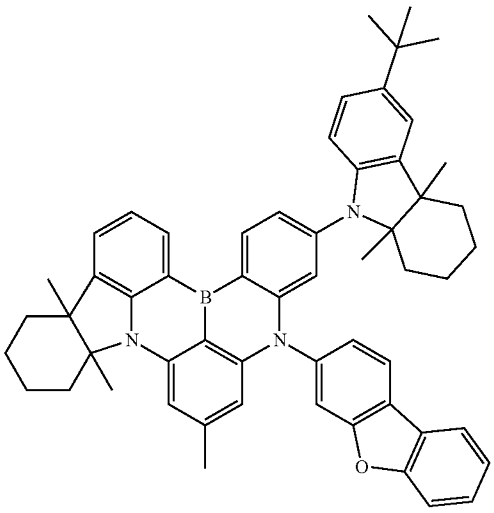

-continued
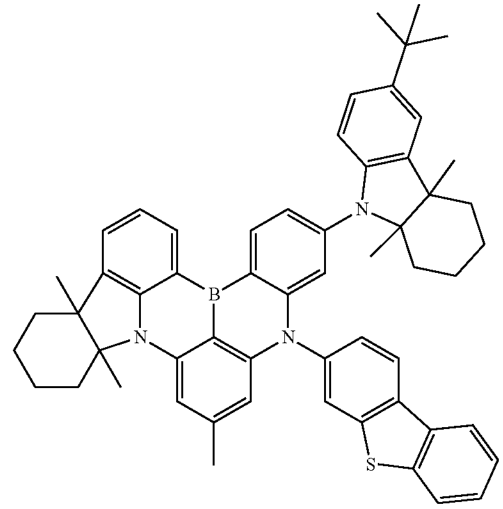
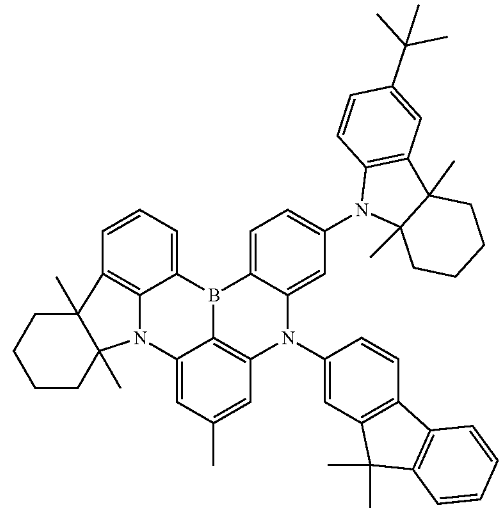
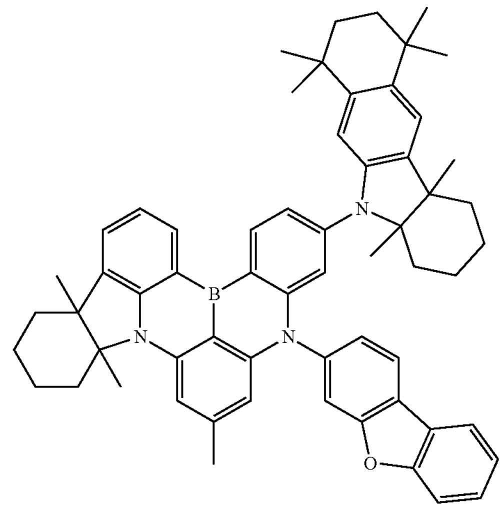
-continued
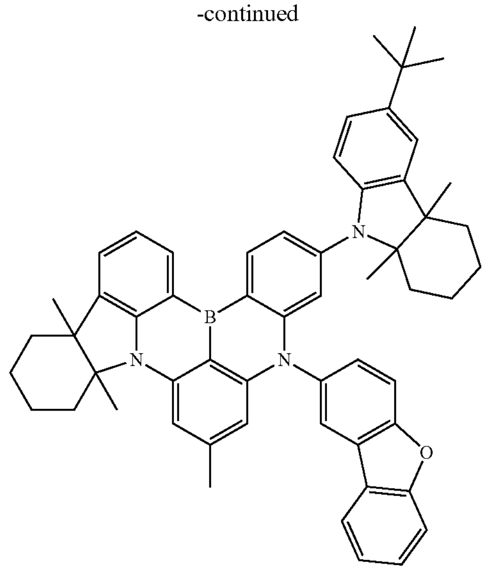
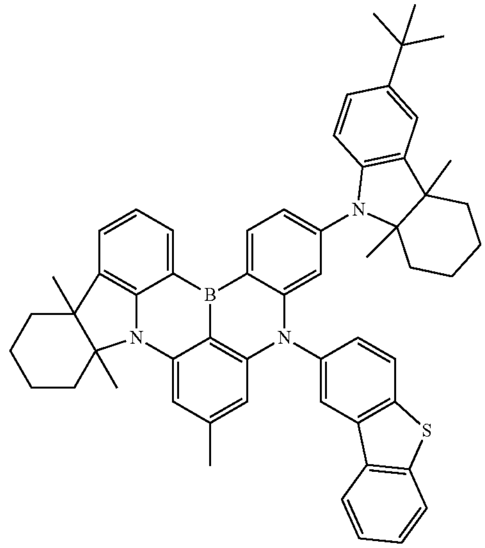
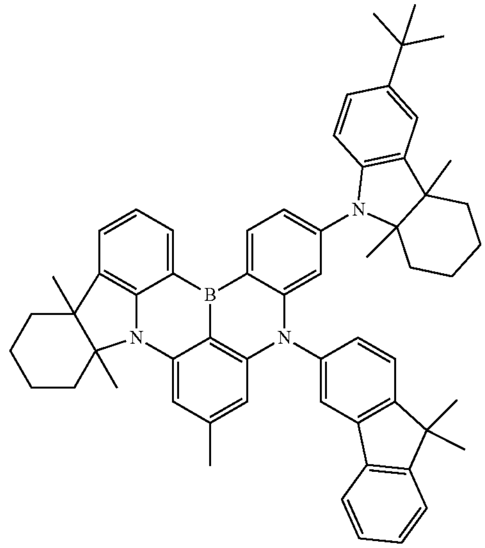

-continued
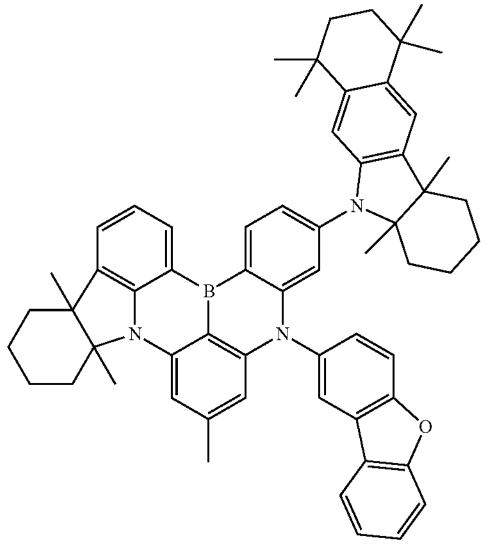
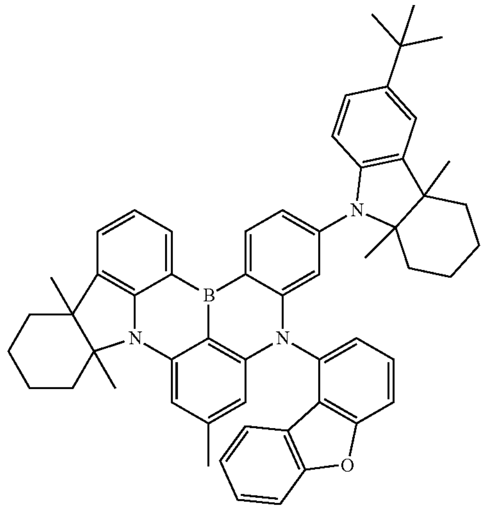
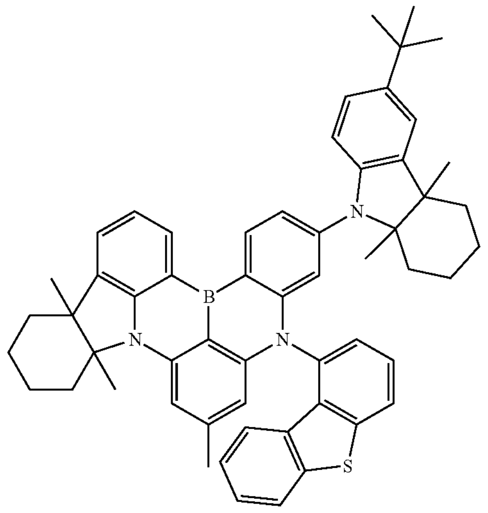
-continued
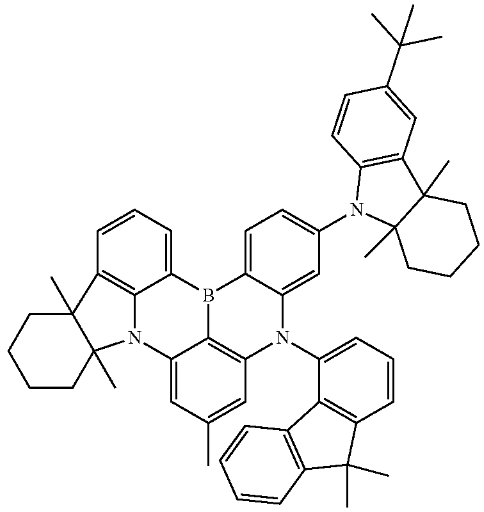
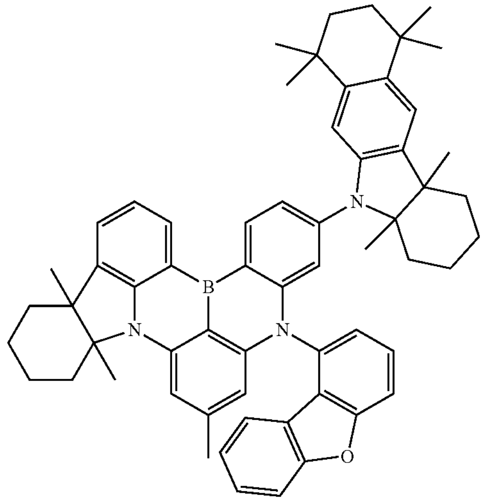
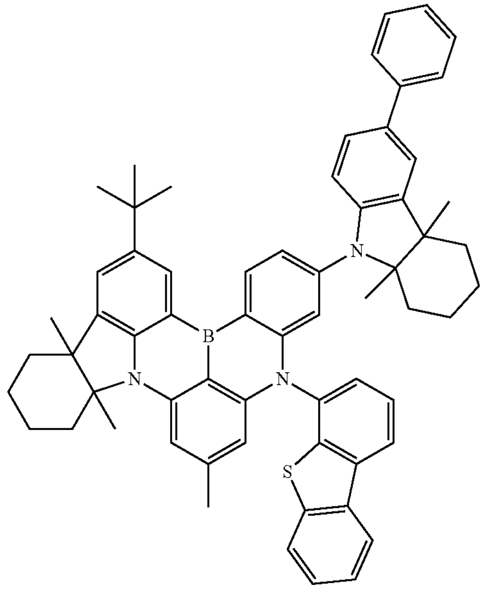

-continued
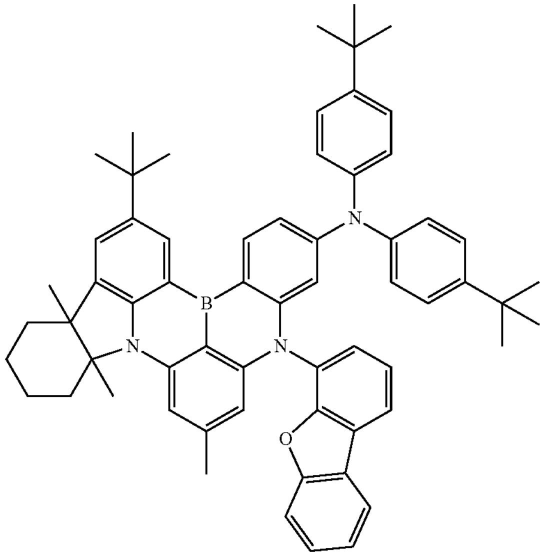
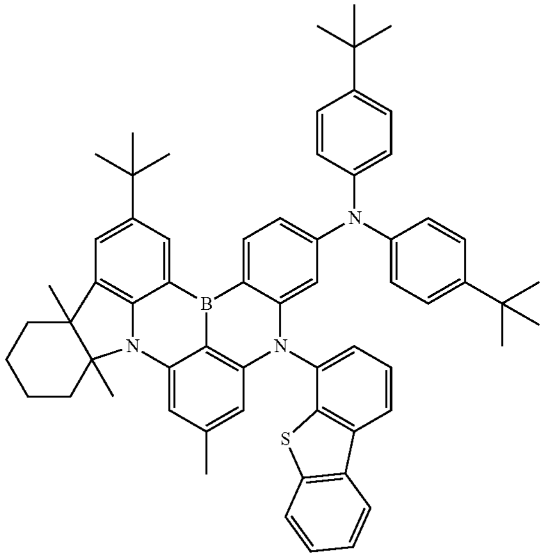
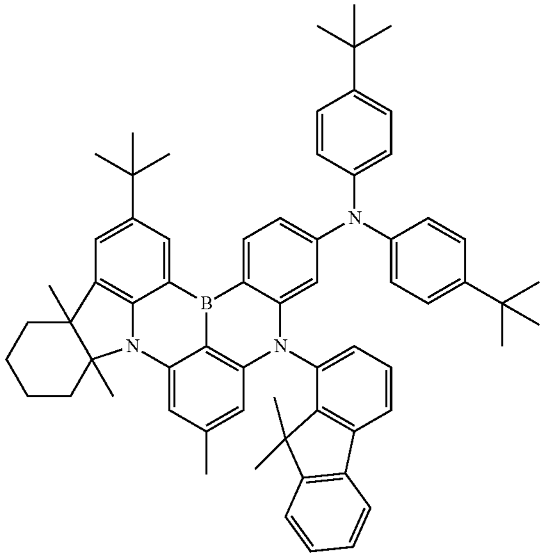
-continued
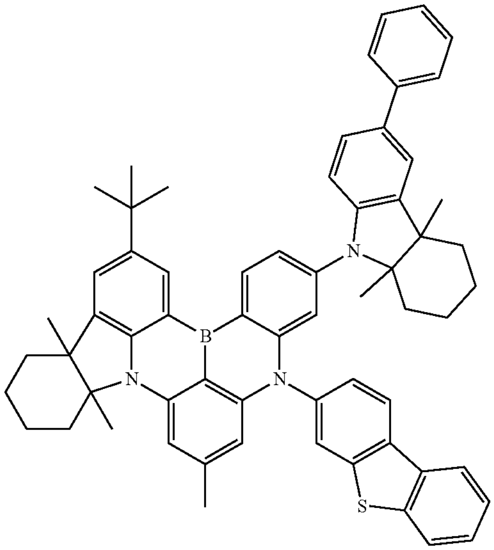
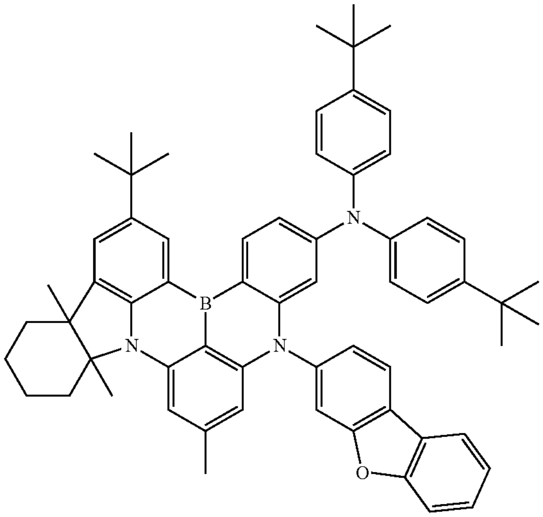
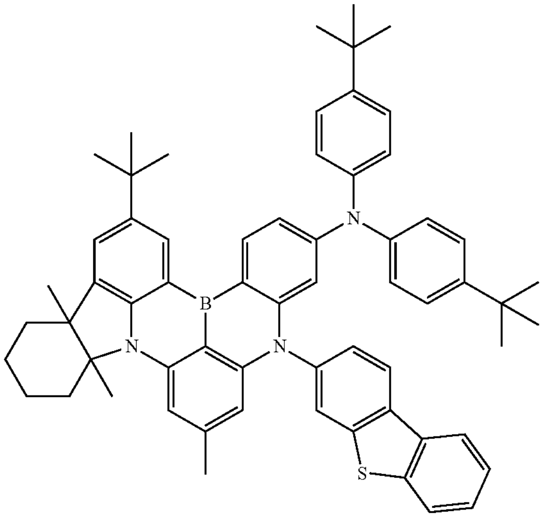

-continued
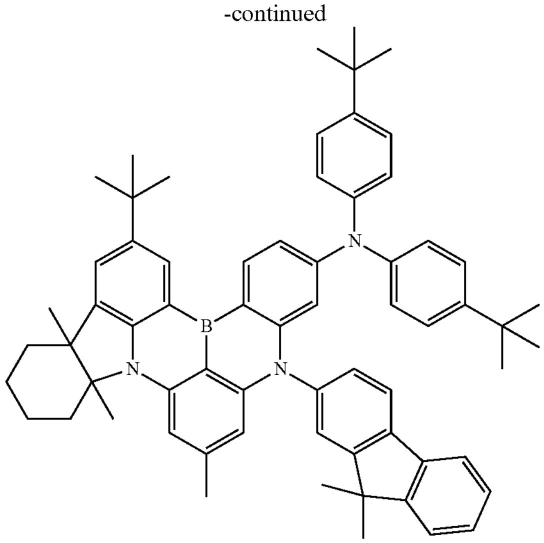
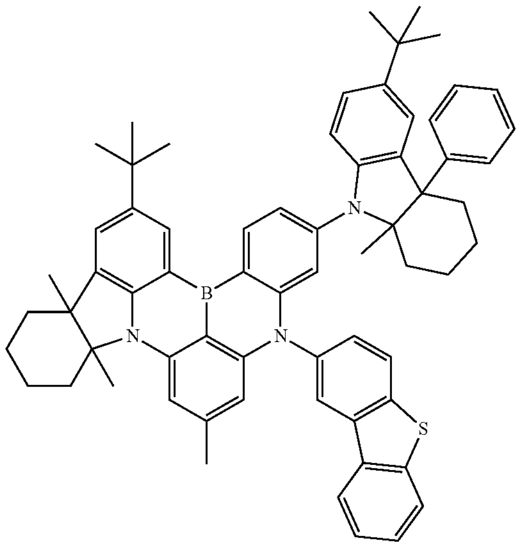
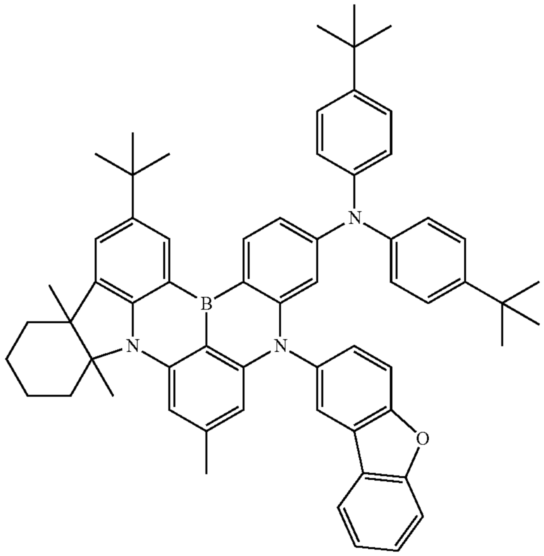
-continued
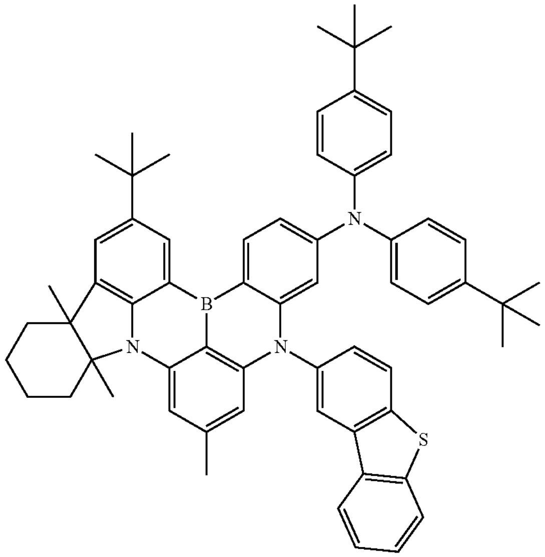
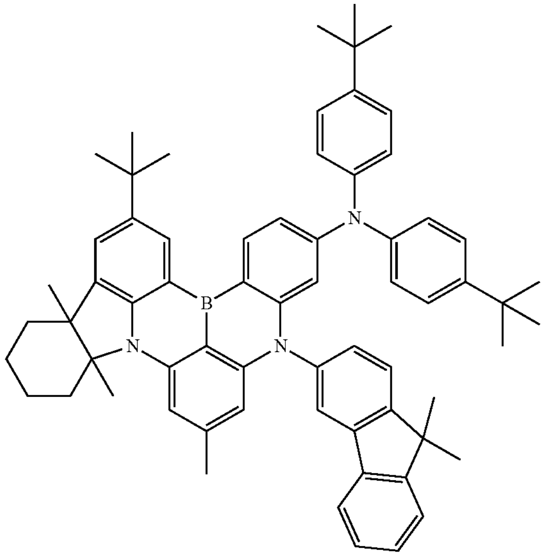
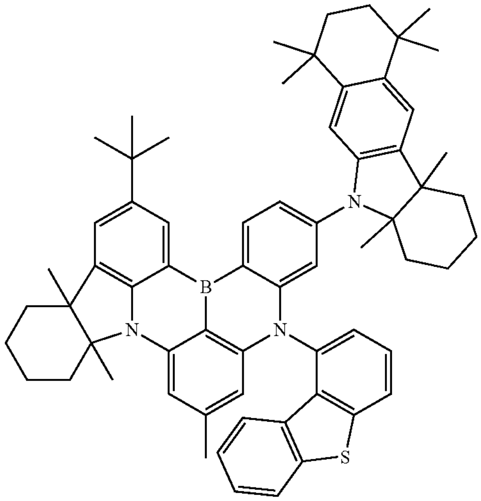

-continued
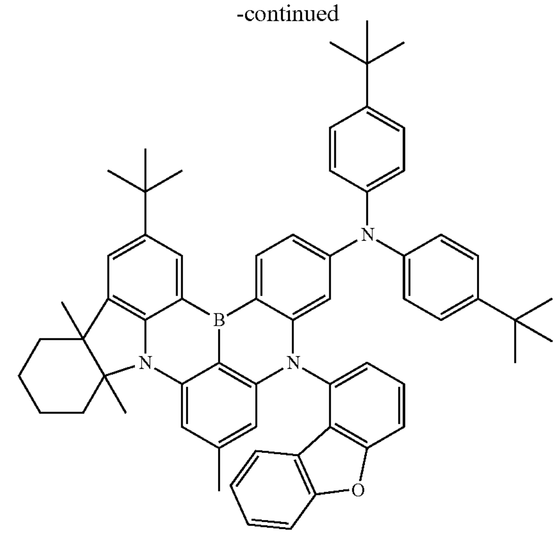
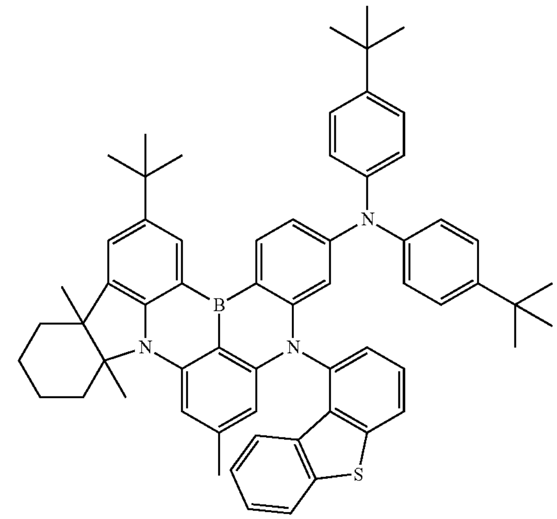
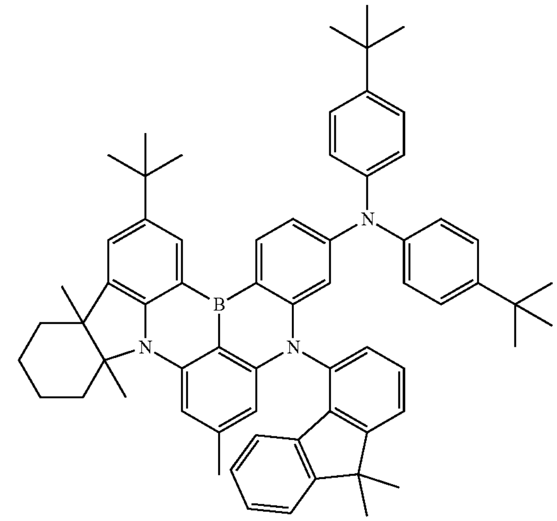
-continued
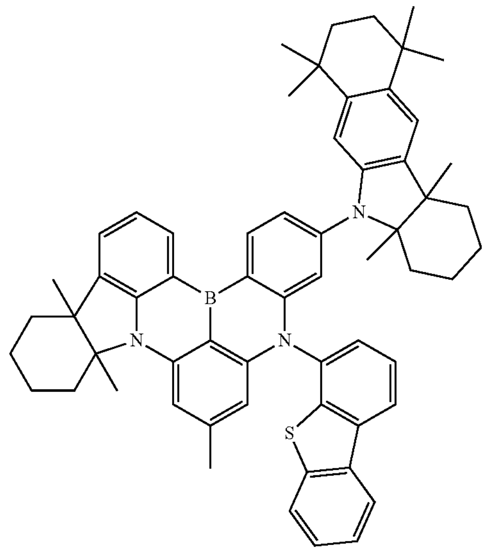
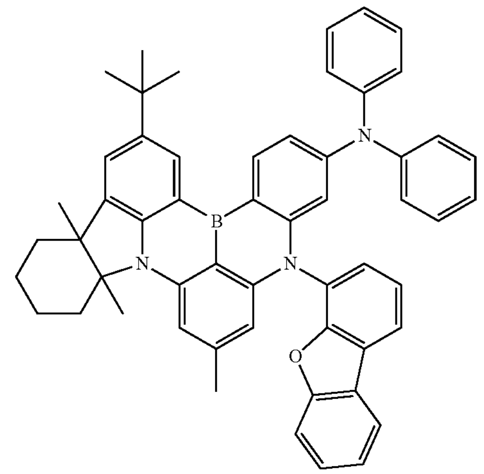
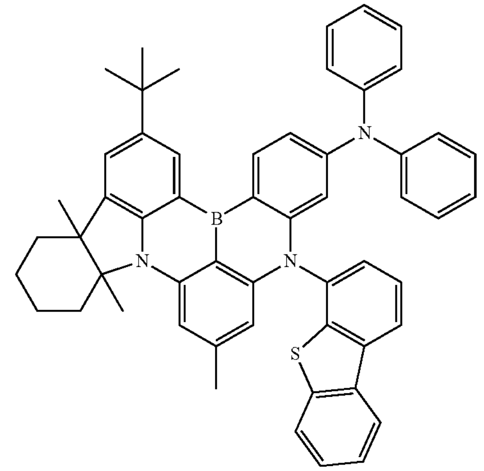

-continued
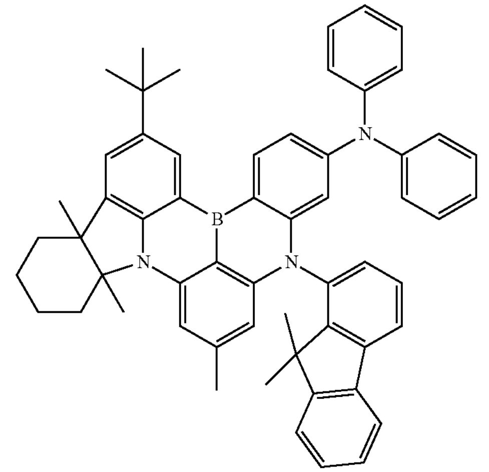
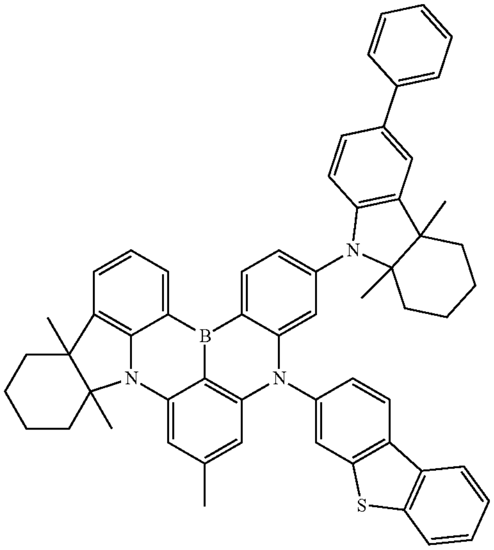
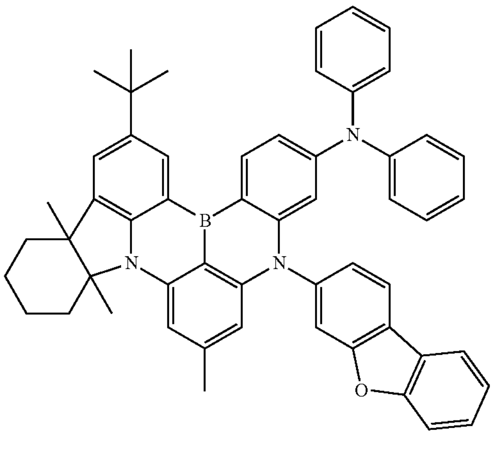
-continued
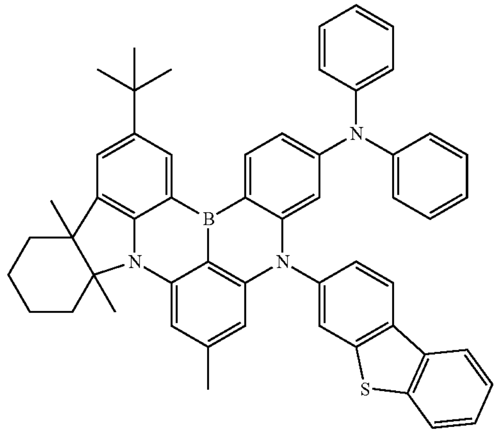
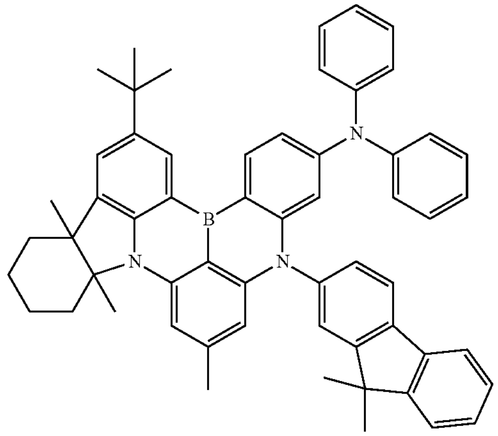
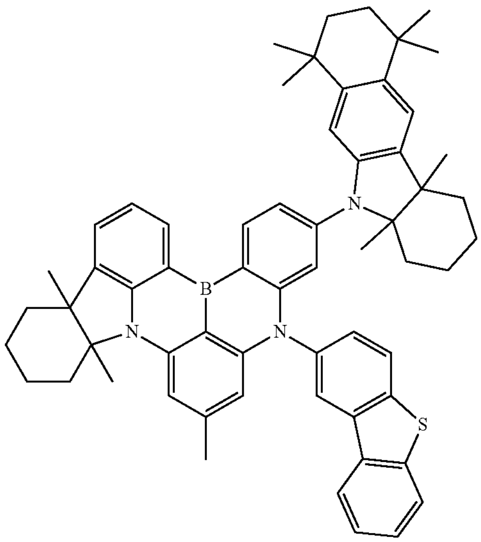

-continued
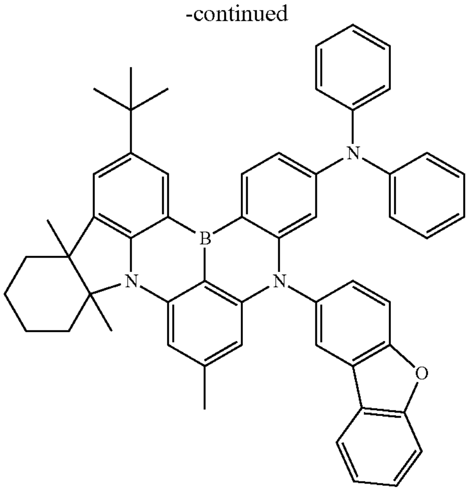
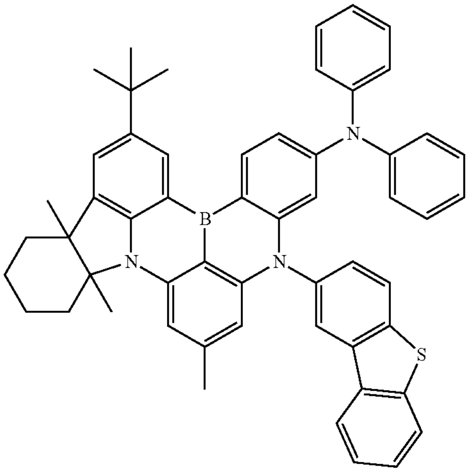
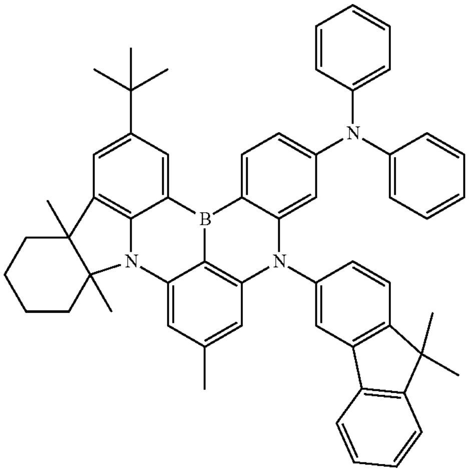
-continued
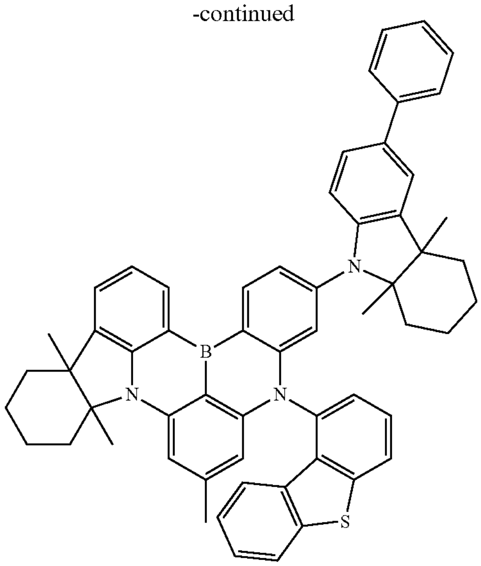
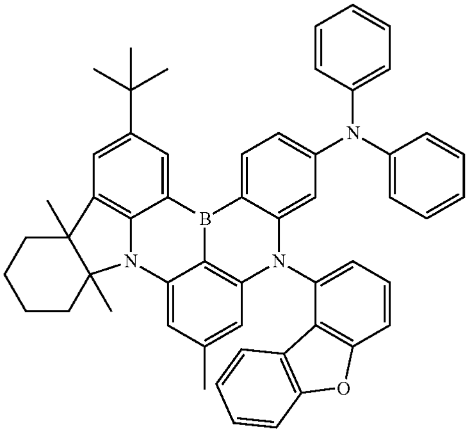
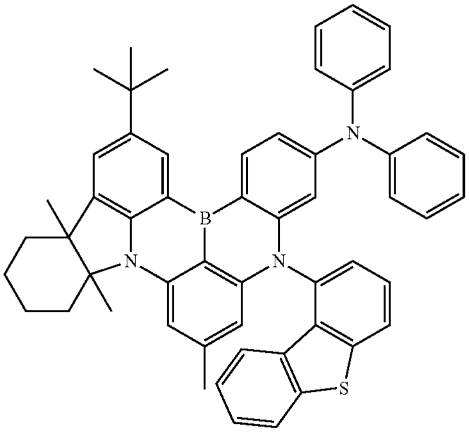

-continued
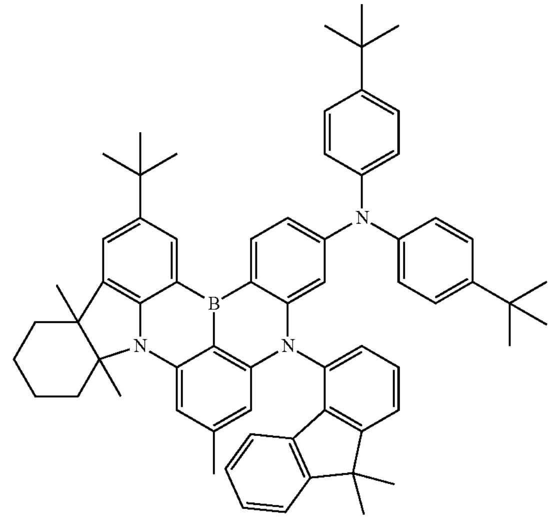
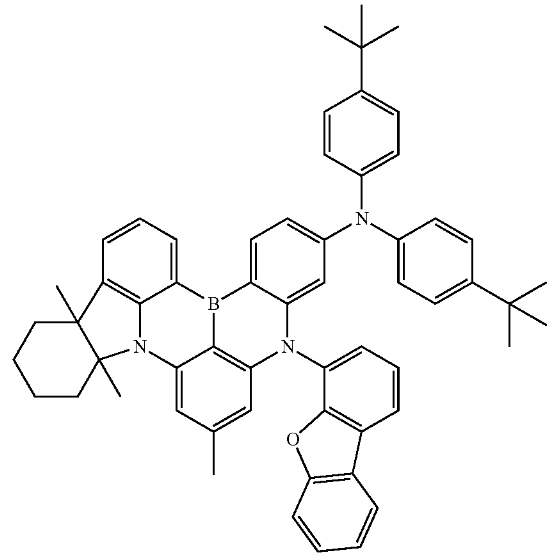
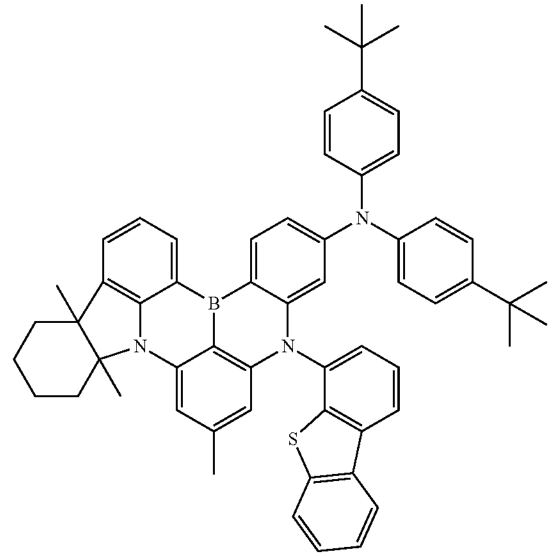
-continued
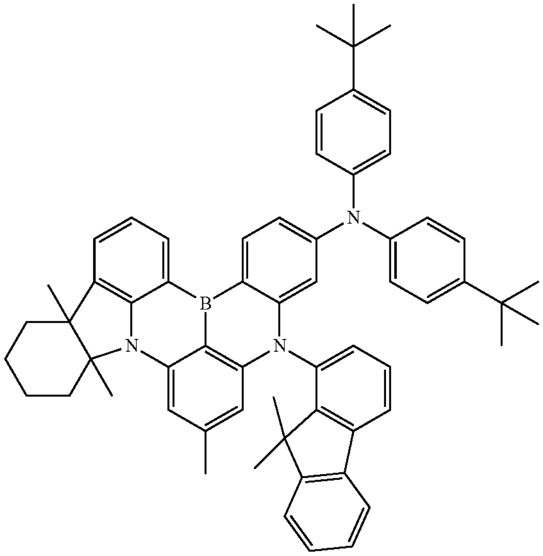
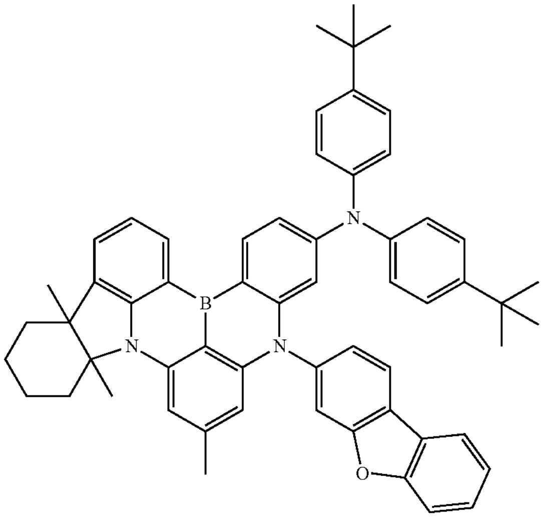
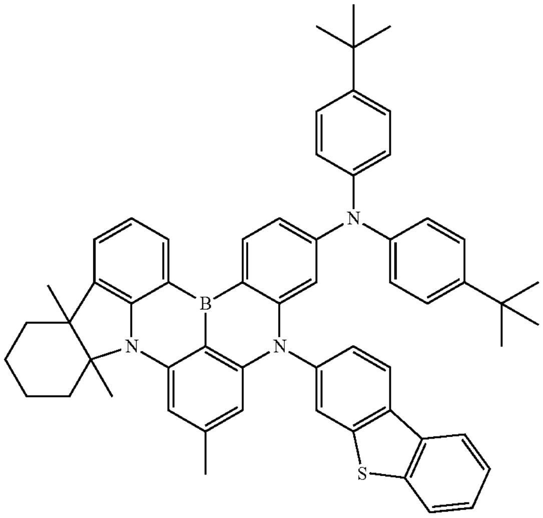

-continued
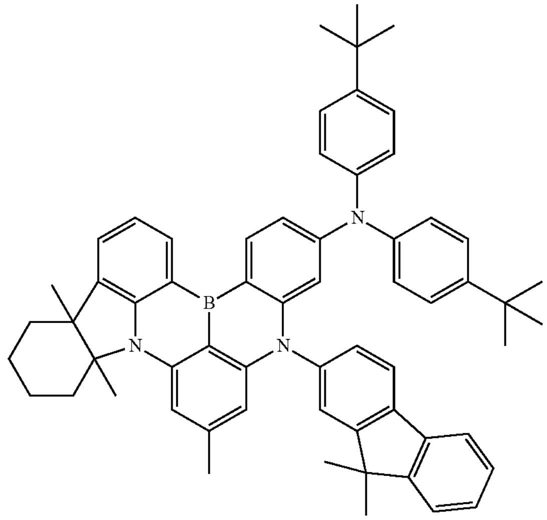
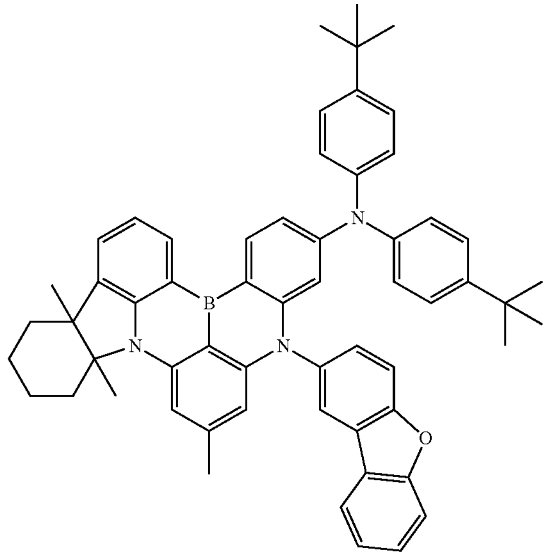
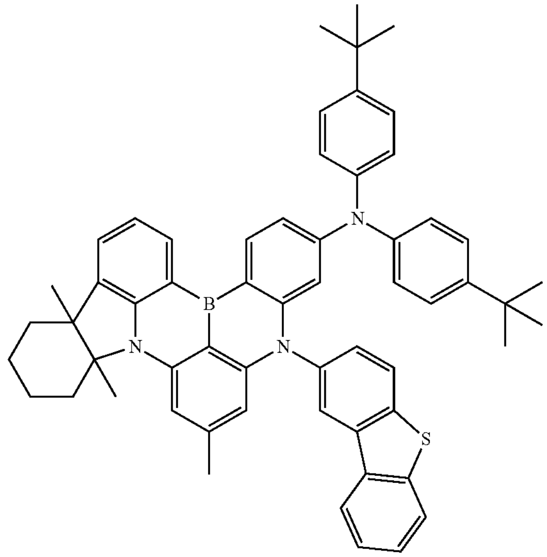
-continued
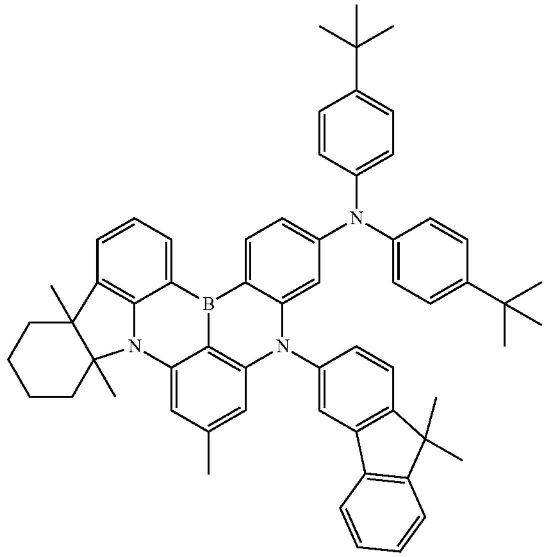
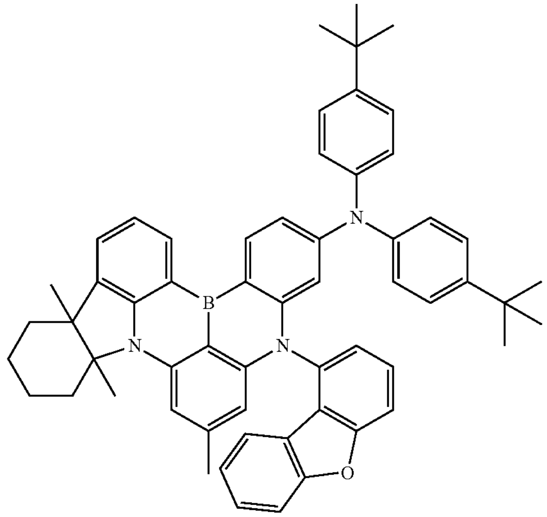
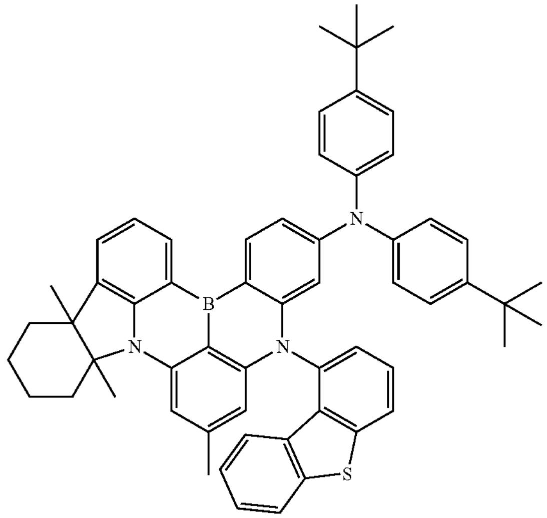

-continued
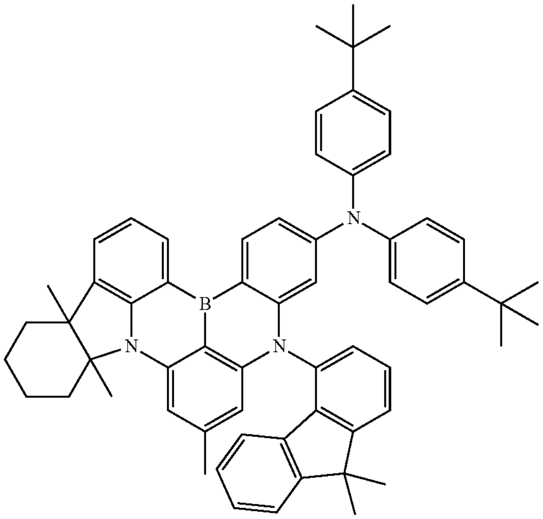
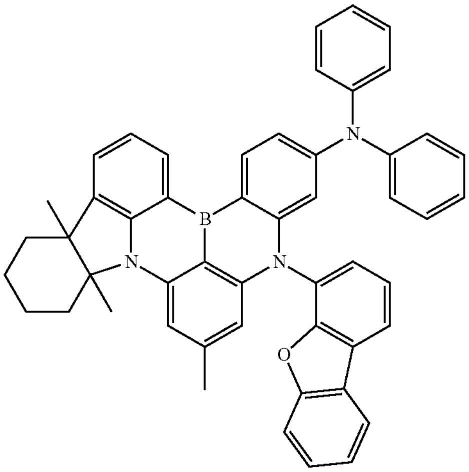
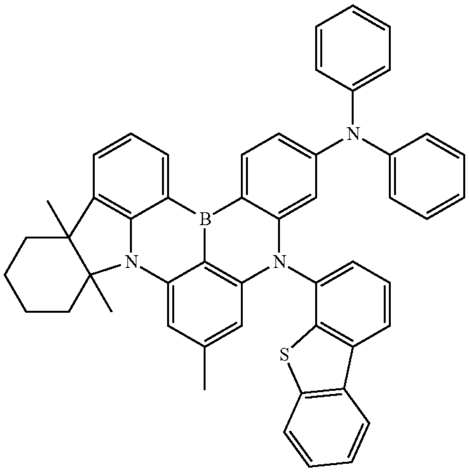
-continued
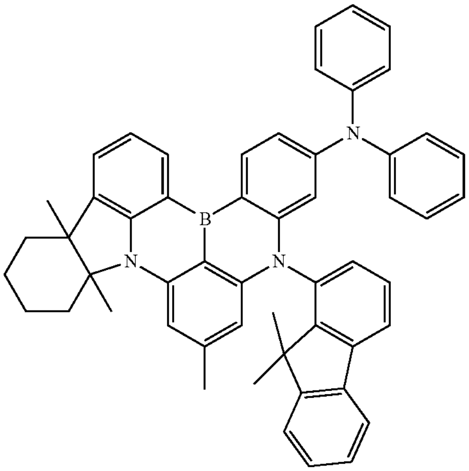
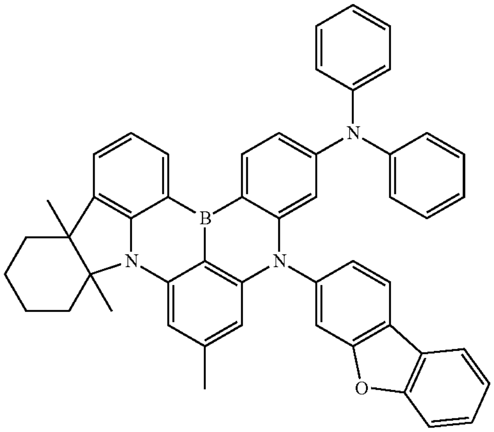
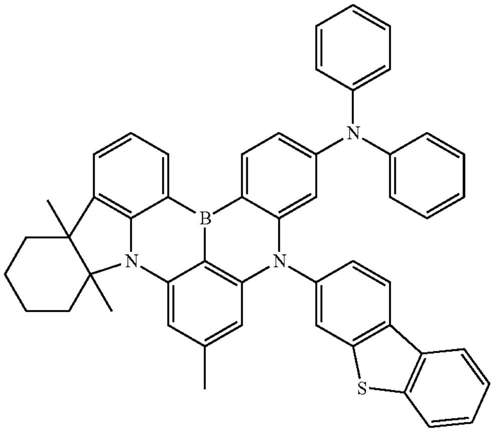

-continued
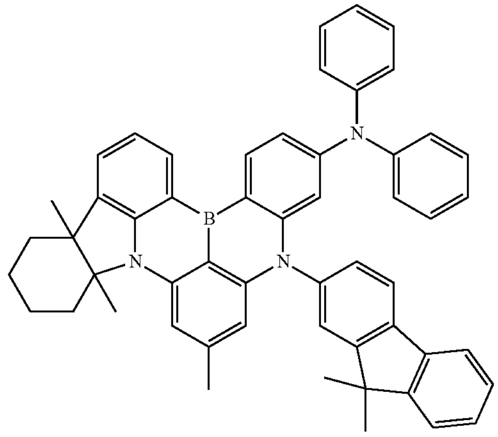
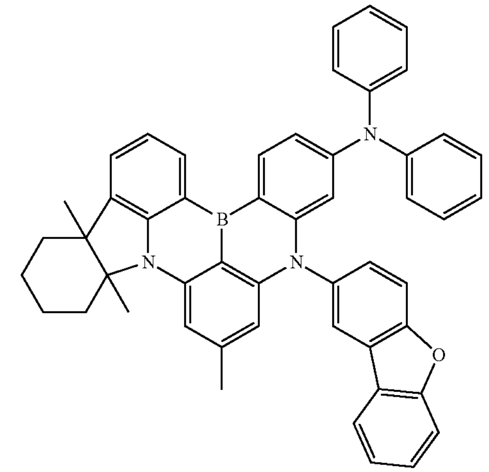
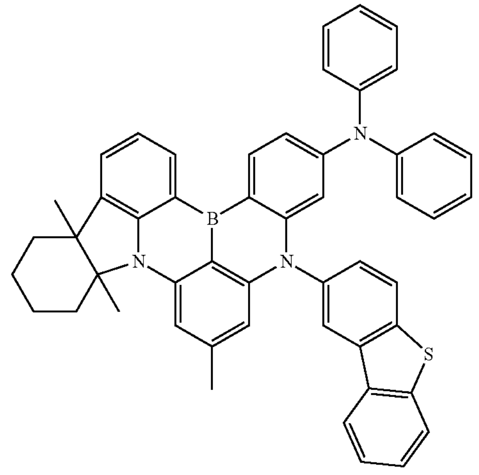
-continued
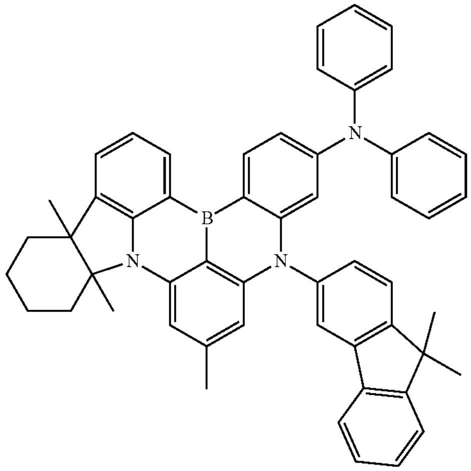
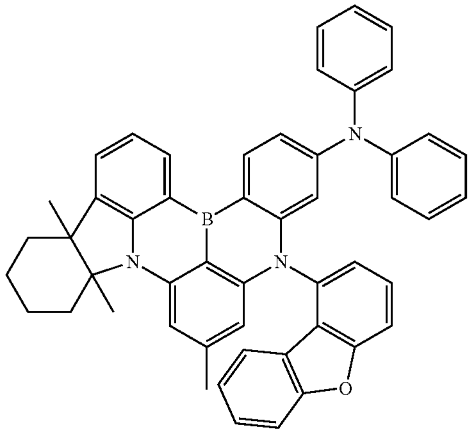
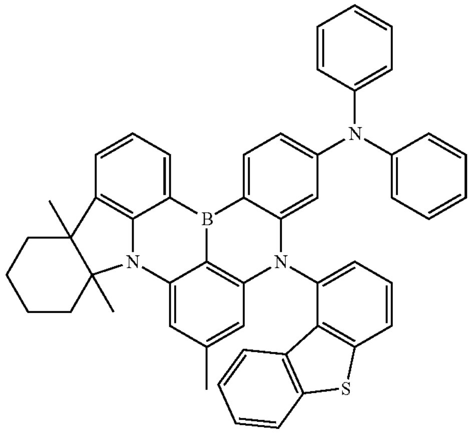

-continued
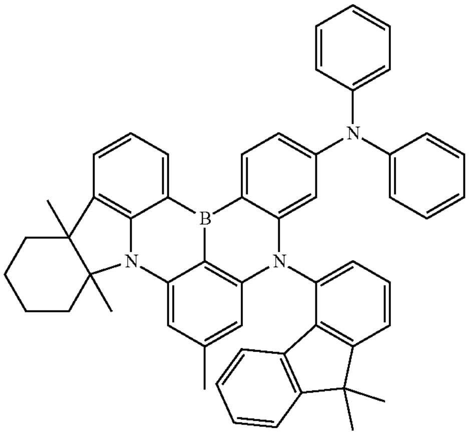
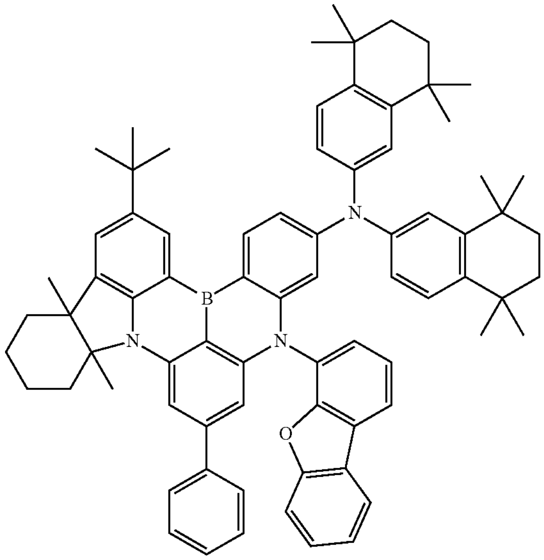
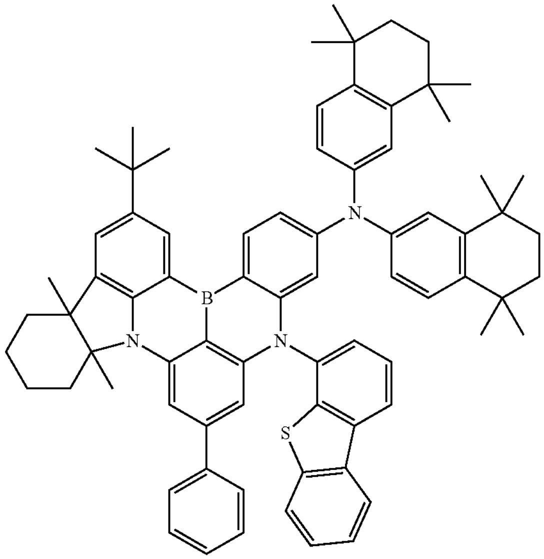
-continued
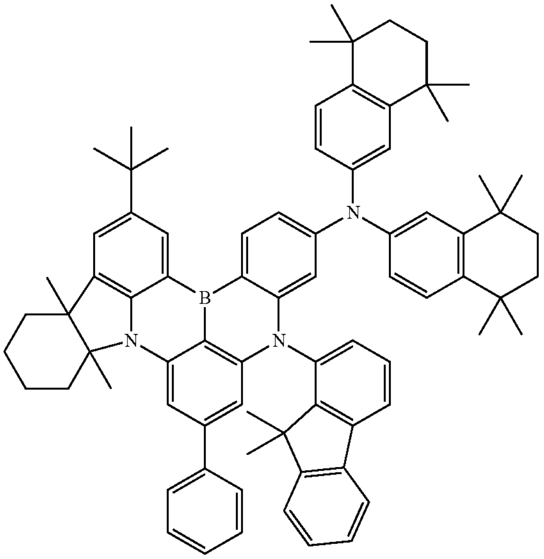
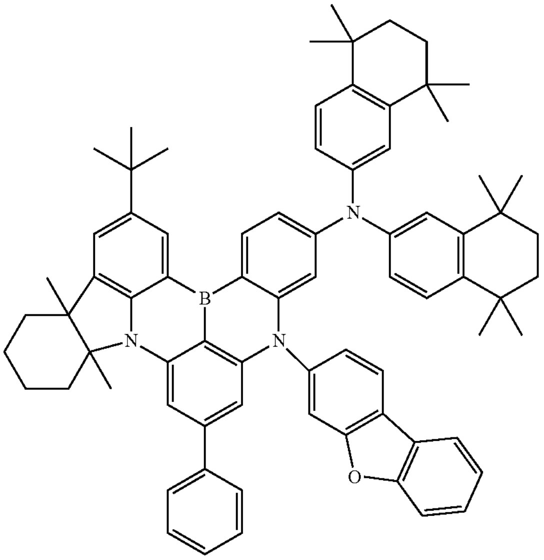
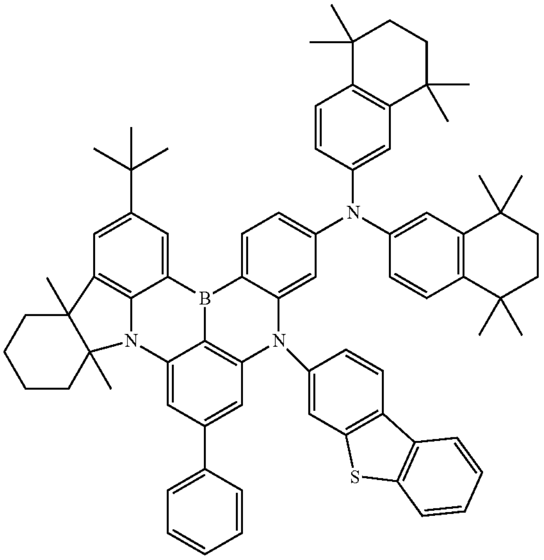

-continued
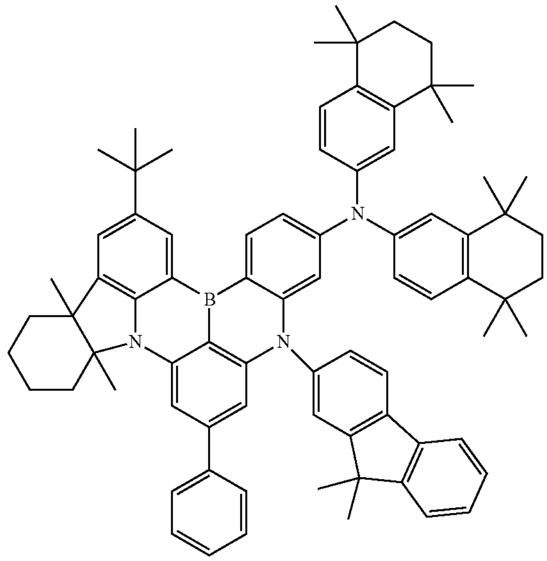
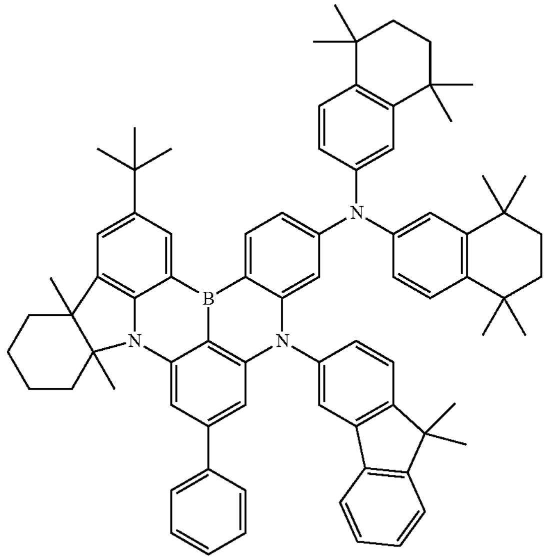
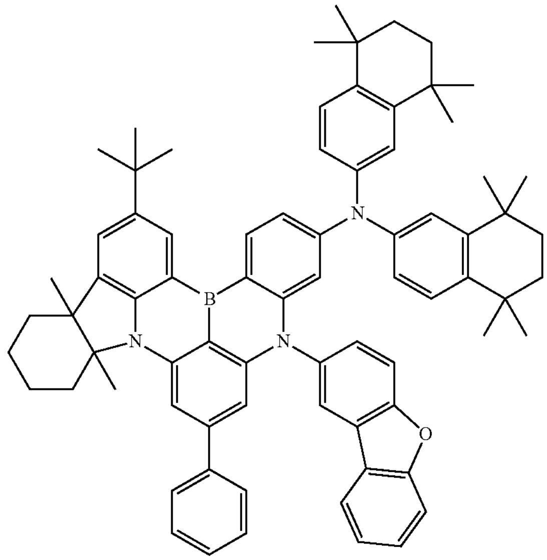
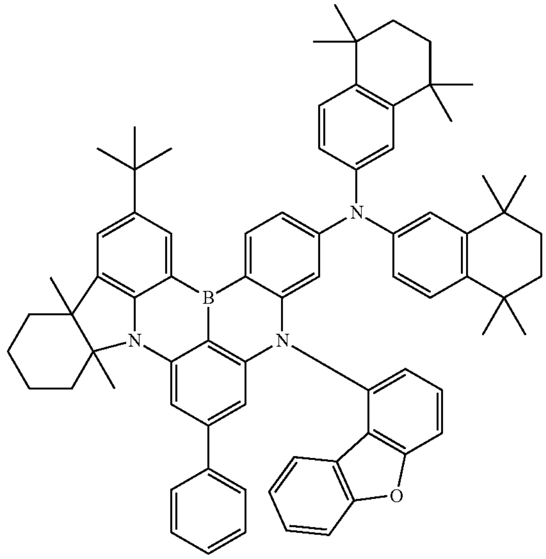
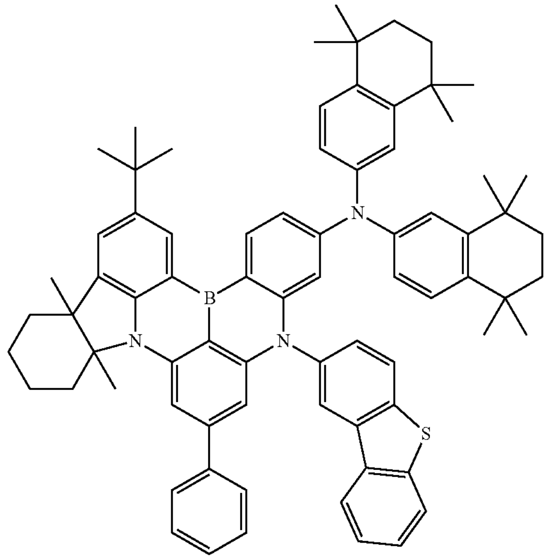
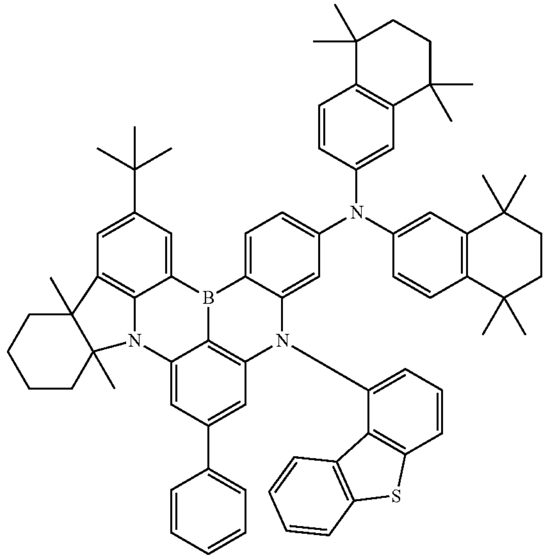
-continued -continued
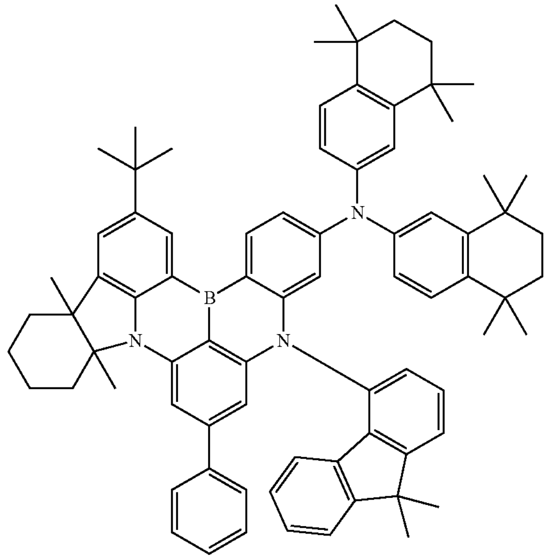
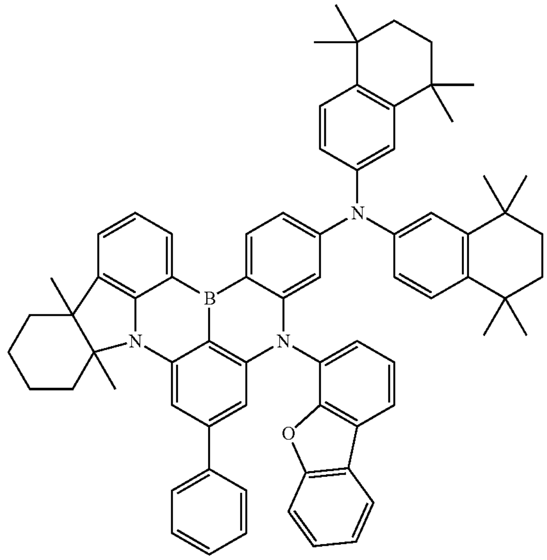
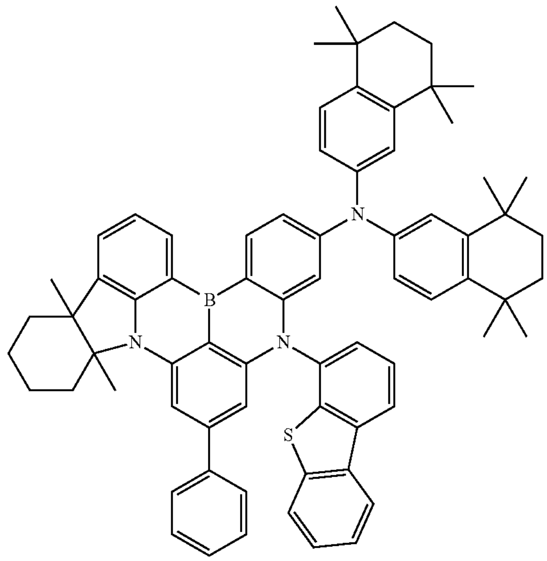
-continued
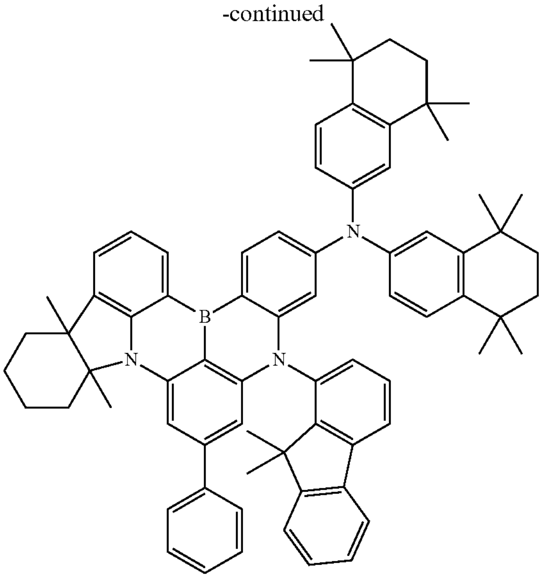
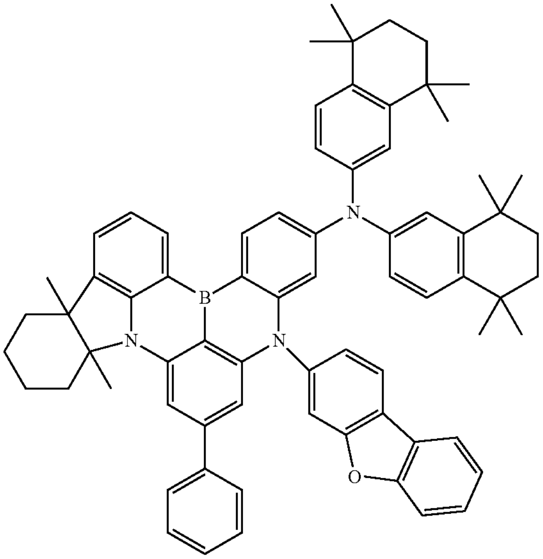
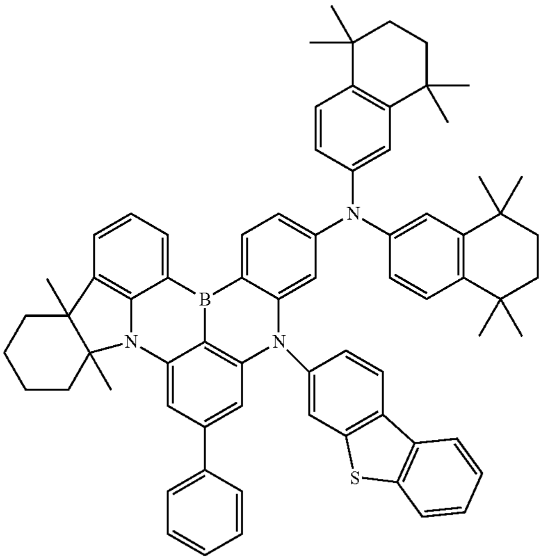

-continued
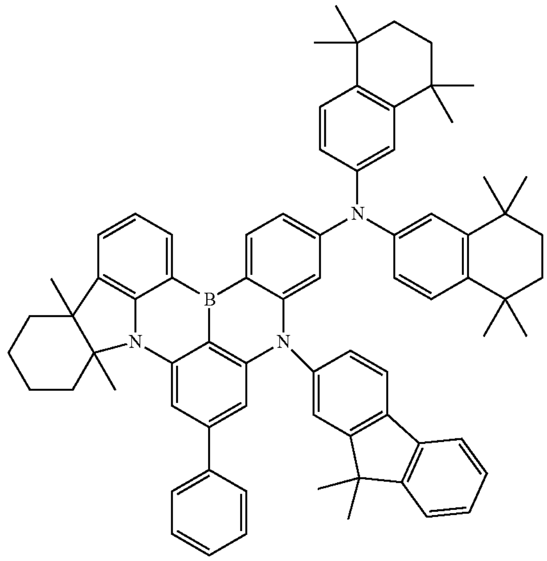
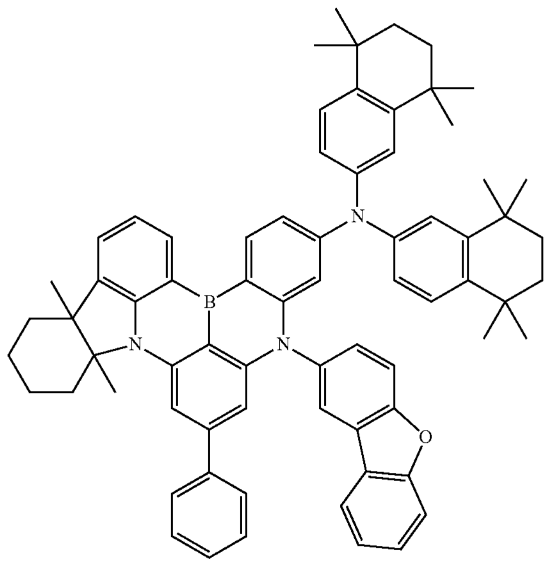
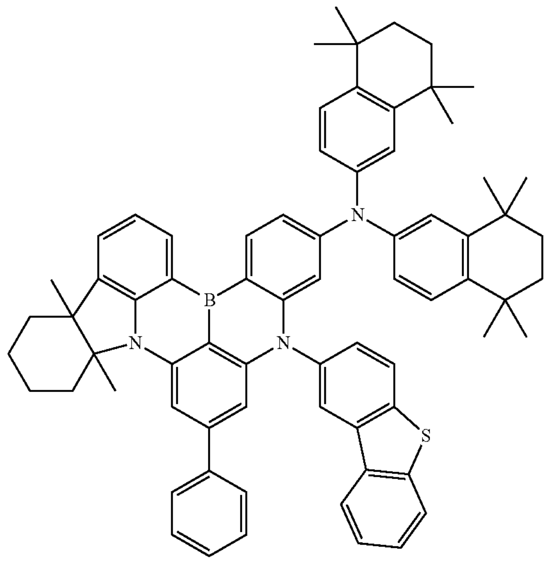
-continued
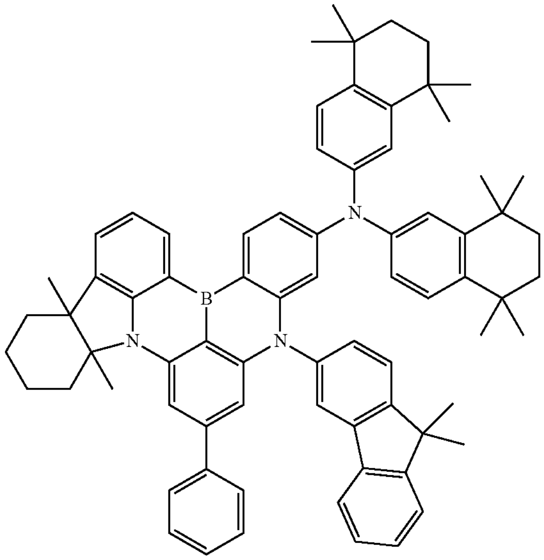
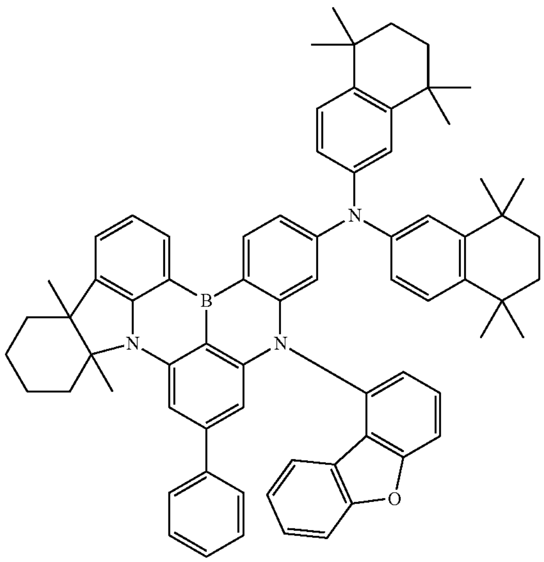
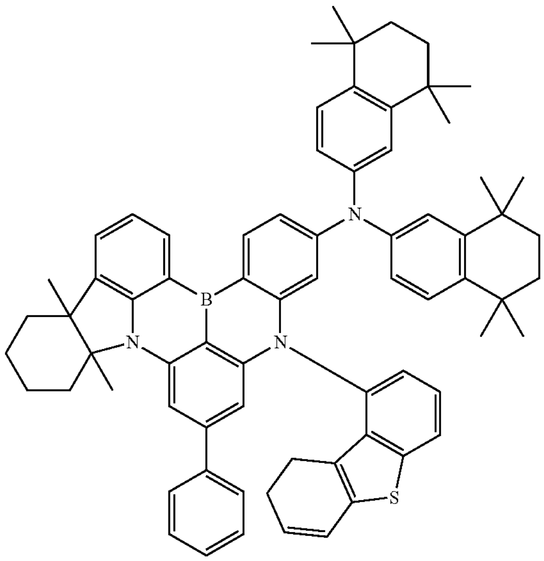

-continued
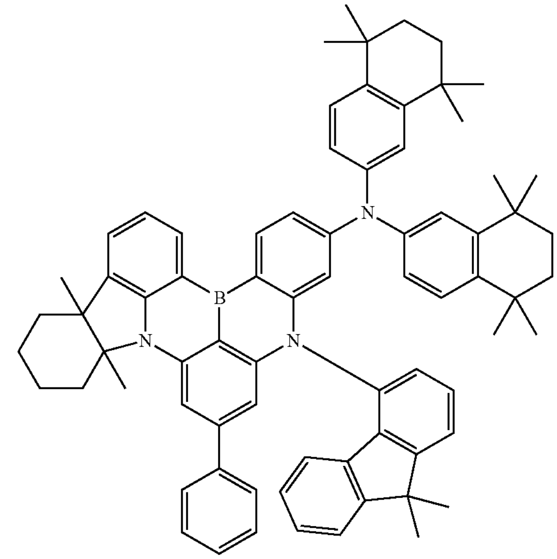
-continued
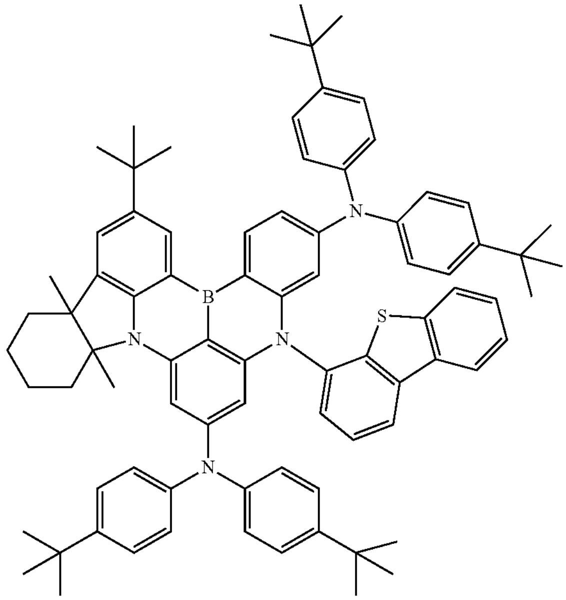
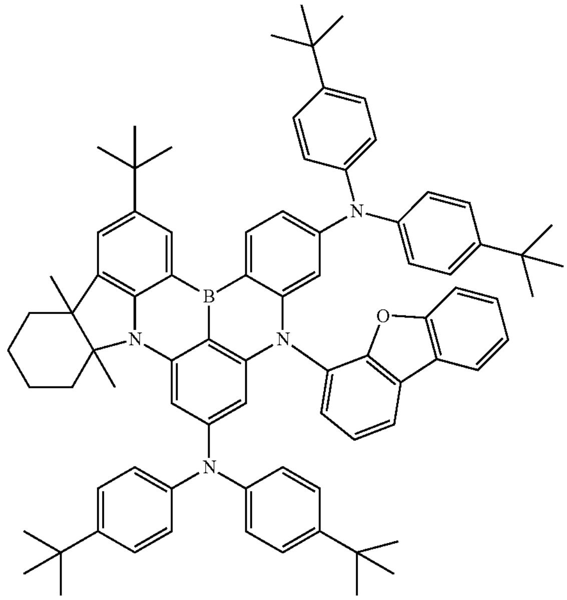
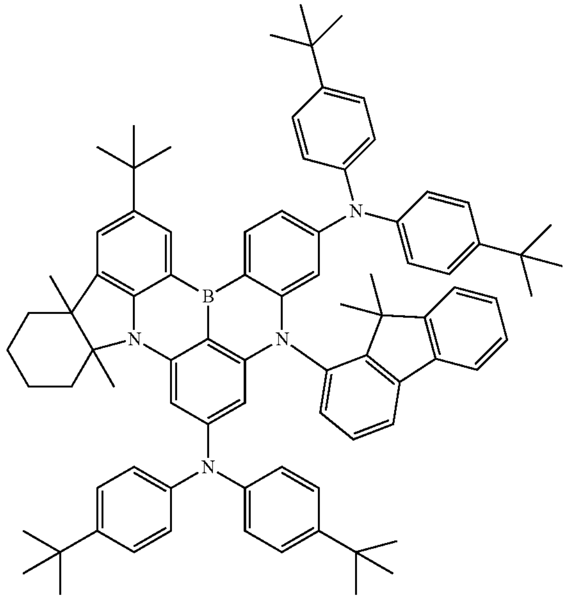

-continued
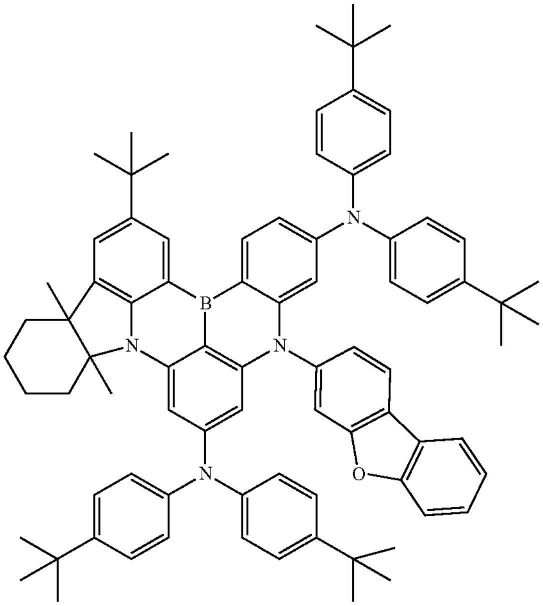
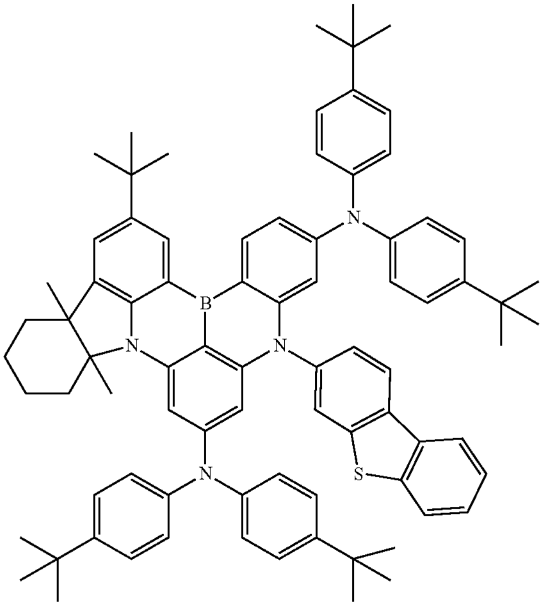
-continued
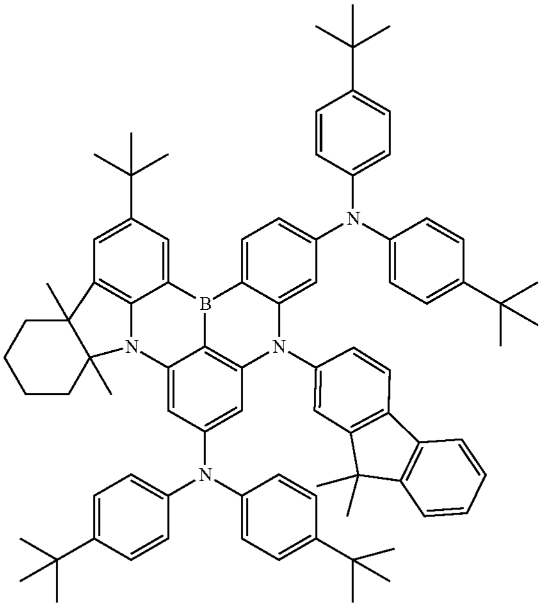
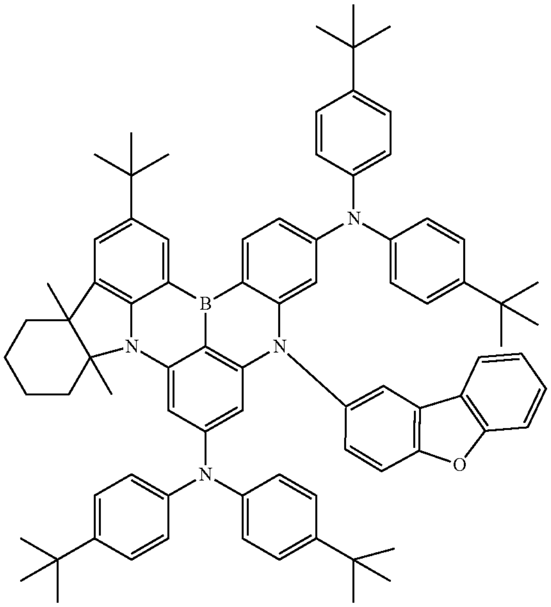

-continued
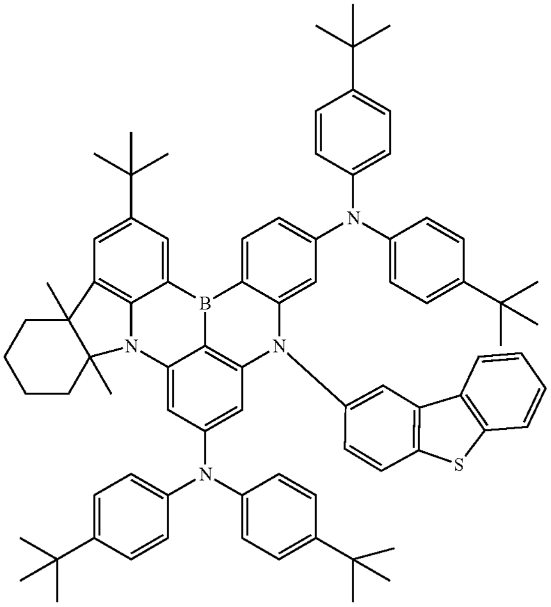
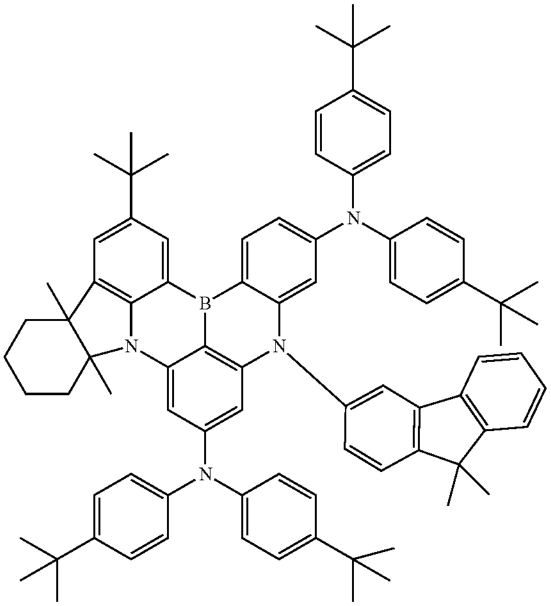
-continued
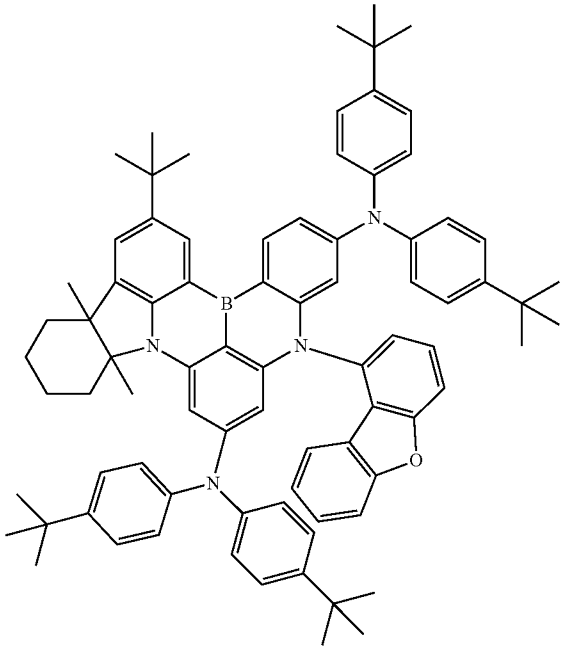
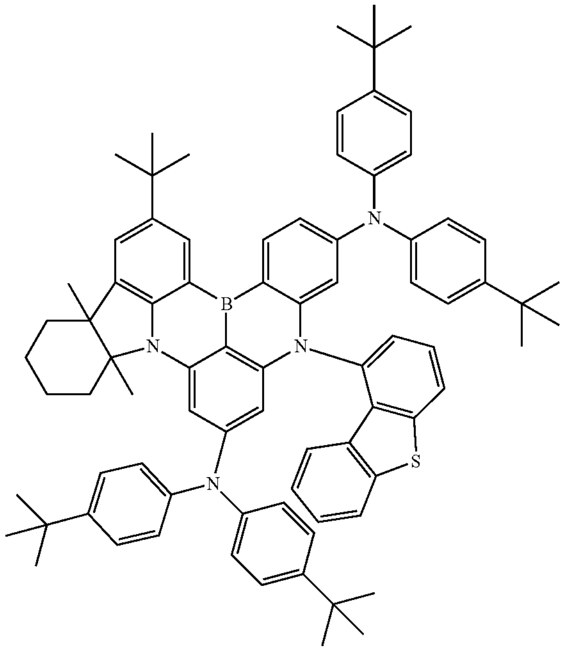

-continued
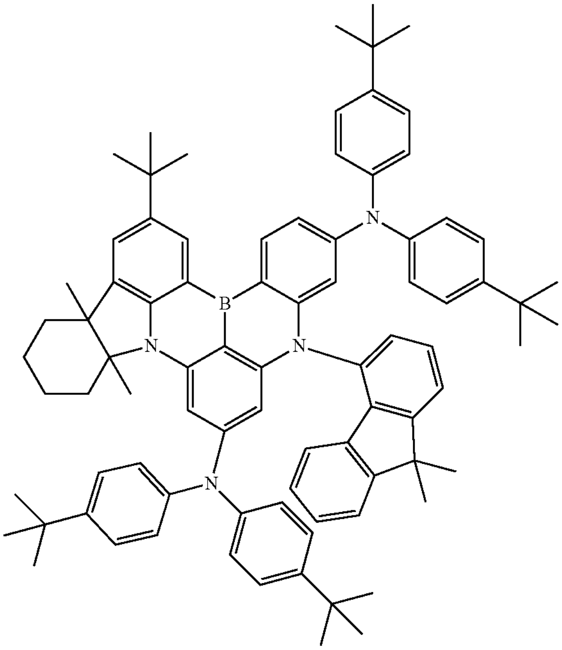
-continued
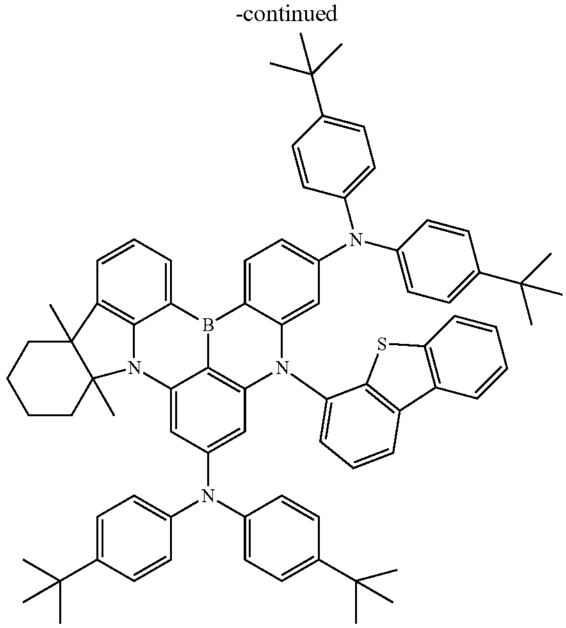
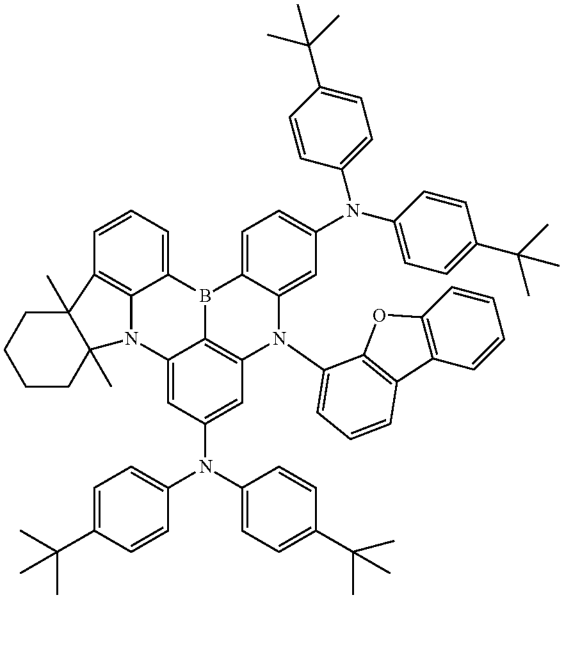
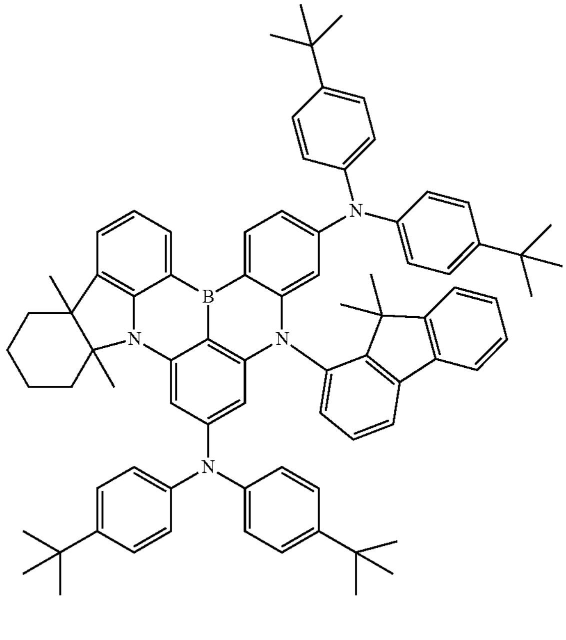

-continued
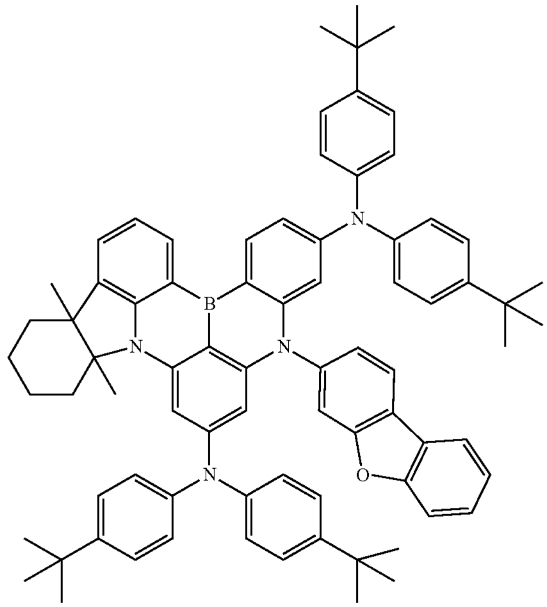
-continued
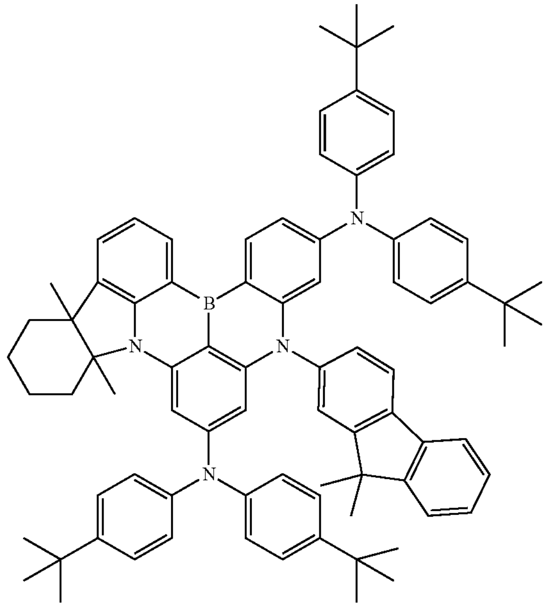
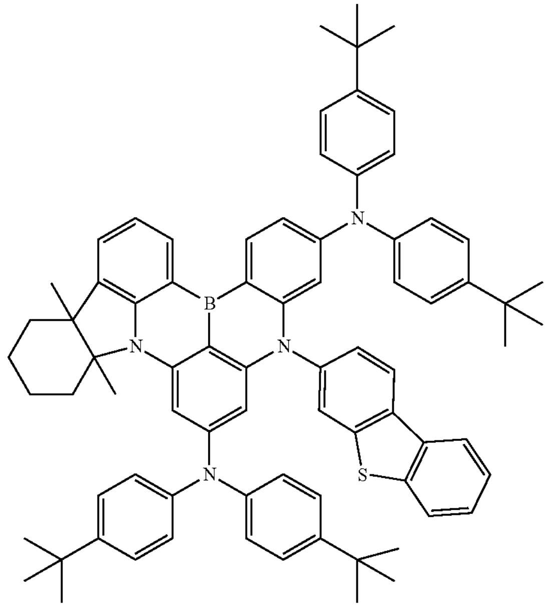
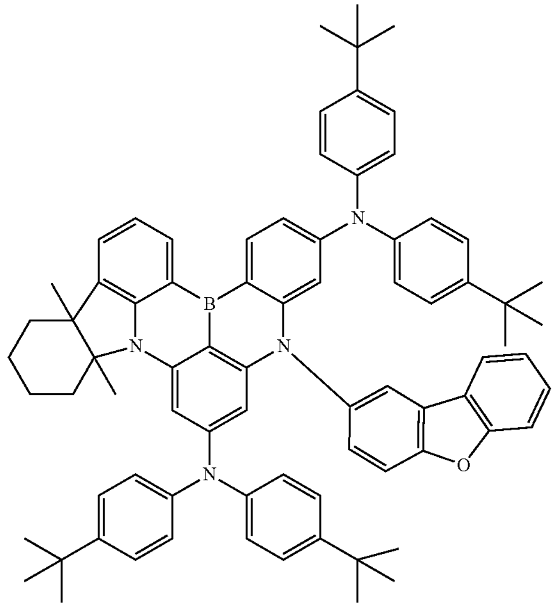

-continued
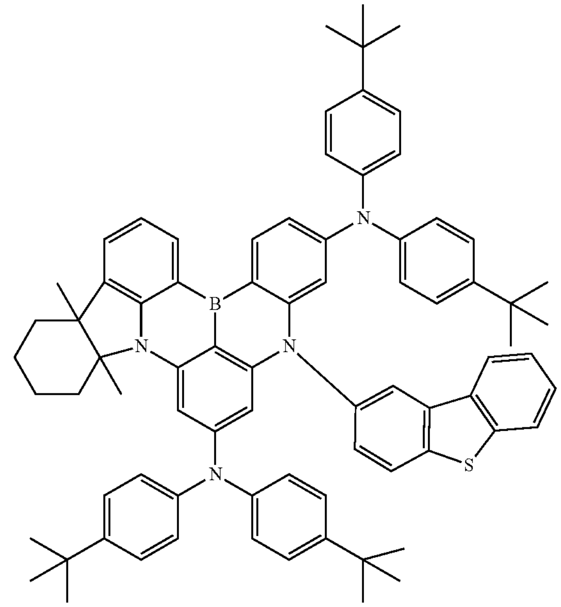
-continued
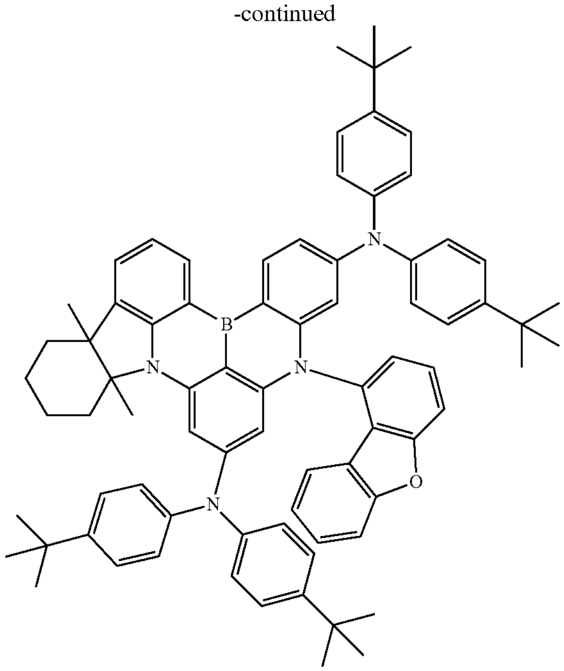
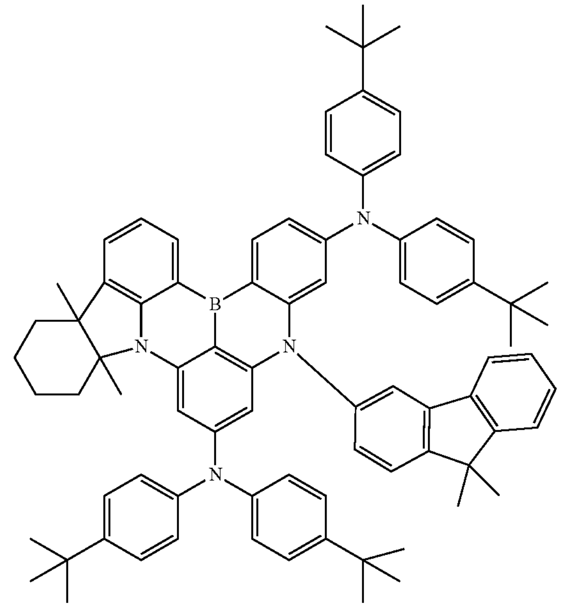
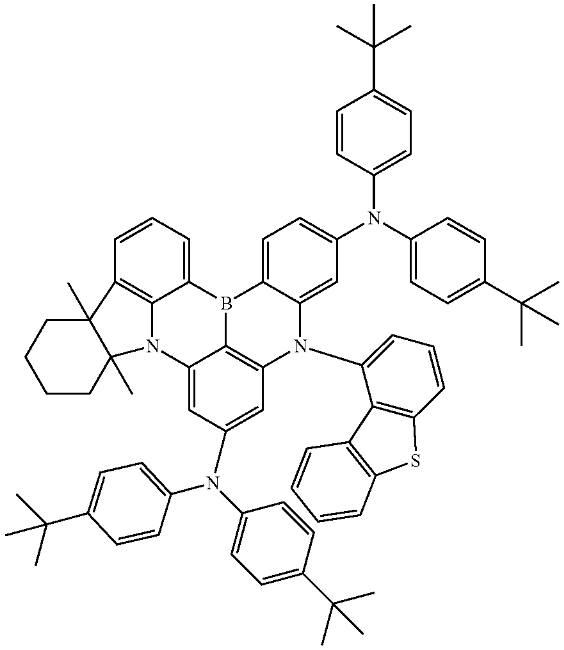

-continued
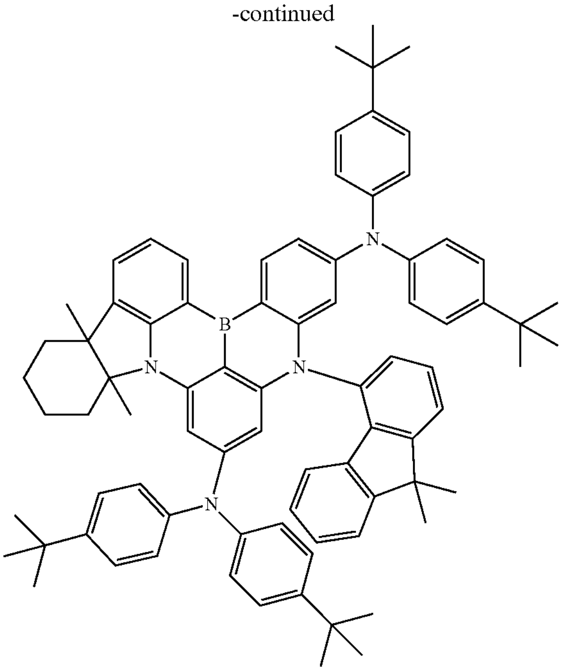
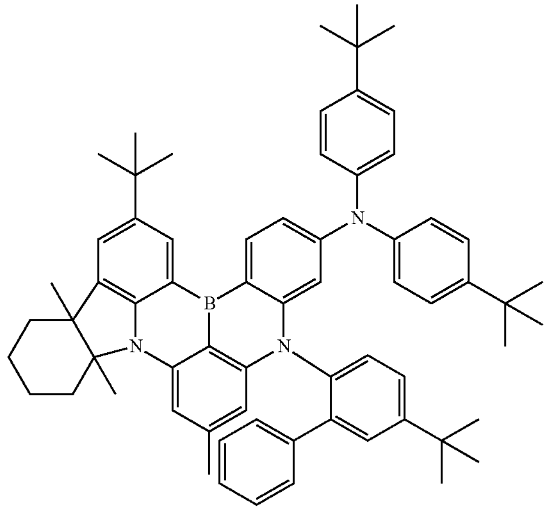
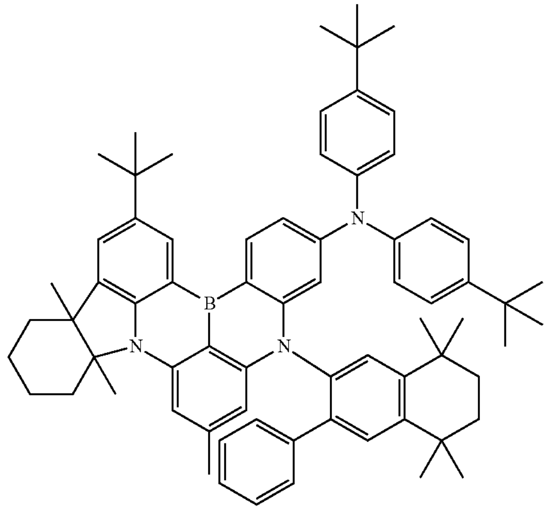
-continued
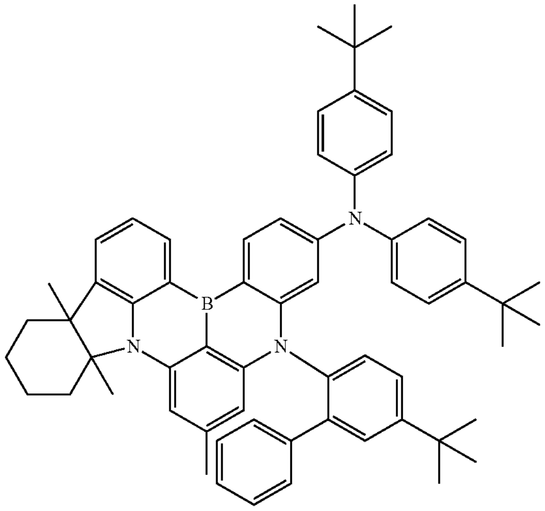
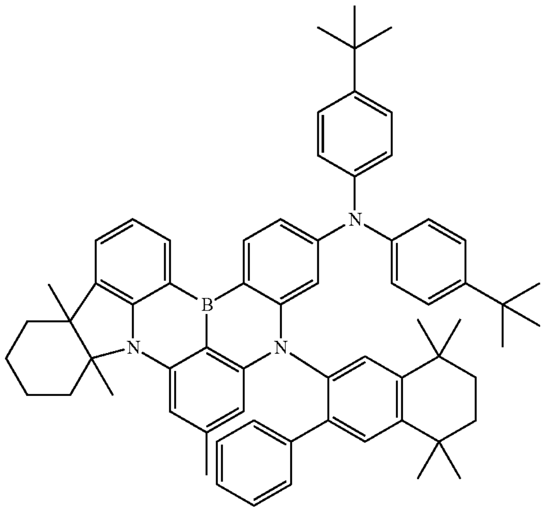
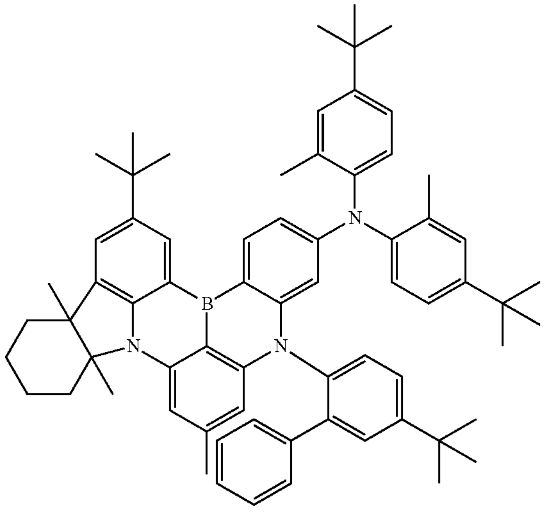

-continued
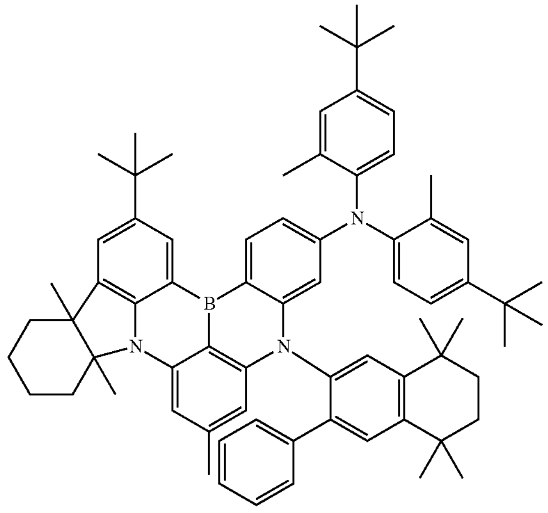
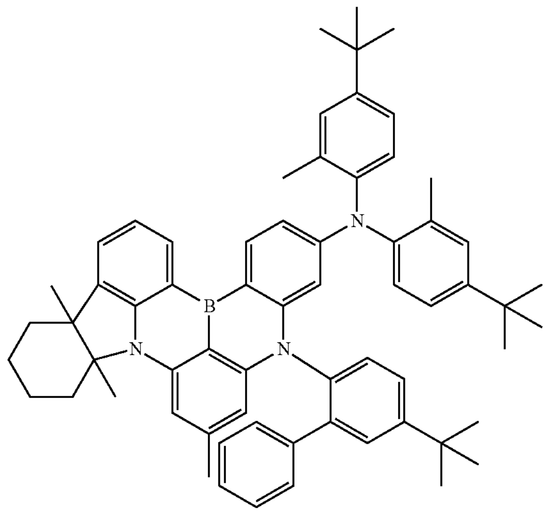
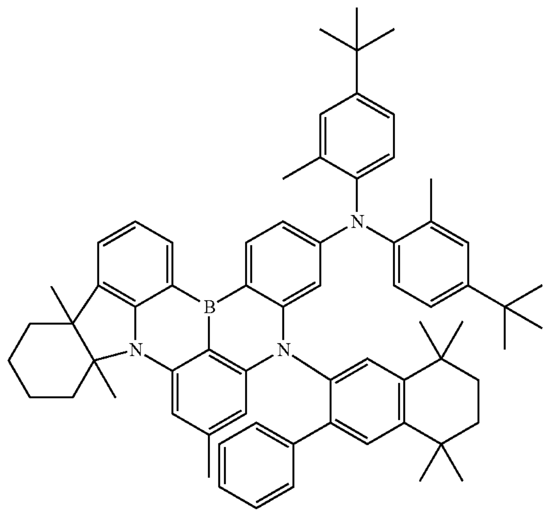
-continued
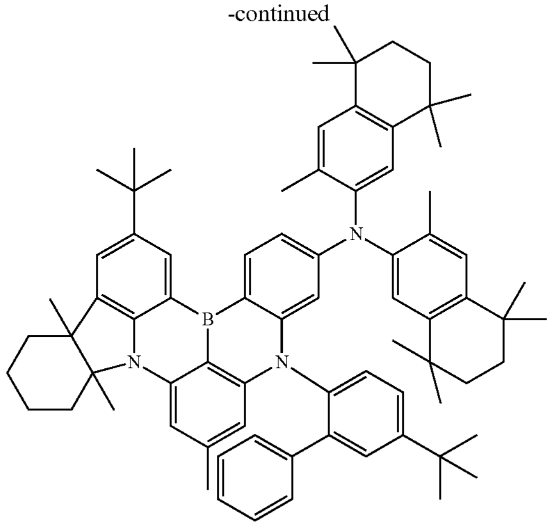
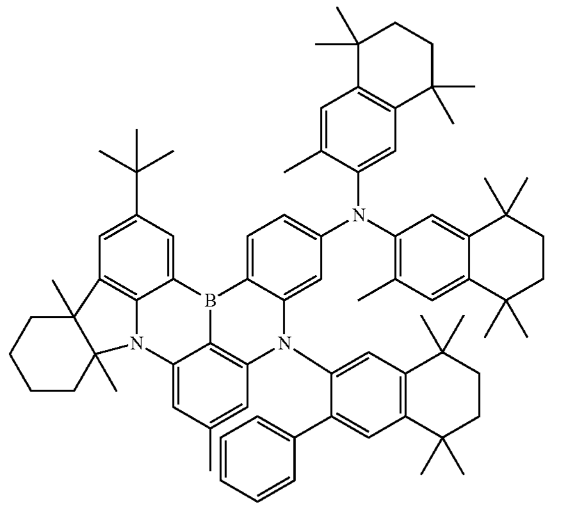
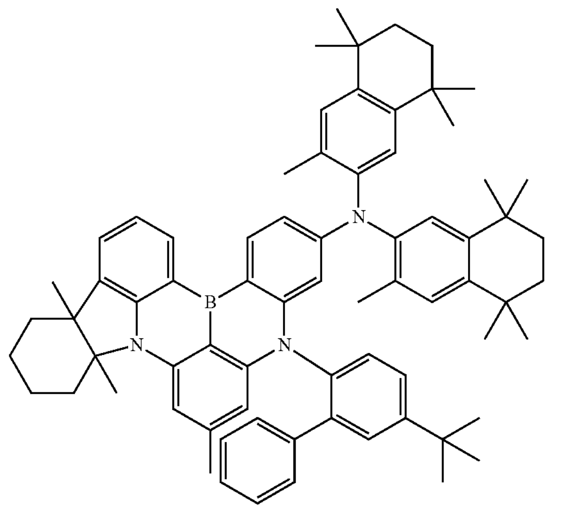

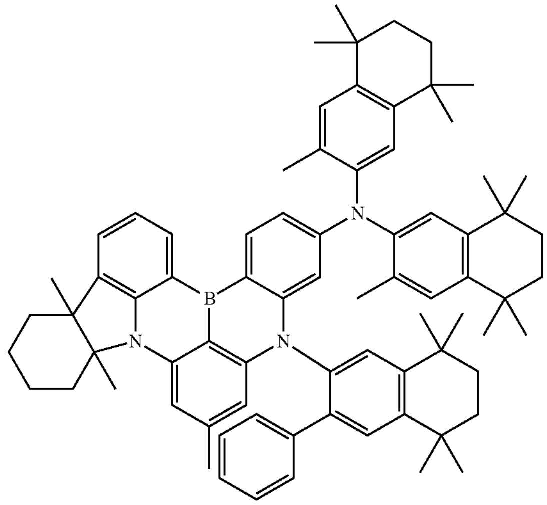
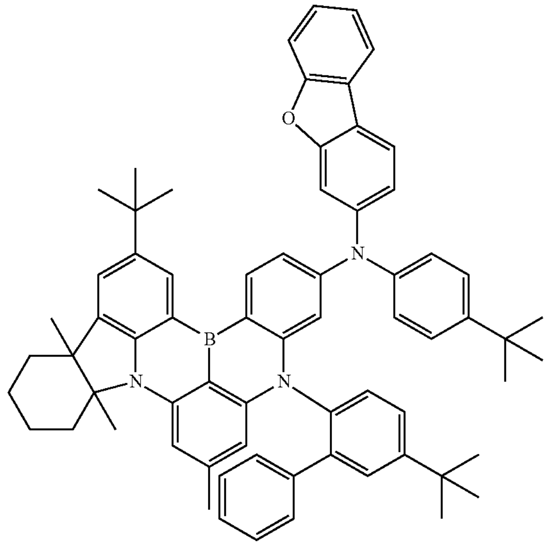
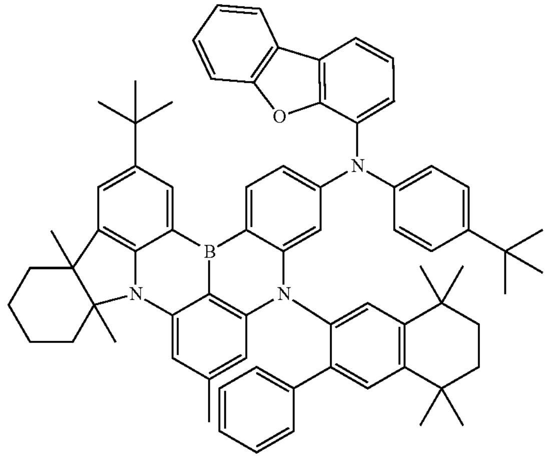
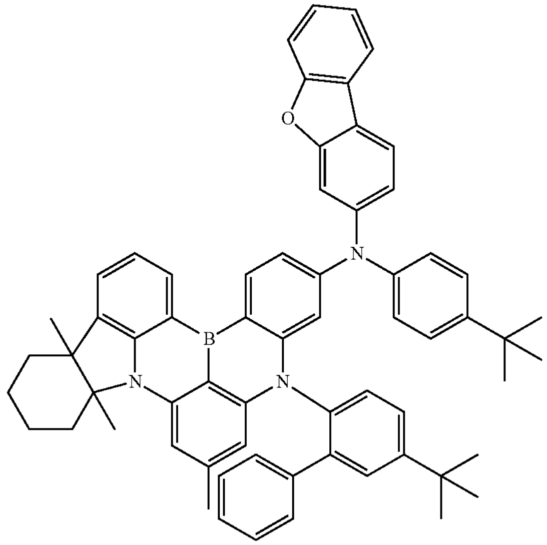
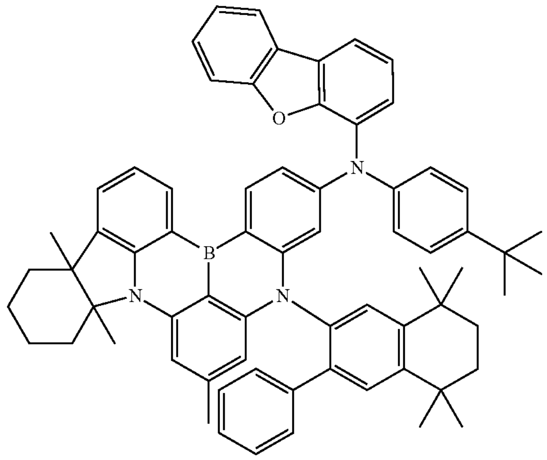
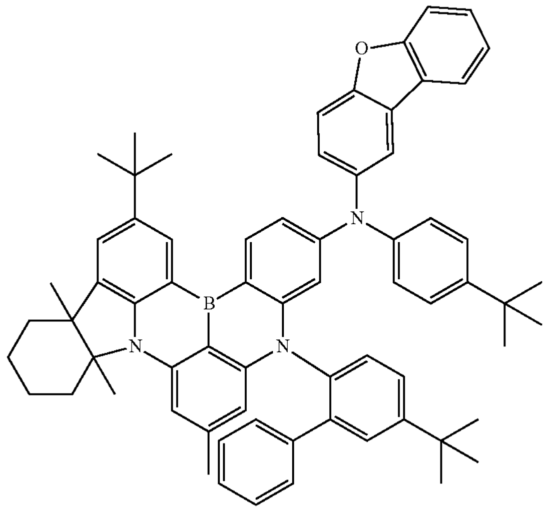

-continued
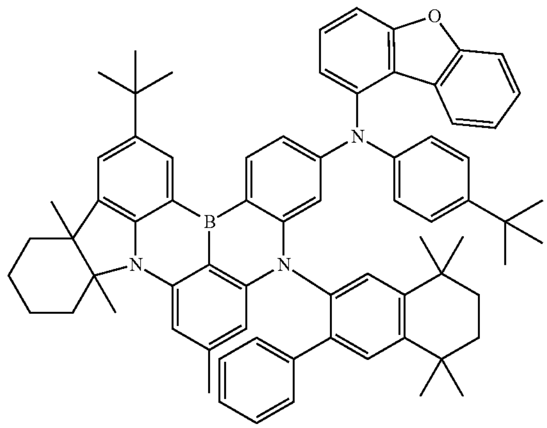
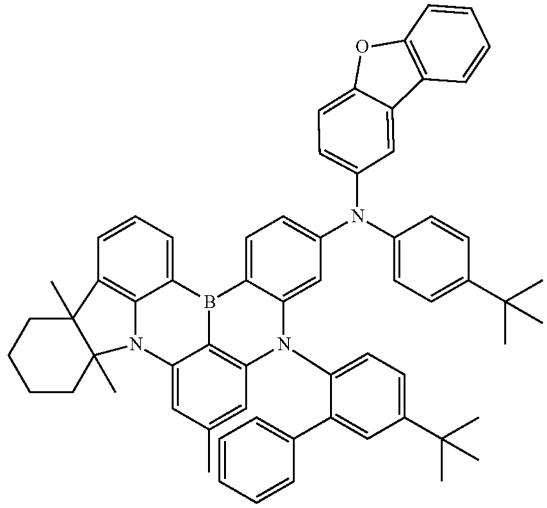
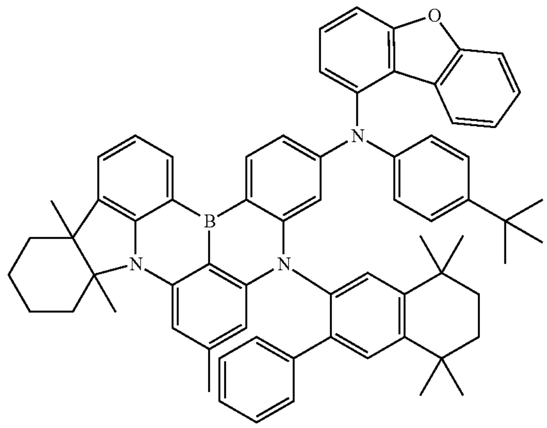
-continued
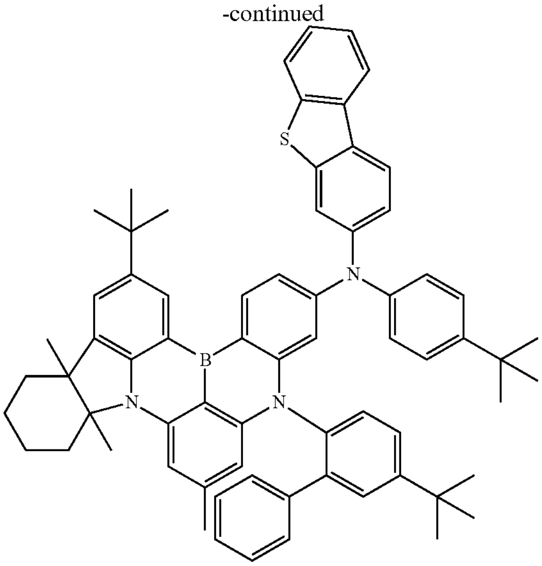
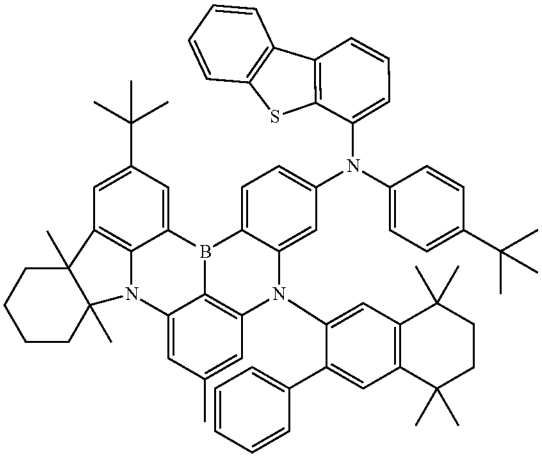
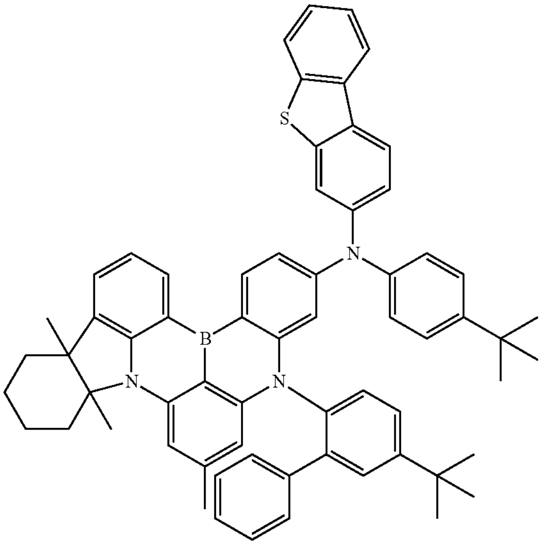

-continued
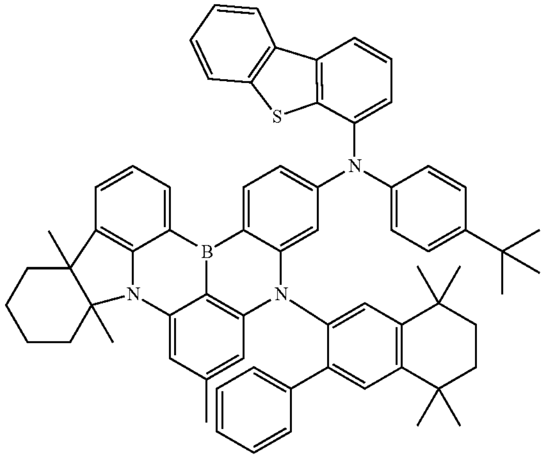
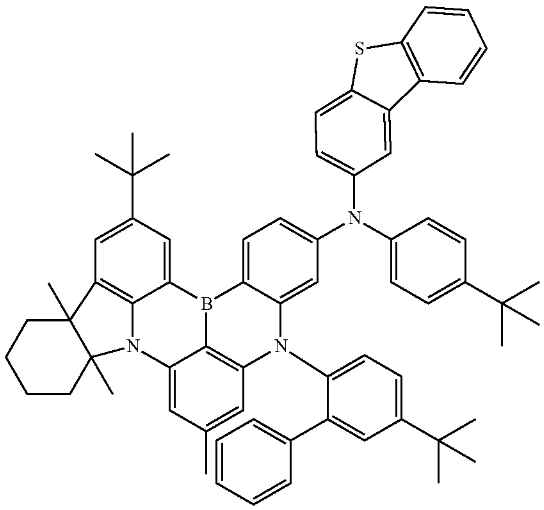
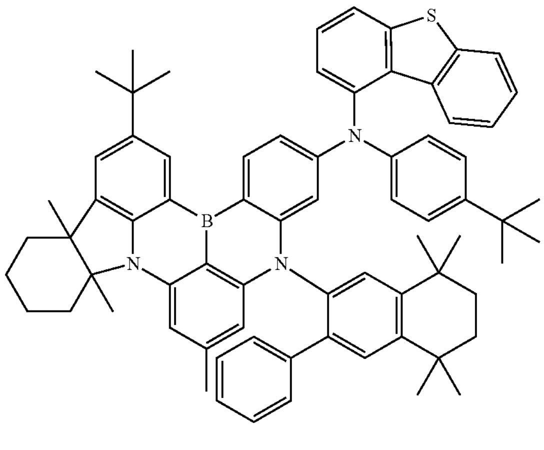
-continued
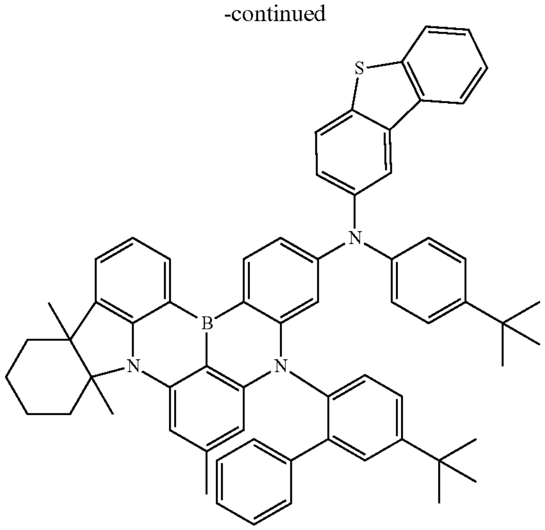
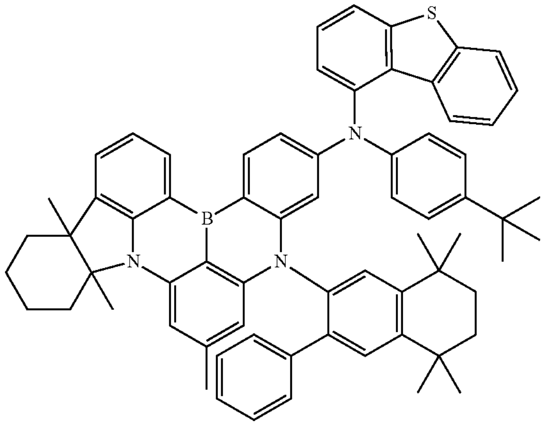
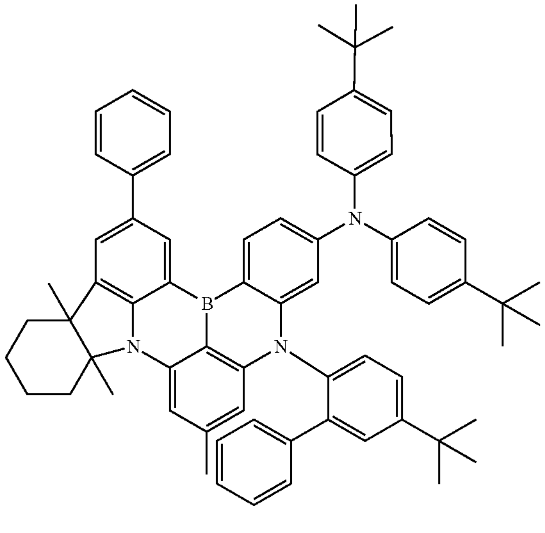

-continued
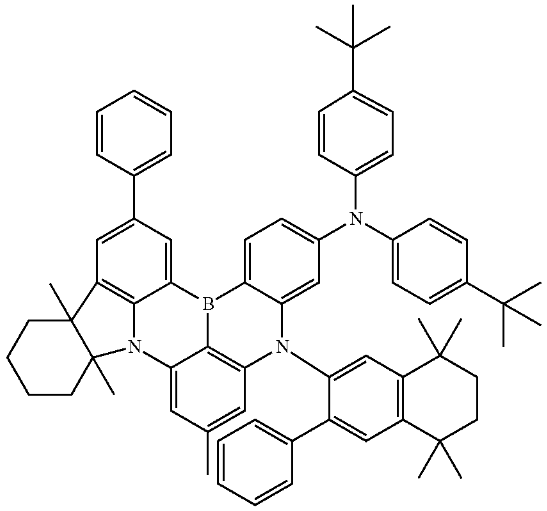
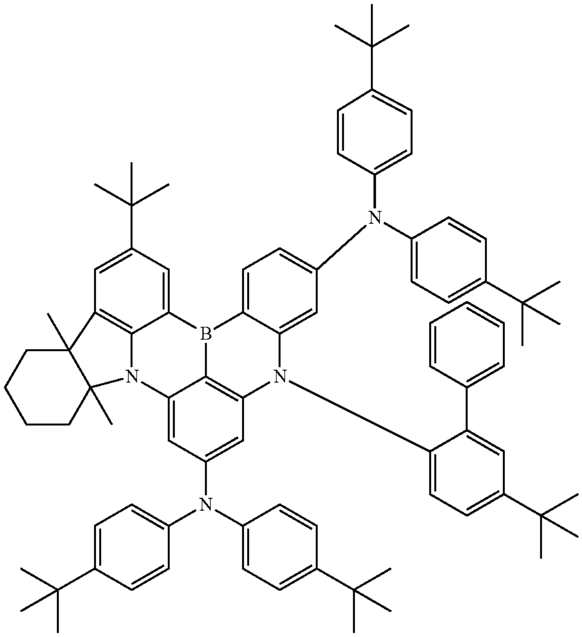
-continued
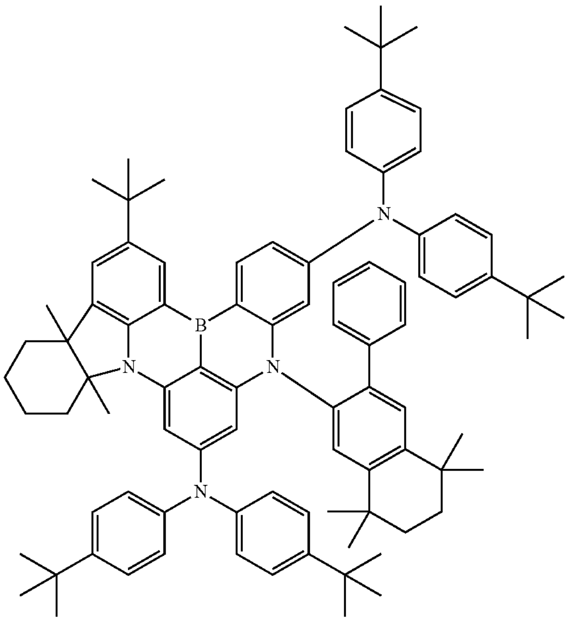
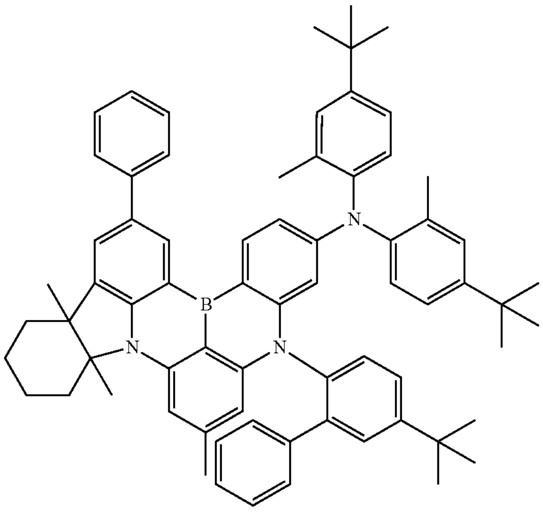
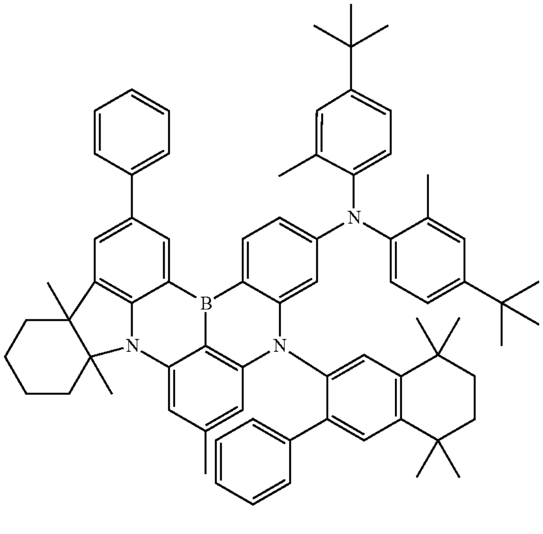

-continued
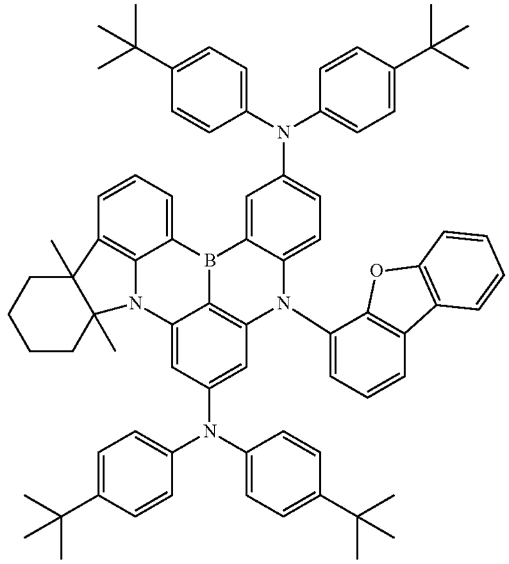
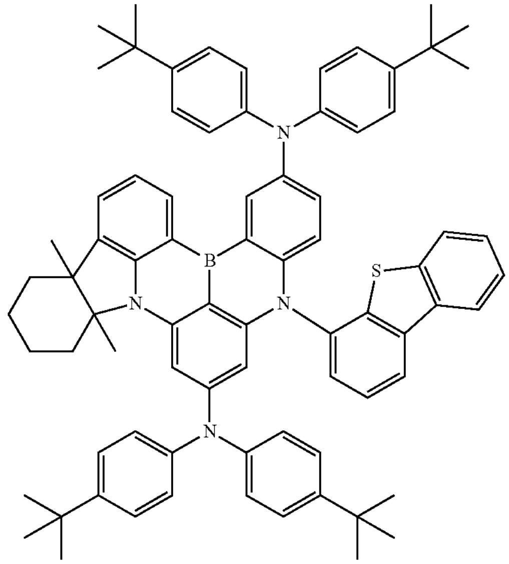
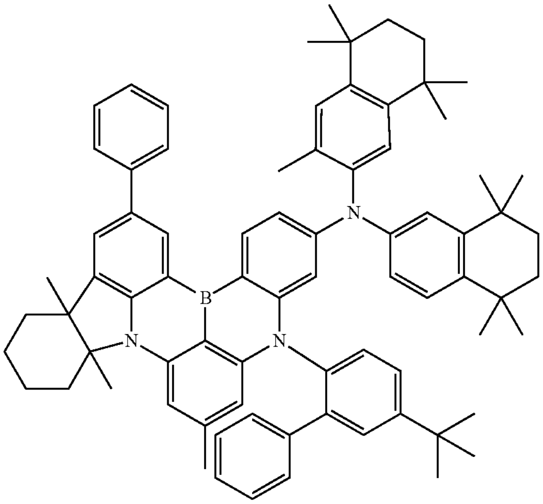
-continued
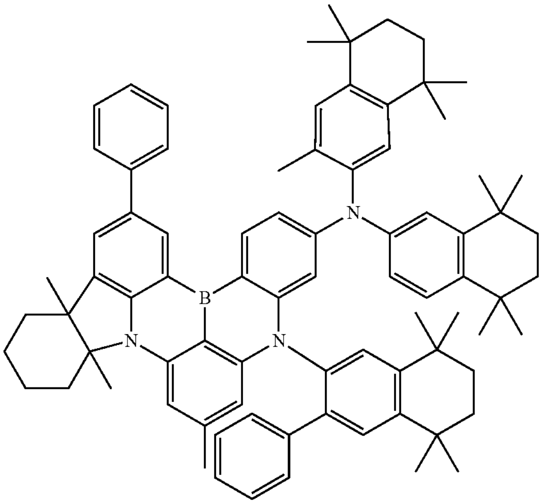
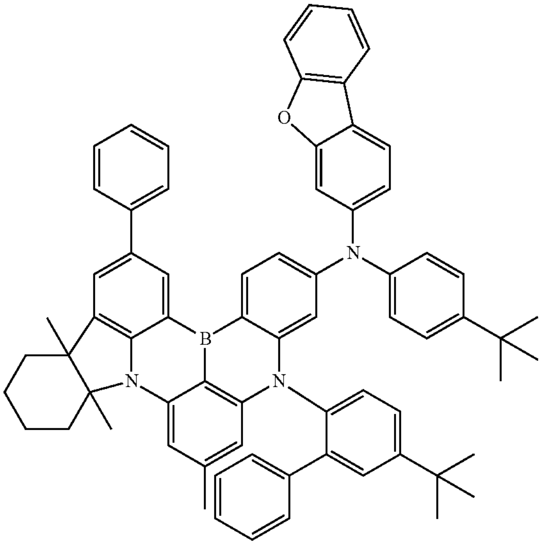
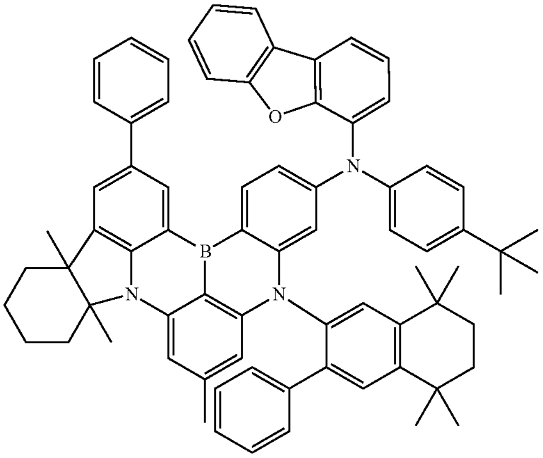

-continued
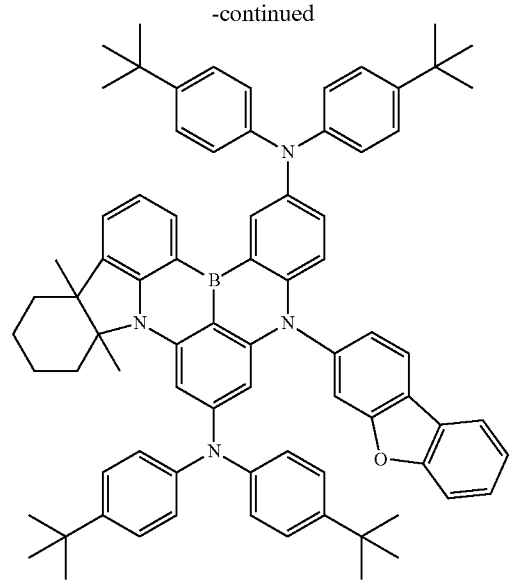
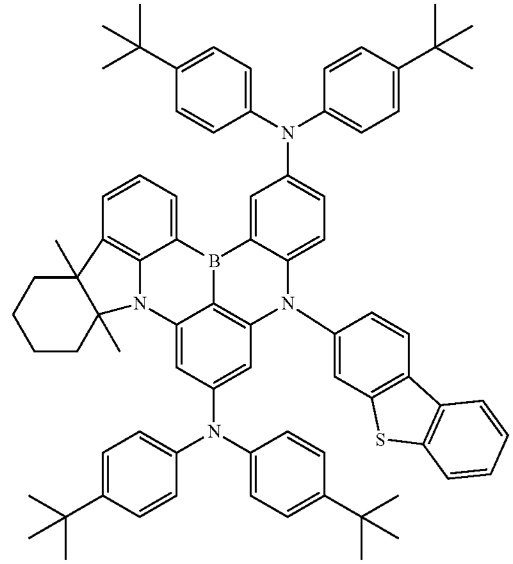
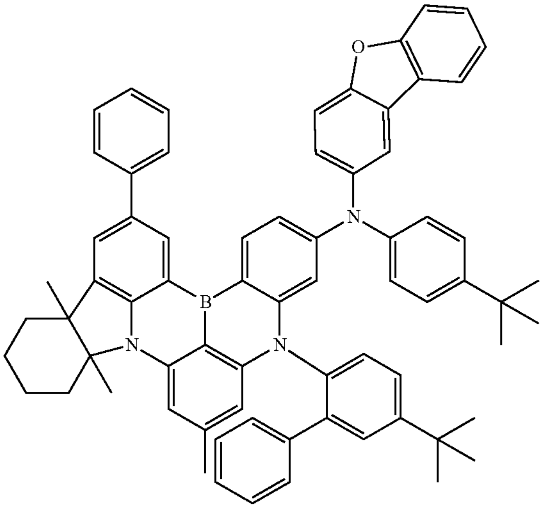
-continued
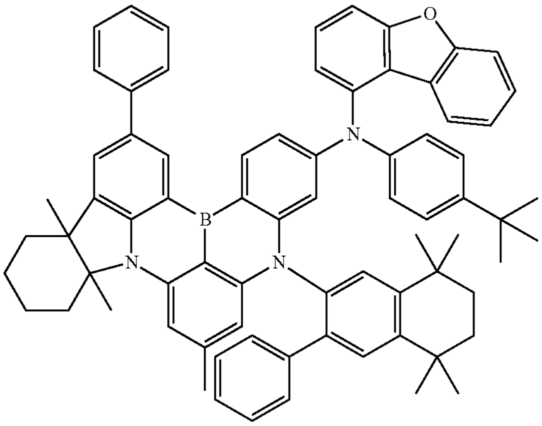
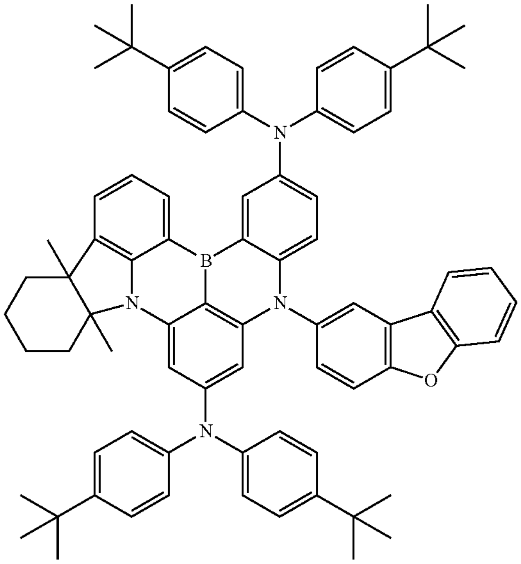
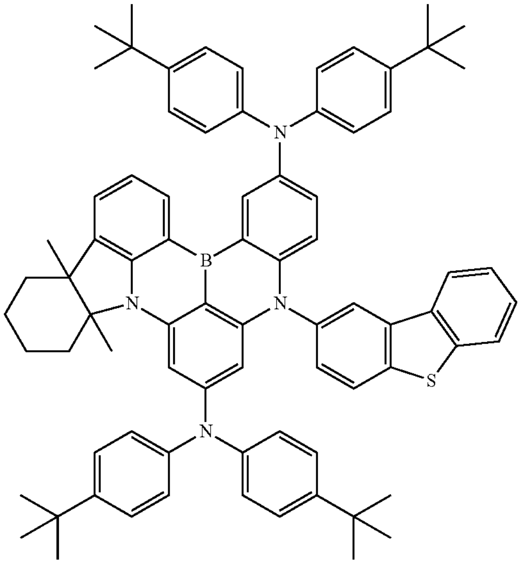

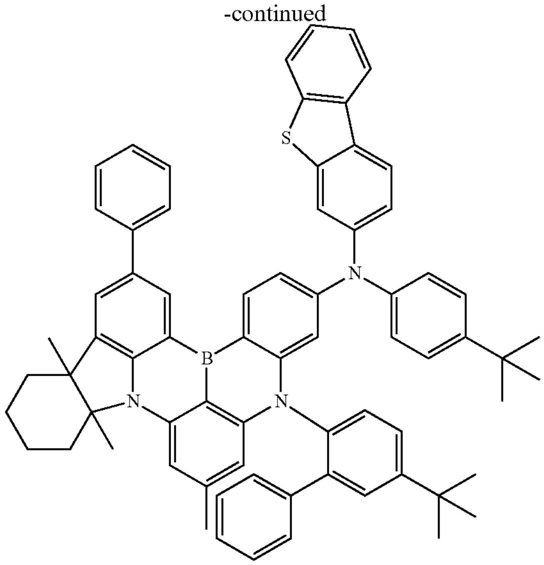
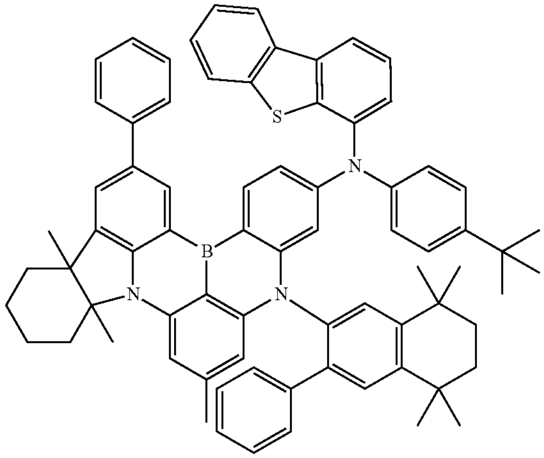
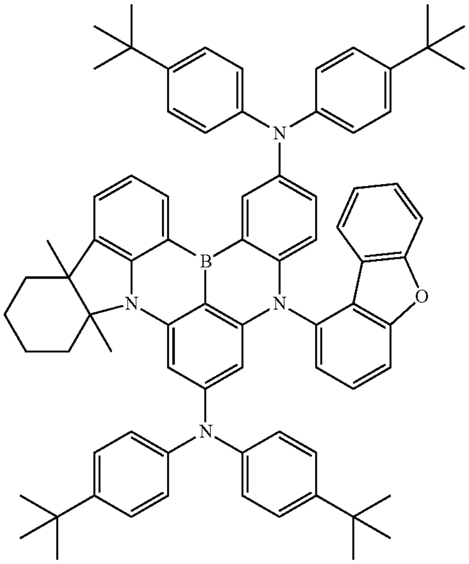
-continued
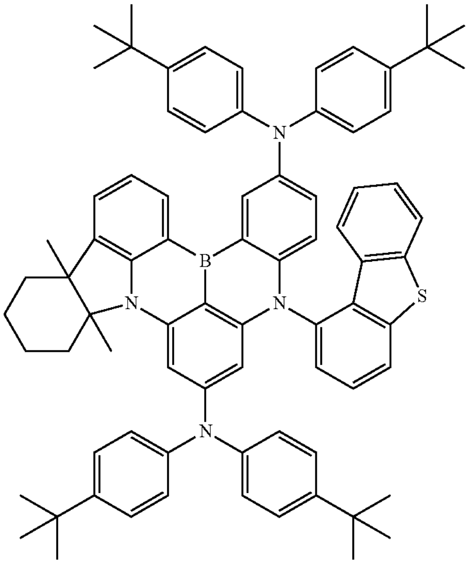
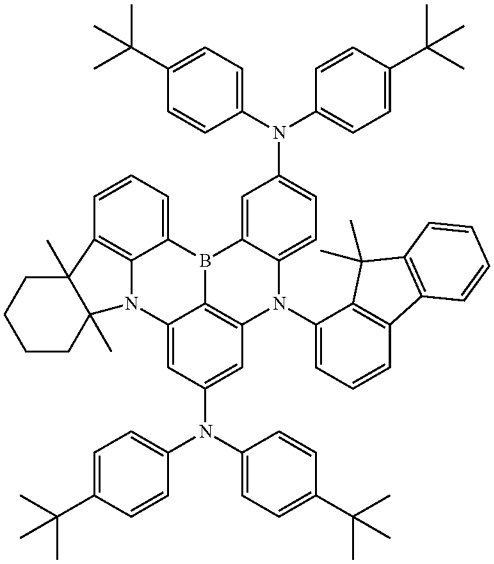
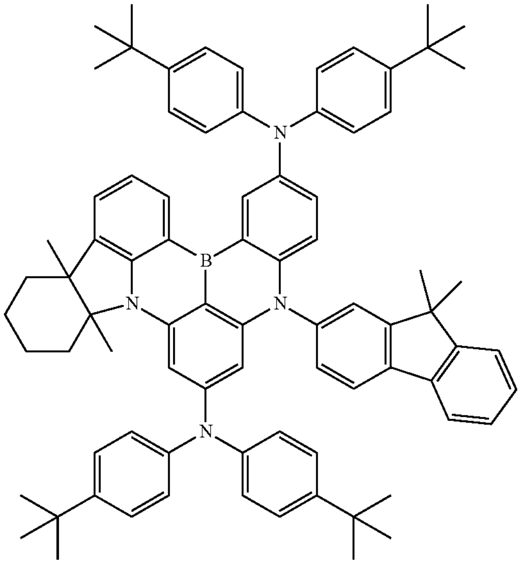

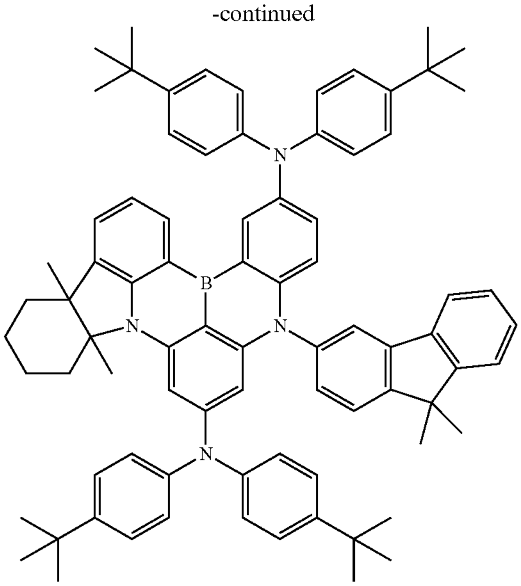
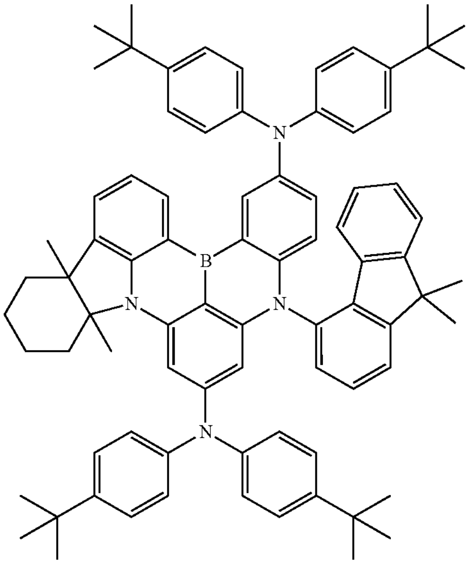
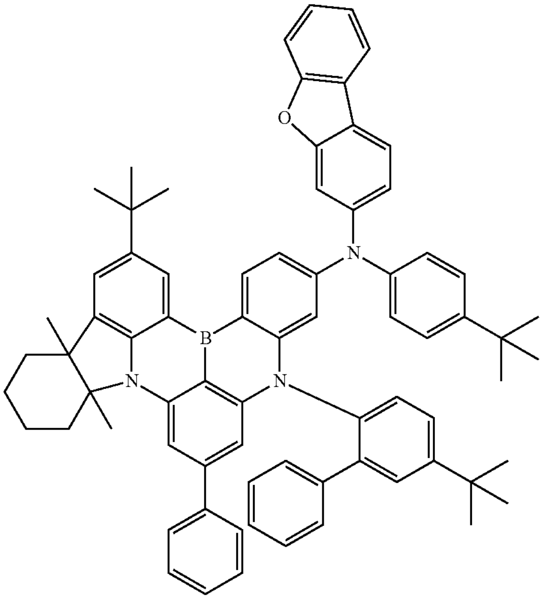
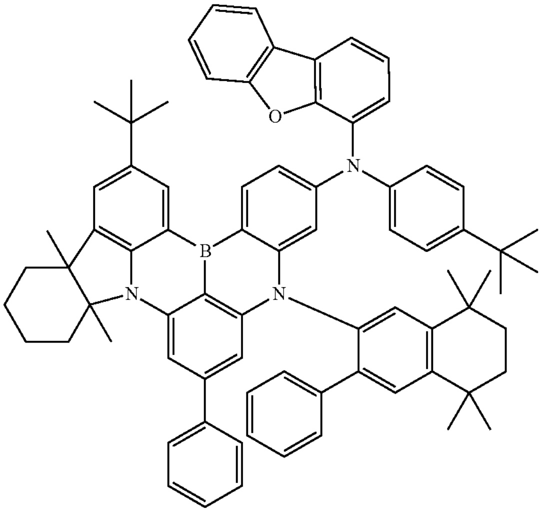
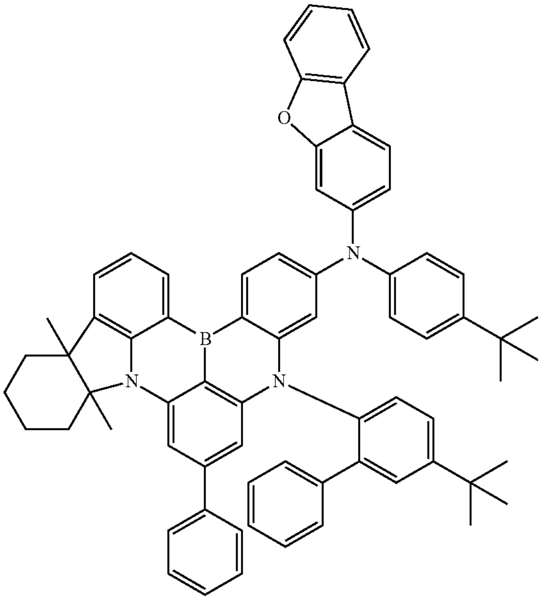
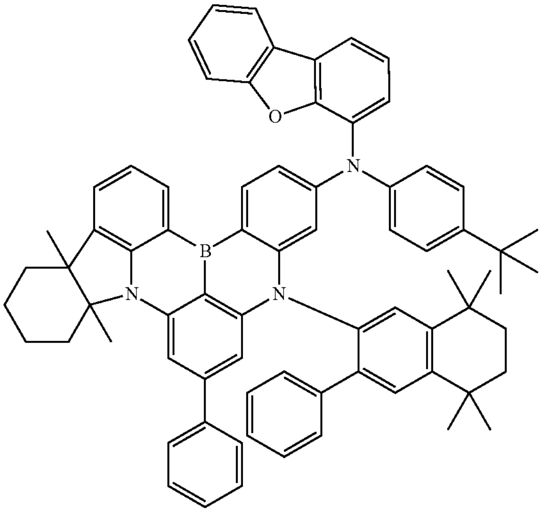

-continued
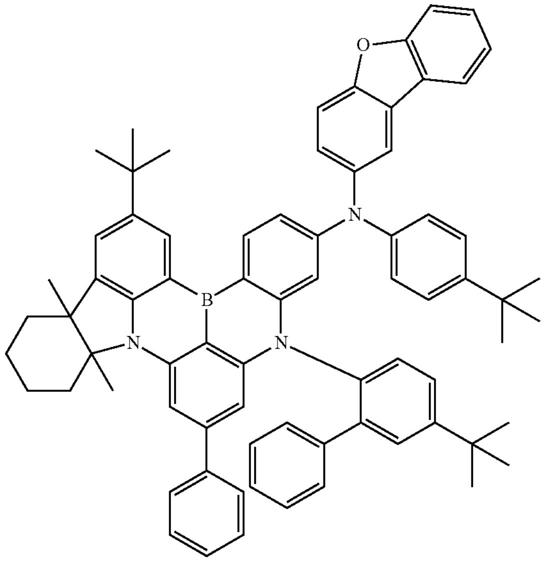
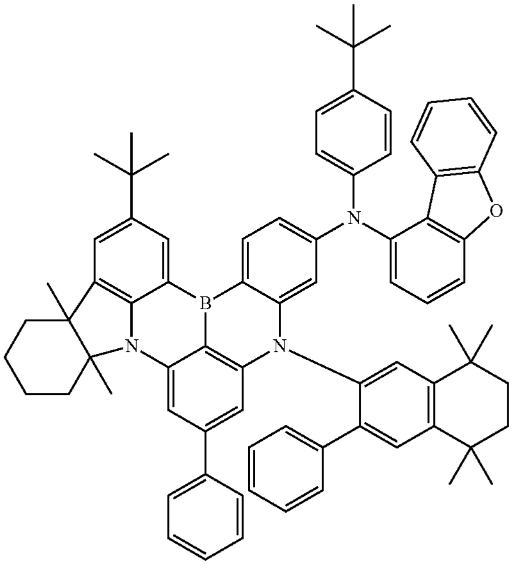
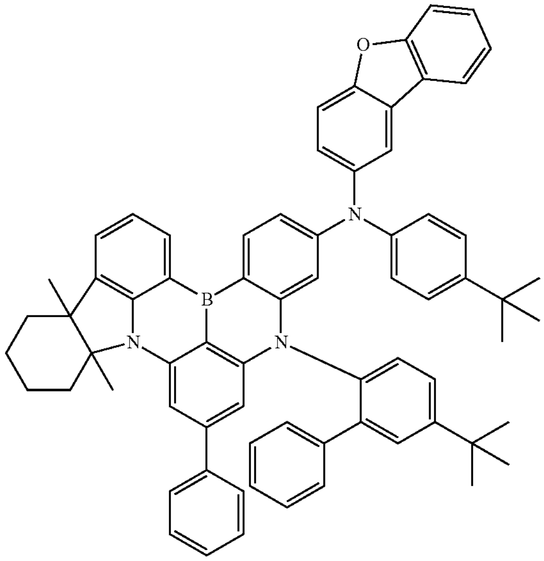
-continued
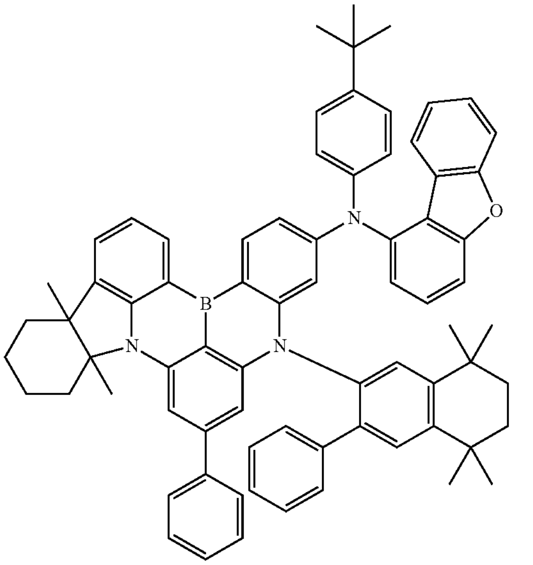
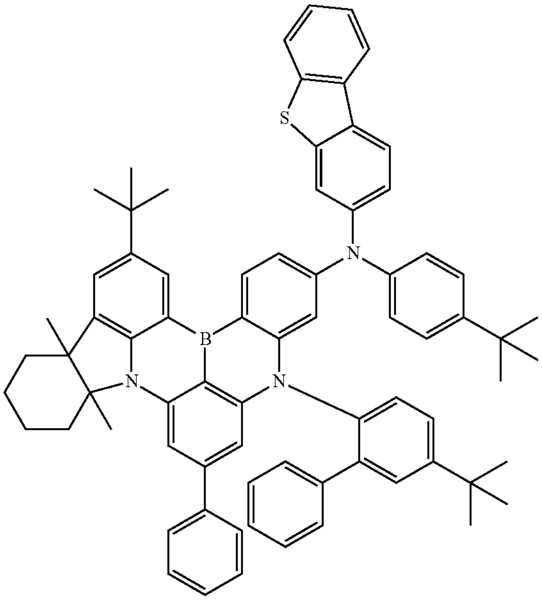
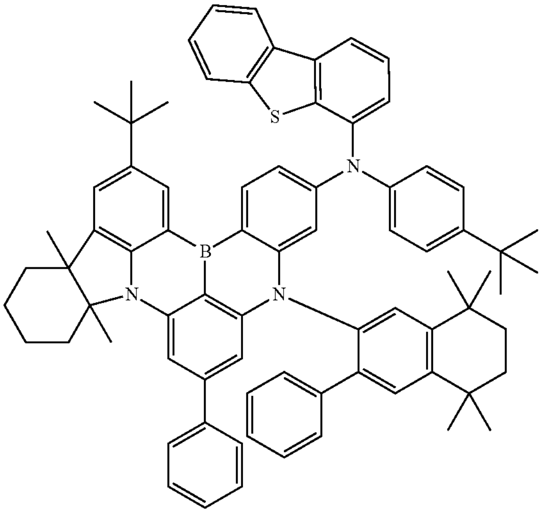

-continued
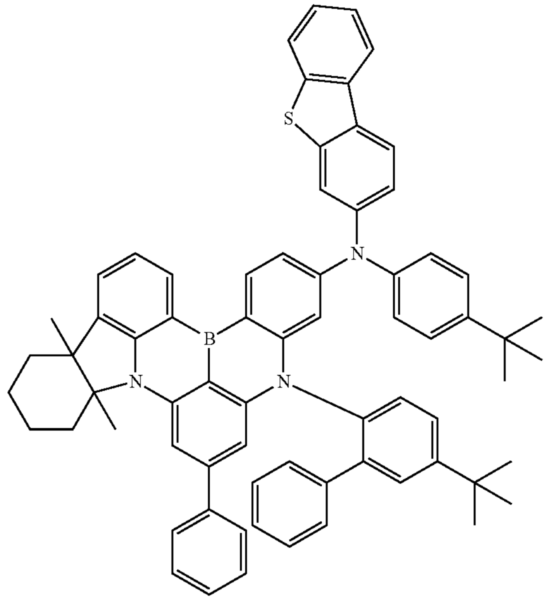
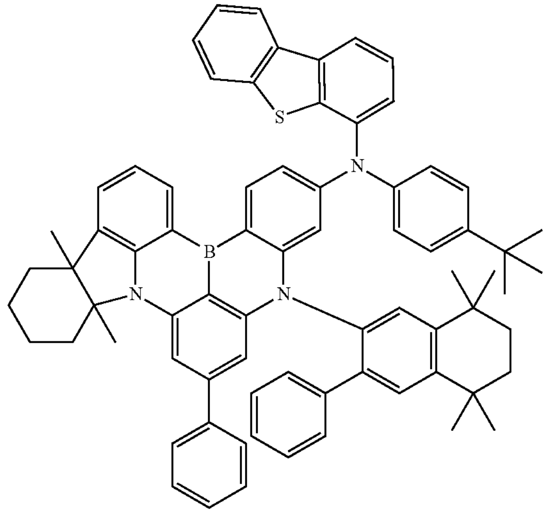
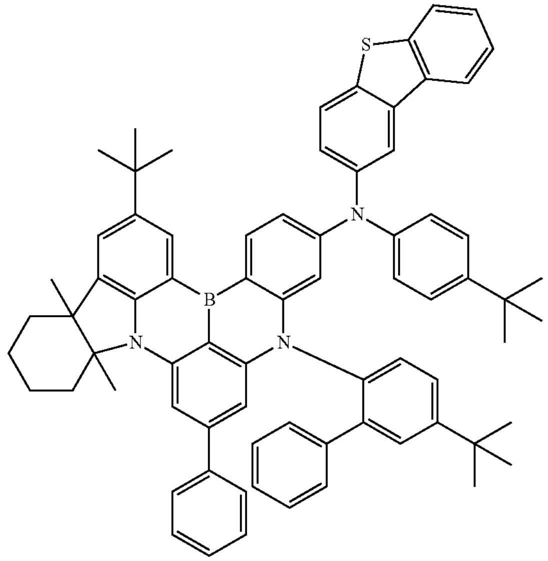
-continued
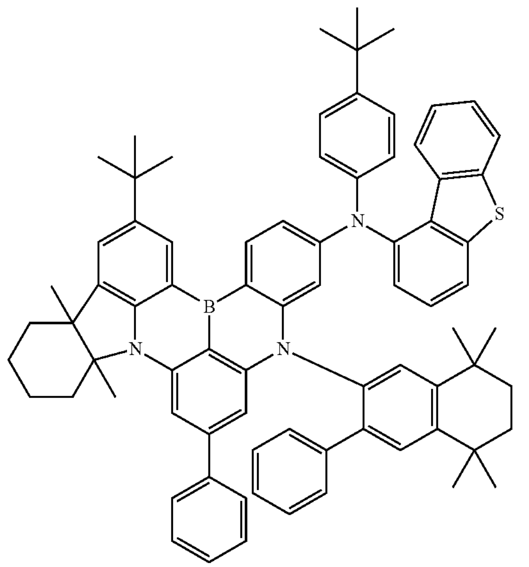
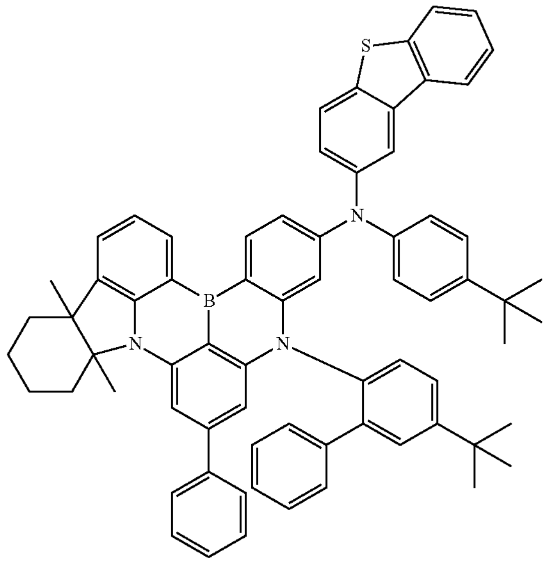
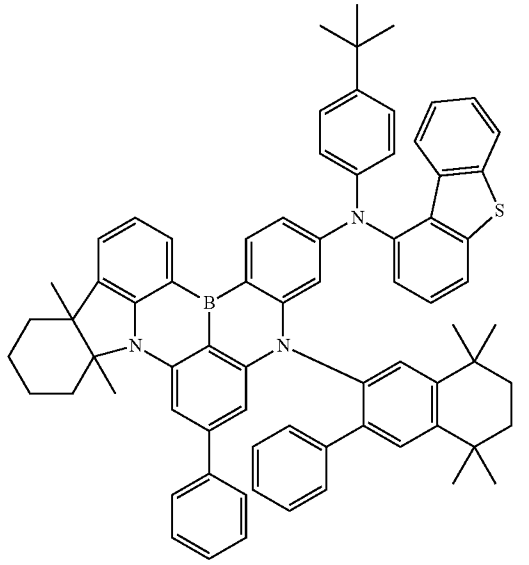

-continued
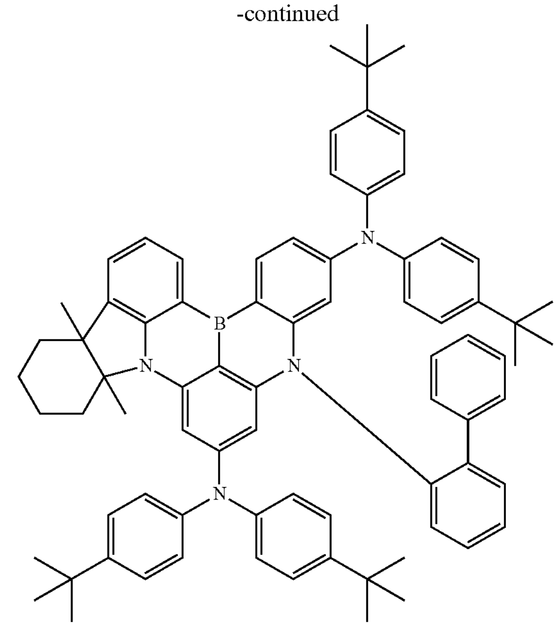
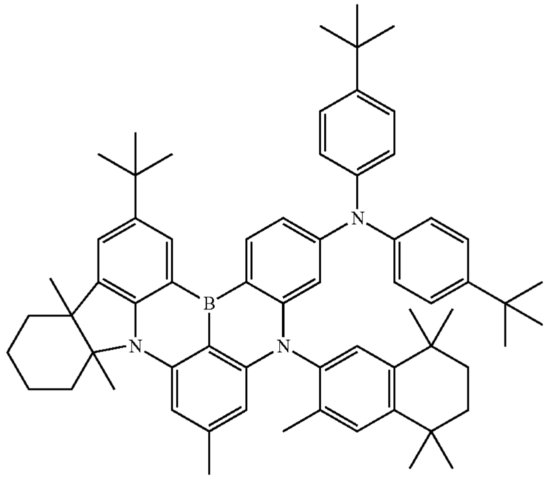
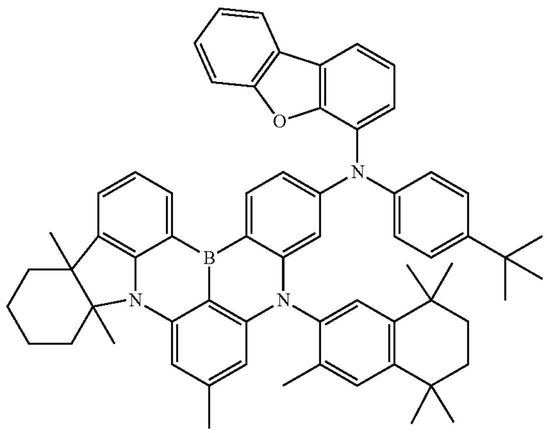
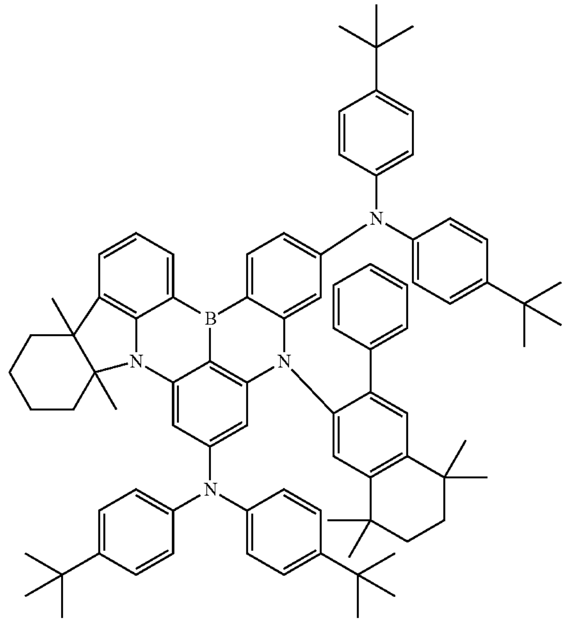 [SMILES: CC(C)(C)c1ccc(N(c2ccc(C(C)(C)C)cc2)c2ccc3c(c2)N(c2cc4c(cc2-c2ccccc2)C(C)(C)CCC4(C)C)c2cc(N(c4ccc(C(C)(C)C)cc4)c4ccc(C(C)(C)C)cc4)cc4c2B3c2cccc3c2N4C2(C)CCCCC32C)cc1]
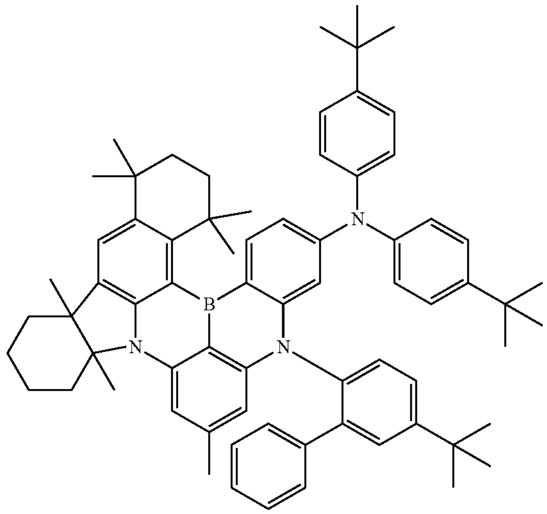

-continued
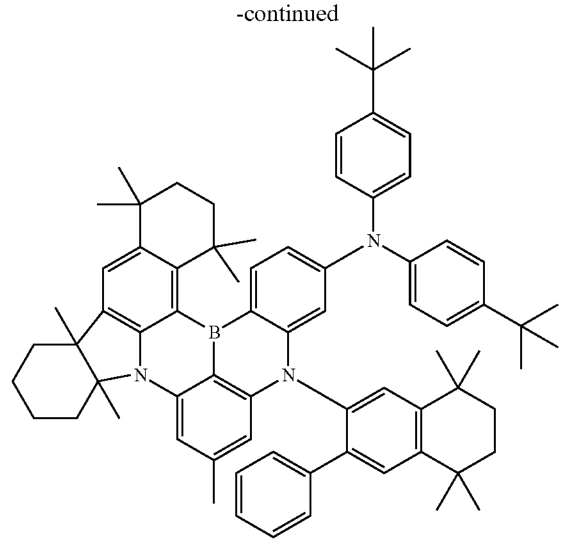
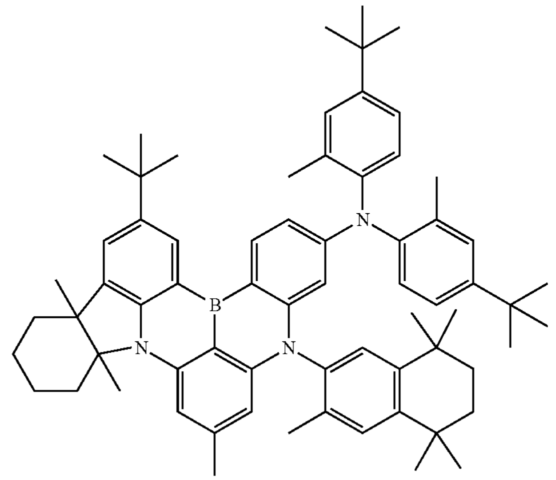
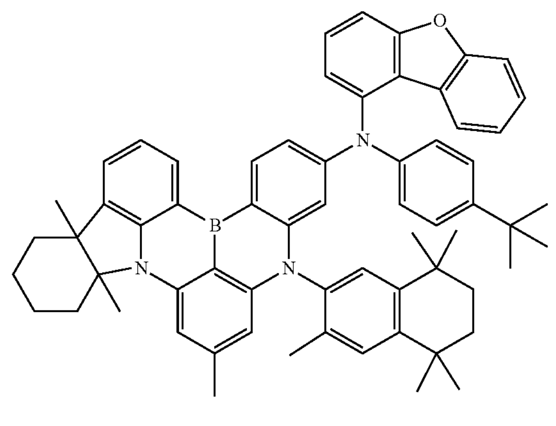
-continued
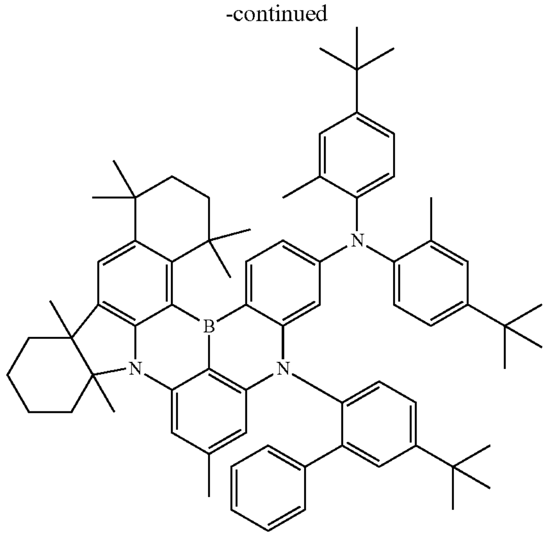
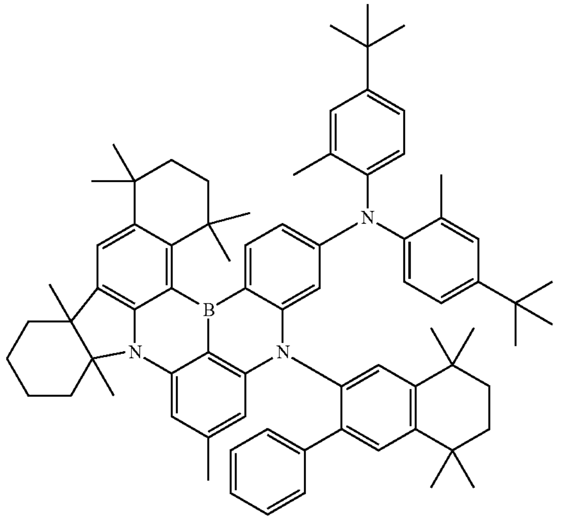
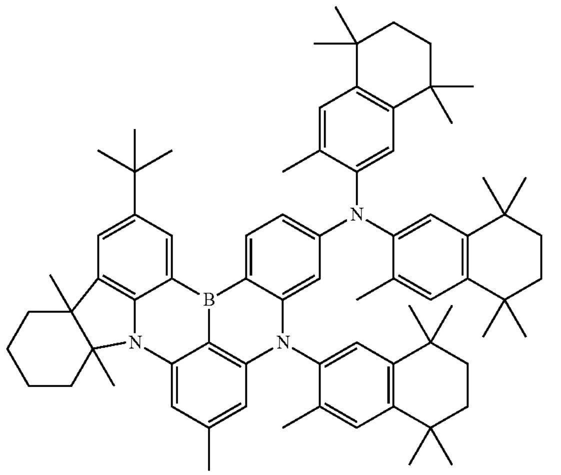

-continued
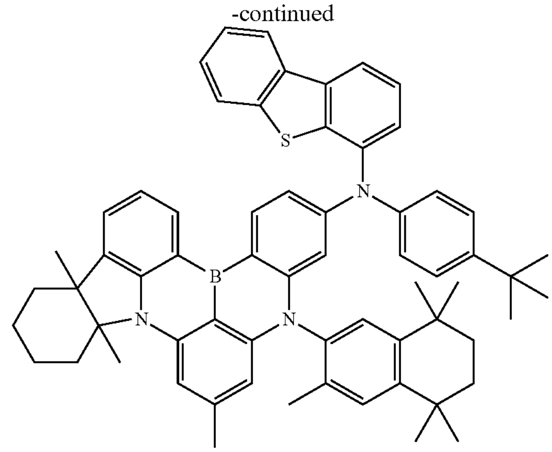
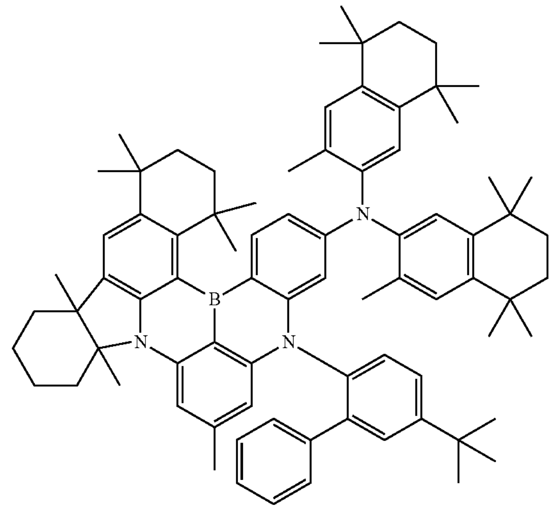
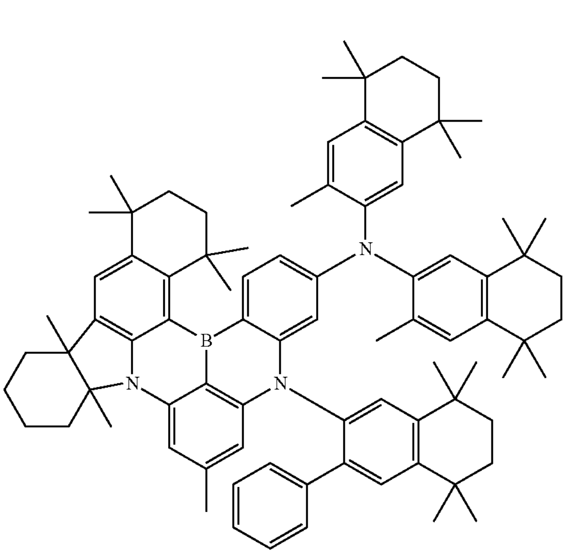
-continued
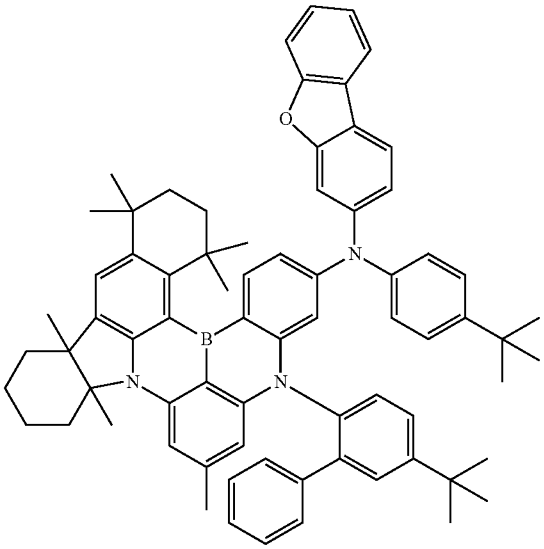
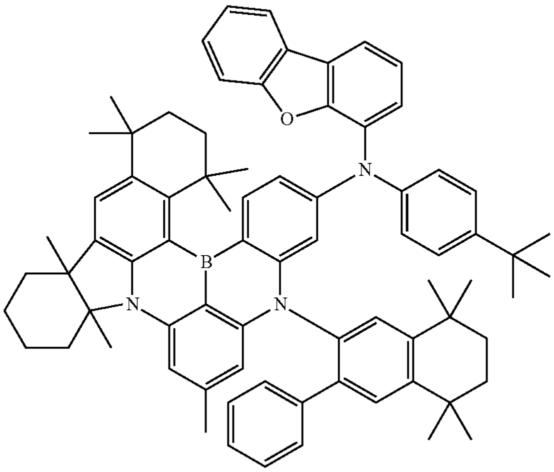
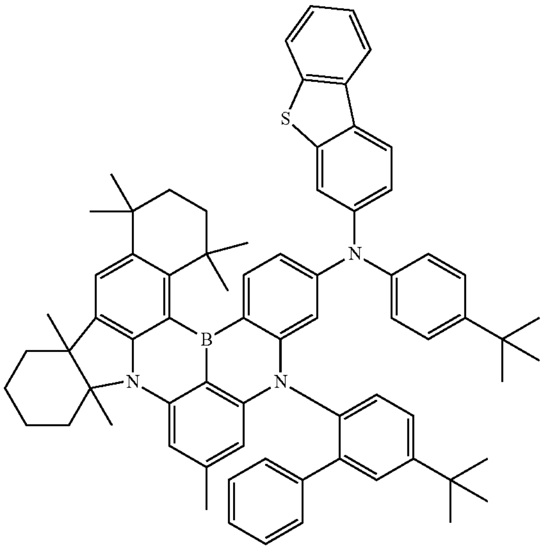

-continued
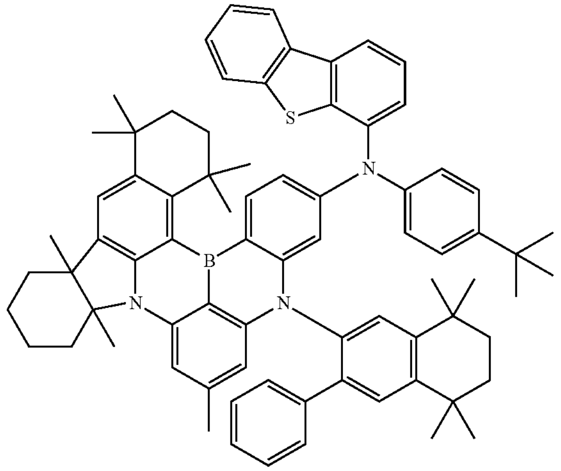
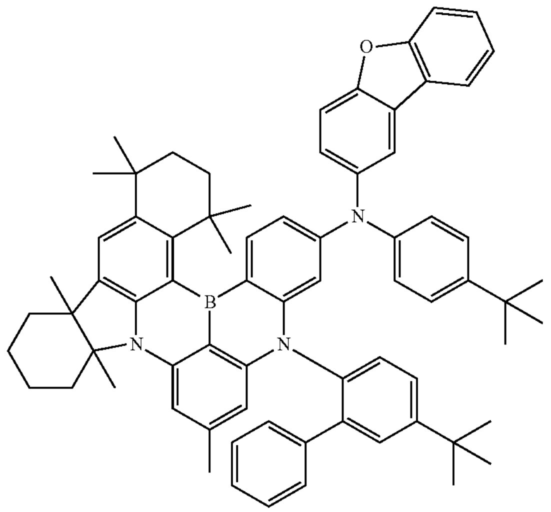
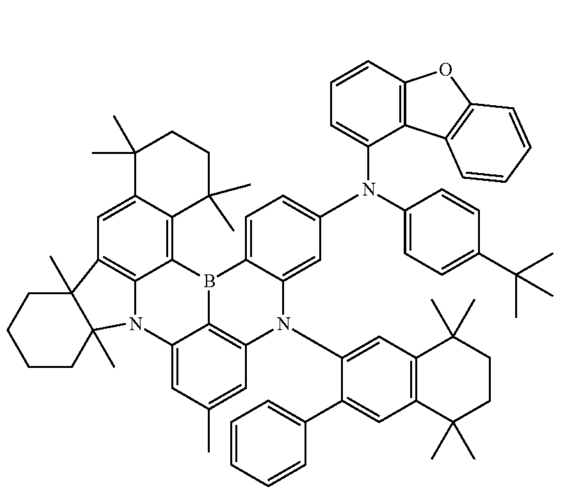
-continued
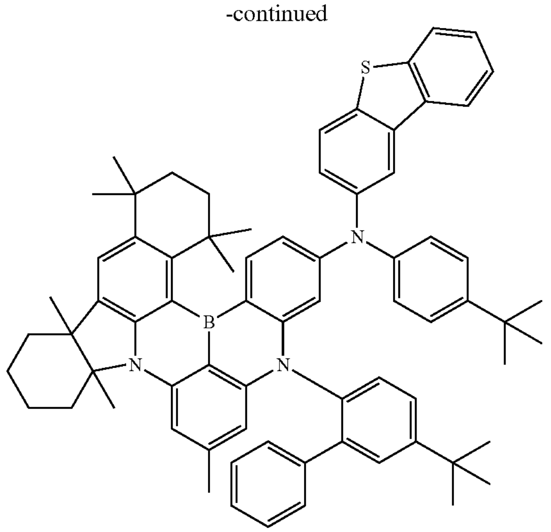
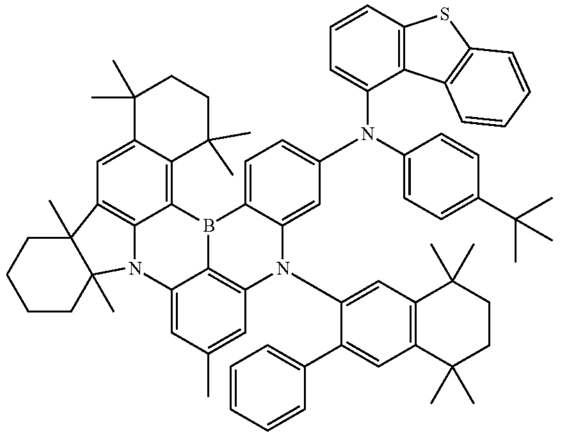
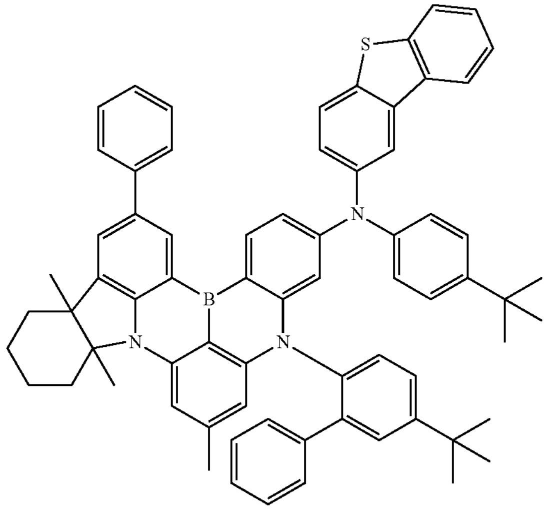

-continued
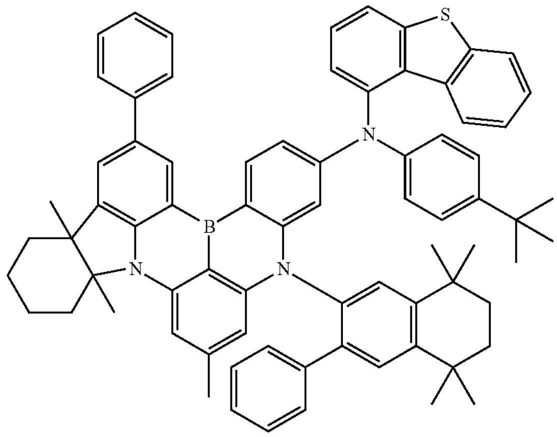
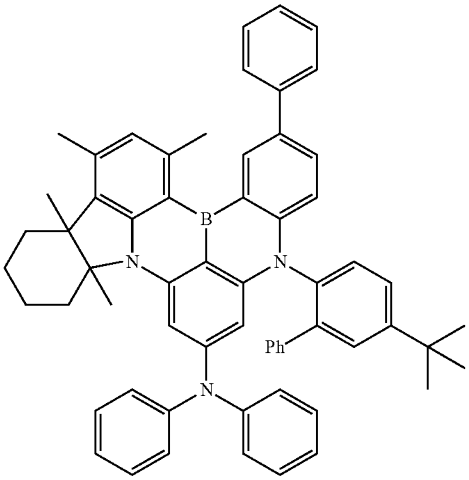
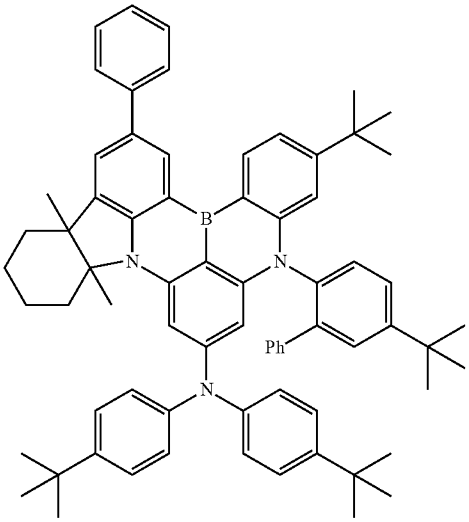
-continued
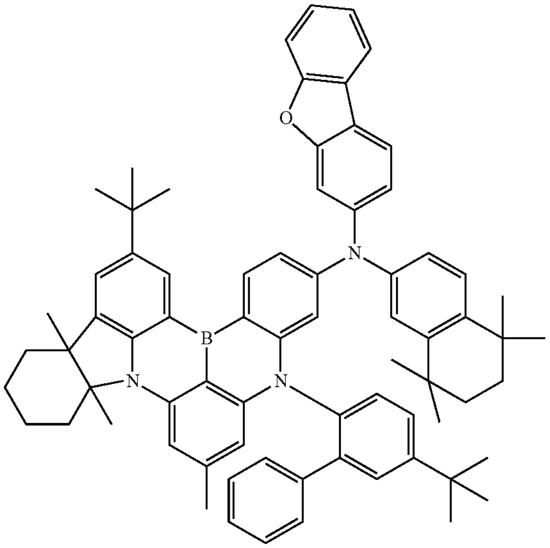
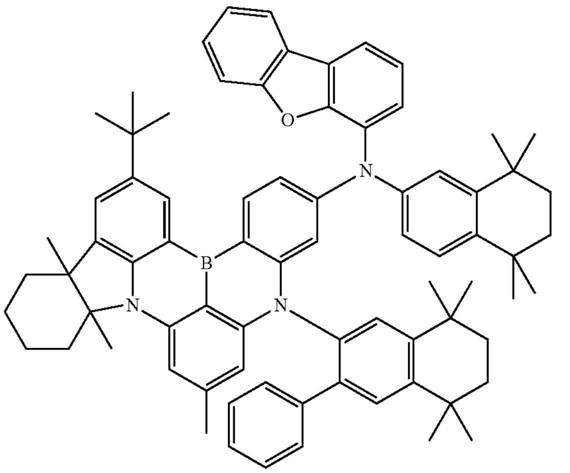
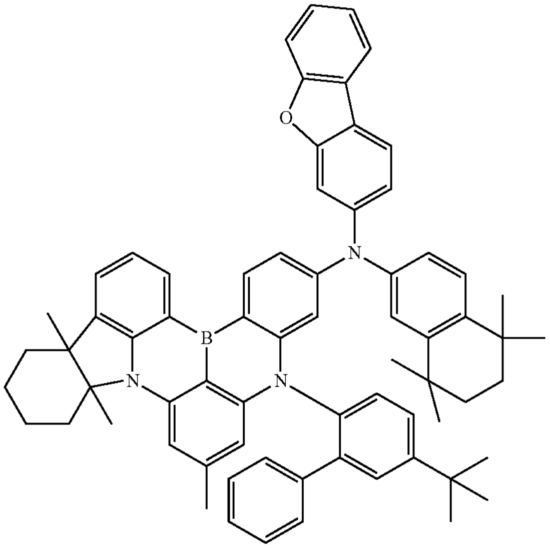

-continued
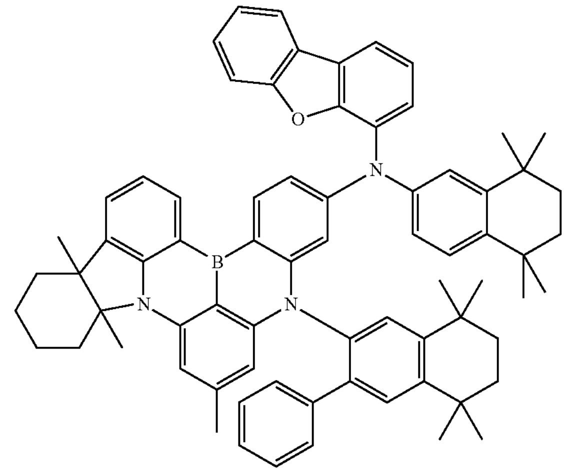
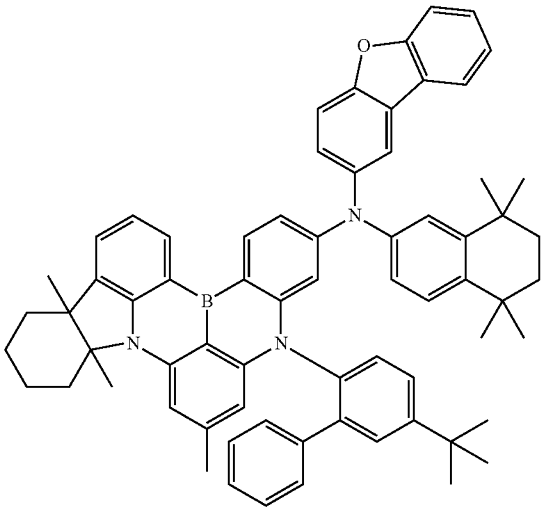
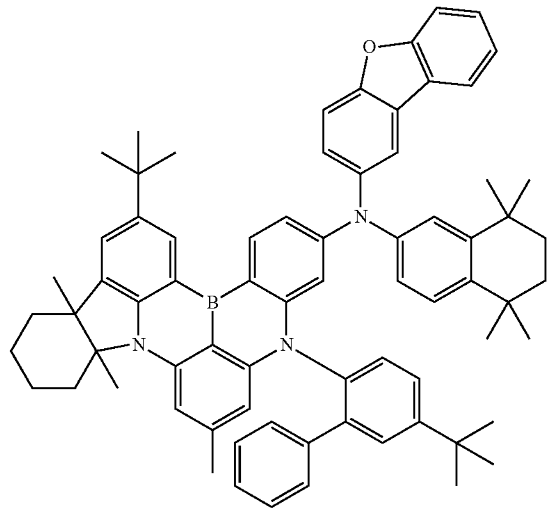
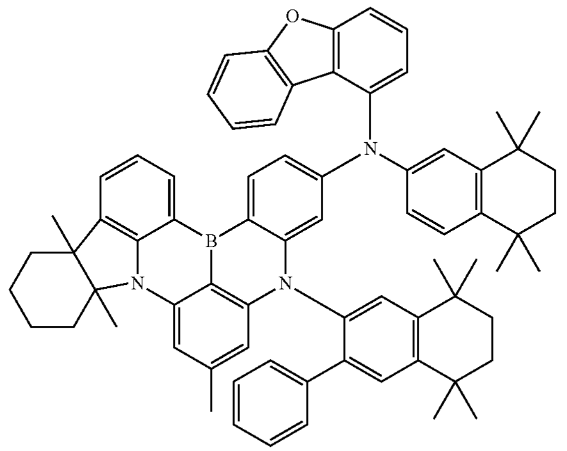 [SMILES: Cc1cc2c3c(c1)N1c4c(cccc4C4(C)CCCCC14C)B3c1ccc(N(c3ccc4c(c3)C(C)(C)CCC4(C)C)c3cccc4sc5ccccc5c34)cc1N2c1cc2c(cc1-c1ccccc1)C(C)(C)CCC2(C)C]
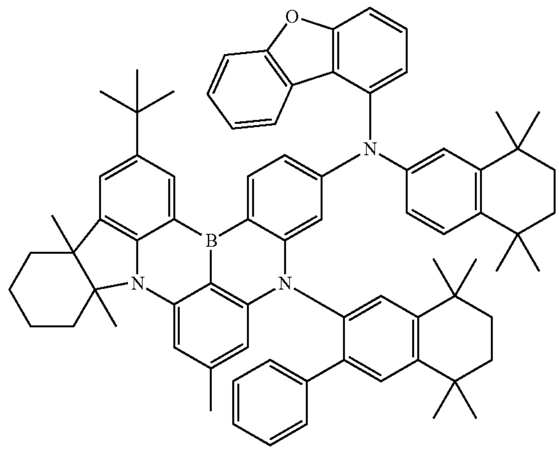
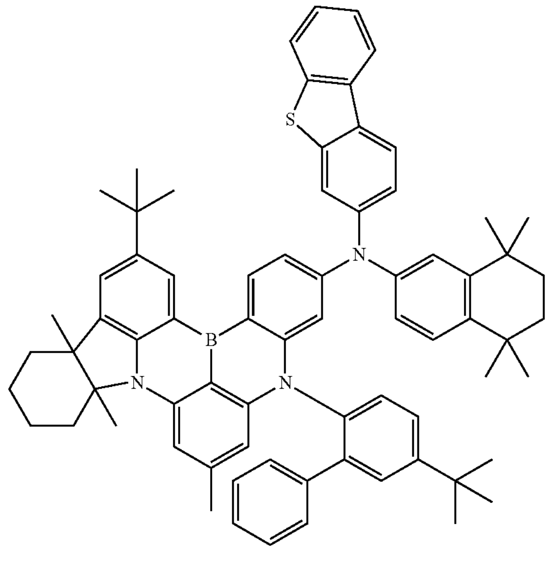
-continued

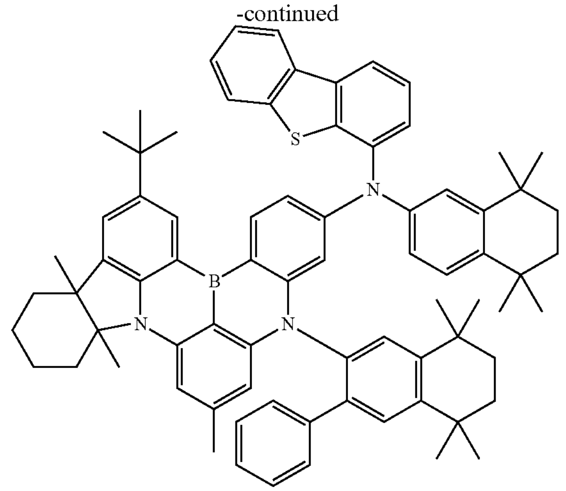
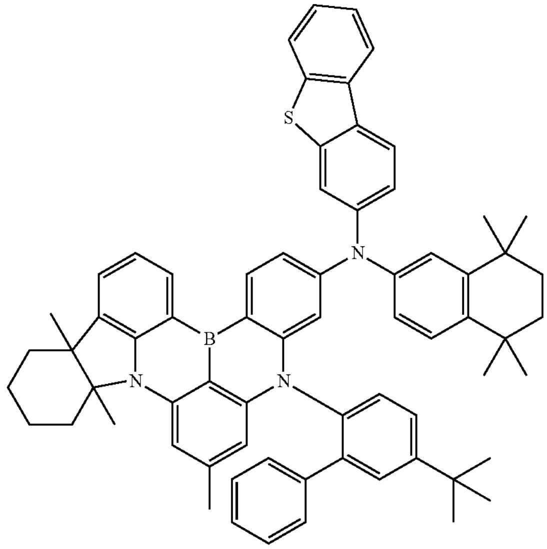
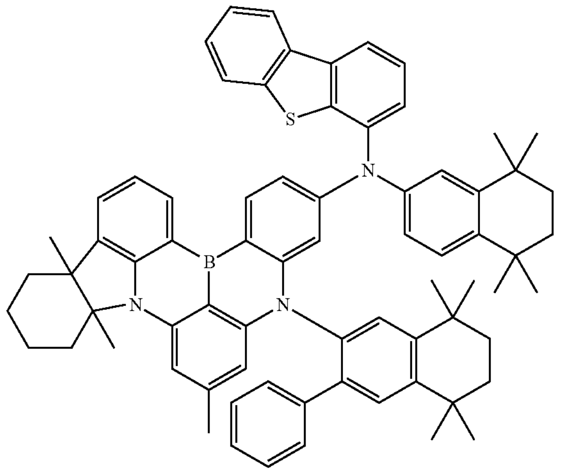
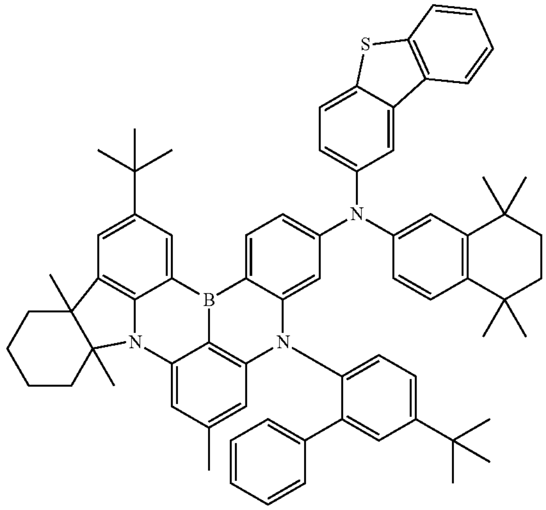
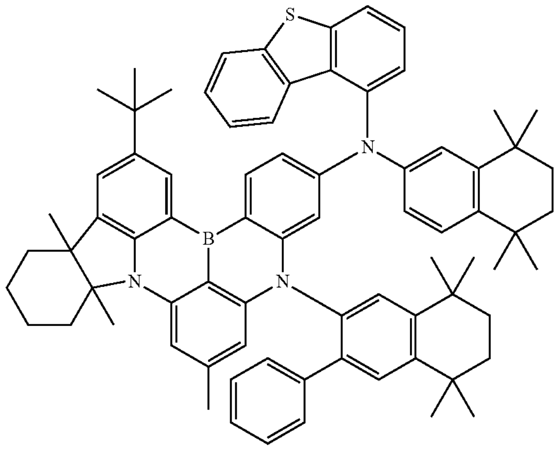
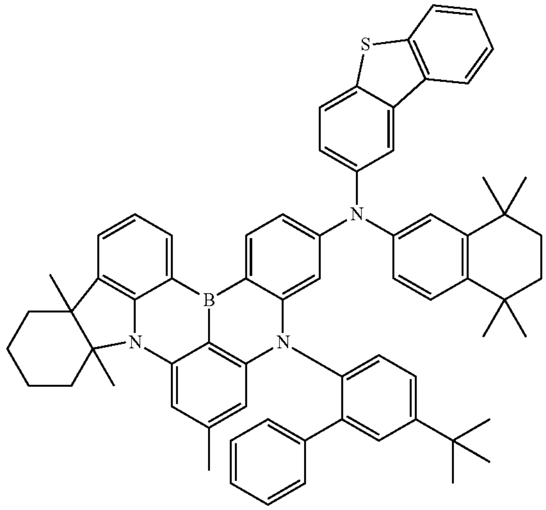

-continued
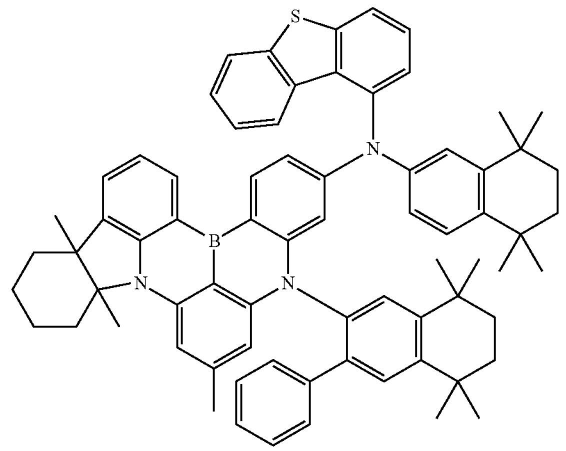
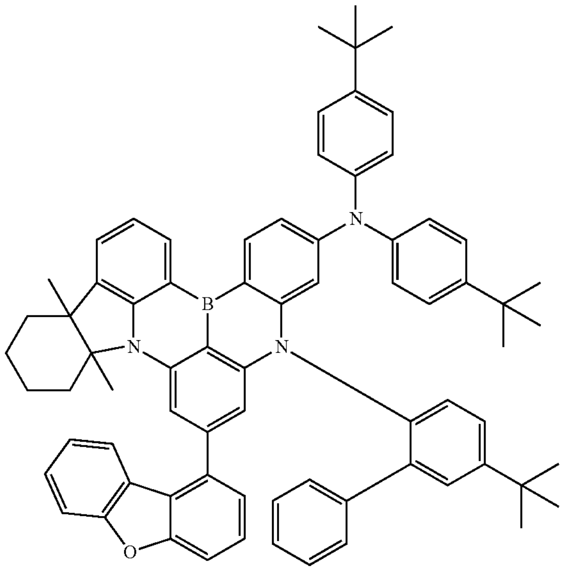
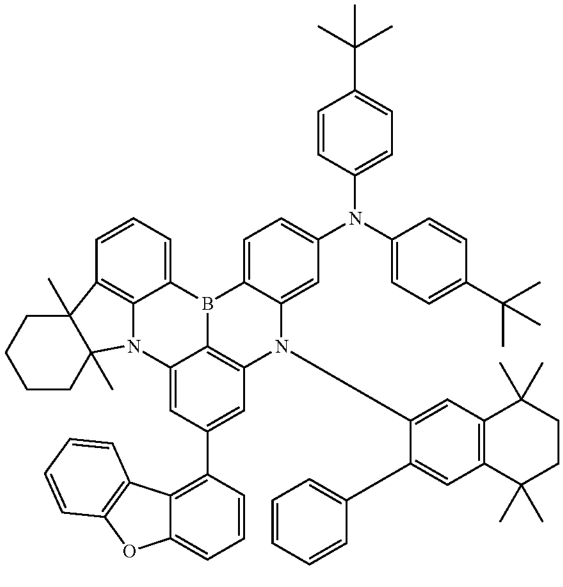
-continued
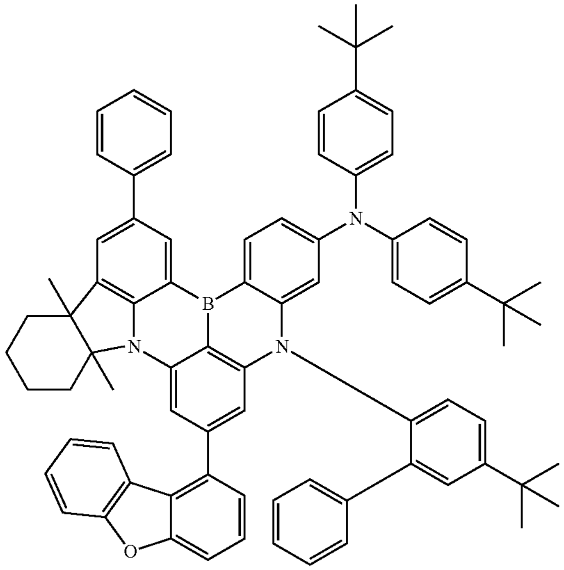
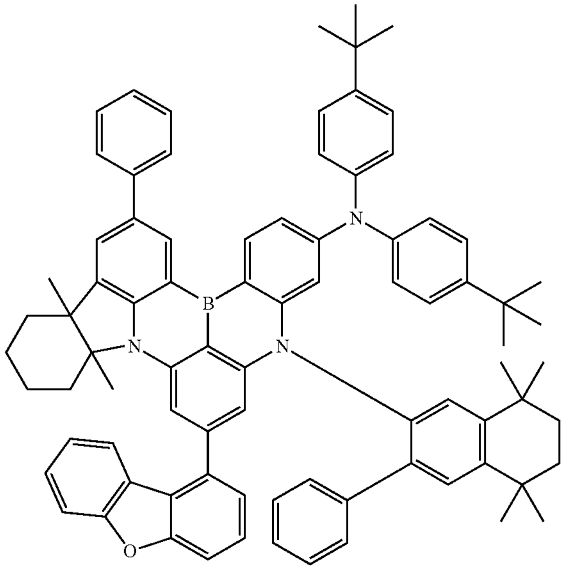
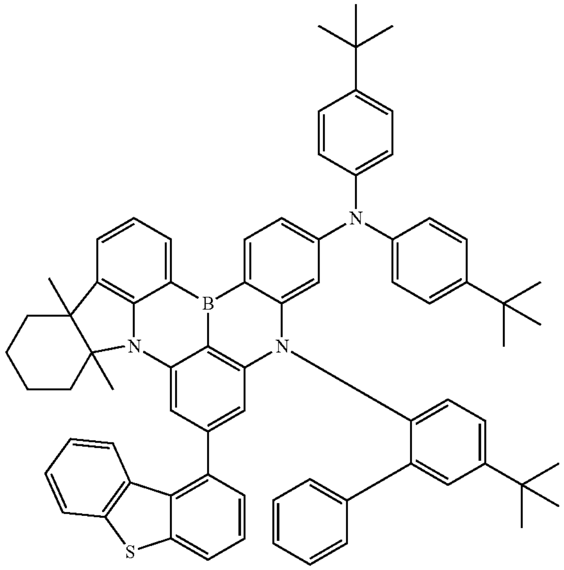

-continued
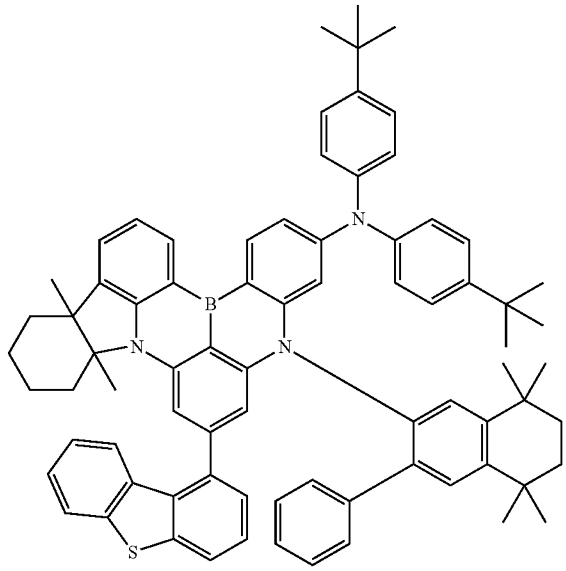
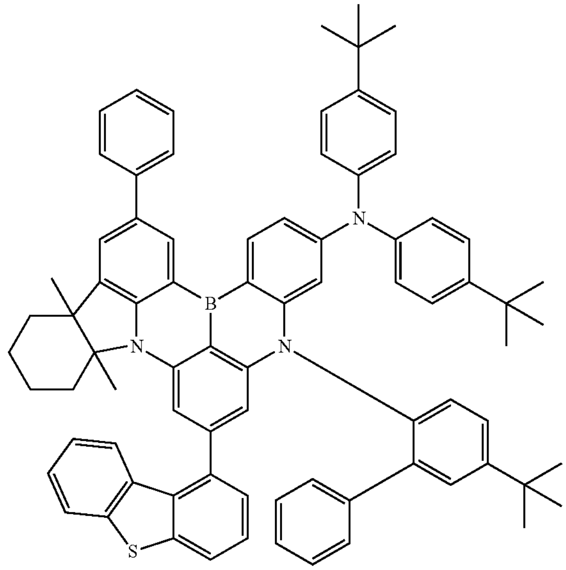
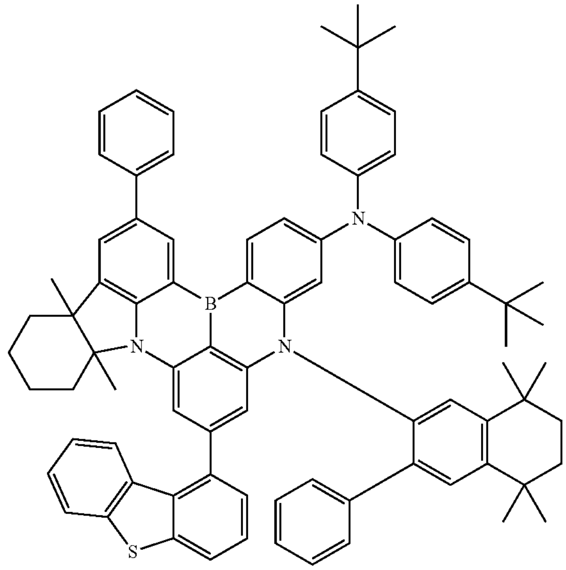
-continued
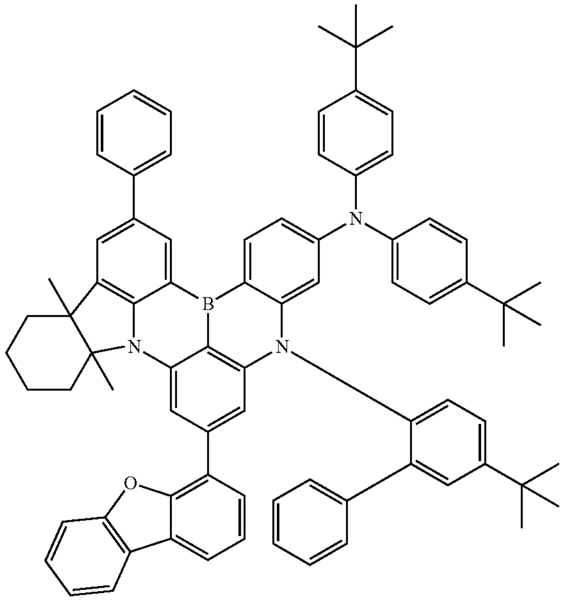
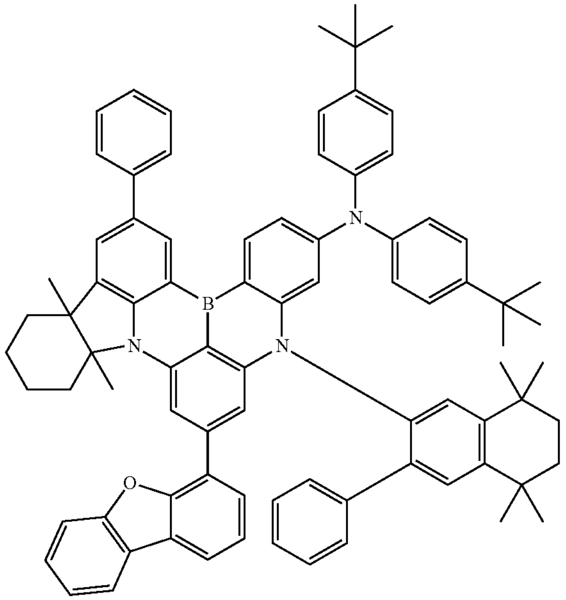

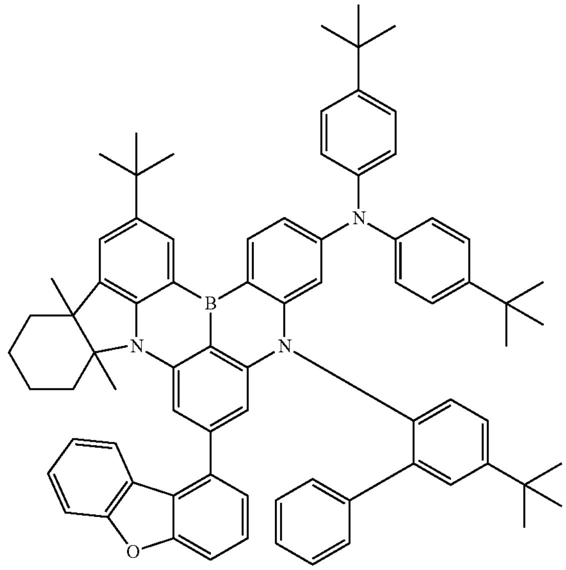
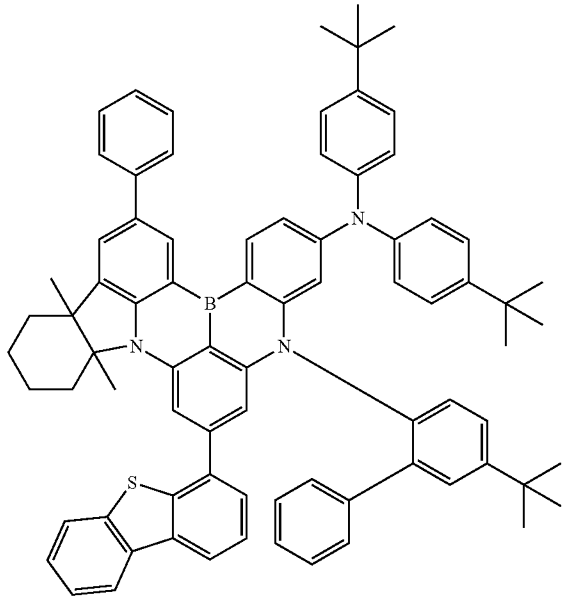
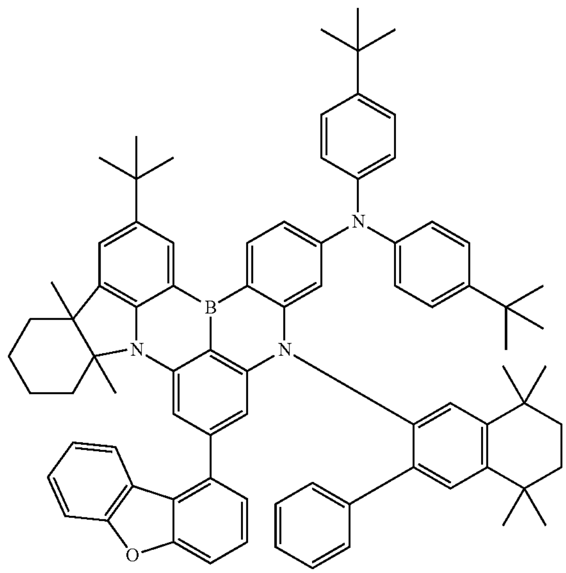
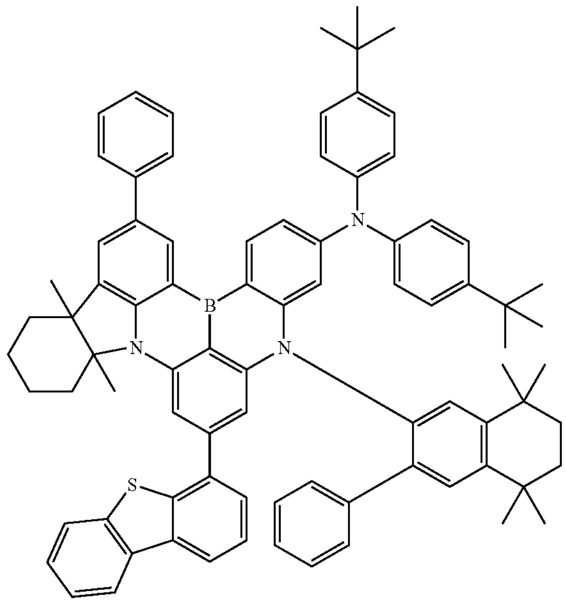

-continued
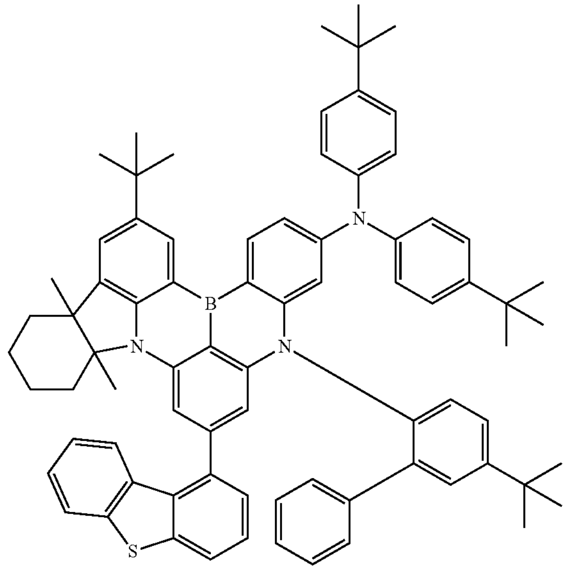
-continued
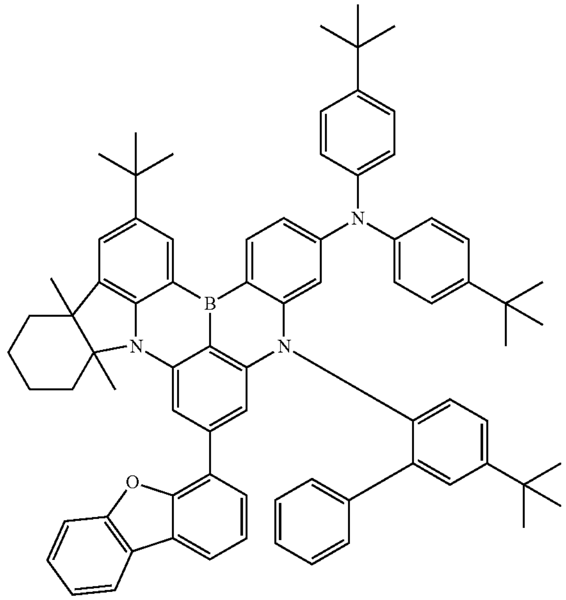
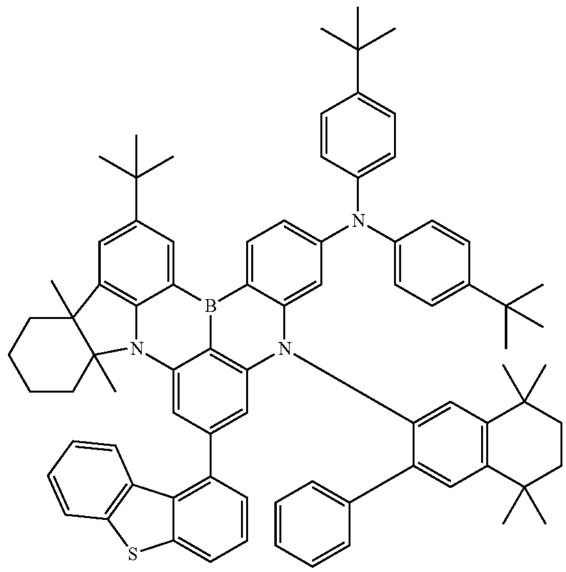
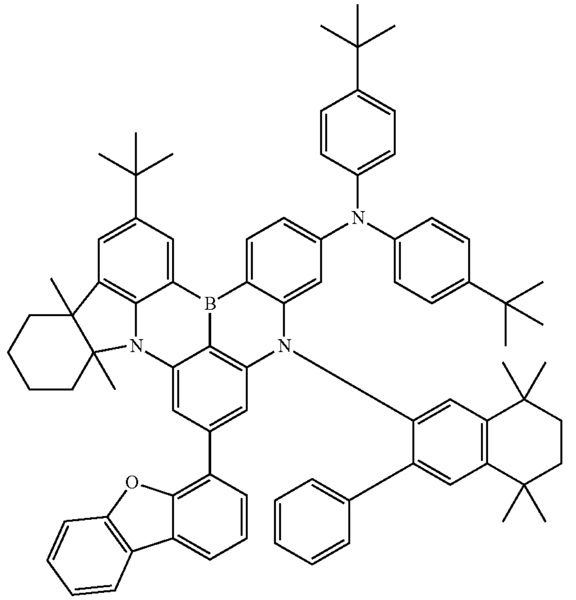

-continued
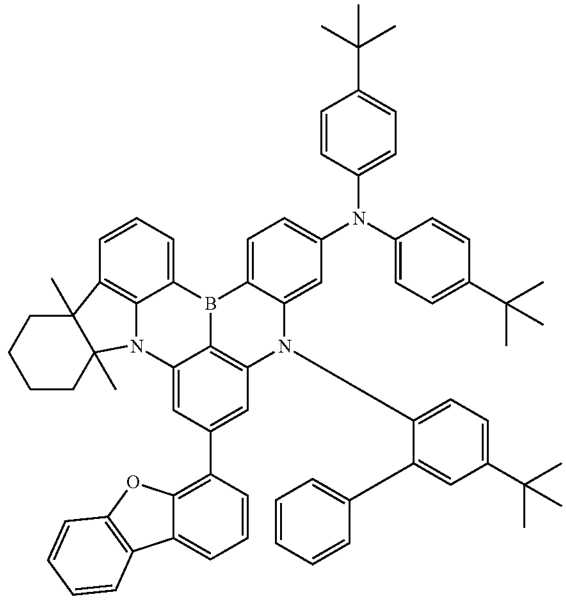
-continued
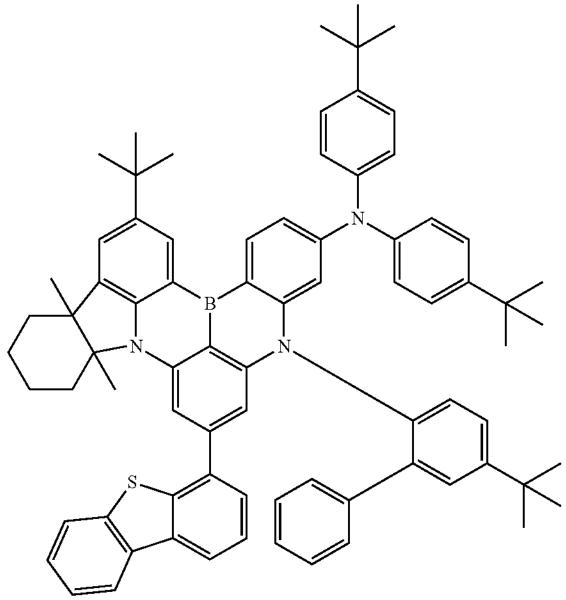
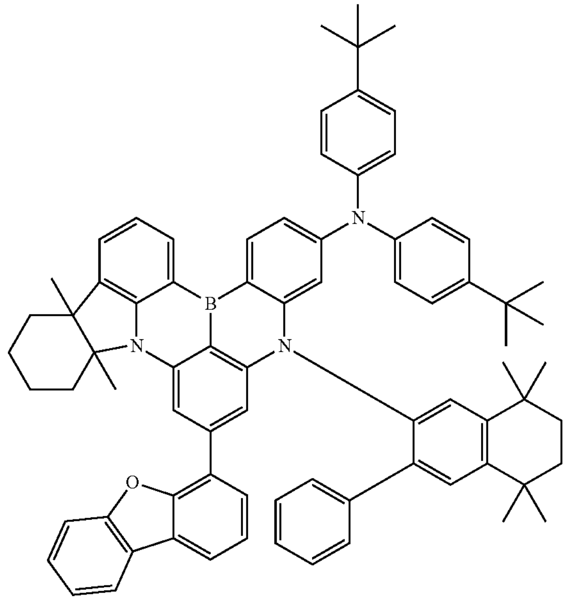
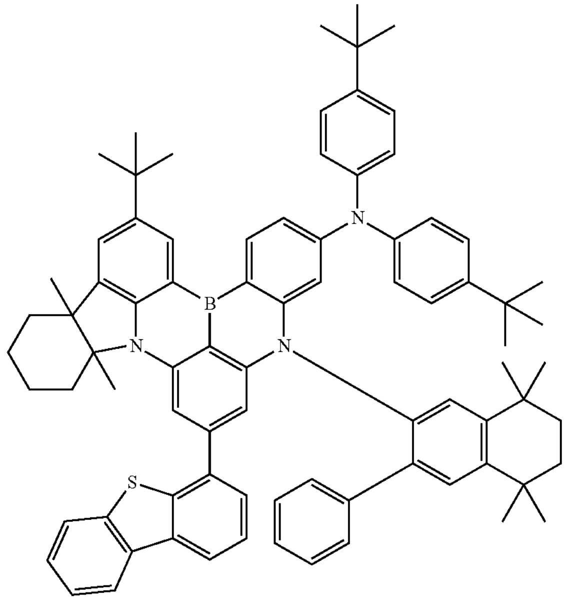

-continued
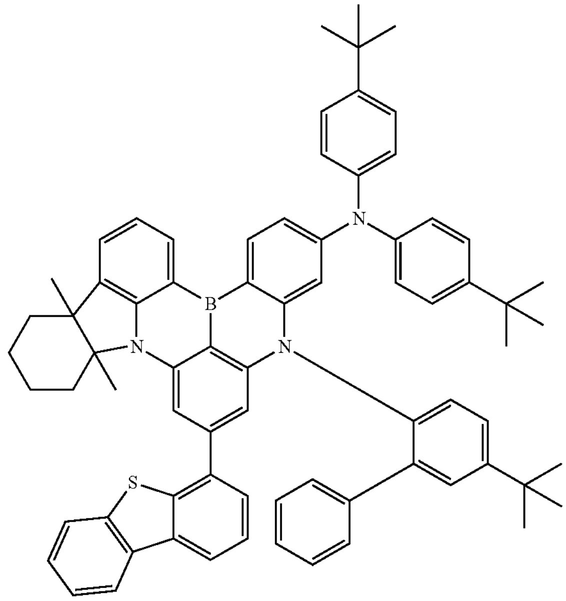
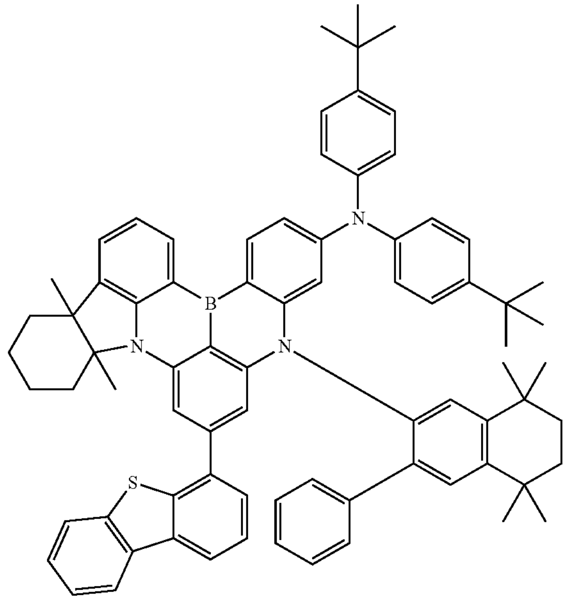
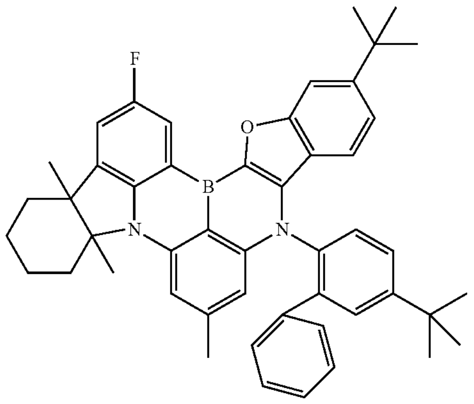
-continued
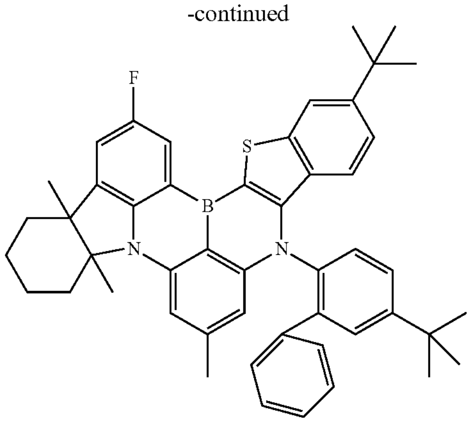
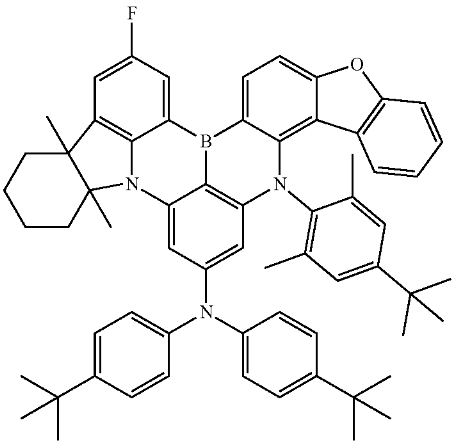
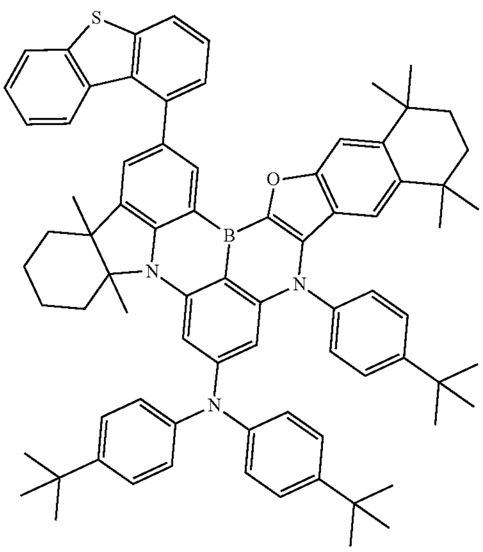

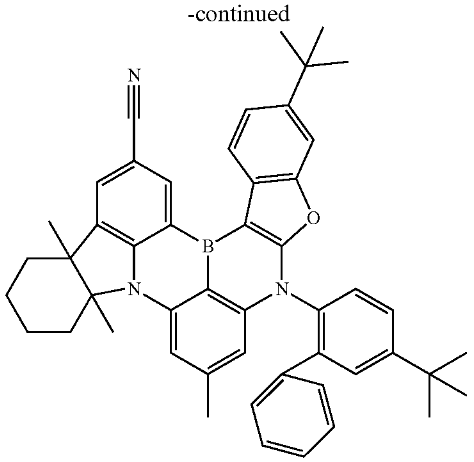
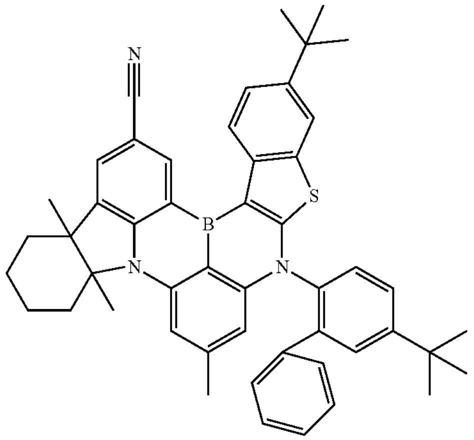
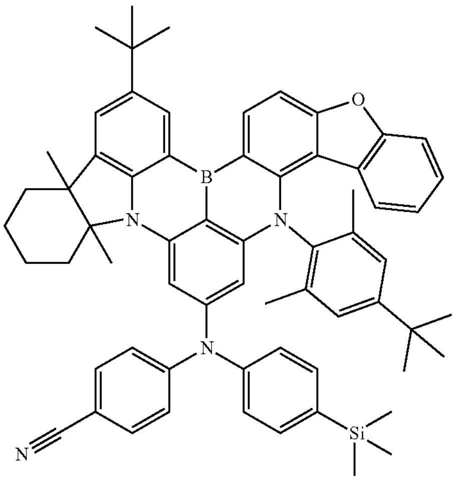
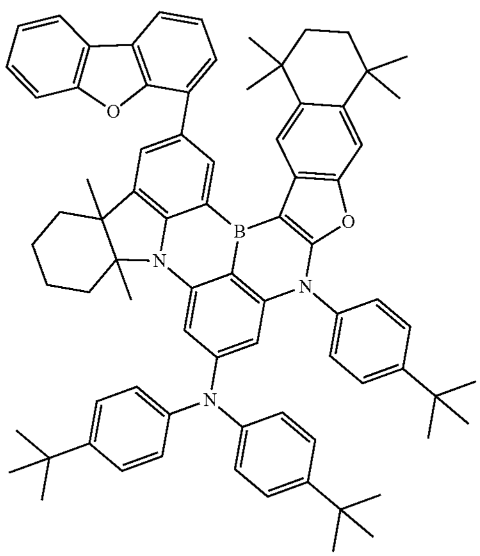
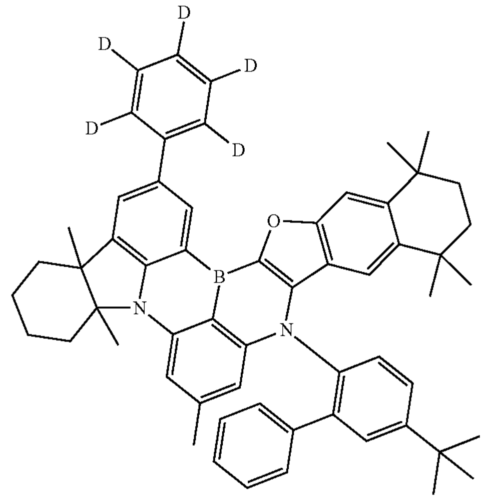
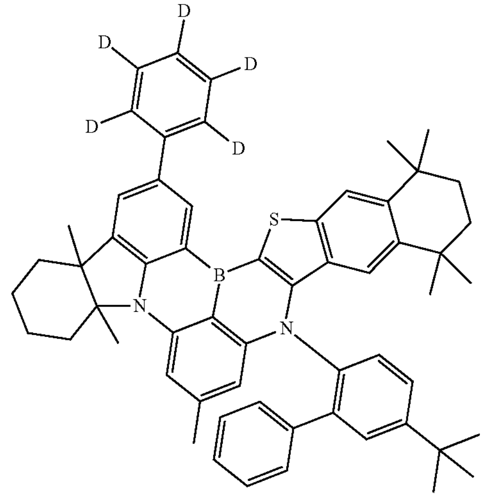

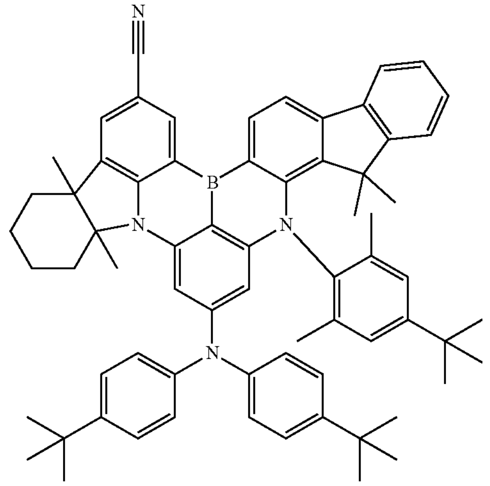
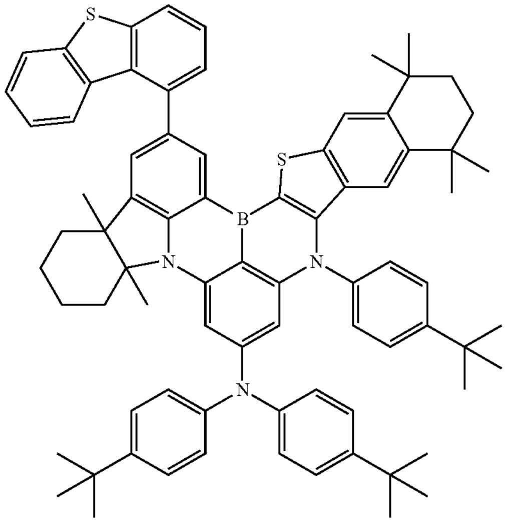
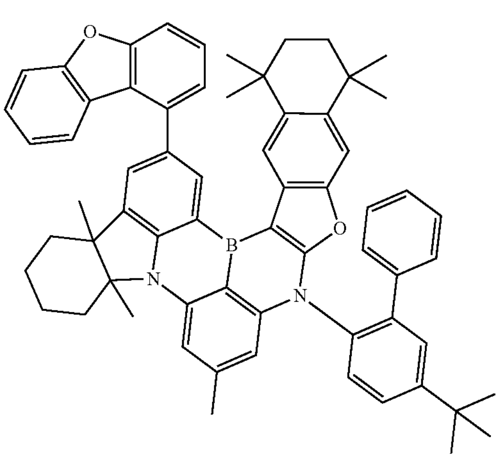
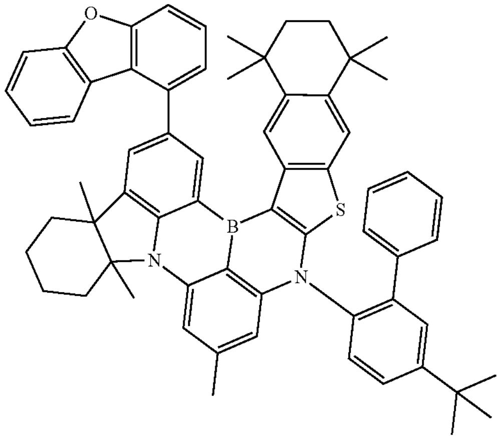
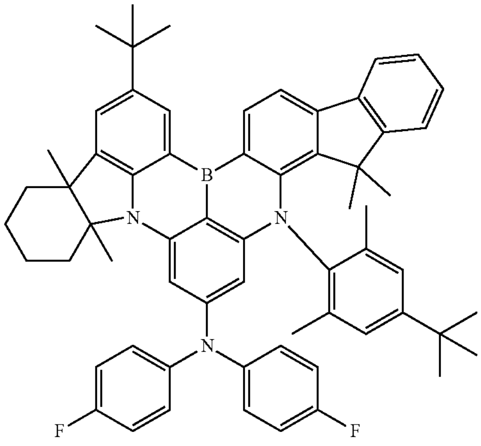
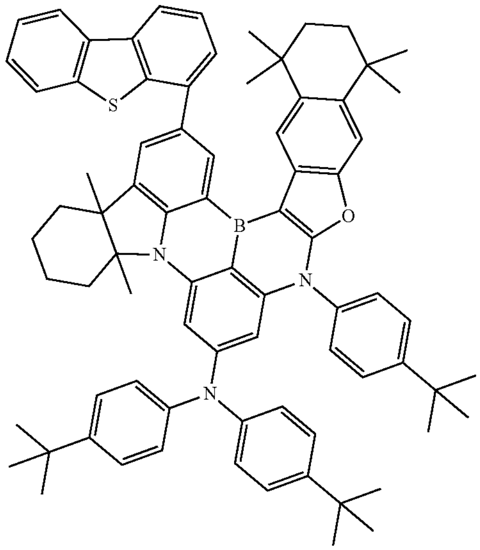

-continued
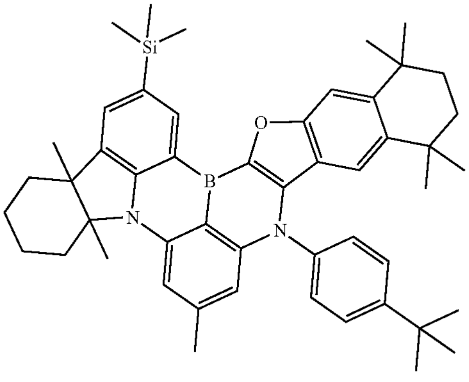
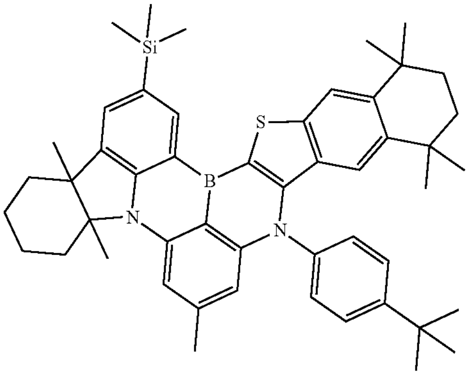
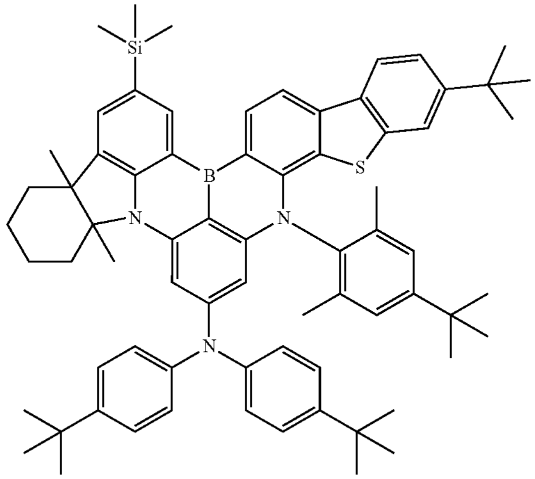
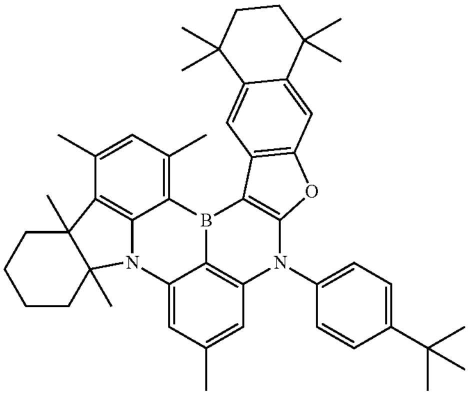
-continued
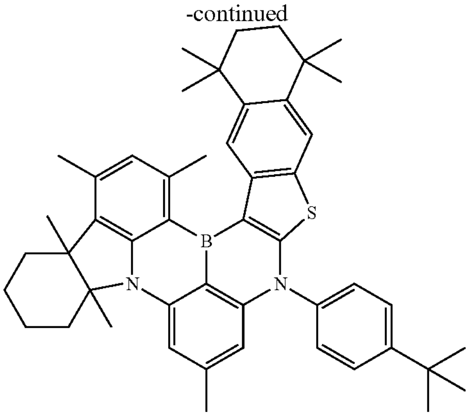
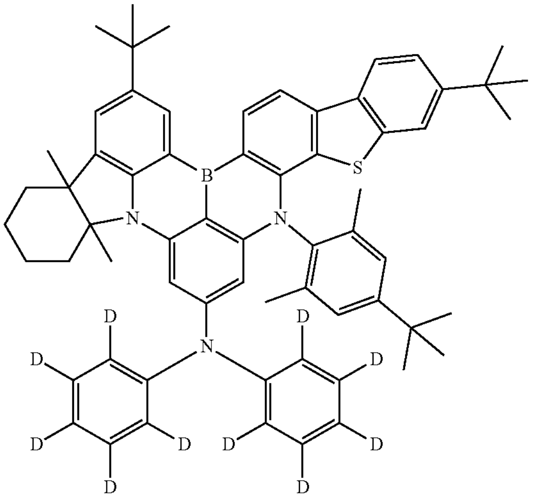
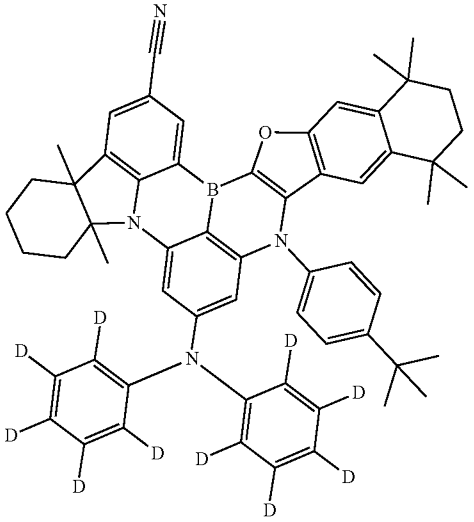

-continued
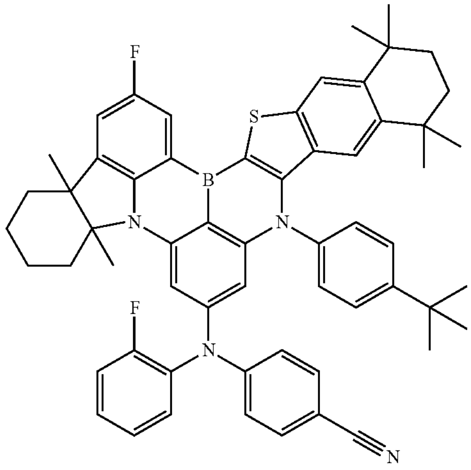
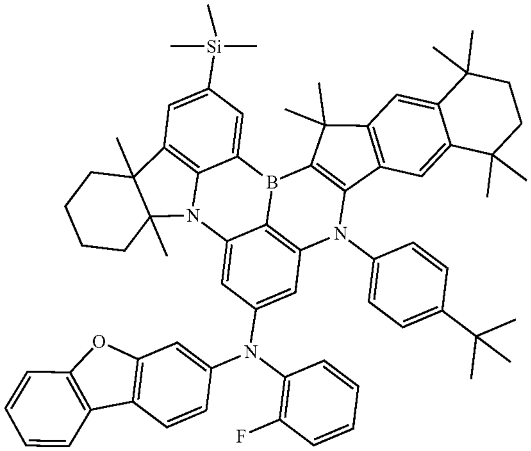
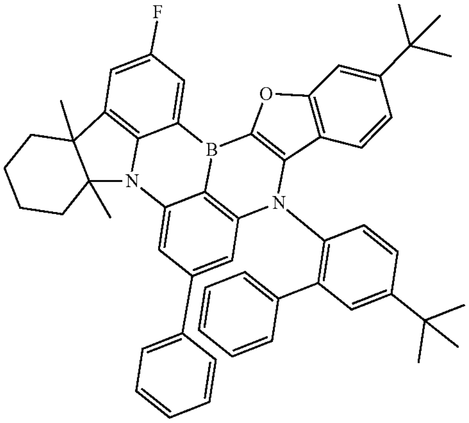
-continued
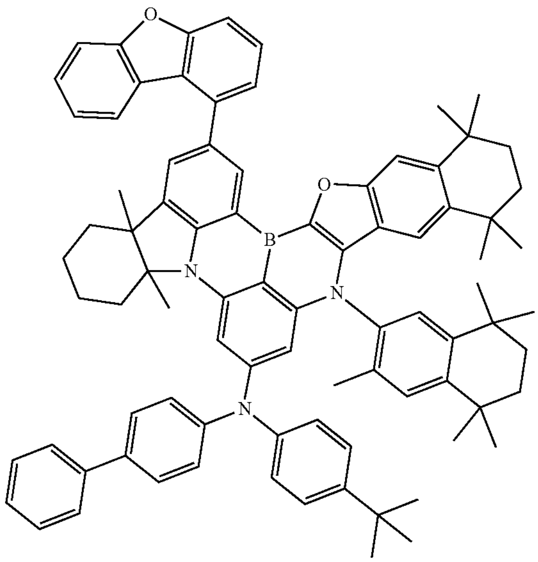
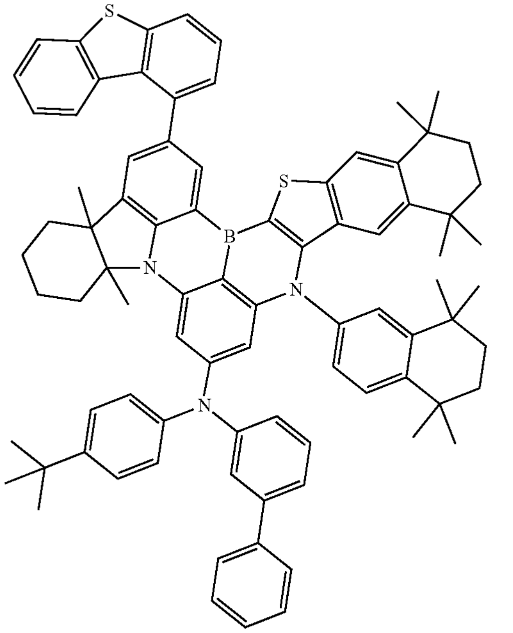

-continued
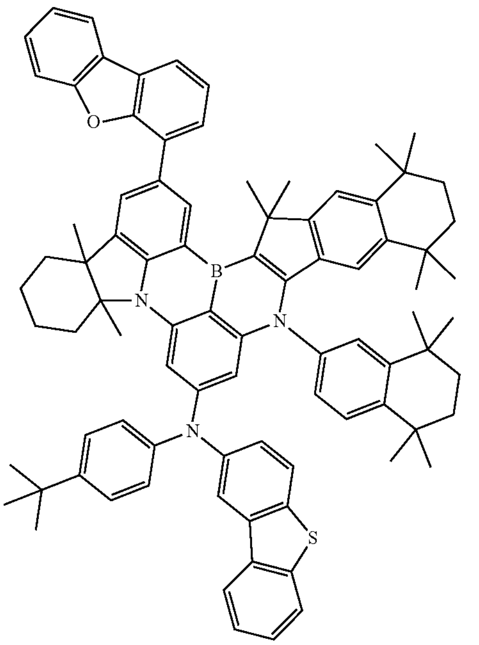
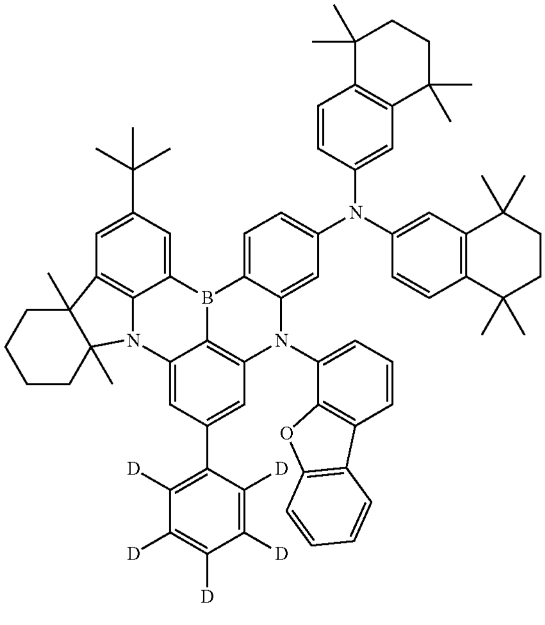
-continued
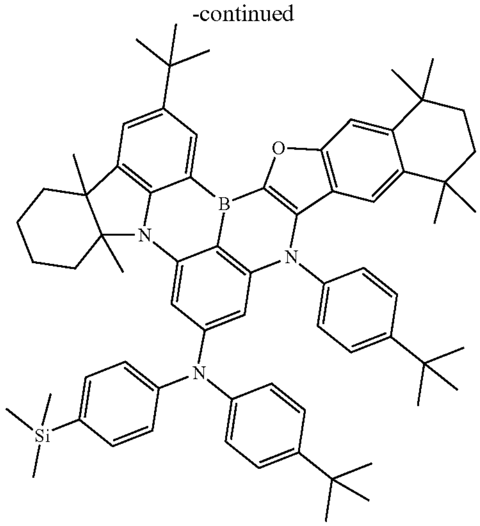
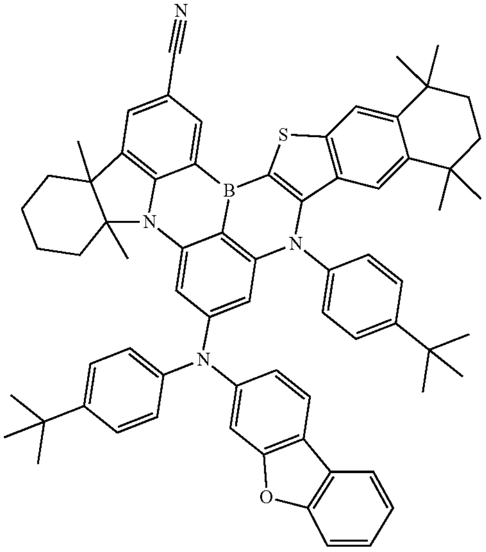
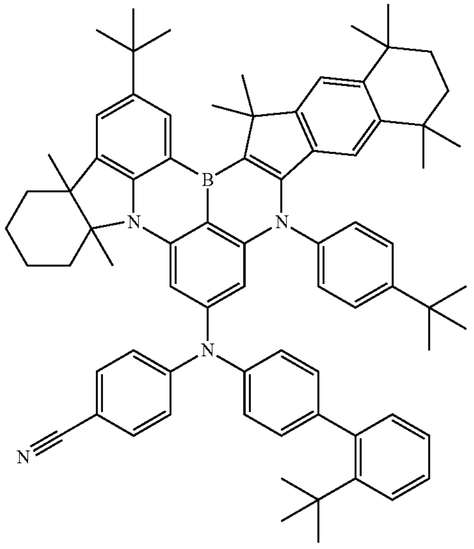

-continued
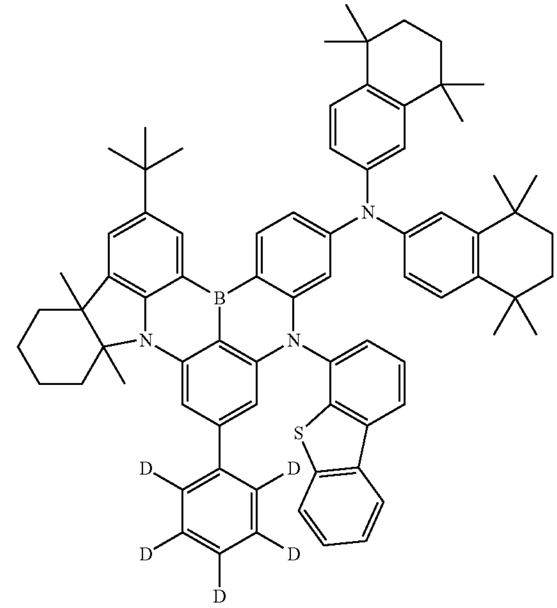
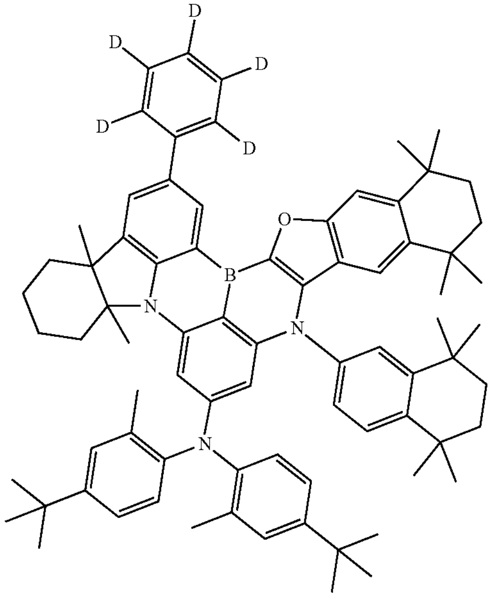
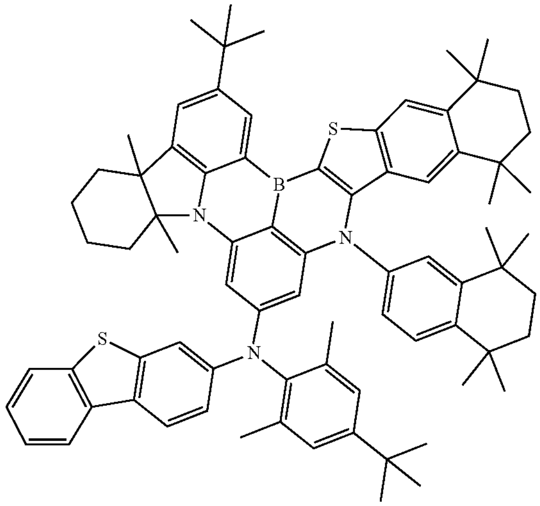
-continued
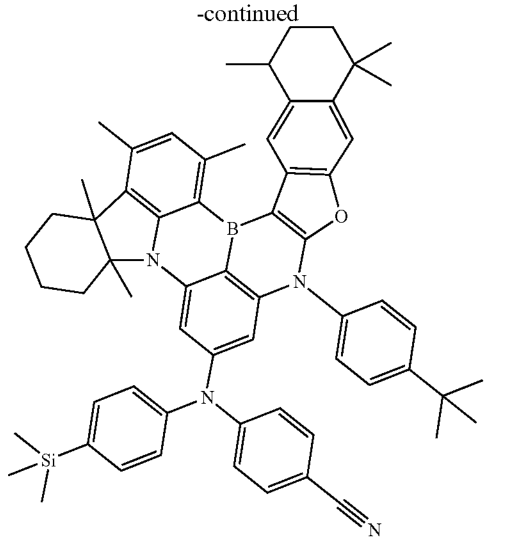
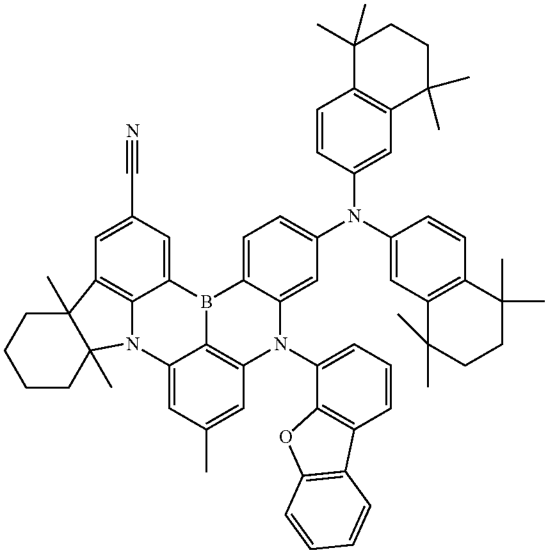
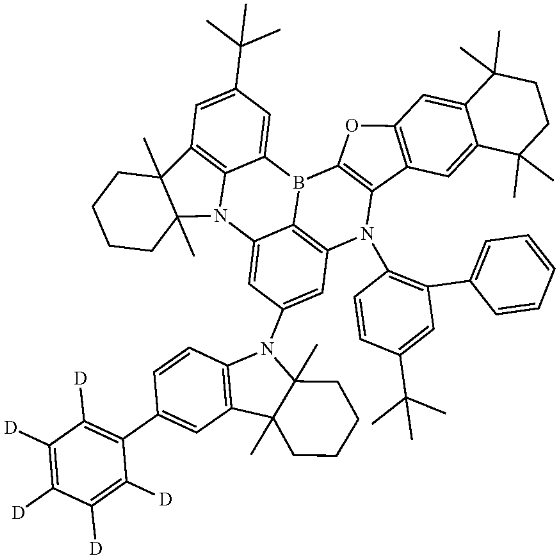

-continued
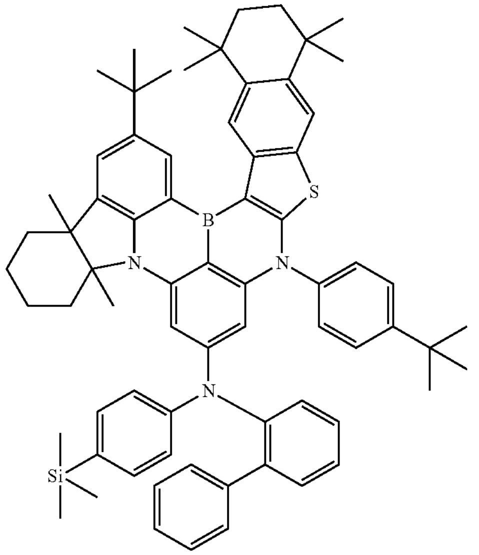
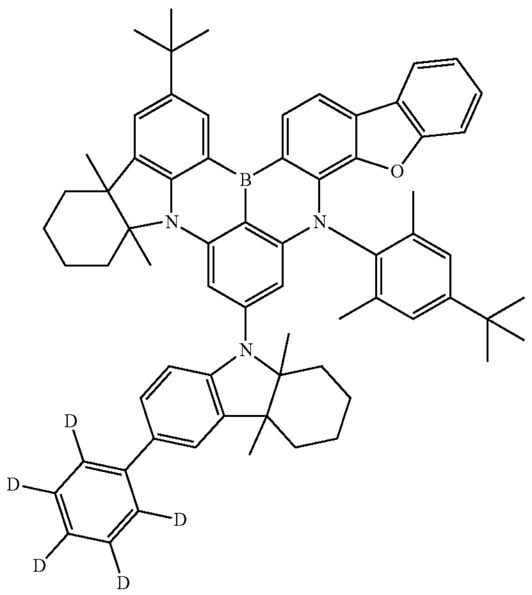
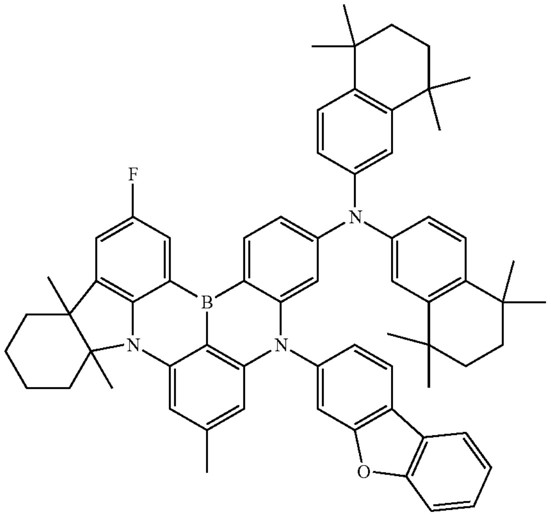
-continued
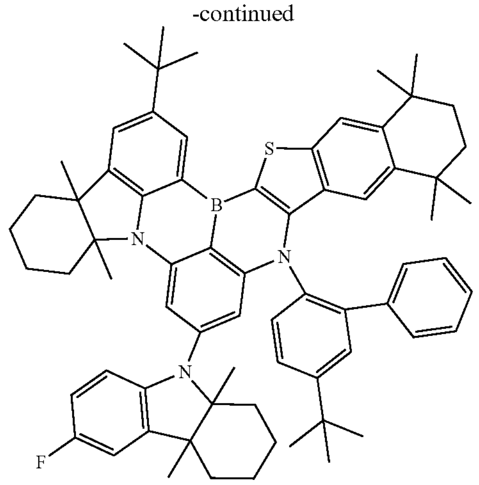
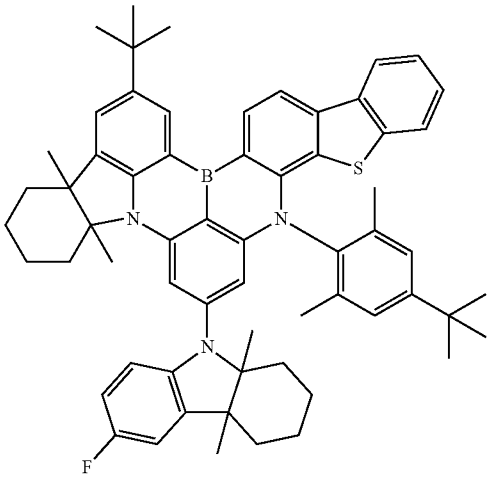
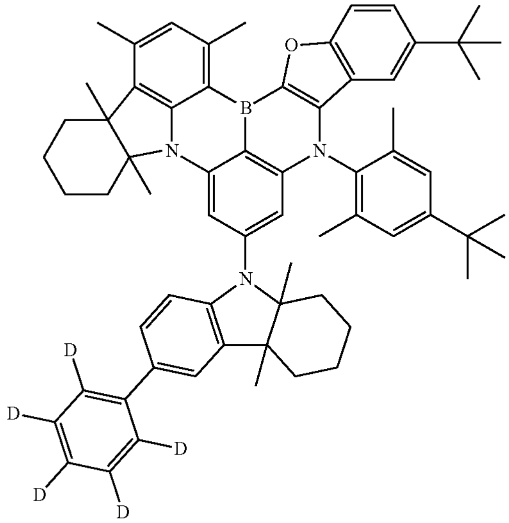

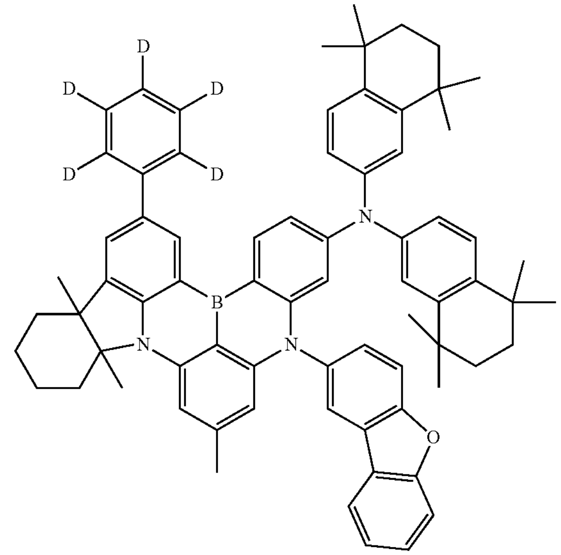
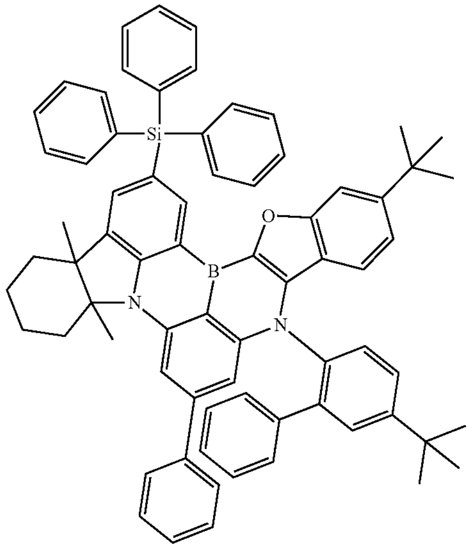
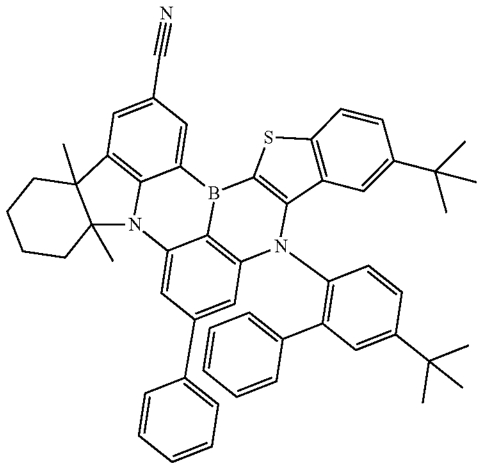
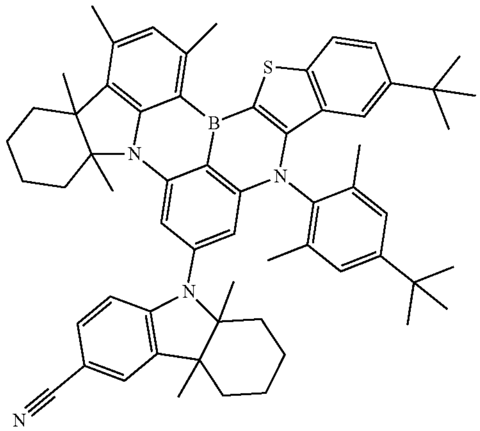
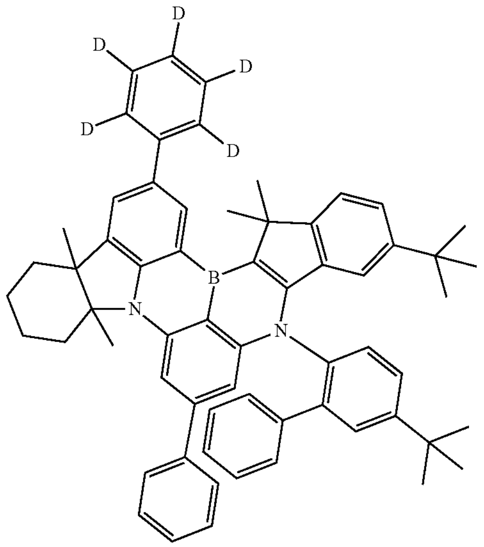
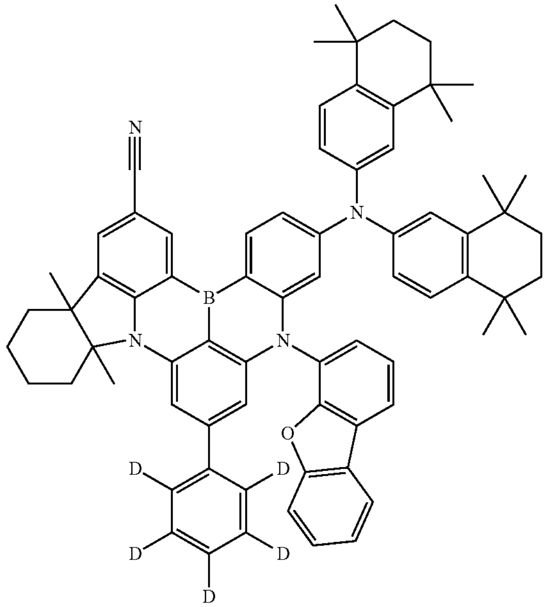

-continued
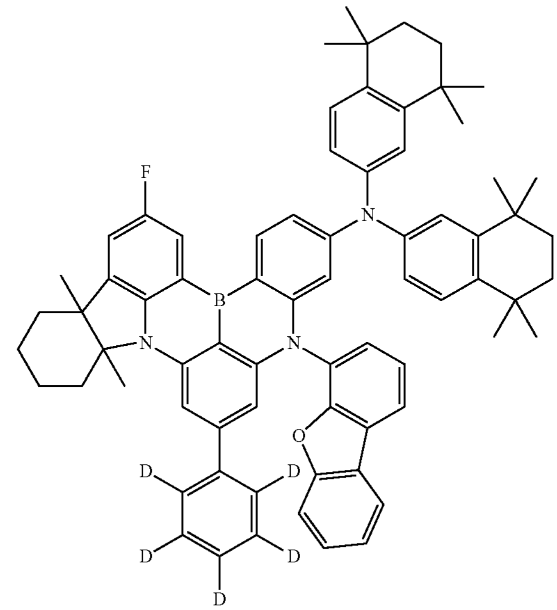
-continued
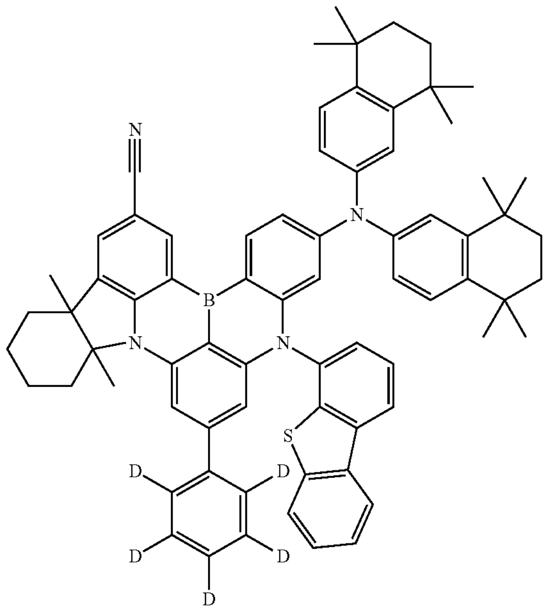
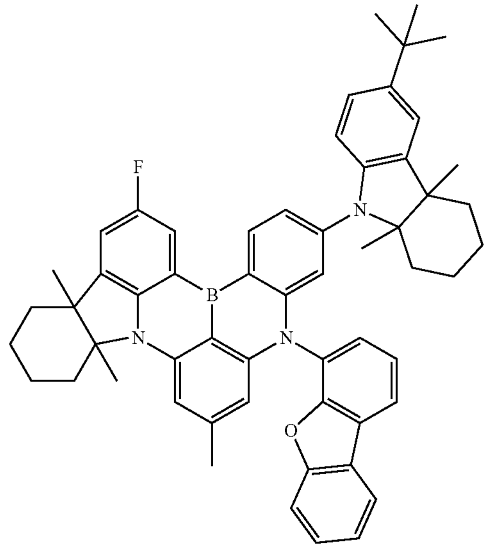
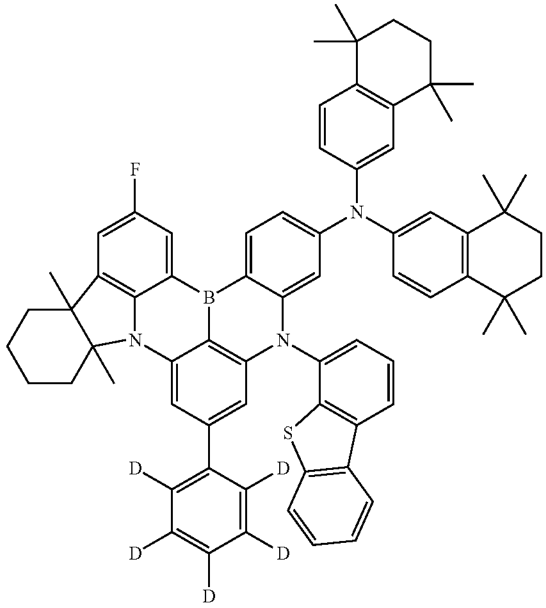
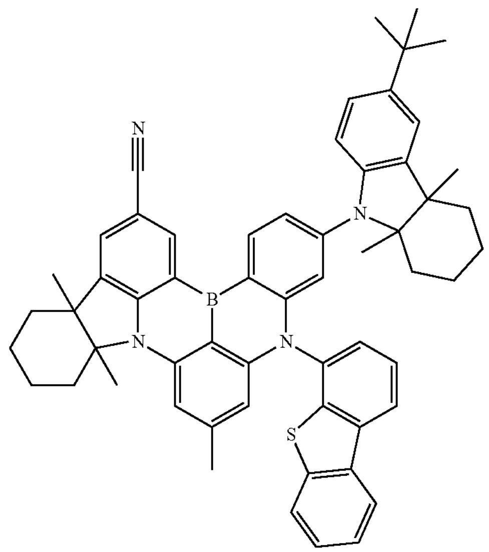
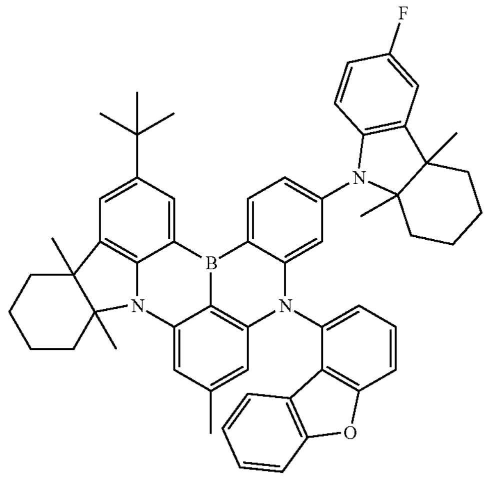

-continued
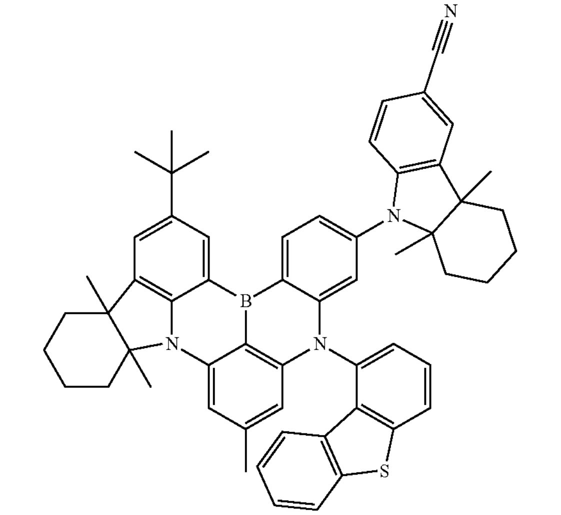
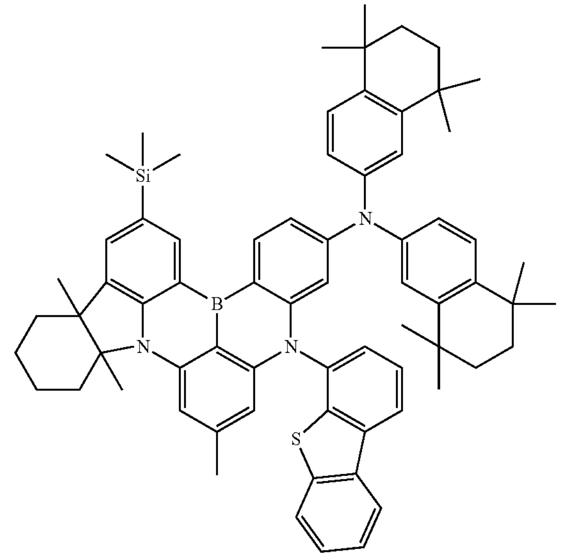
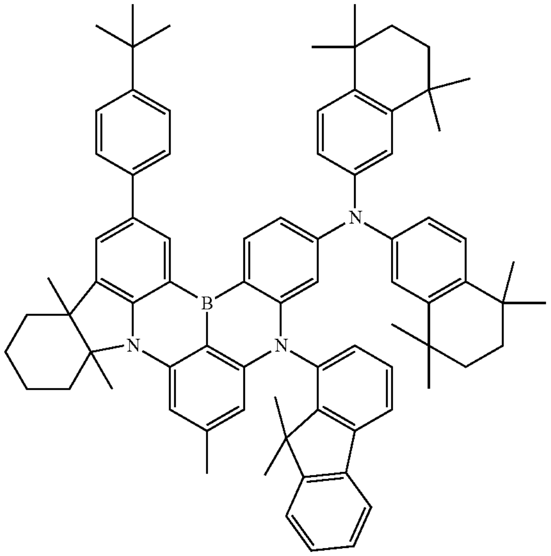
-continued
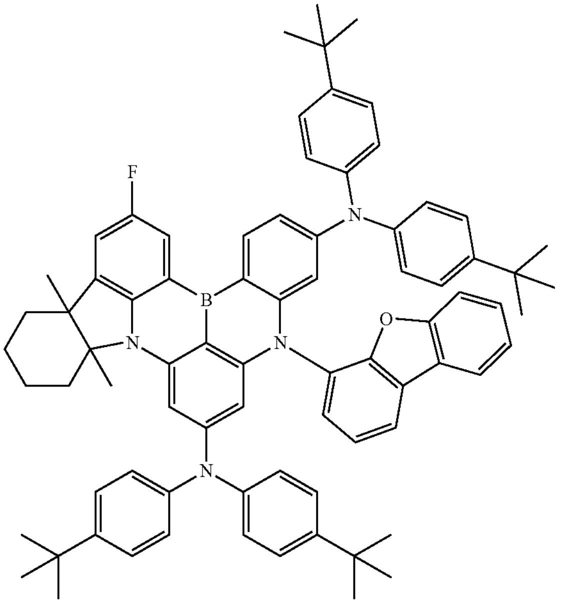
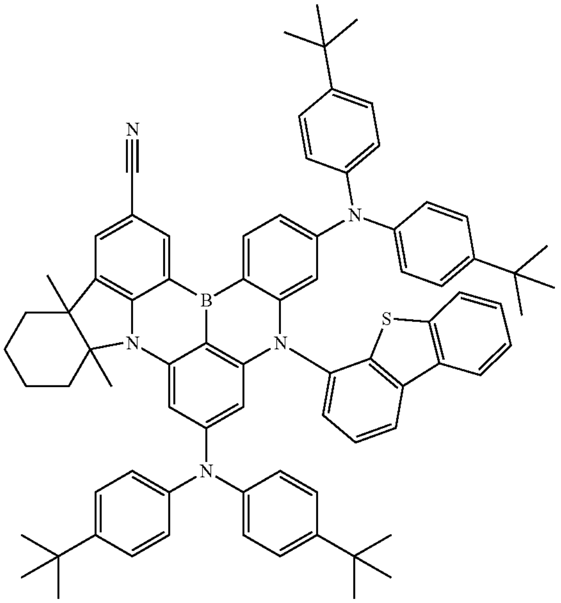
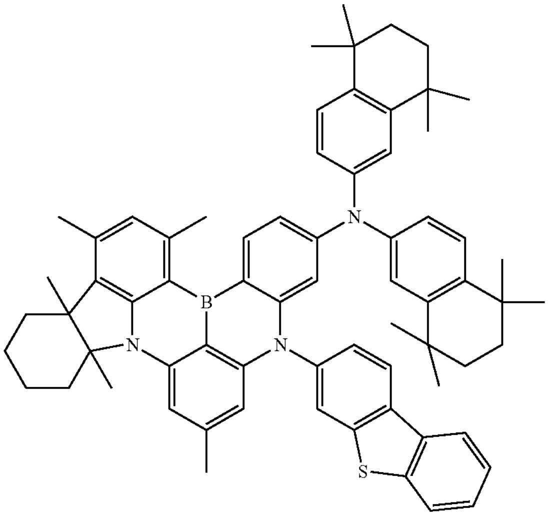

-continued

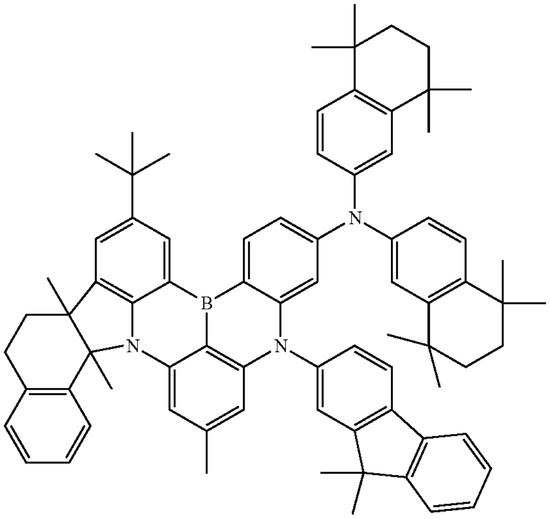

-continued

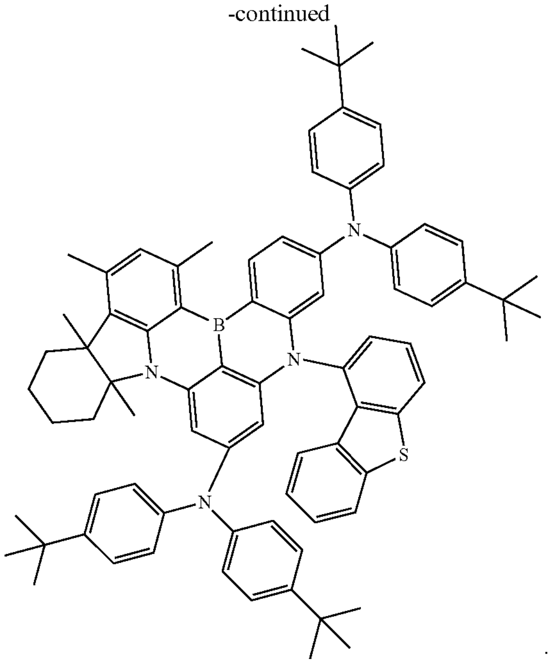

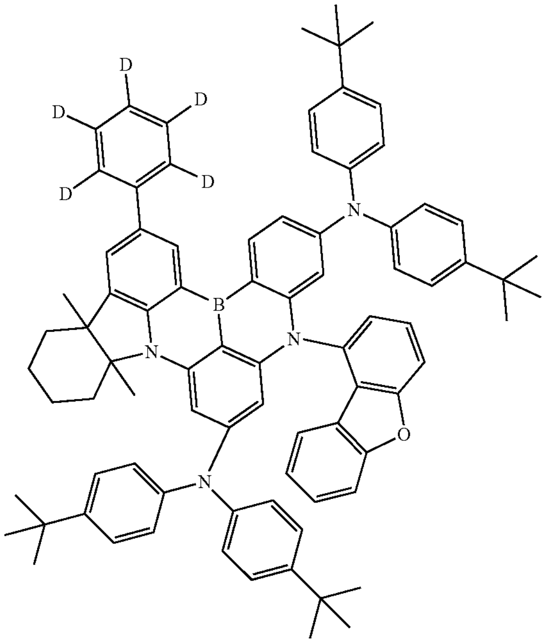

13. The organic light emitting device of claim 1, wherein the hole transport region comprises an electron blocking layer or a hole transport layer, and the electron blocking layer or the hole transport layer comprises the compound of Chemical Formula 1.

14. The organic light emitting device of claim 1, wherein the organic material layer comprising the compound of Chemical Formula 1 is a layer which is in contact with the light emitting layer.

15. The organic light emitting device of claim 1, wherein the host comprises a compound of the following Chemical Formula HO:

[Chemical Formula HO]

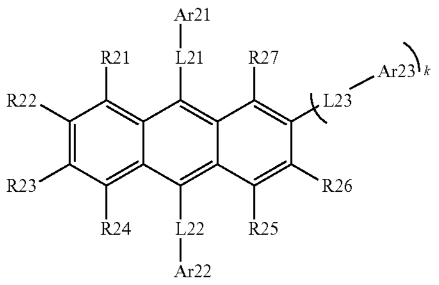

wherein in Chemical Formula HO:

L21 to L23 are the same as or different from each other, and are each independently a direct bond, a substituted or unsubstituted arylene group, or a substituted or unsubstituted heteroarylene group;

R21 to R27 are the same as or different from each other, and are each independently hydrogen, deuterium, a substituted or unsubstituted alkyl group, a substituted or unsubstituted cycloalkyl group, a substituted or unsubstituted silyl group, a substituted or unsubstituted aryl group, or a substituted or unsubstituted heteroaryl group;

Ar21 to Ar23 are the same as or different from each other, and are each independently a substituted or unsubstituted aryl group or a substituted or unsubstituted heteroaryl group; and
k is 0 or 1.
16. The organic light emitting device of claim 1, wherein the host comprises any one of the following compounds:
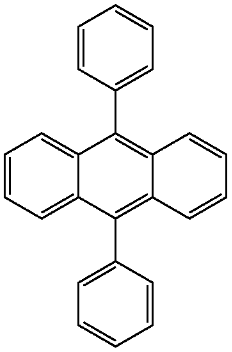
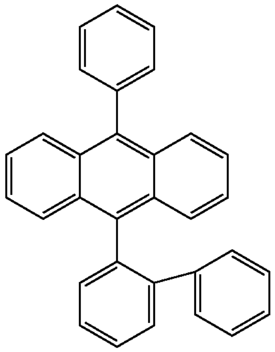
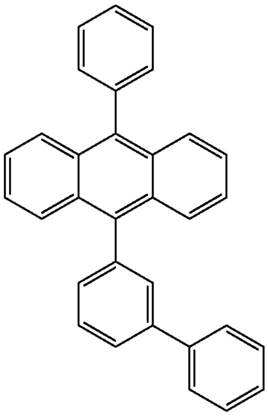
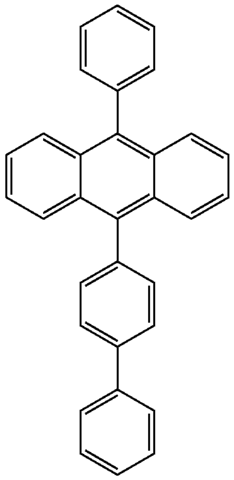
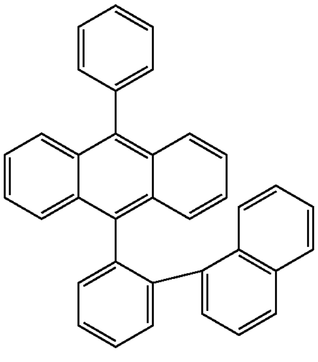
-continued
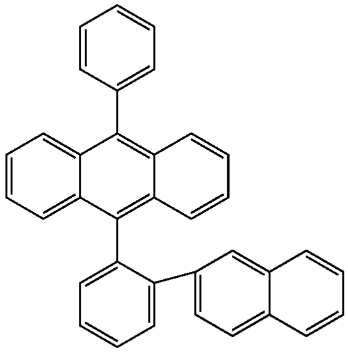
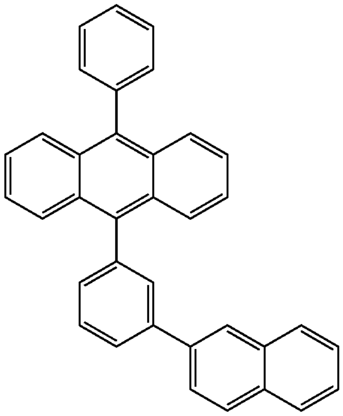
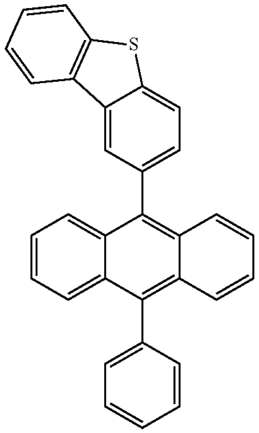
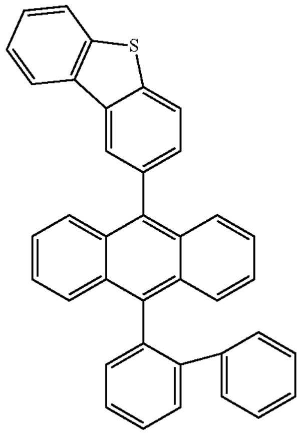

-continued
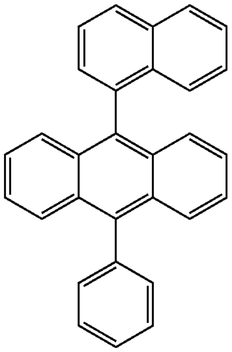
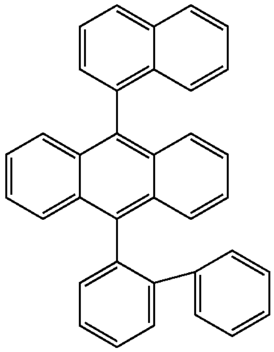
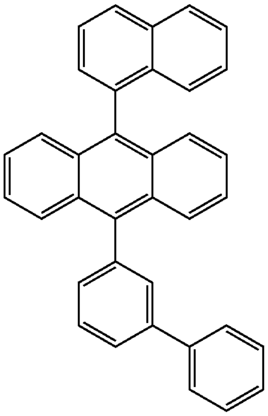
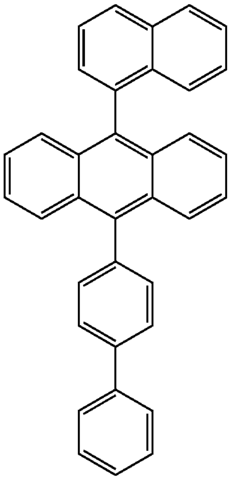
-continued
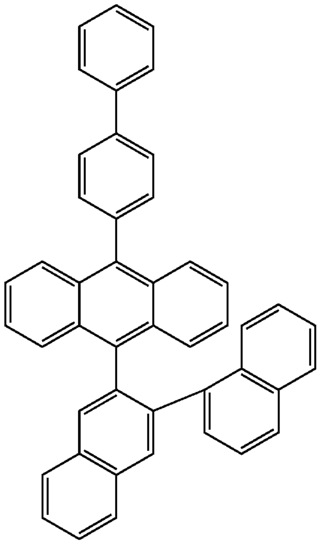
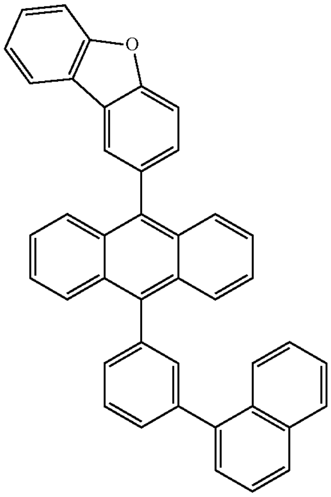
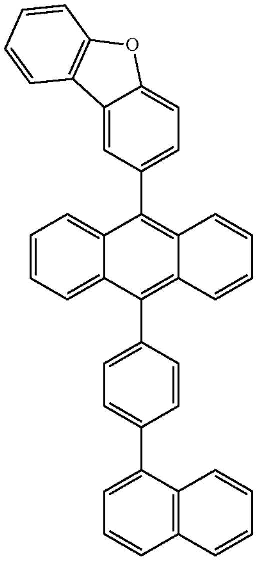

-continued
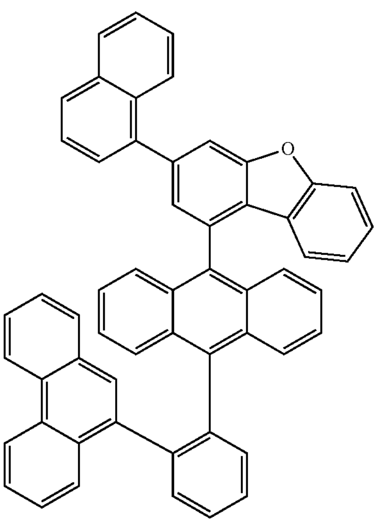
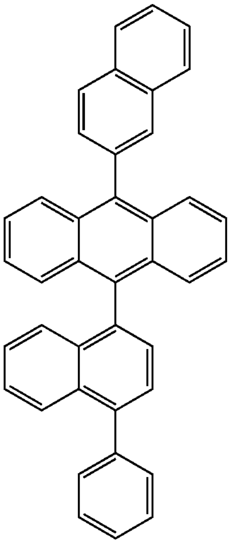
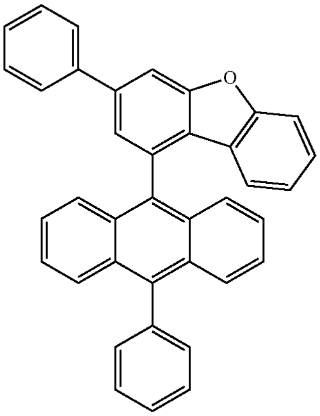
-continued
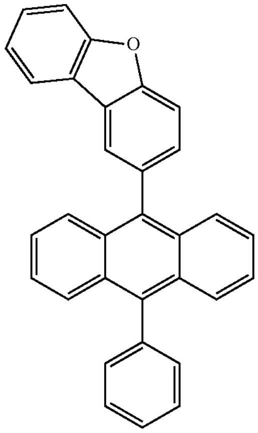
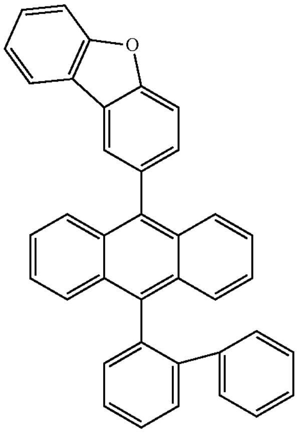
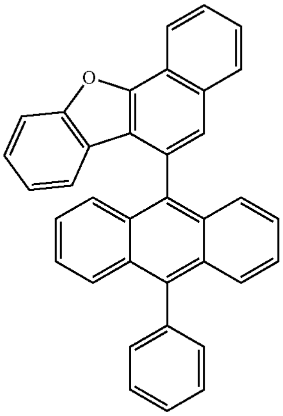
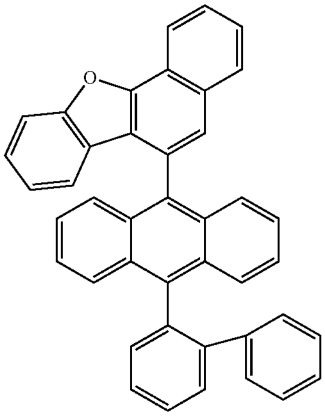

-continued
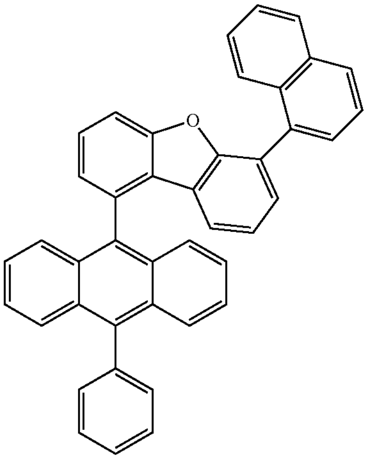
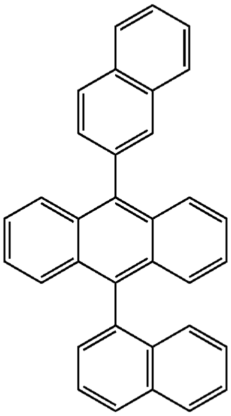
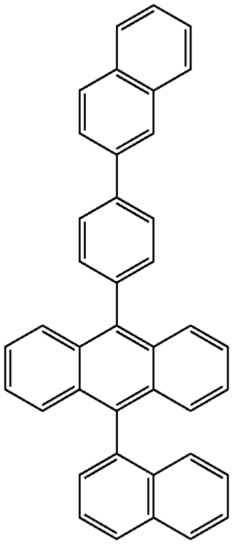
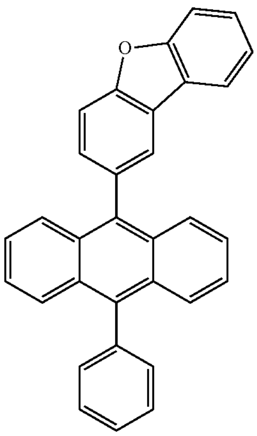
-continued
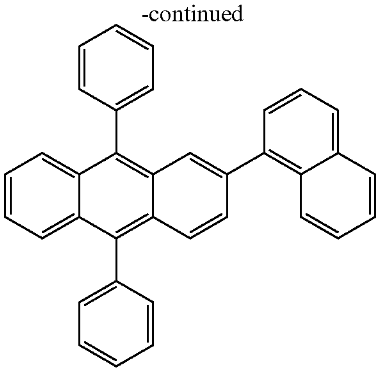
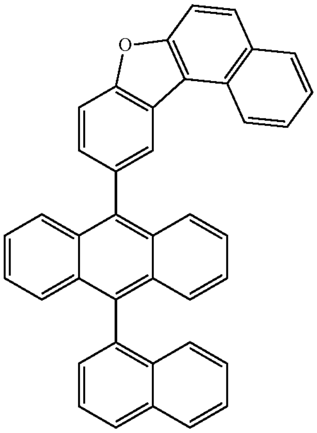
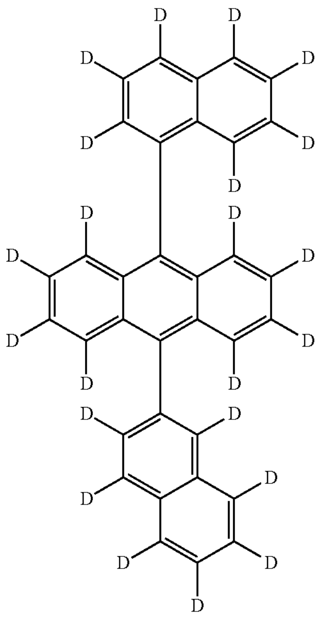

-continued
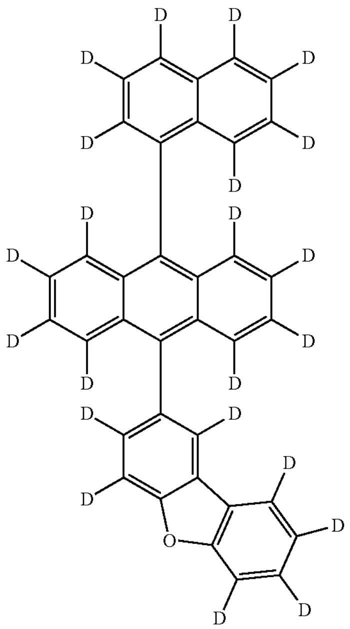
-continued
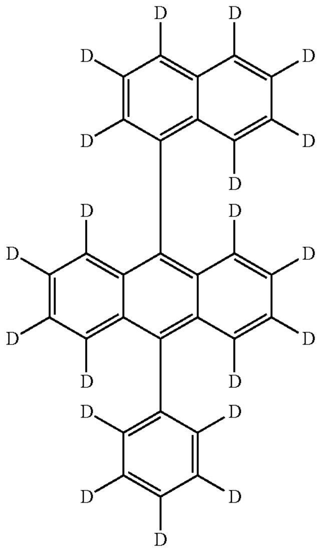
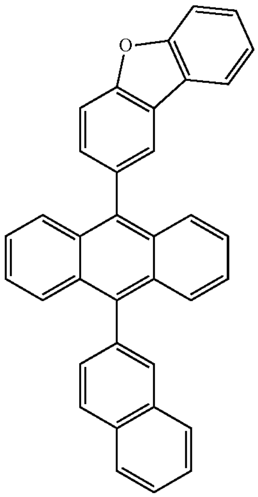
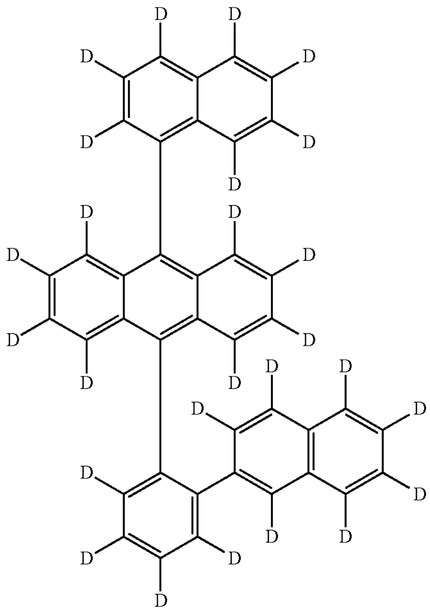
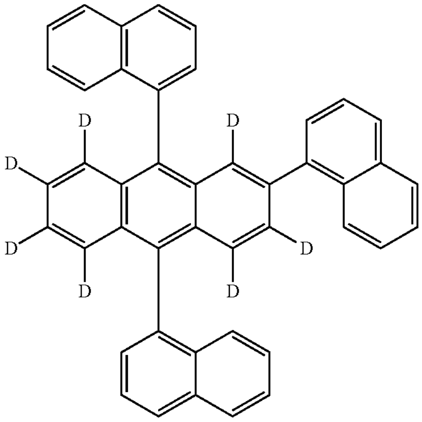

-continued
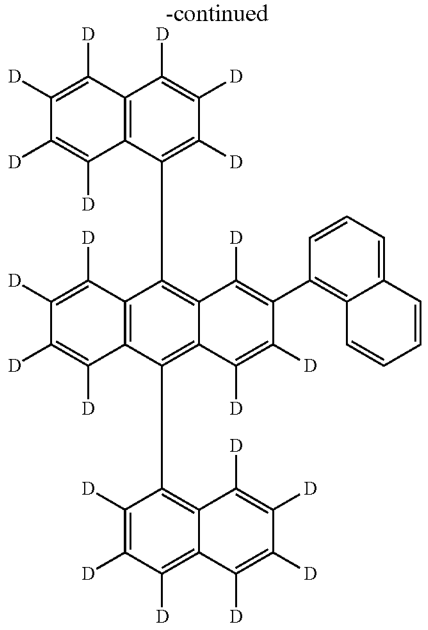
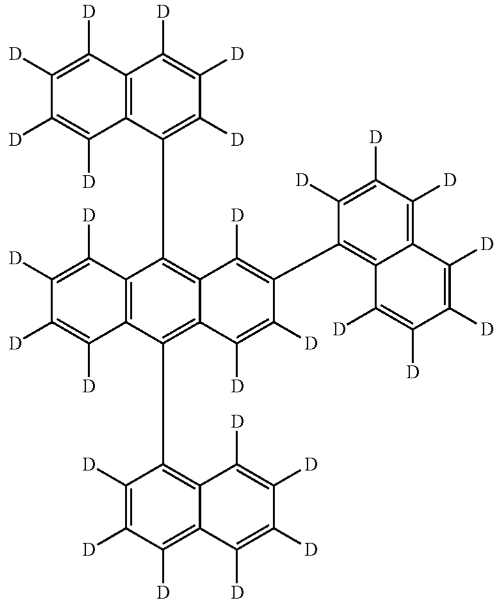
-continued
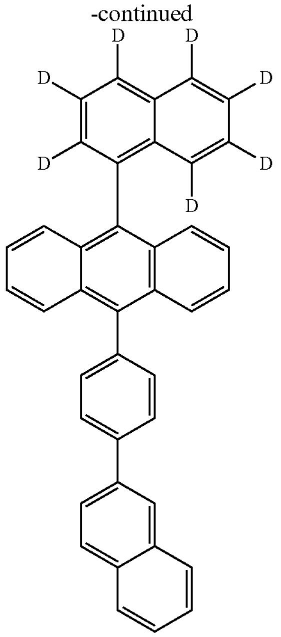
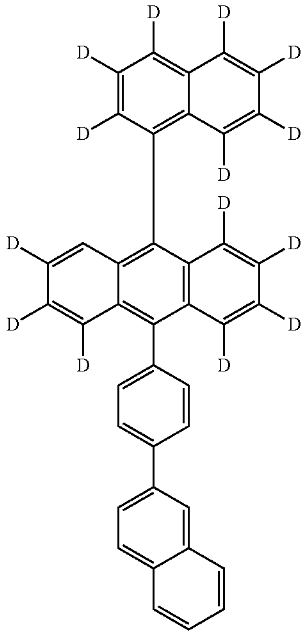

-continued
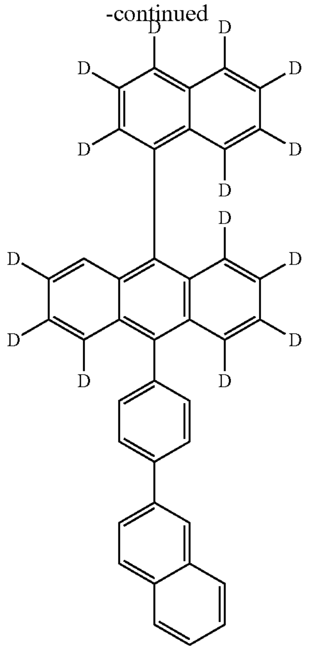
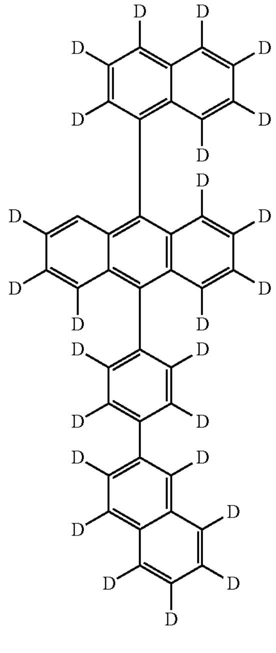
-continued
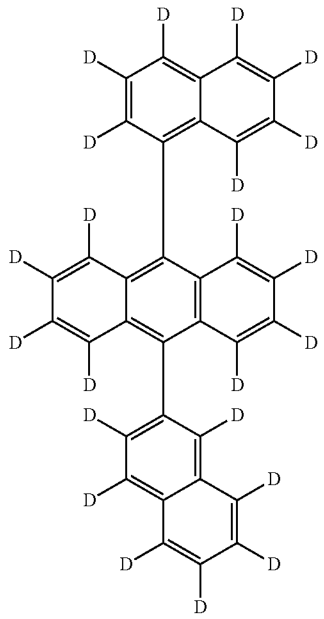
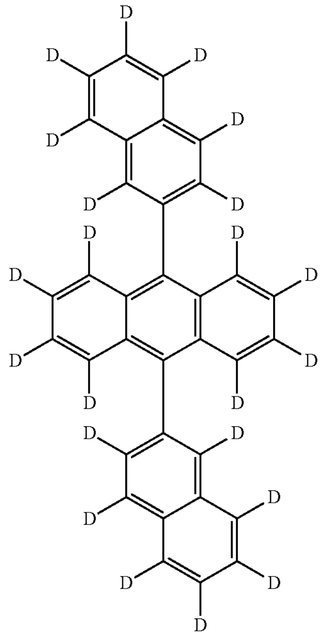

-continued
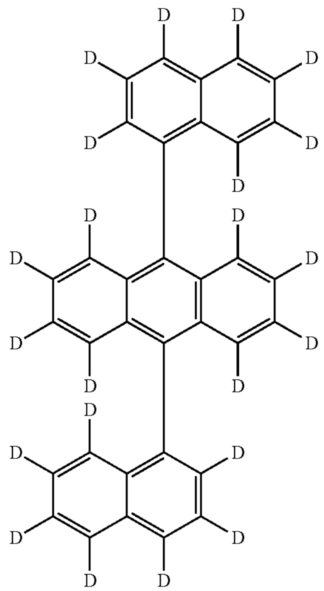
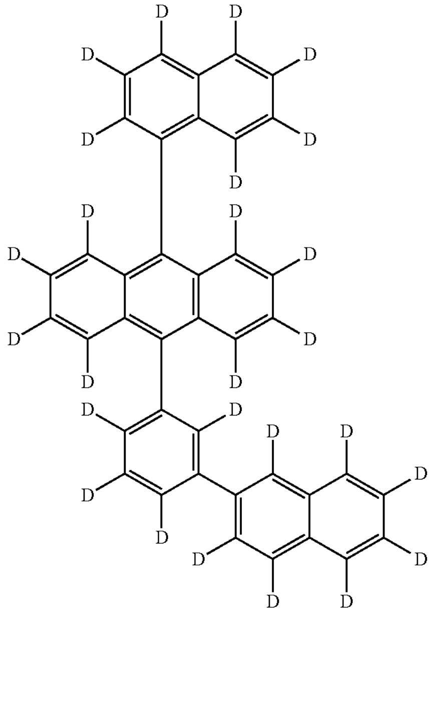
-continued
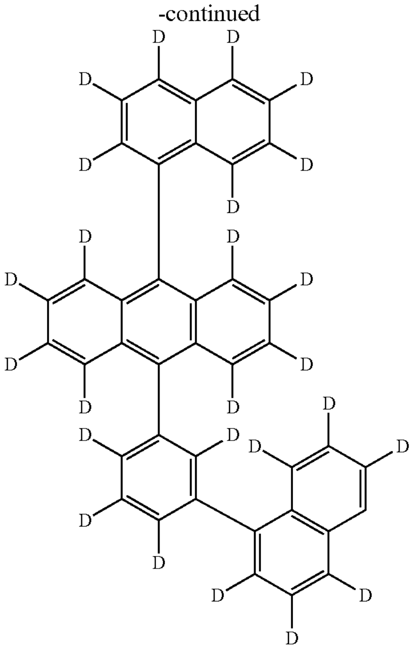
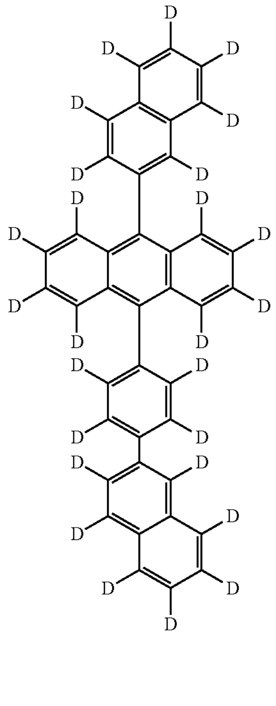

-continued
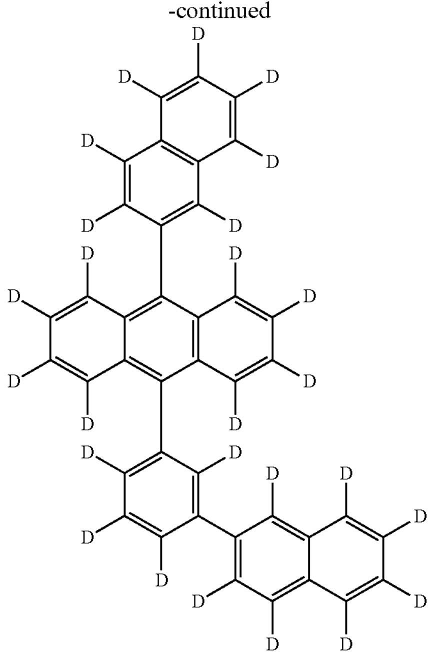
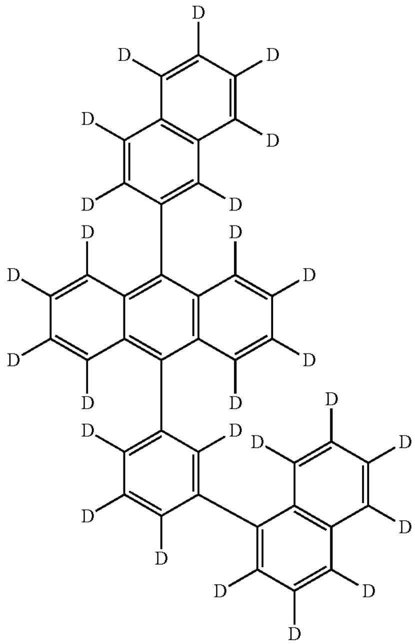
-continued
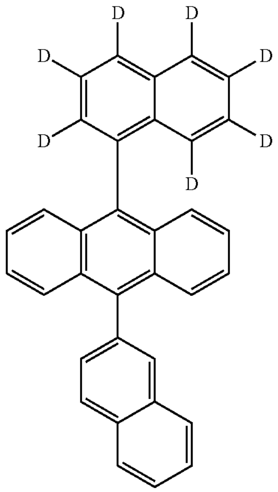
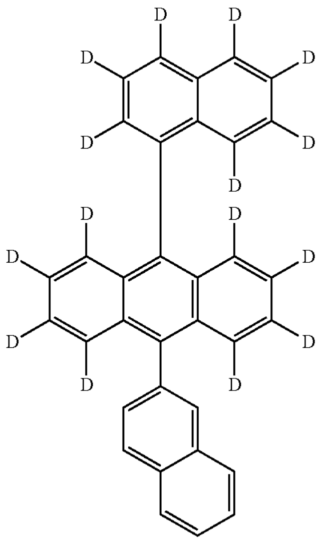
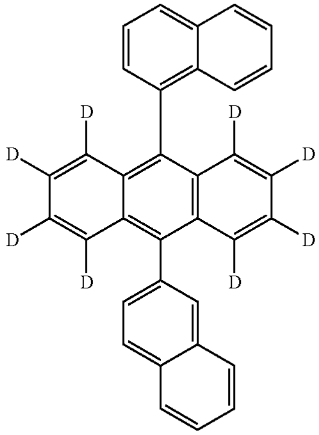

-continued

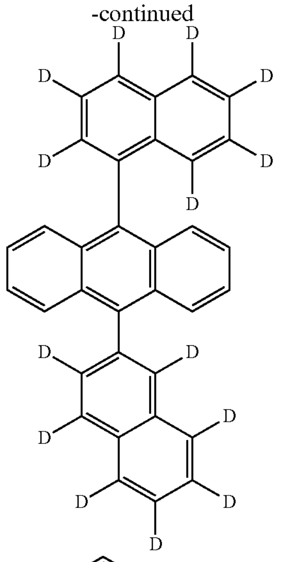

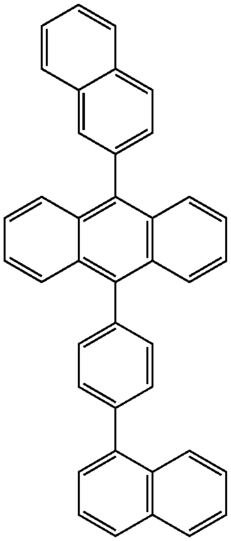

-continued

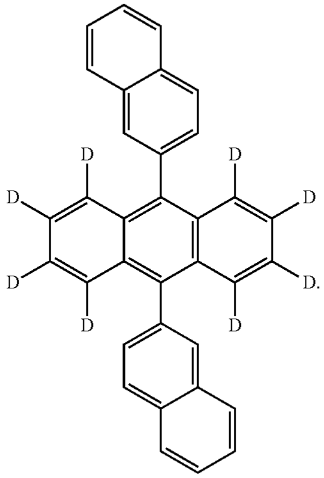

17. The organic light emitting device of claim 1, wherein the hole transport region comprises at least one of an electron blocking layer, a hole blocking layer, a hole transport layer, a hole injection layer, and a hole transport and injection layer.

18. The organic light emitting device of claim 1, wherein the electron transport region comprises at least one of an electron transport layer, an electron injection layer, an electron transport and injection layer, and a hole blocking layer.

19. The organic light emitting device of claim 1, wherein a weight ratio of the host and the dopant is 95:5 to 5:95.

* * * * *